US012610735B2

(12) United States Patent
Lee et al.

(10) Patent No.: US 12,610,735 B2
(45) Date of Patent: Apr. 21, 2026

(54) ORGANIC ELECTROLUMINESCENCE DEVICE AND ELECTRONIC APPARATUS

(71) Applicant: IDEMITSU KOSAN CO.,LTD., Tokyo (JP)

(72) Inventors: Yongguk Lee, Sodegaura (JP); Ryoji Maeda, Sodegaura (JP); Yuki Nakano, Sodegaura (JP); Hiroaki Itoi, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 879 days.

(21) Appl. No.: 17/633,111

(22) PCT Filed: Dec. 25, 2020

(86) PCT No.: PCT/JP2020/048967
§ 371 (c)(1),
(2) Date: Feb. 4, 2022

(87) PCT Pub. No.: WO2021/132651
PCT Pub. Date: Jul. 1, 2021

(65) Prior Publication Data

US 2022/0376183 A1 Nov. 24, 2022

(30) Foreign Application Priority Data

Dec. 26, 2019 (JP) ................................ 2019-236913

(51) Int. Cl.
*H01L 51/50* (2006.01)
*C09K 11/02* (2006.01)
(Continued)

(52) U.S. Cl.
CPC ............ *H10K 85/626* (2023.02); *C09K 11/02* (2013.01); *C09K 11/06* (2013.01); *H10K 85/60* (2023.02);
(Continued)

(58) Field of Classification Search
None
See application file for complete search history.

(56) References Cited

U.S. PATENT DOCUMENTS

| | | | | |
|---|---|---|---|---|
| 2005/0089715 | A1* | 4/2005 | Cosimbescu | H10K 85/615 313/506 |
| 2017/0155050 | A1 | 6/2017 | Kim et al. | |
| 2019/0305227 | A1 | 10/2019 | Yoon et al. | |

FOREIGN PATENT DOCUMENTS

| | | | |
|---|---|---|---|
| CN | 106810457 | A | 6/2017 |
| JP | 2011-241383 | A | 12/2011 |

(Continued)

OTHER PUBLICATIONS

International Search Report issued in corresponding International Patent Application No. PCT/JP2020/048967 dated Mar. 16, 2021.

(Continued)

*Primary Examiner* — Gregory D Clark
(74) *Attorney, Agent, or Firm* — Foley & Lardner LLP

(57) ABSTRACT

An organic electroluminescence device, comprising a cathode, an anode, and at least one emitting layer disposed between the cathode and the anode, wherein the emitting layer contains a first host material, a second host material, and a dopant material, wherein the first host material is a compound represented by the following formula (1), the second host material is a compound represented by the following formula (2), and one or more selected from the group consisting of the compound represented by the formula (1) and the compound represented by the formula (2) have at least one deuterium atom.

(Continued)

(1)

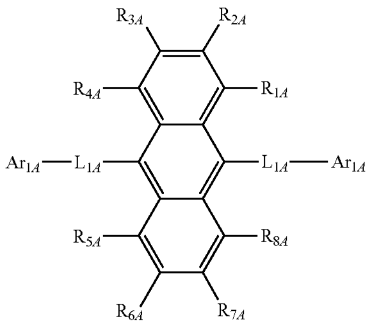

(2)

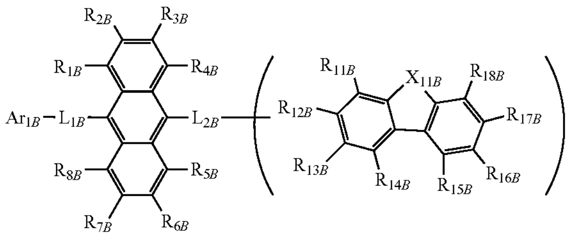

34 Claims, 1 Drawing Sheet

(51) Int. Cl.

| | |
|---|---|
| ***C09K 11/06*** | (2006.01) |
| ***H10K 85/60*** | (2023.01) |
| *H10K 50/11* | (2023.01) |
| *H10K 101/00* | (2023.01) |
| *H10K 101/10* | (2023.01) |

(52) U.S. Cl.

CPC ......... *H10K 85/615* (2023.02); *H10K 85/633* (2023.02); *H10K 85/636* (2023.02); *H10K 85/654* (2023.02); *H10K 85/6572* (2023.02); *H10K 85/6574* (2023.02); *C09K 2211/1007* (2013.01); *C09K 2211/1014* (2013.01); *C09K 2211/1022* (2013.01); *H10K 50/11* (2023.02); *H10K 2101/10* (2023.02); *H10K 2101/90* (2023.02)

(56) References Cited

FOREIGN PATENT DOCUMENTS

| | | | | |
|---|---|---|---|---|
| JP | 2015-018883 | A | | 1/2015 |
| KR | 10-2010-0069216 | A | | 6/2010 |
| KR | 10-1978650 | B1 | | 5/2019 |
| KR | 10-2019-0113498 | A | | 10/2019 |
| KR | 10-2019-0139792 | A | | 12/2019 |
| KR | 2019139792 | A | * | 12/2019 |
| WO | WO 2015/089028 | A1 | * | 6/2015 |
| WO | WO-2019/111971 | A1 | | 6/2019 |
| WO | WO-2019/240251 | A1 | | 12/2019 |

OTHER PUBLICATIONS

Third Party Observation issued in corresponding European Patent Application No. 20907007.7 dated Jan. 12, 2024 (39 pages).

Third Party Observation issued in corresponding European Patent Application No. 20907007.7 dated Jan. 4, 2024 (37 pages).

Office Action issued in corresponding Chinese Patent Application No. 202080056770.1 dated May 28, 2025.

Office Action issued in corresponding Korean Patent Application No. 10-2022-7004497 dated Nov. 21, 2025.

* cited by examiner

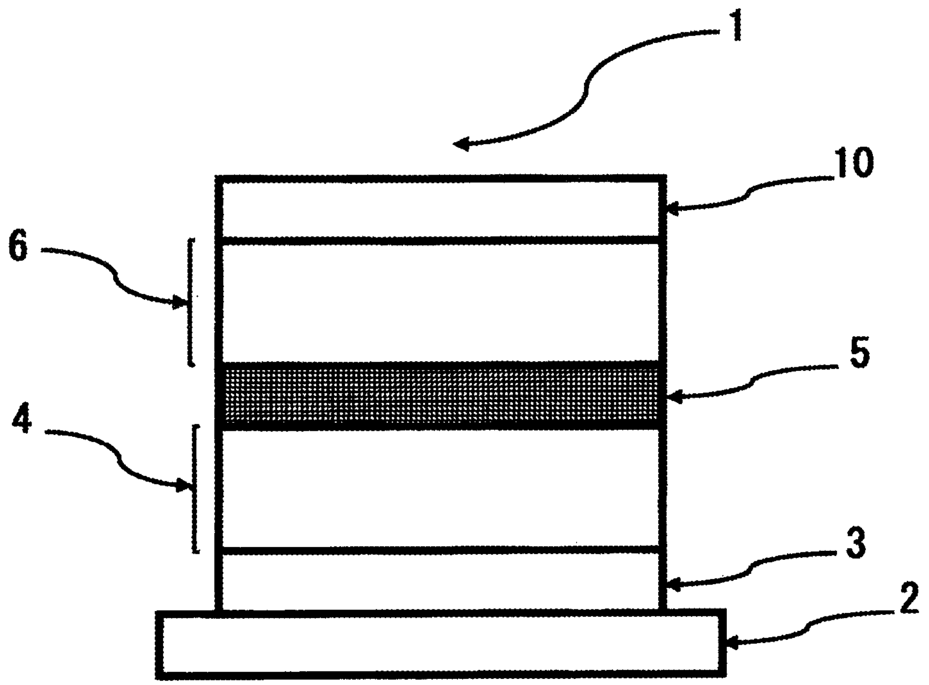
1
10
6
5
4
3
2

ORGANIC ELECTROLUMINESCENCE DEVICE AND ELECTRONIC APPARATUS

CROSS-REFERENCE TO RELATED APPLICATIONS

The present application claims priority under 35 U.S.C. § 371 to International Patent Application No. PCT/JP2020/048967, filed Dec. 25, 2020, which claims priority to and the benefit of Japanese Patent Application No. 2019-236913, filed on Dec. 26, 2019. The contents of these applications are hereby incorporated by reference in their entireties.

TECHNICAL FIELD

The invention relates to an organic electroluminescence device and an electronic apparatus.

BACKGROUND ART

When voltage is applied to an organic electroluminescence device (hereinafter, referred to as an organic EL device), holes and electrons are injected into an emitting layer from an anode and a cathode, respectively. Then, thus injected holes and electrons are recombined in the emitting layer, and excitons are formed therein.

The improvement of the device material is advanced in order to enhance the device performance of the organic EL device. There have also been attempts to use two or more materials in combination in a single organic layer to utilize the advantage of the features of each material. For example, Patent Document 1 discloses a technique in which two kinds of host materials are used in combination in an emitting layer.

RELATED ART DOCUMENTS

Patent Documents

[Patent Document 1] JP 2015-18883 A

SUMMARY OF THE INVENTION

However, even when a plurality of materials is used in combination, the advantages of each material are not necessarily maintained, and there are cases where the improvement as expected is not observed or the performance is deteriorated on the contrary, and there is still room for upgrading in the art for improving the performance of the organic EL device by this method.

The object of the invention is to provide an organic EL device having a low drive voltage, a high external quantum efficiency, and a long lifetime.

As a result of intensive studies to achieve the above object, the inventors have found that an organic EL device having a low driving voltage, a high external quantum efficiency, and a long lifetime can be obtained by using a combination of two compounds having a specific structure and at least one of which contains deuterium (first host material and second host material) in an emitting layer of an organic EL device, thereby completing the invention.

According to the invention, the following organic EL device and the like are provided.

1. An organic electroluminescence device comprising:

a cathode;

an anode; and at least one emitting layer disposed between the cathode and the anode, wherein the emitting layer comprises a first host material, a second host material, and a dopant material, the first host material is a compound represented by the following formula (1), the second host material is a compound represented by the following formula (2), and one or more selected from the group consisting of the compound represented by the formula (1) and the compound represented by the formula (2) have at least one deuterium atom:

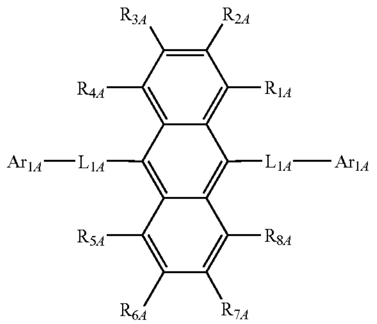

(1)

wherein in the formula (1), $R_{1A}$ to $R_{8A}$ are independently a hydrogen atom, a substituent R, or a group represented by the following formula (1A);

the substituent R is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

when two or more of the substituents R are present, the two or more of the substituents R may be the same as or different from each other;

$L_{1A}$'s are independently a single bond, a substituted or unsubstituted arylene group including 6 to 50 ring carbon atoms, or a substituted or unsubstituted divalent heterocyclic group including 5 to 50 ring atoms;

$Ar_{1A}$'s are independently a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ are the same as or different from each other;

$$-L_{1A}-Ar_{1A} \quad (1A)$$

wherein in the formula (1A), $L_{1A}$ and $Ar_{1A}$ are as defined in the formula (1); and when two or more groups represented by the formula (1A) are present, the two or more of each of the groups represented by the formula (1A) may be the same as or different from each other;

$R_{11B}$ to $R_{18B}$ which are not single bonds bonding with $L_{2B}$ and which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or (2)

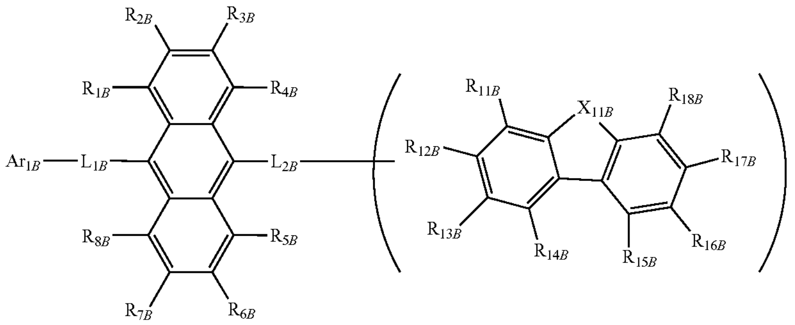

wherein in the formula (2), $R_{1B}$ to $R_{8B}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$X_{11B}$ is an oxygen atom or a sulfur atom;

one of $R_{11B}$ to $R_{18B}$ is a single bond bonding with $L_{2B}$;

one or more sets of adjacent two or more of $R_{11B}$ to $R_{18B}$ which are not single bonds bonding with $L_{2B}$ form a substituted or unsubstituted, saturated or unsaturated ring by bonding with each other, or do not form a substituted or unsubstituted, saturated or unsaturated ring;

a substituted or unsubstituted monovalent heterocyclic group including 5 to 50 ring atoms;

$L_{1B}$ and $L_{2B}$ are independently a single bond, a substituted or unsubstituted arylene group including 6 to 30 ring carbon atoms, or a substituted or unsubstituted divalent heterocyclic group including 5 to 30 ring atoms;

$Ar_{1B}$ is a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (1).

2. A composition comprising a compound represented by the following formula (1) and a compound represented by the following formula (2), wherein one or more selected from the group consisting of the compound represented by the formula (1) and the compound represented by the formula (2) have at least one deuterium atom.

(1)

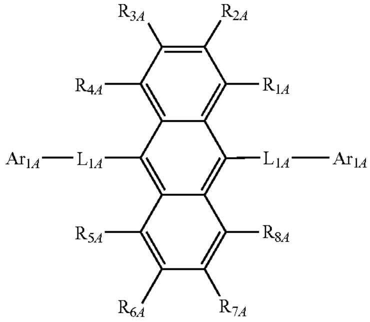

wherein in the formula (1), $R_{1A}$ to $R_{8A}$ are independently a hydrogen atom, a substituent R, or a group represented by the following formula (1A);

the substituent R is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

when two or more of the substituents R are present, the two or more of the substituents R may be the same as or different from each other;

$L_{1A}$'s are independently a single bond, a substituted or unsubstituted arylene group including 6 to 50 ring carbon atoms, or a substituted or unsubstituted divalent heterocyclic group including 5 to 50 ring atoms;

$Ar_{1A}$ are independently a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ are the same as or different from each other;

$$-L_{1A}-Ar_{1A} \quad (1A)$$

wherein in the formula (1A), $L_{1A}$ and $Ar_{1A}$ are as defined in the formula (1);

when two or more groups represented by the formula (1A) are present, the two or more of each of the groups represented by the formula (1A) may be the same as or different from each other;

(2)

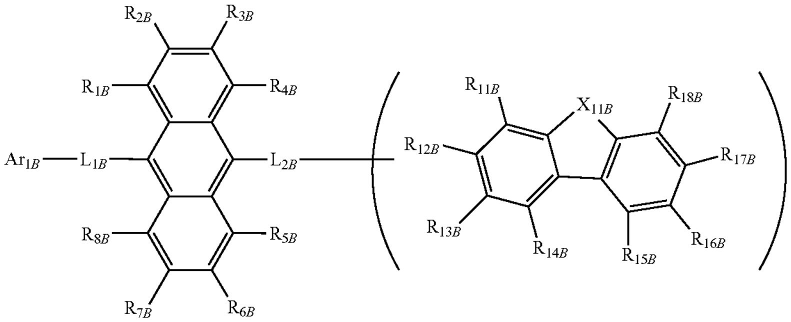

wherein in the formula (2), $R_{1B}$ to $R_{8B}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$X_{11B}$ is an oxygen atom or a sulfur atom;

one of $R_{11B}$ to $R_{18B}$ is a single bond bonding with $L_{2B}$;

one or more sets of adjacent two or more of $R_{11B}$ to $R_{18B}$ which are not single bonds bonding with $L_{2B}$ form a substituted or unsubstituted, saturated or unsaturated ring by bonding with each other, or do not form a substituted or unsubstituted, saturated or unsaturated ring;

$R_{11B}$ to $R_{18B}$ which are not single bonds bonding with $L_{2B}$ and which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$L_{1B}$ and $L_{2B}$ are independently a single bond, a substituted or unsubstituted arylene group including 6 to 30 ring carbon atoms, or a substituted or unsubstituted divalent heterocyclic group including 5 to 30 ring atoms;

$Ar_{1B}$ is a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (1).

3. An organic electroluminescence device comprising:

a cathode;

an anode; and at least one emitting layer disposed between the cathode and the anode, wherein the emitting layer comprises a composition according to 2.

4. An electronic apparatus, comprising the organic electroluminescence device according to 1 or 3.

According to the invention, an organic EL device having a low drive voltage, a high external quantum efficiency, and a long lifetime can be provided.

BRIEF DESCRIPTION OF THE DRAWINGS

The FIGURE is a diagram showing a schematic configuration of an organic EL device according to an aspect of the invention.

MODE FOR CARRYING OUT THE INVENTION

Definition

In this specification, a hydrogen atom includes its isotopes different in the number of neutrons, namely, a protium, a deuterium and a tritium.

In this specification, at a bondable position in a chemical formula where a symbol such as "R", or "D" representing a deuterium atom is not indicated, a hydrogen atom, that is, a protium atom, a deuterium atom or a tritium atom is bonded.

In this specification, the number of ring carbon atoms represents the number of carbon atoms forming a subject ring itself among the carbon atoms of a compound having a structure in which atoms are bonded in a ring form (for example, a monocyclic compound, a fused ring compound, a cross-linked compound, a carbocyclic compound, or a heterocyclic compound). When the subject ring is substituted by a substituent, the carbon contained in the substituent is not included in the number of ring carbon atoms. The same shall apply to "the number of ring carbon atoms" described below, unless otherwise specified. For example, a benzene ring has 6 ring carbon atoms, a naphthalene ring includes 10 ring carbon atoms, a pyridine ring includes 5 ring carbon atoms, and a furan ring includes 4 ring carbon atoms. Further, for example, a 9,9-diphenylfluorenyl group includes 13 ring carbon atoms, and a 9,9'-spirobifluorenyl group includes 25 ring carbon atoms.

When a benzene ring is substituted by, for example, an alkyl group as a substituent, the number of carbon atoms of the alkyl group is not included in the number of ring carbon atoms of the benzene ring. Therefore, the number of ring carbon atoms of the benzene ring substituted by the alkyl group is 6. When a naphthalene ring is substituted by, for example, an alkyl group as a substituent, the number of carbon atoms of the alkyl group is not included in the number of ring carbon atoms of the naphthalene ring. Therefore, the number of ring carbon atoms of the naphthalene ring substituted by the alkyl group is 10.

In this specification, the number of ring atoms represents the number of atoms forming a subject ring itself among the atoms of a compound having a structure in which atoms are bonded in a ring form (for example, the structure includes a monocyclic ring, a fused ring and a ring assembly) (for example, a monocyclic compound, a fused ring compound, a cross-linked compound, a carbocyclic compound and a heterocyclic compound). The number of ring atoms does not include atoms which do not form the ring (for example, a hydrogen atom which terminates a bond of the atoms forming the ring), or atoms contained in a substituent when the ring is substituted by the substituent. The same shall apply to "the number of ring atoms" described below, unless otherwise specified. For example, the number of atoms of a pyridine ring is 6, the number of atoms of a quinazoline ring is 10, and the number of a furan ring is 5. For example, hydrogen atoms bonded to a pyridine ring and atoms constituting a substituent substituted on the pyridine ring are not included in the number of ring atoms of the pyridine ring. Therefore, the number of ring atoms of a pyridine ring with which a hydrogen atom or a substituent is bonded is 6. For example, hydrogen atoms and atoms constituting a substituent which are bonded with a quinazoline ring is not included in the number of ring atoms of the quinazoline ring. Therefore, the number of ring atoms of a quinazoline ring with which a hydrogen atom or a substituent is bonded is 10.

In this specification, "XX to YY carbon atoms" in the expression "a substituted or unsubstituted ZZ group including XX to YY carbon atoms" represents the number of carbon atoms in the case where the ZZ group is unsubstituted by a substituent, and does not include the number of carbon atoms of a substituent in the case where the ZZ group is substituted by the substituent. Here, "YY" is larger than "XX", and "XX" means an integer of 1 or more and "YY" means an integer of 2 or more.

In this specification, "XX to YY atoms" in the expression "a substituted or unsubstituted ZZ group including XX to YY atoms" represents the number of atoms in the case where the ZZ group is unsubstituted by a substituent, and does not include the number of atoms of a substituent in the case where the ZZ group is substituted by the substituent. Here, "YY" is larger than "XX", and "XX" means an integer of 1 or more and "YY" means an integer of 2 or more.

In this specification, the unsubstituted ZZ group represents the case where the "substituted or unsubstituted ZZ group" is a "ZZ group unsubstituted by a substituent", and the substituted ZZ group represents the case where the "substituted or unsubstituted ZZ group"is a" ZZ group substituted by a substituent".

In this specification, a term "unsubstituted" in the case of "a substituted or unsubstituted ZZ group" means that hydrogen atoms in the ZZ group are not substituted by a substituent. Hydrogen atoms in a term "unsubstituted ZZ group" are a protium atom, a deuterium atom, or a tritium atom.

In this specification, a term "substituted" in the case of "a substituted or unsubstituted ZZ group" means that one or more hydrogen atoms in the ZZ group are substituted by a substituent. Similarly, a term "substituted" in the case of "a BB group substituted by an AA group" means that one or more hydrogen atoms in the BB group are substituted by the AA group.

"Substituent as Described in this Specification"

Hereinafter, the substituent described in this specification will be explained.

The number of ring carbon atoms of the "unsubstituted aryl group" described in this specification is 6 to 50, preferably 6 to 30, and more preferably 6 to 18, unless otherwise specified.

The number of ring atoms of the "unsubstituted heterocyclic group" described in this specification is 5 to 50, preferably 5 to 30, and more preferably 5 to 18, unless otherwise specified.

The number of carbon atoms of the "unsubstituted alkyl group" described in this specification is 1 to 50, preferably 1 to 20, and more preferably 1 to 6, unless otherwise specified.

The number of carbon atoms of the "unsubstituted alkenyl group" described in this specification is 2 to 50, preferably 2 to 20, and more preferably 2 to 6, unless otherwise specified.

The number of carbon atoms of the "unsubstituted alkynyl group" described in this specification is 2 to 50, preferably 2 to 20, and more preferably 2 to 6, unless otherwise specified.

The number of ring carbon atoms of the "unsubstituted cycloalkyl group" described in this specification is 3 to 50, preferably 3 to 20, and more preferably 3 to 6, unless otherwise specified.

The number of ring carbon atoms of the "unsubstituted arylene group" described in this specification is 6 to 50, preferably 6 to 30, and more preferably 6 to 18, unless otherwise specified.

The number of ring atoms of the "unsubstituted divalent heterocyclic group" described in this specification is 5 to 50, preferably 5 to 30, and more preferably 5 to 18, unless otherwise specified.

The number of carbon atoms of the "unsubstituted alkylene group" described in this specification is 1 to 50, preferably 1 to 20, and more preferably 1 to 6, unless otherwise specified.

"Substituted or Unsubstituted Aryl Group"

Specific examples of the "substituted or unsubstituted aryl group" described in this specification (specific example group G1) include the following unsubstituted aryl groups (specific example group G1A), substituted aryl groups (specific example group G1B), and the like. (Here, the unsubstituted aryl group refers to the case where the "substituted or unsubstituted aryl group" is an "aryl group unsubstituted by a substituent", and the substituted aryl group refers to the case where the "substituted or unsubstituted aryl group"is an" aryl group substituted by a substituent"). In this specification, in the case where simply referred as an "aryl group", it includes both a "unsubstituted aryl group" and a "substituted aryl group."

The "substituted aryl group" means a group in which one or more hydrogen atoms of the "unsubstituted aryl group" are substituted by a substituent. Specific examples of the "substituted aryl group" include, for example, groups in which one or more hydrogen atoms of the "unsubstituted aryl group" of the following specific example group G1A are substituted by a substituent, the substituted aryl groups of the following specific example group G1B, and the like. It should be noted that the examples of the "unsubstituted aryl group" and the examples of the "substituted aryl group" enumerated in this specification are mere examples, and the "substituted aryl group" described in this specification also includes a group in which a hydrogen atom bonded with a carbon atom of the aryl group itself in the "substituted aryl group" of the following specific group G1B is further substituted by a substituent, and a group in which a hydrogen atom of a substituent in the "substituted aryl group" of the following specific group G1B is further substituted by a substituent.

Unsubstituted Aryl Group (Specific Example Group G1A):

a phenyl group,
a p-biphenyl group,
a m-biphenyl group,
an o-biphenyl group,
a p-terphenyl-4-yl group,
a p-terphenyl-3-yl group,
a p-terphenyl-2-yl group,
a m-terphenyl-4-yl group,
a m-terphenyl-3-yl group,
a m-terphenyl-2-yl group,
an o-terphenyl-4-yl group,
an o-terphenyl-3-yl group,
an o-terphenyl-2-yl group,
a 1-naphthyl group,
a 2-naphthyl group,
an anthryl group,
a benzanthryl group,
a phenanthryl group,
a benzophenanthryl group,
a phenalenyl group,
a pyrenyl group,
a chrysenyl group,
a benzochrysenyl group,
a triphenylenyl group,
a benzotriphenylenyl group,
a tetracenyl group,
a pentacenyl group,
a fluorenyl group,
a 9,9'-spirobifluorenyl group,
a benzofluorenyl group,
a dibenzofluorenyl group,
a fluoranthenyl group,
a benzofluoranthenyl group,
a perylenyl group, and
a monovalent aryl group derived by removing one hydrogen atom from the ring structures represented by any of the following general formulas (TEMP-1) to (TEMP-15).

(TEMP-1)
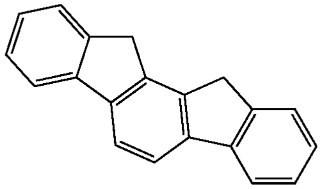
(TEMP-2)
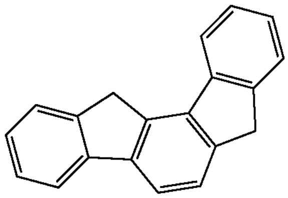
(TEMP-3)
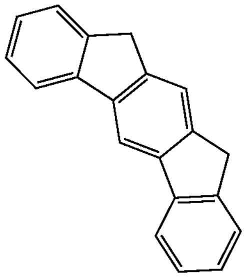
(TEMP-4)
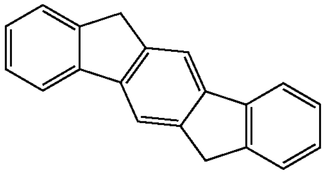
(TEMP-5)
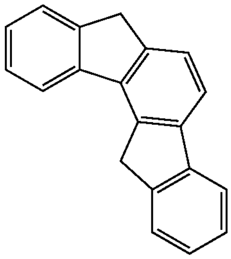
(TEMP-6)
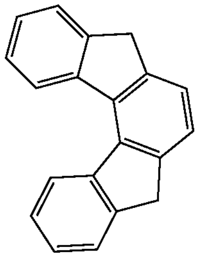
(TEMP-7)
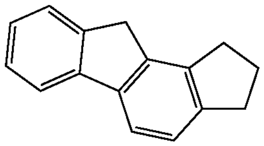
-continued
(TEMP-8)
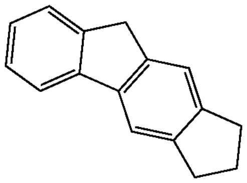
(TEMP-9)
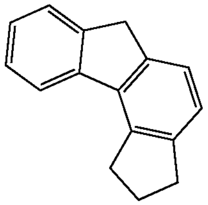
(TEMP-10)
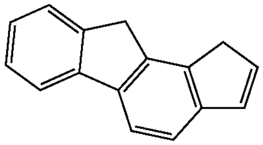
(TEMP-11)
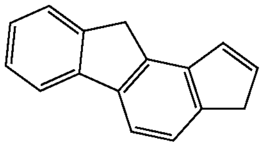
(TEMP-12)
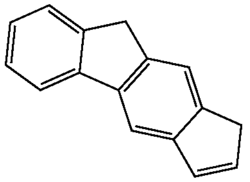
(TEMP-13)
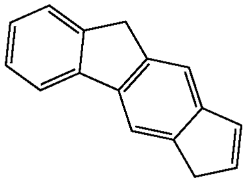
(TEMP-14)
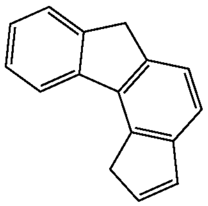
(TEMP-15)
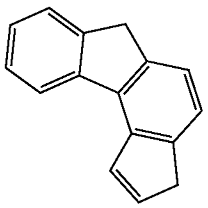
Substituted Aryl Group (Specific Example Group G1B):
an o-tolyl group,
a m-tolyl group, a p-tolyl group,
a p-xylyl group,
a m-xylyl group,
an o-xylyl group,
a p-isopropylphenyl group,
a m-isopropylphenyl group,
an o-isopropylphenyl group,
a p-t-butylphenyl group,
a m-t-butylphenyl group,
an o-t-butylphenyl group,
a 3,4,5-trimethylphenyl group,
a 9,9-dimethylfluorenyl group,
a 9,9-diphenylfluorenyl group,
a 9,9-bis(4-methylphenyl)fluorenyl group,
a 9,9-bis(4-isopropylphenyl)fluorenyl group,
a 9,9-bis(4-t-butylphenyl)fluorenyl group,
a cyanophenyl group,
a triphenylsilylphenyl group,
a trimethylsilylphenyl group,
a phenylnaphthyl group,
a naphthylphenyl group, and
a group in which one or more hydrogen atoms of a monovalent group derived from the ring structures represented by any of the general formulas (TEMP-1) to (TEMP-15) are substituted by a substituent.

"Substituted or Unsubstituted Heterocyclic Group"

The "heterocyclic group" described in this specification is a ring group having at least one hetero atom in the ring atom. Specific examples of the hetero atom include a nitrogen atom, an oxygen atom, a sulfur atom, a silicon atom, a phosphorus atom, and a boron atom.

The "heterocyclic group" in this specification is a monocyclic group or a fused ring group.

The "heterocyclic group" in this specification is an aromatic heterocyclic group or a non-aromatic heterocyclic group.

Specific examples of the "substituted or unsubstituted heterocyclic group" (specific example group G2) described in this specification include the following unsubstituted heterocyclic group (specific example group G2A), the following substituted heterocyclic group (specific example group G2B), and the like. (Here, the unsubstituted heterocyclic group refers to the case where the "substituted or unsubstituted heterocyclic group"is a" heterocyclic group unsubstituted by a substituent", and the substituted heterocyclic group refers to the case where the "substituted or unsubstituted heterocyclic group"is a" heterocyclic group substituted by a substituent"). In this specification, in the case where simply referred as a "heterocyclic group", it includes both the "unsubstituted heterocyclic group" and the "substituted heterocyclic group."

The "substituted heterocyclic group" means a group in which one or more hydrogen atom of the "unsubstituted heterocyclic group" are substituted by a substituent. Specific examples of the "substituted heterocyclic group" include a group in which a hydrogen atom of "unsubstituted heterocyclic group" of the following specific example group G2A is substituted by a substituent, the substituted heterocyclic groups of the following specific example group G2B, and the like. It should be noted that the examples of the "unsubstituted heterocyclic group" and the examples of the "substituted heterocyclic group" enumerated in this specification are mere examples, and the "substituted heterocyclic group" described in this specification includes groups in which hydrogen atom bonded with a ring atom of the heterocyclic group itself in the "substituted heterocyclic group" of the specific example group G2B is further substituted by a substituent, and a group in which hydrogen atom of a substituent in the "substituted heterocyclic group" of the specific example group G2B is further substituted by a substituent.

Specific example group G2A includes, for example, the following unsubstituted heterocyclic group containing a nitrogen atom (specific example group G2A1), the following unsubstituted heterocyclic group containing an oxygen atom (specific example group G2A2), the following unsubstituted heterocyclic group containing a sulfur atom (specific example group G2A3), and the monovalent heterocyclic group derived by removing one hydrogen atom from the ring structures represented by any of the following general formulas (TEMP-16) to (TEMP-33) (specific example group G2A4).

Specific example group G2B includes, for example, the following substituted heterocyclic group containing a nitrogen atom (specific example group G2B1), the following substituted heterocyclic group containing an oxygen atom (specific example group G2B2), the following substituted heterocyclic group containing a sulfur atom (specific example group G2B3), and the following group in which one or more hydrogen atoms of the monovalent heterocyclic group derived from the ring structures represented by any of the following general formulas (TEMP-16) to (TEMP-33) are substituted by a substituent (specific example group G2B4).

Unsubstituted Heterocyclic Group Containing a Nitrogen Atom (Specific Example Group G2A1):

a pyrrolyl group,
an imidazolyl group,
a pyrazolyl group,
a triazolyl group,
a tetrazolyl group,
an oxazolyl group,
an isoxazolyl group,
an oxadiazolyl group,
a thiazolyl group,
an isothiazolyl group,
a thiadiazolyl group,
a pyridyl group,
a pyridazinyl group,
a pyrimidinyl group,
a pyrazinyl group,
a triazinyl group,
an indolyl group,
an isoindolyl group,
an indolizinyl group,
a quinolizinyl group,
a quinolyl group,
an isoquinolyl group,
a cinnolyl group,
a phthalazinyl group,
a quinazolinyl group,
a quinoxalinyl group,
a benzimidazolyl group,
an indazolyl group,
a phenanthrolinyl group,
a phenanthridinyl group,
an acridinyl group,
a phenazinyl group,
a carbazolyl group,
a benzocarbazolyl group,
a morpholino group,
a phenoxazinyl group,
a phenothiazinyl group,
an azacarbazolyl group, and
a diazacarbazolyl group.

Unsubstituted Heterocyclic Group Containing an Oxygen Atom (Specific Example Group G2A2):

- a furyl group,
- an oxazolyl group,
- an isoxazolyl group,
- an oxadiazolyl group,
- a xanthenyl group,
- a benzofuranyl group,
- an isobenzofuranyl group,
- a dibenzofuranyl group,
- a naphthobenzofuranyl group,
- a benzoxazolyl group,
- a benzisoxazolyl group,
- a phenoxazinyl group,
- a morpholino group,
- a dinaphthofuranyl group,
- an azadibenzofuranyl group,
- a diazadibenzofuranyl group,
- an azanaphthobenzofuranyl group, and
- a diazanaphthobenzofuranyl group.

Unsubstituted Heterocyclic Group Containing a Sulfur Atom (Specific Example Group G2A3):

- a thienyl group,
- a thiazolyl group,
- an isothiazolyl group,
- a thiadiazolyl group,
- a benzothiophenyl group (benzothienyl group),
- an isobenzothiophenyl group (isobenzothienyl group),
- a dibenzothiophenyl group (dibenzothienyl group),
- a naphthobenzothiophenyl group (naphthobenzothienyl group),
- a benzothiazolyl group,
- a benzisothiazolyl group,
- a phenothiazinyl group,
- a dinaphthothiophenyl group (dinaphthothienyl group),
- an azadibenzothiophenyl group (azadibenzothienyl group),
- a diazadibenzothiophenyl group (diazadibenzothienyl group),
- an azanaphthobenzothiophenyl group (azanaphthobenzothienyl group), and
- a diazanaphthobenzothiophenyl group (diazanaphthobenzothienyl group).

Monovalent heterocyclic group derived by removing one hydrogen atom from the ring structures represented by any of the following general formulas (TEMP-16) to (TEMP-33) (specific example group G2A4):

(TEMP-16)

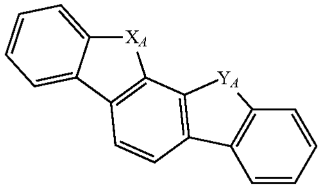

(TEMP-17)

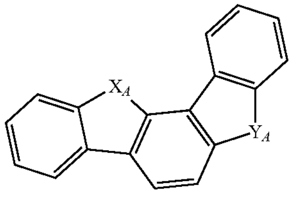

-continued (TEMP-18)

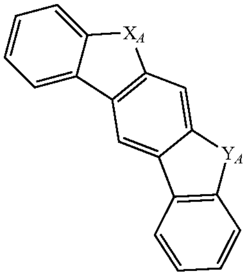

(TEMP-19)

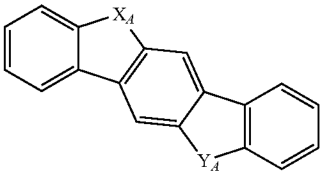

(TEMP-20)

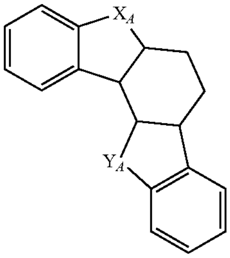

(TEMP-21)

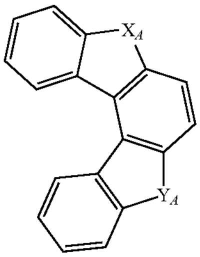

(TEMP-22)

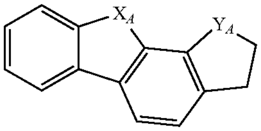

(TEMP-23)

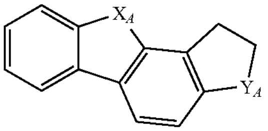

(TEMP-24)

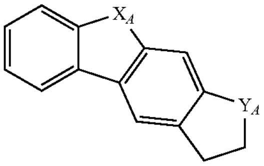

-continued (TEMP-25)

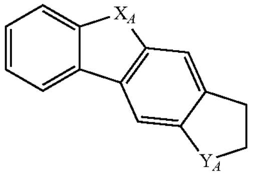

(TEMP-26)

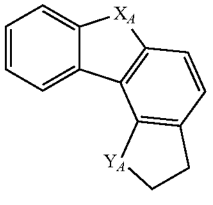

(TEMP-27)

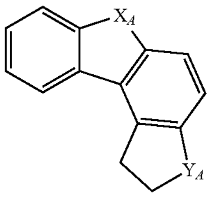

(TEMP-28)

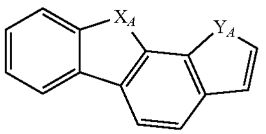

(TEMP-29)

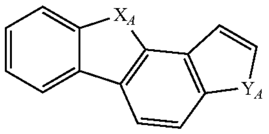

(TEMP-30)

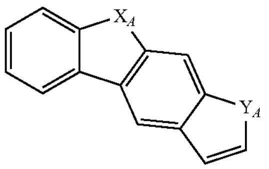

(TEMP-31)

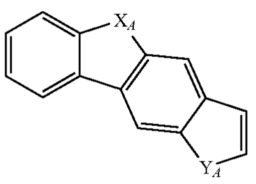

(TEMP-32)

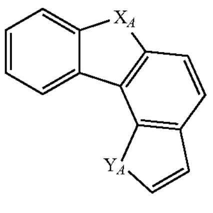

-continued (TEMP-33)

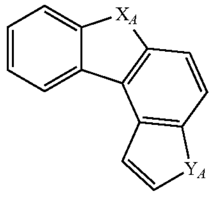

In the general formulas (TEMP-16) to (TEMP-33), $X_A$ and $Y_A$ are independently an oxygen atom, a sulfur atom, NH, or $CH_2$. Provided that at least one of $X_A$ and $Y_A$ is an oxygen atom, a sulfur atom, or NH.

In the general formulas (TEMP-16) to (TEMP-33), when at least one of $X_A$ and $Y_A$ is NH or $CH_2$, the monovalent heterocyclic group derived from the ring structures represented by any of the general formulas (TEMP-16) to (TEMP-33) includes a monovalent group derived by removing one hydrogen atom from these NH or $CH_2$.

Substituted Heterocyclic Group Containing a Nitrogen Atom (Specific Example Group G2B1):

a (9-phenyl)carbazolyl group,
a (9-biphenylyl)carbazolyl group,
a (9-phenyl)phenylcarbazolyl group,
a (9-naphthyl)carbazolyl group,
a diphenylcarbazol-9-yl group,
a phenylcarbazol-9-yl group,
a methylbenzimidazolyl group,
an ethylbenzimidazolyl group,
a phenyltriazinyl group,
a biphenylyltriazinyl group,
a diphenyltriazinyl group,
a phenylquinazolinyl group, and
a biphenylylquinazolinyl group.

Substituted Heterocyclic Group Containing an Oxygen Atom (Specific Example Group G2B2):

a phenyldibenzofuranyl group,
a methyldibenzofuranyl group,
a t-butyldibenzofuranyl group, and
a monovalent residue of spiro[9H-xanthene-9,9'-[9H]fluorene].

Substituted Heterocyclic Group Containing a Sulfur Atom (Specific Example Group G2B3):

a phenyldibenzothiophenyl group,
a methyldibenzothiophenyl group,
a t-butyldibenzothiophenyl group, and
a monovalent residue of spiro[9H-thioxanthene-9,9':[9H]fluorene].

Group in which one or more hydrogen atoms of the monovalent heterocyclic group derived from the ring structures represented by any of the following general formulas (TEMP-16) to (TEMP-33) are substituted by a substituent (specific example group G2B4):

The "one or more hydrogen atoms of the monovalent heterocyclic group" means one or more hydrogen atoms selected from hydrogen atoms bonded with ring carbon atoms of the monovalent heterocyclic group, a hydrogen atom bonded with a nitrogen atom when at least one of $X_A$ and $Y_A$ is NH, and hydrogen atoms of a methylene group when one of $X_A$ and $Y_A$ is $CH_2$.

"Substituted or Unsubstituted Alkyl Group"

Specific examples of the "substituted or unsubstituted alkyl group" (specific example group G3) described in this specification include the following unsubstituted alkyl groups (specific example group G3A) and the following substituted alkyl groups (specific example group G3B). (Here, the unsubstituted alkyl group refers to the case where the “substituted or unsubstituted alkyl group” is an “alkyl group unsubstituted by a substituent”, and the substituted alkyl group refers to the case where the “substituted or unsubstituted alkyl group“is an” alkyl group substituted by a substituent”). In this specification, in the case where simply referred as an “alkyl group” includes both the “unsubstituted alkyl group” and the “substituted alkyl group.”

The “substituted alkyl group” means a group in which one or more hydrogen atoms in the “unsubstituted alkyl group” are substituted by a substituent. Specific examples of the “substituted alkyl group” include groups in which one or more hydrogen atoms in the following “unsubstituted alkyl group” (specific example group G3A) are substituted by a substituent, the following substituted alkyl group (specific example group G3B), and the like. In this specification, the alkyl group in the “unsubstituted alkyl group” means a linear alkyl group. Thus, the “unsubstituted alkyl group” includes a straight-chain “unsubstituted alkyl group” and a branched-chain “unsubstituted alkyl group”. It should be noted that the examples of the “unsubstituted alkyl group” and the examples of the “substituted alkyl group” enumerated in this specification are mere examples, and the “substituted alkyl group” described in this specification includes a group in which hydrogen atom of the alkyl group itself in the “substituted alkyl group” of the specific example group G3B is further substituted by a substituent, and a group in which hydrogen atom of a substituent in the “substituted alkyl group” of the specific example group G3B is further substituted by a substituent.

Unsubstituted Alkyl Group (Specific Example Group G3A):

a methyl group,
an ethyl group,
a n-propyl group,
an isopropyl group,
a n-butyl group,
an isobutyl group,
a s-butyl group, and
a t-butyl group.

Substituted Alkyl Group (Specific Example Group G3B):

a heptafluoropropyl group (including isomers),
a pentafluoroethyl group,
a 2,2,2-trifluoroethyl group, and
a trifluoromethyl group.

“Substituted or Unsubstituted Alkenyl Group”

Specific examples of the “substituted or unsubstituted alkenyl group” described in this specification (specific example group G4) include the following unsubstituted alkenyl group (specific example group G4A), the following substituted alkenyl group (specific example group G4B), and the like. (Here, the unsubstituted alkenyl group refers to the case where the “substituted or unsubstituted alkenyl group” is a “alkenyl group unsubstituted by a substituent”, and the “substituted alkenyl group” refers to the case where the “substituted or unsubstituted alkenyl group” is a “alkenyl group substituted by a substituent.”). In this specification, in the case where simply referred as an “alkenyl group” includes both the “unsubstituted alkenyl group” and the “substituted alkenyl group.”

The “substituted alkenyl group” means a group in which one or more hydrogen atoms in the “unsubstituted alkenyl group” are substituted by a substituent. Specific examples of the “substituted alkenyl group” include a group in which the following “unsubstituted alkenyl group” (specific example group G4A) has a substituent, the following substituted alkenyl group (specific example group G4B), and the like. It should be noted that the examples of the “unsubstituted alkenyl group” and the examples of the “substituted alkenyl group” enumerated in this specification are mere examples, and the “substituted alkenyl group” described in this specification includes a group in which a hydrogen atom of the alkenyl group itself in the “substituted alkenyl group” of the specific example group G4B is further substituted by a substituent, and a group in which a hydrogen atom of a substituent in the “substituted alkenyl group” of the specific example group G4B is further substituted by a substituent.

Unsubstituted Alkenyl Group (Specific Example Group G4A):

a vinyl group,
an allyl group,
a 1-butenyl group,
a 2-butenyl group, and
a 3-butenyl group.

Substituted Alkenyl Group (Specific Example Group G4B):

a 1,3-butanedienyl group,
a 1-methylvinyl group,
a 1-methylallyl group,
a 1,1-dimethylallyl group,
a 2-methylallyl group, and
a 1,2-dimethylallyl group.

“Substituted or Unsubstituted Alkynyl Group”

Specific examples of the “substituted or unsubstituted alkynyl group” described in this specification (specific example group G5) include the following unsubstituted alkynyl group (specific example group G5A) and the like. (Here, the unsubstituted alkynyl group refers to the case where the “substituted or unsubstituted alkynyl group” is an “alkynyl group unsubstituted by a substituent”). In this specification, in the case where simply referred as an “alkynyl group” includes both the “unsubstituted alkynyl group” and the “substituted alkynyl group.”

The “substituted alkynyl group” means a group in which one or more hydrogen atoms in the “unsubstituted alkynyl group” are substituted by a substituent. Specific examples of the “substituted alkynyl group” include a group in which one or more hydrogen atoms in the following “unsubstituted alkynyl group” (specific example group G5A) are substituted by a substituent, and the like.

Unsubstituted Alkynyl Group (Specific Example Group G5A):

an ethynyl group.

“Substituted or Unsubstituted Cycloalkyl Group”

Specific examples of the “substituted or unsubstituted cycloalkyl group” described in this specification (specific example group G6) include the following unsubstituted cycloalkyl group (specific example group G6A), the following substituted cycloalkyl group (specific example group G6B), and the like. (Here, the unsubstituted cycloalkyl group refers to the case where the “substituted or unsubstituted cycloalkyl group“is a” cycloalkyl group unsubstituted by a substituent”, and the substituted cycloalkyl group refers to the case where the “substituted or unsubstituted cycloalkyl group” is a “cycloalkyl group substituted by a substituent”). In this specification, in the case where simply referred as a “cycloalkyl group” includes both the “unsubstituted cycloalkyl group” and the “substituted cycloalkyl group.”

The “substituted cycloalkyl group” means a group in which one or more hydrogen atoms in the “unsubstituted cycloalkyl group” are substituted by a substituent. Specific examples of the “substituted cycloalkyl group” include a group in which one or more hydrogen atoms in the following “unsubstituted cycloalkyl group” (specific example group G6A) are substituted by a substituent, and examples of the following substituted cycloalkyl group (specific example group G6B), and the like. It should be noted that the examples of the "unsubstituted cycloalkyl group" and the examples of the "substituted cycloalkyl group" enumerated in this specification are mere examples, and the "substituted cycloalkyl group" in this specification includes a group in which one or more hydrogen atoms bonded with the carbon atom of the cycloalkyl group itself in the "substituted cycloalkyl group" of the specific example group G6B are substituted by a substituent, and a group in which a hydrogen atom of a substituent in the "substituted cycloalkyl group" of specific example group G6B is further substituted by a substituent.

Unsubstituted Cycloalkyl Group (Specific Example Group G6A):

a cyclopropyl group,
a cyclobutyl group,
a cyclopentyl group,
a cyclohexyl group,
a 1-adamantyl group,
a 2-adamantyl group,
a 1-norbornyl group, and
a 2-norbornyl group.

Substituted Cycloalkyl Group (Specific Example Group G6B):

a 4-methylcyclohexyl group.

"Group Represented by —Si($R_{901}$)($R_{902}$)($R_{903}$)"

Specific examples of the group represented by —Si($R_{901}$)($R_{902}$)($R_{903}$) described in this specification (specific example group G7) include:

—Si(G1)(G1)(G1),
—Si(G1)(G2)(G2),
—Si(G1)(G1)(G2),
—Si(G2)(G2)(G2),
—Si(G3)(G3)(G3); and
—Si(G6)(G6)(G6).

G1 is the "substituted or unsubstituted aryl group" described in the specific example group G1.
G2 is the "substituted or unsubstituted heterocyclic group" described in the specific example group G2.
G3 is the "substituted or unsubstituted alkyl group" described in the specific example group G3.
G6 is the "substituted or unsubstituted cycloalkyl group" described in the specific example group G6.
Plural G1's in —Si(G1)(G1)(G1) are the same or different.
Plural G2's in —Si(G1)(G2)(G2) are the same or different.
Plural G1's in —Si(G1)(G1)(G2) are the same or different.
Plural G2's in —Si(G2)(G2)(G2) are be the same or different.
Plural G3's in —Si(G3)(G3)(G3) are the same or different.
Plural G6's in —Si(G6)(G6)(G6) are be the same or different.

"Group Represented by —O—($R_{904}$)"

Specific examples of the group represented by —O—($R_{904}$) in this specification (specific example group G8) include:

—O(G1),
—O(G2),
—O(G3), and
—O(G6).

G1 is the "substituted or unsubstituted aryl group" described in the specific example group G1.
G2 is the "substituted or unsubstituted heterocyclic group" described in the specific example group G2.
G3 is the "substituted or unsubstituted alkyl group" described in the specific example group G3.
G6 is the "substituted or unsubstituted cycloalkyl group" described in the specific example group G6.

"Group Represented by —S—($R_{905}$)"

Specific examples of the group represented by —S—($R_{905}$) in this specification (specific example group G9) include:

—S(G1),
—S(G2),
—S(G3), and
—S(G6).

G1 is the "substituted or unsubstituted aryl group" described in the specific example group G1.
G2 is the "substituted or unsubstituted heterocyclic group" described in the specific example group G2.
G3 is the "substituted or unsubstituted alkyl group" described in the specific example group G3.
G6 is the "substituted or unsubstituted cycloalkyl group" described in the specific example group G6.

"Group Represented by —N($R_{906}$)($R_{907}$)"

Specific examples of the group represented by —N($R_{906}$)($R_{907}$) in this specification (specific example group G10) include:

—N(G1)(G1),
—N(G2)(G2),
—N(G1)(G2),
—N(G3)(G3), and
—N(G6)(G6).

G1 is the "substituted or unsubstituted aryl group" described in the specific example group G1.
G2 is the "substituted or unsubstituted heterocyclic group" described in the specific example group G2.
G3 is the "substituted or unsubstituted alkyl group" described in the specific example group G3.
G6 is the "substituted or unsubstituted cycloalkyl group" described in the specific example group G6.
Plural G1's in —N(G1)(G1) are the same or different.
Plural G2's in —N(G2)(G2) are the same or different.
Plural G3's in —N(G3)(G3) are the same or different.
Plural G6's in —N(G6)(G6) are the same or different.

"Halogen Atom"

Specific examples of the "halogen atom" described in this specification (specific example group G11) include a fluorine atom, a chlorine atom, a bromine atom, an iodine atom, and the like.

"Substituted or Unsubstituted Fluoroalkyl Group"

The "substituted or unsubstituted fluoroalkyl group" described in this specification is a group in which at least one hydrogen atom bonded with a carbon atom constituting the alkyl group in the "substituted or unsubstituted alkyl group" is substituted by a fluorine atom, and includes a group in which all hydrogen atoms bonded with a carbon atom constituting the alkyl group in the "substituted or unsubstituted alkyl group" are substituted by a fluorine atom (a perfluoro group). The number of carbon atoms of the "unsubstituted fluoroalkyl group" is 1 to 50, preferably 1 to 30, more preferably 1 to 18, unless otherwise specified in this specification. The "substituted fluoroalkyl group" means a group in which one or more hydrogen atoms of the "fluoroalkyl group" are substituted by a substituent. The "substituted fluoroalkyl group" described in this specification also includes a group in which one or more hydrogen atoms bonded with a carbon atom of the alkyl chains in the "substituted fluoroalkyl group" are further substituted by a substituent, and a group in which one or more hydrogen atom of a substituent in the "substituted fluoroalkyl group" are further substituted by a substituent. Specific examples of the "unsubstituted fluoroalkyl group" include a group in which one or more hydrogen atoms in the "alkyl group" (specific group G3) are substituted by a fluorine atom, and the like.

"Substituted or Unsubstituted Haloalkyl Group"

The "substituted or unsubstituted haloalkyl group" described in this specification is a group in which at least one hydrogen atom bonded with a carbon atom constituting the alkyl group in the "substituted or unsubstituted alkyl group" is substituted by a halogen atom, and also includes a group in which all hydrogen atoms bonded with a carbon atom constituting the alkyl group in the "substituted or unsubstituted alkyl group" are substituted by a halogen atom. The number of carbon atoms of the "unsubstituted haloalkyl group" is 1 to 50, preferably 1 to 30, more preferably 1 to 18, unless otherwise specified in this specification. The "substituted haloalkyl group" means a group in which one or more hydrogen atoms of the "haloalkyl group" are substituted by a substituent. The "substituted haloalkyl group" described in this specification also includes a group in which one or more hydrogen atoms bonded with a carbon atom of the alkyl chain in the "substituted haloalkyl group" are further substituted by a substituent, and a group in which one or more hydrogen atoms of a substituent in the "substituted haloalkyl group" are further substituted by a substituent. Specific examples of the "unsubstituted haloalkyl group" include a group in which one or more hydrogen atoms in the "alkyl group" (specific example group G3) are substituted by a halogen atom, and the like. A haloalkyl group is sometimes referred to as an alkyl halide group.

"Substituted or Unsubstituted Alkoxy Group"

Specific examples of the "substituted or unsubstituted alkoxy group" described in this specification include a group represented by —O(G3), wherein G3 is the "substituted or unsubstituted alkyl group" described in the specific example group G3. The number of carbon atoms of the "unsubstituted alkoxy group" is 1 to 50, preferably 1 to 30, more preferably 1 to 18, unless otherwise specified in this specification.

"Substituted or Unsubstituted Alkylthio Group"

Specific examples of the "substituted or unsubstituted alkylthio group" described in this specification include a group represented by —S(G3), wherein G3 is the "substituted or unsubstituted alkyl group" described in the specific example group G3. The number of carbon atoms of the "unsubstituted alkylthio group" is 1 to 50, preferably 1 to 30, more preferably 1 to 18, unless otherwise specified in this specification.

"Substituted or Unsubstituted Aryloxy Group"

Specific examples of the "substituted or unsubstituted aryloxy group" described in this specification include a group represented by —O(G1), wherein G1 is the "substituted or unsubstituted aryl group" described in the specific example group G1. The number of ring carbon atoms of the "unsubstituted aryloxy group" is 6 to 50, preferably 6 to 30, more preferably 6 to 18, unless otherwise specified in this specification.

"Substituted or Unsubstituted Arylthio Group"

Specific examples of the "substituted or unsubstituted arylthio group" described in this specification include a group represented by —S(G1), wherein G1 is a "substituted or unsubstituted aryl group" described in the specific example group G1. The number of ring carbon atoms of the "unsubstituted arylthio group" is 6 to 50, preferably 6 to 30, more preferably 6 to 18, unless otherwise specified in this specification.

"Substituted or Unsubstituted Trialkylsilyl Group"

Specific examples of the "trialkylsilyl group" described in this specification include a group represented by —Si(G3)(G3)(G3), where G3 is the "substituted or unsubstituted alkyl group" described in the specific example group G3. Plural G3's in —Si(G3)(G3)(G3) are the same or different. The number of carbon atoms in each alkyl group of the "trialkylsilyl group" is 1 to 50, preferably 1 to 20, more preferably 1 to 6, unless otherwise specified in this specification.

"Substituted or Unsubstituted Aralkyl Group"

Specific examples of the "substituted or unsubstituted aralkyl group" described in this specification is a group represented by -(G3)-(G1), wherein G3 is the "substituted or unsubstituted alkyl group" described in the specific example group G3, and G1 is the "substituted or unsubstituted aryl group" described in the specific example group G1. Therefore, the "aralkyl group" is a group in which a hydrogen atom of the "alkyl group" is substituted by an "aryl group" as a substituent, and is one form of the "substituted alkyl group." The "unsubstituted aralkyl group" is the "unsubstituted alkyl group" substituted by the "unsubstituted aryl group", and the number of carbon atoms of the "unsubstituted aralkyl group" is 7 to 50, preferably 7 to 30, more preferably 7 to 18, unless otherwise specified in this specification.

Specific examples of the "substituted or unsubstituted aralkyl group" include a benzyl group, a 1-phenylethyl group, a 2-phenylethyl group, a 1-phenylisopropyl group, a 2-phenylisopropyl group, a phenyl-t-butyl group, an α-naphthylmethyl group, a 1-α-naphthylethyl group, a 2-α-naphthylethyl group, a 1-α-naphthylisopropyl group, a 2-α-naphthylisopropyl group, a β-naphthylmethyl group, a 1-β-naphthylethyl group, a 2-β-naphthylethyl group, a 1-β-naphthylisopropyl group, a 2-β-naphthylisopropyl group, and the like.

Unless otherwise specified in this specification, examples of the substituted or unsubstituted aryl group described in this specification preferably include a phenyl group, a p-biphenyl group, a m-biphenyl group, an o-biphenyl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group, an o-terphenyl-4-yl group, an o-terphenyl-3-yl group, an o-terphenyl-2-yl group, a 1-naphthyl group, a 2-naphthyl group, an anthryl group, a phenanthryl group, a pyrenyl group, a chrysenyl group, a triphenylenyl group, a fluorenyl group, a 9,9'-spirobifluorenyl group, 9,9-dimethylfluorenyl group, 9,9-diphenylfluorenyl group, and the like.

Unless otherwise specified in this specification, examples of the substituted or unsubstituted heterocyclic groups described in this specification preferably include a pyridyl group, a pyrimidinyl group, a triazinyl group, a quinolyl group, an isoquinolyl group, a quinazolinyl group, a benzimidazolyl group, a phenanthrolinyl group, a carbazolyl group (a 1-carbazolyl group, a 2-carbazolyl group, a 3-carbazolyl group, a 4-carbazolyl group, or a 9-carbazolyl group), a benzocarbazolyl group, an azacarbazolyl group, a diazacarbazolyl group, a dibenzofuranyl group, a naphthobenzofuranyl group, an azadibenzofuranyl group, a diazadibenzofuranyl group, a dibenzothiophenyl group, a naphthobenzothiophenyl group, an azadibenzothiophenyl group, a diazadibenzothiophenyl group; a (9-phenyl)carbazolyl group (a (9-phenyl)carbazol-1-yl group, a (9-phenyl)carbazol-2-yl group, a (9-phenyl)carbazol-3-yl group, or a (9-phenyl)carbazol-4-yl group), a (9-biphenylyl)carbazolyl group, a (9-phenyl)phenylcarbazolyl group, a diphenylcarbazol-9-yl group, a phenylcarbazol-9-yl group, a phenyltriazinyl group, a biphenylyltriazinyl group, a diphenyltriazinyl group, a phenyldibenzofuranyl group, a phenyldibenzothiophenyl group, and the like.

In this specification, the carbazolyl group is specifically any of the following groups, unless otherwise specified in this specification.

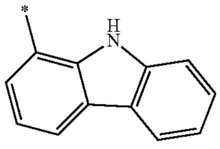

(TEMP-Cz1)

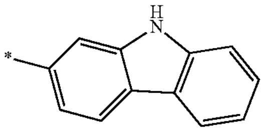

(TEMP-Cz2)

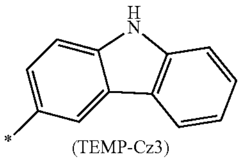

(TEMP-Cz3)

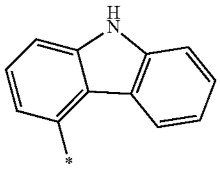

(TEMP-Cz4)

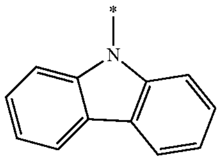

(TEMP-Cz5)

In this specification, the (9-phenyl)carbazolyl group is specifically any of the following groups, unless otherwise specified in this specification.

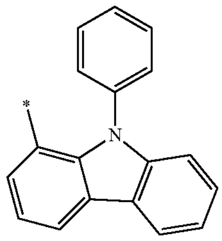

(TEMP-Cz6)

-continued

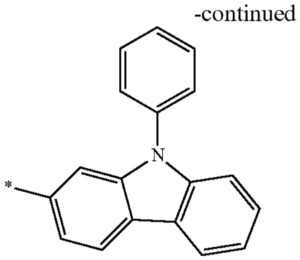

(TEMP-Cz7)

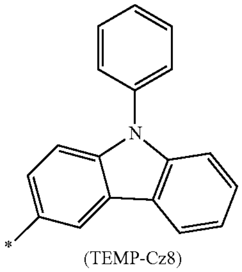

(TEMP-Cz8)

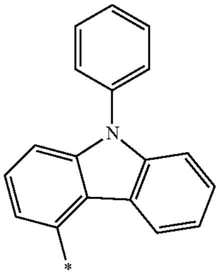

(TEMP-Cz9)

In the general formulas (TEMP-Cz1) to (TEMP-Cz9), * represents a bonding position.

In this specification, the dibenzofuranyl group and the dibenzothiophenyl group are specifically any of the following groups, unless otherwise specified in this specification.

(TEMP-34)

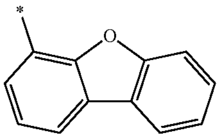

(TEMP-35)

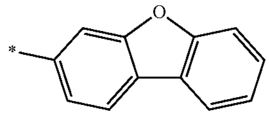

(TEMP-36)

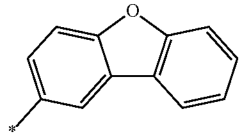

(TEMP-37)

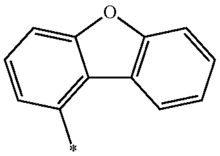

-continued (TEMP-38)

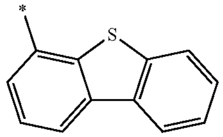

(TEMP-39)

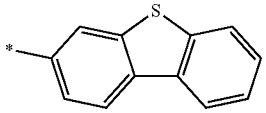

(TEMP-40)

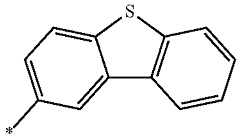

(TEMP-41)

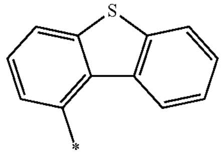

In the general formulas (TEMP-34) to (TEMP-41), * represents a bonding position.

The substituted or unsubstituted alkyl group described in this specification is preferably a methyl group, an ethyl group, a propyl group, an isopropyl group, a n-butyl group, an isobutyl group, a t-butyl group, or the like, unless otherwise specified in this specification.

"Substituted or Unsubstituted Arylene Group"

The "substituted or unsubstituted arylene group" described in this specification is a divalent group derived by removing one hydrogen atom on the aryl ring of the "substituted or unsubstituted aryl group", unless otherwise specified. Specific examples of the "substituted or unsubstituted arylene group" (specific example group G12) include a divalent group derived by removing one hydrogen atom on the aryl ring of the "substituted or unsubstituted aryl group" described in the specific example group G1, and the like.

"Substituted or Unsubstituted Divalent Heterocyclic Group"

The "substituted or unsubstituted divalent heterocyclic group" described in this specification is a divalent group derived by removing one hydrogen atom on the heterocyclic ring of the "substituted or unsubstituted heterocyclic group", unless otherwise specified. Specific examples of the "substituted or unsubstituted divalent heterocyclic group" (specific example group G13) include a divalent group derived by removing one hydrogen atom on the heterocyclic ring of the "substituted or unsubstituted heterocyclic group" described in the specific example group G2, and the like.

"Substituted or Unsubstituted Alkylene Group"

The "substituted or unsubstituted alkylene group" described in this specification is a divalent group derived by removing one hydrogen atom on the alkyl chain of the "substituted or unsubstituted alkyl group", unless otherwise specified. Specific examples of the "substituted or unsubstituted alkylene group" (specific example group G14) include a divalent group derived by removing one hydrogen atom on the alkyl chain of the "substituted or unsubstituted alkyl group" described in the specific example group G3, and the like.

The substituted or unsubstituted arylene group described in this specification is preferably any group of the following general formulas (TEMP-42) to (TEMP-68), unless otherwise specified in this specification.

(TEMP-42)

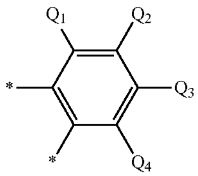

(TEMP-43)

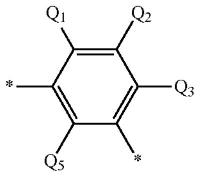

(TEMP-44)

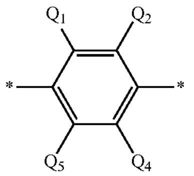

(TEMP-45)

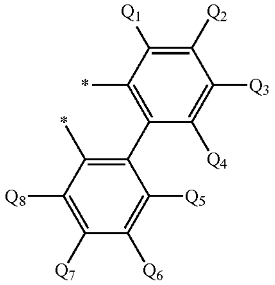

(TEMP-46)

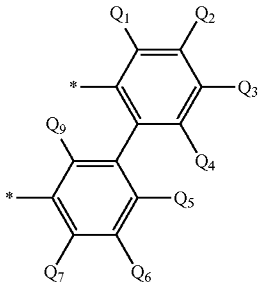

(TEMP-47)

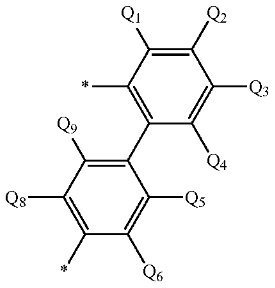

-continued
(TEMP-48)
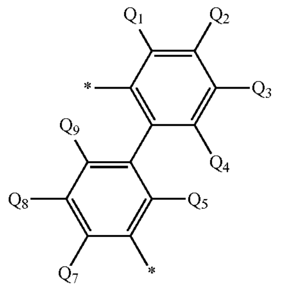
(TEMP-49)
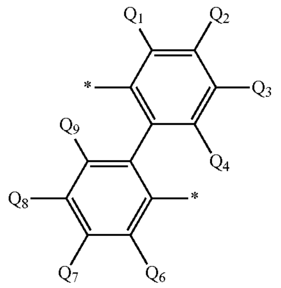
(TEMP-50)
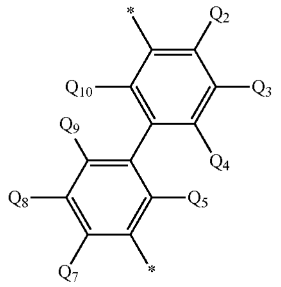
(TEMP-51)
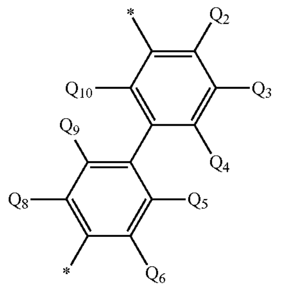
(TEMP-52)
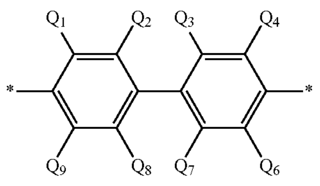
In the general formulas (TEMP-42) to (TEMP-52), $Q_1$ to $Q_{10}$ are independently a hydrogen atom or a substituent.
In the general formulas (TEMP-42) to (TEMP-52), * represents a bonding position.
(TEMP-53)
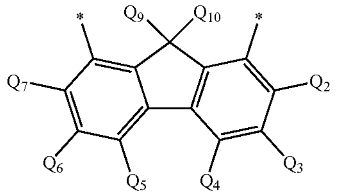
(TEMP-54)
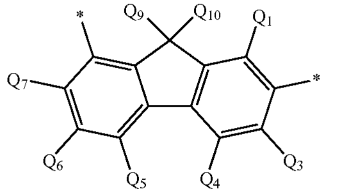
(TEMP-55)
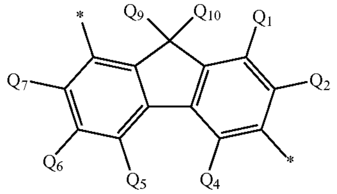
(TEMP-56)
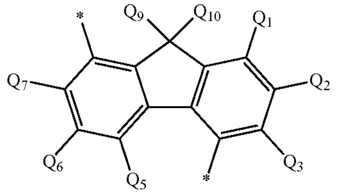
(TEMP-57)
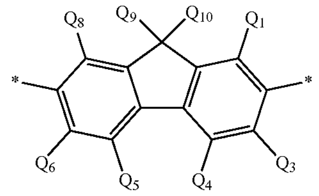
(TEMP-58)
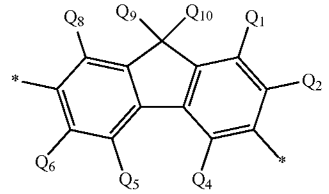
(TEMP-59)
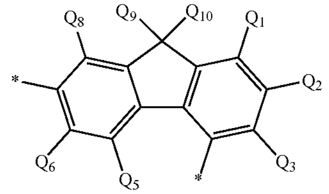
(TEMP-60)
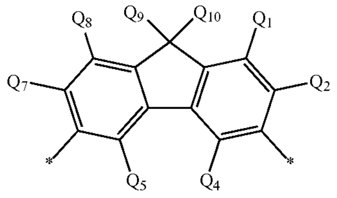

-continued (TEMP-61)

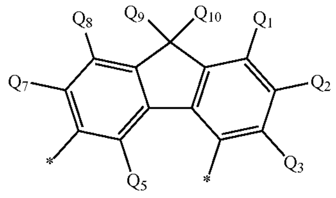

(TEMP-62)

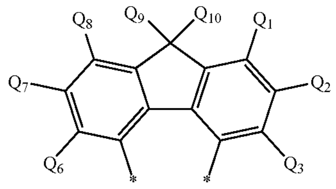

In the general formulas (TEMP-53) to (TEMP-62), $Q_1$ to $Q_{10}$ are independently a hydrogen atom or a substituent.

$Q_9$ and $Q_{10}$ may be bonded with each other via a single bond to form a ring.

In the general formulas (TEMP-53) to (TEMP-62), * represents a bonding position.

(TEMP-63)

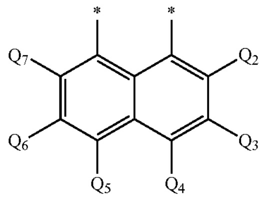

(TEMP-64)

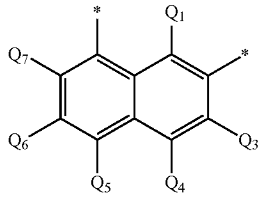

(TEMP-65)

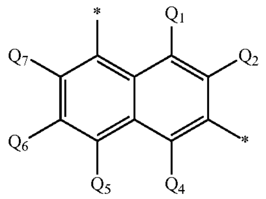

(TEMP-66)

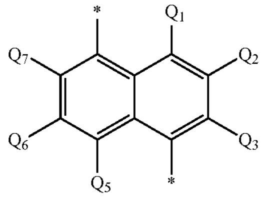

-continued (TEMP-67)

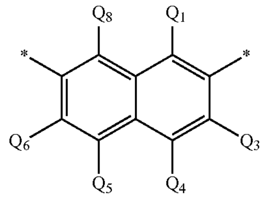

(TEMP-68)

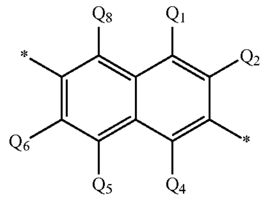

In the general formulas (TEMP-63) to (TEMP-68), $Q_1$ to $Q_8$ are independently a hydrogen atom or a substituent.

In the general formulas (TEMP-63) to (TEMP-68), * represents a bonding position.

The substituted or unsubstituted divalent heterocyclic group described in this specification is preferably any group of the following general formulas (TEMP-69) to (TEMP-102), unless otherwise specified in this specification.

(TEMP-69)

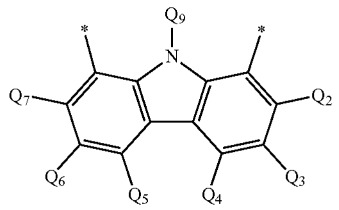

(TEMP-70)

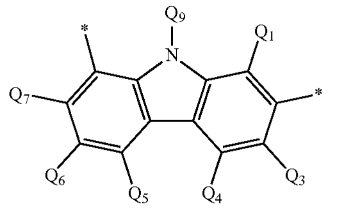

(TEMP-71)

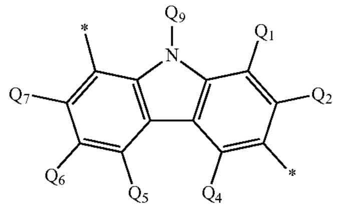

(TEMP-72)

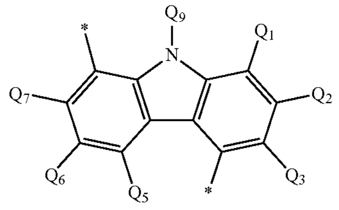

-continued
(TEMP-73)
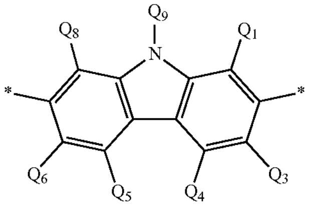
(TEMP-74)
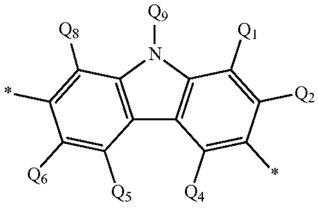
(TEMP-75)
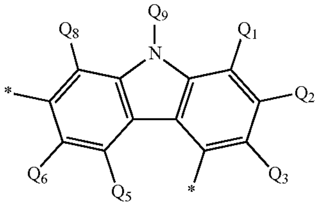
(TEMP-76)
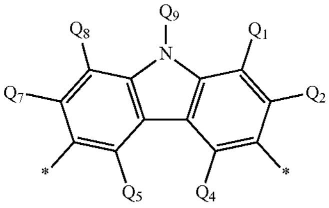
(TEMP-77)
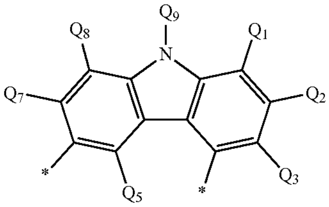
(TEMP-78)
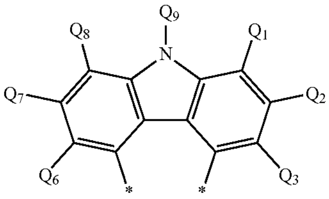
(TEMP-79)
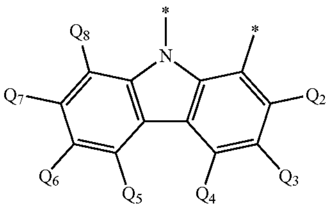
-continued
(TEMP-80)
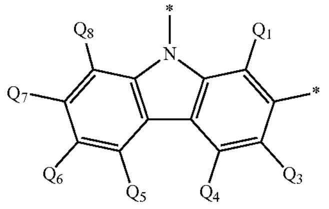
(TEMP-81)
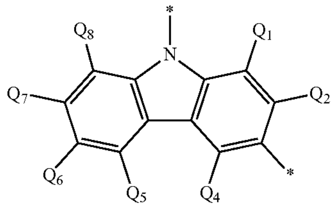
(TEMP-82)
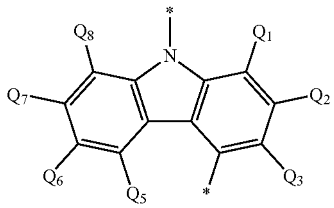
In the general formulas (TEMP-69) to (TEMP-82), $Q_1$ to $Q_9$ are independently a hydrogen atom or a substituent.
(TEMP-83)
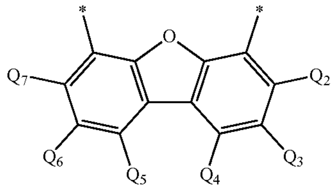
(TEMP-84)
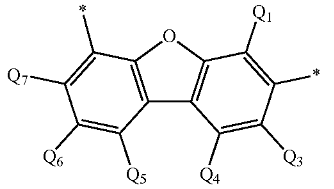
(TEMP-85)
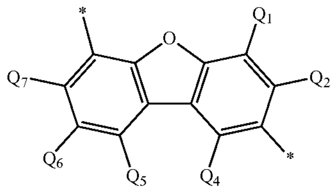
(TEMP-86)
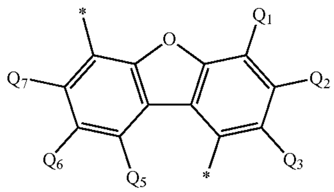

-continued
(TEMP-87)
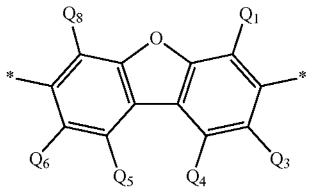
(TEMP-88)
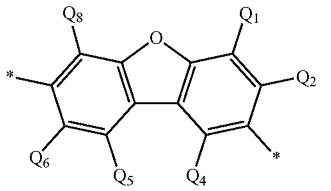
(TEMP-89)
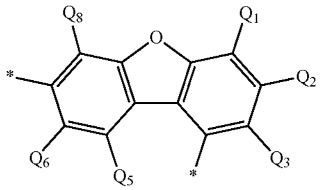
(TEMP-90)
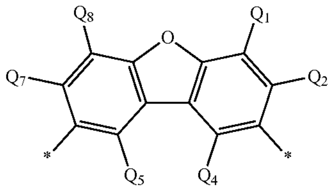
(TEMP-91)
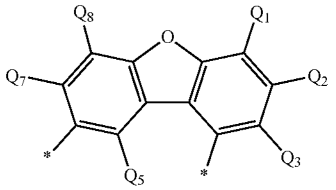
(TEMP-92)
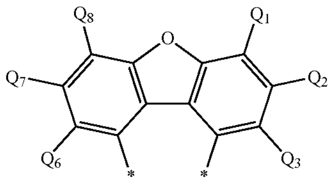
(TEMP-93)
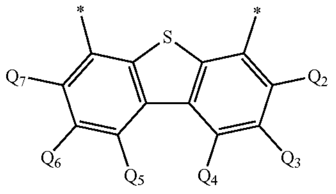
(TEMP-94)
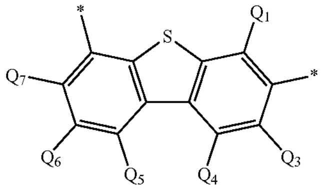
-continued
(TEMP-95)
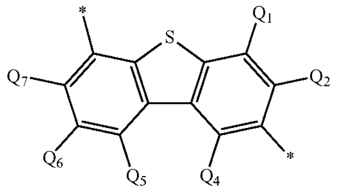
(TEMP-96)
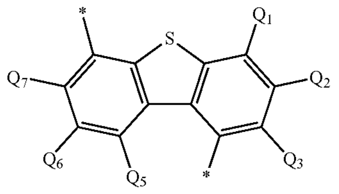
(TEMP-97)
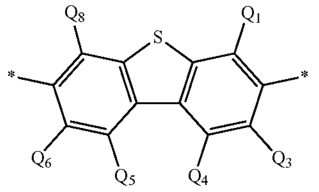
(TEMP-98)
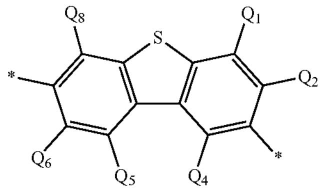
(TEMP-99)
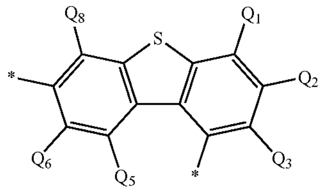
(TEMP-100)
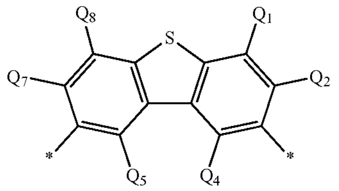
(TEMP-101)
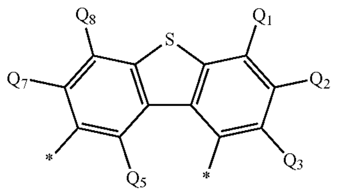
(TEMP-102)
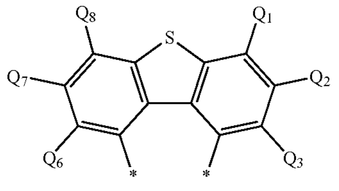

in the general formulas (TEMP-83) to (TEMP-102), $Q_1$ to $Q_8$ are independently a hydrogen atom or a substituent.

The above is the explanation of the "Substituent described in this specification."

"the Case where Bonded with Each Other to Form a Ring"

In this specification, the case where "one or more sets of adjacent two or more form a substituted or unsubstituted monocycle by bonding with each other, form a substituted or unsubstituted fused ring by bonding with each other, or do not bond with each other" means the case where "one or more sets of adjacent two or more form a substituted or unsubstituted monocycle by bonding with each other"; the case where "one or more sets of adjacent two or more form a substituted or unsubstituted fused ring by bonding with each other"; and the case where "one or more sets of adjacent two or more do not bond with each other."

The case where "one or more sets of adjacent two or more form a substituted or unsubstituted monocycle by bonding with each other" and the case where "one or more sets of adjacent two or more form a substituted or unsubstituted fused ring by bonding with each other" in this specification (these cases may be collectively referred to as "the case where forming a ring by bonding with each other") will be described below. The case of an anthracene compound represented by the following general formula (TEMP-103) in which the mother skeleton is an anthracene ring will be described as an example.

(TEMP-103)

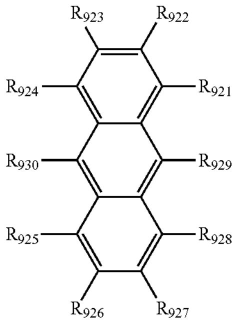

For example, in the case where "one or more sets of adjacent two or more among $R_{921}$ to $R_{930}$ form a ring by bonding with each other", the one set of adjacent two includes a pair of $R_{921}$ and $R_{922}$, a pair of $R_{922}$ and $R_{923}$, a pair of $R_{923}$ and $R_{924}$, a pair of $R_{924}$ and $R_{930}$, a pair of $R_{930}$ and $R_{925}$, a pair of $R_{925}$ and $R_{926}$, a pair of $R_{926}$ and $R_{927}$, a pair of $R_{927}$ and $R_{928}$, a pair of $R_{928}$ and $R_{929}$, and a pair of $R_{929}$ and $R_{921}$.

The "one or more sets" means that two or more sets of the adjacent two or more sets may form a ring at the same time. For example, $R_{921}$ and $R_{922}$ form a ring $Q_A$ by bonding with each other, and at the same, time $R_{925}$ and $R_{926}$ form a ring $Q_B$ by bonding with each other, the anthracene compound represented by the general formula (TEMP-103) is represented by the following general formula (TEMP-104).

(TEMP-104)

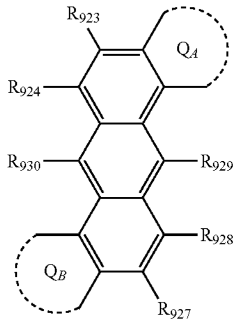

The case where the "set of adjacent two or more" form a ring includes not only the case where the set (pair) of adjacent "two" is bonded with as in the above-mentioned examples, but also the case where the set of adjacent "three or more" are bonded with each other. For example, it means the case where $R_{921}$ and $R_{922}$ form a ring $Q_A$ by bonding with each other, and $R_{922}$ and $R_{923}$ form a ring $Q_C$ by bonding with each other, and adjacent three ($R_{921}$, $R_{922}$ and $R_{923}$) form rings by bonding with each other and together fused to the anthracene mother skeleton. In this case, the anthracene compound represented by the general formula (TEMP-103) is represented by the following general formula (TEMP-105). In the following general formula (TEMP-105), the ring $Q_A$ and the ring $Q_C$ share $R_{922}$.

(TEMP-105)

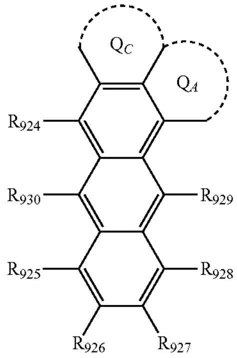

The "monocycle" or "fused ring" formed may be a saturated ring or an unsaturated ring, as a structure of the formed ring alone. Even when the "one pair of adjacent two" forms a "monocycle" or a "fused ring", the "monocycle" or the "fused ring" may form a saturated ring or an unsaturated ring. For example, the ring $Q_A$ and the ring $Q_B$ formed in the general formula (TEMP-104) are independently a "monocycle" or a "fused ring." The ring $Q_A$ and the ring $Q_C$ formed in the general formula (TEMP-105) are "fused ring." The ring $Q_A$ and ring $Q_C$ of the general formula (TEMP-105) are fused ring by fusing the ring $Q_A$ and the ring $Q_C$ together. When the ring $Q_A$ of the general formula (TMEP-104) is a benzene ring, the ring $Q_A$ is a monocycle. When the ring $Q_A$ of the general formula (TMEP-104) is a naphthalene ring, the ring $Q_A$ is a fused ring.

The "unsaturated ring" means an aromatic hydrocarbon ring or an aromatic heterocyclic ring. The "saturated ring" means an aliphatic hydrocarbon ring, or a non-aromatic heterocyclic ring.

Specific examples of the aromatic hydrocarbon ring include a structure in which the group listed as a specific example in the specific example group G1 is terminated by a hydrogen atom.

Specific examples of the aromatic heterocyclic ring include a structure in which the aromatic heterocyclic group listed as a specific example in the example group G2 is terminated by a hydrogen atom.

Specific examples of the aliphatic hydrocarbon ring include a structure in which the group listed as a specific example in the specific example group G6 is terminated by a hydrogen atom.

The term "to form a ring" means forming a ring only with plural atoms of the mother skeleton, or with plural atoms of the mother skeleton and one or more arbitrary elements in addition. For example, the ring $Q_A$ shown in the general formula (TEMP-104), which is formed by bonding $R_{921}$ and $R_{922}$ with each other, is a ring formed from the carbon atom of the anthracene skeleton with which $R_{921}$ is bonded, the carbon atom of the anthracene skeleton with which $R_{922}$ is bonded, and one or more arbitrary elements. For example, in the case where the ring $Q_A$ is formed with $R_{921}$ and $R_{922}$, when a monocyclic unsaturated ring is formed with the carbon atom of the anthracene skeleton with which $R_{921}$ is bonded, the carbon atom of the anthracene skeleton with which $R_{922}$ is bonded, and four carbon atoms, the ring formed with $R_{921}$ and $R_{922}$ is a benzene ring.

Here, the "arbitrary element" is preferably at least one element selected from the group consisting of a carbon element, a nitrogen element, an oxygen element, and a sulfur element, unless otherwise specified in this specification. In the arbitrary element (for example, a carbon element or a nitrogen element), a bond which does not form a ring may be terminated with a hydrogen atom or the like, or may be substituted with "arbitrary substituent" described below. When an arbitrary element other than a carbon element is contained, the ring formed is a heterocyclic ring.

The number of "one or more arbitrary element(s)" constituting a monocycle or a fused ring is preferably 2 or more and 15 or less, more preferably 3 or more and 12 or less, and still more preferably 3 or more and 5 or less, unless otherwise specified in this specification.

The "monocycle" is preferable among the "monocycle" and the "fused ring", unless otherwise specified in this specification.

The "unsaturated ring" is preferable among the "saturated ring" and the "unsaturated ring", unless otherwise specified in this specification.

Unless otherwise specified in this specification, the "monocycle" is preferably a benzene ring.

Unless otherwise specified in this specification, the "unsaturated ring" is preferably a benzene ring.

Unless otherwise specified in this specification, when "one or more sets of adjacent two or more" are "bonded with each other to form a substituted or unsubstituted monocycle" or "bonded with each other to form a substituted or unsubstituted fused ring", this specification, one or more sets of adjacent two or more are preferably bonded with each other to form a substituted or unsubstituted "unsaturated ring" from plural atoms of the mother skeleton and one or more and 15 or less elements which is at least one kind selected from a carbon elements, a nitrogen element, an oxygen element, and a sulfur element.

The substituent in the case where the above-mentioned "monocycle" or "fused ring" has a substituent is, for example, an "arbitrary substituent" described below. Specific examples of the substituent which the above-mentioned "monocycle" or "fused ring" has include the substituent described above in the "Substituent described in this specification" section.

The substituent in the case where the above-mentioned "saturated ring" or "unsaturated ring" has a substituent is, for example, an "arbitrary substituent" described below. Specific examples of the substituent which the above-mentioned "monocycle" or "fused ring" has include the substituent described above in the "Substituent described in this specification" section.

The foregoing describes the case where "one or more sets of adjacent two or more form a substituted or unsubstituted monocycle by bonding with each other" and the case where "one or more sets of adjacent two or more form a substituted or unsubstituted fused ring by bonding with each other "(the case where "forming a ring by bonding with each other").

Substituent in the case of "substituted or unsubstituted"

In one embodiment in this specification, the substituent (in this specification, sometimes referred to as an "arbitrary substituent") in the case of "substituted or unsubstituted" is, for example, a group selected from the group consisting of:

an unsubstituted alkyl group including 1 to 50 carbon atoms, an unsubstituted alkenyl group including 2 to 50 carbon atoms, an unsubstituted alkynyl group including 2 to 50 carbon atoms, an unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, an unsubstituted aryl group including 6 to 50 ring carbon atoms, and an unsubstituted heterocyclic group including 5 to 50 ring atoms, wherein, $R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted heterocyclic group including 5 to 50 ring atoms.

When two or more $R_{901}$'s are present, the two or more $R_{901}$'s may be the same or different.

When two or more $R_{902}$'s are present, the two or more $R_{902}$'s may be the same or different.

When two or more $R_{903}$'s are present, the two or more $R_{903}$'s may be the same or different.

When two or more $R_{904}$'s are present, the two or more $R_{904}$'s may be the same or different.

When two or more $R_{905}$'s are present, the two or more $R_{905}$'s may be the same or different.

When two or more $R_{906}$'s are present, the two or more $R_{906}$'s may be the same or different.

When two or more $R_{907}$'s are present, the two or more $R_{907}$'s may be the same or different.

In one embodiment, the substituent in the case of "substituted or unsubstituted" is a group selected from the group consisting of:

an alkyl group including 1 to 50 carbon atoms, an aryl group including 6 to 50 ring carbon atoms, and a heterocyclic group including 5 to 50 ring atoms.

In one embodiment, the substituent in the case of "substituted or unsubstituted" is a group selected from the group consisting of:

an alkyl group including 1 to 18 carbon atoms, an aryl group including 6 to 18 ring carbon atoms, and a heterocyclic group including 5 to 18 ring atoms.

Specific examples of each of the arbitrary substituents include specific examples of substituent described in the section "Substituent described in this specification" above.

Unless otherwise specified in this specification, adjacent arbitrary substituents may form a "saturated ring" or an "unsaturated ring", preferably form a substituted or unsubstituted saturated 5-membered ring, a substituted or unsubstituted saturated 6-membered ring, a substituted or unsubstituted unsaturated 5-membered ring, or a substituted or unsubstituted unsaturated 6-membered ring, more preferably form a benzene ring.

Unless otherwise specified in this specification, the arbitrary substituent may further have a substituent. The substituent which the arbitrary substituent further has is the same as that of the above-mentioned arbitrary substituent.

In this specification, the numerical range represented by "AA to BB" means the range including the numerical value AA described on the front side of "AA to BB" as the lower limit and the numerical value BB described on the rear side of "AA to BB" as the upper limit.

[Organic EL Device]

The organic EL device according to an aspect of the invention is an organic EL device containing a cathode, an anode, and an emitting layer disposed between the cathode and the anode, wherein the emitting layer contains a first host material, a second host material, and a dopant material.

The first host material is a compound represented by the following formula (1).

The second host material is a compound represented by the following formula (2).

One or more selected from the group consisting of the compound represented by the formula (1) and the compound represented by the formula (2) have at least one deuterium atom.

Note that the first host material and the second host material are different materials.

The organic EL device according to an aspect of the invention exhibits high device performance by having the above-mentioned configuration. Specifically, an organic EL device having a low driving voltage, a high external quantum efficiency, a long lifetime can be provided.

Details of each material will be described later.

Schematic configuration of organic EL device according to one aspect of the invention will be explained referring to the FIGURE.

The organic EL device 1 according to an aspect of the invention includes a substrate 2, an anode 3, an emitting layer 5, a cathode 10, an organic layer 4 between the anode 3 and the emitting layer 5, and an organic layer 6 between the emitting layer 5 and the cathode 10.

The first host material, the second host material, and the dopant material are contained in the emitting layer 5 between the anode 3 and the cathode 10. Each of the compounds contained in the emitting layer 5 may be one compound alone or two or more compounds.

Although the organic EL device 1 may contain an emitting layer other than the emitting layer 5, in an aspect of the invention, a single emitting layer 5 generally contains a first host material, a second host material, and a dopant material.

(First Host Material)

The first host material is a compound represented by the following formula (1):

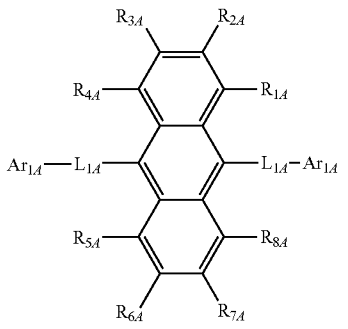

(1)

wherein in the formula (1), $R_{1A}$ to $R_{8A}$ are independently a hydrogen atom, a substituent R, or a group represented by the following formula (1A);

the substituent R is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

when two or more of the substituents R are present, the two or more of the substituents R may be the same as or different from each other;

$L_{1A}$'s are independently a single bond, a substituted or unsubstituted arylene group including 6 to 50 ring carbon atoms, or a substituted or unsubstituted divalent heterocyclic group including 5 to 50 ring atoms;

$Ar_{1A}$ are independently a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ are the same as or different from each other;

$$-L_{1A}-Ar_{1A} \quad (1A)$$

wherein in the formula (1A), $L_{1A}$ and $Ar_{1A}$ are as defined in the formula (1); and when two or more groups represented by the formula (1A) are present, the two or more of each of the groups represented by the formula (1A) may be the same as or different from each other.

In one embodiment, the compound represented by the formula (1) is a compound represented by the formula following (1-1):

(1-1)

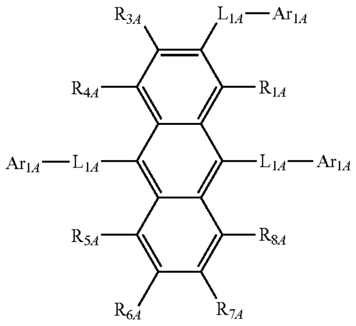

wherein in the formula (1-1), $R_{1A}$, $R_{3A}$ to $R_{8A}$, $L_{1A}$, and $Ar_{1A}$ are as defined in the formula (1).

In one embodiment, the compound represented by the formula (1) is a compound represented by the following formula (1-11), the following formula (1-12), or the following formula (1-13):

(1-11)

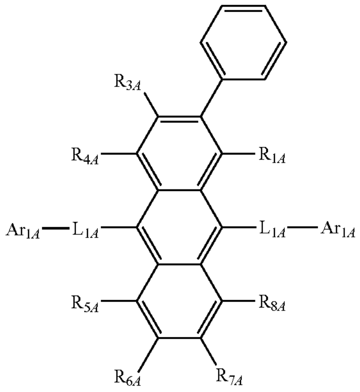

-continued (1-12)

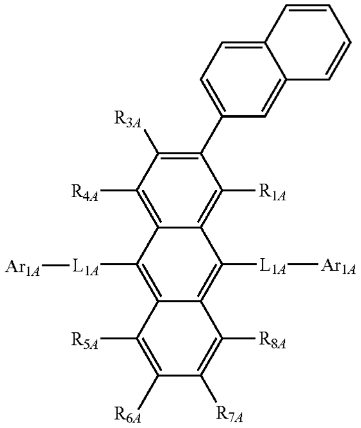

(1-13)

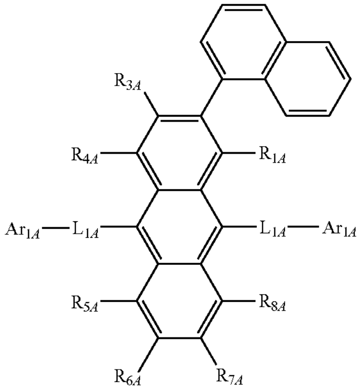

wherein in the formula (1-11), the formula (1-12), and the formula (1-13), $R_{1A}$, $R_{3A}$ to $R_{8A}$, $L_{1A}$, and $Ar_{1A}$ are as defined in the formula (1).

In one embodiment, the compound represented by the formula (1) is a compound represented by the following formula (1-2):

(1-2)

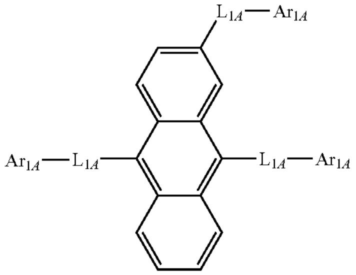

wherein in the formula (1-2), $L_{1A}$ and $Ar_{1A}$ are as defined in the formula (1).

In one embodiment, the compound represented by the formula (1) is a compound represented by the following formula (1-21), the following formula (1-22), or the following formula (1-23):

(1-21)

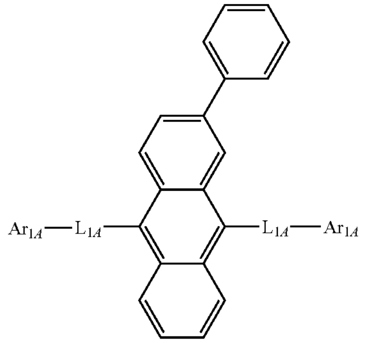

(1-22)

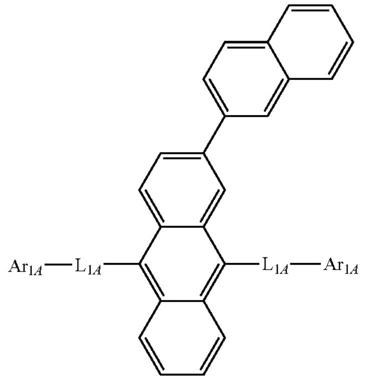

(1-23)

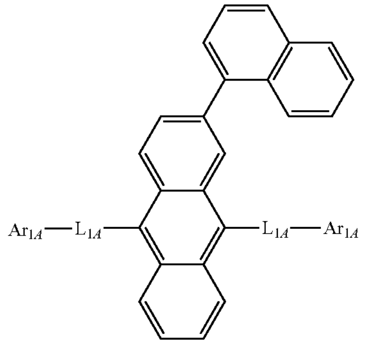

wherein in the formula (1-21), the formula (1-22), and the formula (1-23), $L_{1A}$ and $Ar_{1A}$ are as defined in the formula (1).

In one embodiment, $L_{1A}$ is a single bond or a substituted or unsubstituted arylene group including 6 to 14 ring carbon atoms.

In one embodiment, $L_{1A}$ is a single bond, a substituted or unsubstituted phenylene group, or a substituted or unsubstituted naphthylene group.

In one embodiment, $Ar_{1A}$ is a substituted or unsubstituted aryl group including 6 to 50 ring carbon atoms.

In one embodiment, $Ar_{1A}$ is selected from the group represented by the following formulas (a1) to (a4):

(a1)

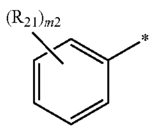

-continued (a2)

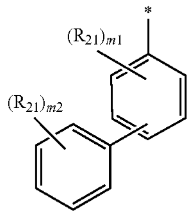

(a3)

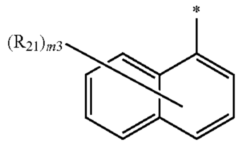

(a4)

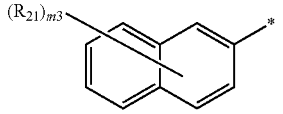

wherein in the formulas (a1) to (a4), * is a single bond bonding with $L_{1A}$;

$R_{21}$ is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are as defined in the formula (1);

m1 is an integer of 0 to 4;

m2 is an integer of 0 to 5;

m3 is an integer of 0 to 7;

when each of m1 to m3 is 2 or more, a plurality of $R_{21}$ may be the same as or different from each other; and when each of m1 to m3 is 2 or more, a plurality of adjacent $R_{21}$'S forms a substituted or unsubstituted, saturated or unsaturated ring by bonding with each other, or does not form a substituted or unsubstituted, saturated or unsaturated ring.

In one embodiment, the compound represented by the formula (1) has at least one deuterium atom.

In one embodiment, at least one of $R_{1A}$ to $R_{8A}$ is a deuterium atom.

In one embodiment, based on the total amount of a compound represented by the formula (1) and a compound having the same structure as the compound represented by the formula (1) except that only protium atoms are contained as hydrogen atoms (hereinafter also referred to as a "protium compound"), the content proportion of the latter in the emitting layer is preferably 99 mol % or less. The content proportion of the protium compound can be confirmed by mass spectrometry.

The compound represented by the formula (1) can be synthesized by using a known alternative reaction or a raw material tailored to the target compound.

Specific examples of the compound represented by the formula (1) will be described below, but these are merely examples, and the compound represented by the formula (1) is not limited to the following specific examples.

1-1

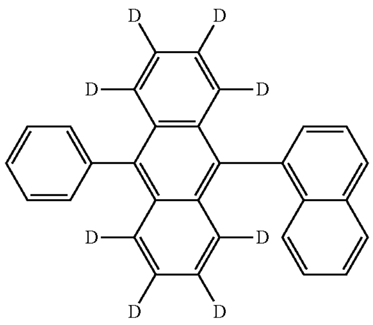

1-2

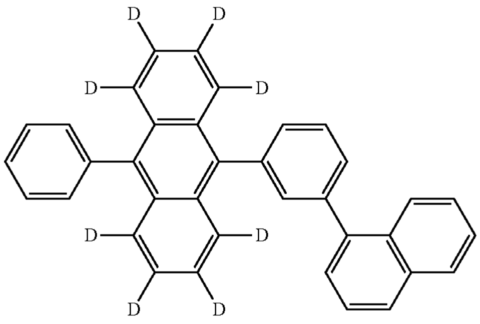

1-3

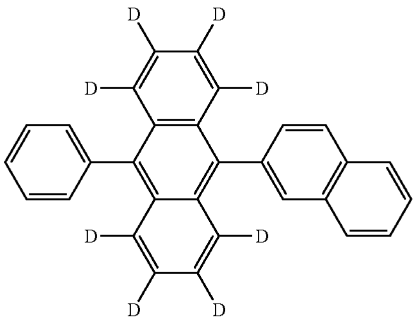

1-4

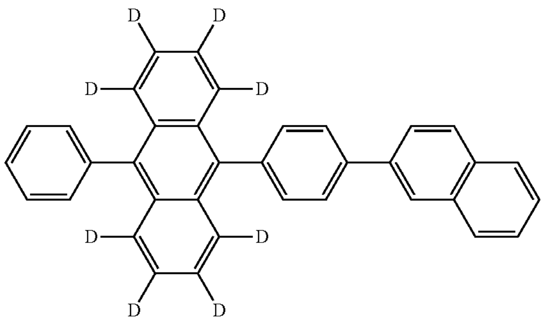

-continued 1-5

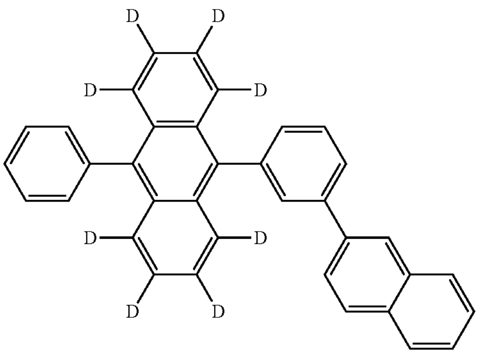

1-6

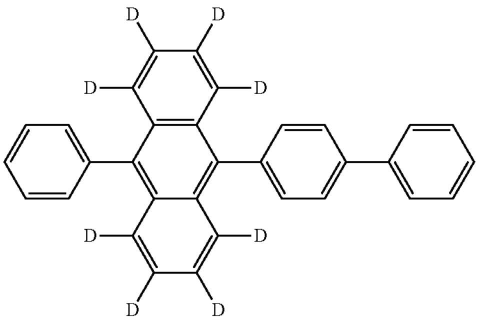

1-7

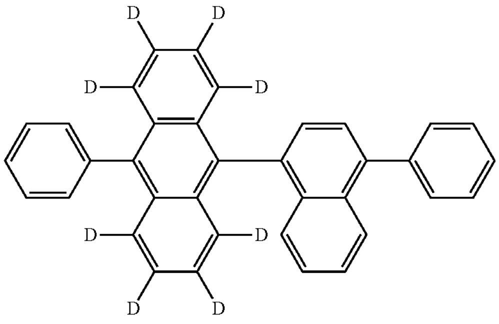

1-8

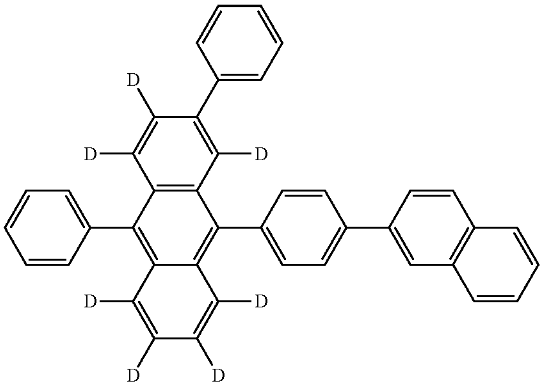

1-9
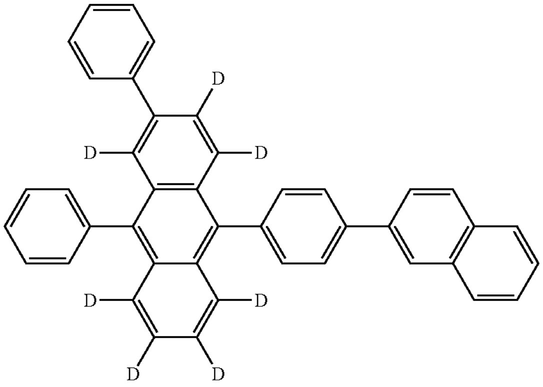
1-10
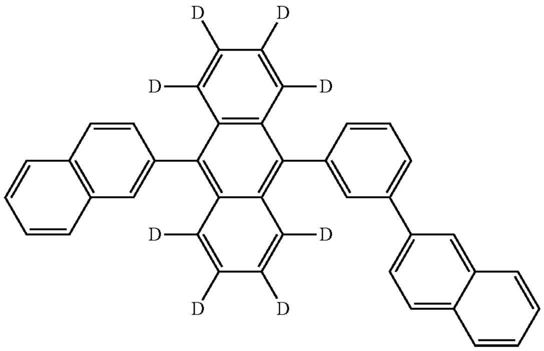
1-11
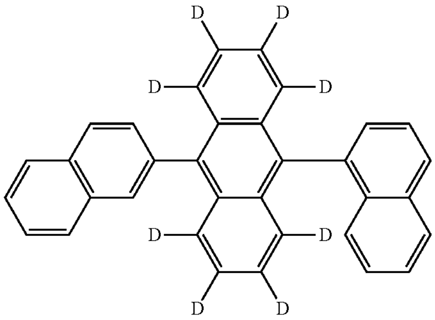
1-12
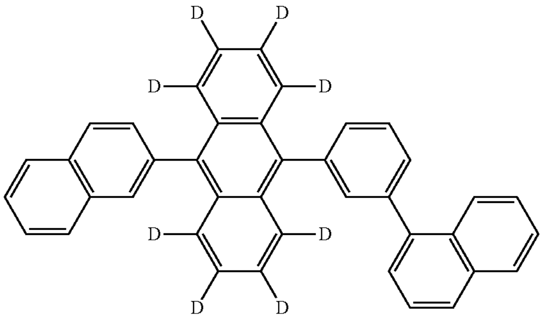
1-13
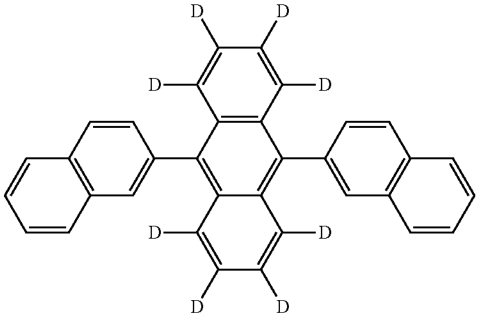
1-14
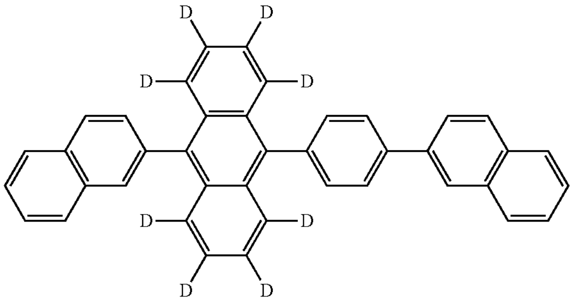
1-15
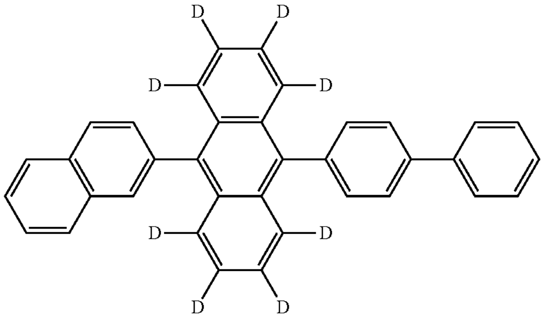
1-16
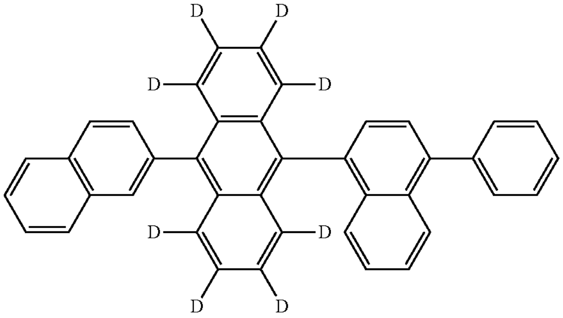

-continued
1-17
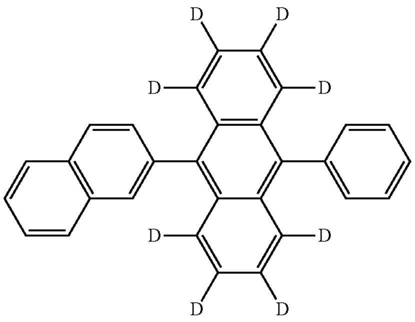
1-18
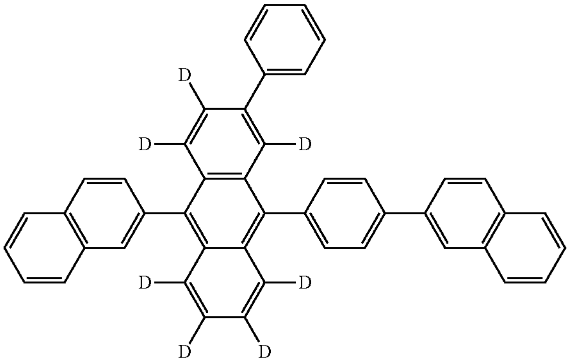
1-19
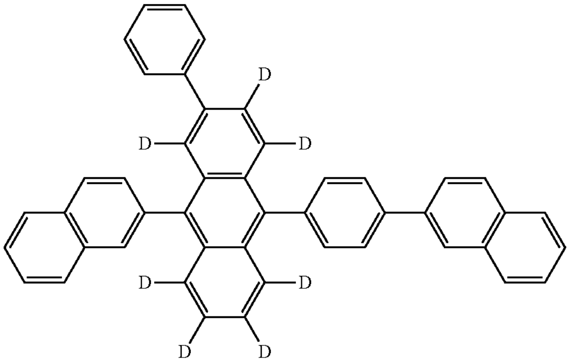
1-20
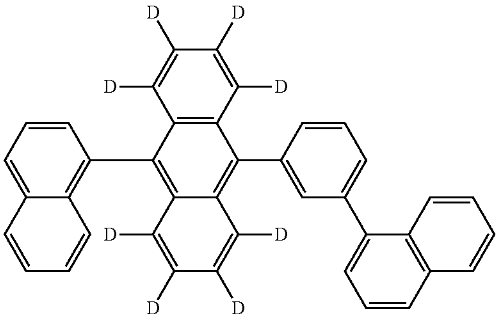
-continued
1-21
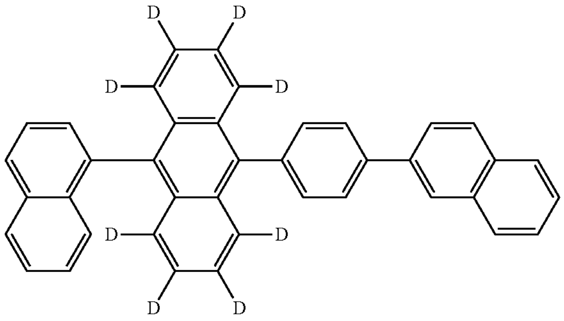
1-22
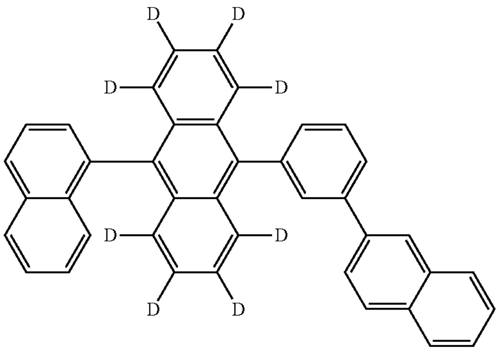
1-23
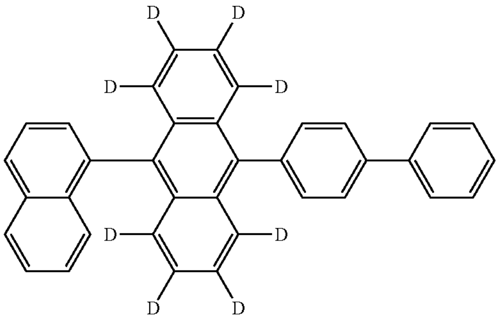
1-24
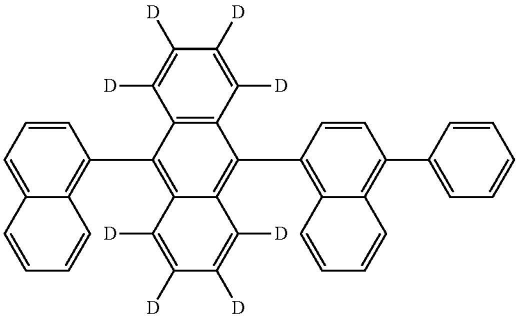

-continued
1-25
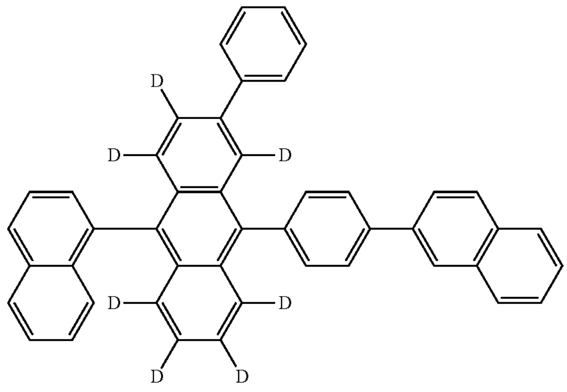
1-26
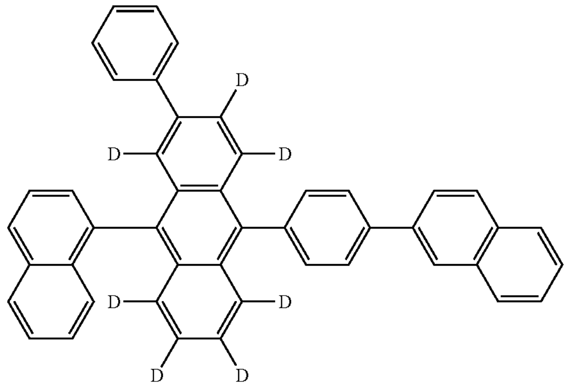
1-27
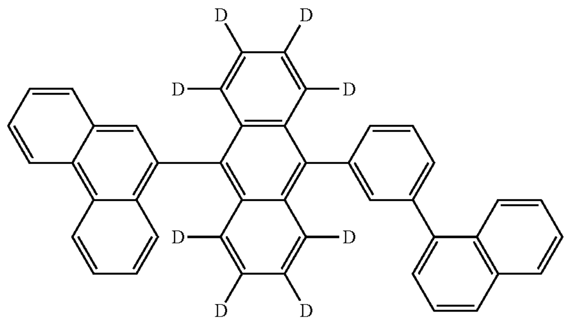
1-28
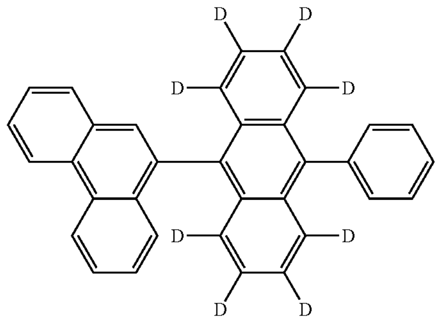
-continued
1-29
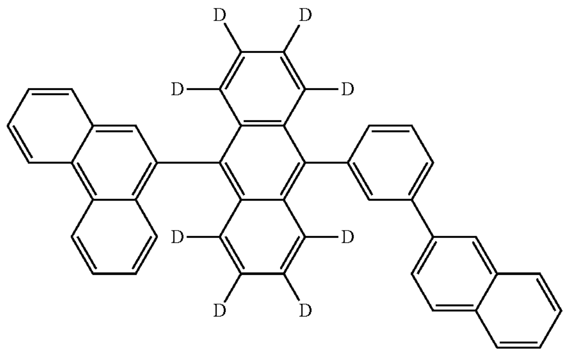
1-30
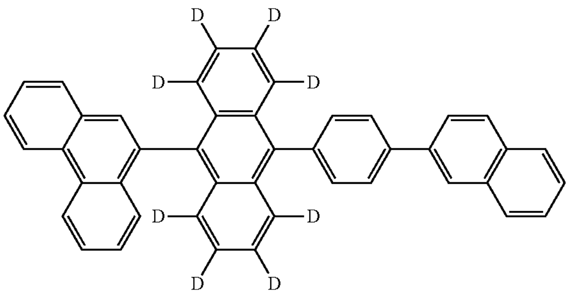
1-31
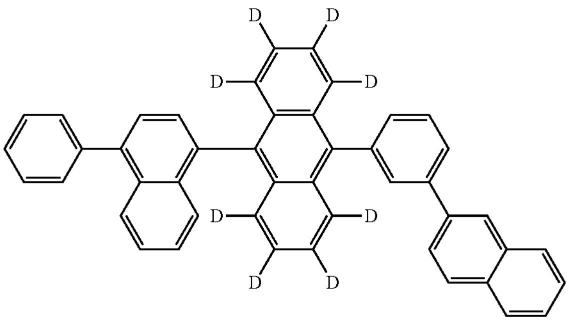
1-32
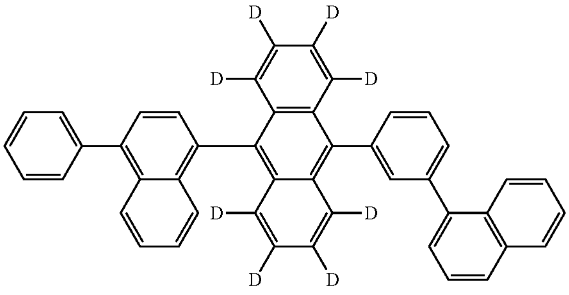
1-33
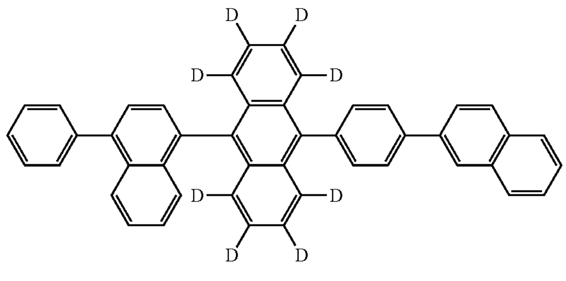

-continued
1-34
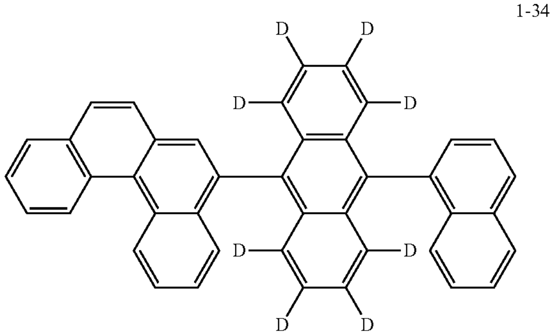
1-35
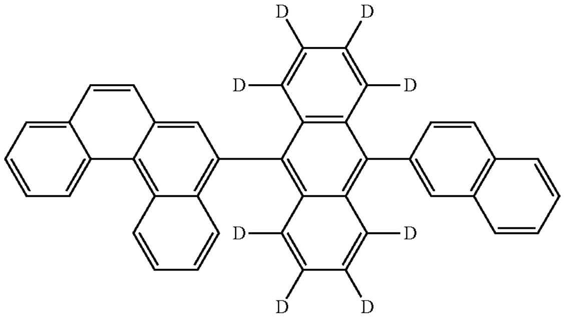
1-36
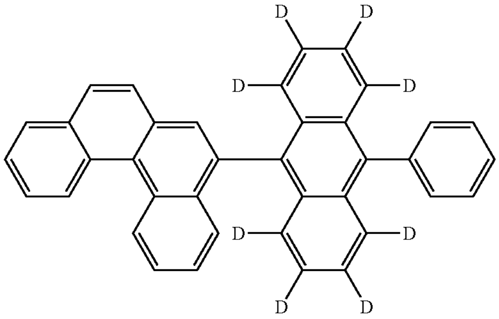
1-37
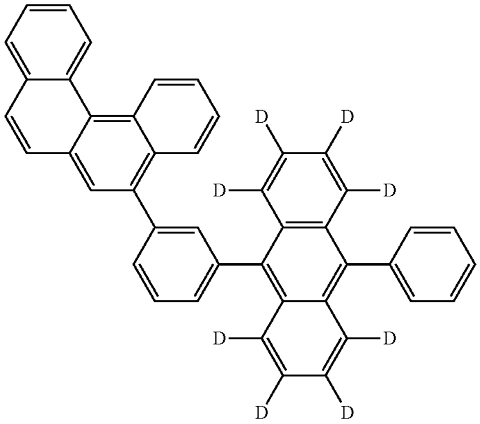
-continued
1-38
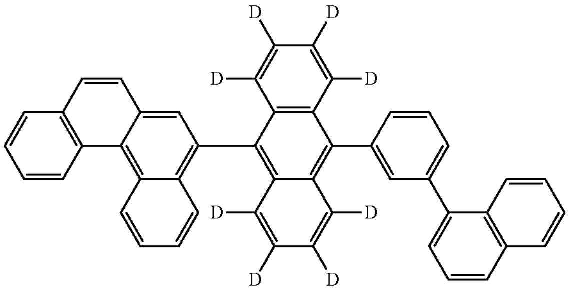
1-39
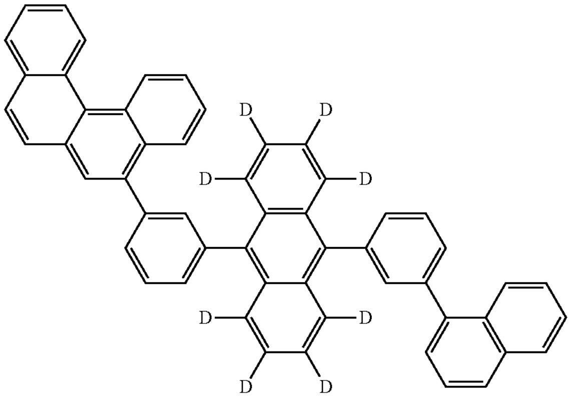
1-40
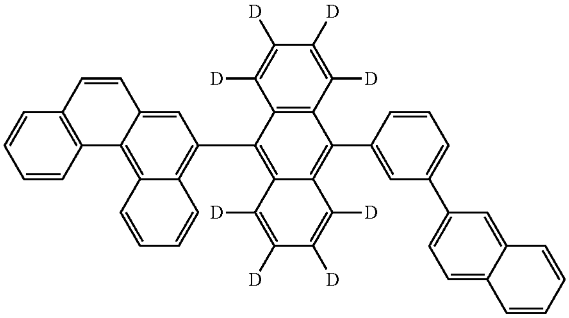
1-41
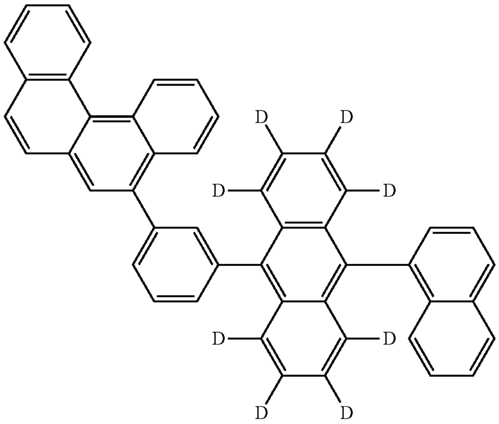

-continued
1-42
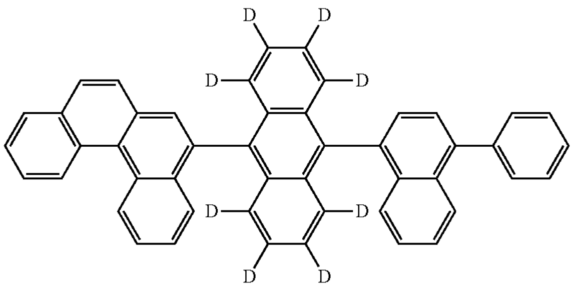
1-43
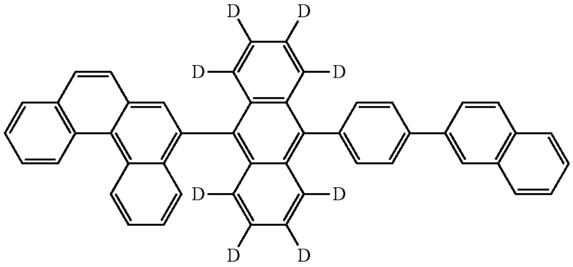
1-44
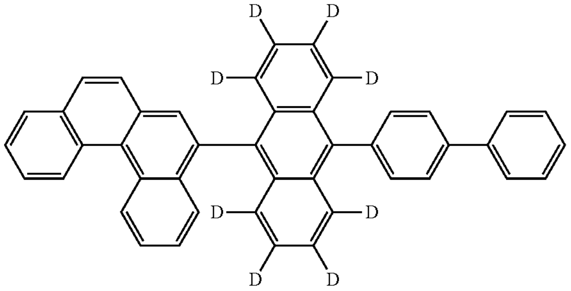
1-45
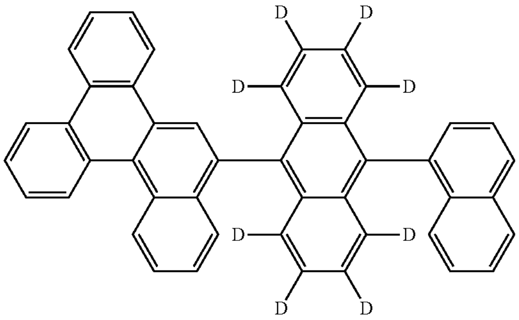
1-46
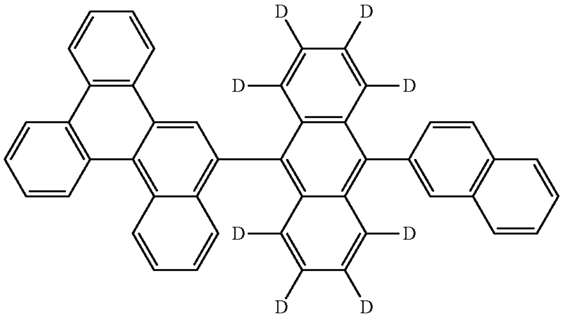
-continued
1-47
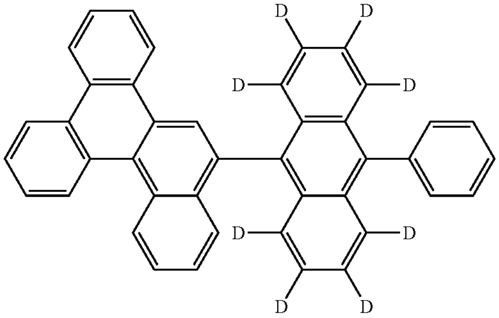
1-48
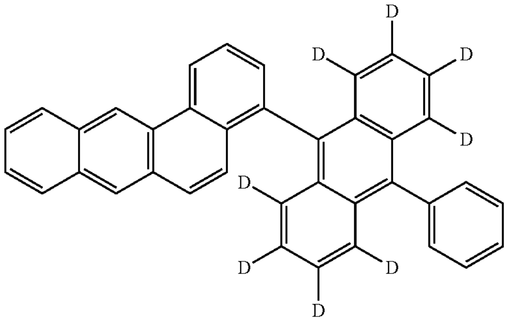
1-49
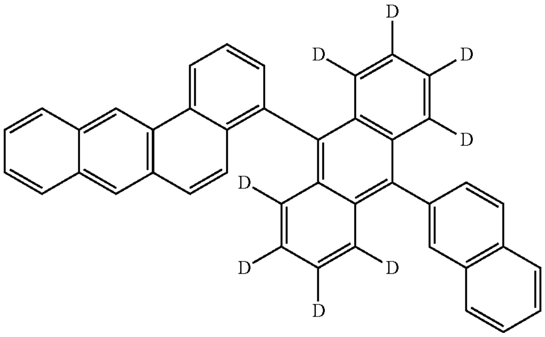
1-50
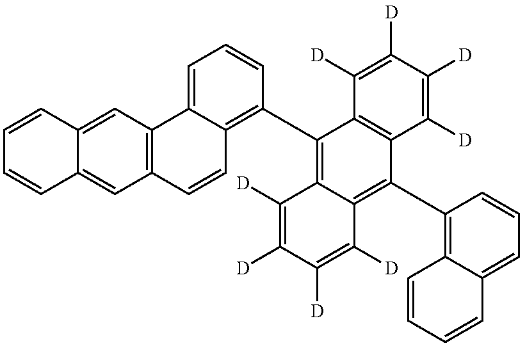

-continued
1-51
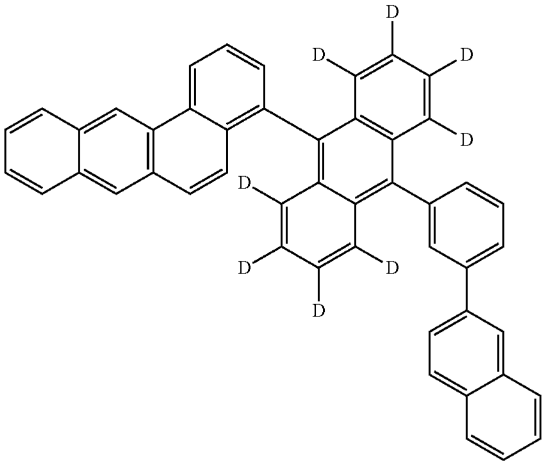
1-52
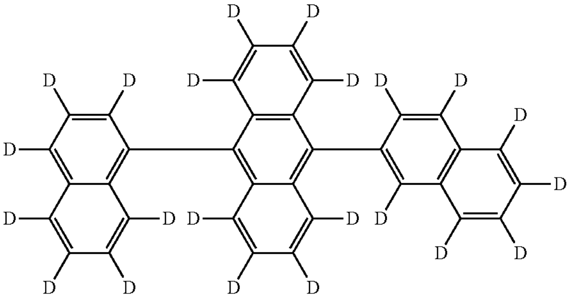
1-53
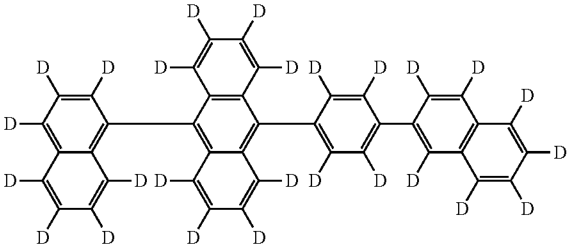
1-54
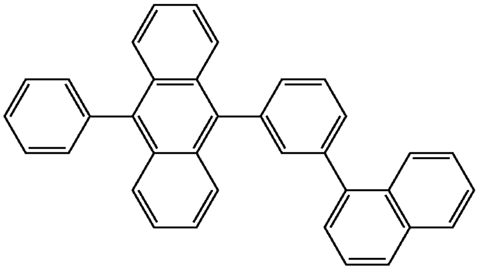
1-55
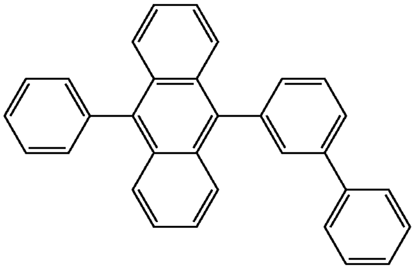
-continued
1-56
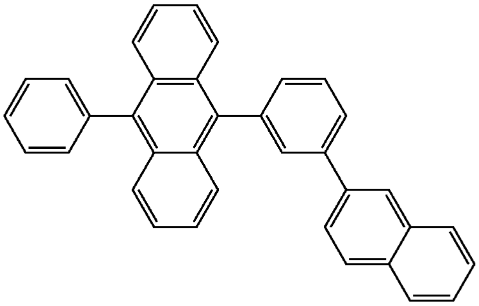
1-57
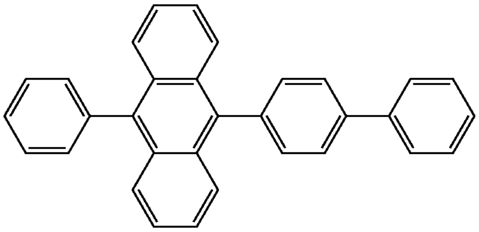
1-58
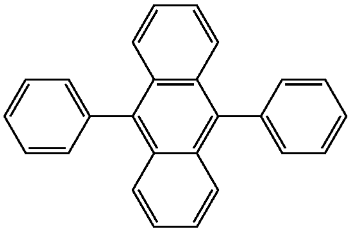
1-59
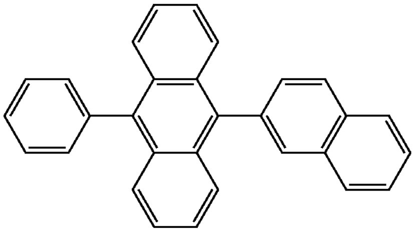
1-60
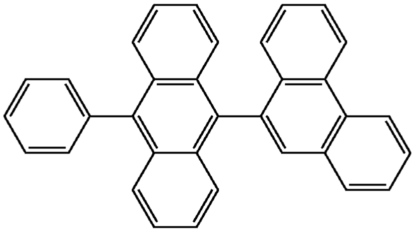
1-61
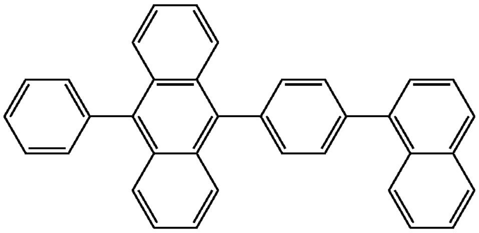

-continued
1-62
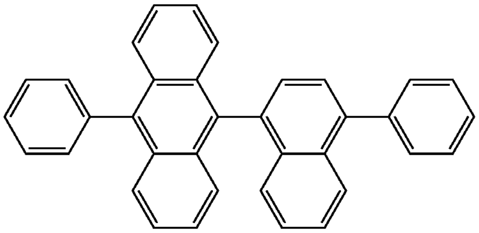
1-63
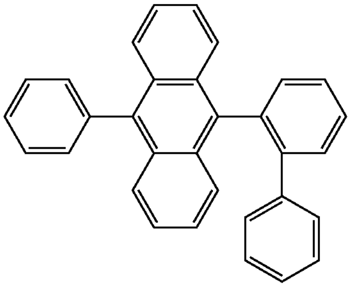
1-64
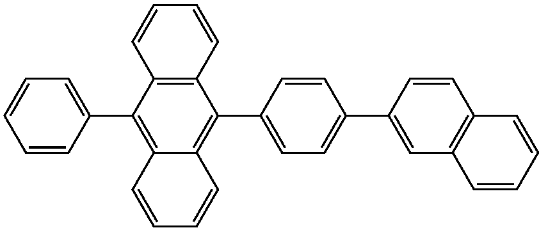
1-65
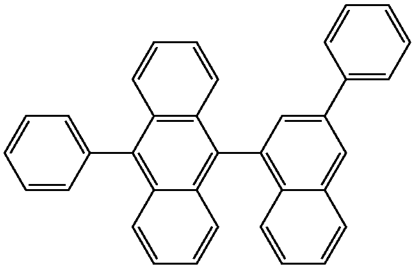
1-66
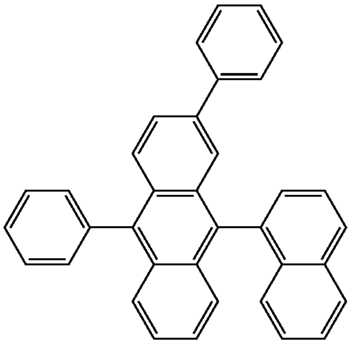
-continued
1-67
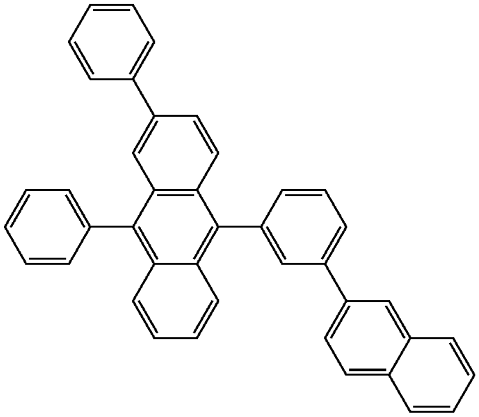
1-68
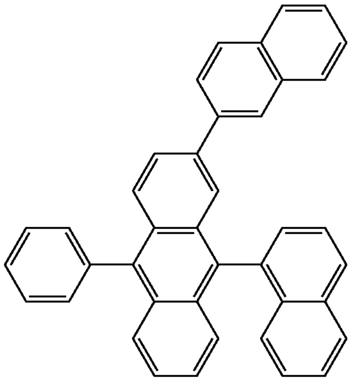
1-69
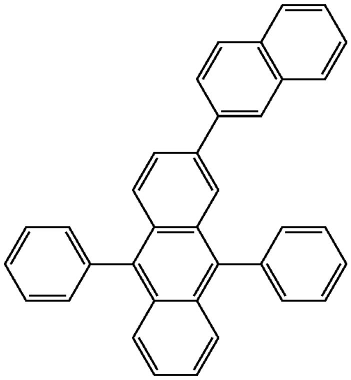
1-70
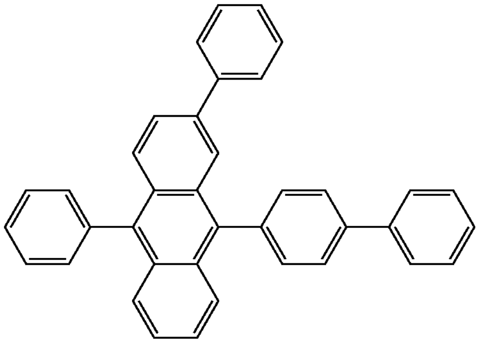

-continued
1-71
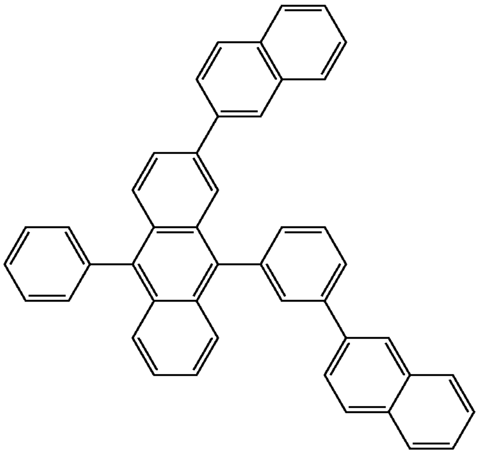
1-72
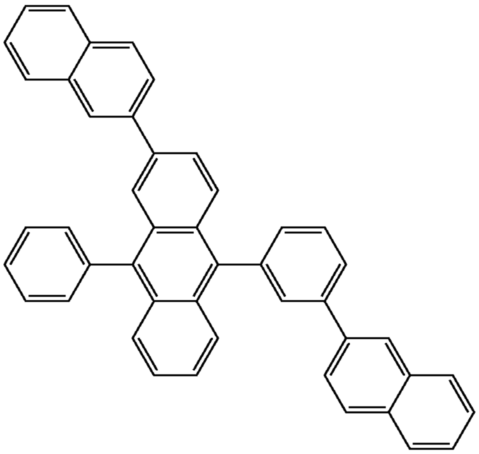
1-73
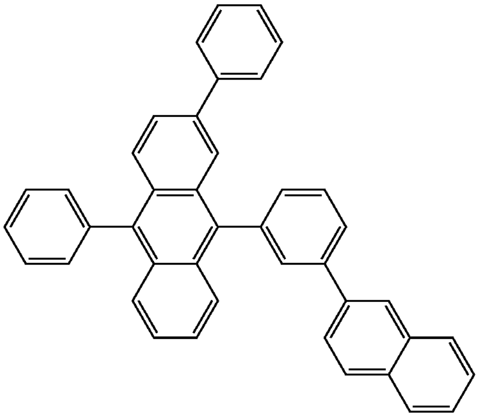
-continued
1-74
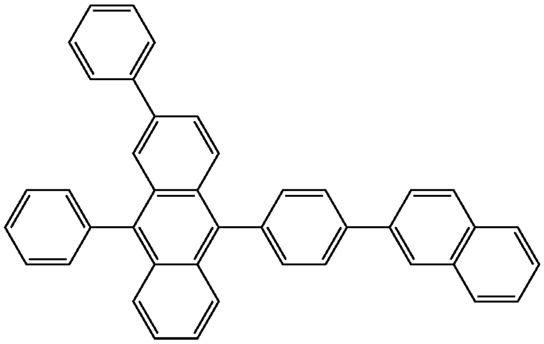
1-75
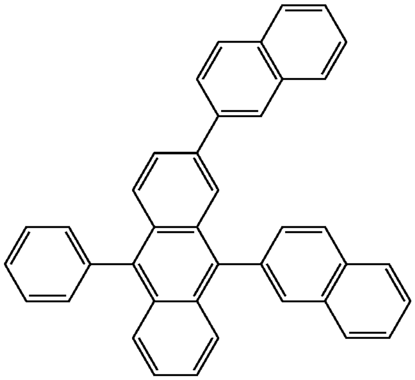
1-76
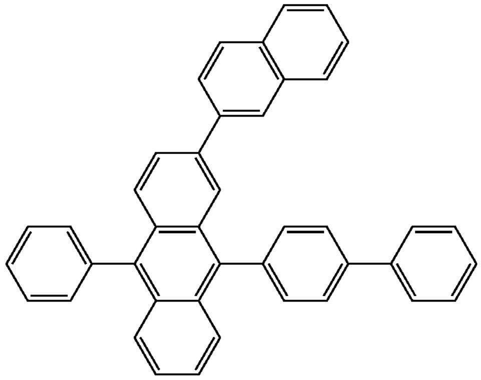
1-77
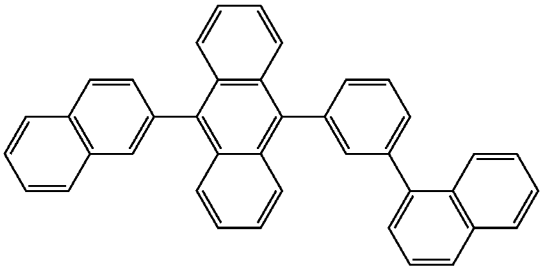

-continued
1-78
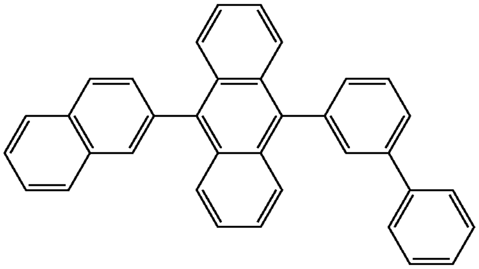
1-79
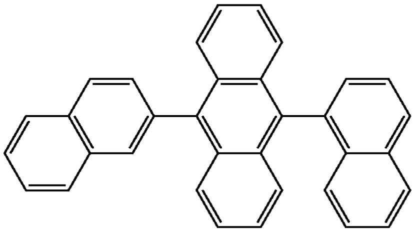
1-80
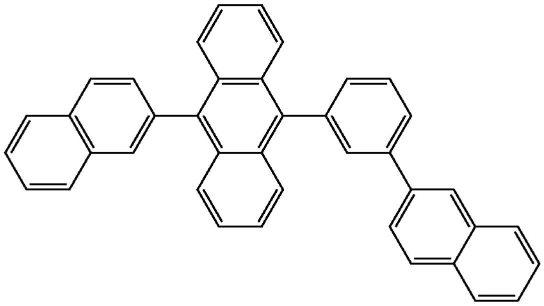
1-81
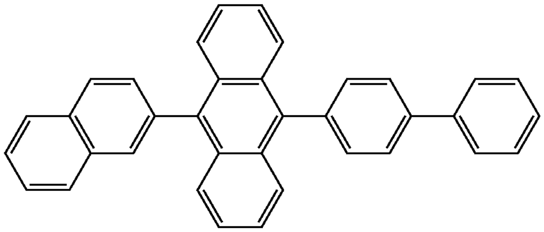
1-82
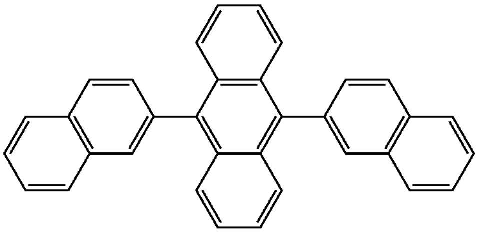
1-83
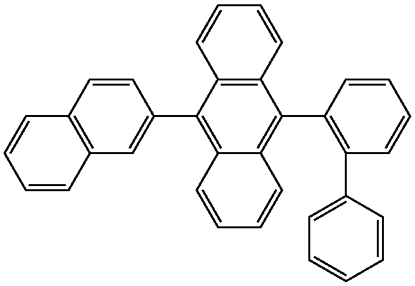
-continued
1-84
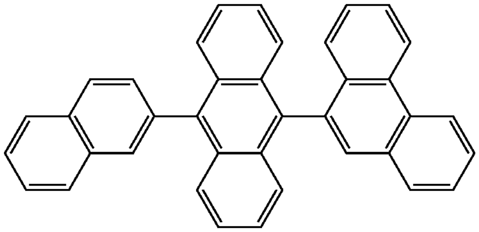
1-85
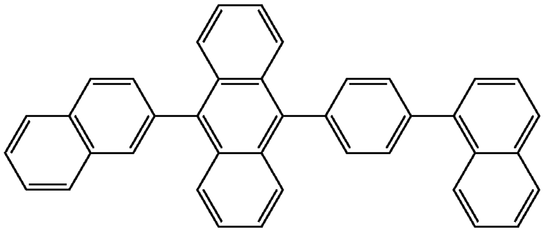
1-86
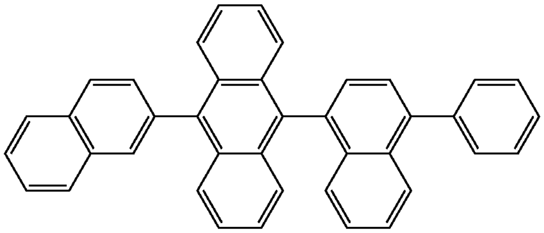
1-87
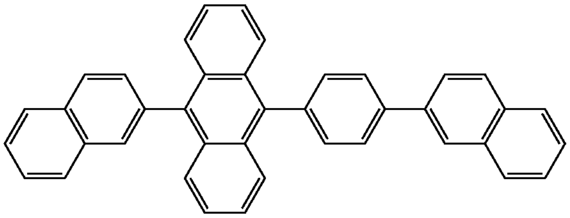
1-88
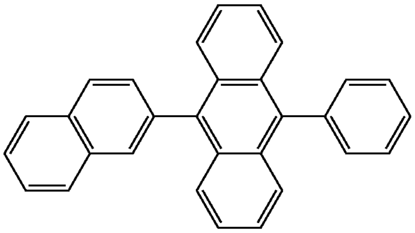
1-89
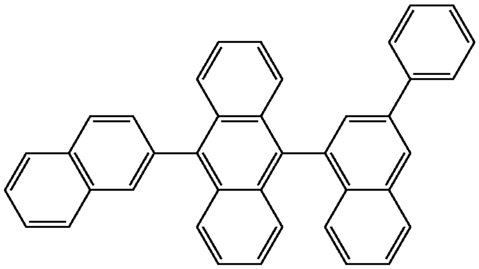

-continued
1-90
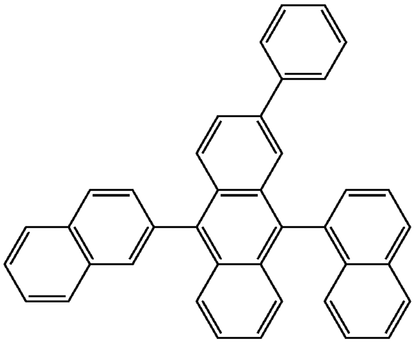
1-91
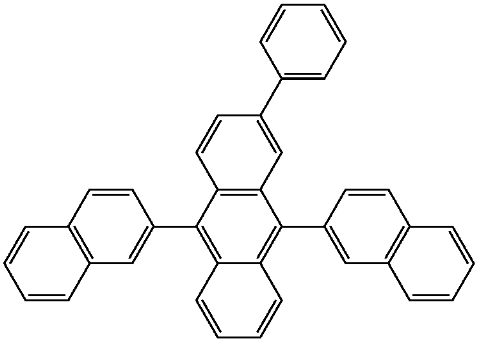
1-92
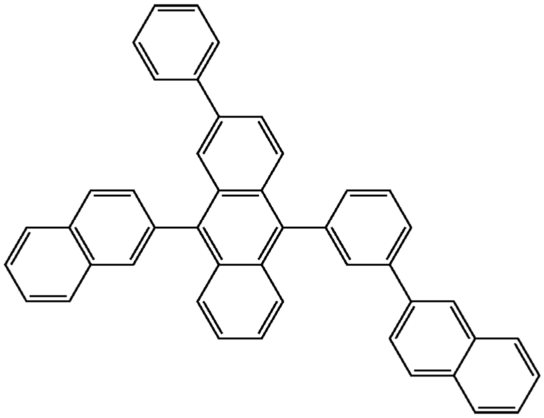
1-93
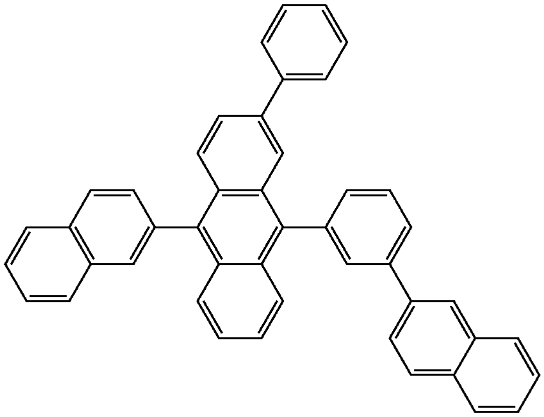
-continued
1-94
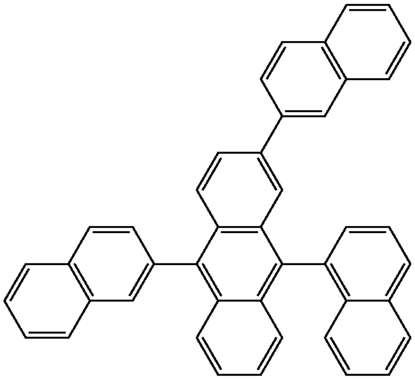
1-95
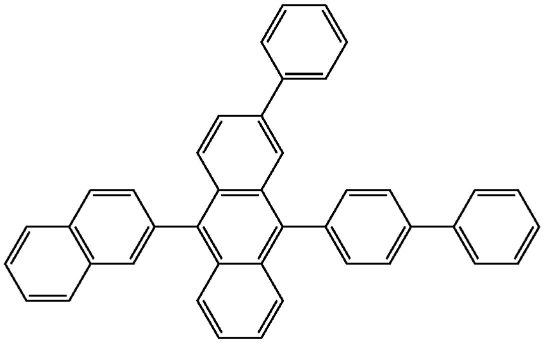
1-96
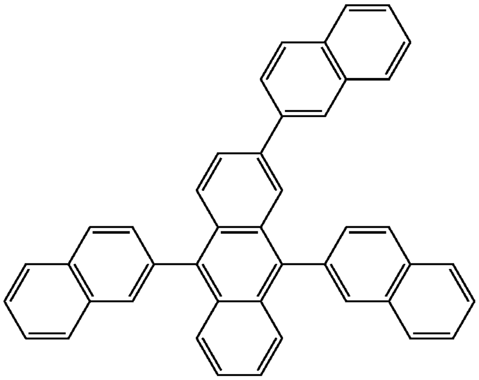
1-97
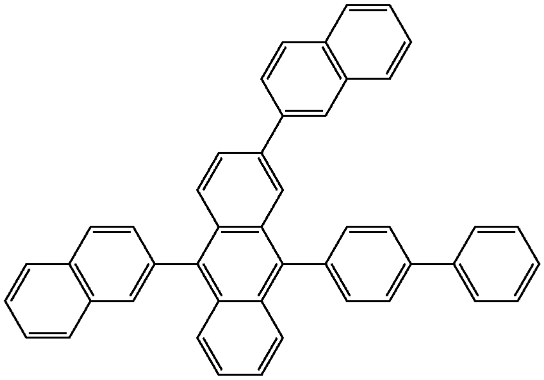

-continued
1-98
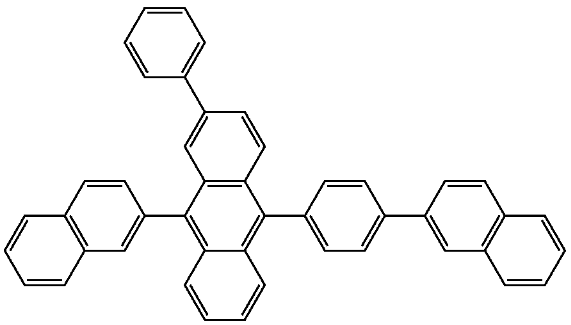
1-99
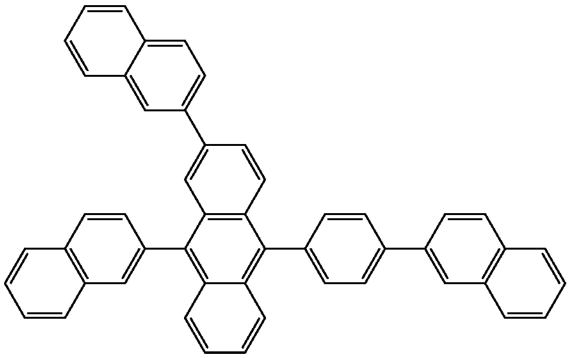
1-100
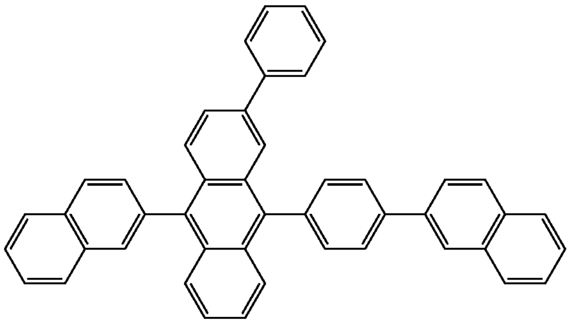
1-101
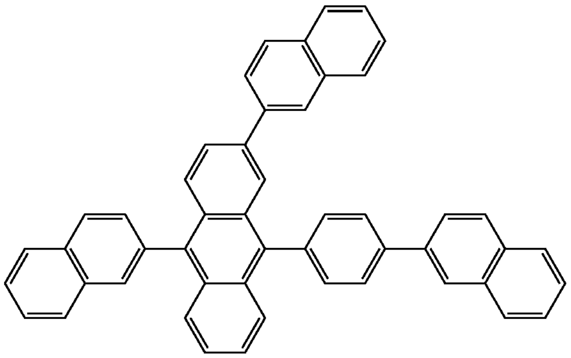
-continued
1-102
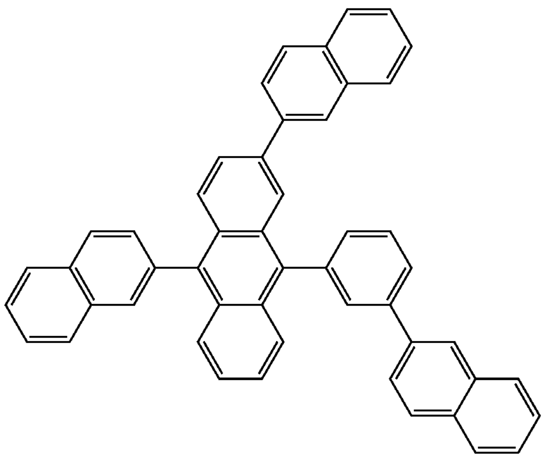
1-103
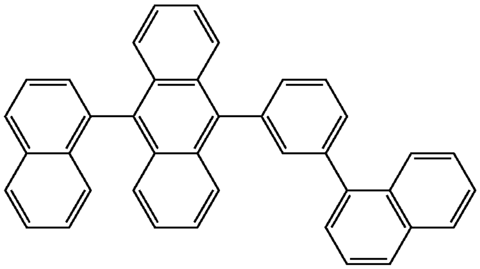
1-104
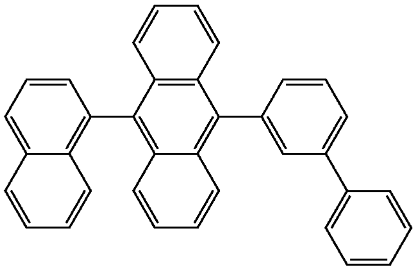
1-105
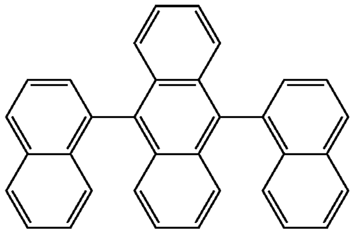
1-106
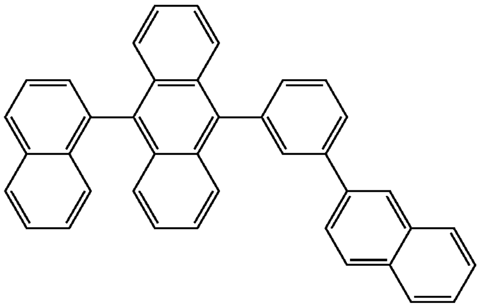

-continued
1-107
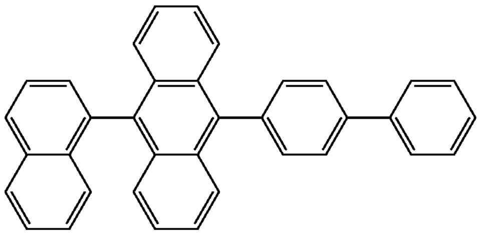
1-108
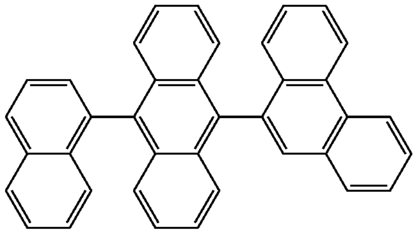
1-109
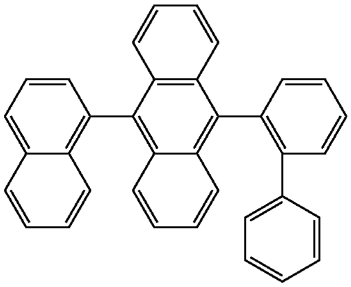
1-110
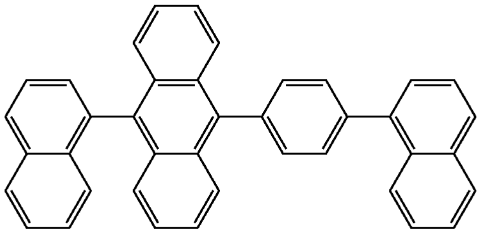
1-111
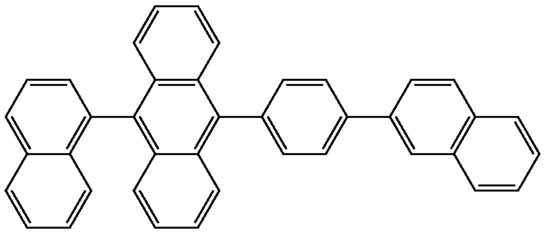
1-112
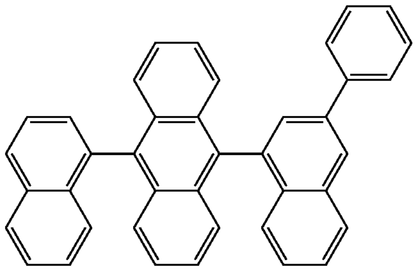
-continued
1-113
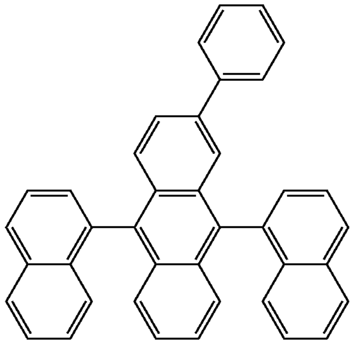
1-114
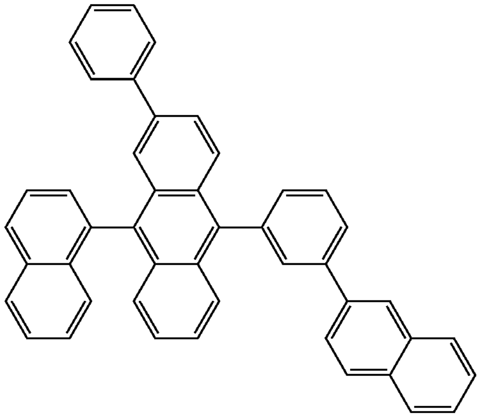
1-115
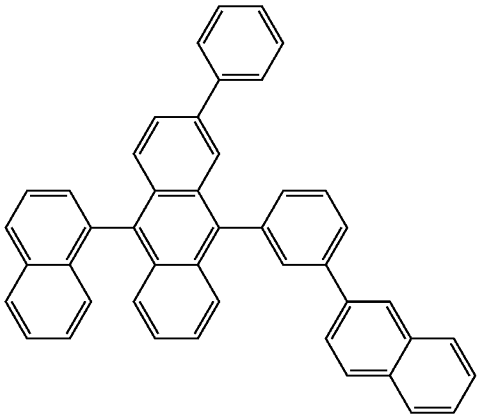
1-116
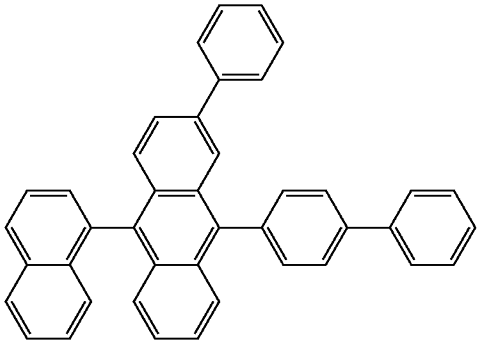

-continued
1-117
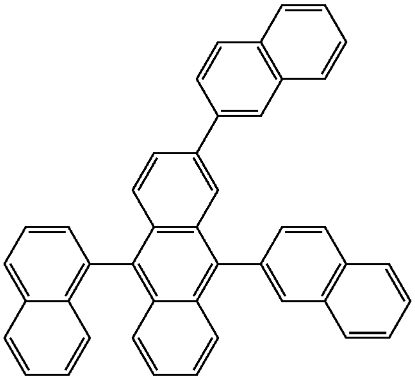
1-118
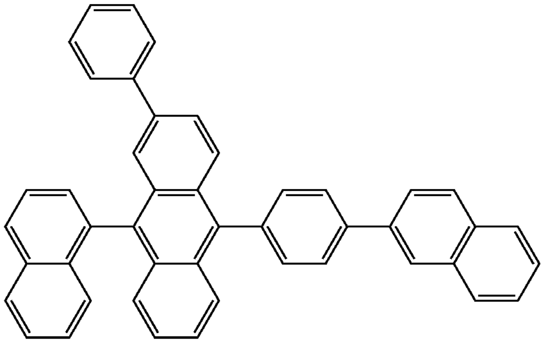
1-119
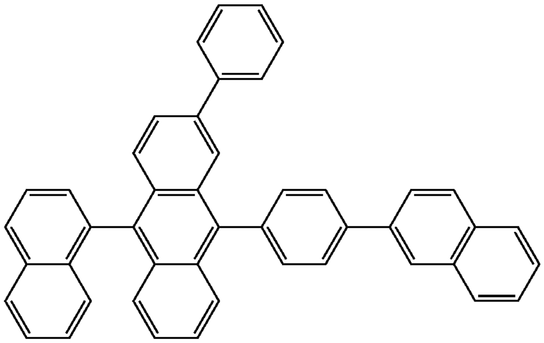
1-120
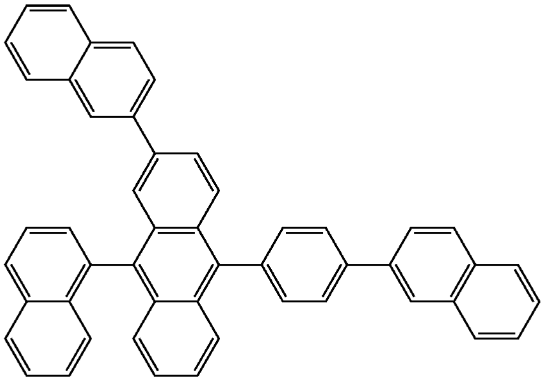
-continued
1-121
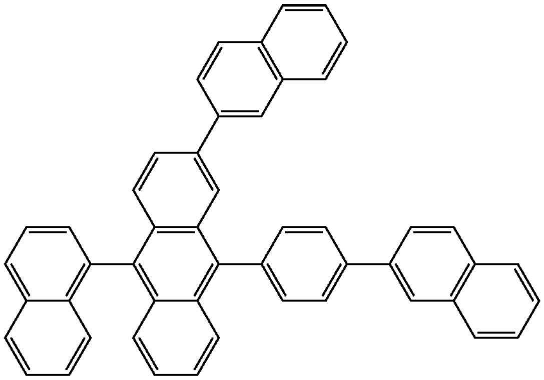
1-122
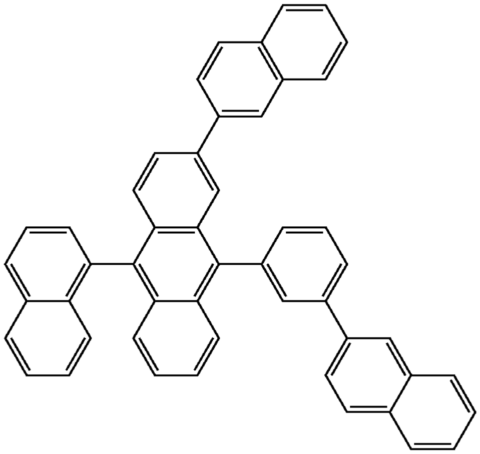
1-123
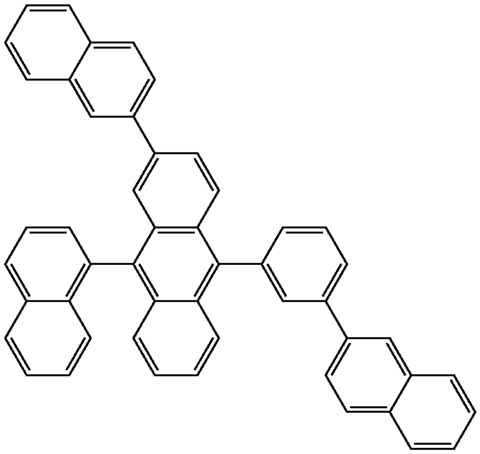
1-124
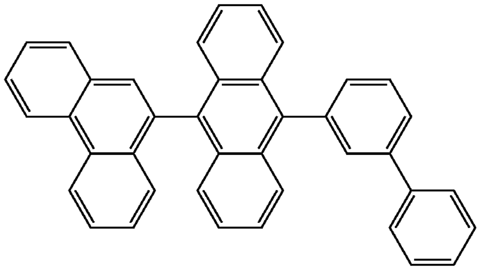

-continued
1-125
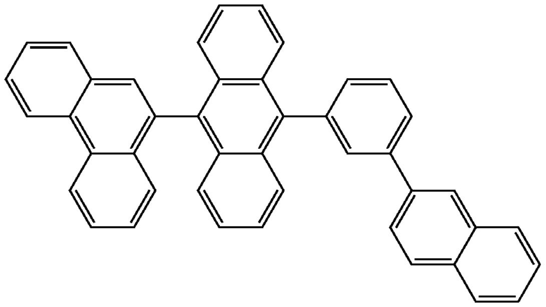
1-126
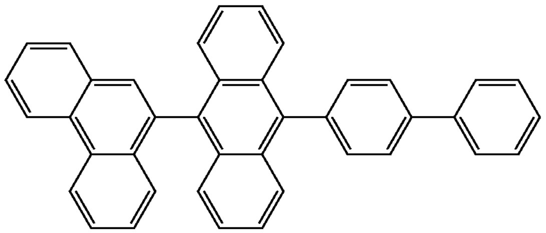
1-127
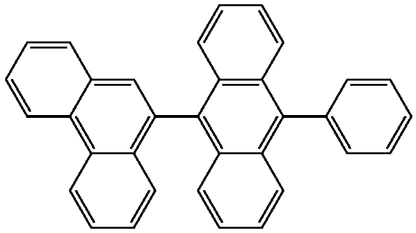
1-128
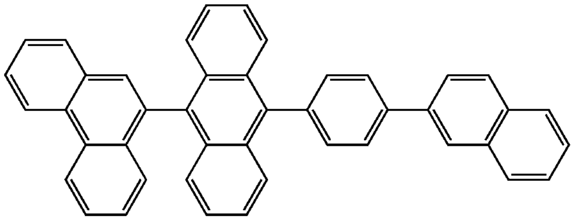
1-129
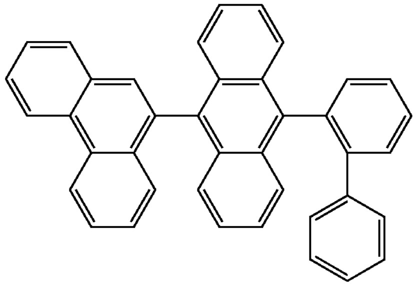
1-130
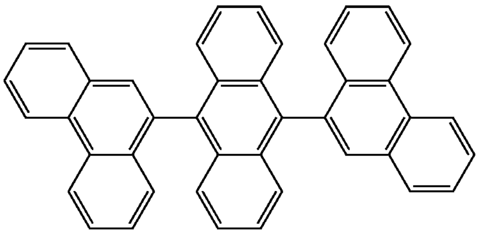
-continued
1-131
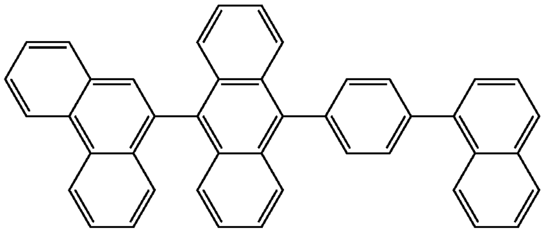
1-132
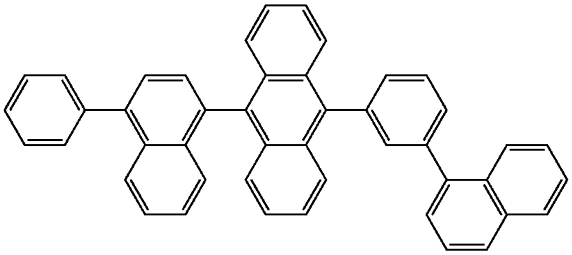
1-133
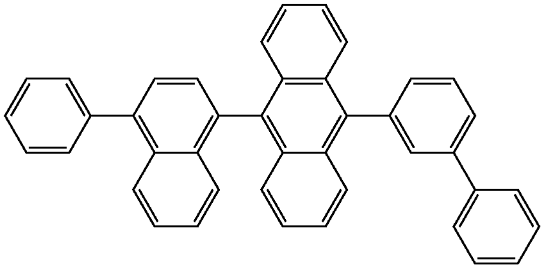
1-134
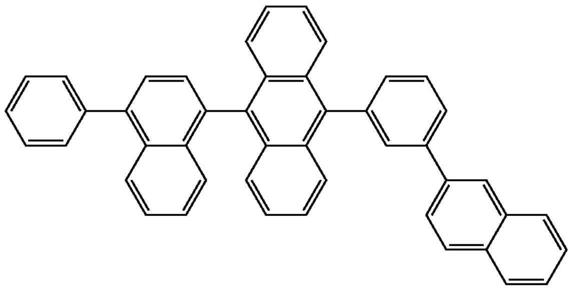
1-135
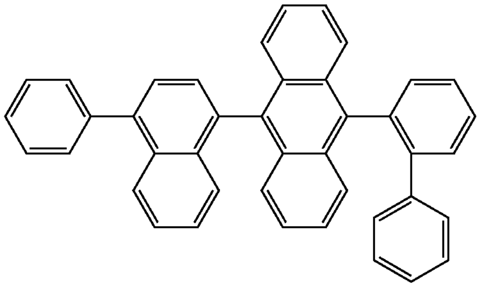

-continued
1-136
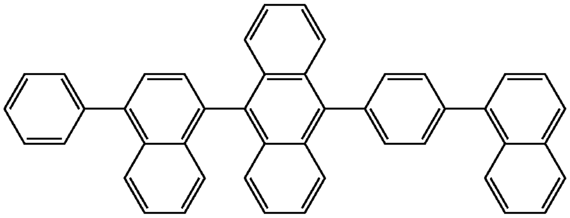
1-137
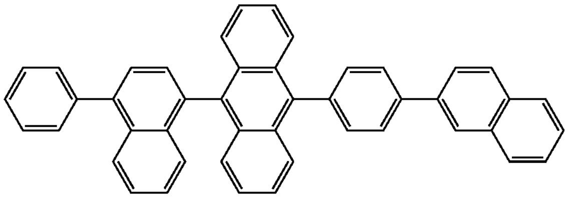
1-138
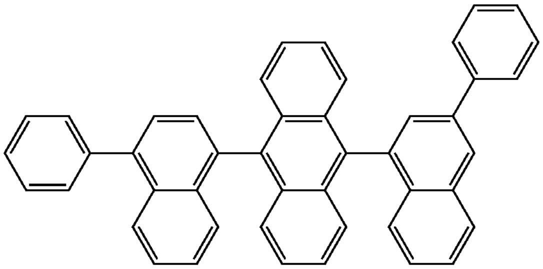
1-139
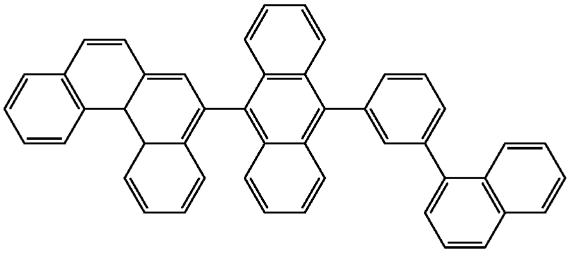
1-140
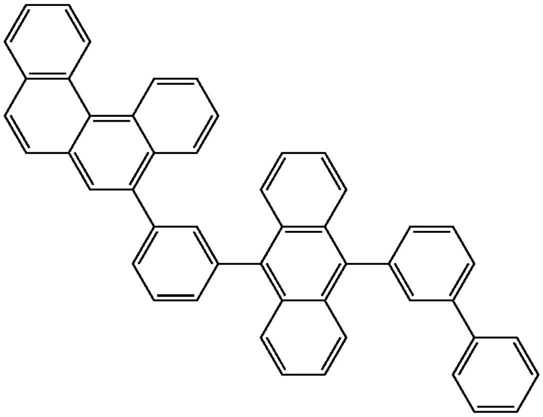
-continued
1-141
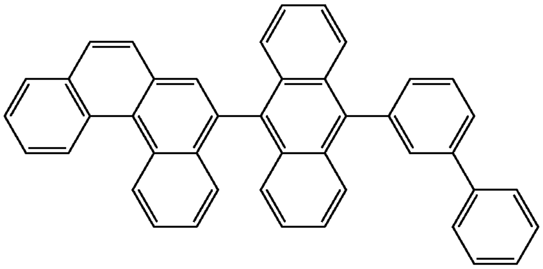
1-142
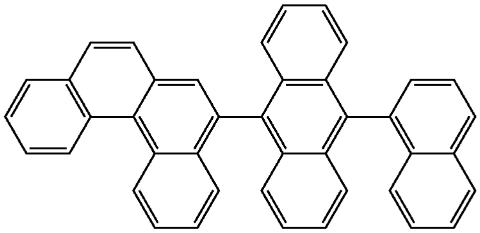
1-143
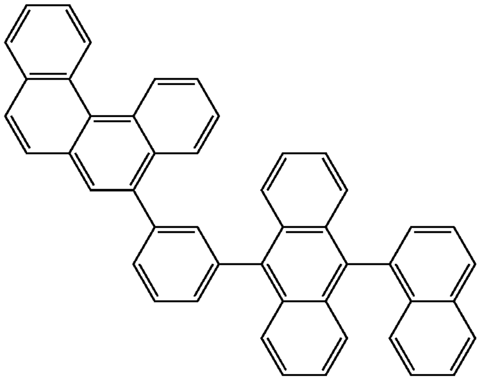
1-144
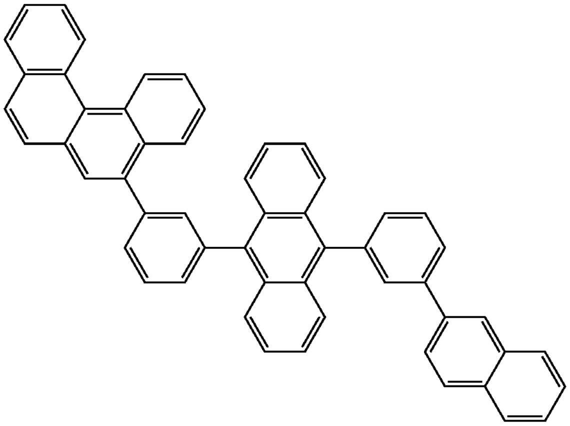

-continued
1-145
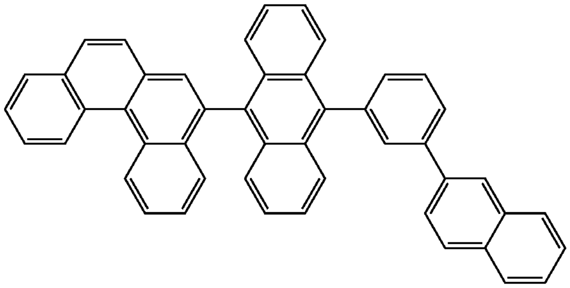
1-146
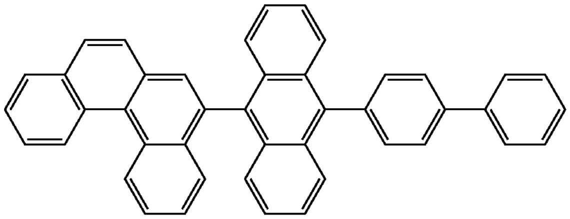
1-147
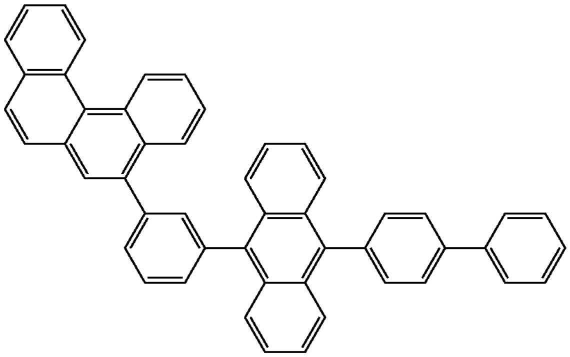
1-148
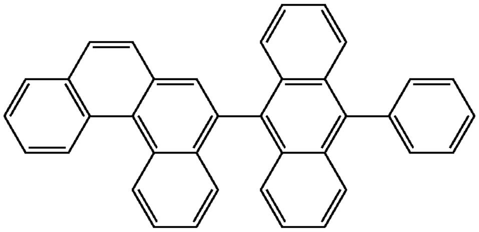
1-149
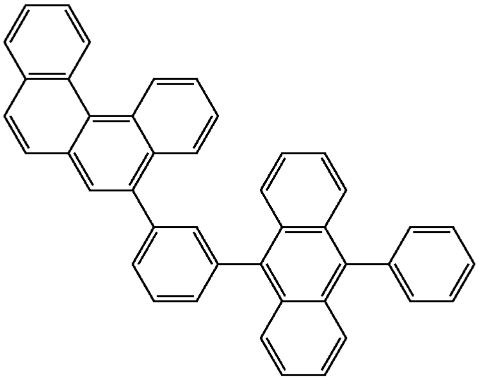
-continued
1-150
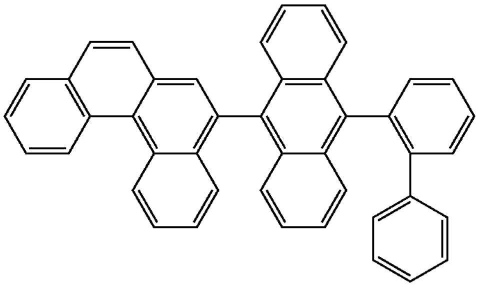
1-151
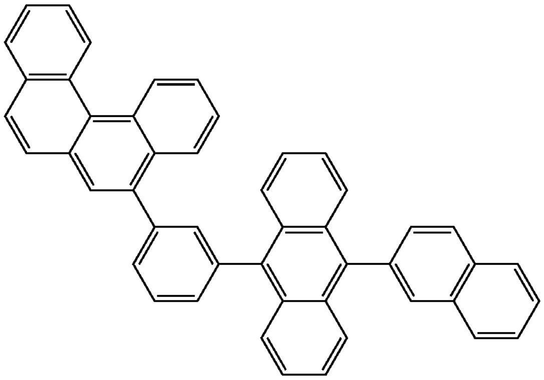
1-152
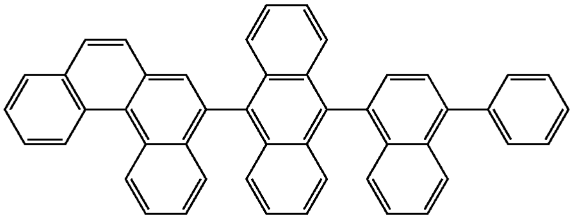
1-153
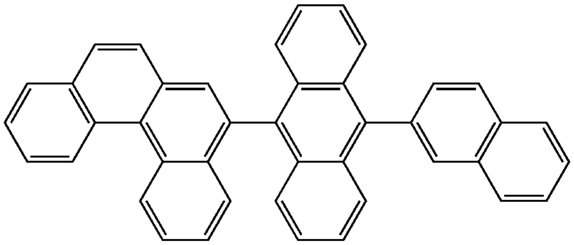
1-154
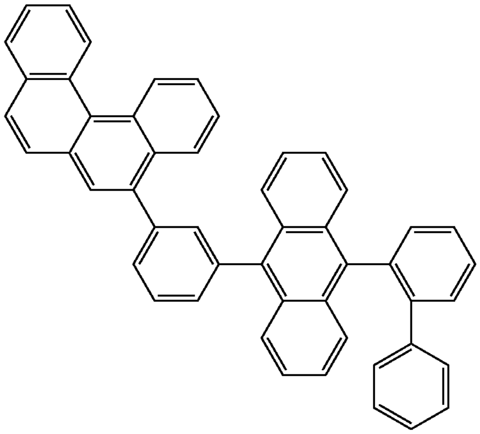

-continued
1-155
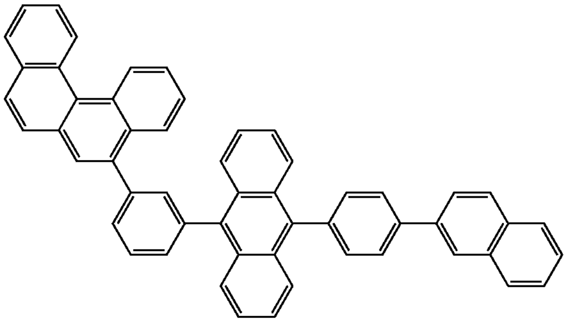
1-156
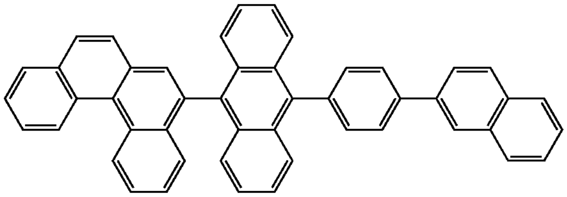
1-157
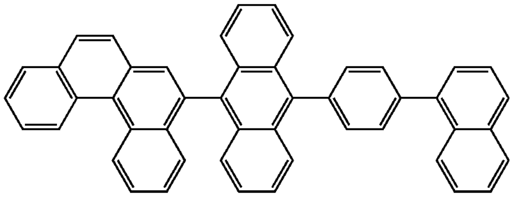
1-158
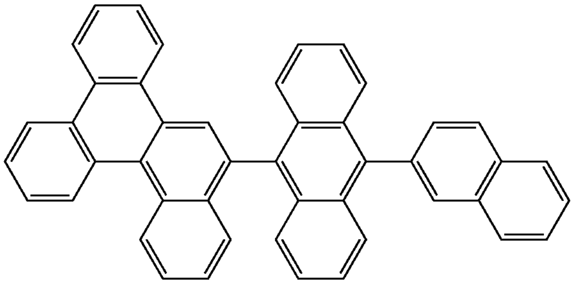
1-159
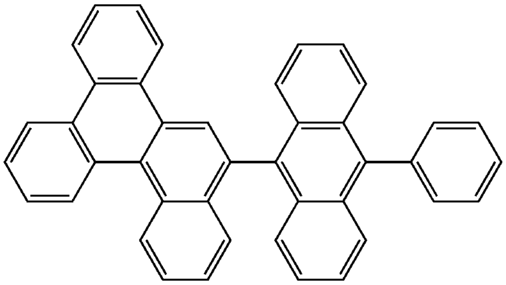
-continued
1-160
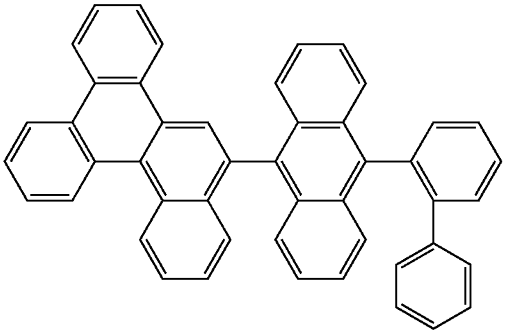
1-161
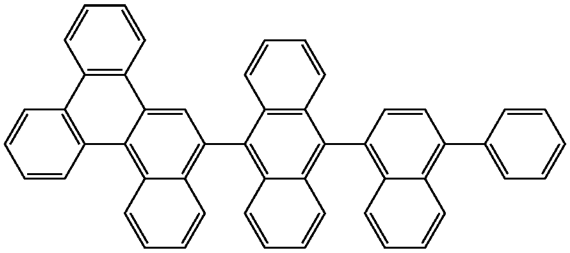
1-162
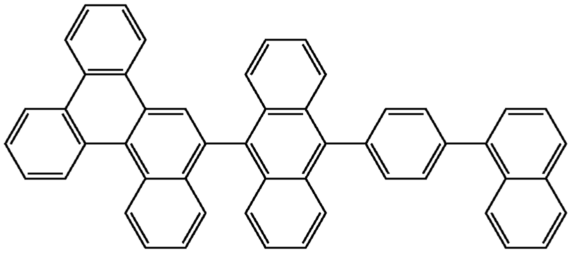
1-163
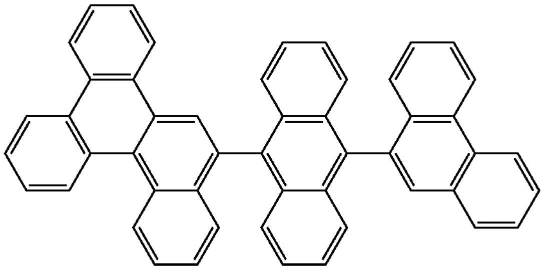
1-164
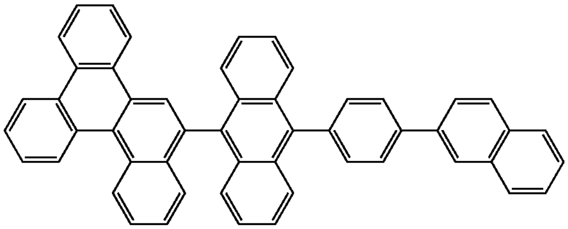

-continued
1-165
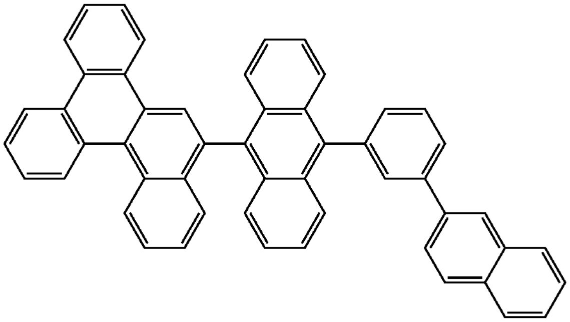
1-166
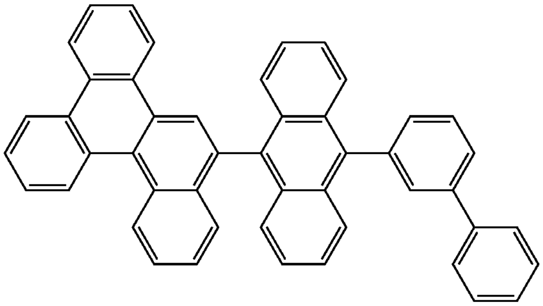
1-167
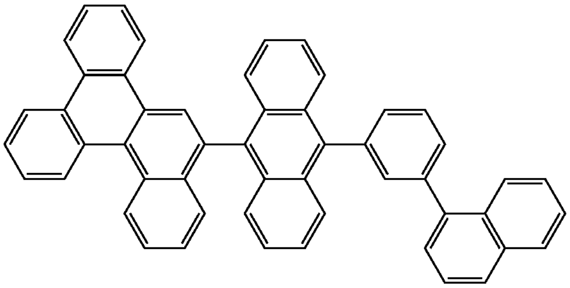
1-168
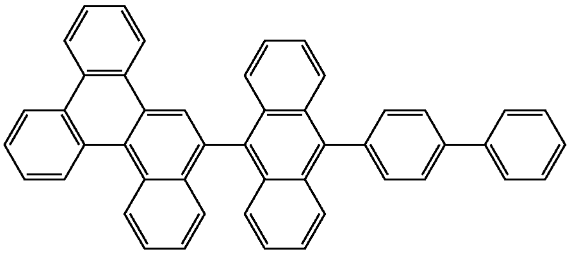
1-169
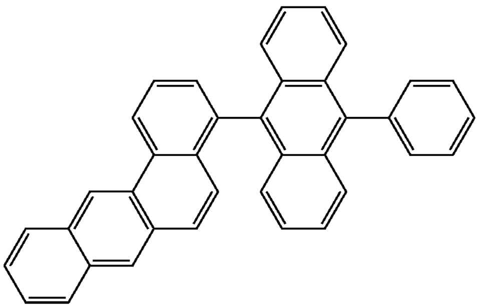
-continued
1-170
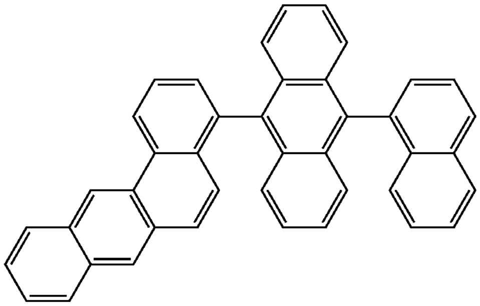
1-171
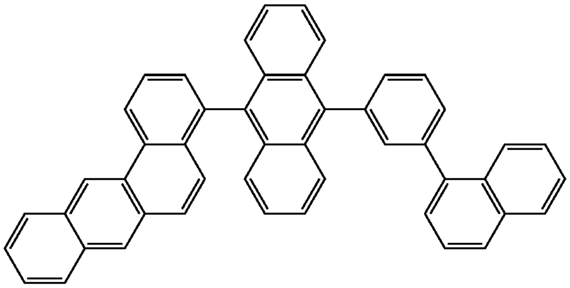
1-172
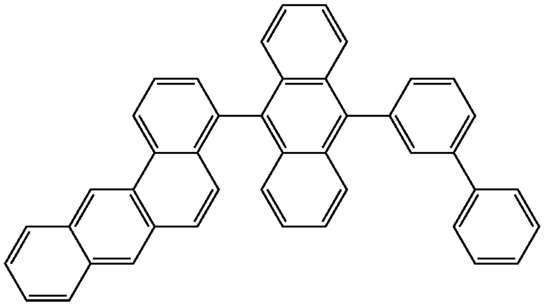
1-173
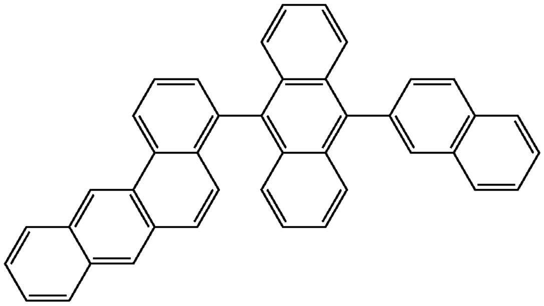
1-174
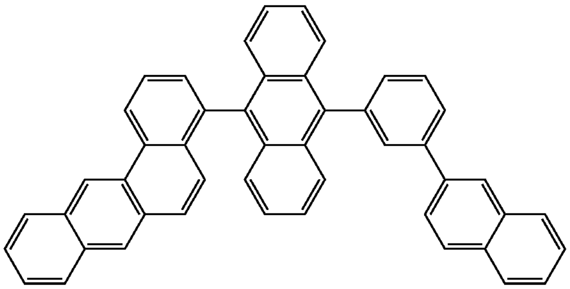

-continued
1-175
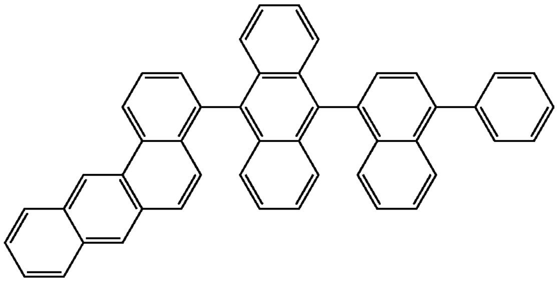
1-176
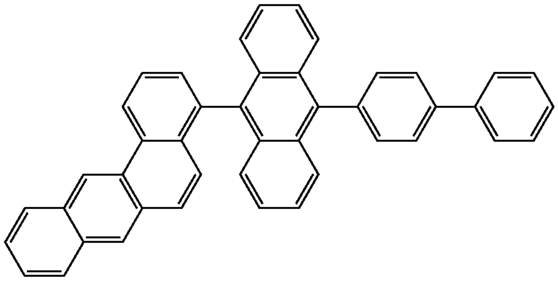
1-177
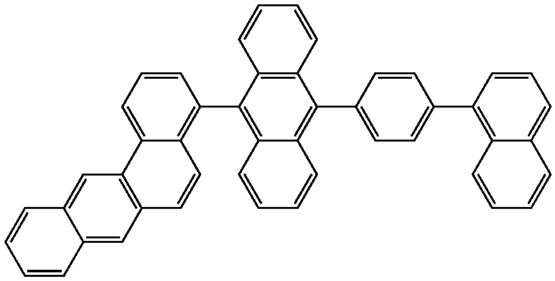
-continued
1-178
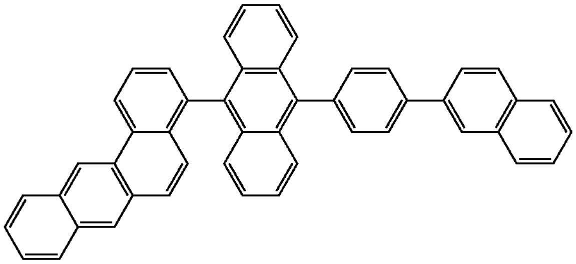
1-179
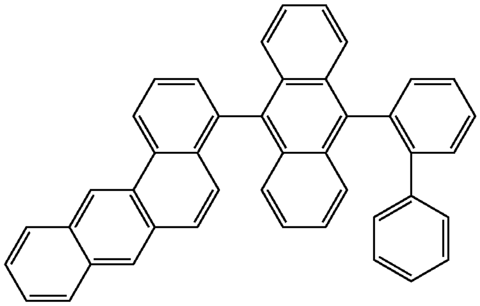
(Second Host Material)
The second host material used in an aspect of the invention is a compound represented by the following formula (2):
(2)
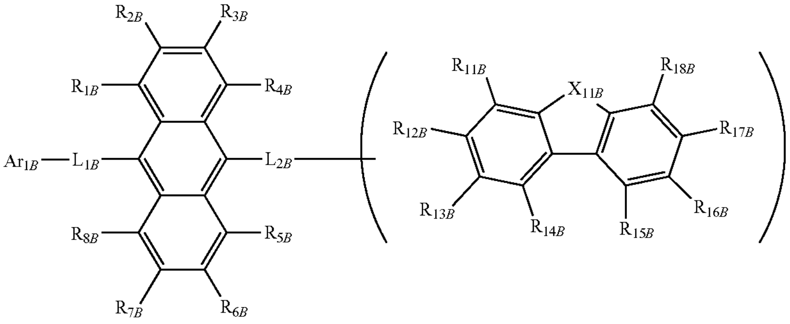

wherein in the formula (2), $R_{1B}$ to $R_{8B}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$X_{11B}$ is an oxygen atom or a sulfur atom;

one of $R_{11B}$ to $R_{18B}$ is a single bond bonding with $L_{2B}$;

one or more sets of adjacent two or more of $R_{11B}$ to $R_{18B}$ which are not single bonds bonding with $L_{2B}$ form a substituted or unsubstituted, saturated or unsaturated ring by bonding with each other, or do not form a substituted or unsubstituted, saturated or unsaturated ring;

$R_{11B}$ to $R_{18B}$ which are not single bonds bonding with $L_{2B}$ and which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$L_{1B}$ and $L_{2B}$ are independently a single bond, a substituted or unsubstituted arylene group including 6 to 30 ring carbon atoms, or a substituted or unsubstituted divalent heterocyclic group including 5 to 30 ring atoms;

$Ar_{1B}$ is a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (1).

In one embodiment, one or more sets of adjacent two or more of $R_{11B}$ to $R_{18B}$ which are not single bonds bonding with $L_{2B}$ do not form a substituted or unsubstituted, saturated or unsaturated ring.

In one embodiment, the compound represented by the formula (2) is a compound represented by any one of the following formulas (2-1) to (2-3):

(2-1)

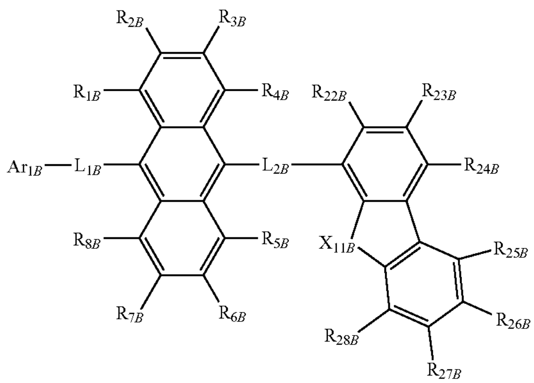

(2-2)

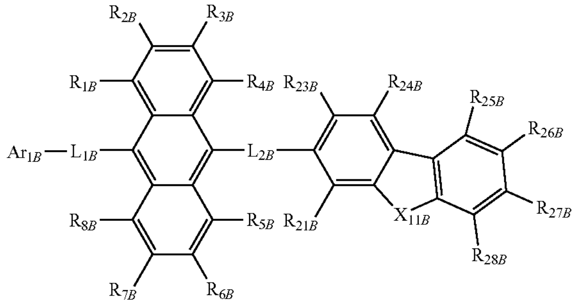

(2-3)

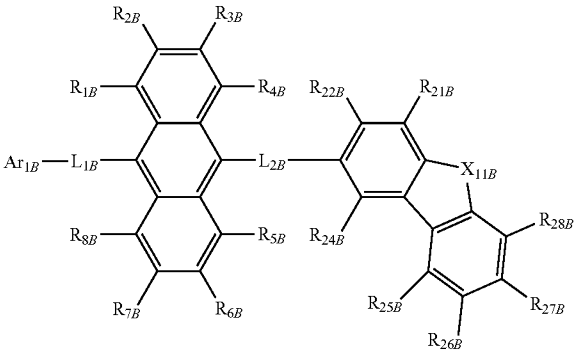

wherein in the formulas (2-1) to (2-3), $R_{1B}$ to $R_{8B}$, $L_{1B}$, $L_{2B}$, $Ar_{1B}$, and $X_{11B}$ are as defined in the formula (2);

one or more sets of adjacent two or more of $R_{25B}$ to $R_{28B}$ form a substituted or unsubstituted, saturated or unsaturated ring by bonding with each other;

one or more sets of adjacent two or more of $R_{21B}$ to $R_{24B}$ form a substituted or unsubstituted, saturated or unsaturated ring by bonding with each other, or do not form a substituted or unsubstituted, saturated or unsaturated ring;

$R_{21B}$ to $R_{28B}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (1).

In one embodiment, $L_{1B}$ and $L_{2B}$ are independently a single bond or a substituted or unsubstituted arylene group including 6 to 14 ring carbon atoms.

In one embodiment, $L_{1B}$ and $L_{2B}$ are independently a single bond, a substituted or unsubstituted phenylene group, or a substituted or unsubstituted naphthylene group.

In one embodiment, $Ar_{1B}$ is a substituted or unsubstituted aryl group including 6 to 50 ring carbon atoms.

In one embodiment, $Ar_{1B}$ is selected from the group represented by the following formulas (a1) to (a4):

(a1)

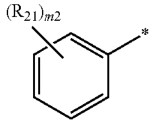

(a2)

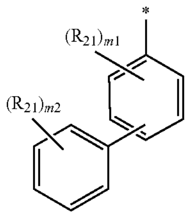

(a3)

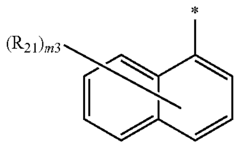

(a4)

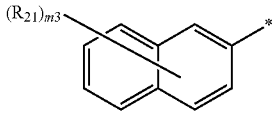

wherein in the formulas (a1) to (a4), * is a single bond bonding with $L_{1B}$;

$R_{21}$ is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{901}$ are as defined in the formula (1);

m1 is an integer of 0 to 4;

m2 is an integer of 0 to 5;

m3 is an integer of 0 to 7;

when each of m1 to m3 is 2 or more, a plurality of $R_{21}$ may be the same as or different from each other; and when each of m1 to m3 is 2 or more, a plurality of adjacent $R_{21}$'s forms a substituted or unsubstituted, saturated or unsaturated ring by bonding with each other, or does not form a substituted or unsubstituted, saturated or unsaturated ring.

In one embodiment, $X_{11B}$ is an oxygen atom.

In one embodiment, the compound represented by the formula (2) or the formulas (2-1) to (2-3) is a compound represented by any one of the following formulas (2-11) to (2-14):

(2-11)

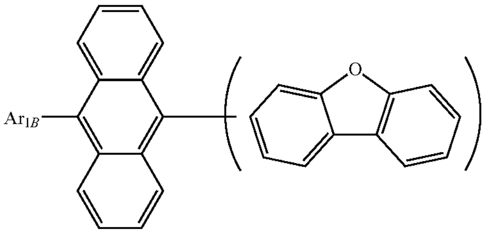

(2-12)

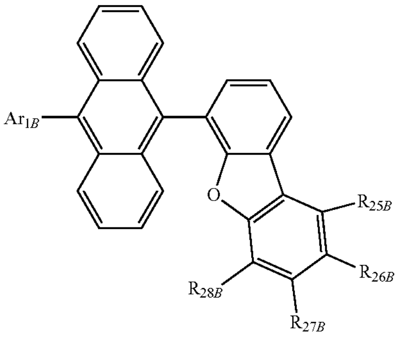

(2-13)

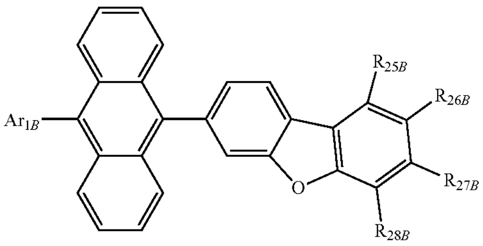

-continued (2-14)

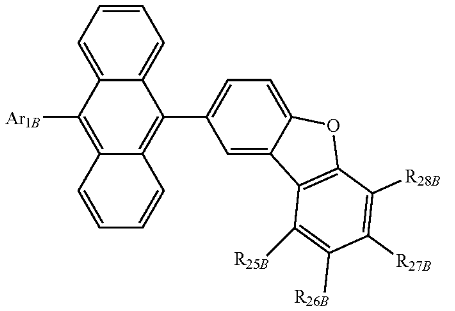

wherein in the formulas (2-11) to (2-14), $Ar_{1B}$ is as defined in the formula (2); and $R_{25B}$ to $R_{28B}$ are as defined in the formulas (2-1) to (2-3).

In one embodiment, at least two of $R_{1A}$ to $R_{8A}$ in the formula (1) and $R_{1B}$ to $R_{8B}$ in the formula (2) are deuterium atoms.

In one embodiment, $R_{1A}$ to $R_{8A}$ in the formula (1) and RIB to $R_{8B}$ in the formula (2) are all deuterium atoms.

In one embodiment, the compound represented by the formula (2) has at least one deuterium atom.

In one embodiment, at least one of $R_{1B}$ to $R_{8B}$ is a deuterium atom.

In one embodiment, based on the total amount of a compound represented by the formula (2) and a compound having the same structure as the compound represented by the formula (2) except that only protium atoms are contained as hydrogen atoms (hereinafter also referred to as a "protium compound"), the content proportion of the latter in the emitting layer is preferably 99 mol % or less. The content proportion of the protium compound can be confirmed by mass spectrometry.

The compound represented by the formula (2) can be synthesized by using a known alternative reaction or a raw material tailored to the target compound.

Specific examples of the compound represented by the formula (2) will be described below, but these are merely examples, and the compound represented by the formula (2) is not limited to the following specific examples.

2-1

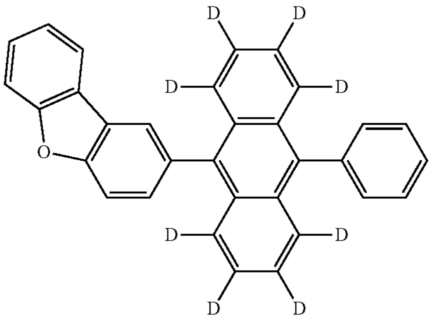

-continued 2-2

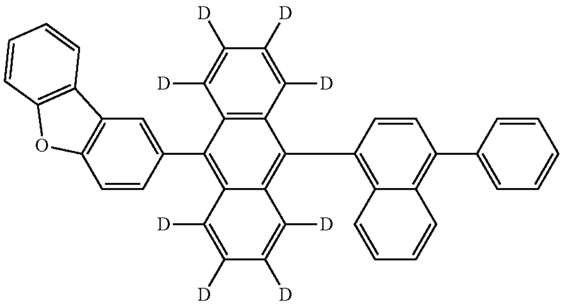

2-3

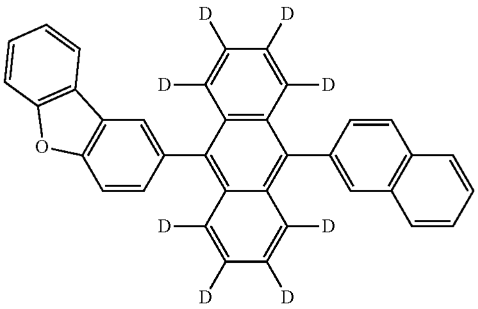

2-4

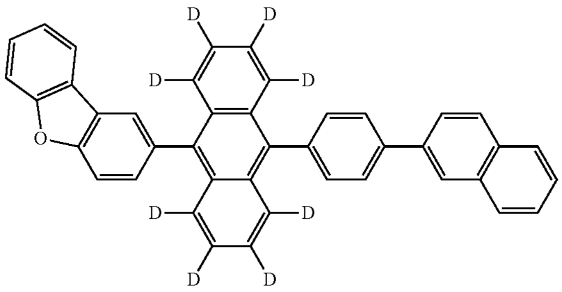

2-5

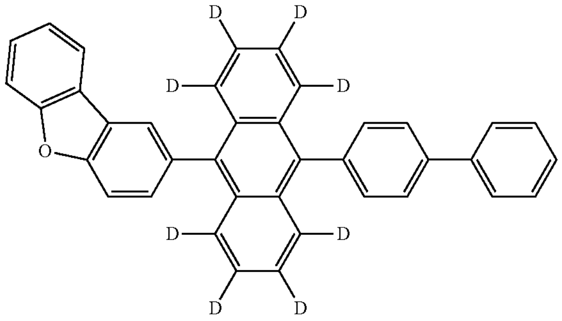

2-6

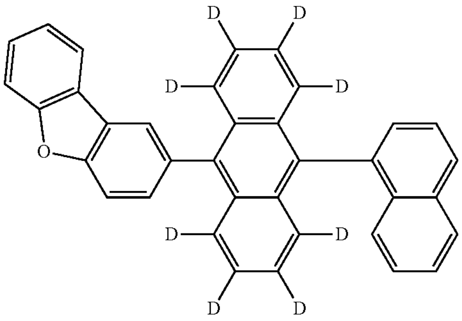

-continued
2-7
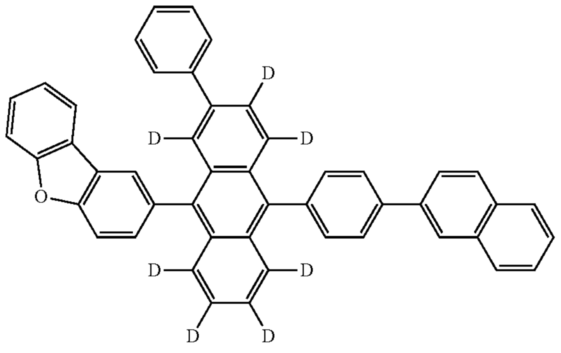
2-8
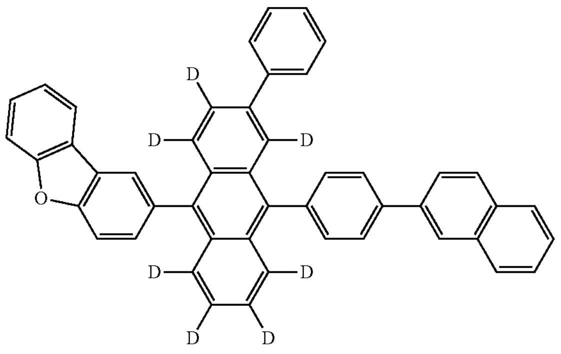
2-9
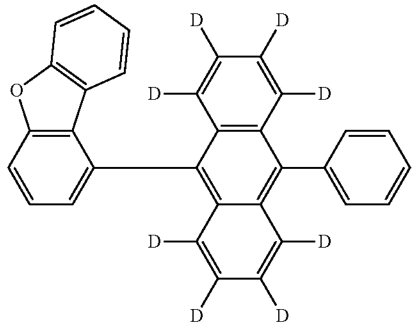
2-10
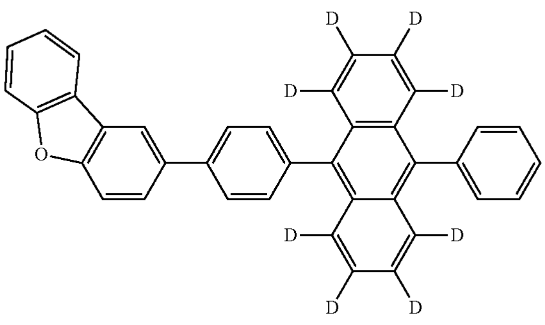
-continued
2-11
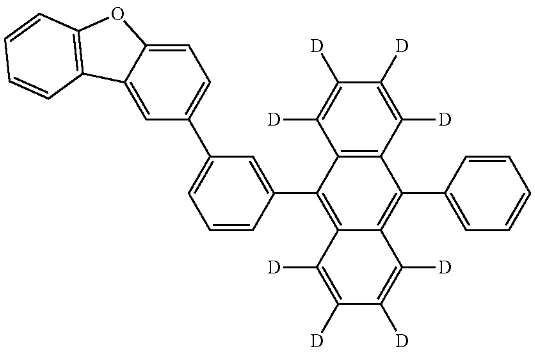
2-12
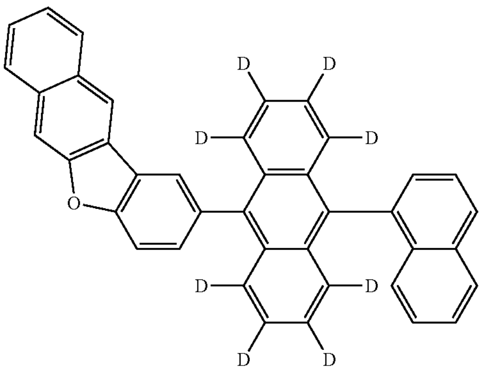
2-13
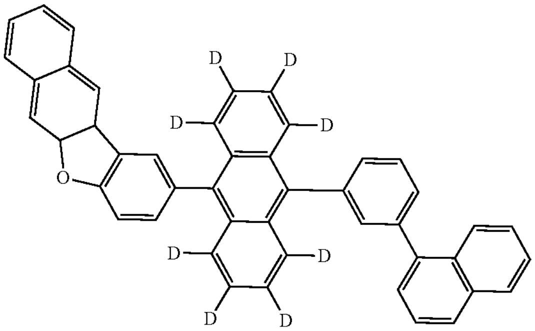
2-14
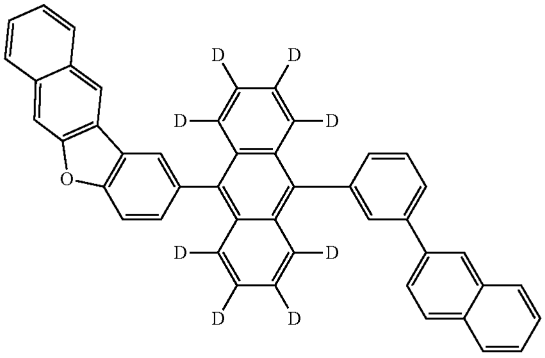

-continued
2-15
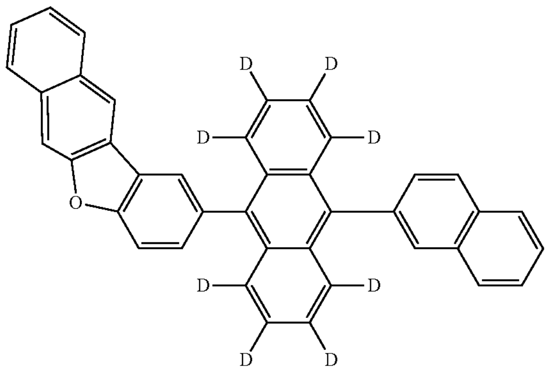
2-16
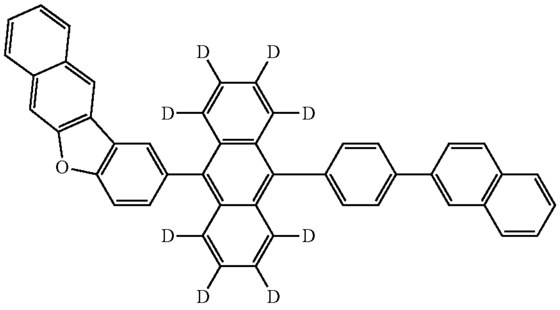
2-17
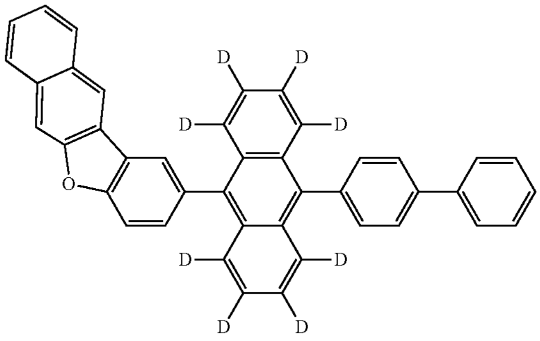
2-18
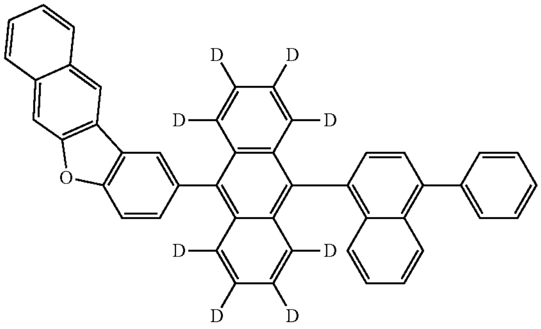
-continued
2-19
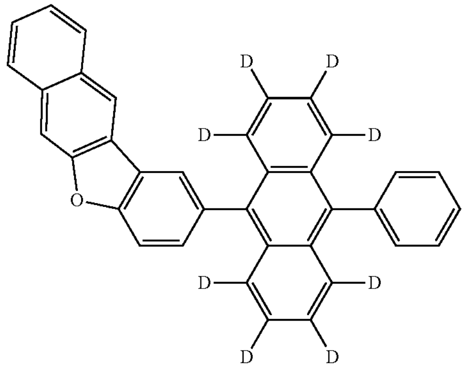
2-20
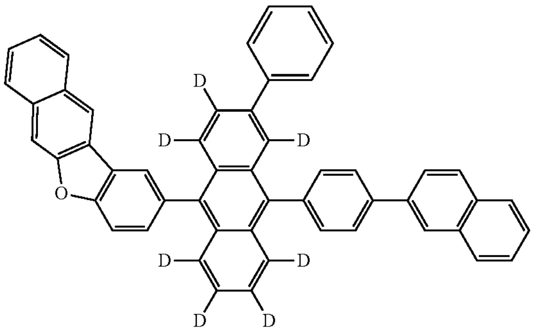
2-21
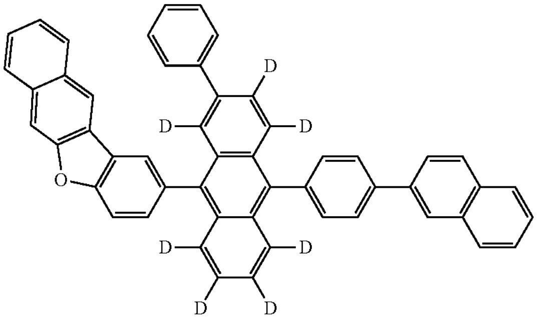
2-22
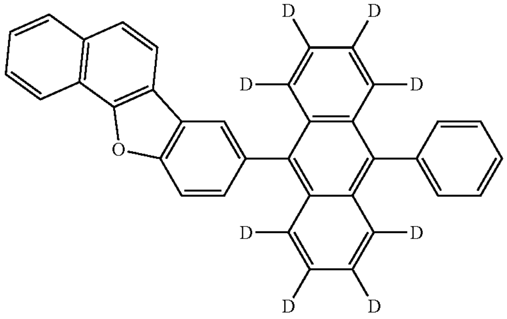

-continued
2-23
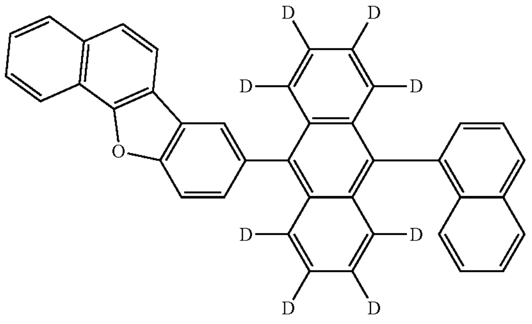
2-24
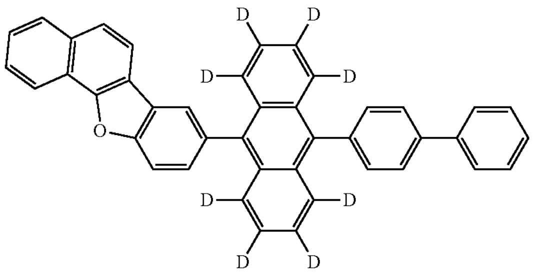
2-25
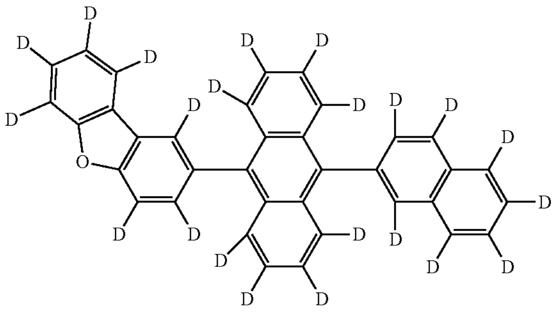
2-26
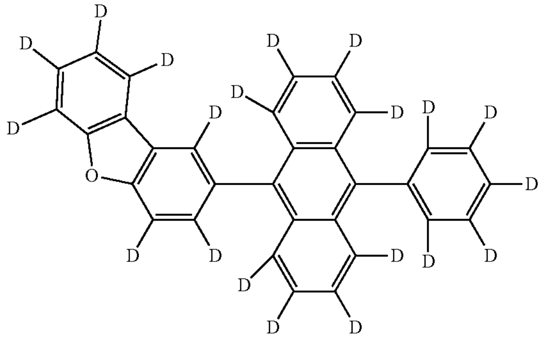
-continued
2-27
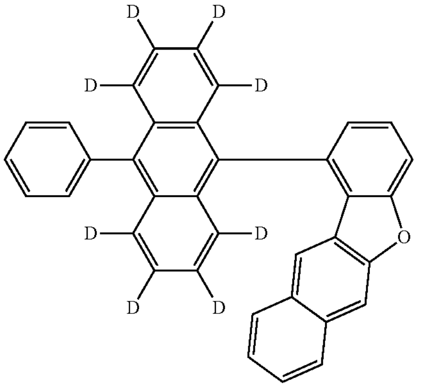
2-28
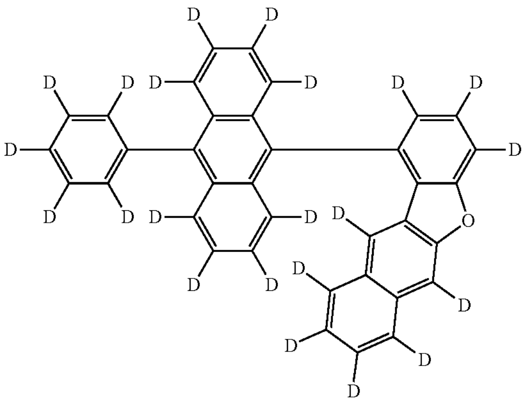
2-29
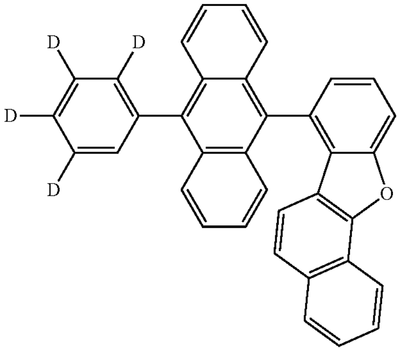
2-30
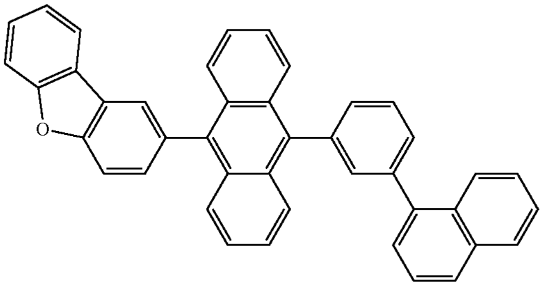

-continued
2-31
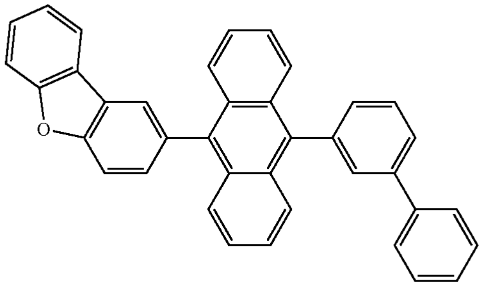
2-32
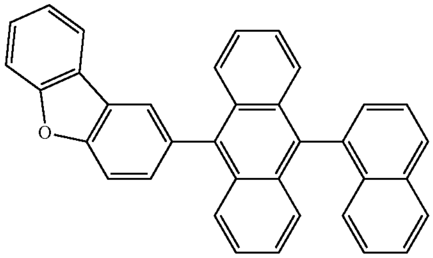
2-33
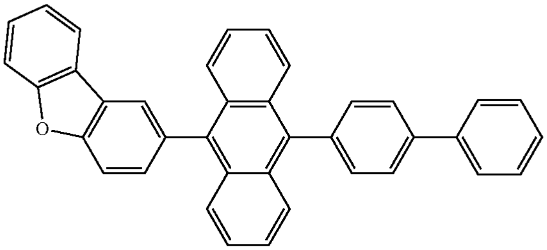
2-34
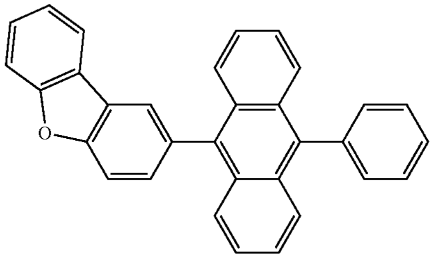
2-35
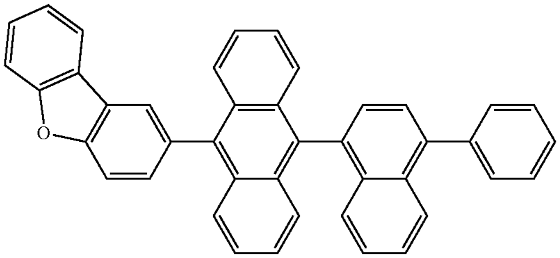
-continued
2-36
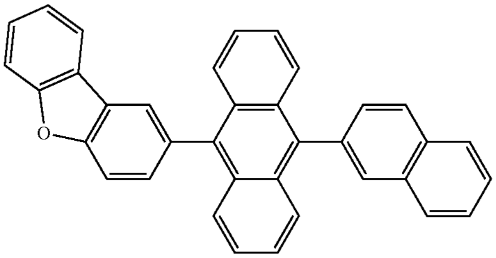
2-37
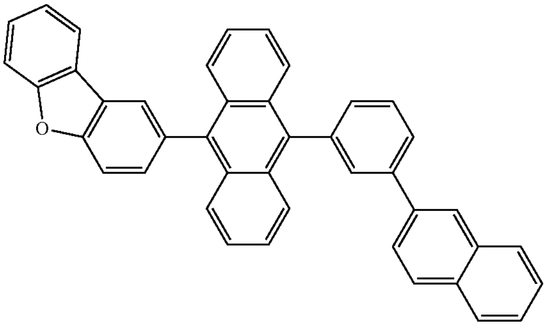
2-38
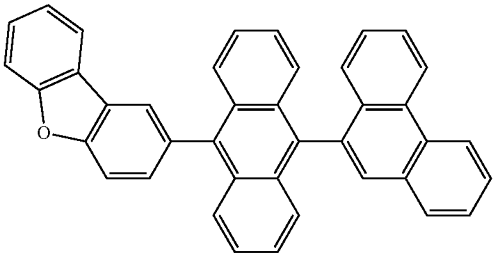
2-39
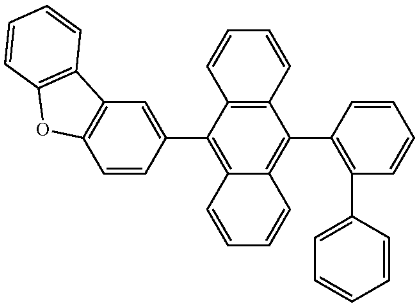
2-40
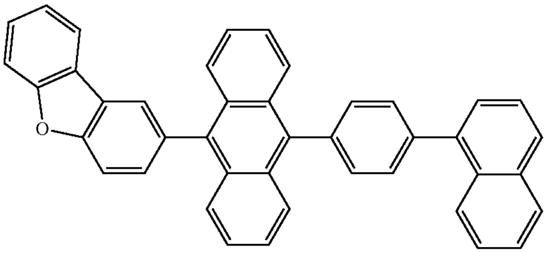

-continued
2-41
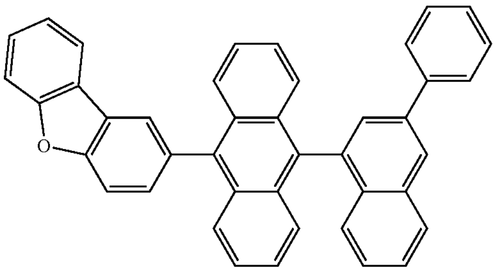
2-42
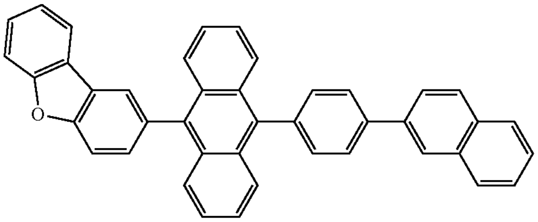
2-43
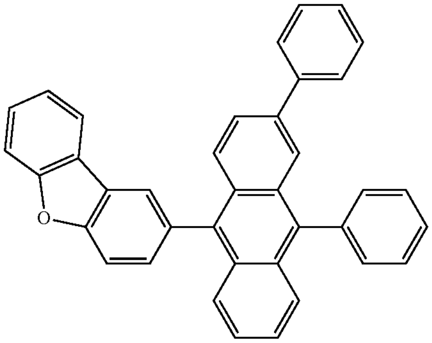
2-44
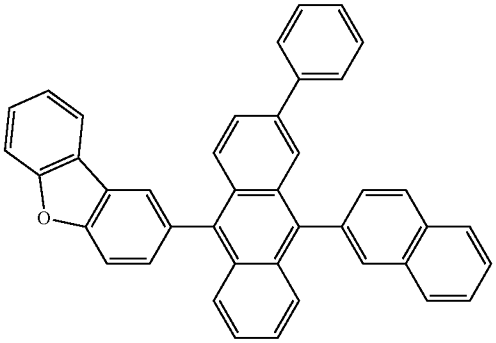
2-45
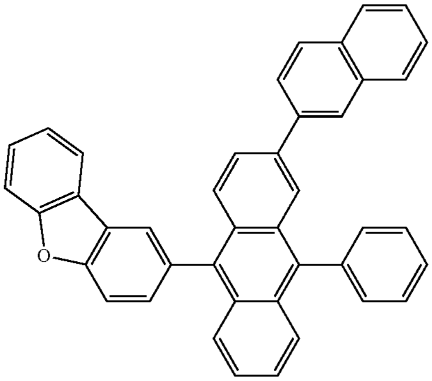
-continued
2-46
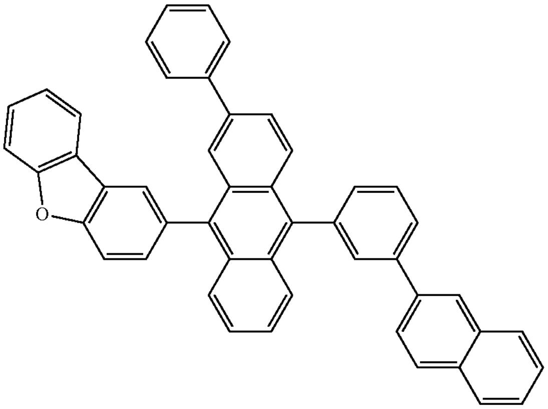
2-47
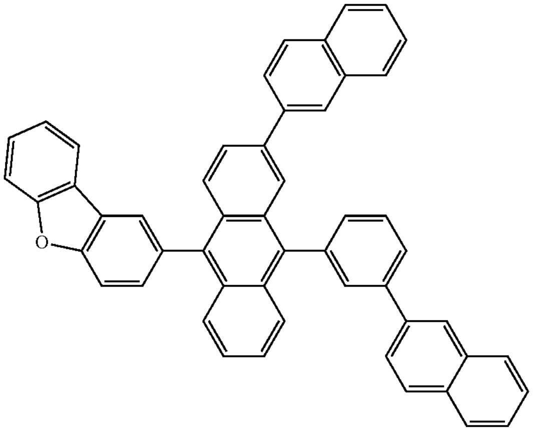
2-48
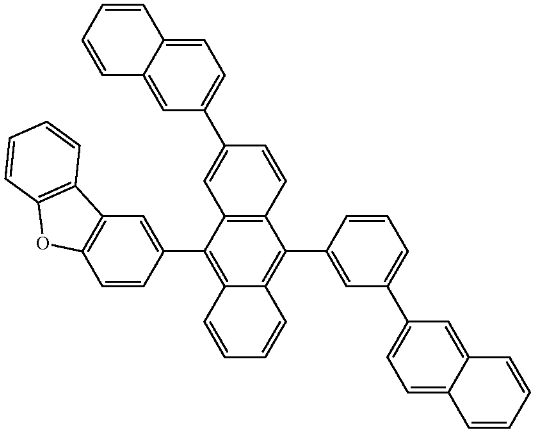

-continued
2-49
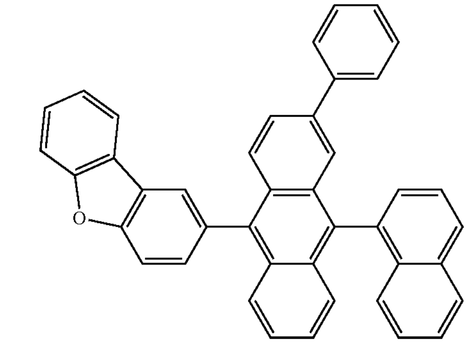
2-50
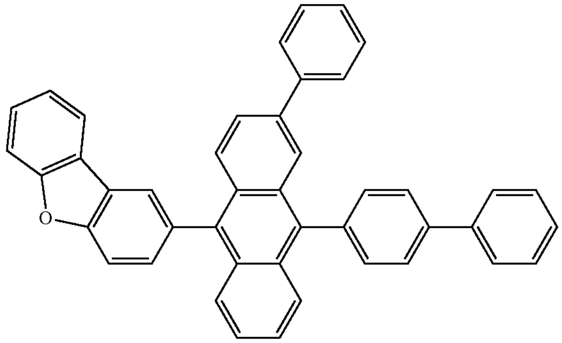
2-51
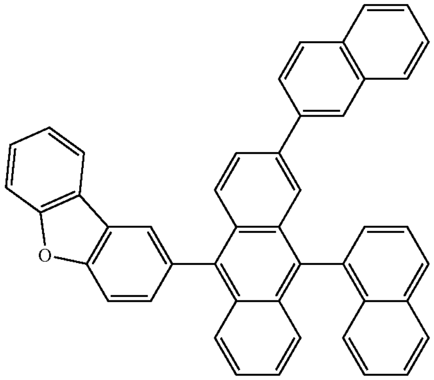
2-52
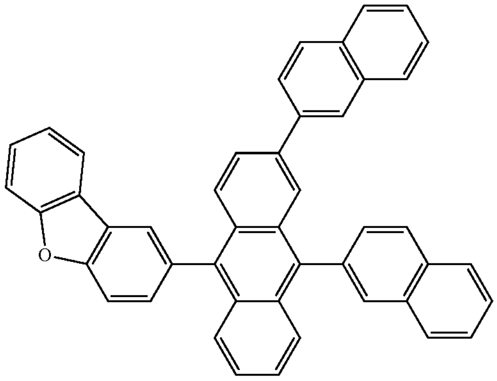
-continued
2-53
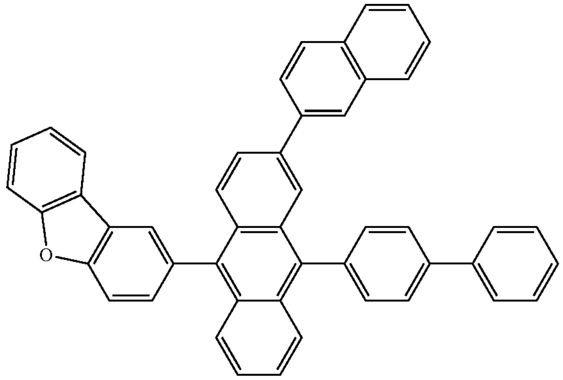
2-54
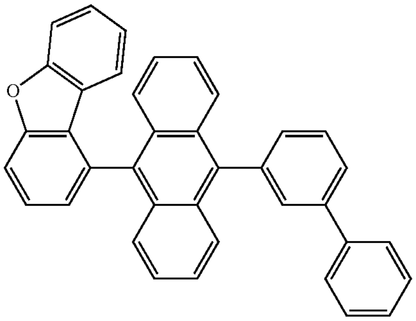
2-55
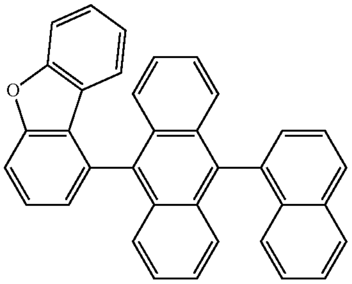
2-56
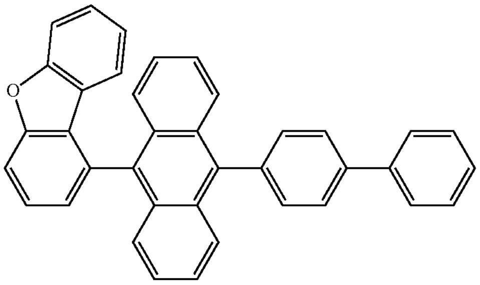
2-57
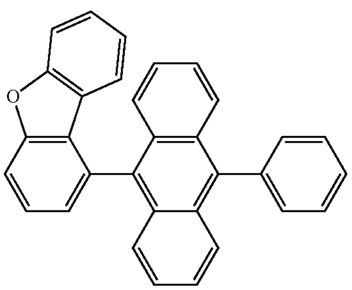

-continued
2-58
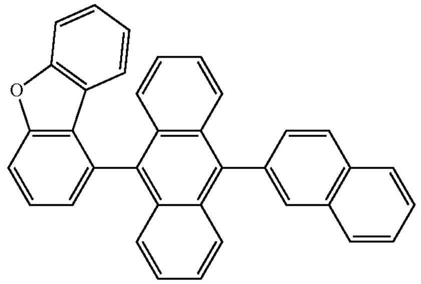
2-59
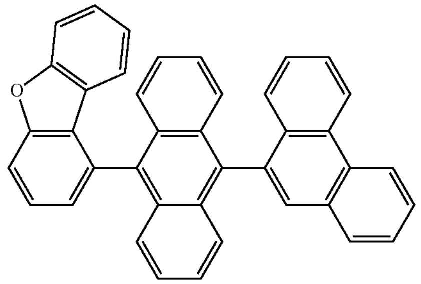
2-60
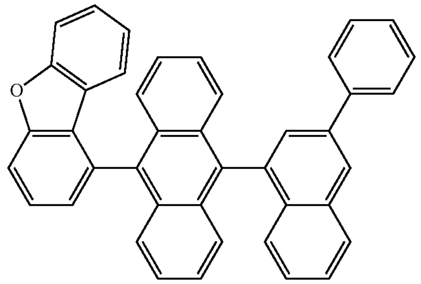
2-61
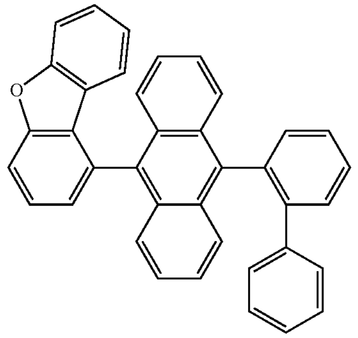
2-62
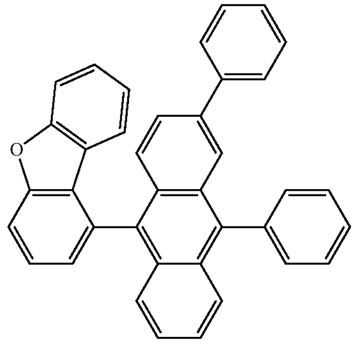
-continued
2-63
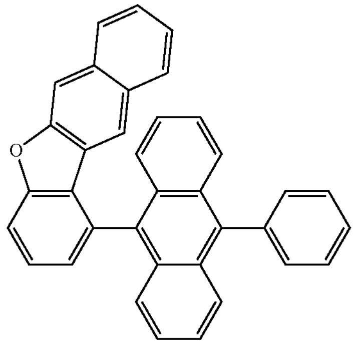
2-64
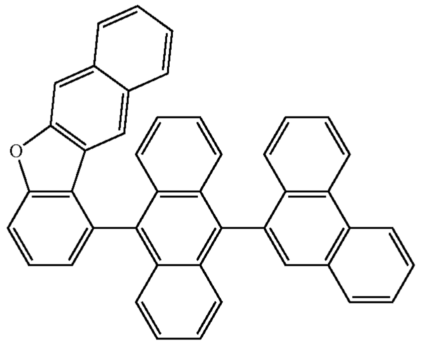
2-65
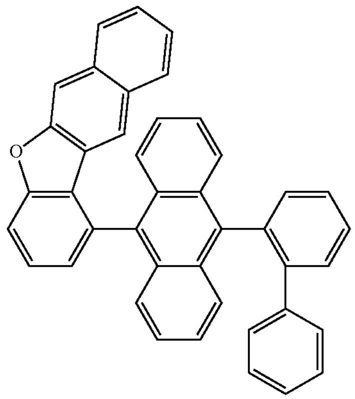
2-66
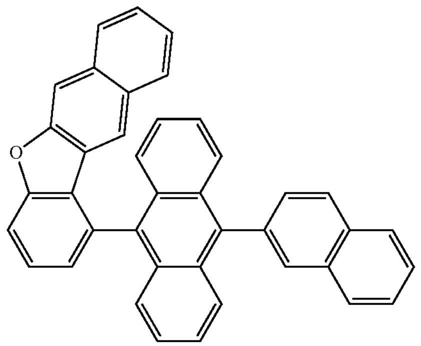

-continued
2-67
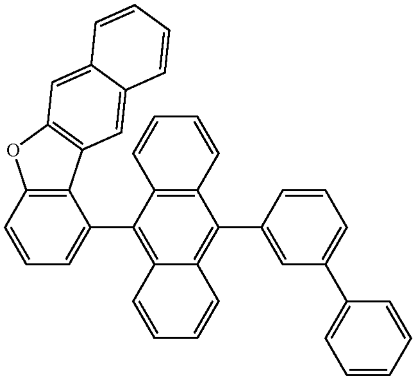
2-68
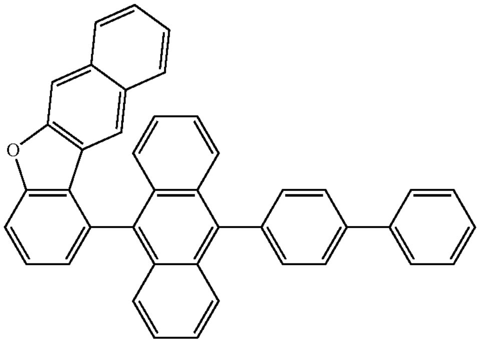
2-69
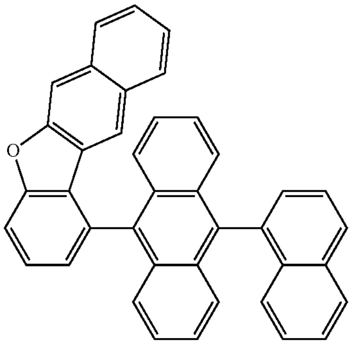
2-70
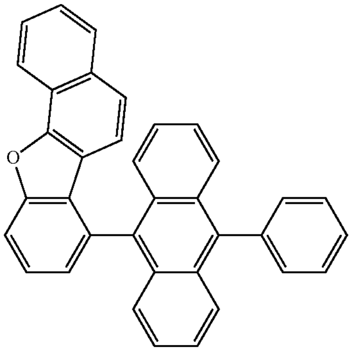
-continued
2-71
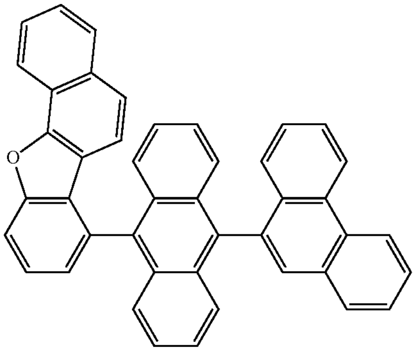
2-72
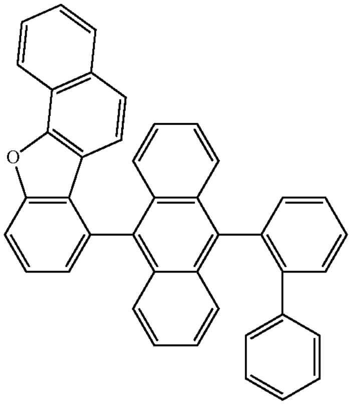
2-73
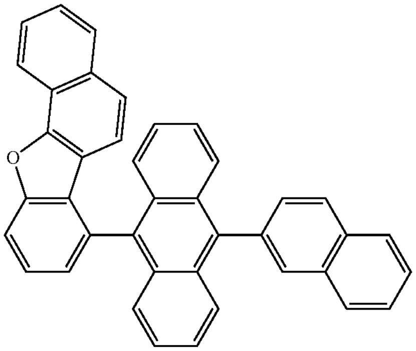
2-74
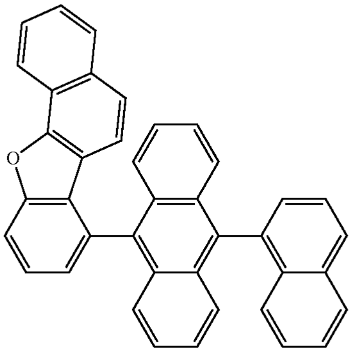

-continued
2-75
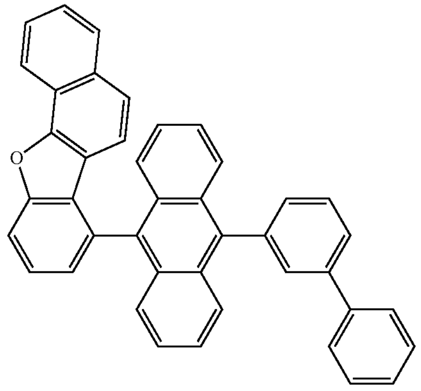
2-76
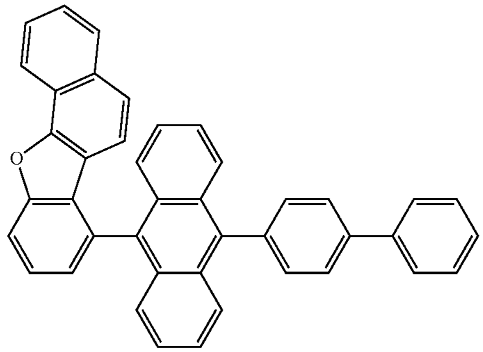
2-77
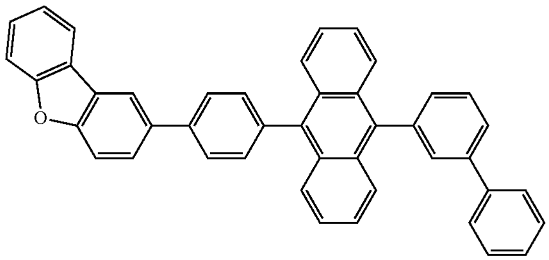
2-78
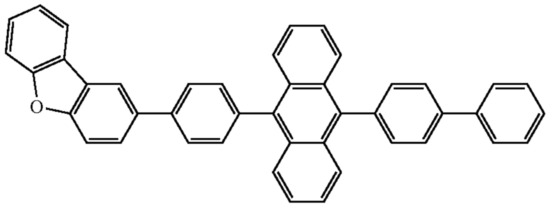
2-79
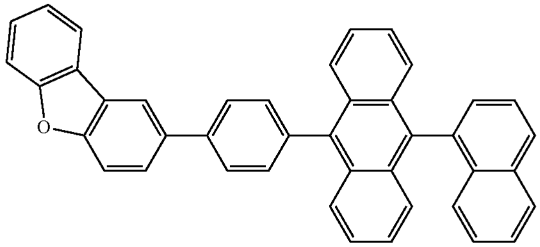
-continued
2-80
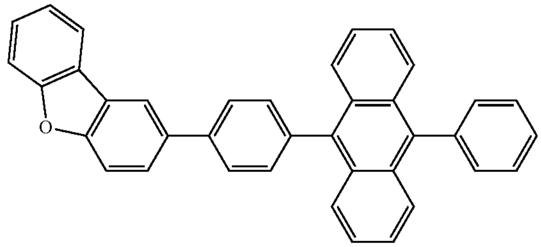
2-81
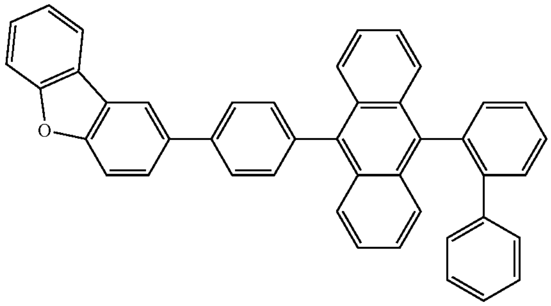
2-82
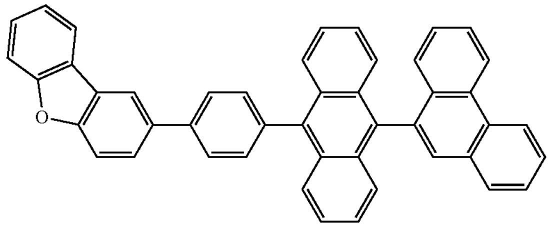
2-83
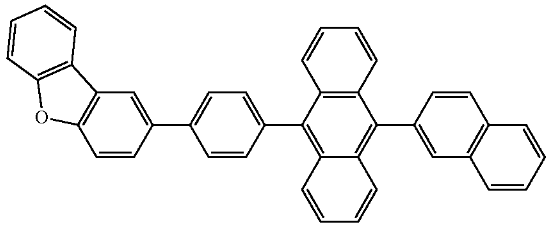
2-84
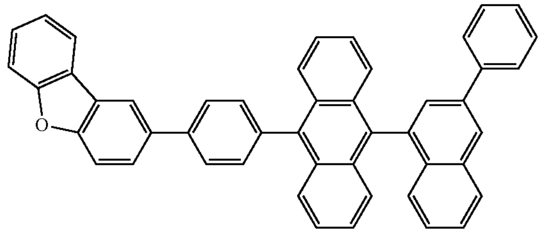

-continued
2-85
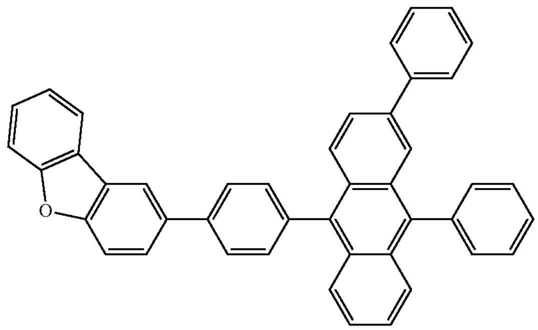
2-86
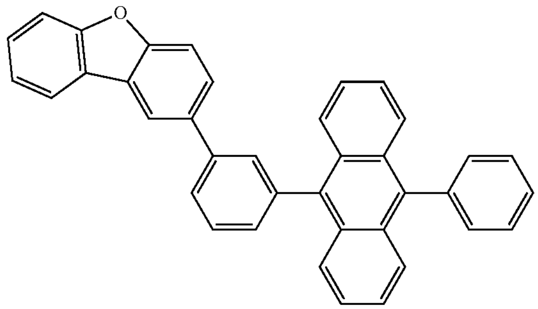
2-87
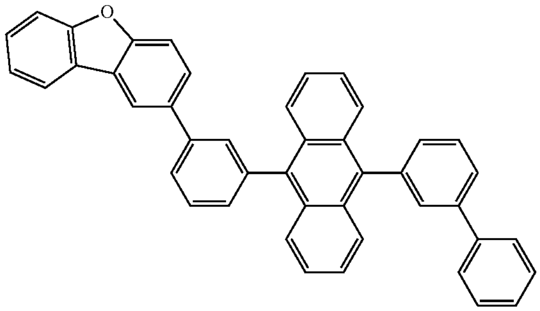
2-88
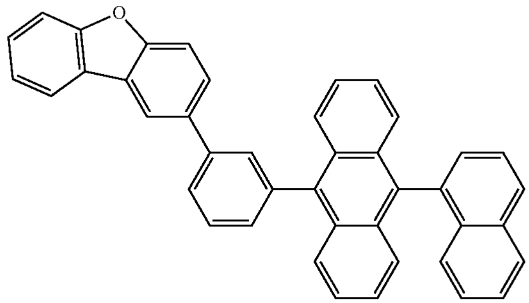
2-89
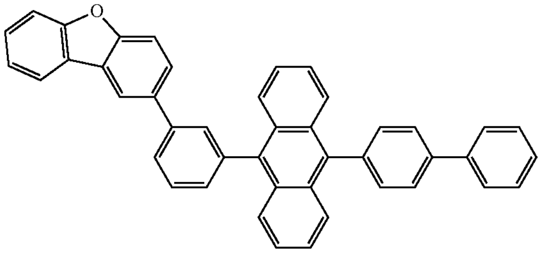
-continued
2-90
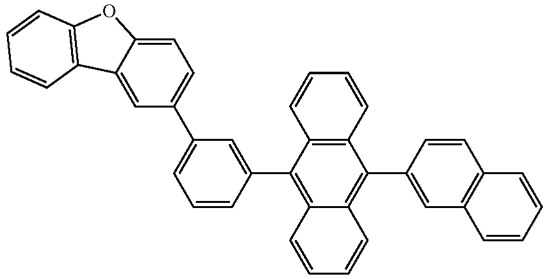
2-91
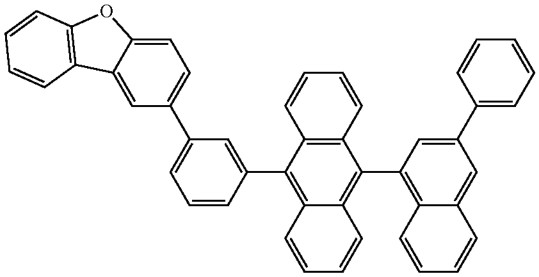
2-92
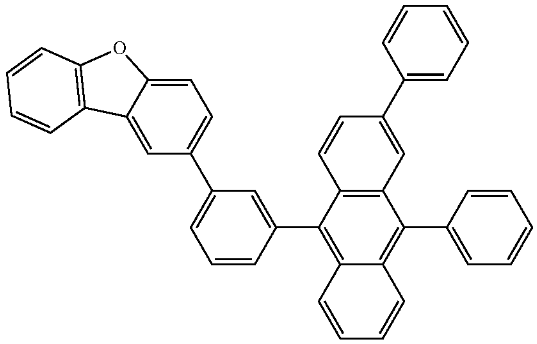
2-93
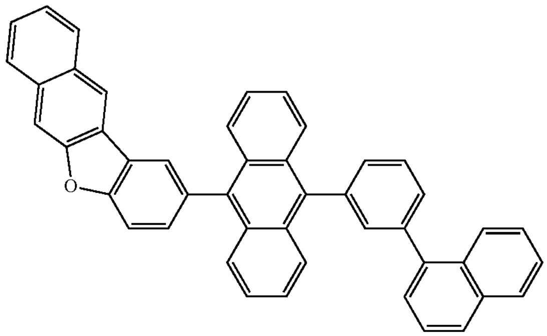

-continued
2-94
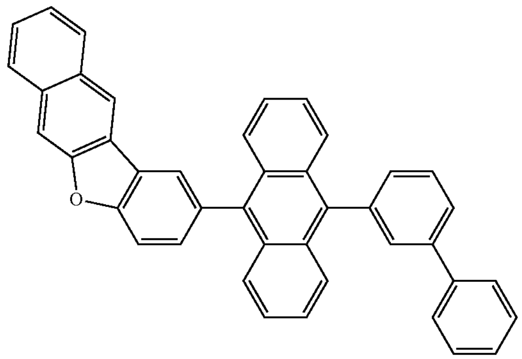
2-95
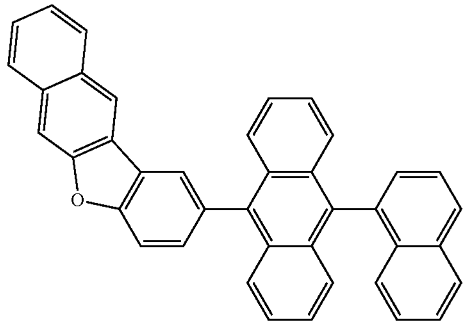
2-96
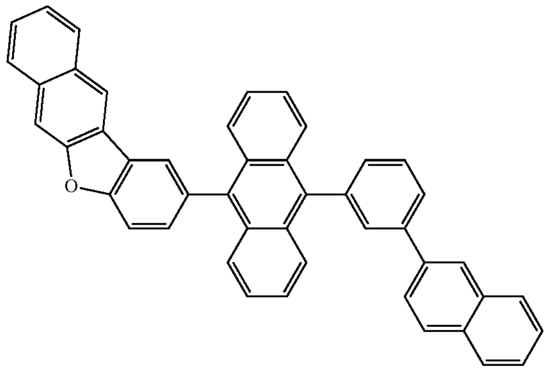
2-97
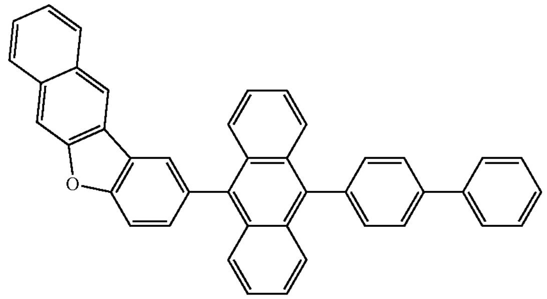
-continued
2-98
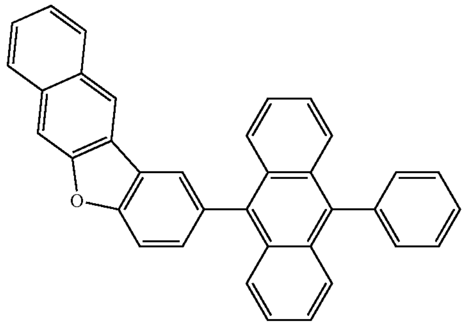
2-99
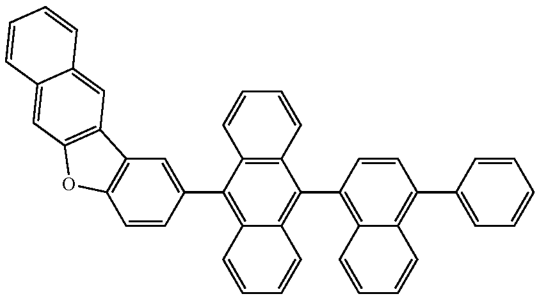
2-100
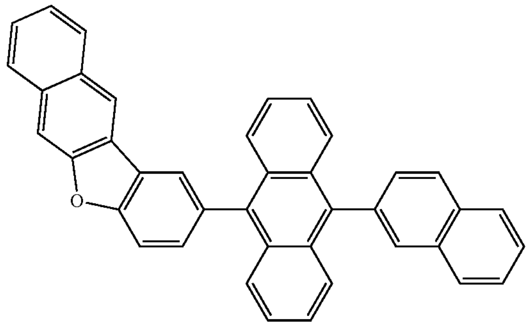
2-101
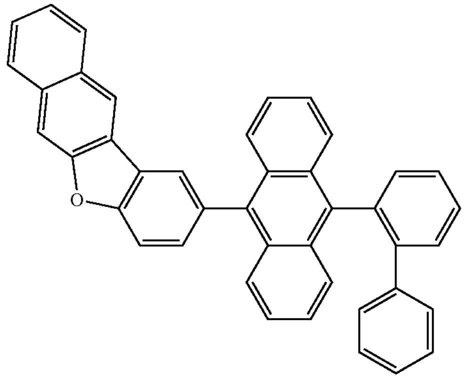

-continued
2-102
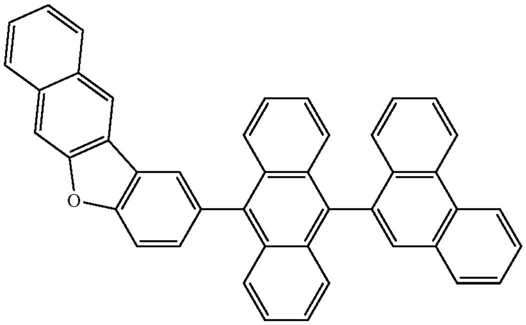
2-103
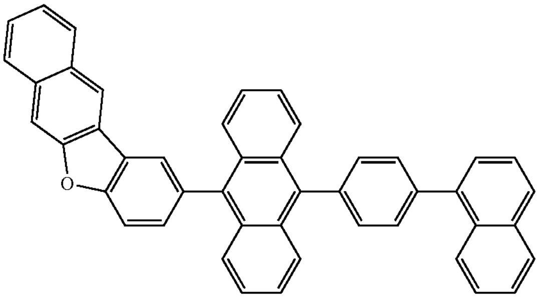
2-104
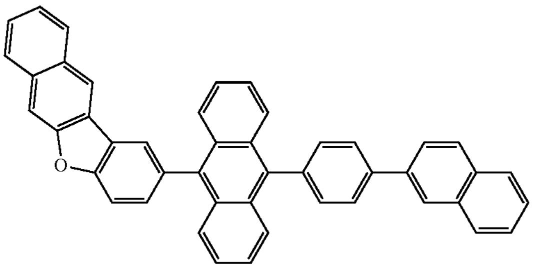
2-105
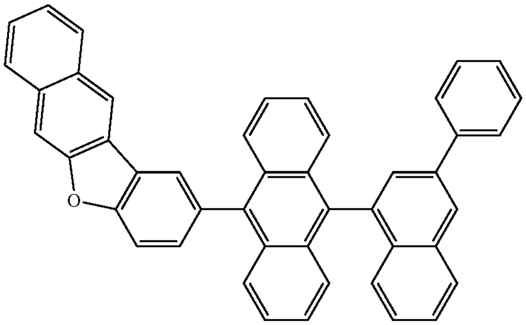
-continued
2-106
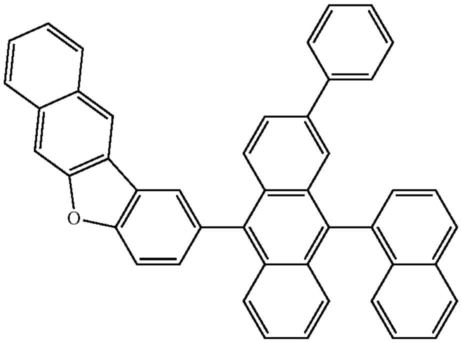
2-107
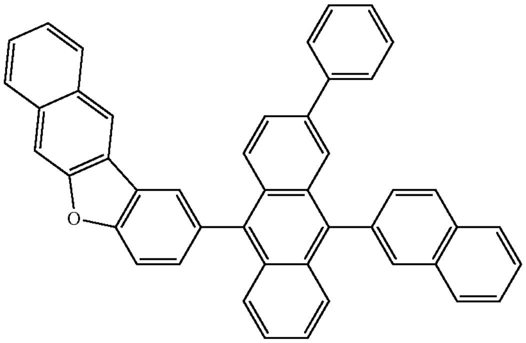
2-108
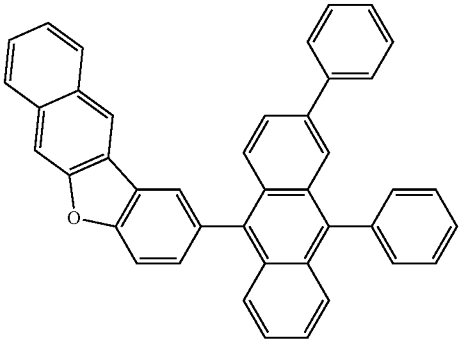
2-109
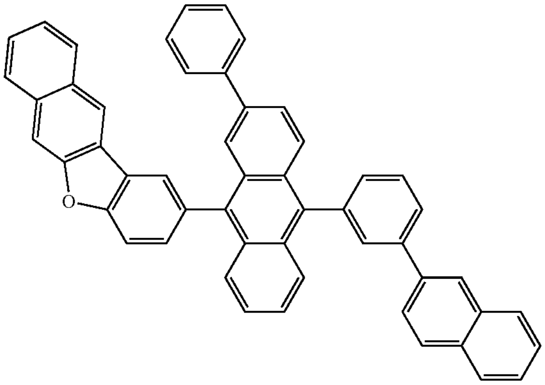

-continued
2-110
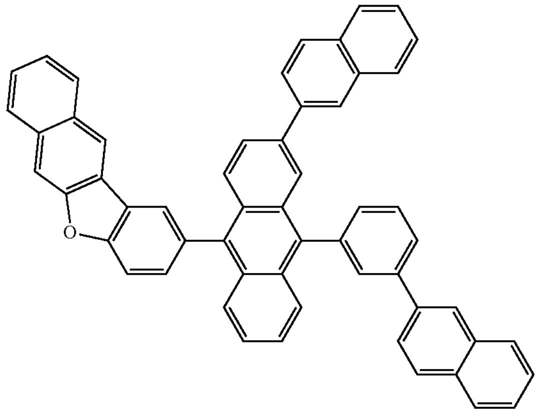
2-111
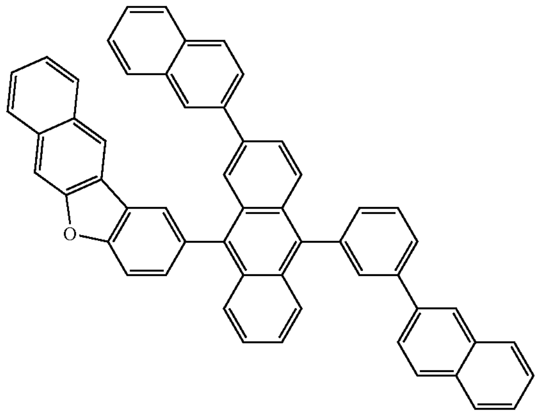
2-112
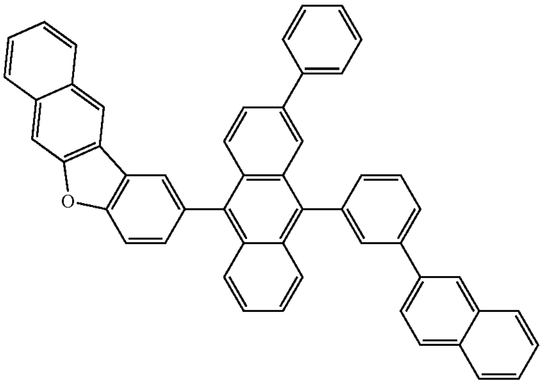
2-113
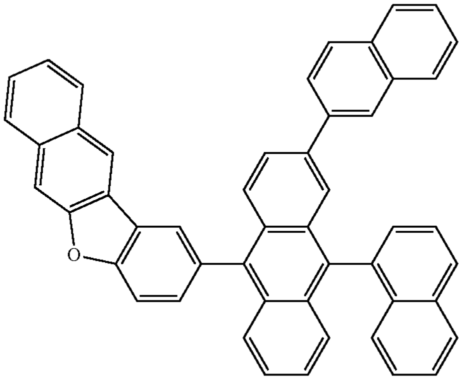
-continued
2-114
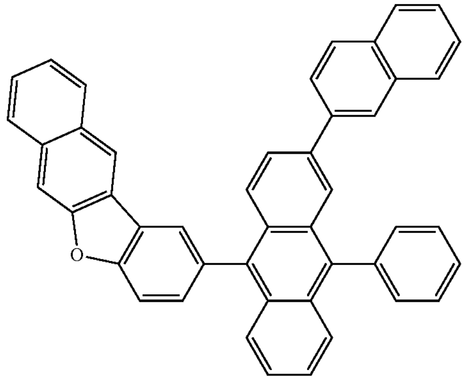
2-115
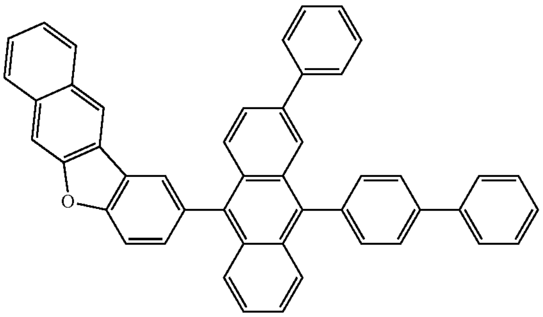
2-116
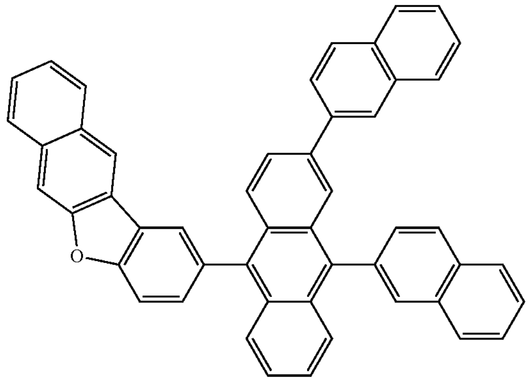
2-117
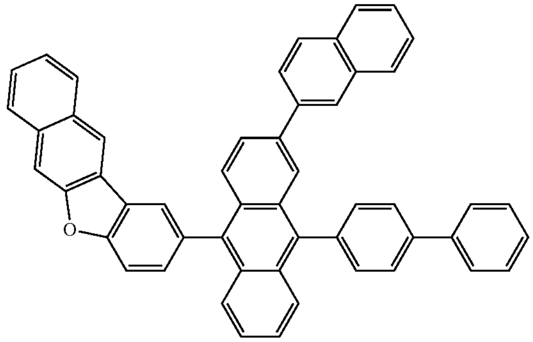

-continued
2-118
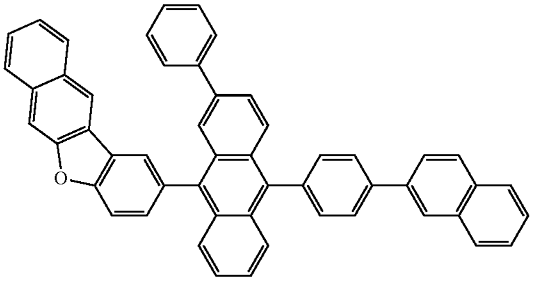
2-119
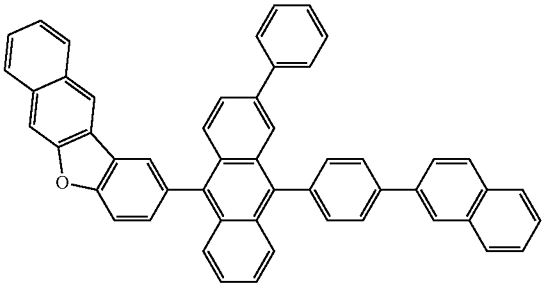
2-120
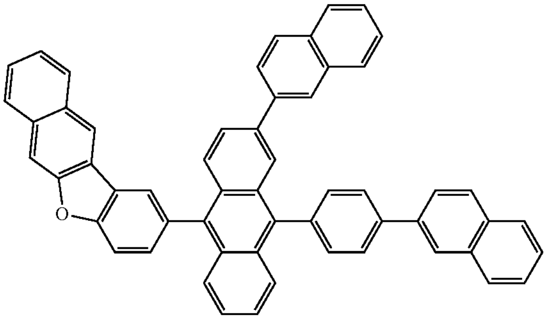
2-121
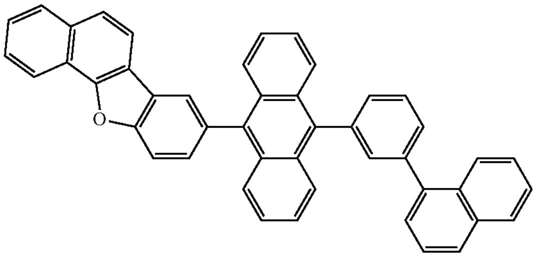
2-122
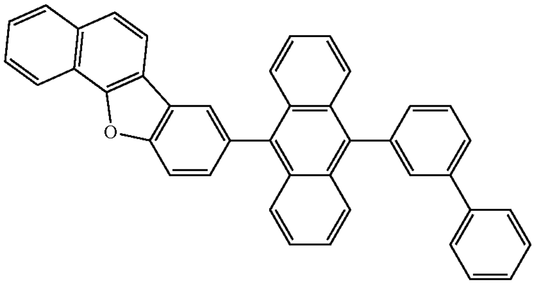
-continued
2-123
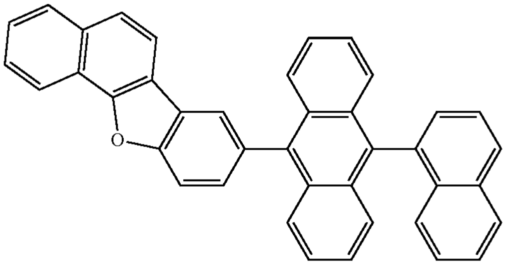
2-124
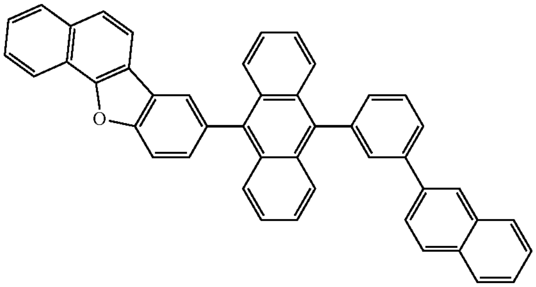
2-125
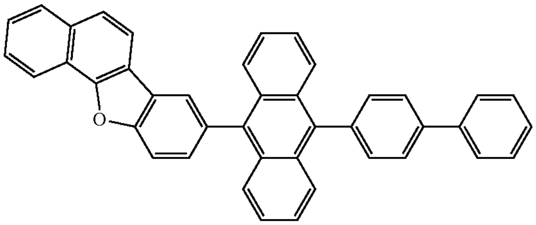
2-126
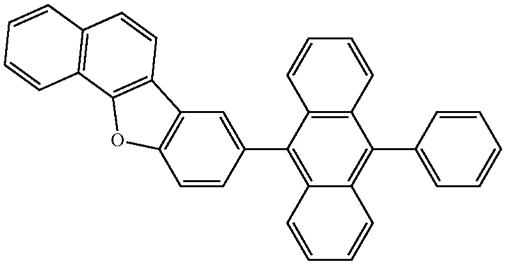
2-127
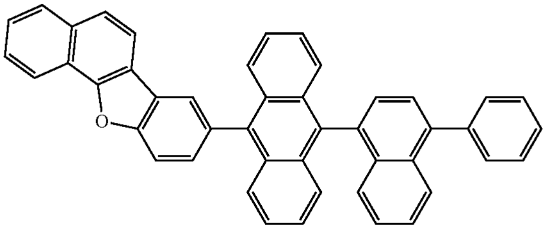

-continued 2-128

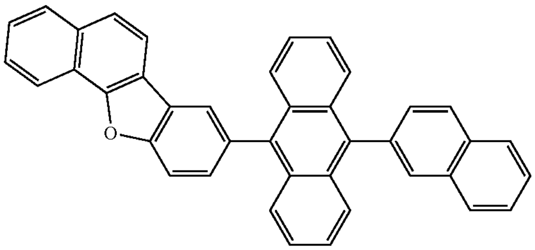

2-129

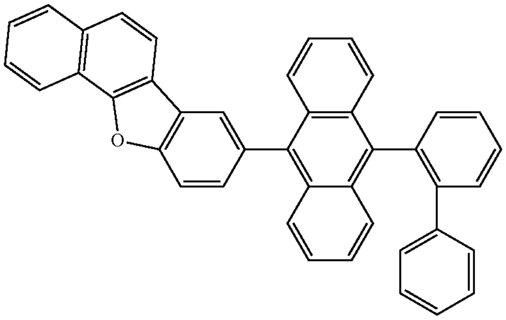

2-130

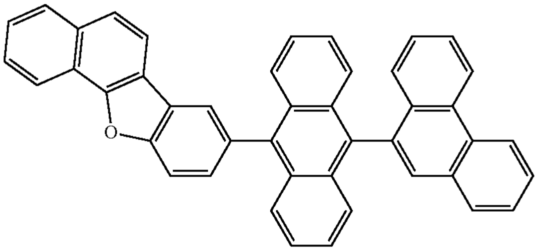

2-131

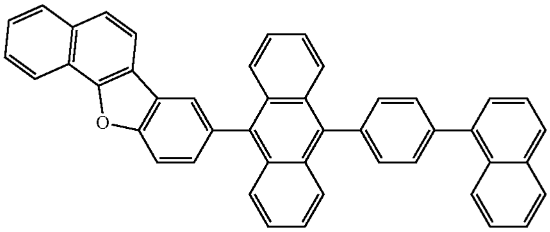

-continued 2-132

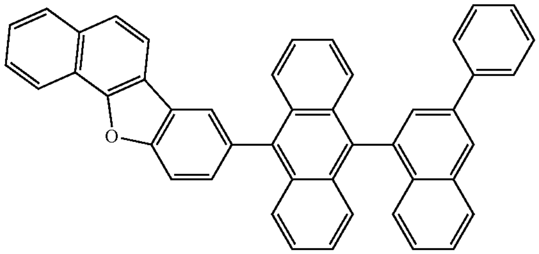

2-133

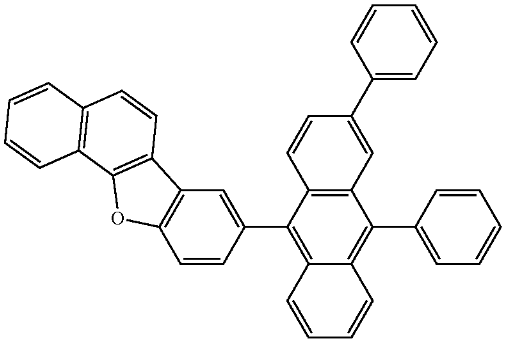

In one embodiment, the emitting layer contains a combination of a compound represented by the formula (1) (a first host material) and a compound represented by the formula (2) (a second host material) described in the following table. In the following table, 1-1 to 1-179 indicate the compound numbers of specific examples of the compound represented by the formula (1), and 2-1 to 2-133 indicate the compound numbers of specific examples of the compound represented by the formula (2). A combination of a specific example compound of the formula (1) and a specific example compound of the formula (2) is shown by a number of 1 to 10,703 in the following table.

TABLE 1

| | | Compound represented by the formula (1) | | | | | | | | | | | | |
|---|---|---|---|---|---|---|---|---|---|---|---|---|---|---|
| | | 1-1 | 1-2 | 1-3 | 1-4 | 1-5 | 1-6 | 1-7 | 1-8 | 1-9 | 1-10 | 1-11 | 1-12 | 1-13 |
| Compound | 2-1 | 1 | 2 | 3 | 4 | 5 | 6 | 7 | 8 | 9 | 10 | 11 | 12 | 13 |
| represented | 2-2 | 26 | 27 | 28 | 29 | 30 | 31 | 32 | 33 | 34 | 35 | 36 | 37 | 38 |
| by the | 2-3 | 51 | 52 | 53 | 54 | 55 | 56 | 57 | 58 | 59 | 60 | 61 | 62 | 63 |
| formula | 2-4 | 76 | 77 | 78 | 79 | 80 | 81 | 82 | 83 | 84 | 85 | 86 | 87 | 88 |
| (2) | 2-5 | 101 | 102 | 103 | 104 | 105 | 106 | 107 | 108 | 109 | 110 | 111 | 112 | 113 |
| | 2-6 | 126 | 127 | 128 | 129 | 130 | 131 | 132 | 133 | 134 | 135 | 136 | 137 | 138 |
| | 2-7 | 151 | 152 | 153 | 154 | 155 | 156 | 157 | 158 | 159 | 160 | 161 | 162 | 163 |
| | 2-8 | 176 | 177 | 178 | 179 | 180 | 181 | 182 | 183 | 184 | 185 | 186 | 187 | 188 |
| | 2-9 | 201 | 202 | 203 | 204 | 205 | 206 | 207 | 208 | 209 | 210 | 211 | 212 | 213 |
| | 2-10 | 226 | 227 | 228 | 229 | 230 | 231 | 232 | 233 | 234 | 235 | 236 | 237 | 238 |
| | 2-11 | 251 | 252 | 253 | 254 | 255 | 256 | 257 | 258 | 259 | 260 | 261 | 262 | 263 |
| | 2-12 | 276 | 277 | 278 | 279 | 280 | 281 | 282 | 283 | 284 | 285 | 286 | 287 | 288 |
| | 2-13 | 301 | 302 | 303 | 304 | 305 | 306 | 307 | 308 | 309 | 310 | 311 | 312 | 313 |
| | 2-14 | 326 | 327 | 328 | 329 | 330 | 331 | 332 | 333 | 334 | 335 | 336 | 337 | 338 |
| | 2-15 | 351 | 352 | 353 | 354 | 355 | 356 | 357 | 358 | 359 | 360 | 361 | 362 | 363 |

TABLE 1-continued

| | | | | | | | | | | | | | |
|---|---|---|---|---|---|---|---|---|---|---|---|---|---|
| 2-16 | 376 | 377 | 378 | 379 | 380 | 381 | 382 | 383 | 384 | 385 | 386 | 387 | 388 |
| 2-17 | 401 | 402 | 403 | 404 | 405 | 406 | 407 | 408 | 409 | 410 | 411 | 412 | 413 |
| 2-18 | 426 | 427 | 428 | 429 | 430 | 431 | 432 | 433 | 434 | 435 | 436 | 437 | 438 |
| 2-19 | 451 | 452 | 453 | 454 | 455 | 456 | 457 | 458 | 459 | 460 | 461 | 462 | 463 |
| 2-20 | 476 | 477 | 478 | 479 | 480 | 481 | 482 | 483 | 484 | 485 | 486 | 487 | 488 |
| 2-21 | 501 | 502 | 503 | 504 | 505 | 506 | 507 | 508 | 509 | 510 | 511 | 512 | 513 |
| 2-22 | 526 | 527 | 528 | 529 | 530 | 531 | 532 | 533 | 534 | 535 | 536 | 537 | 538 |
| 2-23 | 551 | 552 | 553 | 554 | 555 | 556 | 557 | 558 | 559 | 560 | 561 | 562 | 563 |
| 2-24 | 576 | 577 | 578 | 579 | 580 | 581 | 582 | 583 | 584 | 585 | 586 | 587 | 588 |
| 2-25 | 601 | 602 | 603 | 604 | 605 | 606 | 607 | 608 | 609 | 610 | 611 | 612 | 613 |
| 2-26 | 626 | 627 | 628 | 629 | 630 | 631 | 632 | 633 | 634 | 635 | 636 | 637 | 638 |
| 2-27 | 651 | 652 | 653 | 654 | 655 | 656 | 657 | 658 | 659 | 660 | 661 | 662 | 663 |
| 2-28 | 676 | 677 | 678 | 679 | 680 | 681 | 682 | 683 | 684 | 685 | 686 | 687 | 688 |
| 2-29 | 701 | 702 | 703 | 704 | 705 | 706 | 707 | 708 | 709 | 710 | 711 | 712 | 713 |
| 2-30 | 726 | 727 | 728 | 729 | 730 | 731 | 732 | 733 | 734 | 735 | 736 | 737 | 738 |
| 2-31 | 751 | 752 | 753 | 754 | 755 | 756 | 757 | 758 | 759 | 760 | 761 | 762 | 763 |
| 2-32 | 776 | 777 | 778 | 779 | 780 | 781 | 782 | 783 | 784 | 785 | 786 | 787 | 788 |
| 2-33 | 801 | 802 | 803 | 804 | 805 | 806 | 807 | 808 | 809 | 810 | 811 | 812 | 813 |
| 2-34 | 826 | 827 | 828 | 829 | 830 | 831 | 832 | 833 | 834 | 835 | 836 | 837 | 838 |
| 2-35 | 851 | 852 | 853 | 854 | 855 | 856 | 857 | 858 | 859 | 860 | 861 | 862 | 863 |
| 2-36 | 876 | 877 | 878 | 879 | 880 | 881 | 882 | 883 | 884 | 885 | 886 | 887 | 888 |
| 2-37 | 901 | 902 | 903 | 904 | 905 | 906 | 907 | 908 | 909 | 910 | 911 | 912 | 913 |
| 2-38 | 926 | 927 | 928 | 929 | 930 | 931 | 932 | 933 | 934 | 935 | 936 | 937 | 938 |
| 2-39 | 951 | 952 | 953 | 954 | 955 | 956 | 957 | 958 | 959 | 960 | 961 | 962 | 963 |
| 2-40 | 976 | 977 | 978 | 979 | 980 | 981 | 982 | 983 | 984 | 985 | 986 | 987 | 988 |
| 2-41 | 1,001 | 1,002 | 1,003 | 1,004 | 1,005 | 1,006 | 1,007 | 1,008 | 1,009 | 1,010 | 1,011 | 1,012 | 1,013 |
| 2-42 | 1,026 | 1,027 | 1,028 | 1,029 | 1,030 | 1,031 | 1,032 | 1,033 | 1,034 | 1,035 | 1,036 | 1,037 | 1,038 |
| 2-43 | 1,051 | 1,052 | 1,053 | 1,054 | 1,055 | 1,056 | 1,057 | 1,058 | 1,059 | 1,060 | 1,061 | 1,062 | 1,063 |
| 2-44 | 1,076 | 1,077 | 1,078 | 1,079 | 1,080 | 1,081 | 1,082 | 1,083 | 1,084 | 1,085 | 1,086 | 1,087 | 1,088 |
| 2-45 | 1,101 | 1,102 | 1,103 | 1,104 | 1,105 | 1,106 | 1,107 | 1,108 | 1,109 | 1,110 | 1,111 | 1,112 | 1,113 |
| 2-46 | 1,126 | 1,127 | 1,128 | 1,129 | 1,130 | 1,131 | 1,132 | 1,133 | 1,134 | 1,135 | 1,136 | 1,137 | 1,138 |
| 2-47 | 1,151 | 1,152 | 1,153 | 1,154 | 1,155 | 1,156 | 1,157 | 1,158 | 1,159 | 1,160 | 1,161 | 1,162 | 1,163 |
| 2-48 | 1,176 | 1,177 | 1,178 | 1,179 | 1,180 | 1,181 | 1,182 | 1,183 | 1,184 | 1,185 | 1,186 | 1,187 | 1,188 |
| 2-49 | 1,201 | 1,202 | 1,203 | 1,204 | 1,205 | 1,206 | 1,207 | 1,208 | 1,209 | 1,210 | 1,211 | 1,212 | 1,213 |
| 2-50 | 1,226 | 1,227 | 1,228 | 1,229 | 1,230 | 1,231 | 1,232 | 1,233 | 1,234 | 1,235 | 1,236 | 1,237 | 1,238 |
| 2-51 | 1,251 | 1,252 | 1,253 | 1,254 | 1,255 | 1,256 | 1,257 | 1,258 | 1,259 | 1,260 | 1,261 | 1,262 | 1,263 |
| 2-52 | 1,276 | 1,277 | 1,278 | 1,279 | 1,280 | 1,281 | 1,282 | 1,283 | 1,284 | 1,285 | 1,286 | 1,287 | 1,288 |
| 2-53 | 1,301 | 1,302 | 1,303 | 1,304 | 1,305 | 1,306 | 1,307 | 1,308 | 1,309 | 1,310 | 1,311 | 1,312 | 1,313 |
| 2-54 | 1,326 | 1,327 | 1,328 | 1,329 | 1,330 | 1,331 | 1,332 | 1,333 | 1,334 | 1,335 | 1,336 | 1,337 | 1,338 |
| 2-55 | 1,351 | 1,352 | 1,353 | 1,354 | 1,355 | 1,356 | 1,357 | 1,358 | 1,359 | 1,360 | 1,361 | 1,362 | 1,363 |

| | | Compound represented by the formula (1) | | | | | | | | | | | |
|---|---|---|---|---|---|---|---|---|---|---|---|---|---|
| | | 1-14 | 1-15 | 1-16 | 1-17 | 1-18 | 1-19 | 1-20 | 1-21 | 1-22 | 1-23 | 1-24 | 1-25 |
| Compound represented by the formula (2) | 2-1 | 14 | 15 | 16 | 17 | 18 | 19 | 20 | 21 | 22 | 23 | 24 | 25 |
| | 2-2 | 39 | 40 | 41 | 42 | 43 | 44 | 45 | 46 | 47 | 48 | 49 | 50 |
| | 2-3 | 64 | 65 | 66 | 67 | 68 | 69 | 70 | 71 | 72 | 73 | 74 | 75 |
| | 2-4 | 89 | 90 | 91 | 92 | 93 | 94 | 95 | 96 | 97 | 98 | 99 | 100 |
| | 2-5 | 114 | 115 | 116 | 117 | 118 | 119 | 120 | 121 | 122 | 123 | 124 | 125 |
| | 2-6 | 139 | 140 | 141 | 142 | 143 | 144 | 145 | 146 | 147 | 148 | 149 | 150 |
| | 2-7 | 164 | 165 | 166 | 167 | 168 | 169 | 170 | 171 | 172 | 173 | 174 | 175 |
| | 2-8 | 189 | 190 | 191 | 192 | 193 | 194 | 195 | 196 | 197 | 198 | 199 | 200 |
| | 2-9 | 214 | 215 | 216 | 217 | 218 | 219 | 220 | 221 | 222 | 223 | 224 | 225 |
| | 2-10 | 239 | 240 | 241 | 242 | 243 | 244 | 245 | 246 | 247 | 248 | 249 | 250 |
| | 2-11 | 264 | 265 | 266 | 267 | 268 | 269 | 270 | 271 | 272 | 273 | 274 | 275 |
| | 2-12 | 289 | 290 | 291 | 292 | 293 | 294 | 295 | 296 | 297 | 298 | 299 | 300 |
| | 2-13 | 314 | 315 | 316 | 317 | 318 | 319 | 320 | 321 | 322 | 323 | 324 | 325 |
| | 2-14 | 339 | 340 | 341 | 342 | 343 | 344 | 345 | 346 | 347 | 348 | 349 | 350 |
| | 2-15 | 364 | 365 | 366 | 367 | 368 | 369 | 370 | 371 | 372 | 373 | 374 | 375 |
| | 2-16 | 389 | 390 | 391 | 392 | 393 | 394 | 395 | 396 | 397 | 398 | 399 | 400 |
| | 2-17 | 414 | 415 | 416 | 417 | 418 | 419 | 420 | 421 | 422 | 423 | 424 | 425 |
| | 2-18 | 439 | 440 | 441 | 442 | 443 | 444 | 445 | 446 | 447 | 448 | 449 | 450 |
| | 2-19 | 464 | 465 | 466 | 467 | 468 | 469 | 470 | 471 | 472 | 473 | 474 | 475 |
| | 2-20 | 489 | 490 | 491 | 492 | 493 | 494 | 495 | 496 | 497 | 498 | 499 | 500 |
| | 2-21 | 514 | 515 | 516 | 517 | 518 | 519 | 520 | 521 | 522 | 523 | 524 | 525 |
| | 2-22 | 539 | 540 | 541 | 542 | 543 | 544 | 545 | 546 | 547 | 548 | 549 | 550 |
| | 2-23 | 564 | 565 | 566 | 567 | 568 | 569 | 570 | 571 | 572 | 573 | 574 | 575 |
| | 2-24 | 589 | 590 | 591 | 592 | 593 | 594 | 595 | 596 | 597 | 598 | 599 | 600 |
| | 2-25 | 614 | 615 | 616 | 617 | 618 | 619 | 620 | 621 | 622 | 623 | 624 | 625 |
| | 2-26 | 639 | 640 | 641 | 642 | 643 | 644 | 645 | 646 | 647 | 648 | 649 | 650 |
| | 2-27 | 664 | 665 | 666 | 667 | 668 | 669 | 670 | 671 | 672 | 673 | 674 | 675 |
| | 2-28 | 689 | 690 | 691 | 692 | 693 | 694 | 695 | 696 | 697 | 698 | 699 | 700 |
| | 2-29 | 714 | 715 | 716 | 717 | 718 | 719 | 720 | 721 | 722 | 723 | 724 | 725 |
| | 2-30 | 739 | 740 | 741 | 742 | 743 | 744 | 745 | 746 | 747 | 748 | 749 | 750 |
| | 2-31 | 764 | 765 | 766 | 767 | 768 | 769 | 770 | 771 | 772 | 773 | 774 | 775 |
| | 2-32 | 789 | 790 | 791 | 792 | 793 | 794 | 795 | 796 | 797 | 798 | 799 | 800 |
| | 2-33 | 814 | 815 | 816 | 817 | 818 | 819 | 820 | 821 | 822 | 823 | 824 | 825 |
| | 2-34 | 839 | 840 | 841 | 842 | 843 | 844 | 845 | 846 | 847 | 848 | 849 | 850 |
| | 2-35 | 864 | 865 | 866 | 867 | 868 | 869 | 870 | 871 | 872 | 873 | 874 | 875 |

TABLE 1-continued

| | | | | | | | | | | | | | |
|---|---|---|---|---|---|---|---|---|---|---|---|---|---|
| | 2-36 | 889 | 890 | 891 | 892 | 893 | 894 | 895 | 896 | 897 | 898 | 899 | 900 |
| | 2-37 | 914 | 915 | 916 | 917 | 918 | 919 | 920 | 921 | 922 | 923 | 924 | 925 |
| | 2-38 | 939 | 940 | 941 | 942 | 943 | 944 | 945 | 946 | 947 | 948 | 949 | 950 |
| | 2-39 | 964 | 965 | 966 | 967 | 968 | 969 | 970 | 971 | 972 | 973 | 974 | 975 |
| | 2-40 | 989 | 990 | 991 | 992 | 993 | 994 | 995 | 996 | 997 | 998 | 999 | 1,000 |
| | 2-41 | 1,014 | 1,015 | 1,016 | 1,017 | 1,018 | 1,019 | 1,020 | 1,021 | 1,022 | 1,023 | 1,024 | 1,025 |
| | 2-42 | 1,039 | 1,040 | 1,041 | 1,042 | 1,043 | 1,044 | 1,045 | 1,046 | 1,047 | 1,048 | 1,049 | 1,050 |
| | 2-43 | 1,064 | 1,065 | 1,066 | 1,067 | 1,068 | 1,069 | 1,070 | 1,071 | 1,072 | 1,073 | 1,074 | 1,075 |
| | 2-44 | 1,089 | 1,090 | 1,091 | 1,092 | 1,093 | 1,094 | 1,095 | 1,096 | 1,097 | 1,098 | 1,099 | 1,100 |
| | 2-45 | 1,114 | 1,115 | 1,116 | 1,117 | 1,118 | 1,119 | 1,120 | 1,121 | 1,122 | 1,123 | 1,124 | 1,125 |
| | 2-46 | 1,139 | 1,140 | 1,141 | 1,142 | 1,143 | 1,144 | 1,145 | 1,146 | 1,147 | 1,148 | 1,149 | 1,150 |
| | 2-47 | 1,164 | 1,165 | 1,166 | 1,167 | 1,168 | 1,169 | 1,170 | 1,171 | 1,172 | 1,173 | 1,174 | 1,175 |
| | 2-48 | 1,189 | 1,190 | 1,191 | 1,192 | 1,193 | 1,194 | 1,195 | 1,196 | 1,197 | 1,198 | 1,199 | 1,200 |
| | 2-49 | 1,214 | 1,215 | 1,216 | 1,217 | 1,218 | 1,219 | 1,220 | 1,221 | 1,222 | 1,223 | 1,224 | 1,225 |
| | 2-50 | 1,239 | 1,240 | 1,241 | 1,242 | 1,243 | 1,244 | 1,245 | 1,246 | 1,247 | 1,248 | 1,249 | 1,250 |
| | 2-51 | 1,264 | 1,265 | 1,266 | 1,267 | 1,268 | 1,269 | 1,270 | 1,271 | 1,272 | 1,273 | 1,274 | 1,275 |
| | 2-52 | 1,289 | 1,290 | 1,291 | 1,292 | 1,293 | 1,294 | 1,295 | 1,296 | 1,297 | 1,298 | 1,299 | 1,300 |
| | 2-53 | 1,314 | 1,315 | 1,316 | 1,317 | 1,318 | 1,319 | 1,320 | 1,321 | 1,322 | 1,323 | 1,324 | 1,325 |
| | 2-54 | 1,339 | 1,340 | 1,341 | 1,342 | 1,343 | 1,344 | 1,345 | 1,346 | 1,347 | 1,348 | 1,349 | 1,350 |
| | 2-55 | 1,364 | 1,365 | 1,366 | 1,367 | 1,368 | 1,369 | 1,370 | 1,371 | 1,372 | 1,373 | 1,374 | 1,375 |

TABLE 2

| | | Compound represented by the formula (1) | | | | | | | | | | | | |
|---|---|---|---|---|---|---|---|---|---|---|---|---|---|---|
| | | 1-1 | 1-2 | 1-3 | 1-4 | 1-5 | 1-6 | 1-7 | 1-8 | 1-9 | 1-10 | 1-11 | 1-12 | 1-13 |
| Compound represented by the formula (2) | 2-56 | 1,376 | 1,377 | 1,378 | 1,379 | 1,380 | 1,381 | 1,382 | 1,383 | 1,384 | 1,385 | 1,386 | 1,387 | 1,388 |
| | 2-57 | 1,401 | 1,402 | 1,403 | 1,404 | 1,405 | 1,406 | 1,407 | 1,408 | 1,409 | 1,410 | 1,411 | 1,412 | 1,413 |
| | 2-58 | 1,426 | 1,427 | 1,428 | 1,429 | 1,430 | 1,431 | 1,432 | 1,433 | 1,434 | 1,435 | 1,436 | 1,437 | 1,438 |
| | 2-59 | 1,451 | 1,452 | 1,453 | 1,454 | 1,455 | 1,456 | 1,457 | 1,458 | 1,459 | 1,460 | 1,461 | 1,462 | 1,463 |
| | 2-60 | 1,476 | 1,477 | 1,478 | 1,479 | 1,480 | 1,481 | 1,482 | 1,483 | 1,484 | 1,485 | 1,486 | 1,487 | 1,488 |
| | 2-61 | 1,501 | 1,502 | 1,503 | 1,504 | 1,505 | 1,506 | 1,507 | 1,508 | 1,509 | 1,510 | 1,511 | 1,512 | 1,513 |
| | 2-62 | 1,526 | 1,527 | 1,528 | 1,529 | 1,530 | 1,531 | 1,532 | 1,533 | 1,534 | 1,535 | 1,536 | 1,537 | 1,538 |
| | 2-63 | 1,551 | 1,552 | 1,553 | 1,554 | 1,555 | 1,556 | 1,557 | 1,558 | 1,559 | 1,560 | 1,561 | 1,562 | 1,563 |
| | 2-64 | 1,576 | 1,577 | 1,578 | 1,579 | 1,580 | 1,581 | 1,582 | 1,583 | 1,584 | 1,585 | 1,586 | 1,587 | 1,588 |
| | 2-65 | 1,601 | 1,602 | 1,603 | 1,604 | 1,605 | 1,606 | 1,607 | 1,608 | 1,609 | 1,610 | 1,611 | 1,612 | 1,613 |
| | 2-66 | 1,626 | 1,627 | 1,628 | 1,629 | 1,630 | 1,631 | 1,632 | 1,633 | 1,634 | 1,635 | 1,636 | 1,637 | 1,638 |
| | 2-67 | 1,651 | 1,652 | 1,653 | 1,654 | 1,655 | 1,656 | 1,657 | 1,658 | 1,659 | 1,660 | 1,661 | 1,662 | 1,663 |
| | 2-68 | 1,676 | 1,677 | 1,678 | 1,679 | 1,680 | 1,681 | 1,682 | 1,683 | 1,684 | 1,685 | 1,686 | 1,687 | 1,688 |
| | 2-69 | 1,701 | 1,702 | 1,703 | 1,704 | 1,705 | 1,706 | 1,707 | 1,708 | 1,709 | 1,710 | 1,711 | 1,712 | 1,713 |
| | 2-70 | 1,726 | 1,727 | 1,728 | 1,729 | 1,730 | 1,731 | 1,732 | 1,733 | 1,734 | 1,735 | 1,736 | 1,737 | 1,738 |
| | 2-71 | 1,751 | 1,752 | 1,753 | 1,754 | 1,755 | 1,756 | 1,757 | 1,758 | 1,759 | 1,760 | 1,761 | 1,762 | 1,763 |
| | 2-72 | 1,776 | 1,777 | 1,778 | 1,779 | 1,780 | 1,781 | 1,782 | 1,783 | 1,784 | 1,785 | 1,786 | 1,787 | 1,788 |
| | 2-73 | 1,801 | 1,802 | 1,803 | 1,804 | 1,805 | 1,806 | 1,807 | 1,808 | 1,809 | 1,810 | 1,811 | 1,812 | 1,813 |
| | 2-74 | 1,826 | 1,827 | 1,828 | 1,829 | 1,830 | 1,831 | 1,832 | 1,833 | 1,834 | 1,835 | 1,836 | 1,837 | 1,838 |
| | 2-75 | 1,851 | 1,852 | 1,853 | 1,854 | 1,855 | 1,856 | 1,857 | 1,858 | 1,859 | 1,860 | 1,861 | 1,862 | 1,863 |
| | 2-76 | 1,876 | 1,877 | 1,878 | 1,879 | 1,880 | 1,881 | 1,882 | 1,883 | 1,884 | 1,885 | 1,886 | 1,887 | 1,888 |
| | 2-77 | 1,901 | 1,902 | 1,903 | 1,904 | 1,905 | 1,906 | 1,907 | 1,908 | 1,909 | 1,910 | 1,911 | 1,912 | 1,913 |
| | 2-78 | 1,926 | 1,927 | 1,928 | 1,929 | 1,930 | 1,931 | 1,932 | 1,933 | 1,934 | 1,935 | 1,936 | 1,937 | 1,938 |
| | 2-79 | 1,951 | 1,952 | 1,953 | 1,954 | 1,955 | 1,956 | 1,957 | 1,958 | 1,959 | 1,960 | 1,961 | 1,962 | 1,963 |
| | 2-80 | 1,976 | 1,977 | 1,978 | 1,979 | 1,980 | 1,981 | 1,982 | 1,983 | 1,984 | 1,985 | 1,986 | 1,987 | 1,988 |
| | 2-81 | 2,001 | 2,002 | 2,003 | 2,004 | 2,005 | 2,006 | 2,007 | 2,008 | 2,009 | 2,010 | 2,011 | 2,012 | 2,013 |
| | 2-82 | 2,026 | 2,027 | 2,028 | 2,029 | 2,030 | 2,031 | 2,032 | 2,033 | 2,034 | 2,035 | 2,036 | 2,037 | 2,038 |
| | 2-83 | 2,051 | 2,052 | 2,053 | 2,054 | 2,055 | 2,056 | 2,057 | 2,058 | 2,059 | 2,060 | 2,061 | 2,062 | 2,063 |
| | 2-84 | 2,076 | 2,077 | 2,078 | 2,079 | 2,080 | 2,081 | 2,082 | 2,083 | 2,084 | 2,085 | 2,086 | 2,087 | 2,088 |
| | 2-85 | 2,101 | 2,102 | 2,103 | 2,104 | 2,105 | 2,106 | 2,107 | 2,108 | 2,109 | 2,110 | 2,111 | 2,112 | 2,113 |
| | 2-86 | 2,126 | 2,127 | 2,128 | 2,129 | 2,130 | 2,131 | 2,132 | 2,133 | 2,134 | 2,135 | 2,136 | 2,137 | 2,138 |
| | 2-87 | 2,151 | 2,152 | 2,153 | 2,154 | 2,155 | 2,156 | 2,157 | 2,158 | 2,159 | 2,160 | 2,161 | 2,162 | 2,163 |
| | 2-88 | 2,176 | 2,177 | 2,178 | 2,179 | 2,180 | 2,181 | 2,182 | 2,183 | 2,184 | 2,185 | 2,186 | 2,187 | 2,188 |
| | 2-89 | 2,201 | 2,202 | 2,203 | 2,204 | 2,205 | 2,206 | 2,207 | 2,208 | 2,209 | 2,210 | 2,211 | 2,212 | 2,213 |
| | 2-90 | 2,226 | 2,227 | 2,228 | 2,229 | 2,230 | 2,231 | 2,232 | 2,233 | 2,234 | 2,235 | 2,236 | 2,237 | 2,238 |
| | 2-91 | 2,251 | 2,252 | 2,253 | 2,254 | 2,255 | 2,256 | 2,257 | 2,258 | 2,259 | 2,260 | 2,261 | 2,262 | 2,263 |
| | 2-92 | 2,276 | 2,277 | 2,278 | 2,279 | 2,280 | 2,281 | 2,282 | 2,283 | 2,284 | 2,285 | 2,286 | 2,287 | 2,288 |
| | 2-93 | 2,301 | 2,302 | 2,303 | 2,304 | 2,305 | 2,306 | 2,307 | 2,308 | 2,309 | 2,310 | 2,311 | 2,312 | 2,313 |
| | 2-94 | 2,326 | 2,327 | 2,328 | 2,329 | 2,330 | 2,331 | 2,332 | 2,333 | 2,334 | 2,335 | 2,336 | 2,337 | 2,338 |
| | 2-95 | 2,351 | 2,352 | 2,353 | 2,354 | 2,355 | 2,356 | 2,357 | 2,358 | 2,359 | 2,360 | 2,361 | 2,362 | 2,363 |
| | 2-96 | 2,376 | 2,377 | 2,378 | 2,379 | 2,380 | 2,381 | 2,382 | 2,383 | 2,384 | 2,385 | 2,386 | 2,387 | 2,388 |
| | 2-97 | 2,401 | 2,402 | 2,403 | 2,404 | 2,405 | 2,406 | 2,407 | 2,408 | 2,409 | 2,410 | 2,411 | 2,412 | 2,413 |
| | 2-98 | 2,426 | 2,427 | 2,428 | 2,429 | 2,430 | 2,431 | 2,432 | 2,433 | 2,434 | 2,435 | 2,436 | 2,437 | 2,438 |
| | 2-99 | 2,451 | 2,452 | 2,453 | 2,454 | 2,455 | 2,456 | 2,457 | 2,458 | 2,459 | 2,460 | 2,461 | 2,462 | 2,463 |
| | 2-100 | 2,476 | 2,477 | 2,478 | 2,479 | 2,480 | 2,481 | 2,482 | 2,483 | 2,484 | 2,485 | 2,486 | 2,487 | 2,488 |
| | 2-101 | 2,501 | 2,502 | 2,503 | 2,504 | 2,505 | 2,506 | 2,507 | 2,508 | 2,509 | 2,510 | 2,511 | 2,512 | 2,513 |
| | 2-102 | 2,526 | 2,527 | 2,528 | 2,529 | 2,530 | 2,531 | 2,532 | 2,533 | 2,534 | 2,535 | 2,536 | 2,537 | 2,538 |
| | 2-103 | 2,551 | 2,552 | 2,553 | 2,554 | 2,555 | 2,556 | 2,557 | 2,558 | 2,559 | 2,560 | 2,561 | 2,562 | 2,563 |
| | 2-104 | 2,576 | 2,577 | 2,578 | 2,579 | 2,580 | 2,581 | 2,582 | 2,583 | 2,584 | 2,585 | 2,586 | 2,587 | 2,588 |
| | 2-105 | 2,601 | 2,602 | 2,603 | 2,604 | 2,605 | 2,606 | 2,607 | 2,608 | 2,609 | 2,610 | 2,611 | 2,612 | 2,613 |

TABLE 2-continued

| | | | | | | | | | | | | | | |
|---|---|---|---|---|---|---|---|---|---|---|---|---|---|---|
| | 2-106 | 2,626 | 2,627 | 2,628 | 2,629 | 2,630 | 2,631 | 2,632 | 2,633 | 2,634 | 2,635 | 2,636 | 2,637 | 2,638 |
| | 2-107 | 2,651 | 2,652 | 2,653 | 2,654 | 2,655 | 2,656 | 2,657 | 2,658 | 2,659 | 2,660 | 2,661 | 2,662 | 2,663 |
| | 2-108 | 2,676 | 2,677 | 2,678 | 2,679 | 2,680 | 2,681 | 2,682 | 2,683 | 2,684 | 2,685 | 2,686 | 2,687 | 2,688 |
| | 2-109 | 2,701 | 2,702 | 2,703 | 2,704 | 2,705 | 2,706 | 2,707 | 2,708 | 2,709 | 2,710 | 2,711 | 2,712 | 2,713 |
| | 2-110 | 2,726 | 2,727 | 2,728 | 2,729 | 2,730 | 2,731 | 2,732 | 2,733 | 2,734 | 2,735 | 2,736 | 2,737 | 2,738 |

| | | Compound represented by the formula (1) | | | | | | | | | | | |
|---|---|---|---|---|---|---|---|---|---|---|---|---|---|
| | | 1-14 | 1-15 | 1-16 | 1-17 | 1-18 | 1-19 | 1-20 | 1-21 | 1-22 | 1-23 | 1-24 | 1-25 |
| Compound represented by the formula (2) | 2-56 | 1,389 | 1,390 | 1,391 | 1,392 | 1,393 | 1,394 | 1,395 | 1,396 | 1,397 | 1,398 | 1,399 | 1,400 |
| | 2-57 | 1,414 | 1,415 | 1,416 | 1,417 | 1,418 | 1,419 | 1,420 | 1,421 | 1,422 | 1,423 | 1,424 | 1,425 |
| | 2-58 | 1,439 | 1,440 | 1,441 | 1,442 | 1,443 | 1,444 | 1,445 | 1,446 | 1,447 | 1,448 | 1,449 | 1,450 |
| | 2-59 | 1,464 | 1,465 | 1,466 | 1,467 | 1,468 | 1,469 | 1,470 | 1,471 | 1,472 | 1,473 | 1,474 | 1,475 |
| | 2-60 | 1,489 | 1,490 | 1,491 | 1,492 | 1,493 | 1,494 | 1,495 | 1,496 | 1,497 | 1,498 | 1,499 | 1,500 |
| | 2-61 | 1,514 | 1,515 | 1,516 | 1,517 | 1,518 | 1,519 | 1,520 | 1,521 | 1,522 | 1,523 | 1,524 | 1,525 |
| | 2-62 | 1,539 | 1,540 | 1,541 | 1,542 | 1,543 | 1,544 | 1,545 | 1,546 | 1,547 | 1,548 | 1,549 | 1,550 |
| | 2-63 | 1,564 | 1,565 | 1,566 | 1,567 | 1,568 | 1,569 | 1,570 | 1,571 | 1,572 | 1,573 | 1,574 | 1,575 |
| | 2-64 | 1,589 | 1,590 | 1,591 | 1,592 | 1,593 | 1,594 | 1,595 | 1,596 | 1,597 | 1,598 | 1,599 | 1,600 |
| | 2-65 | 1,614 | 1,615 | 1,616 | 1,617 | 1,618 | 1,619 | 1,620 | 1,621 | 1,622 | 1,623 | 1,624 | 1,625 |
| | 2-66 | 1,639 | 1,640 | 1,641 | 1,642 | 1,643 | 1,644 | 1,645 | 1,646 | 1,647 | 1,648 | 1,649 | 1,650 |
| | 2-67 | 1,664 | 1,665 | 1,666 | 1,667 | 1,668 | 1,669 | 1,670 | 1,671 | 1,672 | 1,673 | 1,674 | 1,675 |
| | 2-68 | 1,689 | 1,690 | 1,691 | 1,692 | 1,693 | 1,694 | 1,695 | 1,696 | 1,697 | 1,698 | 1,699 | 1,700 |
| | 2-69 | 1,714 | 1,715 | 1,716 | 1,717 | 1,718 | 1,719 | 1,720 | 1,721 | 1,722 | 1,723 | 1,724 | 1,725 |
| | 2-70 | 1,739 | 1,740 | 1,741 | 1,742 | 1,743 | 1,744 | 1,745 | 1,746 | 1,747 | 1,748 | 1,749 | 1,750 |
| | 2-71 | 1,764 | 1,765 | 1,766 | 1,767 | 1,768 | 1,769 | 1,770 | 1,771 | 1,772 | 1,773 | 1,774 | 1,775 |
| | 2-72 | 1,789 | 1,790 | 1,791 | 1,792 | 1,793 | 1,794 | 1,795 | 1,796 | 1,797 | 1,798 | 1,799 | 1,800 |
| | 2-73 | 1,814 | 1,815 | 1,816 | 1,817 | 1,818 | 1,819 | 1,820 | 1,821 | 1,822 | 1,823 | 1,824 | 1,825 |
| | 2-74 | 1,839 | 1,840 | 1,841 | 1,842 | 1,843 | 1,844 | 1,845 | 1,846 | 1,847 | 1,848 | 1,849 | 1,850 |
| | 2-75 | 1,864 | 1,865 | 1,866 | 1,867 | 1,868 | 1,869 | 1,870 | 1,871 | 1,872 | 1,873 | 1,874 | 1,875 |
| | 2-76 | 1,889 | 1,890 | 1,891 | 1,892 | 1,893 | 1,894 | 1,895 | 1,896 | 1,897 | 1,898 | 1,899 | 1,900 |
| | 2-77 | 1,914 | 1,915 | 1,916 | 1,917 | 1,918 | 1,919 | 1,920 | 1,921 | 1,922 | 1,923 | 1,924 | 1,925 |
| | 2-78 | 1,939 | 1,940 | 1,941 | 1,942 | 1,943 | 1,944 | 1,945 | 1,946 | 1,947 | 1,948 | 1,949 | 1,950 |
| | 2-79 | 1,964 | 1,965 | 1,966 | 1,967 | 1,968 | 1,969 | 1,970 | 1,971 | 1,972 | 1,973 | 1,974 | 1,975 |
| | 2-80 | 1,989 | 1,990 | 1,991 | 1,992 | 1,993 | 1,994 | 1,995 | 1,996 | 1,997 | 1,998 | 1,999 | 2,000 |
| | 2-81 | 2,014 | 2,015 | 2,016 | 2,017 | 2,018 | 2,019 | 2,020 | 2,021 | 2,022 | 2,023 | 2,024 | 2,025 |
| | 2-82 | 2,039 | 2,040 | 2,041 | 2,042 | 2,043 | 2,044 | 2,045 | 2,046 | 2,047 | 2,048 | 2,049 | 2,050 |
| | 2-83 | 2,064 | 2,065 | 2,066 | 2,067 | 2,068 | 2,069 | 2,070 | 2,071 | 2,072 | 2,073 | 2,074 | 2,075 |
| | 2-84 | 2,089 | 2,090 | 2,091 | 2,092 | 2,093 | 2,094 | 2,095 | 2,096 | 2,097 | 2,098 | 2,099 | 2,100 |
| | 2-85 | 2,114 | 2,115 | 2,116 | 2,117 | 2,118 | 2,119 | 2,120 | 2,121 | 2,122 | 2,123 | 2,124 | 2,125 |
| | 2-86 | 2,139 | 2,140 | 2,141 | 2,142 | 2,143 | 2,144 | 2,145 | 2,146 | 2,147 | 2,148 | 2,149 | 2,150 |
| | 2-87 | 2,164 | 2,165 | 2,166 | 2,167 | 2,168 | 2,169 | 2,170 | 2,171 | 2,172 | 2,173 | 2,174 | 2,175 |
| | 2-88 | 2,189 | 2,190 | 2,191 | 2,192 | 2,193 | 2,194 | 2,195 | 2,196 | 2,197 | 2,198 | 2,199 | 2,200 |
| | 2-89 | 2,214 | 2,215 | 2,216 | 2,217 | 2,218 | 2,219 | 2,220 | 2,221 | 2,222 | 2,223 | 2,224 | 2,225 |
| | 2-90 | 2,239 | 2,240 | 2,241 | 2,242 | 2,243 | 2,244 | 2,245 | 2,246 | 2,247 | 2,248 | 2,249 | 2,250 |
| | 2-91 | 2,264 | 2,265 | 2,266 | 2,267 | 2,268 | 2,269 | 2,270 | 2,271 | 2,272 | 2,273 | 2,274 | 2,275 |
| | 2-92 | 2,289 | 2,290 | 2,291 | 2,292 | 2,293 | 2,294 | 2,295 | 2,296 | 2,297 | 2,298 | 2,299 | 2,300 |
| | 2-93 | 2,314 | 2,315 | 2,316 | 2,317 | 2,318 | 2,319 | 2,320 | 2,321 | 2,322 | 2,323 | 2,324 | 2,325 |
| | 2-94 | 2,339 | 2,340 | 2,341 | 2,342 | 2,343 | 2,344 | 2,345 | 2,346 | 2,347 | 2,348 | 2,349 | 2,350 |
| | 2-95 | 2,364 | 2,365 | 2,366 | 2,367 | 2,368 | 2,369 | 2,370 | 2,371 | 2,372 | 2,373 | 2,374 | 2,375 |
| | 2-96 | 2,389 | 2,390 | 2,391 | 2,392 | 2,393 | 2,394 | 2,395 | 2,396 | 2,397 | 2,398 | 2,399 | 2,400 |
| | 2-97 | 2,414 | 2,415 | 2,416 | 2,417 | 2,418 | 2,419 | 2,420 | 2,421 | 2,422 | 2,423 | 2,424 | 2,425 |
| | 2-98 | 2,439 | 2,440 | 2,441 | 2,442 | 2,443 | 2,444 | 2,445 | 2,446 | 2,447 | 2,448 | 2,449 | 2,450 |
| | 2-99 | 2,464 | 2,465 | 2,466 | 2,467 | 2,468 | 2,469 | 2,470 | 2,471 | 2,472 | 2,473 | 2,474 | 2,475 |
| | 2-100 | 2,489 | 2,490 | 2,491 | 2,492 | 2,493 | 2,494 | 2,495 | 2,496 | 2,497 | 2,498 | 2,499 | 2,500 |
| | 2-101 | 2,514 | 2,515 | 2,516 | 2,517 | 2,518 | 2,519 | 2,520 | 2,521 | 2,522 | 2,523 | 2,524 | 2,525 |
| | 2-102 | 2,539 | 2,540 | 2,541 | 2,542 | 2,543 | 2,544 | 2,545 | 2,546 | 2,547 | 2,548 | 2,549 | 2,550 |
| | 2-103 | 2,564 | 2,565 | 2,566 | 2,567 | 2,568 | 2,569 | 2,570 | 2,571 | 2,572 | 2,573 | 2,574 | 2,575 |
| | 2-104 | 2,589 | 2,590 | 2,591 | 2,592 | 2,593 | 2,594 | 2,595 | 2,596 | 2,597 | 2,598 | 2,599 | 2,600 |
| | 2-105 | 2,614 | 2,615 | 2,616 | 2,617 | 2,618 | 2,619 | 2,620 | 2,621 | 2,622 | 2,623 | 2,624 | 2,625 |
| | 2-106 | 2,639 | 2,640 | 2,641 | 2,642 | 2,643 | 2,644 | 2,645 | 2,646 | 2,647 | 2,648 | 2,649 | 2,650 |
| | 2-107 | 2,664 | 2,665 | 2,666 | 2,667 | 2,668 | 2,669 | 2,670 | 2,671 | 2,672 | 2,673 | 2,674 | 2,675 |
| | 2-108 | 2,689 | 2,690 | 2,691 | 2,692 | 2,693 | 2,694 | 2,695 | 2,696 | 2,697 | 2,698 | 2,699 | 2,700 |
| | 2-109 | 2,714 | 2,715 | 2,716 | 2,717 | 2,718 | 2,719 | 2,720 | 2,721 | 2,722 | 2,723 | 2,724 | 2,725 |
| | 2-110 | 2,739 | 2,740 | 2,741 | 2,742 | 2,743 | 2,744 | 2,745 | 2,746 | 2,747 | 2,748 | 2,749 | 2,750 |

TABLE 3

| | | Compound represented by the formula (1) | | | | | | | | | | | | |
|---|---|---|---|---|---|---|---|---|---|---|---|---|---|---|
| | | 1-1 | 1-2 | 1-3 | 1-4 | 1-5 | 1-6 | 1-7 | 1-8 | 1-9 | 1-10 | 1-11 | 1-12 | 1-13 |
| Compound represented by the formula (2) | 2-111 | 2,751 | 2,752 | 2,753 | 2,754 | 2,755 | 2,756 | 2,757 | 2,758 | 2,759 | 2,760 | 2,761 | 2,762 | 2,763 |
| | 2-112 | 2,776 | 2,777 | 2,778 | 2,779 | 2,780 | 2,781 | 2,782 | 2,783 | 2,784 | 2,785 | 2,786 | 2,787 | 2,788 |
| | 2-113 | 2,801 | 2,802 | 2,803 | 2,804 | 2,805 | 2,806 | 2,807 | 2,808 | 2,809 | 2,810 | 2,811 | 2,812 | 2,813 |
| | 2-114 | 2,826 | 2,827 | 2,828 | 2,829 | 2,830 | 2,831 | 2,832 | 2,833 | 2,834 | 2,835 | 2,836 | 2,837 | 2,838 |
| | 2-115 | 2,851 | 2,852 | 2,853 | 2,854 | 2,855 | 2,856 | 2,857 | 2,858 | 2,859 | 2,860 | 2,861 | 2,862 | 2,863 |

TABLE 3-continued

| | | | | | | | | | | | | | | |
|---|---|---|---|---|---|---|---|---|---|---|---|---|---|---|
| | 2-116 | 2,876 | 2,877 | 2,878 | 2,879 | 2,880 | 2,881 | 2,882 | 2,883 | 2,884 | 2,885 | 2,886 | 2,887 | 2,888 |
| | 2-117 | 2,901 | 2,902 | 2,903 | 2,904 | 2,905 | 2,906 | 2,907 | 2,908 | 2,909 | 2,910 | 2,911 | 2,912 | 2,913 |
| | 2-118 | 2,926 | 2,927 | 2,928 | 2,929 | 2,930 | 2,931 | 2,932 | 2,933 | 2,934 | 2,935 | 2,936 | 2,937 | 2,938 |
| | 2-119 | 2,951 | 2,952 | 2,953 | 2,954 | 2,955 | 2,956 | 2,957 | 2,958 | 2,959 | 2,960 | 2,961 | 2,962 | 2,963 |
| | 2-120 | 2,976 | 2,977 | 2,978 | 2,979 | 2,980 | 2,981 | 2,982 | 2,983 | 2,984 | 2,985 | 2,986 | 2,987 | 2,988 |
| | 2-121 | 3,001 | 3,002 | 3,003 | 3,004 | 3,005 | 3,006 | 3,007 | 3,008 | 3,009 | 3,010 | 3,011 | 3,012 | 3,013 |
| | 2-122 | 3,026 | 3,027 | 3,028 | 3,029 | 3,030 | 3,031 | 3,032 | 3,033 | 3,034 | 3,035 | 3,036 | 3,037 | 3,038 |
| | 2-123 | 3,051 | 3,052 | 3,053 | 3,054 | 3,055 | 3,056 | 3,057 | 3,058 | 3,059 | 3,060 | 3,061 | 3,062 | 3,063 |
| | 2-124 | 3,076 | 3,077 | 3,078 | 3,079 | 3,080 | 3,081 | 3,082 | 3,083 | 3,084 | 3,085 | 3,086 | 3,087 | 3,088 |
| | 2-125 | 3,101 | 3,102 | 3,103 | 3,104 | 3,105 | 3,106 | 3,107 | 3,108 | 3,109 | 3,110 | 3,111 | 3,112 | 3,113 |
| | 2-126 | 3,126 | 3,127 | 3,128 | 3,129 | 3,130 | 3,131 | 3,132 | 3,133 | 3,134 | 3,135 | 3,136 | 3,137 | 3,138 |
| | 2-127 | 3,151 | 3,152 | 3,153 | 3,154 | 3,155 | 3,156 | 3,157 | 3,158 | 3,159 | 3,160 | 3,161 | 3,162 | 3,163 |
| | 2-128 | 3,176 | 3,177 | 3,178 | 3,179 | 3,180 | 3,181 | 3,182 | 3,183 | 3,184 | 3,185 | 3,186 | 3,187 | 3,188 |
| | 2-129 | 3,201 | 3,202 | 3,203 | 3,204 | 3,205 | 3,206 | 3,207 | 3,208 | 3,209 | 3,210 | 3,211 | 3,212 | 3,213 |
| | 2-130 | 3,226 | 3,227 | 3,228 | 3,229 | 3,230 | 3,231 | 3,232 | 3,233 | 3,234 | 3,235 | 3,236 | 3,237 | 3,238 |
| | 2-131 | 3,251 | 3,252 | 3,253 | 3,254 | 3,255 | 3,256 | 3,257 | 3,258 | 3,259 | 3,260 | 3,261 | 3,262 | 3,263 |
| | 2-132 | 3,276 | 3,277 | 3,278 | 3,279 | 3,280 | 3,281 | 3,282 | 3,283 | 3,284 | 3,285 | 3,286 | 3,287 | 3,288 |
| | 2-133 | 3,301 | 3,302 | 3,303 | 3,304 | 3,305 | 3,306 | 3,307 | 3,308 | 3,309 | 3,310 | 3,311 | 3,312 | 3,313 |

| | | Compound represented by the formula (1) | | | | | | | | | | | |
|---|---|---|---|---|---|---|---|---|---|---|---|---|---|
| | | 1-14 | 1-15 | 1-16 | 1-17 | 1-18 | 1-19 | 1-20 | 1-21 | 1-22 | 1-23 | 1-24 | 1-25 |
| Compound represented by the formula (2) | 2-111 | 2,764 | 2,765 | 2,766 | 2,767 | 2,768 | 2,769 | 2,770 | 2,771 | 2,772 | 2,773 | 2,774 | 2,775 |
| | 2-112 | 2,789 | 2,790 | 2,791 | 2,792 | 2,793 | 2,794 | 2,795 | 2,796 | 2,797 | 2,798 | 2,799 | 2,800 |
| | 2-113 | 2,814 | 2,815 | 2,816 | 2,817 | 2,818 | 2,819 | 2,820 | 2,821 | 2,822 | 2,823 | 2,824 | 2,825 |
| | 2-114 | 2,839 | 2,840 | 2,841 | 2,842 | 2,843 | 2,844 | 2,845 | 2,846 | 2,847 | 2,848 | 2,849 | 2,850 |
| | 2-115 | 2,864 | 2,865 | 2,866 | 2,867 | 2,868 | 2,869 | 2,870 | 2,871 | 2,872 | 2,873 | 2,874 | 2,875 |
| | 2-116 | 2,889 | 2,890 | 2,891 | 2,892 | 2,893 | 2,894 | 2,895 | 2,896 | 2,897 | 2,898 | 2,899 | 2,900 |
| | 2-117 | 2,914 | 2,915 | 2,916 | 2,917 | 2,918 | 2,919 | 2,920 | 2,921 | 2,922 | 2,923 | 2,924 | 2,925 |
| | 2-118 | 2,939 | 2,940 | 2,941 | 2,942 | 2,943 | 2,944 | 2,945 | 2,946 | 2,947 | 2,948 | 2,949 | 2,950 |
| | 2-119 | 2,964 | 2,965 | 2,966 | 2,967 | 2,968 | 2,969 | 2,970 | 2,971 | 2,972 | 2,973 | 2,974 | 2,975 |
| | 2-120 | 2,989 | 2,990 | 2,991 | 2,992 | 2,993 | 2,994 | 2,995 | 2,996 | 2,997 | 2,998 | 2,999 | 3,000 |
| | 2-121 | 3,014 | 3,015 | 3,016 | 3,017 | 3,018 | 3,019 | 3,020 | 3,021 | 3,022 | 3,023 | 3,024 | 3,025 |
| | 2-122 | 3,039 | 3,040 | 3,041 | 3,042 | 3,043 | 3,044 | 3,045 | 3,046 | 3,047 | 3,048 | 3,049 | 3,050 |
| | 2-123 | 3,064 | 3,065 | 3,066 | 3,067 | 3,068 | 3,069 | 3,070 | 3,071 | 3,072 | 3,073 | 3,074 | 3,075 |
| | 2-124 | 3,089 | 3,090 | 3,091 | 3,092 | 3,093 | 3,094 | 3,095 | 3,096 | 3,097 | 3,098 | 3,099 | 3,100 |
| | 2-125 | 3,114 | 3,115 | 3,116 | 3,117 | 3,118 | 3,119 | 3,120 | 3,121 | 3,122 | 3,123 | 3,124 | 3,125 |
| | 2-126 | 3,139 | 3,140 | 3,141 | 3,142 | 3,143 | 3,144 | 3,145 | 3,146 | 3,147 | 3,148 | 3,149 | 3,150 |
| | 2-127 | 3,164 | 3,165 | 3,166 | 3,167 | 3,168 | 3,169 | 3,170 | 3,171 | 3,172 | 3,173 | 3,174 | 3,175 |
| | 2-128 | 3,189 | 3,190 | 3,191 | 3,192 | 3,193 | 3,194 | 3,195 | 3,196 | 3,197 | 3,198 | 3,199 | 3,200 |
| | 2-129 | 3,214 | 3,215 | 3,216 | 3,217 | 3,218 | 3,219 | 3,220 | 3,221 | 3,222 | 3,223 | 3,224 | 3,225 |
| | 2-130 | 3,239 | 3,240 | 3,241 | 3,242 | 3,243 | 3,244 | 3,245 | 3,246 | 3,247 | 3,248 | 3,249 | 3,250 |
| | 2-131 | 3,264 | 3,265 | 3,266 | 3,267 | 3,268 | 3,269 | 3,270 | 3,271 | 3,272 | 3,273 | 3,274 | 3,275 |
| | 2-132 | 3,289 | 3,290 | 3,291 | 3,292 | 3,293 | 3,294 | 3,295 | 3,296 | 3,297 | 3,298 | 3,299 | 3,300 |
| | 2-133 | 3,314 | 3,315 | 3,316 | 3,317 | 3,318 | 3,319 | 3,320 | 3,321 | 3,322 | 3,323 | 3,324 | 3,325 |

TABLE 4

| | | Compound represented by the formula (1) | | | | | | | | | | | | |
|---|---|---|---|---|---|---|---|---|---|---|---|---|---|---|
| | | 1-26 | 1-27 | 1-28 | 1-29 | 1-30 | 1-31 | 1-32 | 1-33 | 1-34 | 1-35 | 1-36 | 1-37 | 1-38 |
| Compound represented by the formula (2) | 2-1 | 3,326 | 3,327 | 3,328 | 3,329 | 3,330 | 3,331 | 3,332 | 3,333 | 3,334 | 3,335 | 3,336 | 3,337 | 3,338 |
| | 2-2 | 3,351 | 3,352 | 3,353 | 3,354 | 3,355 | 3,356 | 3,357 | 3,358 | 3,359 | 3,360 | 3,361 | 3,362 | 3,363 |
| | 2-3 | 3,376 | 3,377 | 3,378 | 3,379 | 3,380 | 3,381 | 3,382 | 3,383 | 3,384 | 3,385 | 3,386 | 3,387 | 3,388 |
| | 2-4 | 3,401 | 3,402 | 3,403 | 3,404 | 3,405 | 3,406 | 3,407 | 3,408 | 3,409 | 3,410 | 3,411 | 3,412 | 3,413 |
| | 2-5 | 3,426 | 3,427 | 3,428 | 3,429 | 3,430 | 3,431 | 3,432 | 3,433 | 3,434 | 3,435 | 3,436 | 3,437 | 3,438 |
| | 2-6 | 3,451 | 3,452 | 3,453 | 3,454 | 3,455 | 3,456 | 3,457 | 3,458 | 3,459 | 3,460 | 3,461 | 3,462 | 3,463 |
| | 2-7 | 3,476 | 3,477 | 3,478 | 3,479 | 3,480 | 3,481 | 3,482 | 3,483 | 3,484 | 3,485 | 3,486 | 3,487 | 3,488 |
| | 2-8 | 3,501 | 3,502 | 3,503 | 3,504 | 3,505 | 3,506 | 3,507 | 3,508 | 3,509 | 3,510 | 3,511 | 3,512 | 3,513 |
| | 2-9 | 3,526 | 3,527 | 3,528 | 3,529 | 3,530 | 3,531 | 3,532 | 3,533 | 3,534 | 3,535 | 3,536 | 3,537 | 3,538 |
| | 2-10 | 3,551 | 3,552 | 3,553 | 3,554 | 3,555 | 3,556 | 3,557 | 3,558 | 3,559 | 3,560 | 3,561 | 3,562 | 3,563 |
| | 2-11 | 3,576 | 3,577 | 3,578 | 3,579 | 3,580 | 3,581 | 3,582 | 3,583 | 3,584 | 3,585 | 3,586 | 3,587 | 3,588 |
| | 2-12 | 3,601 | 3,602 | 3,603 | 3,604 | 3,605 | 3,606 | 3,607 | 3,608 | 3,609 | 3,610 | 3,611 | 3,612 | 3,613 |
| | 2-13 | 3,626 | 3,627 | 3,628 | 3,629 | 3,630 | 3,631 | 3,632 | 3,633 | 3,634 | 3,635 | 3,636 | 3,637 | 3,638 |
| | 2-14 | 3,651 | 3,652 | 3,653 | 3,654 | 3,655 | 3,656 | 3,657 | 3,658 | 3,659 | 3,660 | 3,661 | 3,662 | 3,663 |
| | 2-15 | 3,676 | 3,677 | 3,678 | 3,679 | 3,680 | 3,681 | 3,682 | 3,683 | 3,684 | 3,685 | 3,686 | 3,687 | 3,688 |
| | 2-16 | 3,701 | 3,702 | 3,703 | 3,704 | 3,705 | 3,706 | 3,707 | 3,708 | 3,709 | 3,710 | 3,711 | 3,712 | 3,713 |
| | 2-17 | 3,726 | 3,727 | 3,728 | 3,729 | 3,730 | 3,731 | 3,732 | 3,733 | 3,734 | 3,735 | 3,736 | 3,737 | 3,738 |
| | 2-18 | 3,751 | 3,752 | 3,753 | 3,754 | 3,755 | 3,756 | 3,757 | 3,758 | 3,759 | 3,760 | 3,761 | 3,762 | 3,763 |
| | 2-19 | 3,776 | 3,777 | 3,778 | 3,779 | 3,780 | 3,781 | 3,782 | 3,783 | 3,784 | 3,785 | 3,786 | 3,787 | 3,788 |
| | 2-20 | 3,801 | 3,802 | 3,803 | 3,804 | 3,805 | 3,806 | 3,807 | 3,808 | 3,809 | 3,810 | 3,811 | 3,812 | 3,813 |
| | 2-21 | 3,826 | 3,827 | 3,828 | 3,829 | 3,830 | 3,831 | 3,832 | 3,833 | 3,834 | 3,835 | 3,836 | 3,837 | 3,838 |
| | 2-22 | 3,851 | 3,852 | 3,853 | 3,854 | 3,855 | 3,856 | 3,857 | 3,858 | 3,859 | 3,860 | 3,861 | 3,862 | 3,863 |
| | 2-23 | 3,876 | 3,877 | 3,878 | 3,879 | 3,880 | 3,881 | 3,882 | 3,883 | 3,884 | 3,885 | 3,886 | 3,887 | 3,888 |

TABLE 4-continued

| | | | | | | | | | | | | | |
|---|---|---|---|---|---|---|---|---|---|---|---|---|---|
| 2-24 | 3,901 | 3,902 | 3,903 | 3,904 | 3,905 | 3,906 | 3,907 | 3,908 | 3,909 | 3,910 | 3,911 | 3,912 | 3,913 |
| 2-25 | 3,926 | 3,927 | 3,928 | 3,929 | 3,930 | 3,931 | 3,932 | 3,933 | 3,934 | 3,935 | 3,936 | 3,937 | 3,938 |
| 2-26 | 3,951 | 3,952 | 3,953 | 3,954 | 3,955 | 3,956 | 3,957 | 3,958 | 3,959 | 3,960 | 3,961 | 3,962 | 3,963 |
| 2-27 | 3,976 | 3,977 | 3,978 | 3,979 | 3,980 | 3,981 | 3,982 | 3,983 | 3,984 | 3,985 | 3,986 | 3,987 | 3,988 |
| 2-28 | 4,001 | 4,002 | 4,003 | 4,004 | 4,005 | 4,006 | 4,007 | 4,008 | 4,009 | 4,010 | 4,011 | 4,012 | 4,013 |
| 2-29 | 4,026 | 4,027 | 4,028 | 4,029 | 4,030 | 4,031 | 4,032 | 4,033 | 4,034 | 4,035 | 4,036 | 4,037 | 4,038 |
| 2-30 | 4,051 | 4,052 | 4,053 | 4,054 | 4,055 | 4,056 | 4,057 | 4,058 | 4,059 | 4,060 | 4,061 | 4,062 | 4,063 |
| 2-31 | 4,076 | 4,077 | 4,078 | 4,079 | 4,080 | 4,081 | 4,082 | 4,083 | 4,084 | 4,085 | 4,086 | 4,087 | 4,088 |
| 2-32 | 4,101 | 4,102 | 4,103 | 4,104 | 4,105 | 4,106 | 4,107 | 4,108 | 4,109 | 4,110 | 4,111 | 4,112 | 4,113 |
| 2-33 | 4,126 | 4,127 | 4,128 | 4,129 | 4,130 | 4,131 | 4,132 | 4,133 | 4,134 | 4,135 | 4,136 | 4,137 | 4,138 |
| 2-34 | 4,151 | 4,152 | 4,153 | 4,154 | 4,155 | 4,156 | 4,157 | 4,158 | 4,159 | 4,160 | 4,161 | 4,162 | 4,163 |
| 2-35 | 4,176 | 4,177 | 4,178 | 4,179 | 4,180 | 4,181 | 4,182 | 4,183 | 4,184 | 4,185 | 4,186 | 4,187 | 4,188 |
| 2-36 | 4,201 | 4,202 | 4,203 | 4,204 | 4,205 | 4,206 | 4,207 | 4,208 | 4,209 | 4,210 | 4,211 | 4,212 | 4,213 |
| 2-37 | 4,226 | 4,227 | 4,228 | 4,229 | 4,230 | 4,231 | 4,232 | 4,233 | 4,234 | 4,235 | 4,236 | 4,237 | 4,238 |
| 2-38 | 4,251 | 4,252 | 4,253 | 4,254 | 4,255 | 4,256 | 4,257 | 4,258 | 4,259 | 4,260 | 4,261 | 4,262 | 4,263 |
| 2-39 | 4,276 | 4,277 | 4,278 | 4,279 | 4,280 | 4,281 | 4,282 | 4,283 | 4,284 | 4,285 | 4,286 | 4,287 | 4,288 |
| 2-40 | 4,301 | 4,302 | 4,303 | 4,304 | 4,305 | 4,306 | 4,307 | 4,308 | 4,309 | 4,310 | 4,311 | 4,312 | 4,313 |
| 2-41 | 4,326 | 4,327 | 4,328 | 4,329 | 4,330 | 4,331 | 4,332 | 4,333 | 4,334 | 4,335 | 4,336 | 4,337 | 4,338 |
| 2-42 | 4,351 | 4,352 | 4,353 | 4,354 | 4,355 | 4,356 | 4,357 | 4,358 | 4,359 | 4,360 | 4,361 | 4,362 | 4,363 |
| 2-43 | 4,376 | 4,377 | 4,378 | 4,379 | 4,380 | 4,381 | 4,382 | 4,383 | 4,384 | 4,385 | 4,386 | 4,387 | 4,388 |
| 2-44 | 4,401 | 4,402 | 4,403 | 4,404 | 4,405 | 4,406 | 4,407 | 4,408 | 4,409 | 4,410 | 4,411 | 4,412 | 4,413 |
| 2-45 | 4,426 | 4,427 | 4,428 | 4,429 | 4,430 | 4,431 | 4,432 | 4,433 | 4,434 | 4,435 | 4,436 | 4,437 | 4,438 |
| 2-46 | 4,451 | 4,452 | 4,453 | 4,454 | 4,455 | 4,456 | 4,457 | 4,458 | 4,459 | 4,460 | 4,461 | 4,462 | 4,463 |
| 2-47 | 4,476 | 4,477 | 4,478 | 4,479 | 4,480 | 4,481 | 4,482 | 4,483 | 4,484 | 4,485 | 4,486 | 4,487 | 4,488 |
| 2-48 | 4,501 | 4,502 | 4,503 | 4,504 | 4,505 | 4,506 | 4,507 | 4,508 | 4,509 | 4,510 | 4,511 | 4,512 | 4,513 |
| 2-49 | 4,526 | 4,527 | 4,528 | 4,529 | 4,530 | 4,531 | 4,532 | 4,533 | 4,534 | 4,535 | 4,536 | 4,537 | 4,538 |
| 2-50 | 4,551 | 4,552 | 4,553 | 4,554 | 4,555 | 4,556 | 4,557 | 4,558 | 4,559 | 4,560 | 4,561 | 4,562 | 4,563 |
| 2-51 | 4,576 | 4,577 | 4,578 | 4,579 | 4,580 | 4,581 | 4,582 | 4,583 | 4,584 | 4,585 | 4,586 | 4,587 | 4,588 |
| 2-52 | 4,601 | 4,602 | 4,603 | 4,604 | 4,605 | 4,606 | 4,607 | 4,608 | 4,609 | 4,610 | 4,611 | 4,612 | 4,613 |
| 2-53 | 4,626 | 4,627 | 4,628 | 4,629 | 4,630 | 4,631 | 4,632 | 4,633 | 4,634 | 4,635 | 4,636 | 4,637 | 4,638 |
| 2-54 | 4,651 | 4,652 | 4,653 | 4,654 | 4,655 | 4,656 | 4,657 | 4,658 | 4,659 | 4,660 | 4,661 | 4,662 | 4,663 |
| 2-55 | 4,676 | 4,677 | 4,678 | 4,679 | 4,680 | 4,681 | 4,682 | 4,683 | 4,684 | 4,685 | 4,686 | 4,687 | 4,688 |

| | | Compound represented by the formula (1) | | | | | | | | | | | |
|---|---|---|---|---|---|---|---|---|---|---|---|---|---|
| | | 1-39 | 1-40 | 1-41 | 1-42 | 1-43 | 1-44 | 1-45 | 1-46 | 1-47 | 1-48 | 1-49 | 1-50 |
| Compound represented by the formula (2) | 2-1 | 3,339 | 3,340 | 3,341 | 3,342 | 3,343 | 3,344 | 3,345 | 3,346 | 3,347 | 3,348 | 3,349 | 3,350 |
| | 2-2 | 3,364 | 3,365 | 3,366 | 3,367 | 3,368 | 3,369 | 3,370 | 3,371 | 3,372 | 3,373 | 3,374 | 3,375 |
| | 2-3 | 3,389 | 3,390 | 3,391 | 3,392 | 3,393 | 3,394 | 3,395 | 3,396 | 3,397 | 3,398 | 3,399 | 3,400 |
| | 2-4 | 3,414 | 3,415 | 3,416 | 3,417 | 3,418 | 3,419 | 3,420 | 3,421 | 3,422 | 3,423 | 3,424 | 3,425 |
| | 2-5 | 3,439 | 3,440 | 3,441 | 3,442 | 3,443 | 3,444 | 3,445 | 3,446 | 3,447 | 3,448 | 3,449 | 3,450 |
| | 2-6 | 3,464 | 3,465 | 3,466 | 3,467 | 3,468 | 3,469 | 3,470 | 3,471 | 3,472 | 3,473 | 3,474 | 3,475 |
| | 2-7 | 3,489 | 3,490 | 3,491 | 3,492 | 3,493 | 3,494 | 3,495 | 3,496 | 3,497 | 3,498 | 3,499 | 3,500 |
| | 2-8 | 3,514 | 3,515 | 3,516 | 3,517 | 3,518 | 3,519 | 3,520 | 3,521 | 3,522 | 3,523 | 3,524 | 3,525 |
| | 2-9 | 3,539 | 3,540 | 3,541 | 3,542 | 3,543 | 3,544 | 3,545 | 3,546 | 3,547 | 3,548 | 3,549 | 3,550 |
| | 2-10 | 3,564 | 3,565 | 3,566 | 3,567 | 3,568 | 3,569 | 3,570 | 3,571 | 3,572 | 3,573 | 3,574 | 3,575 |
| | 2-11 | 3,589 | 3,590 | 3,591 | 3,592 | 3,593 | 3,594 | 3,595 | 3,596 | 3,597 | 3,598 | 3,599 | 3,600 |
| | 2-12 | 3,614 | 3,615 | 3,616 | 3,617 | 3,618 | 3,619 | 3,620 | 3,621 | 3,622 | 3,623 | 3,624 | 3,625 |
| | 2-13 | 3,639 | 3,640 | 3,641 | 3,642 | 3,643 | 3,644 | 3,645 | 3,646 | 3,647 | 3,648 | 3,649 | 3,650 |
| | 2-14 | 3,664 | 3,665 | 3,666 | 3,667 | 3,668 | 3,669 | 3,670 | 3,671 | 3,672 | 3,673 | 3,674 | 3,675 |
| | 2-15 | 3,689 | 3,690 | 3,691 | 3,692 | 3,693 | 3,694 | 3,695 | 3,696 | 3,697 | 3,698 | 3,699 | 3,700 |
| | 2-16 | 3,714 | 3,715 | 3,716 | 3,717 | 3,718 | 3,719 | 3,720 | 3,721 | 3,722 | 3,723 | 3,724 | 3,725 |
| | 2-17 | 3,739 | 3,740 | 3,741 | 3,742 | 3,743 | 3,744 | 3,745 | 3,746 | 3,747 | 3,748 | 3,749 | 3,750 |
| | 2-18 | 3,764 | 3,765 | 3,766 | 3,767 | 3,768 | 3,769 | 3,770 | 3,771 | 3,772 | 3,773 | 3,774 | 3,775 |
| | 2-19 | 3,789 | 3,790 | 3,791 | 3,792 | 3,793 | 3,794 | 3,795 | 3,796 | 3,797 | 3,798 | 3,799 | 3,800 |
| | 2-20 | 3,814 | 3,815 | 3,816 | 3,817 | 3,818 | 3,819 | 3,820 | 3,821 | 3,822 | 3,823 | 3,824 | 3,825 |
| | 2-21 | 3,839 | 3,840 | 3,841 | 3,842 | 3,843 | 3,844 | 3,845 | 3,846 | 3,847 | 3,848 | 3,849 | 3,850 |
| | 2-22 | 3,864 | 3,865 | 3,866 | 3,867 | 3,868 | 3,869 | 3,870 | 3,871 | 3,872 | 3,873 | 3,874 | 3,875 |
| | 2-23 | 3,889 | 3,890 | 3,891 | 3,892 | 3,893 | 3,894 | 3,895 | 3,896 | 3,897 | 3,898 | 3,899 | 3,900 |
| | 2-24 | 3,914 | 3,915 | 3,916 | 3,917 | 3,918 | 3,919 | 3,920 | 3,921 | 3,922 | 3,923 | 3,924 | 3,925 |
| | 2-25 | 3,939 | 3,940 | 3,941 | 3,942 | 3,943 | 3,944 | 3,945 | 3,946 | 3,947 | 3,948 | 3,949 | 3,950 |
| | 2-26 | 3,964 | 3,965 | 3,966 | 3,967 | 3,968 | 3,969 | 3,970 | 3,971 | 3,972 | 3,973 | 3,974 | 3,975 |
| | 2-27 | 3,989 | 3,990 | 3,991 | 3,992 | 3,993 | 3,994 | 3,995 | 3,996 | 3,997 | 3,998 | 3,999 | 4,000 |
| | 2-28 | 4,014 | 4,015 | 4,016 | 4,017 | 4,018 | 4,019 | 4,020 | 4,021 | 4,022 | 4,023 | 4,024 | 4,025 |
| | 2-29 | 4,039 | 4,040 | 4,041 | 4,042 | 4,043 | 4,044 | 4,045 | 4,046 | 4,047 | 4,048 | 4,049 | 4,050 |
| | 2-30 | 4,064 | 4,065 | 4,066 | 4,067 | 4,068 | 4,069 | 4,070 | 4,071 | 4,072 | 4,073 | 4,074 | 4,075 |
| | 2-31 | 4,089 | 4,090 | 4,091 | 4,092 | 4,093 | 4,094 | 4,095 | 4,096 | 4,097 | 4,098 | 4,099 | 4,100 |
| | 2-32 | 4,114 | 4,115 | 4,116 | 4,117 | 4,118 | 4,119 | 4,120 | 4,121 | 4,122 | 4,123 | 4,124 | 4,125 |
| | 2-33 | 4,139 | 4,140 | 4,141 | 4,142 | 4,143 | 4,144 | 4,145 | 4,146 | 4,147 | 4,148 | 4,149 | 4,150 |
| | 2-34 | 4,164 | 4,165 | 4,166 | 4,167 | 4,168 | 4,169 | 4,170 | 4,171 | 4,172 | 4,173 | 4,174 | 4,175 |
| | 2-35 | 4,189 | 4,190 | 4,191 | 4,192 | 4,193 | 4,194 | 4,195 | 4,196 | 4,197 | 4,198 | 4,199 | 4,200 |
| | 2-36 | 4,214 | 4,215 | 4,216 | 4,217 | 4,218 | 4,219 | 4,220 | 4,221 | 4,222 | 4,223 | 4,224 | 4,225 |
| | 2-37 | 4,239 | 4,240 | 4,241 | 4,242 | 4,243 | 4,244 | 4,245 | 4,246 | 4,247 | 4,248 | 4,249 | 4,250 |
| | 2-38 | 4,264 | 4,265 | 4,266 | 4,267 | 4,268 | 4,269 | 4,270 | 4,271 | 4,272 | 4,273 | 4,274 | 4,275 |
| | 2-39 | 4,289 | 4,290 | 4,291 | 4,292 | 4,293 | 4,294 | 4,295 | 4,296 | 4,297 | 4,298 | 4,299 | 4,300 |
| | 2-40 | 4,314 | 4,315 | 4,316 | 4,317 | 4,318 | 4,319 | 4,320 | 4,321 | 4,322 | 4,323 | 4,324 | 4,325 |
| | 2-41 | 4,339 | 4,340 | 4,341 | 4,342 | 4,343 | 4,344 | 4,345 | 4,346 | 4,347 | 4,348 | 4,349 | 4,350 |
| | 2-42 | 4,364 | 4,365 | 4,366 | 4,367 | 4,368 | 4,369 | 4,370 | 4,371 | 4,372 | 4,373 | 4,374 | 4,375 |
| | 2-43 | 4,389 | 4,390 | 4,391 | 4,392 | 4,393 | 4,394 | 4,395 | 4,396 | 4,397 | 4,398 | 4,399 | 4,400 |

TABLE 4-continued

| | | | | | | | | | | | | | |
|---|---|---|---|---|---|---|---|---|---|---|---|---|---|
| | 2-44 | 4,414 | 4,415 | 4,416 | 4,417 | 4,418 | 4,419 | 4,420 | 4,421 | 4,422 | 4,423 | 4,424 | 4,425 |
| | 2-45 | 4,439 | 4,440 | 4,441 | 4,442 | 4,443 | 4,444 | 4,445 | 4,446 | 4,447 | 4,448 | 4,449 | 4,450 |
| | 2-46 | 4,464 | 4,465 | 4,466 | 4,467 | 4,468 | 4,469 | 4,470 | 4,471 | 4,472 | 4,473 | 4,474 | 4,475 |
| | 2-47 | 4,489 | 4,490 | 4,491 | 4,492 | 4,493 | 4,494 | 4,495 | 4,496 | 4,497 | 4,498 | 4,499 | 4,500 |
| | 2-48 | 4,514 | 4,515 | 4,516 | 4,517 | 4,518 | 4,519 | 4,520 | 4,521 | 4,522 | 4,523 | 4,524 | 4,525 |
| | 2-49 | 4,539 | 4,540 | 4,541 | 4,542 | 4,543 | 4,544 | 4,545 | 4,546 | 4,547 | 4,548 | 4,549 | 4,550 |
| | 2-50 | 4,564 | 4,565 | 4,566 | 4,567 | 4,568 | 4,569 | 4,570 | 4,571 | 4,572 | 4,573 | 4,574 | 4,575 |
| | 2-51 | 4,589 | 4,590 | 4,591 | 4,592 | 4,593 | 4,594 | 4,595 | 4,596 | 4,597 | 4,598 | 4,599 | 4,600 |
| | 2-52 | 4,614 | 4,615 | 4,616 | 4,617 | 4,618 | 4,619 | 4,620 | 4,621 | 4,622 | 4,623 | 4,624 | 4,625 |
| | 2-53 | 4,639 | 4,640 | 4,641 | 4,642 | 4,643 | 4,644 | 4,645 | 4,646 | 4,647 | 4,648 | 4,649 | 4,650 |
| | 2-54 | 4,664 | 4,665 | 4,666 | 4,667 | 4,668 | 4,669 | 4,670 | 4,671 | 4,672 | 4,673 | 4,674 | 4,675 |
| | 2-55 | 4,689 | 4,690 | 4,691 | 4,692 | 4,693 | 4,694 | 4,695 | 4,696 | 4,697 | 4,698 | 4,699 | 4,700 |

TABLE 5

| | | Compound represented by the formula (1) | | | | | | | | | | | | |
|---|---|---|---|---|---|---|---|---|---|---|---|---|---|---|
| | | 1-26 | 1-27 | 1-28 | 1-29 | 1-30 | 1-31 | 1-32 | 1-33 | 1-34 | 1-35 | 1-36 | 1-37 | 1-38 |
| Compound represented by the formula (2) | 2-56 | 4,701 | 4,702 | 4,703 | 4,704 | 4,705 | 4,706 | 4,707 | 4,708 | 4,709 | 4,710 | 4,711 | 4,712 | 4,713 |
| | 2-57 | 4,726 | 4,727 | 4,728 | 4,729 | 4,730 | 4,731 | 4,732 | 4,733 | 4,734 | 4,735 | 4,736 | 4,737 | 4,738 |
| | 2-58 | 4,751 | 4,752 | 4,753 | 4,754 | 4,755 | 4,756 | 4,757 | 4,758 | 4,759 | 4,760 | 4,761 | 4,762 | 4,763 |
| | 2-59 | 4,776 | 4,777 | 4,778 | 4,779 | 4,780 | 4,781 | 4,782 | 4,783 | 4,784 | 4,785 | 4,786 | 4,787 | 4,788 |
| | 2-60 | 4,801 | 4,802 | 4,803 | 4,804 | 4,805 | 4,806 | 4,807 | 4,808 | 4,809 | 4,810 | 4,811 | 4,812 | 4,813 |
| | 2-61 | 4,826 | 4,827 | 4,828 | 4,829 | 4,830 | 4,831 | 4,832 | 4,833 | 4,834 | 4,835 | 4,836 | 4,837 | 4,838 |
| | 2-62 | 4,851 | 4,852 | 4,853 | 4,854 | 4,855 | 4,856 | 4,857 | 4,858 | 4,859 | 4,860 | 4,861 | 4,862 | 4,863 |
| | 2-63 | 4,876 | 4,877 | 4,878 | 4,879 | 4,880 | 4,881 | 4,882 | 4,883 | 4,884 | 4,885 | 4,886 | 4,887 | 4,888 |
| | 2-64 | 4,901 | 4,902 | 4,903 | 4,904 | 4,905 | 4,906 | 4,907 | 4,908 | 4,909 | 4,910 | 4,911 | 4,912 | 4,913 |
| | 2-65 | 4,926 | 4,927 | 4,928 | 4,929 | 4,930 | 4,931 | 4,932 | 4,933 | 4,934 | 4,935 | 4,936 | 4,937 | 4,938 |
| | 2-66 | 4,951 | 4,952 | 4,953 | 4,954 | 4,955 | 4,956 | 4,957 | 4,958 | 4,959 | 4,960 | 4,961 | 4,962 | 4,963 |
| | 2-67 | 4,976 | 4,977 | 4,978 | 4,979 | 4,980 | 4,981 | 4,982 | 4,983 | 4,984 | 4,985 | 4,986 | 4,987 | 4,988 |
| | 2-68 | 5,001 | 5,002 | 5,003 | 5,004 | 5,005 | 5,006 | 5,007 | 5,008 | 5,009 | 5,010 | 5,011 | 5,012 | 5,013 |
| | 2-69 | 5,026 | 5,027 | 5,028 | 5,029 | 5,030 | 5,031 | 5,032 | 5,033 | 5,034 | 5,035 | 5,036 | 5,037 | 5,038 |
| | 2-70 | 5,051 | 5,052 | 5,053 | 5,054 | 5,055 | 5,056 | 5,057 | 5,058 | 5,059 | 5,060 | 5,061 | 5,062 | 5,063 |
| | 2-71 | 5,076 | 5,077 | 5,078 | 5,079 | 5,080 | 5,081 | 5,082 | 5,083 | 5,084 | 5,085 | 5,086 | 5,087 | 5,088 |
| | 2-72 | 5,101 | 5,102 | 5,103 | 5,104 | 5,105 | 5,106 | 5,107 | 5,108 | 5,109 | 5,110 | 5,111 | 5,112 | 5,113 |
| | 2-73 | 5,126 | 5,127 | 5,128 | 5,129 | 5,130 | 5,131 | 5,132 | 5,133 | 5,134 | 5,135 | 5,136 | 5,137 | 5,138 |
| | 2-74 | 5,151 | 5,152 | 5,153 | 5,154 | 5,155 | 5,156 | 5,157 | 5,158 | 5,159 | 5,160 | 5,161 | 5,162 | 5,163 |
| | 2-75 | 5,176 | 5,177 | 5,178 | 5,179 | 5,180 | 5,181 | 5,182 | 5,183 | 5,184 | 5,185 | 5,186 | 5,187 | 5,188 |
| | 2-76 | 5,201 | 5,202 | 5,203 | 5,204 | 5,205 | 5,206 | 5,207 | 5,208 | 5,209 | 5,210 | 5,211 | 5,212 | 5,213 |
| | 2-77 | 5,226 | 5,227 | 5,228 | 5,229 | 5,230 | 5,231 | 5,232 | 5,233 | 5,234 | 5,235 | 5,236 | 5,237 | 5,238 |
| | 2-78 | 5,251 | 5,252 | 5,253 | 5,254 | 5,255 | 5,256 | 5,257 | 5,258 | 5,259 | 5,260 | 5,261 | 5,262 | 5,263 |
| | 2-79 | 5,276 | 5,277 | 5,278 | 5,279 | 5,280 | 5,281 | 5,282 | 5,283 | 5,284 | 5,285 | 5,286 | 5,287 | 5,288 |
| | 2-80 | 5,301 | 5,302 | 5,303 | 5,304 | 5,305 | 5,306 | 5,307 | 5,308 | 5,309 | 5,310 | 5,311 | 5,312 | 5,313 |
| | 2-81 | 5,326 | 5,327 | 5,328 | 5,329 | 5,330 | 5,331 | 5,332 | 5,333 | 5,334 | 5,335 | 5,336 | 5,337 | 5,338 |
| | 2-82 | 5,351 | 5,352 | 5,353 | 5,354 | 5,355 | 5,356 | 5,357 | 5,358 | 5,359 | 5,360 | 5,361 | 5,362 | 5,363 |
| | 2-83 | 5,376 | 5,377 | 5,378 | 5,379 | 5,380 | 5,381 | 5,382 | 5,383 | 5,384 | 5,385 | 5,386 | 5,387 | 5,388 |
| | 2-84 | 5,401 | 5,402 | 5,403 | 5,404 | 5,405 | 5,406 | 5,407 | 5,408 | 5,409 | 5,410 | 5,411 | 5,412 | 5,413 |
| | 2-85 | 5,426 | 5,427 | 5,428 | 5,429 | 5,430 | 5,431 | 5,432 | 5,433 | 5,434 | 5,435 | 5,436 | 5,437 | 5,438 |
| | 2-86 | 5,451 | 5,452 | 5,453 | 5,454 | 5,455 | 5,456 | 5,457 | 5,458 | 5,459 | 5,460 | 5,461 | 5,462 | 5,463 |
| | 2-87 | 5,476 | 5,477 | 5,478 | 5,479 | 5,480 | 5,481 | 5,482 | 5,483 | 5,484 | 5,485 | 5,486 | 5,487 | 5,488 |
| | 2-88 | 5,501 | 5,502 | 5,503 | 5,504 | 5,505 | 5,506 | 5,507 | 5,508 | 5,509 | 5,510 | 5,511 | 5,512 | 5,513 |
| | 2-89 | 5,526 | 5,527 | 5,528 | 5,529 | 5,530 | 5,531 | 5,532 | 5,533 | 5,534 | 5,535 | 5,536 | 5,537 | 5,538 |
| | 2-90 | 5,551 | 5,552 | 5,553 | 5,554 | 5,555 | 5,556 | 5,557 | 5,558 | 5,559 | 5,560 | 5,561 | 5,562 | 5,563 |
| | 2-91 | 5,576 | 5,577 | 5,578 | 5,579 | 5,580 | 5,581 | 5,582 | 5,583 | 5,584 | 5,585 | 5,586 | 5,587 | 5,588 |
| | 2-92 | 5,601 | 5,602 | 5,603 | 5,604 | 5,605 | 5,606 | 5,607 | 5,608 | 5,609 | 5,610 | 5,611 | 5,612 | 5,613 |
| | 2-93 | 5,626 | 5,627 | 5,628 | 5,629 | 5,630 | 5,631 | 5,632 | 5,633 | 5,634 | 5,635 | 5,636 | 5,637 | 5,638 |
| | 2-94 | 5,651 | 5,652 | 5,653 | 5,654 | 5,655 | 5,656 | 5,657 | 5,658 | 5,659 | 5,660 | 5,661 | 5,662 | 5,663 |
| | 2-95 | 5,676 | 5,677 | 5,678 | 5,679 | 5,680 | 5,681 | 5,682 | 5,683 | 5,684 | 5,685 | 5,686 | 5,687 | 5,688 |
| | 2-96 | 5,701 | 5,702 | 5,703 | 5,704 | 5,705 | 5,706 | 5,707 | 5,708 | 5,709 | 5,710 | 5,711 | 5,712 | 5,713 |
| | 2-97 | 5,726 | 5,727 | 5,728 | 5,729 | 5,730 | 5,731 | 5,732 | 5,733 | 5,734 | 5,735 | 5,736 | 5,737 | 5,738 |
| | 2-98 | 5,751 | 5,752 | 5,753 | 5,754 | 5,755 | 5,756 | 5,757 | 5,758 | 5,759 | 5,760 | 5,761 | 5,762 | 5,763 |
| | 2-99 | 5,776 | 5,777 | 5,778 | 5,779 | 5,780 | 5,781 | 5,782 | 5,783 | 5,784 | 5,785 | 5,786 | 5,787 | 5,788 |
| | 2-100 | 5,801 | 5,802 | 5,803 | 5,804 | 5,805 | 5,806 | 5,807 | 5,808 | 5,809 | 5,810 | 5,811 | 5,812 | 5,813 |
| | 2-101 | 5,826 | 5,827 | 5,828 | 5,829 | 5,830 | 5,831 | 5,832 | 5,833 | 5,834 | 5,835 | 5,836 | 5,837 | 5,838 |
| | 2-102 | 5,851 | 5,852 | 5,853 | 5,854 | 5,855 | 5,856 | 5,857 | 5,858 | 5,859 | 5,860 | 5,861 | 5,862 | 5,863 |
| | 2-103 | 5,876 | 5,877 | 5,878 | 5,879 | 5,880 | 5,881 | 5,882 | 5,883 | 5,884 | 5,885 | 5,886 | 5,887 | 5,888 |
| | 2-104 | 5,901 | 5,902 | 5,903 | 5,904 | 5,905 | 5,906 | 5,907 | 5,908 | 5,909 | 5,910 | 5,911 | 5,912 | 5,913 |
| | 2-105 | 5,926 | 5,927 | 5,928 | 5,929 | 5,930 | 5,931 | 5,932 | 5,933 | 5,934 | 5,935 | 5,936 | 5,937 | 5,938 |
| | 2-106 | 5,951 | 5,952 | 5,953 | 5,954 | 5,955 | 5,956 | 5,957 | 5,958 | 5,959 | 5,960 | 5,961 | 5,962 | 5,963 |
| | 2-107 | 5,976 | 5,977 | 5,978 | 5,979 | 5,980 | 5,981 | 5,982 | 5,983 | 5,984 | 5,985 | 5,986 | 5,987 | 5,988 |
| | 2-108 | 6,001 | 6,002 | 6,003 | 6,004 | 6,005 | 6,006 | 6,007 | 6,008 | 6,009 | 6,010 | 6,011 | 6,012 | 6,013 |
| | 2-109 | 6,026 | 6,027 | 6,028 | 6,029 | 6,030 | 6,031 | 6,032 | 6,033 | 6,034 | 6,035 | 6,036 | 6,037 | 6,038 |
| | 2-110 | 6,051 | 6,052 | 6,053 | 6,054 | 6,055 | 6,056 | 6,057 | 6,058 | 6,059 | 6,060 | 6,061 | 6,062 | 6,063 |

TABLE 5-continued

| | | Compound represented by the formula (1) | | | | | | | | | | | |
|---|---|---|---|---|---|---|---|---|---|---|---|---|---|
| | | 1-39 | 1-40 | 1-41 | 1-42 | 1-43 | 1-44 | 1-45 | 1-46 | 1-47 | 1-48 | 1-49 | 1-50 |
| Compound represented by the formula (2) | 2-56 | 4,714 | 4,715 | 4,716 | 4,717 | 4,718 | 4,719 | 4,720 | 4,721 | 4,722 | 4,723 | 4,724 | 4,725 |
| | 2-57 | 4,739 | 4,740 | 4,741 | 4,742 | 4,743 | 4,744 | 4,745 | 4,746 | 4,747 | 4,748 | 4,749 | 4,750 |
| | 2-58 | 4,764 | 4,765 | 4,766 | 4,767 | 4,768 | 4,769 | 4,770 | 4,771 | 4,772 | 4,773 | 4,774 | 4,775 |
| | 2-59 | 4,789 | 4,790 | 4,791 | 4,792 | 4,793 | 4,794 | 4,795 | 4,796 | 4,797 | 4,798 | 4,799 | 4,800 |
| | 2-60 | 4,814 | 4,815 | 4,816 | 4,817 | 4,818 | 4,819 | 4,820 | 4,821 | 4,822 | 4,823 | 4,824 | 4,825 |
| | 2-61 | 4,839 | 4,840 | 4,841 | 4,842 | 4,843 | 4,844 | 4,845 | 4,846 | 4,847 | 4,848 | 4,849 | 4,850 |
| | 2-62 | 4,864 | 4,865 | 4,866 | 4,867 | 4,868 | 4,869 | 4,870 | 4,871 | 4,872 | 4,873 | 4,874 | 4,875 |
| | 2-63 | 4,889 | 4,890 | 4,891 | 4,892 | 4,893 | 4,894 | 4,895 | 4,896 | 4,897 | 4,898 | 4,899 | 4,900 |
| | 2-64 | 4,914 | 4,915 | 4,916 | 4,917 | 4,918 | 4,919 | 4,920 | 4,921 | 4,922 | 4,923 | 4,924 | 4,925 |
| | 2-65 | 4,939 | 4,940 | 4,941 | 4,942 | 4,943 | 4,944 | 4,945 | 4,946 | 4,947 | 4,948 | 4,949 | 4,950 |
| | 2-66 | 4,964 | 4,965 | 4,966 | 4,967 | 4,968 | 4,969 | 4,970 | 4,971 | 4,972 | 4,973 | 4,974 | 4,975 |
| | 2-67 | 4,989 | 4,990 | 4,991 | 4,992 | 4,993 | 4,994 | 4,995 | 4,996 | 4,997 | 4,998 | 4,999 | 5,000 |
| | 2-68 | 5,014 | 5,015 | 5,016 | 5,017 | 5,018 | 5,019 | 5,020 | 5,021 | 5,022 | 5,023 | 5,024 | 5,025 |
| | 2-69 | 5,039 | 5,040 | 5,041 | 5,042 | 5,043 | 5,044 | 5,045 | 5,046 | 5,047 | 5,048 | 5,049 | 5,050 |
| | 2-70 | 5,064 | 5,065 | 5,066 | 5,067 | 5,068 | 5,069 | 5,070 | 5,071 | 5,072 | 5,073 | 5,074 | 5,075 |
| | 2-71 | 5,089 | 5,090 | 5,091 | 5,092 | 5,093 | 5,094 | 5,095 | 5,096 | 5,097 | 5,098 | 5,099 | 5,100 |
| | 2-72 | 5,114 | 5,115 | 5,116 | 5,117 | 5,118 | 5,119 | 5,120 | 5,121 | 5,122 | 5,123 | 5,124 | 5,125 |
| | 2-73 | 5,139 | 5,140 | 5,141 | 5,142 | 5,143 | 5,144 | 5,145 | 5,146 | 5,147 | 5,148 | 5,149 | 5,150 |
| | 2-74 | 5,164 | 5,165 | 5,166 | 5,167 | 5,168 | 5,169 | 5,170 | 5,171 | 5,172 | 5,173 | 5,174 | 5,175 |
| | 2-75 | 5,189 | 5,190 | 5,191 | 5,192 | 5,193 | 5,194 | 5,195 | 5,196 | 5,197 | 5,198 | 5,199 | 5,200 |
| | 2-76 | 5,214 | 5,215 | 5,216 | 5,217 | 5,218 | 5,219 | 5,220 | 5,221 | 5,222 | 5,223 | 5,224 | 5,225 |
| | 2-77 | 5,239 | 5,240 | 5,241 | 5,242 | 5,243 | 5,244 | 5,245 | 5,246 | 5,247 | 5,248 | 5,249 | 5,250 |
| | 2-78 | 5,264 | 5,265 | 5,266 | 5,267 | 5,268 | 5,269 | 5,270 | 5,271 | 5,272 | 5,273 | 5,274 | 5,275 |
| | 2-79 | 5,289 | 5,290 | 5,291 | 5,292 | 5,293 | 5,294 | 5,295 | 5,296 | 5,297 | 5,298 | 5,299 | 5,300 |
| | 2-80 | 5,314 | 5,315 | 5,316 | 5,317 | 5,318 | 5,319 | 5,320 | 5,321 | 5,322 | 5,323 | 5,324 | 5,325 |
| | 2-81 | 5,339 | 5,340 | 5,341 | 5,342 | 5,343 | 5,344 | 5,345 | 5,346 | 5,347 | 5,348 | 5,349 | 5,350 |
| | 2-82 | 5,364 | 5,365 | 5,366 | 5,367 | 5,368 | 5,369 | 5,370 | 5,371 | 5,372 | 5,373 | 5,374 | 5,375 |
| | 2-83 | 5,389 | 5,390 | 5,391 | 5,392 | 5,393 | 5,394 | 5,395 | 5,396 | 5,397 | 5,398 | 5,399 | 5,400 |
| | 2-84 | 5,414 | 5,415 | 5,416 | 5,417 | 5,418 | 5,419 | 5,420 | 5,421 | 5,422 | 5,423 | 5,424 | 5,425 |
| | 2-85 | 5,439 | 5,440 | 5,441 | 5,442 | 5,443 | 5,444 | 5,445 | 5,446 | 5,447 | 5,448 | 5,449 | 5,450 |
| | 2-86 | 5,464 | 5,465 | 5,466 | 5,467 | 5,468 | 5,469 | 5,470 | 5,471 | 5,472 | 5,473 | 5,474 | 5,475 |
| | 2-87 | 5,489 | 5,490 | 5,491 | 5,492 | 5,493 | 5,494 | 5,495 | 5,496 | 5,497 | 5,498 | 5,499 | 5,500 |
| | 2-88 | 5,514 | 5,515 | 5,516 | 5,517 | 5,518 | 5,519 | 5,520 | 5,521 | 5,522 | 5,523 | 5,524 | 5,525 |
| | 2-89 | 5,539 | 5,540 | 5,541 | 5,542 | 5,543 | 5,544 | 5,545 | 5,546 | 5,547 | 5,548 | 5,549 | 5,550 |
| | 2-90 | 5,564 | 5,565 | 5,566 | 5,567 | 5,568 | 5,569 | 5,570 | 5,571 | 5,572 | 5,573 | 5,574 | 5,575 |
| | 2-91 | 5,589 | 5,590 | 5,591 | 5,592 | 5,593 | 5,594 | 5,595 | 5,596 | 5,597 | 5,598 | 5,599 | 5,600 |
| | 2-92 | 5,614 | 5,615 | 5,616 | 5,617 | 5,618 | 5,619 | 5,620 | 5,621 | 5,622 | 5,623 | 5,624 | 5,625 |
| | 2-93 | 5,639 | 5,640 | 5,641 | 5,642 | 5,643 | 5,644 | 5,645 | 5,646 | 5,647 | 5,648 | 5,649 | 5,650 |
| | 2-94 | 5,664 | 5,665 | 5,666 | 5,667 | 5,668 | 5,669 | 5,670 | 5,671 | 5,672 | 5,673 | 5,674 | 5,675 |
| | 2-95 | 5,689 | 5,690 | 5,691 | 5,692 | 5,693 | 5,694 | 5,695 | 5,696 | 5,697 | 5,698 | 5,699 | 5,700 |
| | 2-96 | 5,714 | 5,715 | 5,716 | 5,717 | 5,718 | 5,719 | 5,720 | 5,721 | 5,722 | 5,723 | 5,724 | 5,725 |
| | 2-97 | 5,739 | 5,740 | 5,741 | 5,742 | 5,743 | 5,744 | 5,745 | 5,746 | 5,747 | 5,748 | 5,749 | 5,750 |
| | 2-98 | 5,764 | 5,765 | 5,766 | 5,767 | 5,768 | 5,769 | 5,770 | 5,771 | 5,772 | 5,773 | 5,774 | 5,775 |
| | 2-99 | 5,789 | 5,790 | 5,791 | 5,792 | 5,793 | 5,794 | 5,795 | 5,796 | 5,797 | 5,798 | 5,799 | 5,800 |
| | 2-100 | 5,814 | 5,815 | 5,816 | 5,817 | 5,818 | 5,819 | 5,820 | 5,821 | 5,822 | 5,823 | 5,824 | 5,825 |
| | 2-101 | 5,839 | 5,840 | 5,841 | 5,842 | 5,843 | 5,844 | 5,845 | 5,846 | 5,847 | 5,848 | 5,849 | 5,850 |
| | 2-102 | 5,864 | 5,865 | 5,866 | 5,867 | 5,868 | 5,869 | 5,870 | 5,871 | 5,872 | 5,873 | 5,874 | 5,875 |
| | 2-103 | 5,889 | 5,890 | 5,891 | 5,892 | 5,893 | 5,894 | 5,895 | 5,896 | 5,897 | 5,898 | 5,899 | 5,900 |
| | 2-104 | 5,914 | 5,915 | 5,916 | 5,917 | 5,918 | 5,919 | 5,920 | 5,921 | 5,922 | 5,923 | 5,924 | 5,925 |
| | 2-105 | 5,939 | 5,940 | 5,941 | 5,942 | 5,943 | 5,944 | 5,945 | 5,946 | 5,947 | 5,948 | 5,949 | 5,950 |
| | 2-106 | 5,964 | 5,965 | 5,966 | 5,967 | 5,968 | 5,969 | 5,970 | 5,971 | 5,972 | 5,973 | 5,974 | 5,975 |
| | 2-107 | 5,989 | 5,990 | 5,991 | 5,992 | 5,993 | 5,994 | 5,995 | 5,996 | 5,997 | 5,998 | 5,999 | 6,000 |
| | 2-108 | 6,014 | 6,015 | 6,016 | 6,017 | 6,018 | 6,019 | 6,020 | 6,021 | 6,022 | 6,023 | 6,024 | 6,025 |
| | 2-109 | 6,039 | 6,040 | 6,041 | 6,042 | 6,043 | 6,044 | 6,045 | 6,046 | 6,047 | 6,048 | 6,049 | 6,050 |
| | 2-110 | 6,064 | 6,065 | 6,066 | 6,067 | 6,068 | 6,069 | 6,070 | 6,071 | 6,072 | 6,073 | 6,074 | 6,075 |

TABLE 6

| | | Compound represented by the formula (1) | | | | | | | | | | | | |
|---|---|---|---|---|---|---|---|---|---|---|---|---|---|---|
| | | 1-26 | 1-27 | 1-28 | 1-29 | 1-30 | 1-31 | 1-32 | 1-33 | 1-34 | 1-35 | 1-36 | 1-37 | 1-38 |
| Compound represented by the formula (2) | 2-111 | 6,076 | 6,077 | 6,078 | 6,079 | 6,080 | 6,081 | 6,082 | 6,083 | 6,084 | 6,085 | 6,086 | 6,087 | 6,088 |
| | 2-112 | 6,101 | 6,102 | 6,103 | 6,104 | 6,105 | 6,106 | 6,107 | 6,108 | 6,109 | 6,110 | 6,111 | 6,112 | 6,113 |
| | 2-113 | 6,126 | 6,127 | 6,128 | 6,129 | 6,130 | 6,131 | 6,132 | 6,133 | 6,134 | 6,135 | 6,136 | 6,137 | 6,138 |
| | 2-114 | 6,151 | 6,152 | 6,153 | 6,154 | 6,155 | 6,156 | 6,157 | 6,158 | 6,159 | 6,160 | 6,161 | 6,162 | 6,163 |
| | 2-115 | 6,176 | 6,177 | 6,178 | 6,179 | 6,180 | 6,181 | 6,182 | 6,183 | 6,184 | 6,185 | 6,186 | 6,187 | 6,188 |
| | 2-116 | 6,201 | 6,202 | 6,203 | 6,204 | 6,205 | 6,206 | 6,207 | 6,208 | 6,209 | 6,210 | 6,211 | 6,212 | 6,213 |
| | 2-117 | 6,226 | 6,227 | 6,228 | 6,229 | 6,230 | 6,231 | 6,232 | 6,233 | 6,234 | 6,235 | 6,236 | 6,237 | 6,238 |
| | 2-118 | 6,251 | 6,252 | 6,253 | 6,254 | 6,255 | 6,256 | 6,257 | 6,258 | 6,259 | 6,260 | 6,261 | 6,262 | 6,263 |
| | 2-119 | 6,276 | 6,277 | 6,278 | 6,279 | 6,280 | 6,281 | 6,282 | 6,283 | 6,284 | 6,285 | 6,286 | 6,287 | 6,288 |
| | 2-120 | 6,301 | 6,302 | 6,303 | 6,304 | 6,305 | 6,306 | 6,307 | 6,308 | 6,309 | 6,310 | 6,311 | 6,312 | 6,313 |
| | 2-121 | 6,326 | 6,327 | 6,328 | 6,329 | 6,330 | 6,331 | 6,332 | 6,333 | 6,334 | 6,335 | 6,336 | 6,337 | 6,338 |
| | 2-122 | 6,351 | 6,352 | 6,353 | 6,354 | 6,355 | 6,356 | 6,357 | 6,358 | 6,359 | 6,360 | 6,361 | 6,362 | 6,363 |

TABLE 6-continued

| | | | | | | | | | | | | | |
|---|---|---|---|---|---|---|---|---|---|---|---|---|---|
| 2-123 | 6,376 | 6,377 | 6,378 | 6,379 | 6,380 | 6,381 | 6,382 | 6,383 | 6,384 | 6,385 | 6,386 | 6,387 | 6,388 |
| 2-124 | 6,401 | 6,402 | 6,403 | 6,404 | 6,405 | 6,406 | 6,407 | 6,408 | 6,409 | 6,410 | 6,411 | 6,412 | 6,413 |
| 2-125 | 6,426 | 6,427 | 6,428 | 6,429 | 6,430 | 6,431 | 6,432 | 6,433 | 6,434 | 6,435 | 6,436 | 6,437 | 6,438 |
| 2-126 | 6,451 | 6,452 | 6,453 | 6,454 | 6,455 | 6,456 | 6,457 | 6,458 | 6,459 | 6,460 | 6,461 | 6,462 | 6,463 |
| 2-127 | 6,476 | 6,477 | 6,478 | 6,479 | 6,480 | 6,481 | 6,482 | 6,483 | 6,484 | 6,485 | 6,486 | 6,487 | 6,488 |
| 2-128 | 6,501 | 6,502 | 6,503 | 6,504 | 6,505 | 6,506 | 6,507 | 6,508 | 6,509 | 6,510 | 6,511 | 6,512 | 6,513 |
| 2-129 | 6,526 | 6,527 | 6,528 | 6,529 | 6,530 | 6,531 | 6,532 | 6,533 | 6,534 | 6,535 | 6,536 | 6,537 | 6,538 |
| 2-130 | 6,551 | 6,552 | 6,553 | 6,554 | 6,555 | 6,556 | 6,557 | 6,558 | 6,559 | 6,560 | 6,561 | 6,562 | 6,563 |
| 2-131 | 6,576 | 6,577 | 6,578 | 6,579 | 6,580 | 6,581 | 6,582 | 6,583 | 6,584 | 6,585 | 6,586 | 6,587 | 6,588 |
| 2-132 | 6,601 | 6,602 | 6,603 | 6,604 | 6,605 | 6,606 | 6,607 | 6,608 | 6,609 | 6,610 | 6,611 | 6,612 | 6,613 |
| 2-133 | 6,626 | 6,627 | 6,628 | 6,629 | 6,630 | 6,631 | 6,632 | 6,633 | 6,634 | 6,635 | 6,636 | 6,637 | 6,638 |

| | | Compound represented by the formula (1) | | | | | | | | | | | |
|---|---|---|---|---|---|---|---|---|---|---|---|---|---|
| | | 1-39 | 1-40 | 1-41 | 1-42 | 1-43 | 1-44 | 1-45 | 1-46 | 1-47 | 1-48 | 1-49 | 1-50 |
| Compound represented by the formula (2) | 2-111 | 6,089 | 6,090 | 6,091 | 6,092 | 6,093 | 6,094 | 6,095 | 6,096 | 6,097 | 6,098 | 6,099 | 6,100 |
| | 2-112 | 6,114 | 6,115 | 6,116 | 6,117 | 6,118 | 6,119 | 6,120 | 6,121 | 6,122 | 6,123 | 6,124 | 6,125 |
| | 2-113 | 6,139 | 6,140 | 6,141 | 6,142 | 6,143 | 6,144 | 6,145 | 6,146 | 6,147 | 6,148 | 6,149 | 6,150 |
| | 2-114 | 6,164 | 6,165 | 6,166 | 6,167 | 6,168 | 6,169 | 6,170 | 6,171 | 6,172 | 6,173 | 6,174 | 6,175 |
| | 2-115 | 6,189 | 6,190 | 6,191 | 6,192 | 6,193 | 6,194 | 6,195 | 6,196 | 6,197 | 6,198 | 6,199 | 6,200 |
| | 2-116 | 6,214 | 6,215 | 6,216 | 6,217 | 6,218 | 6,219 | 6,220 | 6,221 | 6,222 | 6,223 | 6,224 | 6,225 |
| | 2-117 | 6,239 | 6,240 | 6,241 | 6,242 | 6,243 | 6,244 | 6,245 | 6,246 | 6,247 | 6,248 | 6,249 | 6,250 |
| | 2-118 | 6,264 | 6,265 | 6,266 | 6,267 | 6,268 | 6,269 | 6,270 | 6,271 | 6,272 | 6,273 | 6,274 | 6,275 |
| | 2-119 | 6,289 | 6,290 | 6,291 | 6,292 | 6,293 | 6,294 | 6,295 | 6,296 | 6,297 | 6,298 | 6,299 | 6,300 |
| | 2-120 | 6,314 | 6,315 | 6,316 | 6,317 | 6,318 | 6,319 | 6,320 | 6,321 | 6,322 | 6,323 | 6,324 | 6,325 |
| | 2-121 | 6,339 | 6,340 | 6,341 | 6,342 | 6,343 | 6,344 | 6,345 | 6,346 | 6,347 | 6,348 | 6,349 | 6,350 |
| | 2-122 | 6,364 | 6,365 | 6,366 | 6,367 | 6,368 | 6,369 | 6,370 | 6,371 | 6,372 | 6,373 | 6,374 | 6,375 |
| | 2-123 | 6,389 | 6,390 | 6,391 | 6,392 | 6,393 | 6,394 | 6,395 | 6,396 | 6,397 | 6,398 | 6,399 | 6,400 |
| | 2-124 | 6,414 | 6,415 | 6,416 | 6,417 | 6,418 | 6,419 | 6,420 | 6,421 | 6,422 | 6,423 | 6,424 | 6,425 |
| | 2-125 | 6,439 | 6,440 | 6,441 | 6,442 | 6,443 | 6,444 | 6,445 | 6,446 | 6,447 | 6,448 | 6,449 | 6,450 |
| | 2-126 | 6,464 | 6,465 | 6,466 | 6,467 | 6,468 | 6,469 | 6,470 | 6,471 | 6,472 | 6,473 | 6,474 | 6,475 |
| | 2-127 | 6,489 | 6,490 | 6,491 | 6,492 | 6,493 | 6,494 | 6,495 | 6,496 | 6,497 | 6,498 | 6,499 | 6,500 |
| | 2-128 | 6,514 | 6,515 | 6,516 | 6,517 | 6,518 | 6,519 | 6,520 | 6,521 | 6,522 | 6,523 | 6,524 | 6,525 |
| | 2-129 | 6,539 | 6,540 | 6,541 | 6,542 | 6,543 | 6,544 | 6,545 | 6,546 | 6,547 | 6,548 | 6,549 | 6,550 |
| | 2-130 | 6,564 | 6,565 | 6,566 | 6,567 | 6,568 | 6,569 | 6,570 | 6,571 | 6,572 | 6,573 | 6,574 | 6,575 |
| | 2-131 | 6,589 | 6,590 | 6,591 | 6,592 | 6,593 | 6,594 | 6,595 | 6,596 | 6,597 | 6,598 | 6,599 | 6,600 |
| | 2-132 | 6,614 | 6,615 | 6,616 | 6,617 | 6,618 | 6,619 | 6,620 | 6,621 | 6,622 | 6,623 | 6,624 | 6,625 |
| | 2-133 | 6,639 | 6,640 | 6,641 | 6,642 | 6,643 | 6,644 | 6,645 | 6,646 | 6,647 | 6,648 | 6,649 | 6,650 |

TABLE 7

| | | Compound represented by the formula (1) | | |
|---|---|---|---|---|
| | | 1-51 | 1-52 | 1-53 |
| Compound represented by the formula (2) | 2-1 | 6,651 | 6,652 | 6,653 |
| | 2-2 | 6,654 | 6,655 | 6,656 |
| | 2-3 | 6,657 | 6,658 | 6,659 |
| | 2-4 | 6,660 | 6,661 | 6,662 |
| | 2-5 | 6,663 | 6,664 | 6,665 |
| | 2-6 | 6,666 | 6,667 | 6,668 |
| | 2-7 | 6,669 | 6,670 | 6,671 |
| | 2-8 | 6,672 | 6,673 | 6,674 |
| | 2-9 | 6,675 | 6,676 | 6,677 |
| | 2-10 | 6,678 | 6,679 | 6,680 |
| | 2-11 | 6,681 | 6,682 | 6,683 |
| | 2-12 | 6,684 | 6,685 | 6,686 |
| | 2-13 | 6,687 | 6,688 | 6,689 |
| | 2-14 | 6,690 | 6,691 | 6,692 |
| | 2-15 | 6,693 | 6,694 | 6,695 |
| | 2-16 | 6,696 | 6,697 | 6,698 |
| | 2-17 | 6,699 | 6,700 | 6,701 |
| | 2-18 | 6,702 | 6,703 | 6,704 |
| | 2-19 | 6,705 | 6,706 | 6,707 |
| | 2-20 | 6,708 | 6,709 | 6,710 |
| | 2-21 | 6,711 | 6,712 | 6,713 |
| | 2-22 | 6,714 | 6,715 | 6,716 |
| | 2-23 | 6,717 | 6,718 | 6,719 |
| | 2-24 | 6,720 | 6,721 | 6,722 |
| | 2-25 | 6,723 | 6,724 | 6,725 |
| | 2-26 | 6,726 | 6,727 | 6,728 |
| | 2-27 | 6,729 | 6,730 | 6,731 |
| | 2-28 | 6,732 | 6,733 | 6,734 |
| | 2-29 | 6,735 | 6,736 | 6,737 |
| | 2-30 | 6,738 | 6,739 | 6,740 |
| | 2-31 | 6,741 | 6,742 | 6,743 |

TABLE 7-continued

| | | Compound represented by the formula (1) | | |
|---|---|---|---|---|
| | | 1-51 | 1-52 | 1-53 |
| | 2-32 | 6,744 | 6,745 | 6,746 |
| | 2-33 | 6,747 | 6,748 | 6,749 |
| | 2-34 | 6,750 | 6,751 | 6,752 |
| | 2-35 | 6,753 | 6,754 | 6,755 |
| | 2-36 | 6,756 | 6,757 | 6,758 |
| | 2-37 | 6,759 | 6,760 | 6,761 |
| | 2-38 | 6,762 | 6,763 | 6,764 |
| | 2-39 | 6,765 | 6,766 | 6,767 |
| | 2-40 | 6,768 | 6,769 | 6,770 |
| | 2-41 | 6,771 | 6,772 | 6,773 |
| | 2-42 | 6,774 | 6,775 | 6,776 |
| | 2-43 | 6,777 | 6,778 | 6,779 |
| | 2-44 | 6,780 | 6,781 | 6,782 |
| | 2-45 | 6,783 | 6,784 | 6,785 |
| | 2-46 | 6,786 | 6,787 | 6,788 |
| | 2-47 | 6,789 | 6,790 | 6,791 |
| | 2-48 | 6,792 | 6,793 | 6,794 |
| | 2-49 | 6,795 | 6,796 | 6,797 |
| | 2-50 | 6,798 | 6,799 | 6,800 |
| | 2-51 | 6,801 | 6,802 | 6,803 |
| | 2-52 | 6,804 | 6,805 | 6,806 |
| | 2-53 | 6,807 | 6,808 | 6,809 |
| | 2-54 | 6,810 | 6,811 | 6,812 |
| | 2-55 | 6,813 | 6,814 | 6,815 |
| | 2-56 | 6,816 | 6,817 | 6,818 |
| | 2-57 | 6,819 | 6,820 | 6,821 |
| | 2-58 | 6,822 | 6,823 | 6,824 |
| | 2-59 | 6,825 | 6,826 | 6,827 |
| | 2-60 | 6,828 | 6,829 | 6,830 |
| | 2-61 | 6,831 | 6,832 | 6,833 |
| | 2-62 | 6,834 | 6,835 | 6,836 |

TABLE 7-continued

| | Compound represented by the formula (1) | | |
|---|---|---|---|
| | 1-51 | 1-52 | 1-53 |
| 2-63 | 6,837 | 6,838 | 6,839 |
| 2-64 | 6,840 | 6,841 | 6,842 |
| 2-65 | 6,843 | 6,844 | 6,845 |
| 2-66 | 6,846 | 6,847 | 6,848 |
| 2-67 | 6,849 | 6,850 | 6,851 |
| 2-68 | 6,852 | 6,853 | 6,854 |
| 2-69 | 6,855 | 6,856 | 6,857 |
| 2-70 | 6,858 | 6,859 | 6,860 |
| 2-71 | 6,861 | 6,862 | 6,863 |
| 2-72 | 6,864 | 6,865 | 6,866 |
| 2-73 | 6,867 | 6,868 | 6,869 |
| 2-74 | 6,870 | 6,871 | 6,872 |
| 2-75 | 6,873 | 6,874 | 6,875 |
| 2-76 | 6,876 | 6,877 | 6,878 |
| 2-77 | 6,879 | 6,880 | 6,881 |
| 2-78 | 6,882 | 6,883 | 6,884 |
| 2-79 | 6,885 | 6,886 | 6,887 |
| 2-80 | 6,888 | 6,889 | 6,890 |
| 2-81 | 6,891 | 6,892 | 6,893 |
| 2-82 | 6,894 | 6,895 | 6,896 |
| 2-83 | 6,897 | 6,898 | 6,899 |
| 2-84 | 6,900 | 6,901 | 6,902 |
| 2-85 | 6,903 | 6,904 | 6,905 |
| 2-86 | 6,906 | 6,907 | 6,908 |
| 2-87 | 6,909 | 6,910 | 6,911 |
| 2-88 | 6,912 | 6,913 | 6,914 |
| 2-89 | 6,915 | 6,916 | 6,917 |
| 2-90 | 6,918 | 6,919 | 6,920 |
| 2-91 | 6,921 | 6,922 | 6,923 |
| 2-92 | 6,924 | 6,925 | 6,926 |
| 2-93 | 6,927 | 6,928 | 6,929 |
| 2-94 | 6,930 | 6,931 | 6,932 |
| 2-95 | 6,933 | 6,934 | 6,935 |
| 2-96 | 6,936 | 6,937 | 6,938 |
| 2-97 | 6,939 | 6,940 | 6,941 |
| 2-98 | 6,942 | 6,943 | 6,944 |
| 2-99 | 6,945 | 6,946 | 6,947 |
| 2-100 | 6,948 | 6,949 | 6,950 |
| 2-101 | 6,951 | 6,952 | 6,953 |
| 2-102 | 6,954 | 6,955 | 6,956 |
| 2-103 | 6,957 | 6,958 | 6,959 |
| 2-104 | 6,960 | 6,961 | 6,962 |
| 2-105 | 6,963 | 6,964 | 6,965 |
| 2-106 | 6,966 | 6,967 | 6,968 |
| 2-107 | 6,969 | 6,970 | 6,971 |
| 2-108 | 6,972 | 6,973 | 6,974 |
| 2-109 | 6,975 | 6,976 | 6,977 |
| 2-110 | 6,978 | 6,979 | 6,980 |
| 2-111 | 6,981 | 6,982 | 6,983 |
| 2-112 | 6,984 | 6,985 | 6,986 |
| 2-113 | 6,987 | 6,988 | 6,989 |
| 2-114 | 6,990 | 6,991 | 6,992 |
| 2-115 | 6,993 | 6,994 | 6,995 |
| 2-116 | 6,996 | 6,997 | 6,998 |
| 2-117 | 6,999 | 7,000 | 7,001 |
| 2-118 | 7,002 | 7,003 | 7,004 |
| 2-119 | 7,005 | 7,006 | 7,007 |
| 2-120 | 7,008 | 7,009 | 7,010 |
| 2-121 | 7,011 | 7,012 | 7,013 |
| 2-122 | 7,014 | 7,015 | 7,016 |
| 2-123 | 7,017 | 7,018 | 7,019 |
| 2-124 | 7,020 | 7,021 | 7,022 |
| 2-125 | 7,023 | 7,024 | 7,025 |
| 2-126 | 7,026 | 7,027 | 7,028 |
| 2-127 | 7,029 | 7,030 | 7,031 |
| 2-128 | 7,032 | 7,033 | 7,034 |
| 2-129 | 7,035 | 7,036 | 7,037 |
| 2-130 | 7,038 | 7,039 | 7,040 |
| 2-131 | 7,041 | 7,042 | 7,043 |
| 2-132 | 7,044 | 7,045 | 7,046 |
| 2-133 | 7,047 | 7,048 | 7,049 |

TABLE 8

| | | Compound represented by the formula (1) | | | | | | | | | | |
|---|---|---|---|---|---|---|---|---|---|---|---|---|
| | | 1-54 | 1-55 | 1-56 | 1-57 | 1-58 | 1-59 | 1-60 | 1-61 | 1-62 | 1-63 | 1-64 |
| Compound | 2-1 | 7,050 | 7,051 | 7,052 | 7,053 | 7,054 | 7,055 | 7,056 | 7,057 | 7,058 | 7,059 | 7,060 |
| represented | 2-2 | 7,072 | 7,073 | 7,074 | 7,075 | 7,076 | 7,077 | 7,078 | 7,079 | 7,080 | 7,081 | 7,082 |
| by the | 2-3 | 7,094 | 7,095 | 7,096 | 7,097 | 7,098 | 7,099 | 7,100 | 7,101 | 7,102 | 7,103 | 7,104 |
| formula | 2-4 | 7,116 | 7,117 | 7,118 | 7,119 | 7,120 | 7,121 | 7,122 | 7,123 | 7,124 | 7,125 | 7,126 |
| (2) | 2-5 | 7,138 | 7,139 | 7,140 | 7,141 | 7,142 | 7,143 | 7,144 | 7,145 | 7,146 | 7,147 | 7,148 |
| | 2-6 | 7,160 | 7,161 | 7,162 | 7,163 | 7,164 | 7,165 | 7,166 | 7,167 | 7,168 | 7,169 | 7,170 |
| | 2-7 | 7,182 | 7,183 | 7,184 | 7,185 | 7,186 | 7,187 | 7,188 | 7,189 | 7,190 | 7,191 | 7,192 |
| | 2-8 | 7,204 | 7,205 | 7,206 | 7,207 | 7,208 | 7,209 | 7,210 | 7,211 | 7,212 | 7,213 | 7,214 |
| | 2-9 | 7,226 | 7,227 | 7,228 | 7,229 | 7,230 | 7,231 | 7,232 | 7,233 | 7,234 | 7,235 | 7,236 |
| | 2-10 | 7,248 | 7,249 | 7,250 | 7,251 | 7,252 | 7,253 | 7,254 | 7,255 | 7,256 | 7,257 | 7,258 |
| | 2-11 | 7,270 | 7,271 | 7,272 | 7,273 | 7,274 | 7,275 | 7,276 | 7,277 | 7,278 | 7,279 | 7,280 |
| | 2-12 | 7,292 | 7,293 | 7,294 | 7,295 | 7,296 | 7,297 | 7,298 | 7,299 | 7,300 | 7,301 | 7,302 |
| | 2-13 | 7,314 | 7,315 | 7,316 | 7,317 | 7,318 | 7,319 | 7,320 | 7,321 | 7,322 | 7,323 | 7,324 |
| | 2-14 | 7,336 | 7,337 | 7,338 | 7,339 | 7,340 | 7,341 | 7,342 | 7,343 | 7,344 | 7,345 | 7,346 |
| | 2-15 | 7,358 | 7,359 | 7,360 | 7,361 | 7,362 | 7,363 | 7,364 | 7,365 | 7,366 | 7,367 | 7,368 |
| | 2-16 | 7,380 | 7,381 | 7,382 | 7,383 | 7,384 | 7,385 | 7,386 | 7,387 | 7,388 | 7,389 | 7,390 |
| | 2-17 | 7,402 | 7,403 | 7,404 | 7,405 | 7,406 | 7,407 | 7,408 | 7,409 | 7,410 | 7,411 | 7,412 |
| | 2-18 | 7,424 | 7,425 | 7,426 | 7,427 | 7,428 | 7,429 | 7,430 | 7,431 | 7,432 | 7,433 | 7,434 |
| | 2-19 | 7,446 | 7,447 | 7,448 | 7,449 | 7,450 | 7,451 | 7,452 | 7,453 | 7,454 | 7,455 | 7,456 |
| | 2-20 | 7,468 | 7,469 | 7,470 | 7,471 | 7,472 | 7,473 | 7,474 | 7,475 | 7,476 | 7,477 | 7,478 |
| | 2-21 | 7,490 | 7,491 | 7,492 | 7,493 | 7,494 | 7,495 | 7,496 | 7,497 | 7,498 | 7,499 | 7,500 |
| | 2-22 | 7,512 | 7,513 | 7,514 | 7,515 | 7,516 | 7,517 | 7,518 | 7,519 | 7,520 | 7,521 | 7,522 |
| | 2-23 | 7,534 | 7,535 | 7,536 | 7,537 | 7,538 | 7,539 | 7,540 | 7,541 | 7,542 | 7,543 | 7,544 |
| | 2-24 | 7,556 | 7,557 | 7,558 | 7,559 | 7,560 | 7,561 | 7,562 | 7,563 | 7,564 | 7,565 | 7,566 |
| | 2-25 | 7,578 | 7,579 | 7,580 | 7,581 | 7,582 | 7,583 | 7,584 | 7,585 | 7,586 | 7,587 | 7,588 |
| | 2-26 | 7,600 | 7,601 | 7,602 | 7,603 | 7,604 | 7,605 | 7,606 | 7,607 | 7,608 | 7,609 | 7,610 |
| | 2-27 | 7,622 | 7,623 | 7,624 | 7,625 | 7,626 | 7,627 | 7,628 | 7,629 | 7,630 | 7,631 | 7,632 |
| | 2-28 | 7,644 | 7,645 | 7,646 | 7,647 | 7,648 | 7,649 | 7,650 | 7,651 | 7,652 | 7,653 | 7,654 |
| | 2-29 | 7,666 | 7,667 | 7,668 | 7,669 | 7,670 | 7,671 | 7,672 | 7,673 | 7,674 | 7,675 | 7,676 |

TABLE 8-continued

| | | Compound represented by the formula (1) | | | | | | | | | | |
|---|---|---|---|---|---|---|---|---|---|---|---|---|
| | | 1-65 | 1-66 | 1-67 | 1-68 | 1-69 | 1-70 | 1-71 | 1-72 | 1-73 | 1-74 | 1-75 |
| Compound | 2-1 | 7,061 | 7,062 | 7,063 | 7,064 | 7,065 | 7,066 | 7,067 | 7,068 | 7,069 | 7,070 | 7,071 |
| represented | 2-2 | 7,083 | 7,084 | 7,085 | 7,086 | 7,087 | 7,088 | 7,089 | 7,090 | 7,091 | 7,092 | 7,093 |
| by the | 2-3 | 7,105 | 7,106 | 7,107 | 7,108 | 7,109 | 7,110 | 7,111 | 7,112 | 7,113 | 7,114 | 7,115 |
| formula | 2-4 | 7,127 | 7,128 | 7,129 | 7,130 | 7,131 | 7,132 | 7,133 | 7,134 | 7,135 | 7,136 | 7,137 |
| (2) | 2-5 | 7,149 | 7,150 | 7,151 | 7,152 | 7,153 | 7,154 | 7,155 | 7,156 | 7,157 | 7,158 | 7,159 |
| | 2-6 | 7,171 | 7,172 | 7,173 | 7,174 | 7,175 | 7,176 | 7,177 | 7,178 | 7,179 | 7,180 | 7,181 |
| | 2-7 | 7,193 | 7,194 | 7,195 | 7,196 | 7,197 | 7,198 | 7,199 | 7,200 | 7,201 | 7,202 | 7,203 |
| | 2-8 | 7,215 | 7,216 | 7,217 | 7,218 | 7,219 | 7,220 | 7,221 | 7,222 | 7,223 | 7,224 | 7,225 |
| | 2-9 | 7,237 | 7,238 | 7,239 | 7,240 | 7,241 | 7,242 | 7,243 | 7,244 | 7,245 | 7,246 | 7,247 |
| | 2-10 | 7,259 | 7,260 | 7,261 | 7,262 | 7,263 | 7,264 | 7,265 | 7,266 | 7,267 | 7,268 | 7,269 |
| | 2-11 | 7,281 | 7,282 | 7,283 | 7,284 | 7,285 | 7,286 | 7,287 | 7,288 | 7,289 | 7,290 | 7,291 |
| | 2-12 | 7,303 | 7,304 | 7,305 | 7,306 | 7,307 | 7,308 | 7,309 | 7,310 | 7,311 | 7,312 | 7,313 |
| | 2-13 | 7,325 | 7,326 | 7,327 | 7,328 | 7,329 | 7,330 | 7,331 | 7,332 | 7,333 | 7,334 | 7,335 |
| | 2-14 | 7,347 | 7,348 | 7,349 | 7,350 | 7,351 | 7,352 | 7,353 | 7,354 | 7,355 | 7,356 | 7,357 |
| | 2-15 | 7,369 | 7,370 | 7,371 | 7,372 | 7,373 | 7,374 | 7,375 | 7,376 | 7,377 | 7,378 | 7,379 |
| | 2-16 | 7,391 | 7,392 | 7,393 | 7,394 | 7,395 | 7,396 | 7,397 | 7,398 | 7,399 | 7,400 | 7,401 |
| | 2-17 | 7,413 | 7,414 | 7,415 | 7,416 | 7,417 | 7,418 | 7,419 | 7,420 | 7,421 | 7,422 | 7,423 |
| | 2-18 | 7,435 | 7,436 | 7,437 | 7,438 | 7,439 | 7,440 | 7,441 | 7,442 | 7,443 | 7,444 | 7,445 |
| | 2-19 | 7,457 | 7,458 | 7,459 | 7,460 | 7,461 | 7,462 | 7,463 | 7,464 | 7,465 | 7,466 | 7,467 |
| | 2-20 | 7,479 | 7,480 | 7,481 | 7,482 | 7,483 | 7,484 | 7,485 | 7,486 | 7,487 | 7,488 | 7,489 |
| | 2-21 | 7,501 | 7,502 | 7,503 | 7,504 | 7,505 | 7,506 | 7,507 | 7,508 | 7,509 | 7,510 | 7,511 |
| | 2-22 | 7,523 | 7,524 | 7,525 | 7,526 | 7,527 | 7,528 | 7,529 | 7,530 | 7,531 | 7,532 | 7,533 |
| | 2-23 | 7,545 | 7,546 | 7,547 | 7,548 | 7,549 | 7,550 | 7,551 | 7,552 | 7,553 | 7,554 | 7,555 |
| | 2-24 | 7,567 | 7,568 | 7,569 | 7,570 | 7,571 | 7,572 | 7,573 | 7,574 | 7,575 | 7,576 | 7,577 |
| | 2-25 | 7,589 | 7,590 | 7,591 | 7,592 | 7,593 | 7,594 | 7,595 | 7,596 | 7,597 | 7,598 | 7,599 |
| | 2-26 | 7,611 | 7,612 | 7,613 | 7,614 | 7,615 | 7,616 | 7,617 | 7,618 | 7,619 | 7,620 | 7,621 |
| | 2-27 | 7,633 | 7,634 | 7,635 | 7,636 | 7,637 | 7,638 | 7,639 | 7,640 | 7,641 | 7,642 | 7,643 |
| | 2-28 | 7,655 | 7,656 | 7,657 | 7,658 | 7,659 | 7,660 | 7,661 | 7,662 | 7,663 | 7,664 | 7,665 |
| | 2-29 | 7,677 | 7,678 | 7,679 | 7,680 | 7,681 | 7,682 | 7,683 | 7,684 | 7,685 | 7,686 | 7,687 |

TABLE 9

| | | Compound represented by the formula (1) | | | | | | | | | | | | |
|---|---|---|---|---|---|---|---|---|---|---|---|---|---|---|
| | | 1-76 | 1-77 | 1-78 | 1-79 | 1-80 | 1-81 | 1-82 | 1-83 | 1-84 | 1-85 | 1-86 | 1-87 | 1-88 |
| Compound | 2-1 | 7,688 | 7,689 | 7,690 | 7,691 | 7,692 | 7,693 | 7,694 | 7,695 | 7,696 | 7,697 | 7,698 | 7,699 | 7,700 |
| represented | 2-2 | 7,713 | 7,714 | 7,715 | 7,716 | 7,717 | 7,718 | 7,719 | 7,720 | 7,721 | 7,722 | 7,723 | 7,724 | 7,725 |
| by the | 2-3 | 7,738 | 7,739 | 7,740 | 7,741 | 7,742 | 7,743 | 7,744 | 7,745 | 7,746 | 7,747 | 7,748 | 7,749 | 7,750 |
| formula | 2-4 | 7,763 | 7,764 | 7,765 | 7,766 | 7,767 | 7,768 | 7,769 | 7,770 | 7,771 | 7,772 | 7,773 | 7,774 | 7,775 |
| (2) | 2-5 | 7,788 | 7,789 | 7,790 | 7,791 | 7,792 | 7,793 | 7,794 | 7,795 | 7,796 | 7,797 | 7,798 | 7,799 | 7,800 |
| | 2-6 | 7,813 | 7,814 | 7,815 | 7,816 | 7,817 | 7,818 | 7,819 | 7,820 | 7,821 | 7,822 | 7,823 | 7,824 | 7,825 |
| | 2-7 | 7,838 | 7,839 | 7,840 | 7,841 | 7,842 | 7,843 | 7,844 | 7,845 | 7,846 | 7,847 | 7,848 | 7,849 | 7,850 |
| | 2-8 | 7,863 | 7,864 | 7,865 | 7,866 | 7,867 | 7,868 | 7,869 | 7,870 | 7,871 | 7,872 | 7,873 | 7,874 | 7,875 |
| | 2-9 | 7,888 | 7,889 | 7,890 | 7,891 | 7,892 | 7,893 | 7,894 | 7,895 | 7,896 | 7,897 | 7,898 | 7,899 | 7,900 |
| | 2-10 | 7,913 | 7,914 | 7,915 | 7,916 | 7,917 | 7,918 | 7,919 | 7,920 | 7,921 | 7,922 | 7,923 | 7,924 | 7,925 |
| | 2-11 | 7,938 | 7,939 | 7,940 | 7,941 | 7,942 | 7,943 | 7,944 | 7,945 | 7,946 | 7,947 | 7,948 | 7,949 | 7,950 |
| | 2-12 | 7,963 | 7,964 | 7,965 | 7,966 | 7,967 | 7,968 | 7,969 | 7,970 | 7,971 | 7,972 | 7,973 | 7,974 | 7,975 |
| | 2-13 | 7,988 | 7,989 | 7,990 | 7,991 | 7,992 | 7,993 | 7,994 | 7,995 | 7,996 | 7,997 | 7,998 | 7,999 | 8,000 |
| | 2-14 | 8,013 | 8,014 | 8,015 | 8,016 | 8,017 | 8,018 | 8,019 | 8,020 | 8,021 | 8,022 | 8,023 | 8,024 | 8,025 |
| | 2-15 | 8,038 | 8,039 | 8,040 | 8,041 | 8,042 | 8,043 | 8,044 | 8,045 | 8,046 | 8,047 | 8,048 | 8,049 | 8,050 |
| | 2-16 | 8,063 | 8,064 | 8,065 | 8,066 | 8,067 | 8,068 | 8,069 | 8,070 | 8,071 | 8,072 | 8,073 | 8,074 | 8,075 |
| | 2-17 | 8,088 | 8,089 | 8,090 | 8,091 | 8,092 | 8,093 | 8,094 | 8,095 | 8,096 | 8,097 | 8,098 | 8,099 | 8,100 |
| | 2-18 | 8,113 | 8,114 | 8,115 | 8,116 | 8,117 | 8,118 | 8,119 | 8,120 | 8,121 | 8,122 | 8,123 | 8,124 | 8,125 |
| | 2-19 | 8,138 | 8,139 | 8,140 | 8,141 | 8,142 | 8,143 | 8,144 | 8,145 | 8,146 | 8,147 | 8,148 | 8,149 | 8,150 |
| | 2-20 | 8,163 | 8,164 | 8,165 | 8,166 | 8,167 | 8,168 | 8,169 | 8,170 | 8,171 | 8,172 | 8,173 | 8,174 | 8,175 |
| | 2-21 | 8,188 | 8,189 | 8,190 | 8,191 | 8,192 | 8,193 | 8,194 | 8,195 | 8,196 | 8,197 | 8,198 | 8,199 | 8,200 |
| | 2-22 | 8,213 | 8,214 | 8,215 | 8,216 | 8,217 | 8,218 | 8,219 | 8,220 | 8,221 | 8,222 | 8,223 | 8,224 | 8,225 |
| | 2-23 | 8,238 | 8,239 | 8,240 | 8,241 | 8,242 | 8,243 | 8,244 | 8,245 | 8,246 | 8,247 | 8,248 | 8,249 | 8,250 |
| | 2-24 | 8,263 | 8,264 | 8,265 | 8,266 | 8,267 | 8,268 | 8,269 | 8,270 | 8,271 | 8,272 | 8,273 | 8,274 | 8,275 |
| | 2-25 | 8,288 | 8,289 | 8,290 | 8,291 | 8,292 | 8,293 | 8,294 | 8,295 | 8,296 | 8,297 | 8,298 | 8,299 | 8,300 |
| | 2-26 | 8,313 | 8,314 | 8,315 | 8,316 | 8,317 | 8,318 | 8,319 | 8,320 | 8,321 | 8,322 | 8,323 | 8,324 | 8,325 |
| | 2-27 | 8,338 | 8,339 | 8,340 | 8,341 | 8,342 | 8,343 | 8,344 | 8,345 | 8,346 | 8,347 | 8,348 | 8,349 | 8,350 |
| | 2-28 | 8,363 | 8,364 | 8,365 | 8,366 | 8,367 | 8,368 | 8,369 | 8,370 | 8,371 | 8,372 | 8,373 | 8,374 | 8,375 |
| | 2-29 | 8,388 | 8,389 | 8,390 | 8,391 | 8,392 | 8,393 | 8,394 | 8,395 | 8,396 | 8,397 | 8,398 | 8,399 | 8,400 |

TABLE 9-continued

| | | Compound represented by the formula (1) | | | | | | | | | | | |
|---|---|---|---|---|---|---|---|---|---|---|---|---|---|
| | | 1-89 | 1-90 | 1-91 | 1-92 | 1-93 | 1-94 | 1-95 | 1-96 | 1-97 | 1-98 | 1-99 | 1-100 |
| Compound represented by the formula (2) | 2-1 | 7,701 | 7,702 | 7,703 | 7,704 | 7,705 | 7,706 | 7,707 | 7,708 | 7,709 | 7,710 | 7,711 | 7,712 |
| | 2-2 | 7,726 | 7,727 | 7,728 | 7,729 | 7,730 | 7,731 | 7,732 | 7,733 | 7,734 | 7,735 | 7,736 | 7,737 |
| | 2-3 | 7,751 | 7,752 | 7,753 | 7,754 | 7,755 | 7,756 | 7,757 | 7,758 | 7,759 | 7,760 | 7,761 | 7,762 |
| | 2-4 | 7,776 | 7,777 | 7,778 | 7,779 | 7,780 | 7,781 | 7,782 | 7,783 | 7,784 | 7,785 | 7,786 | 7,787 |
| | 2-5 | 7,801 | 7,802 | 7,803 | 7,804 | 7,805 | 7,806 | 7,807 | 7,808 | 7,809 | 7,810 | 7,811 | 7,812 |
| | 2-6 | 7,826 | 7,827 | 7,828 | 7,829 | 7,830 | 7,831 | 7,832 | 7,833 | 7,834 | 7,835 | 7,836 | 7,837 |
| | 2-7 | 7,851 | 7,852 | 7,853 | 7,854 | 7,855 | 7,856 | 7,857 | 7,858 | 7,859 | 7,860 | 7,861 | 7,862 |
| | 2-8 | 7,876 | 7,877 | 7,878 | 7,879 | 7,880 | 7,881 | 7,882 | 7,883 | 7,884 | 7,885 | 7,886 | 7,887 |
| | 2-9 | 7,901 | 7,902 | 7,903 | 7,904 | 7,905 | 7,906 | 7,907 | 7,908 | 7,909 | 7,910 | 7,911 | 7,912 |
| | 2-10 | 7,926 | 7,927 | 7,928 | 7,929 | 7,930 | 7,931 | 7,932 | 7,933 | 7,934 | 7,935 | 7,936 | 7,937 |
| | 2-11 | 7,951 | 7,952 | 7,953 | 7,954 | 7,955 | 7,956 | 7,957 | 7,958 | 7,959 | 7,960 | 7,961 | 7,962 |
| | 2-12 | 7,976 | 7,977 | 7,978 | 7,979 | 7,980 | 7,981 | 7,982 | 7,983 | 7,984 | 7,985 | 7,986 | 7,987 |
| | 2-13 | 8,001 | 8,002 | 8,003 | 8,004 | 8,005 | 8,006 | 8,007 | 8,008 | 8,009 | 8,010 | 8,011 | 8,012 |
| | 2-14 | 8,026 | 8,027 | 8,028 | 8,029 | 8,030 | 8,031 | 8,032 | 8,033 | 8,034 | 8,035 | 8,036 | 8,037 |
| | 2-15 | 8,051 | 8,052 | 8,053 | 8,054 | 8,055 | 8,056 | 8,057 | 8,058 | 8,059 | 8,060 | 8,061 | 8,062 |
| | 2-16 | 8,076 | 8,077 | 8,078 | 8,079 | 8,080 | 8,081 | 8,082 | 8,083 | 8,084 | 8,085 | 8,086 | 8,087 |
| | 2-17 | 8,101 | 8,102 | 8,103 | 8,104 | 8,105 | 8,106 | 8,107 | 8,108 | 8,109 | 8,110 | 8,111 | 8,112 |
| | 2-18 | 8,126 | 8,127 | 8,128 | 8,129 | 8,130 | 8,131 | 8,132 | 8,133 | 8,134 | 8,135 | 8,136 | 8,137 |
| | 2-19 | 8,151 | 8,152 | 8,153 | 8,154 | 8,155 | 8,156 | 8,157 | 8,158 | 8,159 | 8,160 | 8,161 | 8,162 |
| | 2-20 | 8,176 | 8,177 | 8,178 | 8,179 | 8,180 | 8,181 | 8,182 | 8,183 | 8,184 | 8,185 | 8,186 | 8,187 |
| | 2-21 | 8,201 | 8,202 | 8,203 | 8,204 | 8,205 | 8,206 | 8,207 | 8,208 | 8,209 | 8,210 | 8,211 | 8,212 |
| | 2-22 | 8,226 | 8,227 | 8,228 | 8,229 | 8,230 | 8,231 | 8,232 | 8,233 | 8,234 | 8,235 | 8,236 | 8,237 |
| | 2-23 | 8,251 | 8,252 | 8,253 | 8,254 | 8,255 | 8,256 | 8,257 | 8,258 | 8,259 | 8,260 | 8,261 | 8,262 |
| | 2-24 | 8,276 | 8,277 | 8,278 | 8,279 | 8,280 | 8,281 | 8,282 | 8,283 | 8,284 | 8,285 | 8,286 | 8,287 |
| | 2-25 | 8,301 | 8,302 | 8,303 | 8,304 | 8,305 | 8,306 | 8,307 | 8,308 | 8,309 | 8,310 | 8,311 | 8,312 |
| | 2-26 | 8,326 | 8,327 | 8,328 | 8,329 | 8,330 | 8,331 | 8,332 | 8,333 | 8,334 | 8,335 | 8,336 | 8,337 |
| | 2-27 | 8,351 | 8,352 | 8,353 | 8,354 | 8,355 | 8,356 | 8,357 | 8,358 | 8,359 | 8,360 | 8,361 | 8,362 |
| | 2-28 | 8,376 | 8,377 | 8,378 | 8,379 | 8,380 | 8,381 | 8,382 | 8,383 | 8,384 | 8,385 | 8,386 | 8,387 |
| | 2-29 | 8,401 | 8,402 | 8,403 | 8,404 | 8,405 | 8,406 | 8,407 | 8,408 | 8,409 | 8,410 | 8,411 | 8,412 |

TABLE 10

| | | Compound represented by the formula (1) | | | | | | | | | | | | |
|---|---|---|---|---|---|---|---|---|---|---|---|---|---|---|
| | | 1-101 | 1-102 | 1-103 | 1-104 | 1-105 | 1-106 | 1-107 | 1-108 | 1-109 | 1-110 | 1-111 | 1-112 | 1-113 |
| Compound represented by the formula (2) | 2-1 | 8,413 | 8,414 | 8,415 | 8,416 | 8,417 | 8,418 | 8,419 | 8,420 | 8,421 | 8,422 | 8,423 | 8,424 | 8,425 |
| | 2-2 | 8,438 | 8,439 | 8,440 | 8,441 | 8,442 | 8,443 | 8,444 | 8,445 | 8,446 | 8,447 | 8,448 | 8,449 | 8,450 |
| | 2-3 | 8,463 | 8,464 | 8,465 | 8,466 | 8,467 | 8,468 | 8,469 | 8,470 | 8,471 | 8,472 | 8,473 | 8,474 | 8,475 |
| | 2-4 | 8,488 | 8,489 | 8,490 | 8,491 | 8,492 | 8,493 | 8,494 | 8,495 | 8,496 | 8,497 | 8,498 | 8,499 | 8,500 |
| | 2-5 | 8,513 | 8,514 | 8,515 | 8,516 | 8,517 | 8,518 | 8,519 | 8,520 | 8,521 | 8,522 | 8,523 | 8,524 | 8,525 |
| | 2-6 | 8,538 | 8,539 | 8,540 | 8,541 | 8,542 | 8,543 | 8,544 | 8,545 | 8,546 | 8,547 | 8,548 | 8,549 | 8,550 |
| | 2-7 | 8,563 | 8,564 | 8,565 | 8,566 | 8,567 | 8,568 | 8,569 | 8,570 | 8,571 | 8,572 | 8,573 | 8,574 | 8,575 |
| | 2-8 | 8,588 | 8,589 | 8,590 | 8,591 | 8,592 | 8,593 | 8,594 | 8,595 | 8,596 | 8,597 | 8,598 | 8,599 | 8,600 |
| | 2-9 | 8,613 | 8,614 | 8,615 | 8,616 | 8,617 | 8,618 | 8,619 | 8,620 | 8,621 | 8,622 | 8,623 | 8,624 | 8,625 |
| | 2-10 | 8,638 | 8,639 | 8,640 | 8,641 | 8,642 | 8,643 | 8,644 | 8,645 | 8,646 | 8,647 | 8,648 | 8,649 | 8,650 |
| | 2-11 | 8,663 | 8,664 | 8,665 | 8,666 | 8,667 | 8,668 | 8,669 | 8,670 | 8,671 | 8,672 | 8,673 | 8,674 | 8,675 |
| | 2-12 | 8,688 | 8,689 | 8,690 | 8,691 | 8,692 | 8,693 | 8,694 | 8,695 | 8,696 | 8,697 | 8,698 | 8,699 | 8,700 |
| | 2-13 | 8,713 | 8,714 | 8,715 | 8,716 | 8,717 | 8,718 | 8,719 | 8,720 | 8,721 | 8,722 | 8,723 | 8,724 | 8,725 |
| | 2-14 | 8,738 | 8,739 | 8,740 | 8,741 | 8,742 | 8,743 | 8,744 | 8,745 | 8,746 | 8,747 | 8,748 | 8,749 | 8,750 |
| | 2-15 | 8,763 | 8,764 | 8,765 | 8,766 | 8,767 | 8,768 | 8,769 | 8,770 | 8,771 | 8,772 | 8,773 | 8,774 | 8,775 |
| | 2-16 | 8,788 | 8,789 | 8,790 | 8,791 | 8,792 | 8,793 | 8,794 | 8,795 | 8,796 | 8,797 | 8,798 | 8,799 | 8,800 |
| | 2-17 | 8,813 | 8,814 | 8,815 | 8,816 | 8,817 | 8,818 | 8,819 | 8,820 | 8,821 | 8,822 | 8,823 | 8,824 | 8,825 |
| | 2-18 | 8,838 | 8,839 | 8,840 | 8,841 | 8,842 | 8,843 | 8,844 | 8,845 | 8,846 | 8,847 | 8,848 | 8,849 | 8,850 |
| | 2-19 | 8,863 | 8,864 | 8,865 | 8,866 | 8,867 | 8,868 | 8,869 | 8,870 | 8,871 | 8,872 | 8,873 | 8,874 | 8,875 |
| | 2-20 | 8,888 | 8,889 | 8,890 | 8,891 | 8,892 | 8,893 | 8,894 | 8,895 | 8,896 | 8,897 | 8,898 | 8,899 | 8,900 |
| | 2-21 | 8,913 | 8,914 | 8,915 | 8,916 | 8,917 | 8,918 | 8,919 | 8,920 | 8,921 | 8,922 | 8,923 | 8,924 | 8,925 |
| | 2-22 | 8,938 | 8,939 | 8,940 | 8,941 | 8,942 | 8,943 | 8,944 | 8,945 | 8,946 | 8,947 | 8,948 | 8,949 | 8,950 |
| | 2-23 | 8,963 | 8,964 | 8,965 | 8,966 | 8,967 | 8,968 | 8,969 | 8,970 | 8,971 | 8,972 | 8,973 | 8,974 | 8,975 |
| | 2-24 | 8,988 | 8,989 | 8,990 | 8,991 | 8,992 | 8,993 | 8,994 | 8,995 | 8,996 | 8,997 | 8,998 | 8,999 | 9,000 |
| | 2-25 | 9,013 | 9,014 | 9,015 | 9,016 | 9,017 | 9,018 | 9,019 | 9,020 | 9,021 | 9,022 | 9,023 | 9,024 | 9,025 |
| | 2-26 | 9,038 | 9,039 | 9,040 | 9,041 | 9,042 | 9,043 | 9,044 | 9,045 | 9,046 | 9,047 | 9,048 | 9,049 | 9,050 |
| | 2-27 | 9,063 | 9,064 | 9,065 | 9,066 | 9,067 | 9,068 | 9,069 | 9,070 | 9,071 | 9,072 | 9,073 | 9,074 | 9,075 |
| | 2-28 | 9,088 | 9,089 | 9,090 | 9,091 | 9,092 | 9,093 | 9,094 | 9,095 | 9,096 | 9,097 | 9,098 | 9,099 | 9,100 |
| | 2-29 | 9,113 | 9,114 | 9,115 | 9,116 | 9,117 | 9,118 | 9,119 | 9,120 | 9,121 | 9,122 | 9,123 | 9,124 | 9,125 |

| | | Compound represented by the formula (1) | | | | | | | | | | | |
|---|---|---|---|---|---|---|---|---|---|---|---|---|---|
| | | 1-114 | 1-115 | 1-116 | 1-117 | 1-118 | 1-119 | 1-120 | 1-121 | 1-122 | 1-123 | 1-124 | 1-125 |
| Compound represented by the | 2-1 | 8,426 | 8,427 | 8,428 | 8,429 | 8,430 | 8,431 | 8,432 | 8,433 | 8,434 | 8,435 | 8,436 | 8,437 |
| | 2-2 | 8,451 | 8,452 | 8,453 | 8,454 | 8,455 | 8,456 | 8,457 | 8,458 | 8,459 | 8,460 | 8,461 | 8,462 |
| | 2-3 | 8,476 | 8,477 | 8,478 | 8,479 | 8,480 | 8,481 | 8,482 | 8,483 | 8,484 | 8,485 | 8,486 | 8,487 |

TABLE 10-continued

| | | | | | | | | | | | | | |
|---|---|---|---|---|---|---|---|---|---|---|---|---|---|
| formula | 2-4 | 8,501 | 8,502 | 8,503 | 8,504 | 8,505 | 8,506 | 8,507 | 8,508 | 8,509 | 8,510 | 8,511 | 8,512 |
| (2) | 2-5 | 8,526 | 8,527 | 8,528 | 8,529 | 8,530 | 8,531 | 8,532 | 8,533 | 8,534 | 8,535 | 8,536 | 8,537 |
| | 2-6 | 8,551 | 8,552 | 8,553 | 8,554 | 8,555 | 8,556 | 8,557 | 8,558 | 8,559 | 8,560 | 8,561 | 8,562 |
| | 2-7 | 8,576 | 8,577 | 8,578 | 8,579 | 8,580 | 8,581 | 8,582 | 8,583 | 8,584 | 8,585 | 8,586 | 8,587 |
| | 2-8 | 8,601 | 8,602 | 8,603 | 8,604 | 8,605 | 8,606 | 8,607 | 8,608 | 8,609 | 8,610 | 8,611 | 8,612 |
| | 2-9 | 8,626 | 8,627 | 8,628 | 8,629 | 8,630 | 8,631 | 8,632 | 8,633 | 8,634 | 8,635 | 8,636 | 8,637 |
| | 2-10 | 8,651 | 8,652 | 8,653 | 8,654 | 8,655 | 8,656 | 8,657 | 8,658 | 8,659 | 8,660 | 8,661 | 8,662 |
| | 2-11 | 8,676 | 8,677 | 8,678 | 8,679 | 8,680 | 8,681 | 8,682 | 8,683 | 8,684 | 8,685 | 8,686 | 8,687 |
| | 2-12 | 8,701 | 8,702 | 8,703 | 8,704 | 8,705 | 8,706 | 8,707 | 8,708 | 8,709 | 8,710 | 8,711 | 8,712 |
| | 2-13 | 8,726 | 8,727 | 8,728 | 8,729 | 8,730 | 8,731 | 8,732 | 8,733 | 8,734 | 8,735 | 8,736 | 8,737 |
| | 2-14 | 8,751 | 8,752 | 8,753 | 8,754 | 8,755 | 8,756 | 8,757 | 8,758 | 8,759 | 8,760 | 8,761 | 8,762 |
| | 2-15 | 8,776 | 8,777 | 8,778 | 8,779 | 8,780 | 8,781 | 8,782 | 8,783 | 8,784 | 8,785 | 8,786 | 8,787 |
| | 2-16 | 8,801 | 8,802 | 8,803 | 8,804 | 8,805 | 8,806 | 8,807 | 8,808 | 8,809 | 8,810 | 8,811 | 8,812 |
| | 2-17 | 8,826 | 8,827 | 8,828 | 8,829 | 8,830 | 8,831 | 8,832 | 8,833 | 8,834 | 8,835 | 8,836 | 8,837 |
| | 2-18 | 8,851 | 8,852 | 8,853 | 8,854 | 8,855 | 8,856 | 8,857 | 8,858 | 8,859 | 8,860 | 8,861 | 8,862 |
| | 2-19 | 8,876 | 8,877 | 8,878 | 8,879 | 8,880 | 8,881 | 8,882 | 8,883 | 8,884 | 8,885 | 8,886 | 8,887 |
| | 2-20 | 8,901 | 8,902 | 8,903 | 8,904 | 8,905 | 8,906 | 8,907 | 8,908 | 8,909 | 8,910 | 8,911 | 8,912 |
| | 2-21 | 8,926 | 8,927 | 8,928 | 8,929 | 8,930 | 8,931 | 8,932 | 8,933 | 8,934 | 8,935 | 8,936 | 8,937 |
| | 2-22 | 8,951 | 8,952 | 8,953 | 8,954 | 8,955 | 8,956 | 8,957 | 8,958 | 8,959 | 8,960 | 8,961 | 8,962 |
| | 2-23 | 8,976 | 8,977 | 8,978 | 8,979 | 8,980 | 8,981 | 8,982 | 8,983 | 8,984 | 8,985 | 8,986 | 8,987 |
| | 2-24 | 9,001 | 9,002 | 9,003 | 9,004 | 9,005 | 9,006 | 9,007 | 9,008 | 9,009 | 9,010 | 9,011 | 9,012 |
| | 2-25 | 9,026 | 9,027 | 9,028 | 9,029 | 9,030 | 9,031 | 9,032 | 9,033 | 9,034 | 9,035 | 9,036 | 9,037 |
| | 2-26 | 9,051 | 9,052 | 9,053 | 9,054 | 9,055 | 9,056 | 9,057 | 9,058 | 9,059 | 9,060 | 9,061 | 9,062 |
| | 2-27 | 9,076 | 9,077 | 9,078 | 9,079 | 9,080 | 9,081 | 9,082 | 9,083 | 9,084 | 9,085 | 9,086 | 9,087 |
| | 2-28 | 9,101 | 9,102 | 9,103 | 9,104 | 9,105 | 9,106 | 9,107 | 9,108 | 9,109 | 9,110 | 9,111 | 9,112 |
| | 2-29 | 9,126 | 9,127 | 9,128 | 9,129 | 9,130 | 9,131 | 9,132 | 9,133 | 9,134 | 9,135 | 9,136 | 9,137 |

TABLE 11

| | | Compound represented by the formula (1) | | | | | | | | | | | | |
|---|---|---|---|---|---|---|---|---|---|---|---|---|---|---|
| | | 1-126 | 1-127 | 1-128 | 1-129 | 1-130 | 1-131 | 1-132 | 1-133 | 1-134 | 1-135 | 1-136 | 1-137 | 1-138 |
| Compound | 2-1 | 9,138 | 9,139 | 9,140 | 9,141 | 9,142 | 9,143 | 9,144 | 9,145 | 9,146 | 9,147 | 9,148 | 9,149 | 9,150 |
| represented | 2-2 | 9,163 | 9,164 | 9,165 | 9,166 | 9,167 | 9,168 | 9,169 | 9,170 | 9,171 | 9,172 | 9,173 | 9,174 | 9,175 |
| by the | 2-3 | 9,188 | 9,189 | 9,190 | 9,191 | 9,192 | 9,193 | 9,194 | 9,195 | 9,196 | 9,197 | 9,198 | 9,199 | 9,200 |
| formula | 2-4 | 9,213 | 9,214 | 9,215 | 9,216 | 9,217 | 9,218 | 9,219 | 9,220 | 9,221 | 9,222 | 9,223 | 9,224 | 9,225 |
| (2) | 2-5 | 9,238 | 9,239 | 9,240 | 9,241 | 9,242 | 9,243 | 9,244 | 9,245 | 9,246 | 9,247 | 9,248 | 9,249 | 9,250 |
| | 2-6 | 9,263 | 9,264 | 9,265 | 9,266 | 9,267 | 9,268 | 9,269 | 9,270 | 9,271 | 9,272 | 9,273 | 9,274 | 9,275 |
| | 2-7 | 9,288 | 9,289 | 9,290 | 9,291 | 9,292 | 9,293 | 9,294 | 9,295 | 9,296 | 9,297 | 9,298 | 9,299 | 9,300 |
| | 2-8 | 9,313 | 9,314 | 9,315 | 9,316 | 9,317 | 9,318 | 9,319 | 9,320 | 9,321 | 9,322 | 9,323 | 9,324 | 9,325 |
| | 2-9 | 9,338 | 9,339 | 9,340 | 9,341 | 9,342 | 9,343 | 9,344 | 9,345 | 9,346 | 9,347 | 9,348 | 9,349 | 9,350 |
| | 2-10 | 9,363 | 9,364 | 9,365 | 9,366 | 9,367 | 9,368 | 9,369 | 9,370 | 9,371 | 9,372 | 9,373 | 9,374 | 9,375 |
| | 2-11 | 9,388 | 9,389 | 9,390 | 9,391 | 9,392 | 9,393 | 9,394 | 9,395 | 9,396 | 9,397 | 9,398 | 9,399 | 9,400 |
| | 2-12 | 9,413 | 9,414 | 9,415 | 9,416 | 9,417 | 9,418 | 9,419 | 9,420 | 9,421 | 9,422 | 9,423 | 9,424 | 9,425 |
| | 2-13 | 9,438 | 9,439 | 9,440 | 9,441 | 9,442 | 9,443 | 9,444 | 9,445 | 9,446 | 9,447 | 9,448 | 9,449 | 9,450 |
| | 2-14 | 9,463 | 9,464 | 9,465 | 9,466 | 9,467 | 9,468 | 9,469 | 9,470 | 9,471 | 9,472 | 9,473 | 9,474 | 9,475 |
| | 2-15 | 9,488 | 9,489 | 9,490 | 9,491 | 9,492 | 9,493 | 9,494 | 9,495 | 9,496 | 9,497 | 9,498 | 9,499 | 9,500 |
| | 2-16 | 9,513 | 9,514 | 9,515 | 9,516 | 9,517 | 9,518 | 9,519 | 9,520 | 9,521 | 9,522 | 9,523 | 9,524 | 9,525 |
| | 2-17 | 9,538 | 9,539 | 9,540 | 9,541 | 9,542 | 9,543 | 9,544 | 9,545 | 9,546 | 9,547 | 9,548 | 9,549 | 9,550 |
| | 2-18 | 9,563 | 9,564 | 9,565 | 9,566 | 9,567 | 9,568 | 9,569 | 9,570 | 9,571 | 9,572 | 9,573 | 9,574 | 9,575 |
| | 2-19 | 9,588 | 9,589 | 9,590 | 9,591 | 9,592 | 9,593 | 9,594 | 9,595 | 9,596 | 9,597 | 9,598 | 9,599 | 9,600 |
| | 2-20 | 9,613 | 9,614 | 9,615 | 9,616 | 9,617 | 9,618 | 9,619 | 9,620 | 9,621 | 9,622 | 9,623 | 9,624 | 9,625 |
| | 2-21 | 9,638 | 9,639 | 9,640 | 9,641 | 9,642 | 9,643 | 9,644 | 9,645 | 9,646 | 9,647 | 9,648 | 9,649 | 9,650 |
| | 2-22 | 9,663 | 9,664 | 9,665 | 9,666 | 9,667 | 9,668 | 9,669 | 9,670 | 9,671 | 9,672 | 9,673 | 9,674 | 9,675 |
| | 2-23 | 9,688 | 9,689 | 9,690 | 9,691 | 9,692 | 9,693 | 9,694 | 9,695 | 9,696 | 9,697 | 9,698 | 9,699 | 9,700 |
| | 2-24 | 9,713 | 9,714 | 9,715 | 9,716 | 9,717 | 9,718 | 9,719 | 9,720 | 9,721 | 9,722 | 9,723 | 9,724 | 9,725 |
| | 2-25 | 9,738 | 9,739 | 9,740 | 9,741 | 9,742 | 9,743 | 9,744 | 9,745 | 9,746 | 9,747 | 9,748 | 9,749 | 9,750 |
| | 2-26 | 9,763 | 9,764 | 9,765 | 9,766 | 9,767 | 9,768 | 9,769 | 9,770 | 9,771 | 9,772 | 9,773 | 9,774 | 9,775 |
| | 2-27 | 9,788 | 9,789 | 9,790 | 9,791 | 9,792 | 9,793 | 9,794 | 9,795 | 9,796 | 9,797 | 9,798 | 9,799 | 9,800 |
| | 2-28 | 9,813 | 9,814 | 9,815 | 9,816 | 9,817 | 9,818 | 9,819 | 9,820 | 9,821 | 9,822 | 9,823 | 9,824 | 9,825 |
| | 2-29 | 9,838 | 9,839 | 9,840 | 9,841 | 9,842 | 9,843 | 9,844 | 9,845 | 9,846 | 9,847 | 9,848 | 9,849 | 9,850 |

| | | Compound represented by the formula (1) | | | | | | | | | | | |
|---|---|---|---|---|---|---|---|---|---|---|---|---|---|
| | | 1-139 | 1-140 | 1-141 | 1-142 | 1-143 | 1-144 | 1-145 | 1-146 | 1-147 | 1-148 | 1-149 | 1-150 |
| Compound | 2-1 | 9,151 | 9,152 | 9,153 | 9,154 | 9,155 | 9,156 | 9,157 | 9,158 | 9,159 | 9,160 | 9,161 | 9,162 |
| represented | 2-2 | 9,176 | 9,177 | 9,178 | 9,179 | 9,180 | 9,181 | 9,182 | 9,183 | 9,184 | 9,185 | 9,186 | 9,187 |
| by the | 2-3 | 9,201 | 9,202 | 9,203 | 9,204 | 9,205 | 9,206 | 9,207 | 9,208 | 9,209 | 9,210 | 9,211 | 9,212 |
| formula | 2-4 | 9,226 | 9,227 | 9,228 | 9,229 | 9,230 | 9,231 | 9,232 | 9,233 | 9,234 | 9,235 | 9,236 | 9,237 |
| (2) | 2-5 | 9,251 | 9,252 | 9,253 | 9,254 | 9,255 | 9,256 | 9,257 | 9,258 | 9,259 | 9,260 | 9,261 | 9,262 |
| | 2-6 | 9,276 | 9,277 | 9,278 | 9,279 | 9,280 | 9,281 | 9,282 | 9,283 | 9,284 | 9,285 | 9,286 | 9,287 |
| | 2-7 | 9,301 | 9,302 | 9,303 | 9,304 | 9,305 | 9,306 | 9,307 | 9,308 | 9,309 | 9,310 | 9,311 | 9,312 |
| | 2-8 | 9,326 | 9,327 | 9,328 | 9,329 | 9,330 | 9,331 | 9,332 | 9,333 | 9,334 | 9,335 | 9,336 | 9,337 |
| | 2-9 | 9,351 | 9,352 | 9,353 | 9,354 | 9,355 | 9,356 | 9,357 | 9,358 | 9,359 | 9,360 | 9,361 | 9,362 |
| | 2-10 | 9,376 | 9,377 | 9,378 | 9,379 | 9,380 | 9,381 | 9,382 | 9,383 | 9,384 | 9,385 | 9,386 | 9,387 |

TABLE 11-continued

| | | | | | | | | | | | | |
|---|---|---|---|---|---|---|---|---|---|---|---|---|
| 2-11 | 9,401 | 9,402 | 9,403 | 9,404 | 9,405 | 9,406 | 9,407 | 9,408 | 9,409 | 9,410 | 9,411 | 9,412 |
| 2-12 | 9,426 | 9,427 | 9,428 | 9,429 | 9,430 | 9,431 | 9,432 | 9,433 | 9,434 | 9,435 | 9,436 | 9,437 |
| 2-13 | 9,451 | 9,452 | 9,453 | 9,454 | 9,455 | 9,456 | 9,457 | 9,458 | 9,459 | 9,460 | 9,461 | 9,462 |
| 2-14 | 9,476 | 9,477 | 9,478 | 9,479 | 9,480 | 9,481 | 9,482 | 9,483 | 9,484 | 9,485 | 9,486 | 9,487 |
| 2-15 | 9,501 | 9,502 | 9,503 | 9,504 | 9,505 | 9,506 | 9,507 | 9,508 | 9,509 | 9,510 | 9,511 | 9,512 |
| 2-16 | 9,526 | 9,527 | 9,528 | 9,529 | 9,530 | 9,531 | 9,532 | 9,533 | 9,534 | 9,535 | 9,536 | 9,537 |
| 2-17 | 9,551 | 9,552 | 9,553 | 9,554 | 9,555 | 9,556 | 9,557 | 9,558 | 9,559 | 9,560 | 9,561 | 9,562 |
| 2-18 | 9,576 | 9,577 | 9,578 | 9,579 | 9,580 | 9,581 | 9,582 | 9,583 | 9,584 | 9,585 | 9,586 | 9,587 |
| 2-19 | 9,601 | 9,602 | 9,603 | 9,604 | 9,605 | 9,606 | 9,607 | 9,608 | 9,609 | 9,610 | 9,611 | 9,612 |
| 2-20 | 9,626 | 9,627 | 9,628 | 9,629 | 9,630 | 9,631 | 9,632 | 9,633 | 9,634 | 9,635 | 9,636 | 9,637 |
| 2-21 | 9,651 | 9,652 | 9,653 | 9,654 | 9,655 | 9,656 | 9,657 | 9,658 | 9,659 | 9,660 | 9,661 | 9,662 |
| 2-22 | 9,676 | 9,677 | 9,678 | 9,679 | 9,680 | 9,681 | 9,682 | 9,683 | 9,684 | 9,685 | 9,686 | 9,687 |
| 2-23 | 9,701 | 9,702 | 9,703 | 9,704 | 9,705 | 9,706 | 9,707 | 9,708 | 9,709 | 9,710 | 9,711 | 9,712 |
| 2-24 | 9,726 | 9,727 | 9,728 | 9,729 | 9,730 | 9,731 | 9,732 | 9,733 | 9,734 | 9,735 | 9,736 | 9,737 |
| 2-25 | 9,751 | 9,752 | 9,753 | 9,754 | 9,755 | 9,756 | 9,757 | 9,758 | 9,759 | 9,760 | 9,761 | 9,762 |
| 2-26 | 9,776 | 9,777 | 9,778 | 9,779 | 9,780 | 9,781 | 9,782 | 9,783 | 9,784 | 9,785 | 9,786 | 9,787 |
| 2-27 | 9,801 | 9,802 | 9,803 | 9,804 | 9,805 | 9,806 | 9,807 | 9,808 | 9,809 | 9,810 | 9,811 | 9,812 |
| 2-28 | 9,826 | 9,827 | 9,828 | 9,829 | 9,830 | 9,831 | 9,832 | 9,833 | 9,834 | 9,835 | 9,836 | 9,837 |
| 2-29 | 9,851 | 9,852 | 9,853 | 9,854 | 9,855 | 9,856 | 9,857 | 9,858 | 9,859 | 9,860 | 9,861 | 9,862 |

TABLE 12

| | | Compound represented by the formula (1) | | | | | | | | | | | | |
|---|---|---|---|---|---|---|---|---|---|---|---|---|---|---|
| | | 1-151 | 1-152 | 1-153 | 1-154 | 1-155 | 1-156 | 1-157 | 1-158 | 1-159 | 1-160 | 1-161 | 1-162 | 1-163 |
| Compound | 2-1 | 9,863 | 9,864 | 9,865 | 9,866 | 9,867 | 9,868 | 9,869 | 9,870 | 9,871 | 9,872 | 9,873 | 9,874 | 9,875 |
| represented | 2-2 | 9,888 | 9,889 | 9,890 | 9,891 | 9,892 | 9,893 | 9,894 | 9,895 | 9,896 | 9,897 | 9,898 | 9,899 | 9,900 |
| by the | 2-3 | 9,913 | 9,914 | 9,915 | 9,916 | 9,917 | 9,918 | 9,919 | 9,920 | 9,921 | 9,922 | 9,923 | 9,924 | 9,925 |
| formula | 2-4 | 9,938 | 9,939 | 9,940 | 9,941 | 9,942 | 9,943 | 9,944 | 9,945 | 9,946 | 9,947 | 9,948 | 9,949 | 9,950 |
| (2) | 2-5 | 9,963 | 9,964 | 9,965 | 9,966 | 9,967 | 9,968 | 9,969 | 9,970 | 9,971 | 9,972 | 9,973 | 9,974 | 9,975 |
| | 2-6 | 9,988 | 9,989 | 9,990 | 9,991 | 9,992 | 9,993 | 9,994 | 9,995 | 9,996 | 9,997 | 9,998 | 9,999 | 10,000 |
| | 2-7 | 10,013 | 10,014 | 10,015 | 10,016 | 10,017 | 10,018 | 10,019 | 10,020 | 10,021 | 10,022 | 10,023 | 10,024 | 10,025 |
| | 2-8 | 10,038 | 10,039 | 10,040 | 10,041 | 10,042 | 10,043 | 10,044 | 10,045 | 10,046 | 10,047 | 10,048 | 10,049 | 10,050 |
| | 2-9 | 10,063 | 10,064 | 10,065 | 10,066 | 10,067 | 10,068 | 10,069 | 10,070 | 10,071 | 10,072 | 10,073 | 10,074 | 10,075 |
| | 2-10 | 10,088 | 10,089 | 10,090 | 10,091 | 10,092 | 10,093 | 10,094 | 10,095 | 10,096 | 10,097 | 10,098 | 10,099 | 10,100 |
| | 2-11 | 10,113 | 10,114 | 10,115 | 10,116 | 10,117 | 10,118 | 10,119 | 10,120 | 10,121 | 10,122 | 10,123 | 10,124 | 10,125 |
| | 2-12 | 10,138 | 10,139 | 10,140 | 10,141 | 10,142 | 10,143 | 10,144 | 10,145 | 10,146 | 10,147 | 10,148 | 10,149 | 10,150 |
| | 2-13 | 10,163 | 10,164 | 10,165 | 10,166 | 10,167 | 10,168 | 10,169 | 10,170 | 10,171 | 10,172 | 10,173 | 10,174 | 10,175 |
| | 2-14 | 10,188 | 10,189 | 10,190 | 10,191 | 10,192 | 10,193 | 10,194 | 10,195 | 10,196 | 10,197 | 10,198 | 10,199 | 10,200 |
| | 2-15 | 10,213 | 10,214 | 10,215 | 10,216 | 10,217 | 10,218 | 10,219 | 10,220 | 10,221 | 10,222 | 10,223 | 10,224 | 10,225 |
| | 2-16 | 10,238 | 10,239 | 10,240 | 10,241 | 10,242 | 10,243 | 10,244 | 10,245 | 10,246 | 10,247 | 10,248 | 10,249 | 10,250 |
| | 2-17 | 10,263 | 10,264 | 10,265 | 10,266 | 10,267 | 10,268 | 10,269 | 10,270 | 10,271 | 10,272 | 10,273 | 10,274 | 10,275 |
| | 2-18 | 10,288 | 10,289 | 10,290 | 10,291 | 10,292 | 10,293 | 10,294 | 10,295 | 10,296 | 10,297 | 10,298 | 10,299 | 10,300 |
| | 2-19 | 10,313 | 10,314 | 10,315 | 10,316 | 10,317 | 10,318 | 10,319 | 10,320 | 10,321 | 10,322 | 10,323 | 10,324 | 10,325 |
| | 2-20 | 10,338 | 10,339 | 10,340 | 10,341 | 10,342 | 10,343 | 10,344 | 10,345 | 10,346 | 10,347 | 10,348 | 10,349 | 10,350 |
| | 2-21 | 10,363 | 10,364 | 10,365 | 10,366 | 10,367 | 10,368 | 10,369 | 10,370 | 10,371 | 10,372 | 10,373 | 10,374 | 10,375 |
| | 2-22 | 10,388 | 10,389 | 10,390 | 10,391 | 10,392 | 10,393 | 10,394 | 10,395 | 10,396 | 10,397 | 10,398 | 10,399 | 10,400 |
| | 2-23 | 10,413 | 10,414 | 10,415 | 10,416 | 10,417 | 10,418 | 10,419 | 10,420 | 10,421 | 10,422 | 10,423 | 10,424 | 10,425 |
| | 2-24 | 10,438 | 10,439 | 10,440 | 10,441 | 10,442 | 10,443 | 10,444 | 10,445 | 10,446 | 10,447 | 10,448 | 10,449 | 10,450 |
| | 2-25 | 10,463 | 10,464 | 10,465 | 10,466 | 10,467 | 10,468 | 10,469 | 10,470 | 10,471 | 10,472 | 10,473 | 10,474 | 10,475 |
| | 2-26 | 10,488 | 10,489 | 10,490 | 10,491 | 10,492 | 10,493 | 10,494 | 10,495 | 10,496 | 10,497 | 10,498 | 10,499 | 10,500 |
| | 2-27 | 10,513 | 10,514 | 10,515 | 10,516 | 10,517 | 10,518 | 10,519 | 10,520 | 10,521 | 10,522 | 10,523 | 10,524 | 10,525 |
| | 2-28 | 10,538 | 10,539 | 10,540 | 10,541 | 10,542 | 10,543 | 10,544 | 10,545 | 10,546 | 10,547 | 10,548 | 10,549 | 10,550 |
| | 2-29 | 10,563 | 10,564 | 10,565 | 10,566 | 10,567 | 10,568 | 10,569 | 10,570 | 10,571 | 10,572 | 10,573 | 10,574 | 10,575 |

| | | Compound represented by the formula (1) | | | | | | | | | | | |
|---|---|---|---|---|---|---|---|---|---|---|---|---|---|
| | | 1-164 | 1-165 | 1-166 | 1-167 | 1-168 | 1-169 | 1-170 | 1-171 | 1-172 | 1-173 | 1-174 | 1-175 |
| Compound | 2-1 | 9,876 | 9,877 | 9,878 | 9,879 | 9,880 | 9,881 | 9,882 | 9,883 | 9,884 | 9,885 | 9,886 | 9,887 |
| represented | 2-2 | 9,901 | 9,902 | 9,903 | 9,904 | 9,905 | 9,906 | 9,907 | 9,908 | 9,909 | 9,910 | 9,911 | 9,912 |
| by the | 2-3 | 9,926 | 9,927 | 9,928 | 9,929 | 9,930 | 9,931 | 9,932 | 9,933 | 9,934 | 9,935 | 9,936 | 9,937 |
| formula | 2-4 | 9,951 | 9,952 | 9,953 | 9,954 | 9,955 | 9,956 | 9,957 | 9,958 | 9,959 | 9,960 | 9,961 | 9,962 |
| (2) | 2-5 | 9,976 | 9,977 | 9,978 | 9,979 | 9,980 | 9,981 | 9,982 | 9,983 | 9,984 | 9,985 | 9,986 | 9,987 |
| | 2-6 | 10,001 | 10,002 | 10,003 | 10,004 | 10,005 | 10,006 | 10,007 | 10,008 | 10,009 | 10,010 | 10,011 | 10,012 |
| | 2-7 | 10,026 | 10,027 | 10,028 | 10,029 | 10,030 | 10,031 | 10,032 | 10,033 | 10,034 | 10,035 | 10,036 | 10,037 |
| | 2-8 | 10,051 | 10,052 | 10,053 | 10,054 | 10,055 | 10,056 | 10,057 | 10,058 | 10,059 | 10,060 | 10,061 | 10,062 |
| | 2-9 | 10,076 | 10,077 | 10,078 | 10,079 | 10,080 | 10,081 | 10,082 | 10,083 | 10,084 | 10,085 | 10,086 | 10,087 |
| | 2-10 | 10,101 | 10,102 | 10,103 | 10,104 | 10,105 | 10,106 | 10,107 | 10,108 | 10,109 | 10,110 | 10,111 | 10,112 |
| | 2-11 | 10,126 | 10,127 | 10,128 | 10,129 | 10,130 | 10,131 | 10,132 | 10,133 | 10,134 | 10,135 | 10,136 | 10,137 |
| | 2-12 | 10,151 | 10,152 | 10,153 | 10,154 | 10,155 | 10,156 | 10,157 | 10,158 | 10,159 | 10,160 | 10,161 | 10,162 |
| | 2-13 | 10,176 | 10,177 | 10,178 | 10,179 | 10,180 | 10,181 | 10,182 | 10,183 | 10,184 | 10,185 | 10,186 | 10,187 |
| | 2-14 | 10,201 | 10,202 | 10,203 | 10,204 | 10,205 | 10,206 | 10,207 | 10,208 | 10,209 | 10,210 | 10,211 | 10,212 |
| | 2-15 | 10,226 | 10,227 | 10,228 | 10,229 | 10,230 | 10,231 | 10,232 | 10,233 | 10,234 | 10,235 | 10,236 | 10,237 |
| | 2-16 | 10,251 | 10,252 | 10,253 | 10,254 | 10,255 | 10,256 | 10,257 | 10,258 | 10,259 | 10,260 | 10,261 | 10,262 |
| | 2-17 | 10,276 | 10,277 | 10,278 | 10,279 | 10,280 | 10,281 | 10,282 | 10,283 | 10,284 | 10,285 | 10,286 | 10,287 |

TABLE 12-continued

| | | | | | | | | | | | | |
|---|---|---|---|---|---|---|---|---|---|---|---|---|
| 2-18 | 10,301 | 10,302 | 10,303 | 10,304 | 10,305 | 10,306 | 10,307 | 10,308 | 10,309 | 10,310 | 10,311 | 10,312 |
| 2-19 | 10,326 | 10,327 | 10,328 | 10,329 | 10,330 | 10,331 | 10,332 | 10,333 | 10,334 | 10,335 | 10,336 | 10,337 |
| 2-20 | 10,351 | 10,352 | 10,353 | 10,354 | 10,355 | 10,356 | 10,357 | 10,358 | 10,359 | 10,360 | 10,361 | 10,362 |
| 2-21 | 10,376 | 10,377 | 10,378 | 10,379 | 10,380 | 10,381 | 10,382 | 10,383 | 10,384 | 10,385 | 10,386 | 10,387 |
| 2-22 | 10,401 | 10,402 | 10,403 | 10,404 | 10,405 | 10,406 | 10,407 | 10,408 | 10,409 | 10,410 | 10,411 | 10,412 |
| 2-23 | 10,426 | 10,427 | 10,428 | 10,429 | 10,430 | 10,431 | 10,432 | 10,433 | 10,434 | 10,435 | 10,436 | 10,437 |
| 2-24 | 10,451 | 10,452 | 10,453 | 10,454 | 10,455 | 10,456 | 10,457 | 10,458 | 10,459 | 10,460 | 10,461 | 10,462 |
| 2-25 | 10,476 | 10,477 | 10,478 | 10,479 | 10,480 | 10,481 | 10,482 | 10,483 | 10,484 | 10,485 | 10,486 | 10,487 |
| 2-26 | 10,501 | 10,502 | 10,503 | 10,504 | 10,505 | 10,506 | 10,507 | 10,508 | 10,509 | 10,510 | 10,511 | 10,512 |
| 2-27 | 10,526 | 10,527 | 10,528 | 10,529 | 10,530 | 10,531 | 10,532 | 10,533 | 10,534 | 10,535 | 10,536 | 10,537 |
| 2-28 | 10,551 | 10,552 | 10,553 | 10,554 | 10,555 | 10,556 | 10,557 | 10,558 | 10,559 | 10,560 | 10,561 | 10,562 |
| 2-29 | 10,576 | 10,577 | 10,578 | 10,579 | 10,580 | 10,581 | 10,582 | 10,583 | 10,584 | 10,585 | 10,586 | 10,587 |

TABLE 13

| | | Compound represented by the formula (1) | | | |
|---|---|---|---|---|---|
| | | 1-176 | 1-177 | 1-178 | 1-179 |
| Compound represented by the formula (2) | 2-1 | 10,588 | 10,589 | 10,590 | 10,591 |
| | 2-2 | 10,592 | 10,593 | 10,594 | 10,595 |
| | 2-3 | 10,596 | 10,597 | 10,598 | 10,599 |
| | 2-4 | 10,600 | 10,601 | 10,602 | 10,603 |
| | 2-5 | 10,604 | 10,605 | 10,606 | 10,607 |
| | 2-6 | 10,608 | 10,609 | 10,610 | 10,611 |
| | 2-7 | 10,612 | 10,613 | 10,614 | 10,615 |
| | 2-8 | 10,616 | 10,617 | 10,618 | 10,619 |
| | 2-8 | 10,620 | 10,621 | 10,622 | 10,623 |
| | 2-10 | 10,624 | 10,625 | 10,626 | 10,627 |
| | 2-11 | 10,628 | 10,629 | 10,630 | 10,631 |
| | 2-12 | 10,632 | 10,633 | 10,634 | 10,635 |
| | 2-13 | 10,636 | 10,637 | 10,638 | 10,639 |
| | 2-14 | 10,640 | 10,641 | 10,642 | 10,643 |
| | 2-15 | 10,644 | 10,645 | 10,646 | 10,647 |
| | 2-16 | 10,648 | 10,649 | 10,650 | 10,651 |
| | 2-17 | 10,652 | 10,653 | 10,654 | 10,655 |
| | 2-18 | 10,656 | 10,657 | 10,658 | 10,659 |
| | 2-19 | 10,660 | 10,661 | 10,662 | 10,663 |
| | 2-20 | 10,664 | 10,665 | 10,666 | 10,667 |
| | 2-21 | 10,668 | 10,669 | 10,670 | 10,671 |
| | 2-22 | 10,672 | 10,673 | 10,674 | 10,675 |
| | 2-23 | 10,676 | 10,677 | 10,678 | 10,679 |
| | 2-24 | 10,680 | 10,681 | 10,682 | 10,683 |
| | 2-25 | 10,684 | 10,685 | 10,686 | 10,687 |
| | 2-26 | 10,688 | 10,689 | 10,690 | 10,691 |
| | 2-27 | 10,692 | 10,693 | 10,694 | 10,695 |
| | 2-28 | 10,696 | 10,697 | 10,698 | 10,699 |
| | 2-29 | 10,700 | 10,701 | 10,702 | 10,703 |

(Dopant Material)

The dopant material used in the emitting layer of the organic EL device of an aspect of the invention is one or more compounds selected from the group consisting of a compound represented by the following formula (11), a compound represented by the following formula (21), a compound represented by the following formula (31), a compound represented by the following formula (41), a compound represented by the following formula (51), a compound represented by the following formula (61), a compound represented by the following formula (71), and a compound represented by the following formula (81).

(Compound Represented by Formula (11))

The compound represented by the formula (11) is explained below.

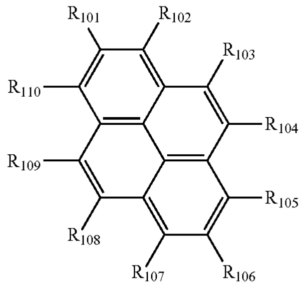

(11)

In the formula (11), one or more sets of two or more adjacent groups of $R_{101}$ to $R_{110}$ are bonded with each other to form a substituted or unsubstituted, saturated or unsaturated ring, or do not form a substituted or unsubstituted, saturated or unsaturated ring;

at least one of $R_{101}$ to $R_{110}$ is a monovalent group represented by the following formula (12);

$R_{101}$ to $R_{110}$ that do not form the substituted or unsubstituted, saturated or unsaturated ring and that are not a monovalent group represented by the following formula (12) are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (1).

(12)

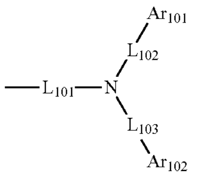

In the formula (12), $Ar_{101}$ and $Ar_{102}$ are independently a substituted or unsubstituted aryl group including 6 to 50 ring carbon atoms, or a substituted or unsubstituted monovalent heterocyclic group including 5 to 50 ring atoms; and $L_{101}$ to $L_{103}$ are independently a single bond, a substituted or unsubstituted arylene group including 6 to 30 ring carbon atoms, or a substituted or unsubstituted divalent heterocyclic group including 5 to 30 ring atoms.

In the formula (11), it is preferable that two of $R_{101}$ to $R_{110}$ are the group represented by the formula (12).

In one embodiment, the compound represented by the formula (11) is a compound represented by the following formula (13).

(13)

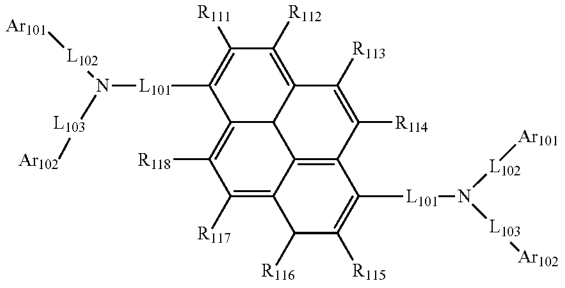

In the formula (13), $R_{111}$ to $R_{118}$ are the same as $R_{101}$ to $R_{110}$ that are not a monovalent group represented by the formula (12) in the formula (11); and $Ar_{101}$, $Ar_{102}$, $L_{101}$, $L_{102}$ and $L_{103}$ are as defined in the formula (12).

In the formula (11), $L_{101}$ is preferably a single bond and $L_{102}$ and $L_{103}$ are preferably a single bond.

In one embodiment, the compound represented by the formula (11) is a compound represented by the following formula (14) or (15).

(14)

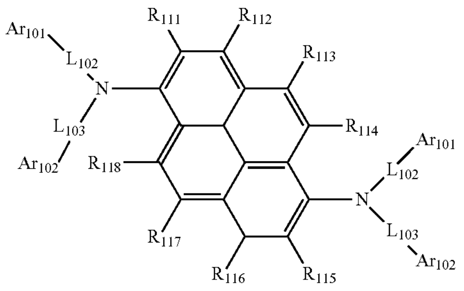

In the formula (14), $R_{111}$ to $R_{118}$ are as defined in the formula (13); and $Ar_{101}$, $Ar_{102}$, $L_{102}$ and $L_{103}$ are as defined in the formula (12).

(15)

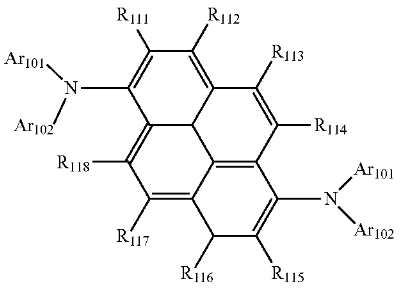

In the formula (15), $R_{111}$ to $R_{118}$ are as defined in the formula (13); and $Ar_{101}$ and $Ar_{102}$ are as defined in the formula (12).

In the formula (11) and the formula (12), it is preferable that at least one of $Ar_{101}$ and $Ar_{102}$ is a group represented by the following formula (16).

(16)

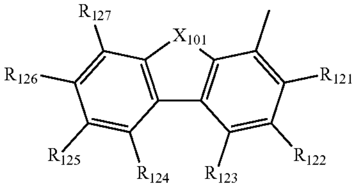

In the formula (16), $X_{101}$ is an oxygen atom or a sulfur atom;

one or more sets of two or more adjacent groups of $R_{121}$ to $R_{127}$ are bonded with each other to form a substituted or unsubstituted, saturated or unsaturated ring, or do not form a substituted or unsubstituted, saturated or unsaturated ring:

$R_{121}$ to $R_{127}$ that do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

It is preferable that $X_{101}$ is an oxygen atom.

It is preferable that at least one of $R_{121}$ to $R_{127}$ is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

It is preferable that in the formula (11) and the formula (12), $Ar_{101}$ is a group represented by the formula (16) and $Ar_{102}$ is a substituted or unsubstituted aryl group including 6 to 50 ring carbon atoms.

In one embodiment, the compound represented by the formula (11) is a compound represented by the following formula (17).

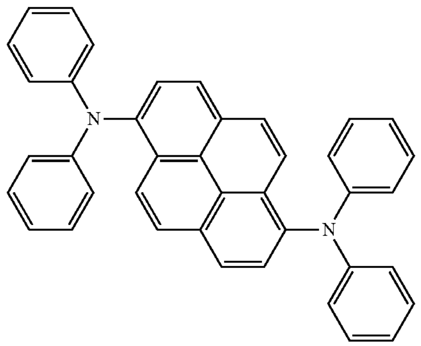

(17)

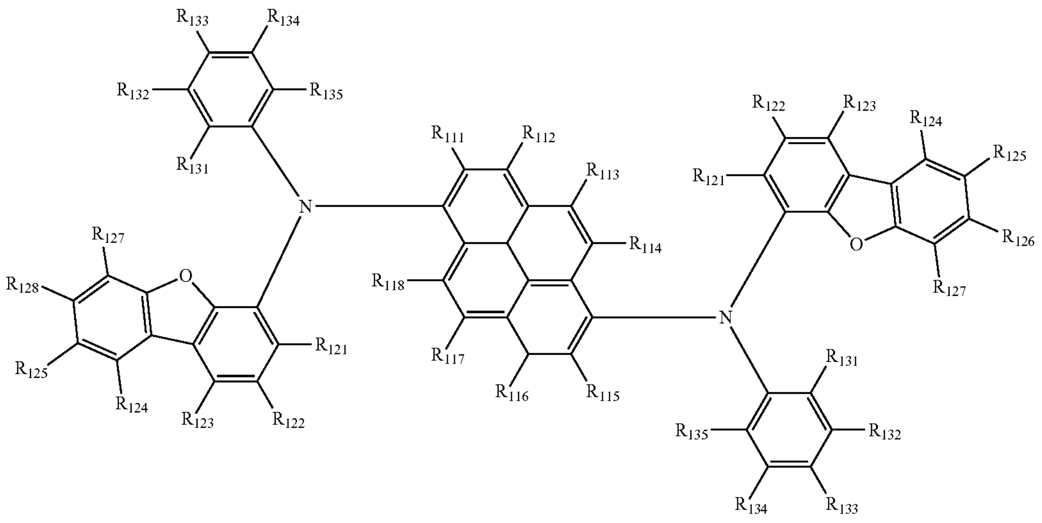

In the formula (17), $R_{111}$ to $R_{118}$ are as defined in the formula (13), and $R_{121}$ to $R_{127}$ are as defined in the formula (16);

$R_{131}$ to $R_{135}$ are independently a hydrogen atom, a substituted or unsubstituted alkyl group including 1 to 50 carbon atoms, a substituted or unsubstituted alkenyl group including 2 to 50 carbon atoms.

a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

As the compound represented by the formula (11), the following compounds can be given as specific examples, for example. In the following specific examples, Me represents a methyl group.

-continued

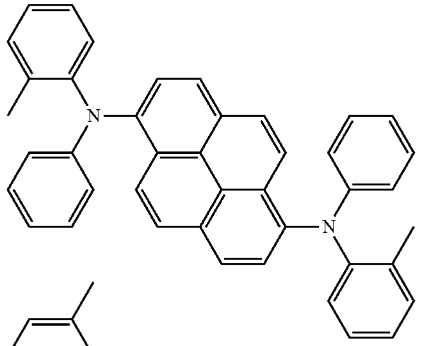

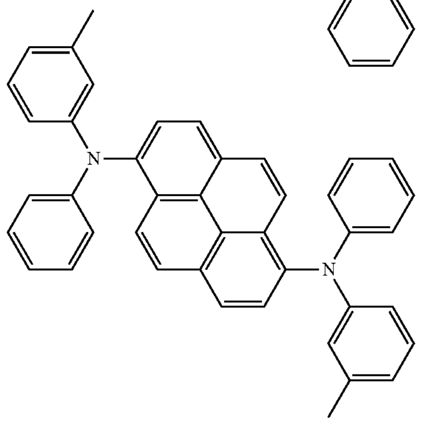

-continued
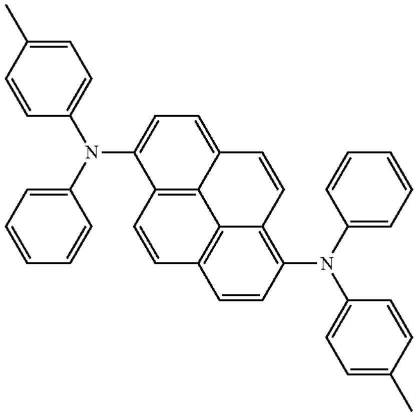
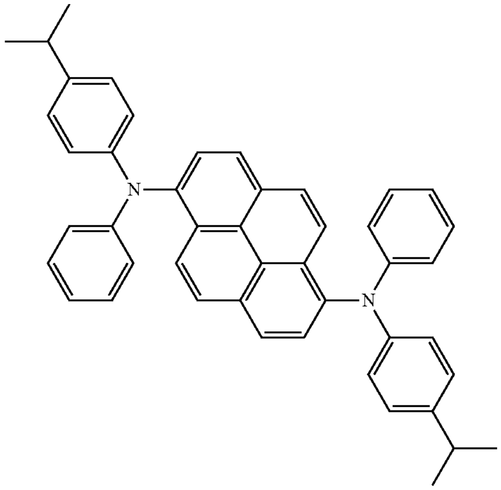
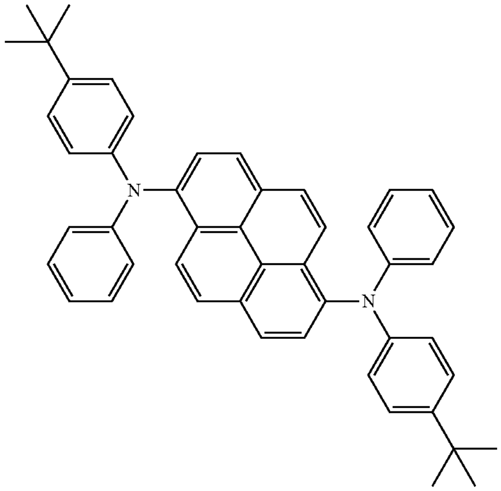
-continued
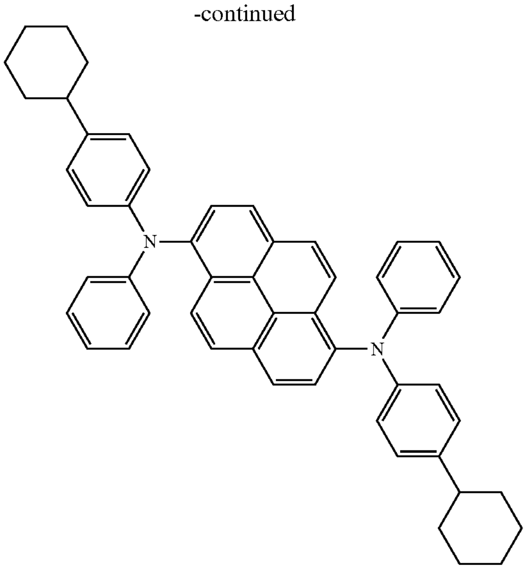
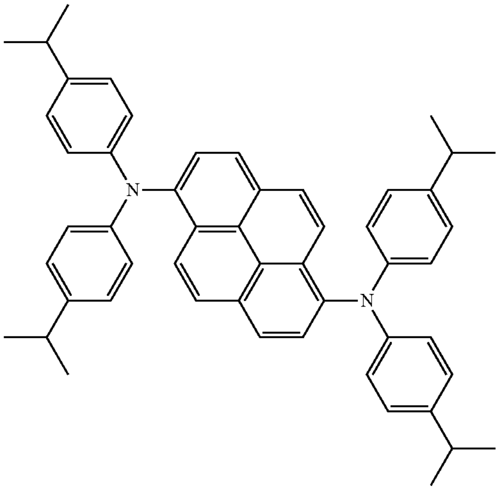
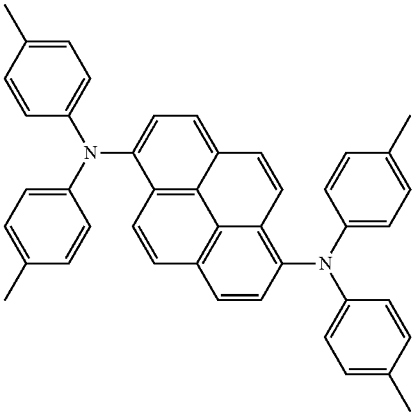

-continued
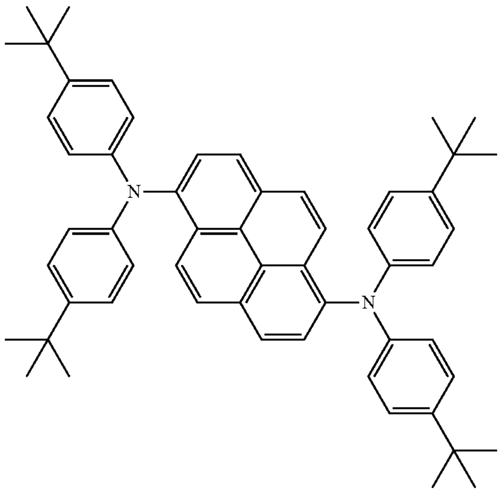
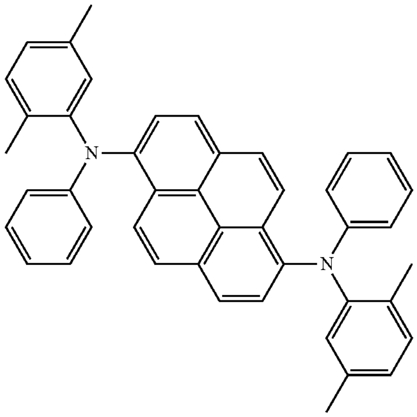
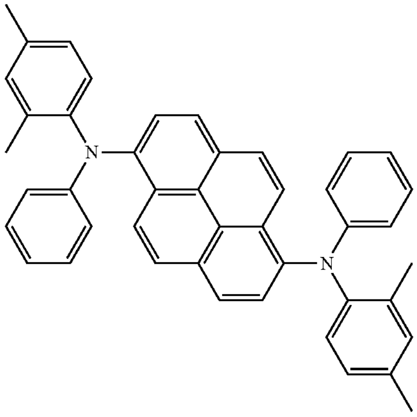
-continued
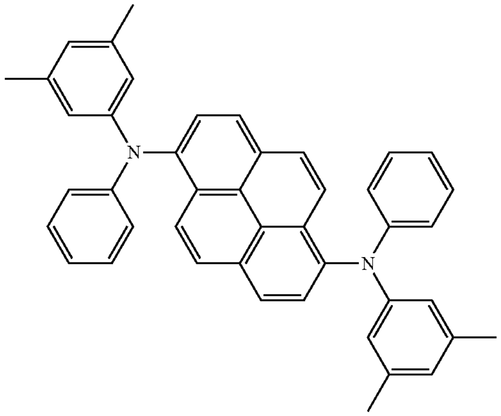
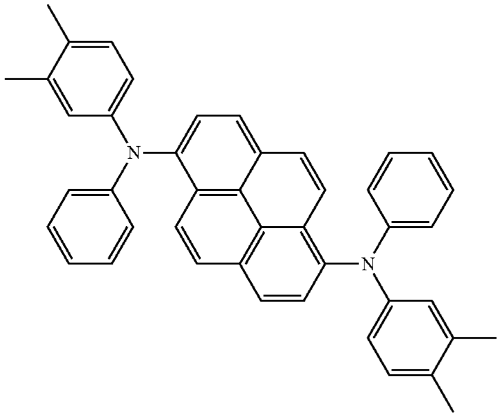
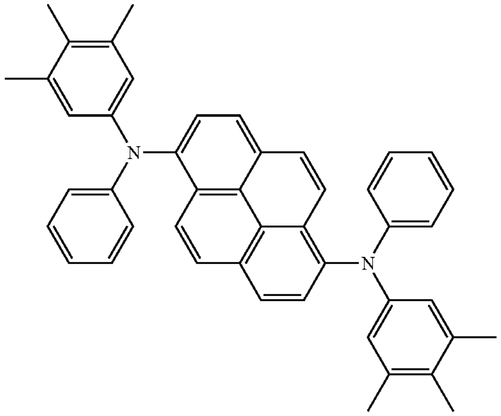
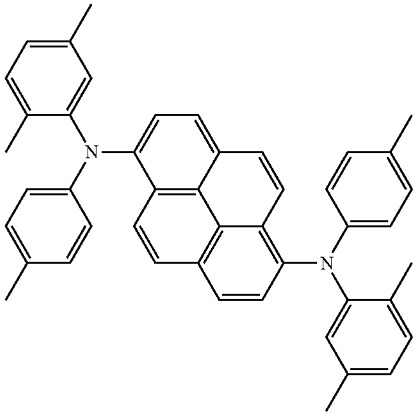

-continued
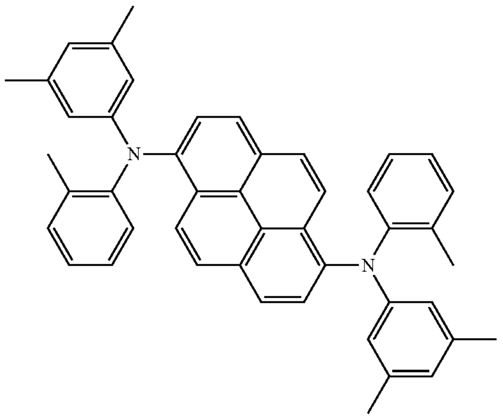
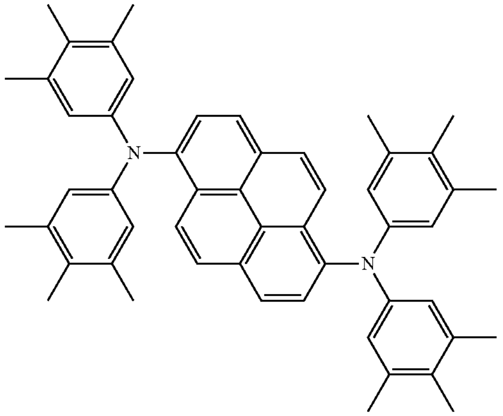
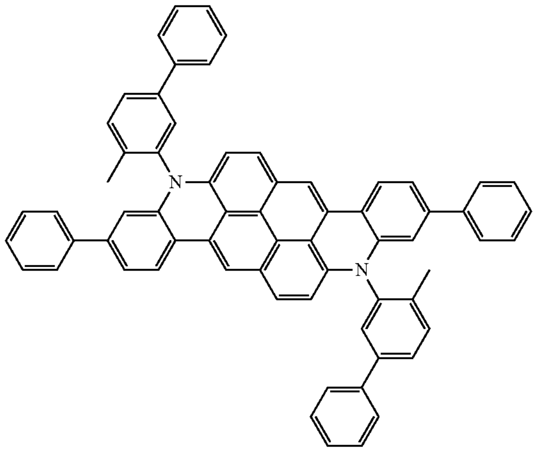
-continued
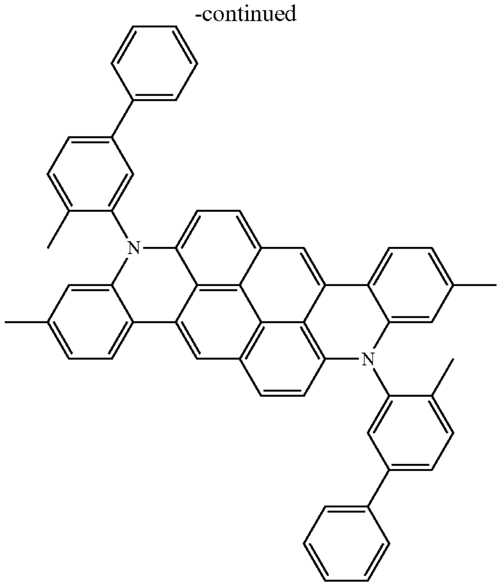
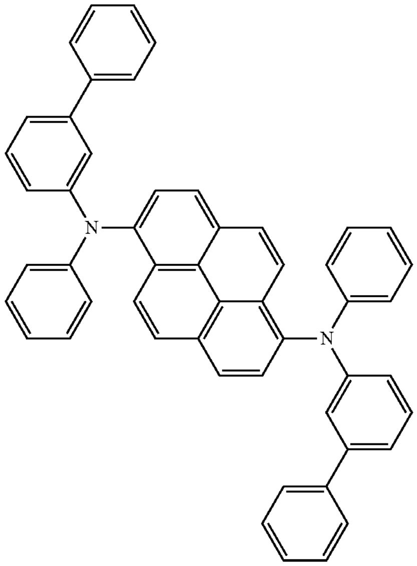
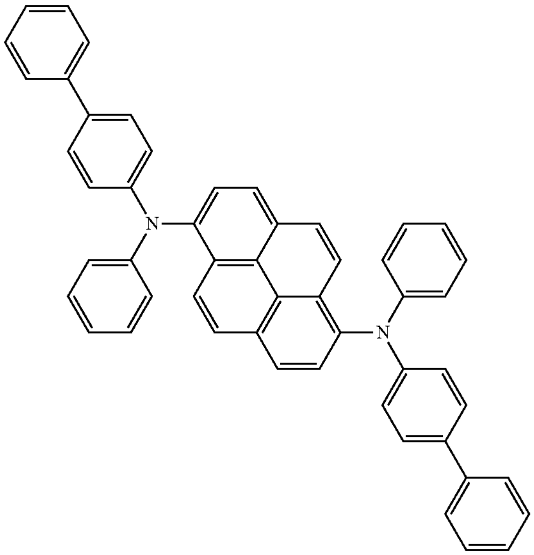

-continued
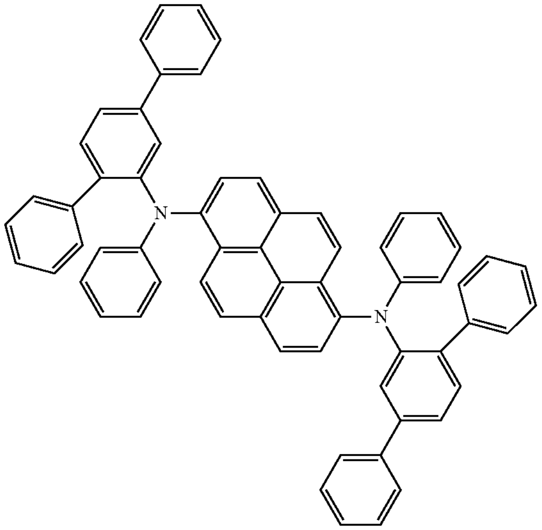
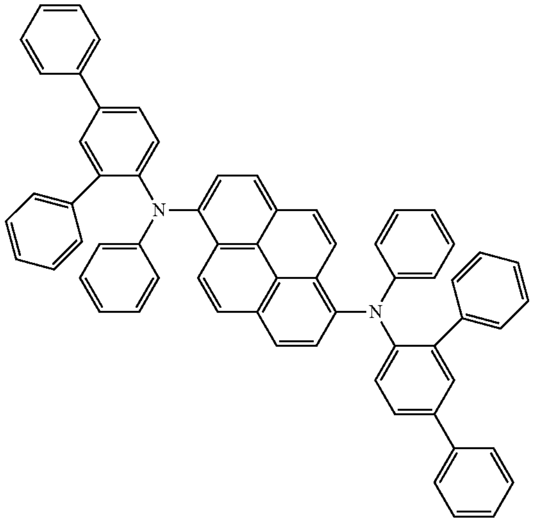
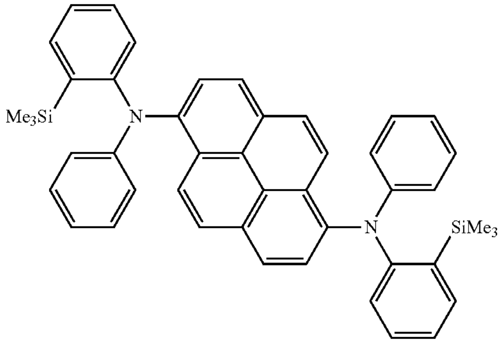
-continued
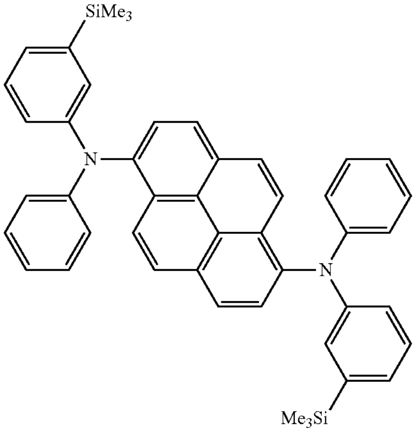
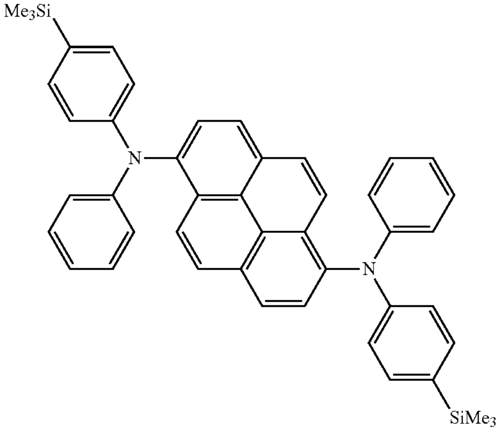
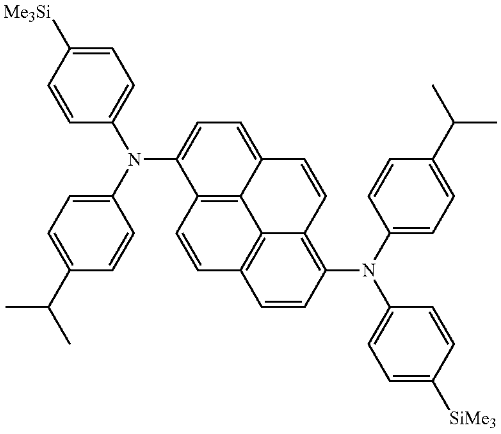
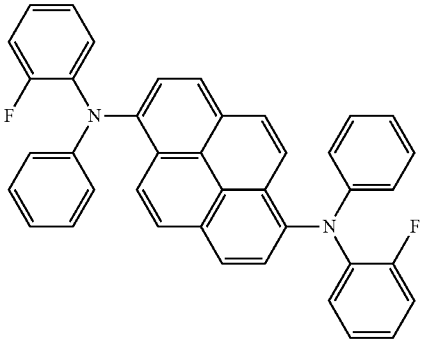

-continued
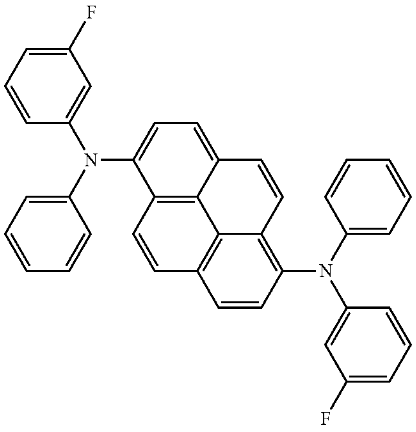
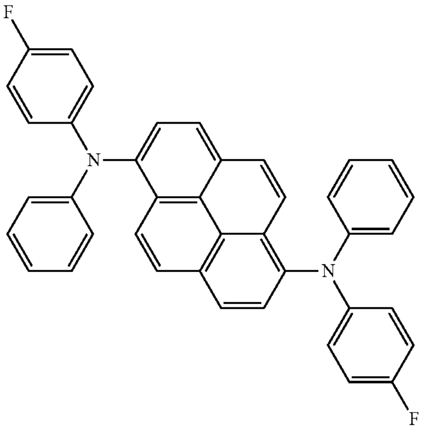
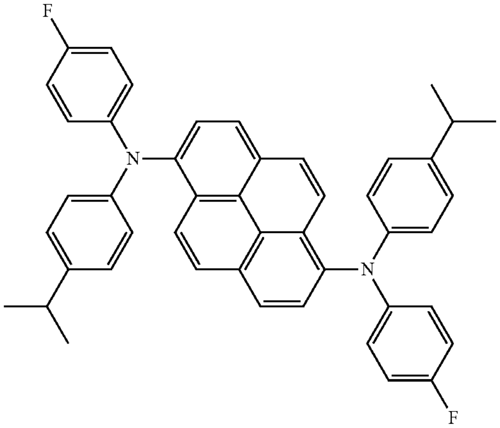
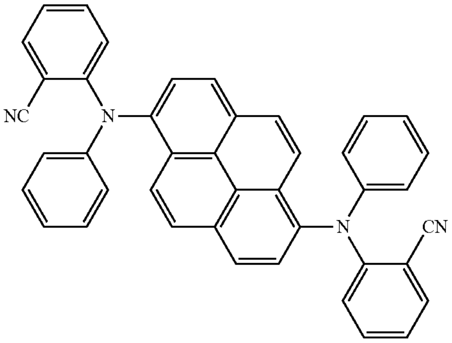
-continued
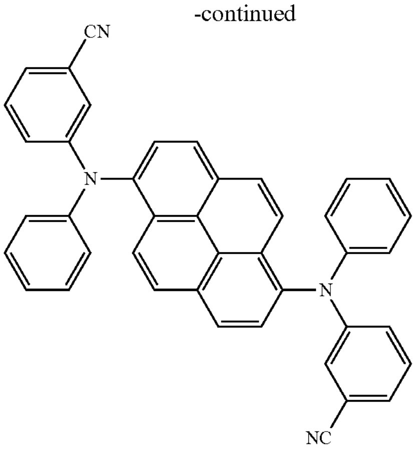
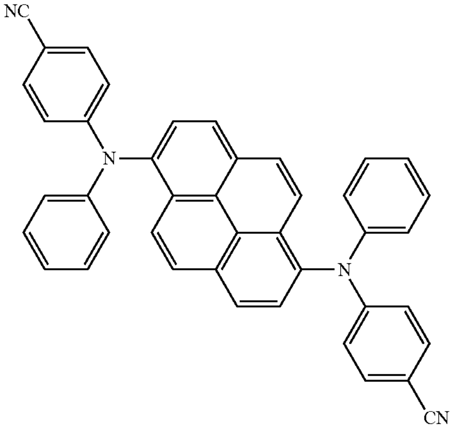
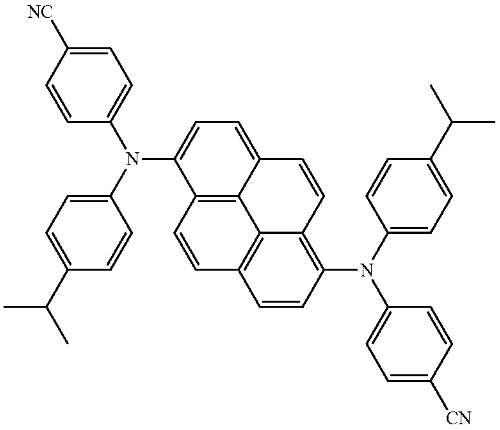
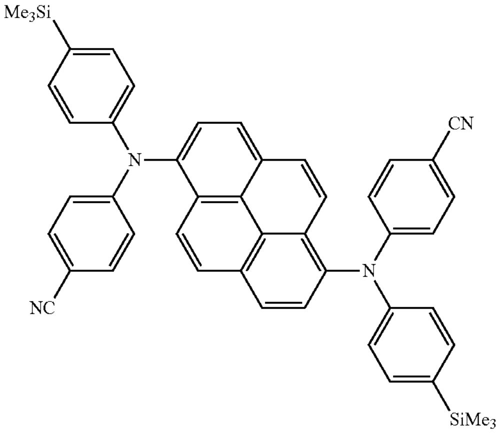

-continued
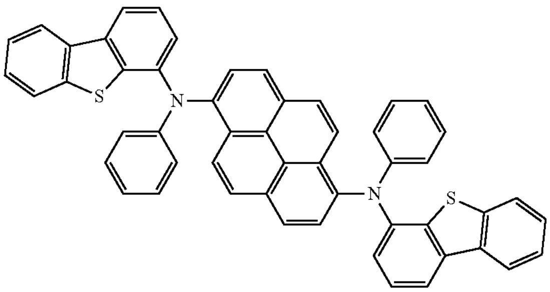
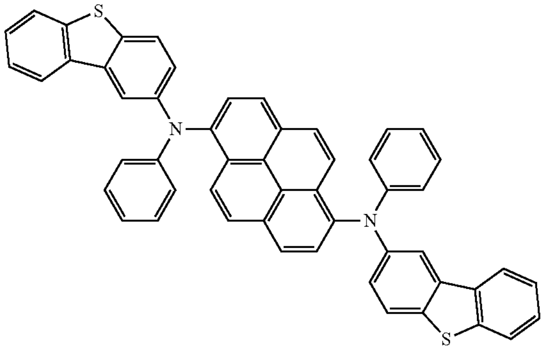
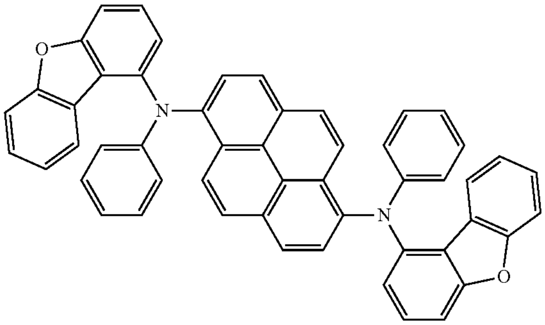
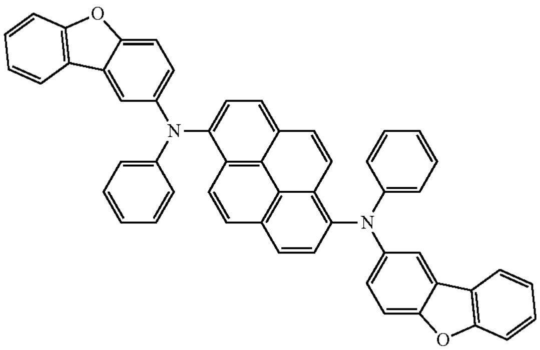
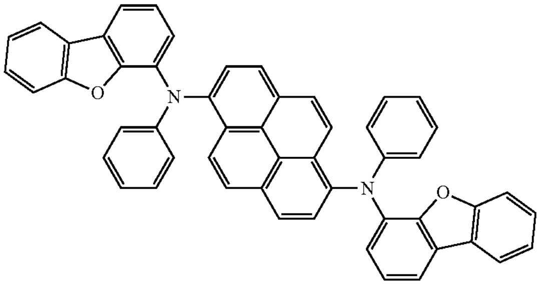
-continued
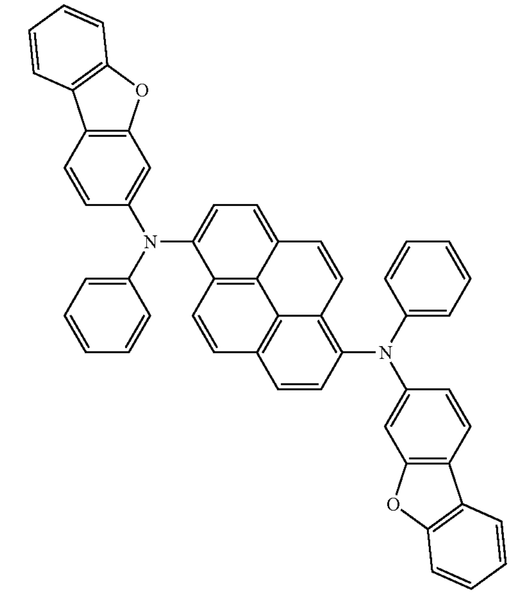
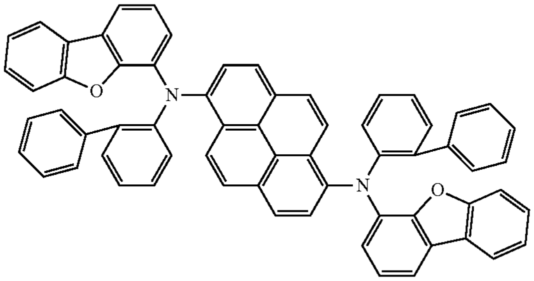
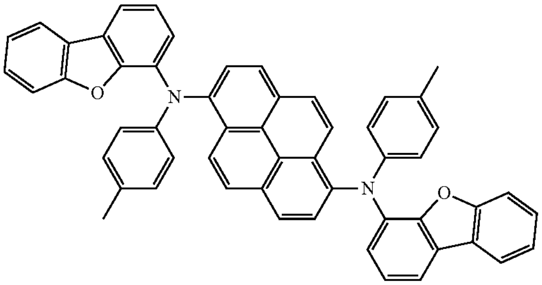
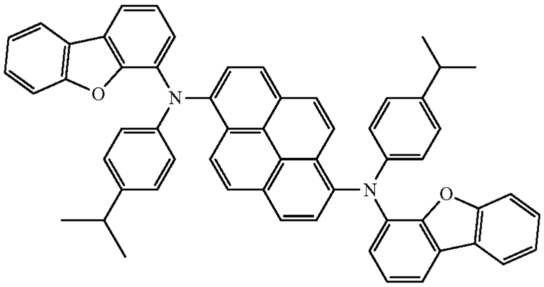
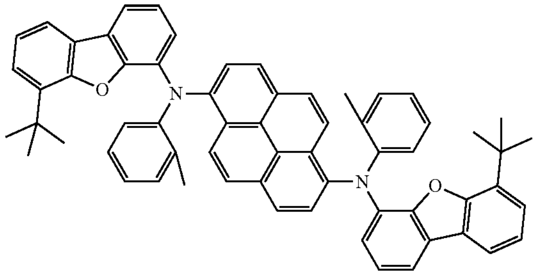

-continued
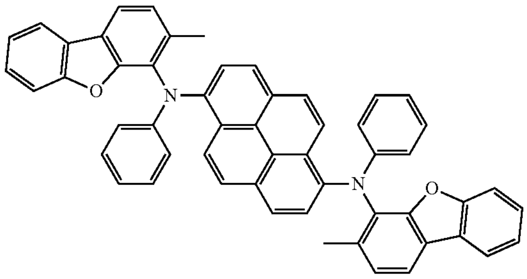
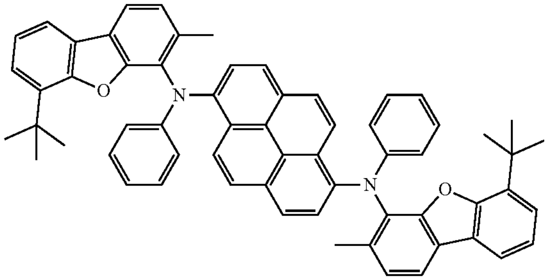
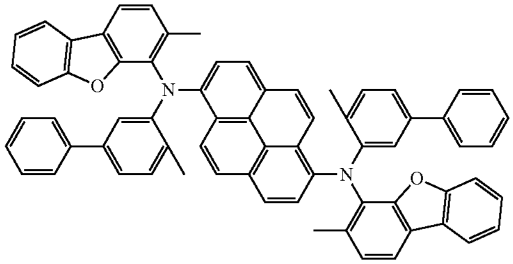
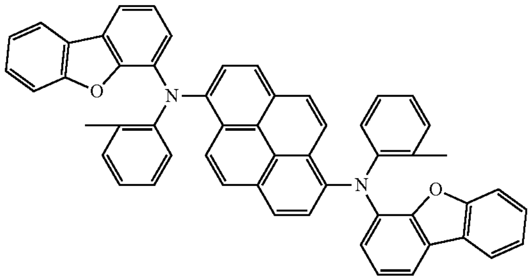
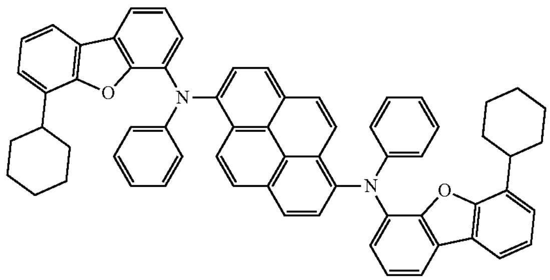
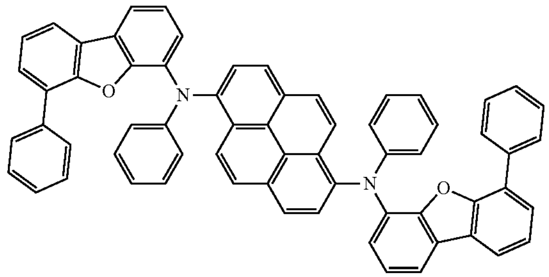
-continued
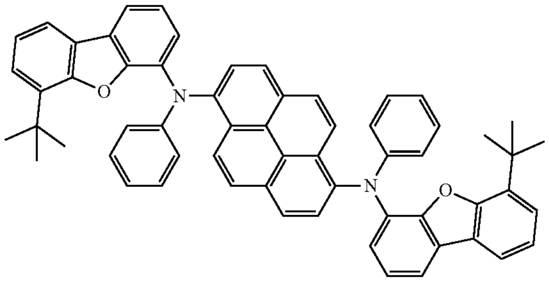
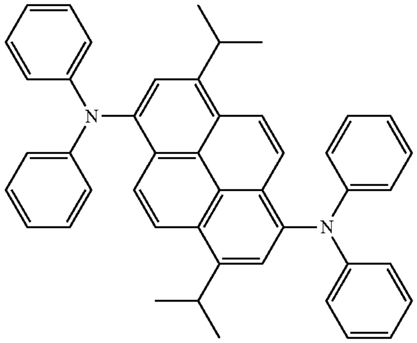
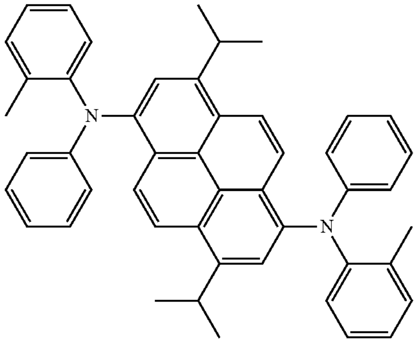
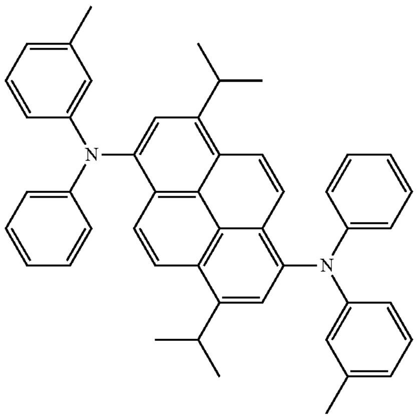

-continued
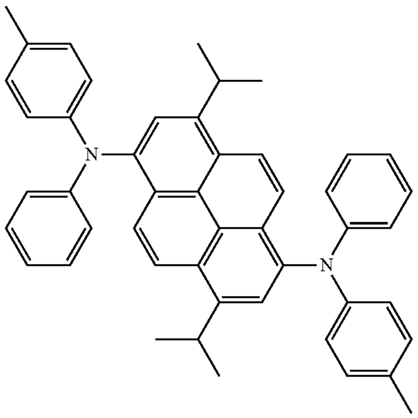
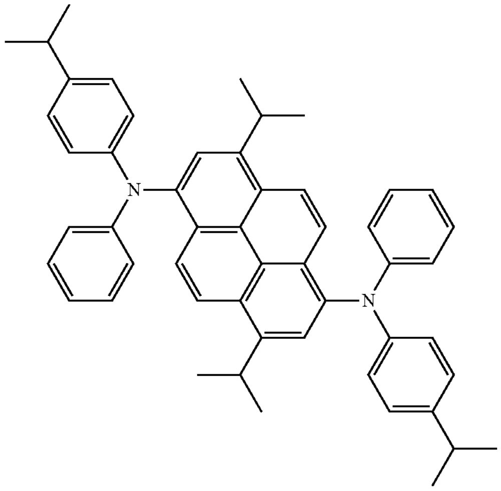
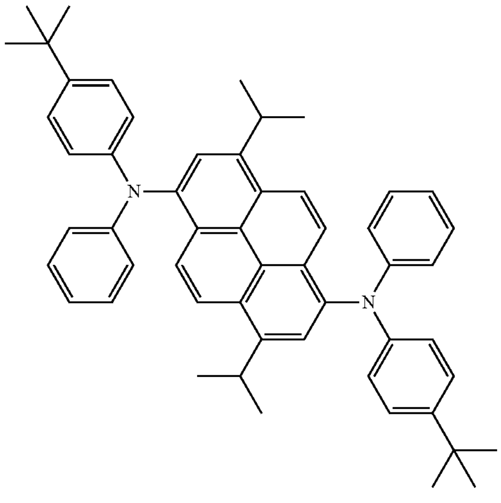
-continued
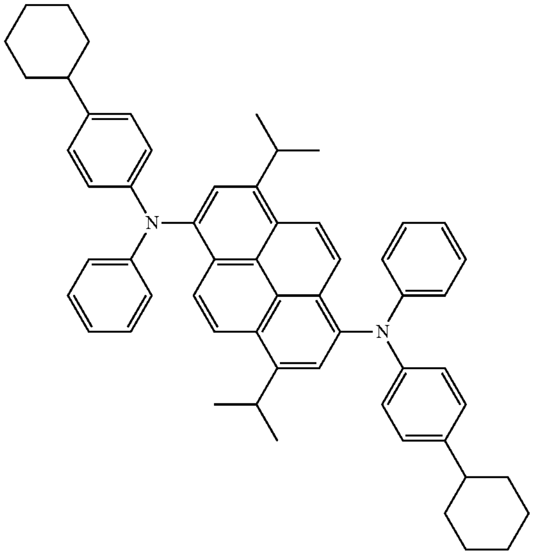
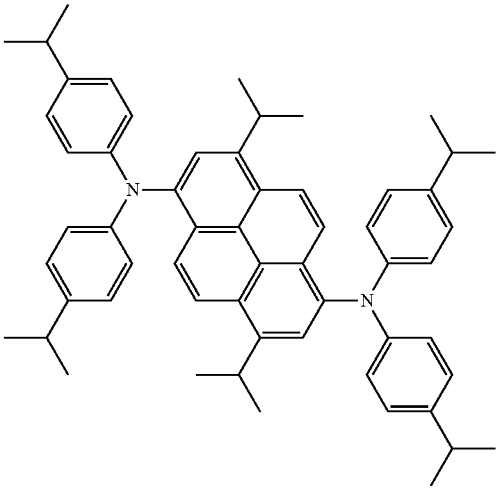
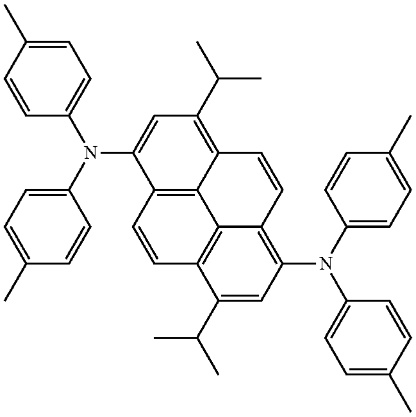

-continued
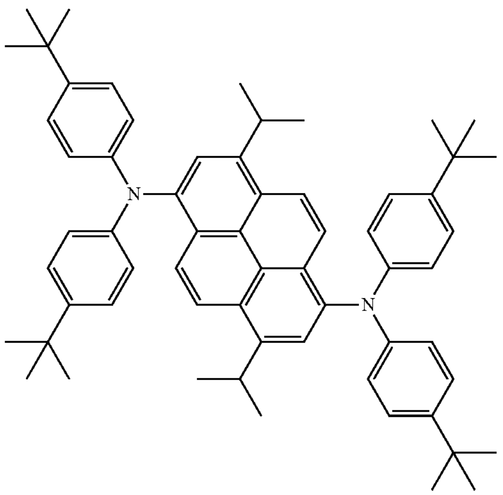
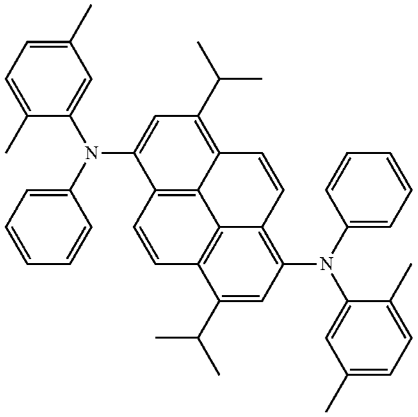
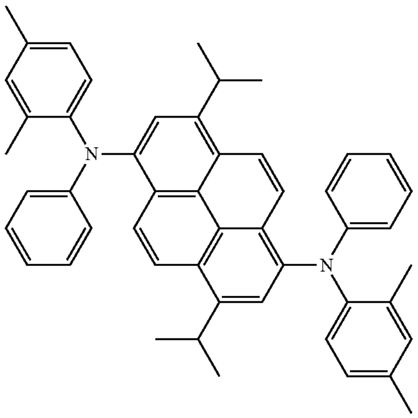
-continued
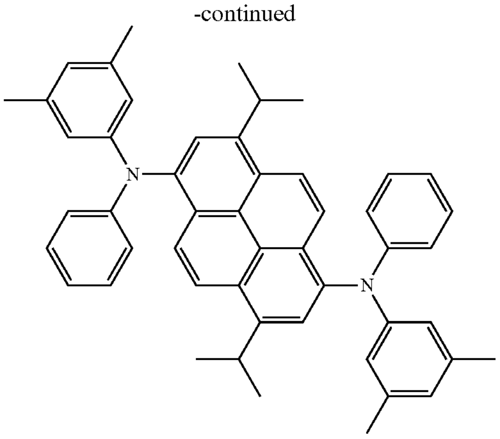
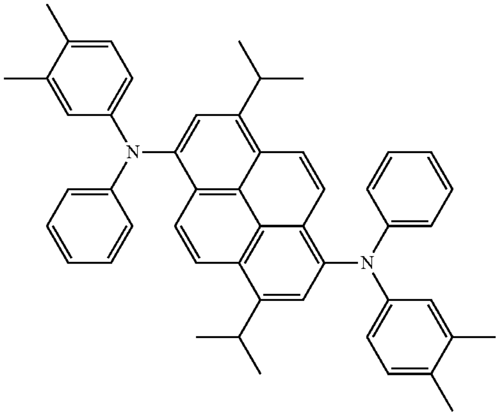
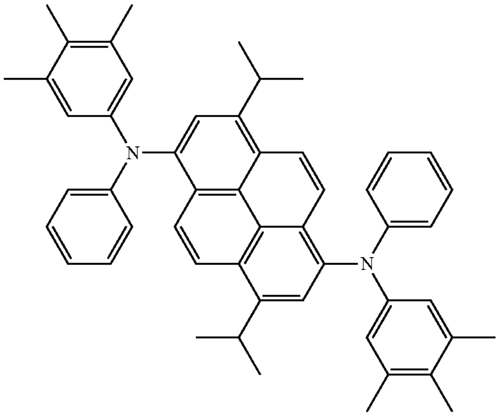
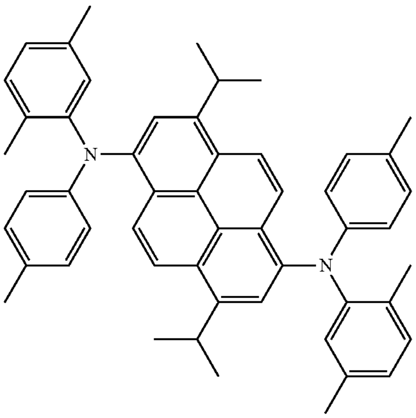

-continued
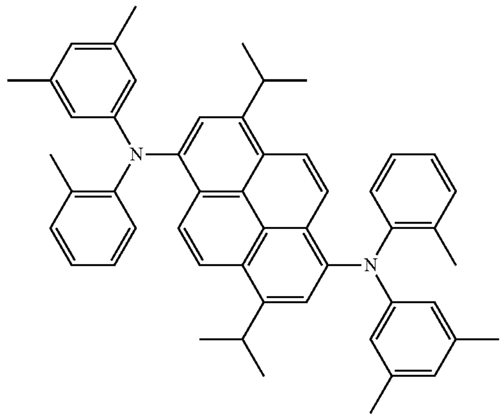
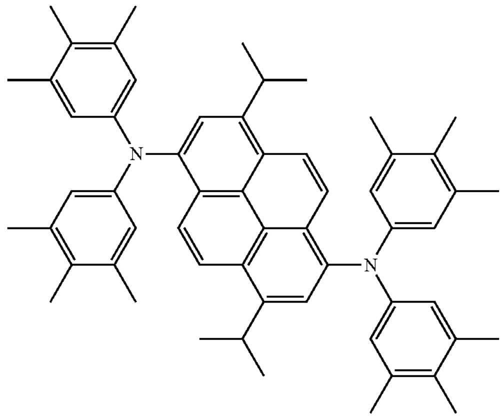
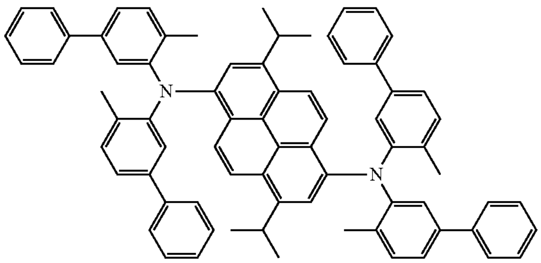
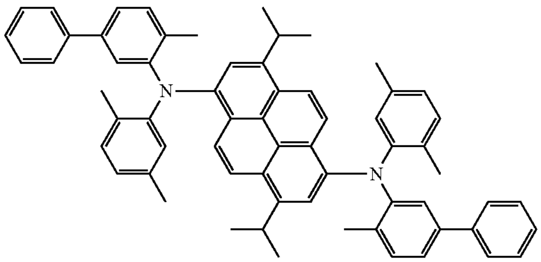
-continued
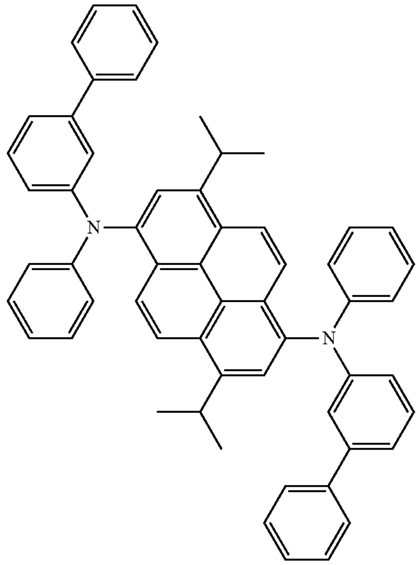
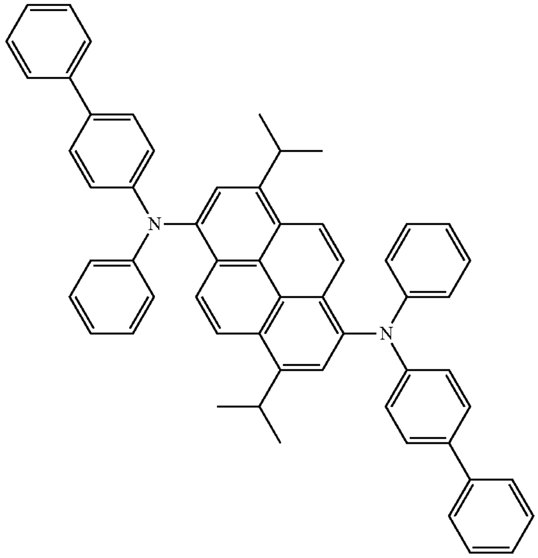
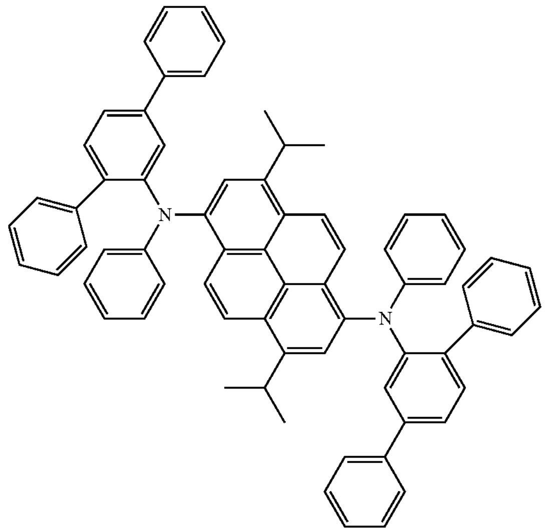

-continued
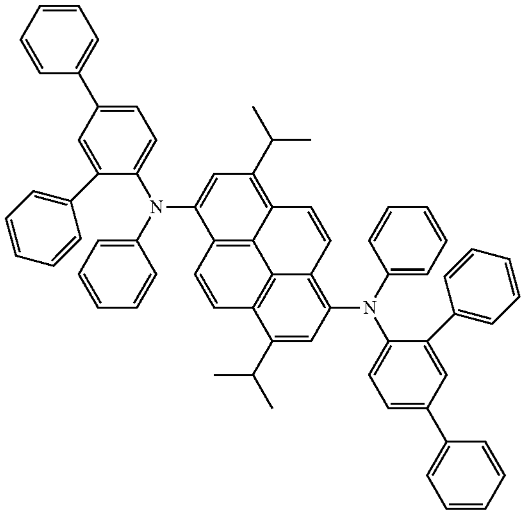
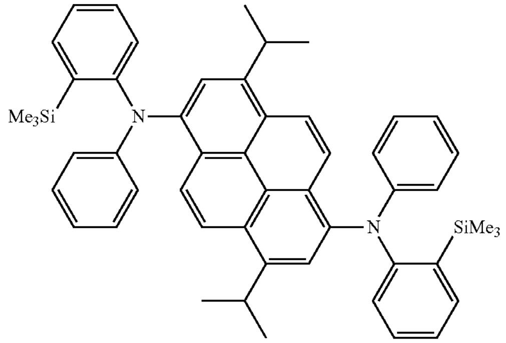
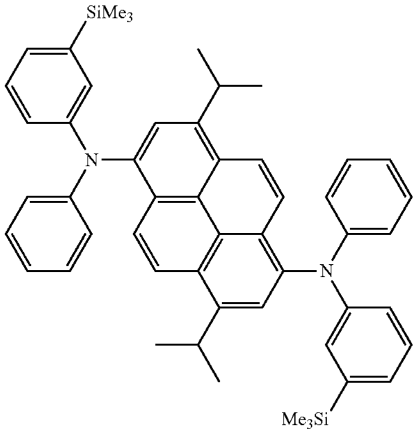
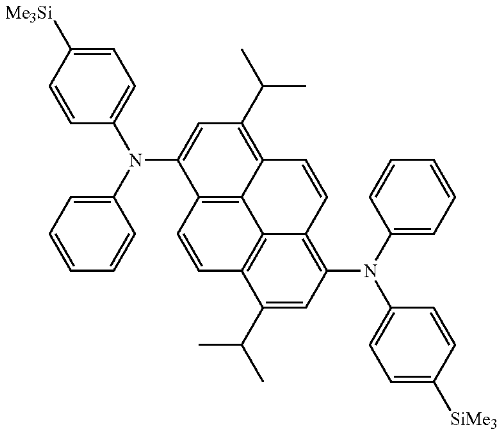
-continued
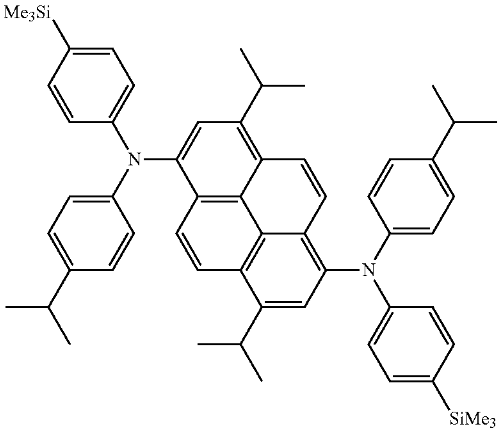
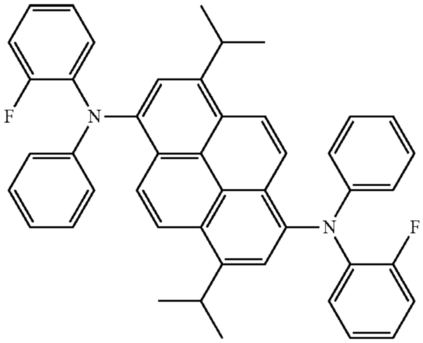
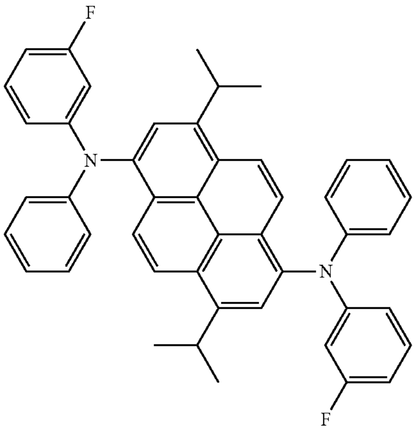
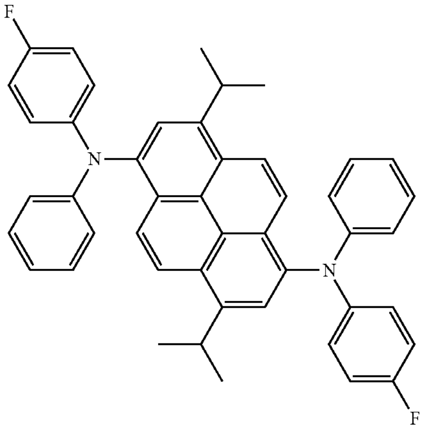

-continued
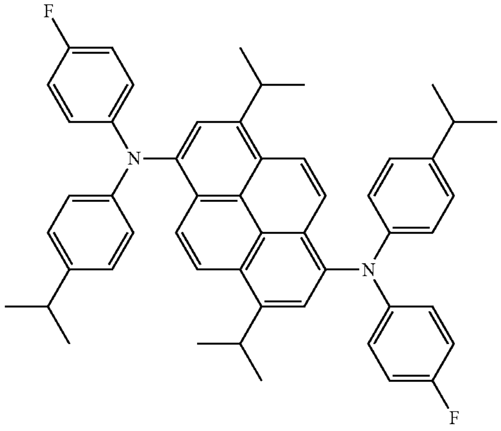
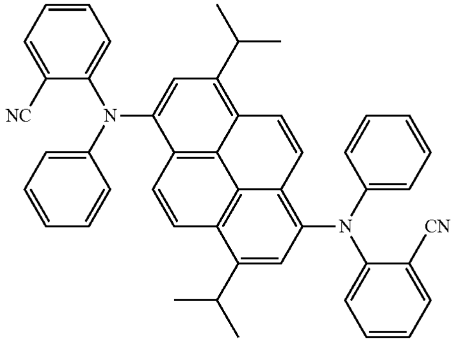
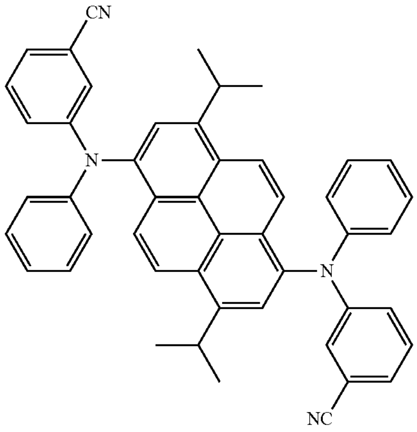
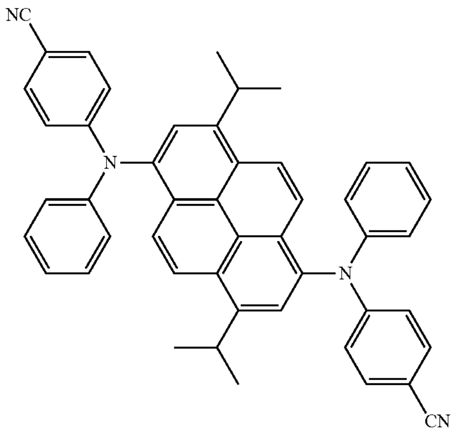
-continued
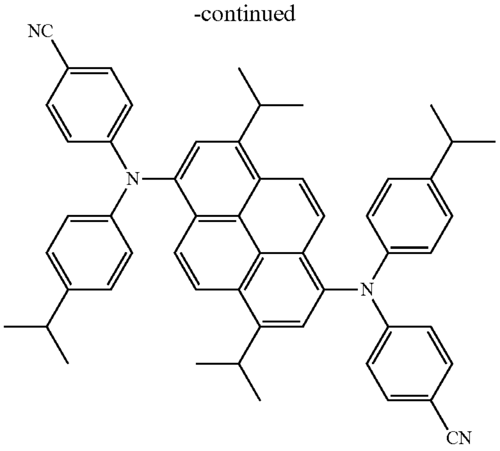
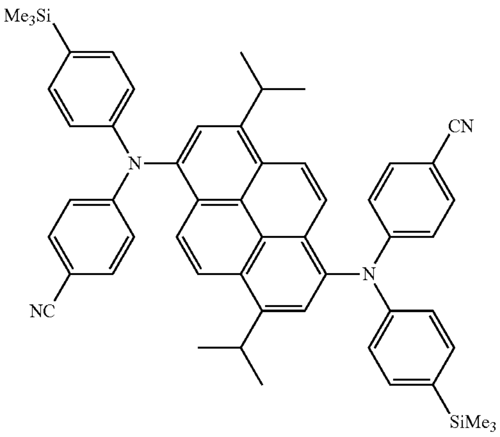
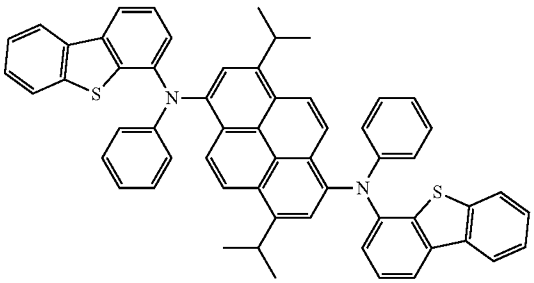
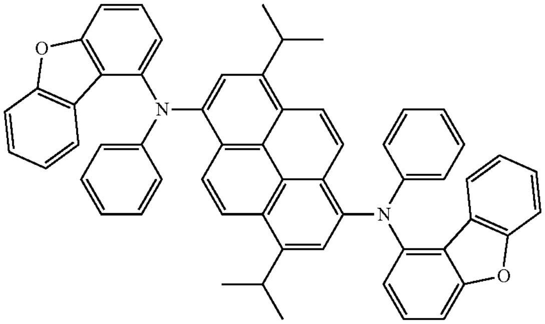

-continued
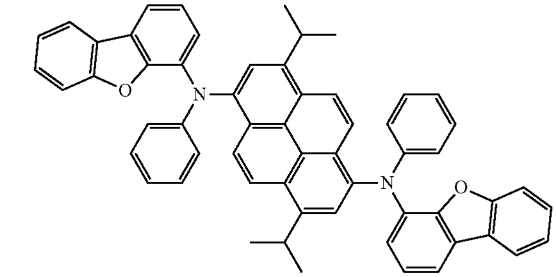
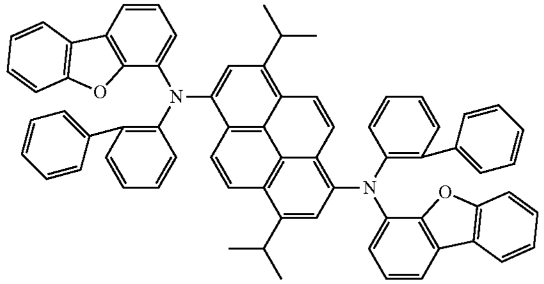
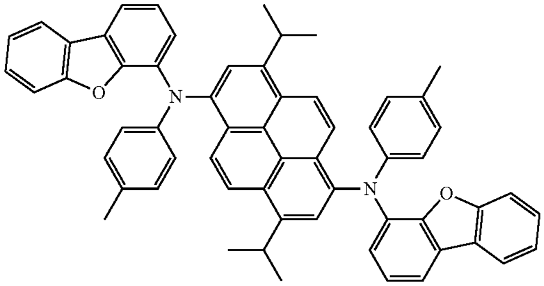
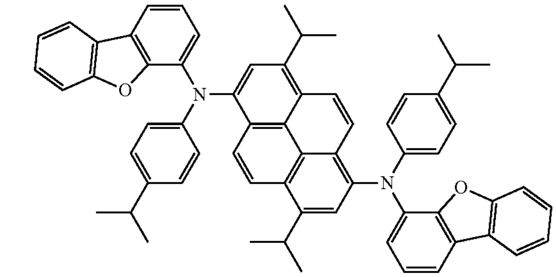
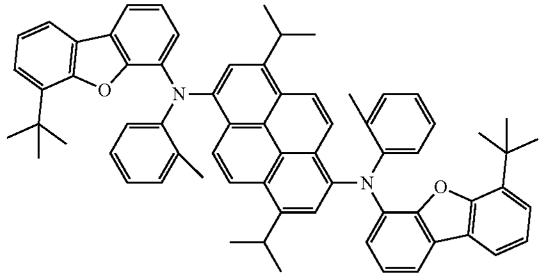
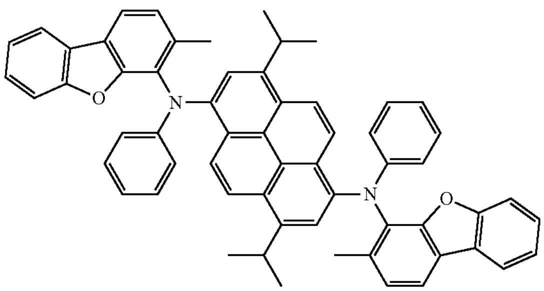
-continued
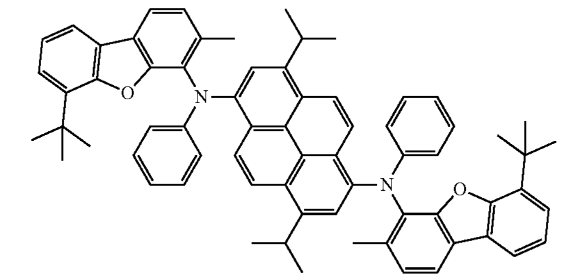
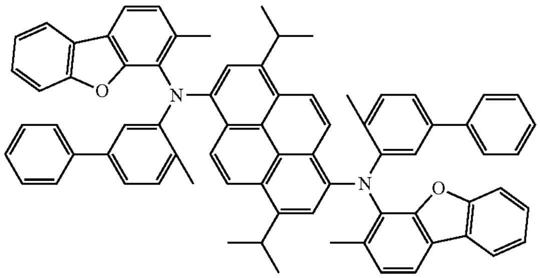
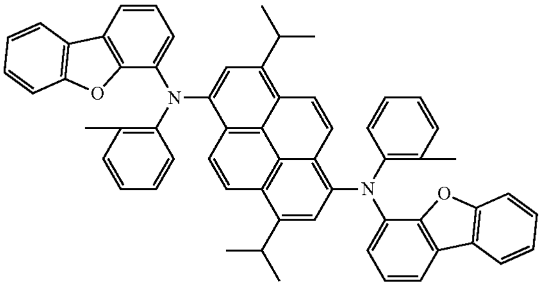
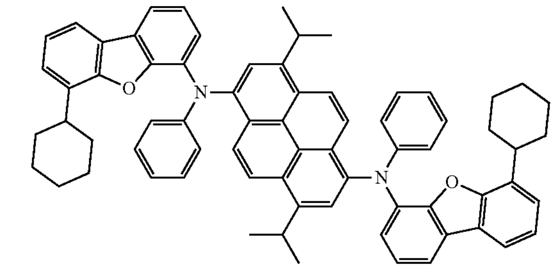
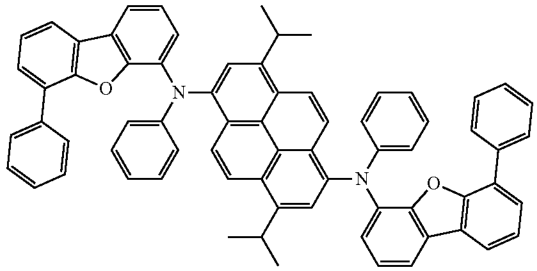
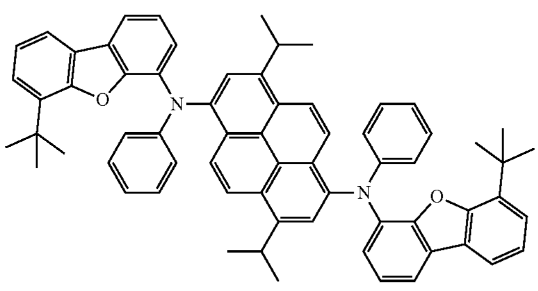

-continued
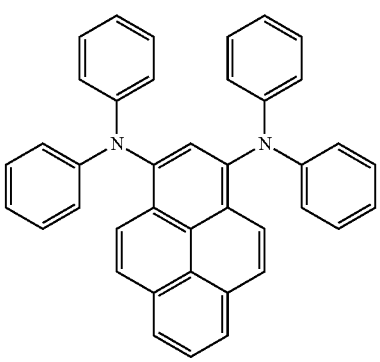
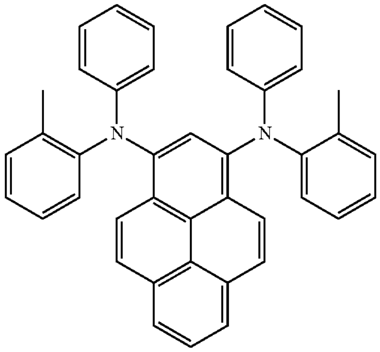
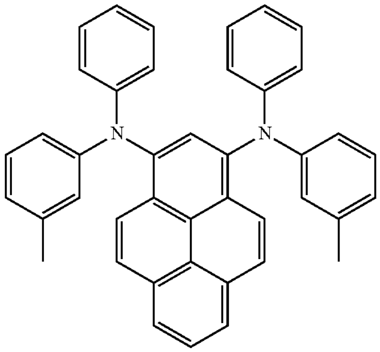
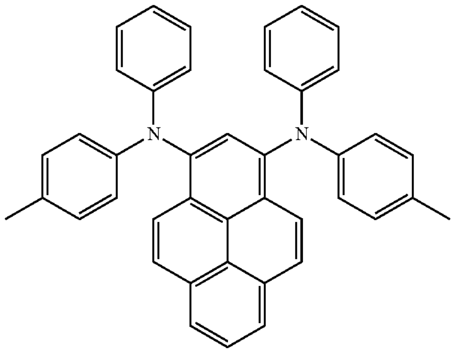
-continued
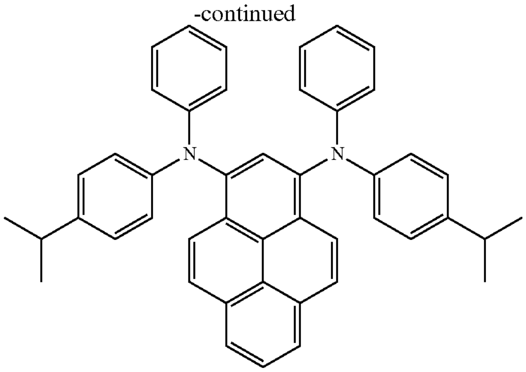
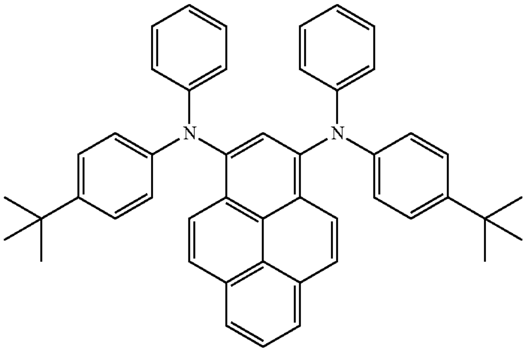
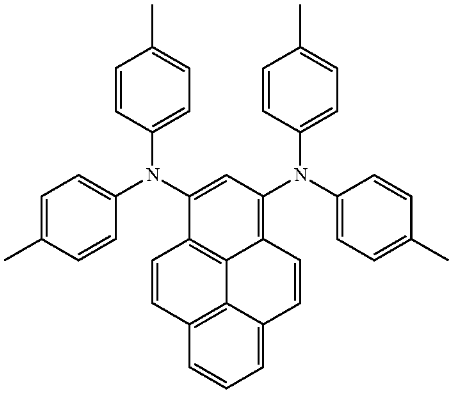
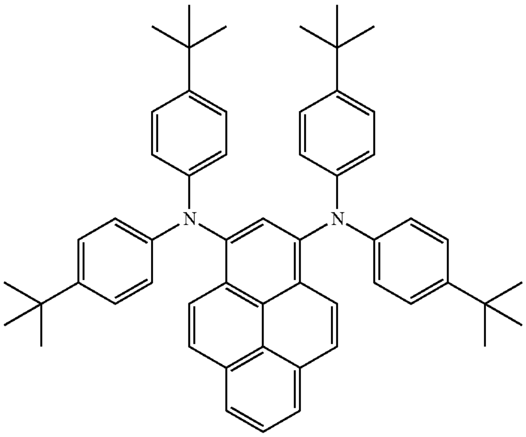

-continued
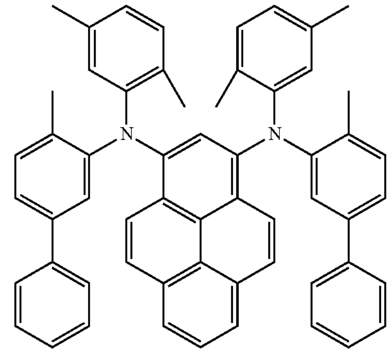
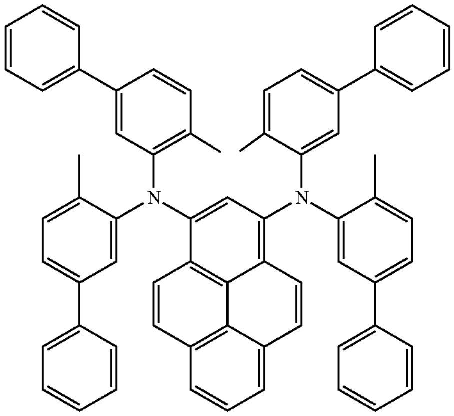
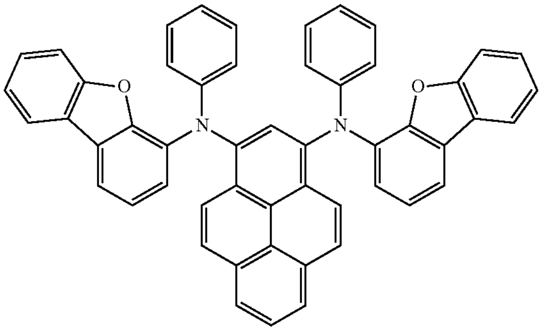
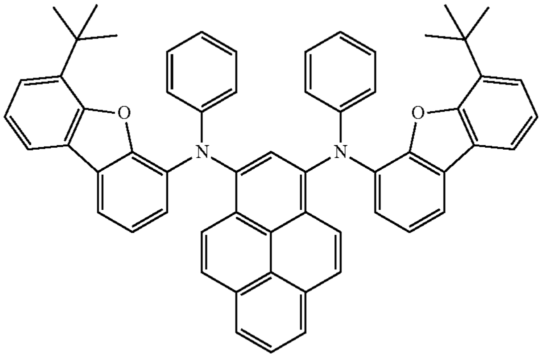
-continued
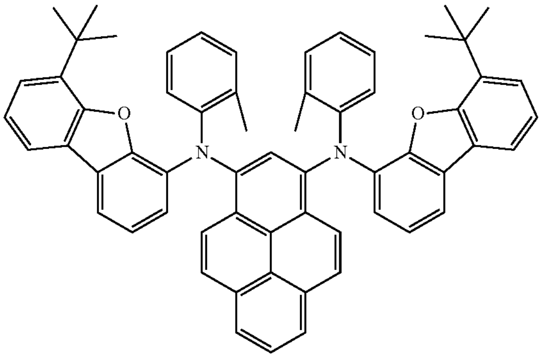
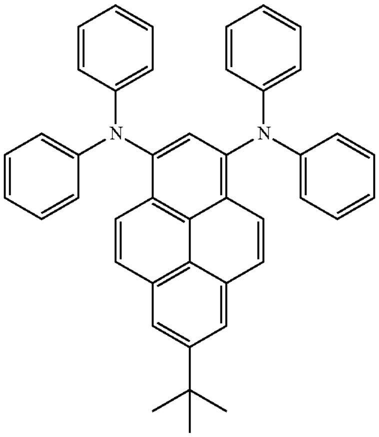
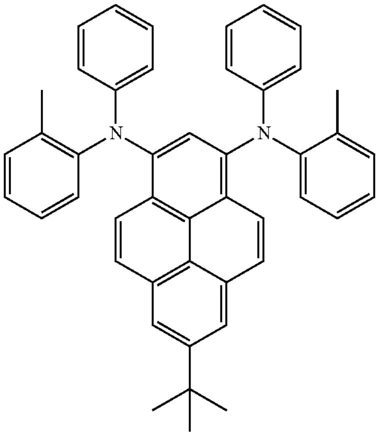
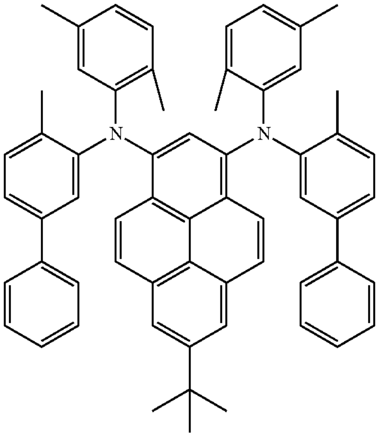

-continued
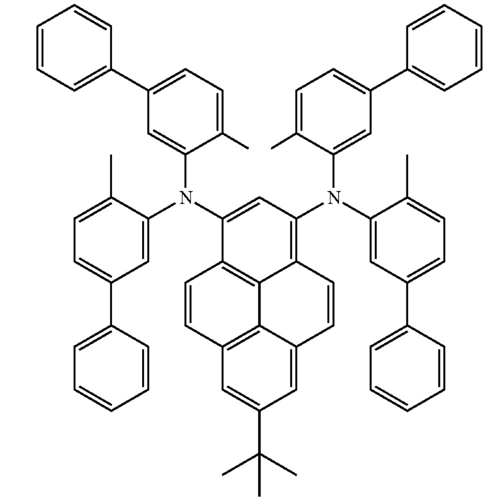
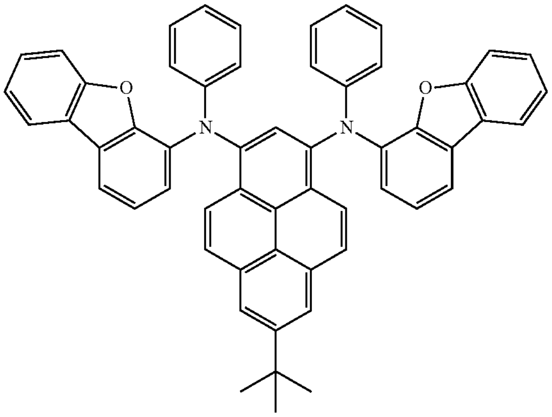
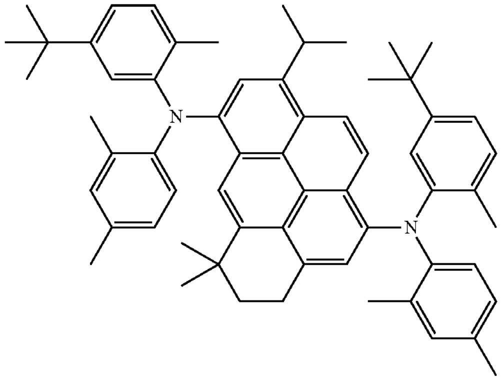
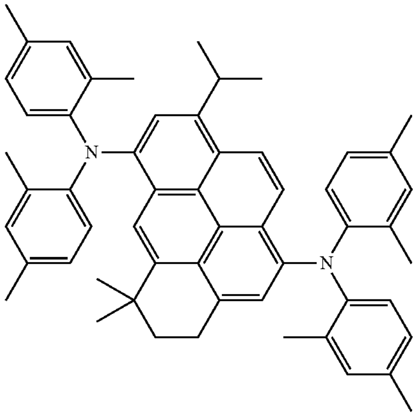
-continued
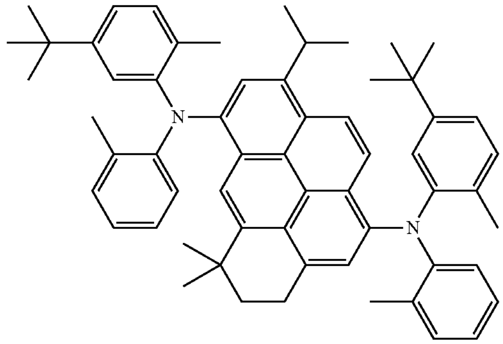
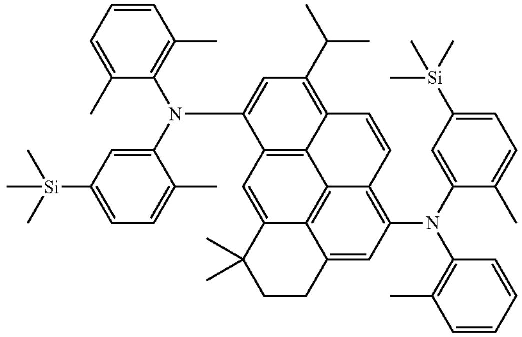
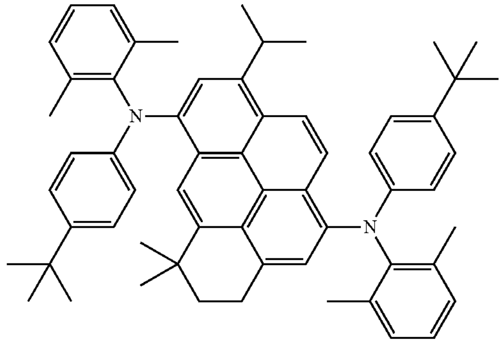
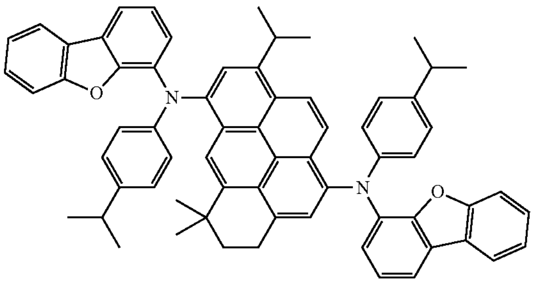

-continued
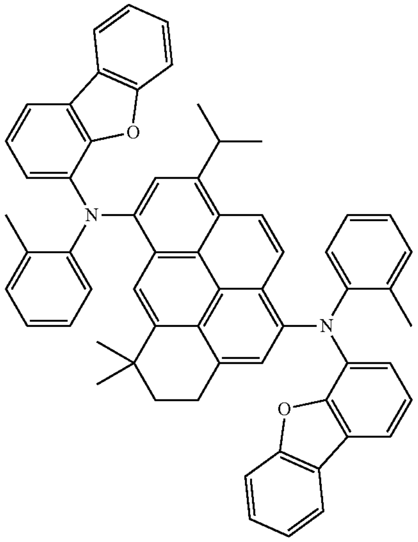
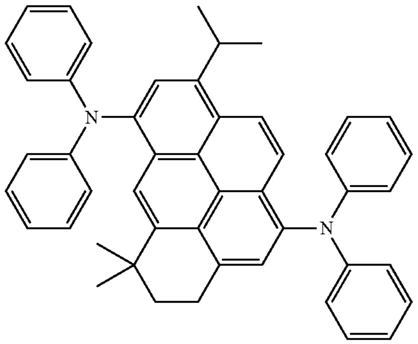
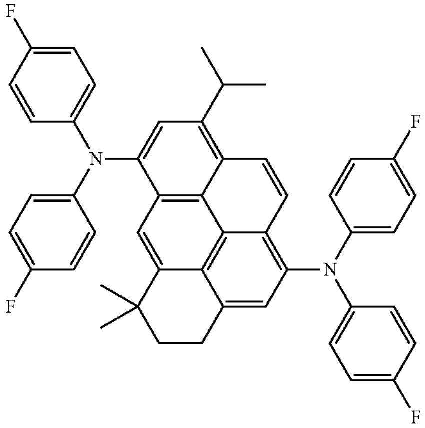
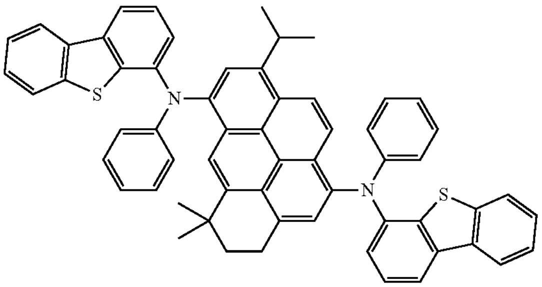
-continued
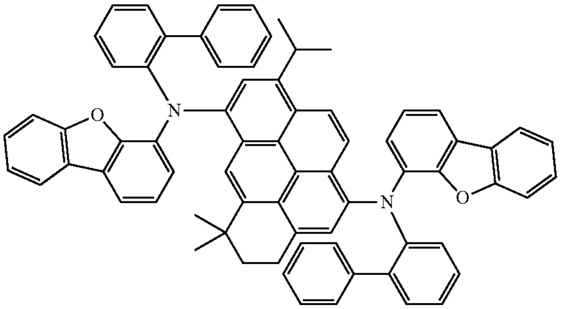
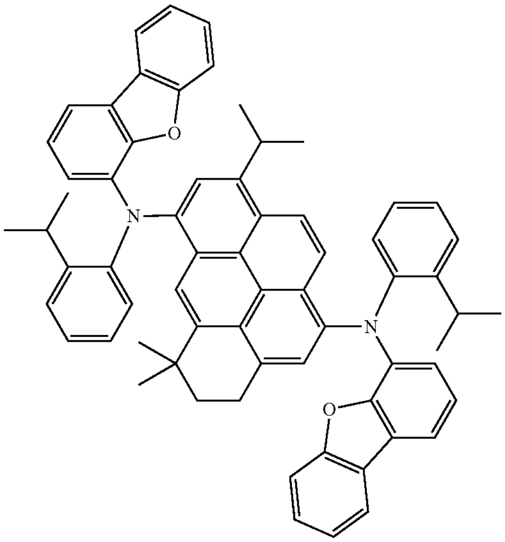
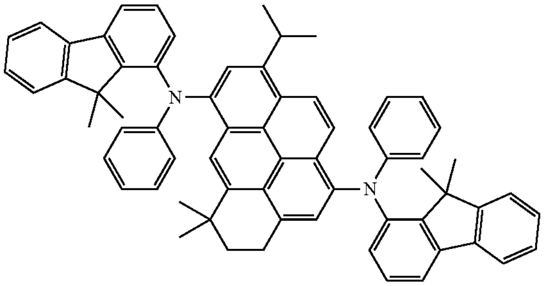
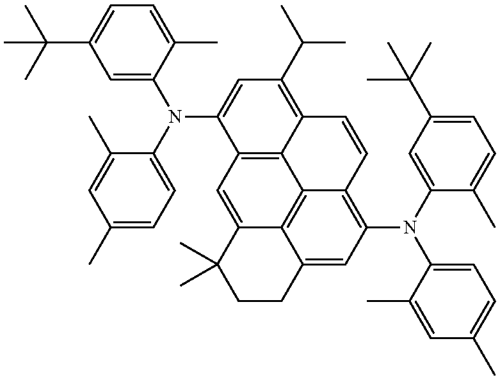

-continued

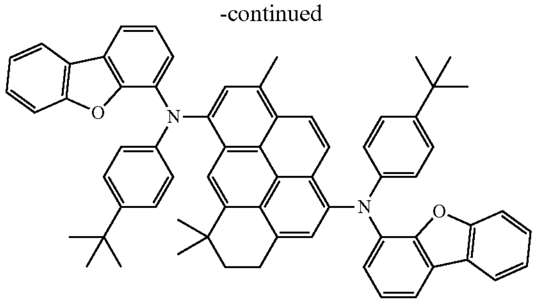

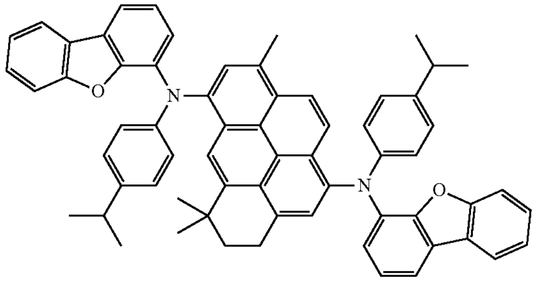

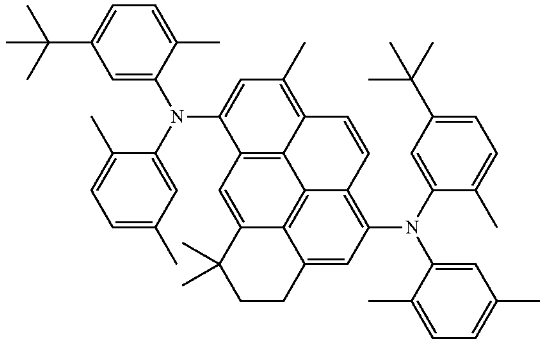

(Compound Represented by Formula (21))

The compound represented by the formula (21) is explained below.

(21)

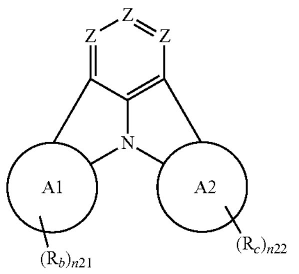

In the formula (21),

Z's are independently $CR_a$ or N;

ring A1 and ring A2 are independently a substituted or unsubstituted aromatic hydrocarbon ring including 6 to 50 ring carbon atoms, or a substituted or unsubstituted heterocycle including 5 to 50 ring atoms;

when a plurality of $R_a$'s exists, two or more adjacent groups of $R_a$'s are bonded with each other to form a substituted or unsubstituted, saturated or unsaturated ring, or do not form a substituted or unsubstituted, saturated or unsaturated ring;

when a plurality of $R_b$'s exists, one or more sets of two or more adjacent groups of $R_b$'s are bonded with each other to form a substituted or unsubstituted, saturated or unsaturated ring, or do not form a substituted or unsubstituted, saturated or unsaturated ring;

when a plurality of Rc's exists, one or more sets of two or more adjacent groups of $R_c$'s are bonded with each other to form a substituted or unsubstituted, saturated or unsaturated ring, or do not form a substituted or unsubstituted, saturated or unsaturated ring;

n21 and n22 are independently an integer of 0 to 4;

$R_a$ to $R_c$ that do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

The "aromatic hydrocarbon ring" for ring A1 and ring A2 has the same structure as the compound obtained by introducing a hydrogen atom into the "aryl group" described above. The "aromatic hydrocarbon ring" for the ring A1 and the ring A2 contains two carbon atoms in the fused bicyclic structure at the center of the formula (21) as the ring atoms. Examples of the "substituted or unsubstituted aromatic hydrocarbon ring including 6 to 50 ring carbon atoms" include compounds in which a hydrogen atom is introduced into the "aryl group" described in the example group G1.

The "heterocycle" for ring A1 and ring A2 has the same structure as the compound obtained by introducing a hydrogen atom into the "heterocyclic group" described above. The "heterocycle" for the ring A1 and the ring A2 contains two carbon atoms in the fused bicyclic structure at the center of the formula (21) as the ring atoms. Examples of the "substituted or unsubstituted heterocycle including 5 to 50 ring atoms" include compounds in which a hydrogen atom is introduced into the "heterocyclic group" described in the example group G2.

$R_b$ is bonded to one of the carbon atoms which constitute the aromatic hydrocarbon ring of ring A1, or one of the atoms which constitute the heterocycle of ring A1.

$R_c$ is bonded to one of the carbon atoms which constitute the aromatic hydrocarbon ring of ring A2, or one of the atoms which constitute the heterocycle of ring A2.

It is preferable that at least one (preferably two) of $R_a$ to $R_c$ is a group represented by the following formula (21a).

$$-L_{201}-Ar_{201} \quad (21a)$$

In the formula (21a), $L_{201}$ is a single bond, a substituted or unsubstituted arylene group including 6 to 30 ring carbon atoms, or a substituted or unsubstituted divalent heterocyclic group including 5 to 30 ring atoms; and $Ar_{201}$ is a substituted or unsubstituted aryl group including 6 to 50 ring carbon atoms, a substituted or unsubstituted monovalent heterocyclic group including 5 to 50 ring atoms, or a group represented by the following formula (21b):

(21b)

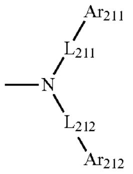

In the formula (21b), $L_{211}$ and $L_{212}$ are independently a single bond, a substituted or unsubstituted arylene group including 6 to 30 ring carbon atoms, or a substituted or unsubstituted divalent heterocyclic group including 5 to 30 ring atoms;

$Ar_{211}$ and $Ar_{212}$ are bonded with each other to form a substituted or unsubstituted, saturated or unsaturated ring, or do not form a substituted or unsubstituted, saturated or unsaturated ring; and $Ar_{211}$ and $Ar_{212}$ that do not form the substituted or unsubstituted, saturated or unsaturated ring are independently a substituted or unsubstituted aryl group including 6 to 50 ring carbon atoms or a substituted or unsubstituted monovalent heterocyclic group including 5 to 50 ring atoms.

In one embodiment, the compound represented by the formula (21) is a compound represented by the following formula (22).

(22)

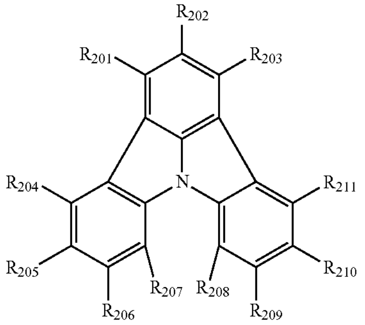

In the formula (22), one or more sets of two or more adjacent groups of $R_{201}$ to $R_{211}$ are bonded with each other to form a substituted or unsubstituted, saturated or unsaturated ring, or do not form a substituted or unsubstituted saturated or unsaturated ring;

$R_{201}$ to $R_{211}$ that do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

It is preferable that at least one (preferably two) of $R_{201}$ to $R_{211}$ is the group represented by the formula (21a). It is preferable that $R_{204}$ and $R_{211}$ are the groups represented by the formula (21a).

In one embodiment, the compound represented by the formula (21) is a compound obtained by bonding a structure represented by the following formula (21-1) or (21-2) to ring A1. In one embodiment, the compound represented by the formula (22) is a compound obtained by bonding a structure represented by the following formula (21-1) or (21-2) to the ring to which $R_{204}$ to $R_{207}$ bond.

(21-1)

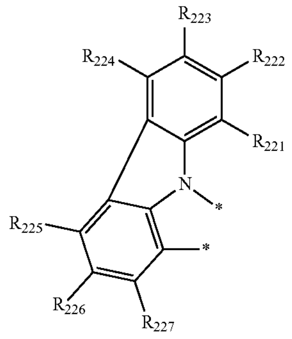

(21-2)

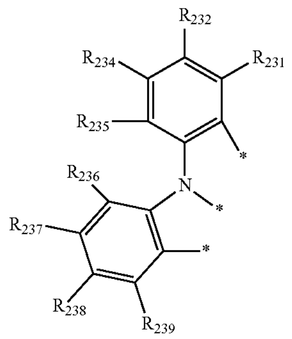

In the formula (21-1), two bonding hand *'s bond, respectively to a ring carbon atom in the aromatic hydrocarbon ring or a ring atom in the heterocycle for the ring A1 in the formula (21), or bond, respectively to one of $R_{204}$ to $R_{207}$ in the formula (22);

In the formula (21-2), three bonding hand *'s bond, respectively to a ring carbon atom in the aromatic hydrocarbon ring or a ring atom in the heterocycle for the A1 ring in the formula (21), or bond, respectively to one of $R_{204}$ to $R_{207}$ in the formula (22);

One or more sets of two or more adjacent groups of $R_{221}$ to $R_{227}$ and $R_{231}$ to $R_{239}$ are bonded with each other to form a substituted or unsubstituted, saturated or unsaturated ring, or do not form a substituted or unsubstituted, saturated or unsaturated ring;

$R_{221}$ to $R_{227}$ and $R_{231}$ to $R_{239}$ that do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

In one embodiment, the compound represented by the formula (21) is a compound represented by the following formula (21-3), (21-4), or (21-5).

(21-3)

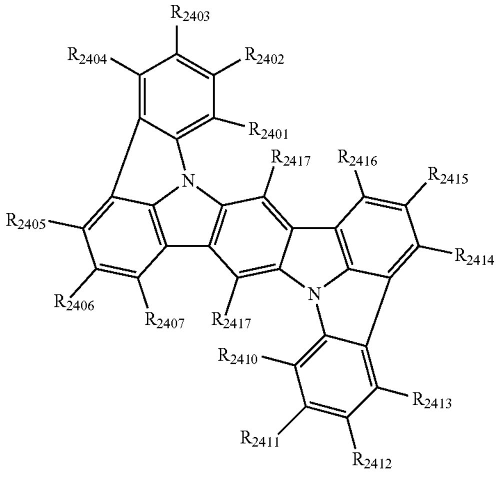

(21-4)

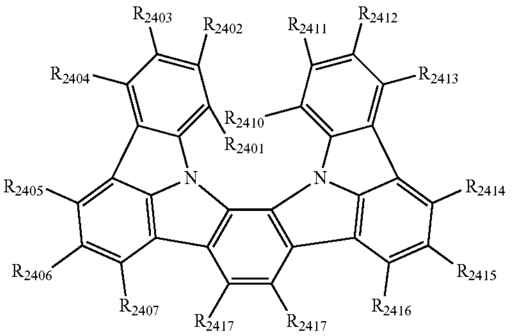

-continued (21-5)

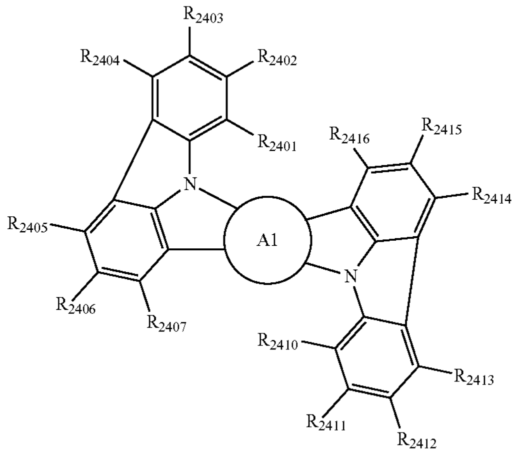

In the formulas (21-3), (21-4), and (21-5), ring A1 is as defined in the formula (21);

$R_{2401}$ to $R_{2407}$ are as defined in $R_{221}$ to $R_{227}$ of the formulas (21-1) and (21-2);

$R_{2410}$ to $R_{2417}$ are as defined in $R_{201}$ to $R_{211}$ of the formula (22); and two $R_{2417}$'s may be the same as or different from each other.

In one embodiment, the substituted or unsubstituted aromatic hydrocarbon ring including 6 to 50 ring carbon atoms for the ring A1 in the formula (21-5) is a substituted or unsubstituted naphthalene ring, or a substituted or unsubstituted fluorene ring.

In one embodiment, the substituted or unsubstituted heterocycle including 5 to 50 ring atoms for the ring A1 in the formula (21-5) is a substituted or unsubstituted dibenzofuran ring, a substituted or unsubstituted carbazole ring, or a substituted or unsubstituted dibenzothiophene ring.

In one embodiment, the compound represented by the formula (21) or (22) is selected from the group consisting of the compounds represented by each of the following formulas (21-6-1) to (21-6-7).

(21-6-1)

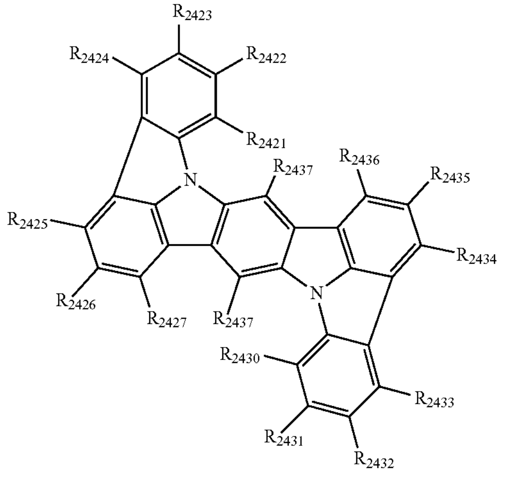

-continued (21-6-2)

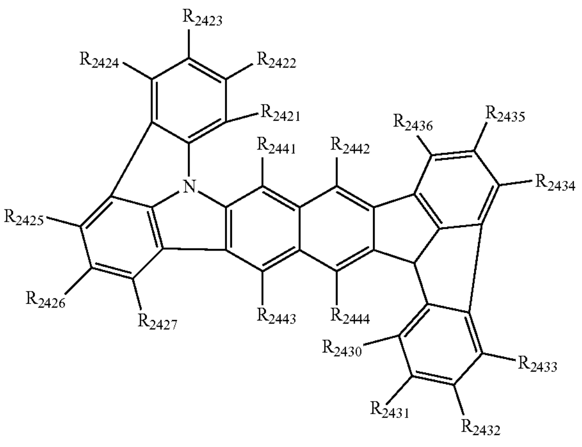

(21-6-3)

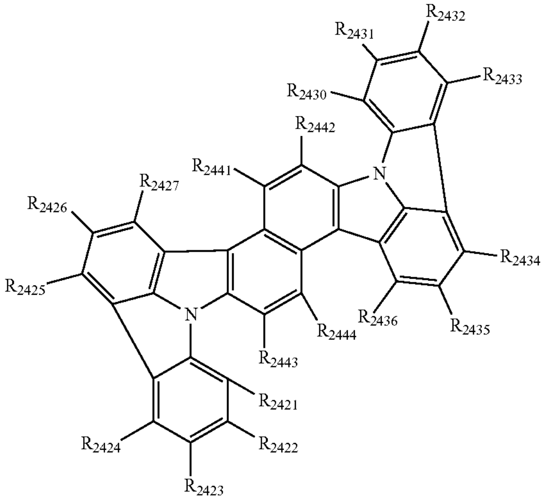

(21-6-4)

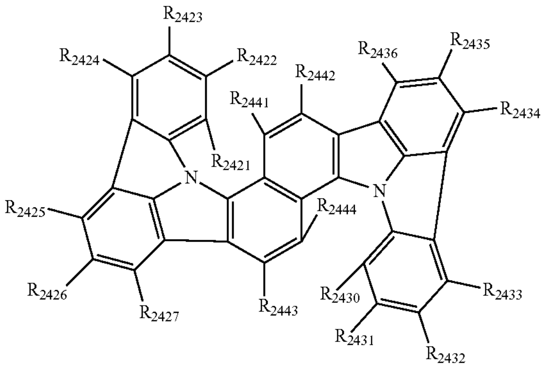

-continued (21-6-5)

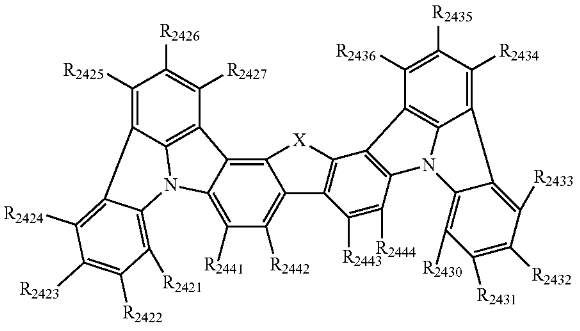

(21-6-6)

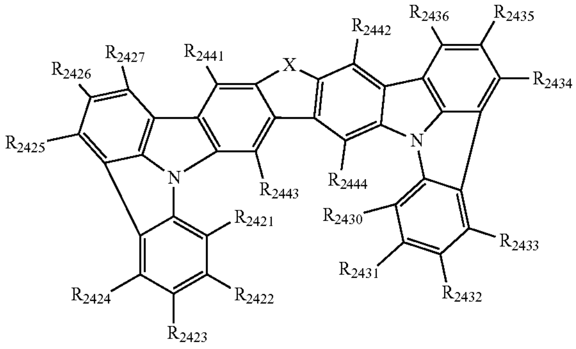

(21-6-7)

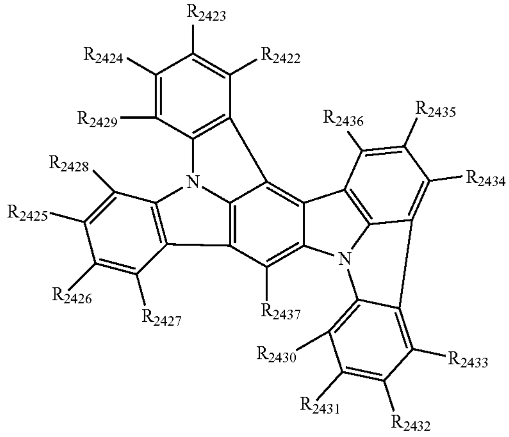

In the formulas (21-6-1) to (21-6-7), $R_{2421}$ to $R_{2427}$ are the same as $R_{221}$ to $R_{227}$ in the formulas (21-1) and (21-2); $R_{2430}$ to $R_{2437}$ and $R_{2441}$ to $R_{2444}$ are the same as $R_{201}$ to $R_{211}$ in the formula (22);

X is O, $NR_{901}$, or $C(R_{902})(R_{903})$; and $R_{901}$ to $R_{903}$ are as defined in the formulas (1).

In one embodiment, in the compound represented by the formula (22), one or more sets of two or more adjacent groups of $R_{201}$ to $R_{211}$ are bonded with each other to form a substituted or unsubstituted, saturated or unsaturated ring. This embodiment is described in the following formula (25).

(Compound Represented by Formula (25))

The compound represented by the formula (25) is explained below.

(25)

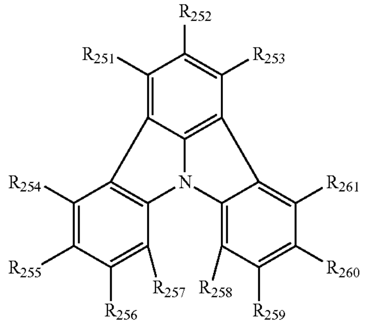

In the formula (25), two or more pairs selected from a group consisting of $R_{251}$ and $R_{252}$, $R_{252}$ and $R_{253}$, $R_{254}$ and $R_{255}$, $R_{255}$ and $R_{256}$, $R_{256}$ and $R_{257}$, $R_{258}$ and $R_{259}$, $R_{259}$ and $R_{260}$, and $R_{260}$ and $R_{261}$ are bonded with each other to form a substituted or unsubstituted, saturated or unsaturated ring;

provided that the pair of $R_{251}$ and $R_{252}$ and the pair of $R_{252}$ and $R_{253}$ do not form a ring simultaneously; the pair of $R_{254}$ and $R_{255}$ and the pair of $R_{255}$ and $R_{256}$ do not form a ring simultaneously; the pair of $R_{255}$ and $R_{256}$ and the pair of $R_{256}$ and $R_{257}$ do not form a ring simultaneously; the pair of $R_{258}$ and $R_{259}$ and the pair of $R_{259}$ and $R_{260}$ do not form a ring simultaneously; and the pair of $R_{259}$ and $R_{260}$ and the pair of $R_{260}$ and $R_{261}$ do not form a ring simultaneously;

two or more rings formed by each of pairs of $R_{251}$ to $R_{261}$ may be the same or different;

$R_{251}$ to $R_{261}$ that do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

In the formula (25), $R_n$ and $R_{n+1}$ (n is an integer selected from 251, 252, 254 to 256 and 258 to 260) are bonded with each other to form a substituted or unsubstituted, saturated or unsaturated ring together with the two ring carbon atoms to which $R_n$ and $R_{n+1}$ are bonded. The ring is preferably configured with atoms selected from a C atom, an O atom, a S atom and a N atom, and the number of atoms is preferably 3 to 7, more preferably 5 or 6.

The number of the above-described ring structures in the compound represented by the formula (25) is, for example, 2, 3 or 4. The two or more ring structures may exist on the same benzene ring of the main skeleton in the formula (25), or may exist on different benzene rings. For example, in the case where the compound has the three ring structures, each one ring structure may exist on the three benzene rings in the formula (25).

As the above-mentioned ring structure in the compound represented by the formula (25), structures represented by each of the following formulas (251) to (260) can be given, for example.

(251)

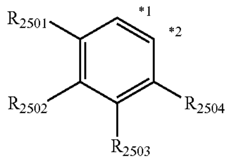

(252)

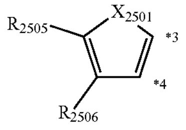

(253)

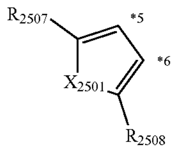

(254)

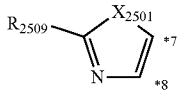

(255)

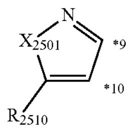

(256)

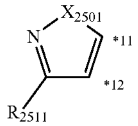

(257)

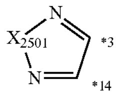

In the formulas (251) to (257), each of *1 and *2, *3 and *4, *5 and *6, *7 and *8,*9 and *10, *11 and *12, and *13 and *14 represents two ring carbon atoms to which $R_n$ and $R_{n+1}$ are bonded, and $R_n$ may bond to either one of the two ring carbon atoms of *1 and *2, *3 and *4, *5 and *6, *7 and *8, *9 and *10, *11 and *12, and *13 and *14;

$X_{2501}$ is $C(R_{2512})(R_{2513})$, $NR_{2514}$, O or S;

one or more sets of two or more adjacent groups of $R_{2501}$ to $R_{2506}$ and $R_{2512}$ to $R_{2513}$ are bonded with each other to form a substituted or unsubstituted, saturated or unsaturated ring, or do not form a substituted or unsubstituted saturated or unsaturated ring; and $R_{2501}$ to $R_{2514}$ that do not form the substituted or unsubstituted, saturated or unsaturated ring are the same as $R_{251}$ to $R_{261}$.

(258)

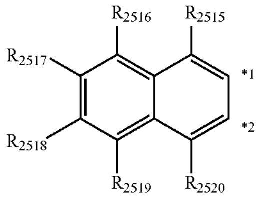

(259)

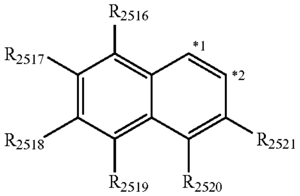

(260)

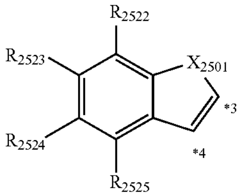

In the formulas (258) to (260), each of *1 and *2, and *3 and *4 represents two ring carbon atoms to which $R_n$ and $R_{n+1}$ are bonded, and $R_n$ may bond to either one of the two ring carbon atoms of *1 and*2, or *3 and*4;

$X_{2501}$ is $C(R_{2512})(R_{2513})$, $NR_{2514}$, O or S;

one or more sets of two or more adjacent groups of $R_{2515}$ to $R_{2525}$ are bonded with each other to form a substituted or unsubstituted, saturated or unsaturated ring, or do not form a substituted or unsubstituted saturated or unsaturated ring; and $R_{2515}$ to $R_{2521}$ and $R_{2522}$ to $R_{2525}$ that do not form the substituted or unsubstituted saturated or unsaturated ring are the same as $R_{251}$ to $R_{261}$.

In the formula (25), it is preferable that at least one of $R_{252}$, $R_{254}$, $R_{255}$, $R_{260}$ and $R_{261}$ (preferably at least one of $R_{252}$, $R_{255}$, and $R_{260}$, more preferably $R_{252}$) is a group that does not form the ring.

(i) A substituent which the ring structure formed by $R_n$ and $R_{n+1}$ in the formula (25) has, (ii) $R_{251}$ to $R_{261}$ that do not form the ring structure in the formula (25), and (iii) $R_{2501}$ to $R_{2514}$ and $R_{2515}$ to $R_{2525}$ in the formulas (251) to (260)

are preferably independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—N(R_{905})(R_{907})$, a substituted or unsubstituted aryl group including 6 to 50 ring carbon atoms, a substituted or unsubstituted monovalent heterocyclic group including 5 to 50 ring atoms, or a group selected from the following groups.

(261)

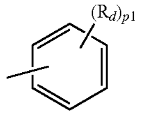

(262)

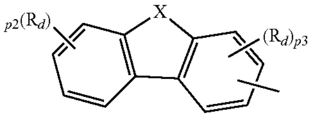

(263)

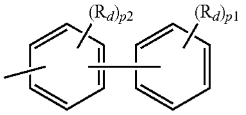

(264)

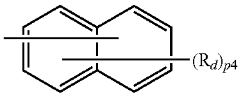

In the formulas (261) to (264), $R_d$'s are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

X is $C(R_{901})(R_{902})$, $NR_{903}$, O, or S;

$R_{901}$ to $R_{907}$ are as defined in the formulas (1); and p1's are independently an integer of 0 to 5, p2's are independently an integer of 0 to 4, p3 is an integer of 0 to 3, and p4 is an integer of 0 to 7.

In one embodiment, the compound represented by the formula (25) is a compound represented by any one of the following formulas (25-1) to (25-6).

(25-1)

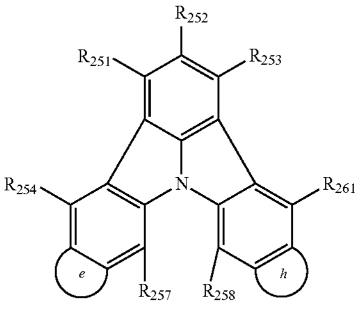

-continued
(25-2)
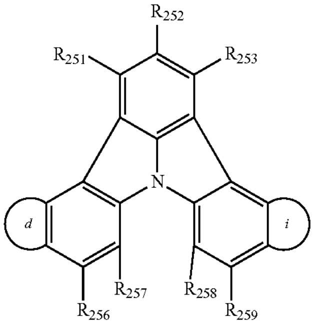
(25-3)
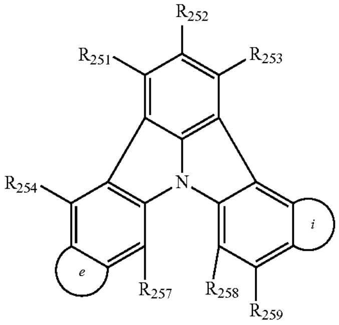
(25-4)
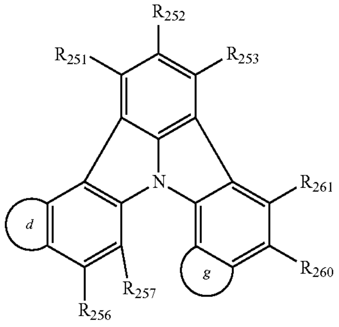
(25-5)
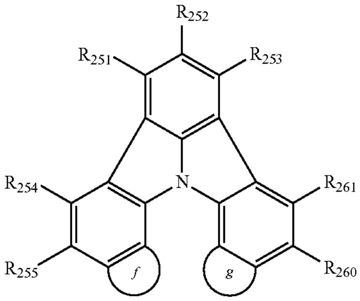
(25-6)
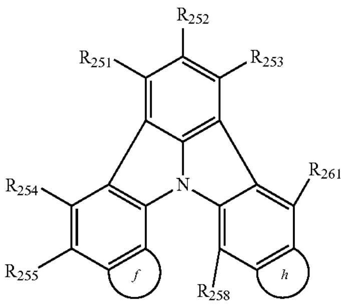
In the formulas (25-1) to (25-6), ring d to ring I are independently a substituted or unsubstituted, saturated or unsaturated ring; and $R_{251}$ to $R_{261}$ are the same as those defined in the formula (25).
In one embodiment, the compound represented by the formula (25) is a compound represented by any one of the following formulas (25-7) to (25-12).
(25-7)
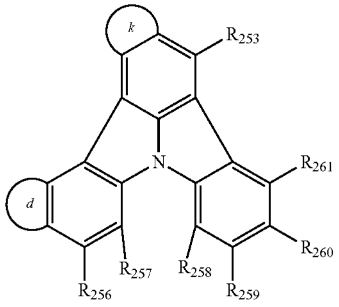
(25-8)
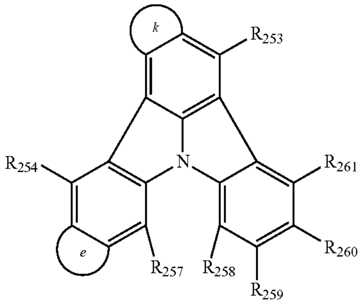
(25-9)
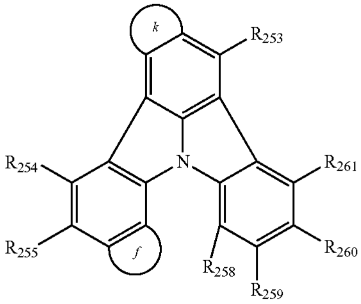
(25-10)
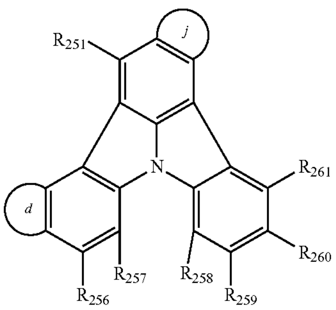

-continued
(25-11)
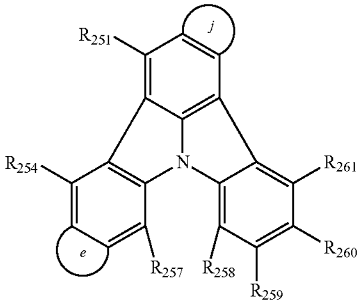
(25-12)
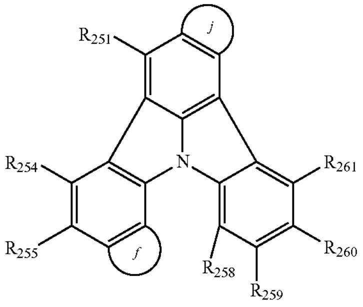
In the formulas (25-7) to (25-12), ring d to ring f, ring k, and ring j are independently a substituted or unsubstituted, saturated or unsaturated ring; and $R_{251}$ to $R_{261}$ are the same as those defined in the formula (25).
In one embodiment, the compound represented by the formula (25) is a compound represented by any one of the following formulas (25-13) to (25-21).
(25-13)
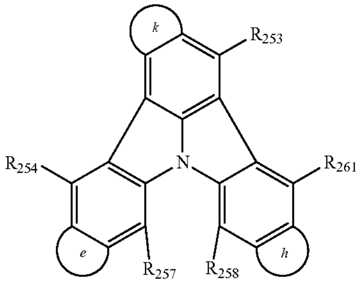
(25-14)
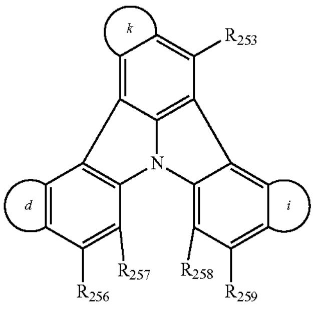
-continued
(25-15)
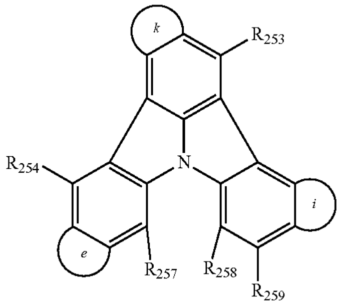
(25-16)
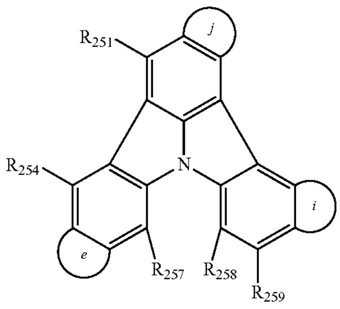
(25-17)
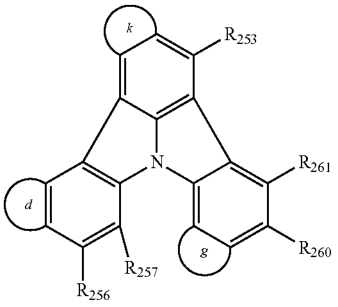
(25-18)
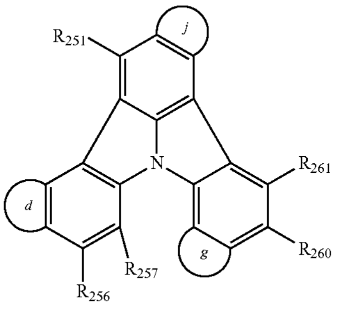
(25-19)
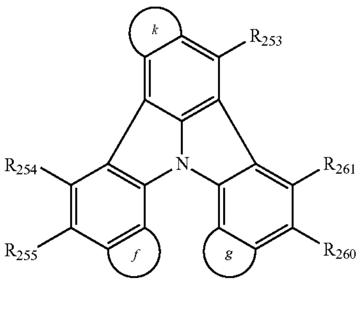

-continued (25-20)

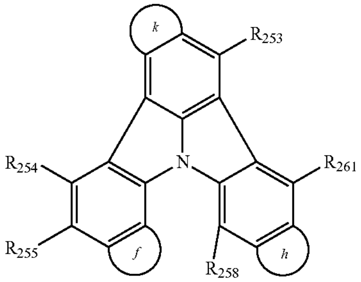

(25-21)

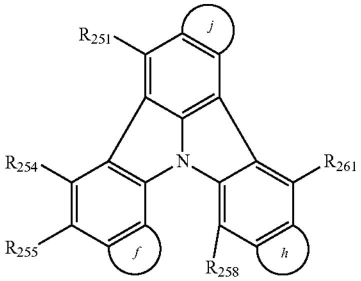

In the formulas (25-13) to (25-21), ring d to ring k are independently a substituted or unsubstituted, saturated or unsaturated ring; and $R_{251}$ to $R_{261}$ are the same as those defined in the formula (25).

As a substituent which the ring g or the ring h further has, a substituted or unsubstituted alkyl group including 1 to 50 carbon atoms, a substituted or unsubstituted aryl group including 6 to 50 ring carbon atoms, and groups represented by each of the formula (261), (263) and (264) can be given, for example.

In one embodiment, the compound represented by the formula (25) is a compound represented by any one of the following formulas (25-22) to (25-25).

(25-22)

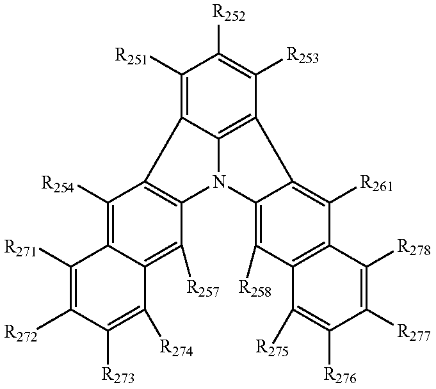

-continued (25-23)

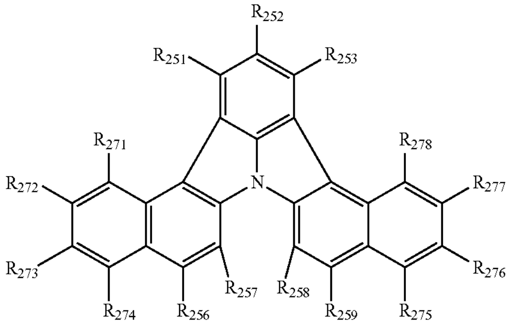

(25-24)

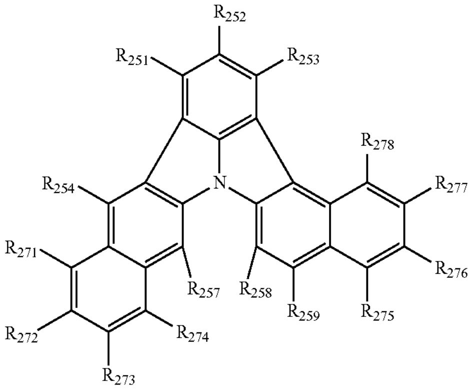

(25-25)

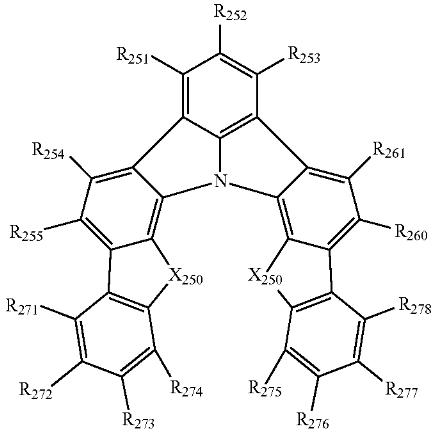

In the formulas (25-22) to (25-25), $X_{250}$' are independently $C(R_{961})(R_{902})$, $NR_{903}$, O or S; $R_{251}$ to $R_{261}$, and $R_{271}$ to $R_{278}$ are the same as $R_{251}$ to $R_{261}$ in the formula (25); and $R_{901}$ to $R_{903}$ are as defined in the formulas (1).

In one embodiment, the compound represented by the formula (25) is a compound represented by the following formula (25-26).

(25-26)
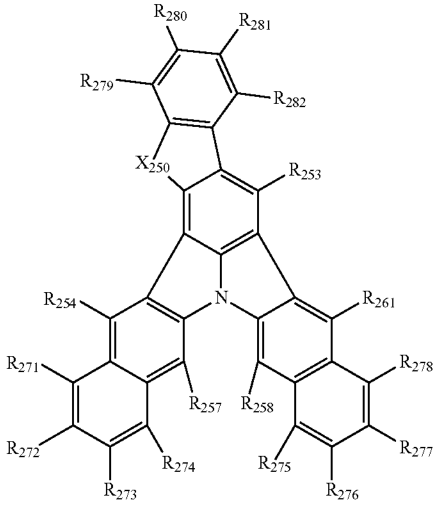
In the formula (25-26), $X_{250}$ is $C(R_{901})(R_{902})$, $NR_{903}$, O or S; $R_{253}$, $R_{254}$, $R_{257}$, $R_{258}$, $R_{261}$ and $R_{271}$ to $R_{282}$ are the same as $R_{251}$ to $R_{261}$ in the formula (25); and $R_{901}$ to $R_{903}$ are as defined in the formulas (1).
As the compound represented by the formula (21), the following compounds can be shown for example. In the following examples, "Me" represents a methyl group.
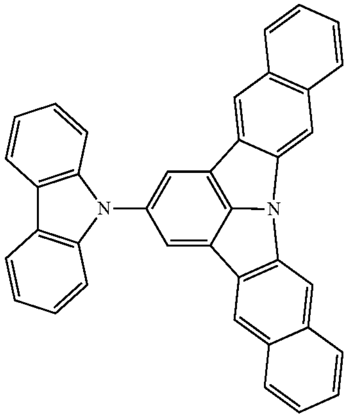
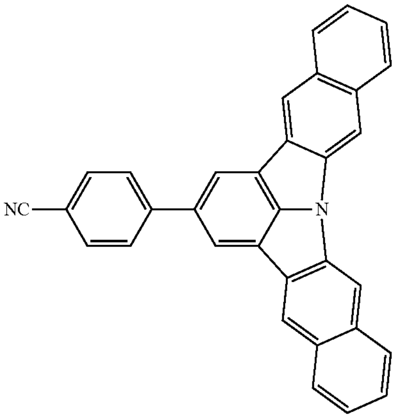
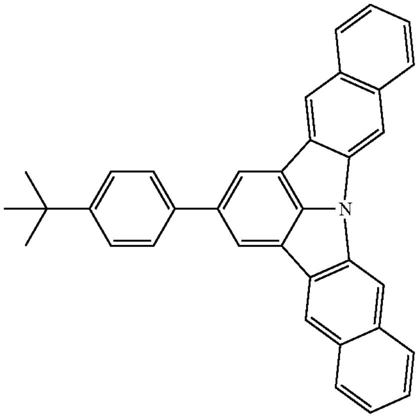
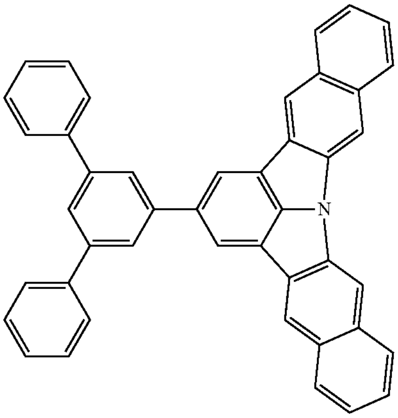

-continued
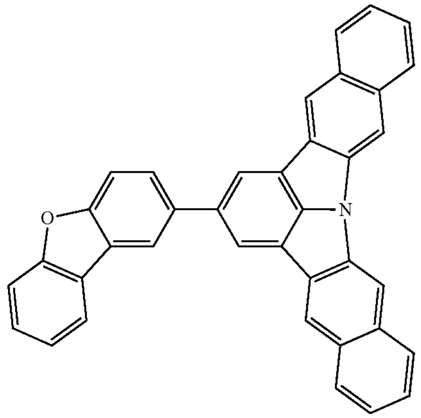
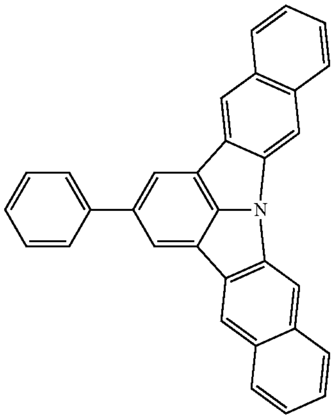
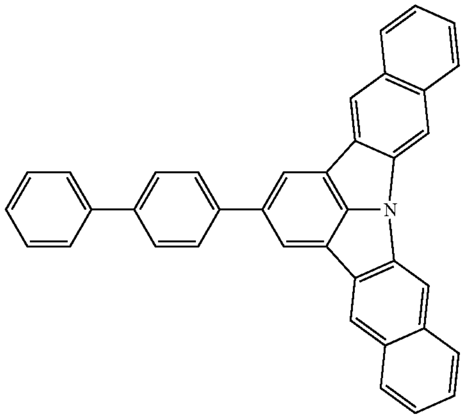
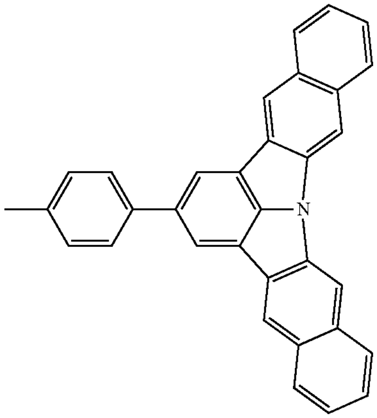
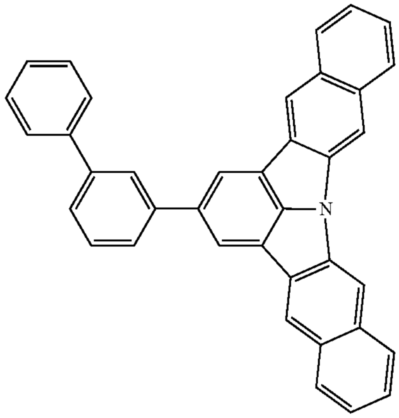
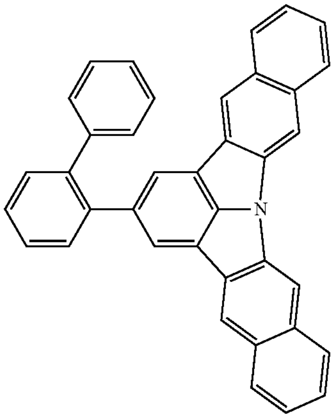

-continued
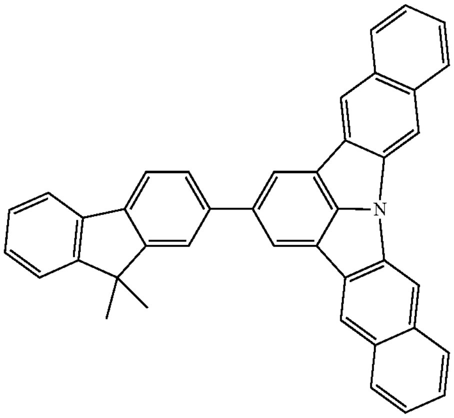
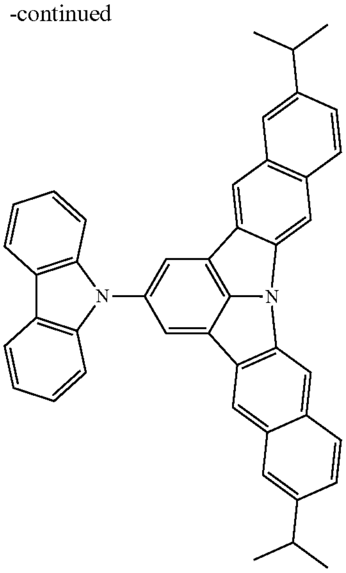
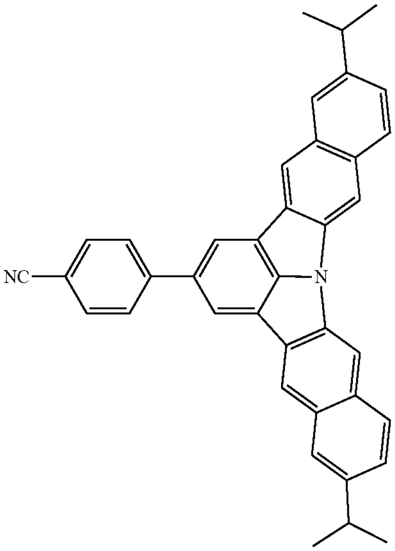
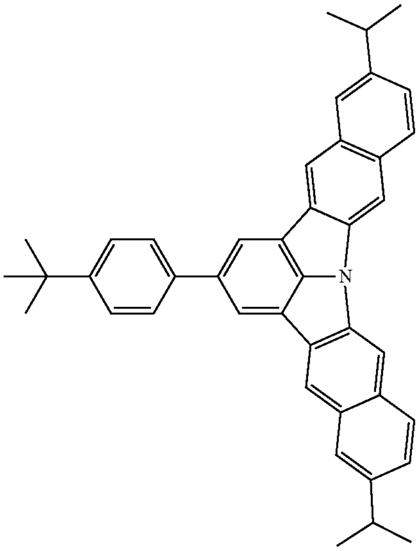
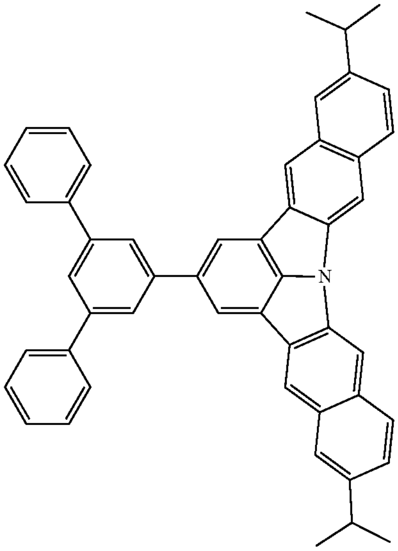
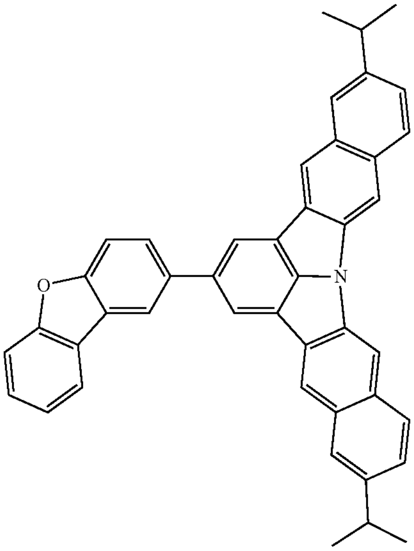

-continued
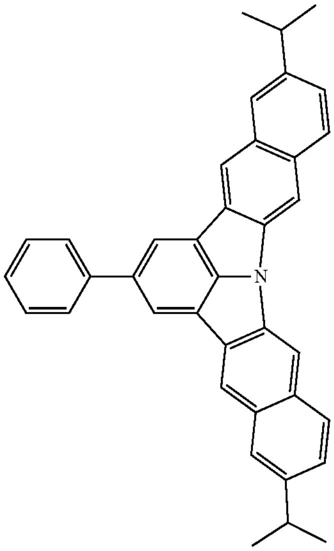
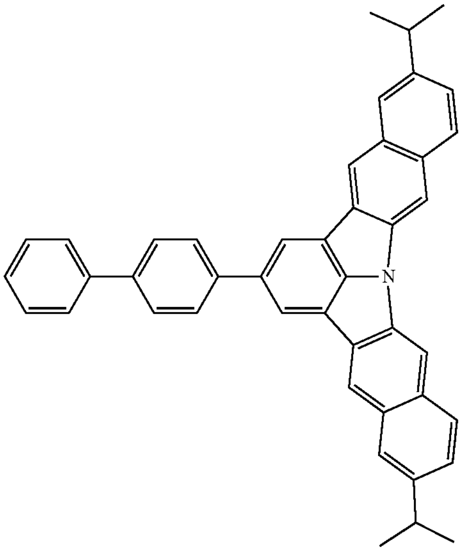
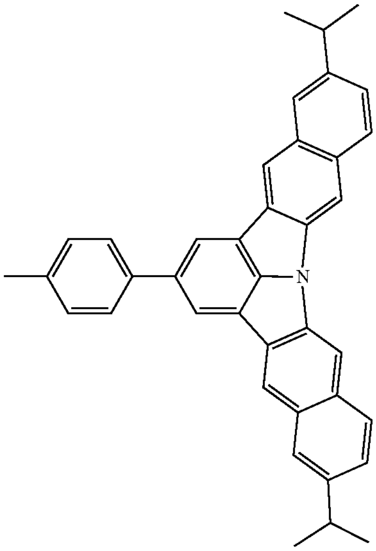
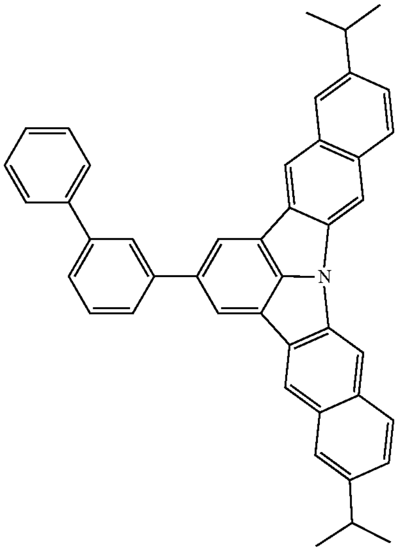
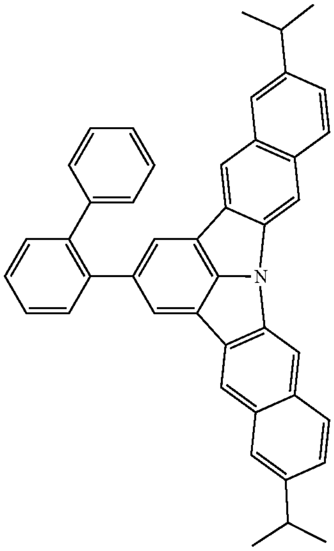
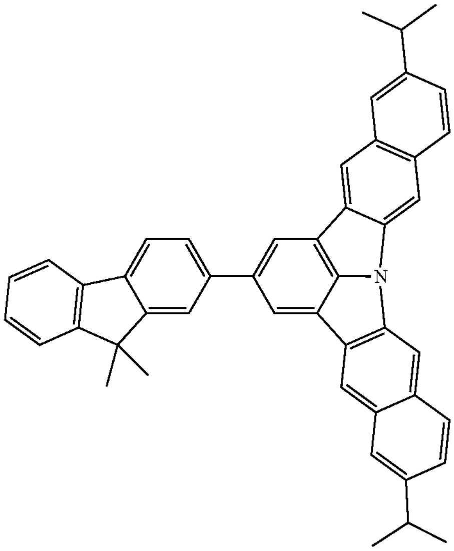

-continued
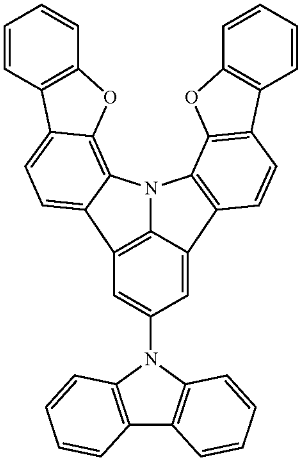
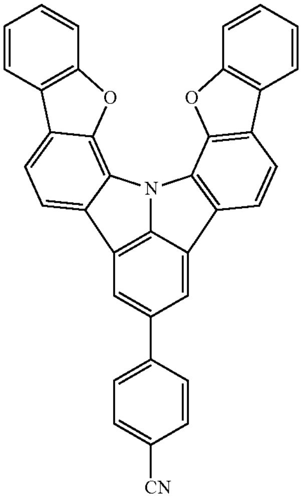
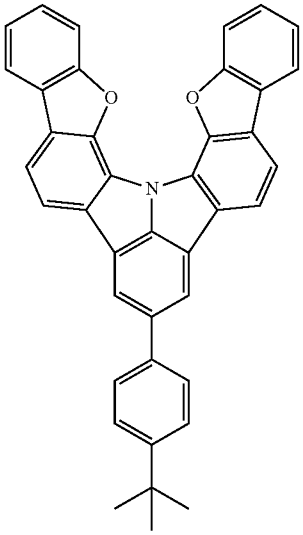
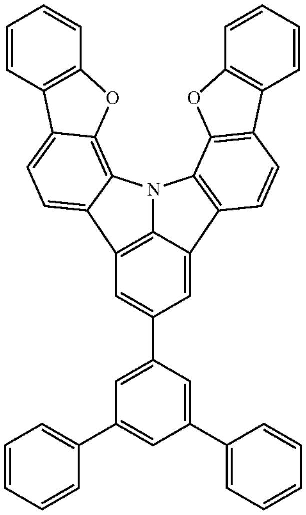
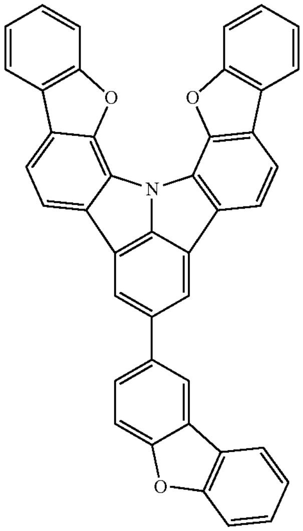
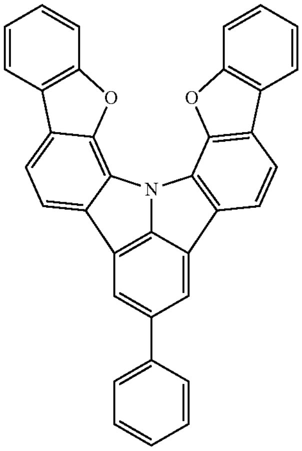
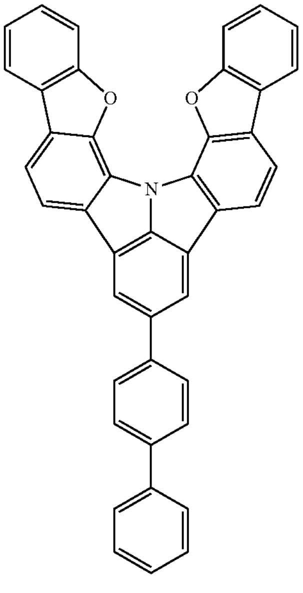
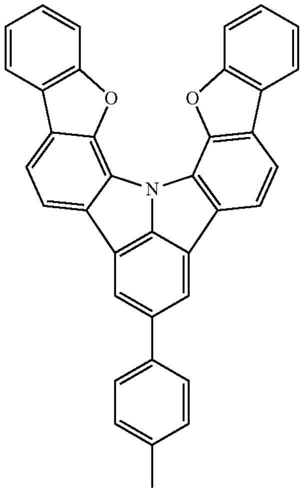
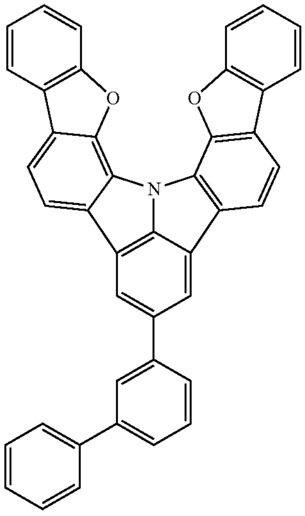

-continued
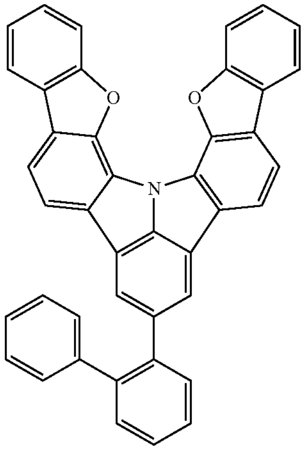
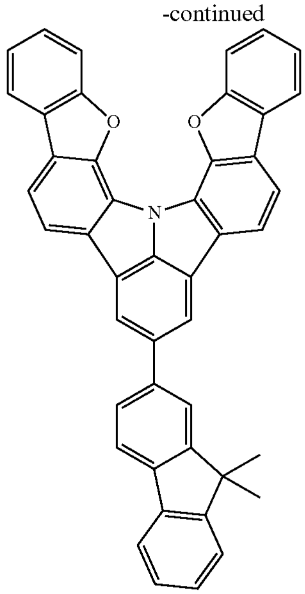
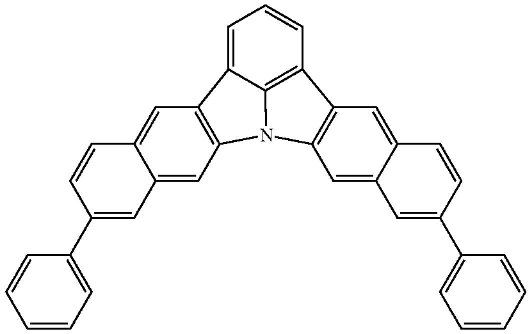
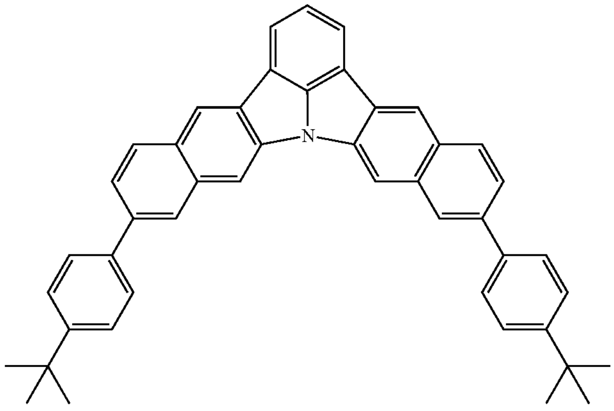
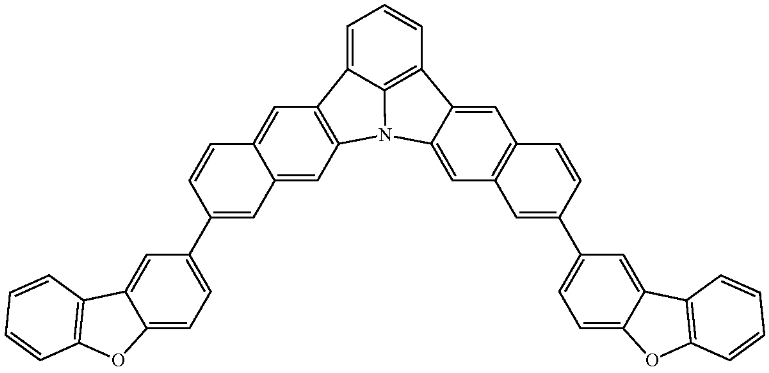

-continued
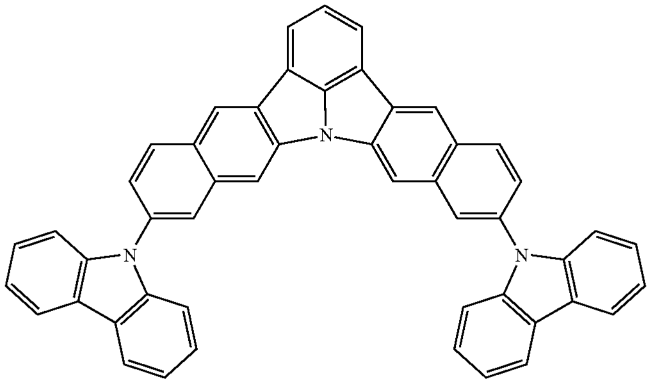
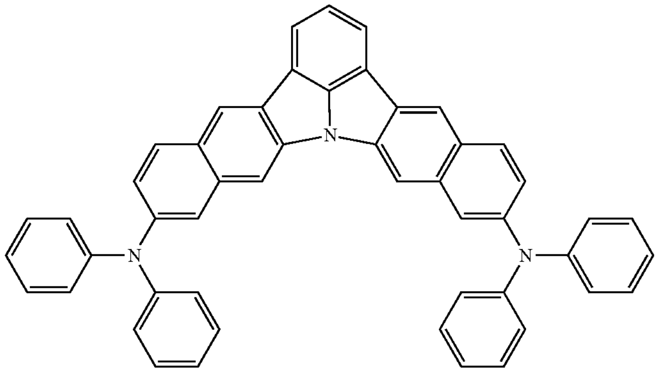
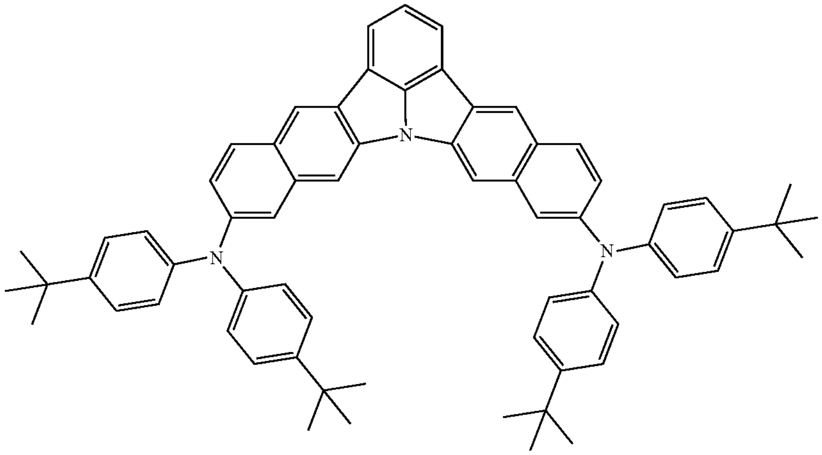
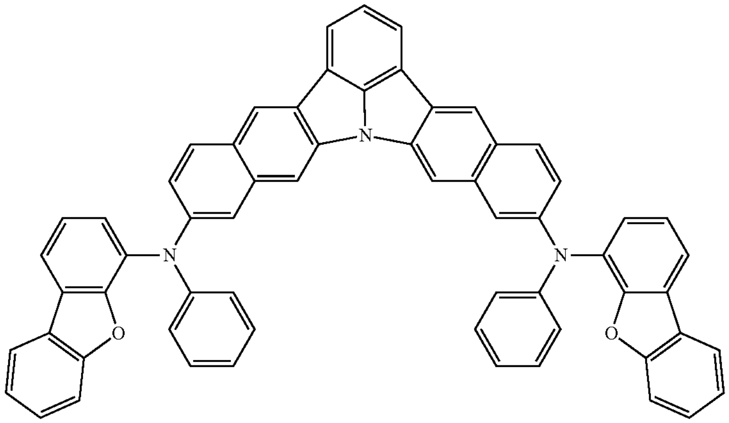

-continued
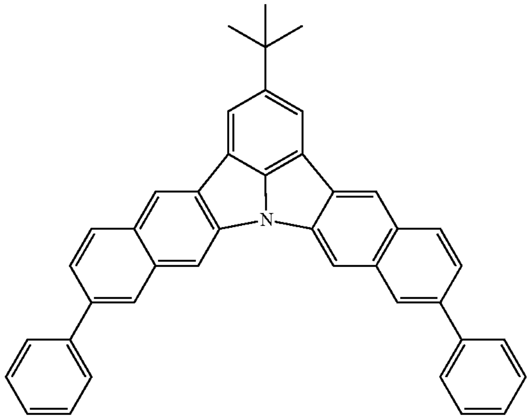
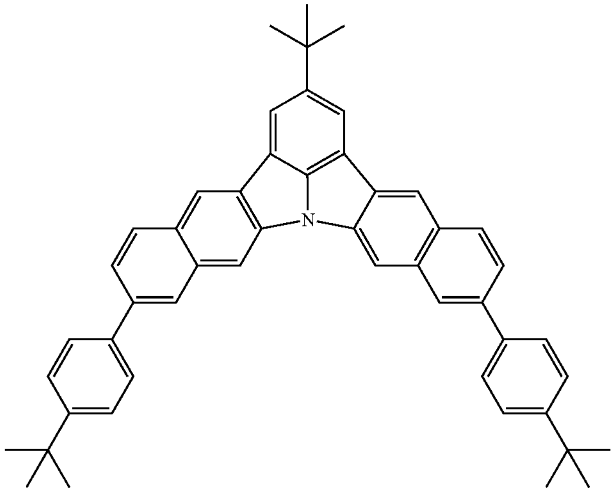
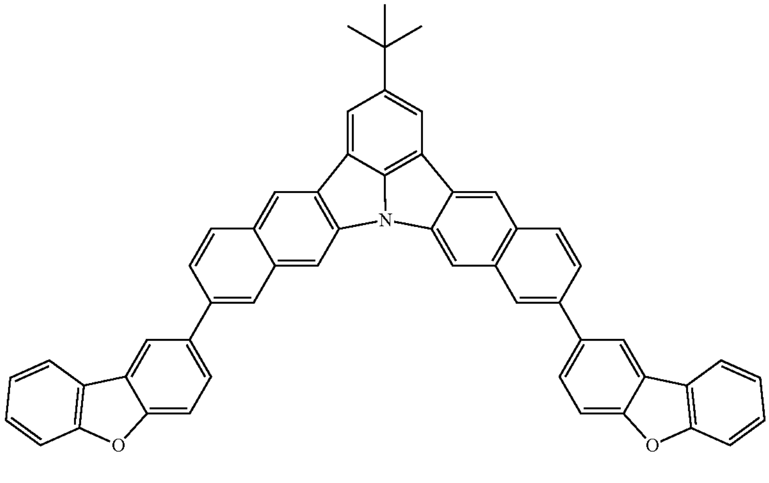

-continued
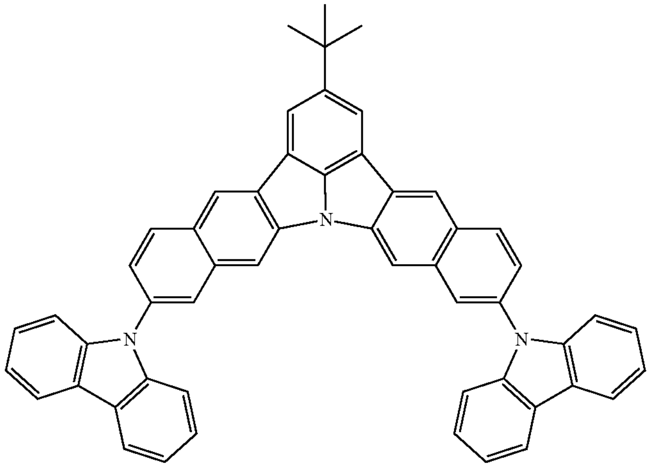
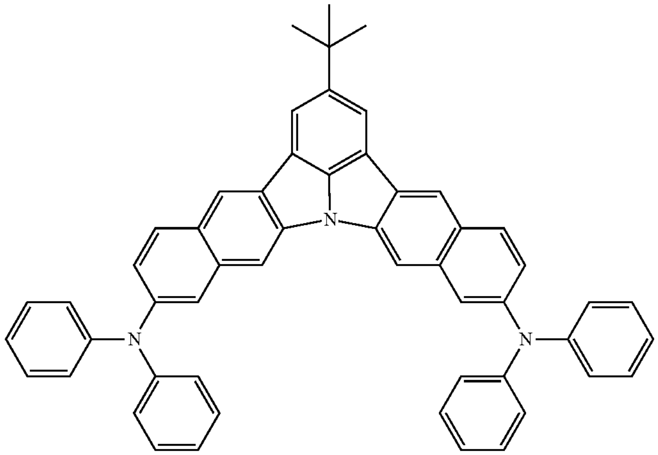
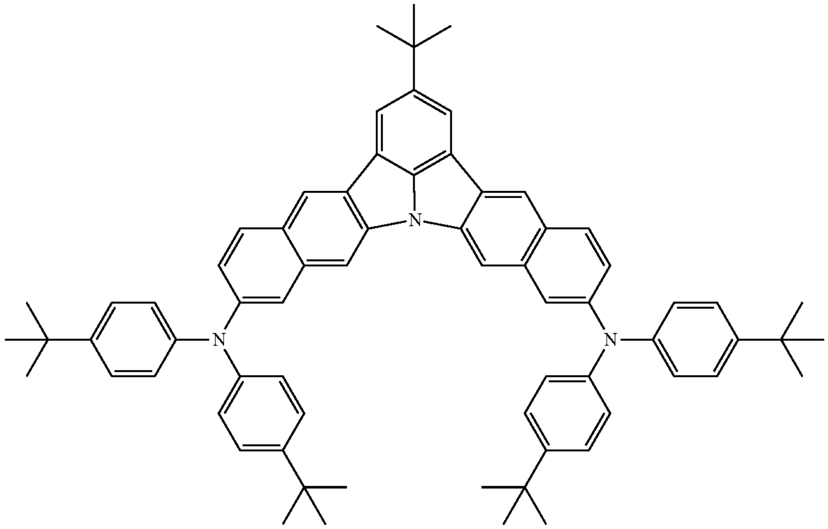

-continued
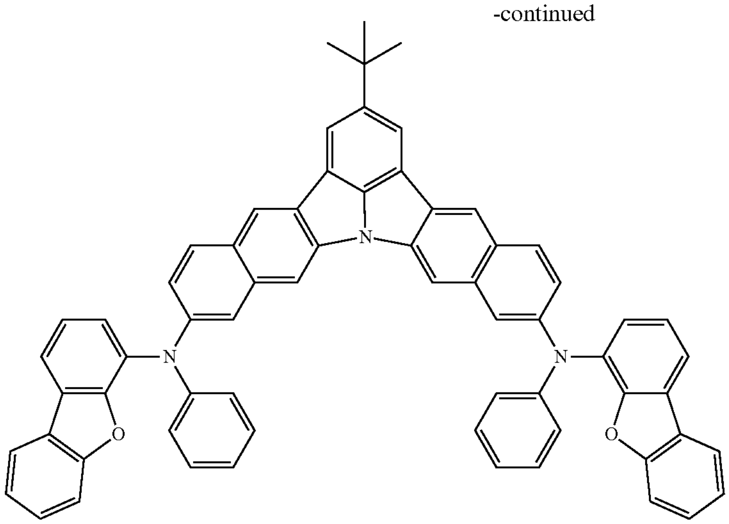
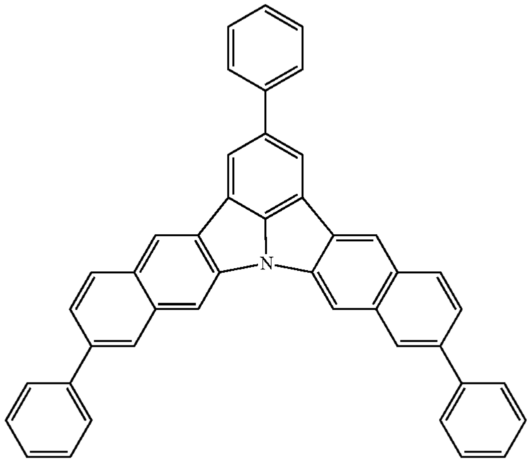
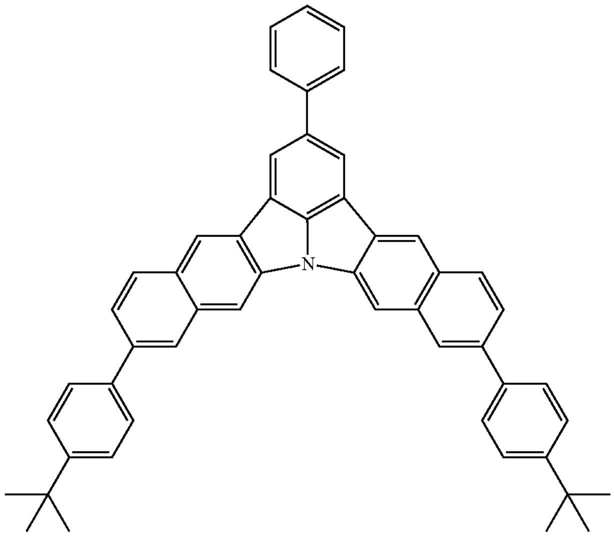

-continued
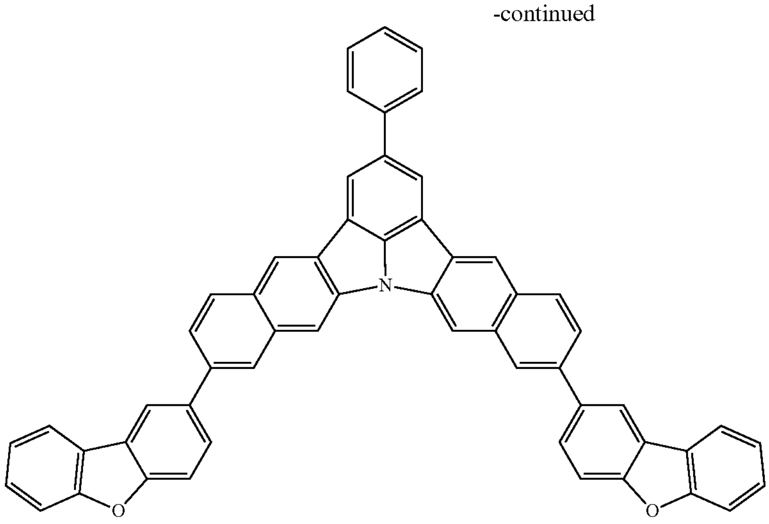
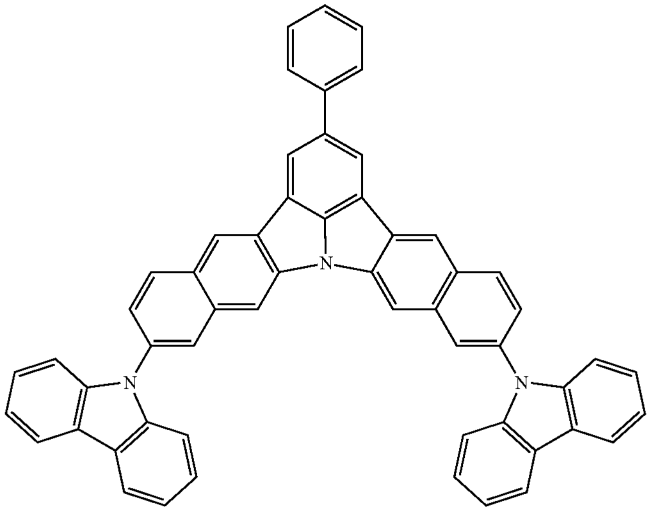
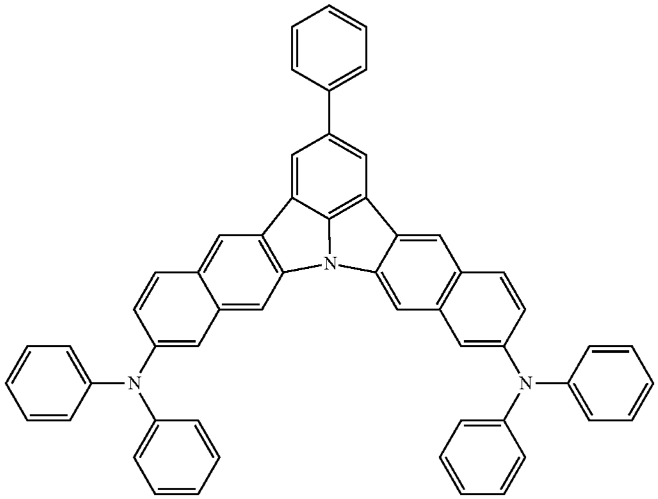

-continued
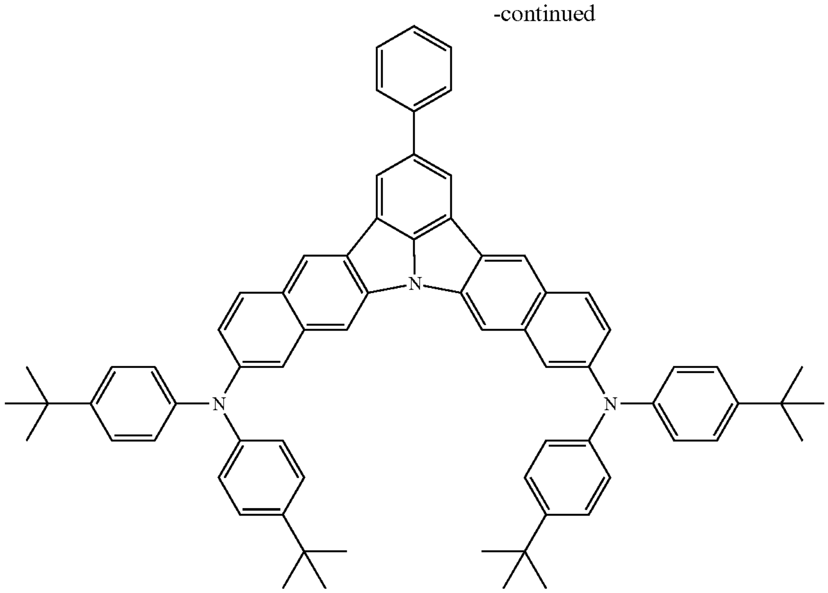
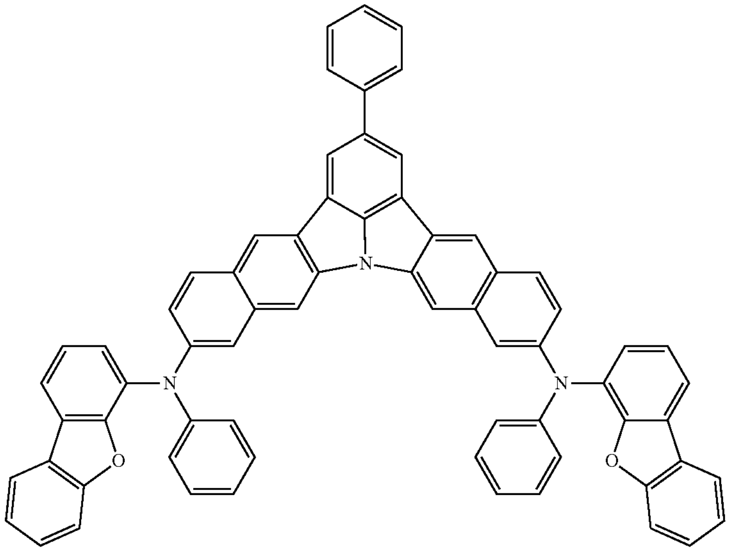
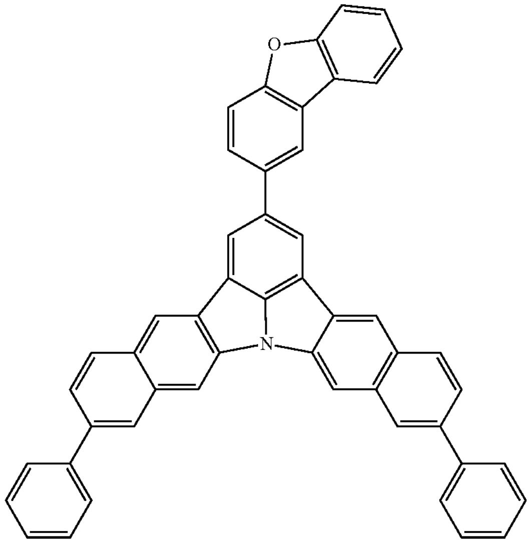

-continued
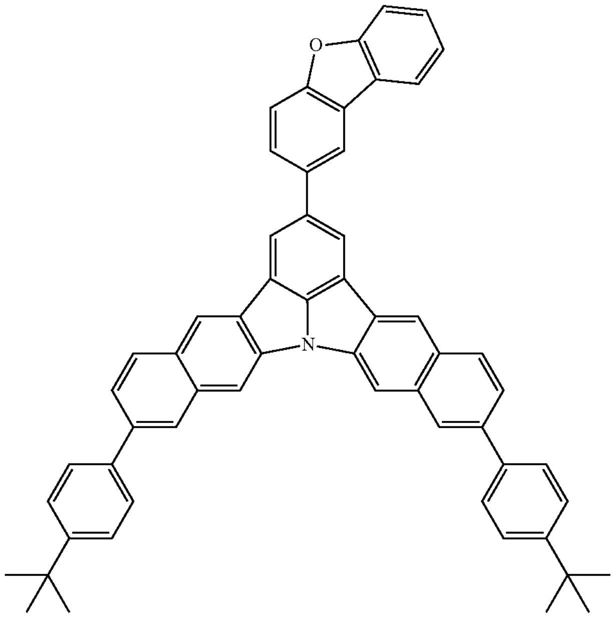
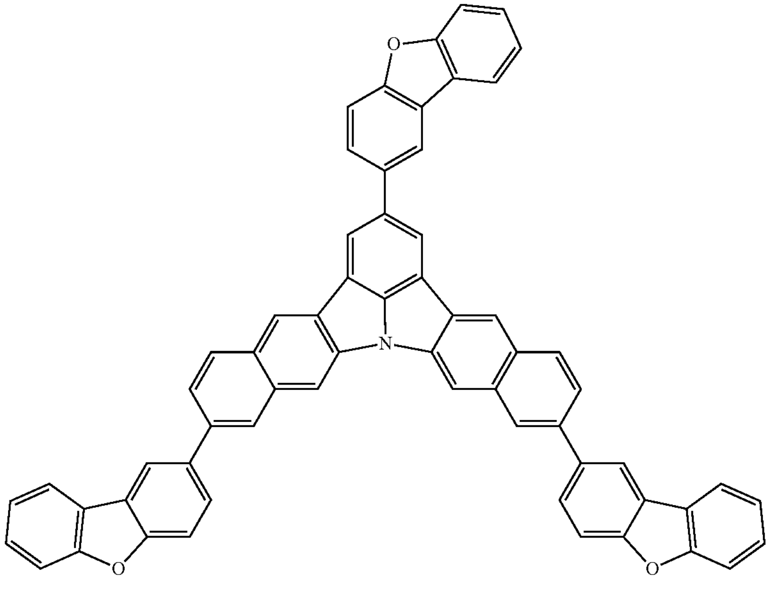

-continued
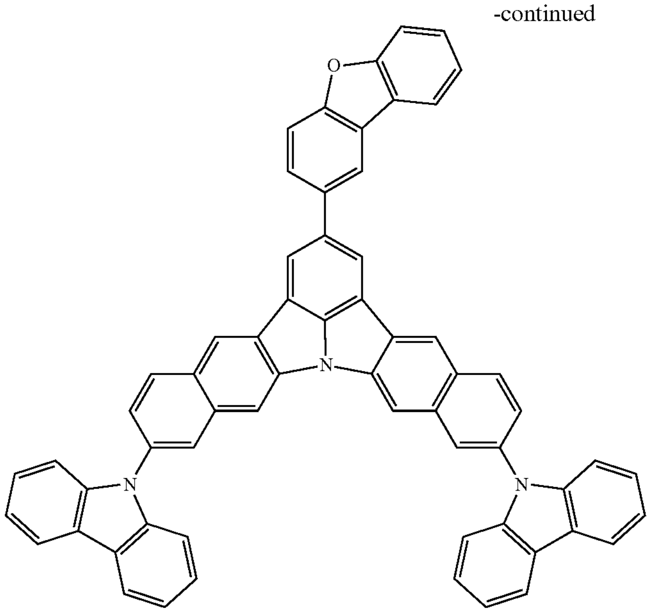
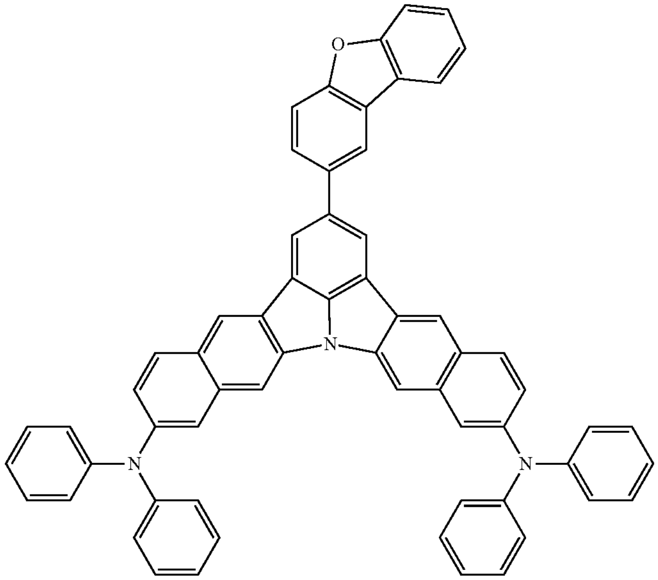

-continued
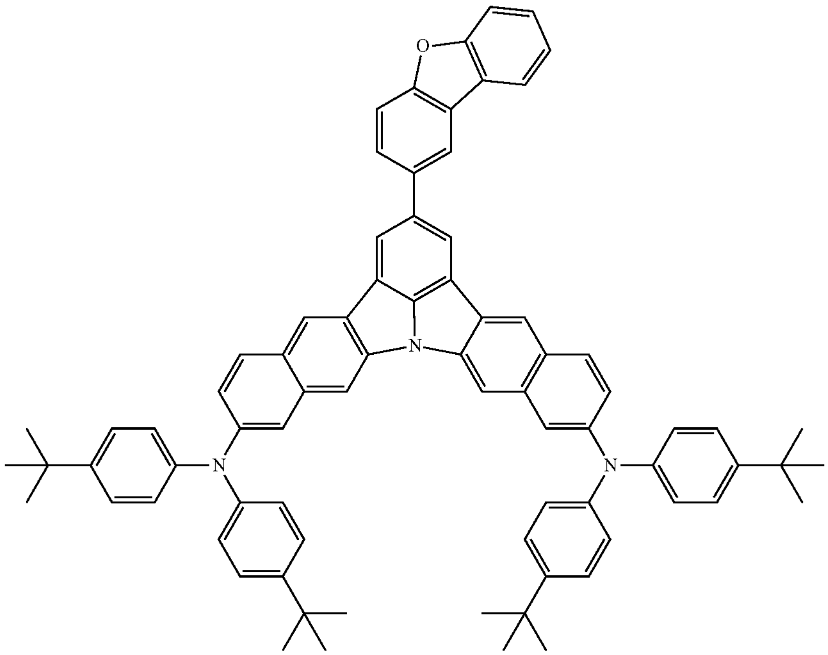
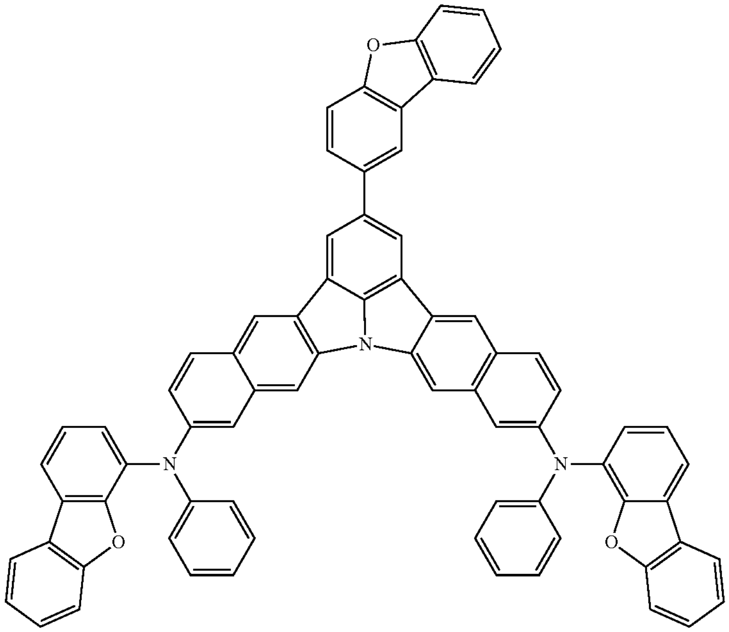
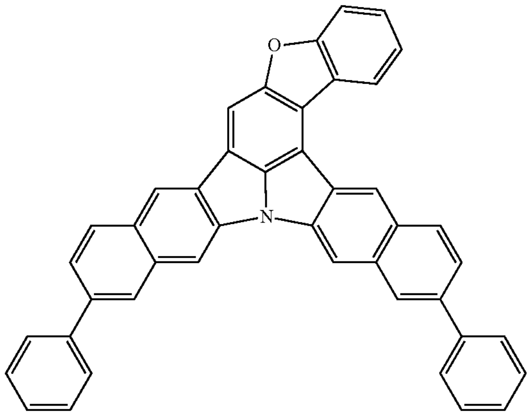

-continued
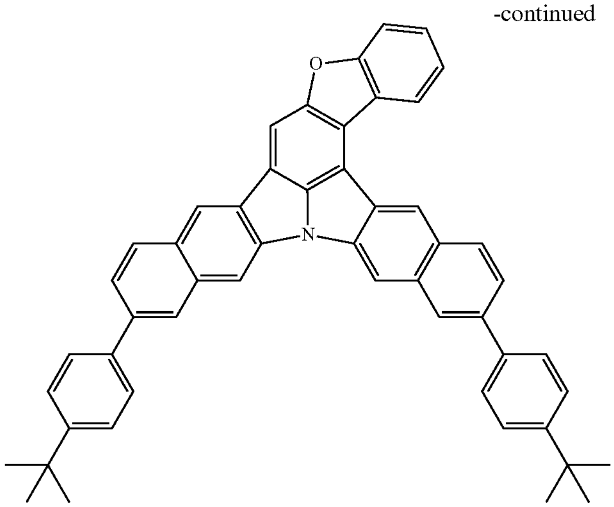
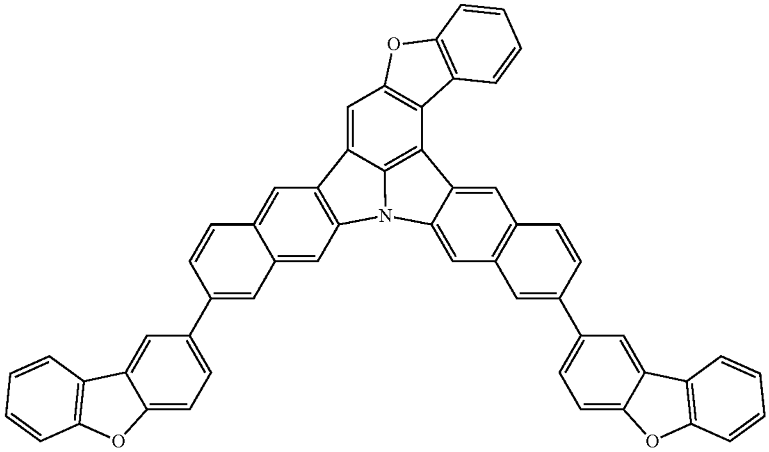
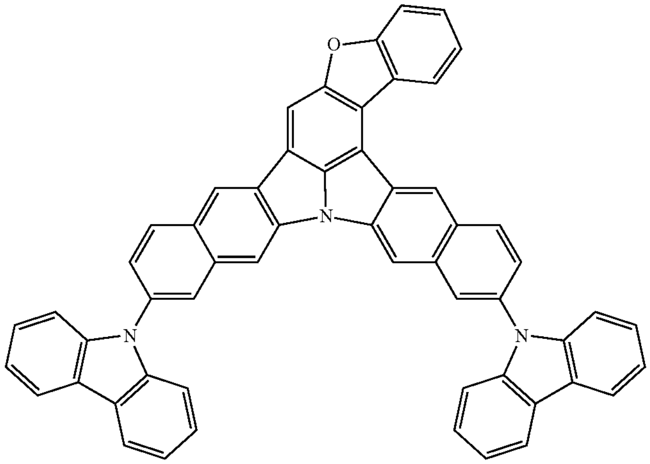

-continued
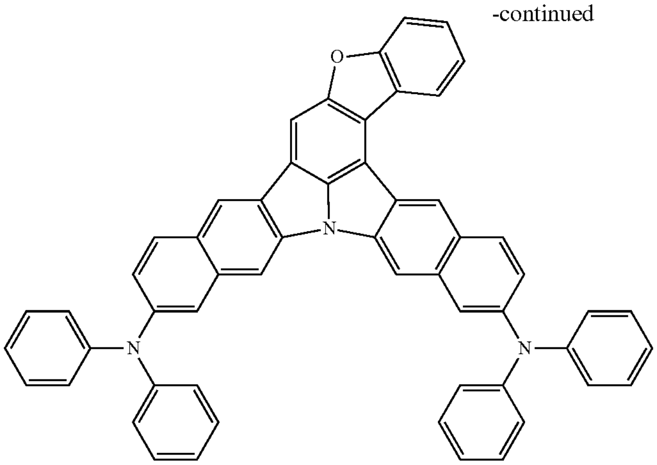
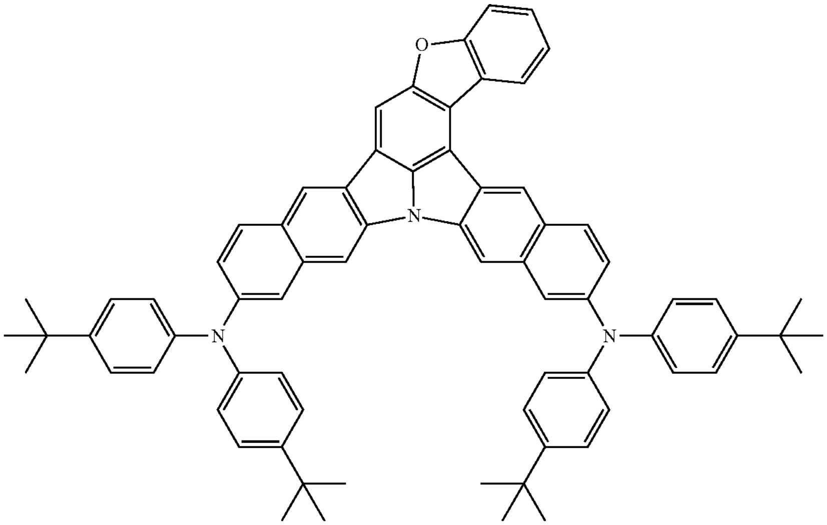
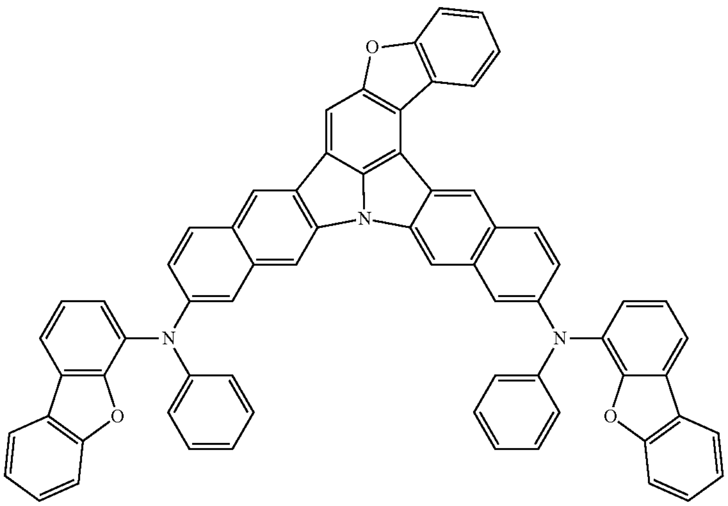

-continued
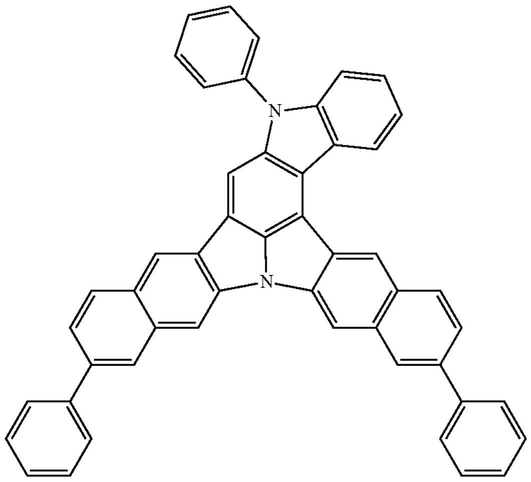
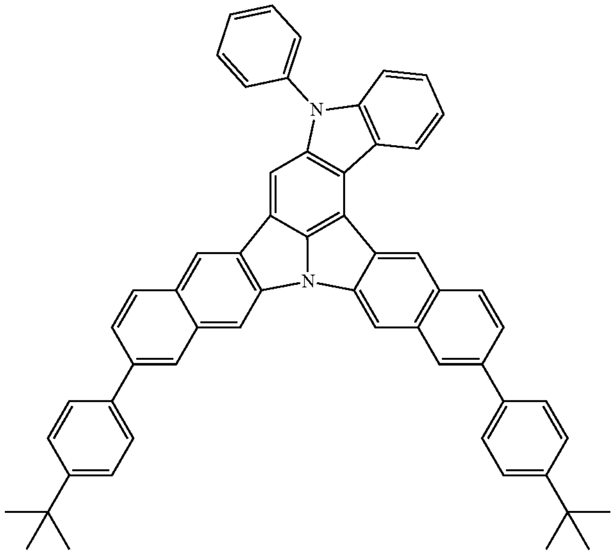
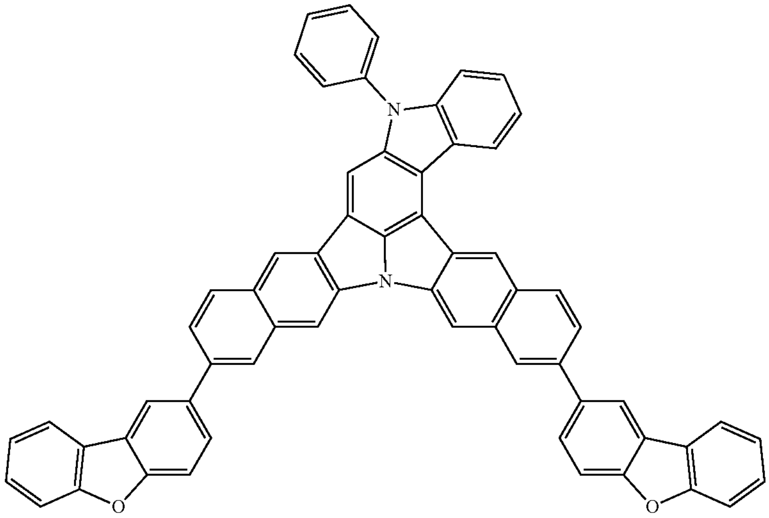

-continued
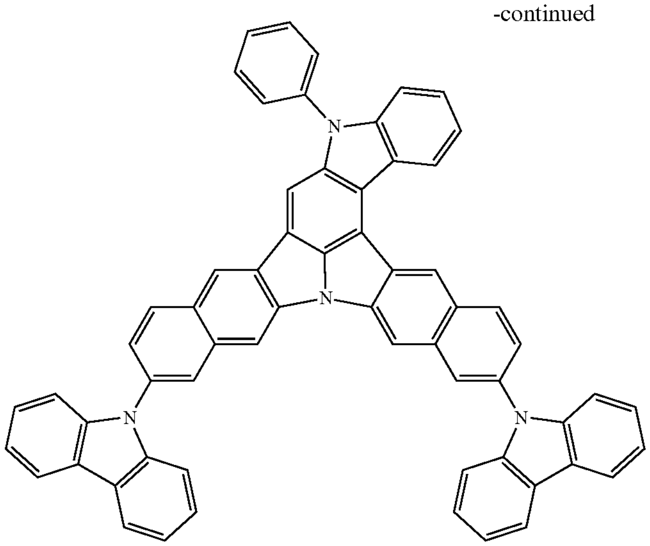
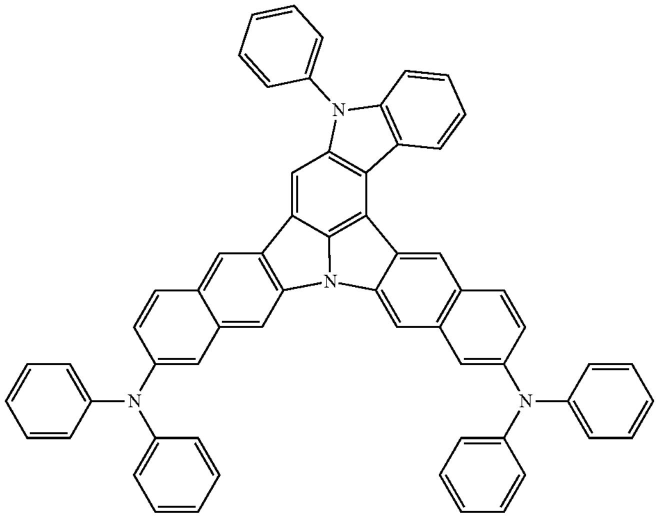
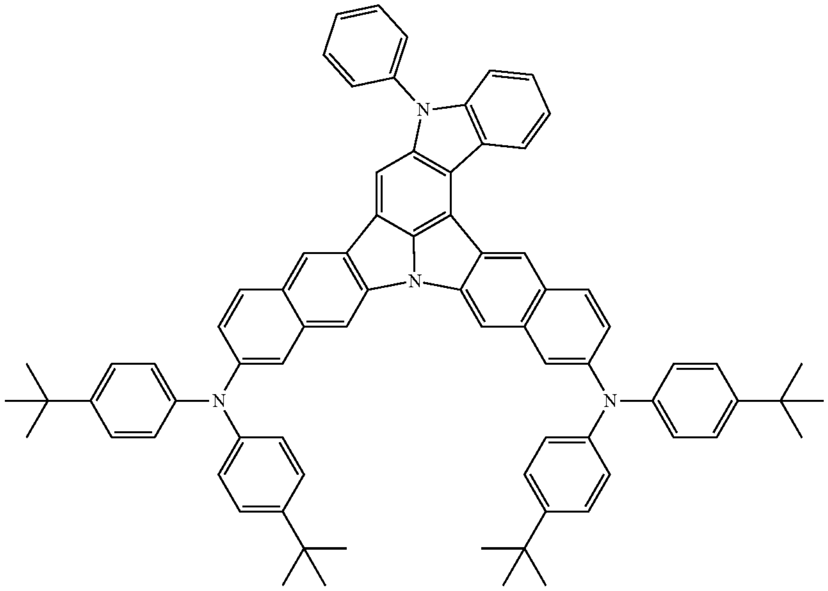

-continued
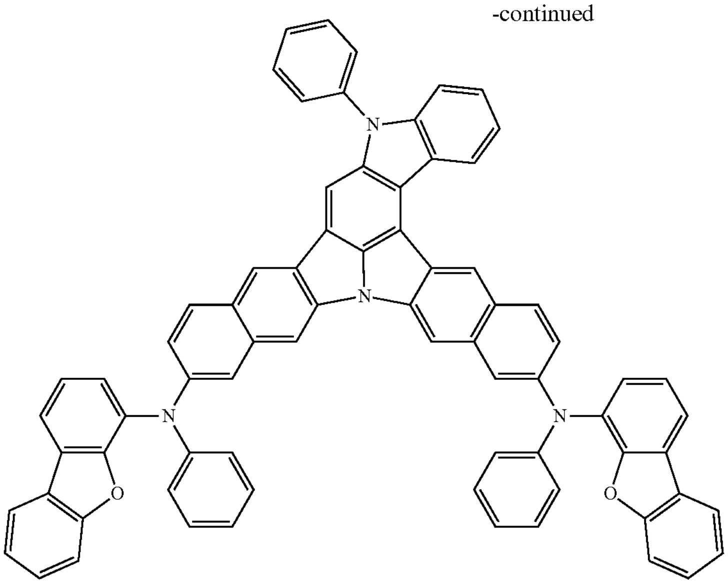
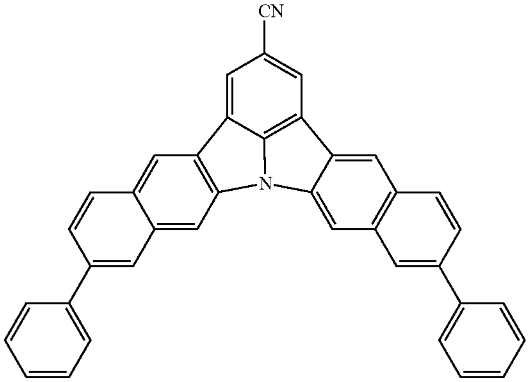
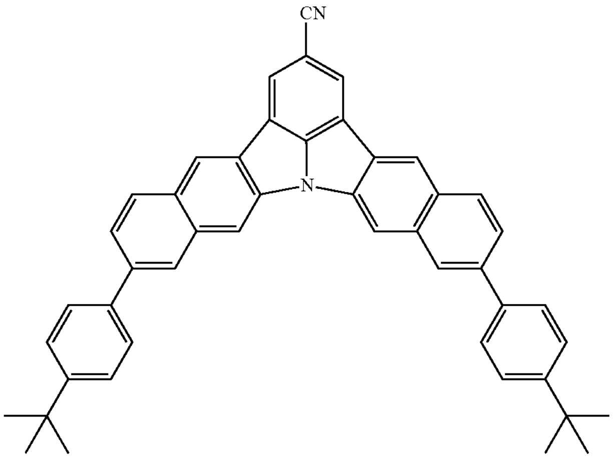

-continued
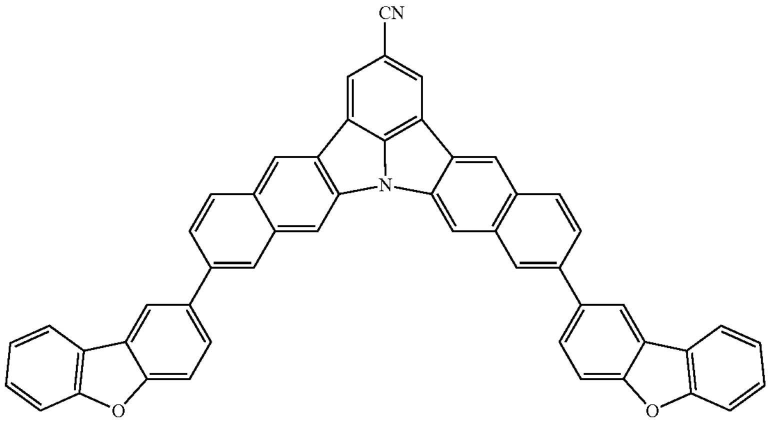
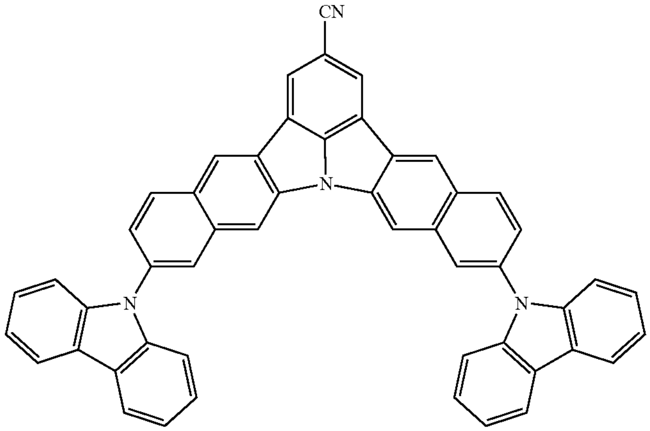
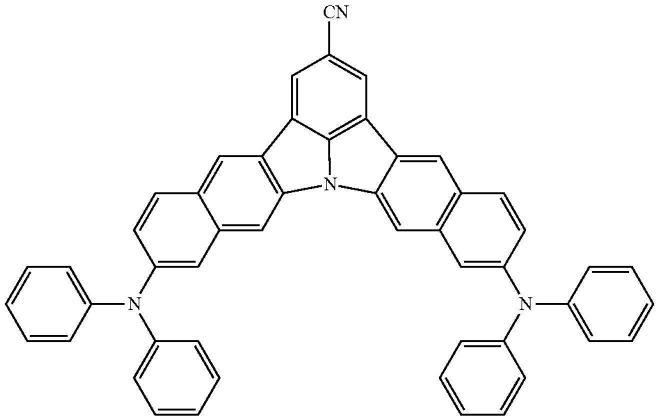

-continued
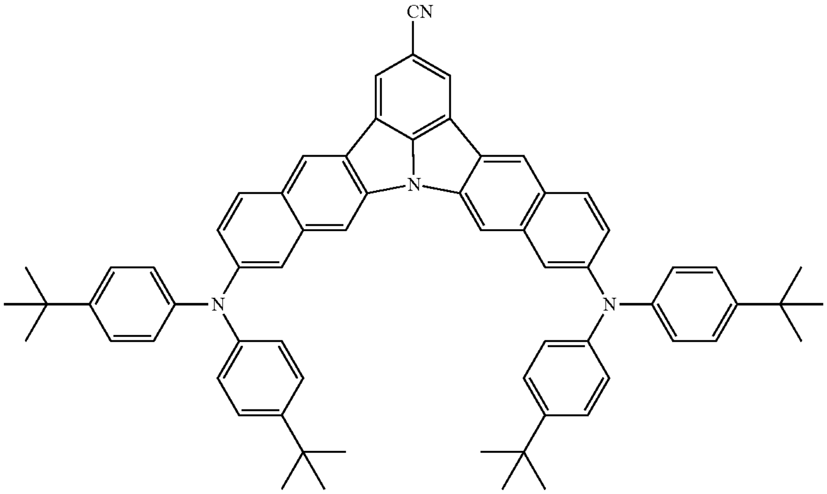
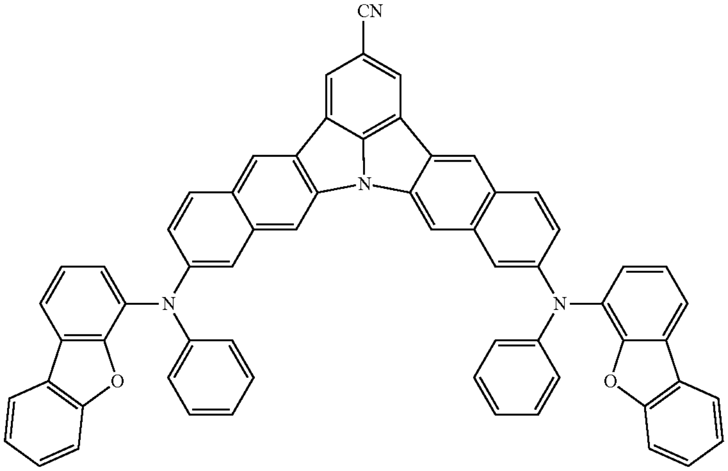
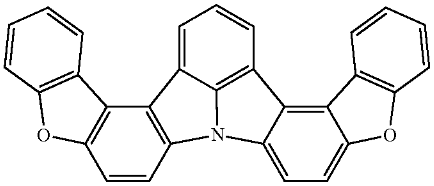
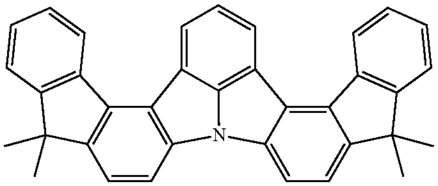
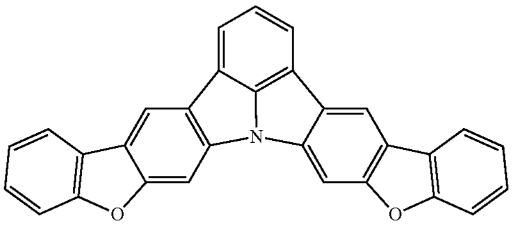
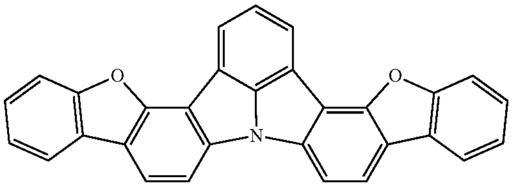
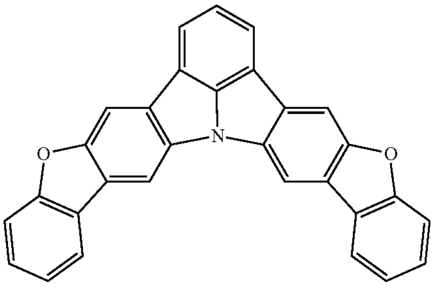

-continued
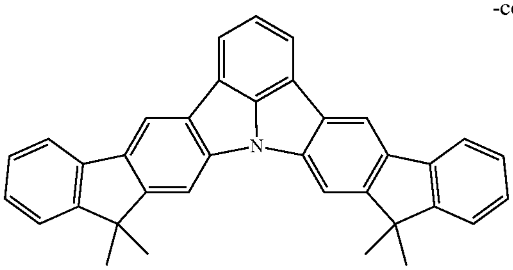
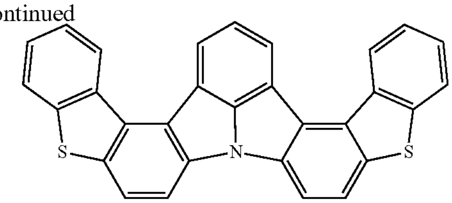
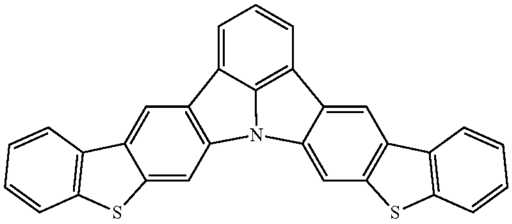
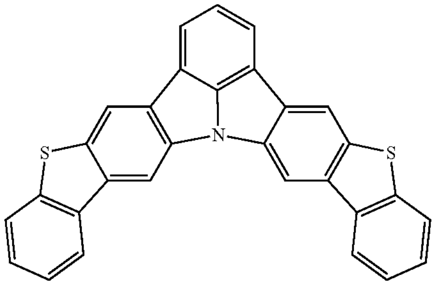
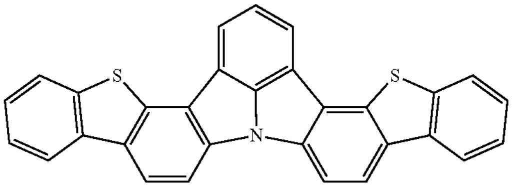
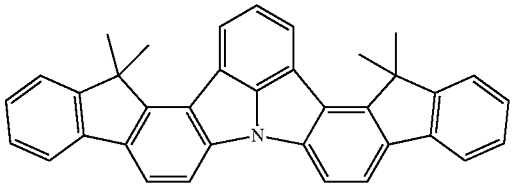
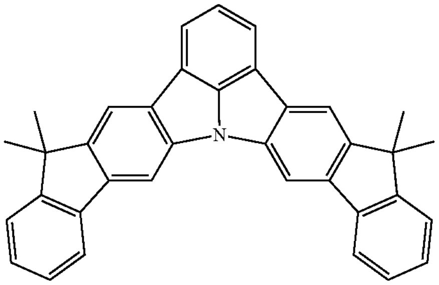
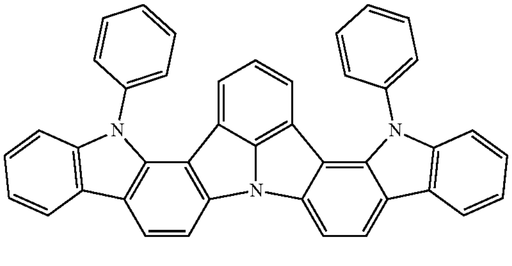
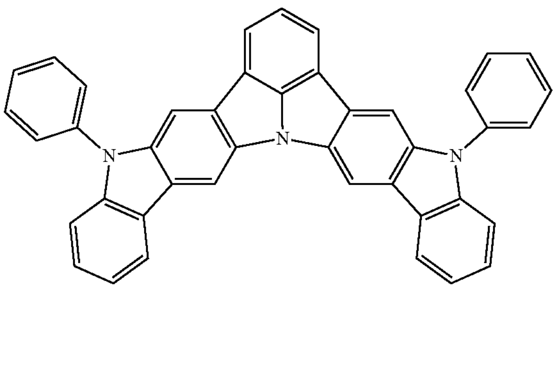
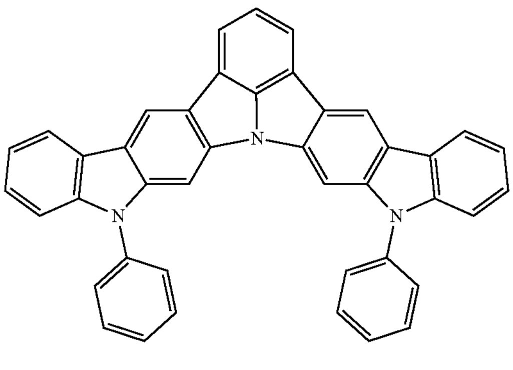

-continued
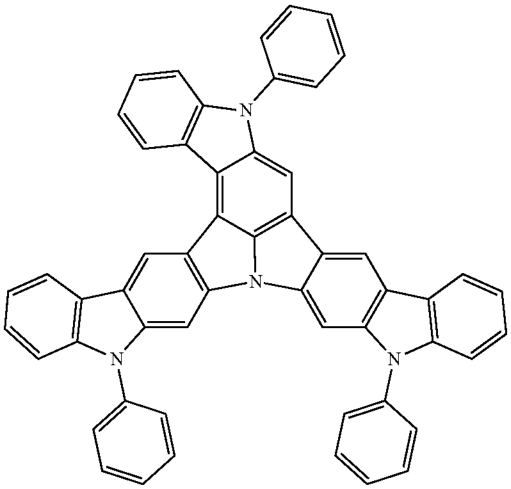
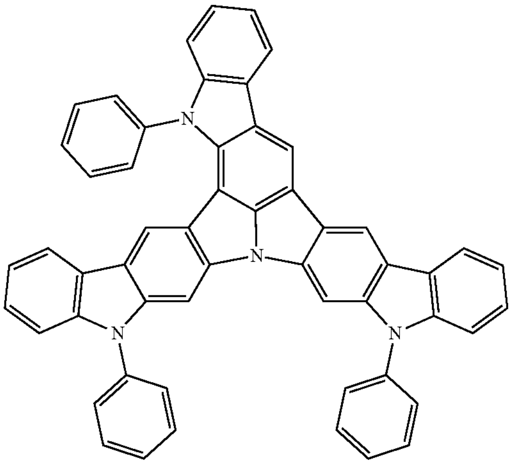
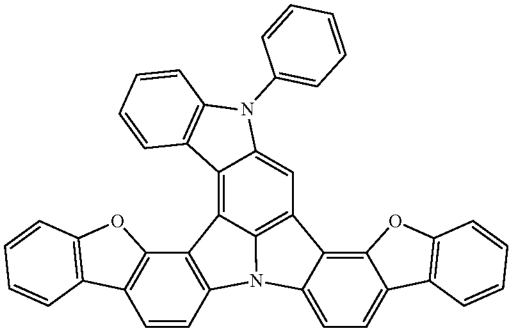
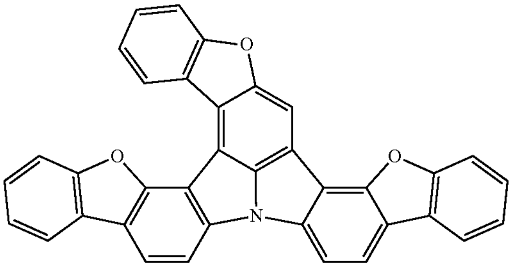
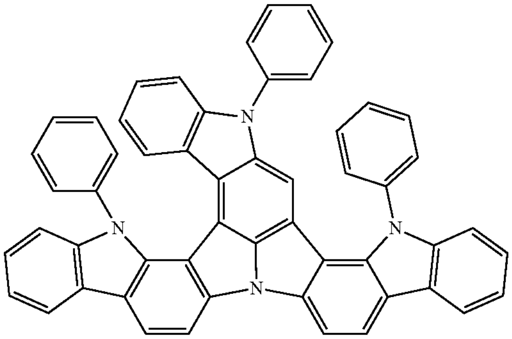
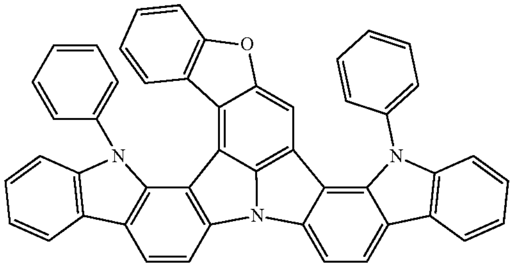
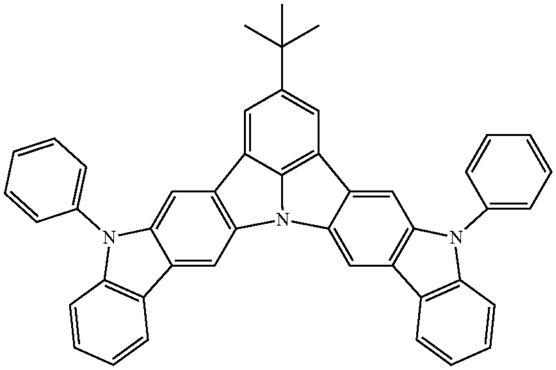
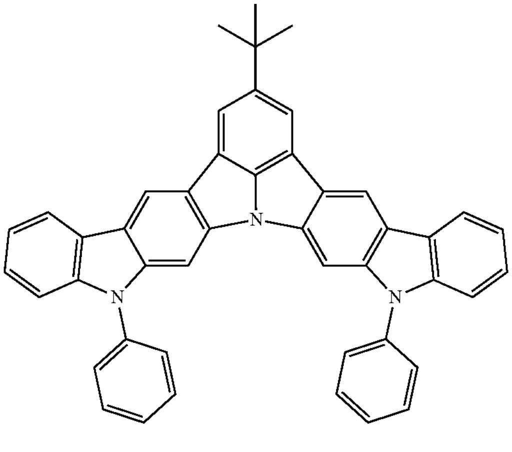

-continued
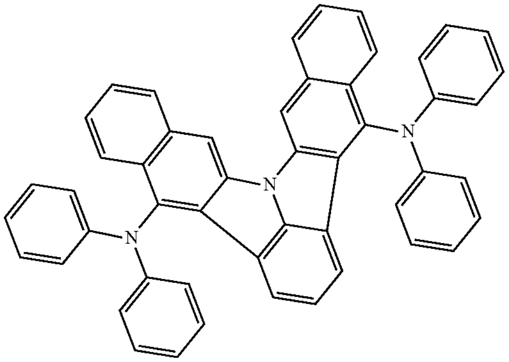
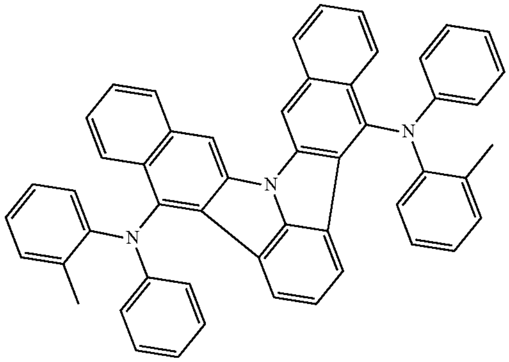
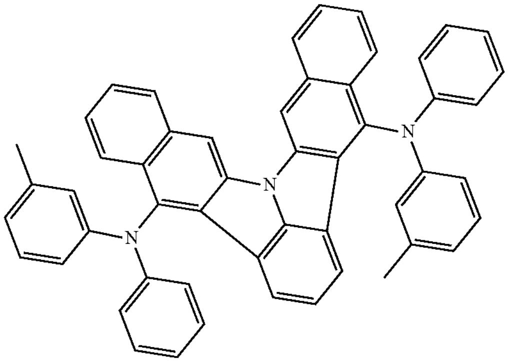
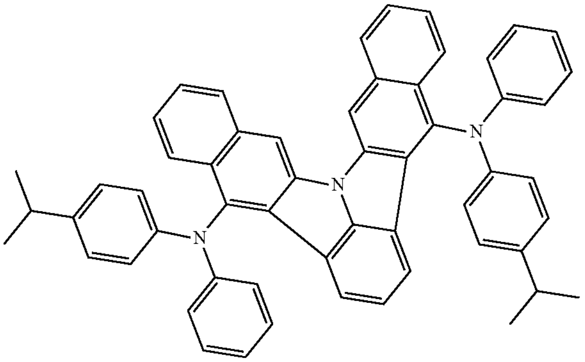
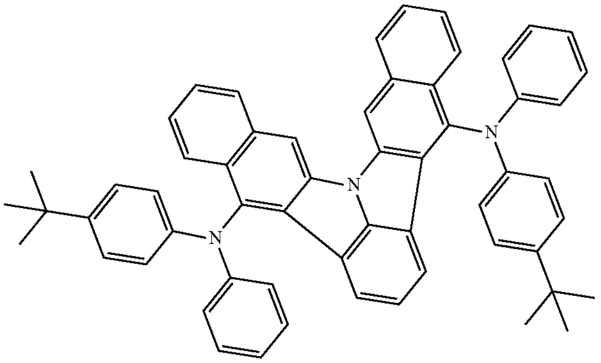
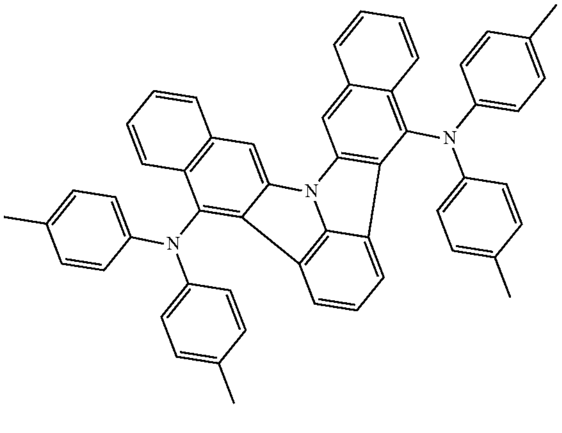
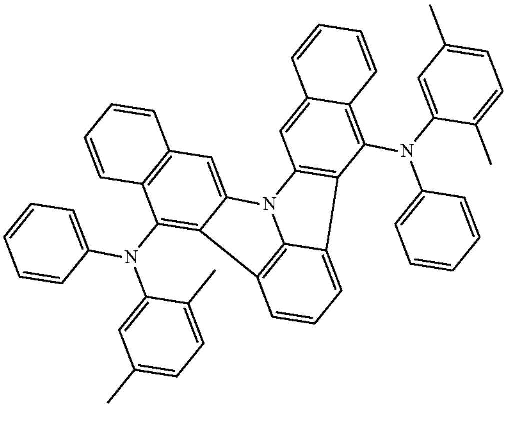

-continued
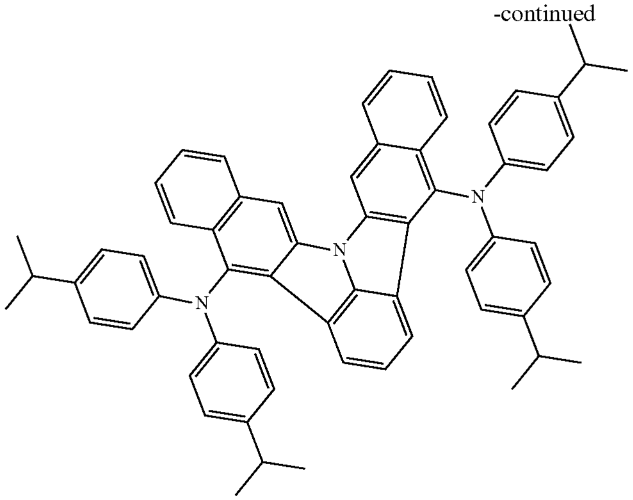
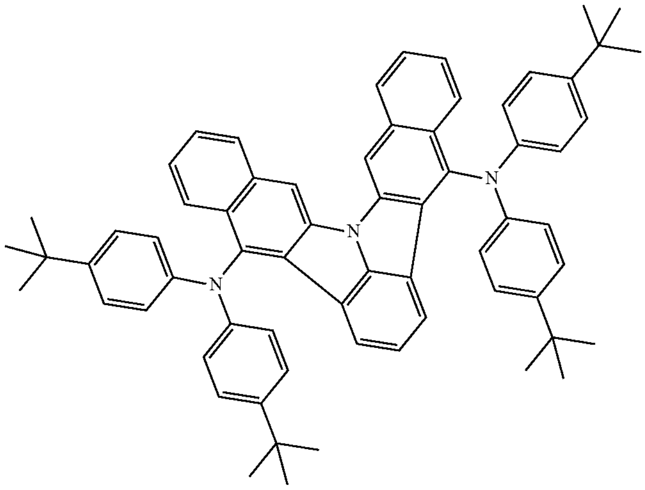
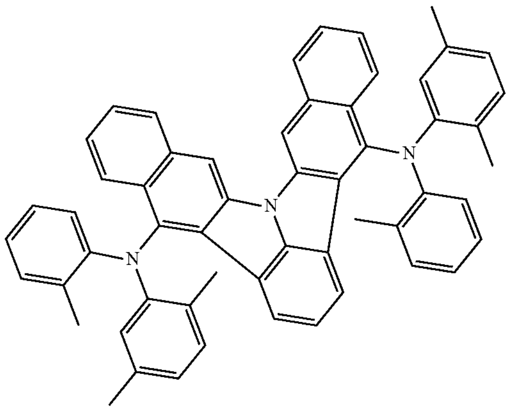
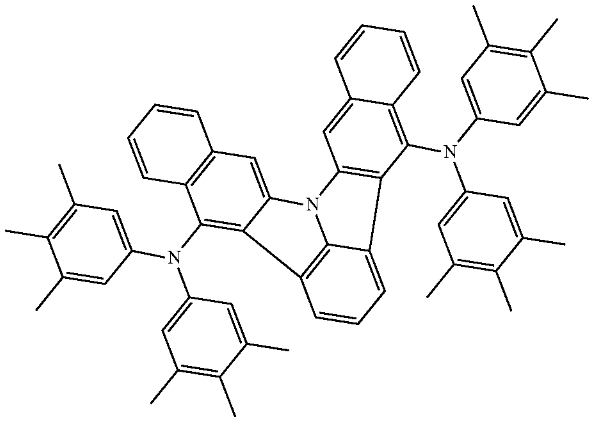

-continued
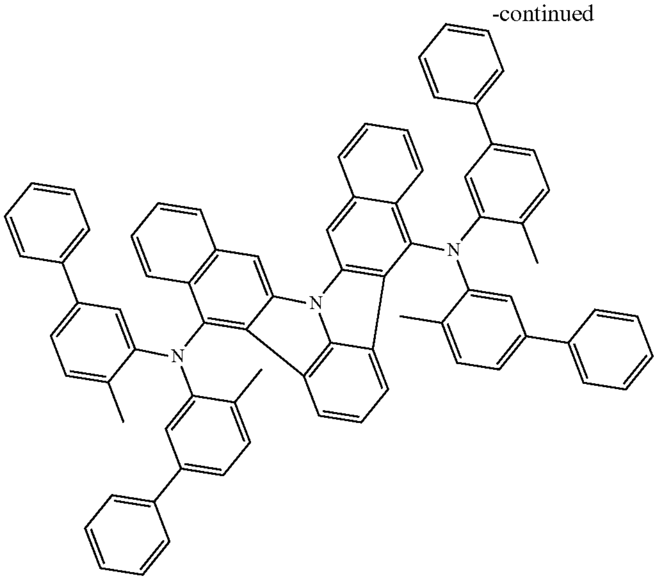
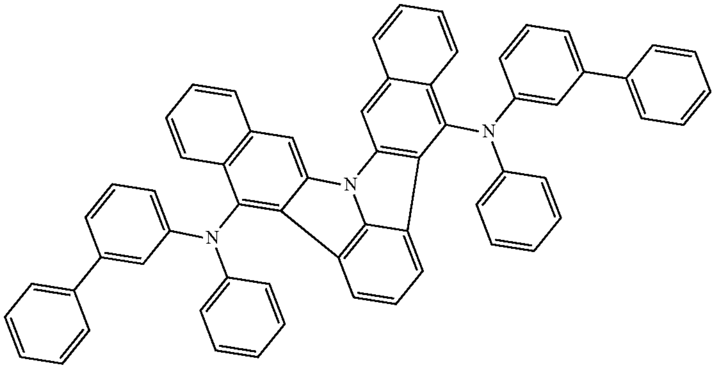
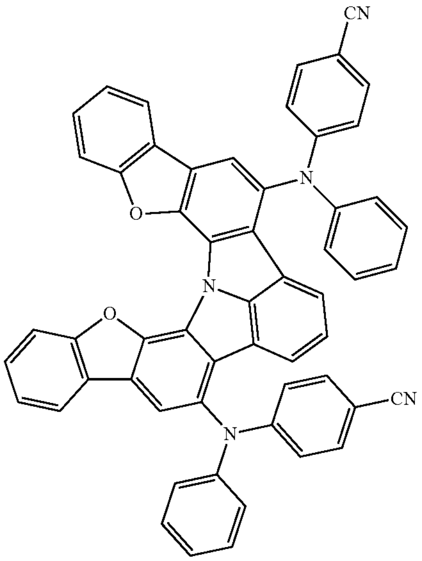
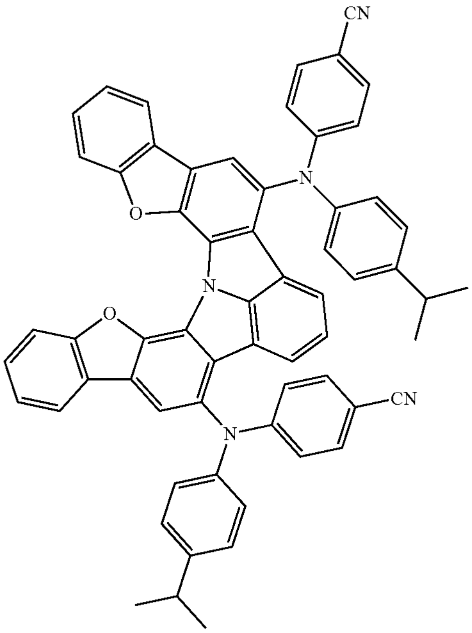

-continued
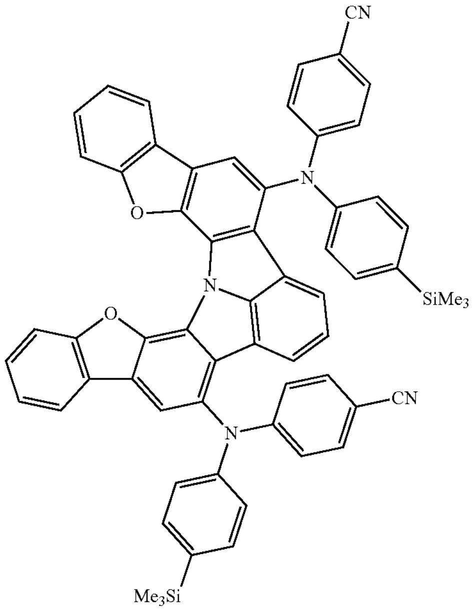
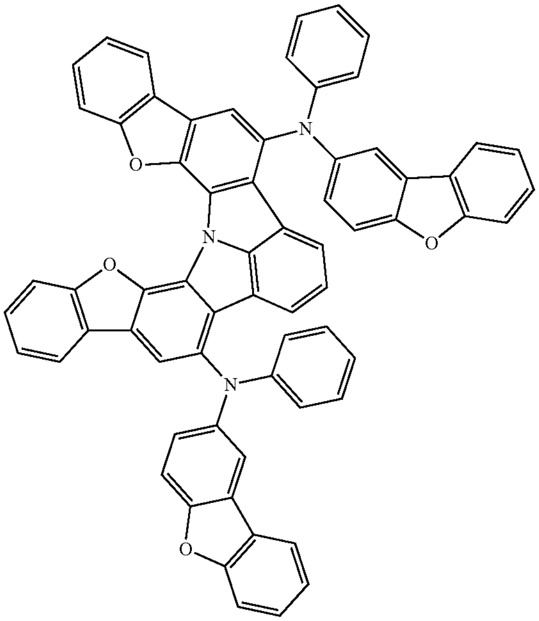
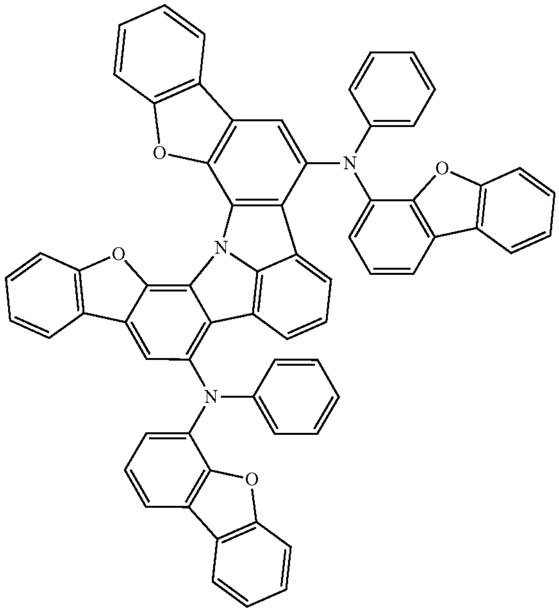

-continued
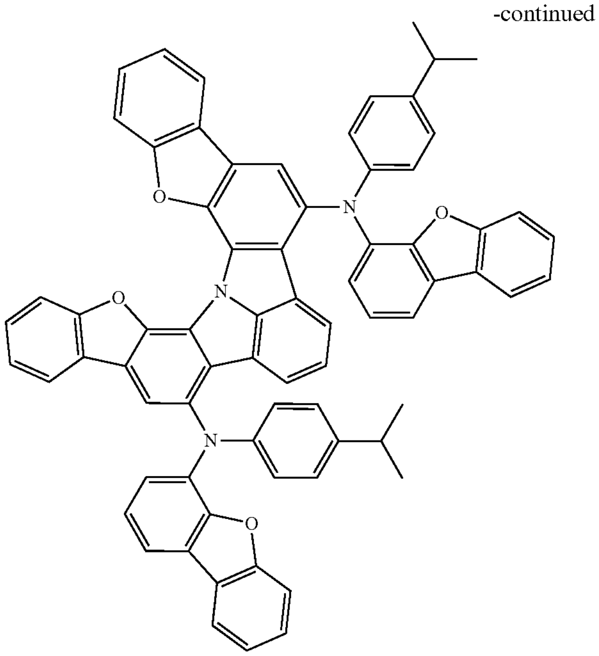
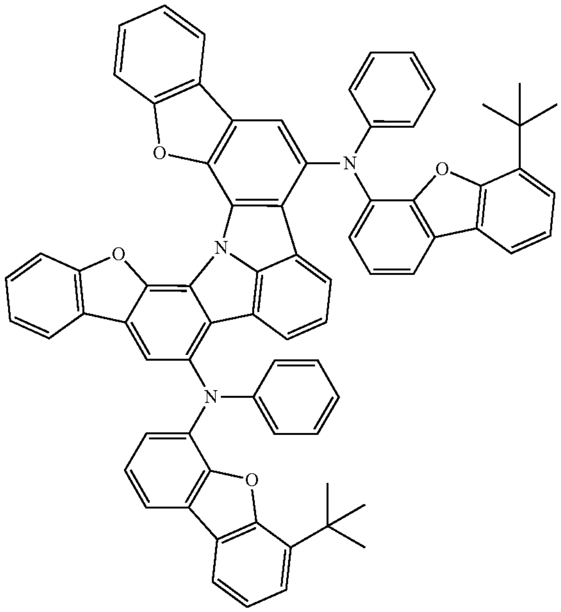

-continued
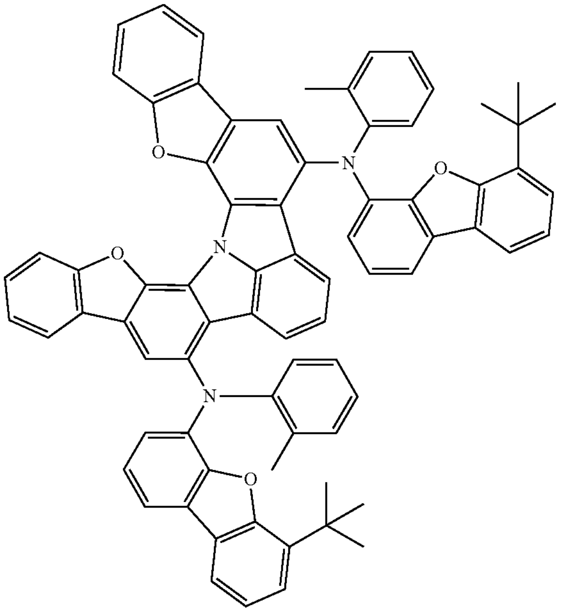
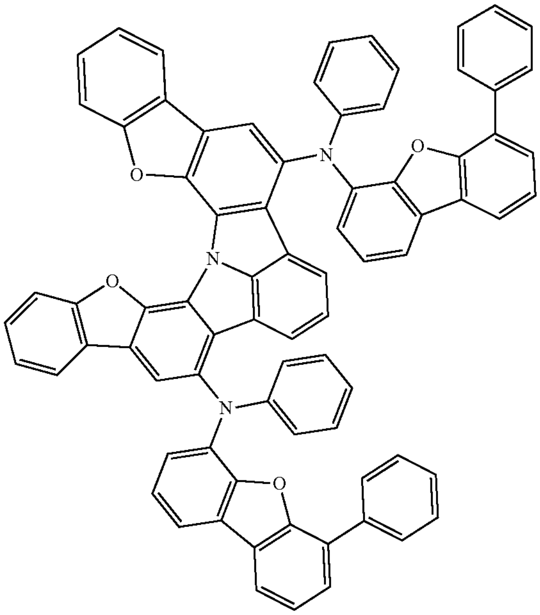

-continued
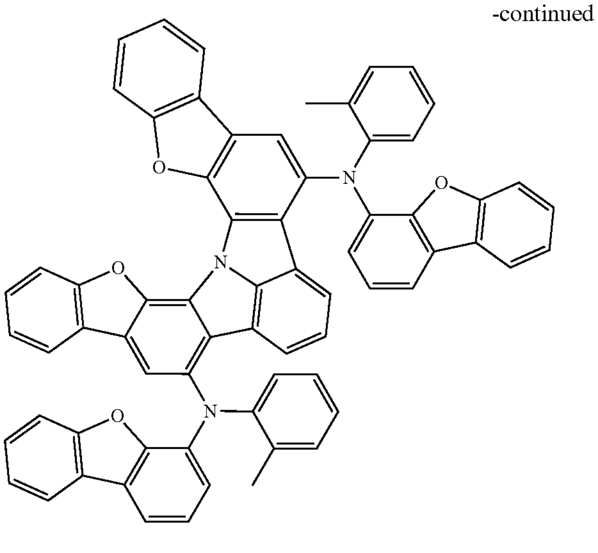
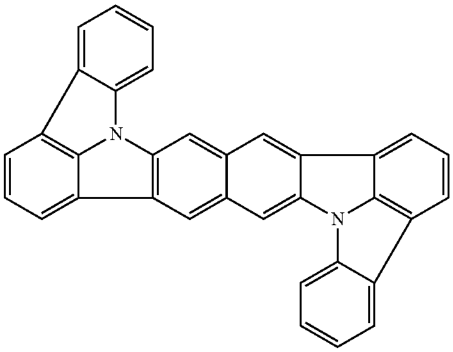
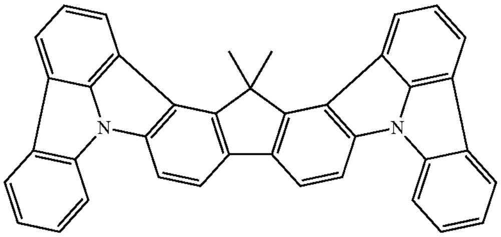
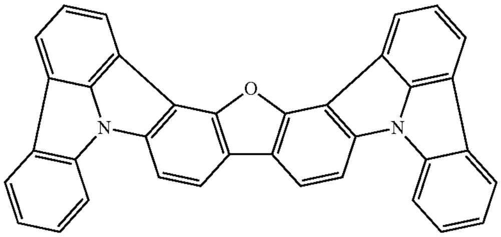
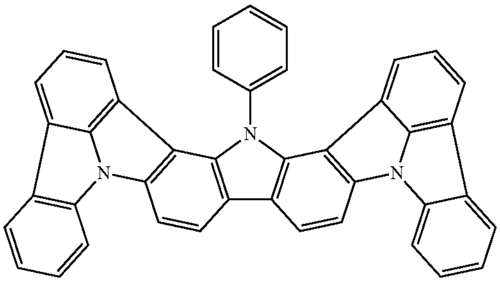
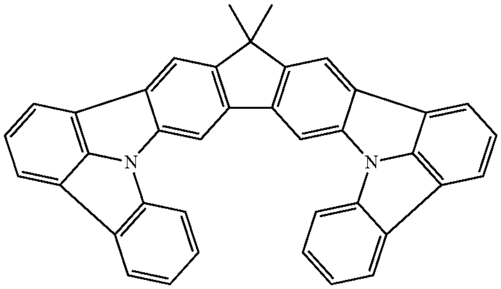
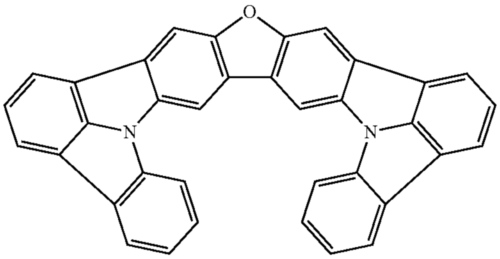

-continued
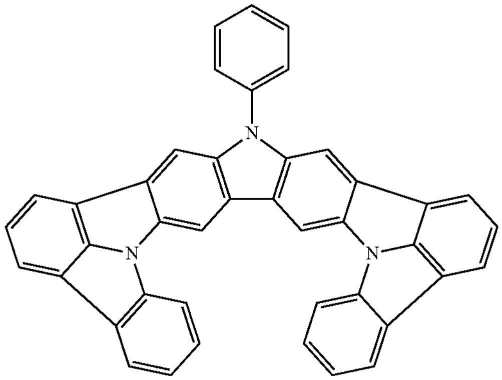
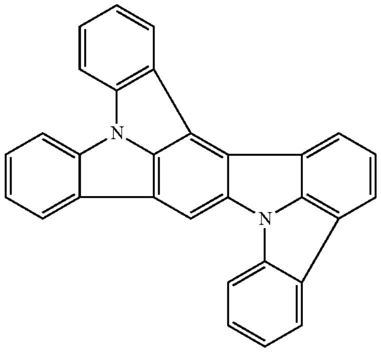
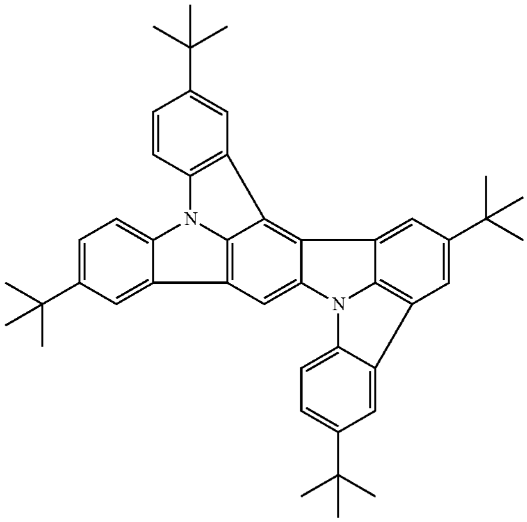
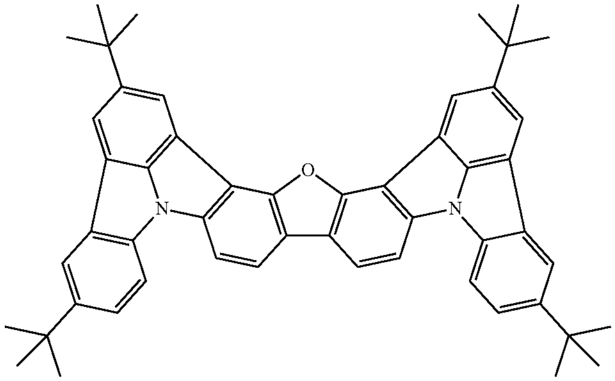

(Compound Represented by Formula (31))

The compound represented by the formula (31) is explained below. The compound represented by the formula (31) is a compound corresponding to the above-mentioned compound represented by the formula (21-3).

(31)

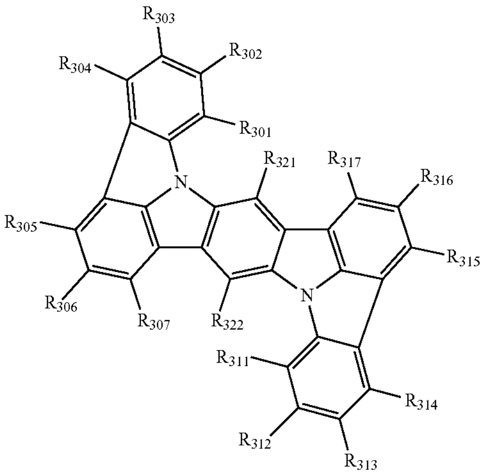

In the formula (31), one or more sets of two or more adjacent groups of $R_{301}$ to $R_{307}$ and $R_{311}$ to $R_{317}$ form a substituted or unsubstituted, saturated or unsaturated ring, or do not form a substituted or unsubstituted, saturated or unsaturated ring;

$R_{301}$ to $R_{307}$ and $R_{311}$ to $R_{317}$ that do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{321}$ and $R_{322}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

Examples of "one set of two or more adjacent groups of $R_{301}$ to $R_{307}$ and $R_{311}$ to $R_{317}$" are sets of $R_{301}$ and $R_{302}$, $R_{302}$ and $R_{303}$, $R_{303}$ and $R_{304}$, $R_{305}$ and $R_{306}$, $R_{306}$ and $R_{307}$, and $R_{301}$, $R_{302}$ and $R_{303}$, and the like.

In one embodiment, at least one, preferably two of $R_{301}$ to $R_{307}$ and $R_{311}$ to $R_{317}$ are groups represented by —$N(R_{906})(R_{907})$.

In one embodiment, $R_{301}$ to $R_{307}$ and $R_{311}$ to $R_{317}$ are independently a hydrogen atom, a substituted or unsubstituted aryl group including 6 to 50 ring carbon atoms, or a substituted or unsubstituted monovalent heterocyclic group including 5 to 50 ring atoms.

In one embodiment, the compound represented by the formula (31) is a compound represented by the following formula (32).

(32)

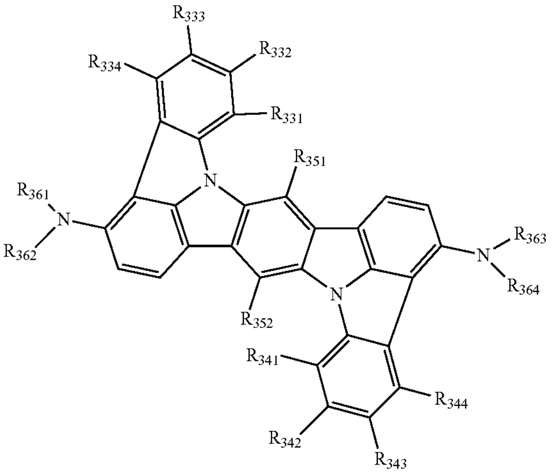

In the formula (32), one or more sets of two or more adjacent groups of $R_{331}$ to $R_{334}$ and $R_{341}$ to $R_{344}$ form a substituted or unsubstituted, saturated or unsaturated ring by bonding with each other, or do not form a substituted or unsubstituted saturated or unsaturated ring;

$R_{331}$ to $R_{334}$ and $R_{341}$ to $R_{344}$ that do not form the substituted or unsubstituted, saturated or unsaturated ring, and $R_{351}$ and $R_{352}$ are independently a hydrogen atom, a substituted or unsubstituted aryl group including 6 to 50 ring carbon atoms, or a substituted or unsubstituted monovalent heterocyclic group including 5 to 50 ring atoms; and $R_{361}$ to $R_{364}$ are independently a substituted or unsubstituted aryl group including 6 to 50 ring carbon atoms, or a substituted or unsubstituted monovalent heterocyclic group including 5 to 50 ring atoms.

In one embodiment, the compound represented by the formula (31) is a compound represented by the following formula (33).

(33)

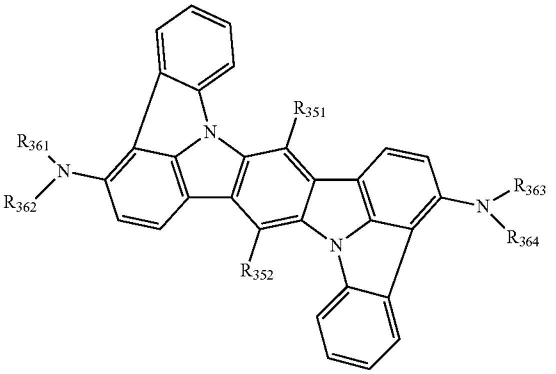

In the formula (33), $R_{351}$, $R_{352}$, and $R_{361}$ to $R_{364}$ are as defined in the formula (32).

In one embodiment, the compound represented by the formula (31) is a compound represented by the following formula (34) or (35):

(34)

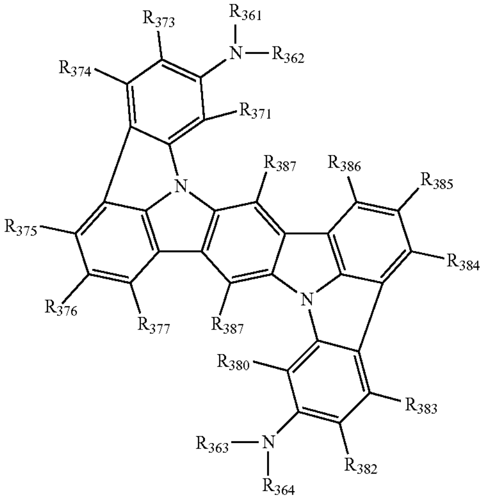

(35)

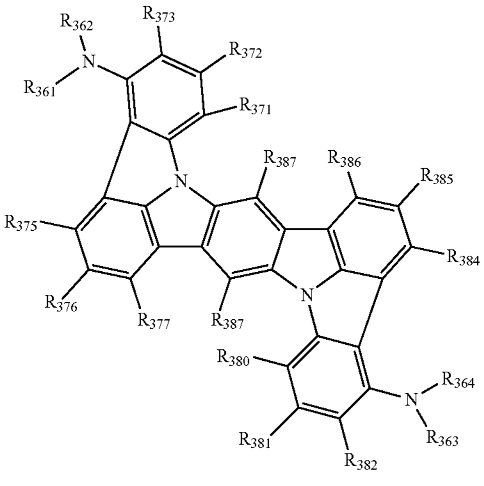

wherein in the formulas (34) and (35), $R_{361}$ to $R_{364}$ are as defined in the formula (32);

one or more sets of adjacent two or more of $R_{371}$ to $R_{377}$ and $R_{380}$ to $R_{386}$ form a substituted or unsubstituted, saturated or unsaturated ring, or do not form a substituted or unsubstituted, saturated or unsaturated ring;

$R_{371}$ to $R_{377}$ and $R_{380}$ to $R_{386}$ which do not form a substituted or unsubstituted, saturated or unsaturated ring, and $R_{387}$ are independently a hydrogen atom, a substituted or unsubstituted aryl group including 6 to 50 ring carbon atoms, or a substituted or unsubstituted monovalent heterocyclic group including 5 to 50 ring atoms; and two $R_{387}$'s may be the same as or different from each other.

In one embodiment, the compound represented by the formula (31) is a compound represented by the following formula (34-2) or (35-2):

(34-2)

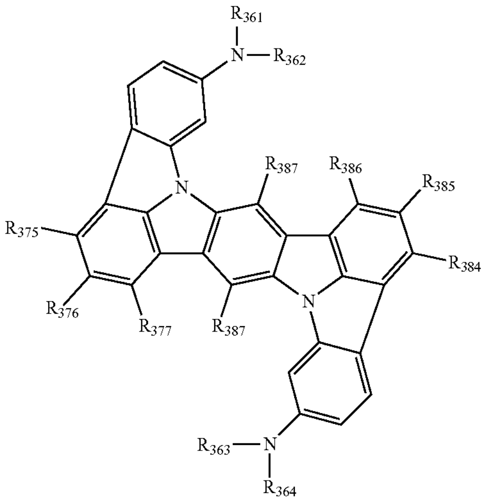

(35-2)

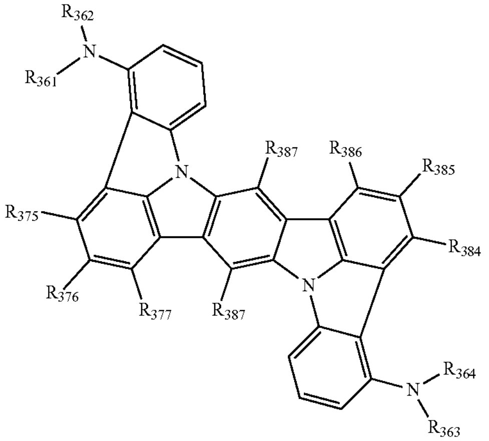

wherein in the formulas (34-2) and (35-2), $R_{361}$ to $R_{364}$, $R_{375}$ to $R_{377}$, and $R_{384}$ to $R_{387}$ are as defined in the formulas (34) and (35).

In one embodiment, $R_{361}$ to $R_{364}$ in the formulas (32), (33), (34), (35), (34-2), and (35-2) are independently a substituted or unsubstituted aryl group including 6 to 50 ring carbon atoms (preferably a phenyl group).

In one embodiment, $R_{321}$ and $R_{322}$ in the formula (31), and $R_{351}$, $R_{352}$, and $R_{387}$ in the formulas (32), (33), (34), (35), (34-2), and (35-2) are independently a hydrogen atom or a substituted or unsubstituted aryl group including 6 to 50 ring carbon atoms (preferably a phenyl group).

In one embodiment, the compound represented by the formula (31) is one or more compounds selected from the group consisting of the following formulas (32-11), (34-11), and (35-11):

(32-11)

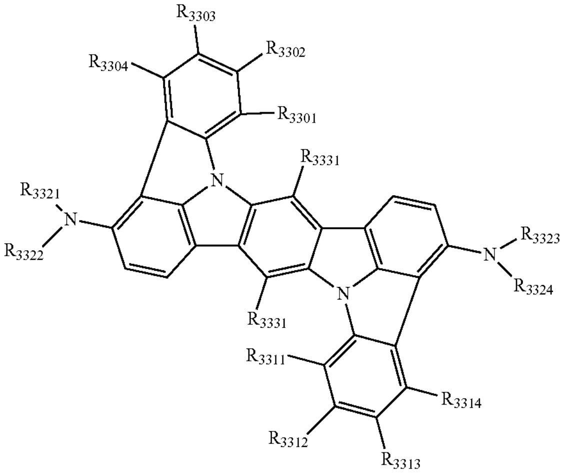

(34-11)

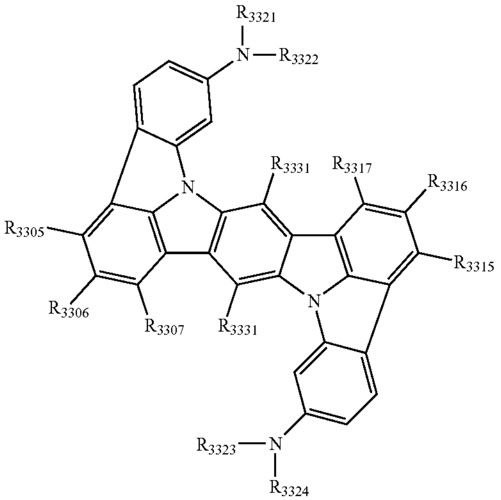

-continued (35-11)

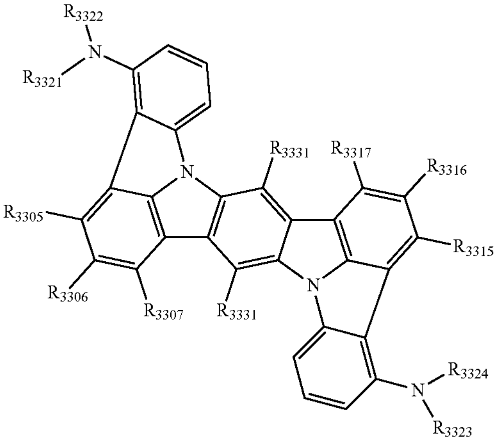

wherein in the formulas (32-11), (34-11), and (35-11), one or more sets of adjacent two or more of $R_{3301}$ to $R_{3307}$ and $R_{3311}$ to $R_{3317}$ form a substituted or unsubstituted, saturated or unsaturated ring, or do not form a substituted or unsubstituted, saturated or unsaturated ring;

$R_{3301}$ to $R_{3307}$ and $R_{3311}$ to $R_{3317}$ which do not form the substituted or unsubstituted, saturated or unsaturated ring, and $R_{3331}$ are independently a hydrogen atom, a substituted or unsubstituted aryl group including 6 to 20 ring carbon atoms, or a substituted or unsubstituted monovalent heterocyclic group including 5 to 20 ring atoms; two $R_{3331}$'s may be the same as or different from each other; and $R_{3321}$ to $R_{3324}$ are independently a substituted or unsubstituted aryl group including 6 to 20 ring carbon atoms, or a substituted or unsubstituted monovalent heterocyclic group including 5 to 20 ring atoms.

In one embodiment, one or more compounds selected from the group consisting of the formulas (32-11), (34-11), and (35-11) are one or more compounds selected from the group consisting of the following formulas (32-12), (34-12), and (35-12):

(32-12)

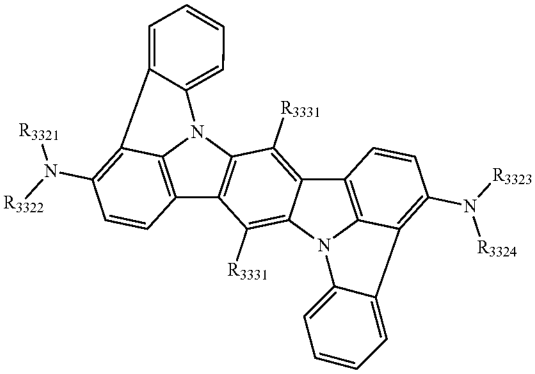

-continued (34-12)

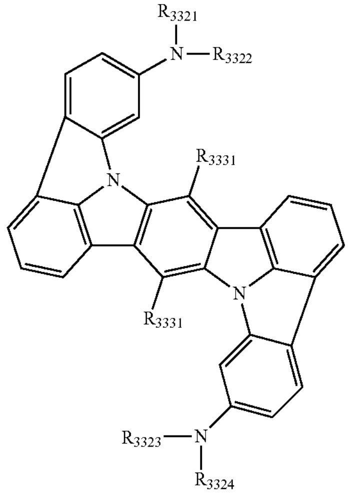

(35-12)

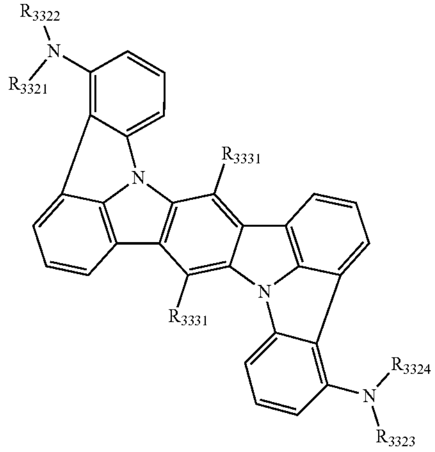

wherein in the formulas (32-12), (34-12), and (35-12), $R_{3321}$ to $R_{3324}$ and $R_{3331}$ are as defined in the formulas (32-11), (34-11), and (35-11).

In one embodiment, in the formulas (32-11), (34-11), (35-11), (32-12), (34-12), and (35-12), $R_{3321}$ to $R_{3324}$ are independently a substituted or unsubstituted phenyl group.

In one embodiment, in the formulas (32-11), (34-11), (35-11), (32-12), (34-12), and (35-12), two $R_{3331}$'s are hydrogen atoms.

In one embodiment, in the formulas (32-11), (34-11), (35-11), (32-12), (34-12), and (35-12), the substituent in the case of "substituted or unsubstituted" is selected from the group consisting of an alkyl group including 1 to 20 carbon atoms, an aryl group including 6 to 20 ring carbon atoms, and a monovalent heterocyclic group including 5 to 20 ring atoms.

In one embodiment, in the formulas (32-11), (34-11), (35-11), (32-12), (34-12), and (35-12), the substituent in the case of "substituted or unsubstituted" is an alkyl group including 1 to 5 carbon atoms.

In one embodiment, in the formulas (32-11), (34-11), (35-11), (32-12), (34-12), and (35-12), $R_{3321}$ to $R_{3324}$ are independently a substituted or unsubstituted phenyl group and two $R_{3331}$'s are hydrogen atoms.

In one embodiment, in the formulas (32-11), (34-11), (35-11), (32-12), (34-12), and (35-12), $R_{3321}$ to $R_{3324}$ are independently a substituted or unsubstituted phenyl group, two $R_{3331}$'s are hydrogen atoms, and the substituent in the case of "substituted or unsubstituted" is selected from the group consisting of an alkyl group including 1 to 20 carbon atoms, an aryl group including 6 to 20 ring carbon atoms, and a monovalent heterocyclic group including 5 to 20 ring atoms.

In one embodiment, in the formulas (32-11), (34-11), (35-11), (32-12), (34-12), and (35-12), $R_{3321}$ to $R_{3324}$ are independently a substituted or unsubstituted phenyl group, two $R_{3331}$'s are hydrogen atoms, and the substituent in the case of "substituted or unsubstituted" is an alkyl group including 1 to 5 carbon atoms.

In one embodiment, in the compound represented by the formula (31), one or more sets of adjacent two or more of $R_{301}$ to $R_{307}$ and $R_{311}$ to $R_{317}$ form a substituted or unsubstituted, saturated or unsaturated ring.

In one embodiment, the compound represented by the formula (31) is one or more compounds selected from the group consisting of compounds represented by the following formulas (36-1) to (36-6):

(36-1)

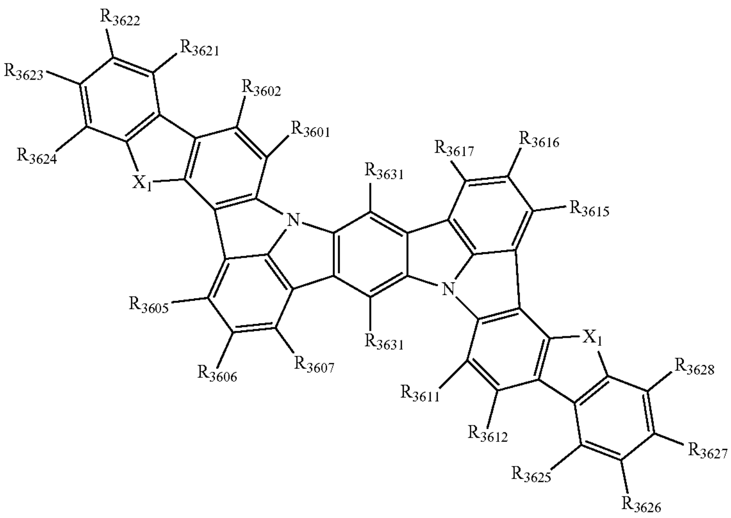

-continued
(36-2)
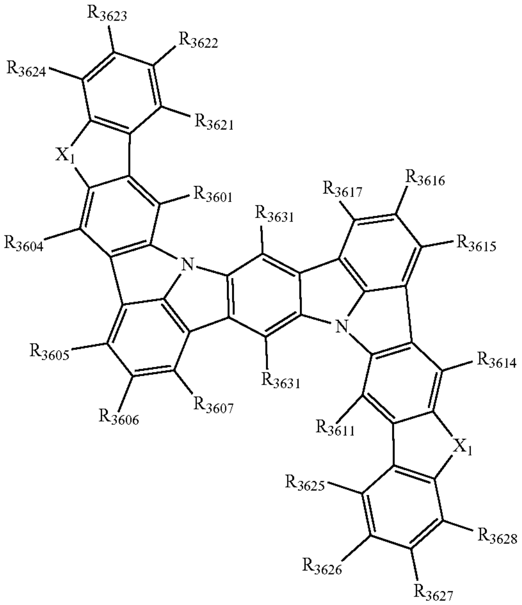
(36-3)
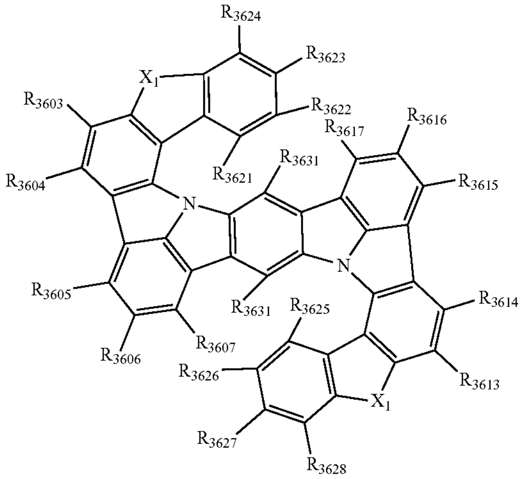
(36-4)
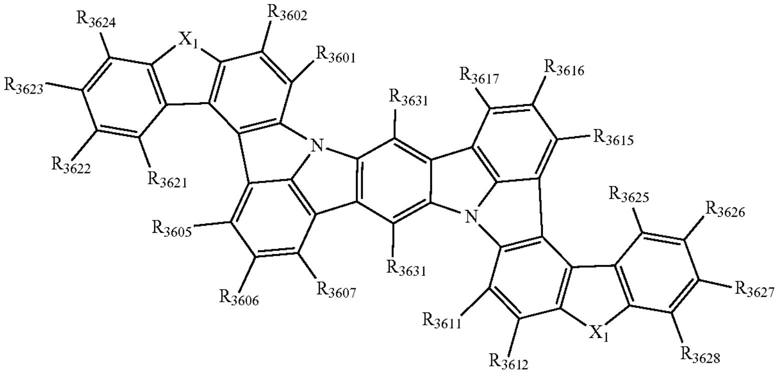
(36-5)
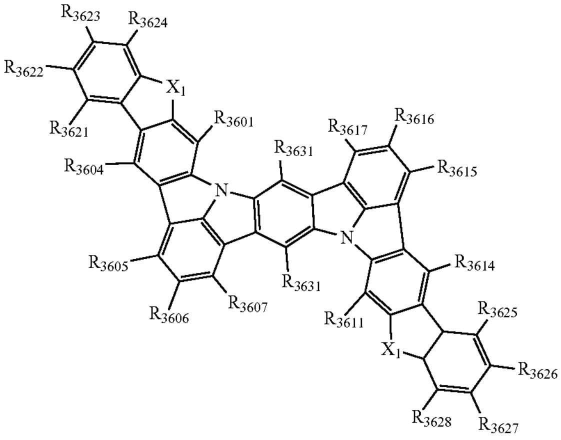
(36-6)
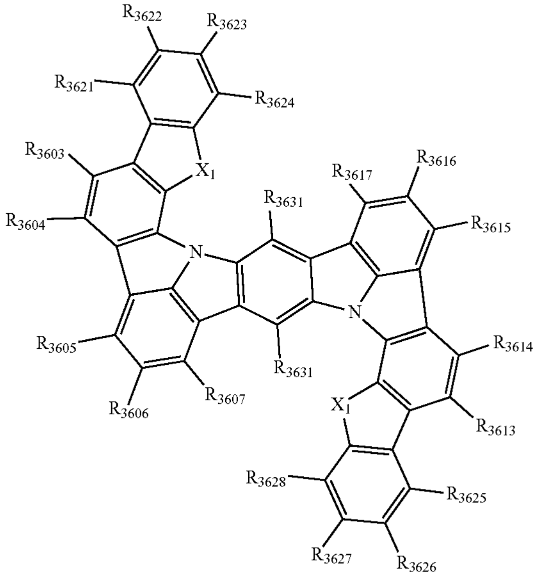

wherein in the formulas (36-1) to (36-6), one or more sets of adjacent two or more of $R_{3605}$ to $R_{3607}$, $R_{3615}$ to $R_{3617}$, and $R_{3631}$ form a substituted or unsubstituted, saturated or unsaturated ring by bonding with each other, or do not form the ring;

one or more sets of adjacent two or more of $R_{3601}$ to $R_{3604}$, $R_{3611}$ to $R_{3614}$, and $R_{3621}$ to $R_{3628}$ form a substituted or unsubstituted, saturated or unsaturated ring by bonding with each other, or do not form the ring;

$R_{3601}$ to $R_{3607}$, $R_{3611}$ to $R_{3617}$, $R_{3621}$ to $R_{3628}$, and $R_{3631}$ which do not form the ring are independently a hydrogen atom, a halogen atom, a cyano group, a nitro group, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms; when two or more of each of $R_{901}$ to $R_{907}$ are present, the two or more of each of $R_{901}$ to $R_{907}$ are the same as or different from each other;

$X_1$ is selected from O, S, and N($R_{3641}$) and two $X_1$'s may be the same as or different from each other;

$R_{3641}$ forms a substituted or unsubstituted saturated or unsaturated ring by bonding with one or more selected from the group consisting of $R_{3601}$ to $R_{3604}$, $R_{3611}$ to $R_{3614}$, $R_{3624}$, and $R_{3628}$, or do not form the ring; and $R_{3641}$ which does not form the ring is a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

In one embodiment, the compound represented by the formula (31) is a compound represented by the formula (36-1) or the formula (36-2), and in one embodiment, the compound represented by the formula (31) is a compound represented by the formula (36-1).

In one embodiment, in the compound represented by the formulas (36-1) to (36-6), two $R_{3631}$'s are phenyl groups.

In one embodiment, in the compound represented by the formulas (36-1) to (36-6), $X_1$ is N($R_{3641}$).

In one embodiment, in the compound represented by the formulas (36-1) to (36-6), $R_{3641}$ is a substituted or unsubstituted aryl group including 6 to 50 ring carbon atoms.

In one embodiment, the compound represented by the formula (31) is a compound represented by the following formula (36-1-1).

(36-1-1)

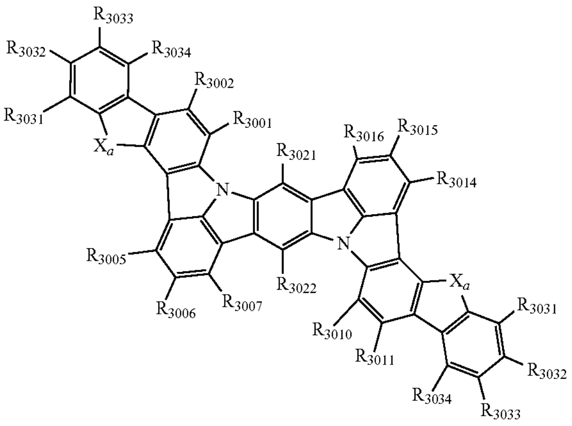

wherein in the formula (36-1-1), one or more sets of adjacent two or more of $R_{3001}$, $R_{3002}$, $R_{3005}$ to $R_{3007}$, $R_{3010}$, $R_{3011}$, $R_{3014}$ to $R_{3016}$, and $R_{3031}$ to $R_{3034}$ form a substituted or unsubstituted, saturated or unsaturated ring by bonding with each other, or do not form a substituted or unsubstituted, saturated or unsaturated ring;

$X_a$'s are independently selected from O, S, and N($R_{3035}$);

$R_{3035}$ forms a substituted or unsubstituted, saturated or unsaturated ring by bonding with $R_{3031}$, or does not form the ring;

$R_{3001}$, $R_{3002}$, $R_{3005}$ to $R_{3007}$, $R_{3010}$, $R_{3011}$, $R_{3014}$ to $R_{3016}$, $R_{3031}$ to $R_{3035}$, and $R_{3021}$, $R_{3022}$ which do not form the substituted or unsubstituted, saturated or unsaturated ring are independently a hydrogen atom, a substituted or unsubstituted aryl group including 6 to 50 ring carbon atoms, or a substituted or unsubstituted monovalent heterocyclic group including 5 to 50 ring atoms.

In one embodiment, a substituent in the case of the "substituted or unsubstituted" in the formulas (31) to (35), (34-2), (35-2), (32-11), (34-11), (35-11), (32-12), (34-12), (35-12), (36-1) to (36-6), and (36-1-1) is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

As the compound represented by the formula (31), the following compounds can be given for example. In the following examples, "Me" represents a methyl group.

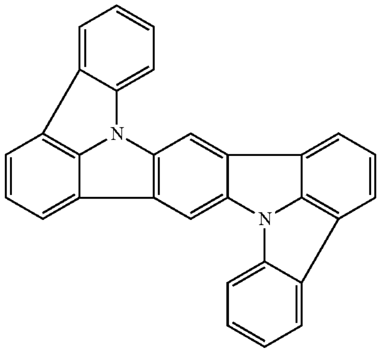
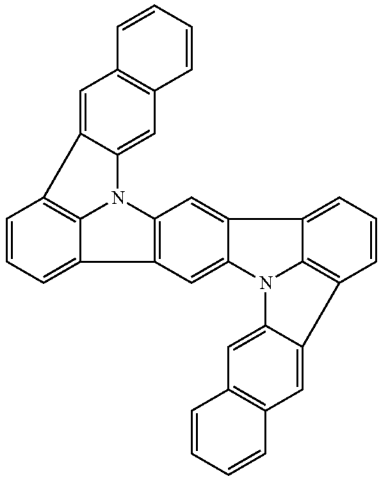
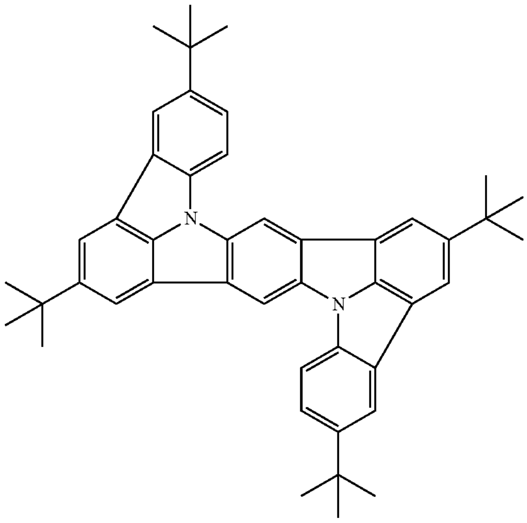
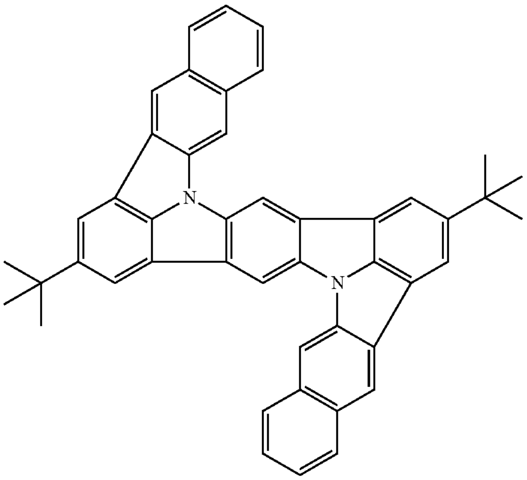
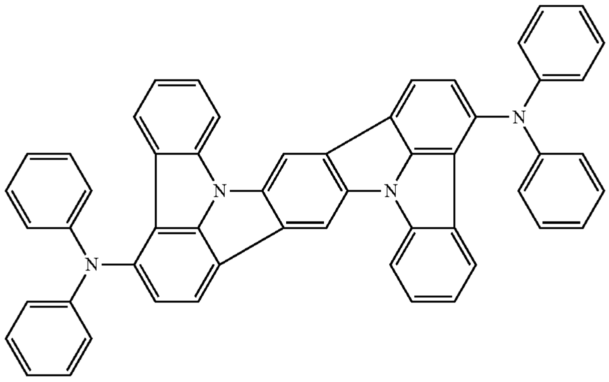

-continued
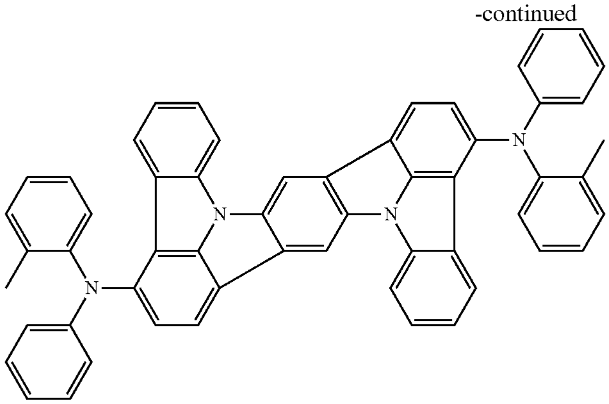
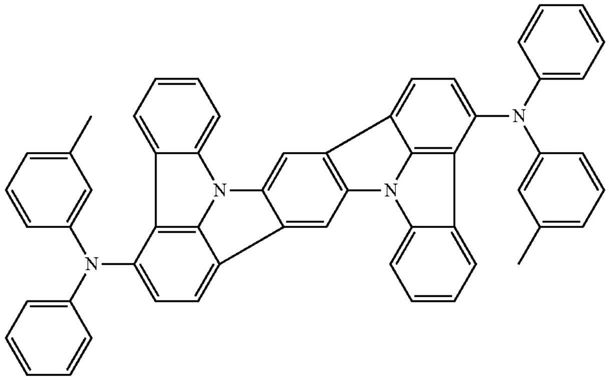
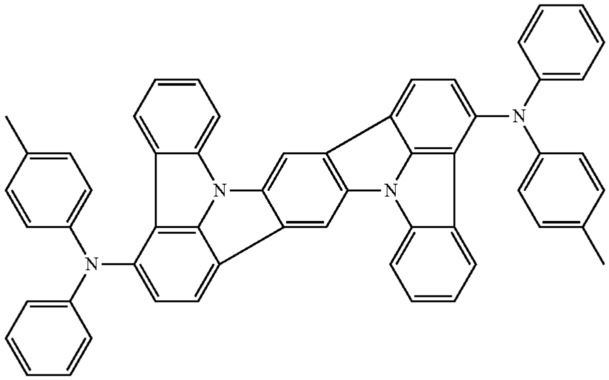
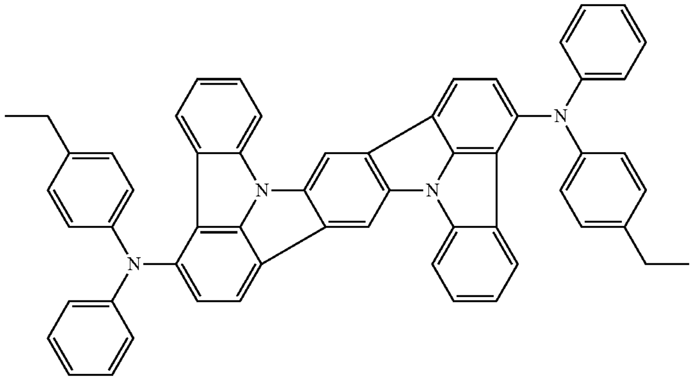

-continued
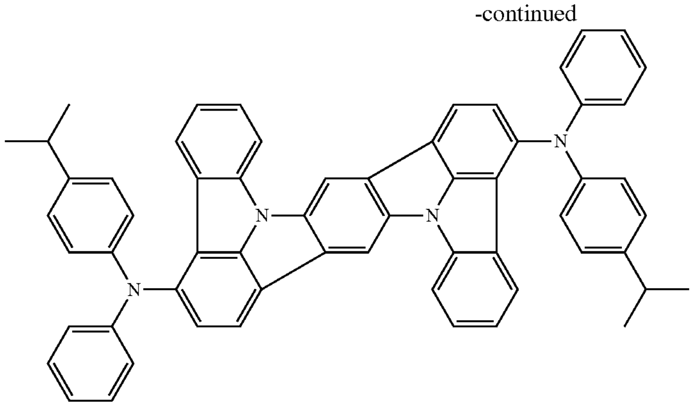
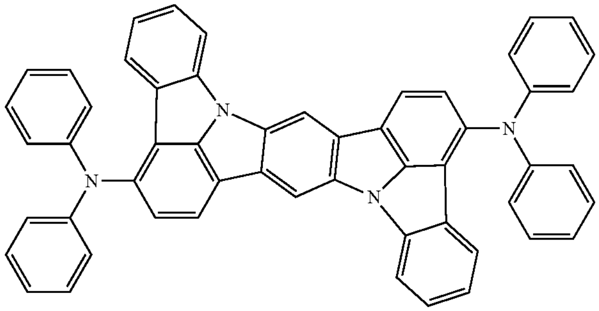
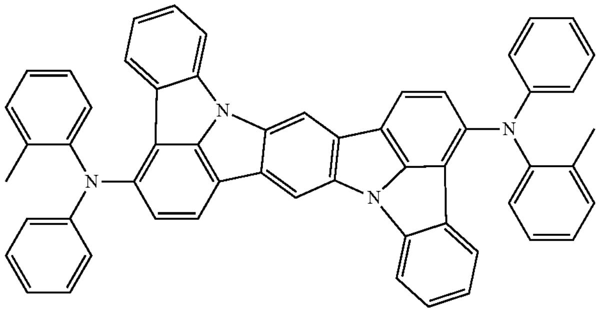
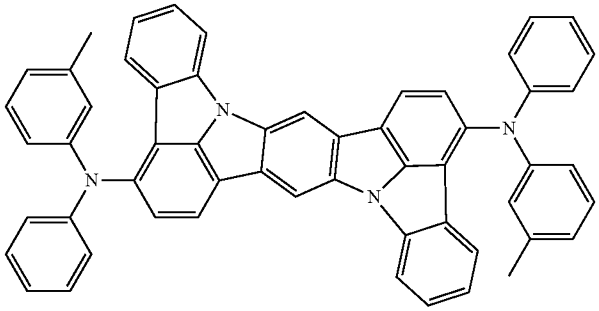
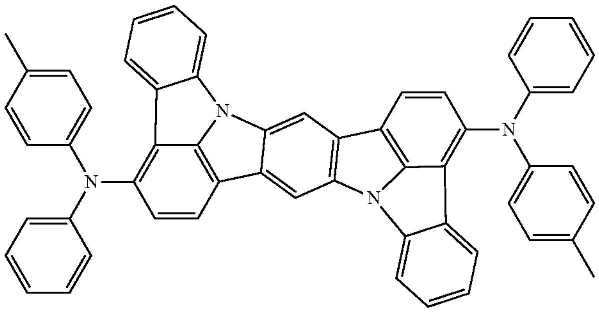

-continued
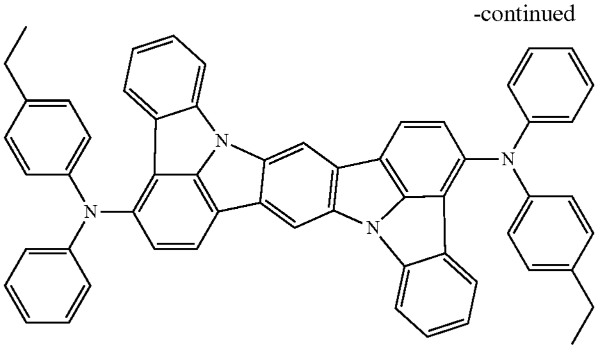
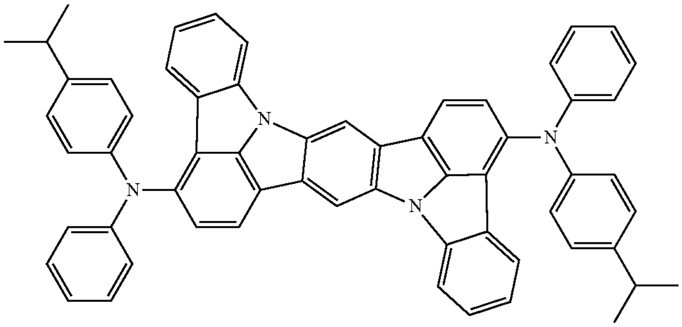
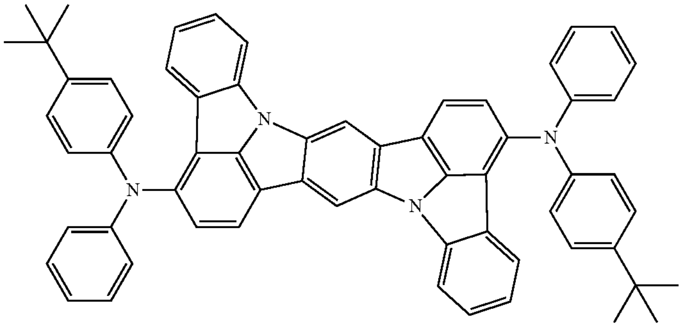
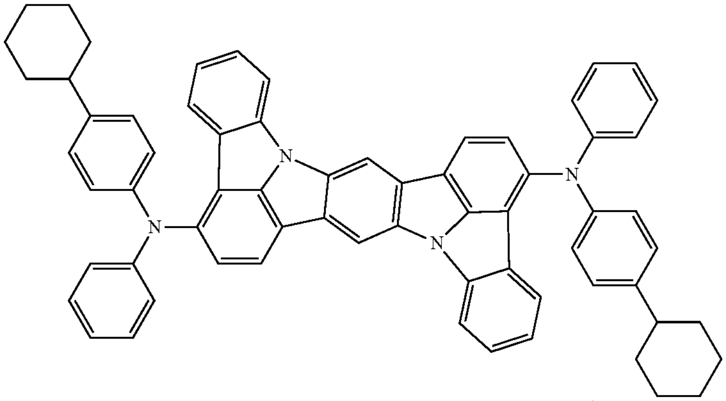
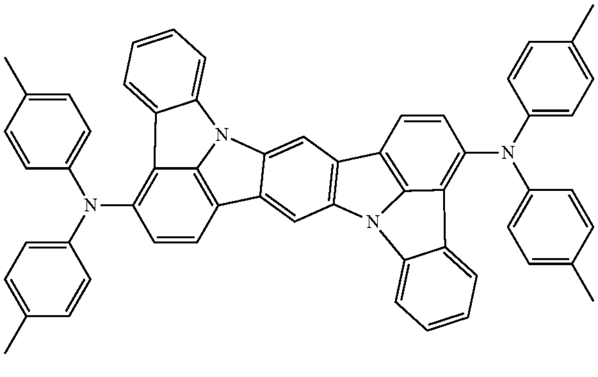

-continued
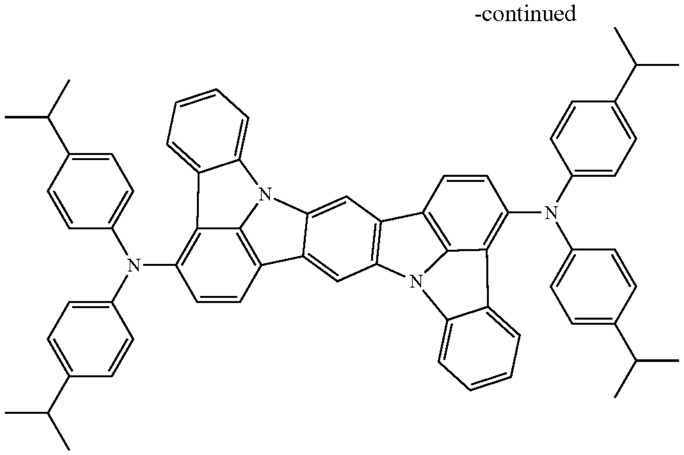
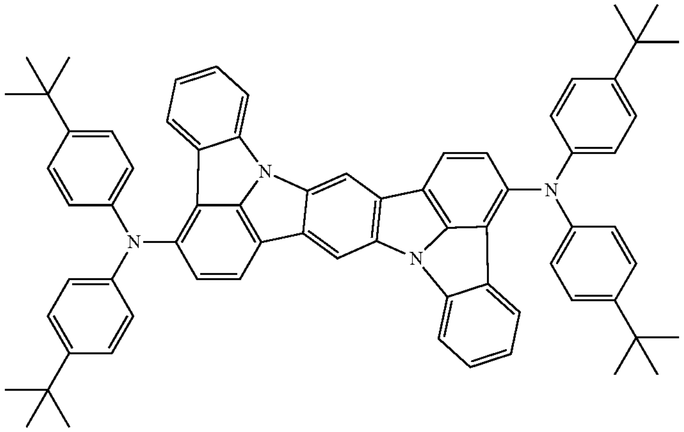
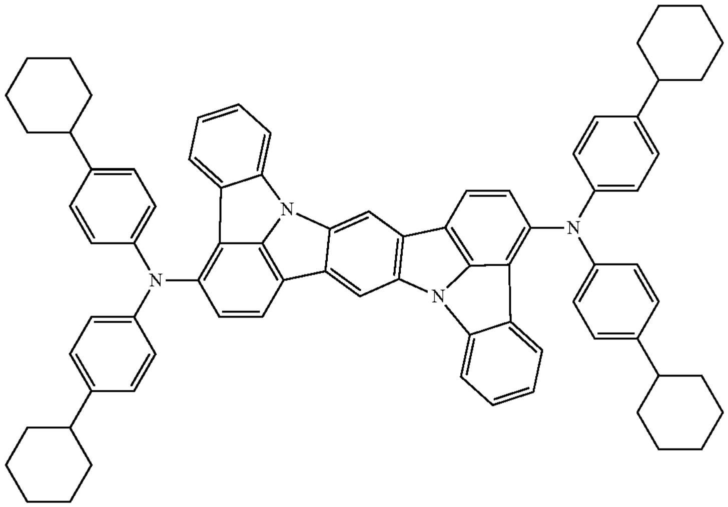
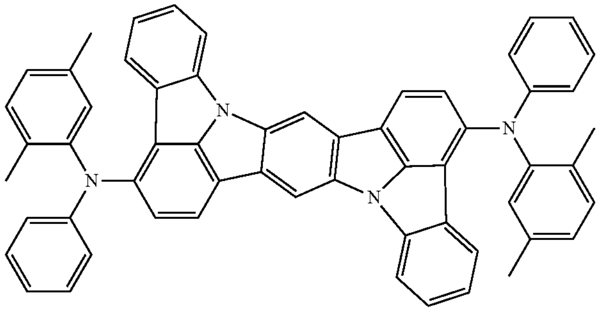

-continued
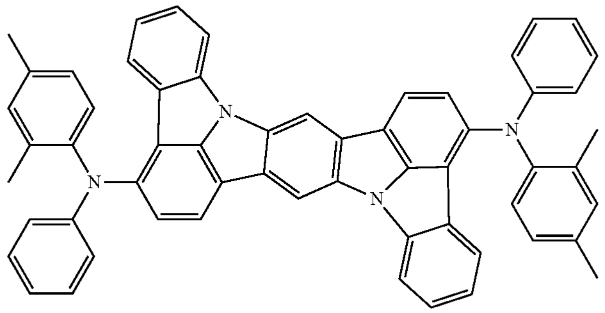
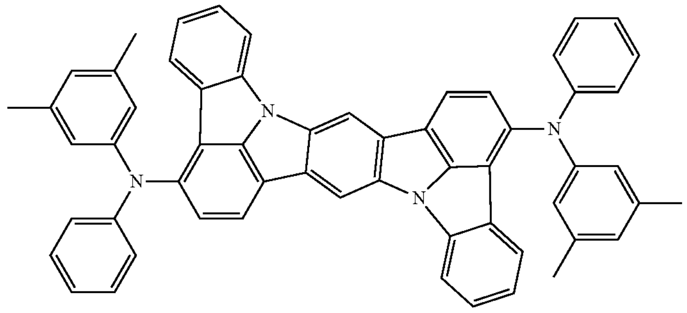
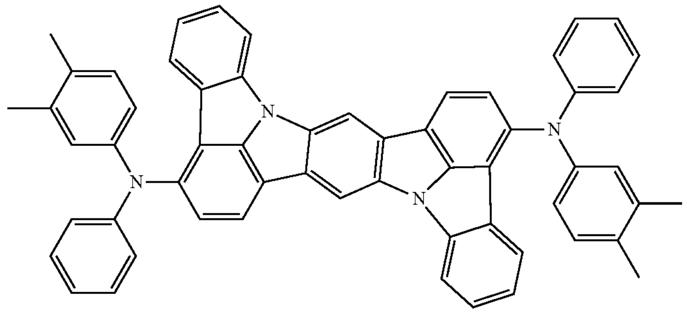
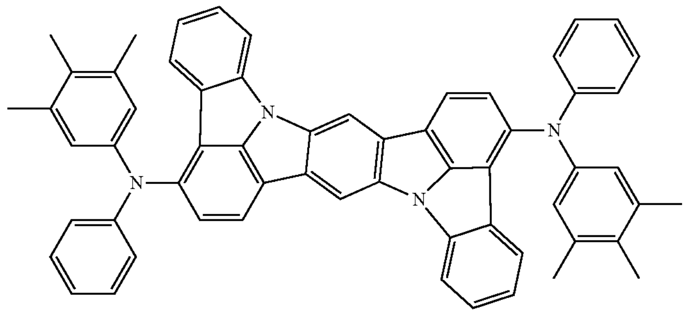
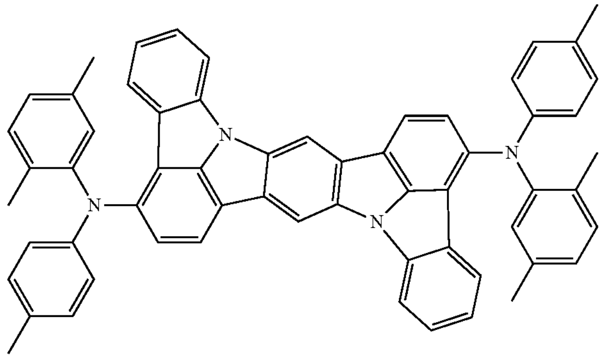

-continued
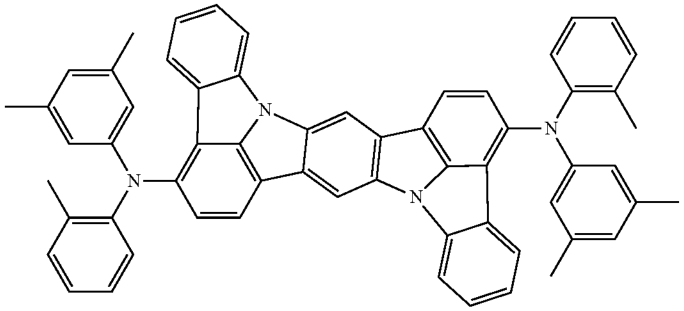
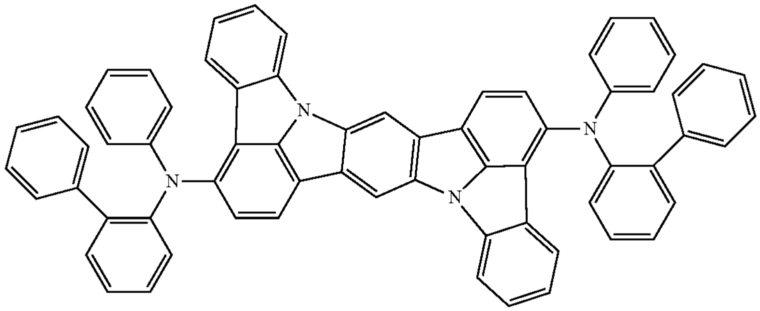
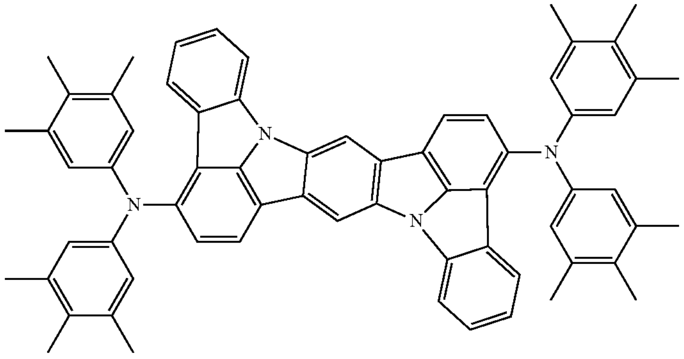
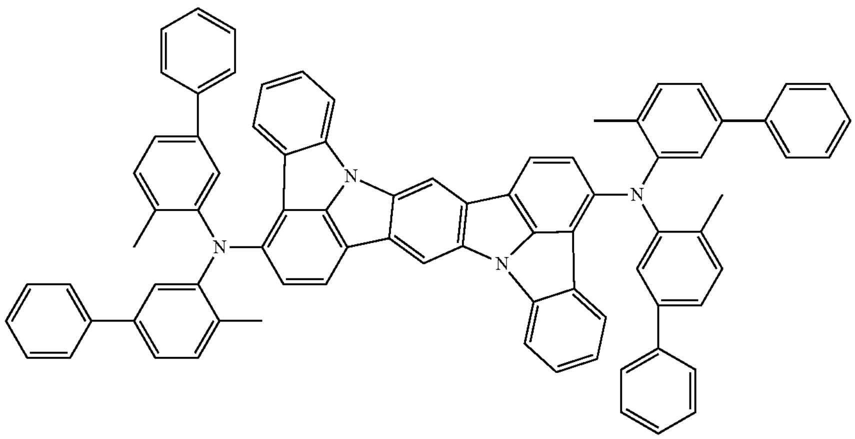

-continued
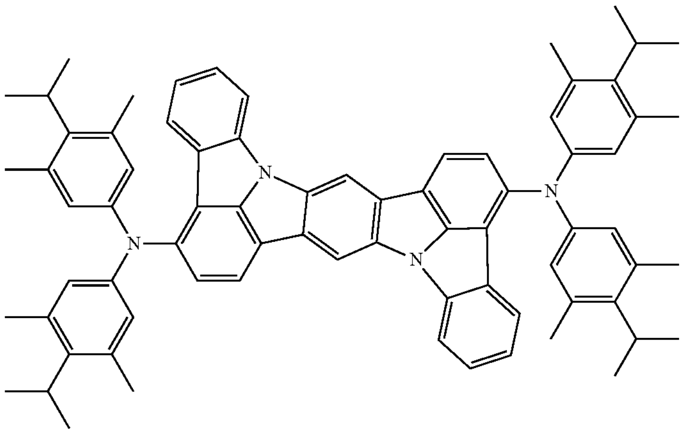
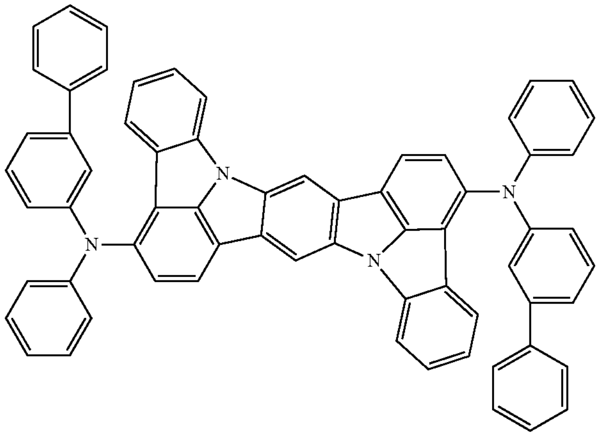
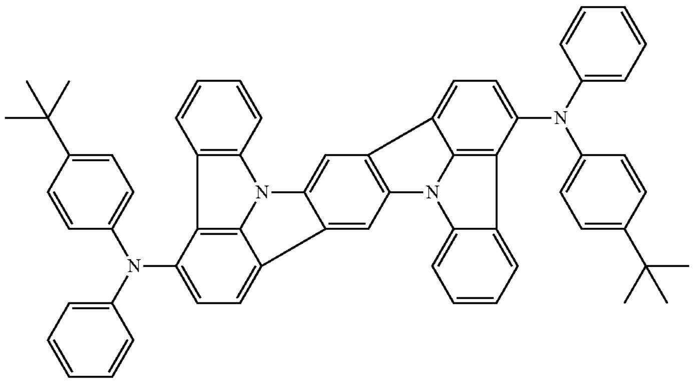
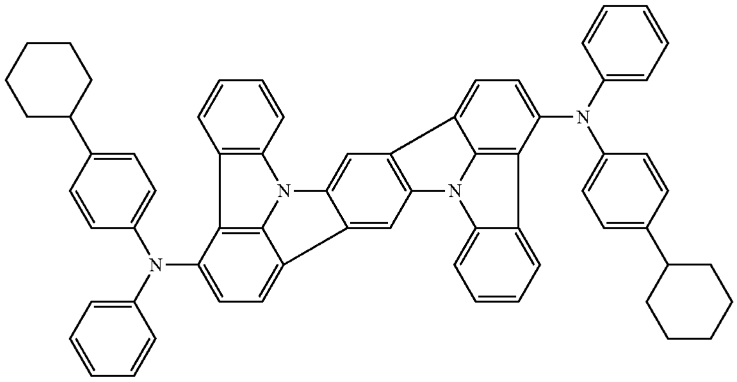

-continued
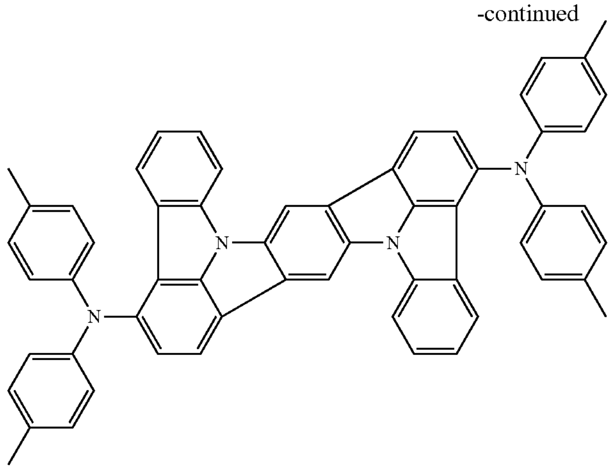
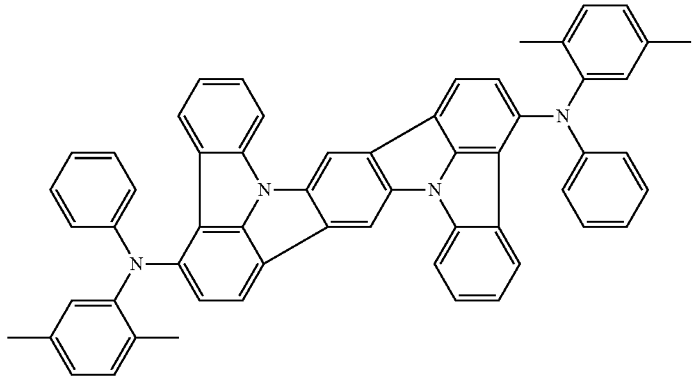
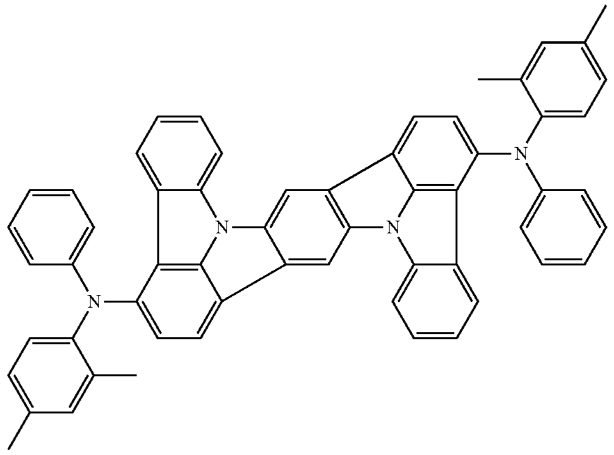

-continued
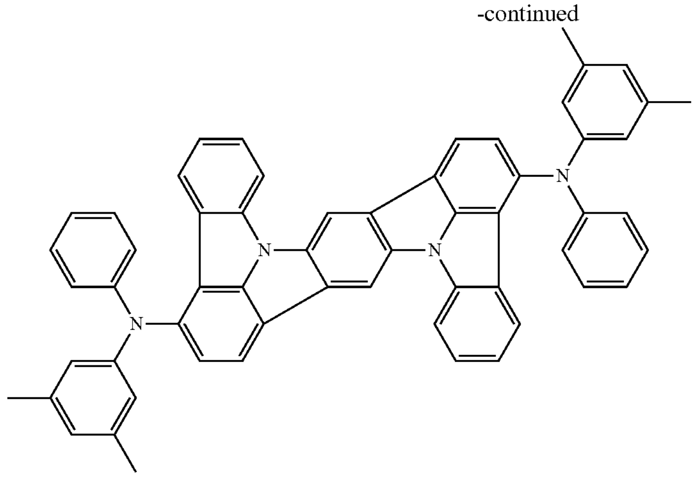
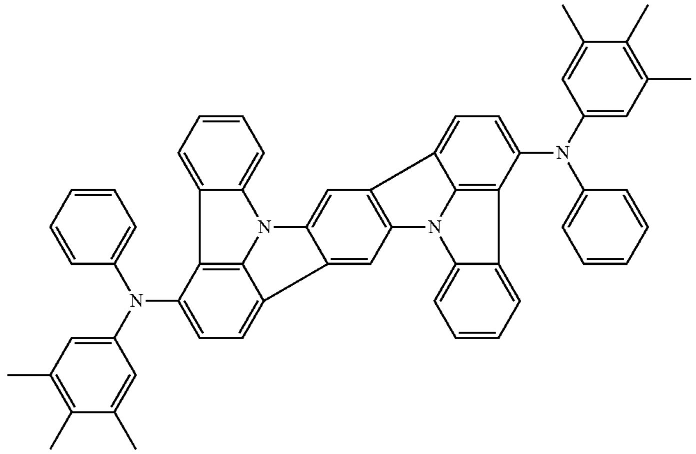
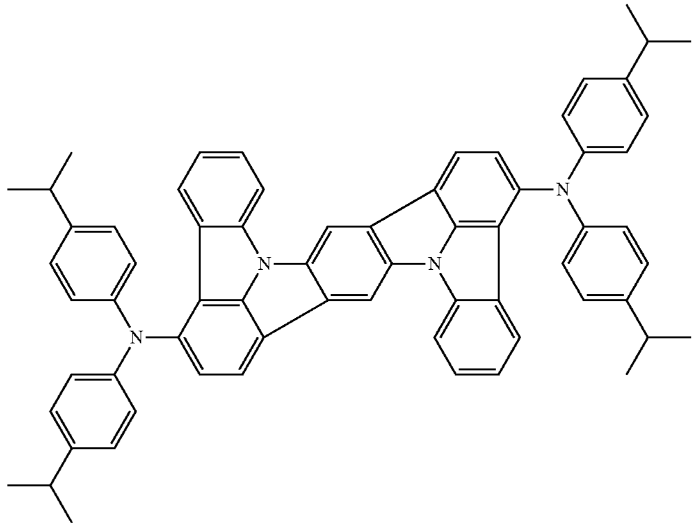

-continued
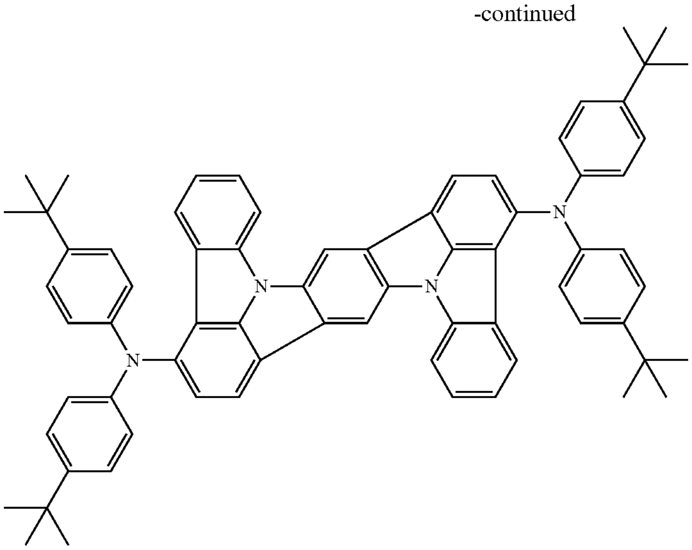
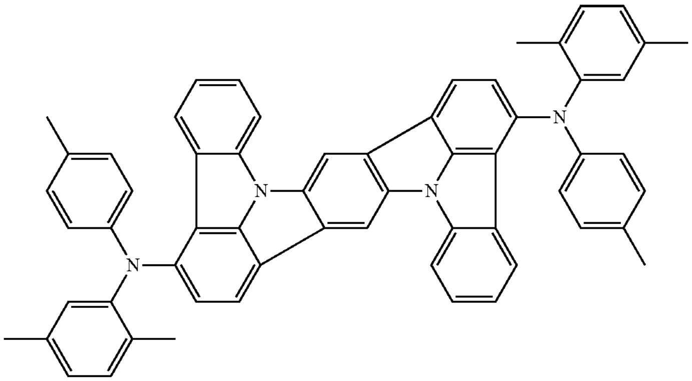
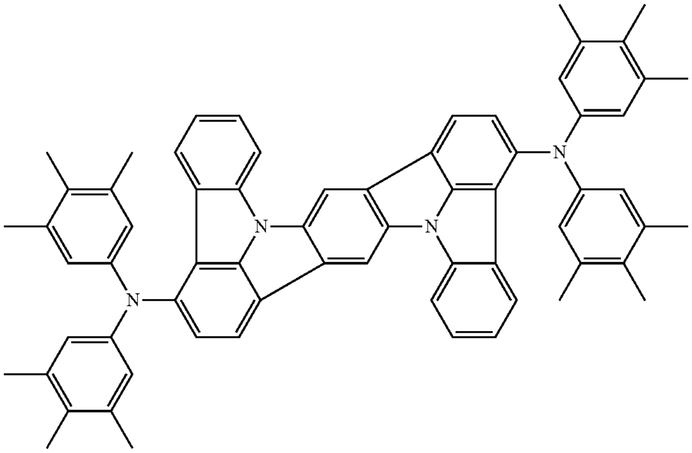
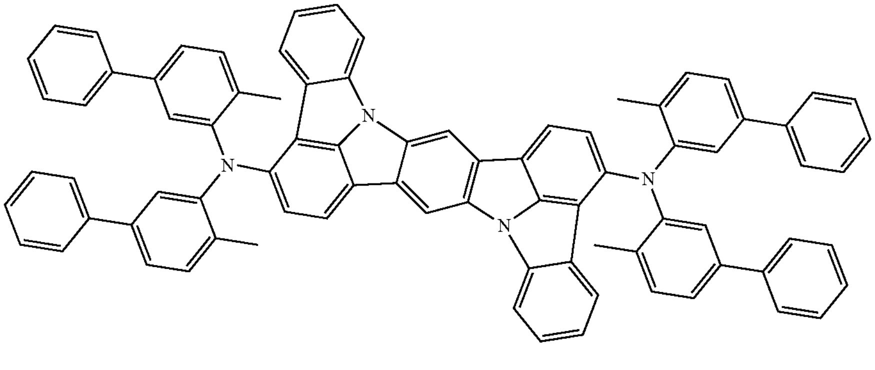

-continued
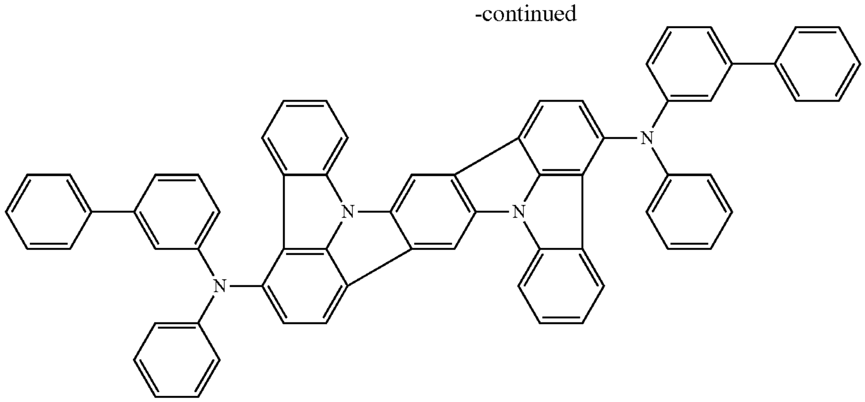
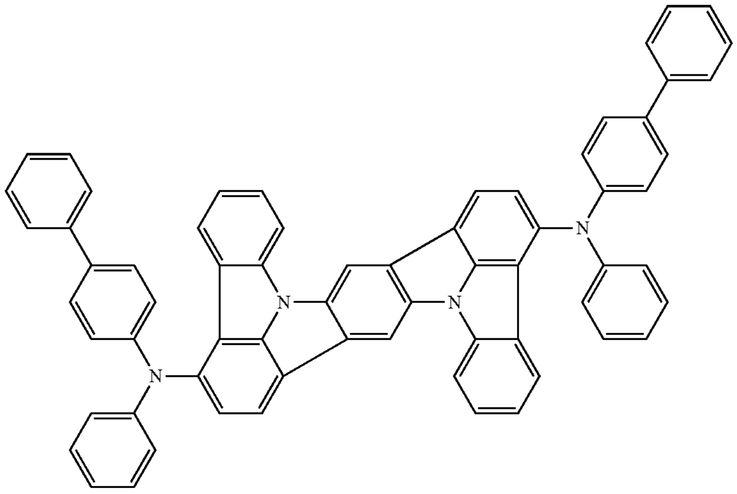
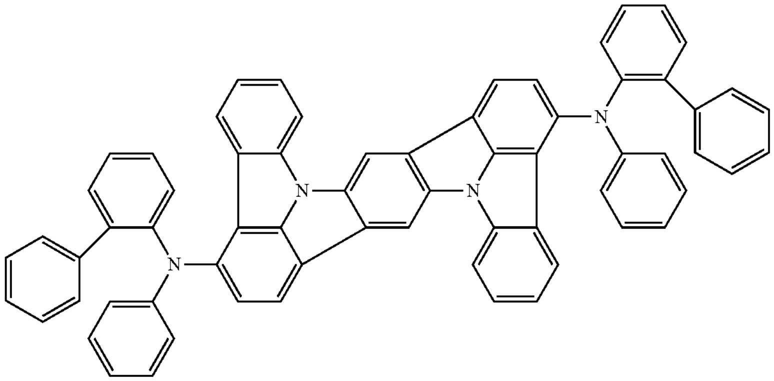
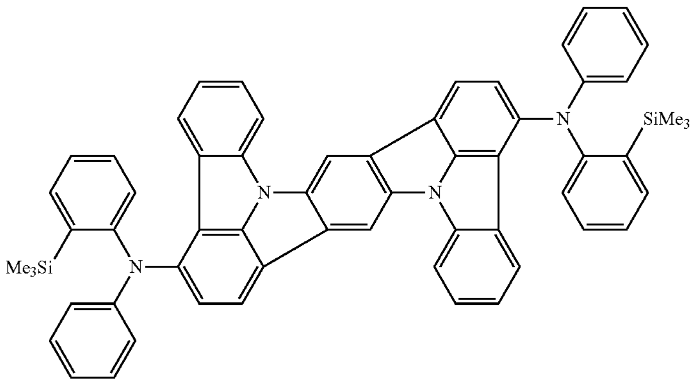

-continued
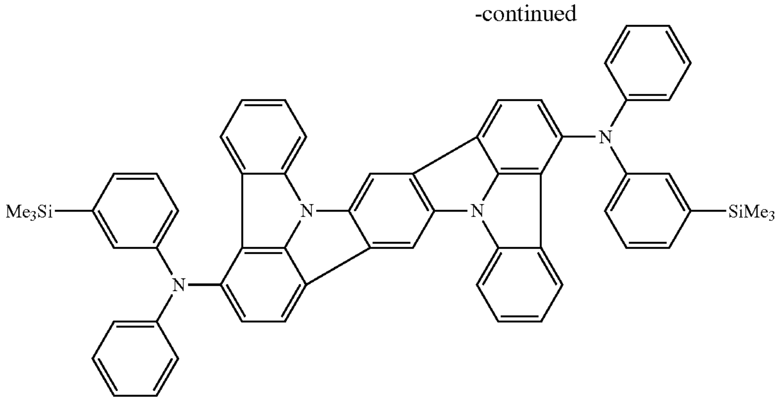
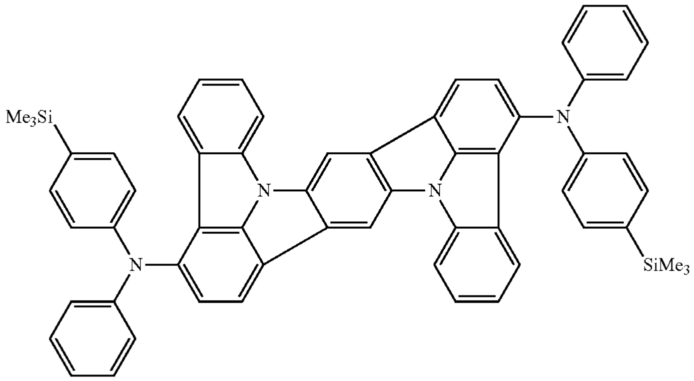
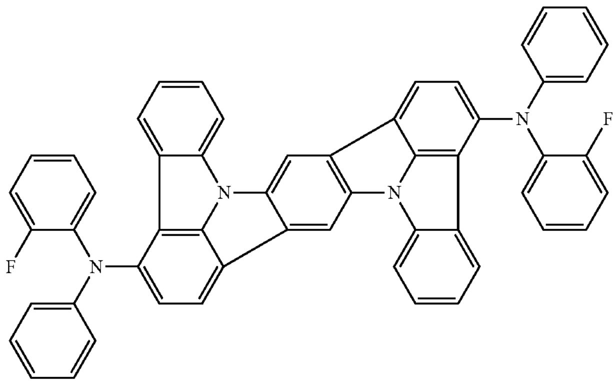
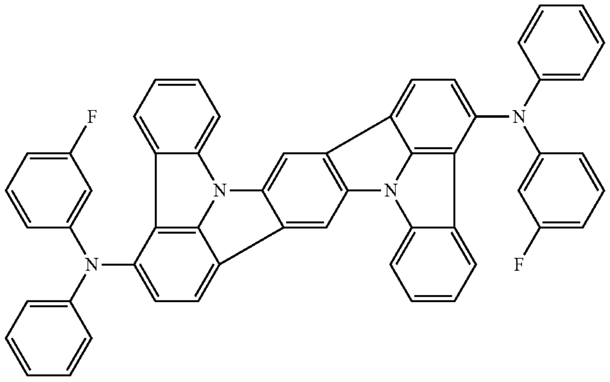

-continued
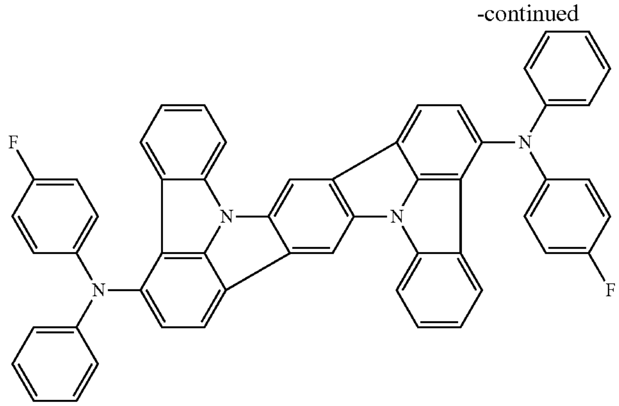
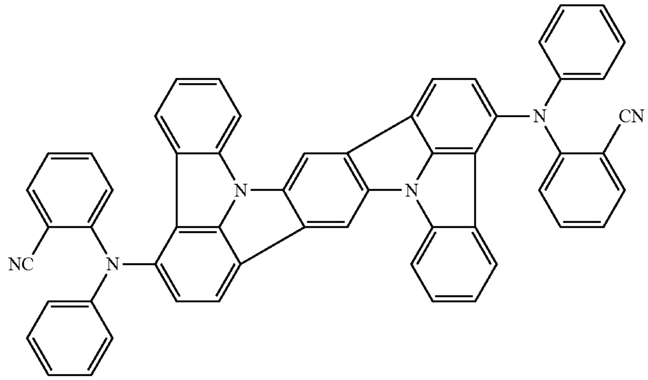
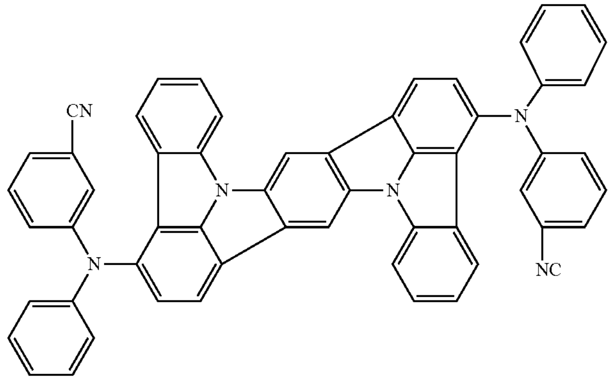
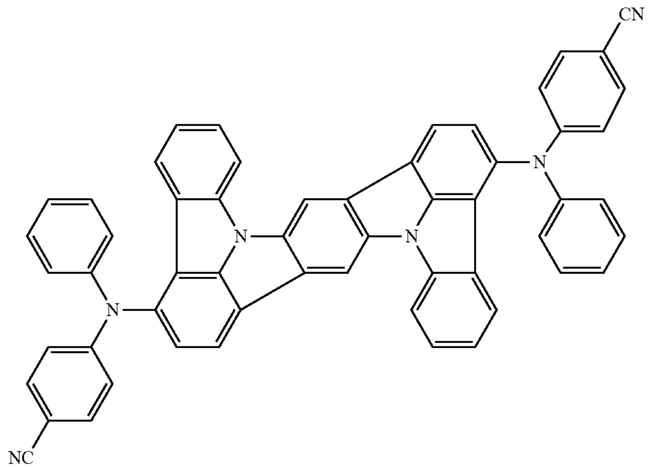

-continued
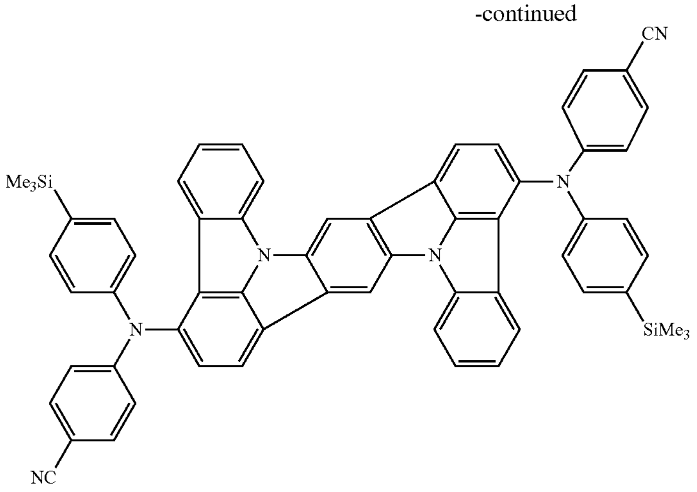
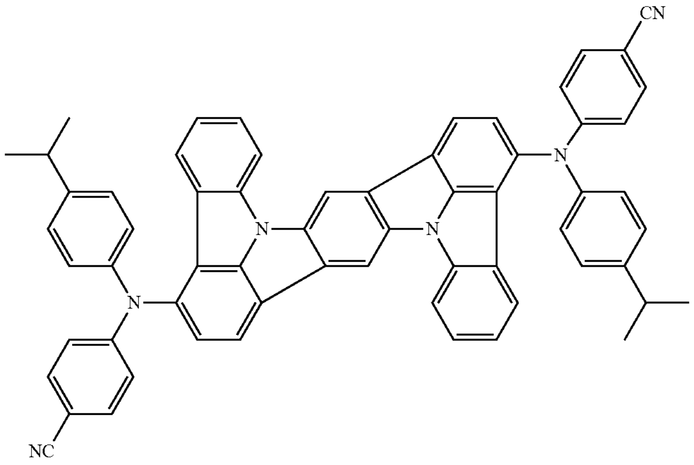
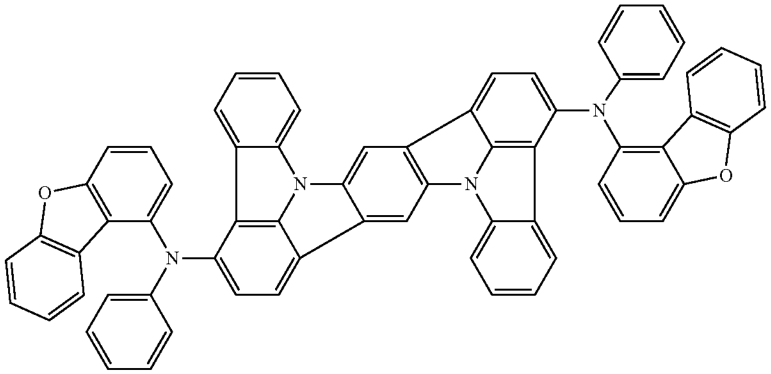
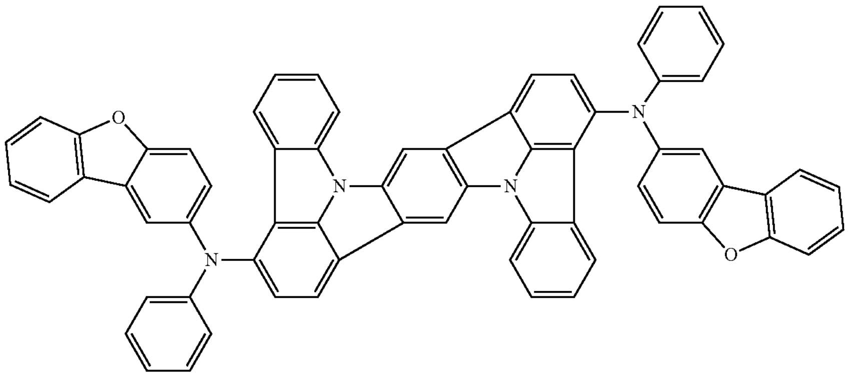

-continued
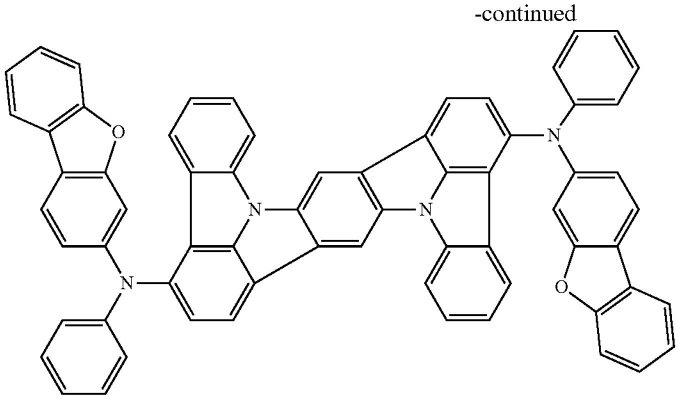
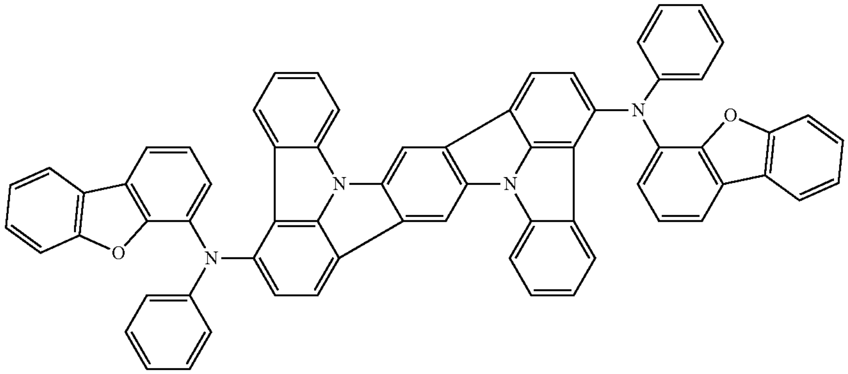
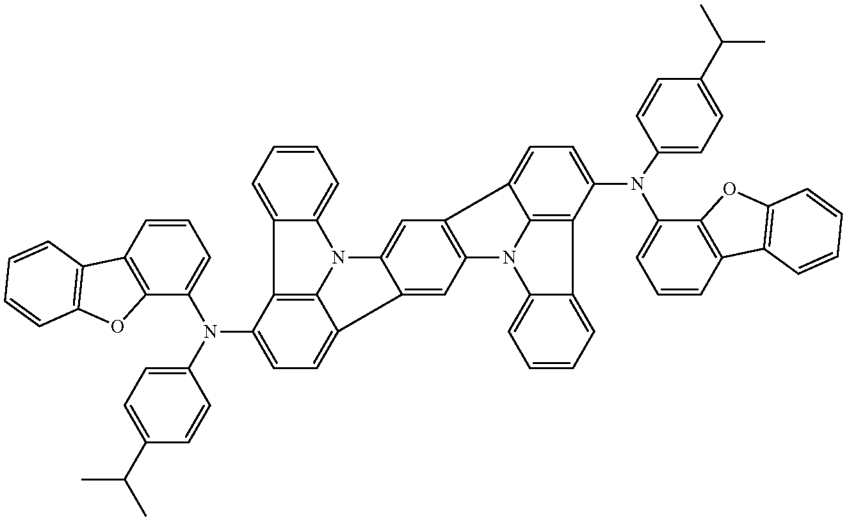
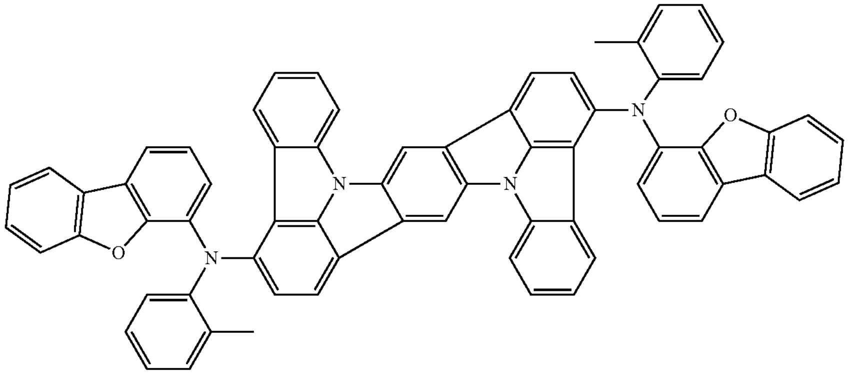

-continued
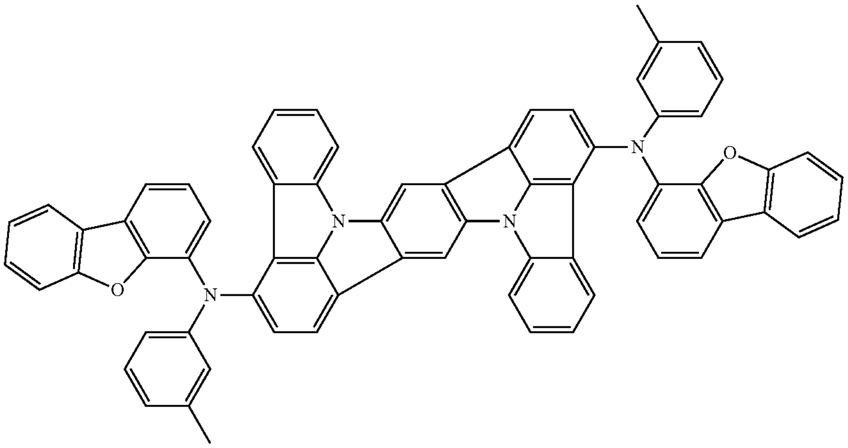
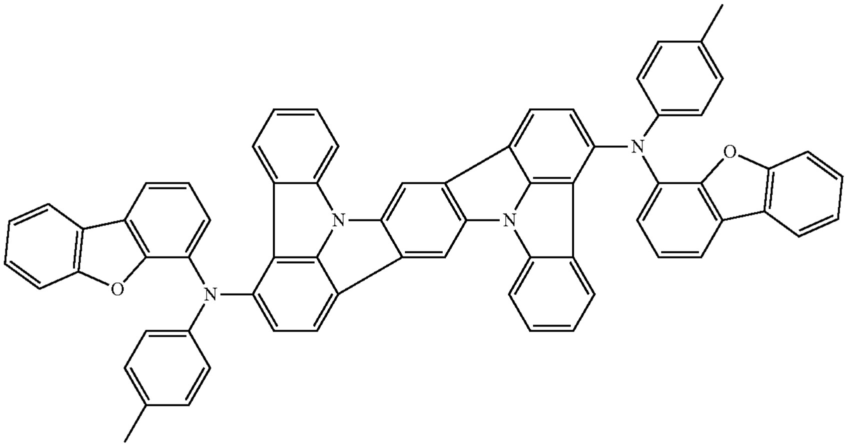
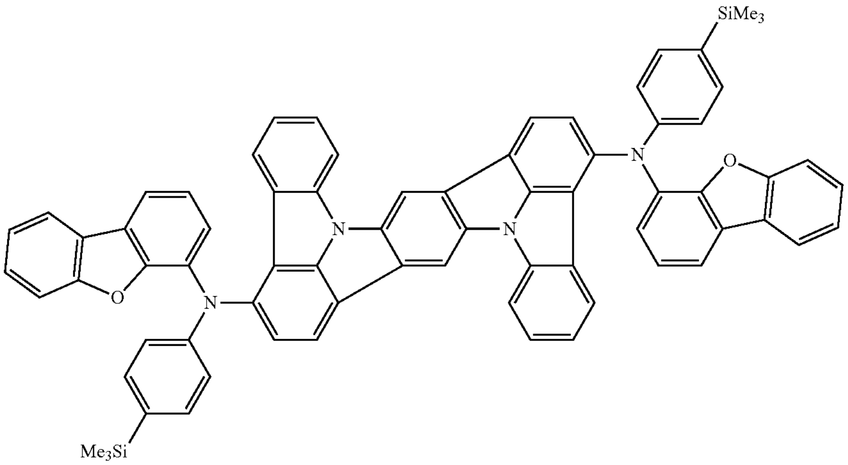

-continued
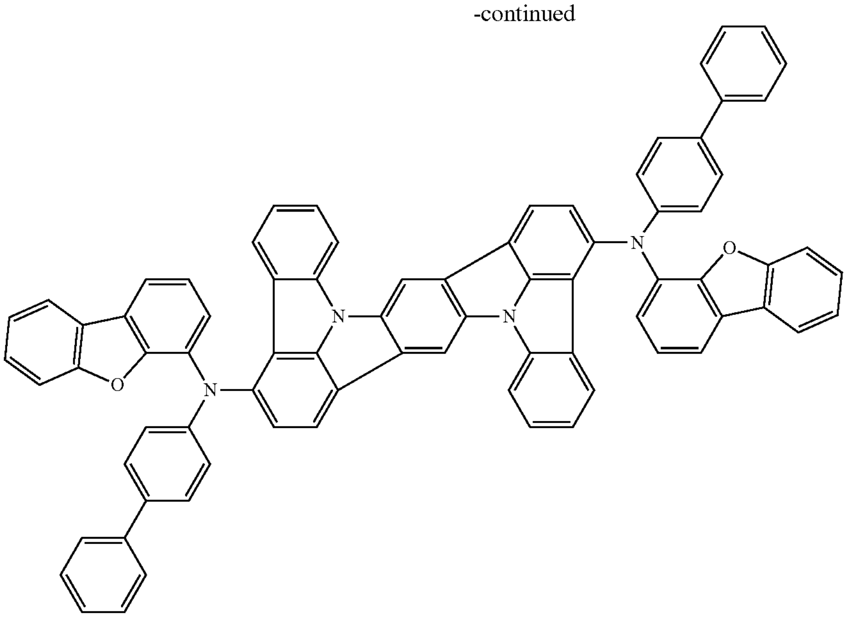
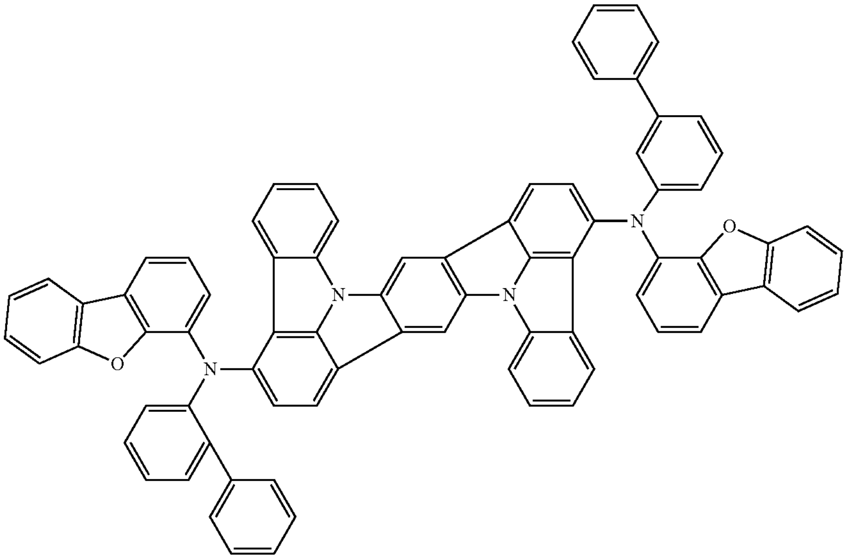
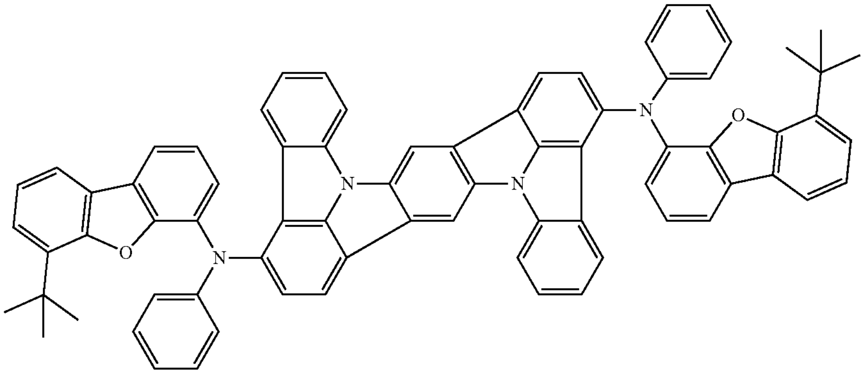

-continued
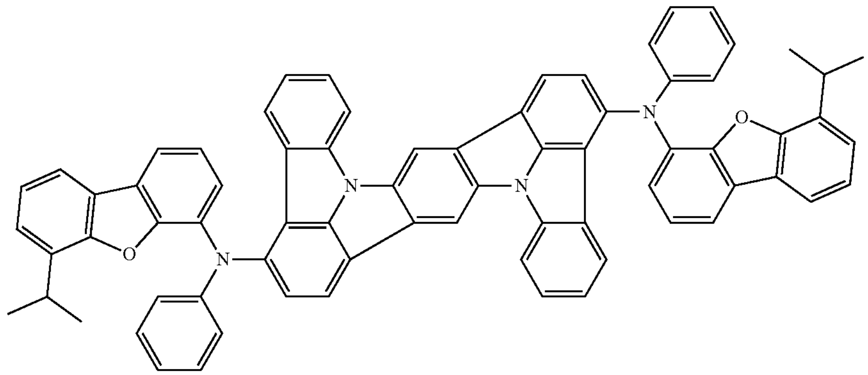
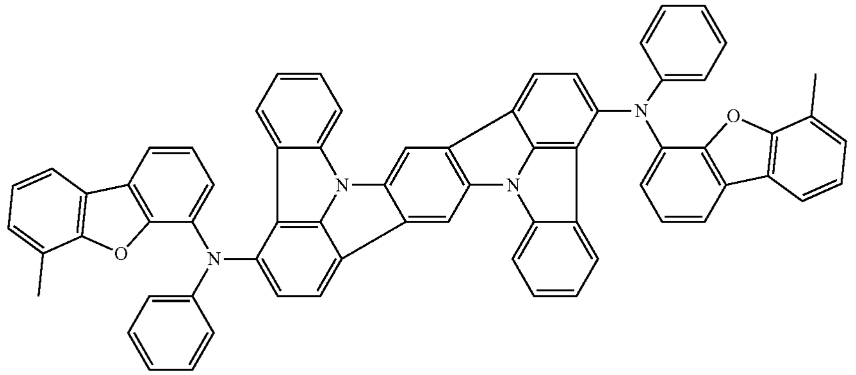
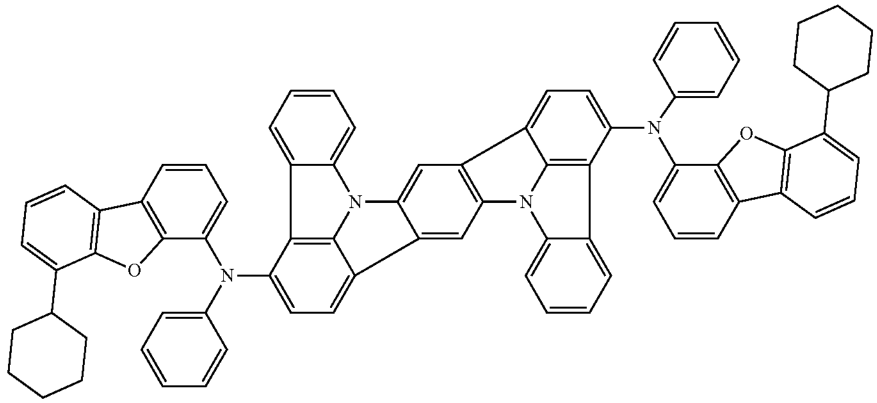
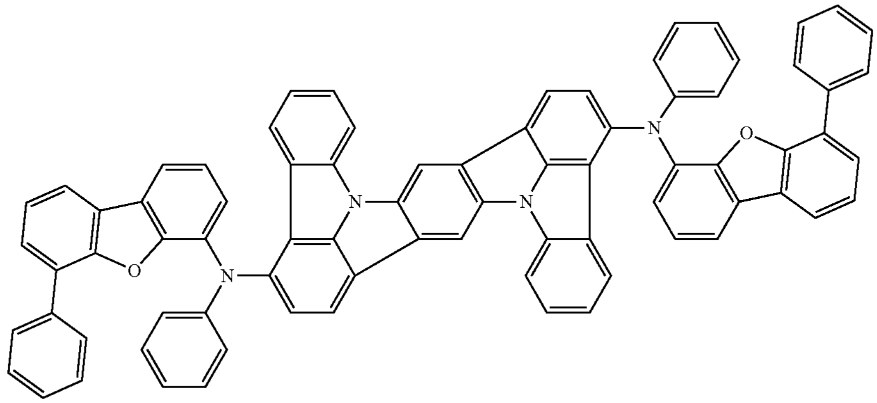

-continued
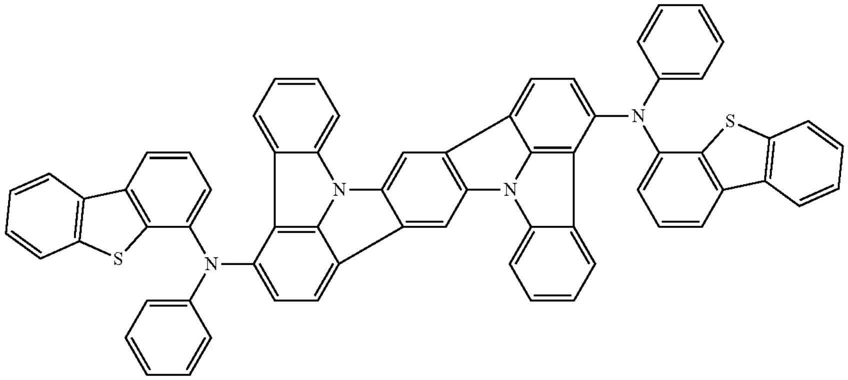
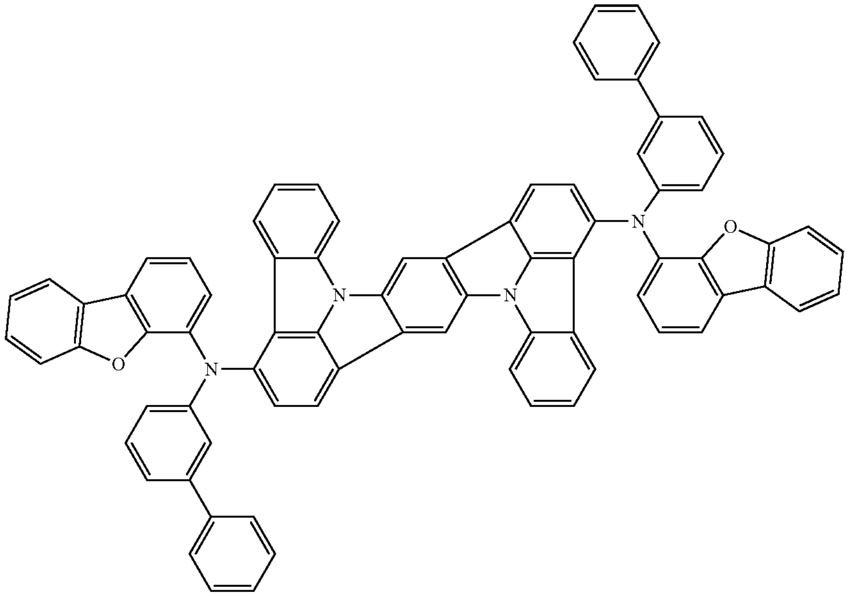
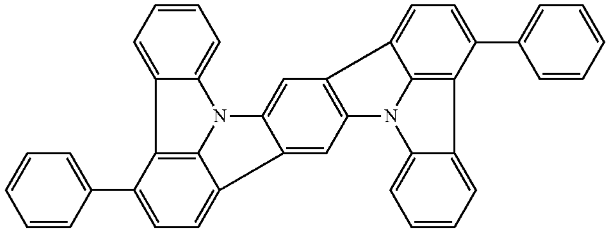
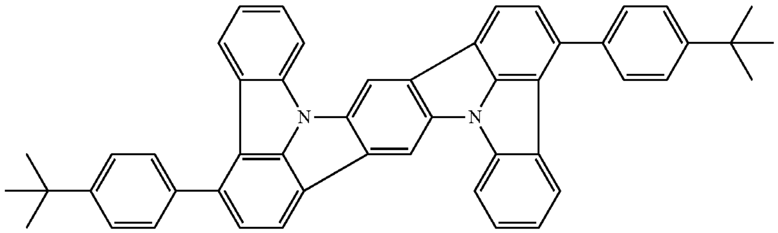
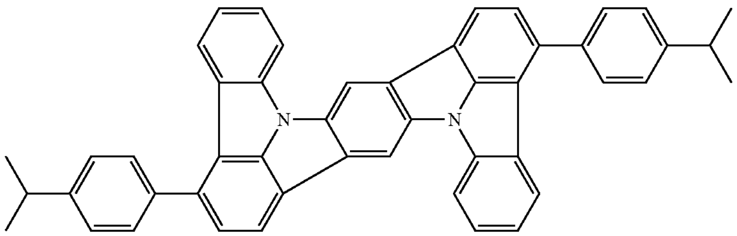

-continued
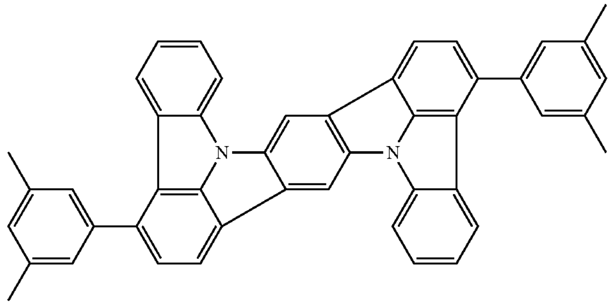
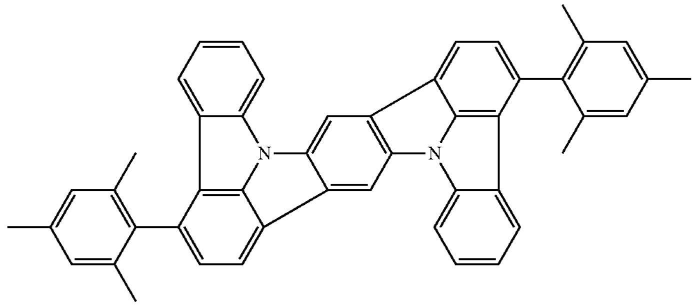
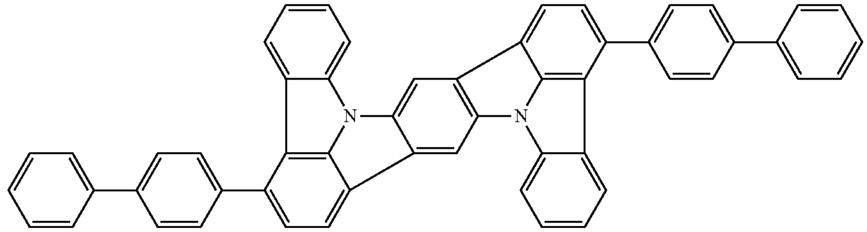
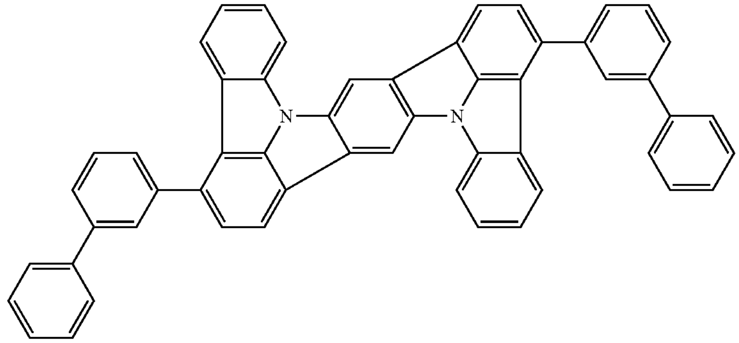
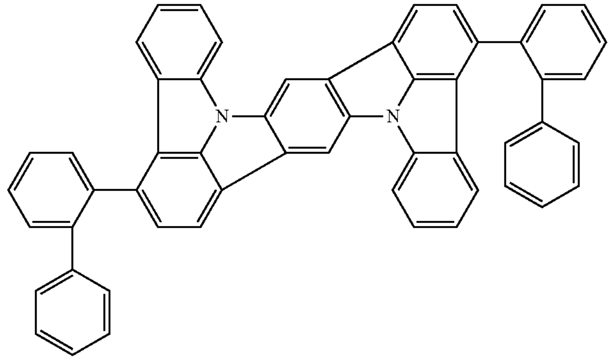

-continued
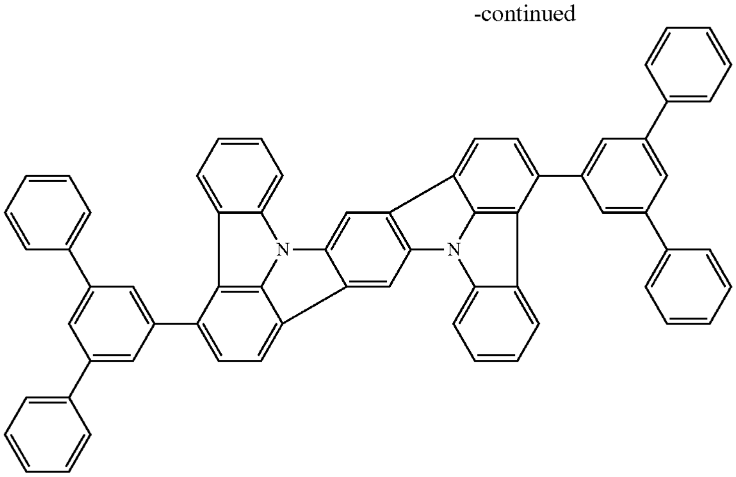
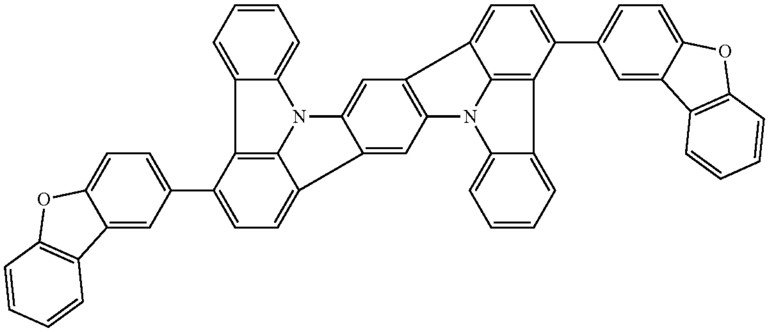
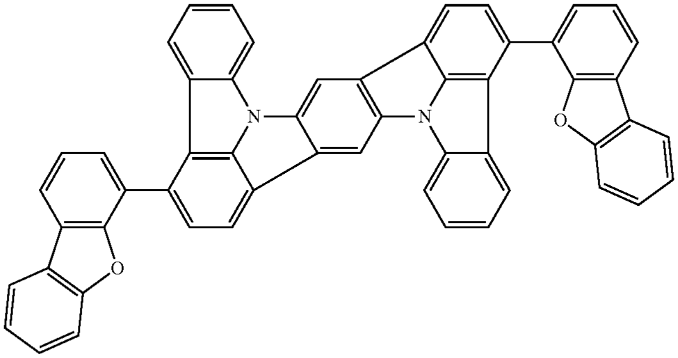
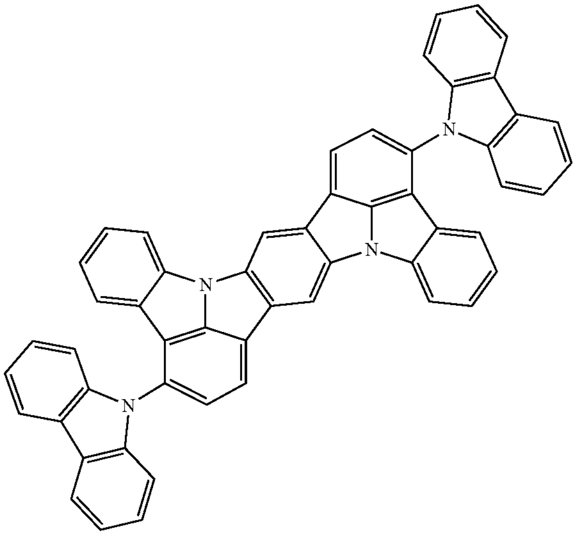

-continued
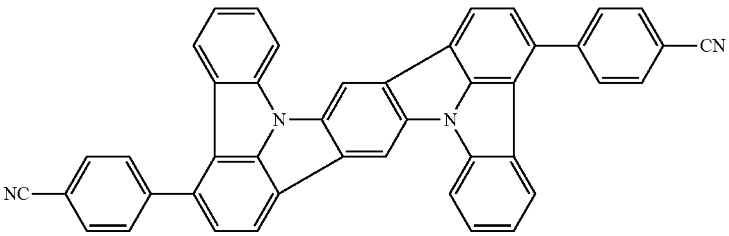
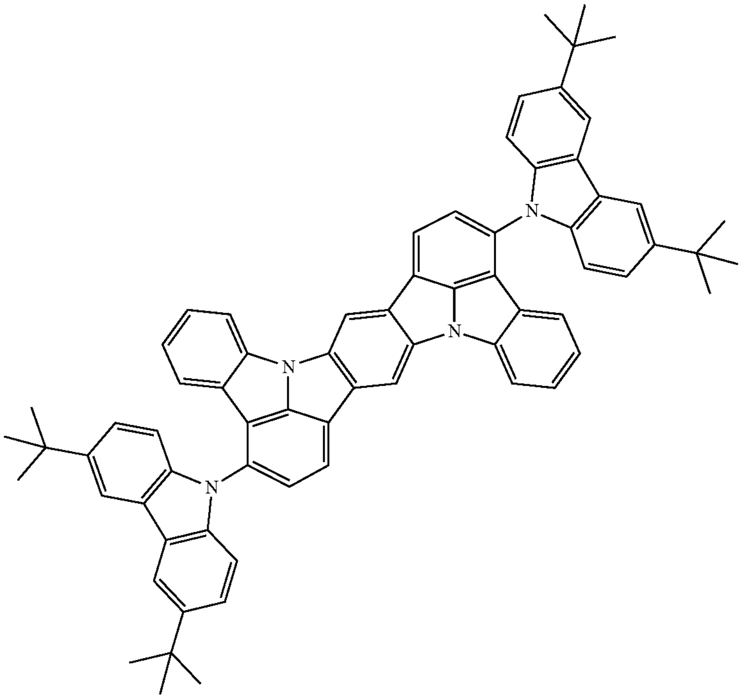
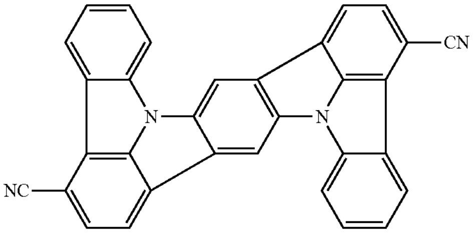

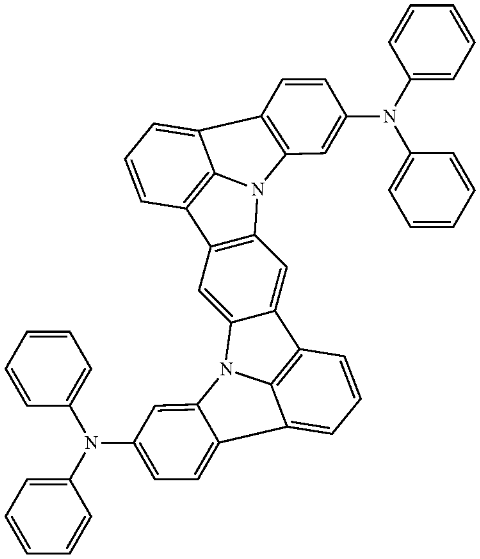
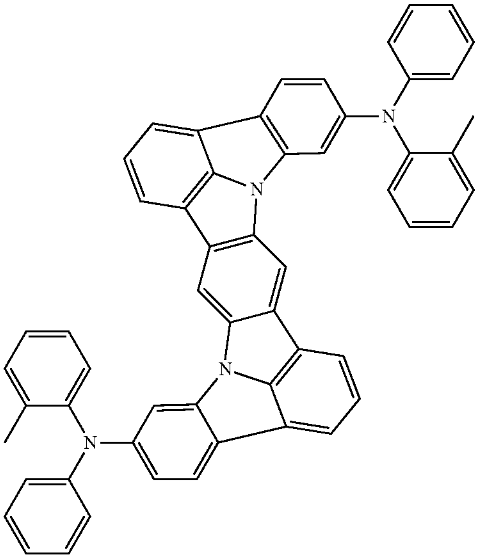
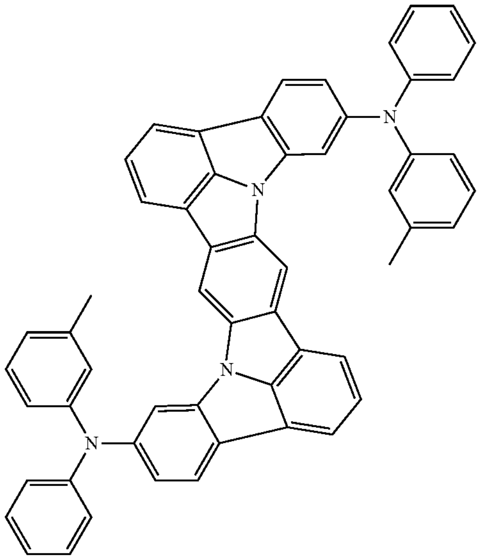
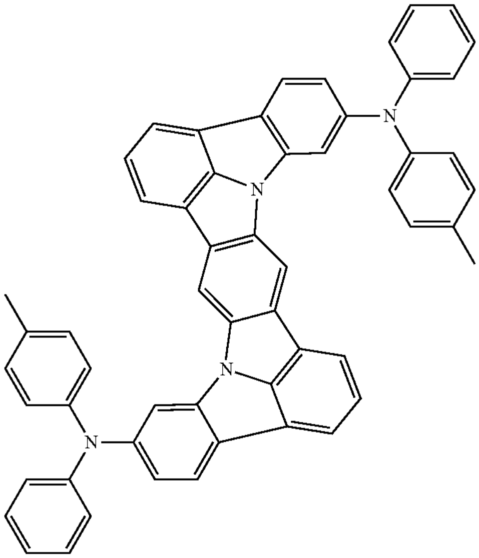
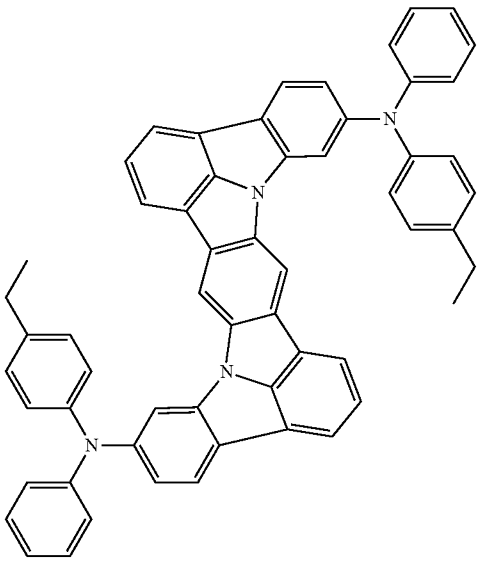
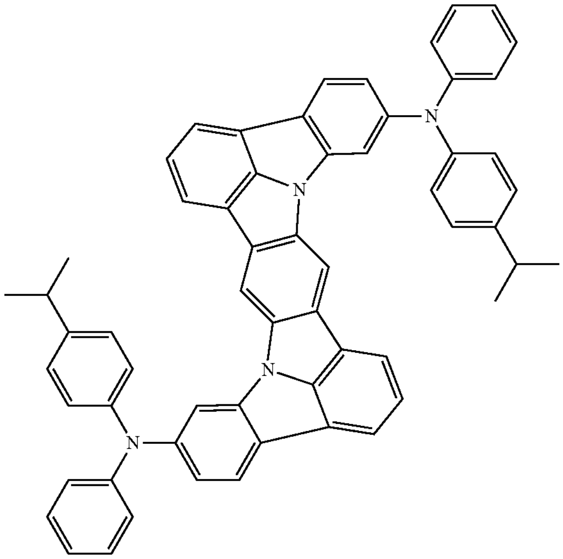

-continued
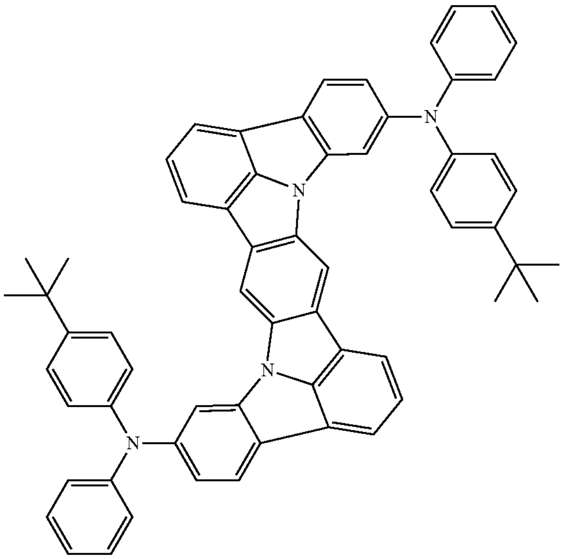
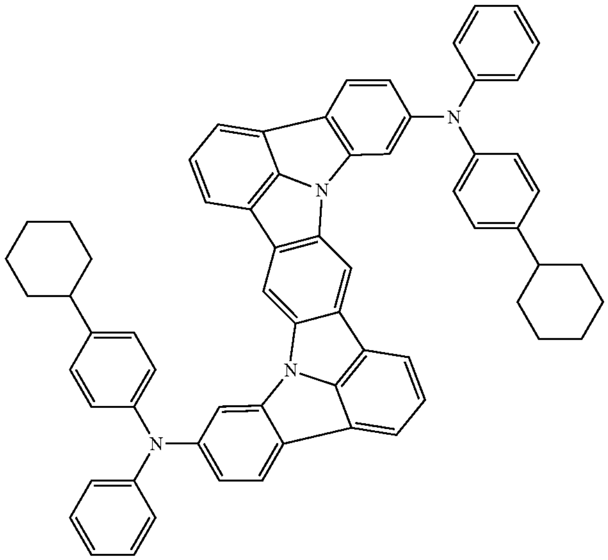
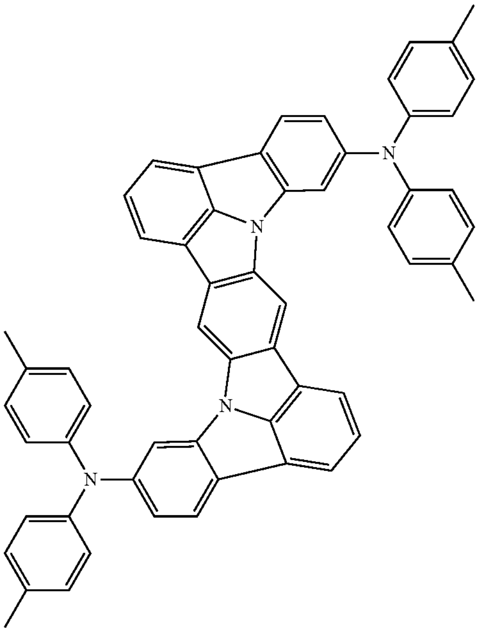
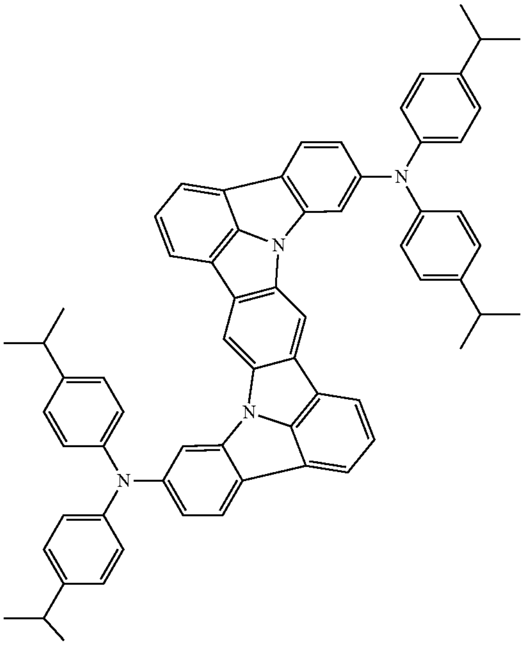

-continued
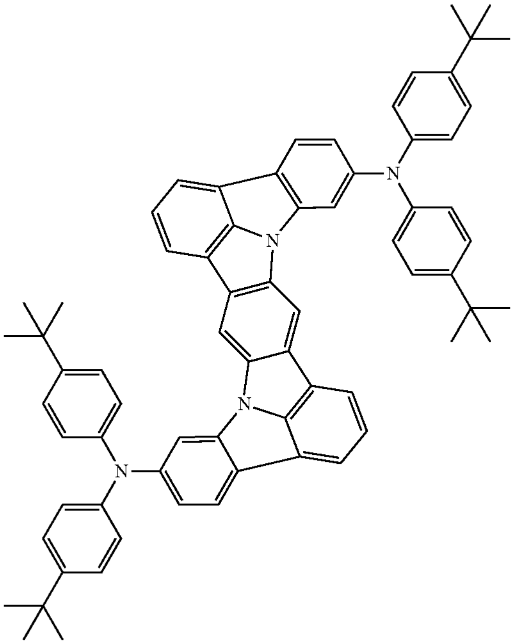
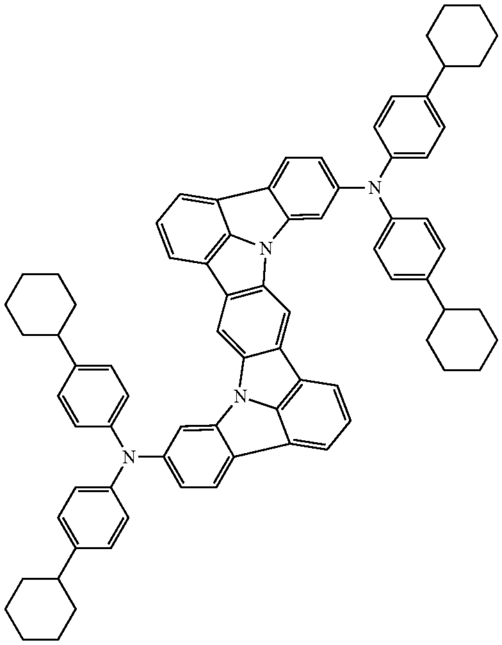
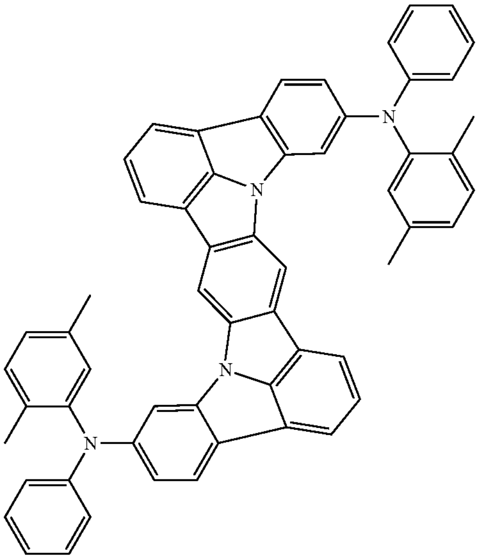
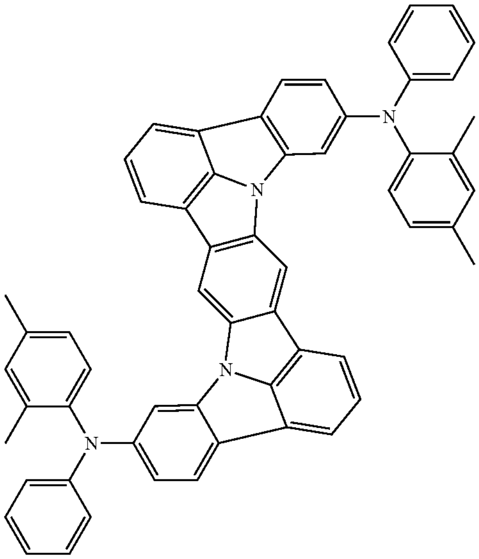

-continued
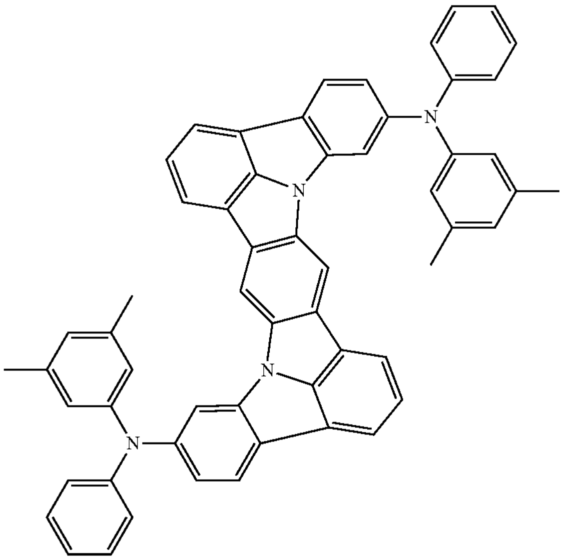
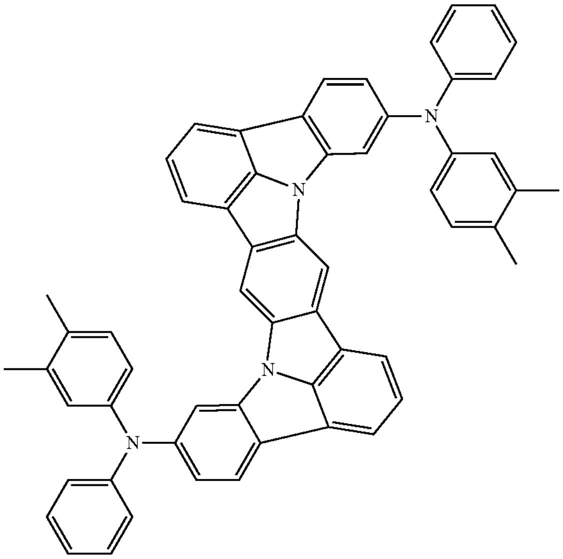
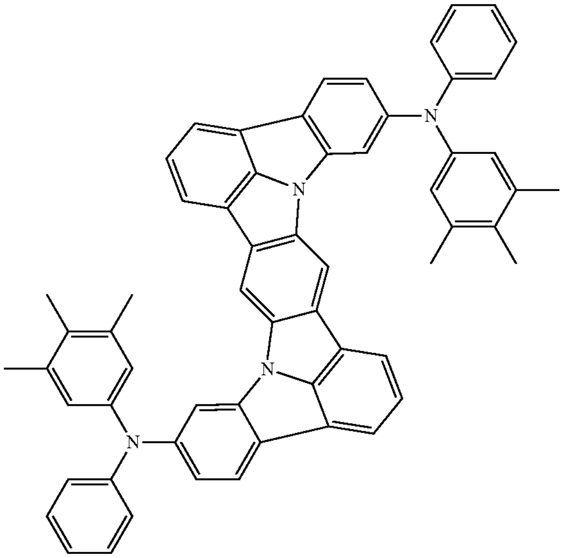
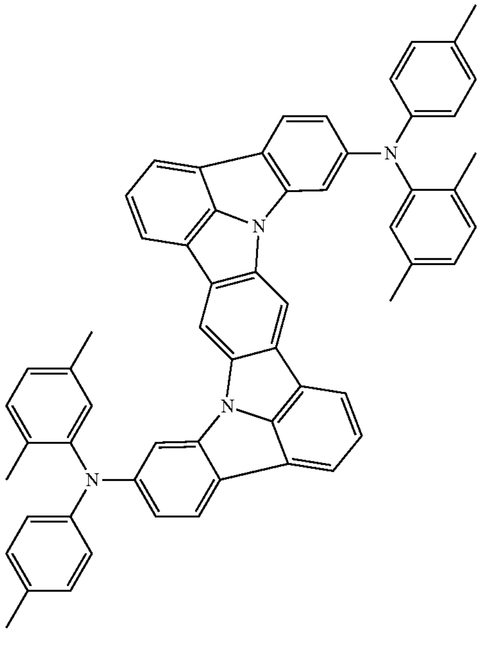

-continued
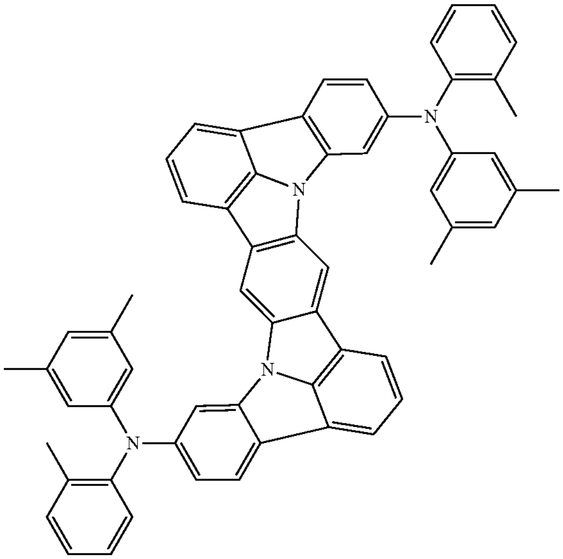
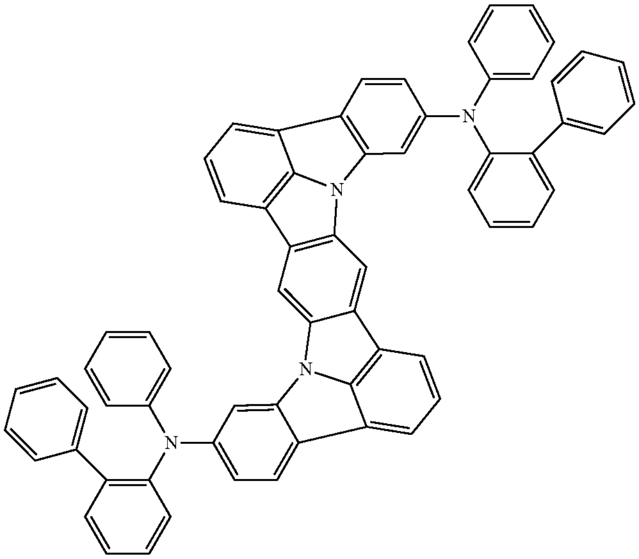

-continued
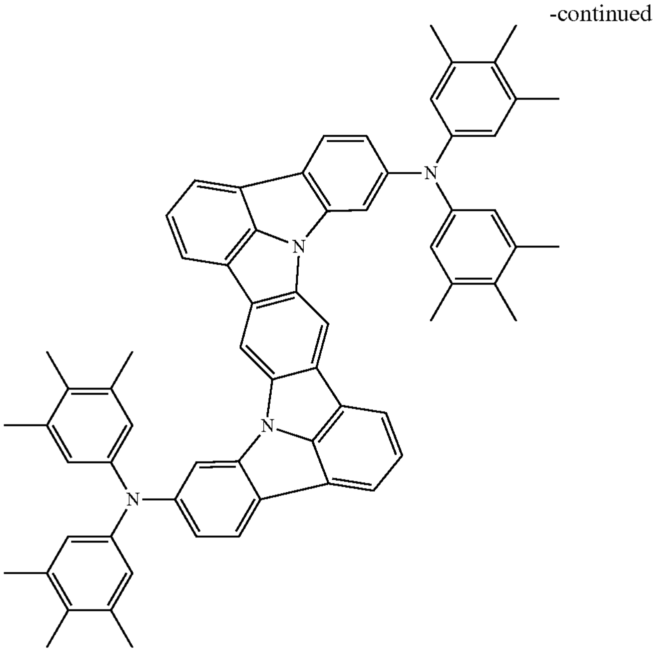
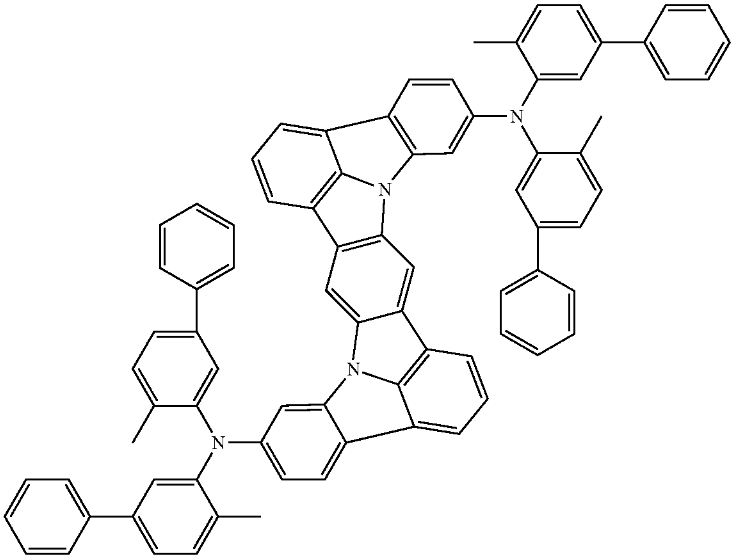

-continued
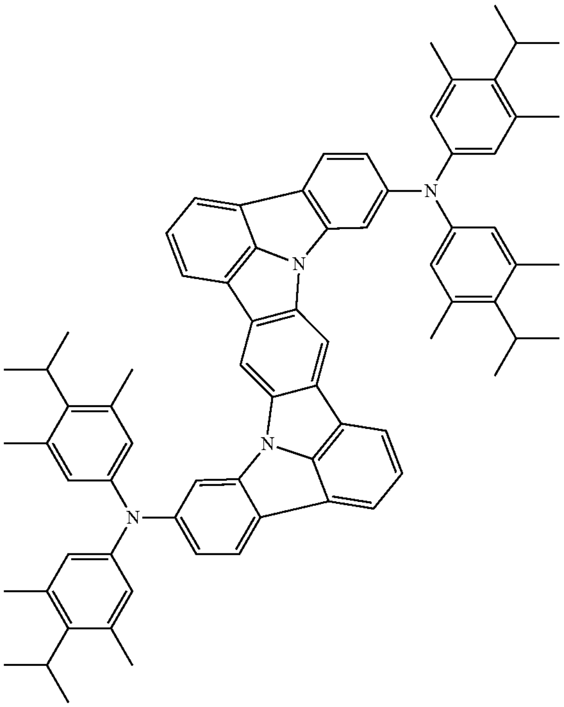
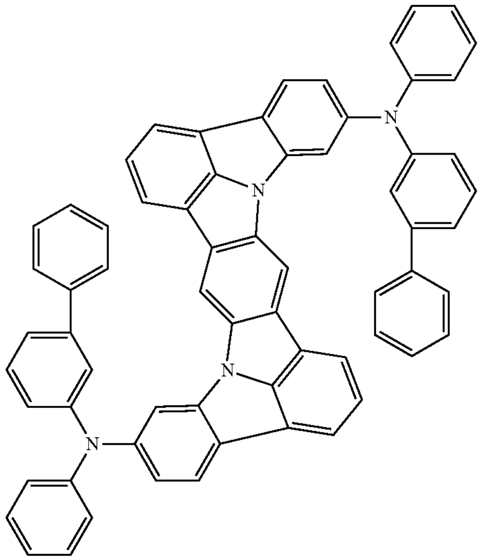
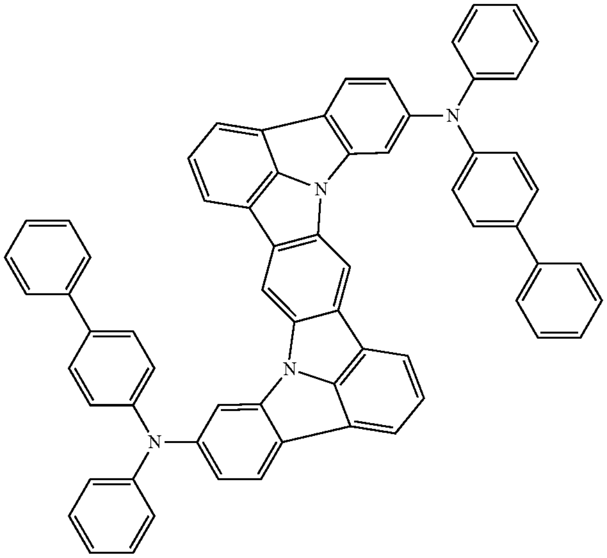

-continued
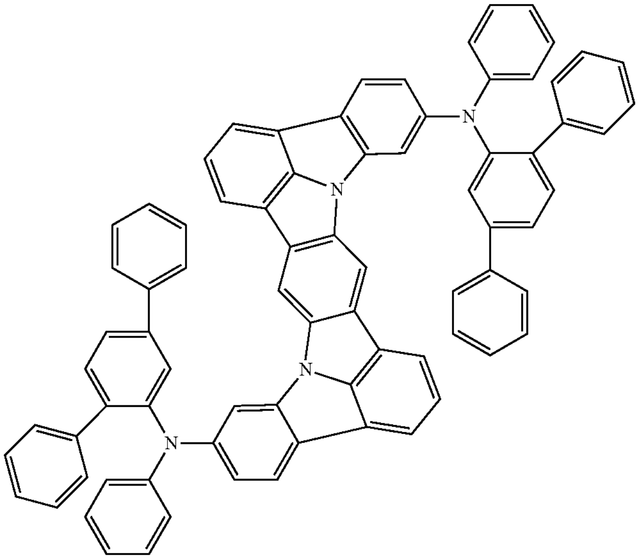
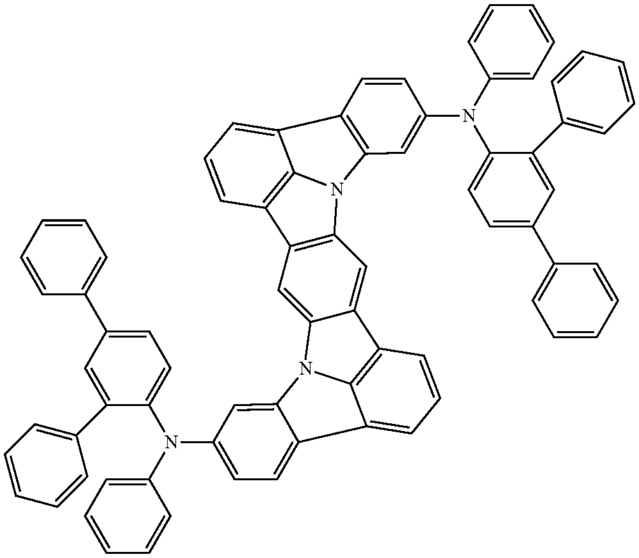
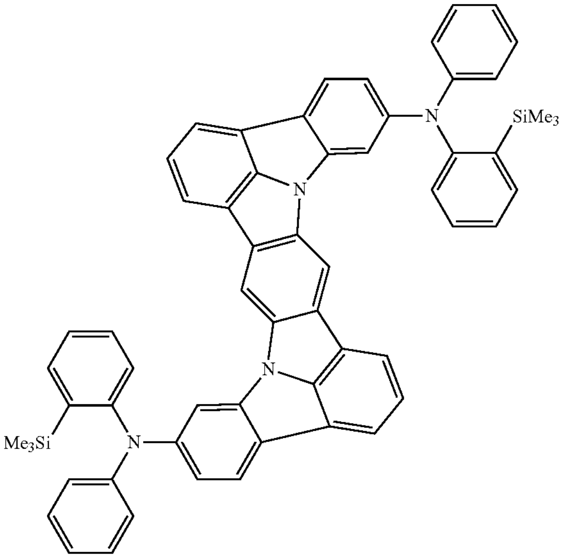
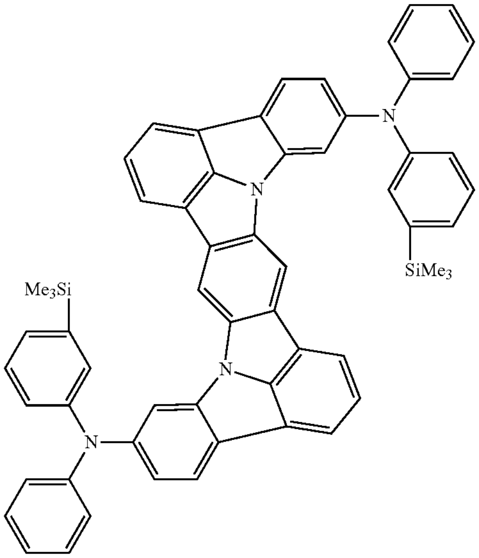

-continued
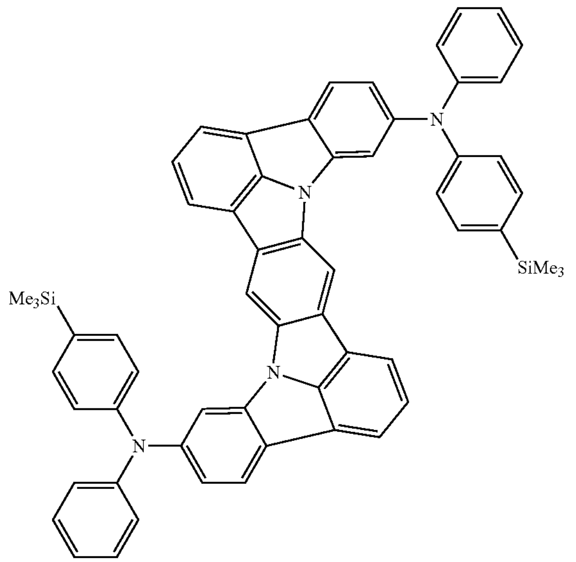
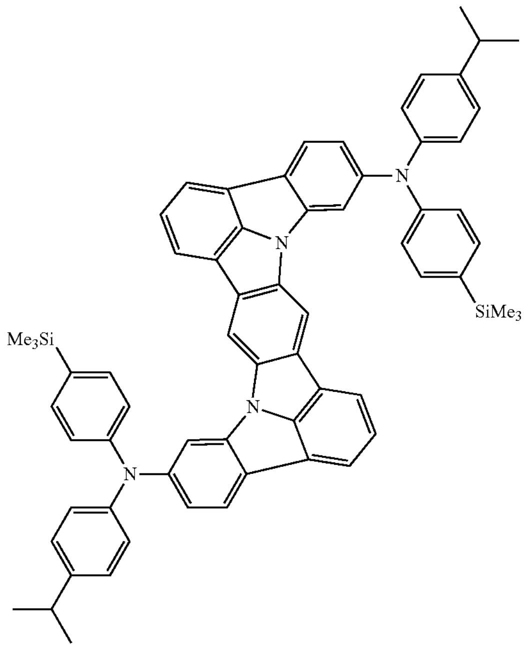
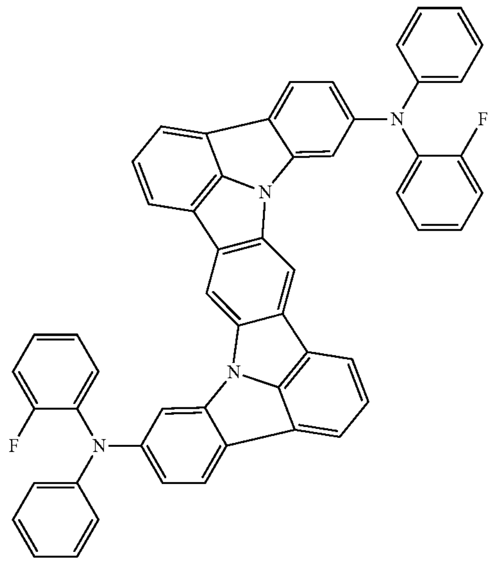
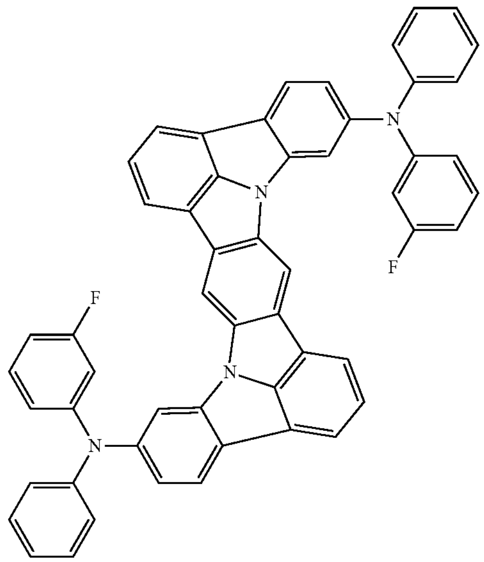

-continued
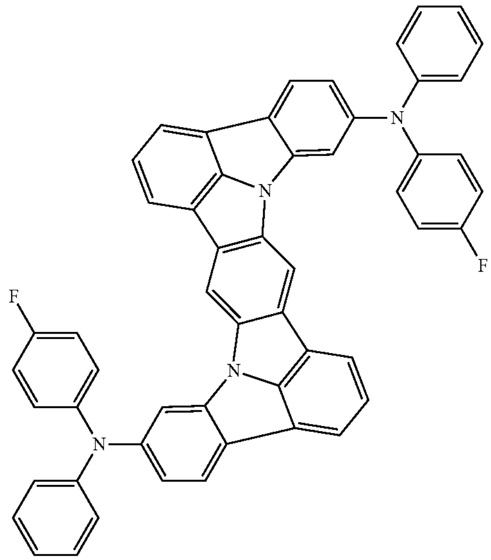
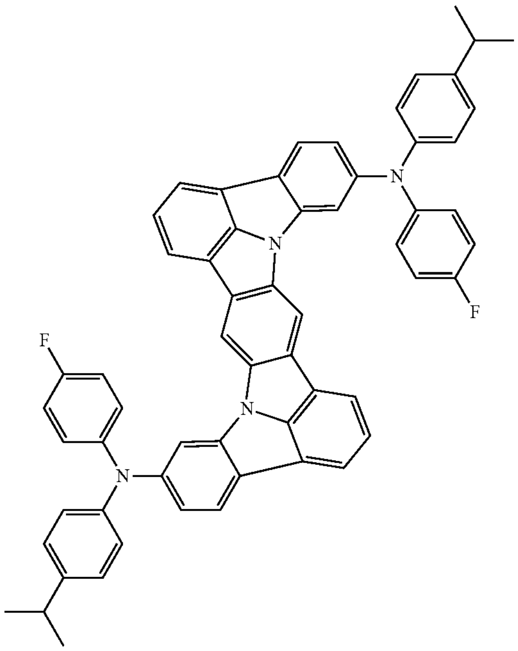
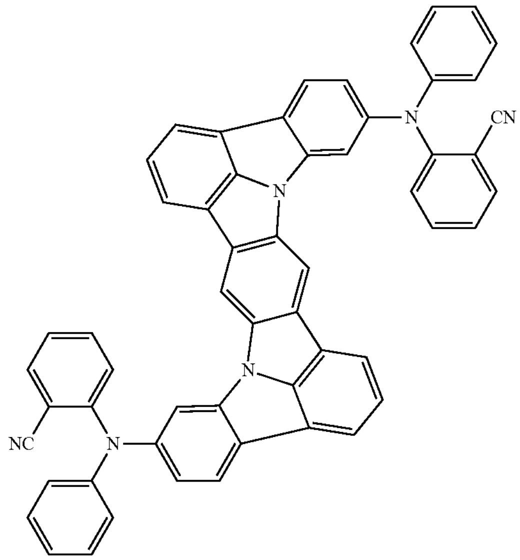
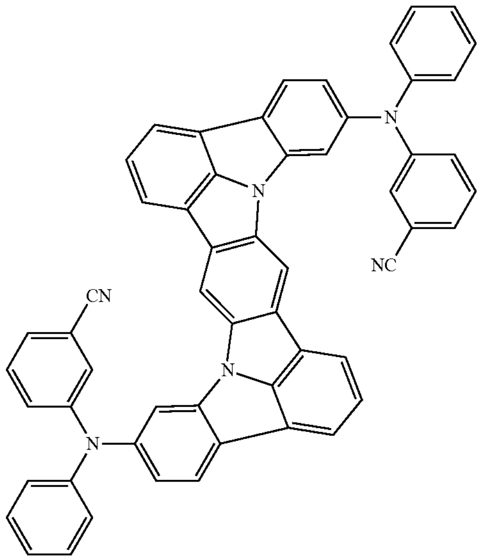

-continued
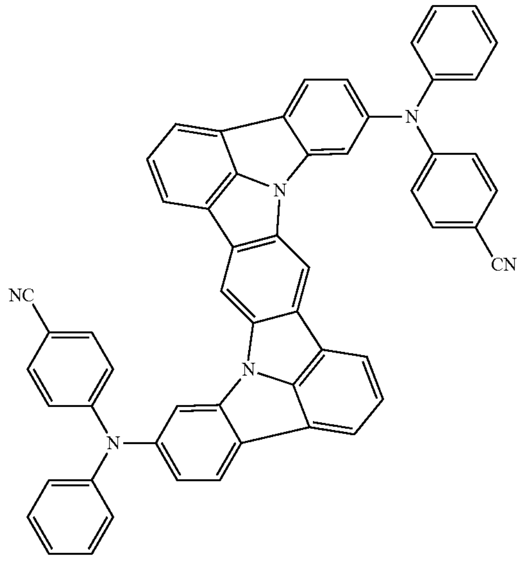
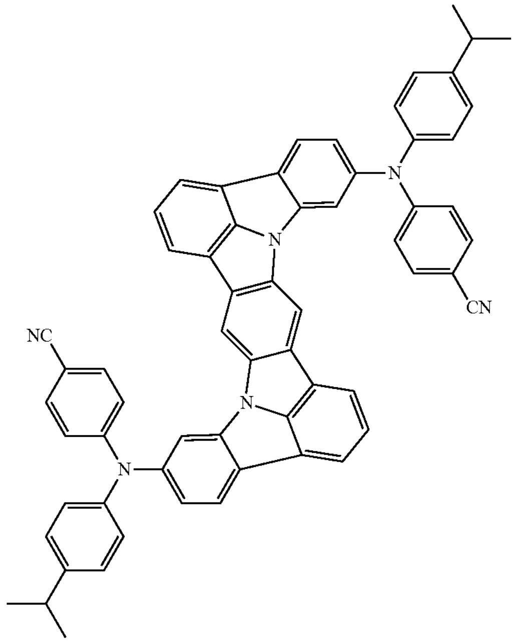
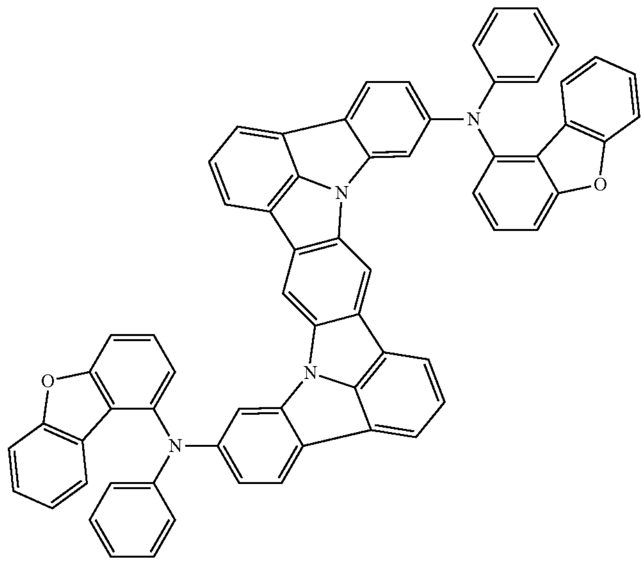

-continued
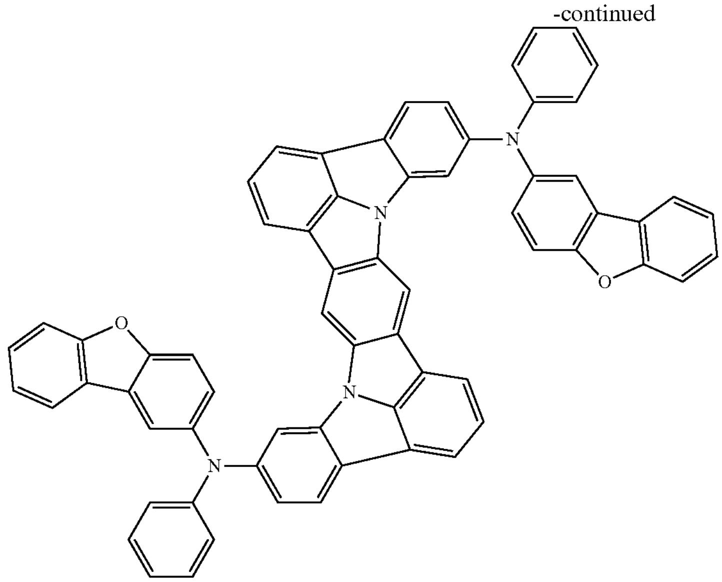
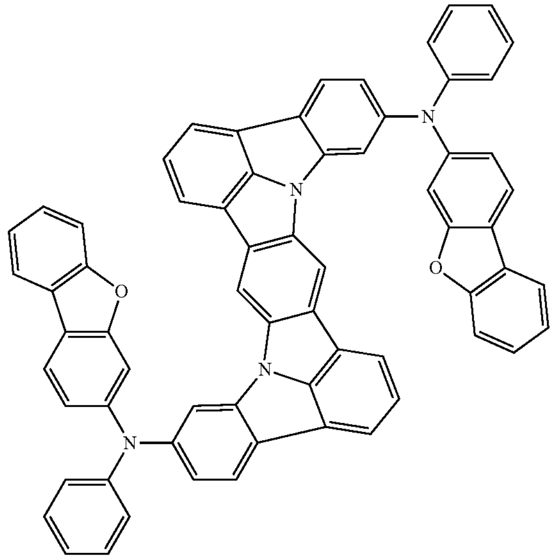
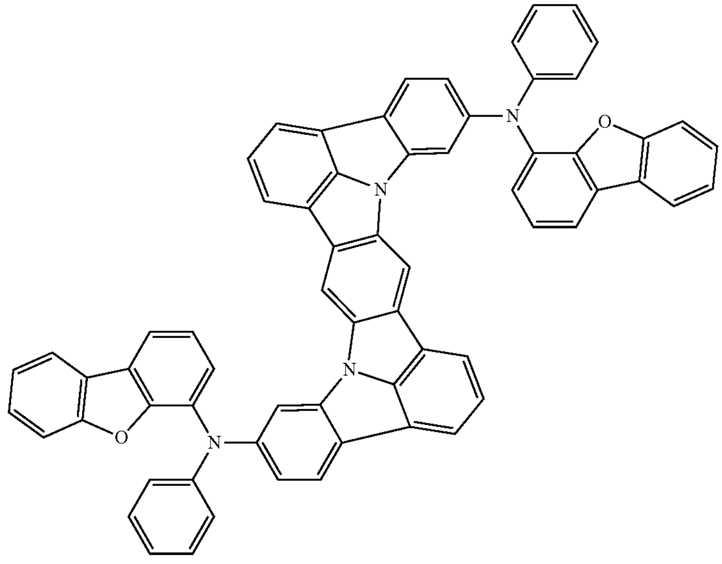

-continued
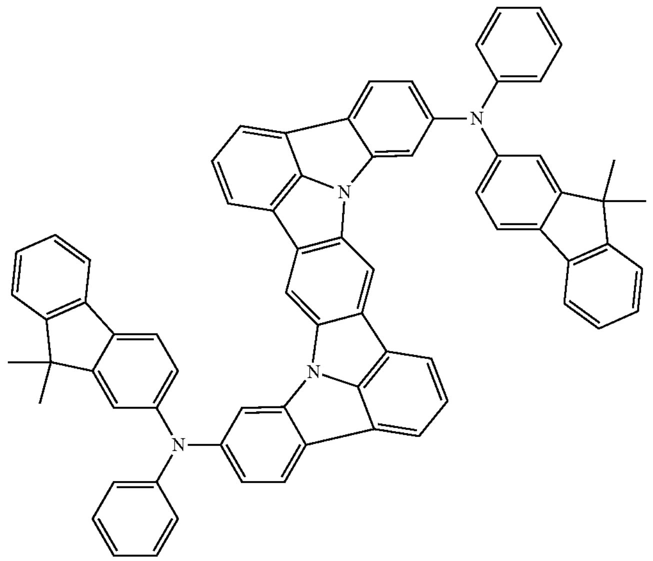
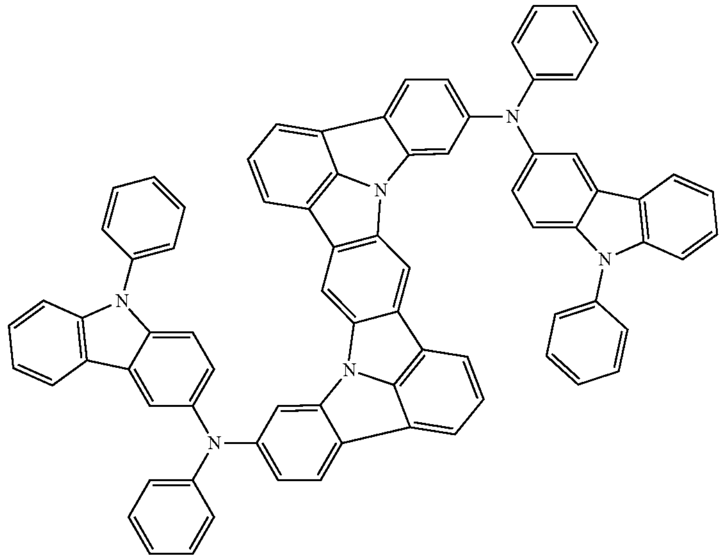
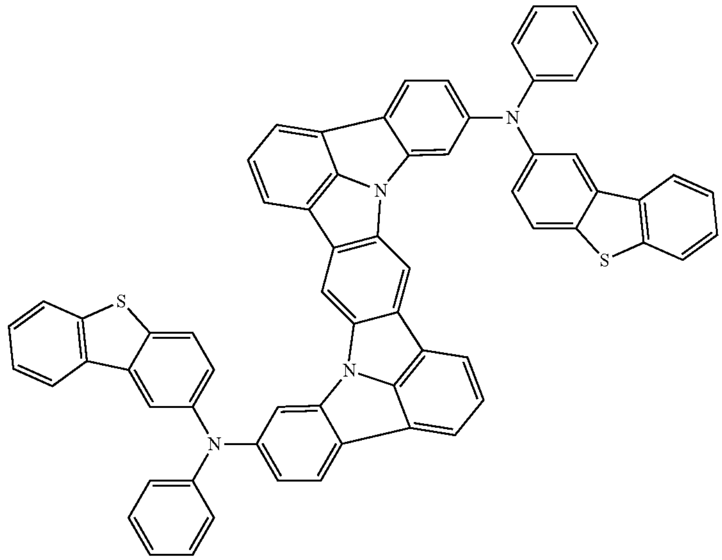

-continued
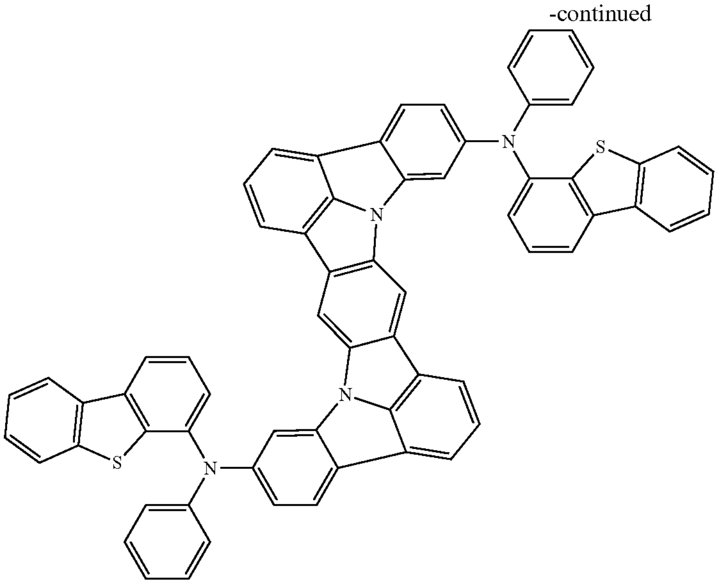
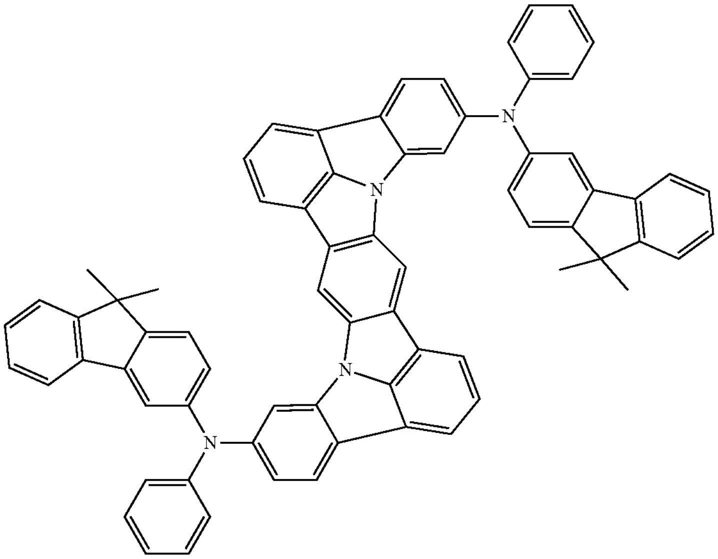
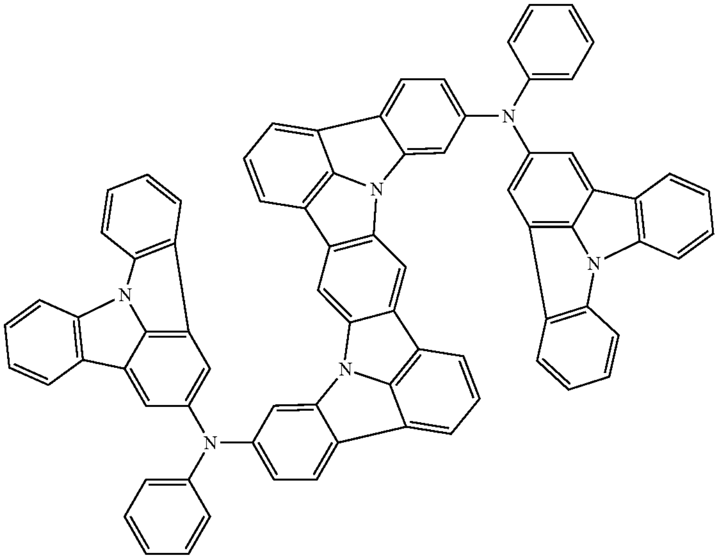

-continued
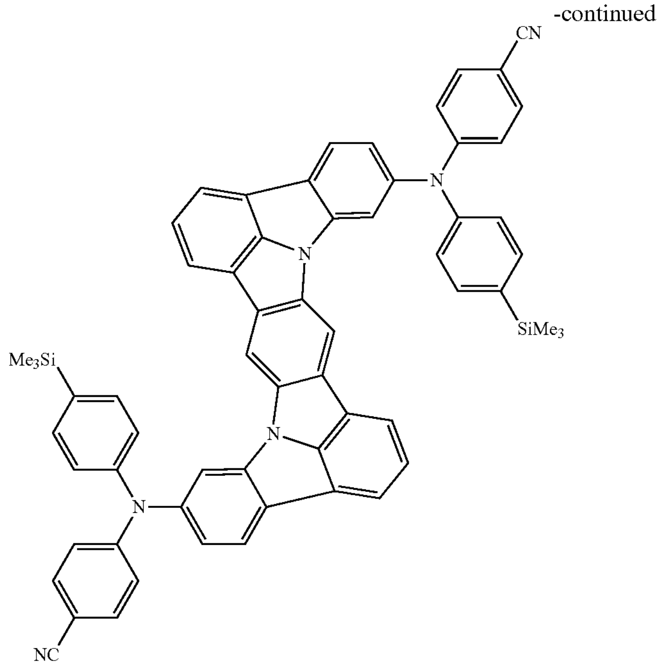
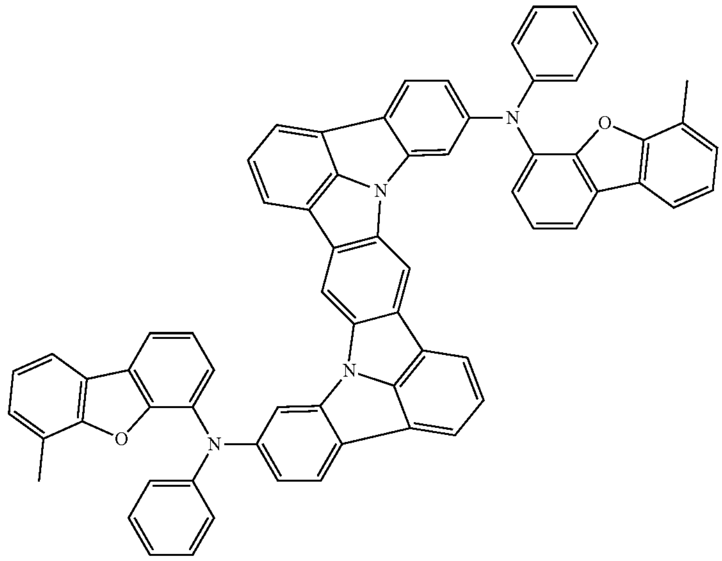

-continued
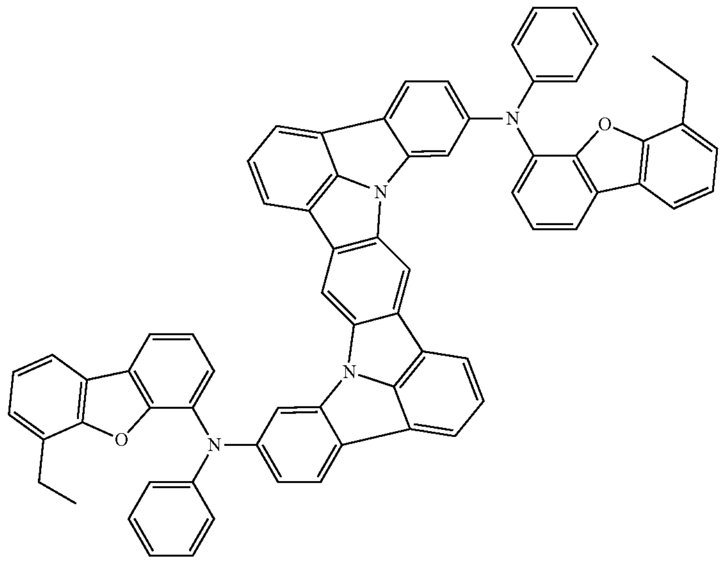
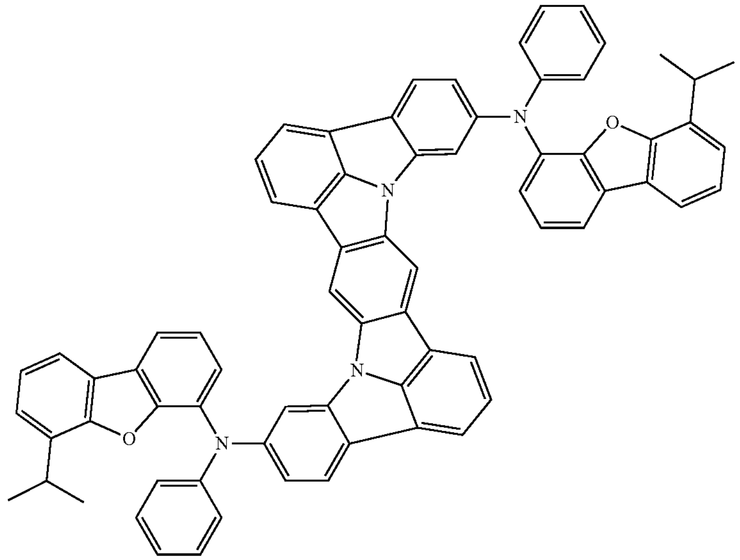
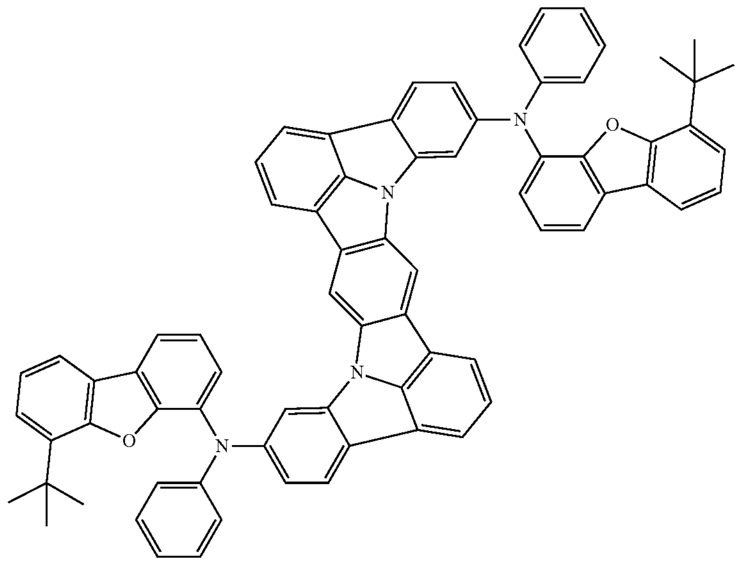

-continued
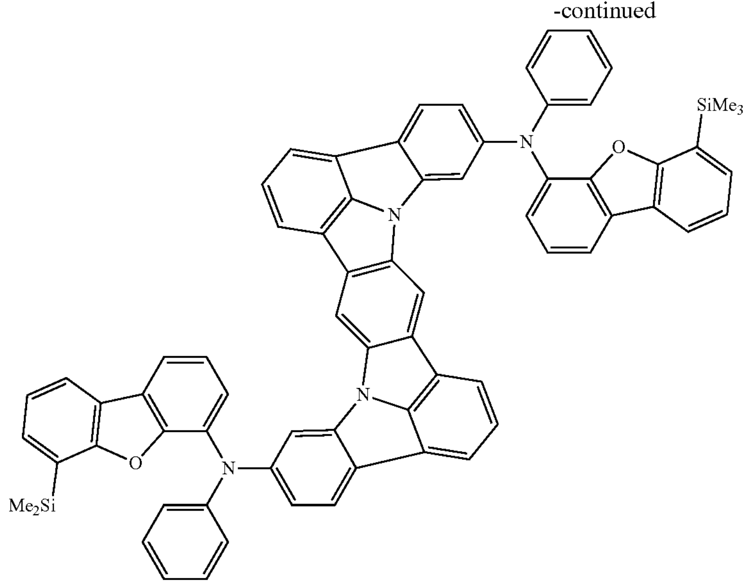
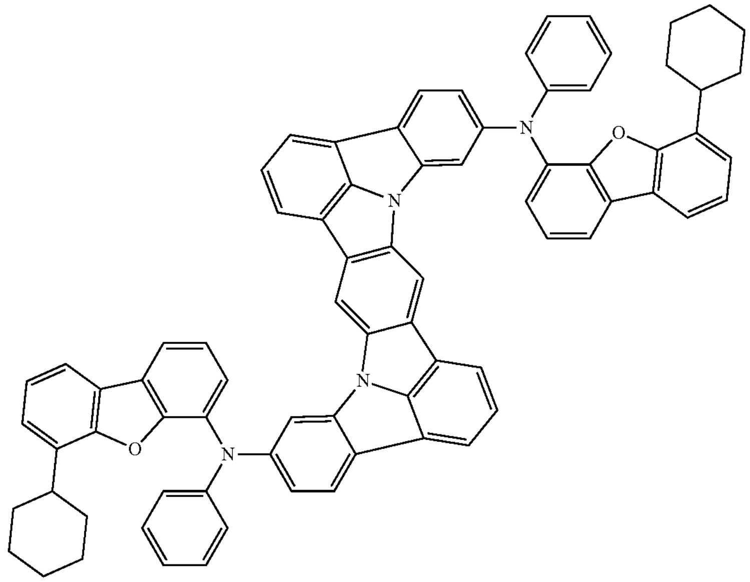
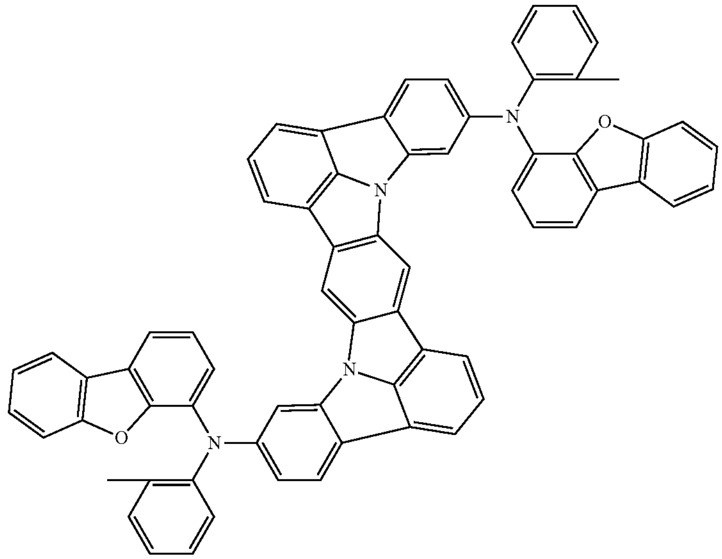

-continued
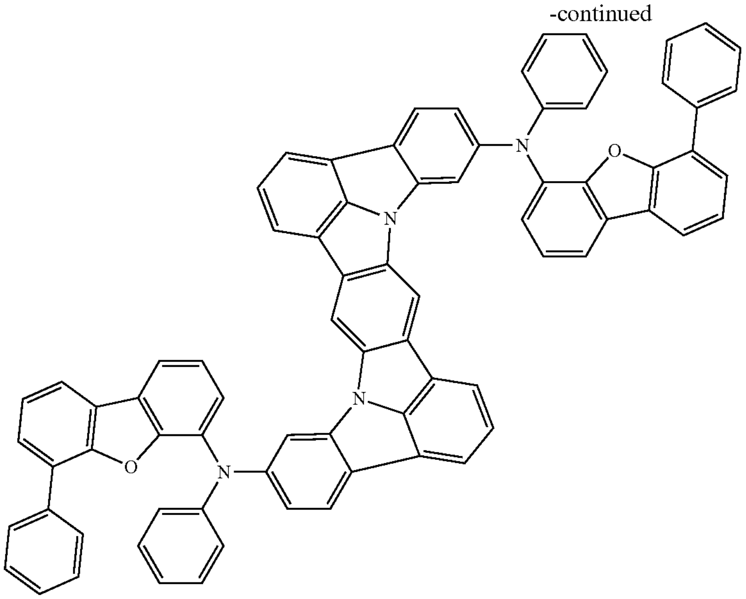
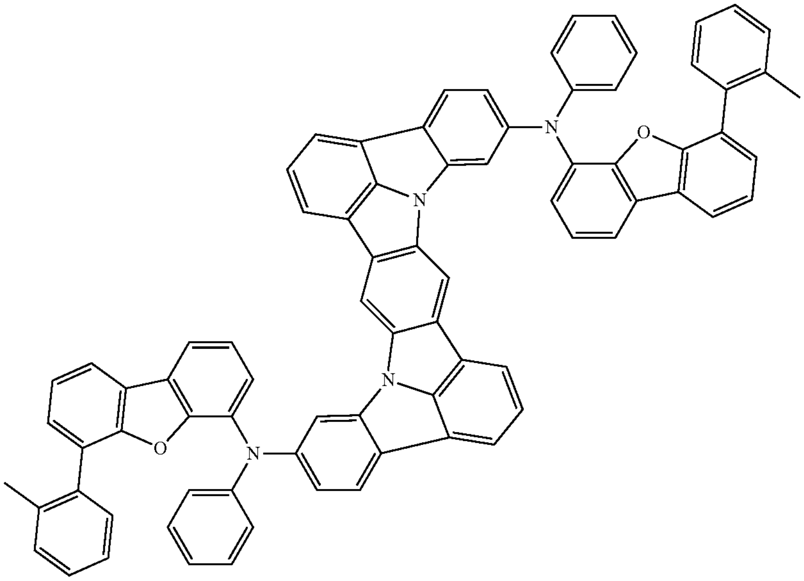
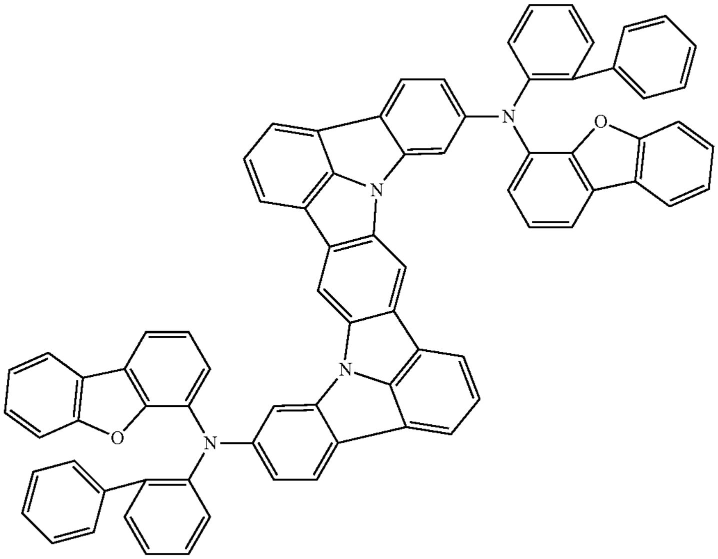

-continued
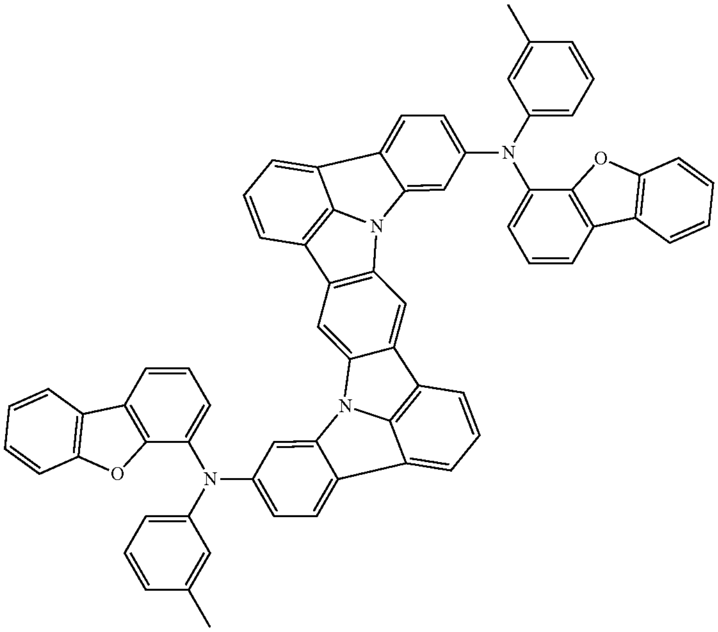
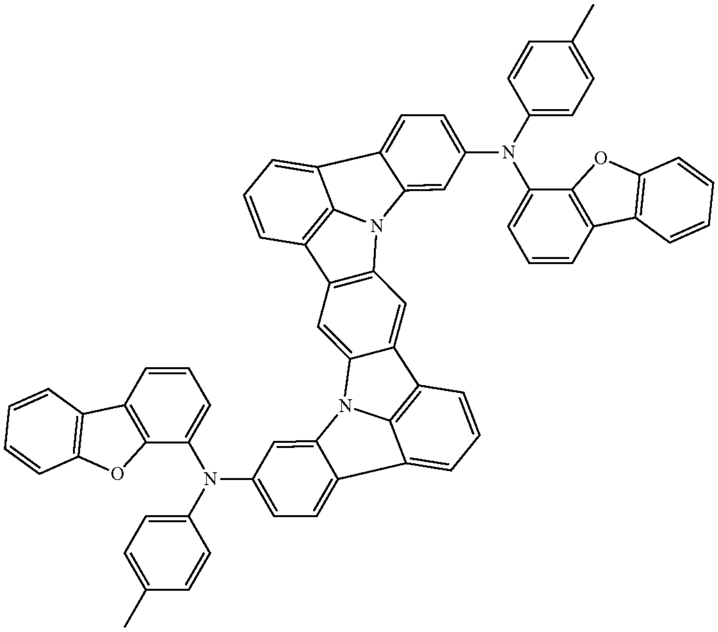

-continued
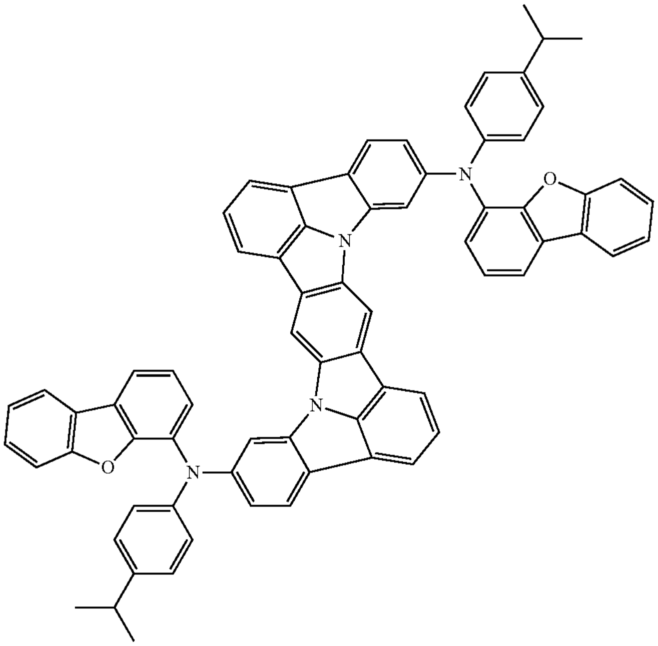
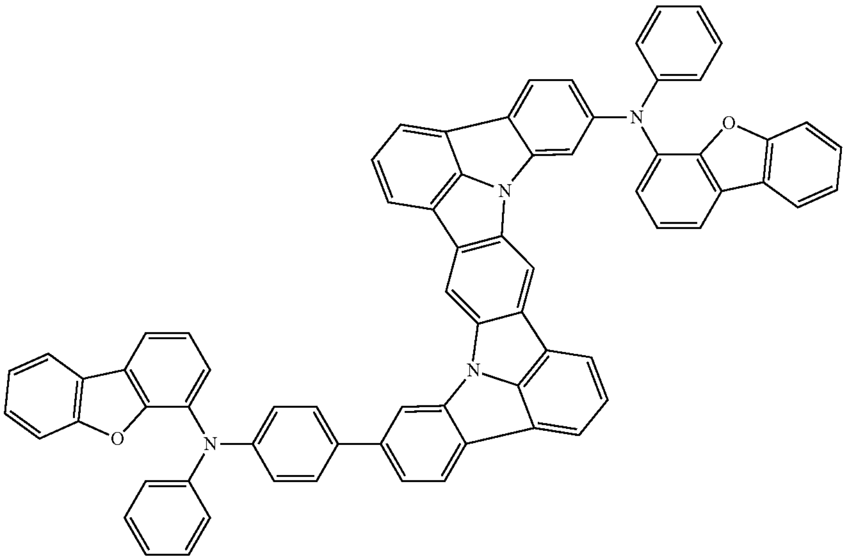

-continued
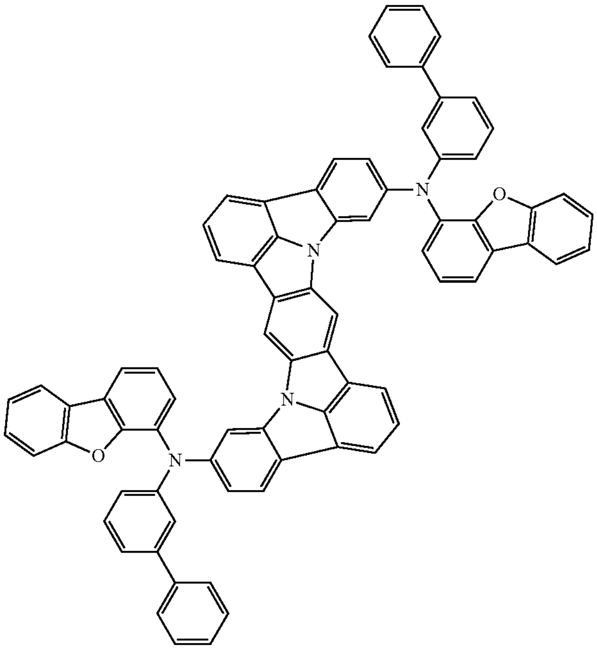
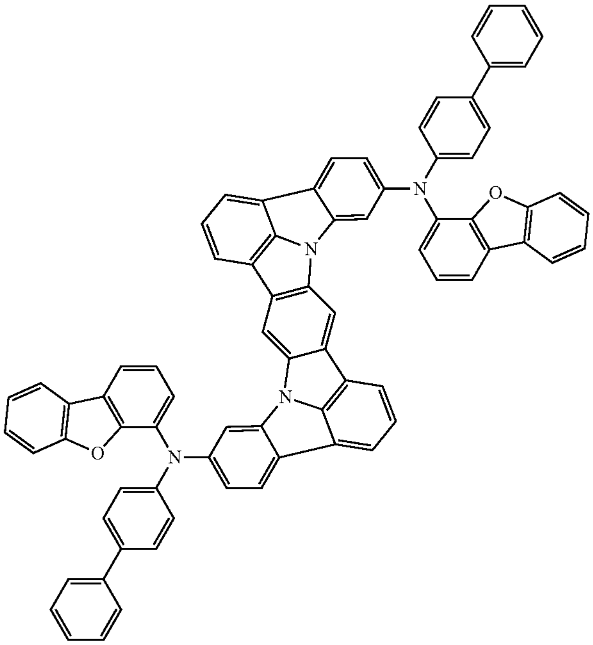

-continued
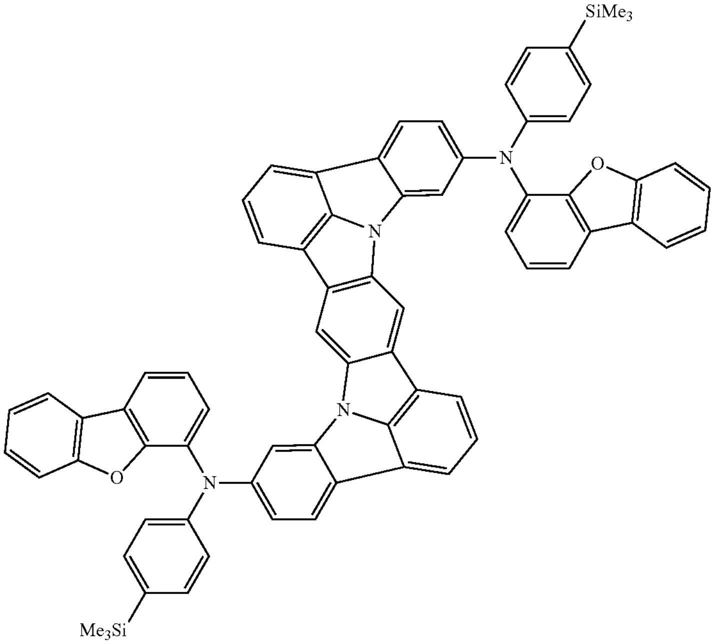
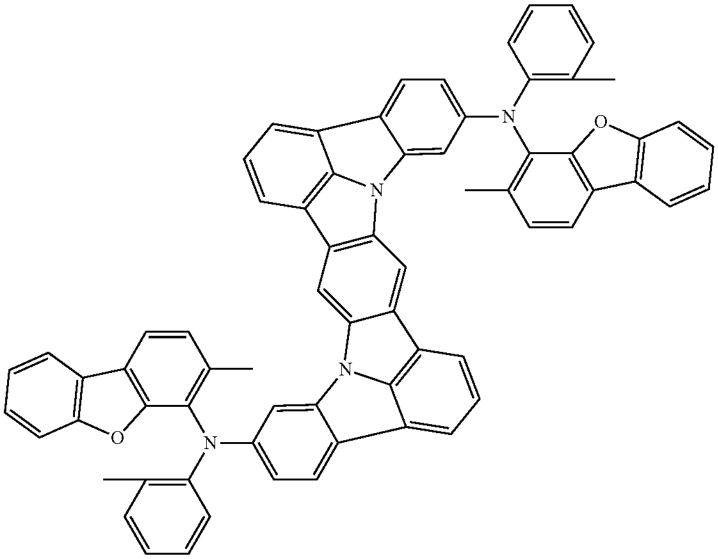

-continued
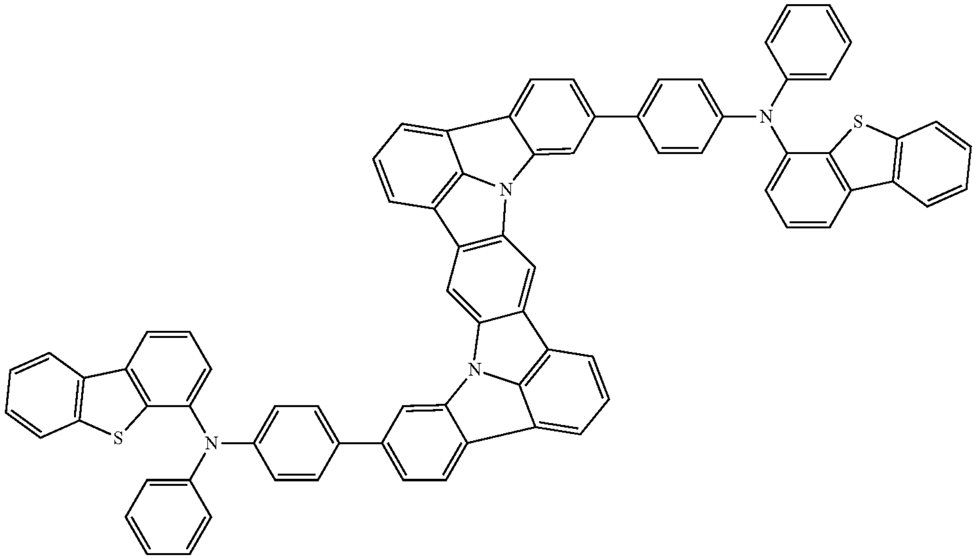
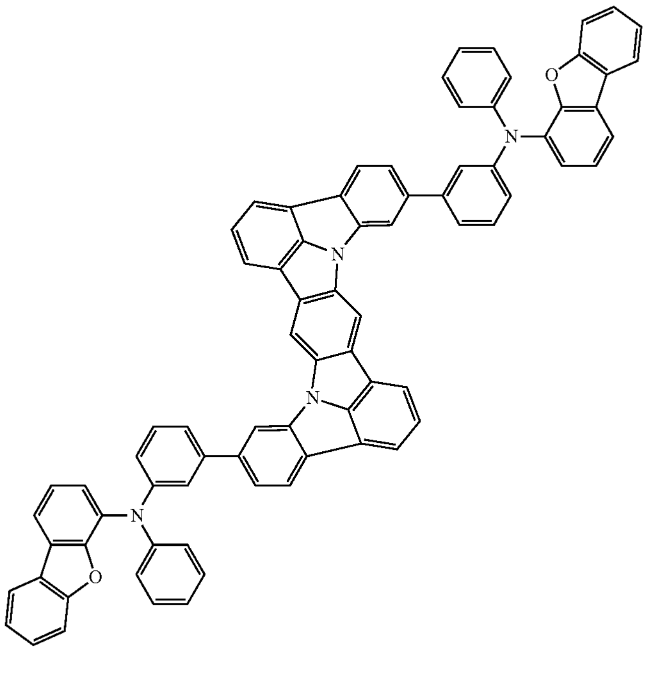

-continued
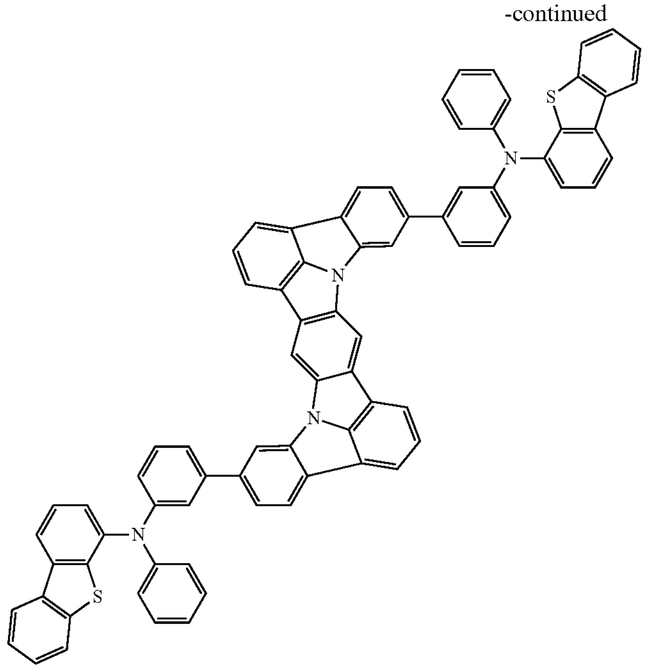
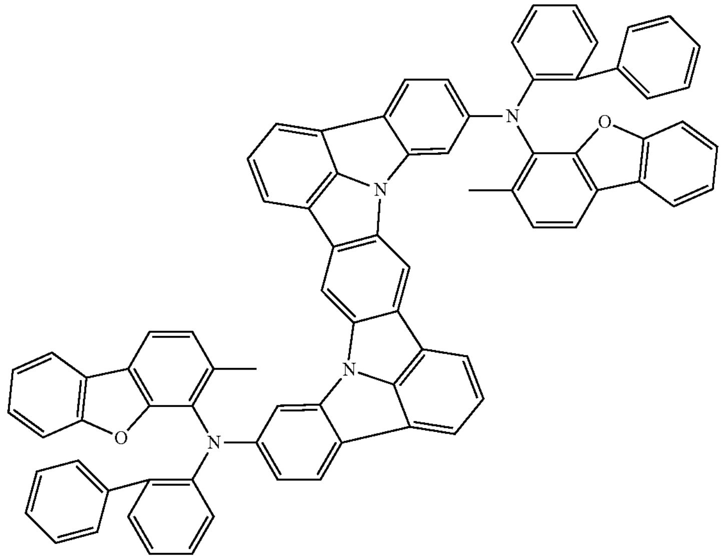

-continued
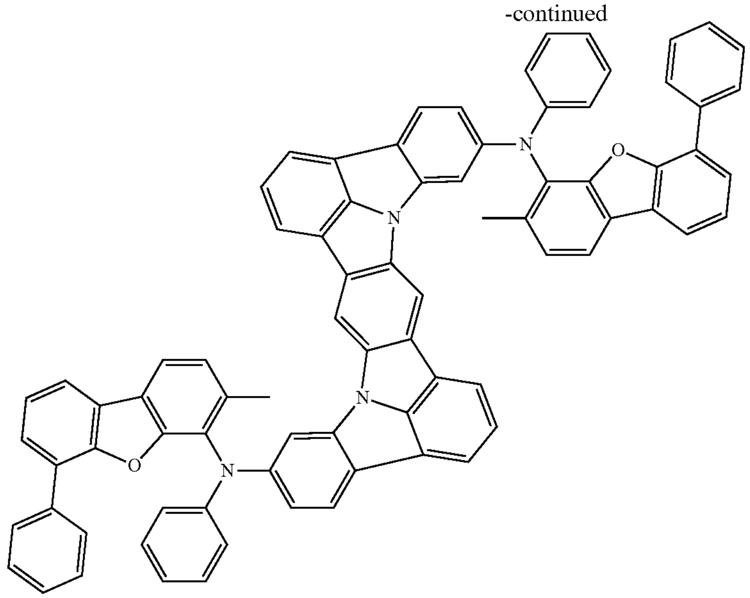
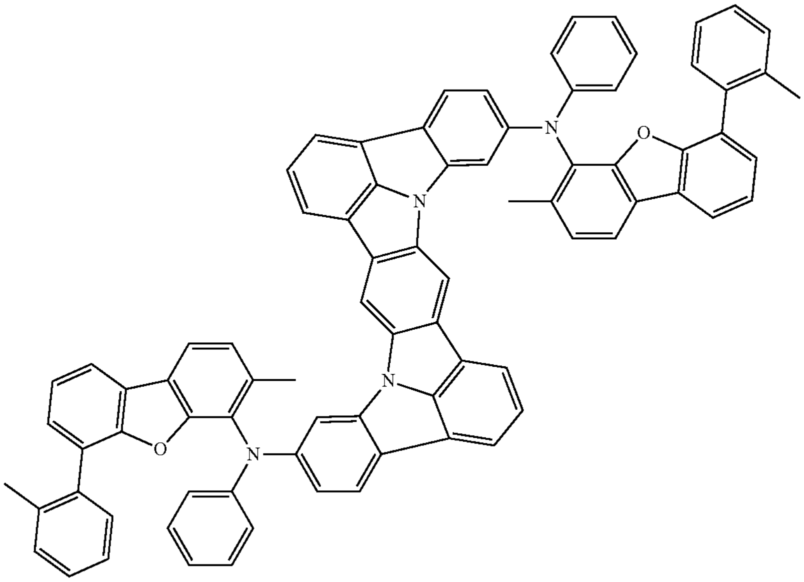
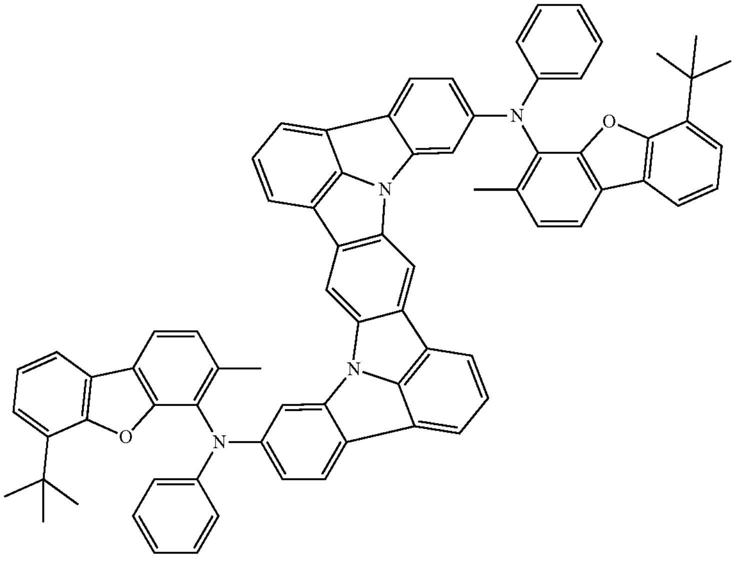

-continued
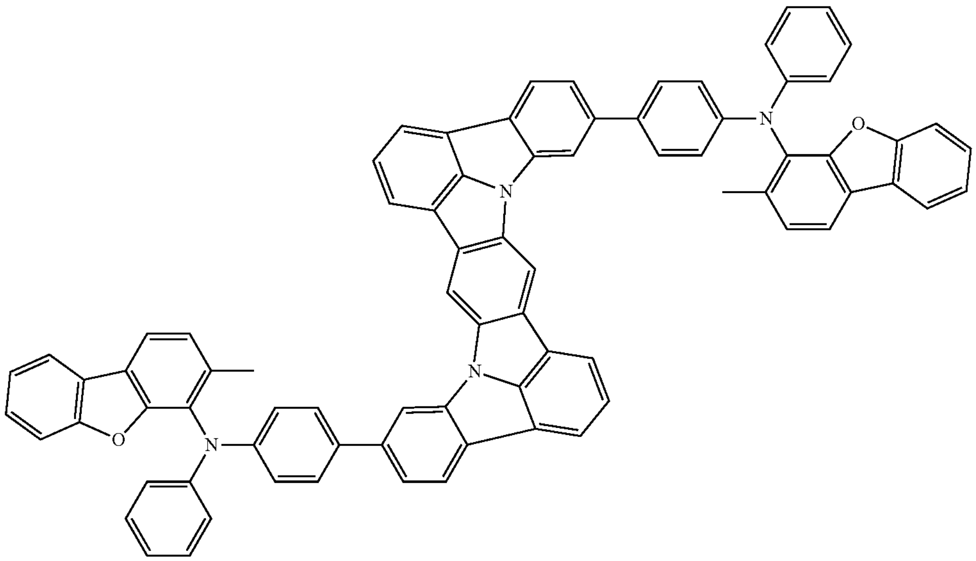
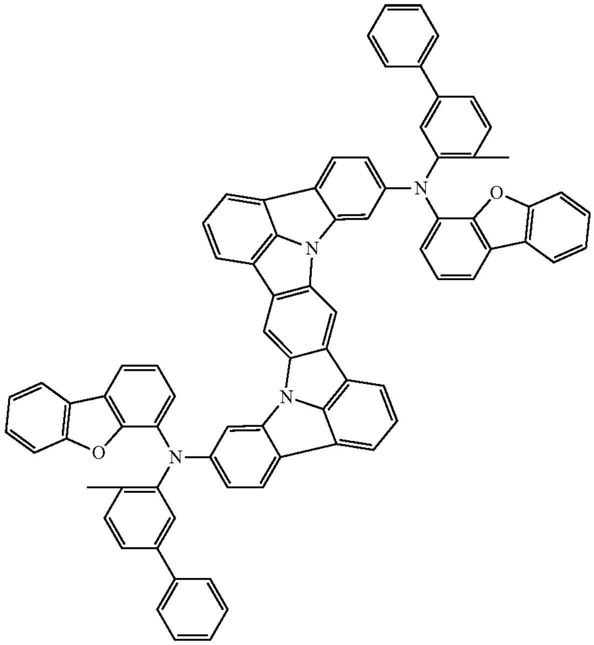
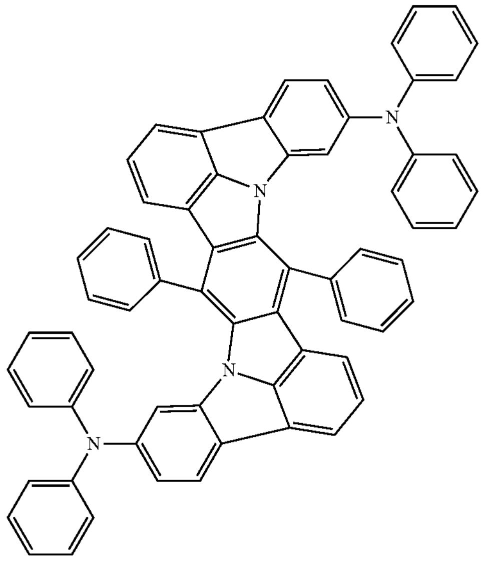

-continued
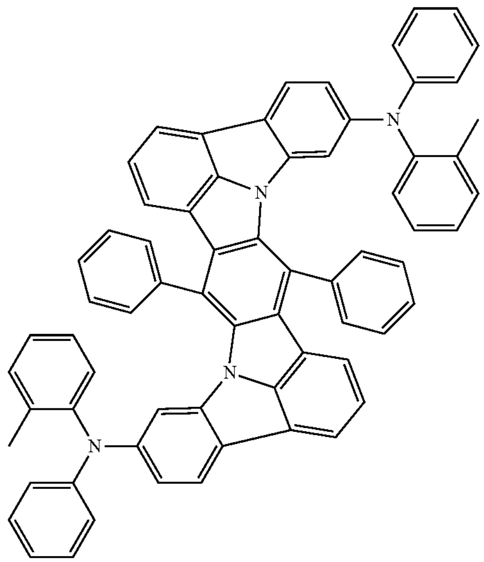
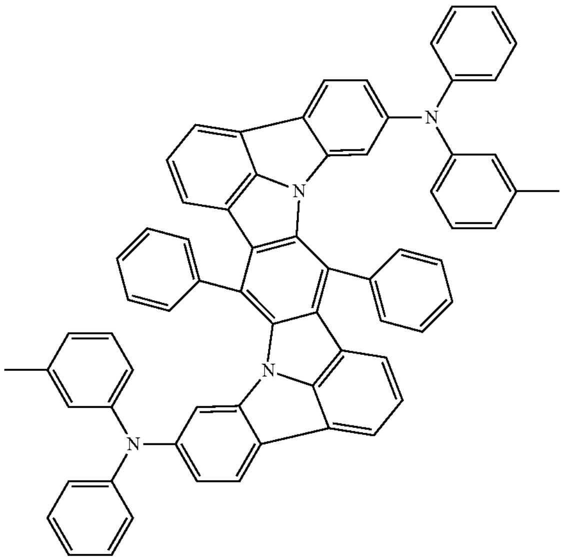
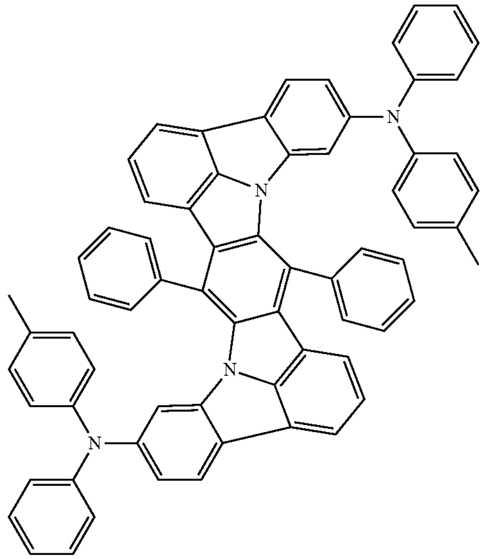
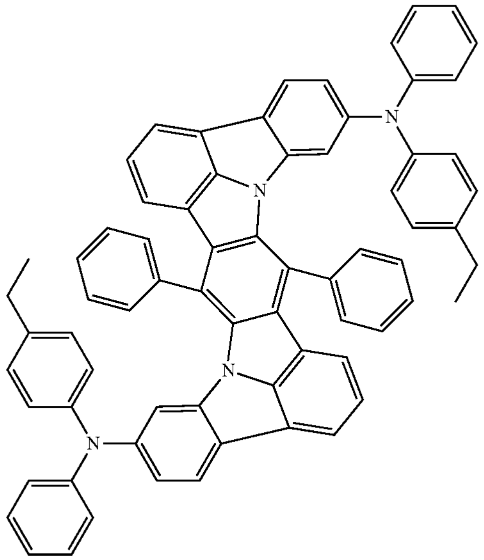
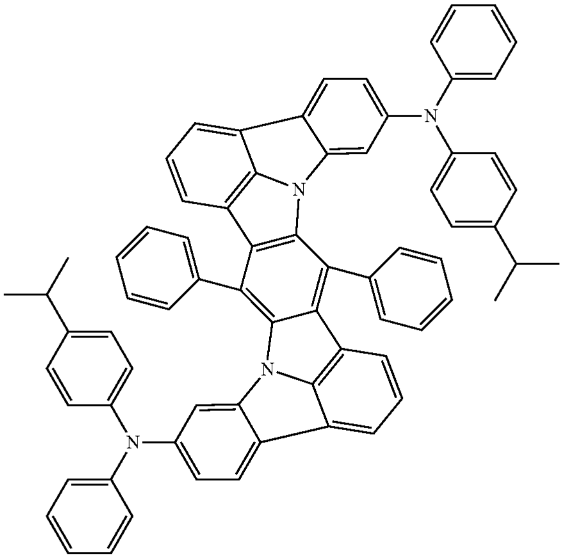
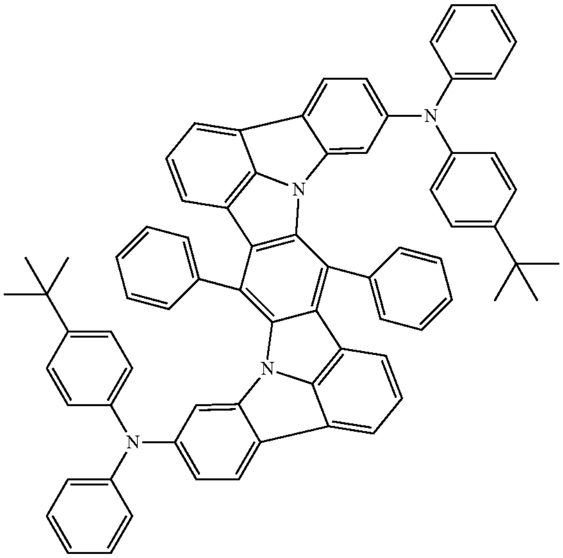

-continued
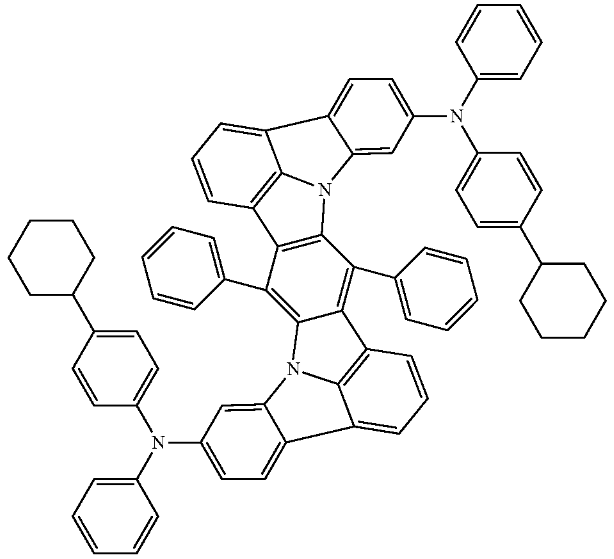
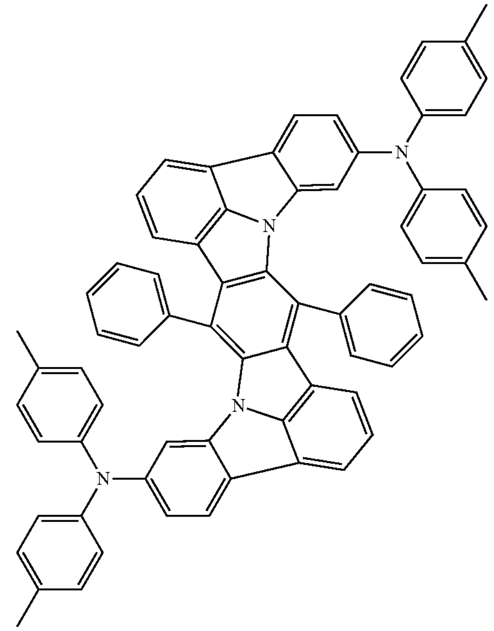
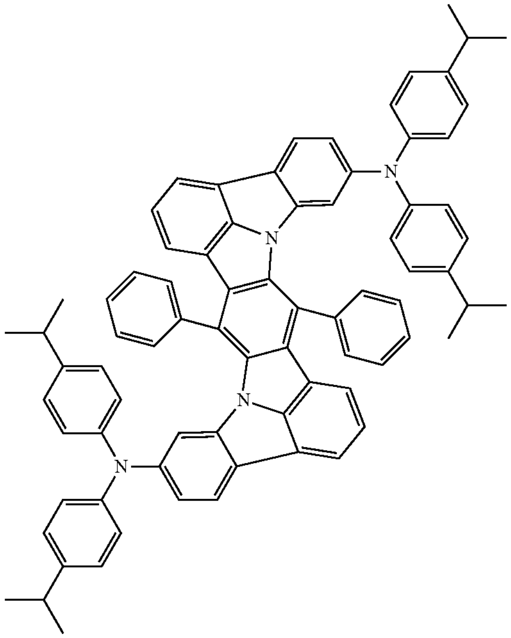
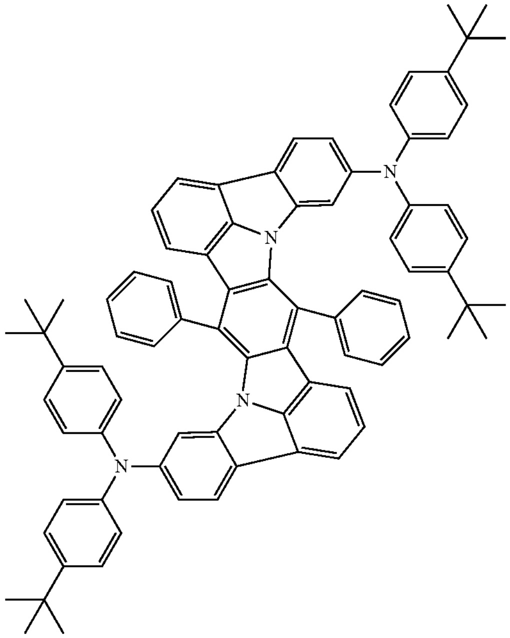

-continued
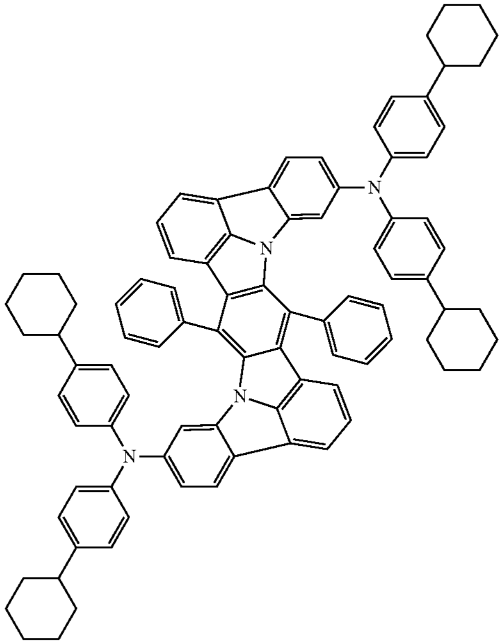
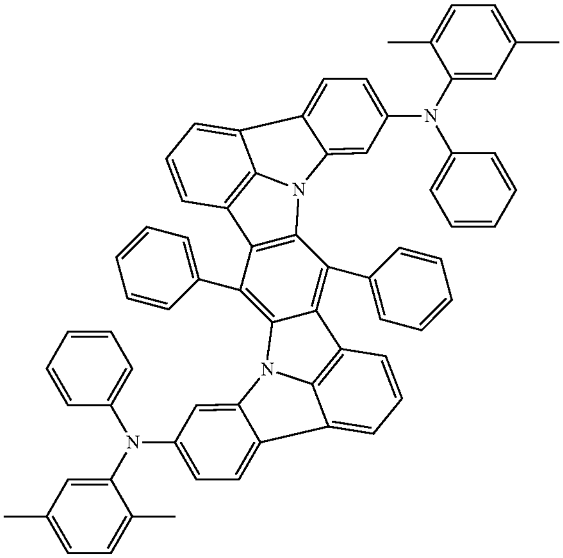
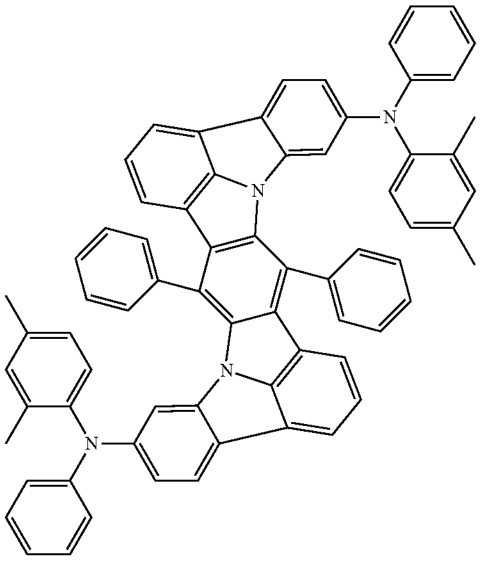
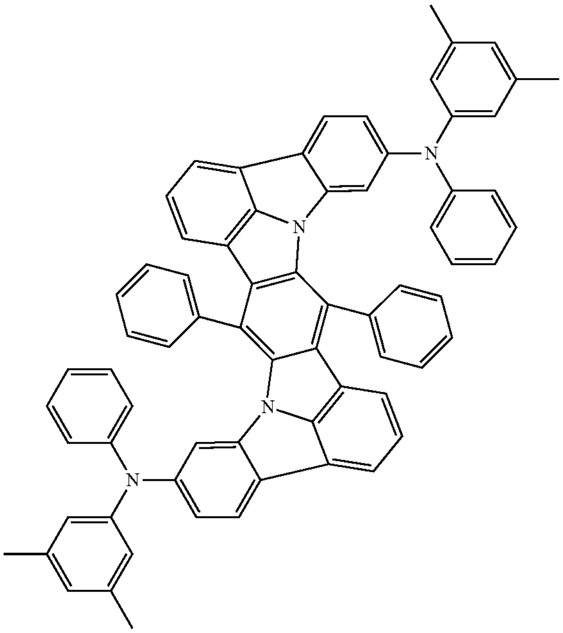

-continued
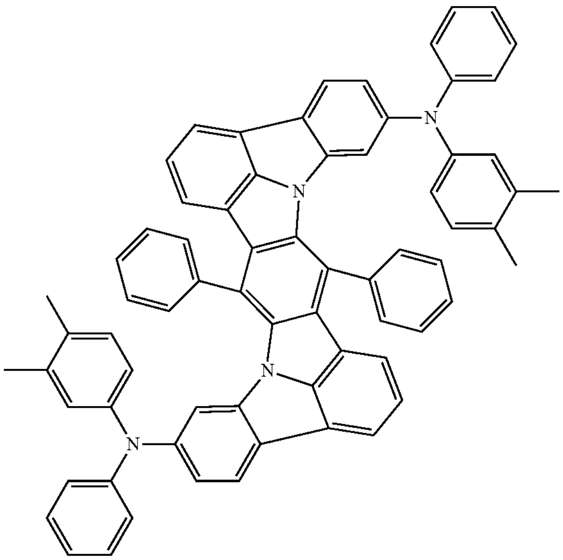
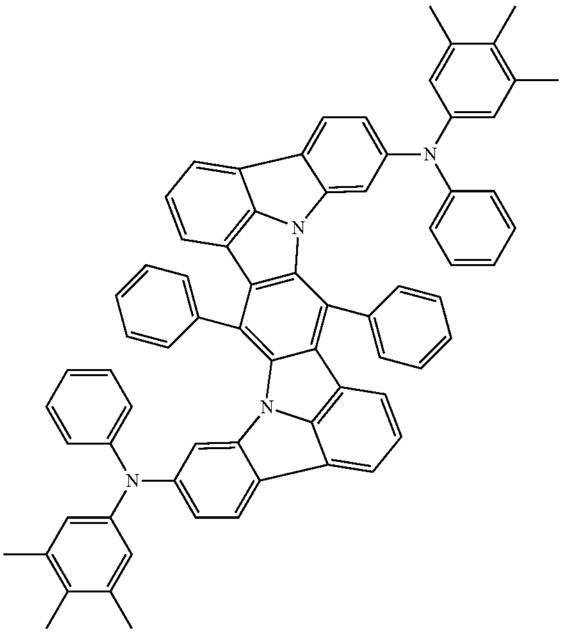
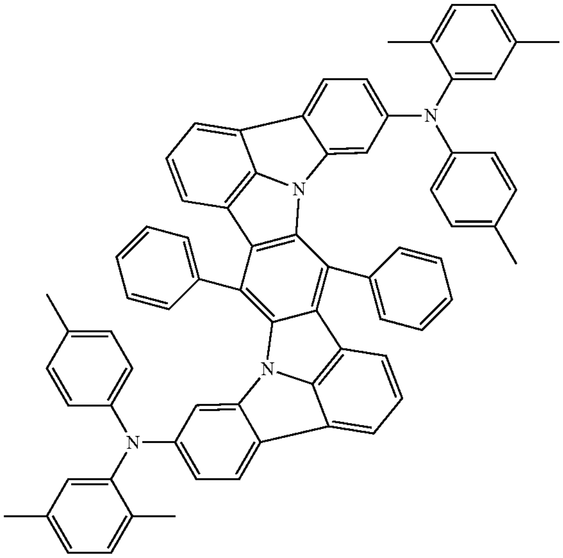
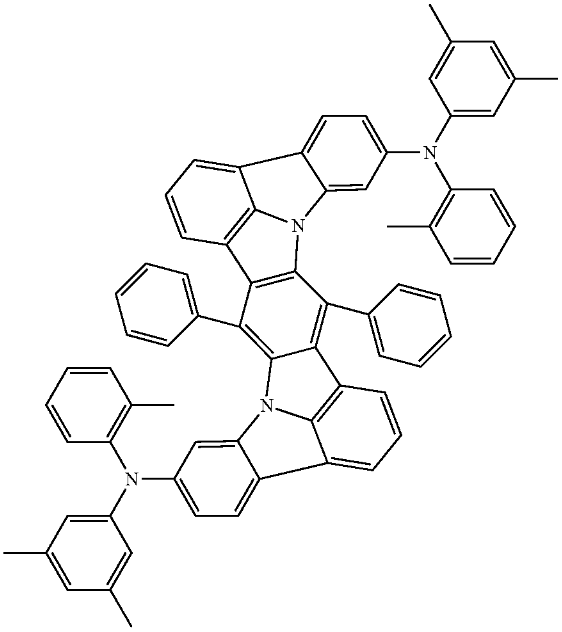

-continued
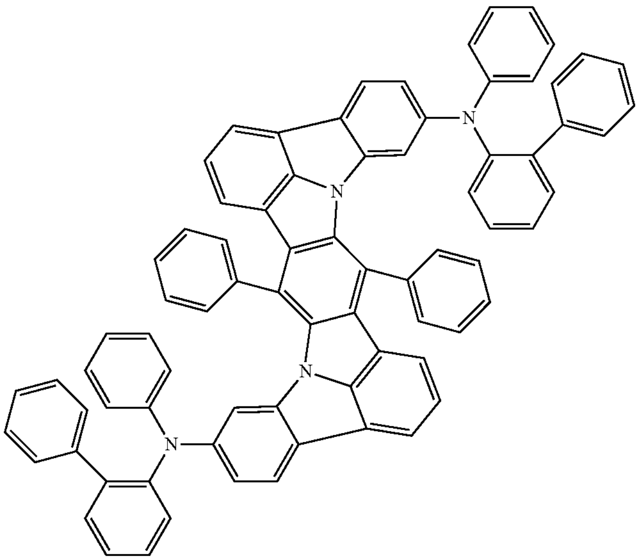
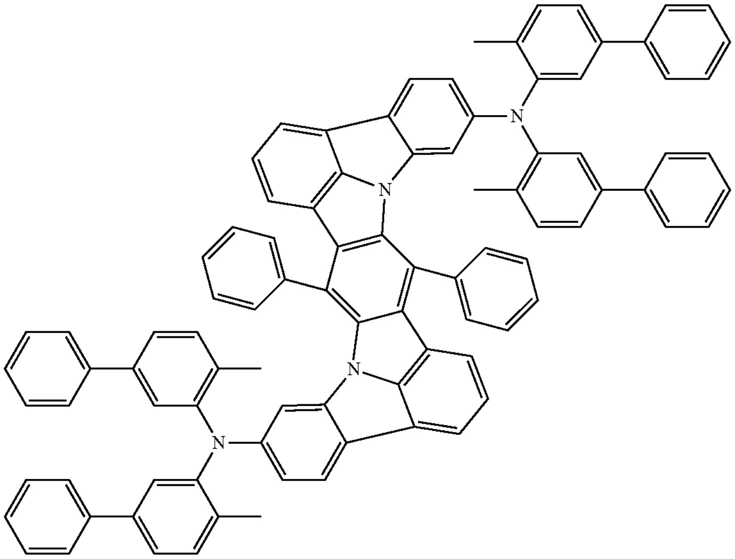
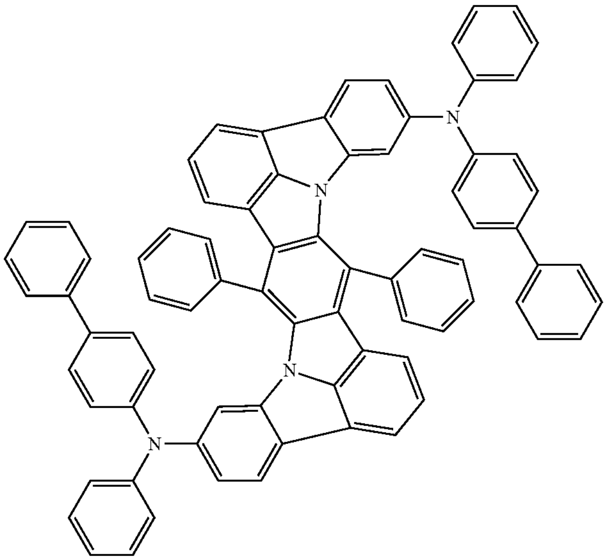

-continued
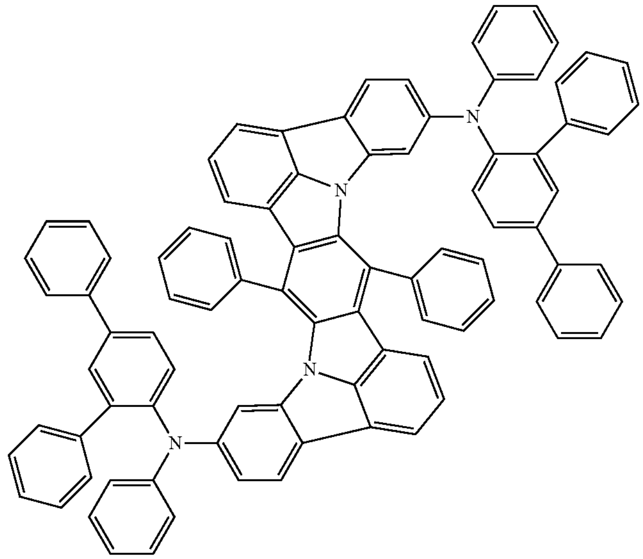
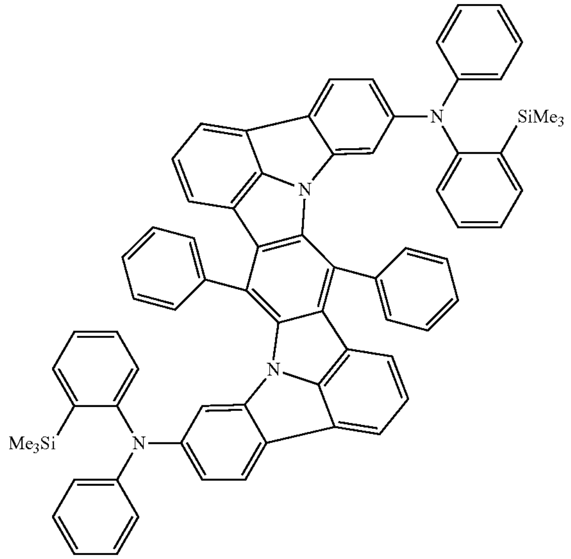
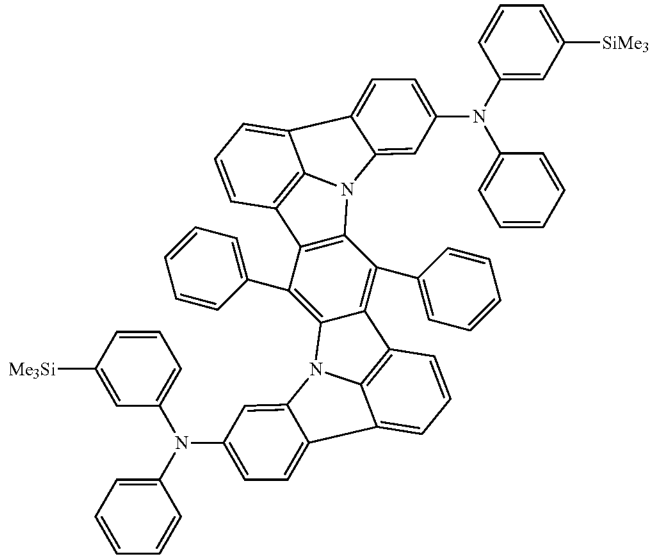

-continued
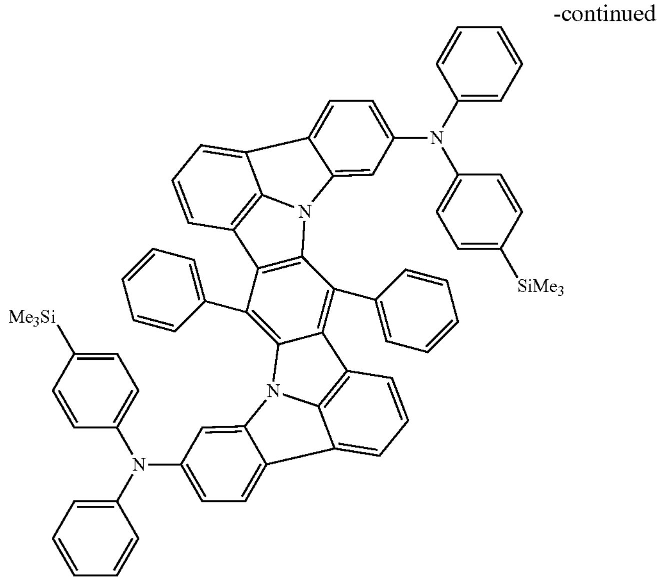
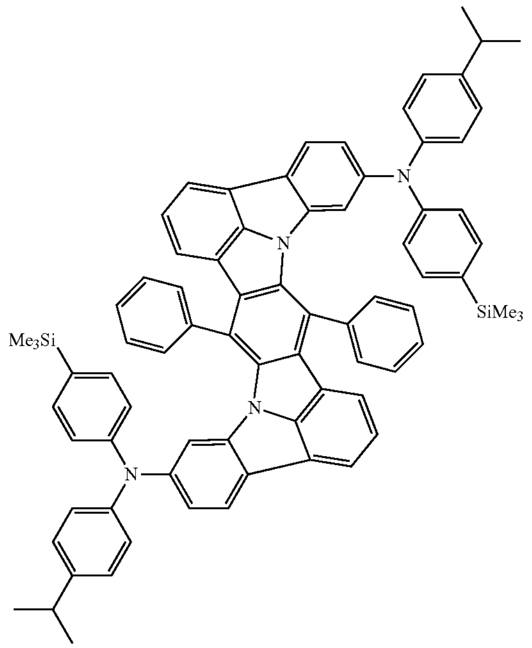
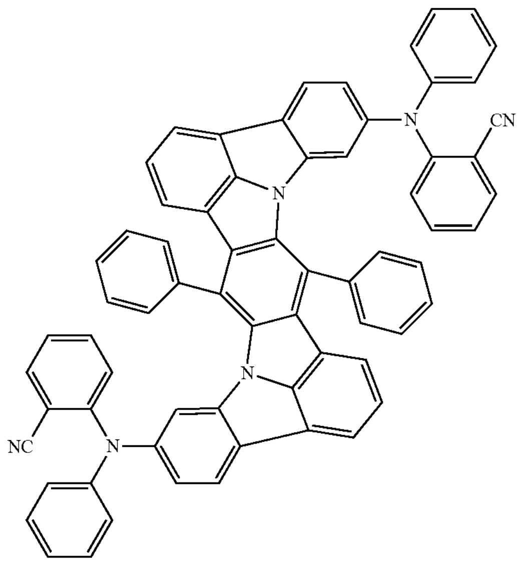

-continued
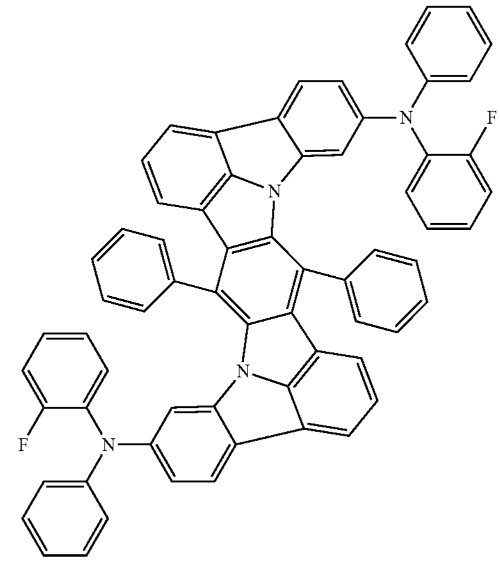
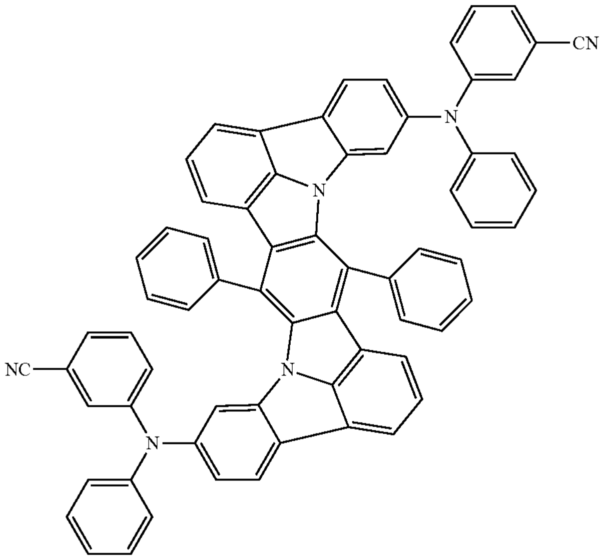
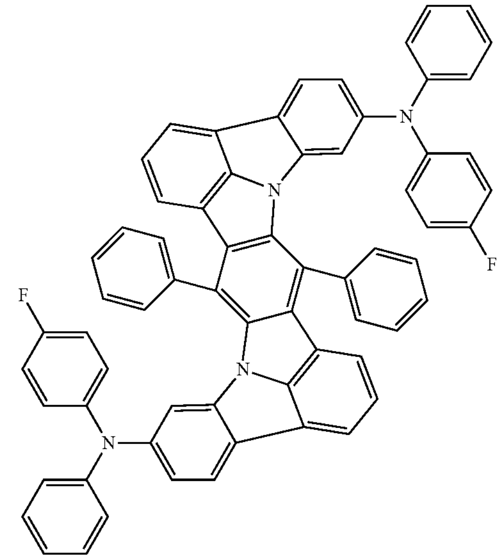
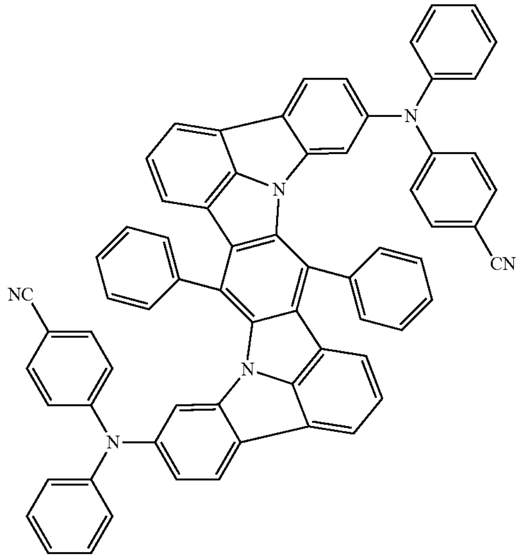
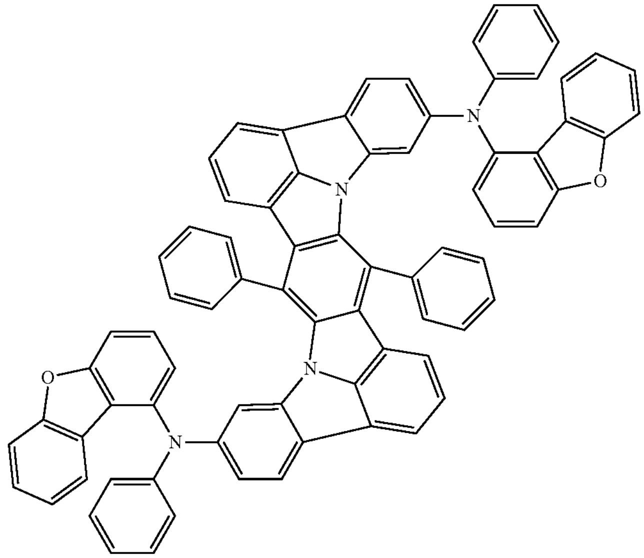

-continued
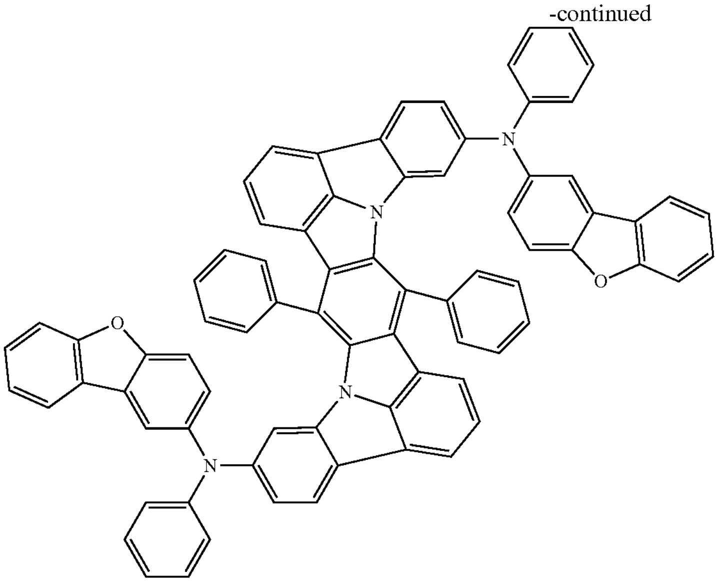
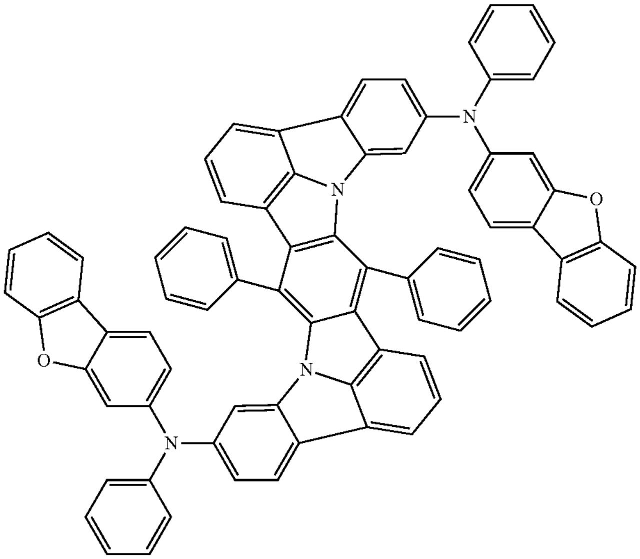
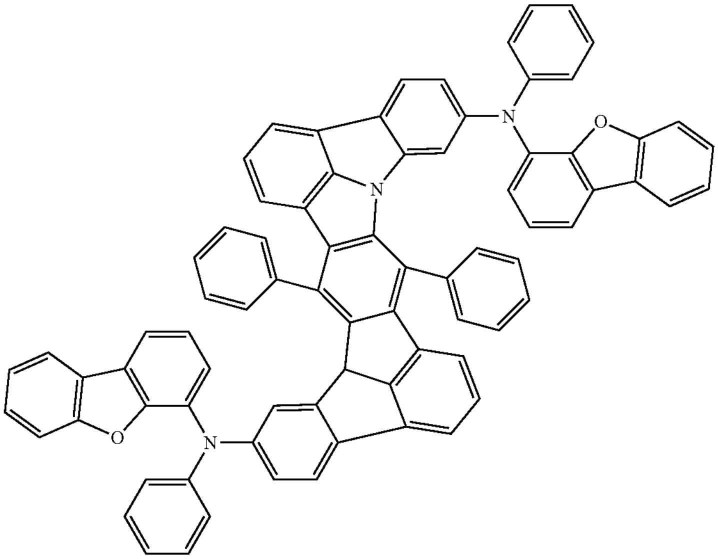

-continued
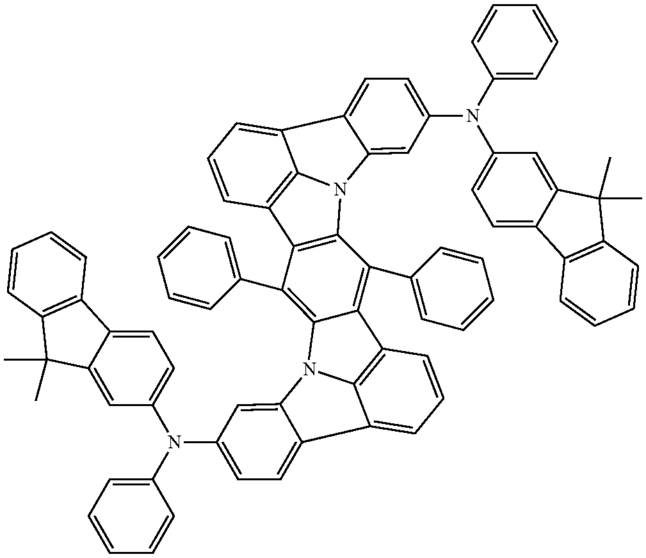
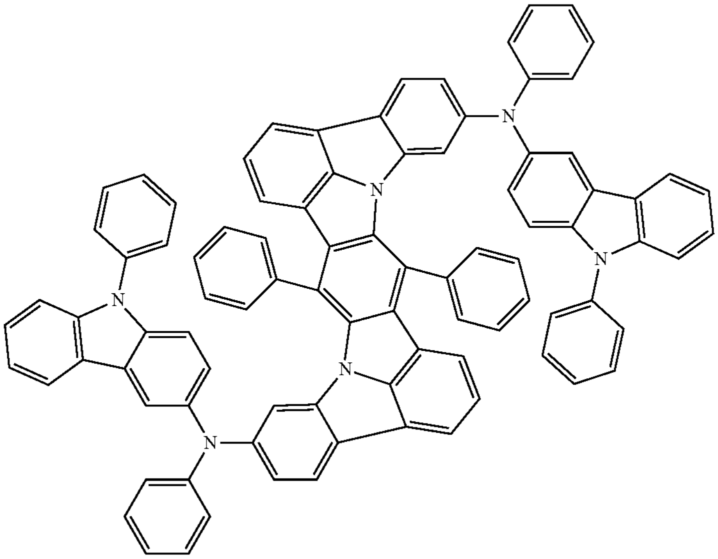
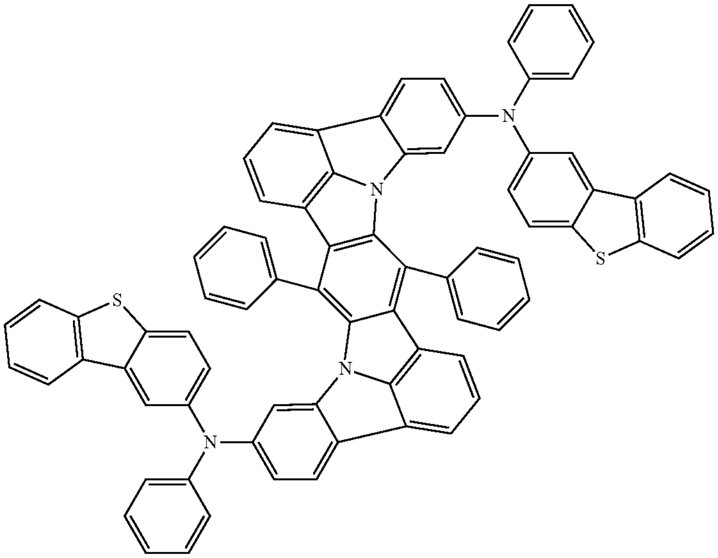

-continued
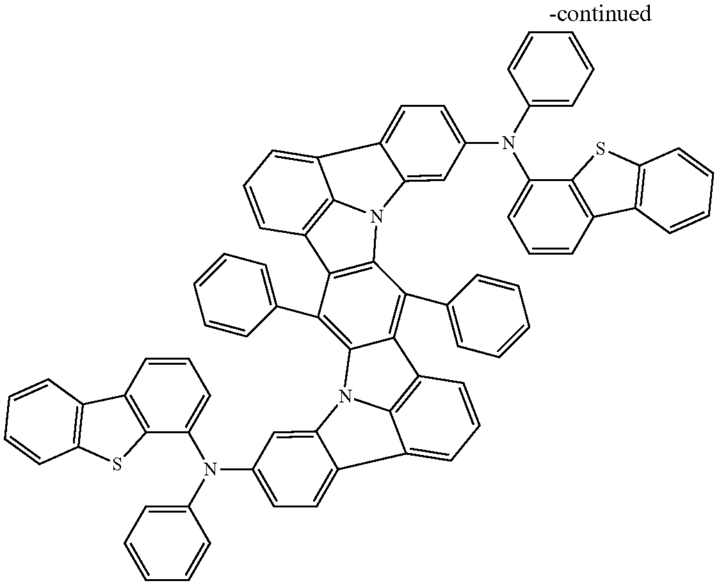
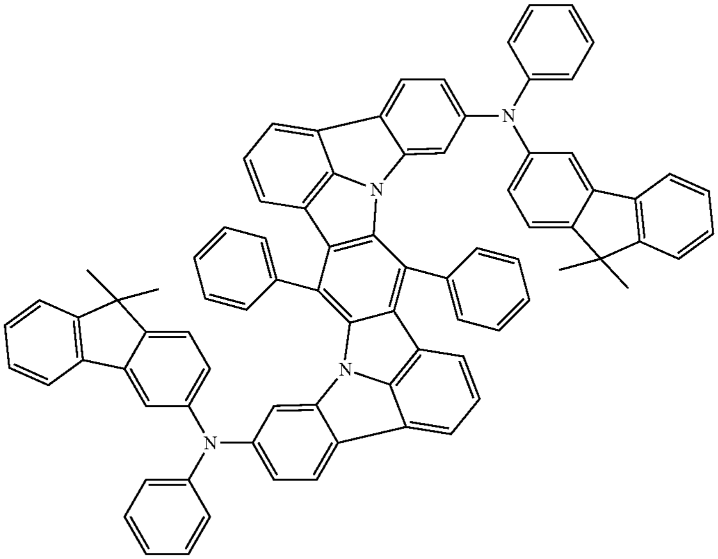
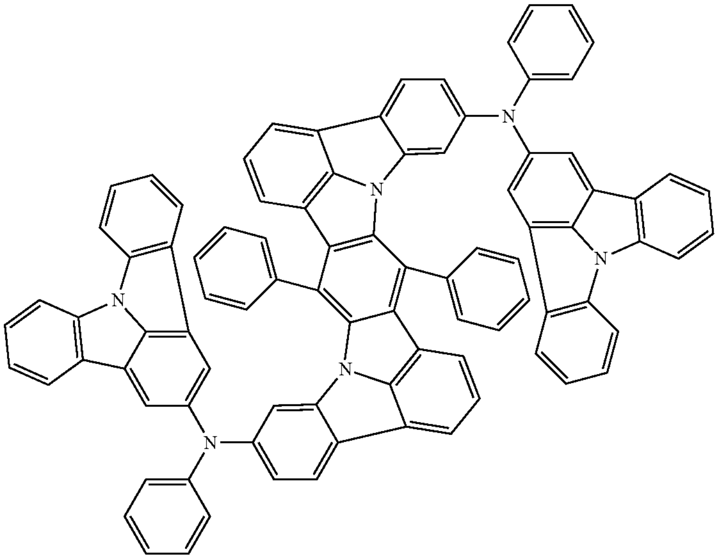

-continued
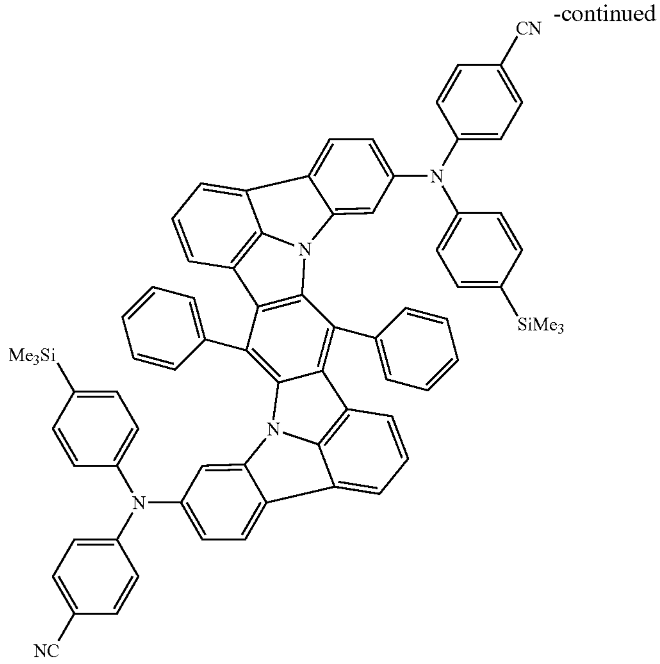
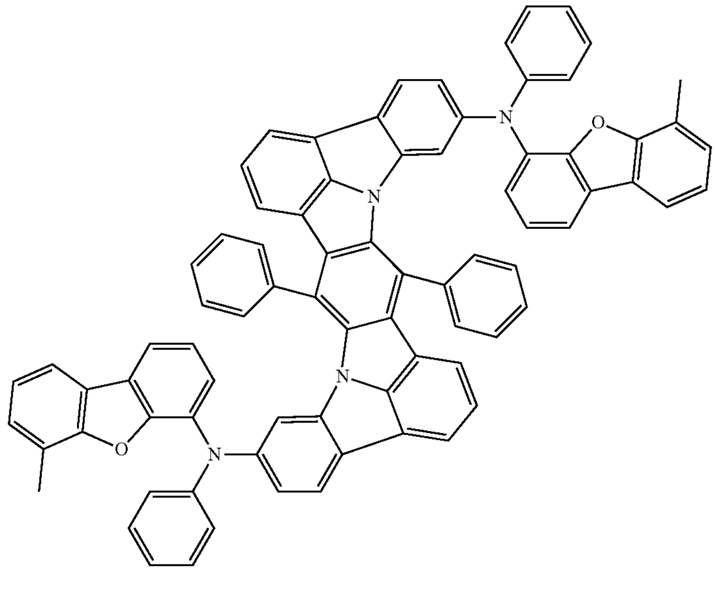

-continued
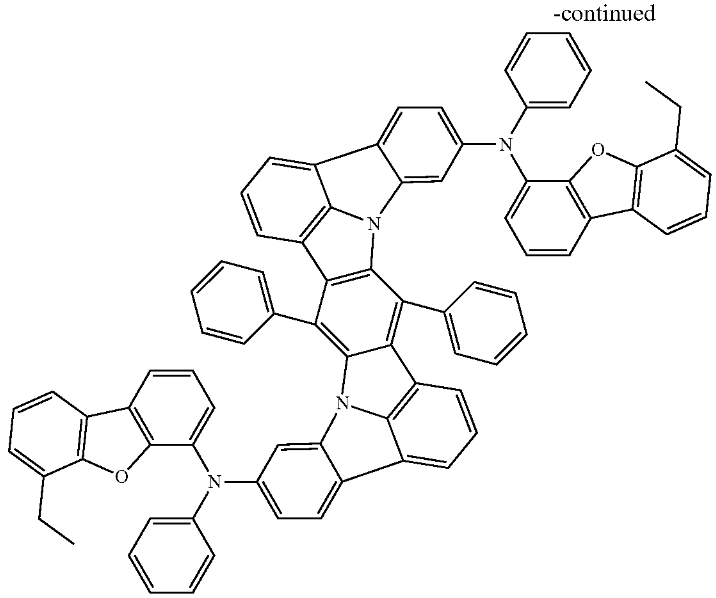
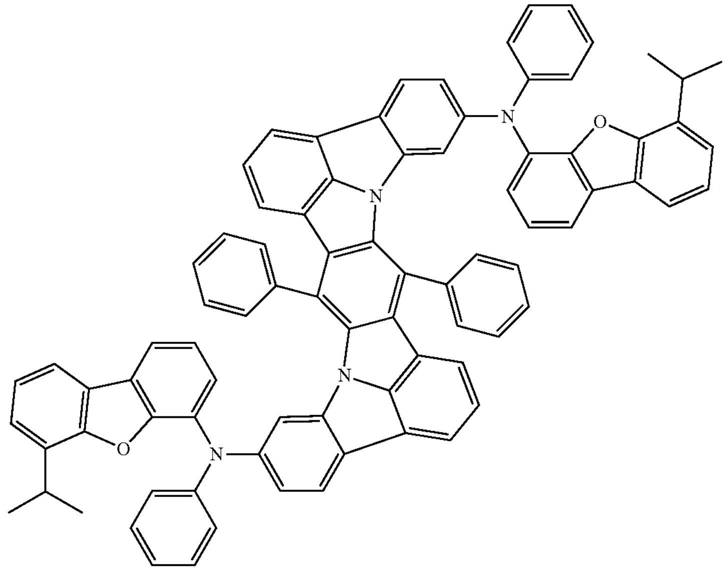
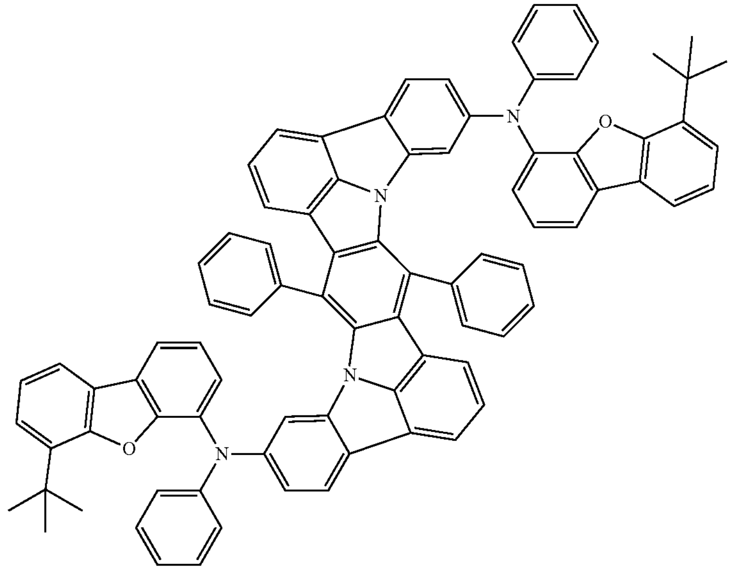

-continued
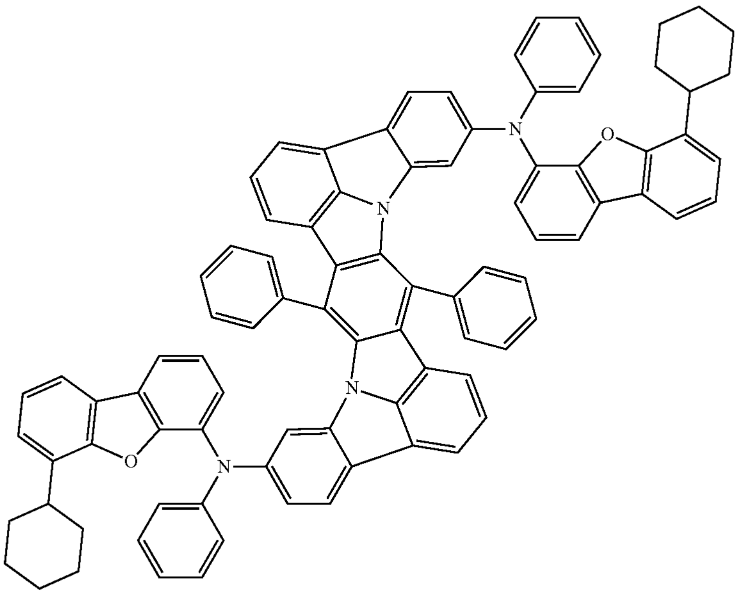
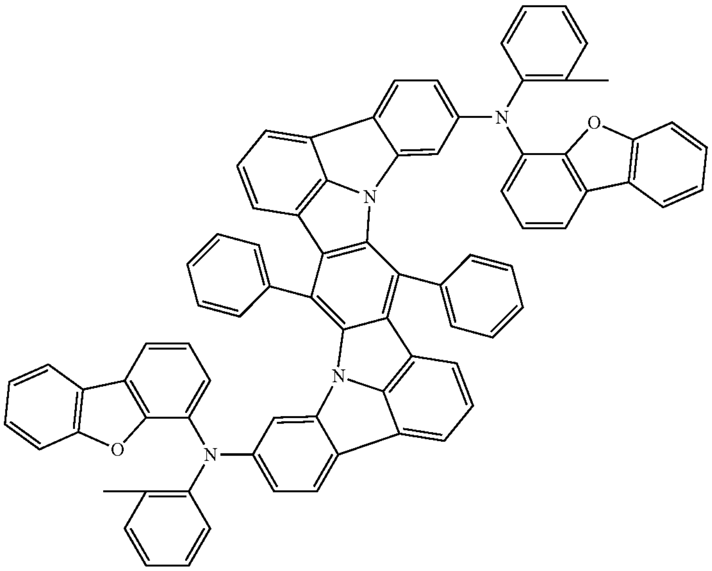

-continued
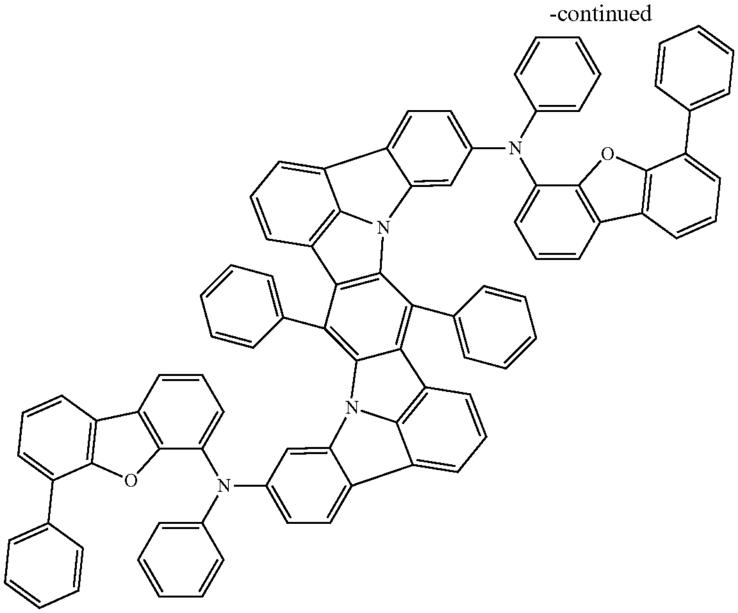
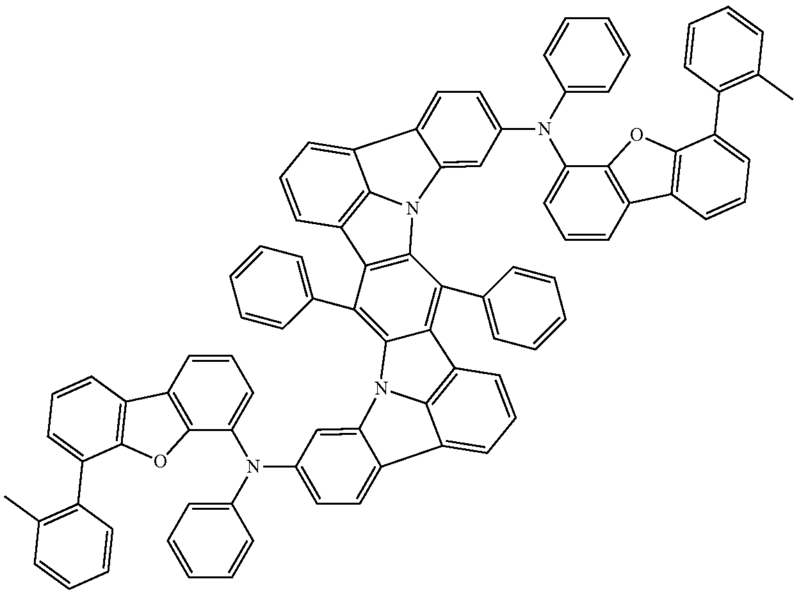

-continued
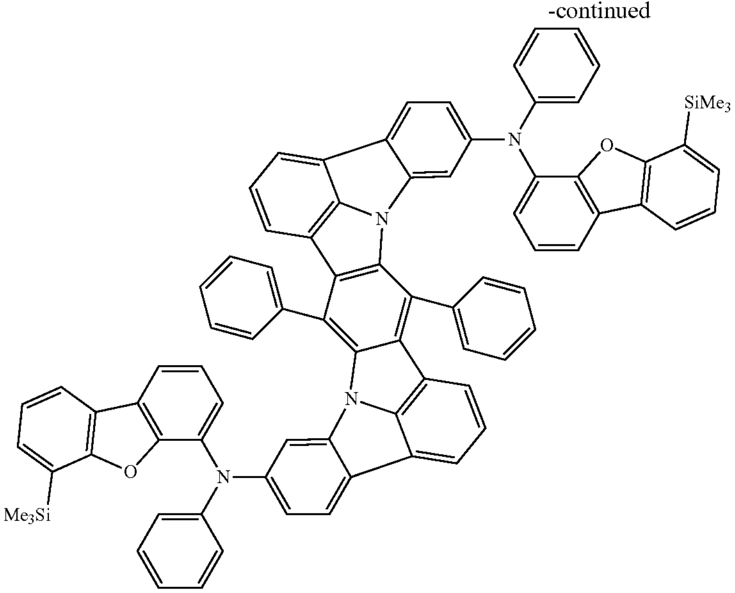
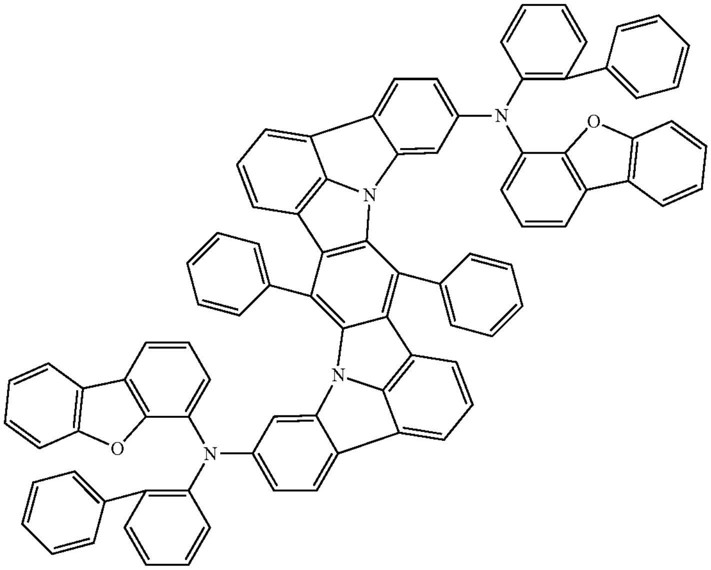

-continued
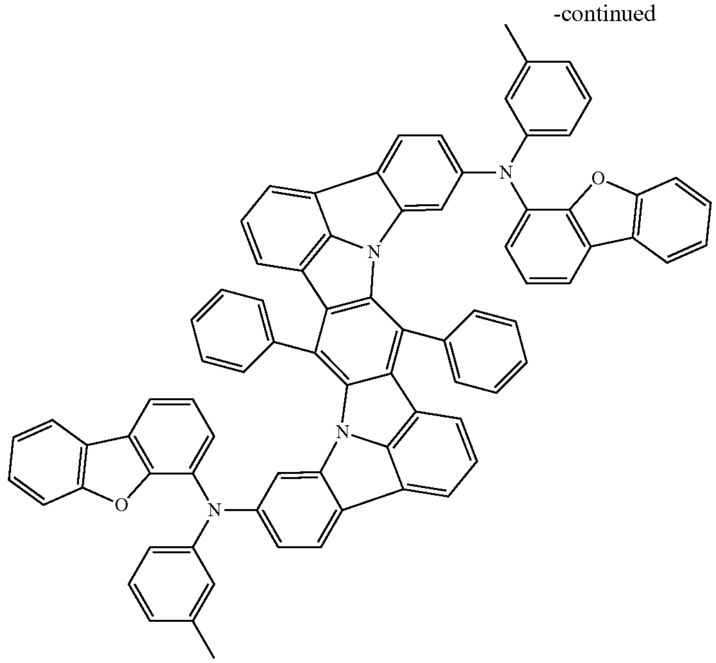
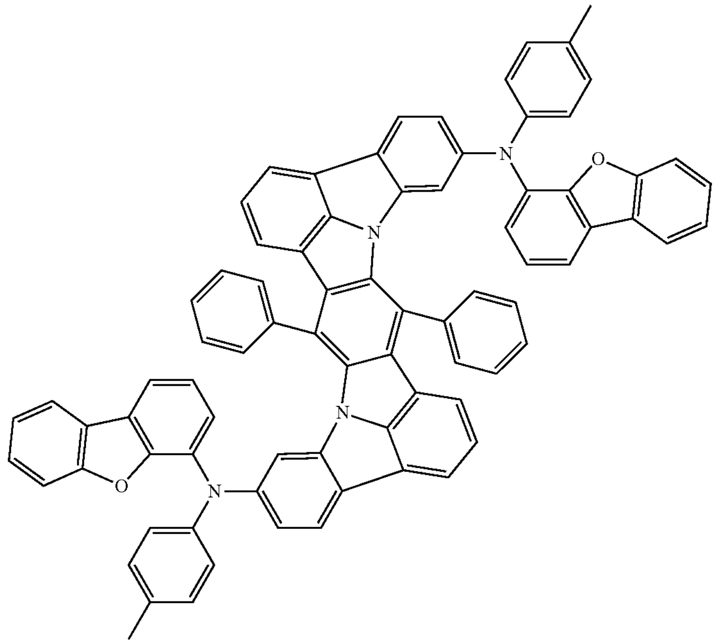

-continued
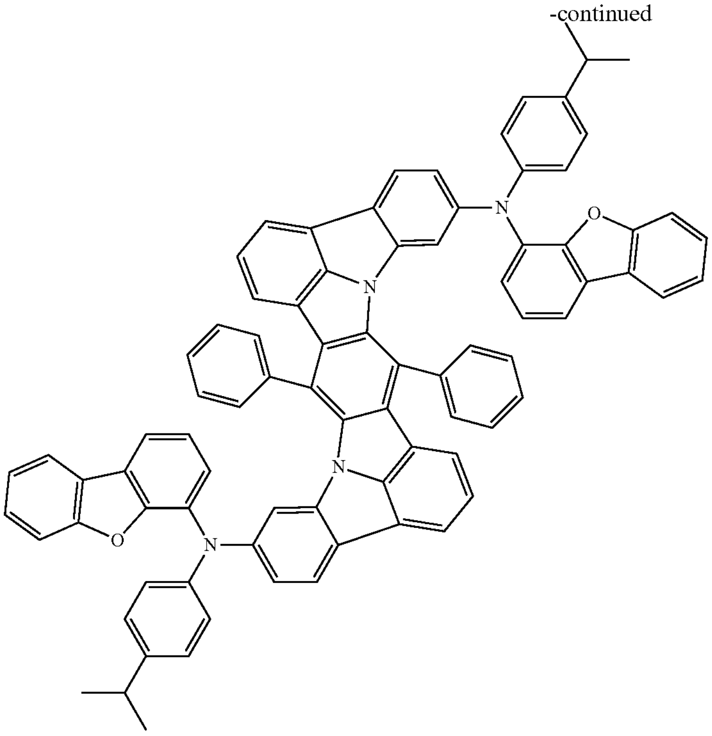
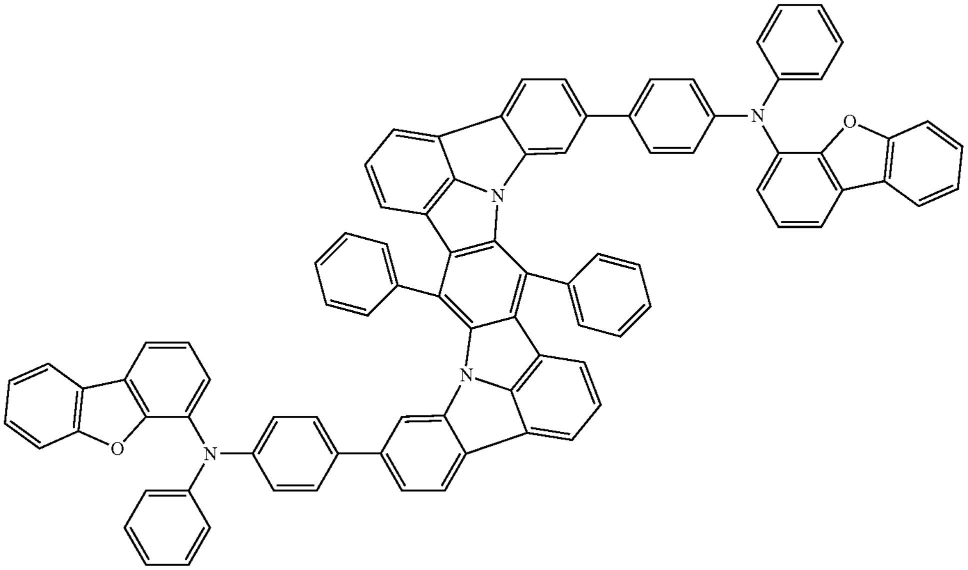

-continued
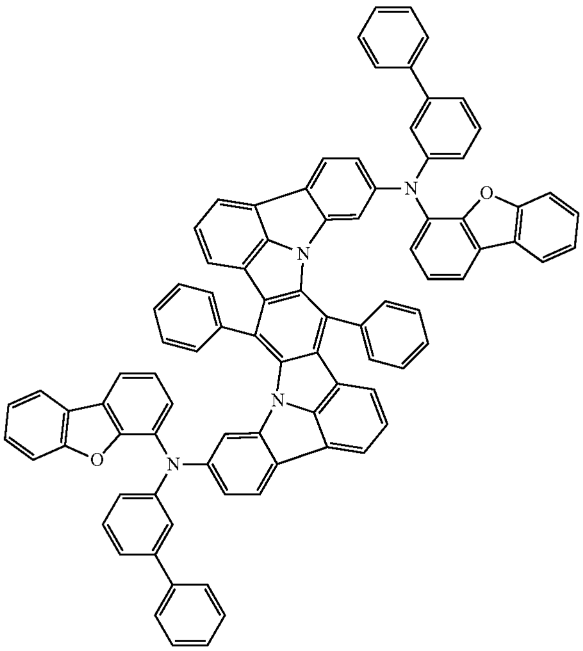 [SMILES: Cc1ccc(-c2ccccc2)cc1N(c1ccc2c3cccc4c5c(-c6ccccc6)c6c(c(-c7ccccc7)c5n(c2c1)c34)c1cccc2c3ccc(N(c4cc(-c5ccccc5)ccc4C)c4cccc5c4oc4ccccc45)cc3n6c21)c1cccc2c1oc1ccccc12]
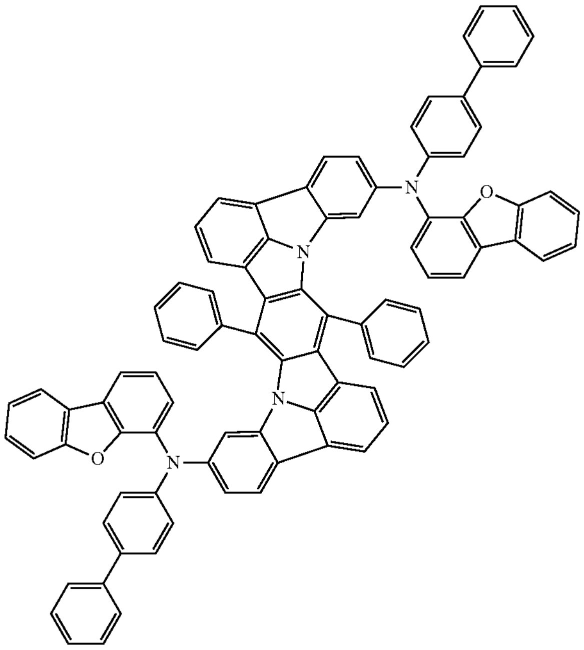
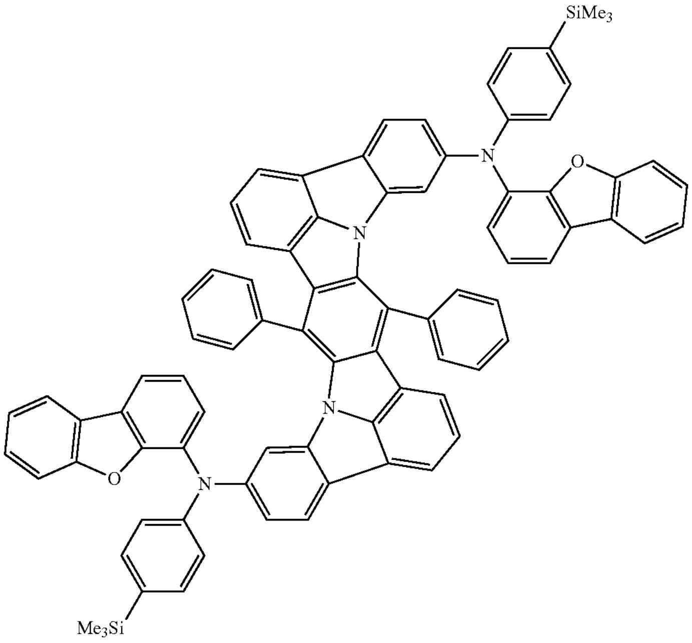

-continued
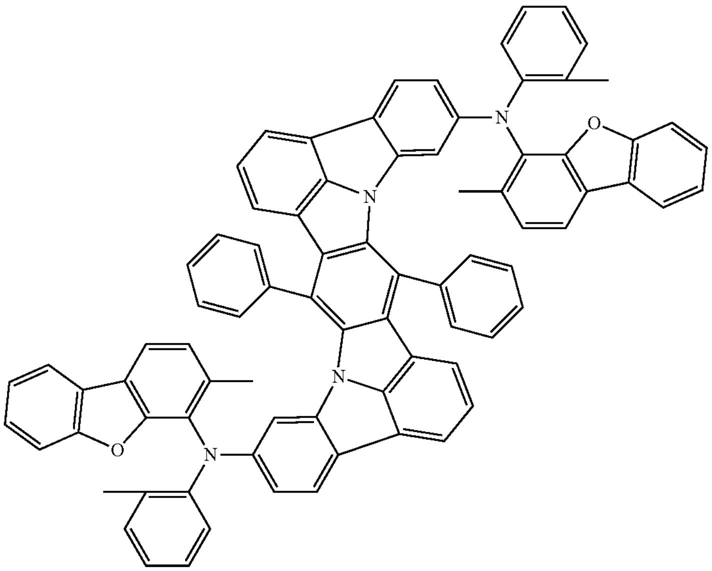
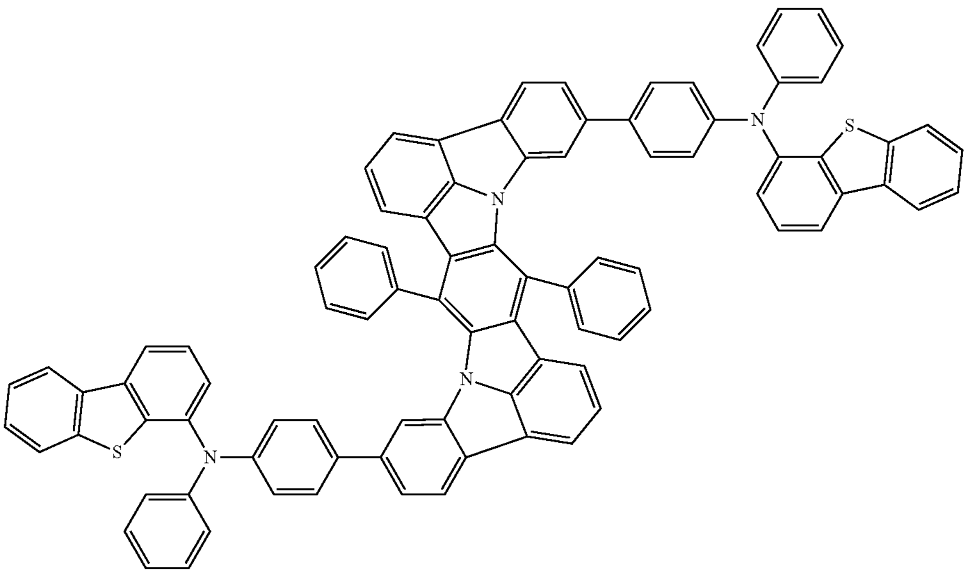

-continued
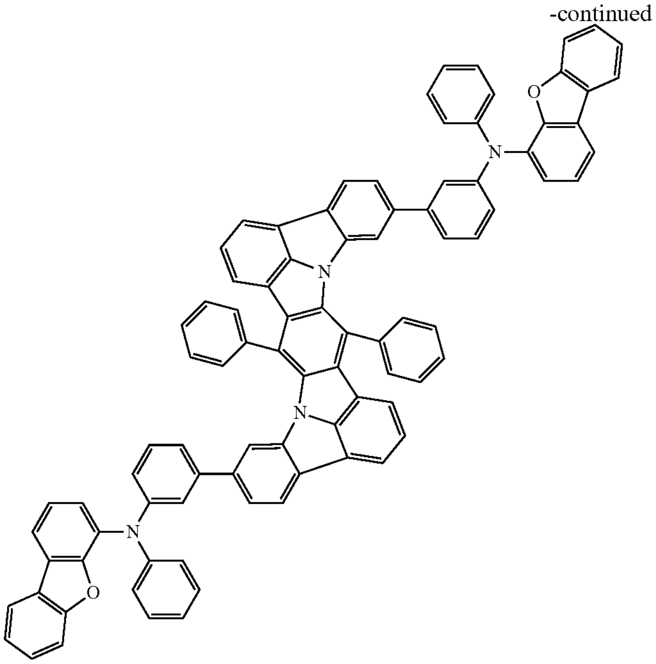
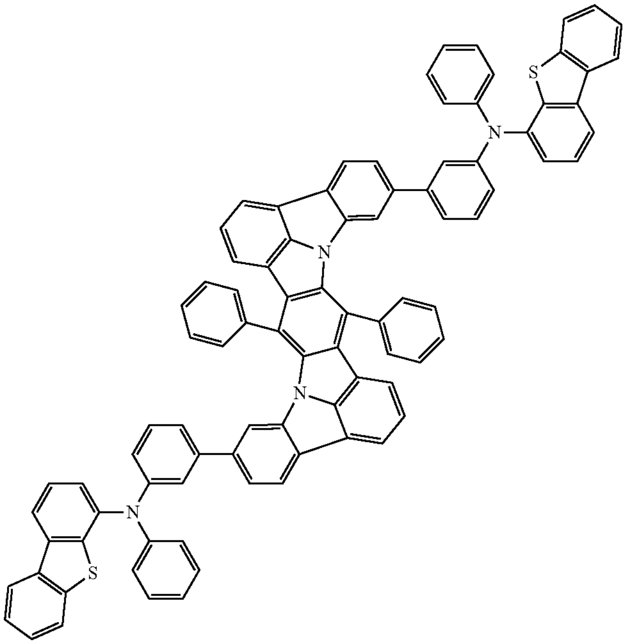

-continued
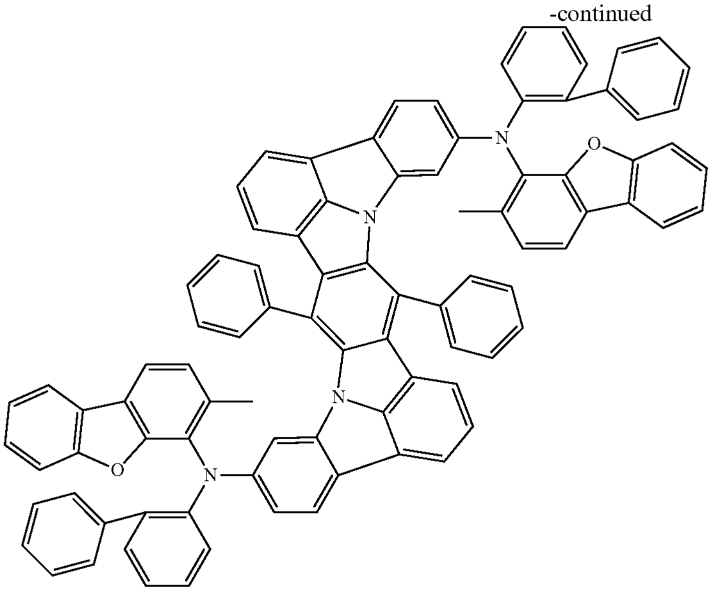
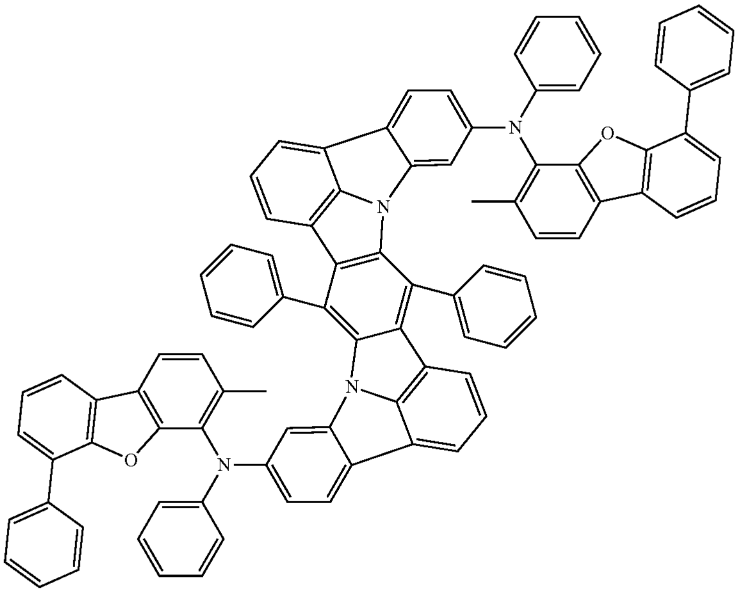

-continued
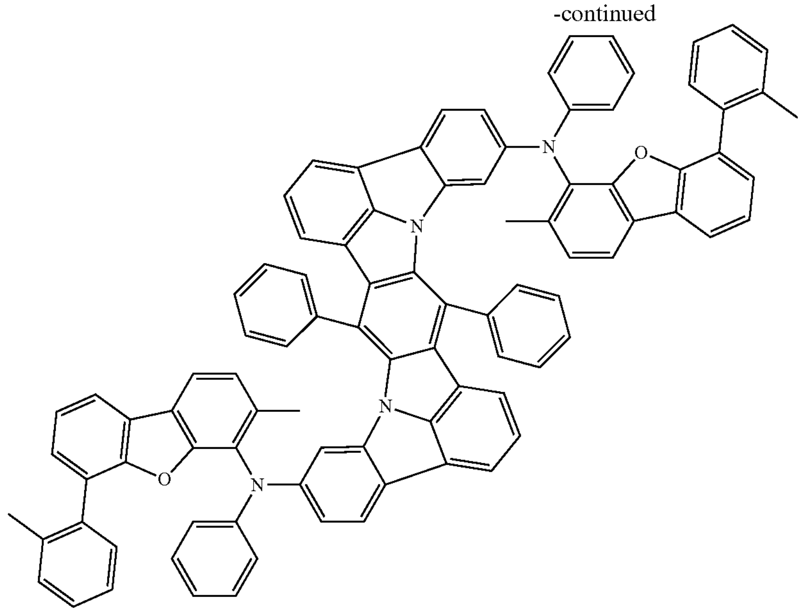
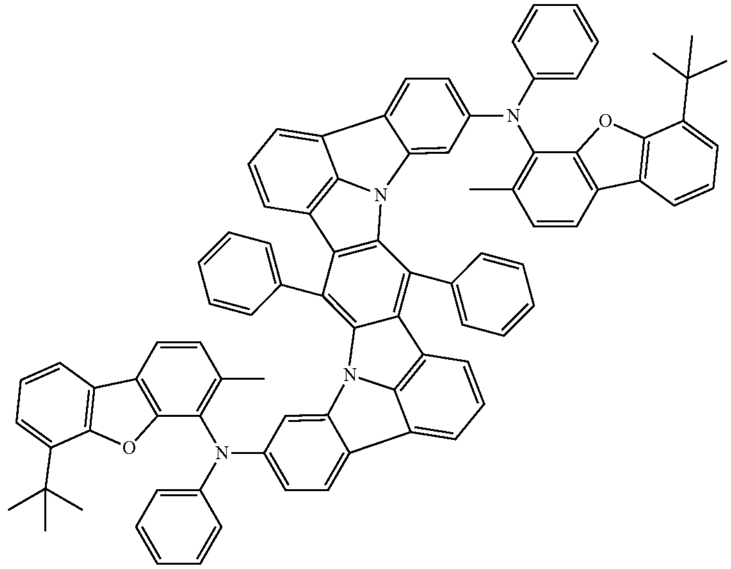
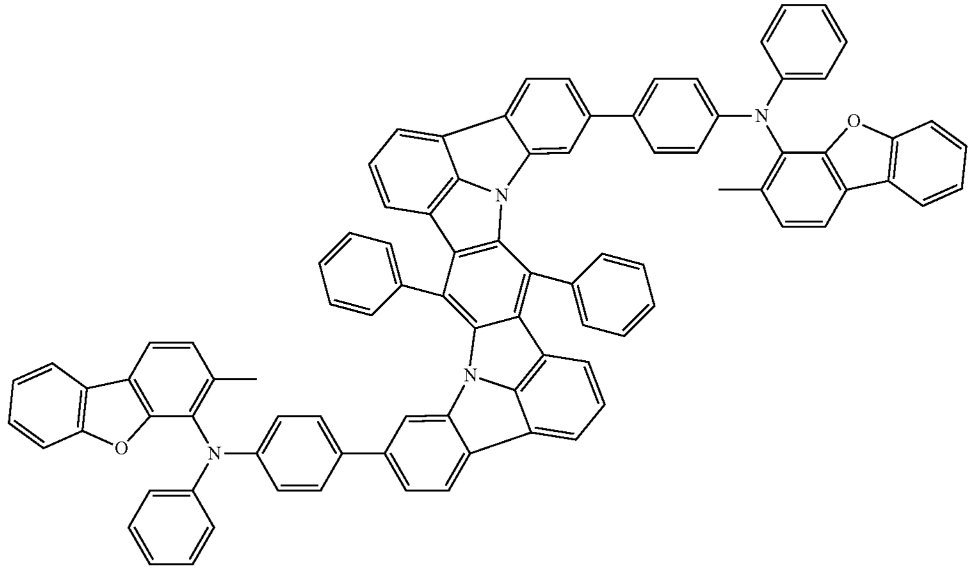

-continued
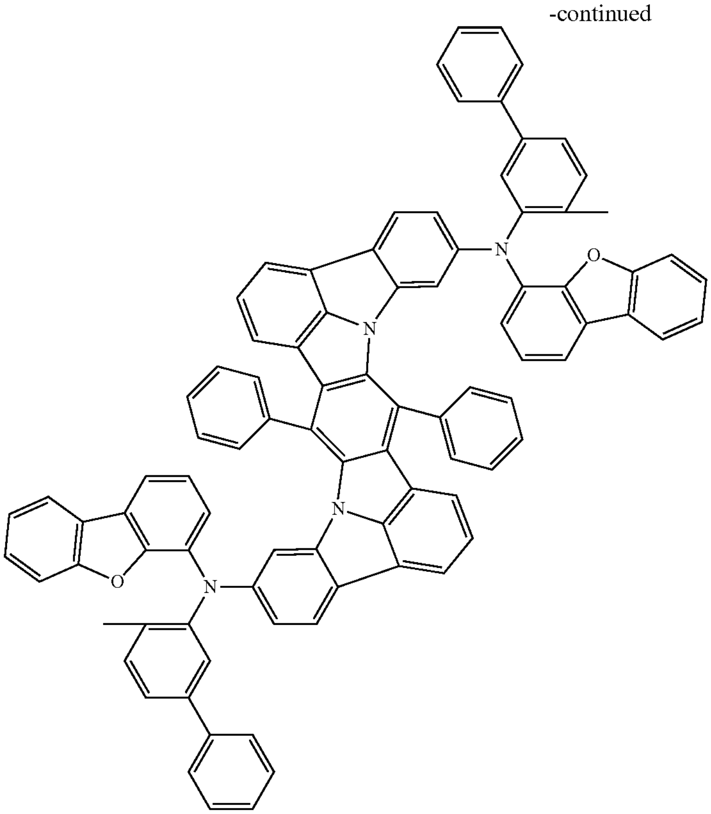
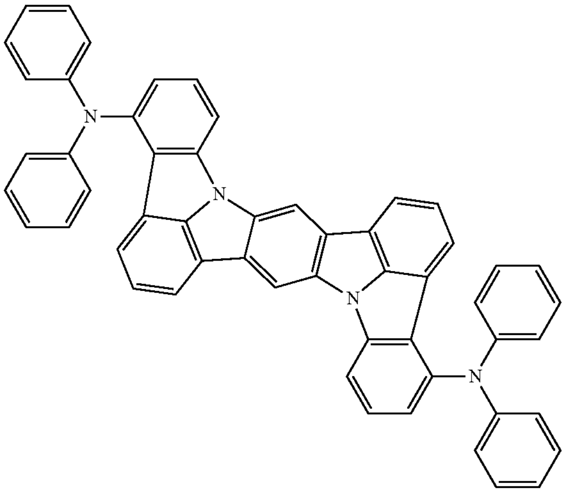
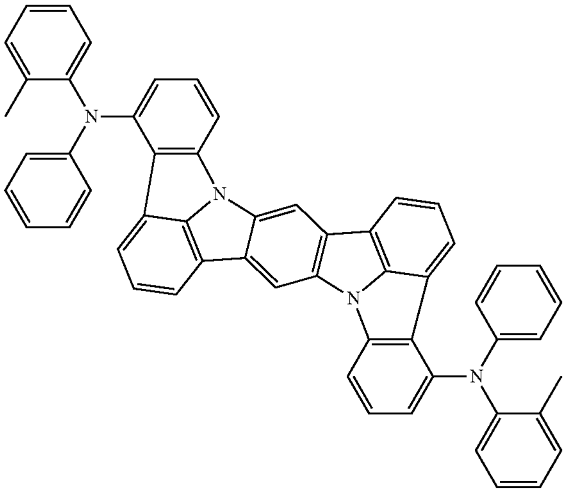

-continued
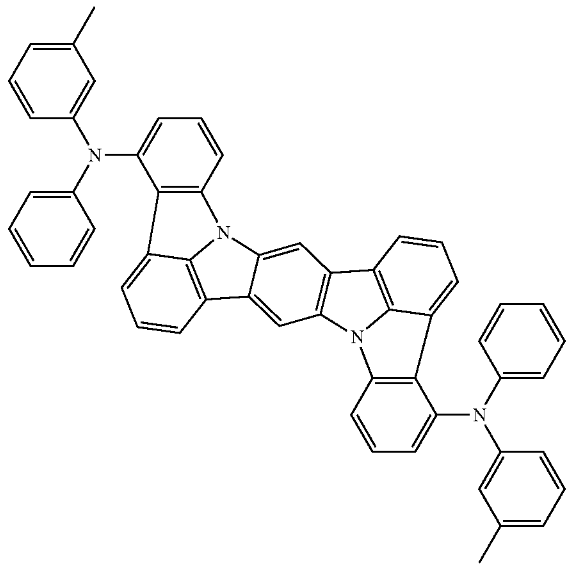
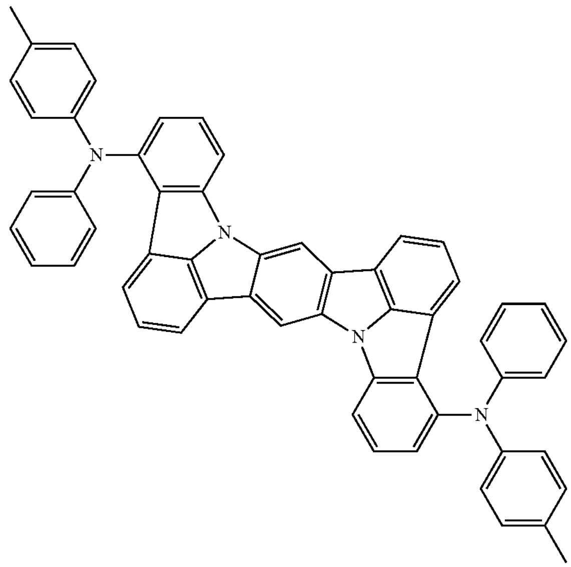
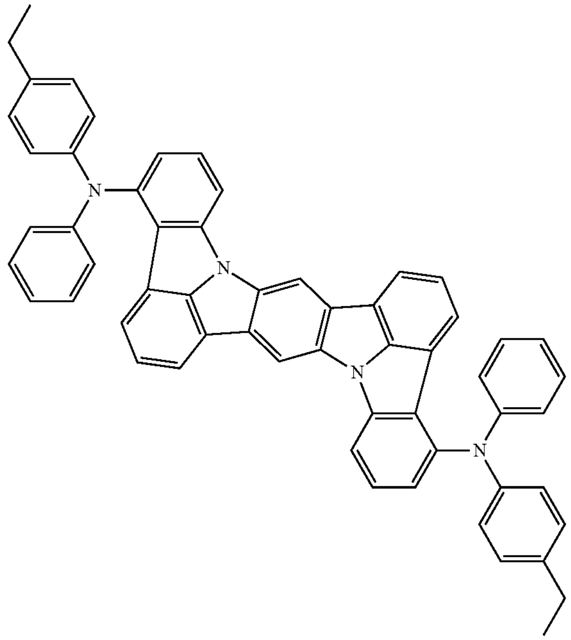

-continued
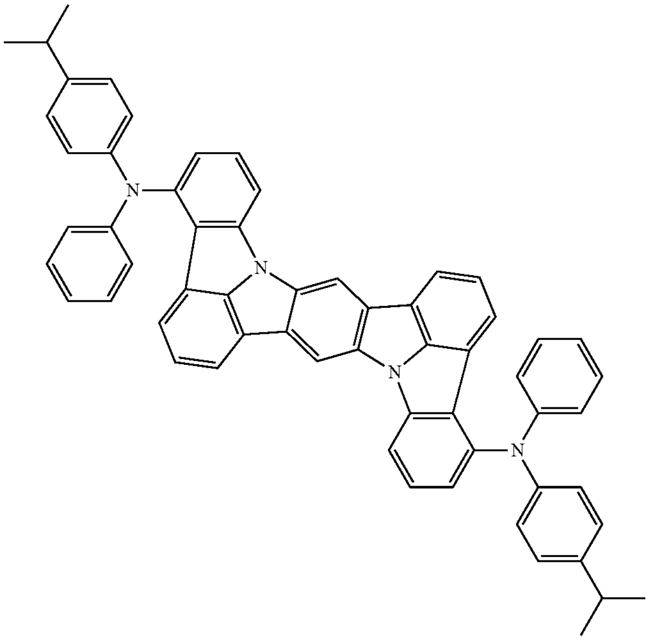
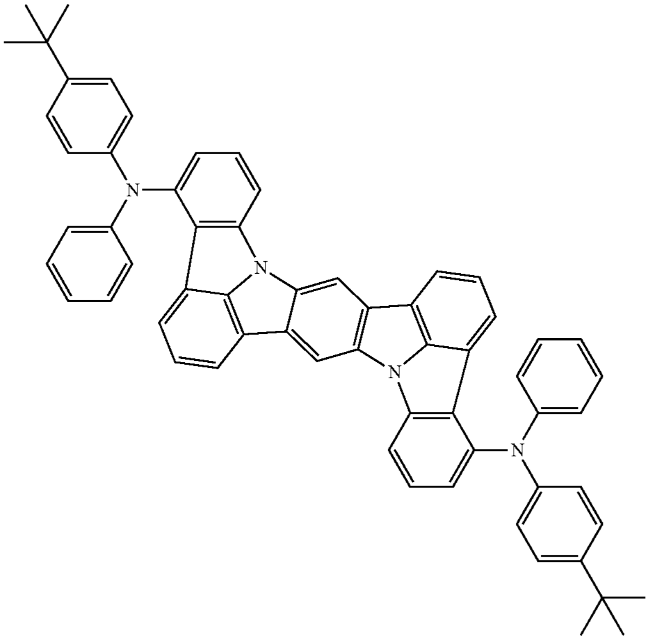

-continued
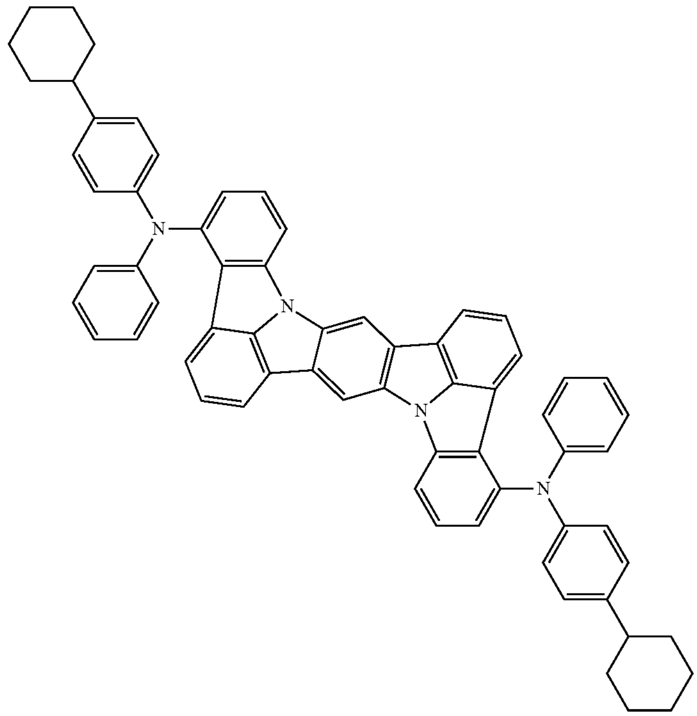
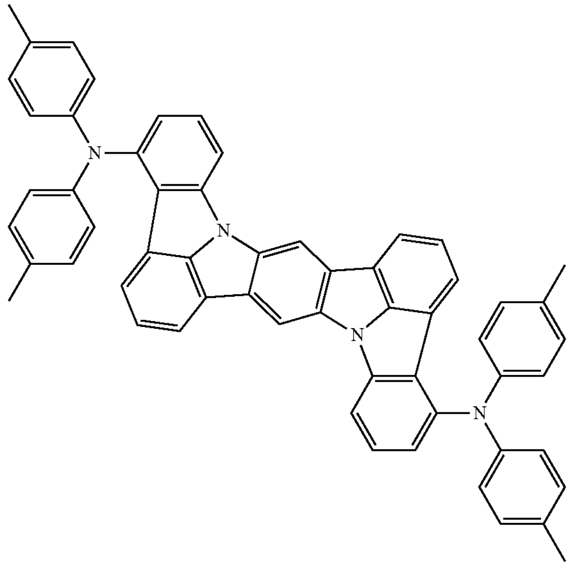

-continued
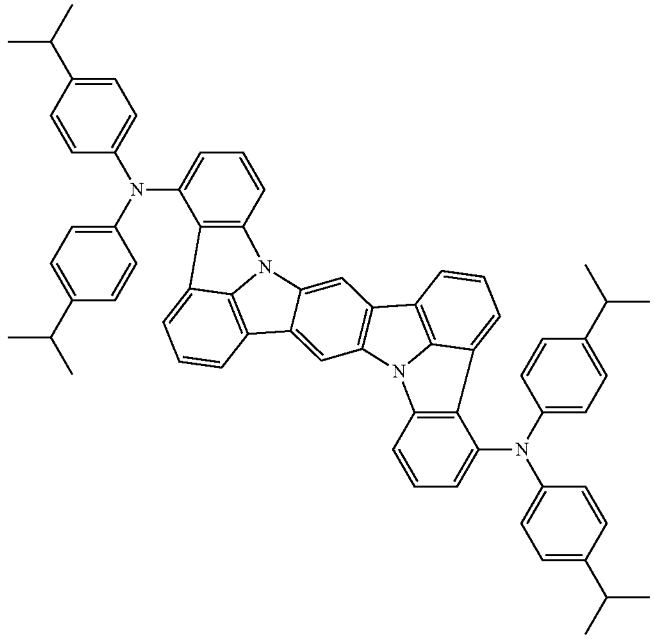
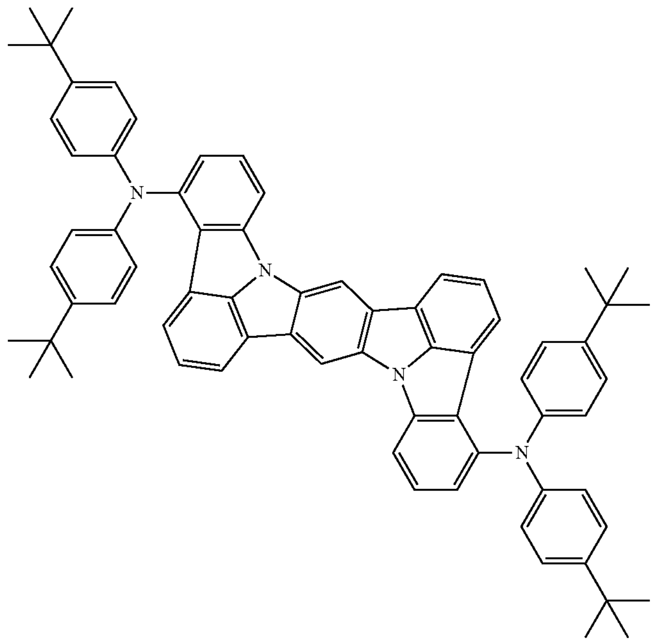

-continued
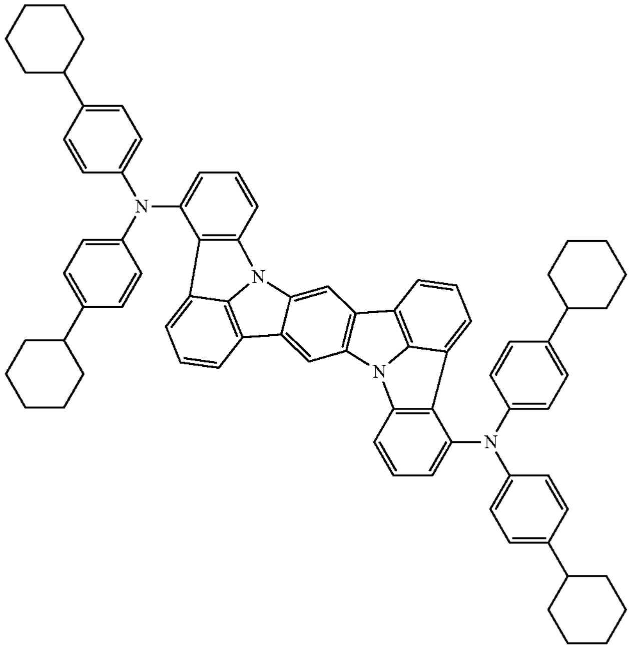
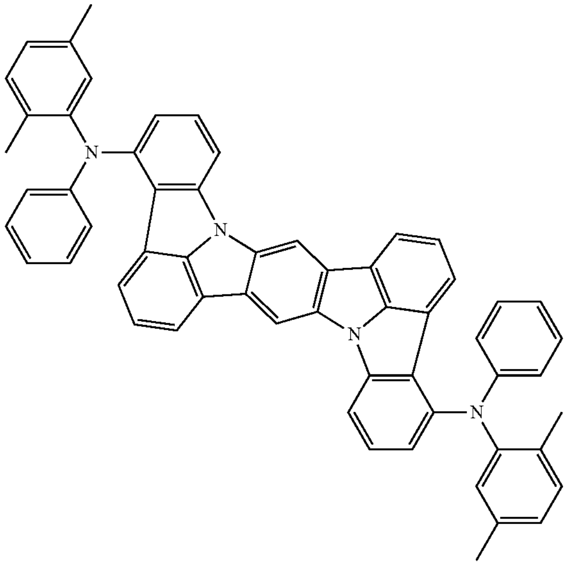
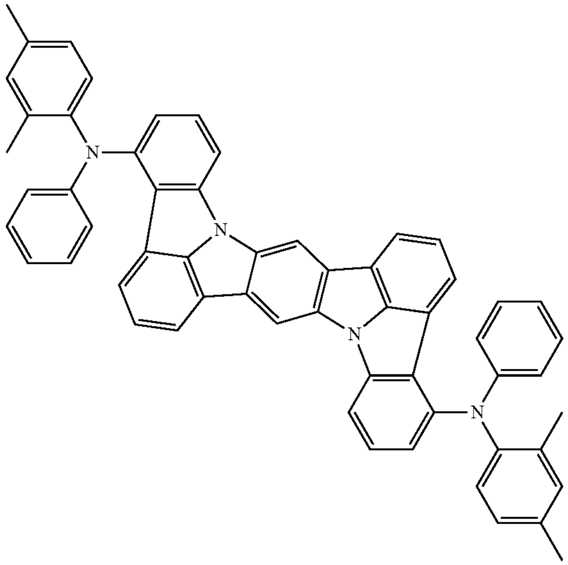

-continued
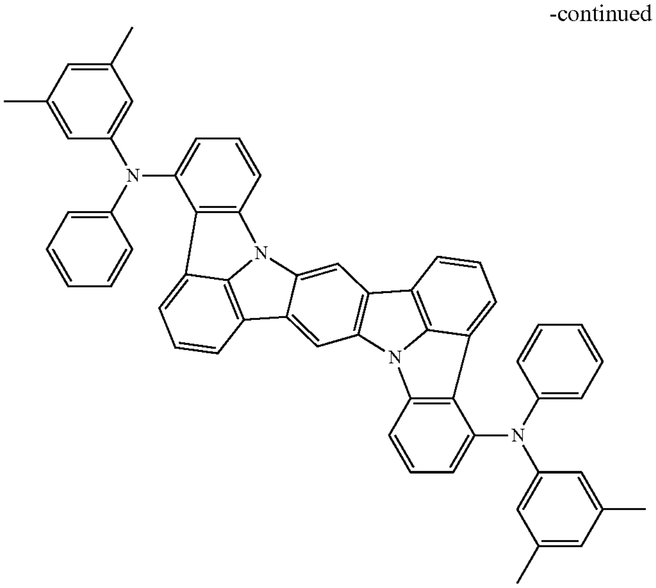
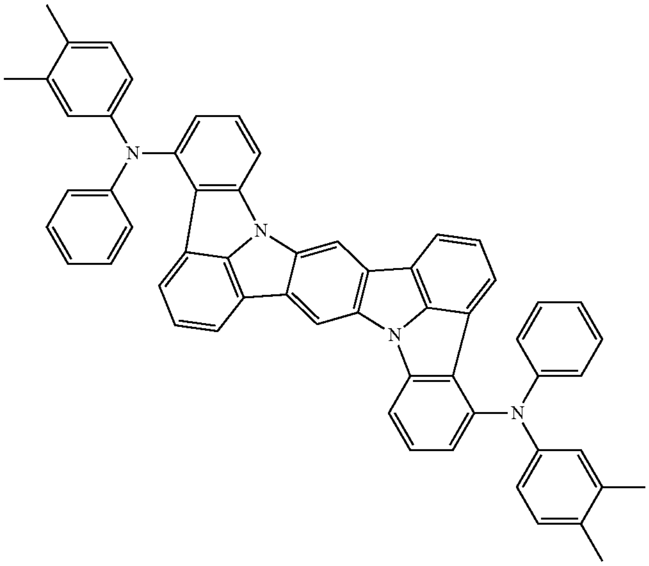
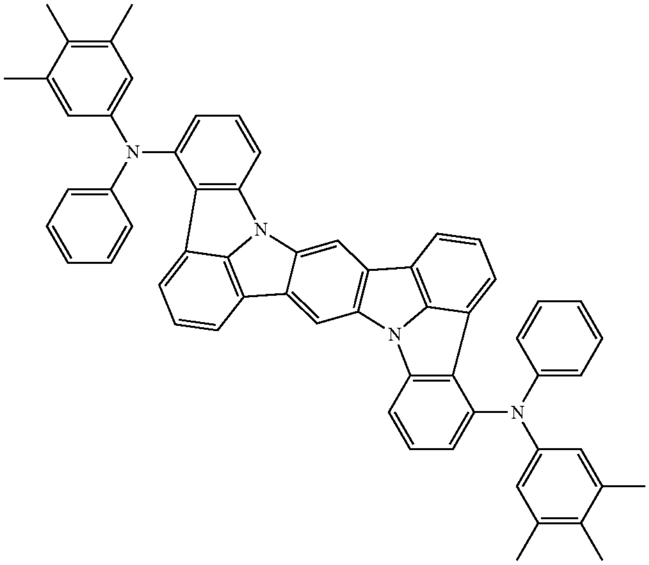

-continued
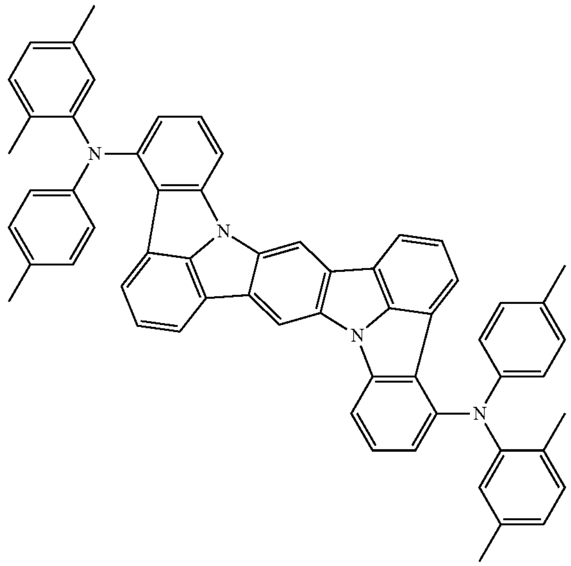
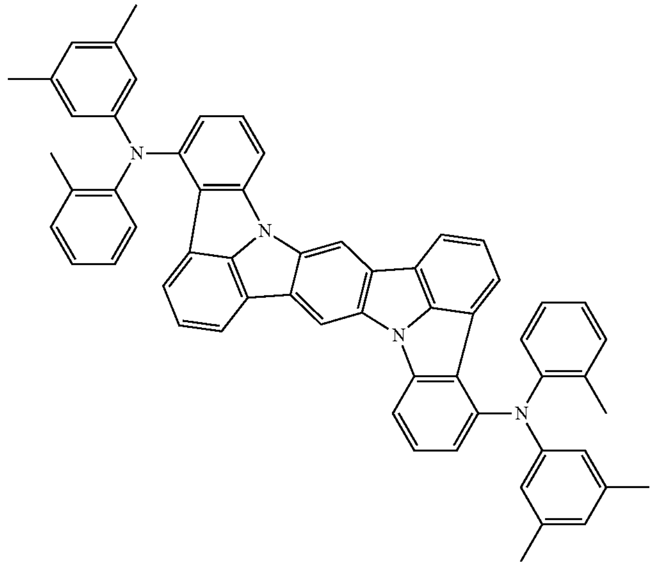
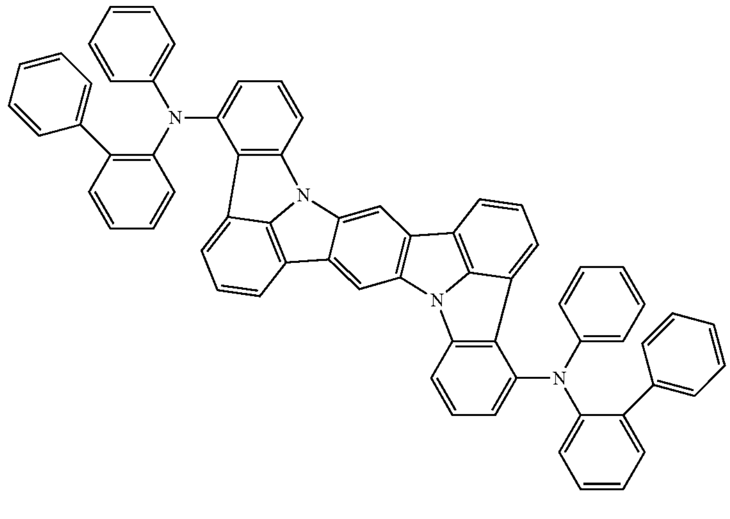

-continued
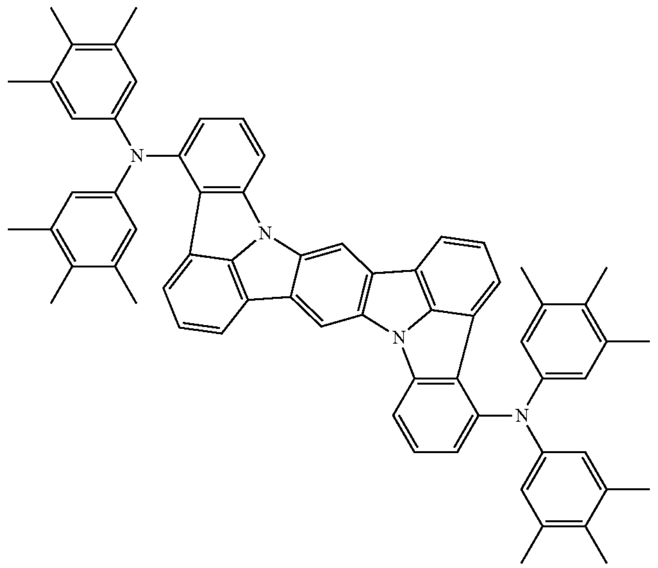
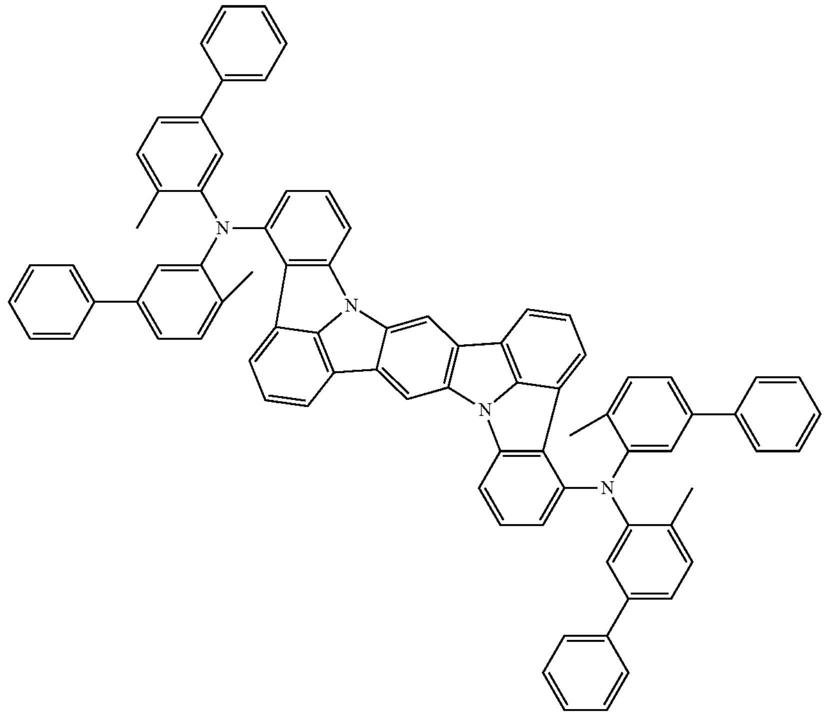

-continued
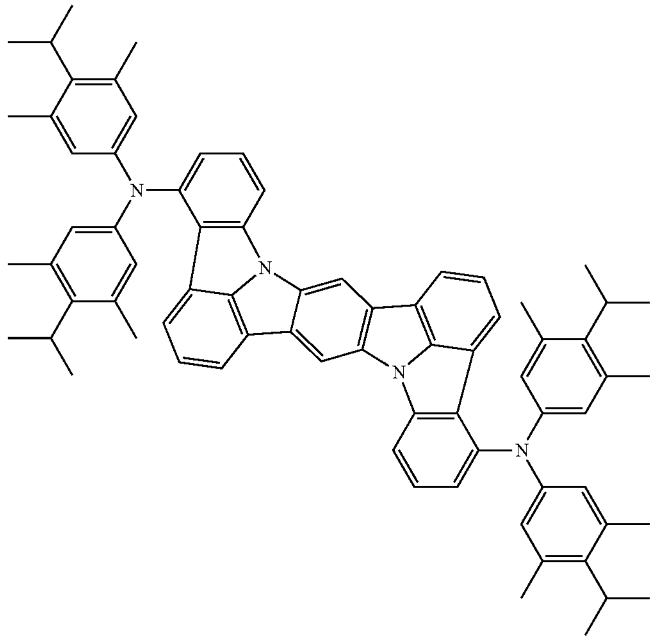
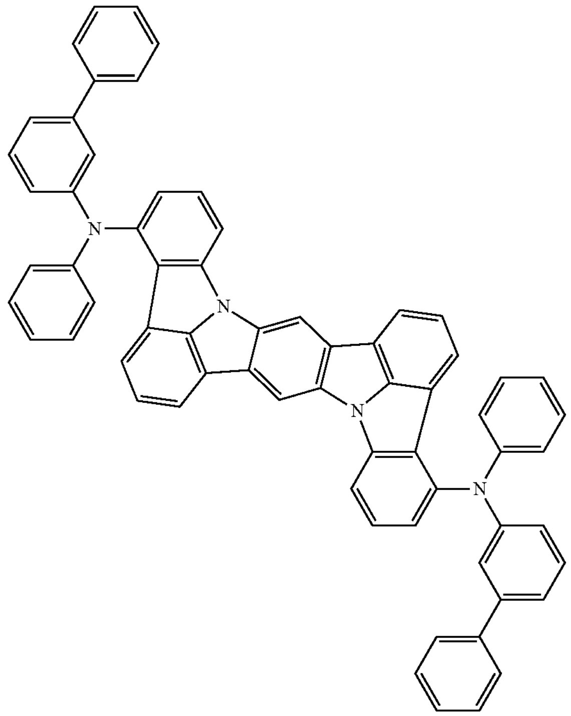

-continued
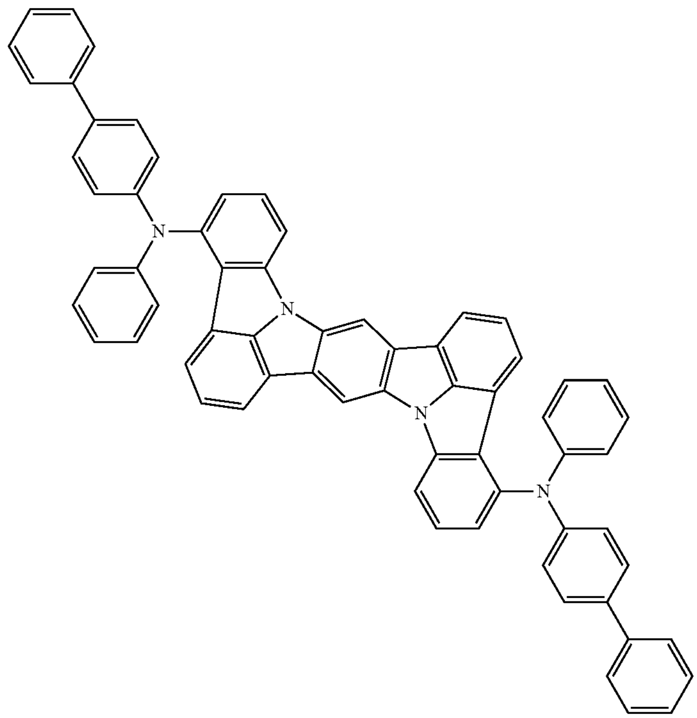
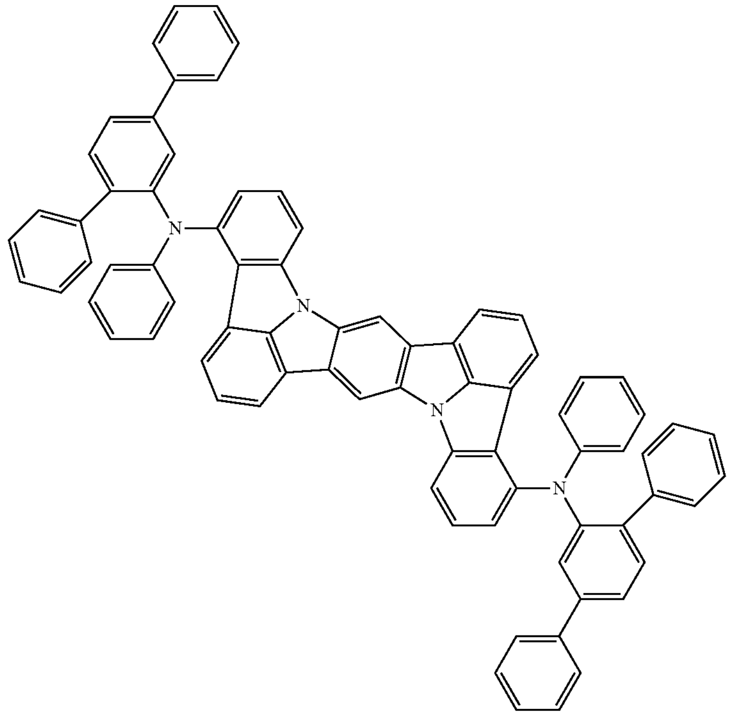

-continued
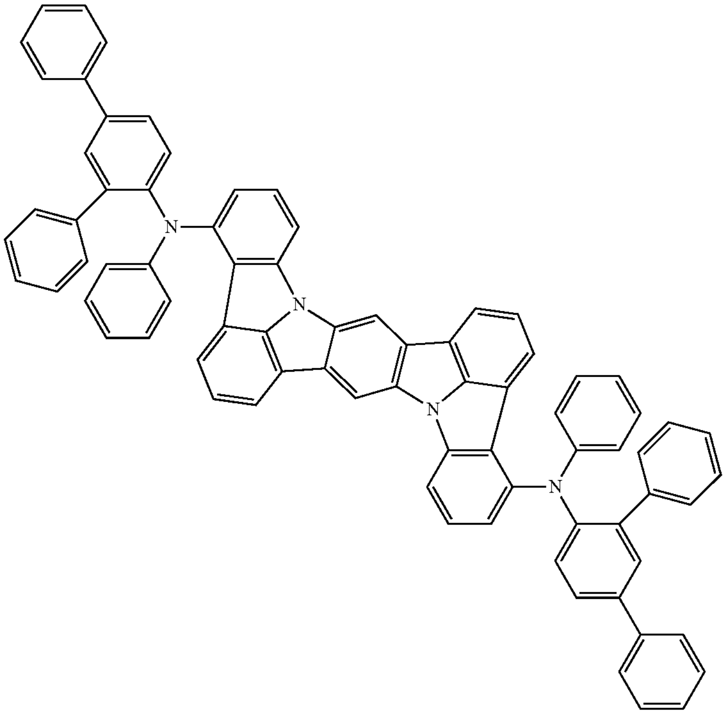
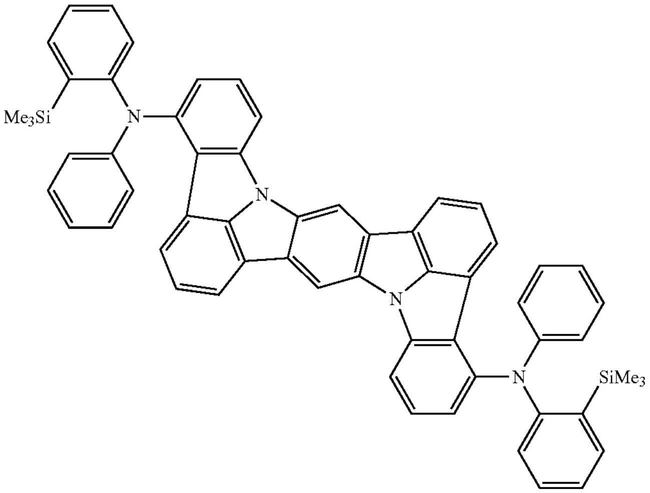

-continued
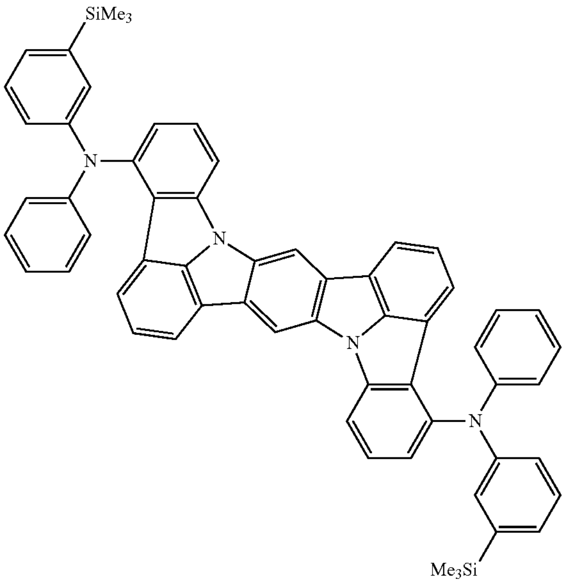
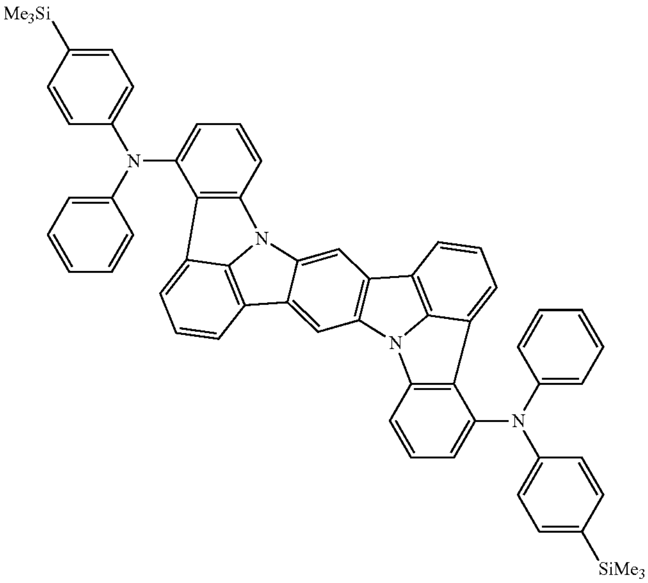

-continued
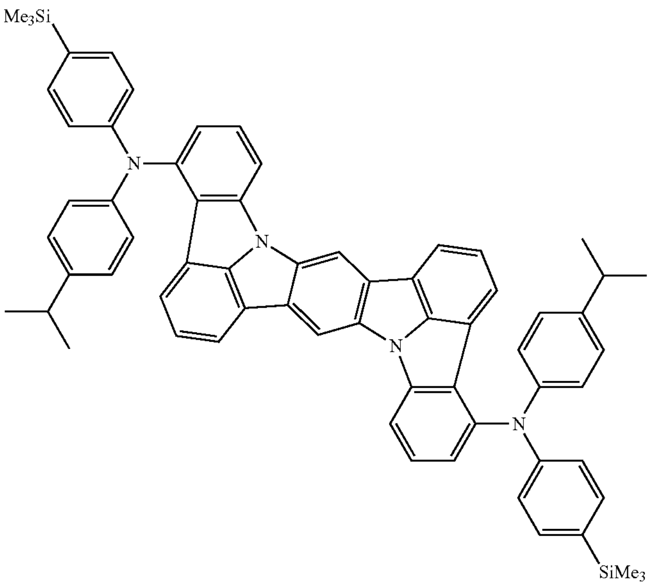
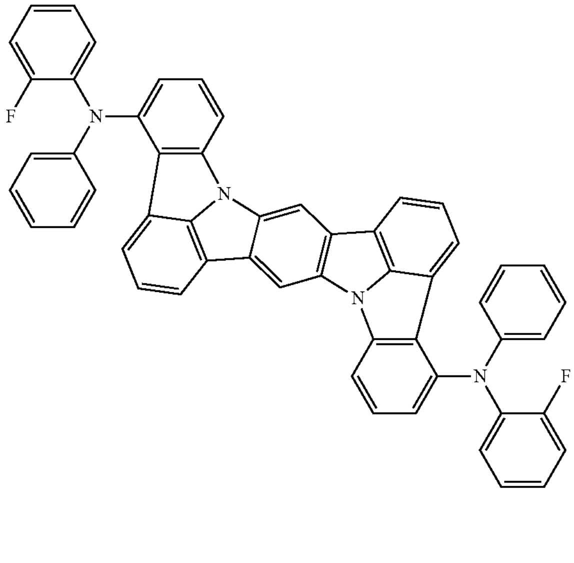
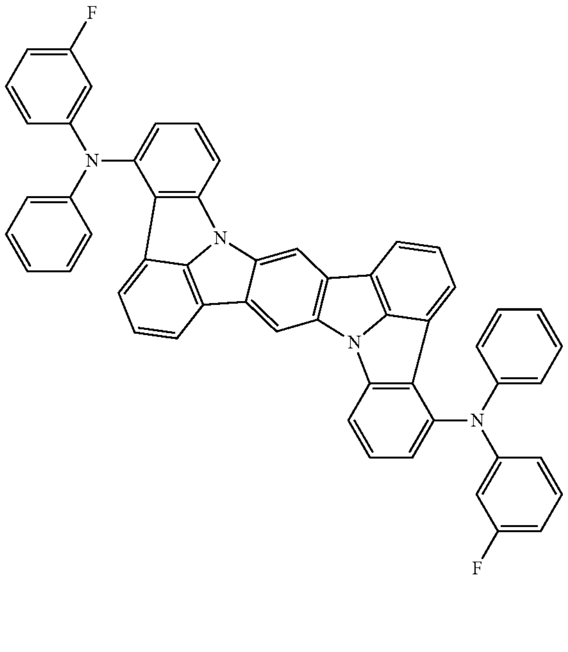

-continued
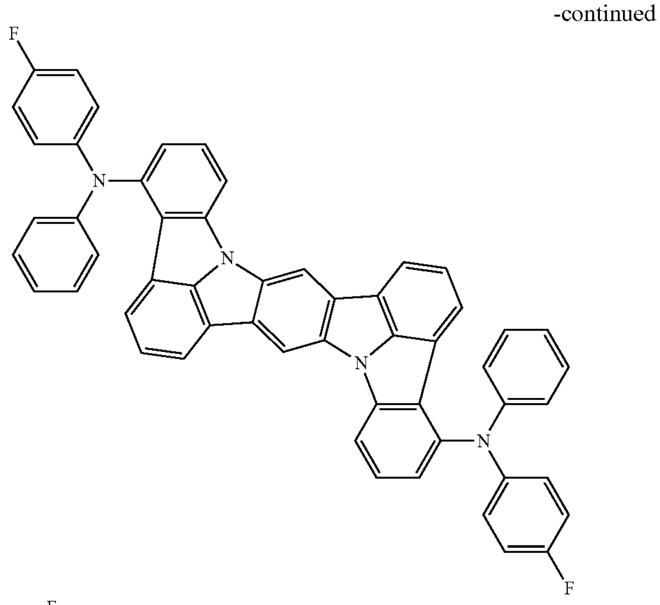
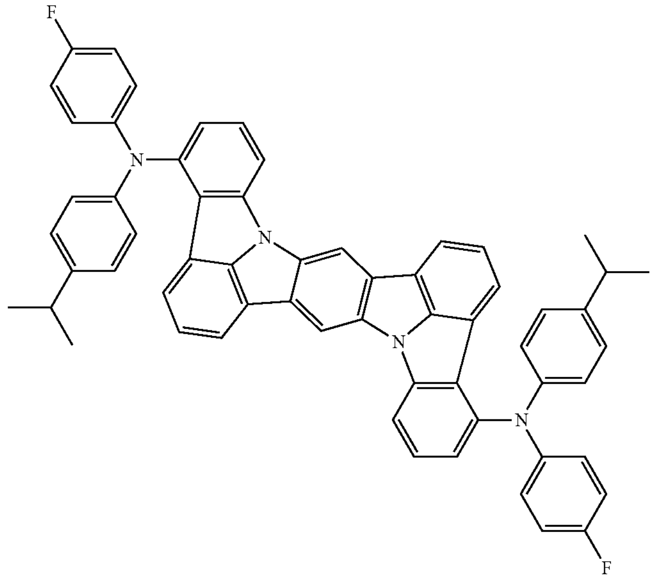
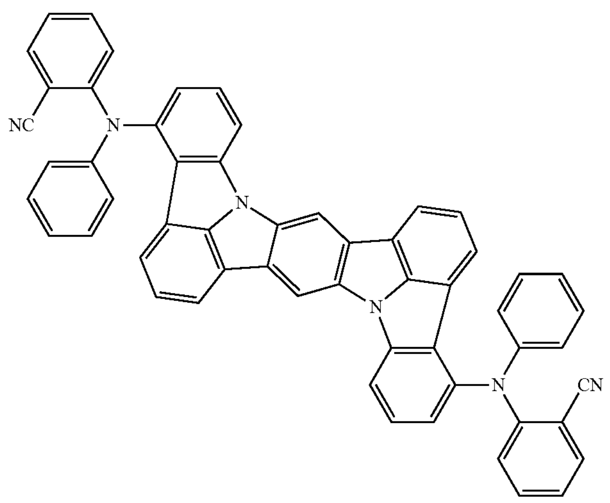
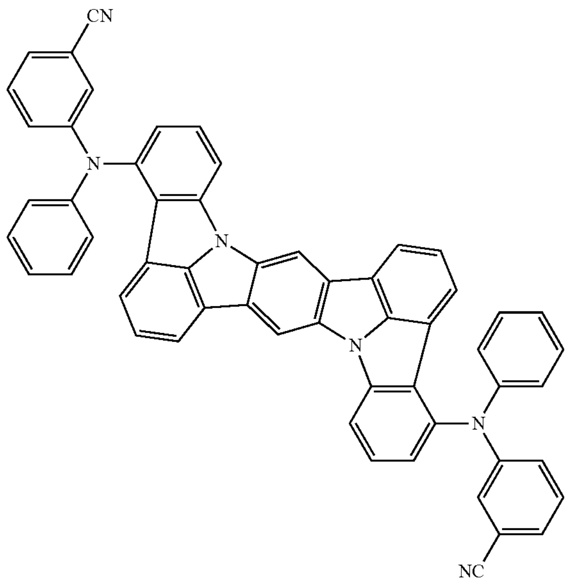

-continued
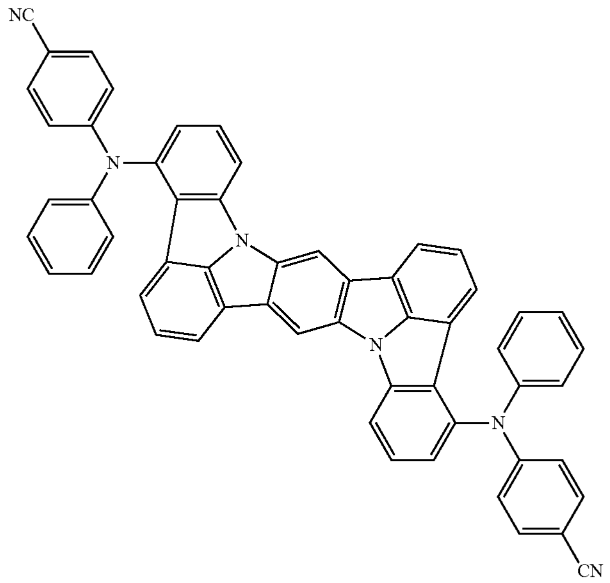
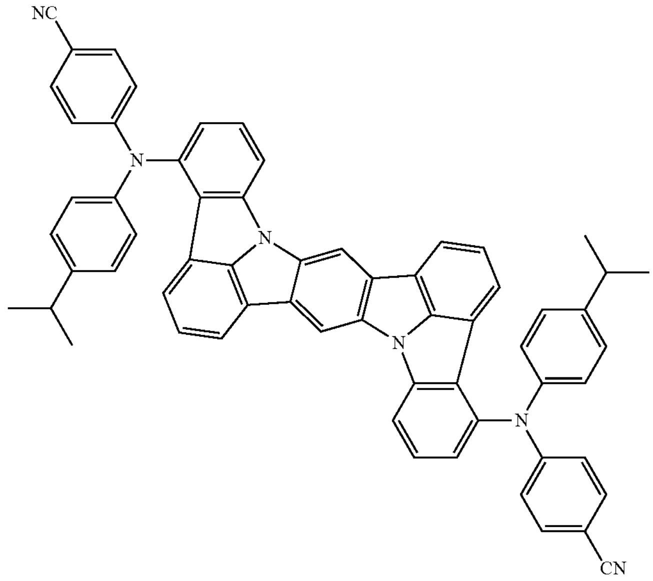
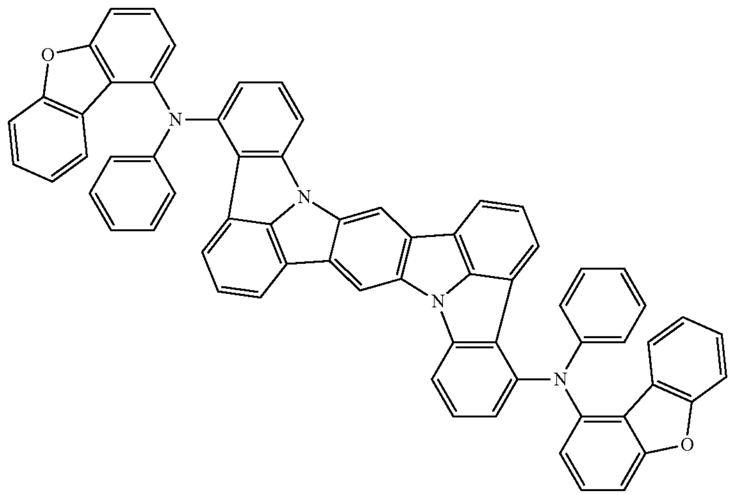

-continued
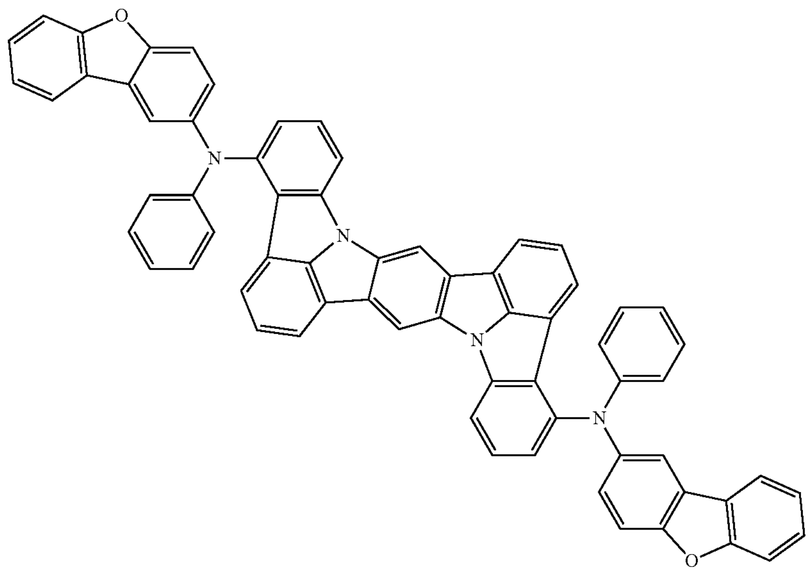
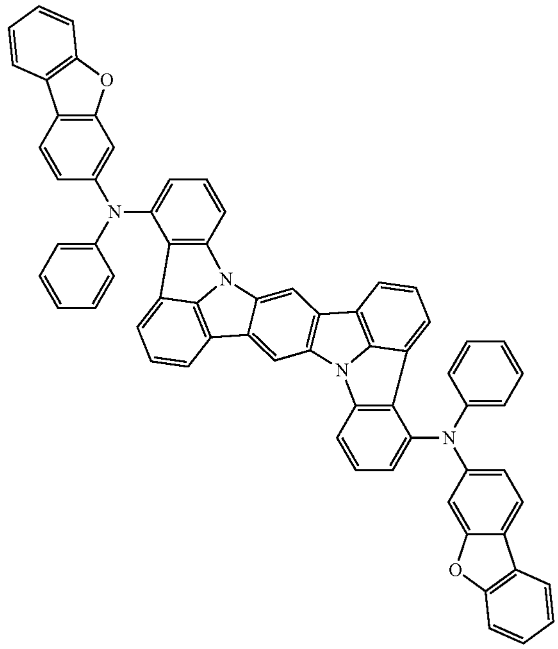
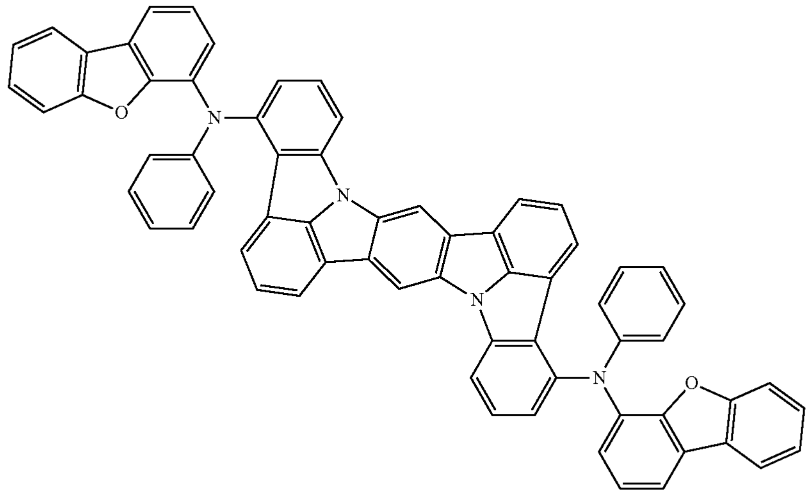

-continued
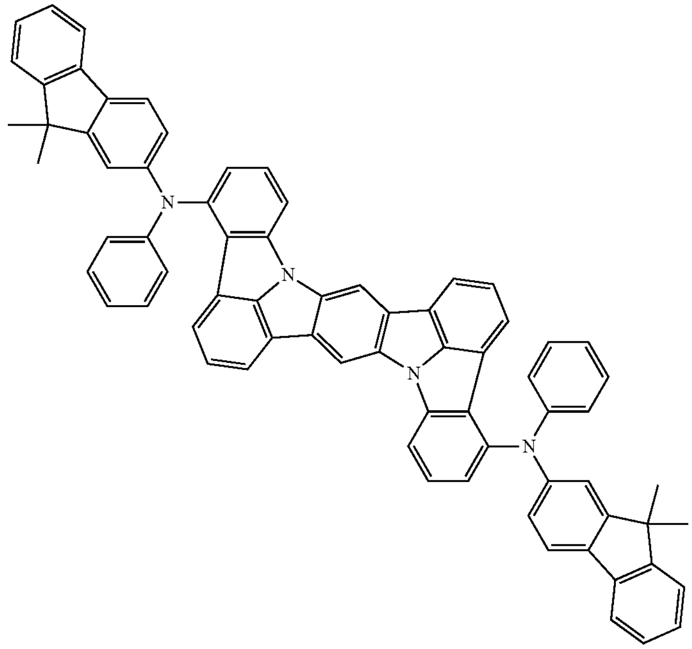
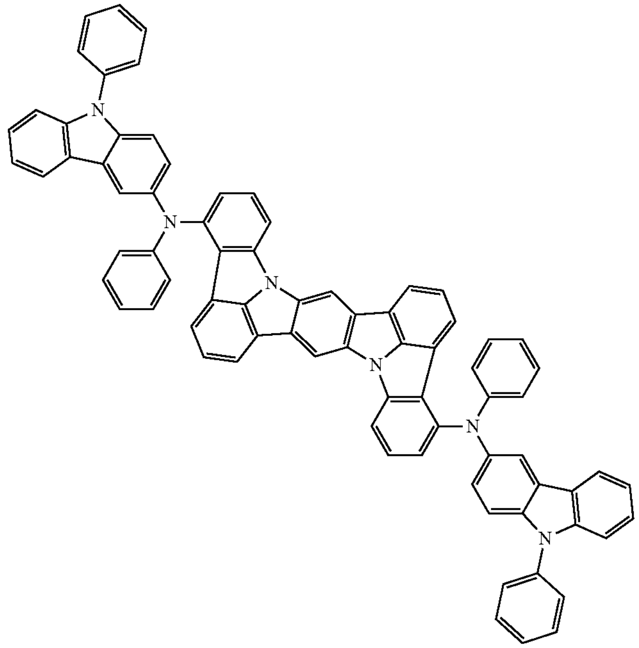

-continued
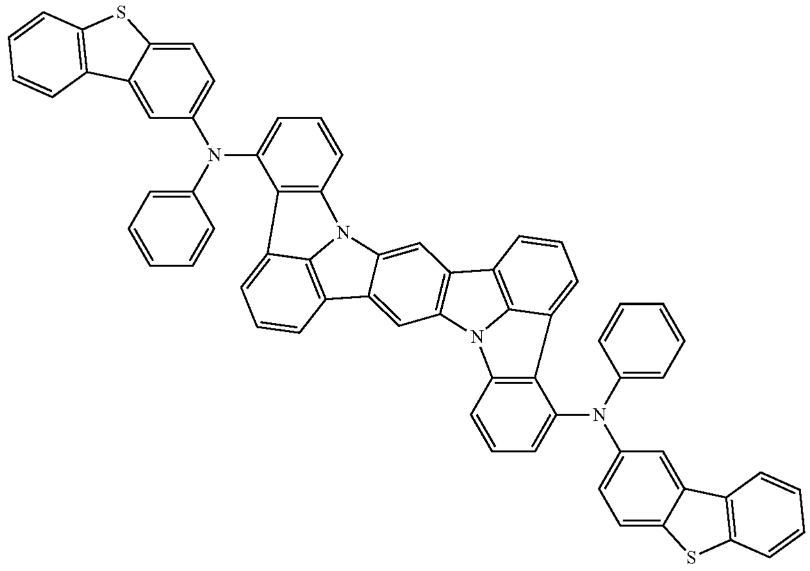
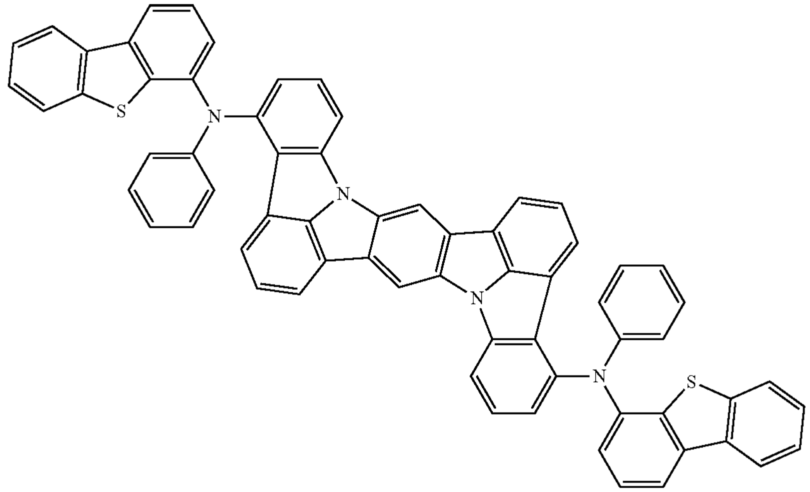
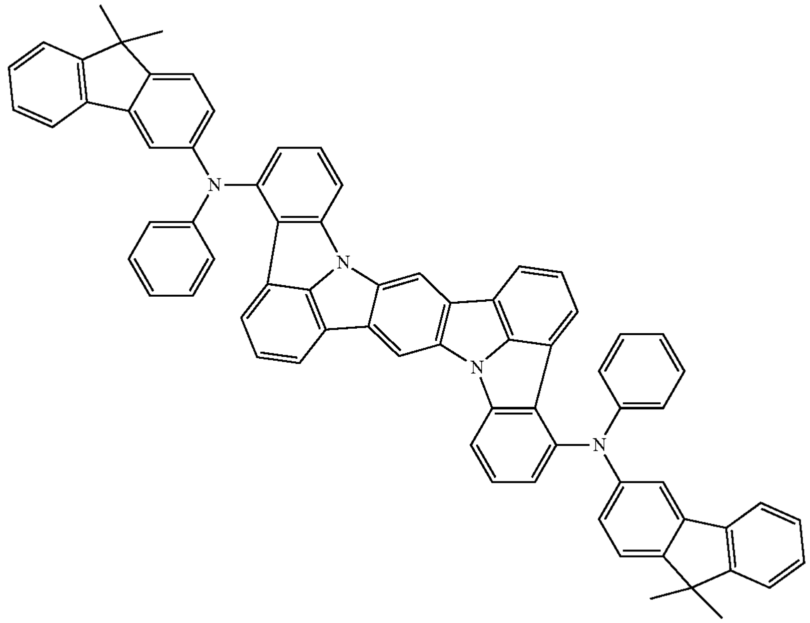

-continued
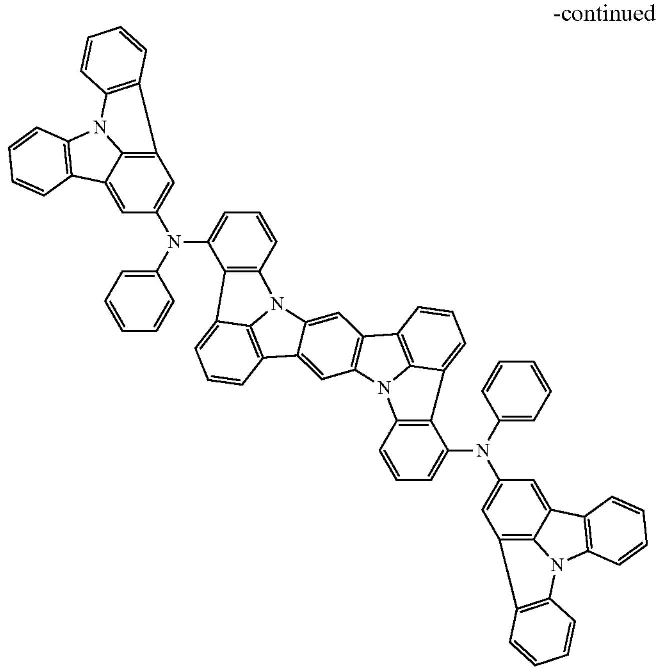
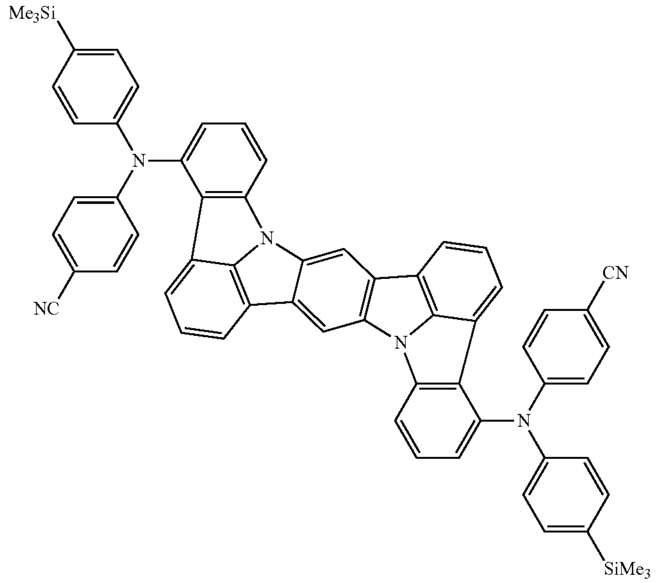
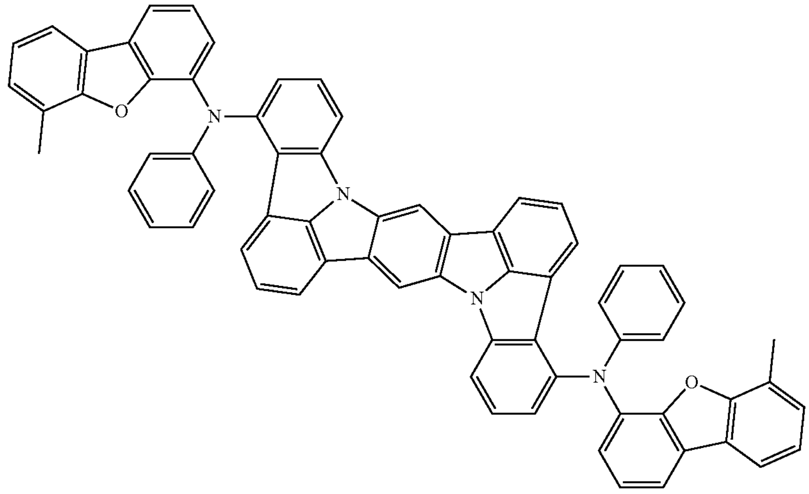

-continued
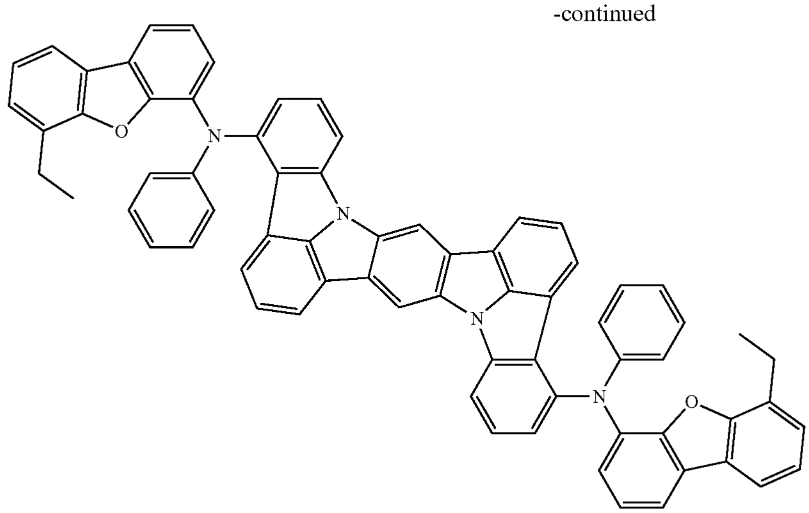
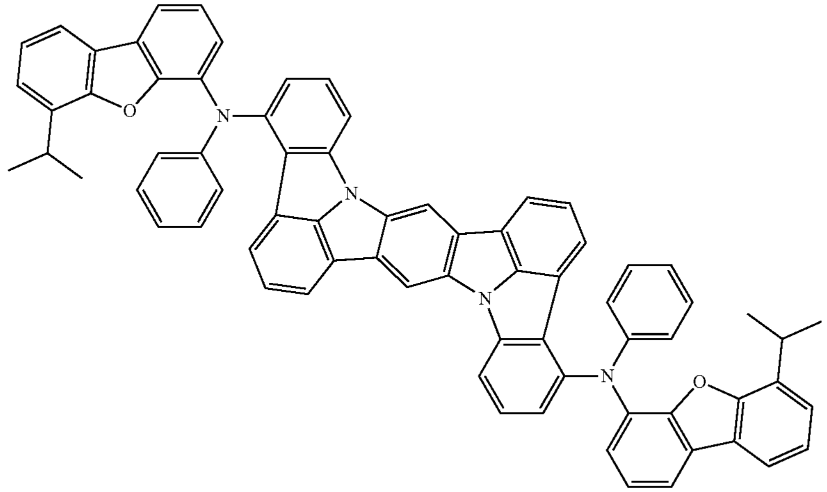
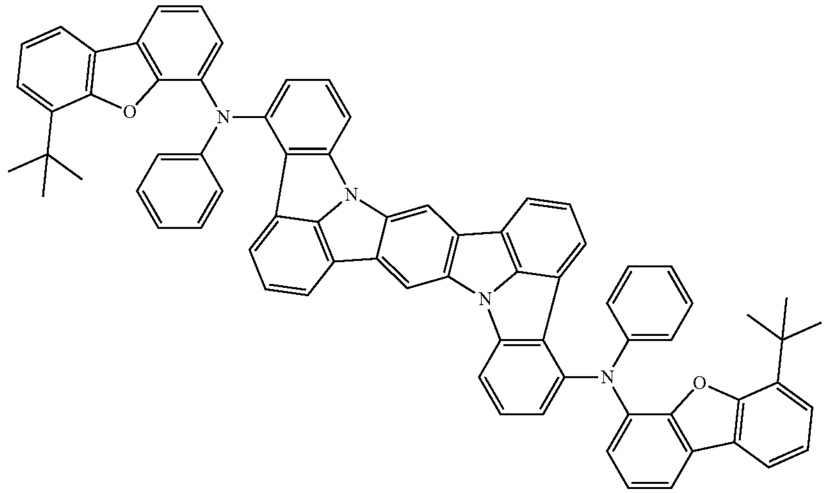

-continued
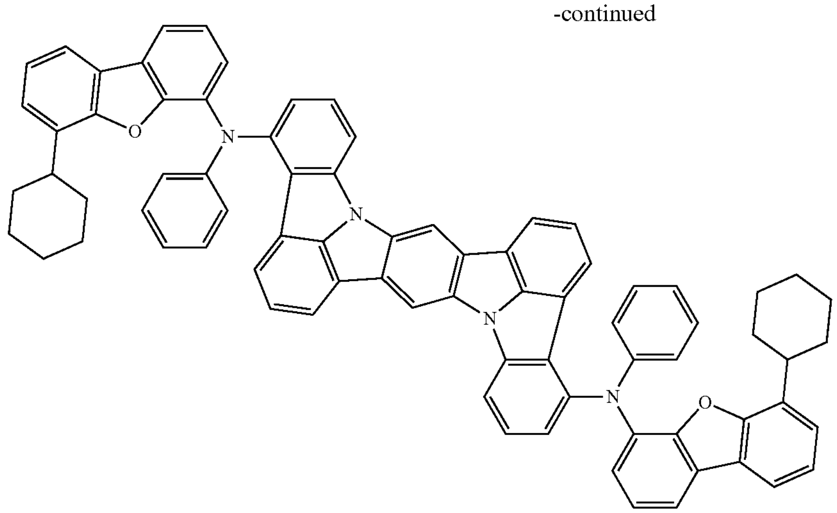
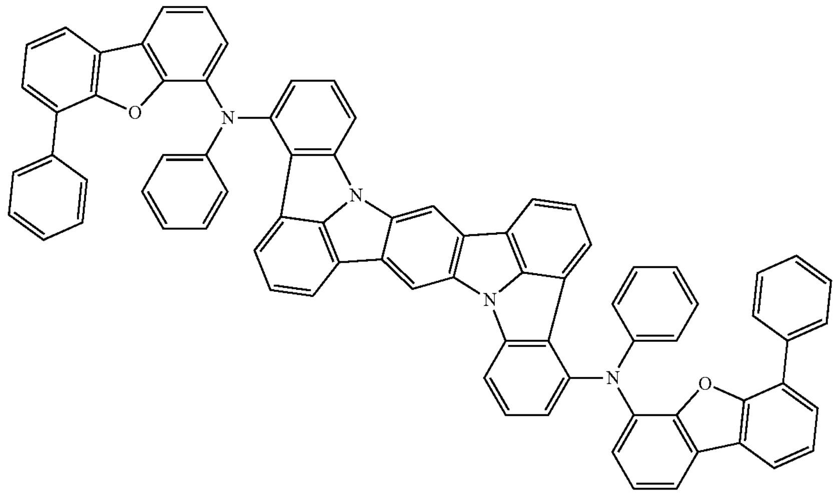
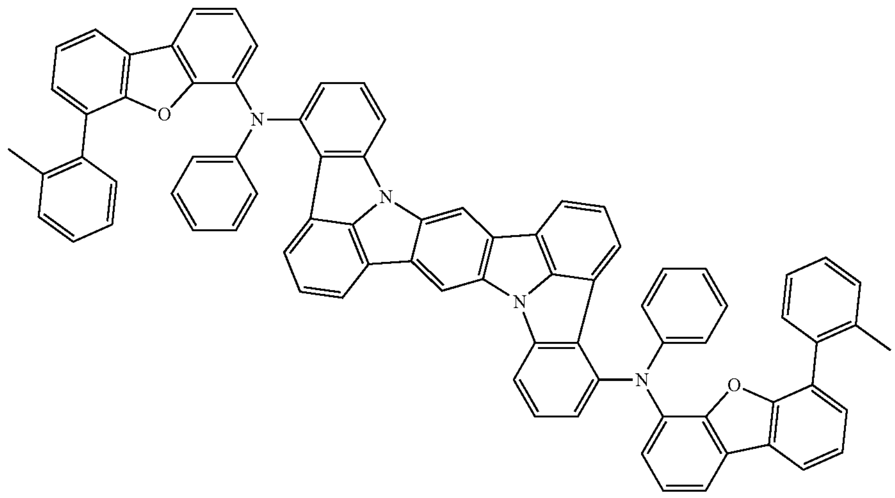

-continued
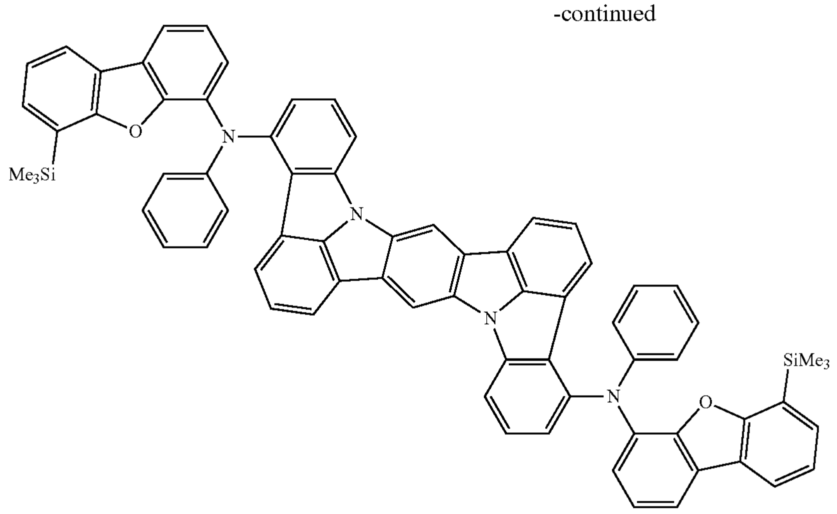
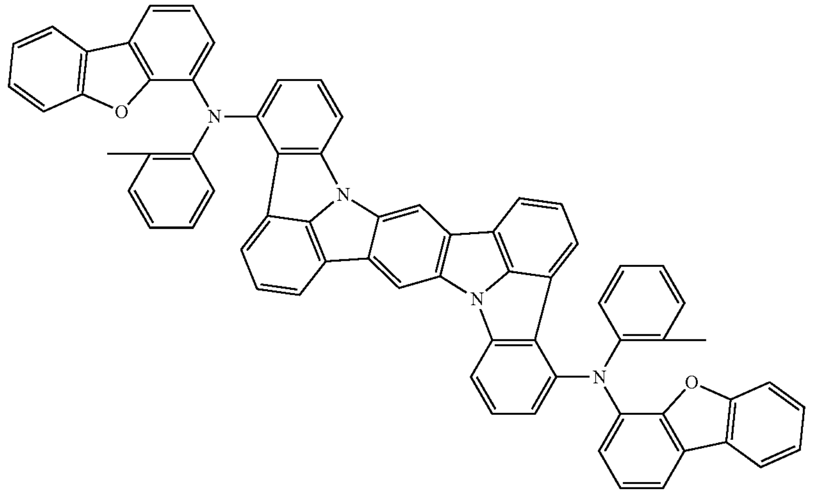
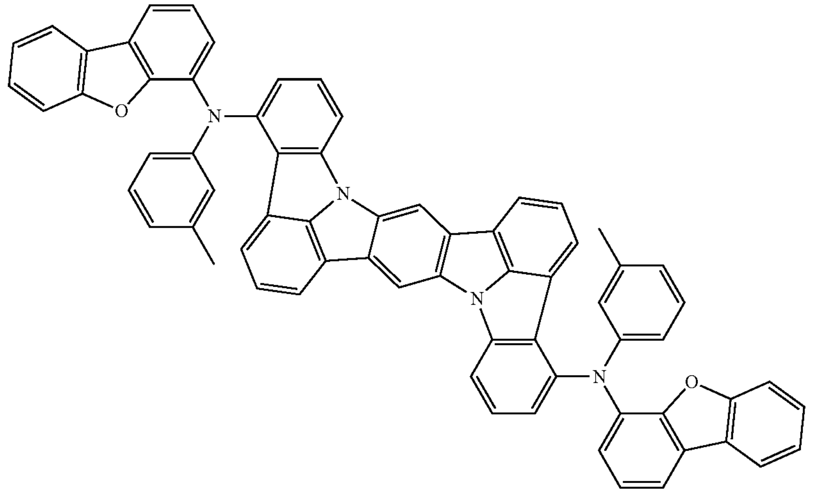

-continued
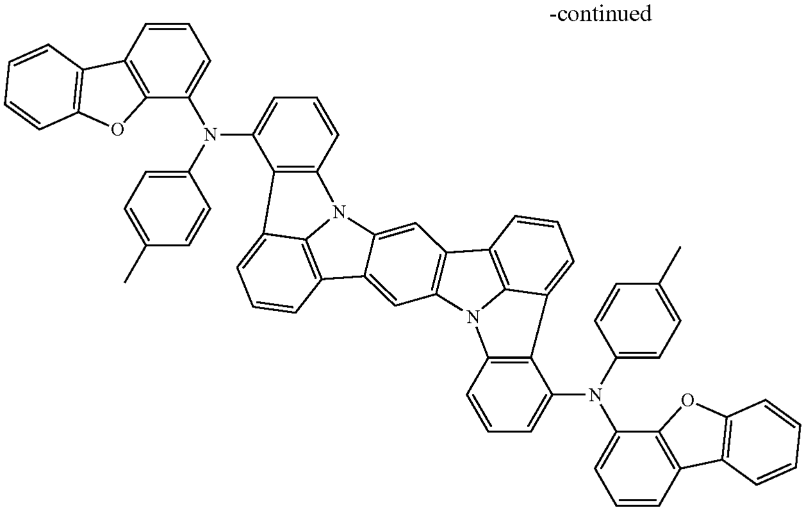
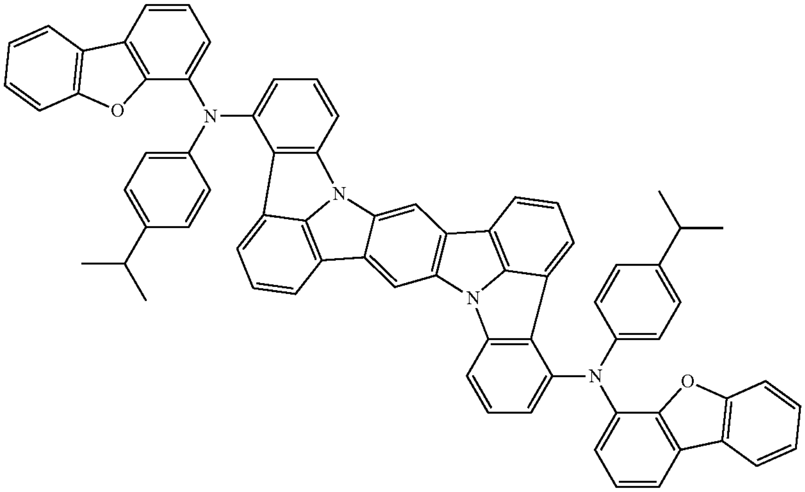
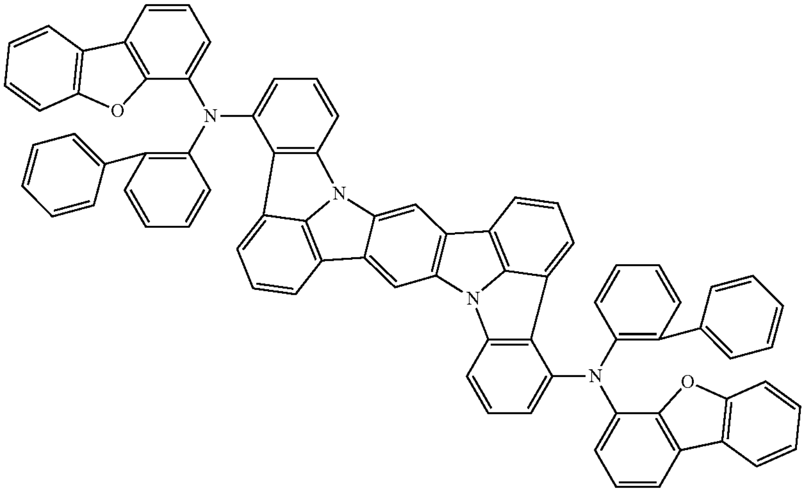

-continued
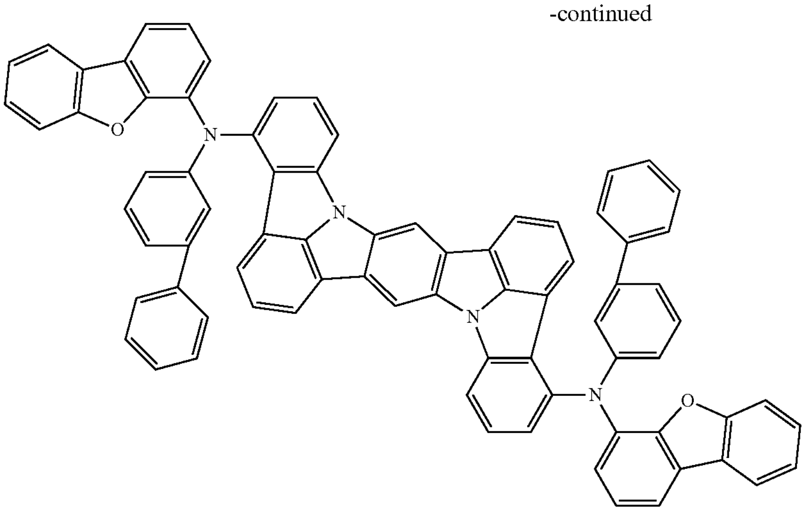
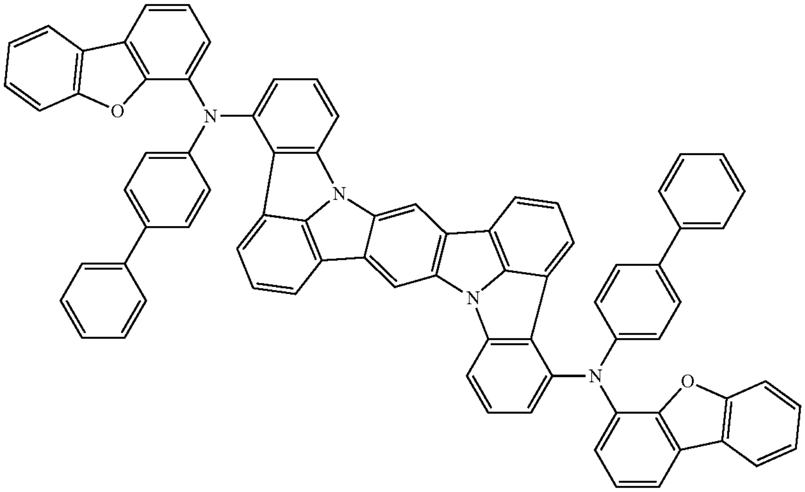
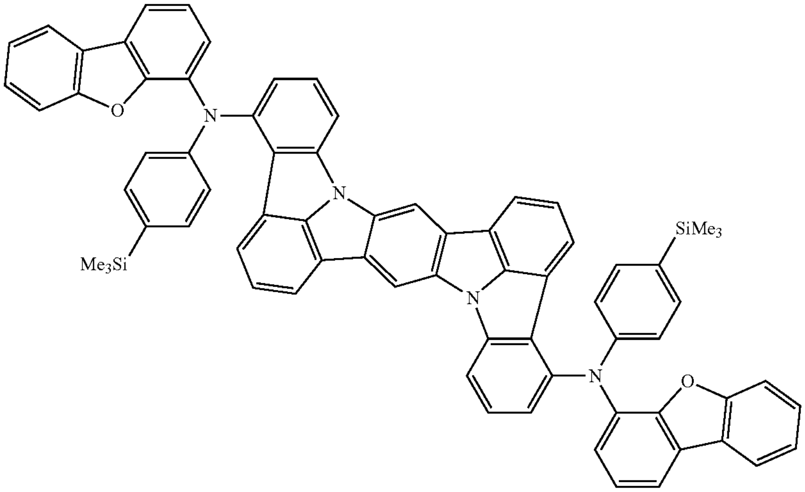

-continued
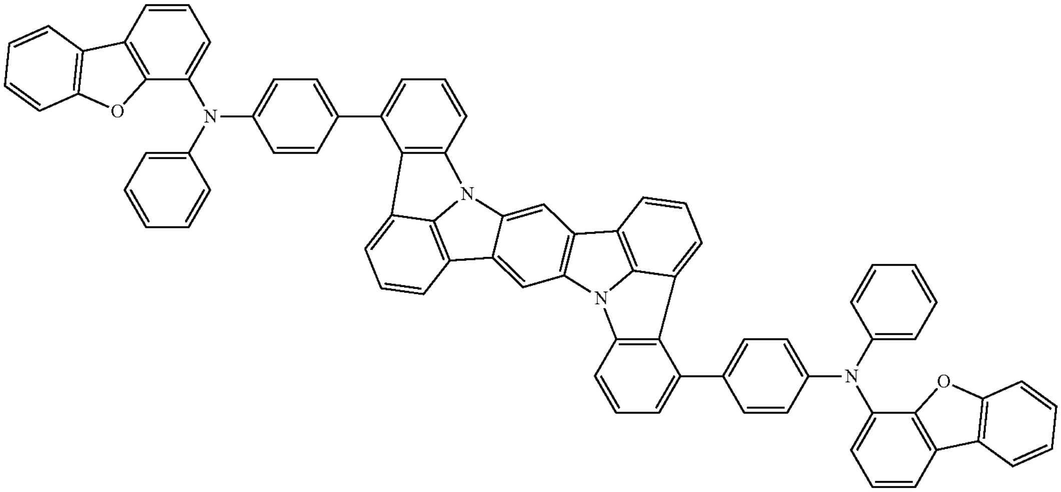
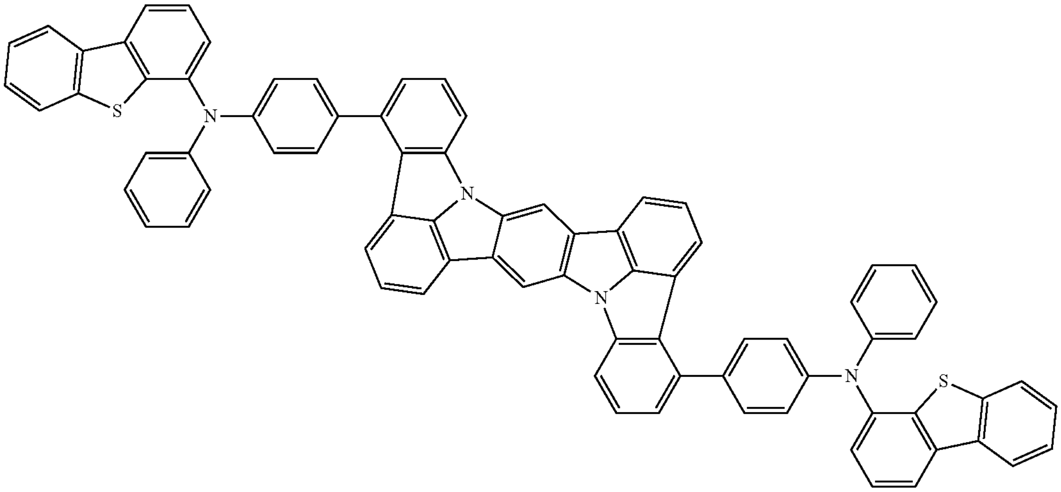
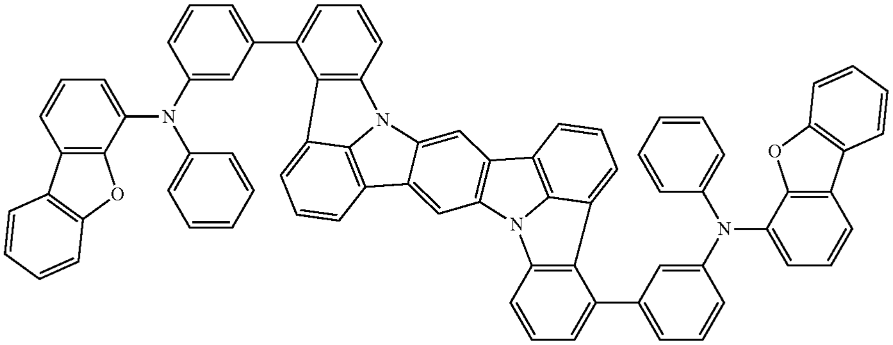
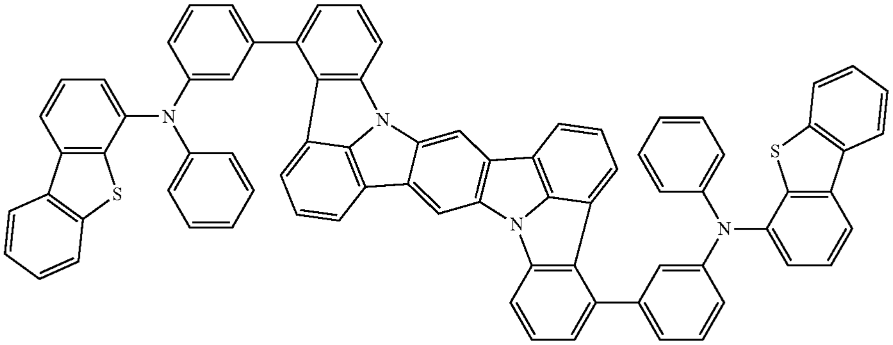

-continued
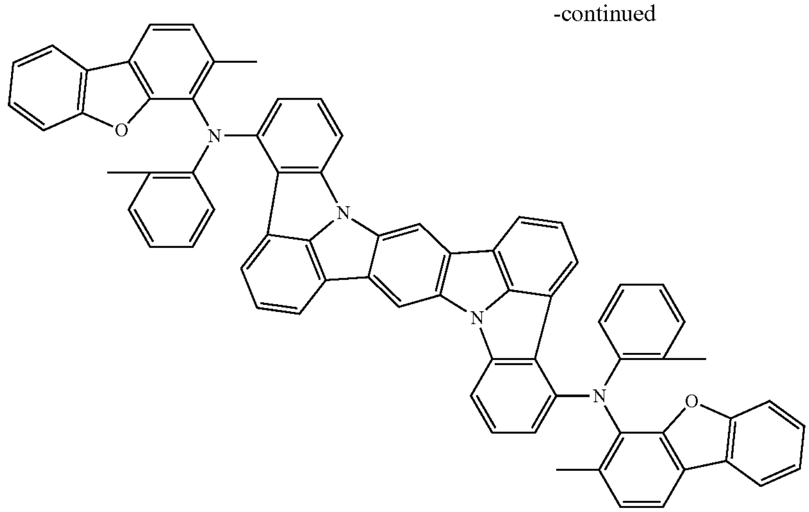
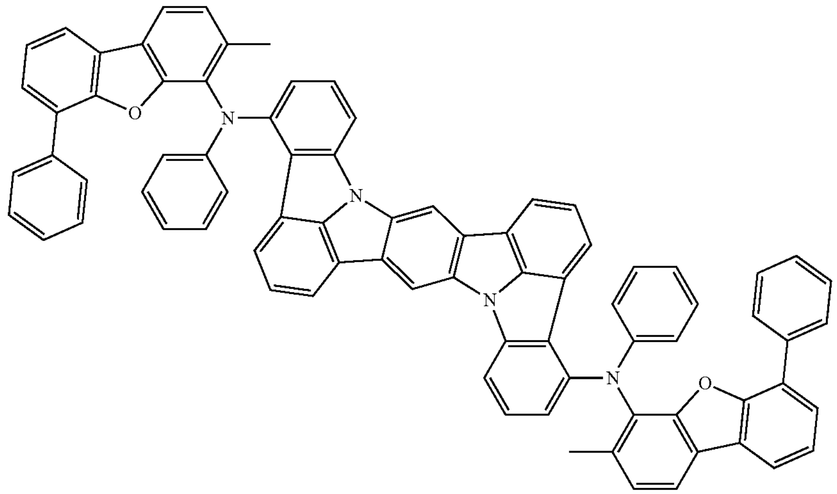
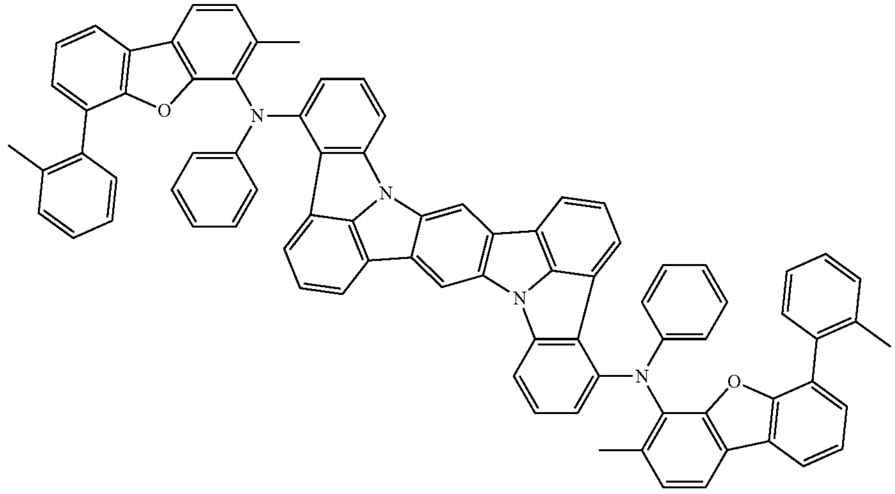

-continued
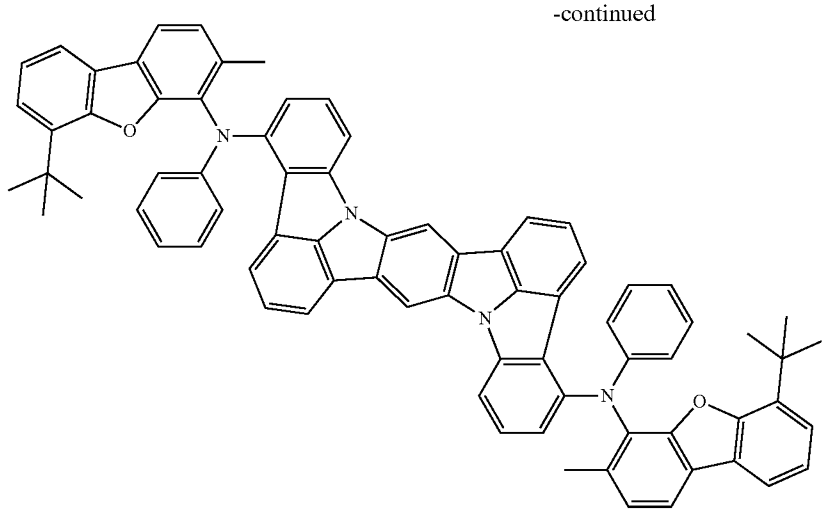
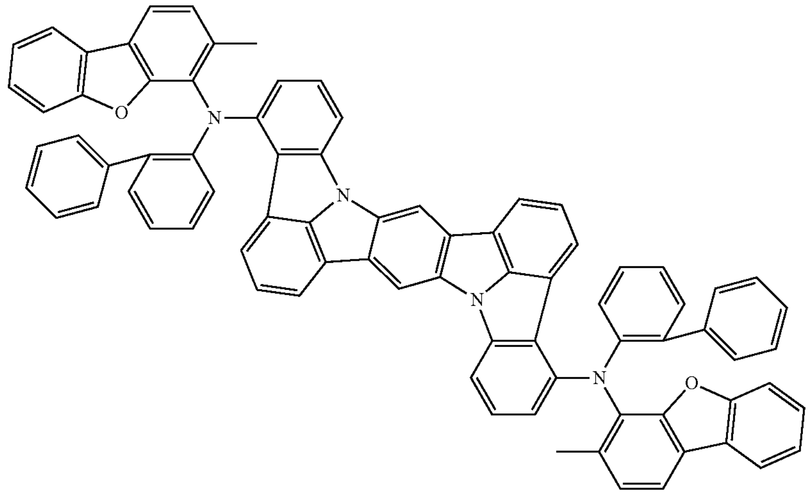
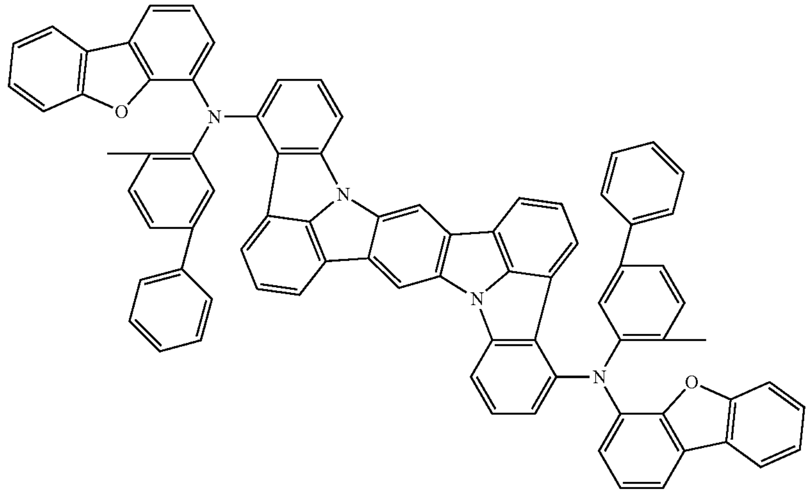

-continued
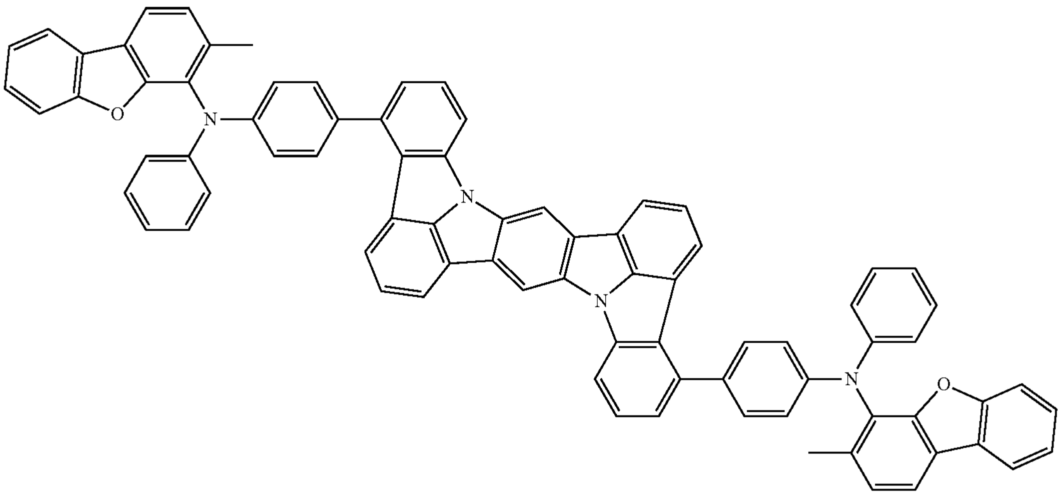
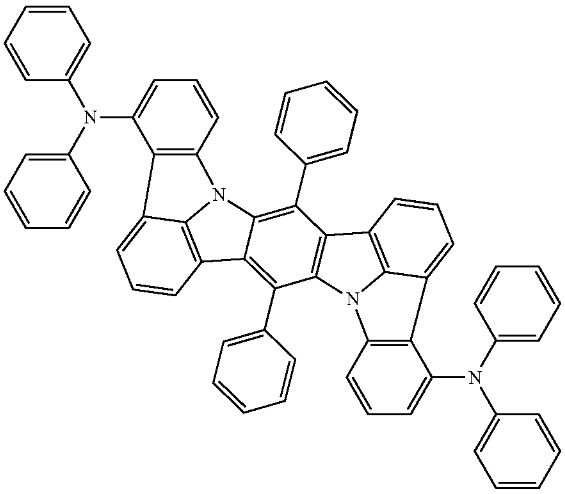
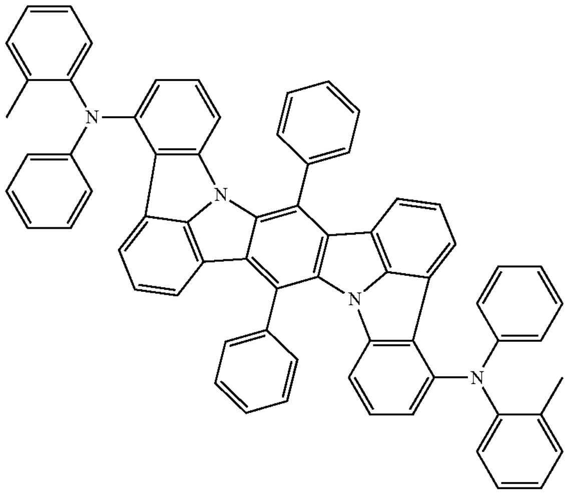
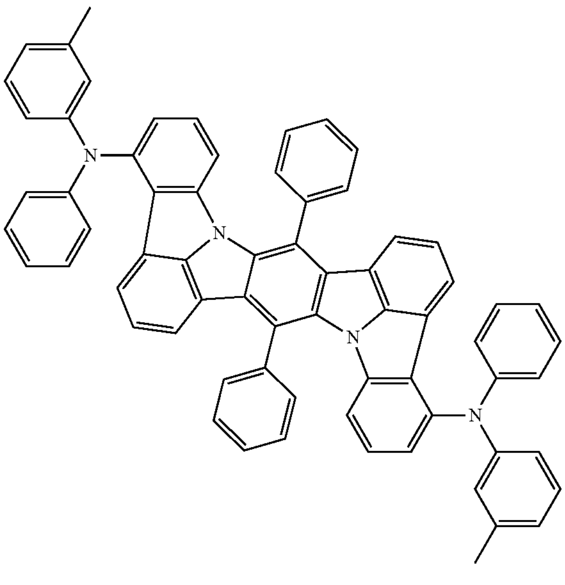
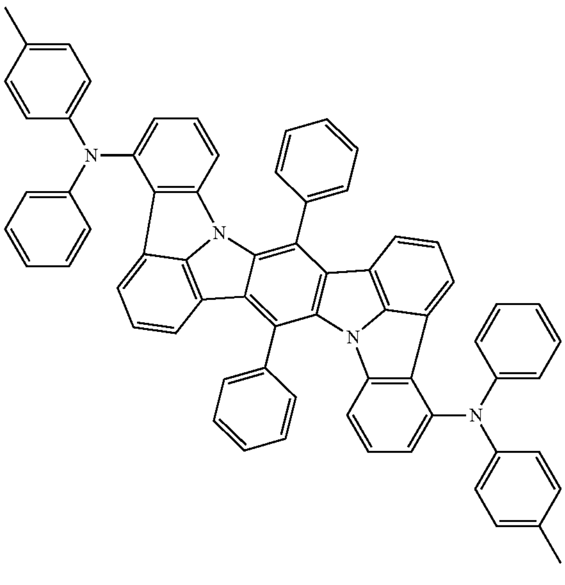

-continued
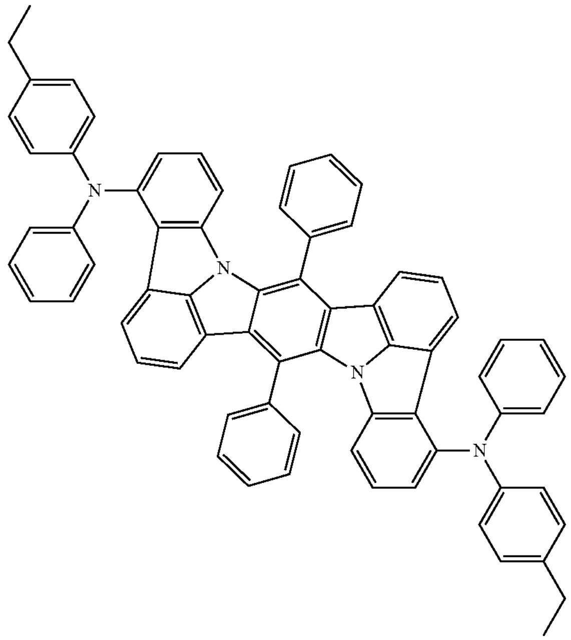
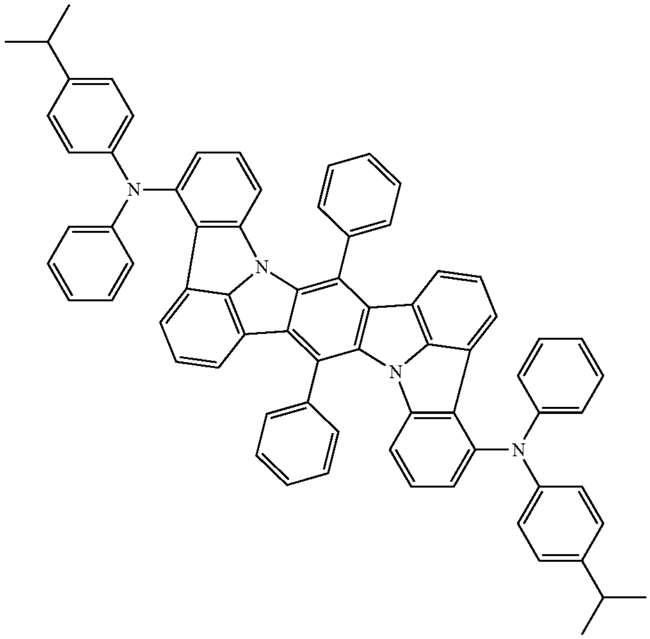

-continued
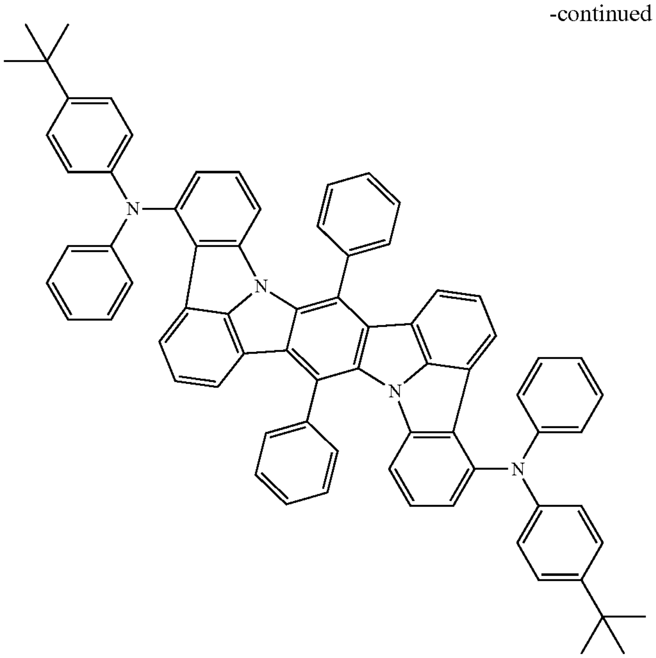
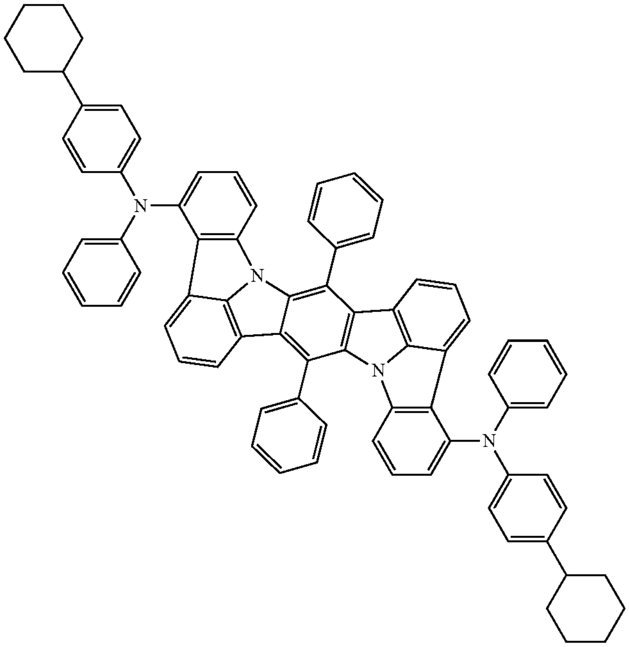

-continued
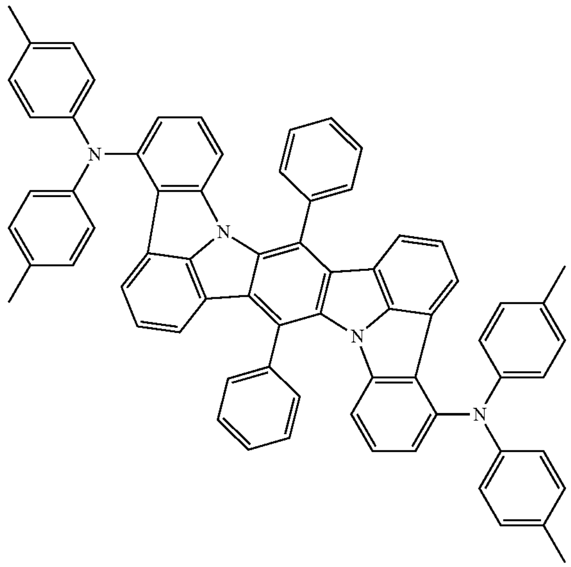
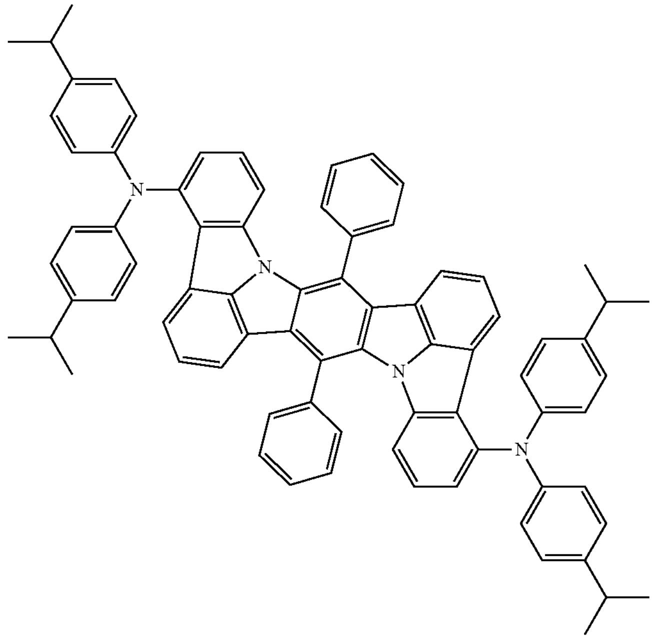

-continued
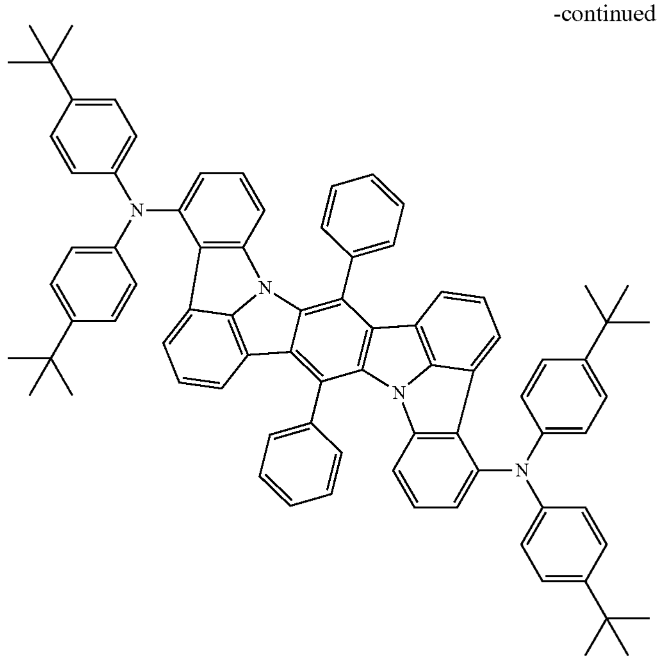
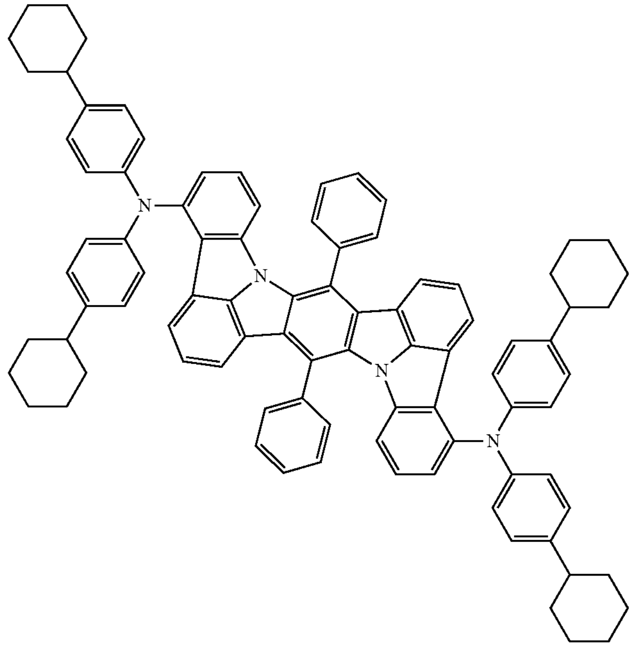

-continued
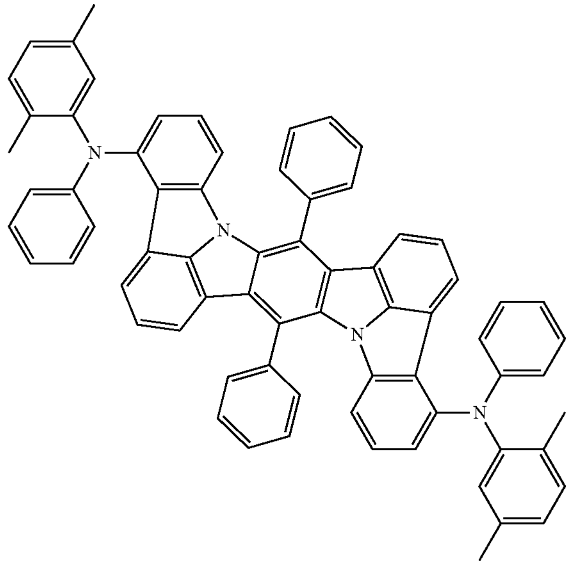
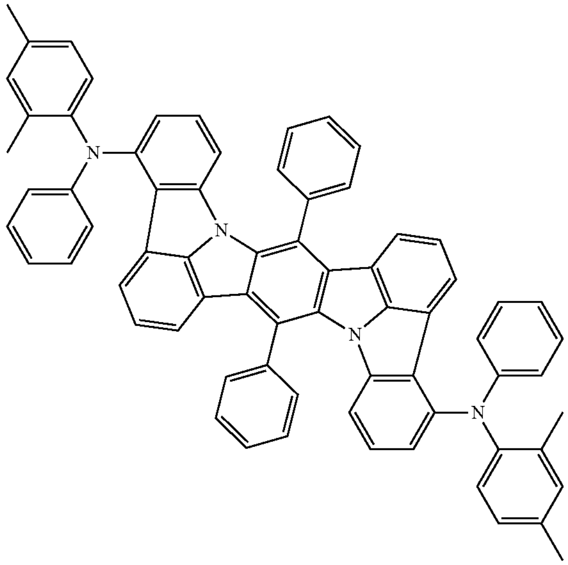
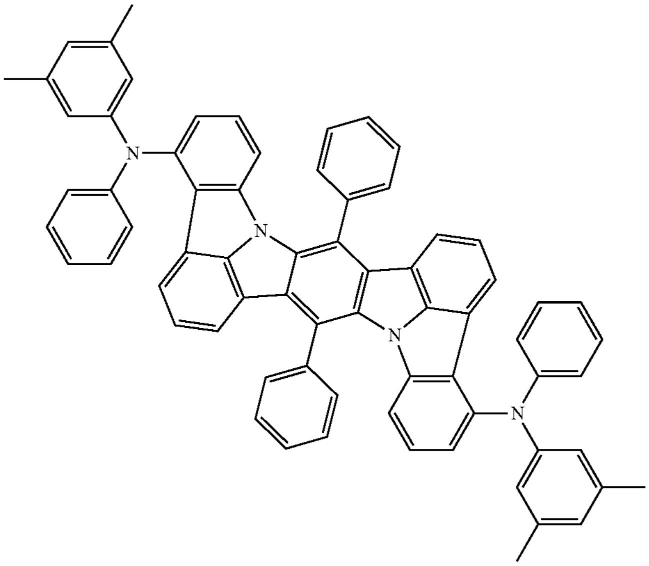
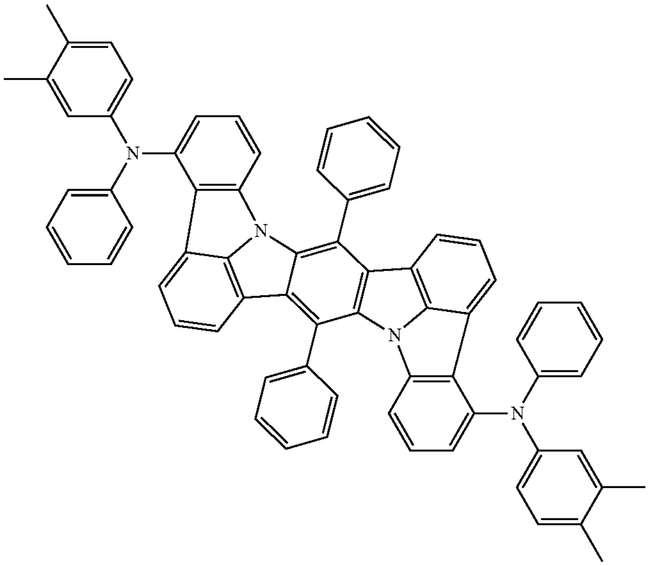

-continued
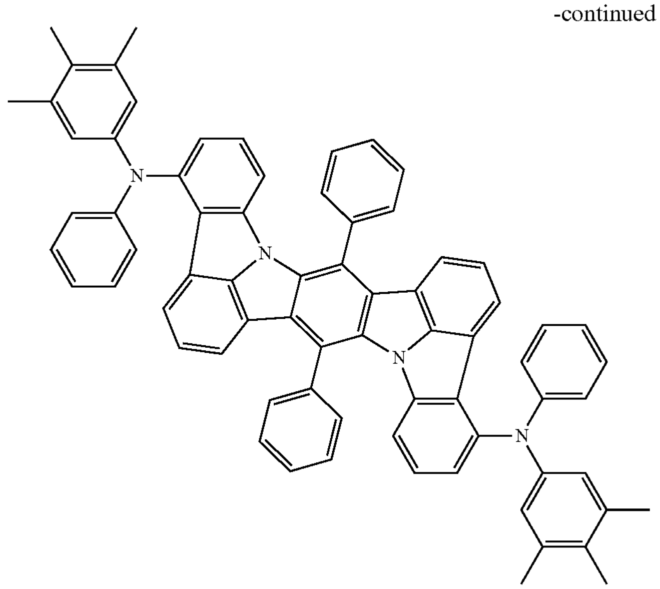
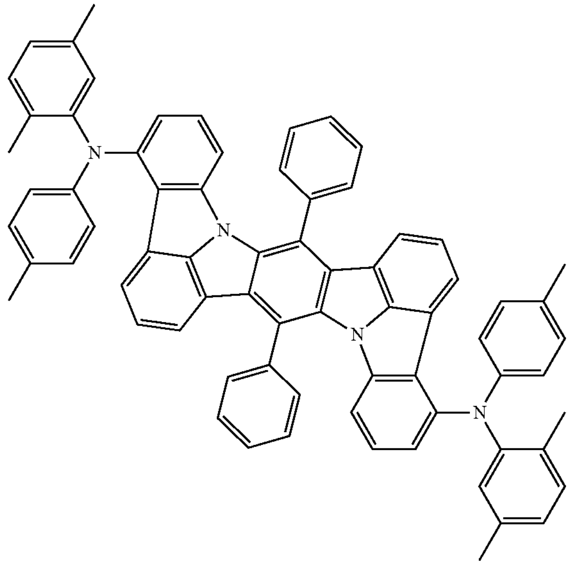
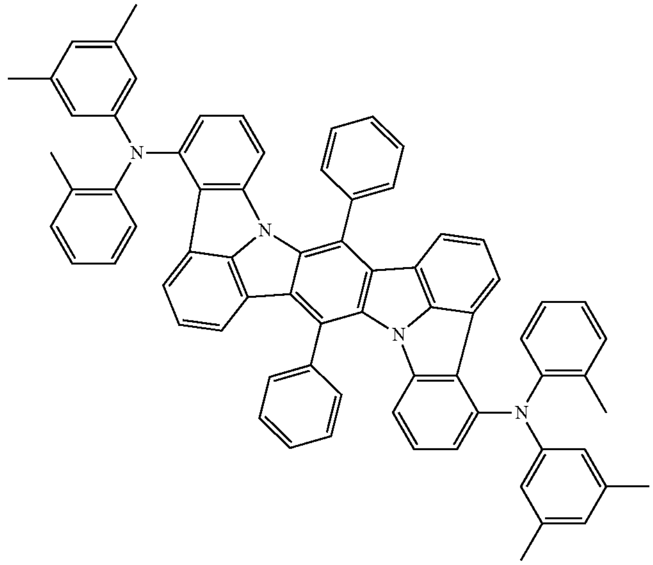

-continued
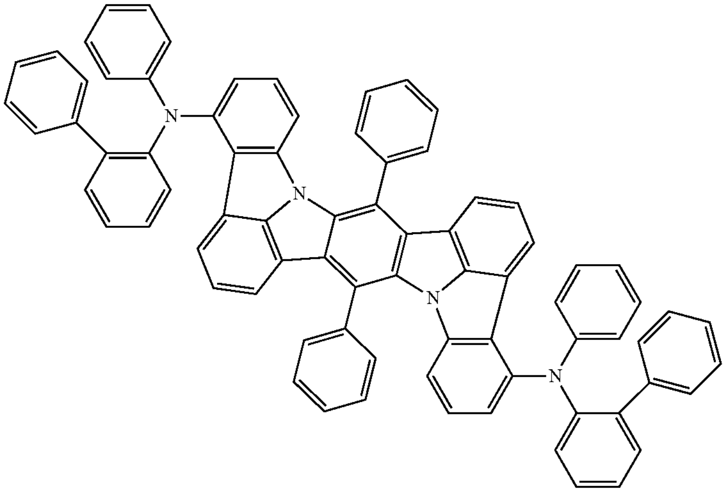
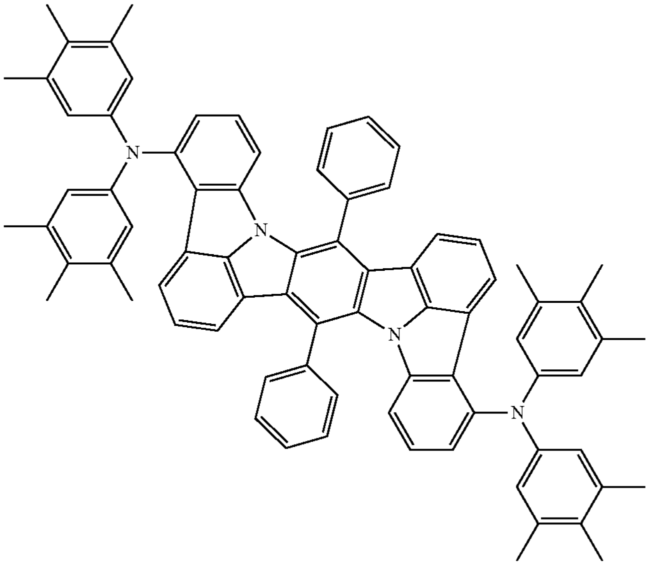
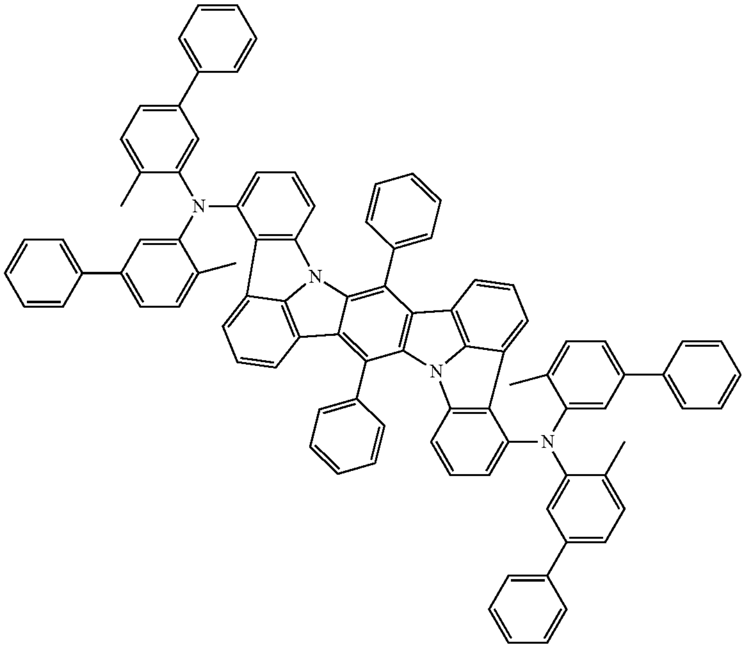

-continued
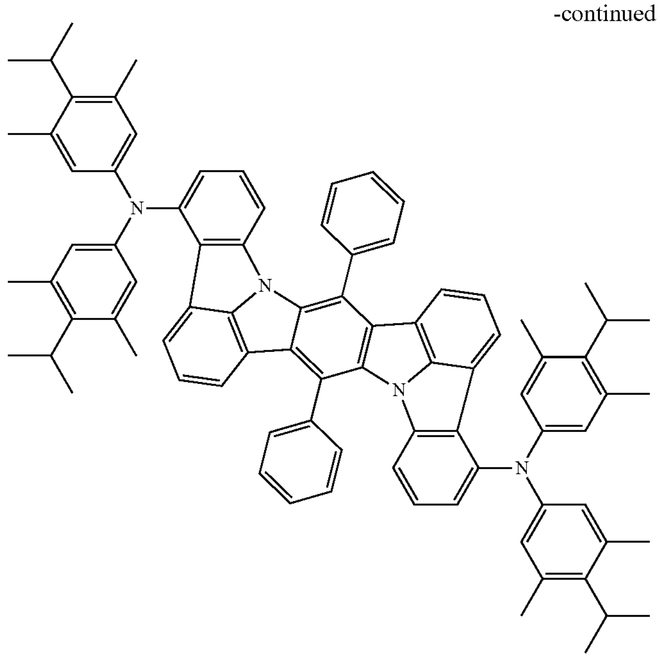
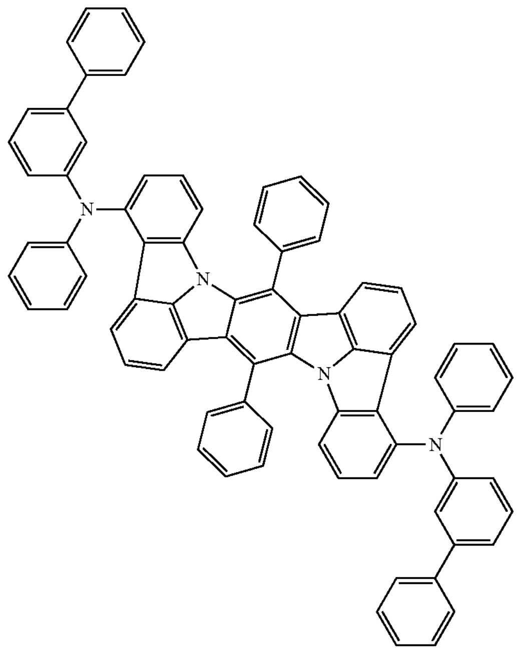
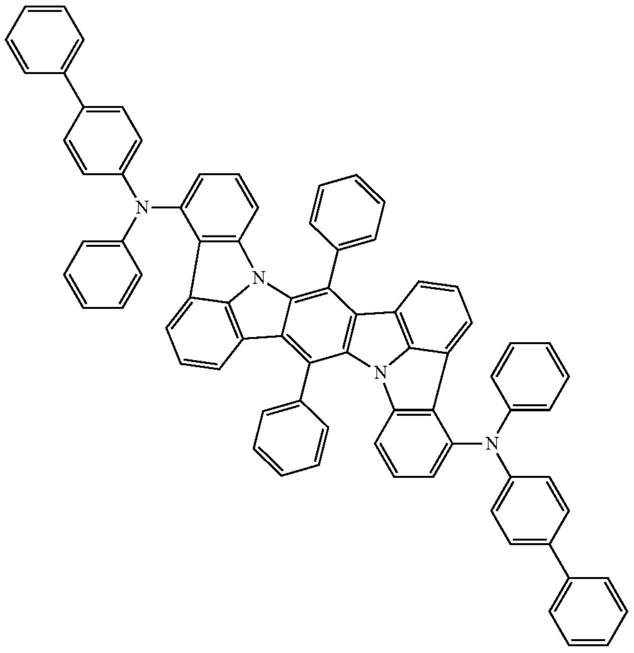

-continued
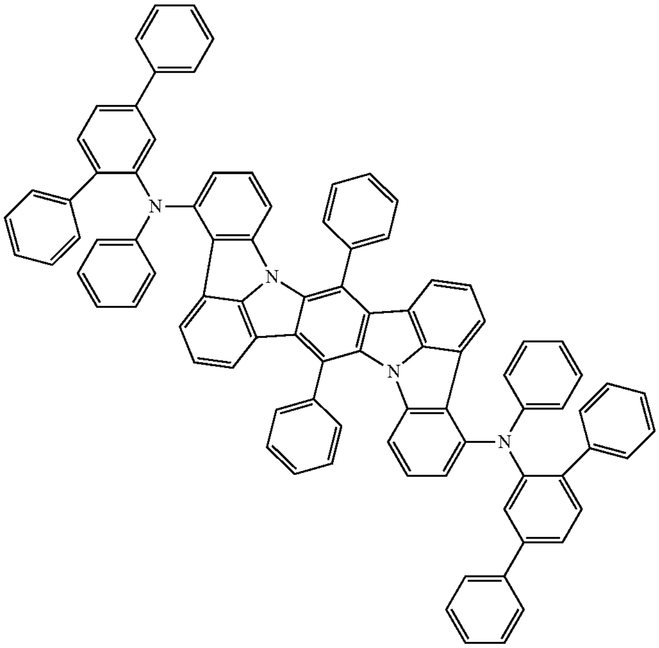
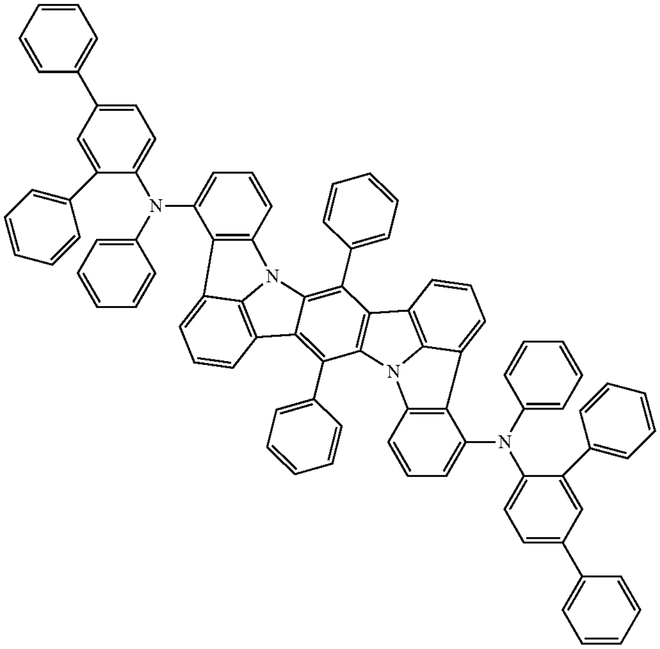

-continued
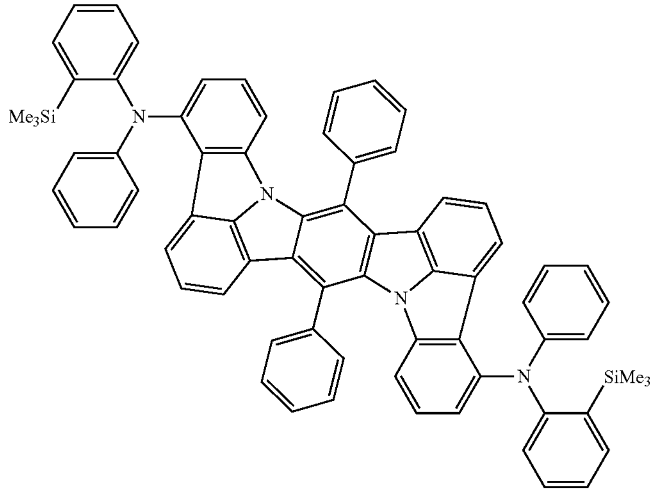
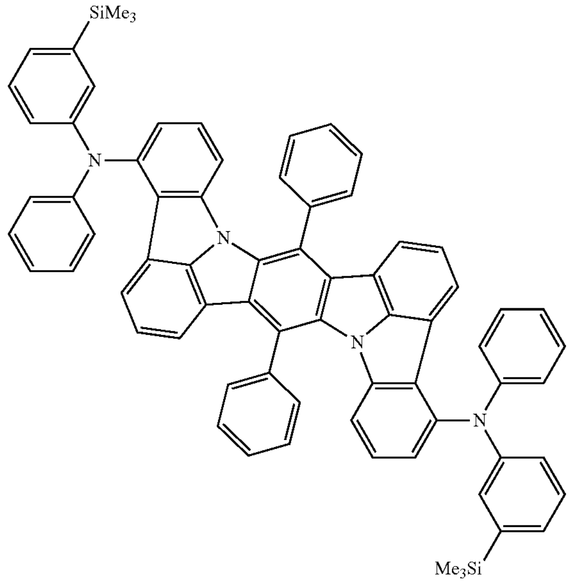
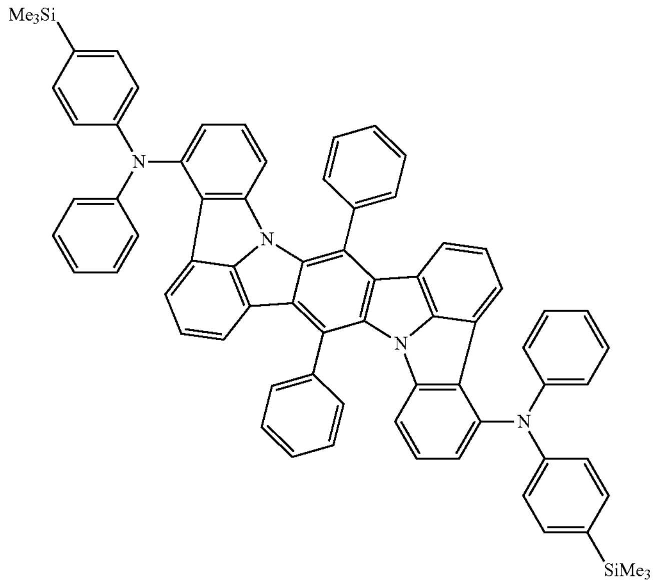

-continued
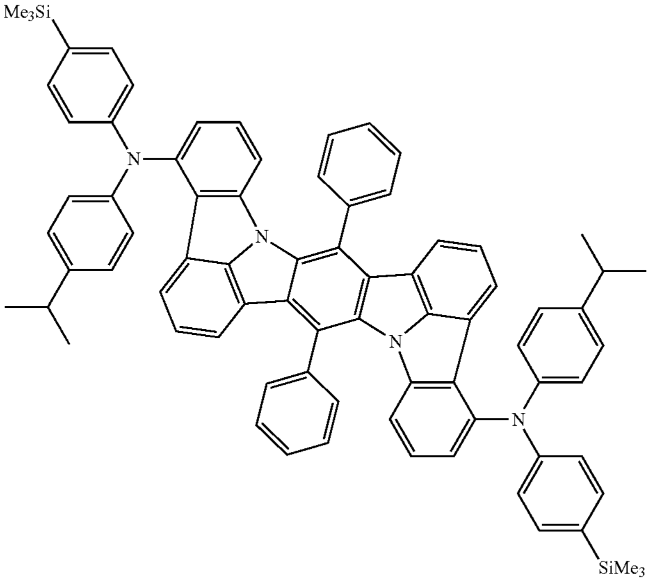
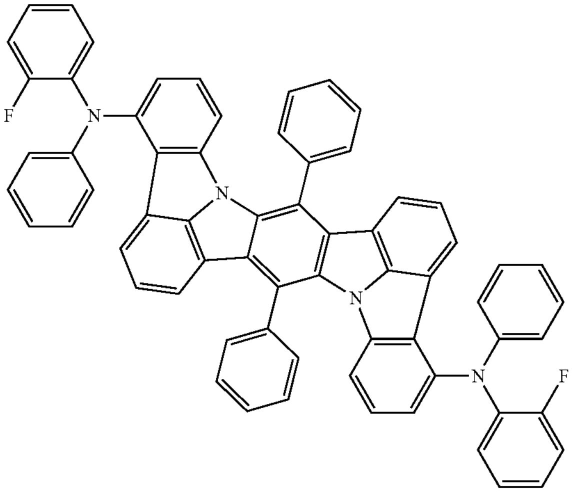
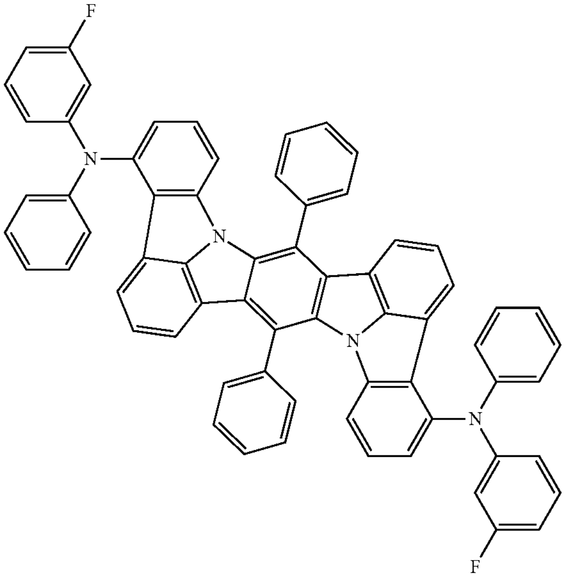
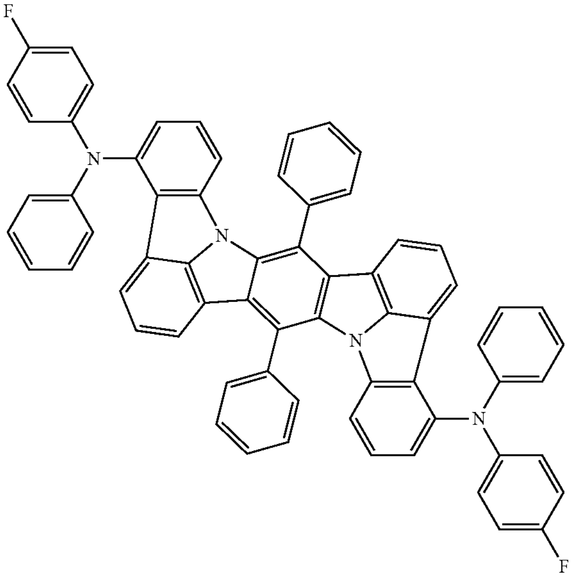

-continued
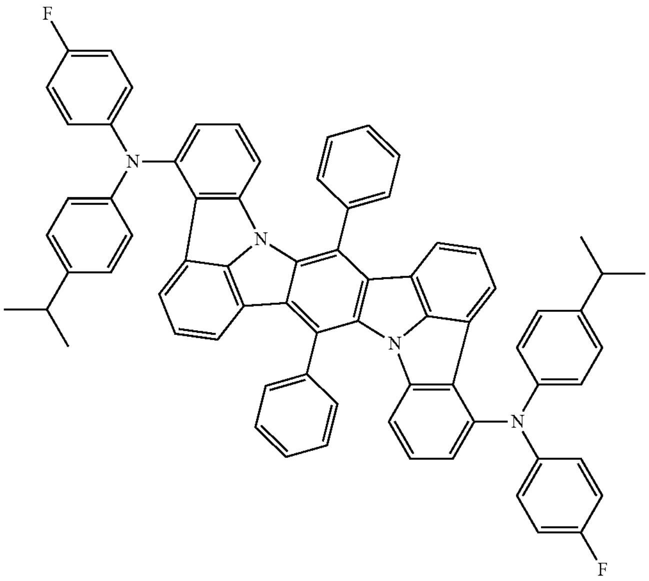
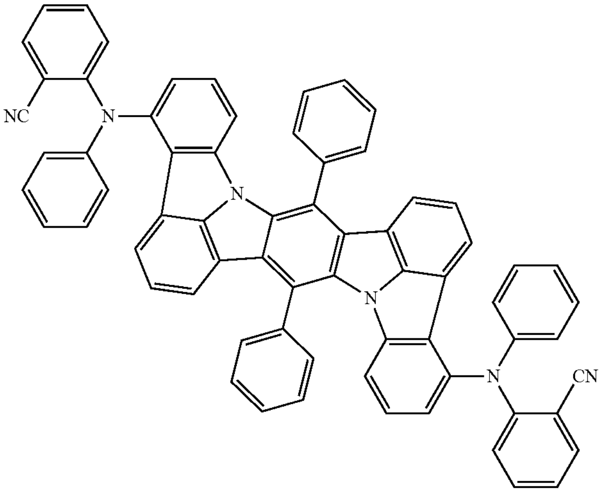
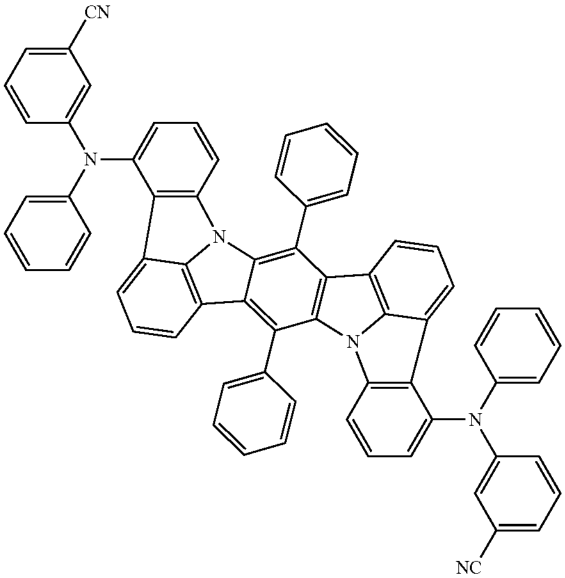

-continued
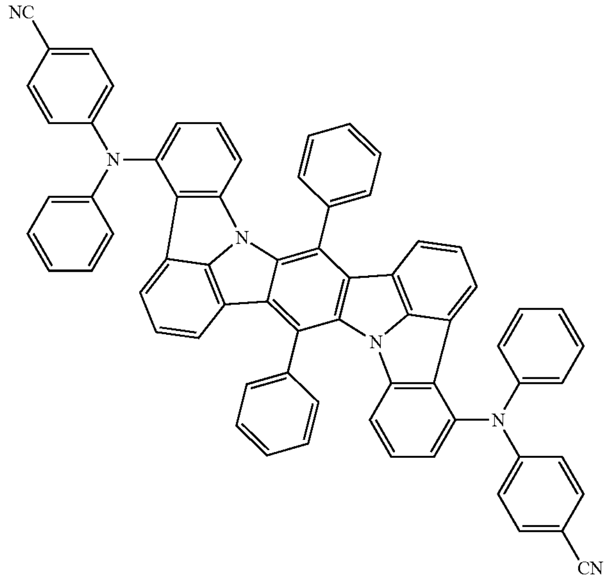
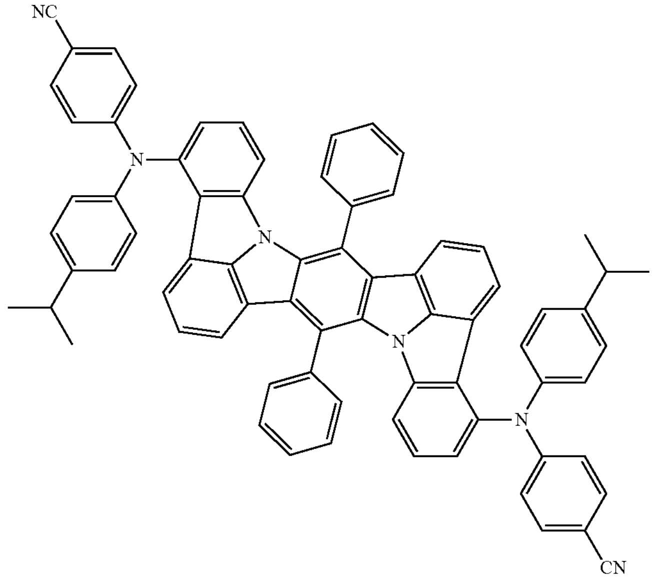
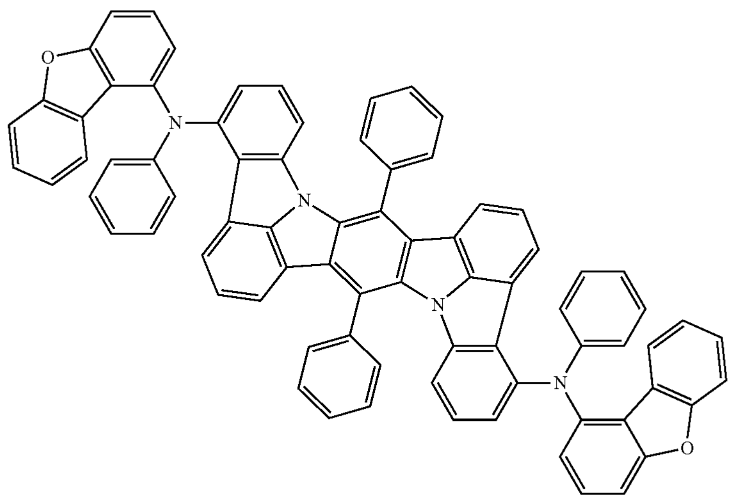

-continued
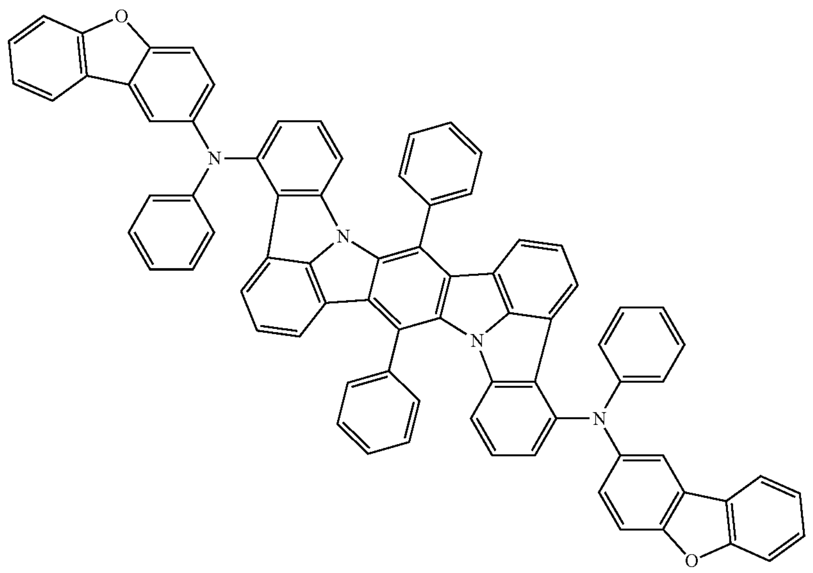
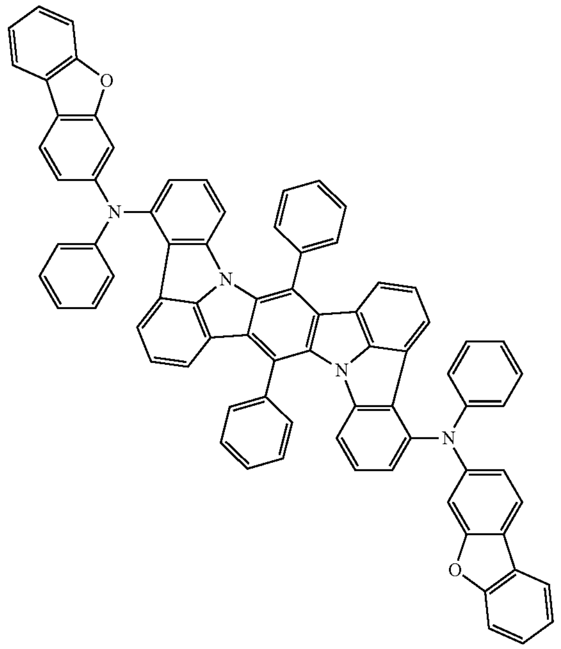
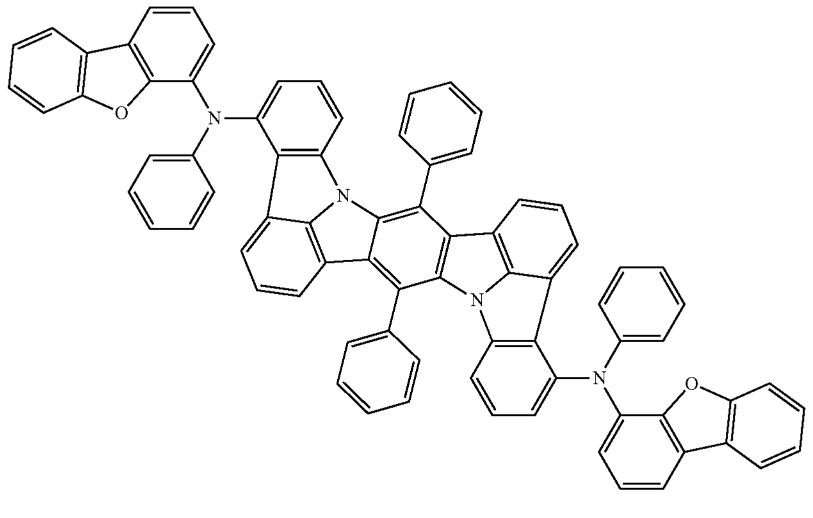

-continued
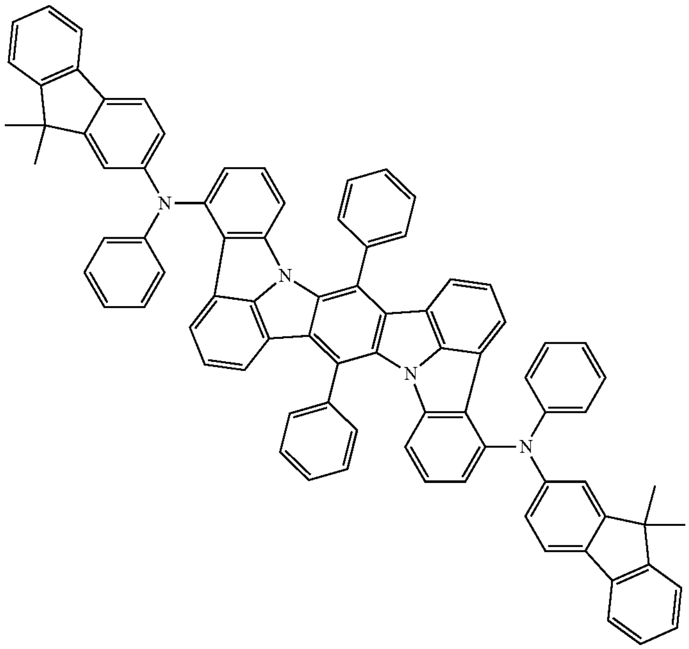
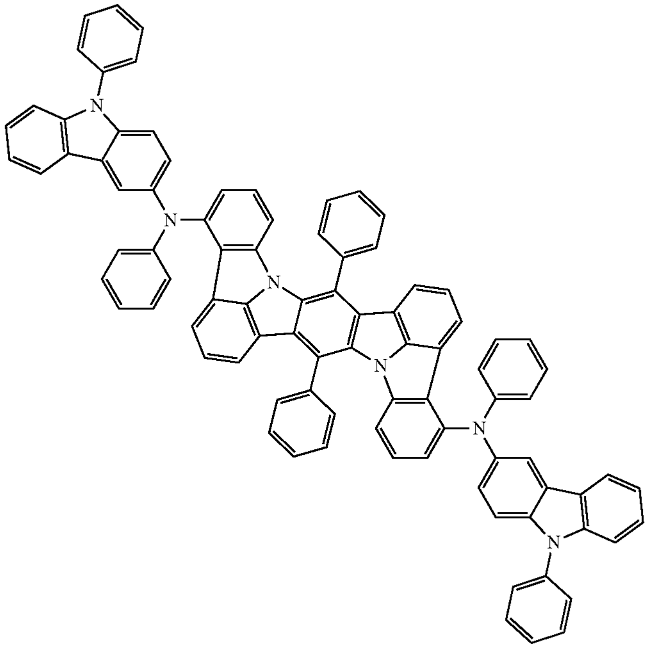

-continued
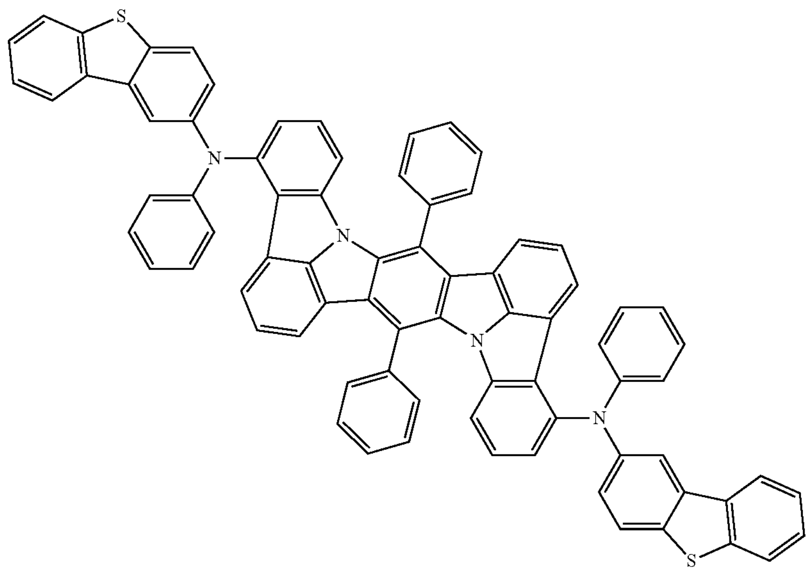
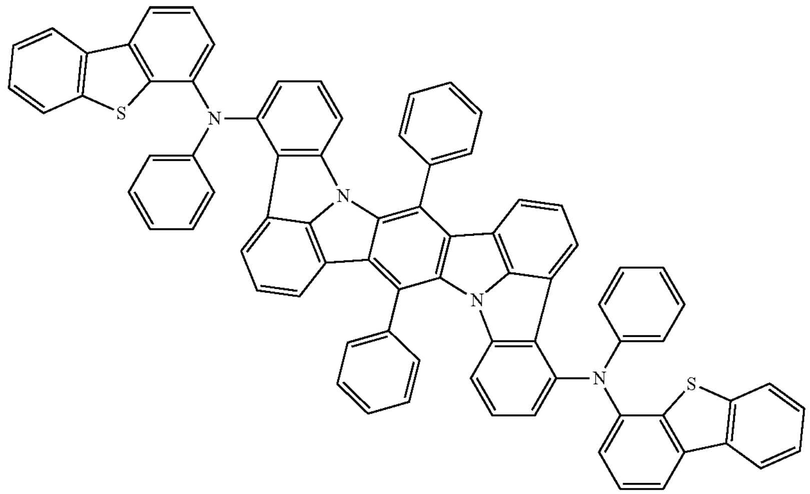
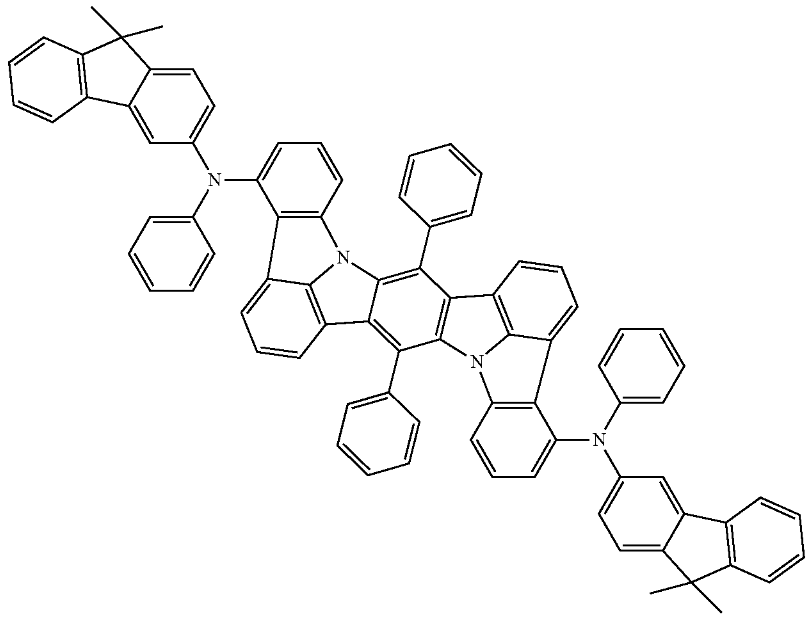

-continued
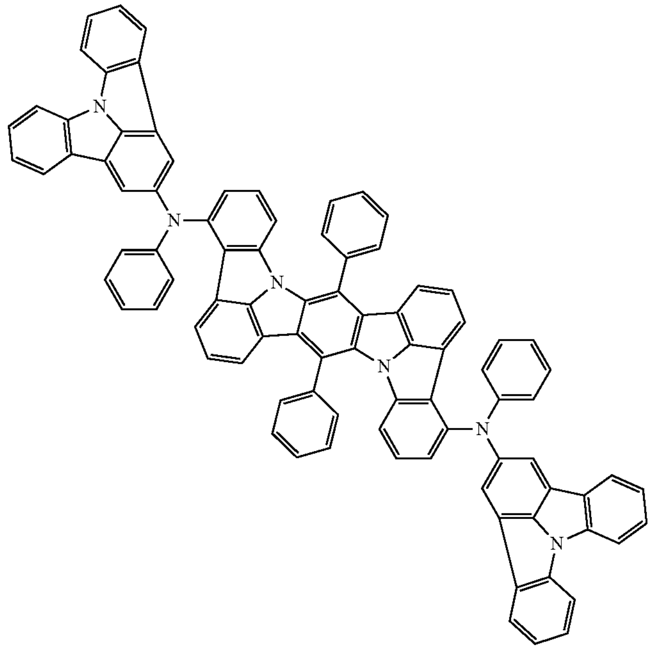
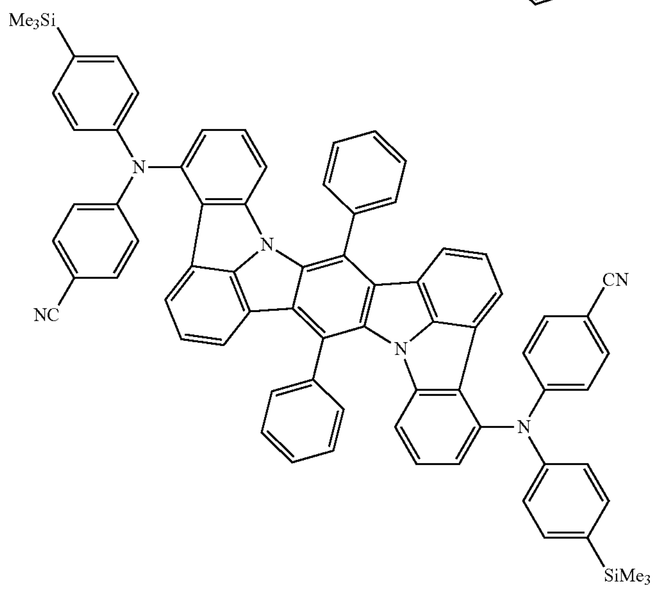
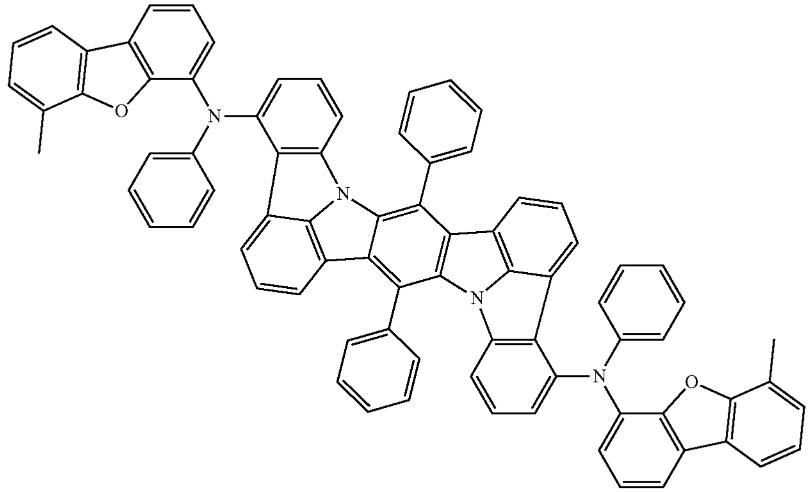

-continued
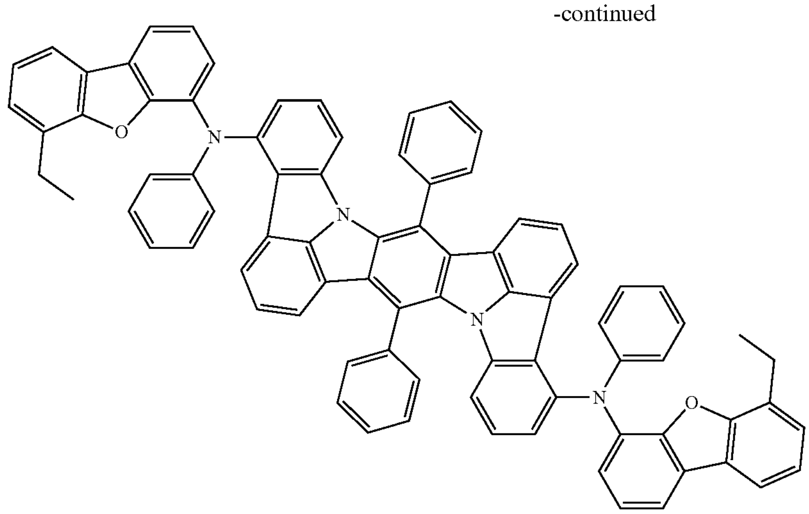
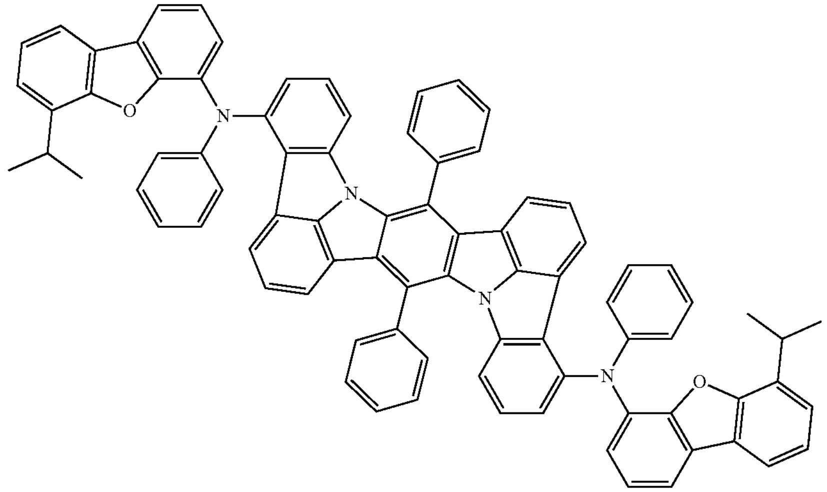
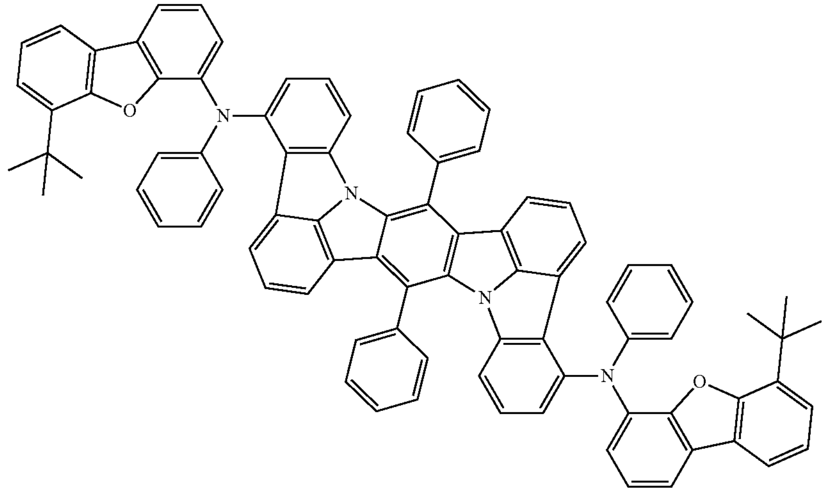

-continued
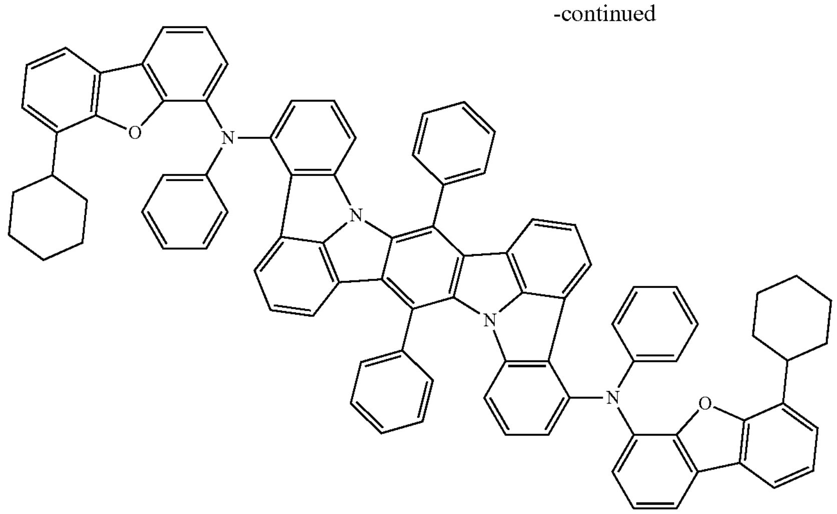
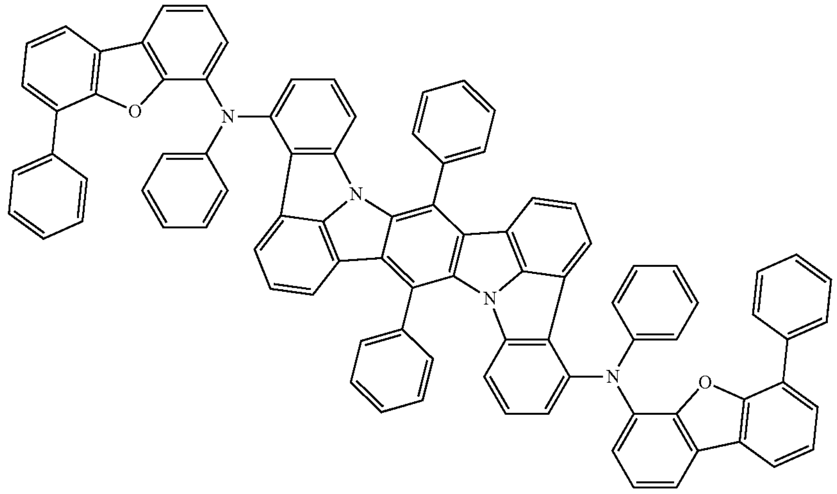
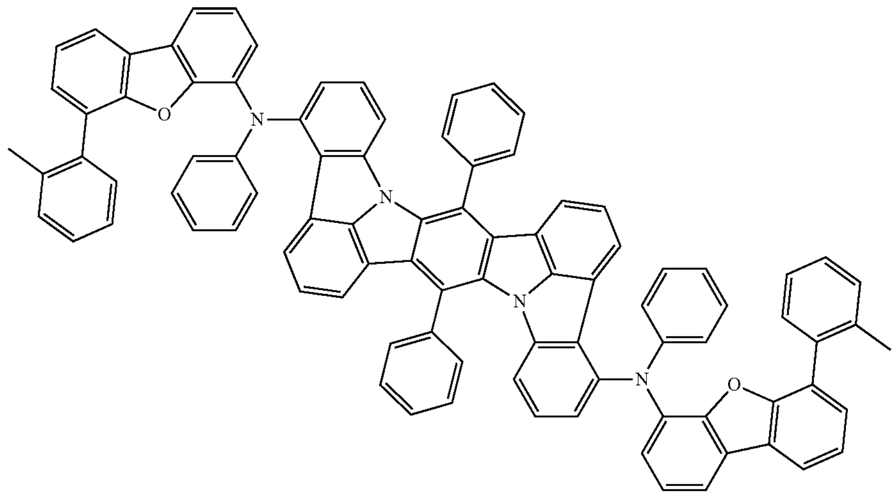

-continued
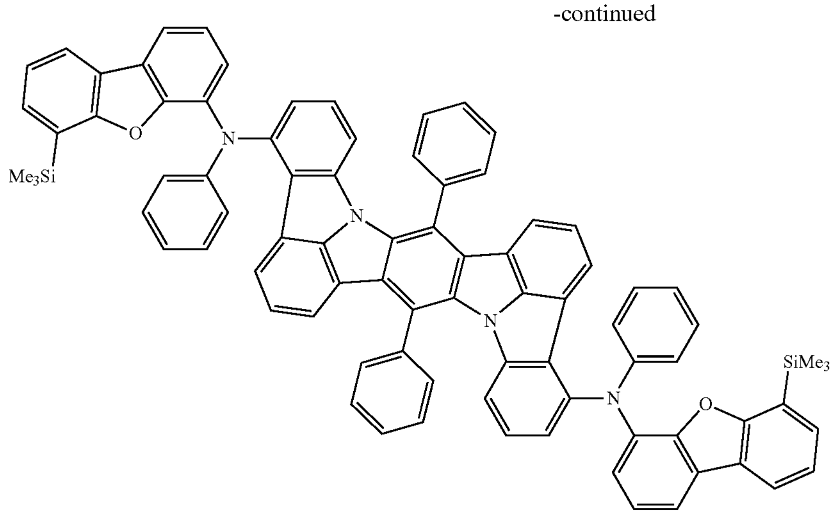
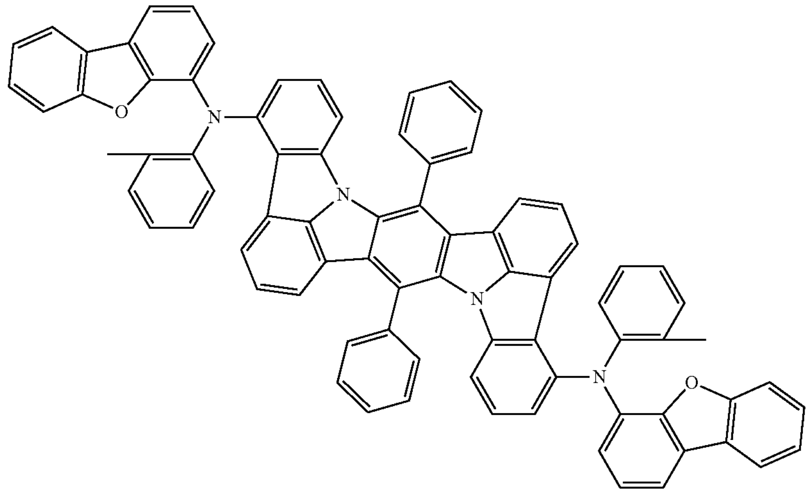
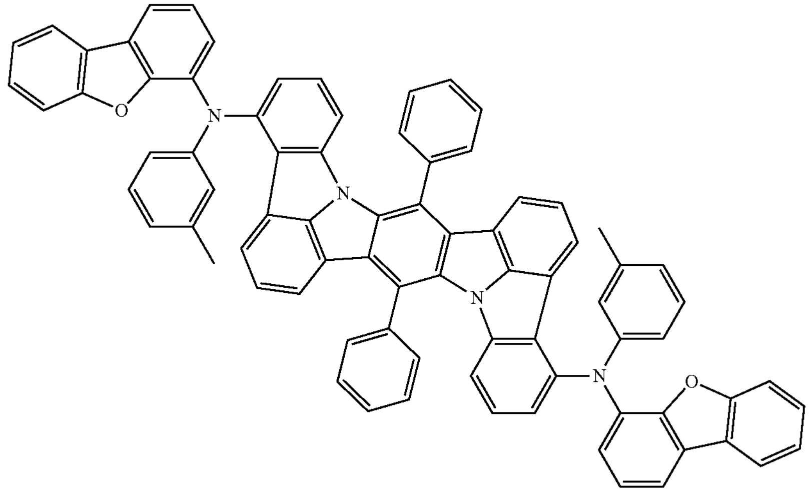

-continued
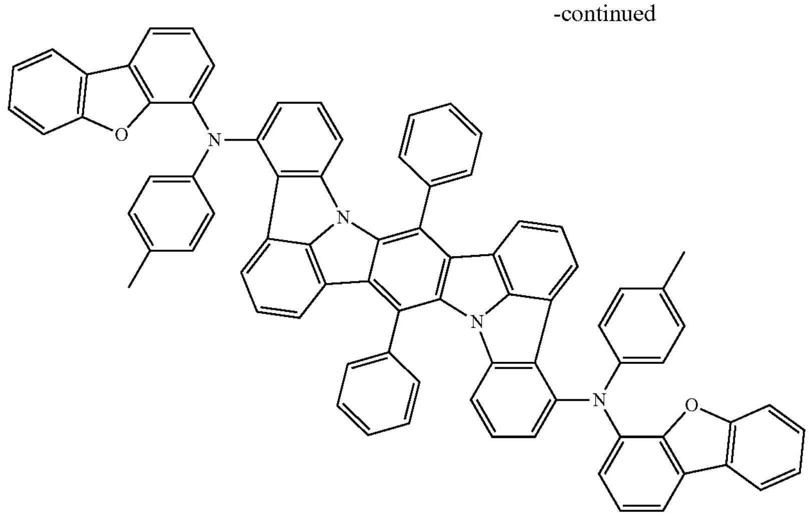
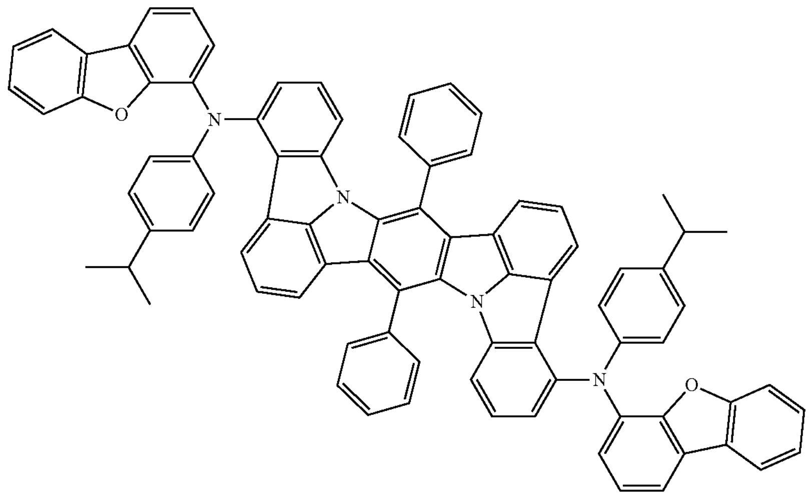
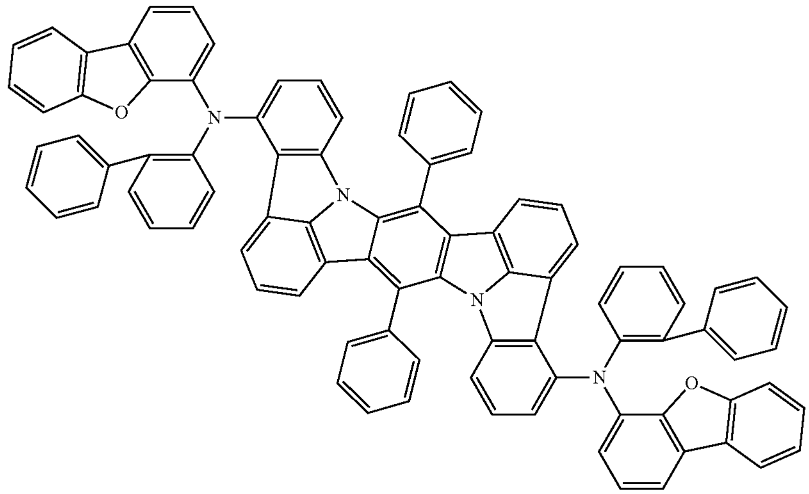

-continued
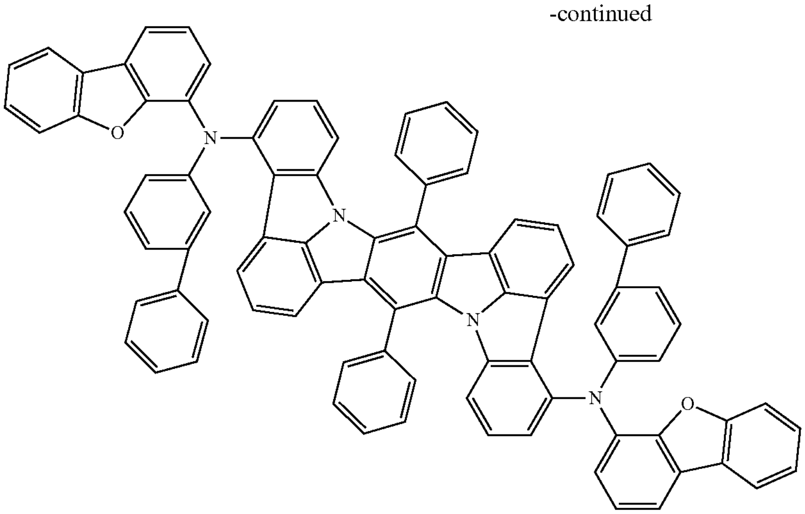
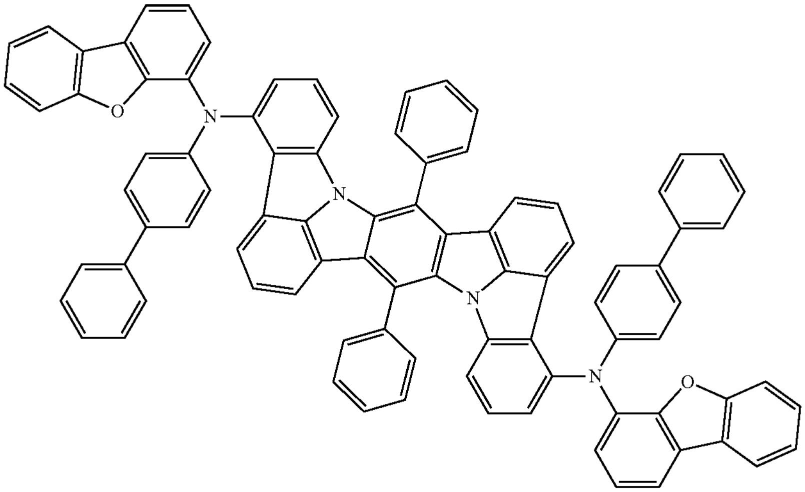
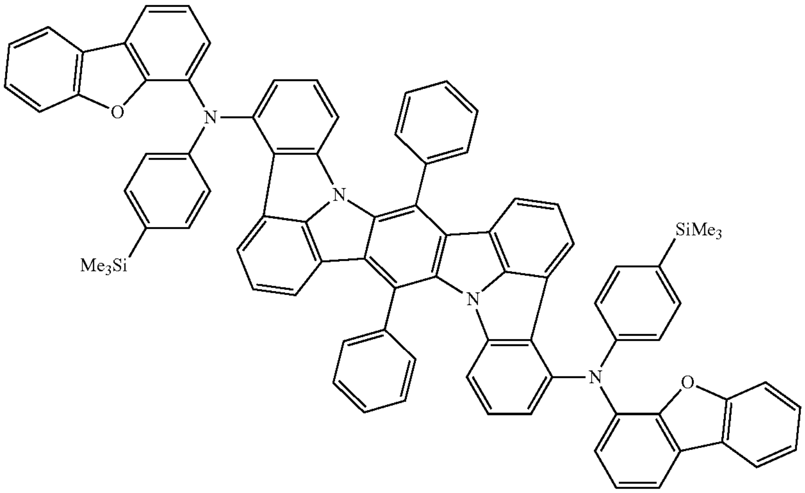

-continued
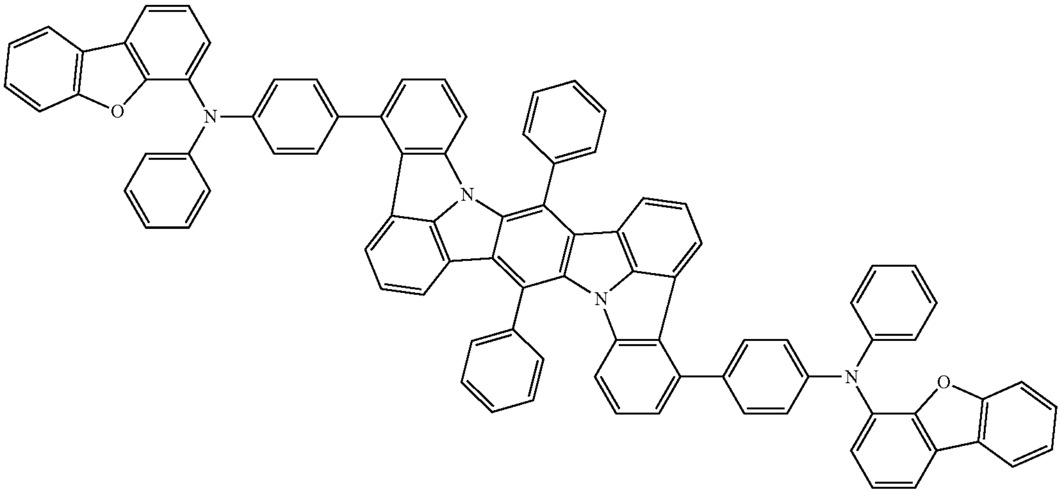
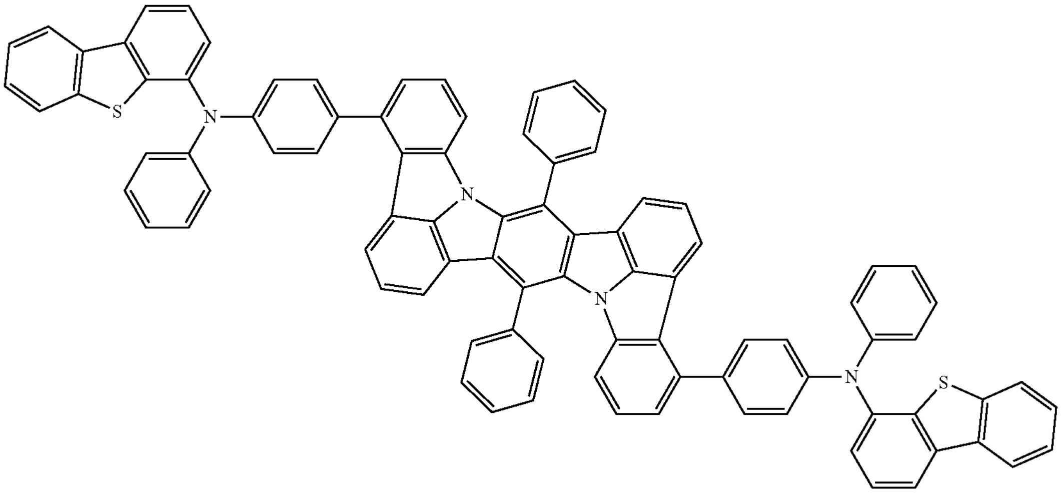 [SMILES: Cc1ccc2c(oc3ccccc32)c1N(c1ccccc1)c1ccc(-c2cccc3c2c2cccc4c5c(-c6ccccc6)c6c(c(-c7ccccc7)c5n3c24)c2cccc3c4c(-c5ccc(N(c7ccccc7)c7c(C)ccc8c7oc7ccccc78)cc5)cccc4n6c32)cc1]
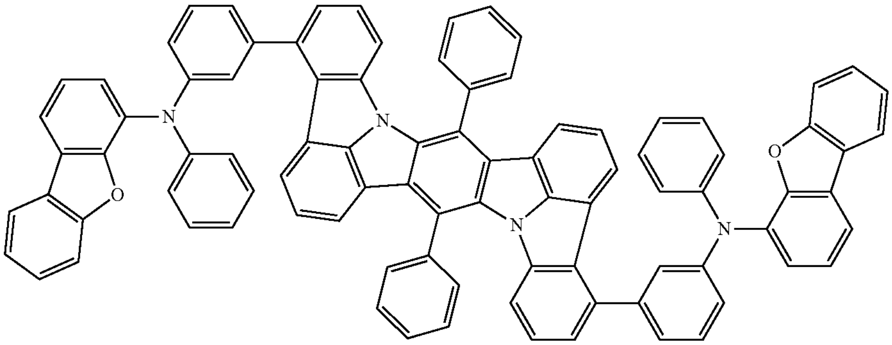
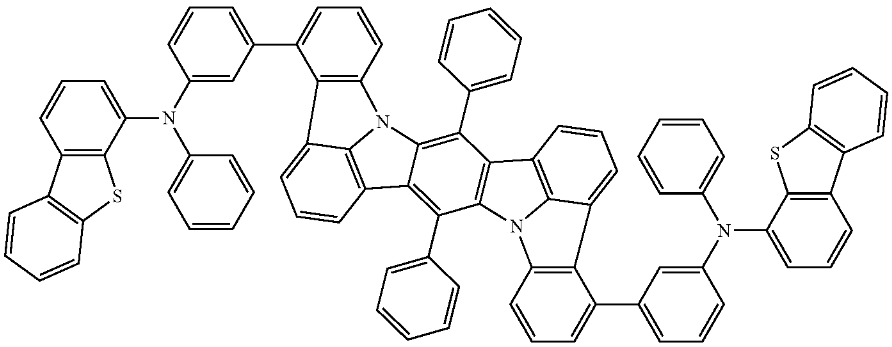

-continued
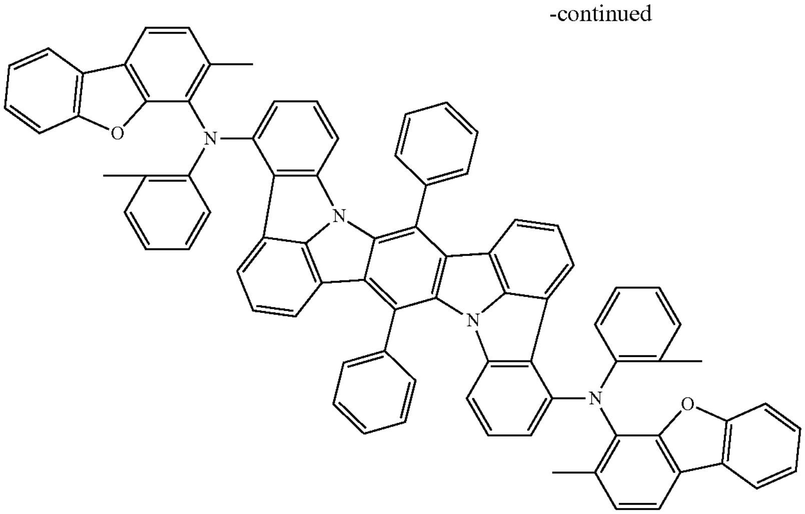
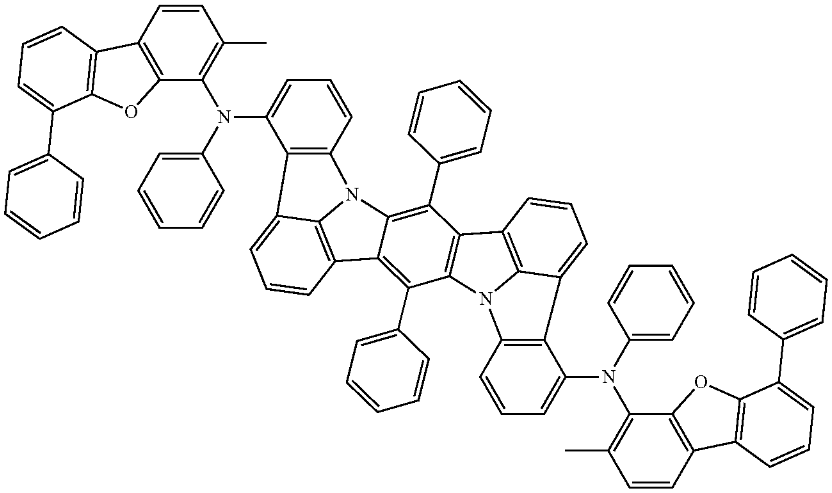
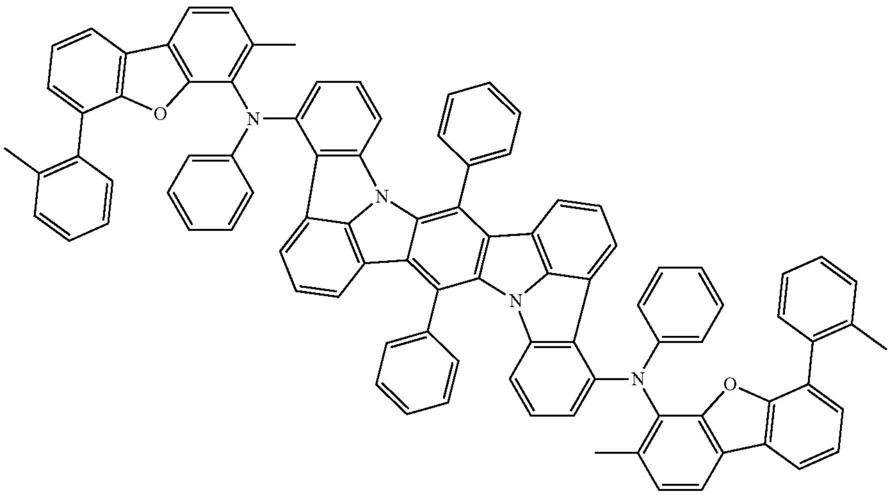

-continued
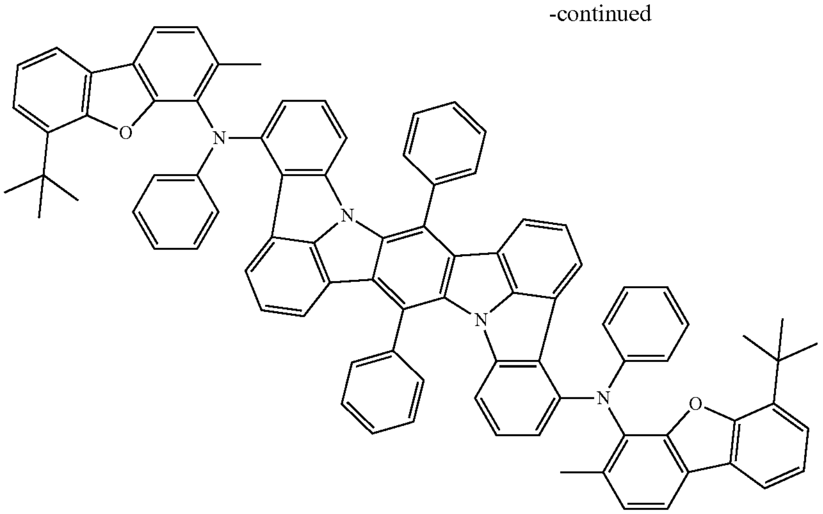
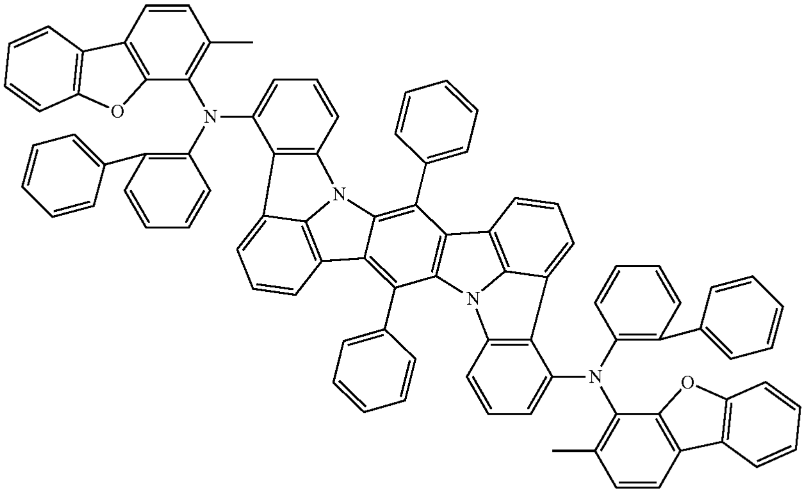
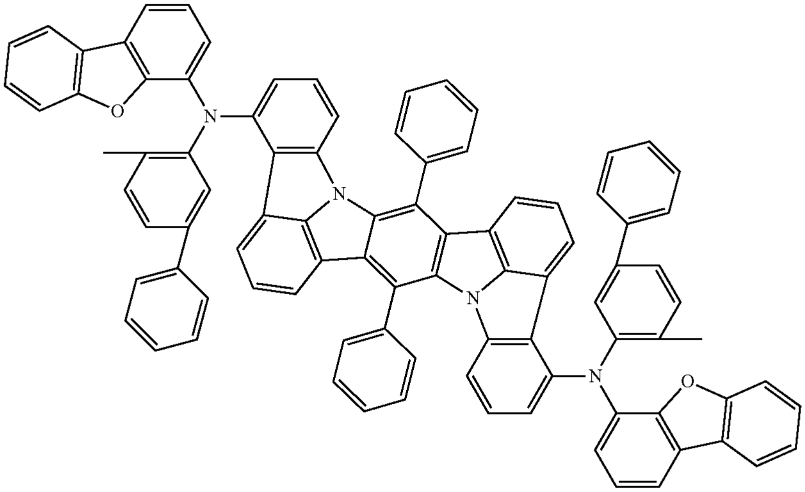

-continued
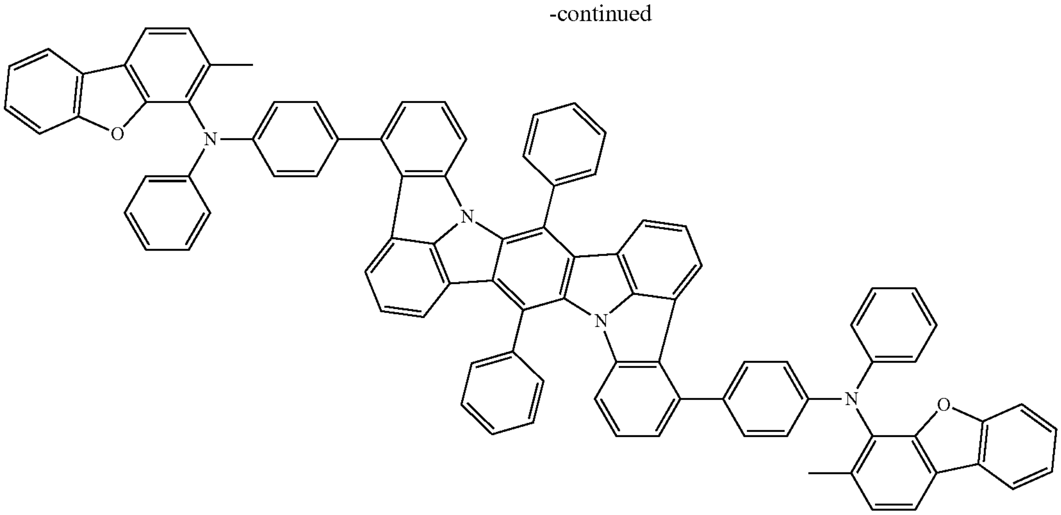
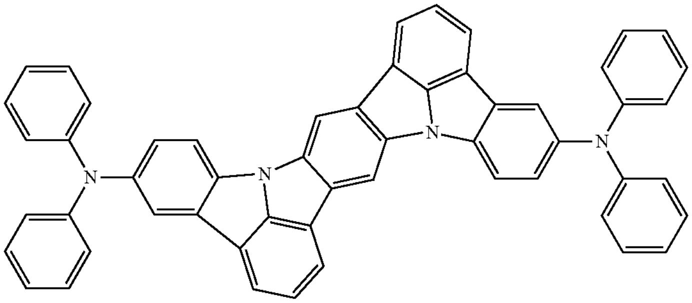
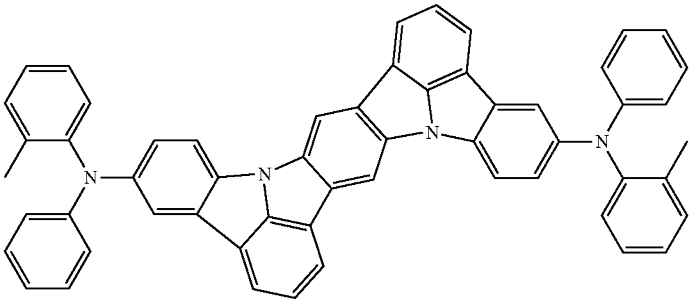
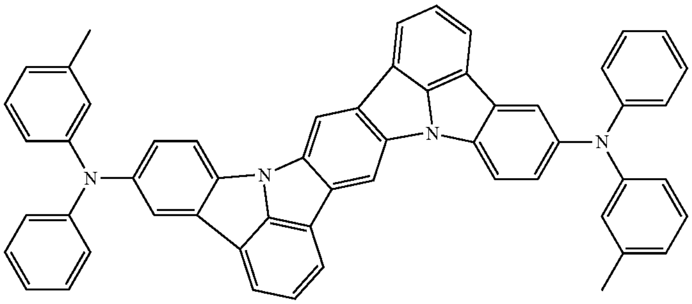

-continued
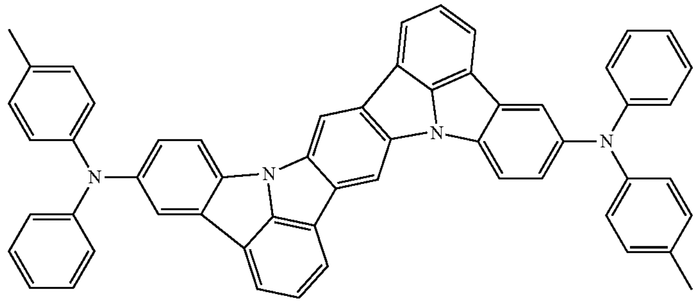
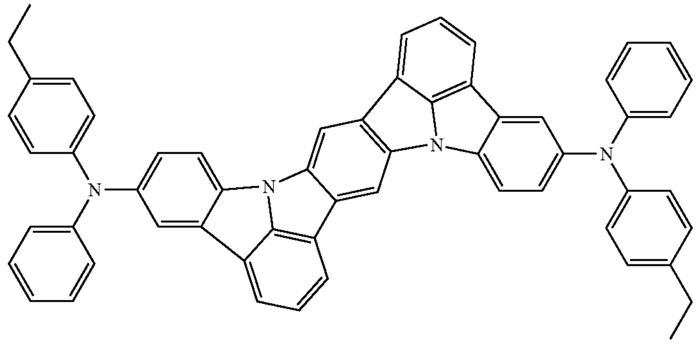
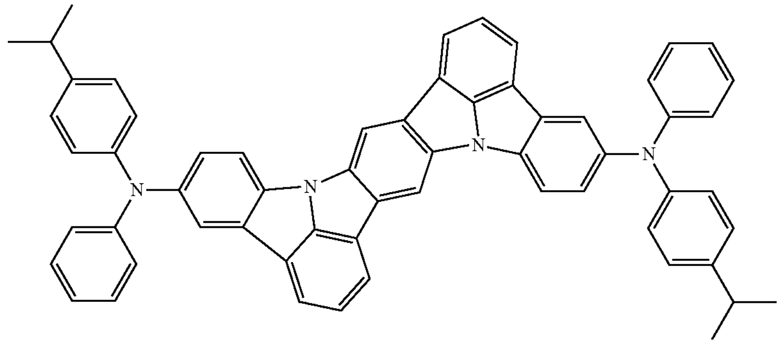
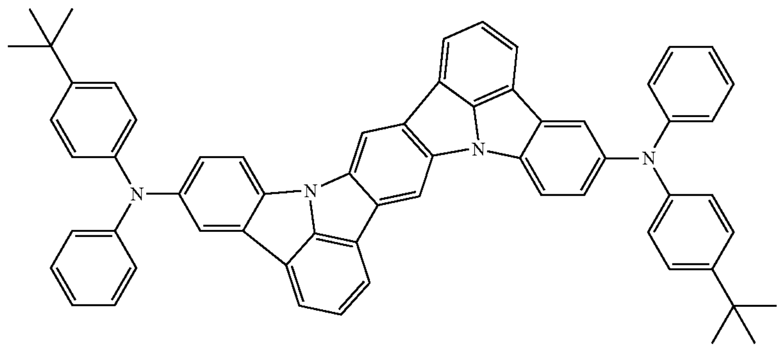

-continued
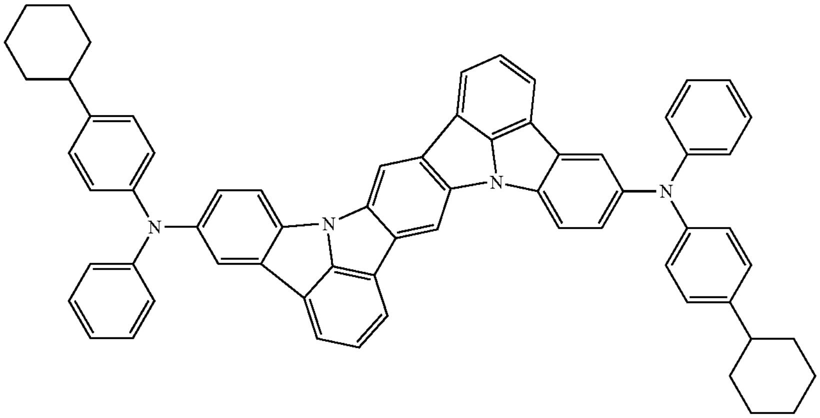
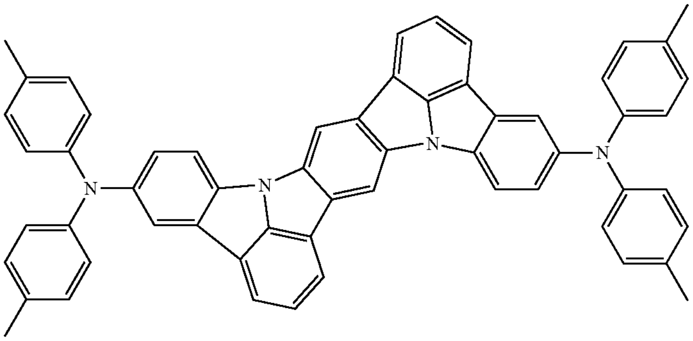
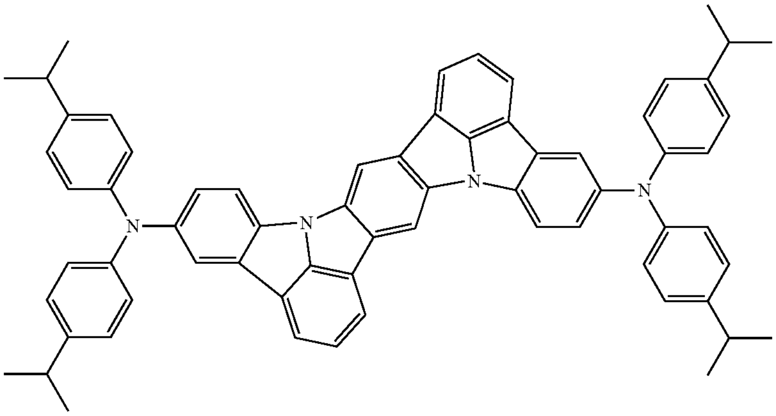
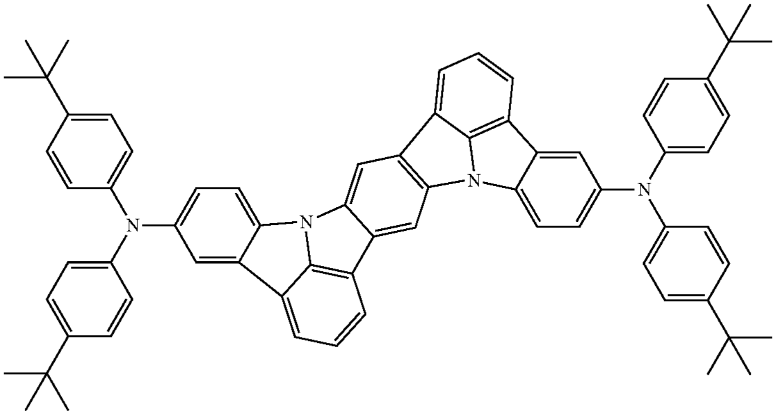

-continued
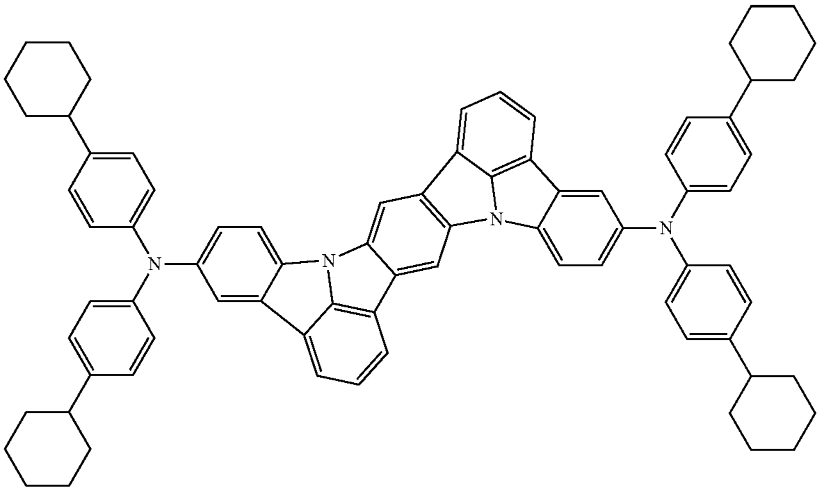
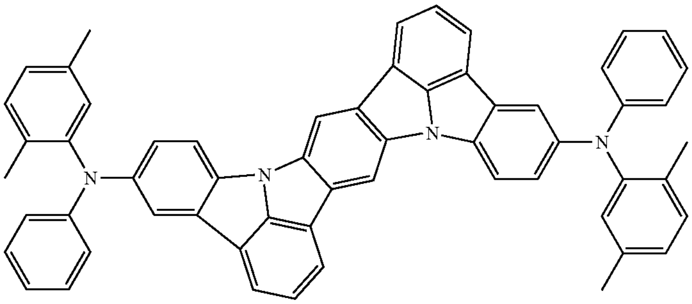
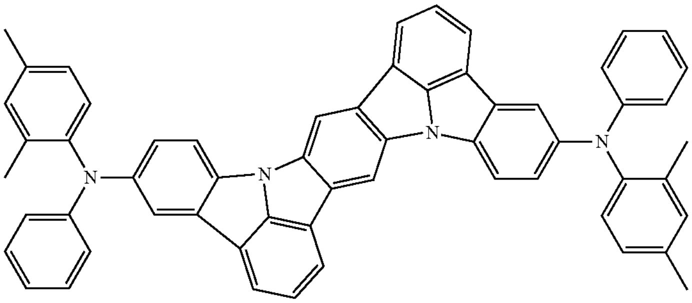
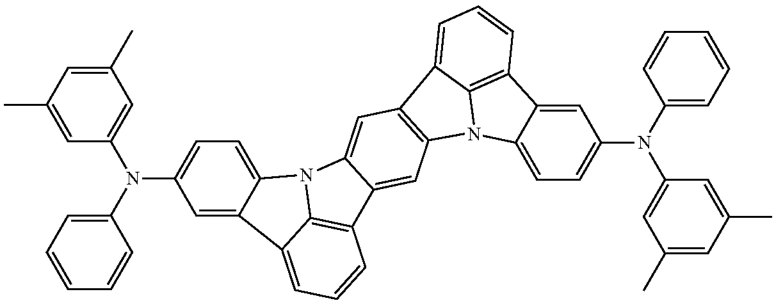
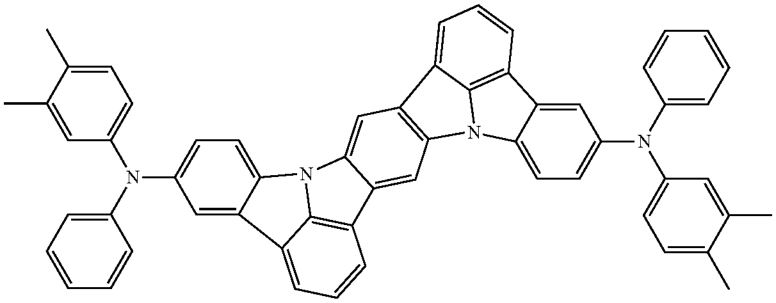

-continued
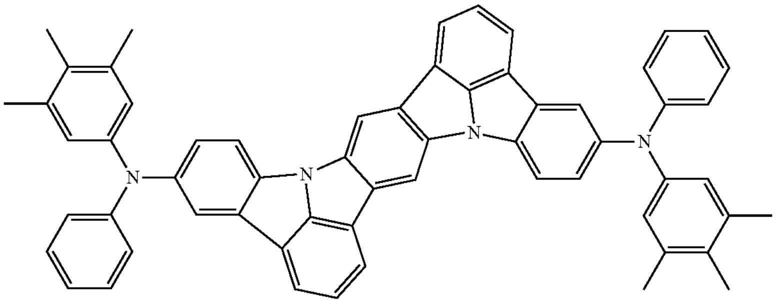
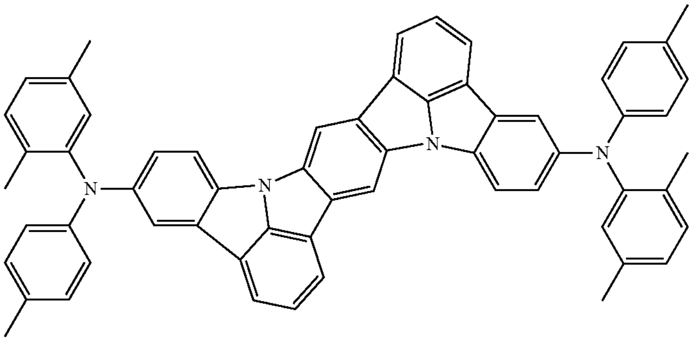
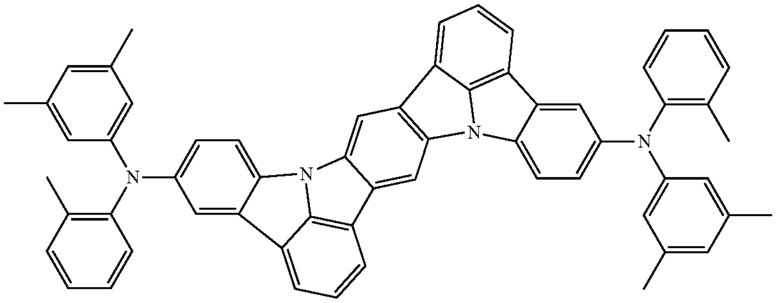
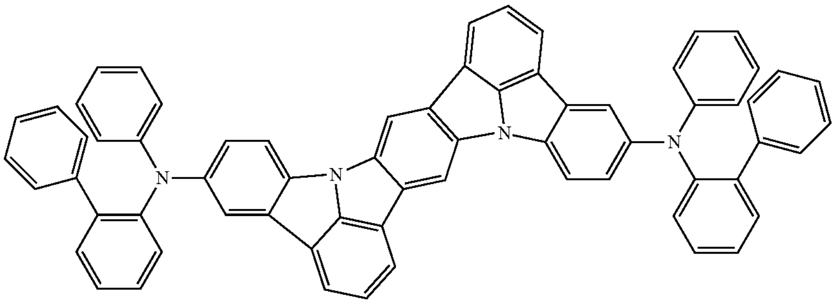
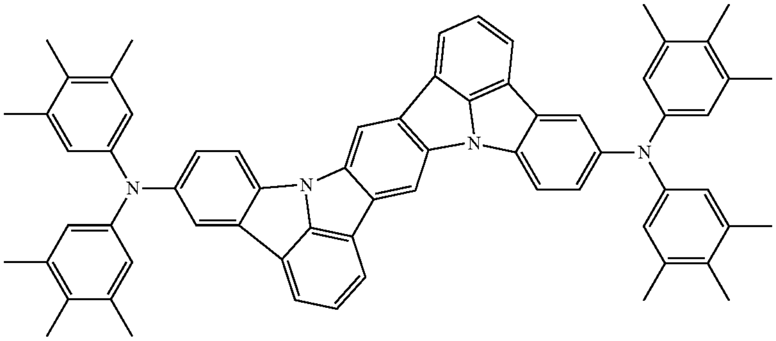

-continued
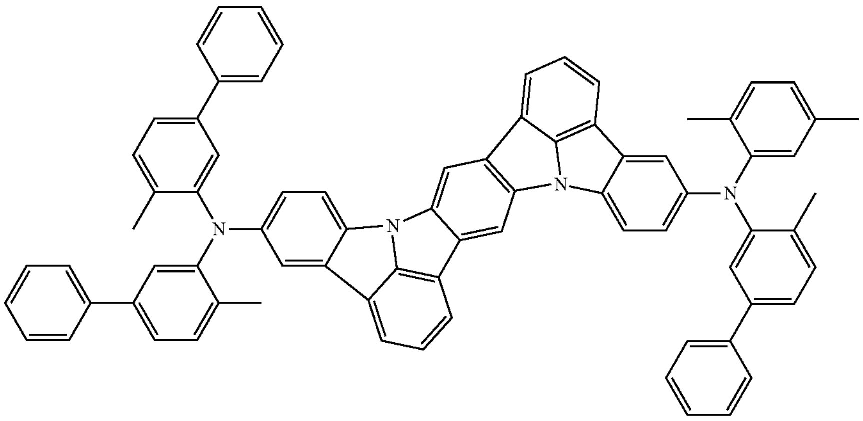
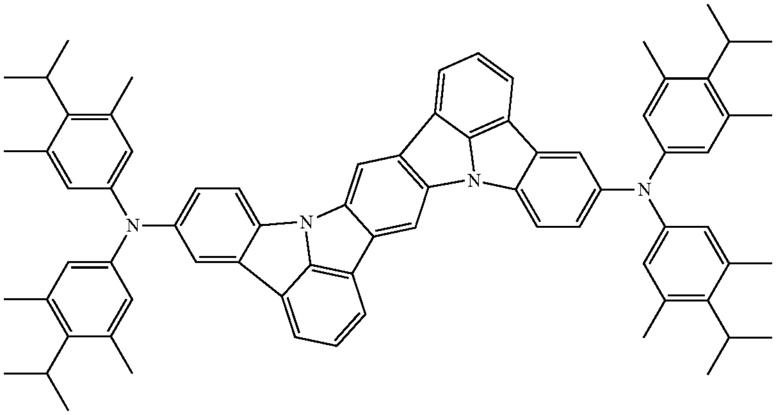
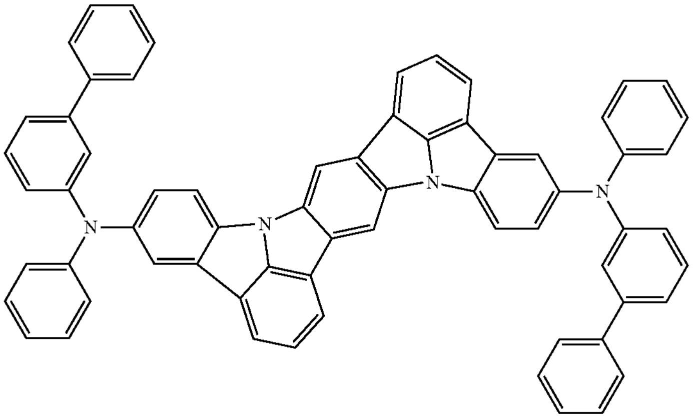

-continued
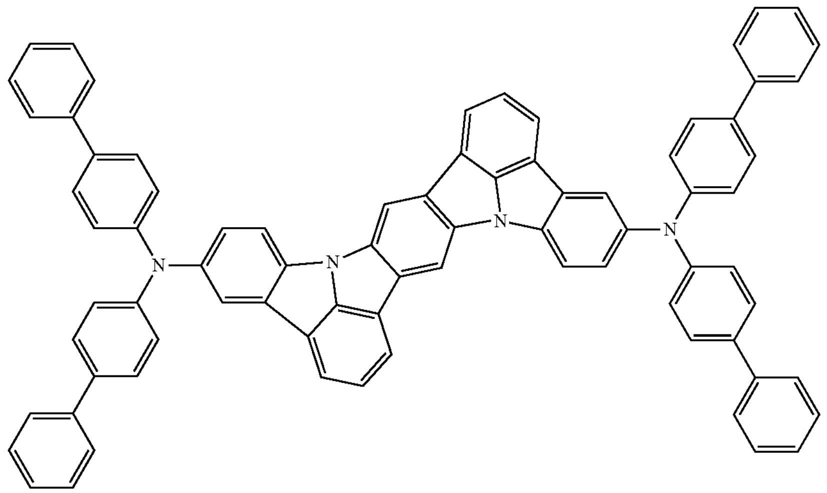
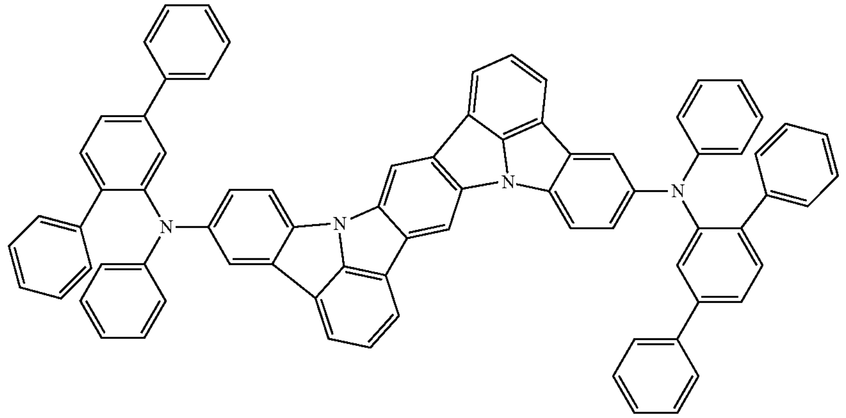
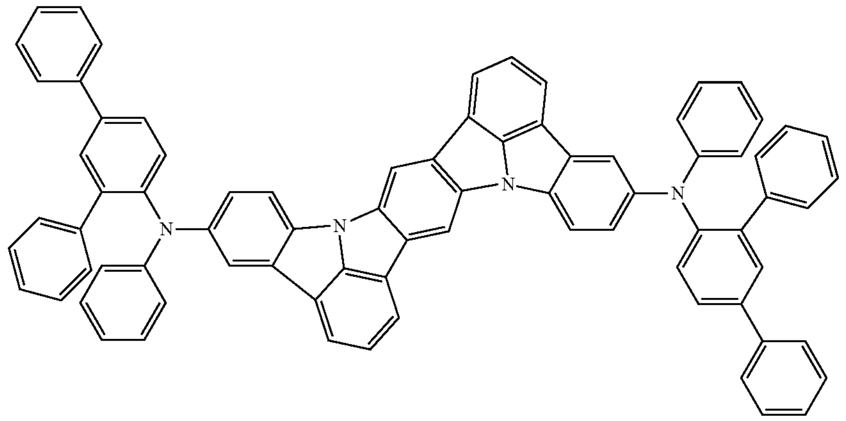
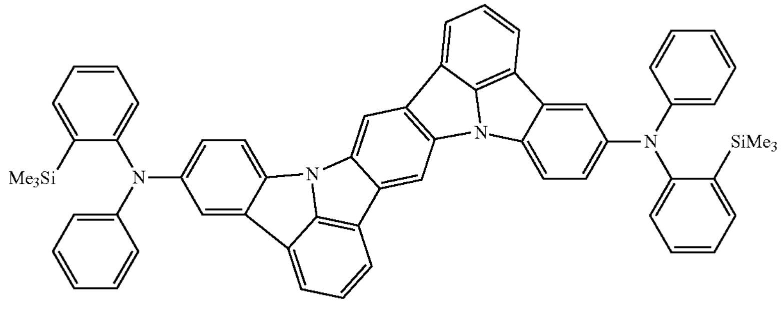

-continued
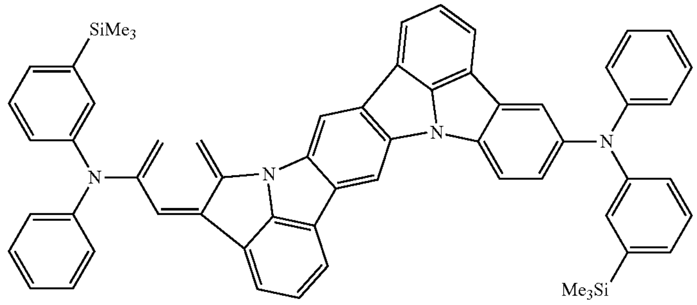
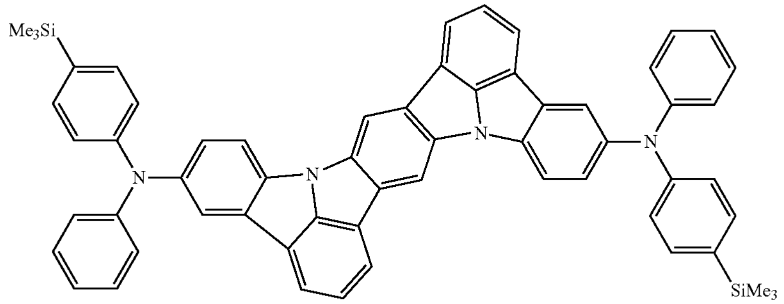
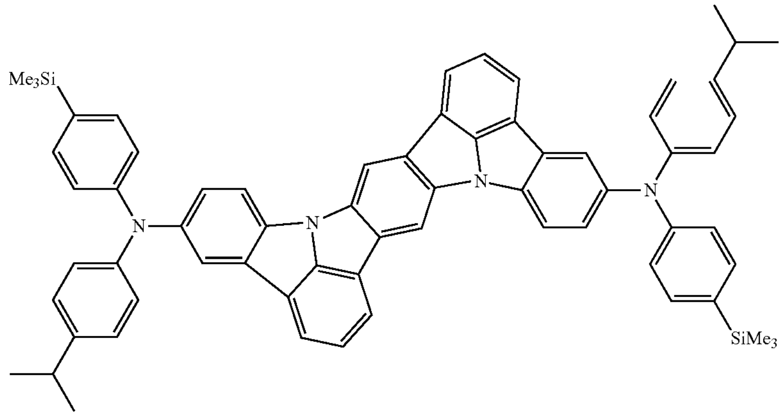
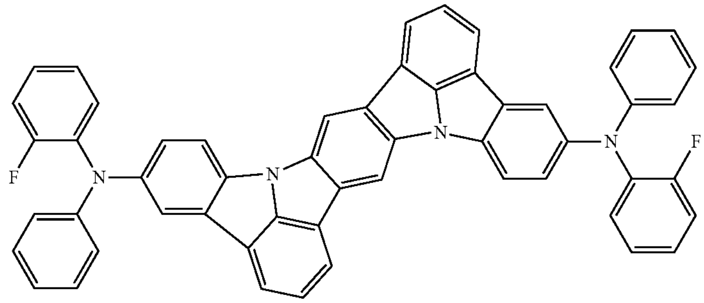
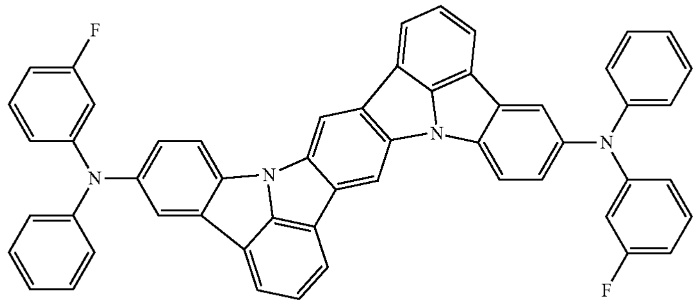

-continued
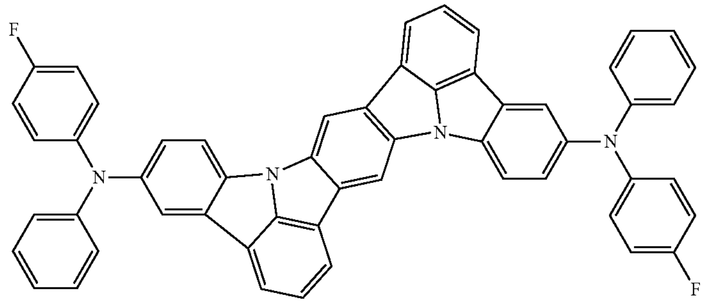
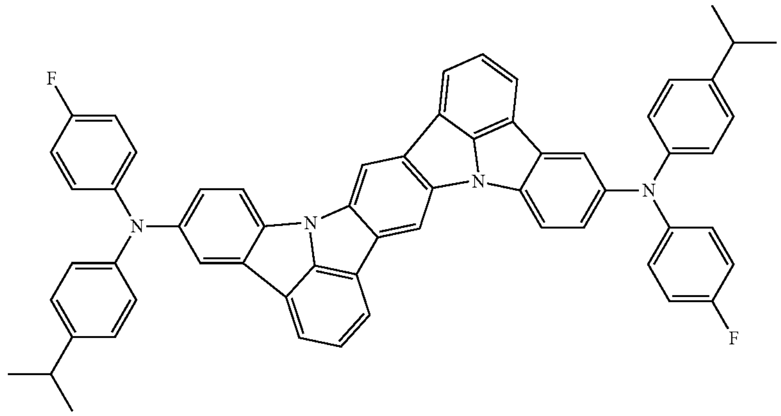
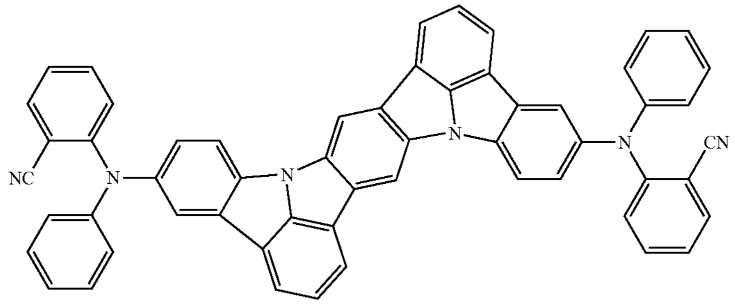
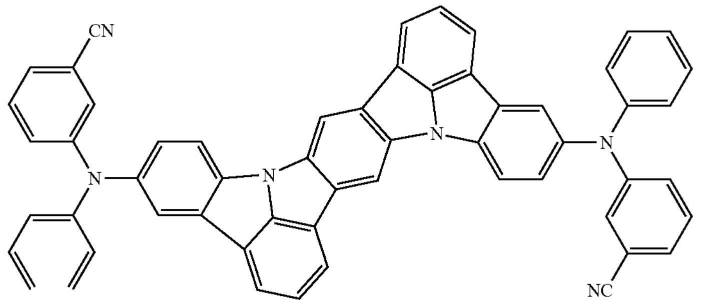
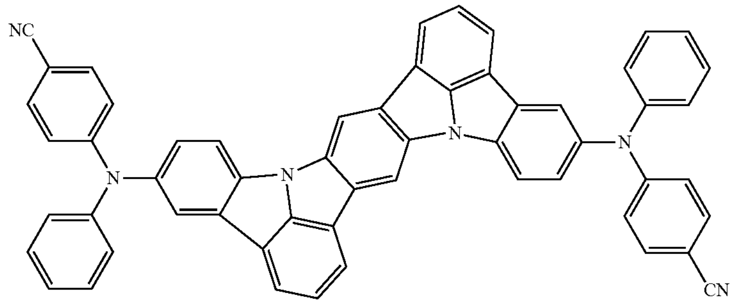

-continued
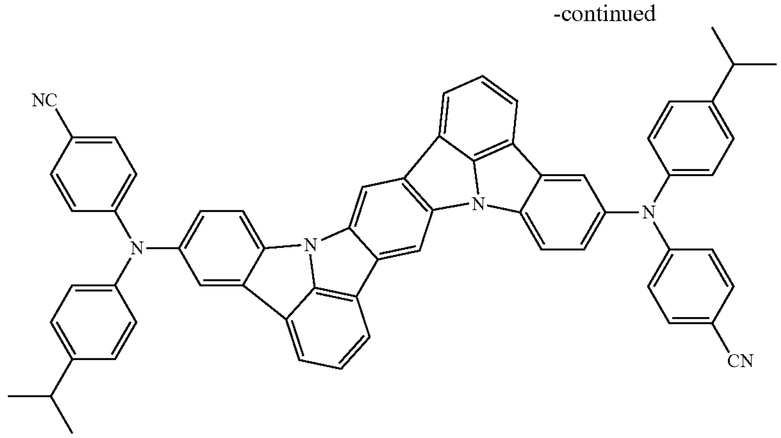
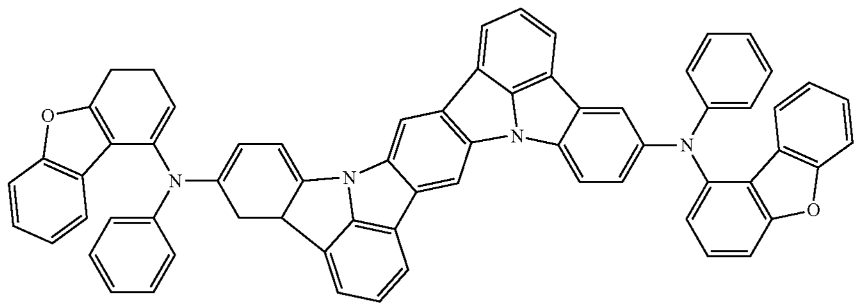
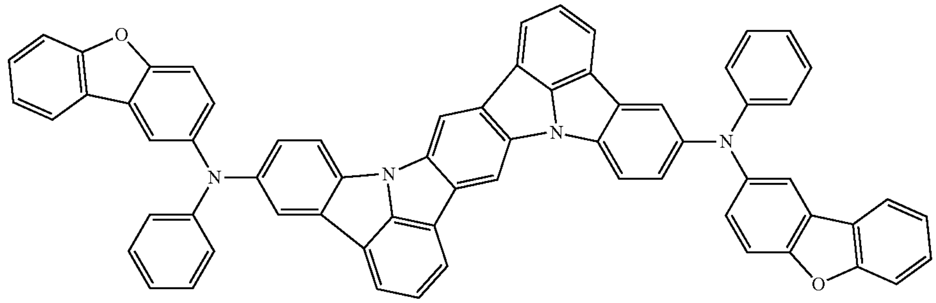
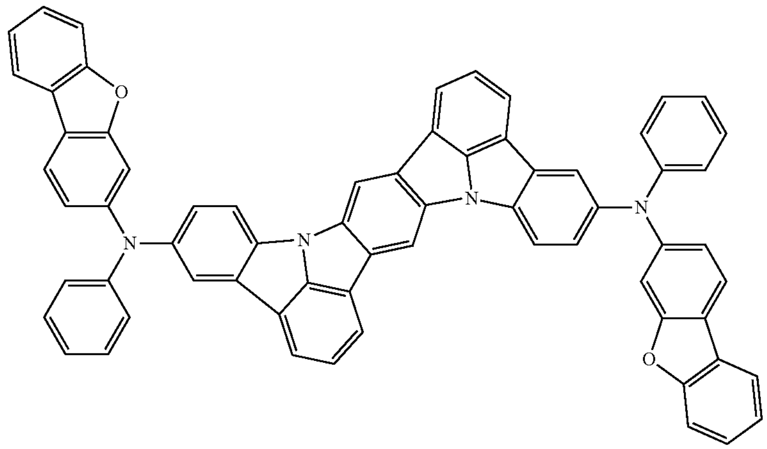

-continued
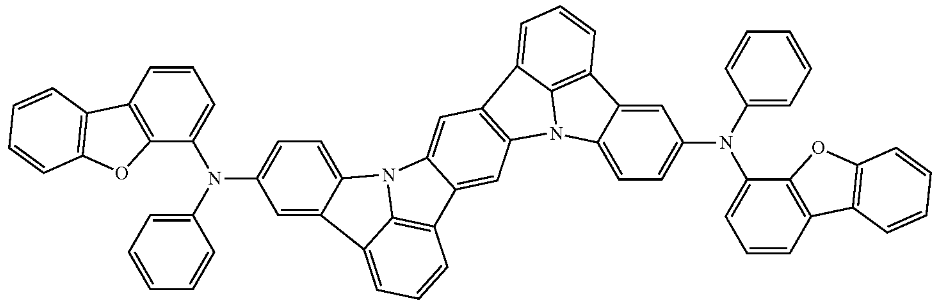
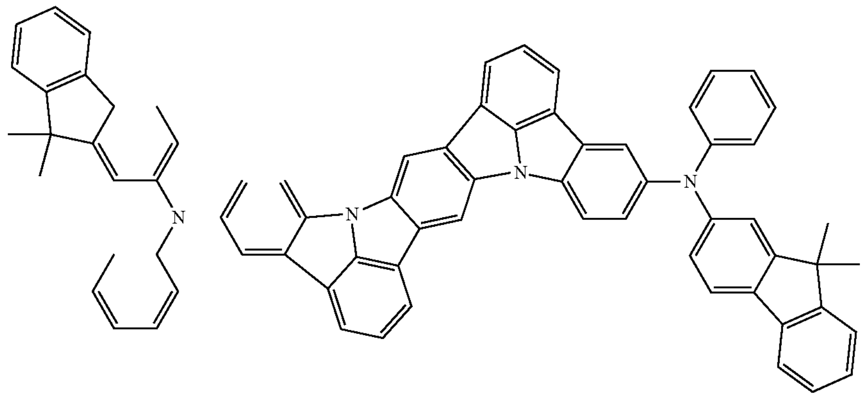
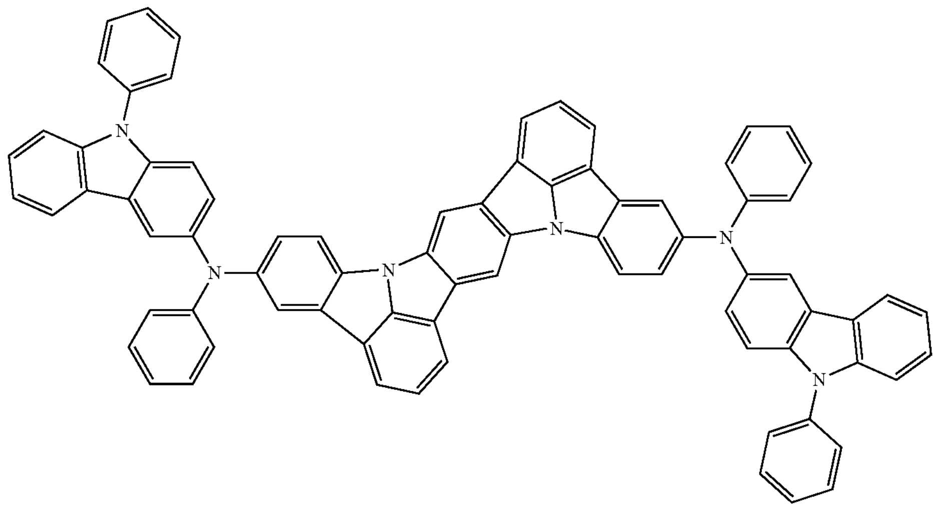
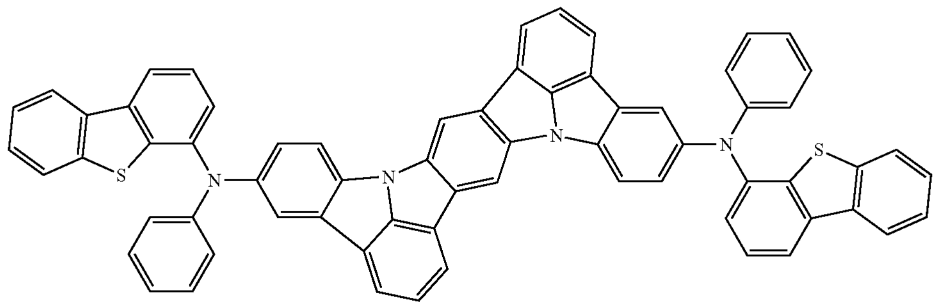

-continued
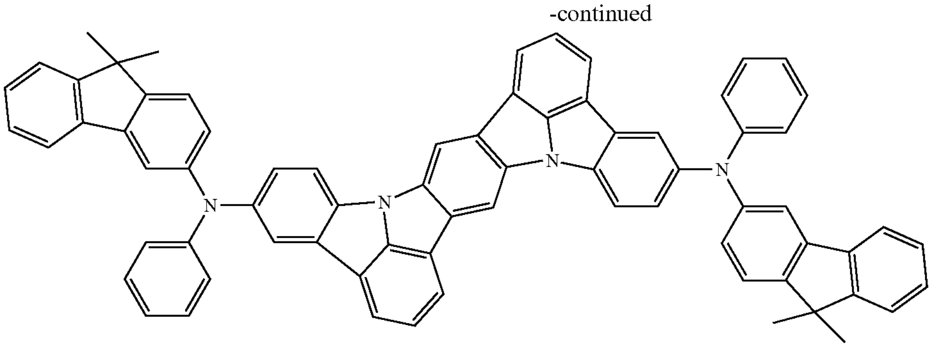
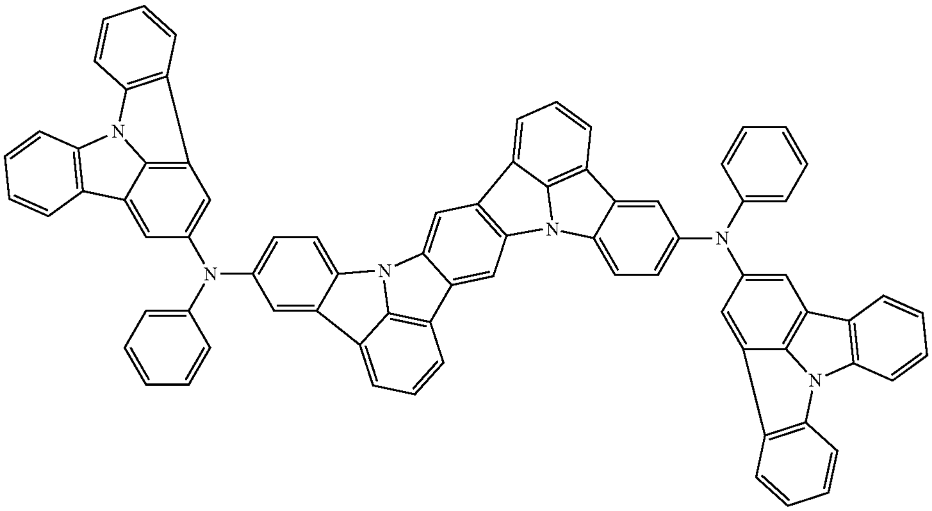
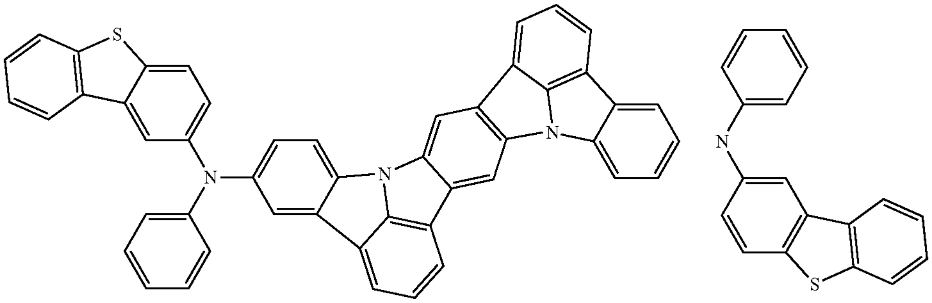
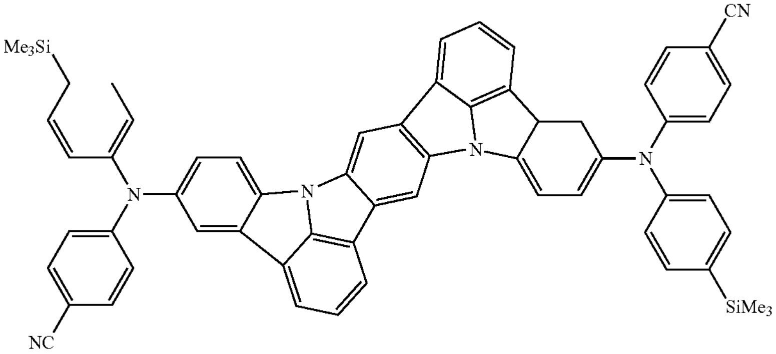

-continued
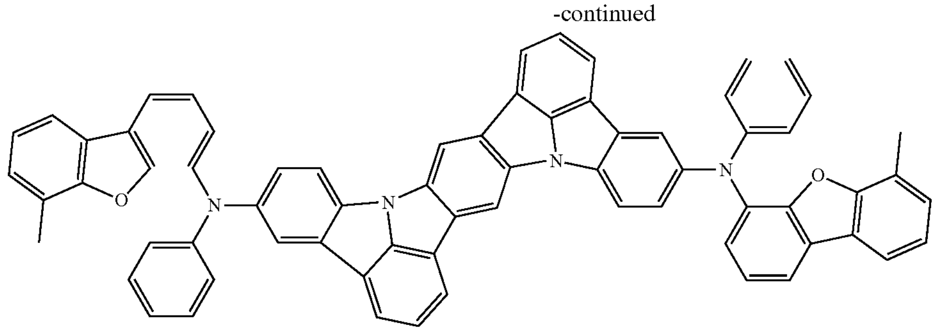
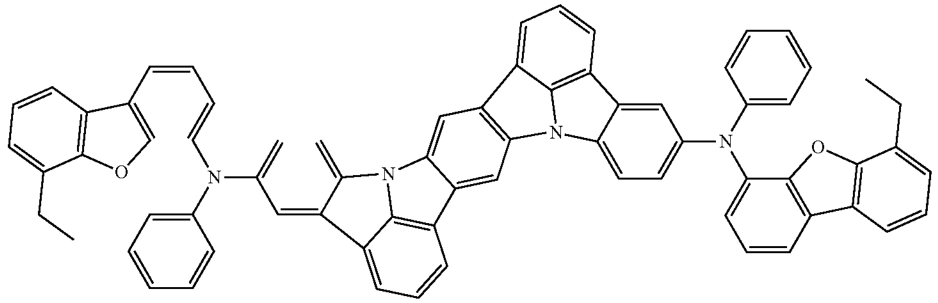
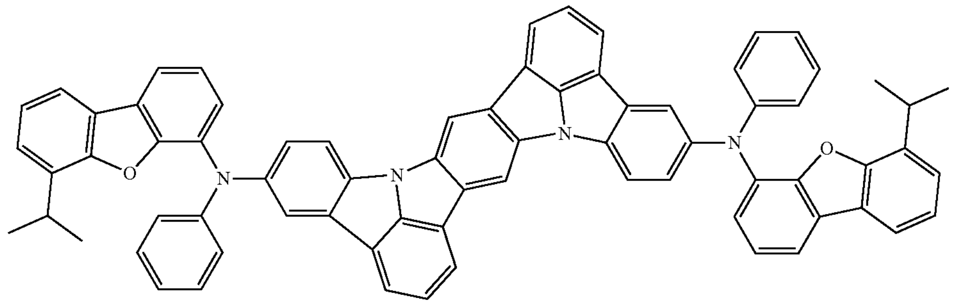
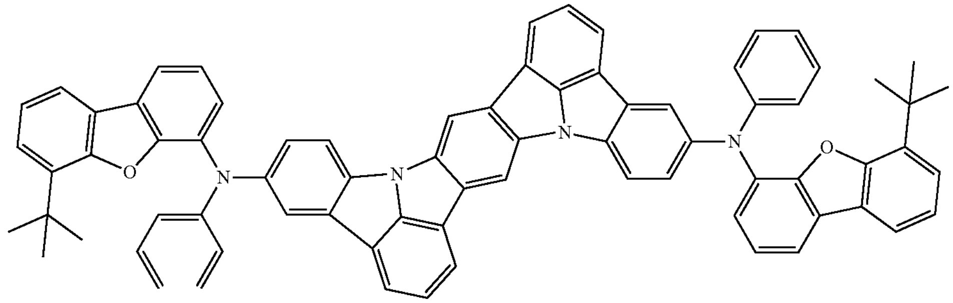
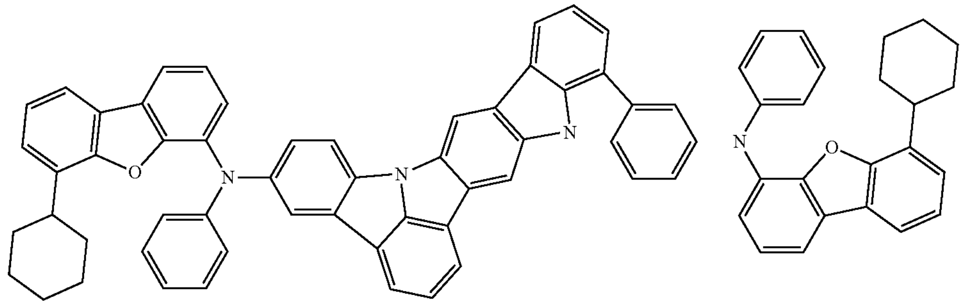

-continued
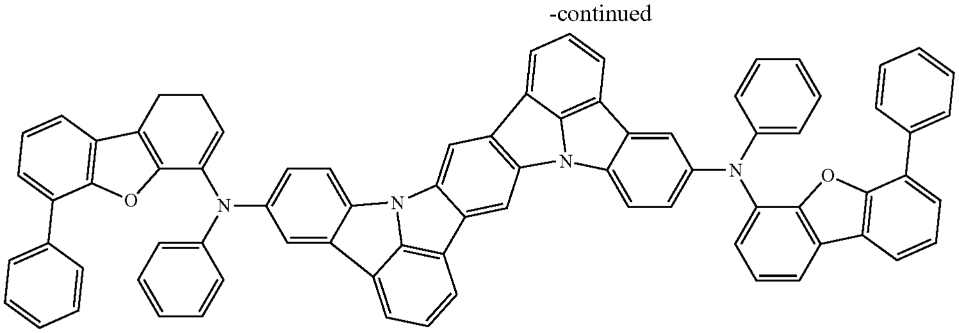
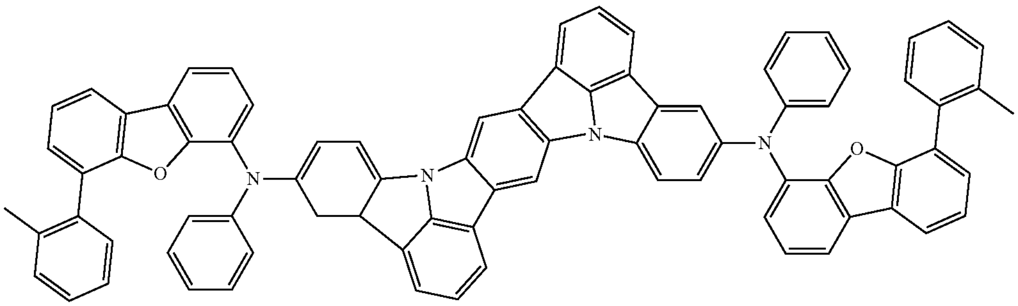
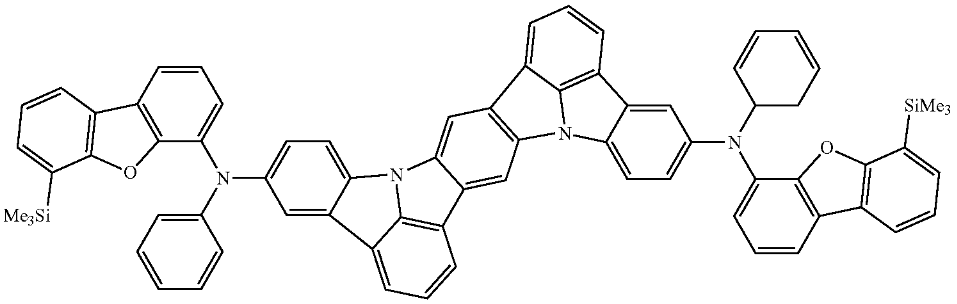
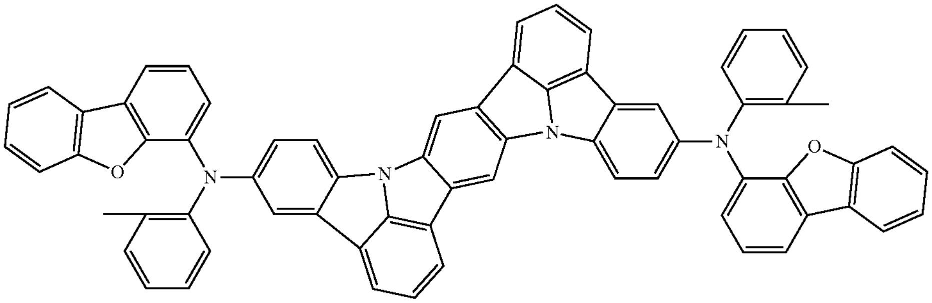
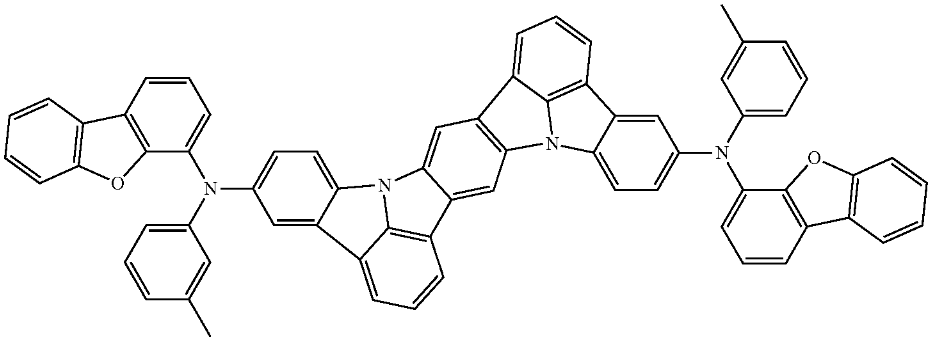

-continued
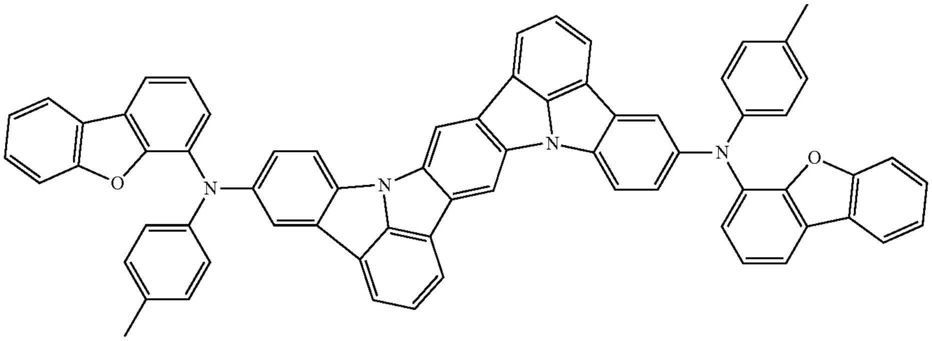
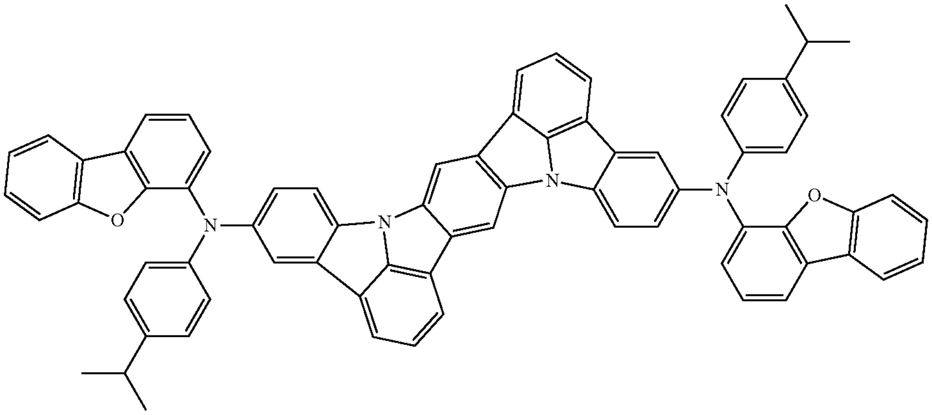
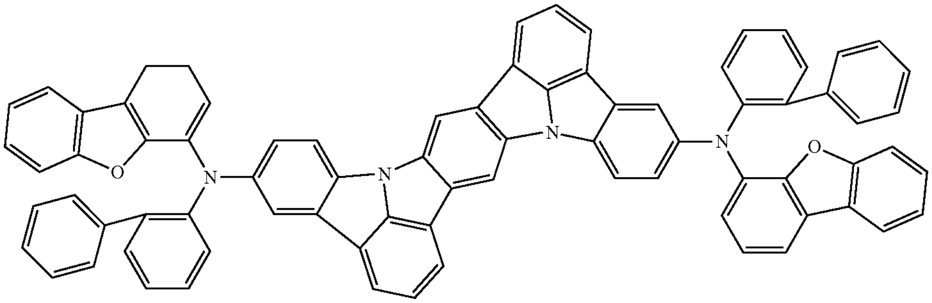
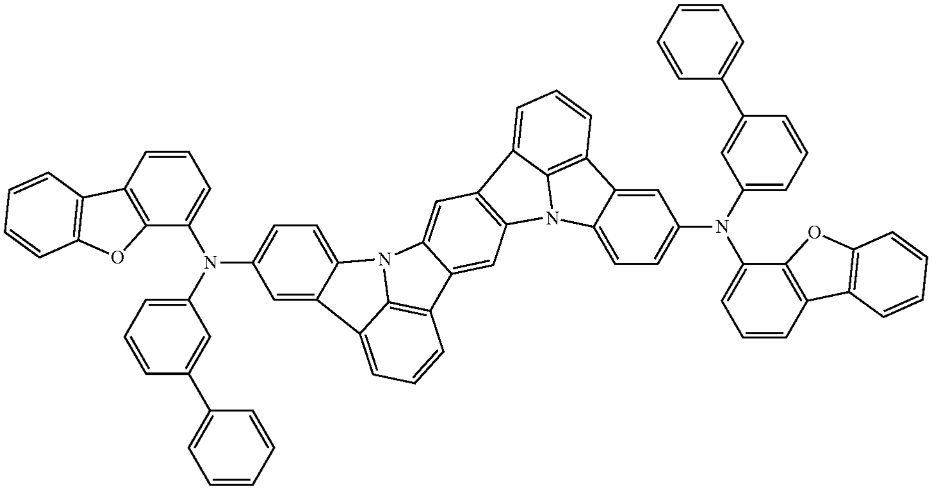

-continued
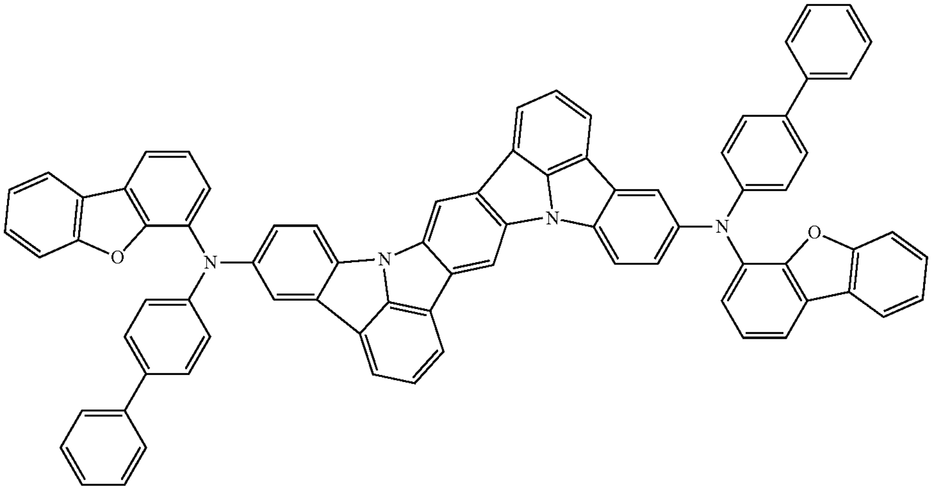
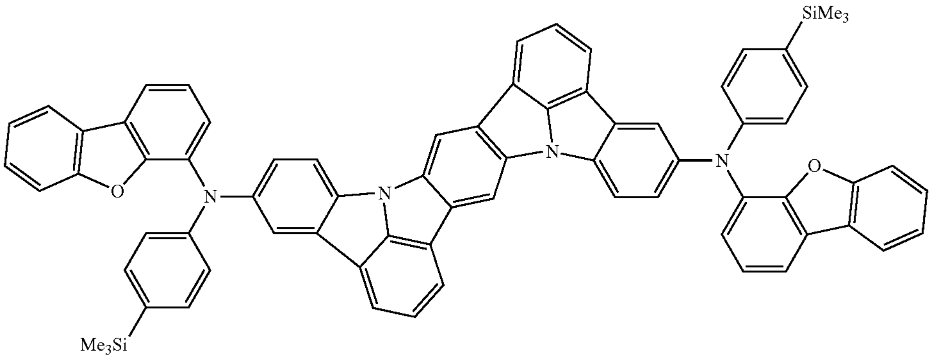
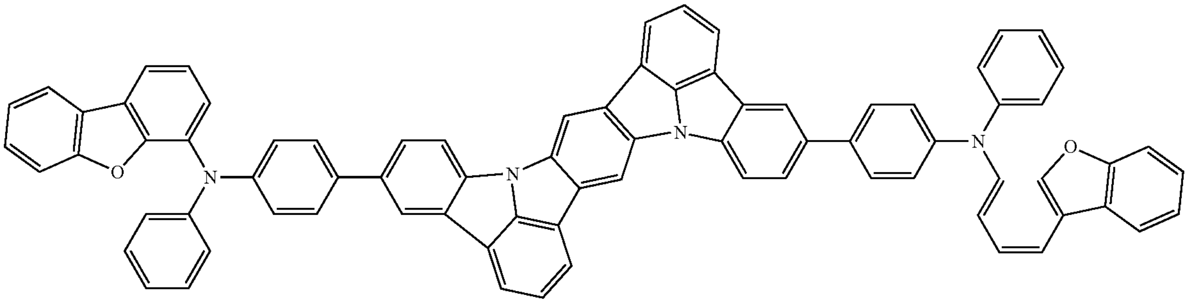
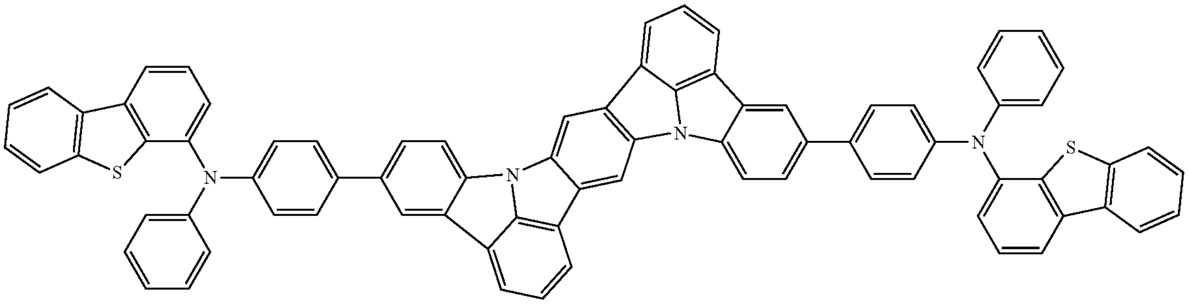

-continued
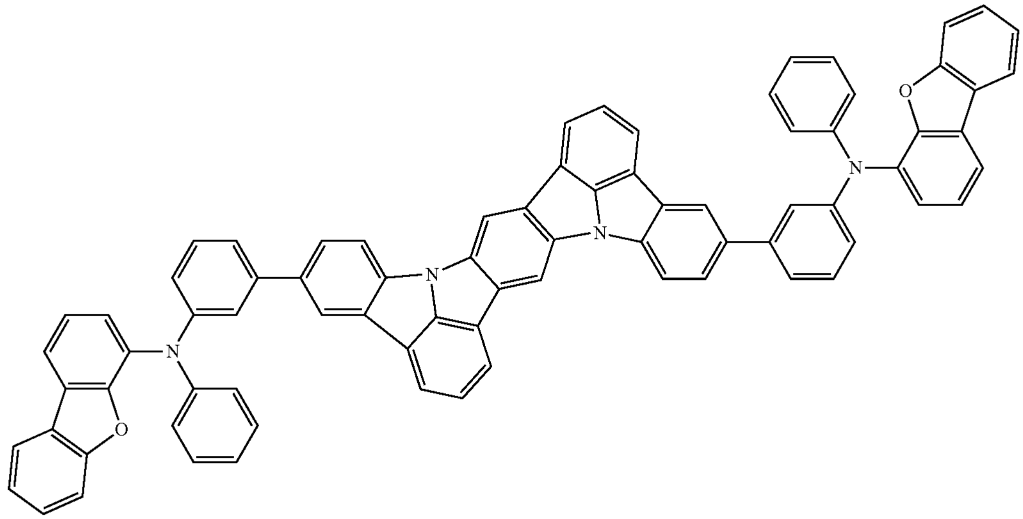
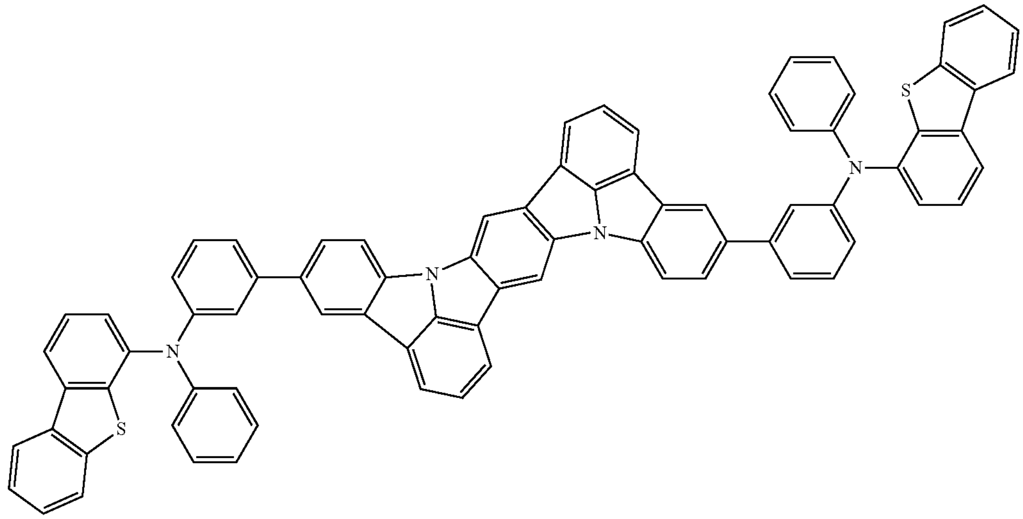
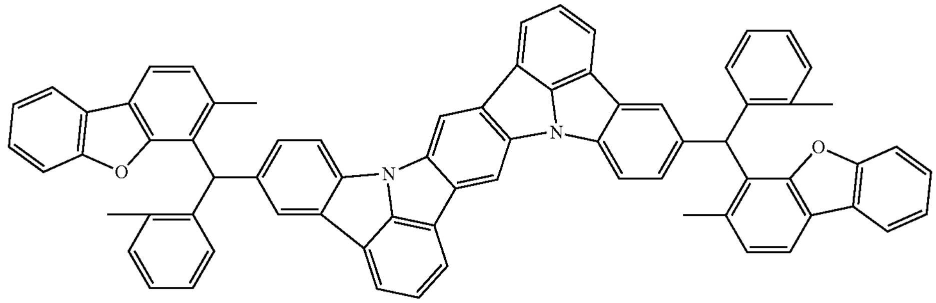
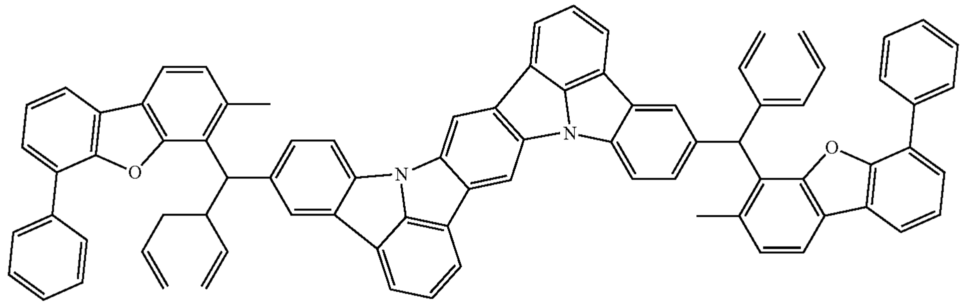

-continued
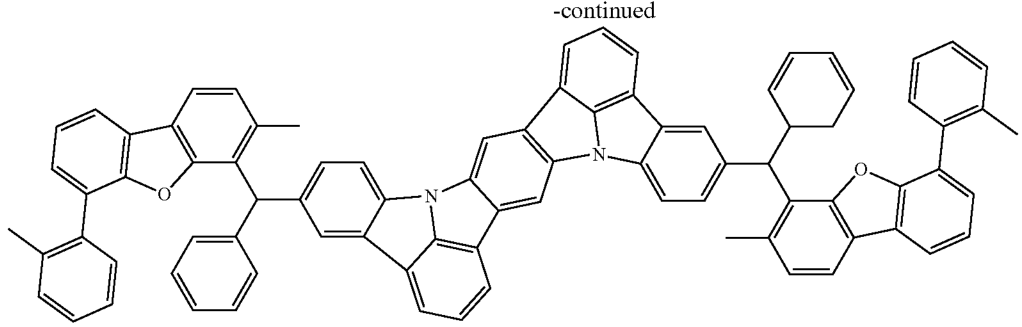
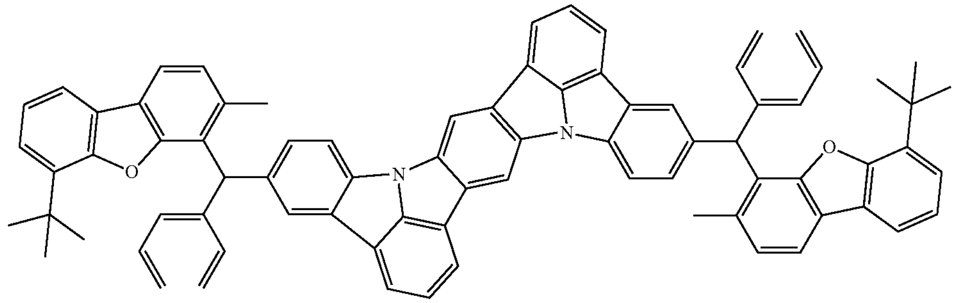
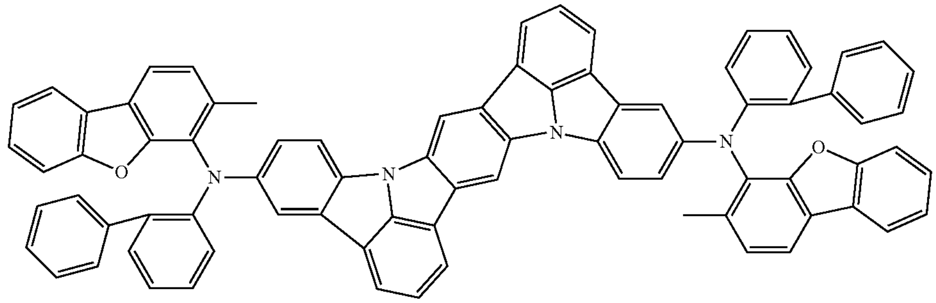
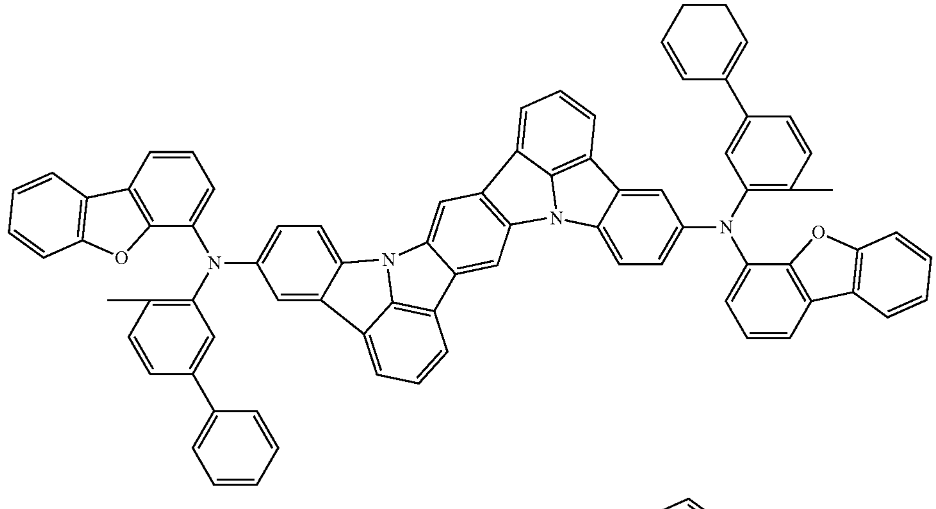
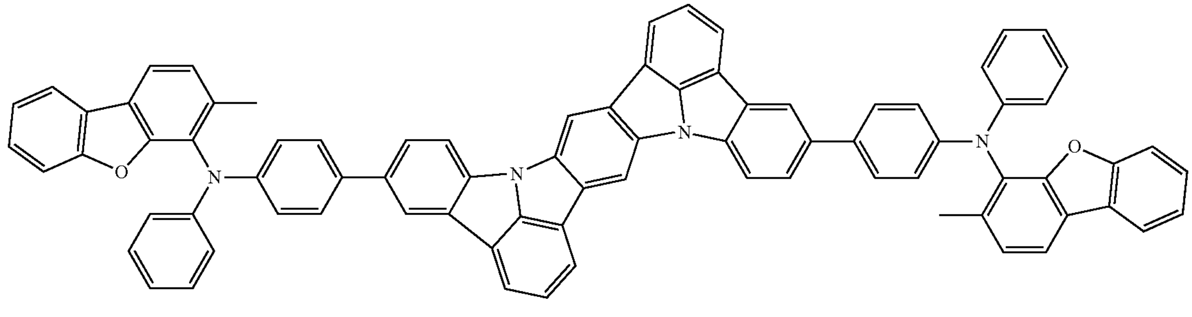

-continued
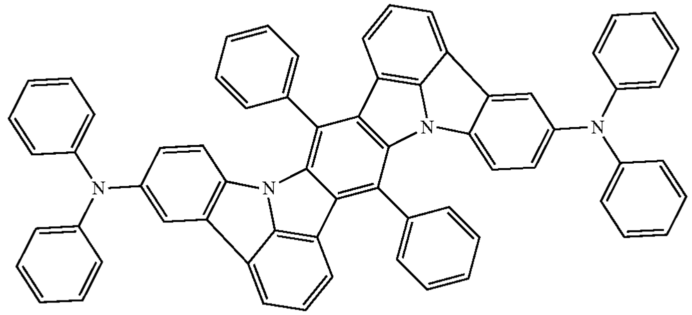
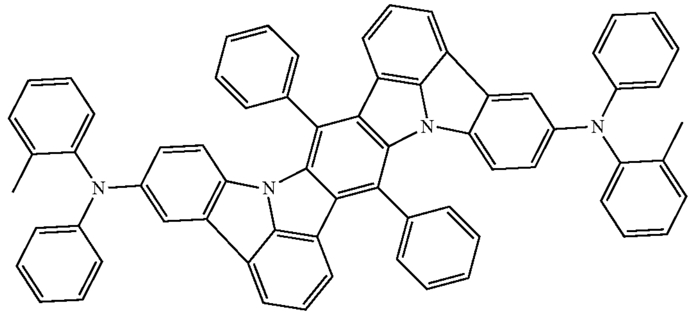
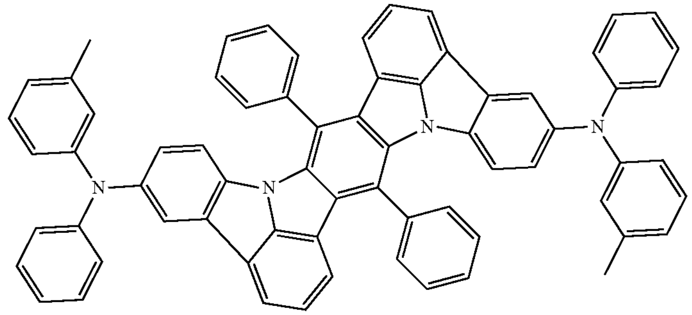
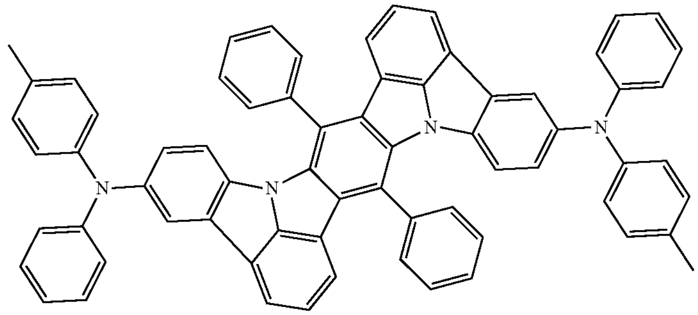
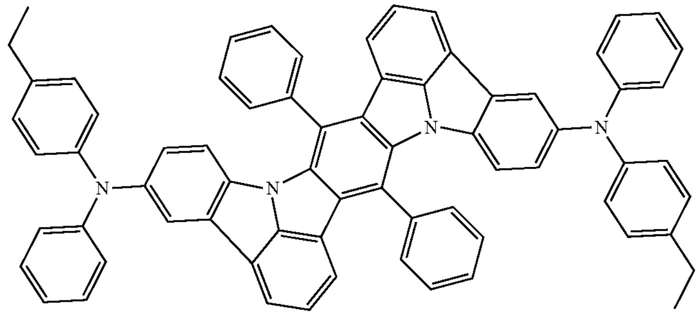

-continued
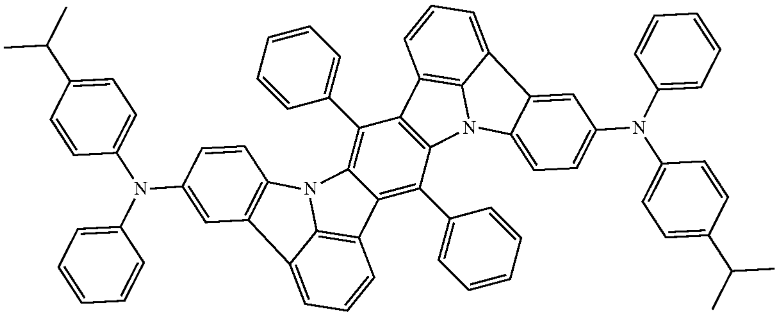
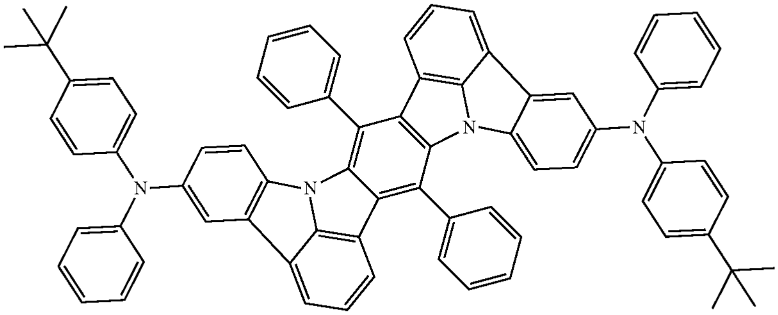
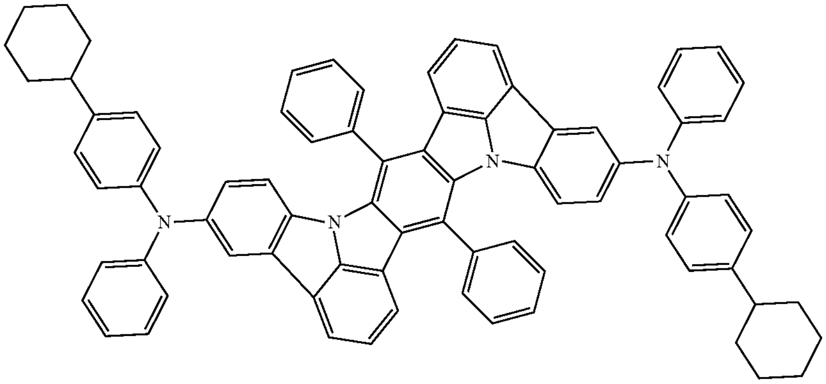
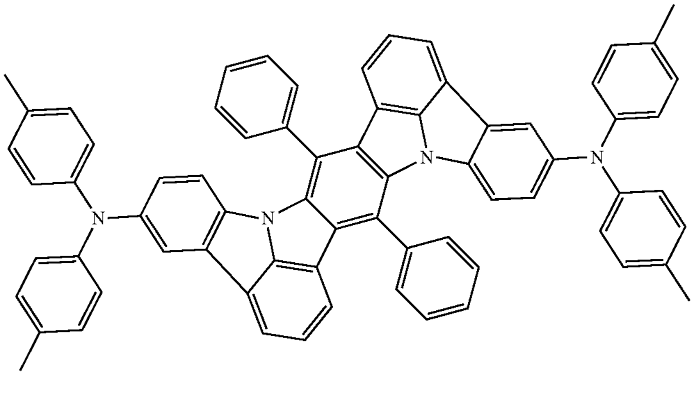

-continued
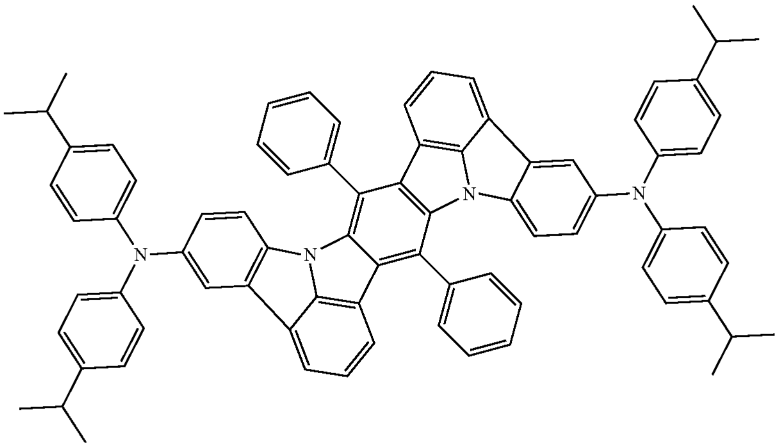
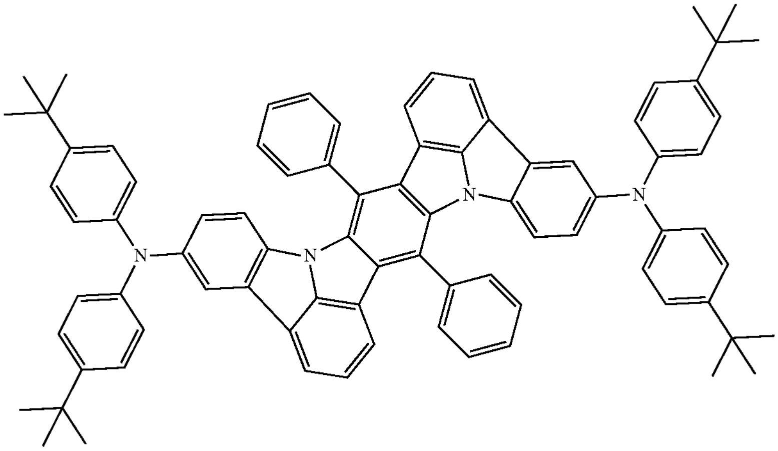
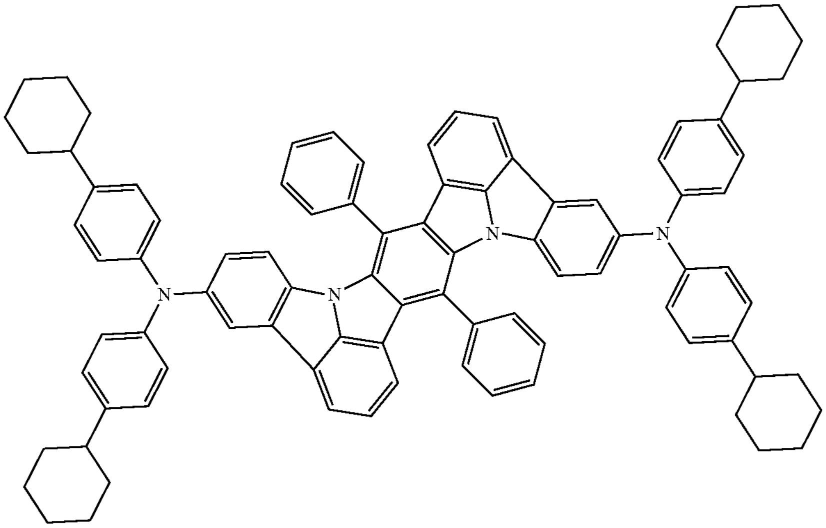

-continued
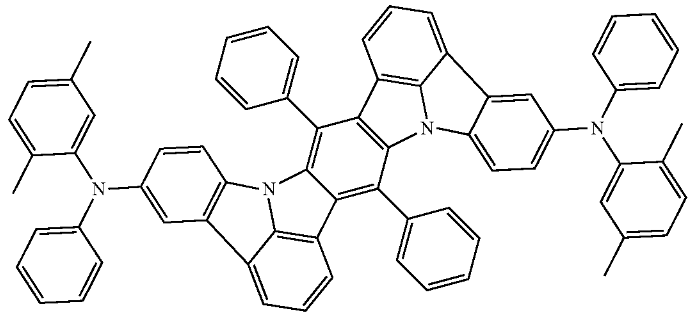
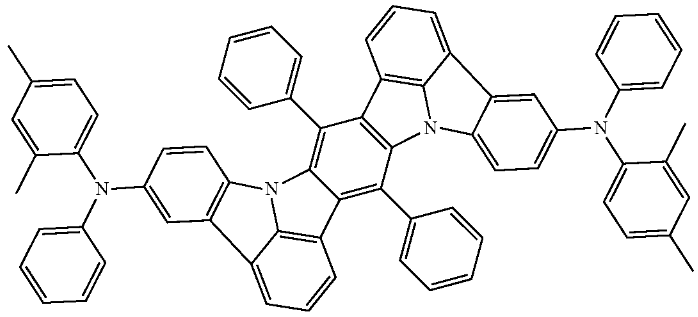
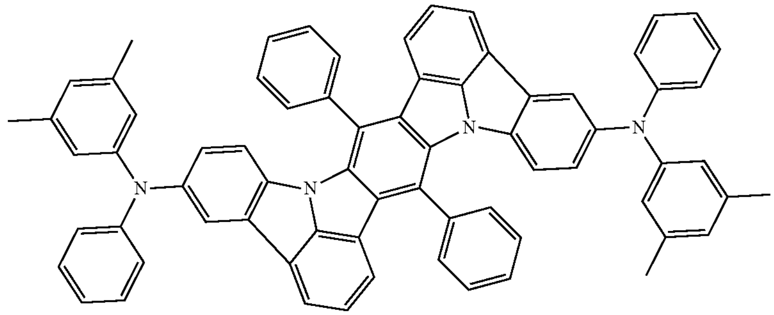
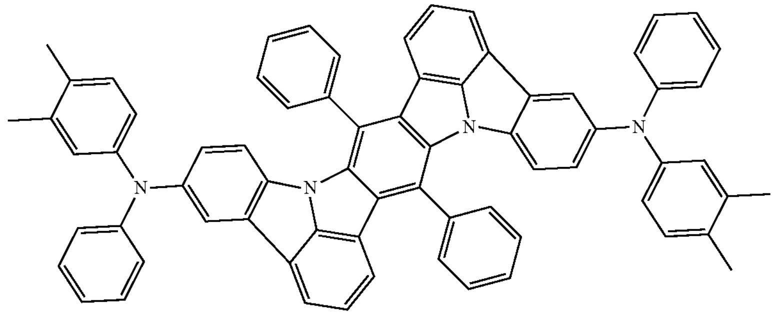
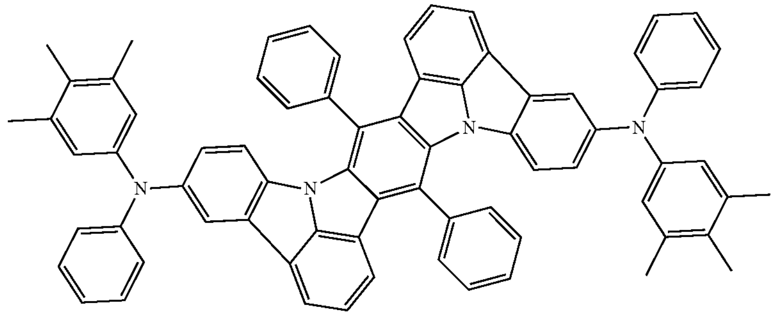

-continued
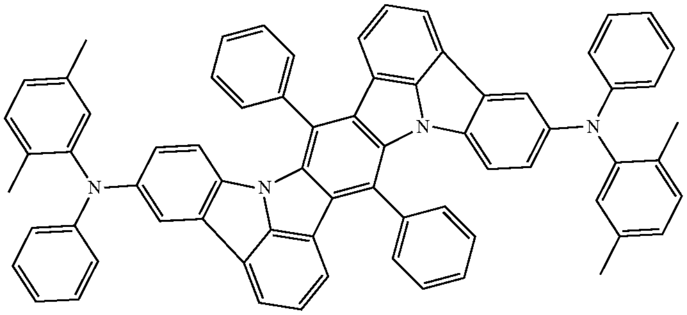
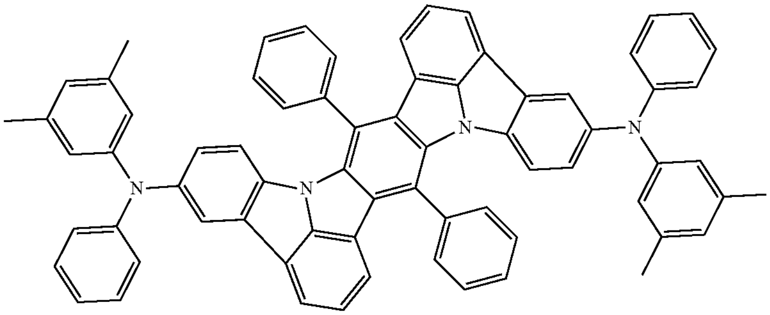
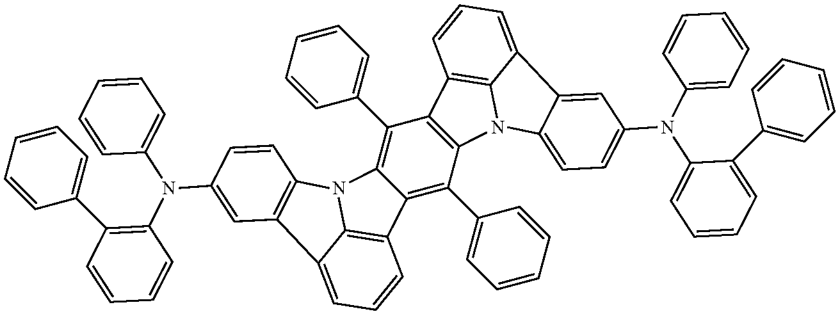
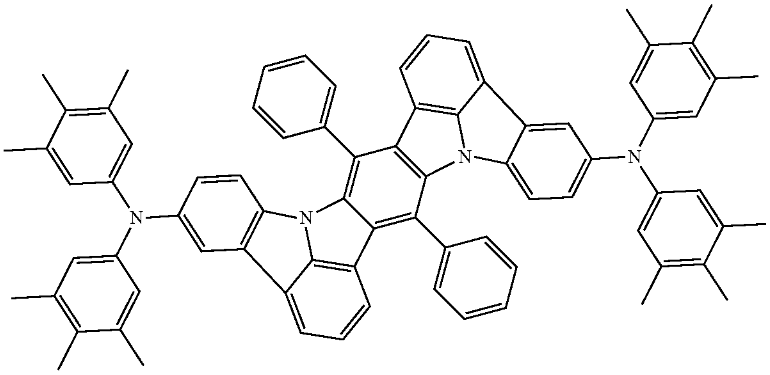
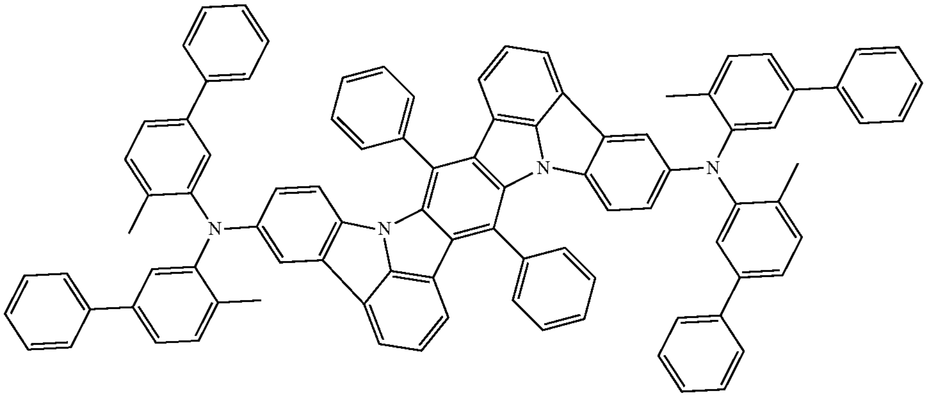

-continued
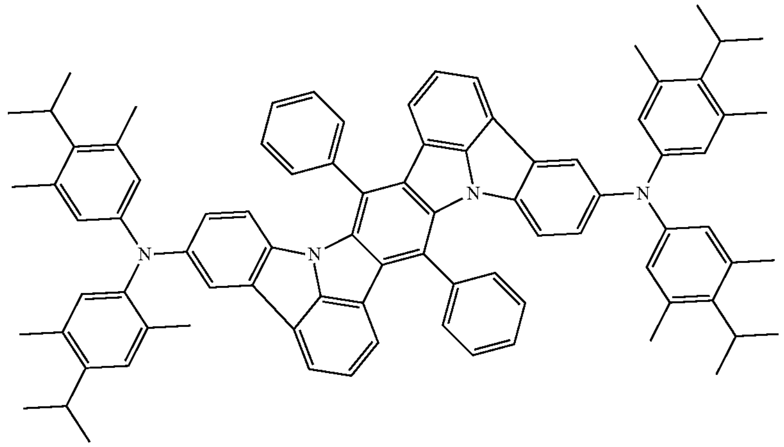
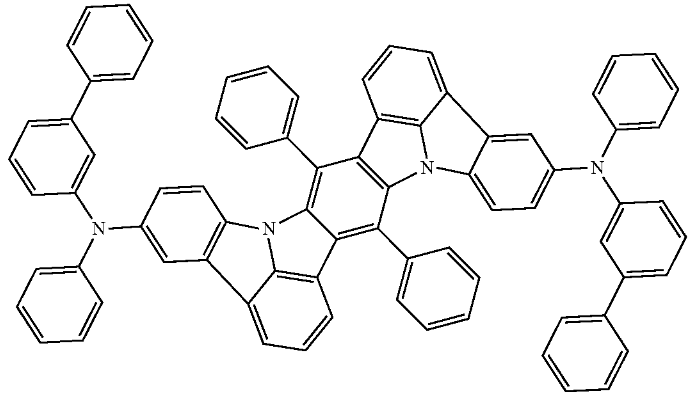
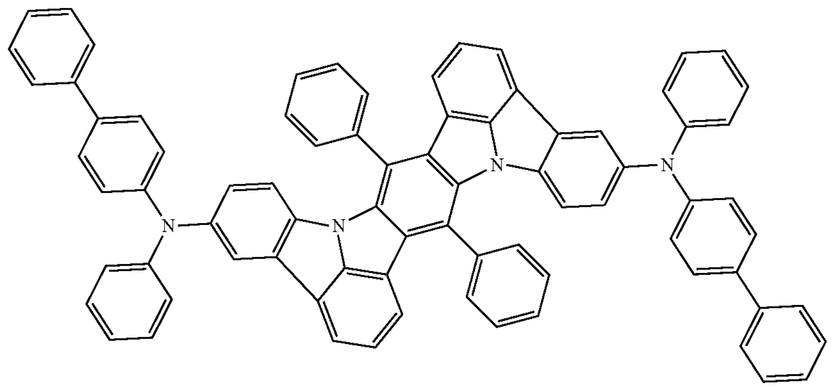
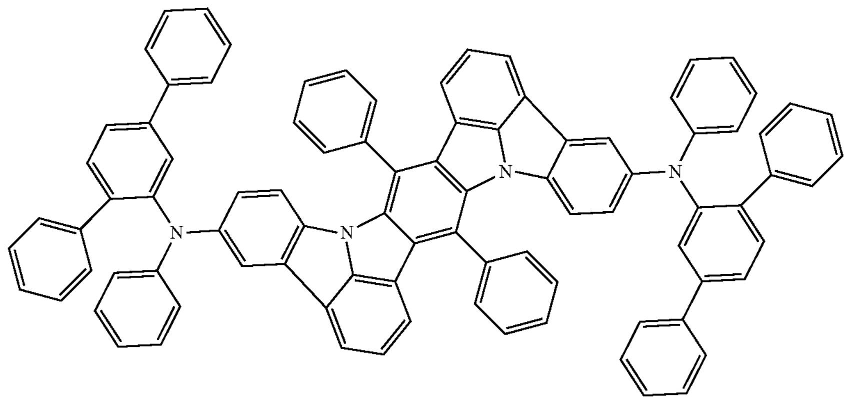

-continued
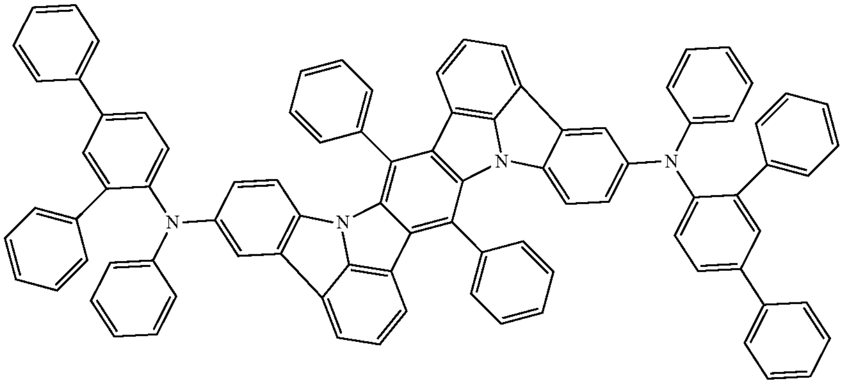
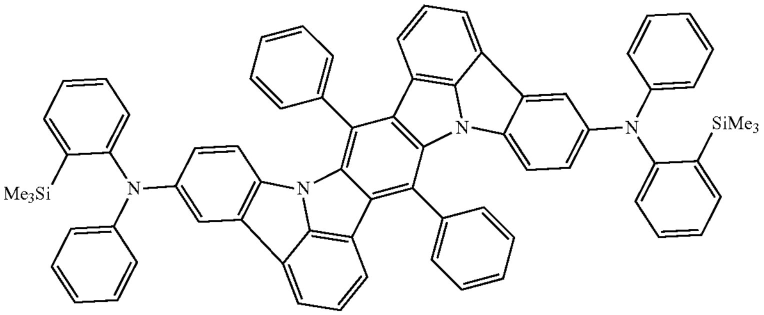
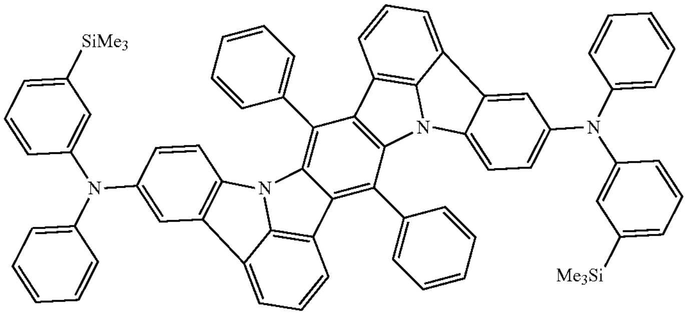
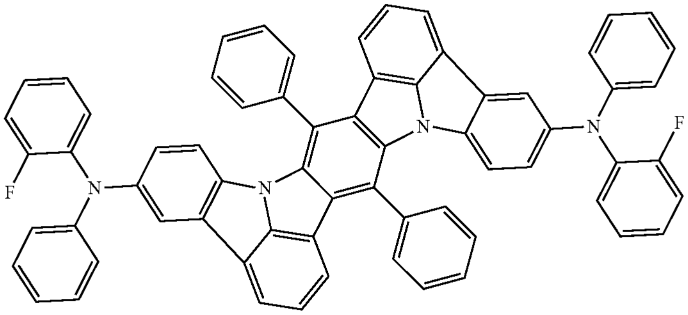
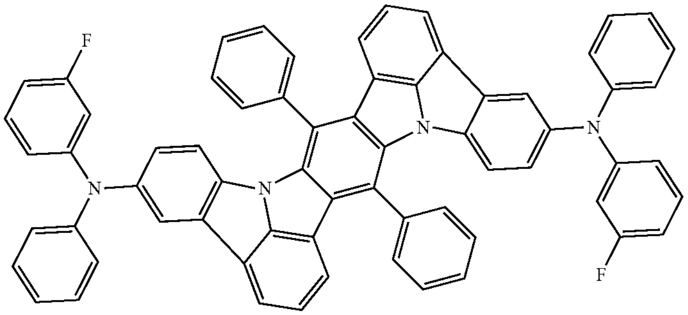

-continued
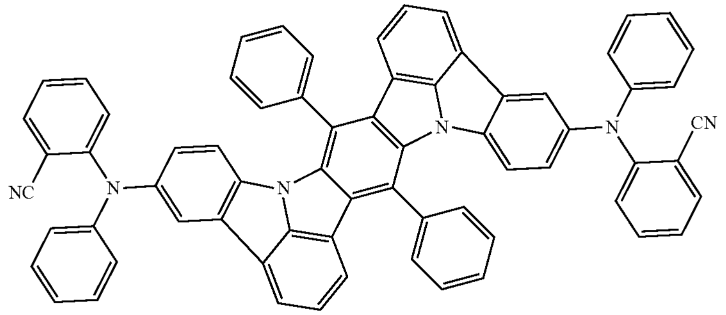
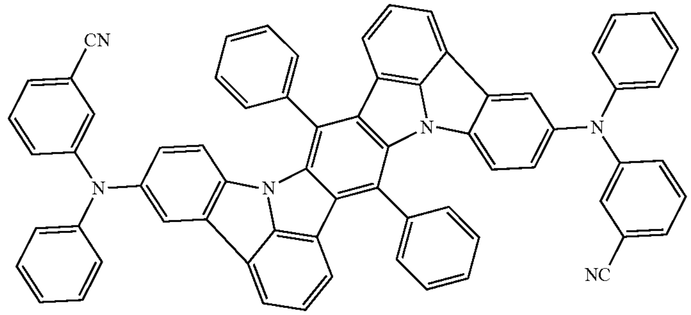
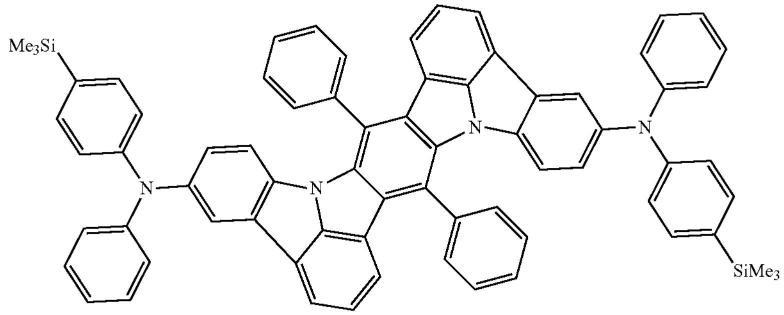
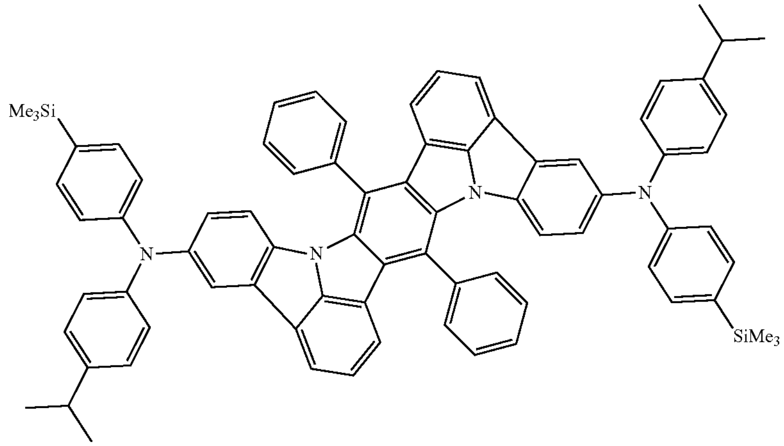
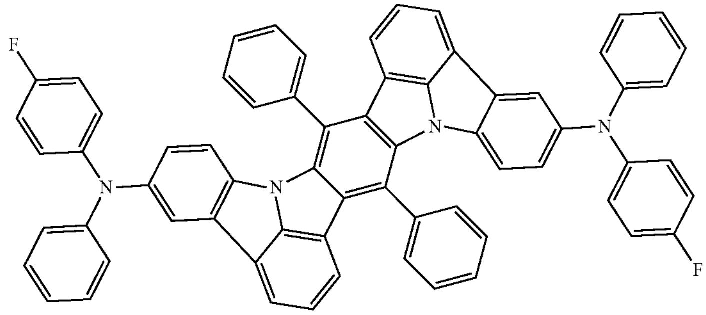

-continued
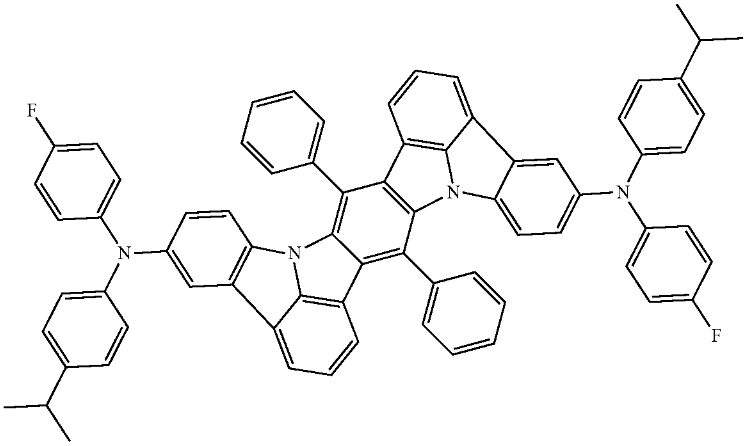
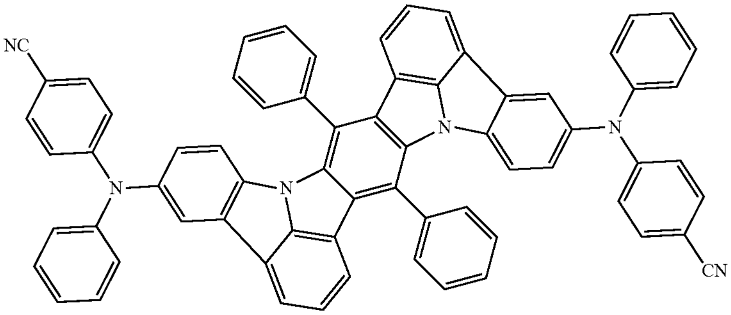
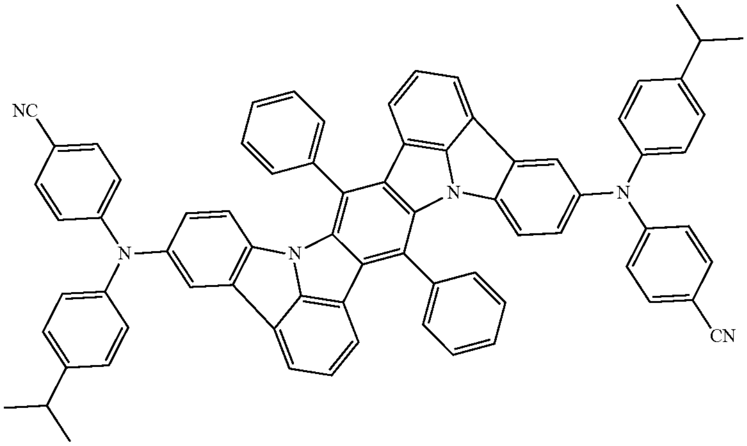 [SMILES: CC(C)c1ccc(N(c2ccc(C#N)cc2)c2ccc3c(c2)c2cccc4c5c(-c6ccccc6)c6c(c(-c7ccccc7)c5n3c24)c2cccc3c4cc(N(c5ccc(C#N)cc5)c5ccc(C(C)C)cc5)ccc4n6c32)cc1]
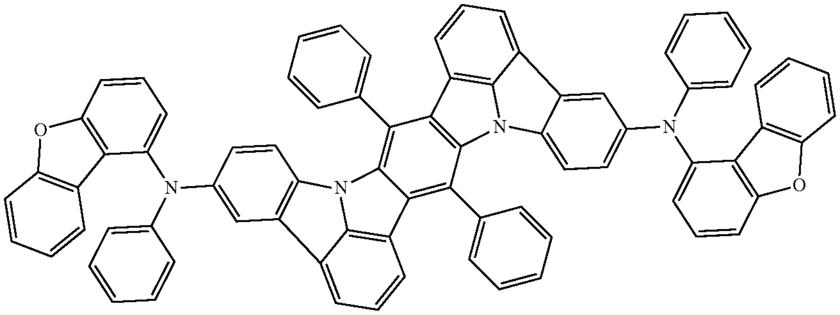

-continued
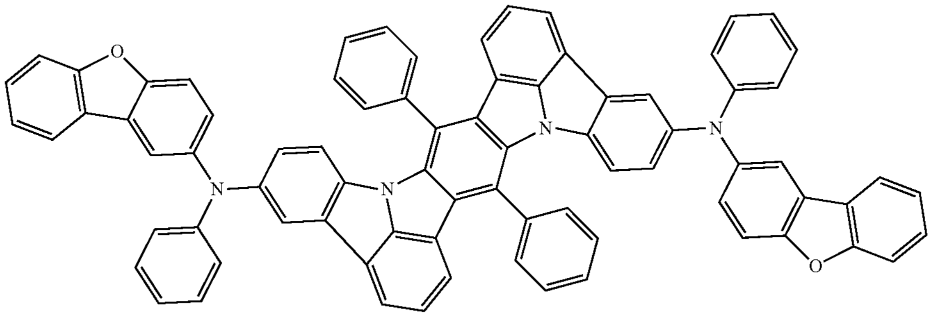
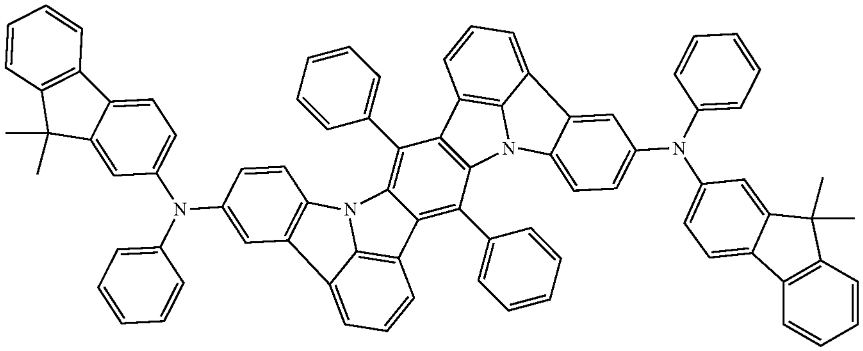
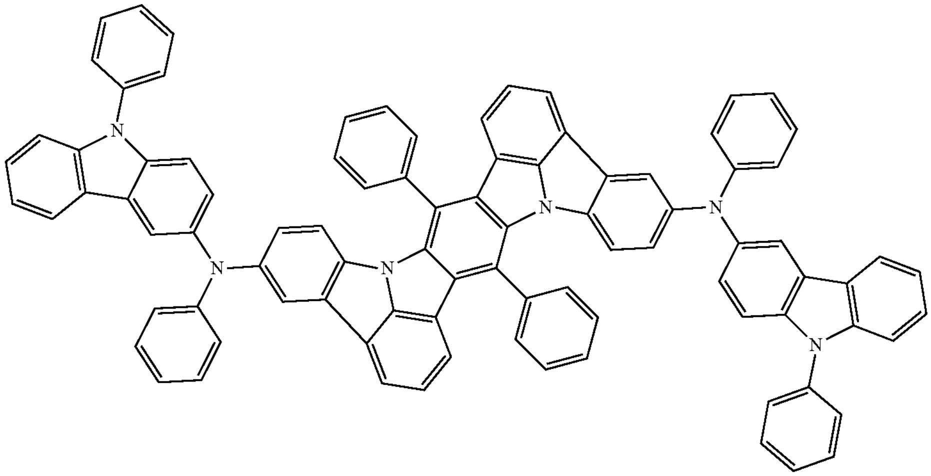
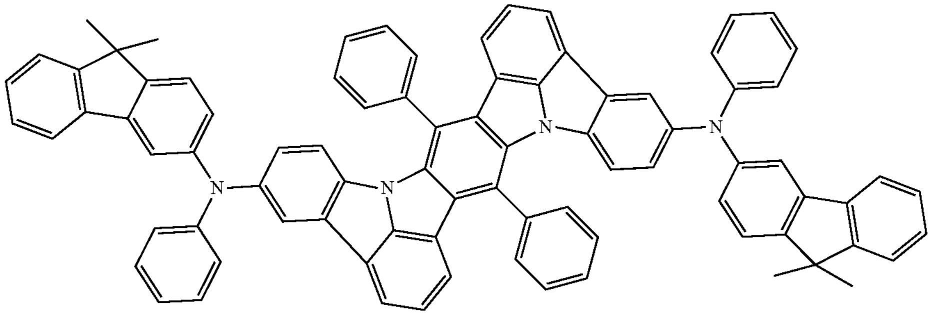

-continued
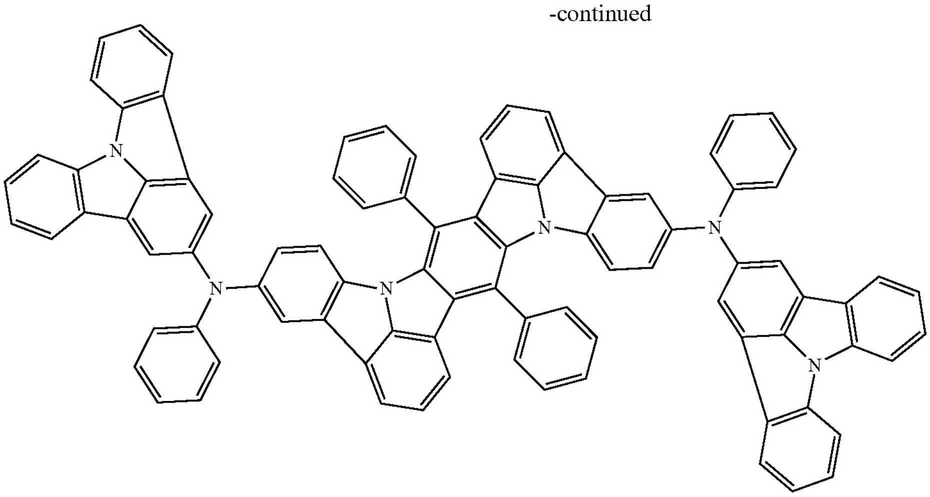
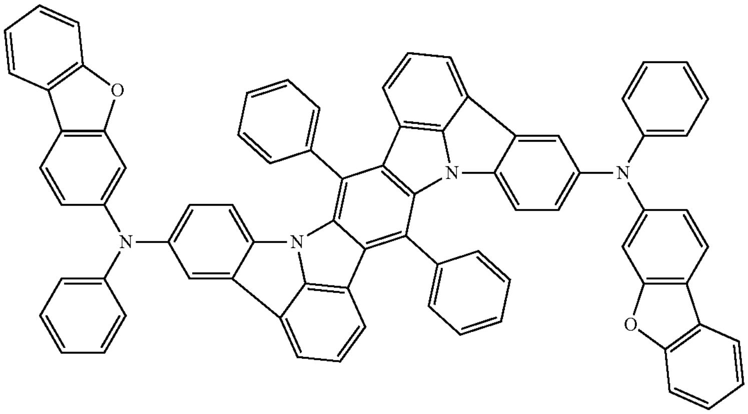
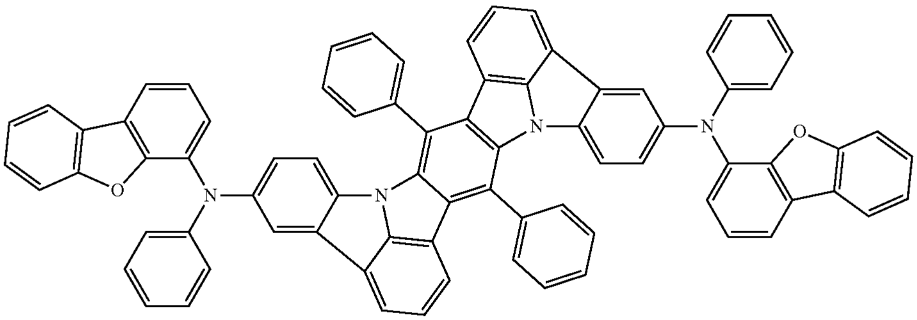
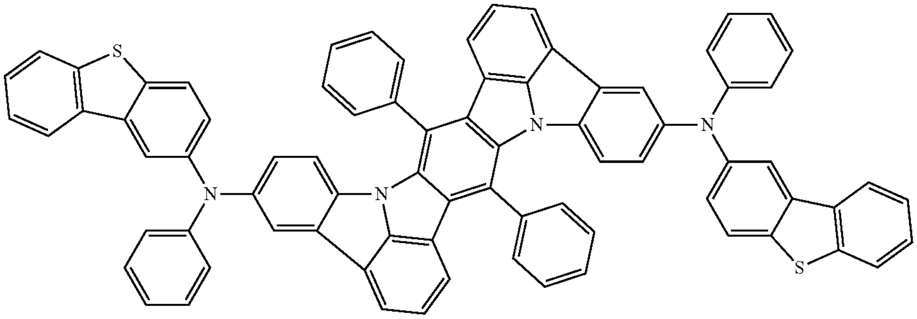

-continued
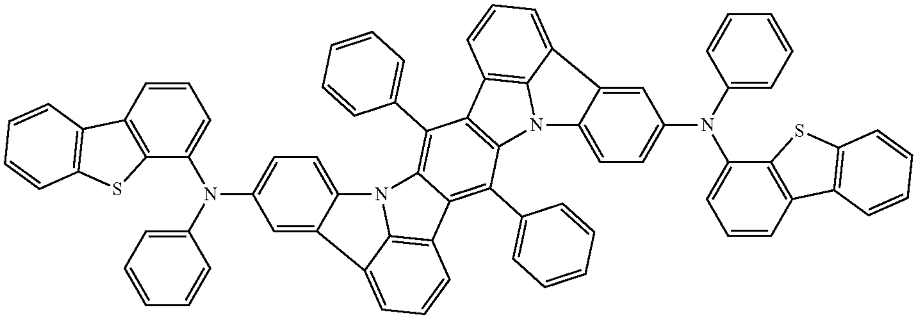
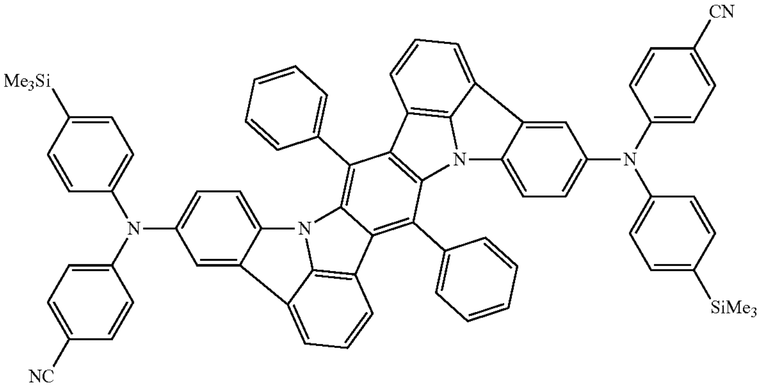
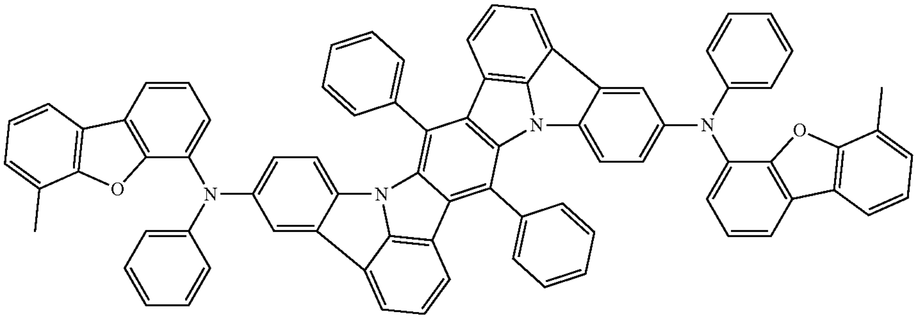
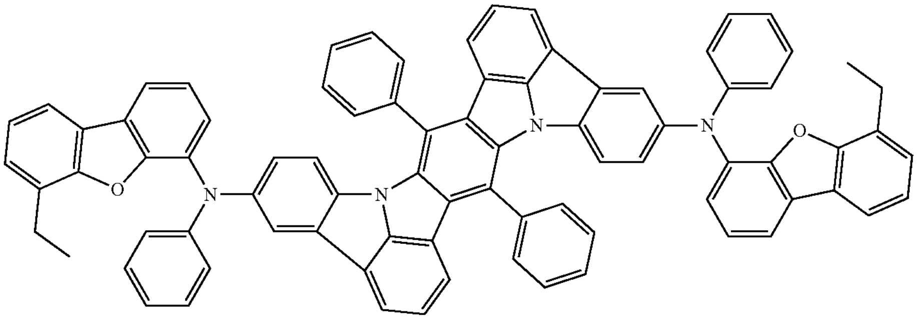
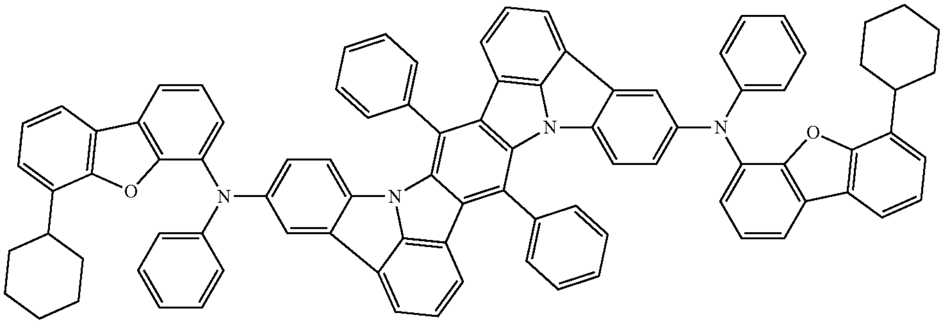

-continued
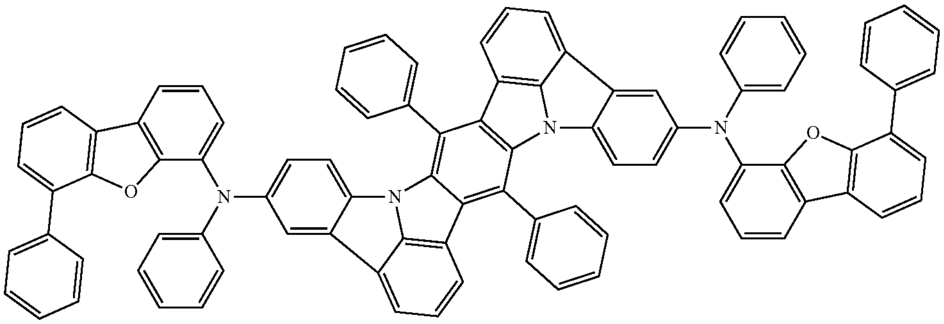
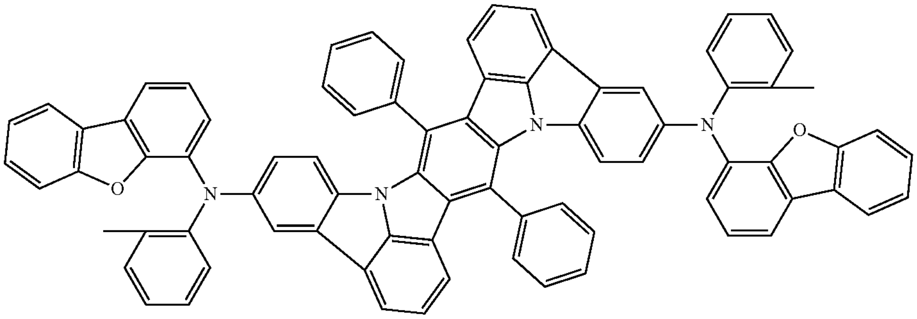
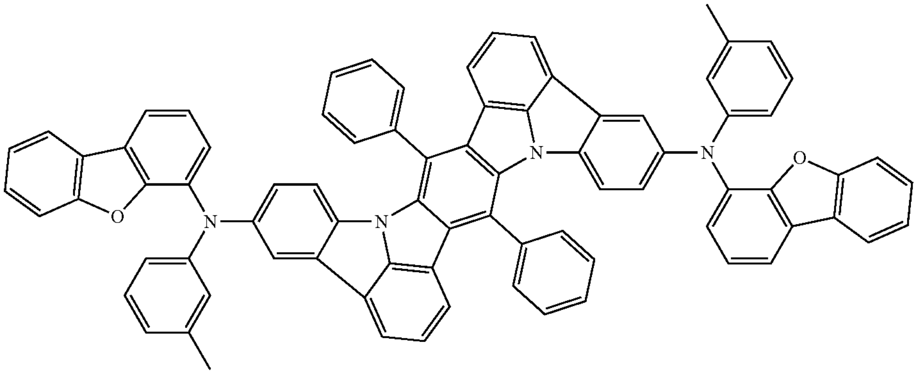
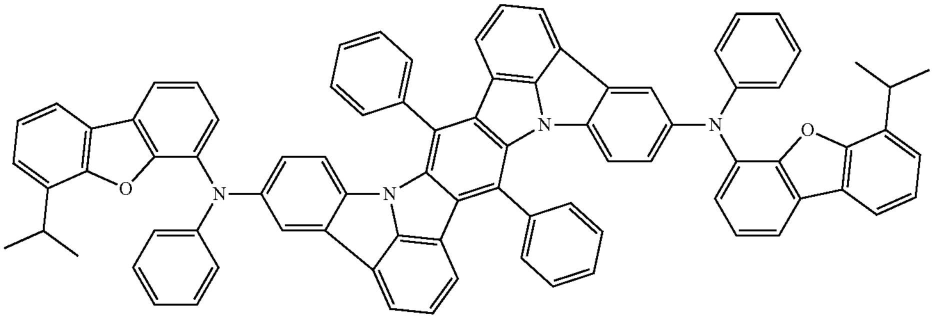
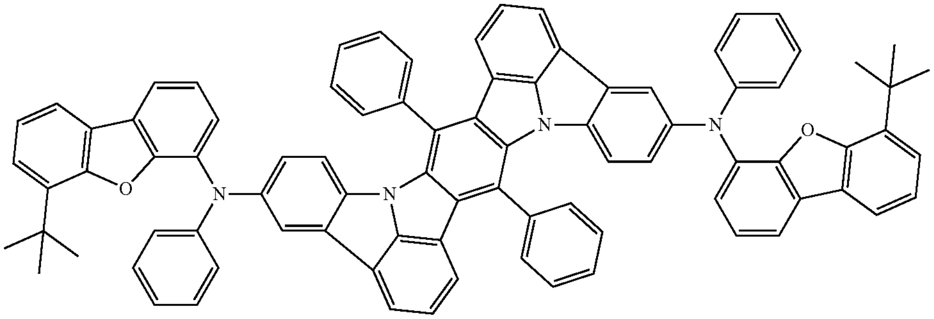

-continued
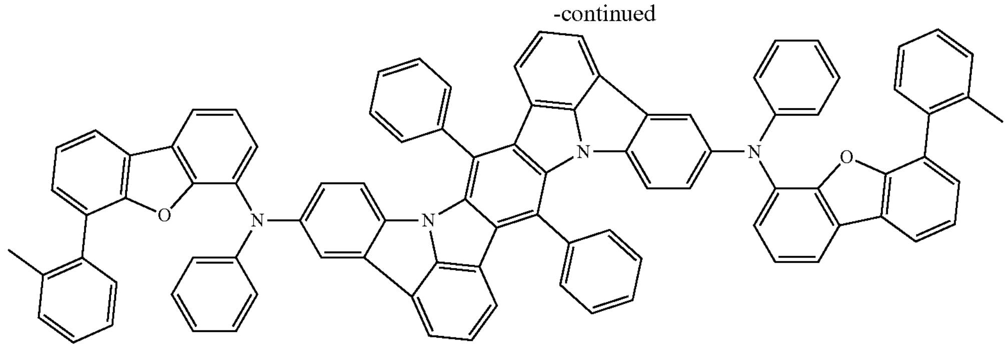
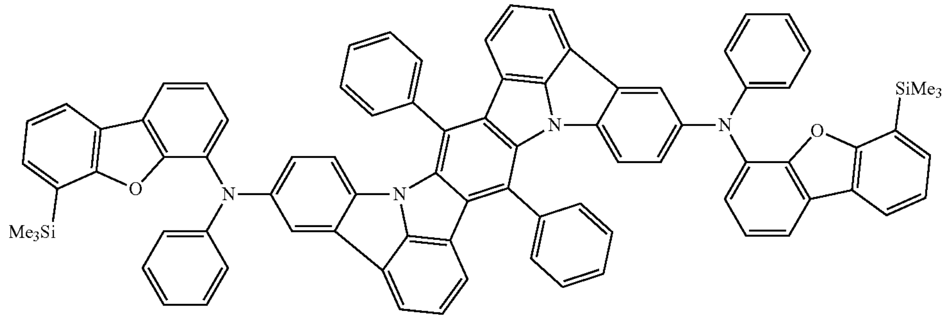
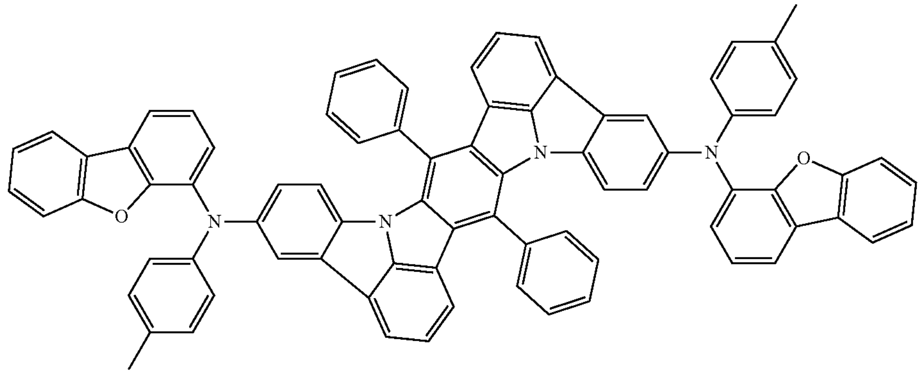
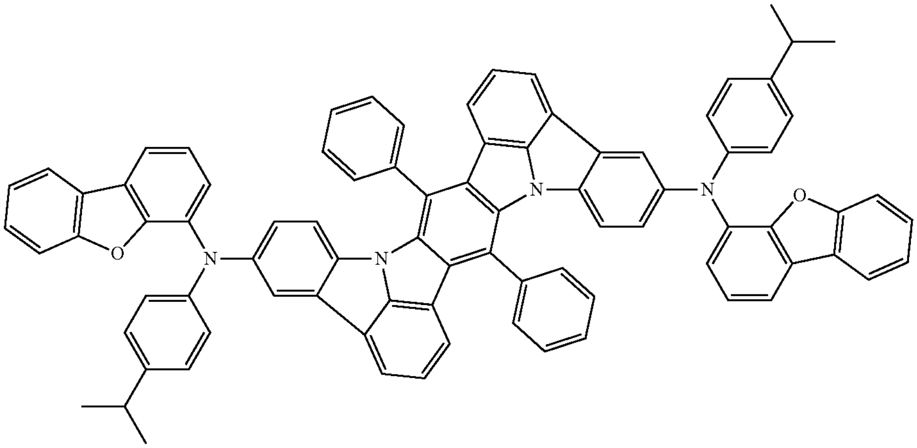

-continued
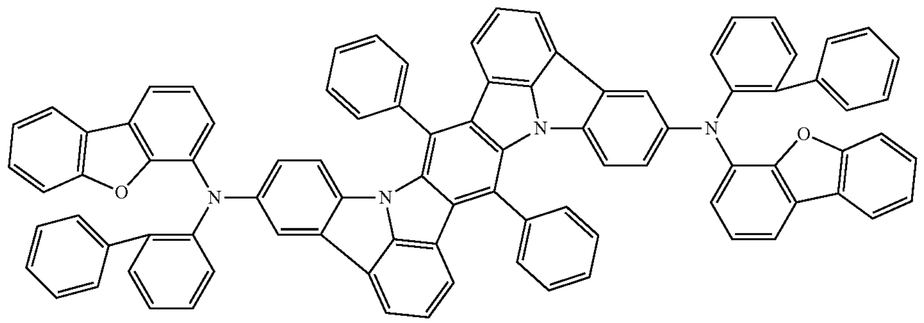
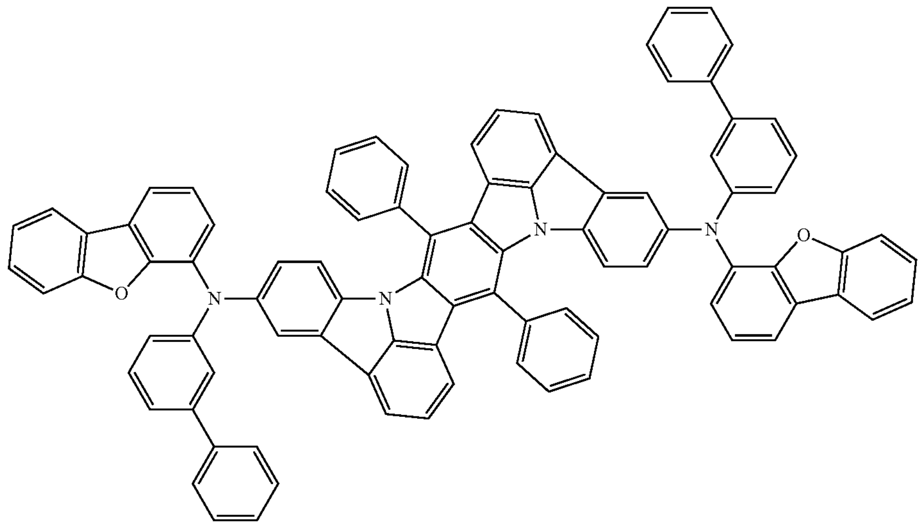
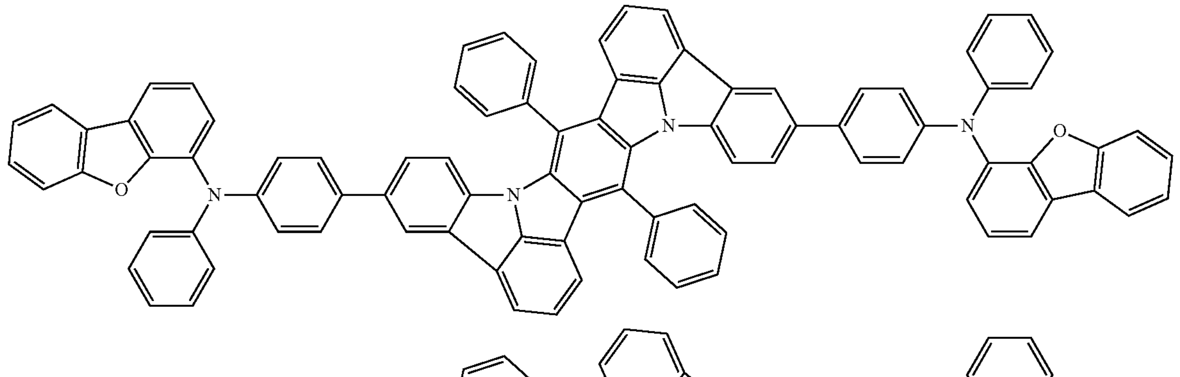
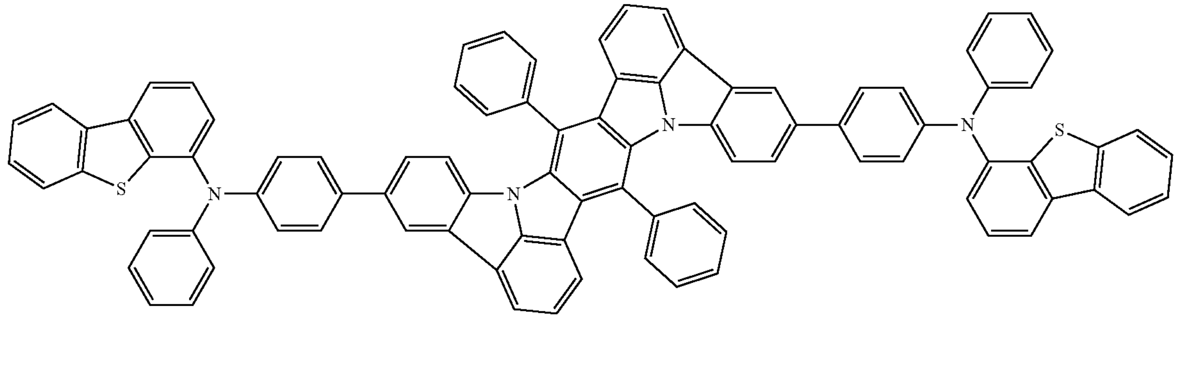

-continued
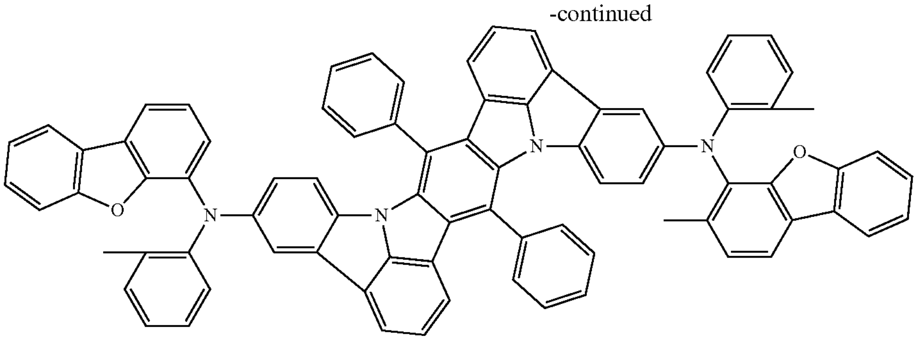
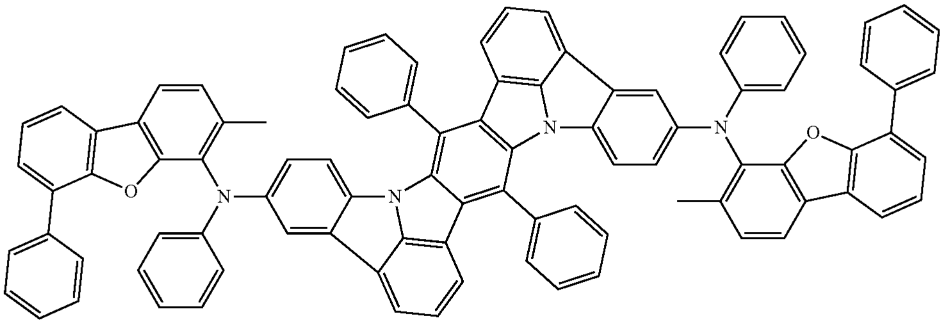
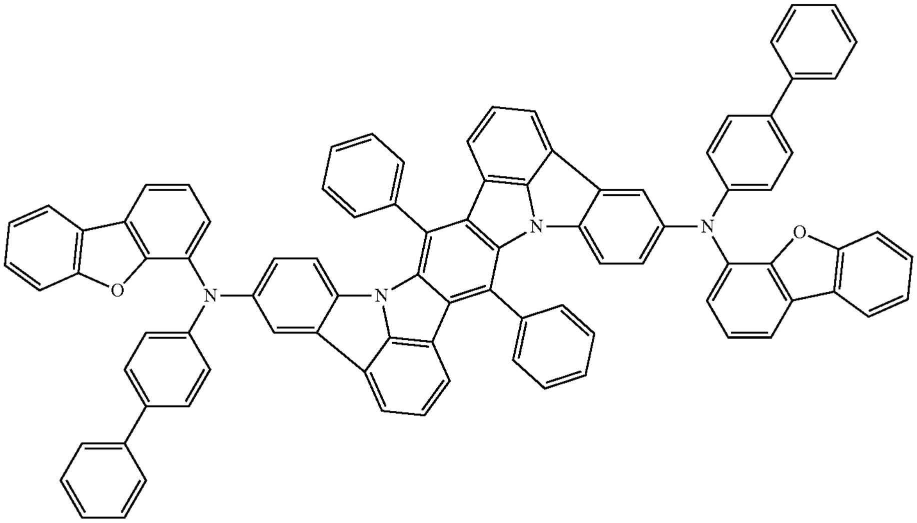
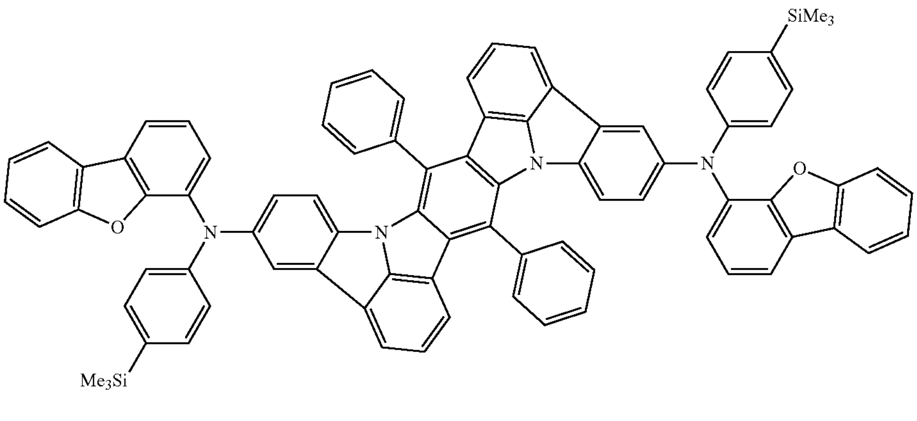

-continued
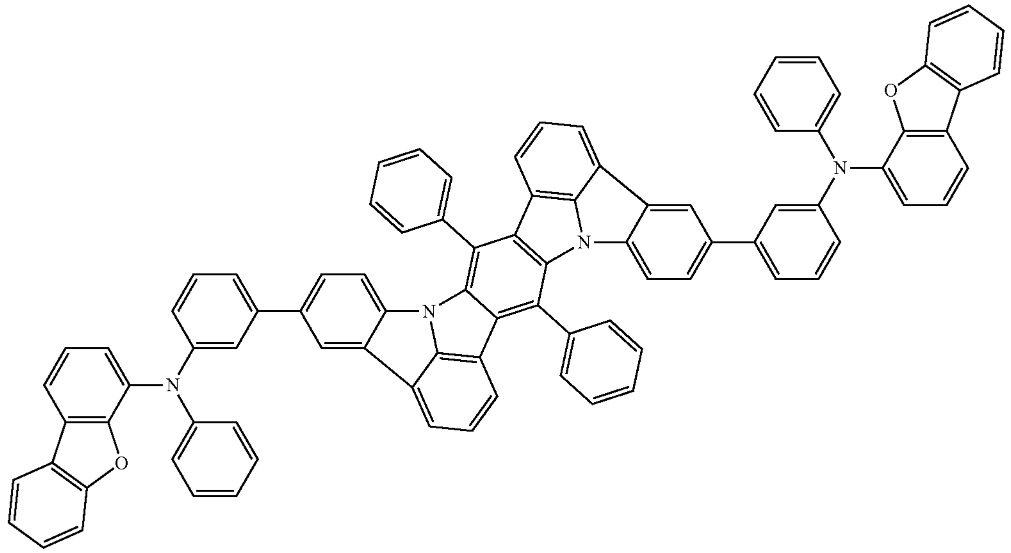
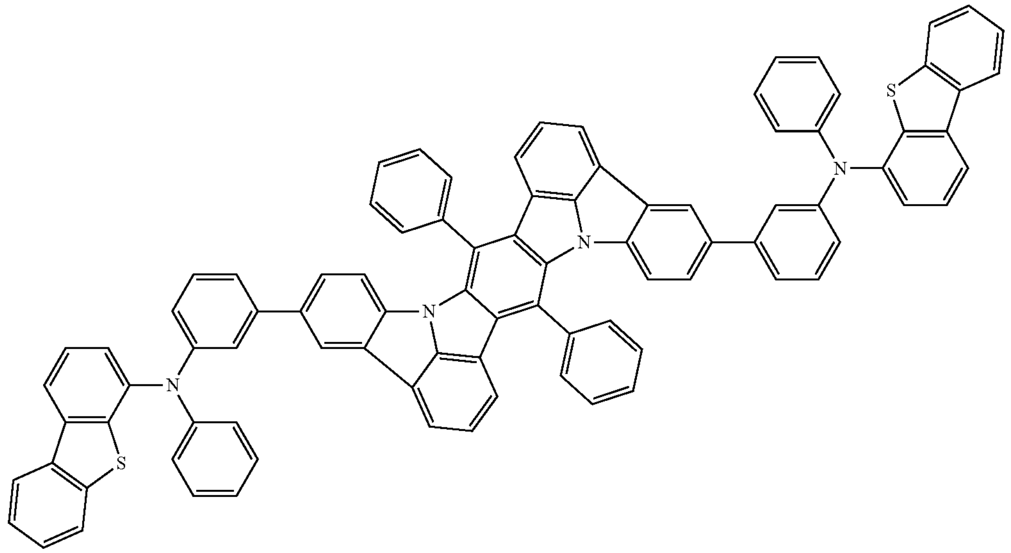
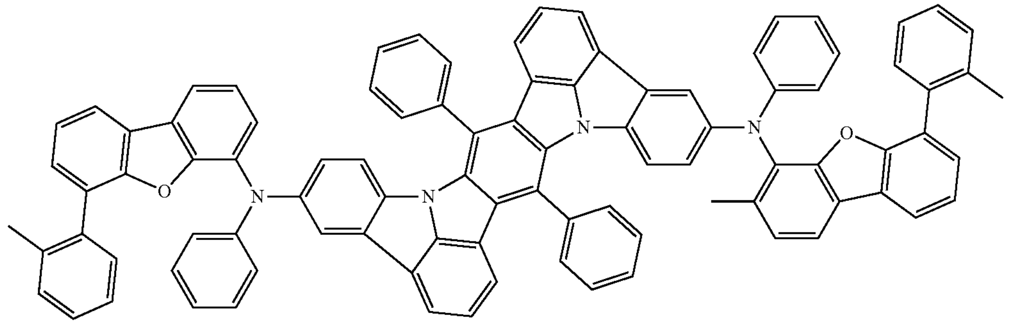

-continued
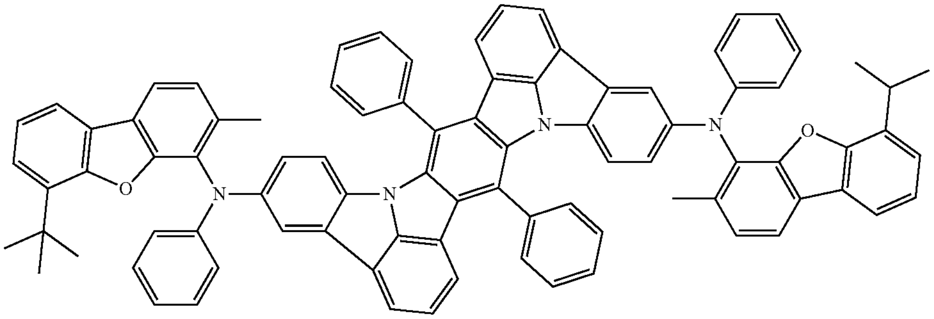
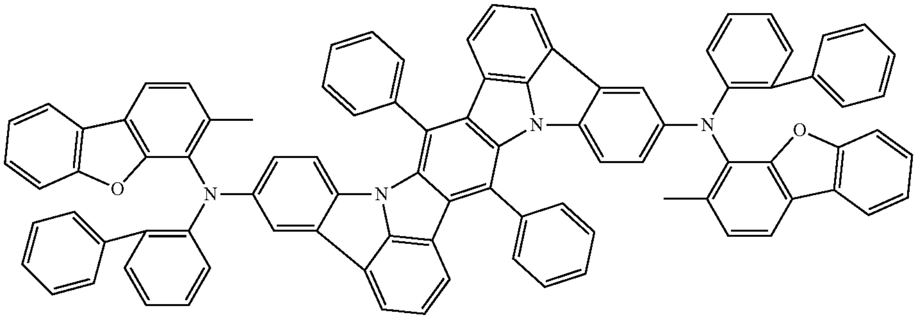
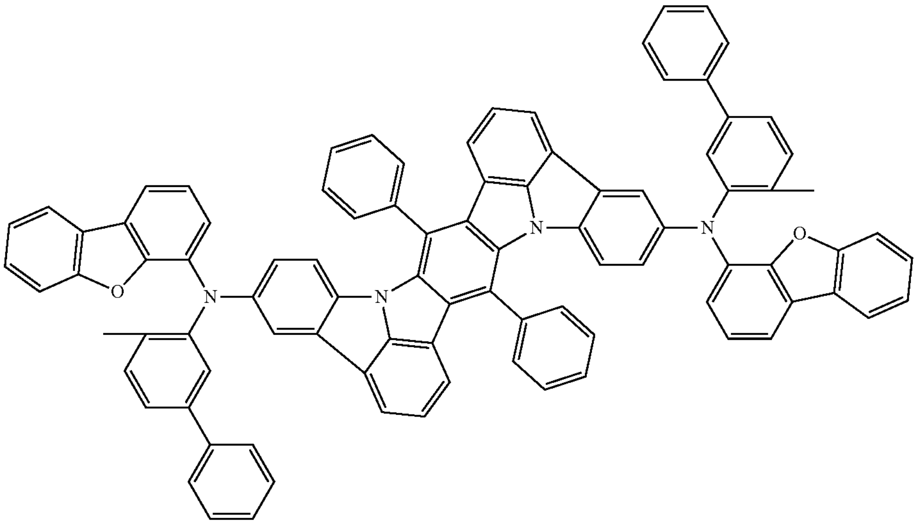
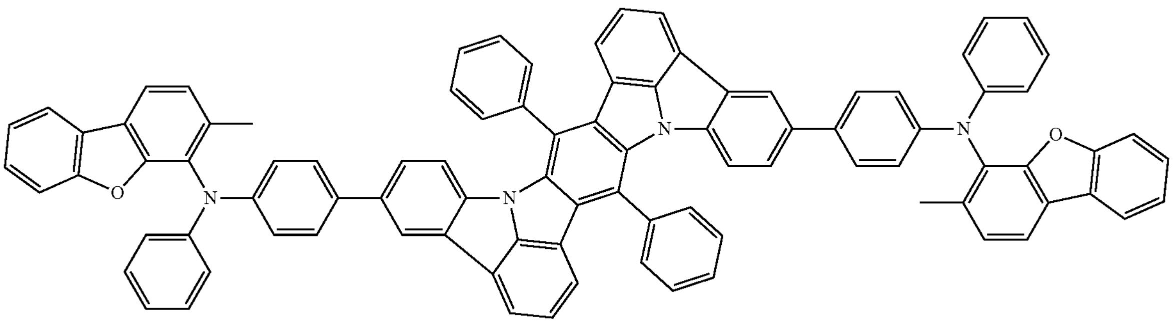

-continued
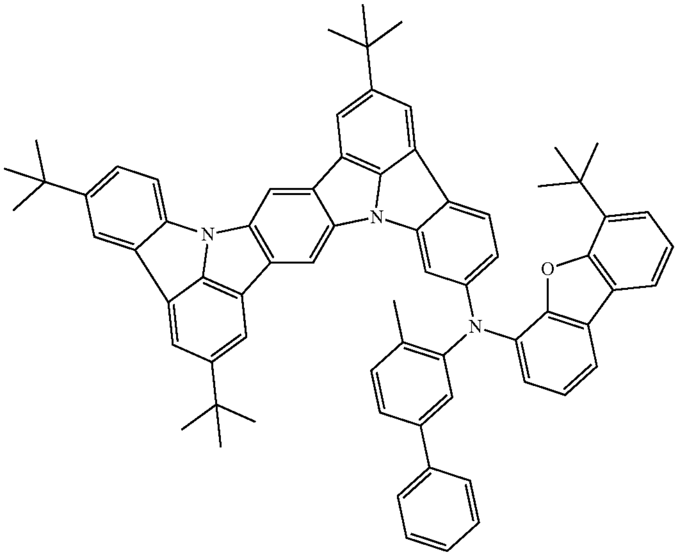
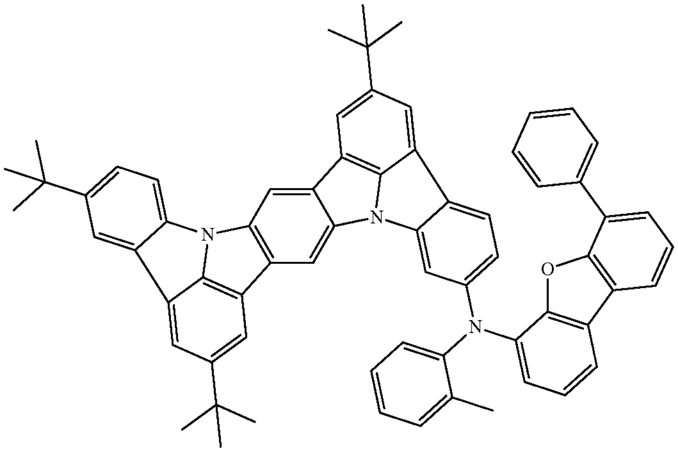
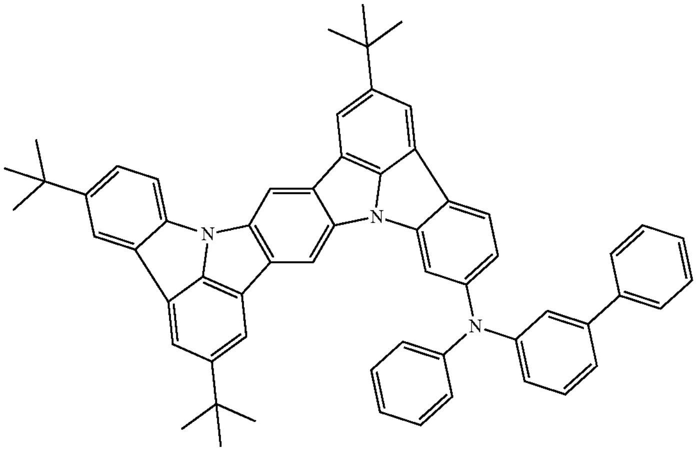

-continued
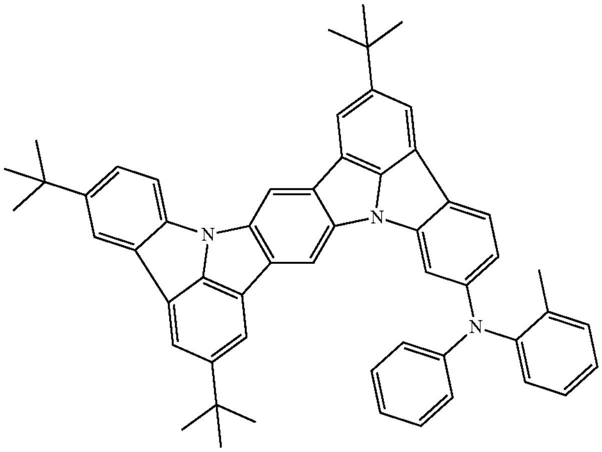
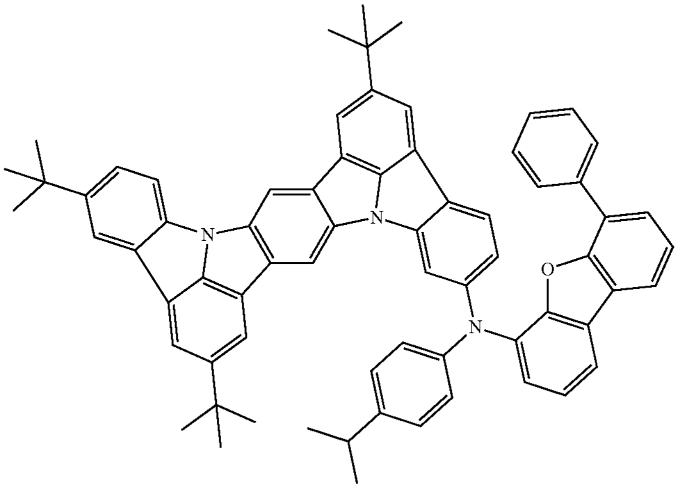
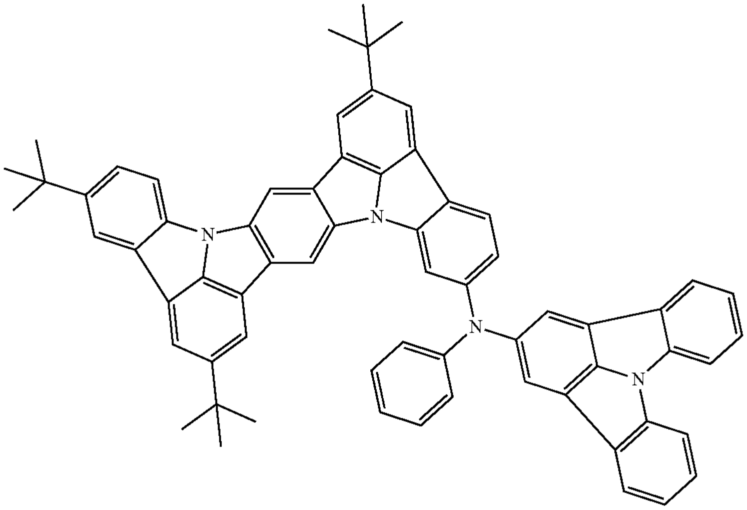

-continued
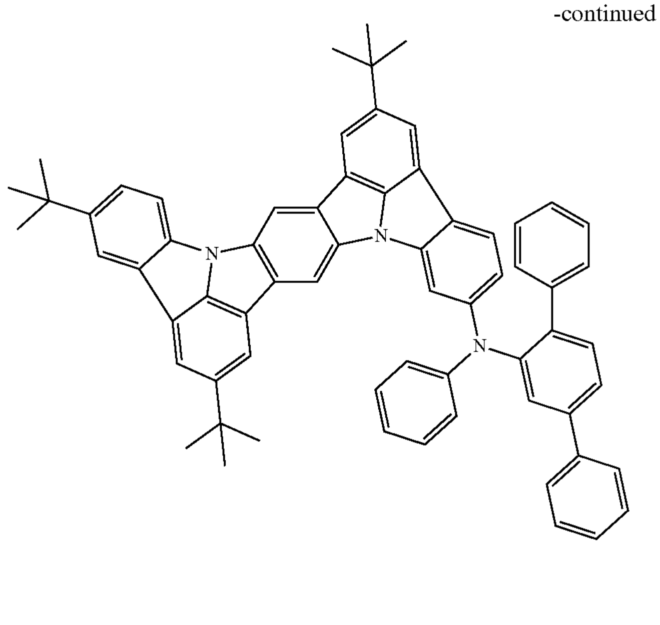
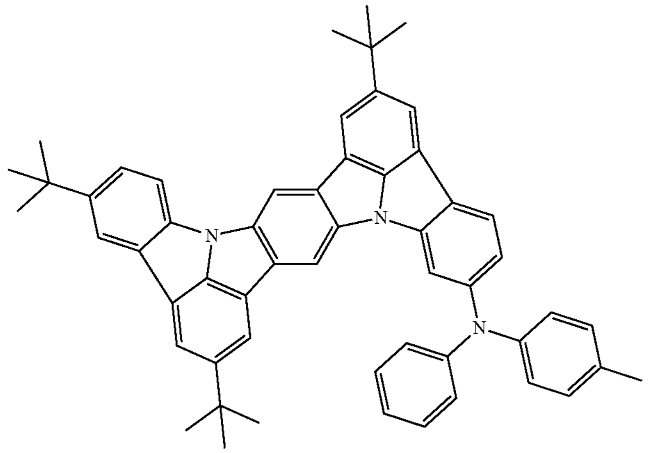
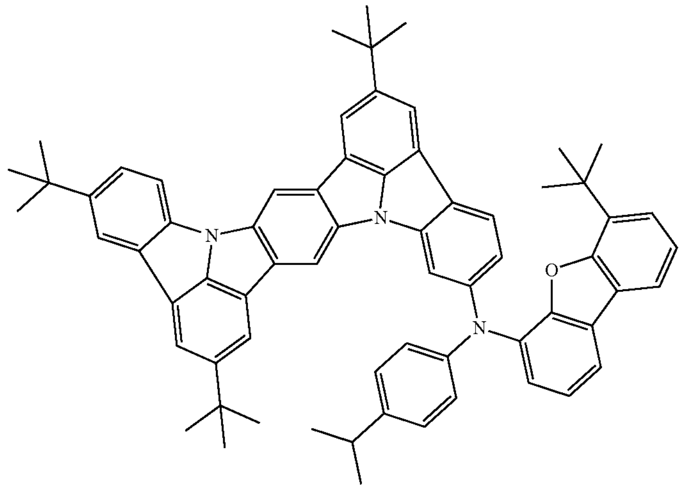

-continued
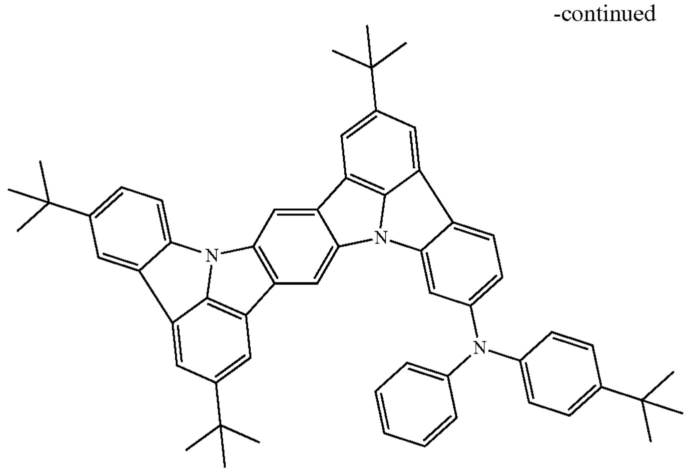
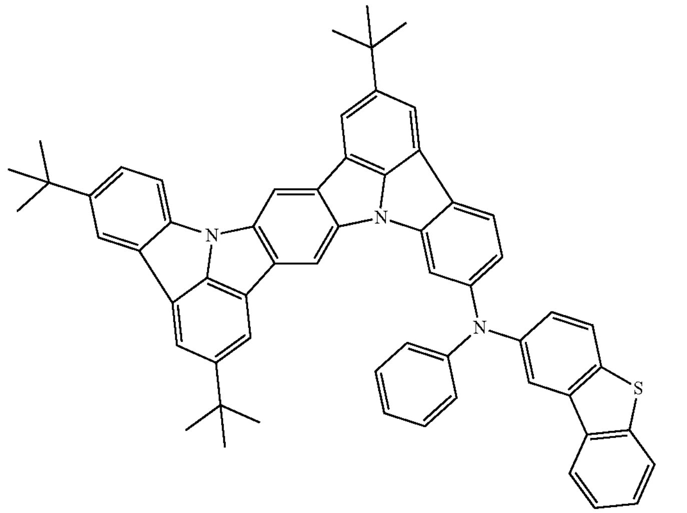
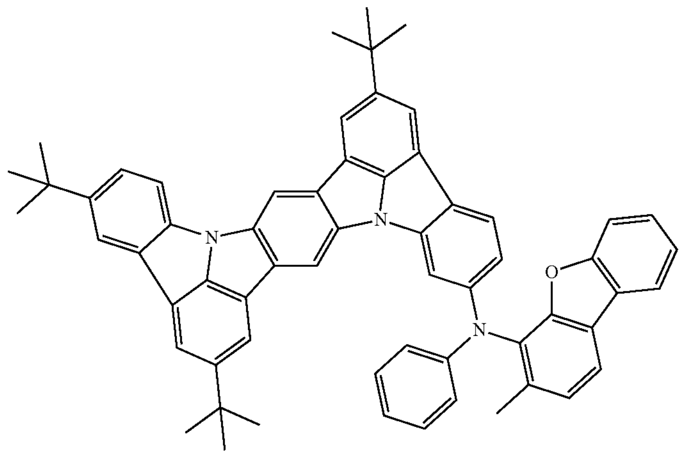

-continued
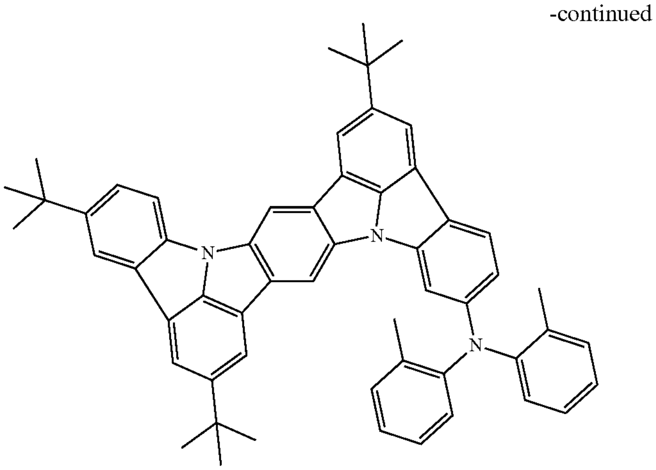
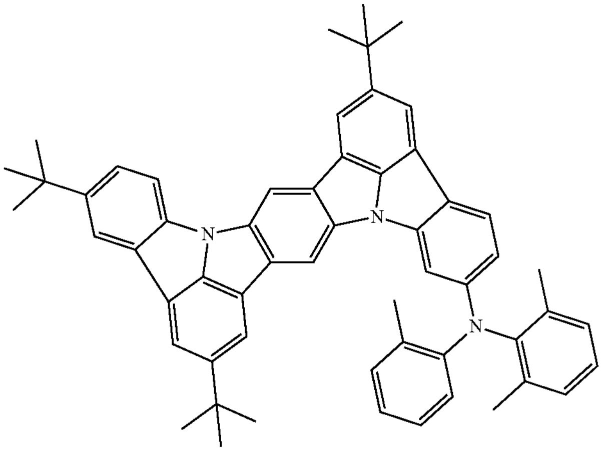
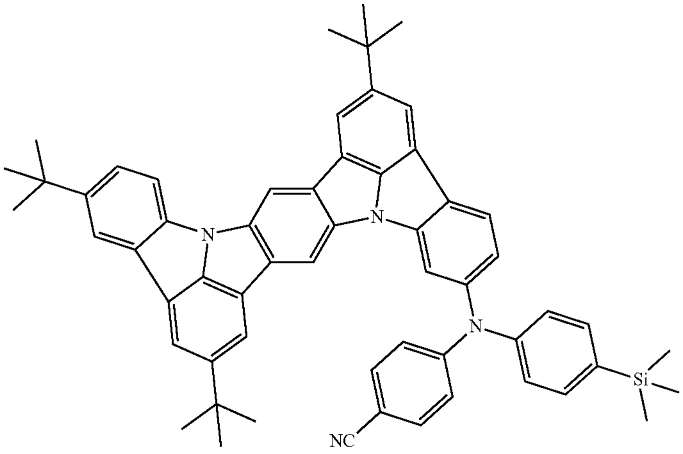

-continued
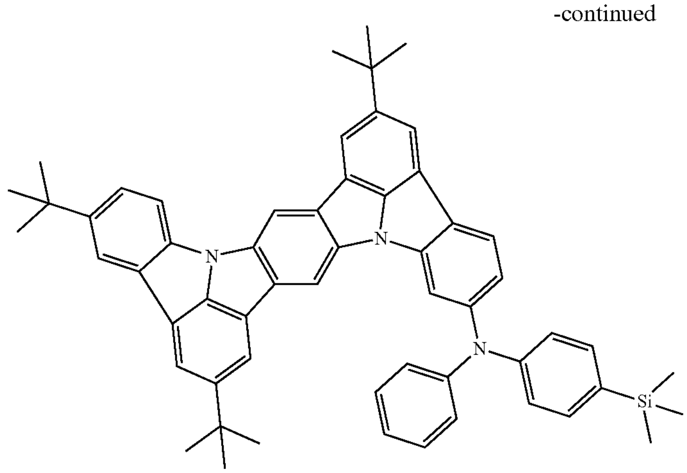
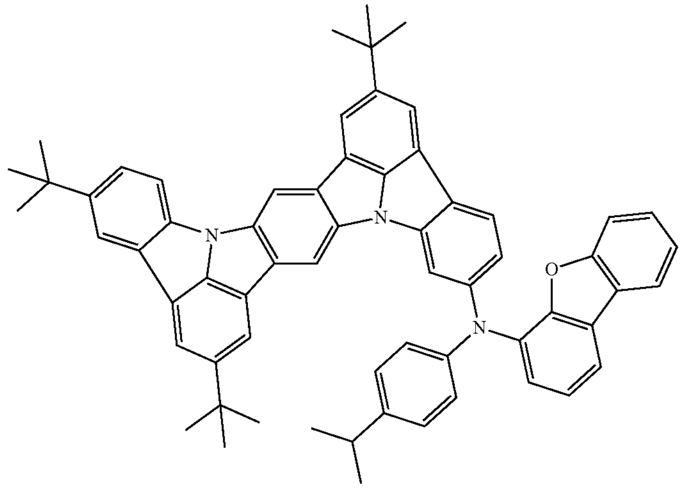
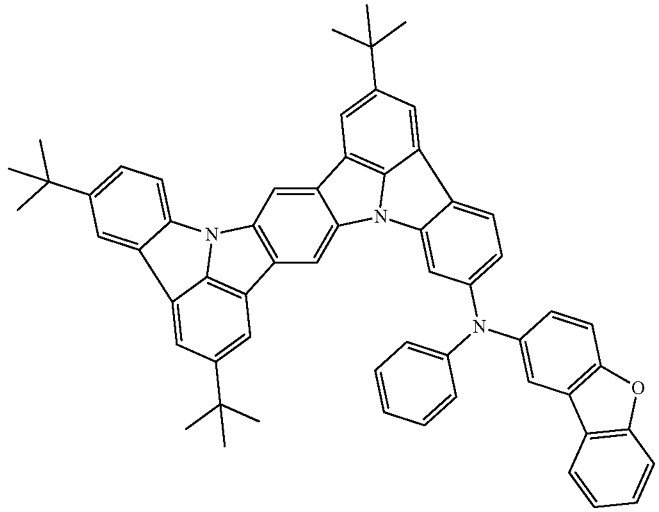

-continued
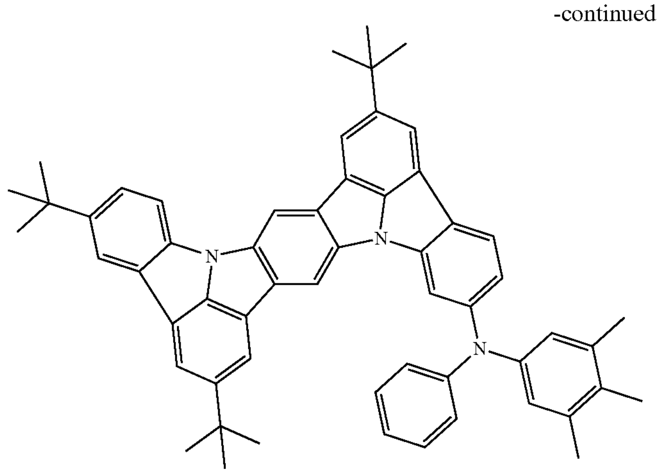
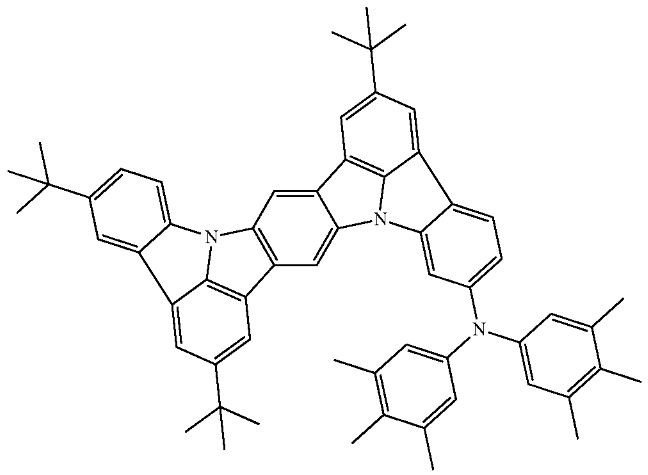
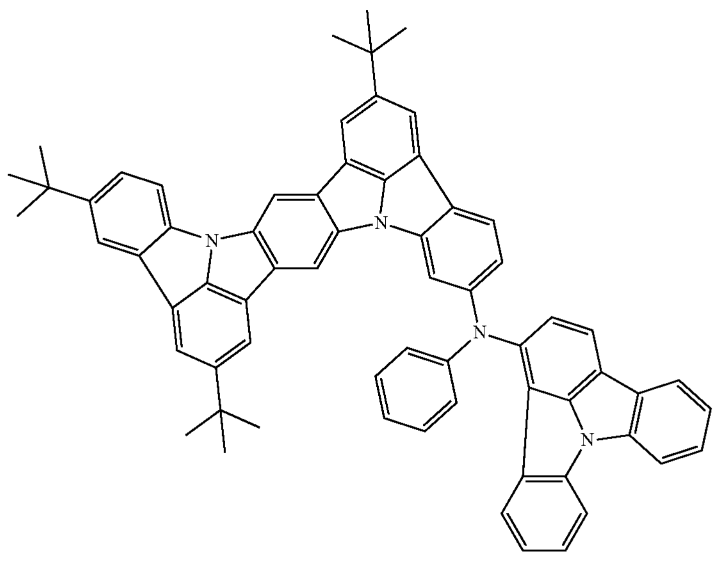

-continued
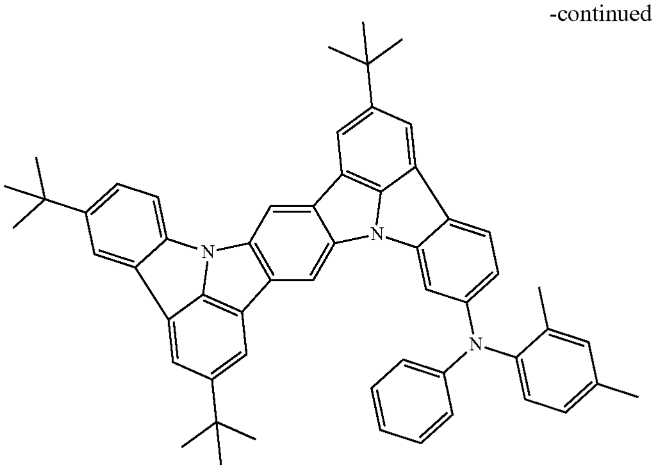
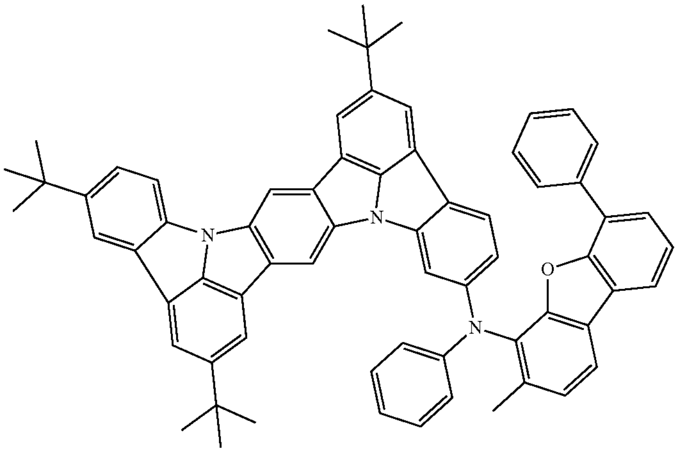
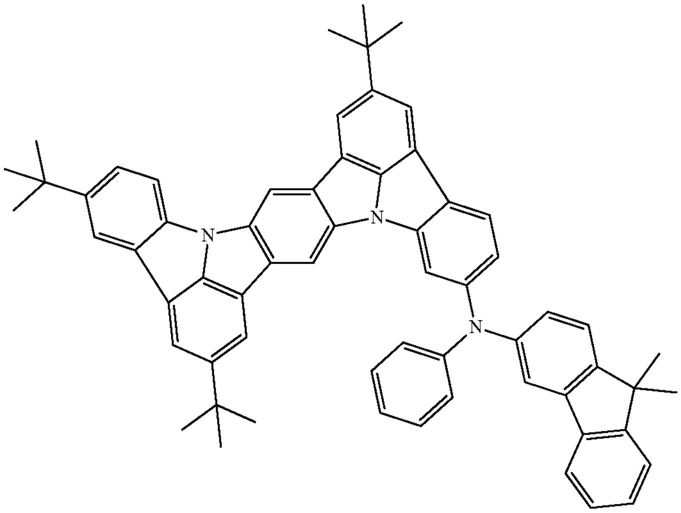

-continued
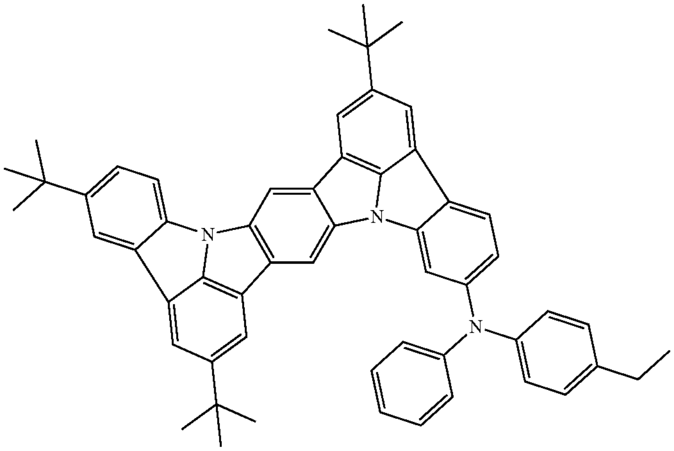
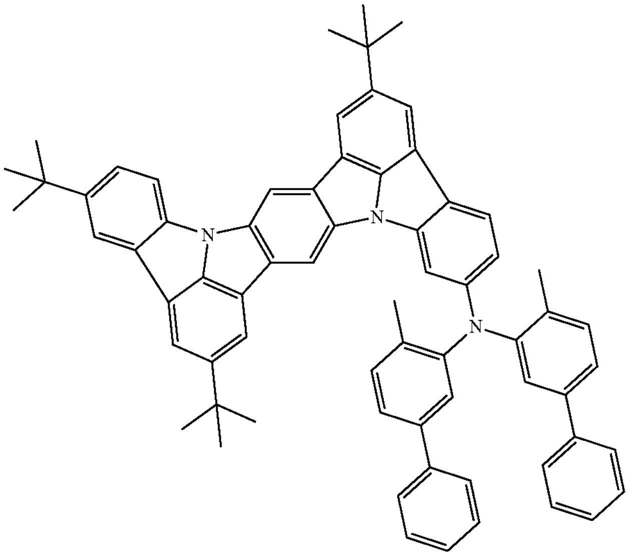
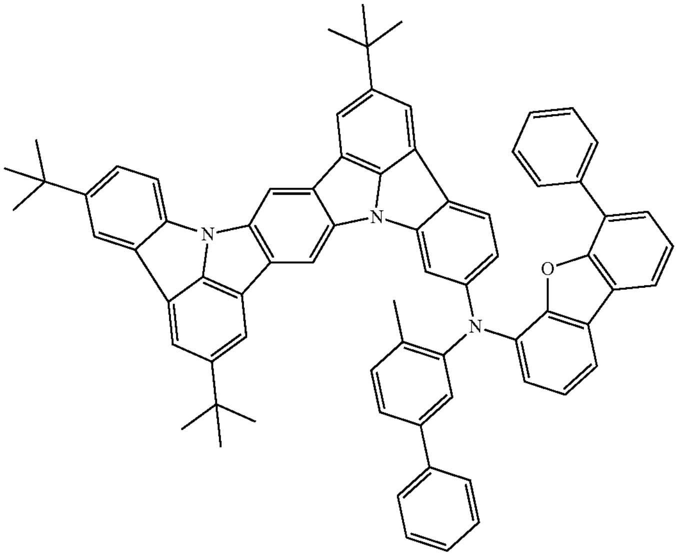

-continued
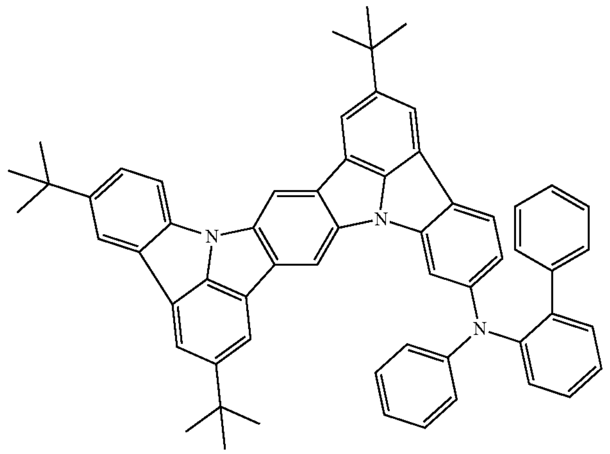
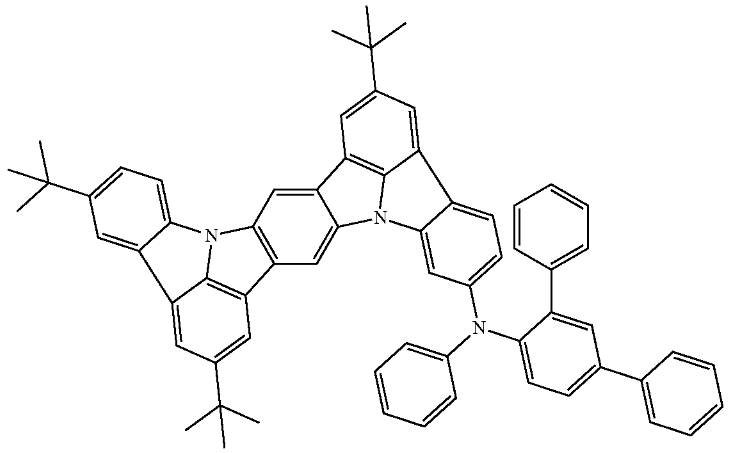
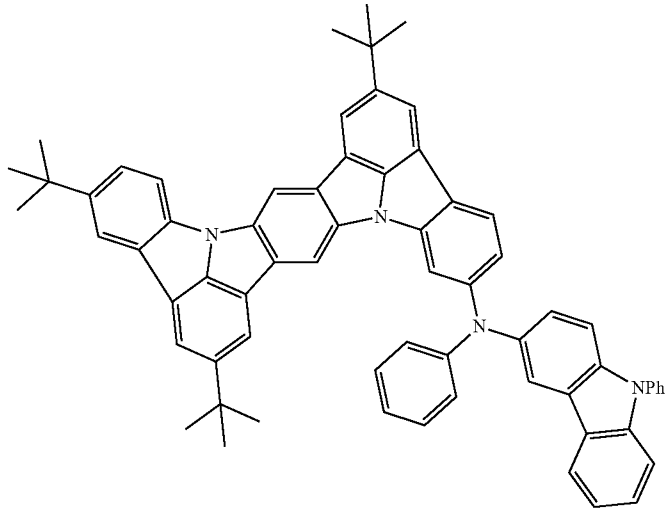

-continued
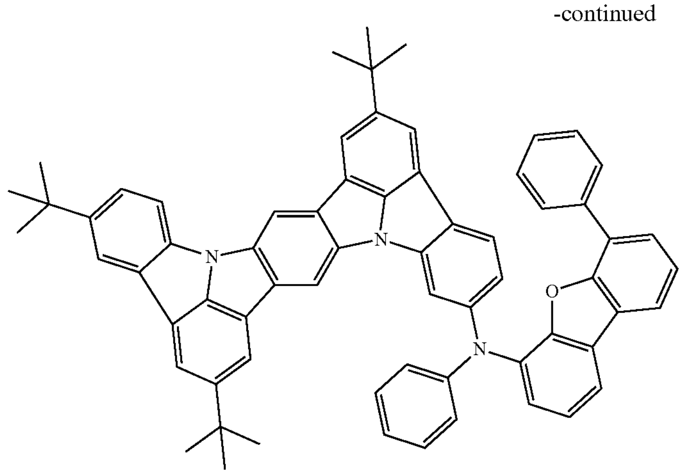
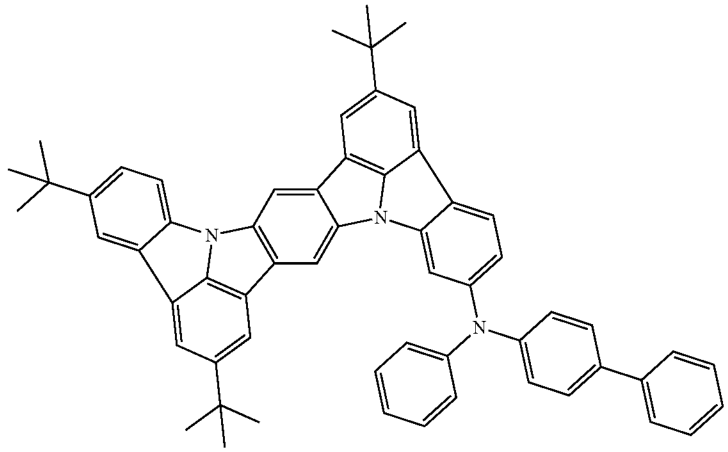
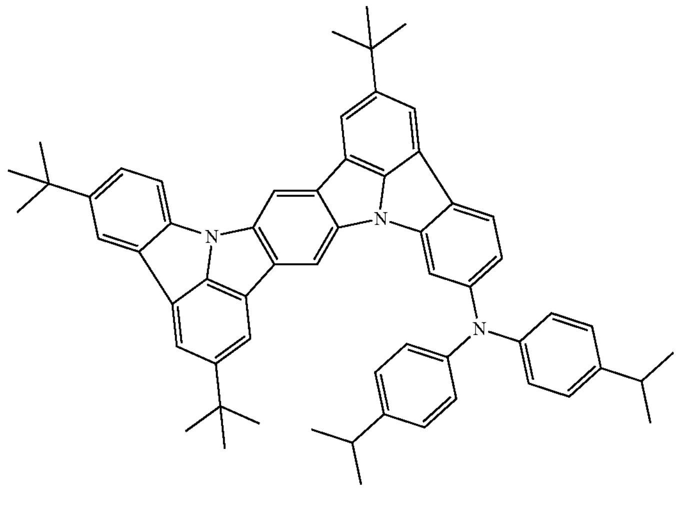

-continued
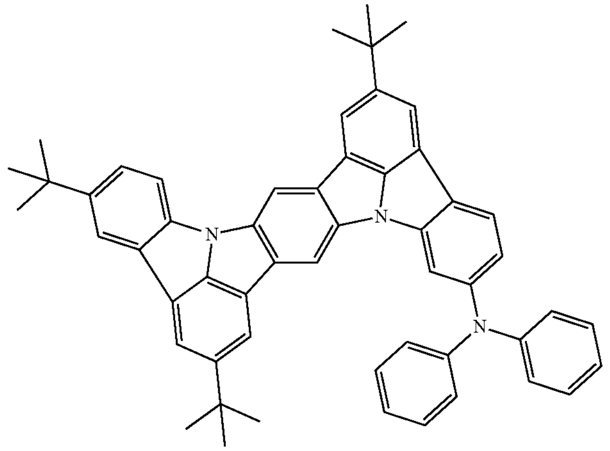
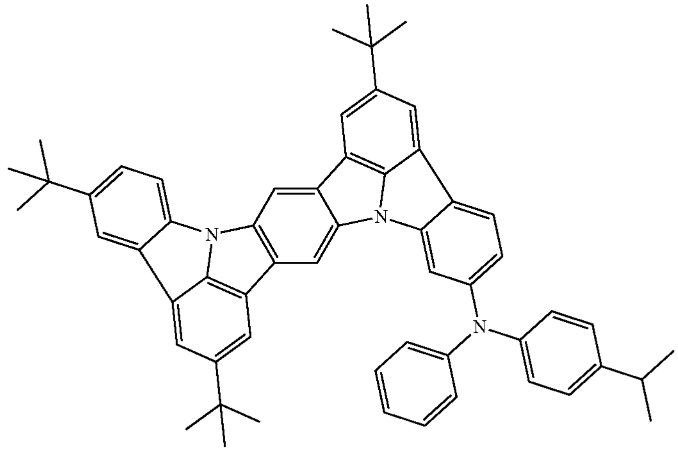
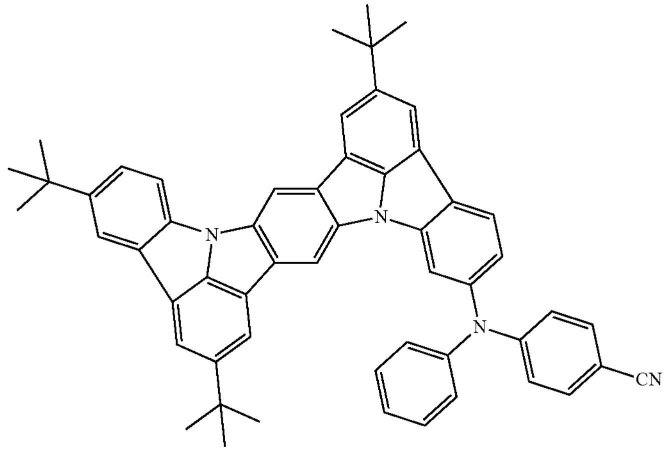

-continued
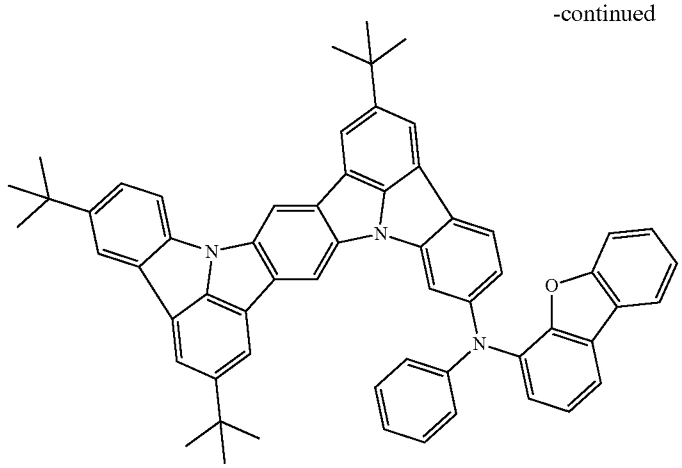
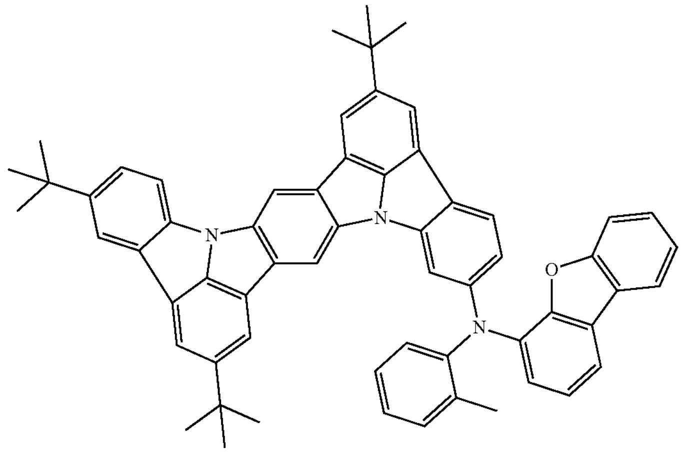
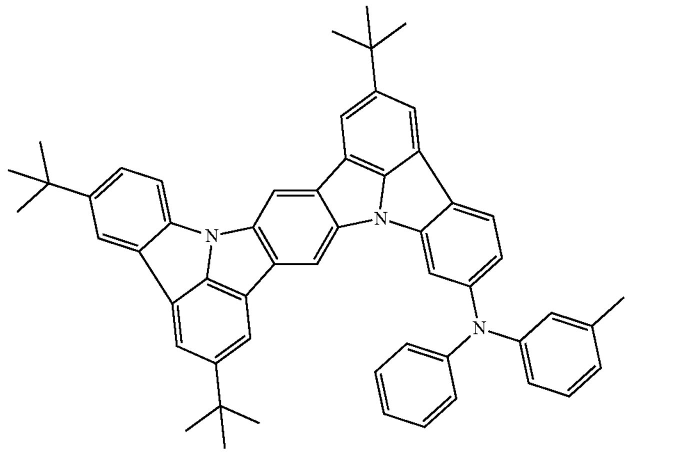

-continued
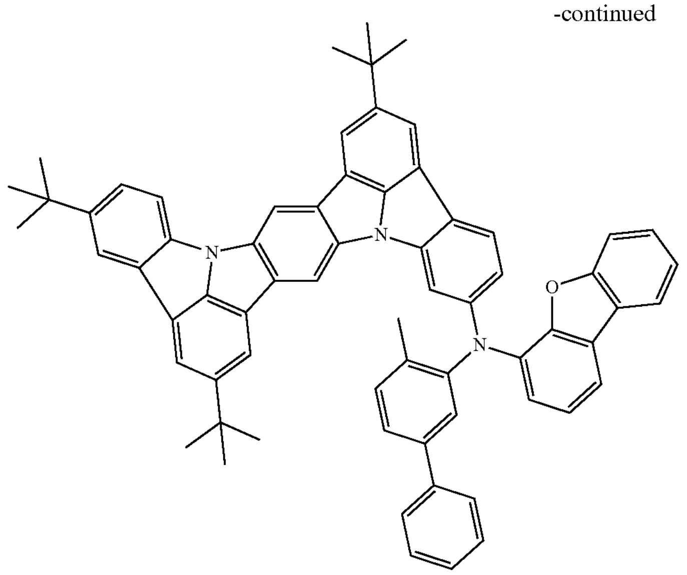
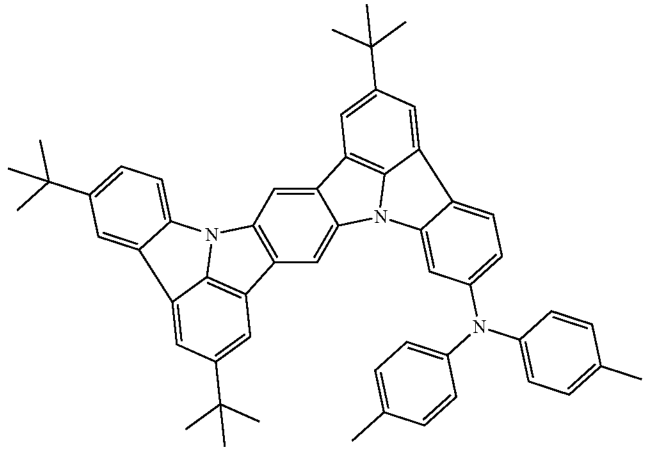
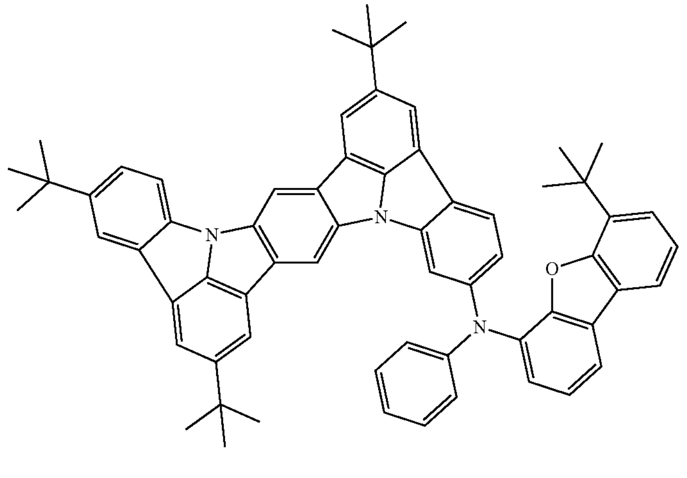

-continued
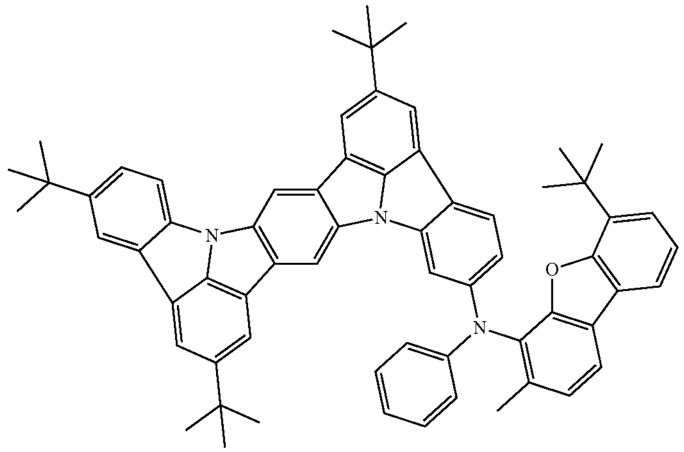
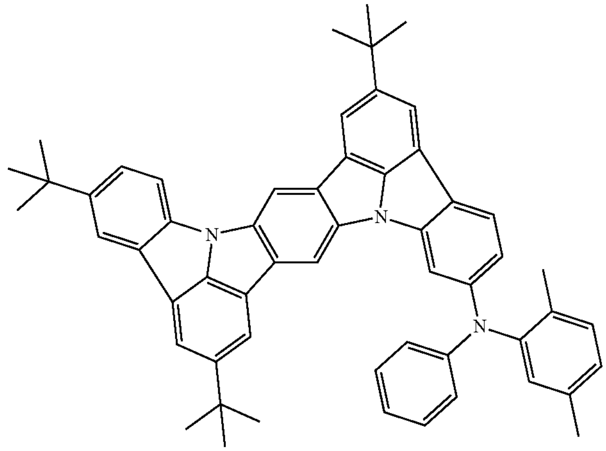
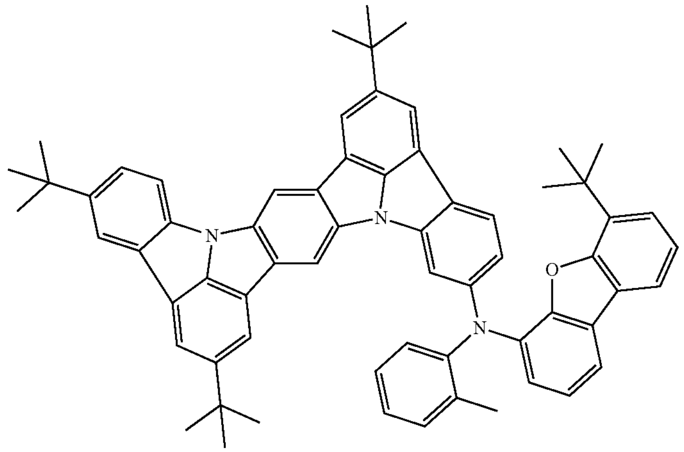

-continued
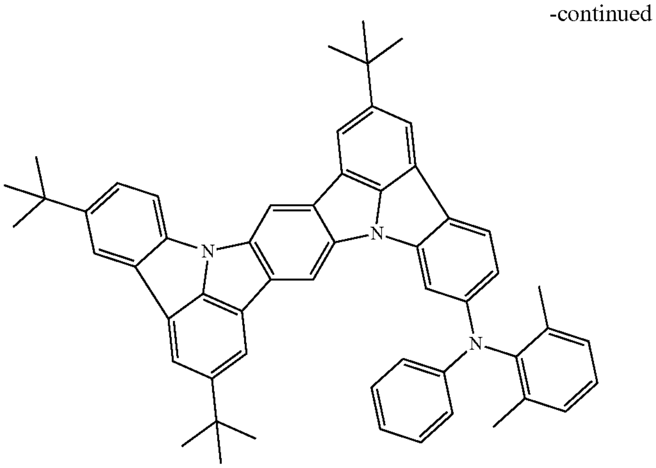
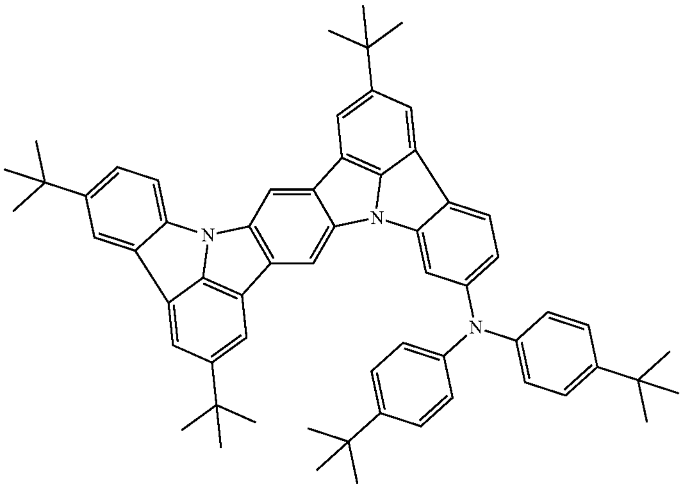
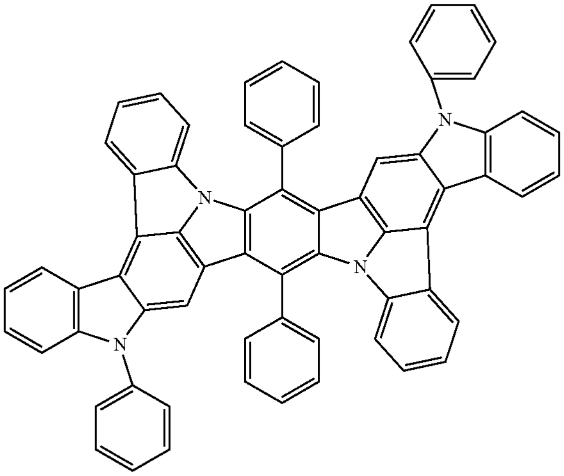

-continued
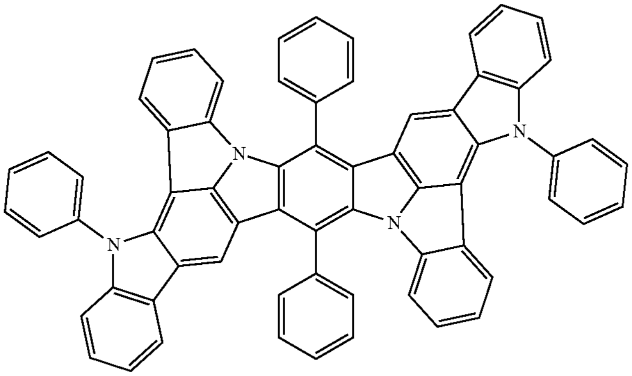
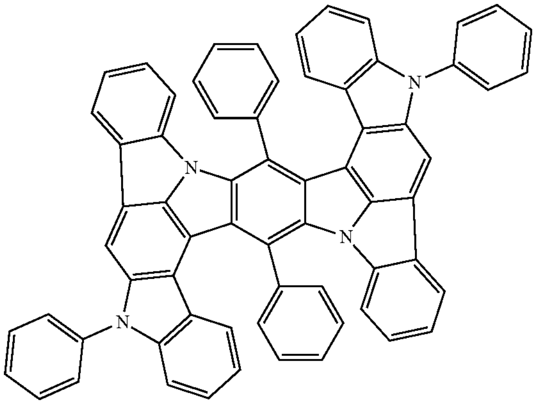
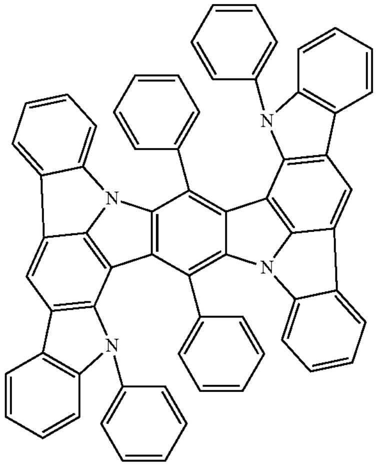
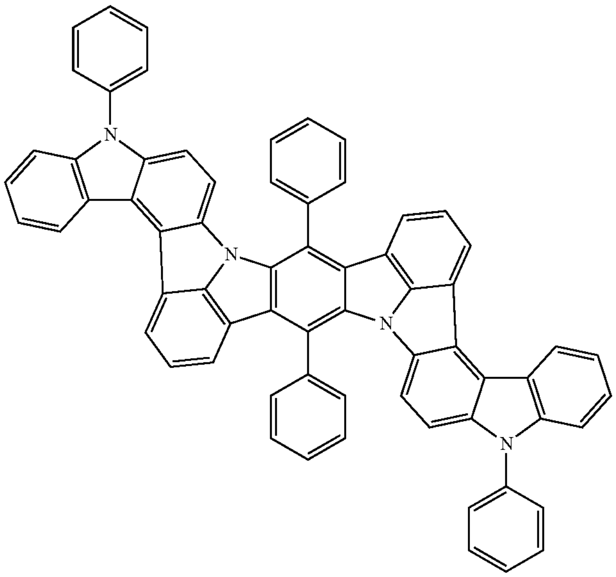
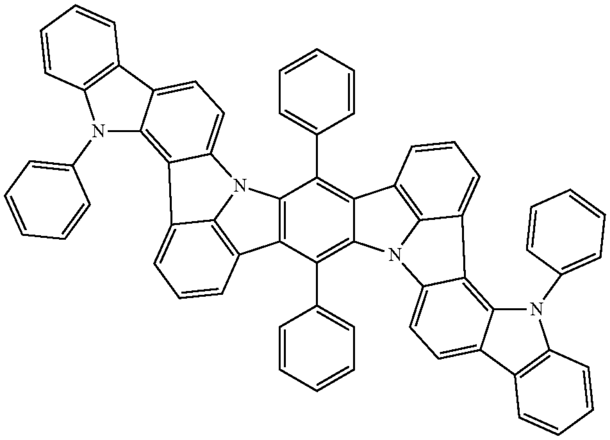
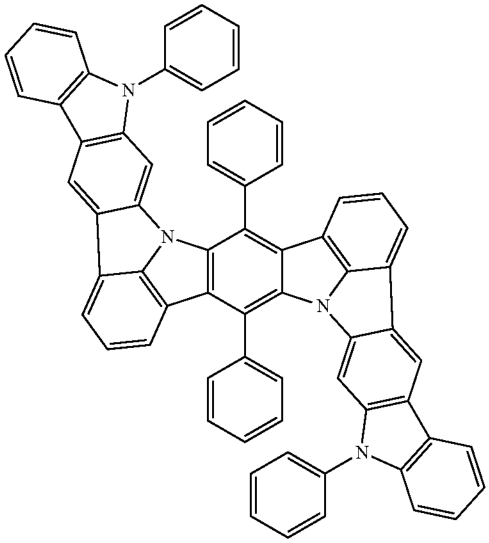

-continued
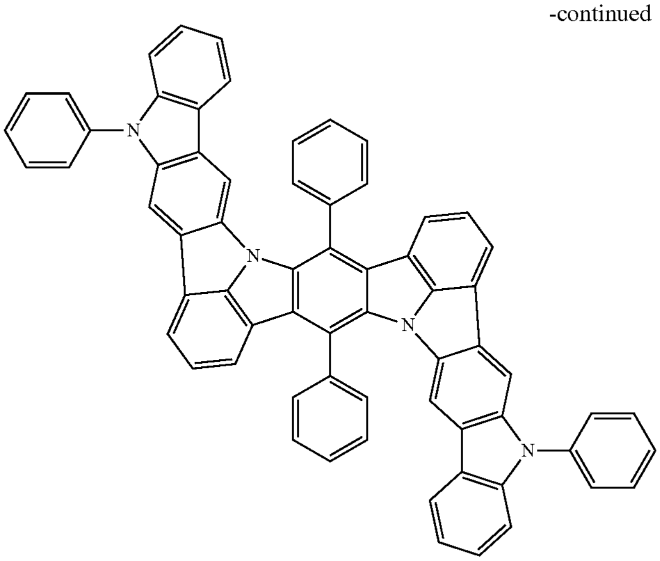
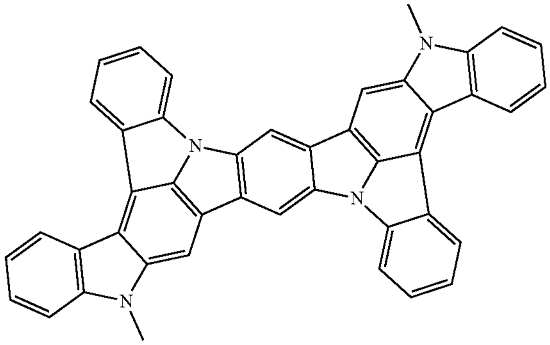
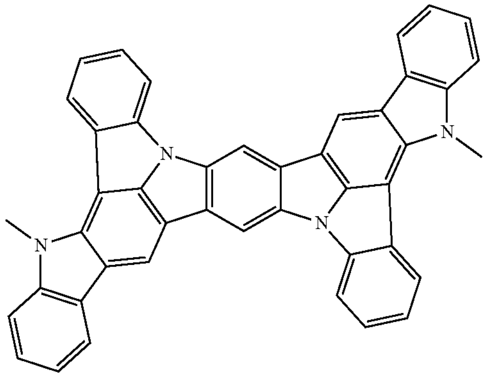
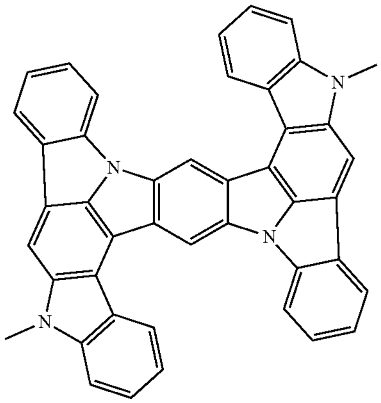
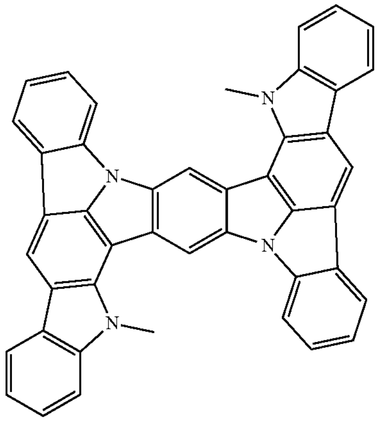

-continued
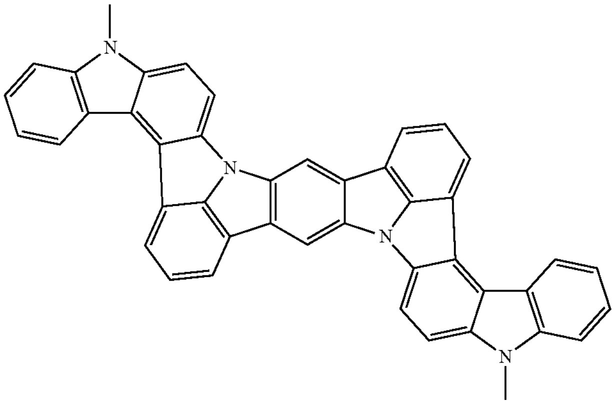
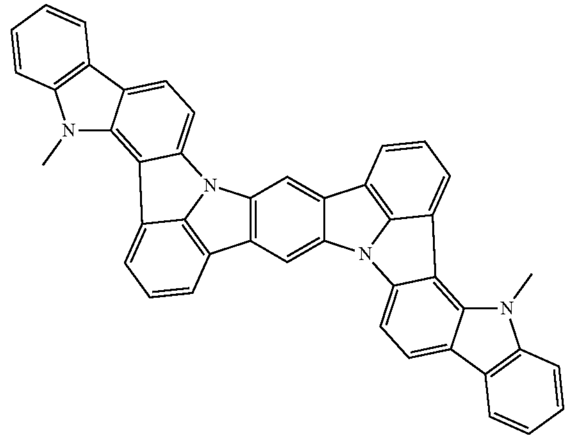
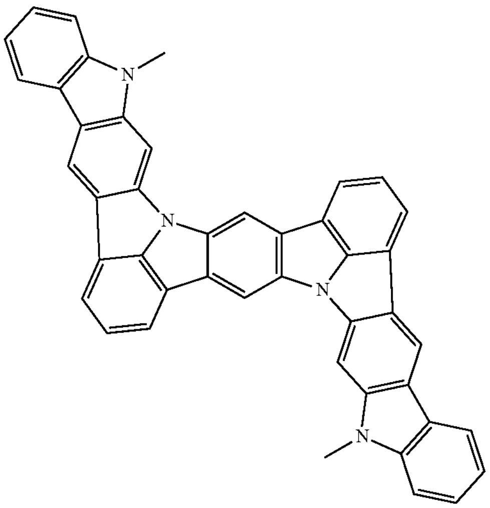
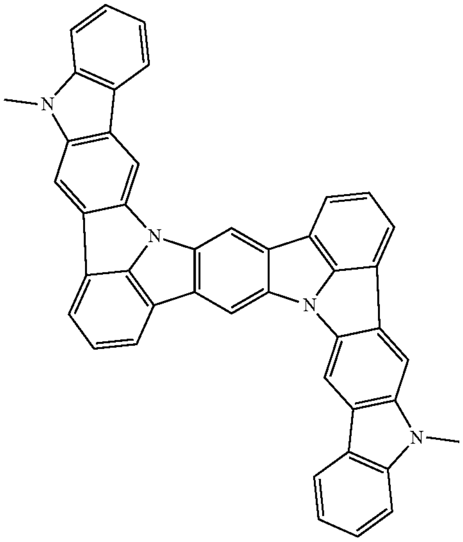
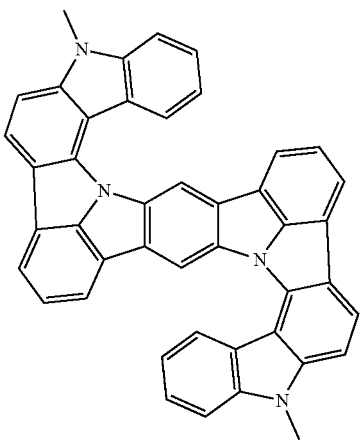
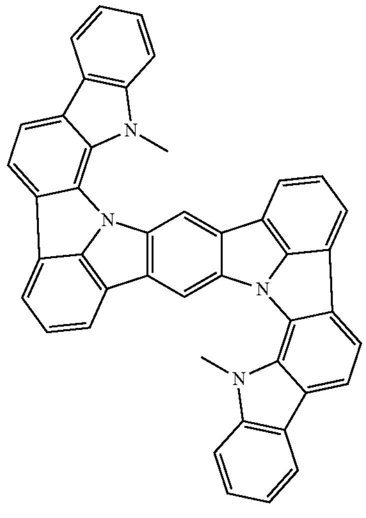

-continued
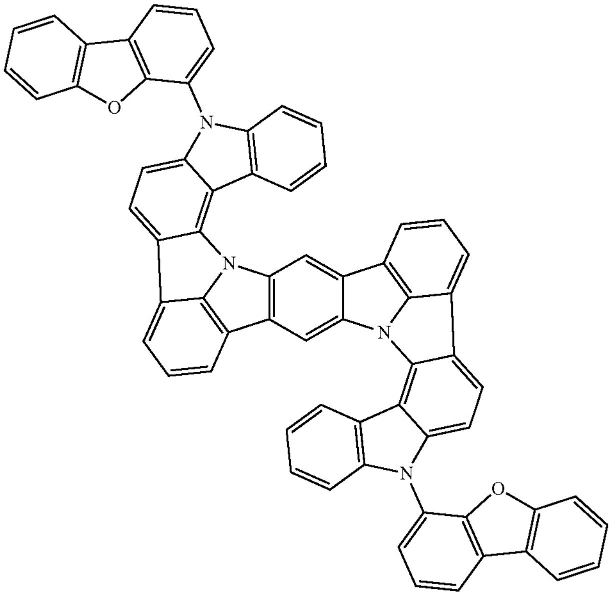
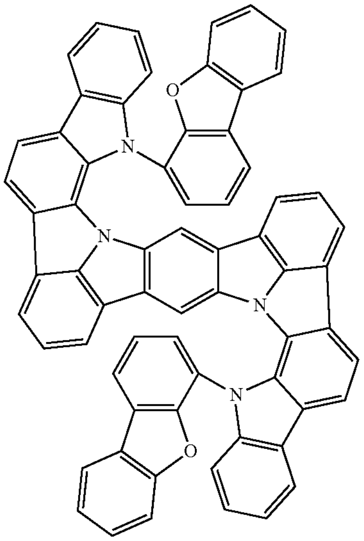
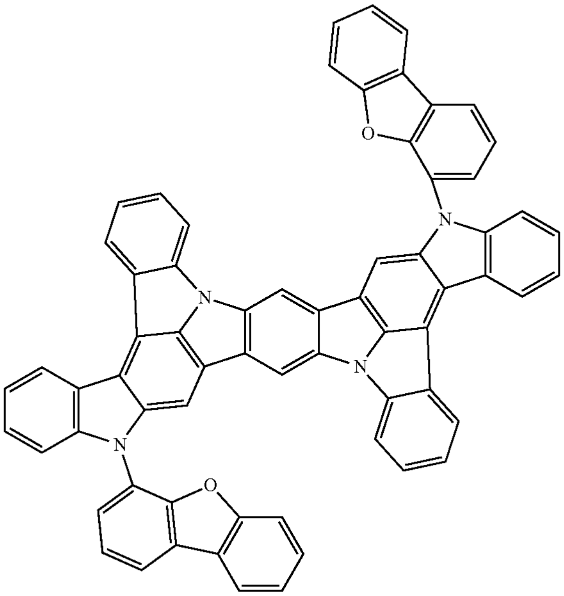
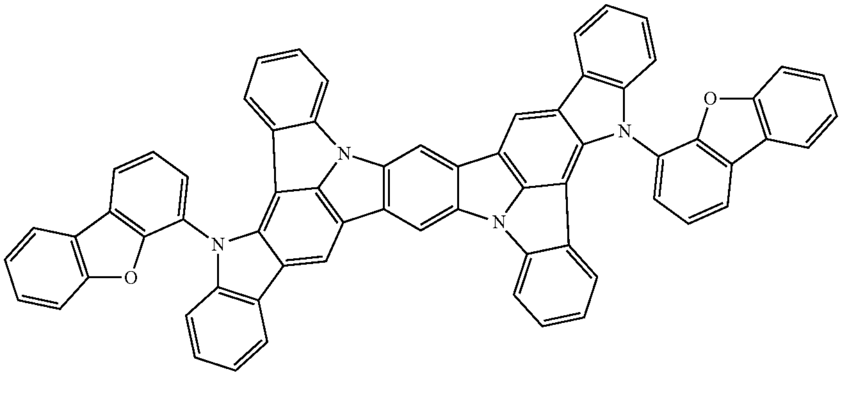

-continued
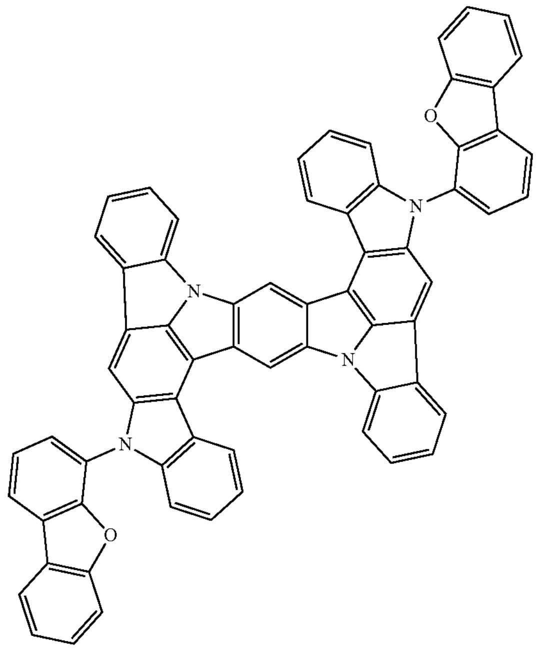
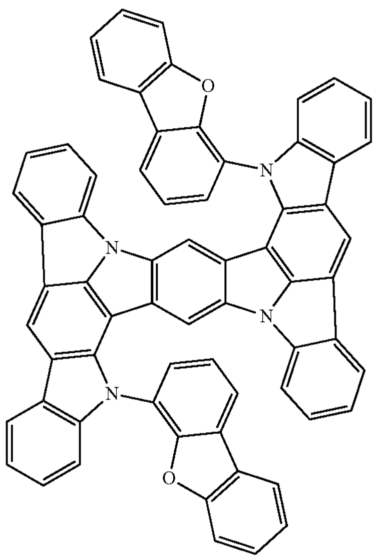
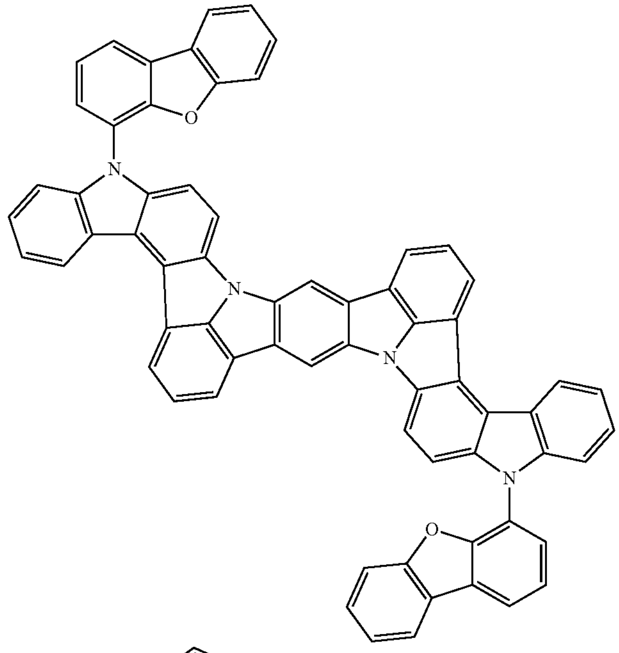
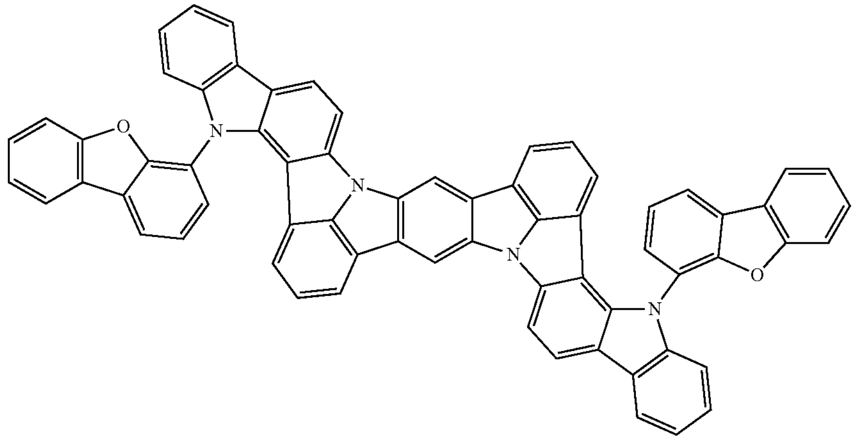

-continued
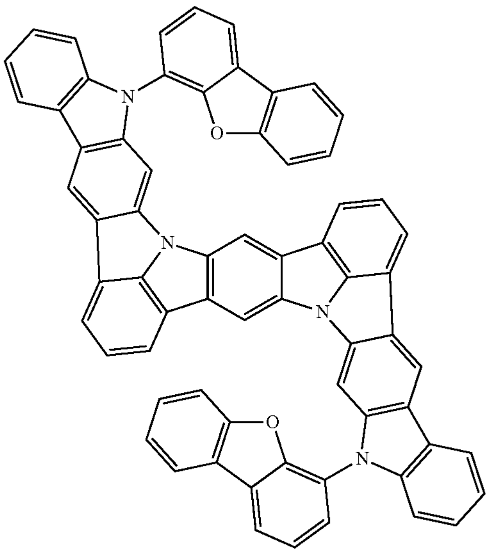
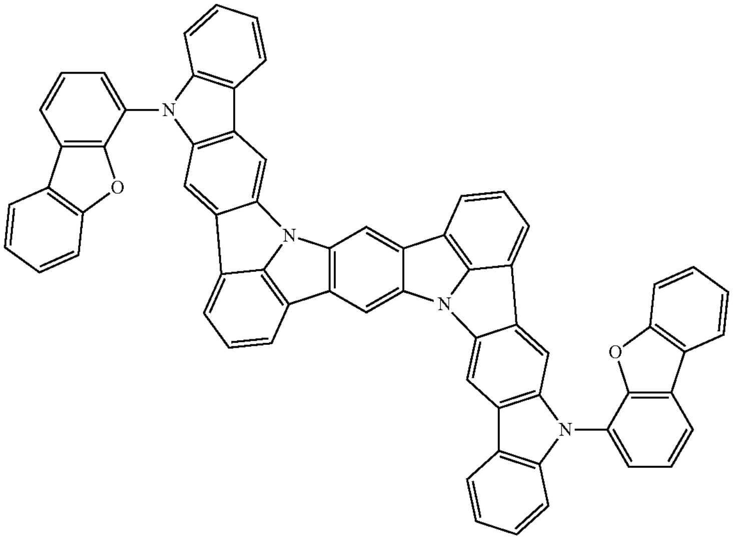
-continued
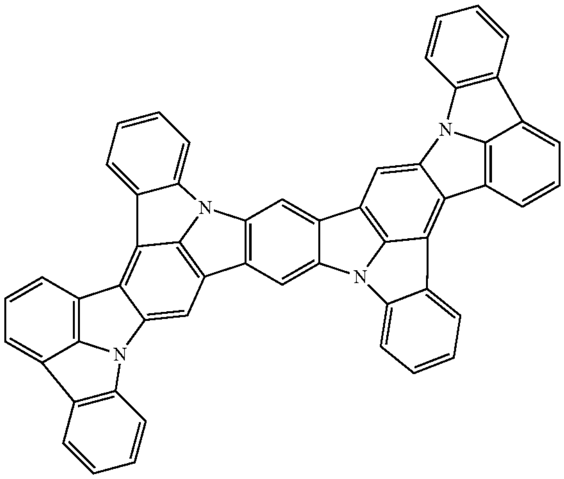
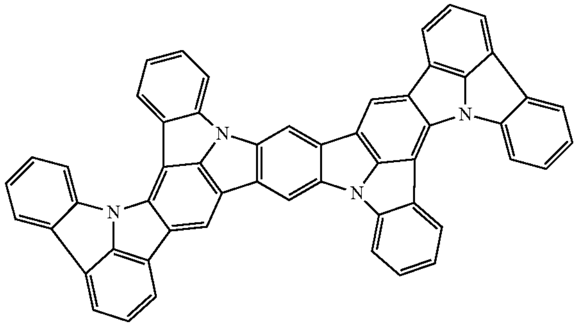

-continued
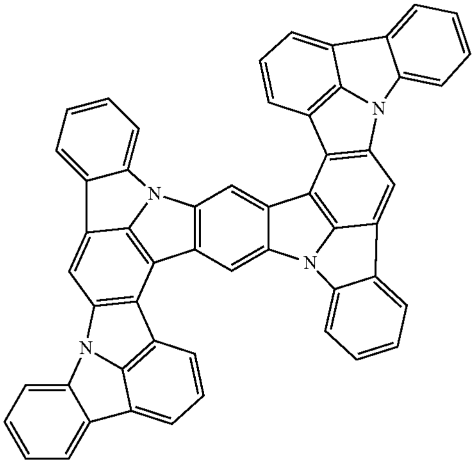
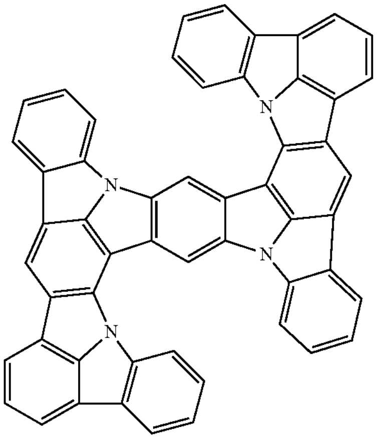
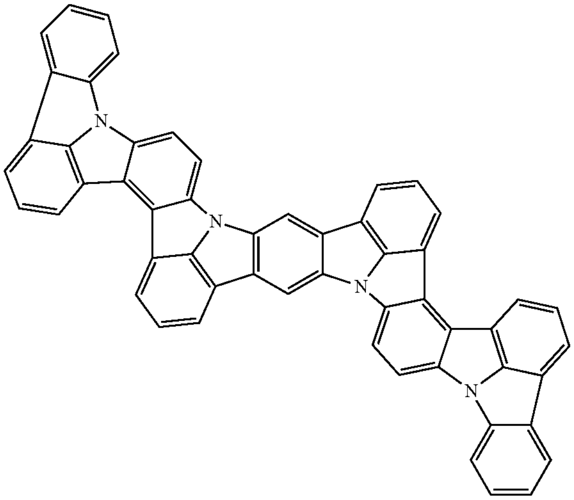
-continued
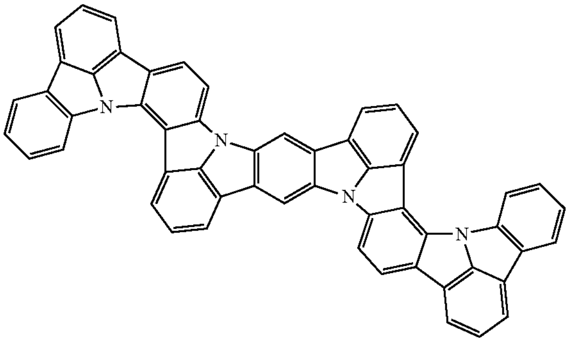
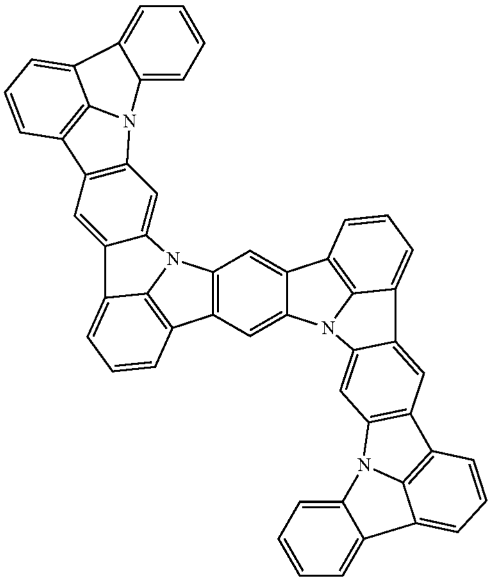
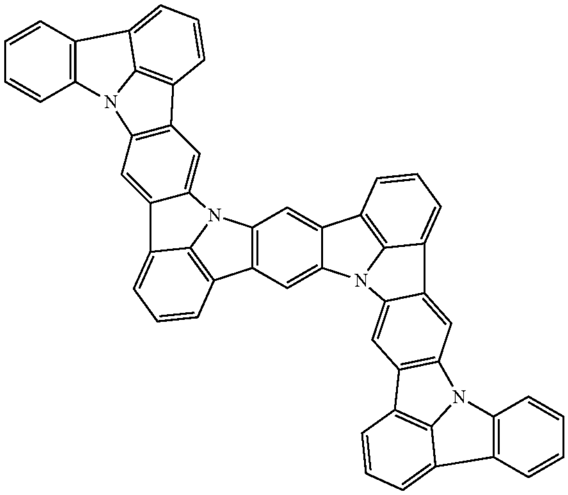

-continued
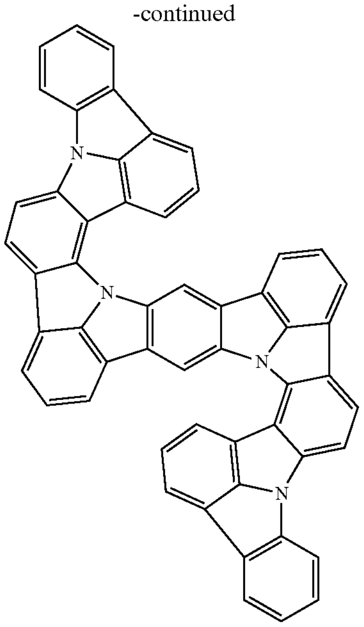
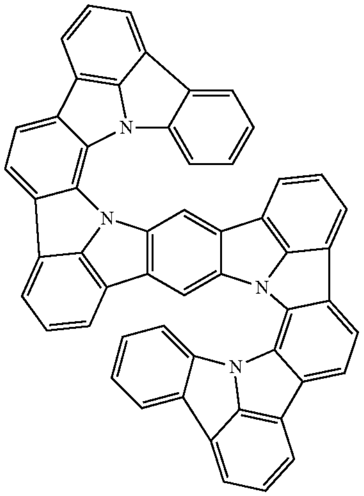
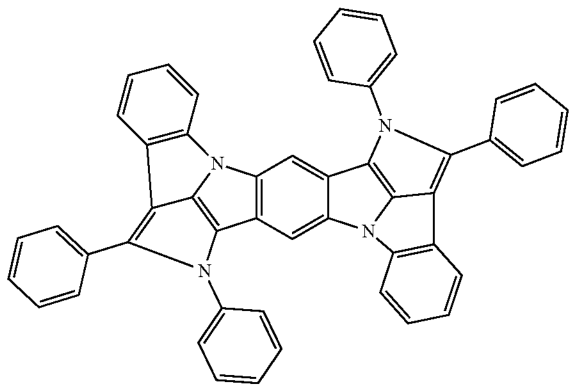
-continued
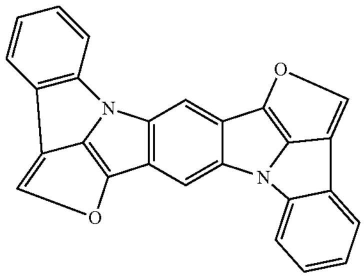
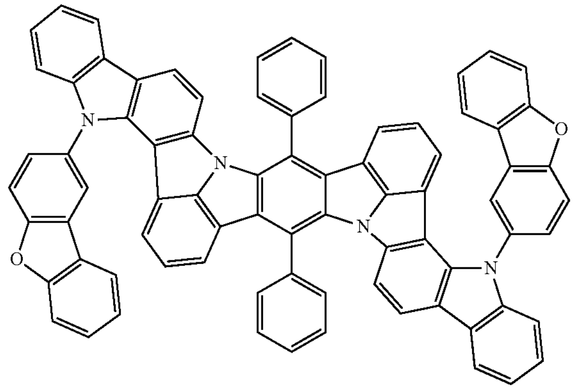
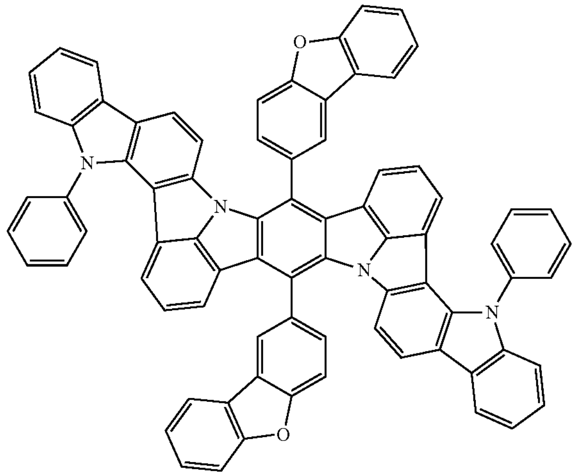
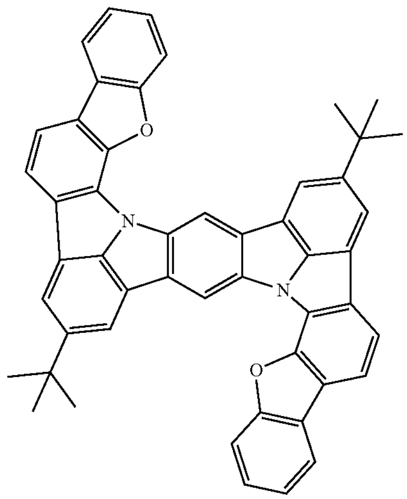

-continued

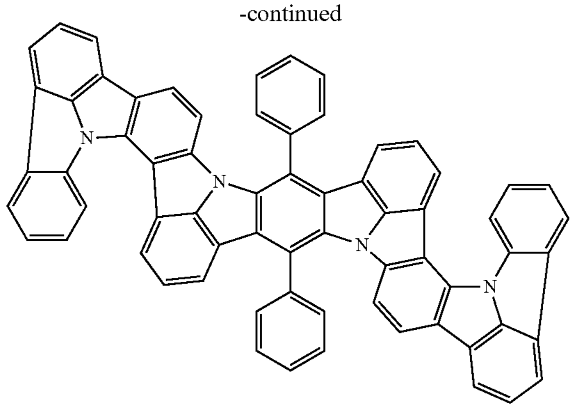

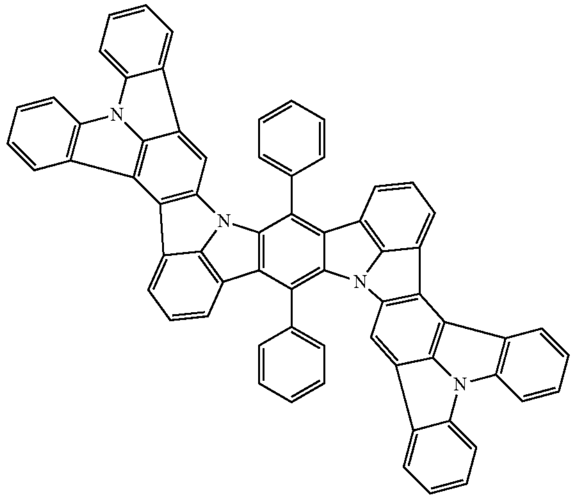

(Compound Represented by Formula (41))

The compound represented by the formula (41) is explained below:

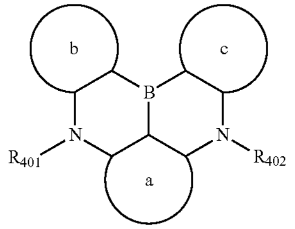

(41)

In the formula (41), ring a, ring b and ring c are independently a substituted or unsubstituted aromatic hydrocarbon ring including 6 to 50 ring carbon atoms, or a substituted or unsubstituted heterocycle including 5 to 50 ring atoms;

$R_{401}$ and $R_{402}$ are independently bonded to the ring a, the ring b or the ring c to form a substituted or unsubstituted heterocycle, or do not form a substituted or unsubstituted heterocycle;

$R_{401}$ and $R_{402}$ that do not form the substituted or unsubstituted heterocycle are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

The ring a, the ring b and the ring c are rings (a substituted or unsubstituted aromatic hydrocarbon ring including 6 to 50 ring carbon atoms or a substituted or unsubstituted heterocycle including 5 to 50 ring atoms) which are fused to the fused bicyclic structure composed of a B atom and two N atoms in the center of the formula (41).

The "aromatic hydrocarbon ring" for the ring a, the ring b and the ring c has the structure same as the compound obtained by introducing a hydrogen atom into the "aryl group" described above. The "aromatic hydrocarbon ring" for the ring a contains three carbon atoms in the fused bicyclic structure in the center of the formula (41) as ring atoms. The "aromatic hydrocarbon ring" of the ring b and the ring c contain two carbon atoms in the fused bicyclic structure in the center of the formula (41) as the ring atoms. As examples of the "substituted or unsubstituted aromatic hydrocarbon ring including 6 to 50 ring carbon atoms", compounds in which a hydrogen atom is introduced into the "aryl group" described in the specific example group G1 and the like can be given.

The "heterocycle" for the ring a, the ring b and the ring c has the structure same as the compound obtained by introducing a hydrogen atom into the "heterocyclic group" described above. The "heterocycle" for the ring a contains three carbon atoms in the fused bicyclic structure in the center of the formula (41) as the ring atoms. The "heterocycle" for the ring b and the ring c contain two carbon atoms in the fused bicyclic structure in the center of the formula (41) as the ring atoms. As examples of the "substituted or unsubstituted heterocycle including 5 to 50 ring atoms", compounds in which a hydrogen atom is introduced into the "heterocyclic group" described in the specific example group G2.

$R_{401}$ and $R_{402}$ may be independently bonded to the ring a, the ring b or the ring c to form a substituted or unsubstituted heterocycle. In this case, the heterocycle contains the nitrogen atom in the fused bicyclic structure in the center of the formula (41). In this case, the heterocycle may contain a heteroatom other than the nitrogen atom. "$R_{401}$ and $R_{402}$ are bonded to the ring a, the ring b or the ring c" means, specifically, an atom forming the ring a, the ring b or the ring c is bonded to an atom forming $R_{401}$ and $R_{402}$. For example, $R_{401}$ may be bonded to the ring a to form a nitrogen-containing heterocycle including a fused bicyclic structure (or fused tricyclic or fused more polycyclic structure) in which a ring containing $R_{401}$ and the ring a are fused. Specific examples of the nitrogen-containing heterocycle include compounds corresponding to the fused bicyclic or more fused polycyclic heterocyclic groups containing nitrogen among the specific example groups G2, and the like.

The same applies to the case where $R_{401}$ is bonded to the ring b, $R_{402}$ is bonded to the ring a, and $R_{402}$ is bonded to the ring c.

In one embodiment, the ring a, the ring b and the ring c in the formula (41) are independently a substituted or unsubstituted aromatic hydrocarbon ring including 6 to 50 ring carbon atoms.

In one embodiment, the ring a, the ring b and the ring c in the formula (41) are independently a substituted or unsubstituted benzene ring or a substituted or unsubstituted naphthalene ring.

In one embodiment, $R_{401}$ and $R_{402}$ in the formula (41) are independently a substituted or unsubstituted aryl group including 6 to 50 ring carbon atoms, or a substituted or unsubstituted monovalent heterocyclic group including 5 to 50 ring atoms, and preferably a substituted or unsubstituted aryl group including 6 to 50 ring carbon atoms.

In one embodiment, the compound represented by the formula (41) is a compound represented by the following formula (42):

(42)

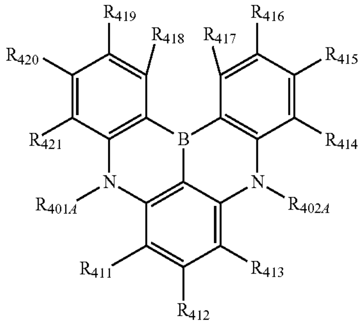

In the formula (42), $R_{401A}$ is bonded with one or more selected from the group consisting of $R_{411}$ and $R_{421}$ to form a substituted or unsubstituted heterocycle, or does not form a substituted or unsubstituted heterocycle; $R_{402A}$ is bonded with one or more selected from the group consisting of $R_{413}$ or $R_{414}$ to form a substituted or unsubstituted heterocycle, or does not form a substituted or unsubstituted heterocycle;

$R_{401A}$ and $R_{402A'}$ that do not form the substituted or unsubstituted heterocycle are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

one or more sets of two or more adjacent groups of $R_{411}$ to $R_{421}$ are bonded with each other to form a substituted or unsubstituted, saturated or unsaturated ring, or do not form a substituted or unsubstituted, saturated or unsaturated ring;

$R_{411}$ to $R_{421}$ that do not form the substituted or unsubstituted heterocycle or the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

$R_{401A}$ and $R_{402A}$ in the formula (42) are groups corresponding to $R_{401}$ and $R_{402}$ in the formula (41).

$R_{401A}$ and $R_{411}$ may be bonded with each other to form a nitrogen-containing fused bicyclic (or fused tricyclic or more fused polycyclic) heterocycle in which formed by condensing a ring containing $R_{401A}$ and $R_{411}$ with the benzene ring corresponding to the ring a, for example. As examples of the nitrogen-containing heterocycle, compounds corresponding to nitrogen-containing fused bicyclic or more fused polycyclic heterocyclic group among the specific example group G2 can be given. The same applies to the cases where $R_{401A}$ and $R_{412}$ are bonded, $R_{402A}$ and $R_{413}$ are bonded, and $R_{402A}$ and $R_{414}$ are bonded.

One or more sets of two or more adjacent groups of $R_{411}$ to $R_{421}$ may be bonded with each other to form a substituted or unsubstituted, saturated or unsaturated ring. For example, $R_{11}$ and $R_{12}$ may be bonded with each other to form a benzene ring, an indole ring, a pyrrole ring, a benzofuran ring, a benzothiophene ring or the like, which is fused to the six-membered ring to which $R_{411}$ and $R_{412}$ are bonded, and the formed fused ring is a naphthalene ring, a carbazole ring, an indole ring, a dibenzofuran ring or a dibenzothiophene ring.

In one embodiment, $R_{411}$ to $R_{421}$ that are not involved to form the ring are independently a hydrogen atom, a substituted or unsubstituted alkyl group including 1 to 50 carbon atoms, a substituted or unsubstituted aryl group including 6 to 50 ring carbon atoms, or a substituted or unsubstituted monovalent heterocyclic group including 5 to 50 ring atoms.

In one embodiment, $R_{411}$ to $R_{421}$ that are not involved to form the ring are independently a hydrogen atom, a substituted or unsubstituted aryl group including 6 to 50 ring carbon atoms, or a substituted or unsubstituted monovalent heterocyclic group including 5 to 50 ring atoms.

In one embodiment, $R_{411}$ to $R_{421}$ that are not involved to form the ring are independently a hydrogen atom or a substituted or unsubstituted alkyl group including 1 to 50 carbon atoms.

In one embodiment, $R_{411}$ to $R_{421}$ that are not involved to form the ring are independently a hydrogen atom, or a substituted or unsubstituted alkyl group including 1 to 50 carbon atoms, and at least one of $R_{411}$ to $R_{421}$ is a substituted or unsubstituted alkyl group including 1 to 50 carbon atoms.

In one embodiment, the compound represented by the formula (42) is a compound represented by the following formula (43).

(43)

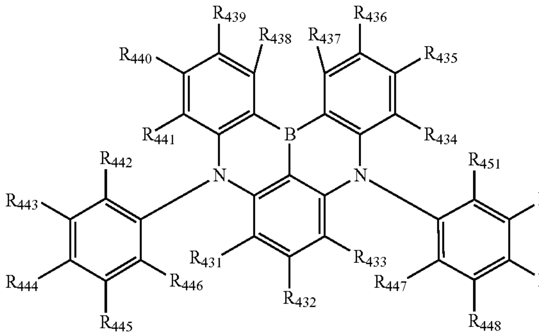

In the formula (43), $R_{431}$ is bonded with $R_{446}$ to form a substituted or unsubstituted heterocycle, or does not form a substituted or unsubstituted heterocycle; $R_{433}$ is bonded with $R_{447}$ to form a substituted or unsubstituted heterocycle, or does not form a substituted or unsubstituted heterocycle; $R_{434}$ is bonded with $R_{451}$ to form a substituted or unsubstituted heterocycle, or does not form a substituted or unsubstituted heterocycle; and $R_{441}$ is bonded with $R_{442}$ to form a substituted or unsubstituted heterocycle, or does not form a substituted or unsubstituted heterocycle;

one or more sets of two or more adjacent groups of $R_{431}$ to $R_{451}$ are bonded with each other to form a substituted or unsubstituted, saturated or unsaturated ring, or do not form a substituted or unsubstituted, saturated or unsaturated ring;

$R_{431}$ to $R_{451}$ that do not form the substituted or unsubstituted heterocycle and do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

$R_{431}$ may bond to $R_{446}$ to form a substituted or unsubstituted heterocycle. For example, $R_{431}$ may bonds with $R_{446}$ to form a nitrogen-containing fused tricyclic or more fused polycyclic heterocycle in which the benzene ring to which $R_{46}$ is bonded, a nitrogen-containing ring and the benzene ring corresponding to the ring a are condensed. As examples of such a nitrogen-containing heterocycle, compounds corresponding to nitrogen-containing heterocyclic groups including a fused tricyclic or more fused polycyclic structure in the specific example group G2 can be given. The same applies to the cases where $R_{433}$ and $R_{447}$ are bonded, $R_{434}$ and $R_{451}$ are bonded, and $R_{441}$ and $R_{442}$ are bonded.

In one embodiment, $R_{431}$ to $R_{451}$ that are not involved to form a ring are independently, a hydrogen atom, a substituted or unsubstituted alkyl group including 1 to 50 carbon atoms, a substituted or unsubstituted aryl group including 6 to 50 ring carbon atoms, or a substituted or unsubstituted monovalent heterocyclic group including 5 to 50 ring atoms.

In one embodiment, $R_{431}$ to $R_{451}$ that are not involved to form the ring are independently, a hydrogen atom, a substituted or unsubstituted aryl group including 6 to 50 ring carbon atoms, or a substituted or unsubstituted monovalent heterocyclic group including 5 to 50 ring atoms.

In one embodiment, $R_{431}$ to $R_{451}$ that are not involved to form the ring are independently a hydrogen atom or a substituted or unsubstituted alkyl group including 1 to 50 carbon atoms.

In one embodiment, $R_{431}$ to $R_{451}$ that are not involved to form the ring are independently a hydrogen atom, or a substituted or unsubstituted alkyl group including 1 to 50 carbon atoms, and at least one of $R_{431}$ to $R_{451}$ is a substituted or unsubstituted alkyl group including 1 to 50 carbon atoms.

In one embodiment, the compound represented by the formula (43) is a compound represented by the following formula (43A).

(43A)

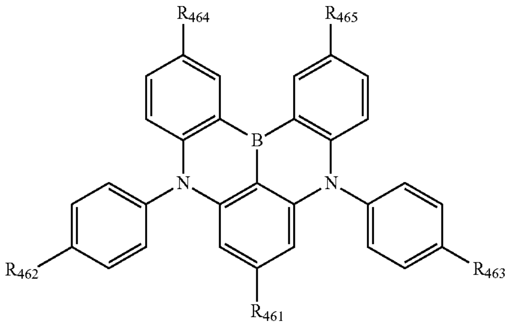

In the formula (43A), $R_{461}$ is a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms; and $R_{462}$ to $R_{465}$ are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms.

In one embodiment, $R_{461}$ to $R_{465}$ are independently a substituted or unsubstituted alkyl group including 1 to 50 carbon atoms, or a substituted or unsubstituted aryl group including 6 to 50 ring carbon atoms.

In one embodiment, $R_{461}$ and $R_{465}$ are independently a substituted or unsubstituted alkyl group including 1 to 50 carbon atoms.

In one embodiment, the compound represented by the formula (43) is a compound represented by the following formula (43B).

(43B)

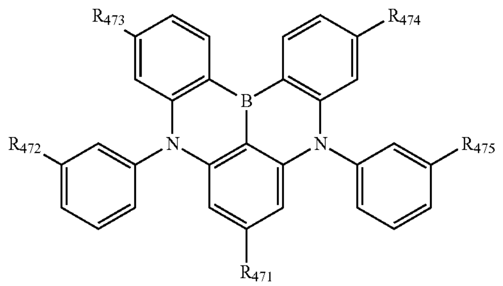

In the formula (43B), $R_{471}$ and $R_{472}$ are independently, a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$N(R_{906})(R_{907})$, or a substituted or unsubstituted aryl group including 6 to 50 ring carbon atoms;

$R_{473}$ to $R_{475}$ are independently, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$N(R_{906})(R_{907})$, or a substituted or unsubstituted aryl group including 6 to 50 ring carbon atoms; and $R_{906}$ and $R_{907}$ are as defined in the formulas (1).

In one embodiment, the compound represented by the formula (43) is a compound represented by the following formula (43B').

(43B')

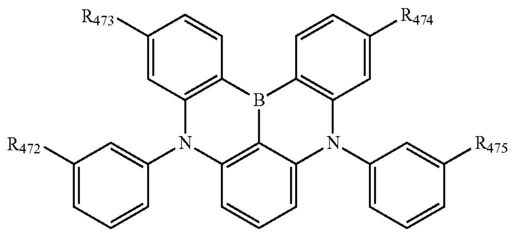

In the formula (43B'), $R_{472}$ to $R_{475}$ are as defined in the formula (43B).

In one embodiment, at least one of $R_{471}$ to $R_{475}$ is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$N(R_{906})(R_{907})$, or a substituted or unsubstituted aryl group including 6 to 50 ring carbon atoms.

In one embodiment, $R_{472}$ is a hydrogen atom, a substituted or unsubstituted alkyl group including 1 to 50 carbon atoms, —$N(R_{906})(R_{907})$, or a substituted or unsubstituted aryl group including 6 to 50 ring carbon atoms; and $R_{471}$ and $R_{473}$ to $R_{475}$ are independently a substituted or unsubstituted alkyl group including 1 to 50 carbon atoms, —$N(R_{906})(R_{907})$, or a substituted or unsubstituted aryl group including 6 to 50 ring carbon atoms.

In one embodiment, the compound represented by the formula (43) is a compound represented by the following formula (43C).

(43C)

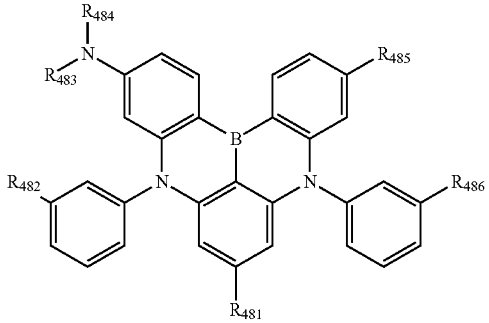

In the formula (43C), $R_{481}$ and $R_{482}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms; and $R_{483}$ to $R_{486}$ are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, or a substituted or unsubstituted aryl group including 6 to 50 ring carbon atoms.

In one embodiment, the compound represented by the formula (43) is a compound represented by the following formula (43C').

(43C')

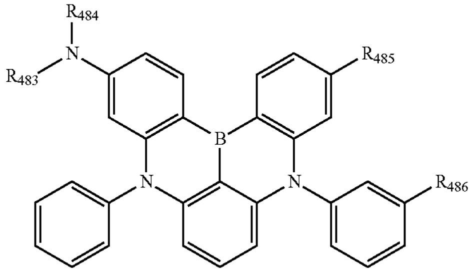

In the formula (43C'), $R_{483}$ to $R_{486}$ are as defined in the formula (43C).

In one embodiment, $R_{481}$ to $R_{486}$ are independently a substituted or unsubstituted alkyl group including 1 to 50 carbon atoms or a substituted or unsubstituted aryl group including 6 to 50 ring carbon atoms.

In one embodiment, $R_{481}$ to $R_{486}$ are independently a substituted or unsubstituted aryl group including 6 to 50 ring carbon atoms.

In one embodiment, the compound represented by the formula (43) is a compound represented by the following formula (43D).

(43D)

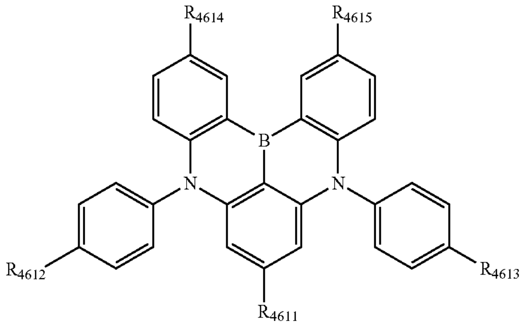

In the formula (43D), $R_{4611}$ is a hydrogen atom, an unsubstituted alkyl group including 1 to 6 carbon atoms, an unsubstituted cycloalkyl group including 3 to 10 ring carbon atoms, —$Si(R_{911})(R_{912})(R_{913})$, or —$N(R_{914})(R_{915})$;

$R_{4612}$ to $R_{4615}$ are independently an unsubstituted alkyl group including 1 to 6 carbon atoms, an unsubstituted cycloalkyl group including 3 to 10 ring carbon atoms, or —$Si(R_{911})(R_{912})(R_{913})$;

$R_{911}$ to $R_{913}$ are independently an unsubstituted alkyl group including 1 to 6 carbon atoms or an unsubstituted aryl group including 6 to 18 ring carbon atoms; and $R_{914}$ to $R_{915}$ are independently an unsubstituted aryl group having 6 to 18 ring carbon atoms.

In one embodiment, in the formula (43D), $R_{4611}$ is a hydrogen atom, an unsubstituted alkyl group including 1 to 6 carbon atoms, or —$N(R_{914})(R_{915})$.

In one embodiment, in the formula (43D), $R_{4612}$ to $R_{4615}$ are independently an unsubstituted alkyl group including 1 to 6 carbon atoms or an unsubstituted cycloalkyl group including 3 to 10 ring carbon atoms.

In one embodiment, in the formula (43D), $R_{4611}$ is —$N(R_{914})(R_{915})$, and $R_{4612}$ to $R_{4615}$ are independently an unsubstituted alkyl group including 1 to 6 carbon atoms.

In one embodiment, in the formula (43D), $R_{4611}$ is an unsubstituted alkyl group including 1 to 6 carbon atoms, and $R_{4612}$ to $R_{4615}$ are independently an unsubstituted alkyl group including 1 to 6 carbon atoms.

In one embodiment, in the formula (43D), $R_{4611}$ is a hydrogen atom, and $R_{4612}$ to $R_{4615}$ are independently an unsubstituted alkyl group including 1 to 6 carbon atoms or an unsubstituted cycloalkyl group including 3 to 10 ring carbon atoms.

In one embodiment, in the formula (43D), at least one hydrogen atom contained in one or more selected from the group consisting of $R_{914}$ and $R_{915}$ is a deuterium atom.

The compound represented by the formula (41) can be synthesized by the following method. An intermediate is obtained by bonding ring a, ring b and ring c with linking groups (a group containing N—$R_1$ and a group containing N—$R_2$) (first reaction), and a final compound is obtained by bonding the ring a, the ring b and the ring c with a linking group (a group containing B) (second reaction). In the first reaction, an amination reaction such as Buchwald-Hartwig reaction can be applied. In the second reaction, tandem hetero-Friedel-Crafts reaction or the like can be applied.

Examples of the compound represented by the formula (41) are described below. They are just exemplified compounds, and the compound represented by the formula (41) is not limited to the following examples. In the following specific examples, "Me" represents a methyl group, and "tBu" represents a tert-butyl group.

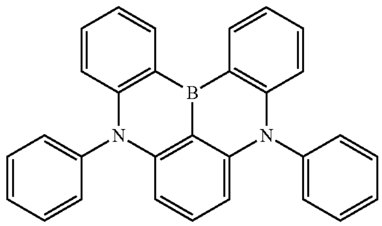

-continued
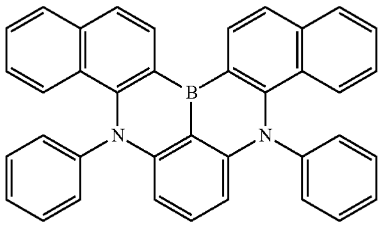
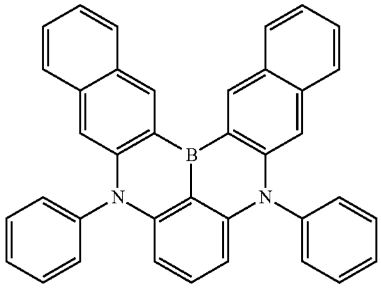
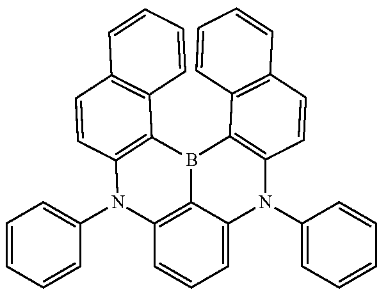
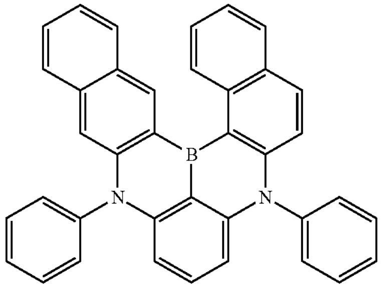
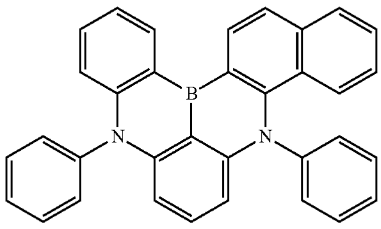
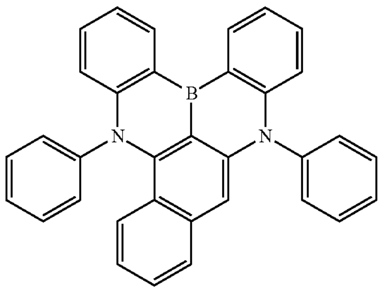
-continued
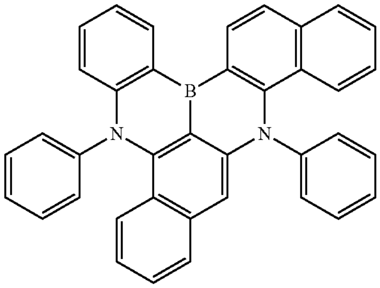
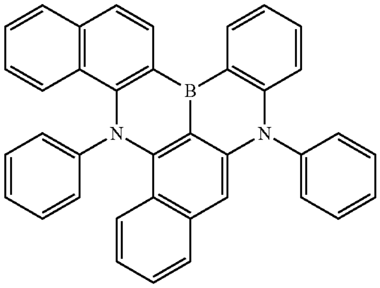
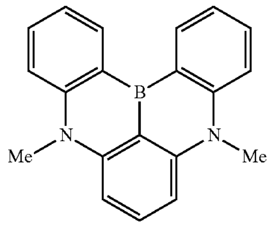
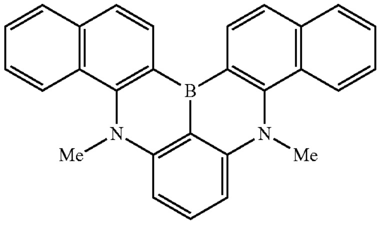
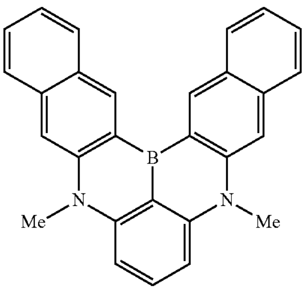
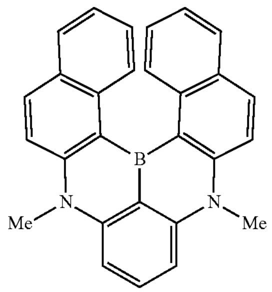

-continued
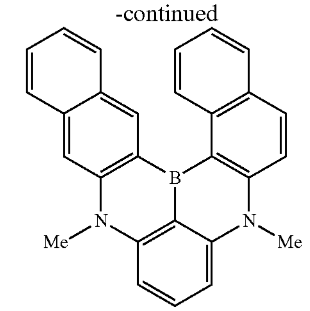
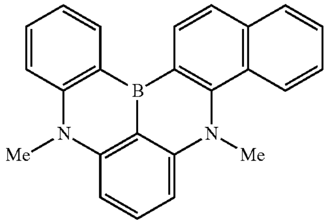
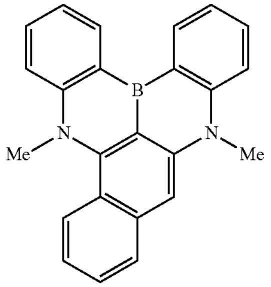
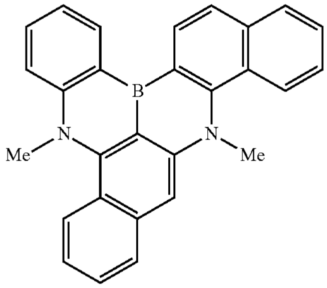
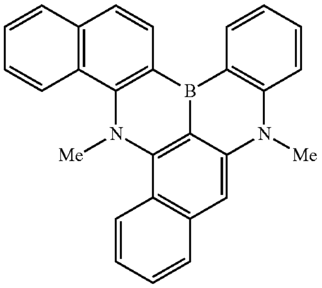
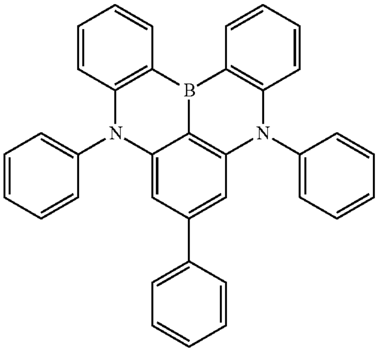
-continued
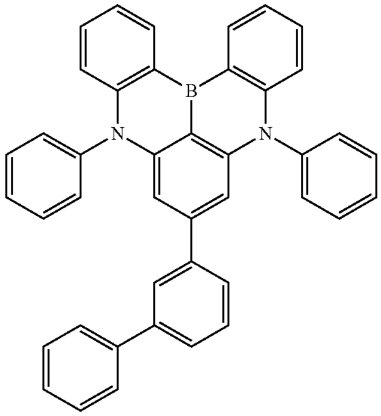
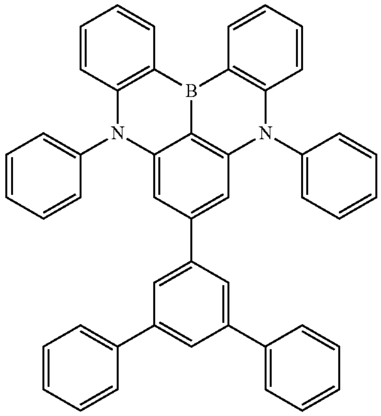
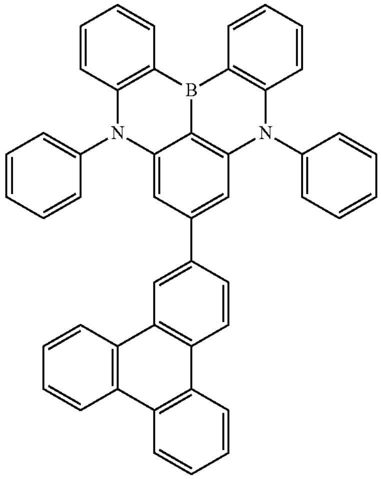

-continued
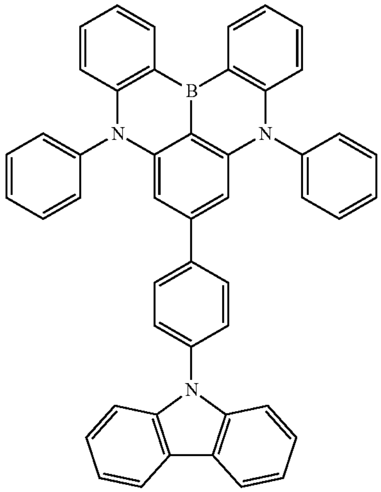
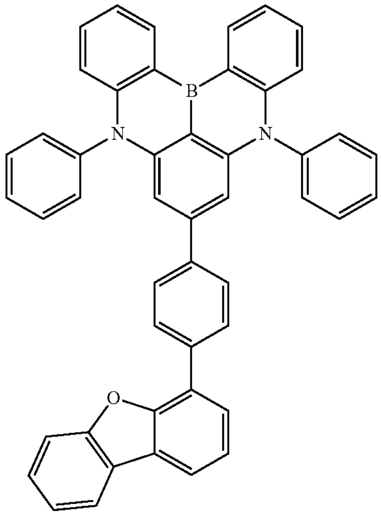
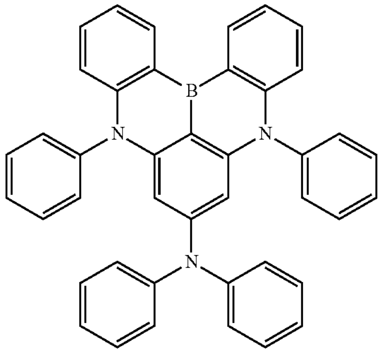
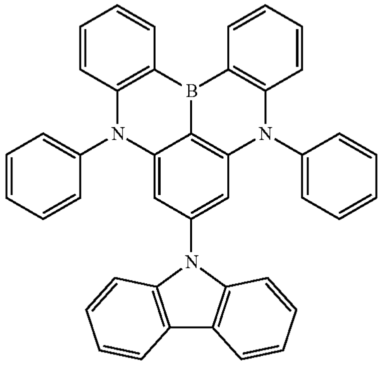
-continued
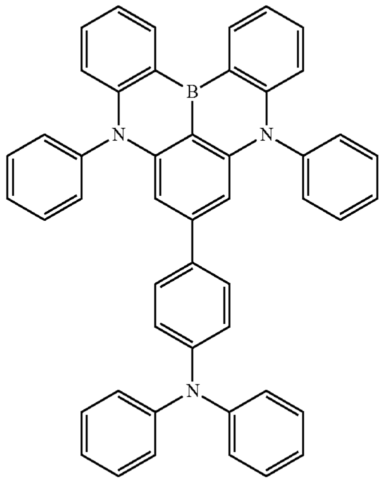
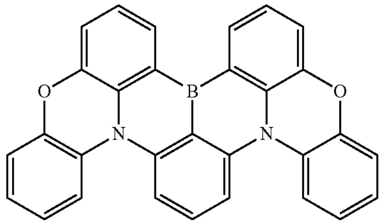
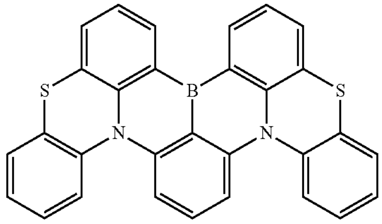
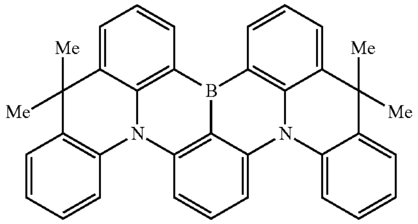
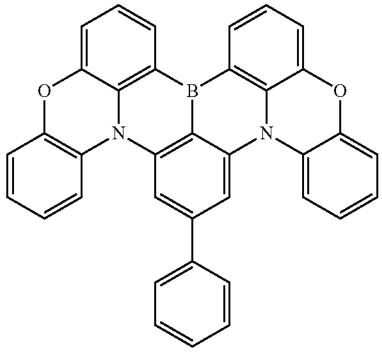

-continued
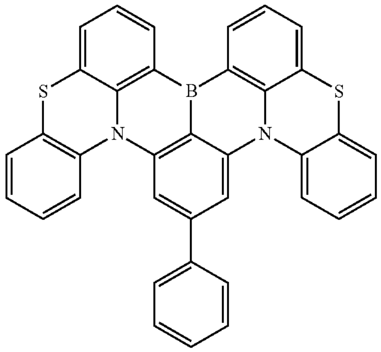
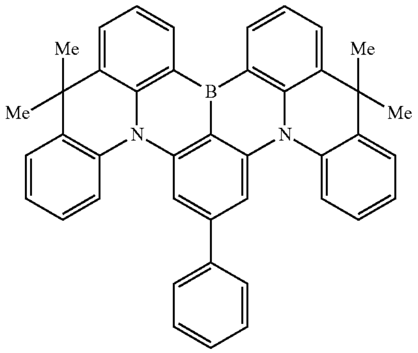
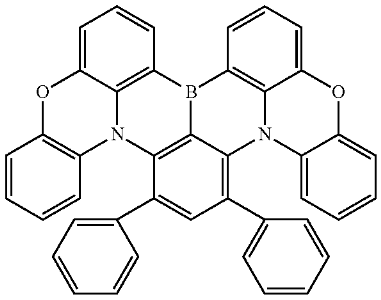
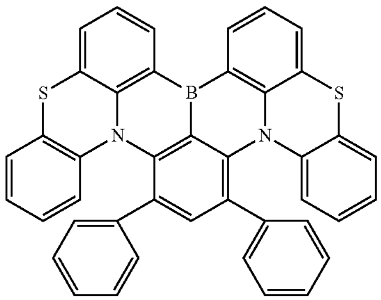
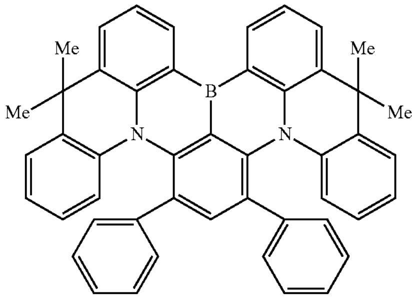
-continued
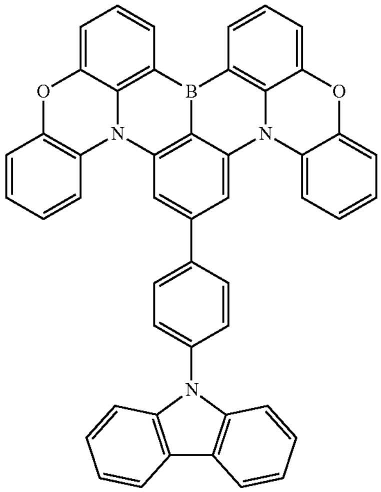
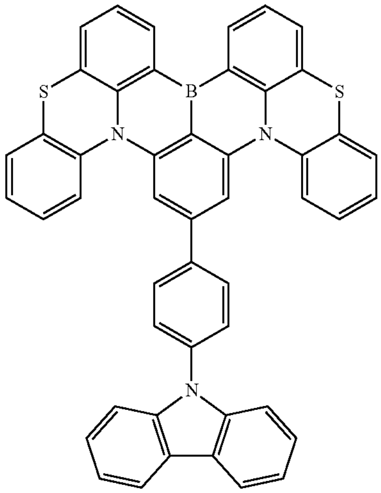
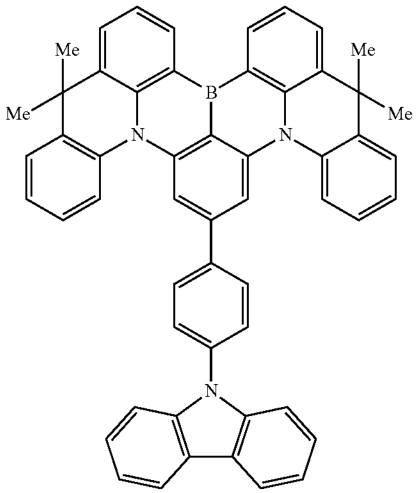
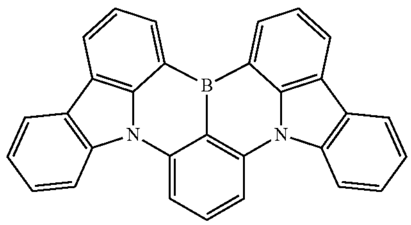

-continued
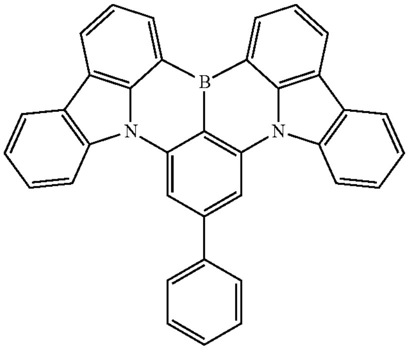
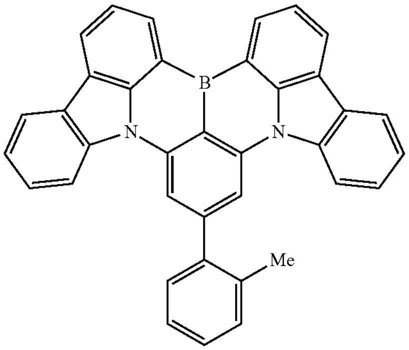
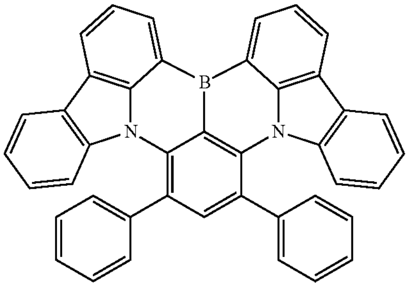
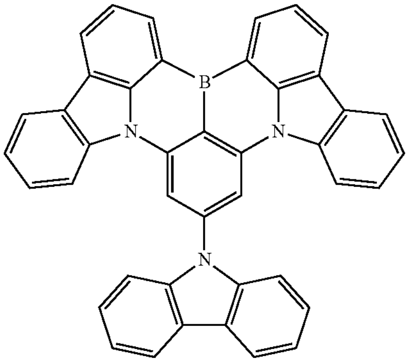
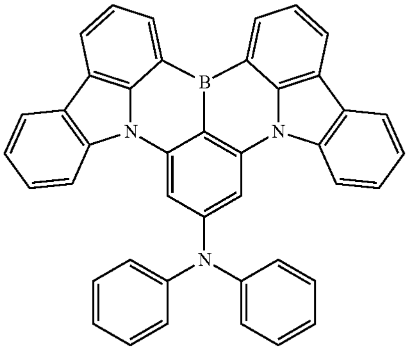
-continued
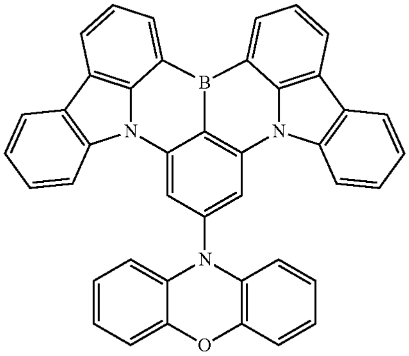
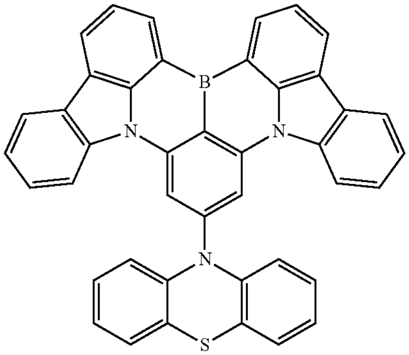
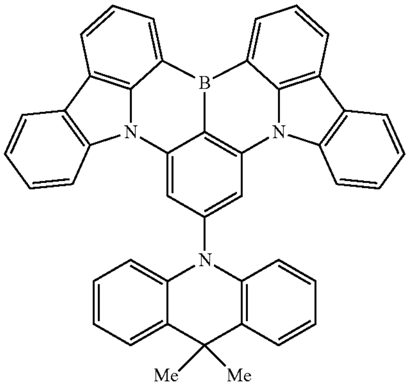
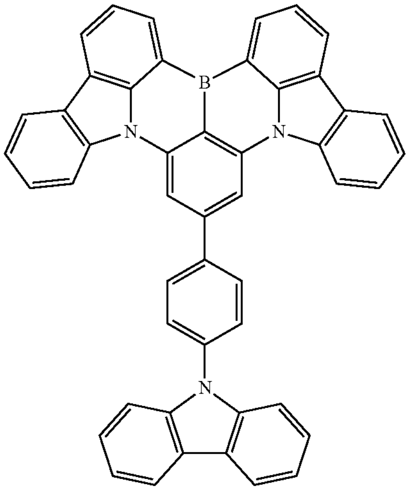

-continued
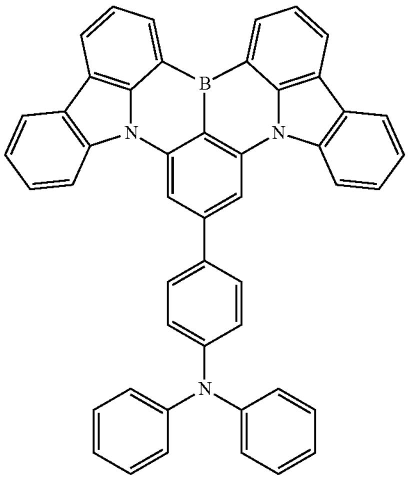
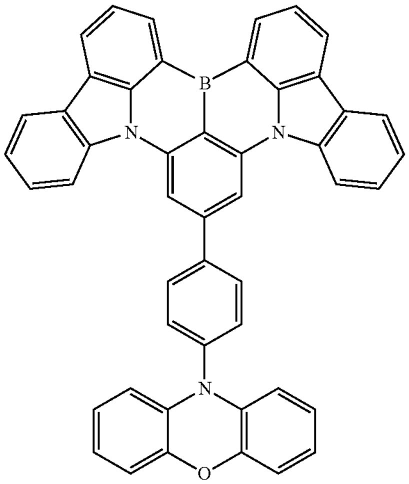
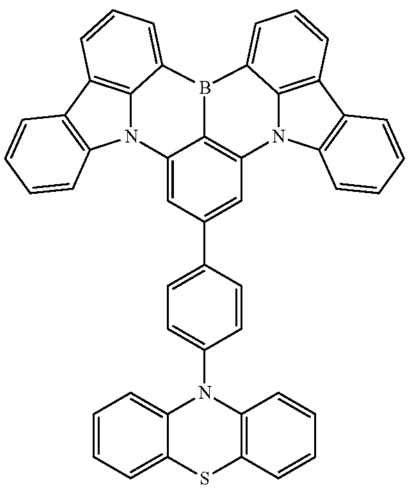
-continued
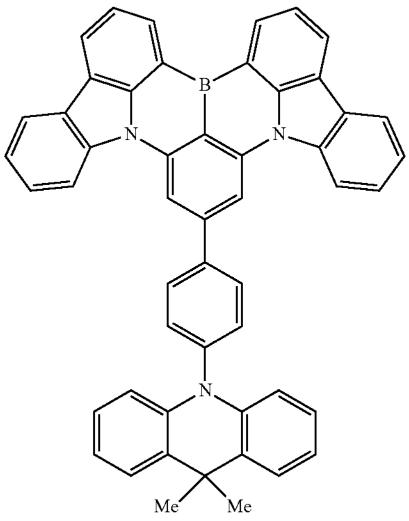
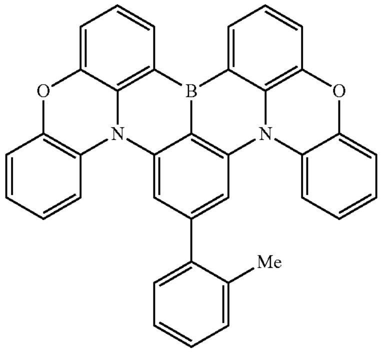
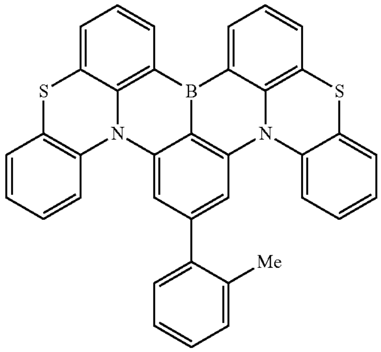
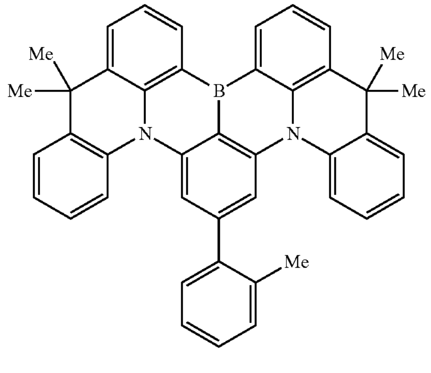

-continued
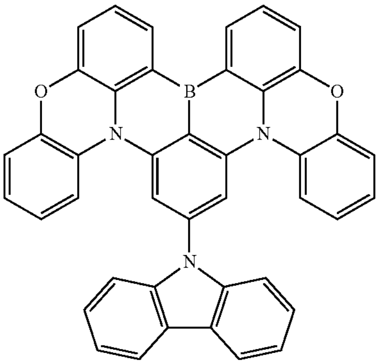
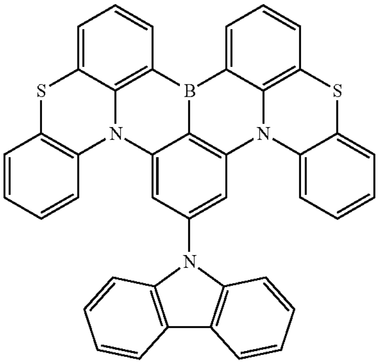
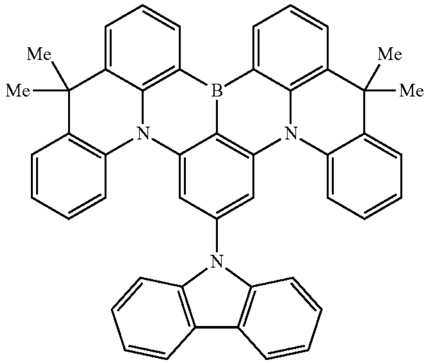
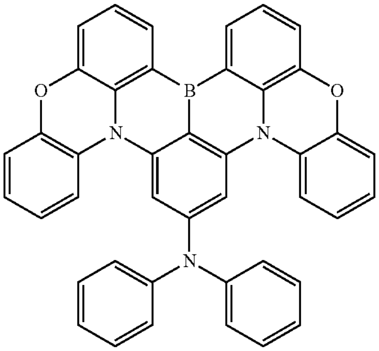
-continued
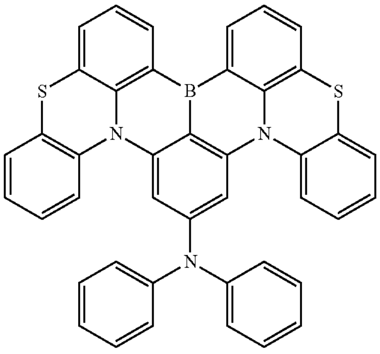
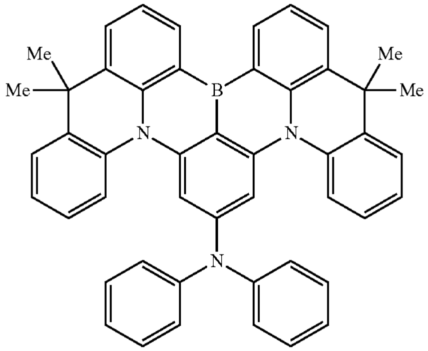
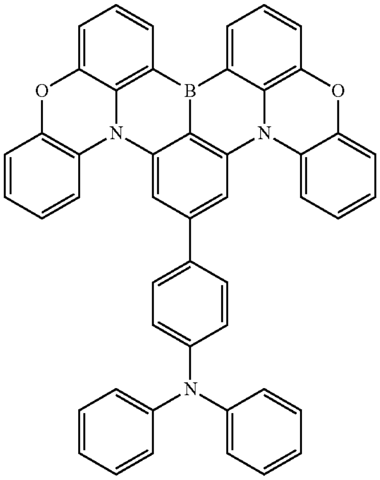
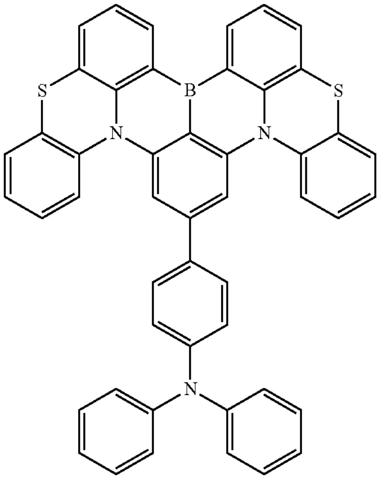

-continued
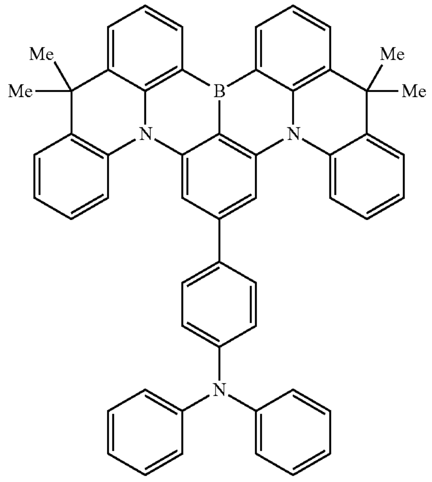
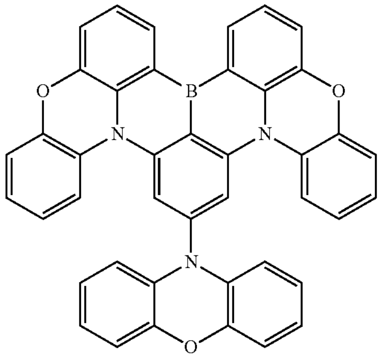
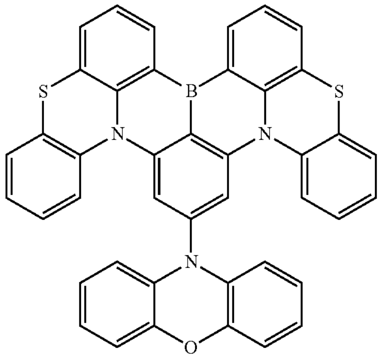
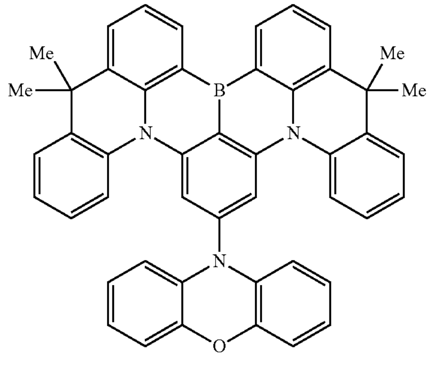
-continued
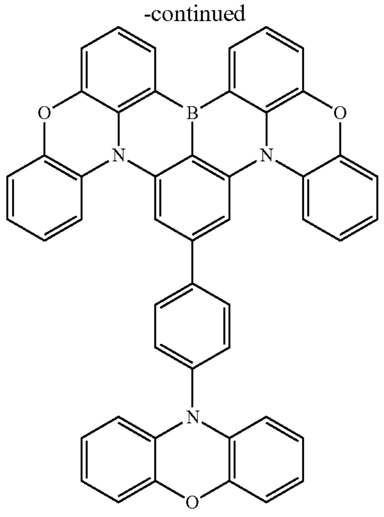
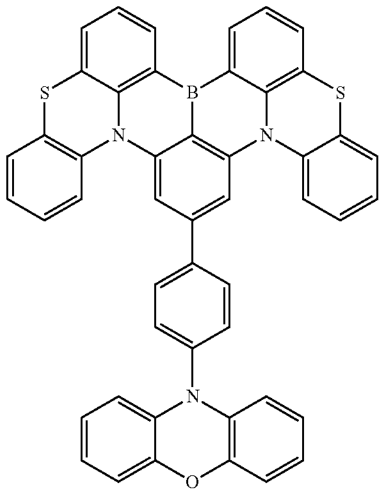
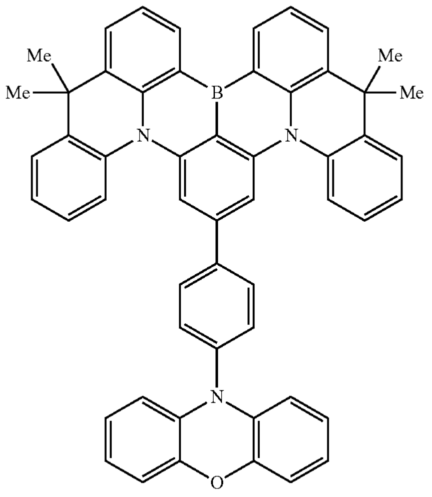

-continued
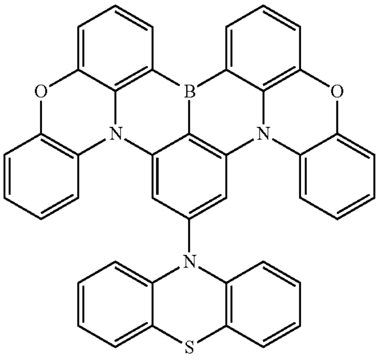
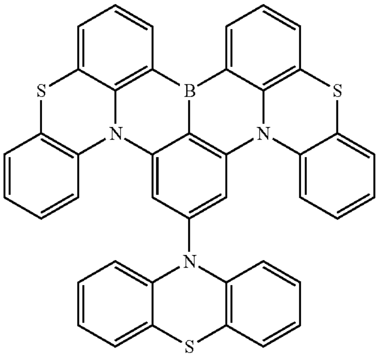
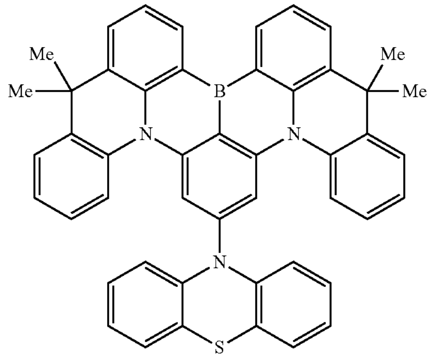
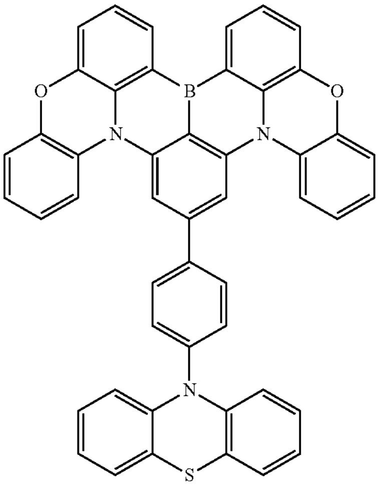
-continued
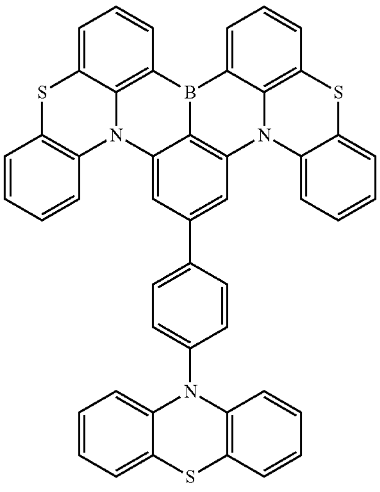
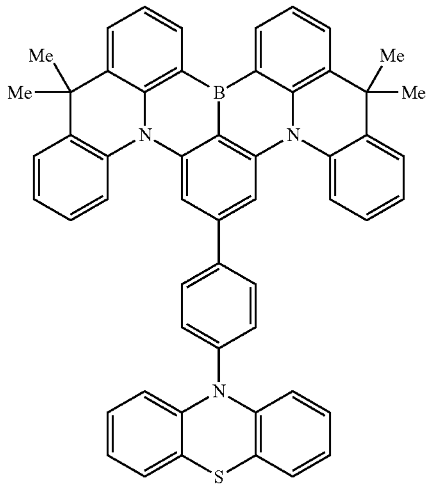
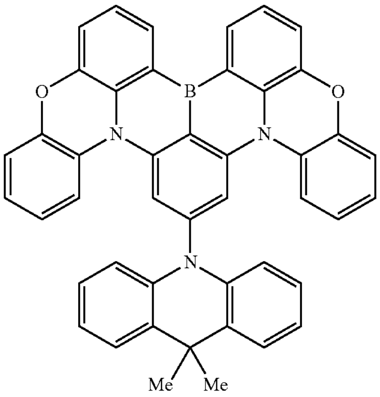

-continued
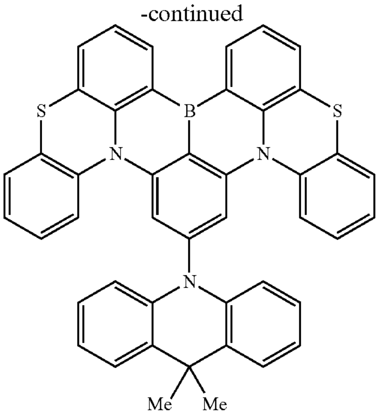
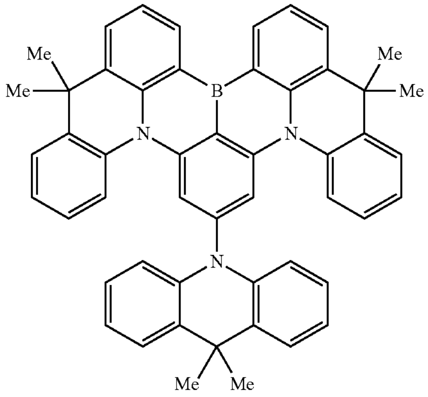
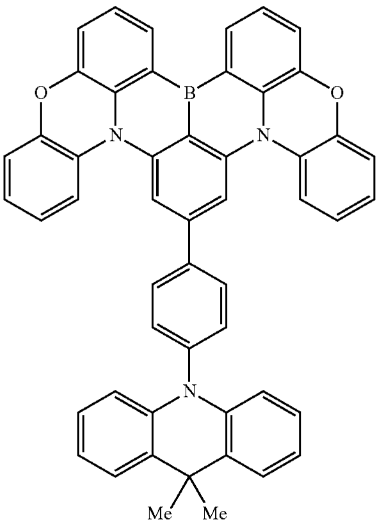
-continued
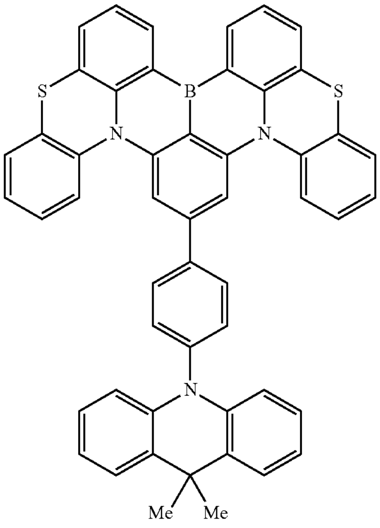
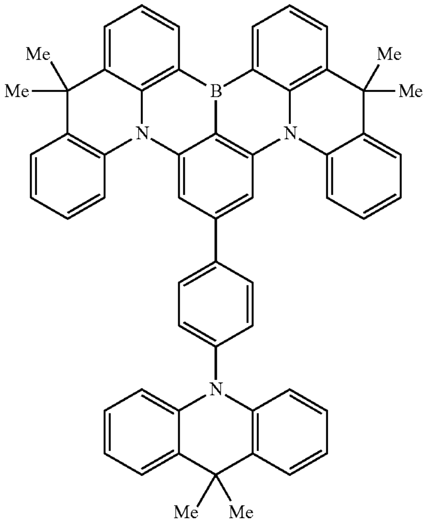
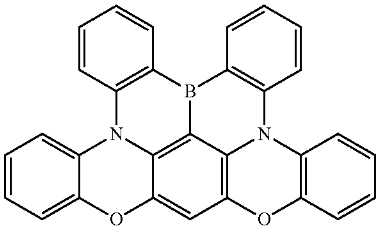
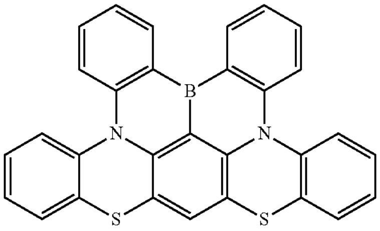

-continued
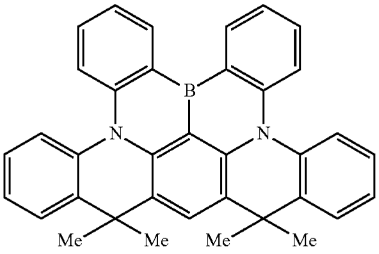
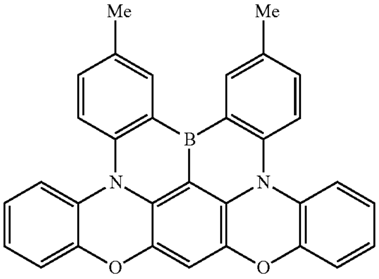
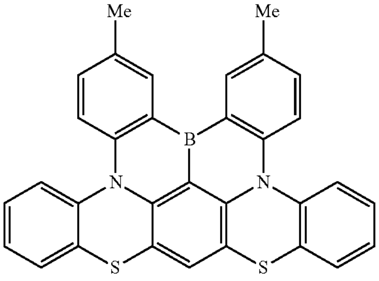
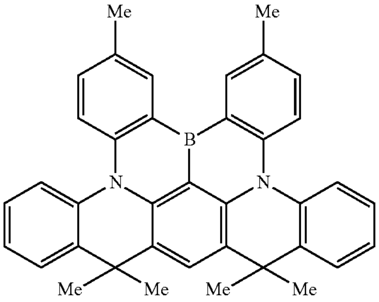
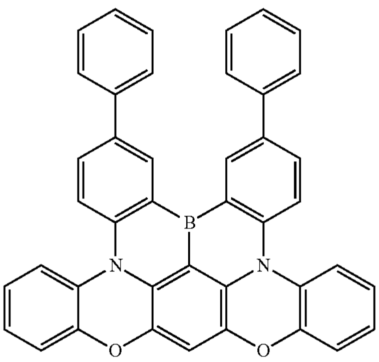
-continued
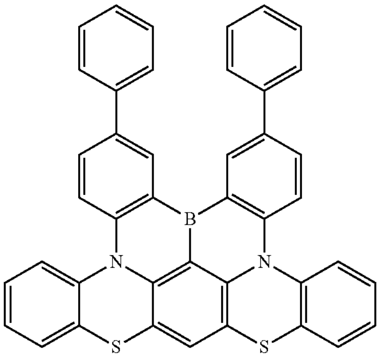
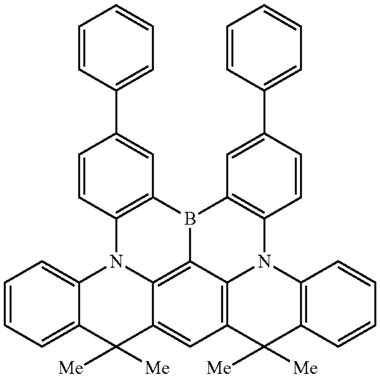
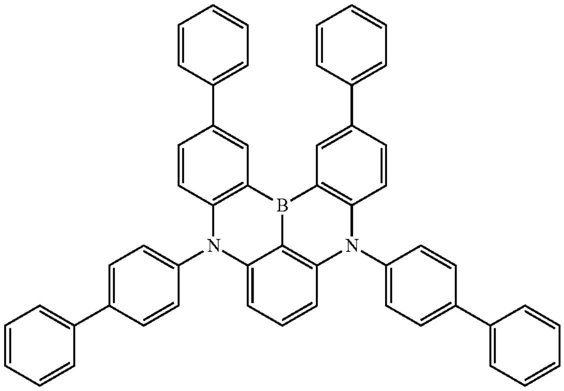
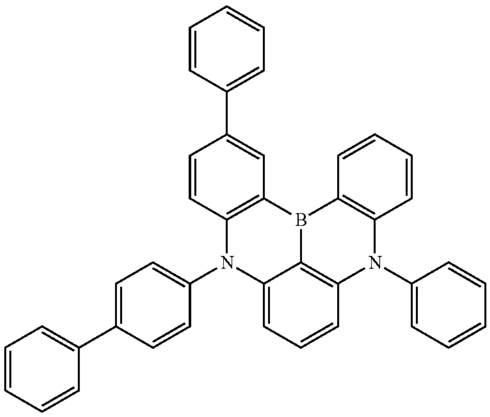

-continued
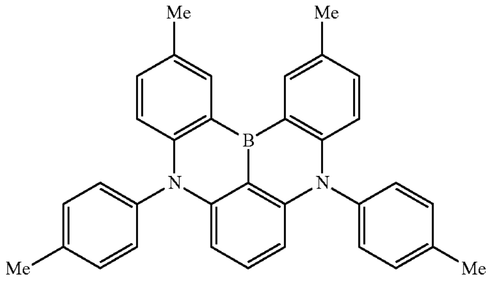
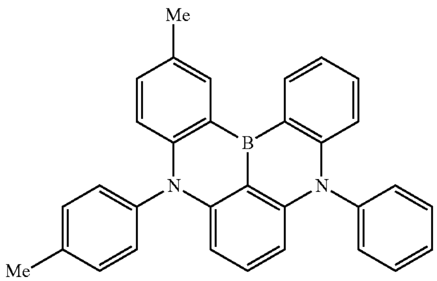
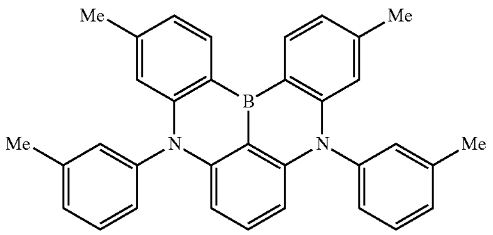
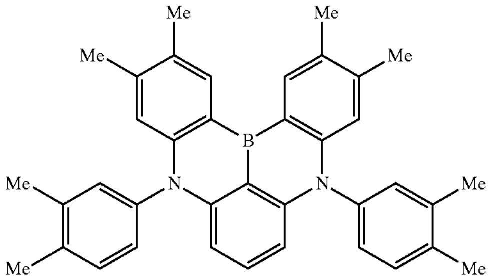
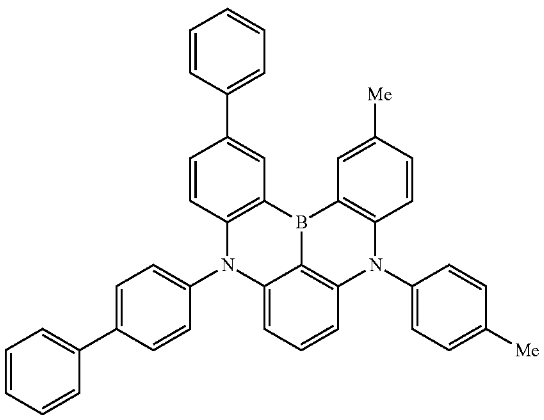
-continued
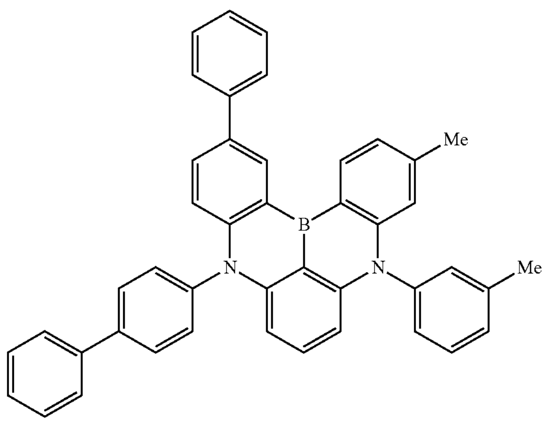
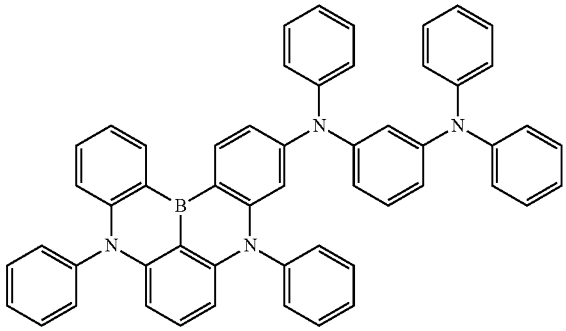
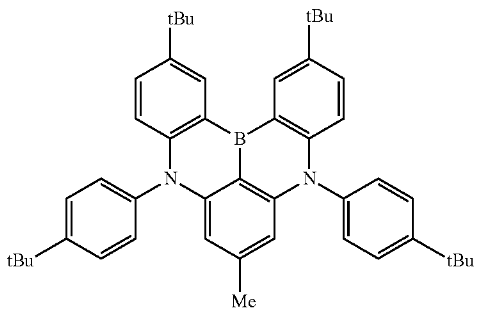
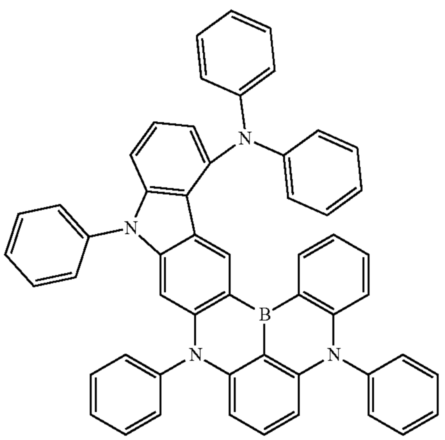

-continued
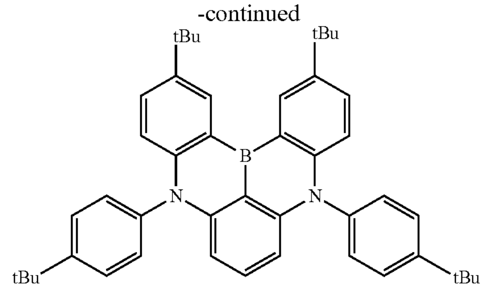
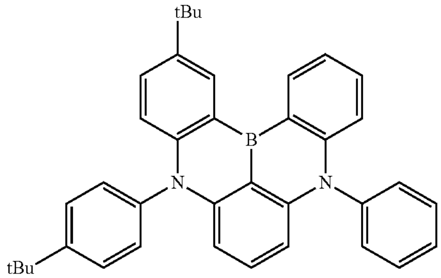
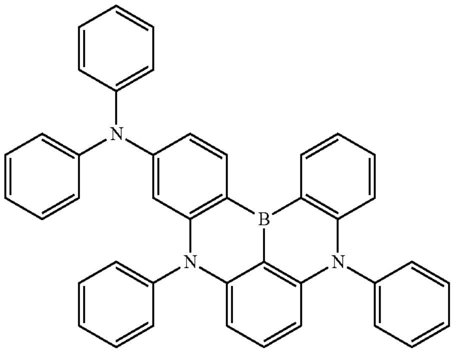
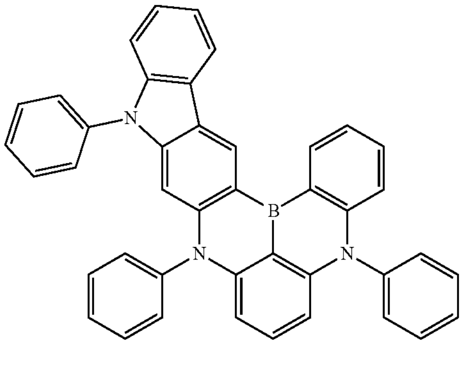
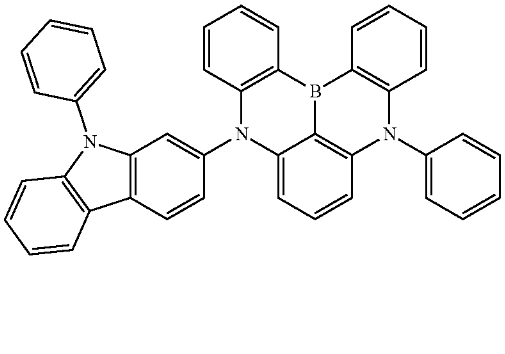
-continued
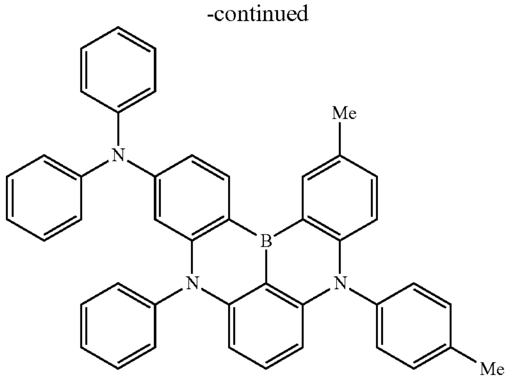
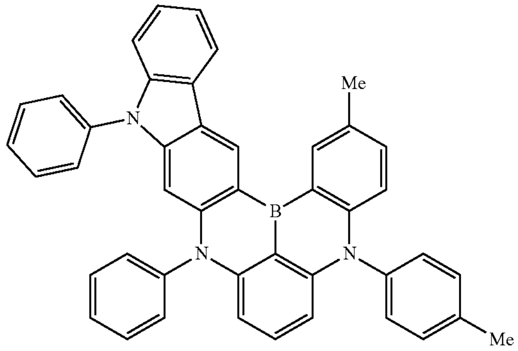
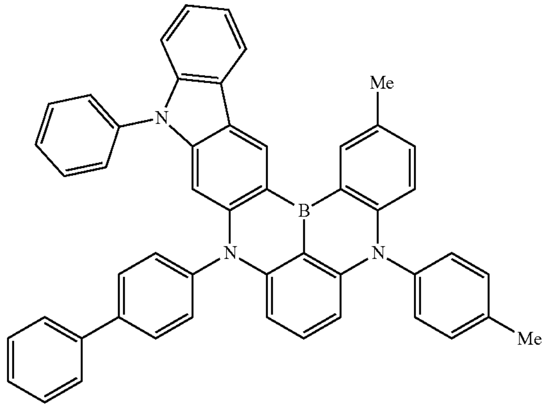
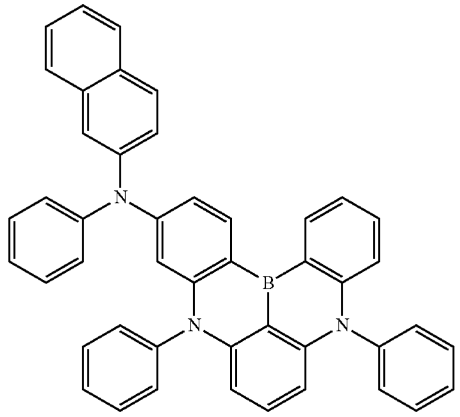

-continued
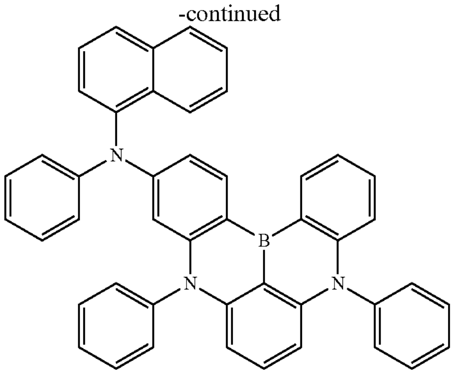
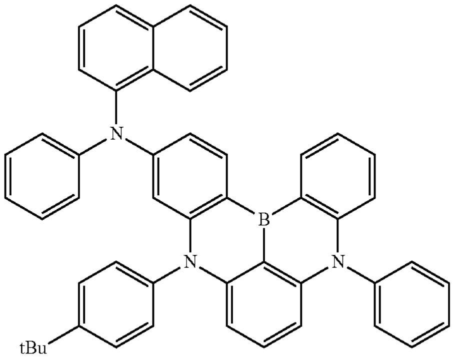
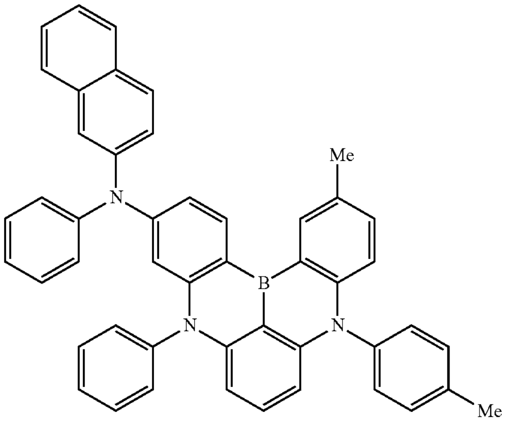
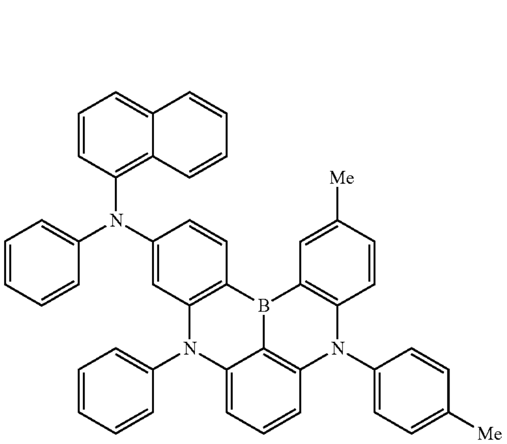
-continued
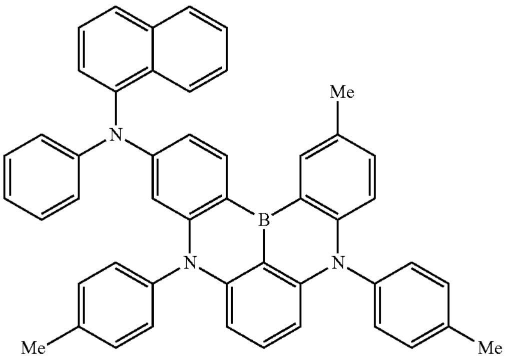
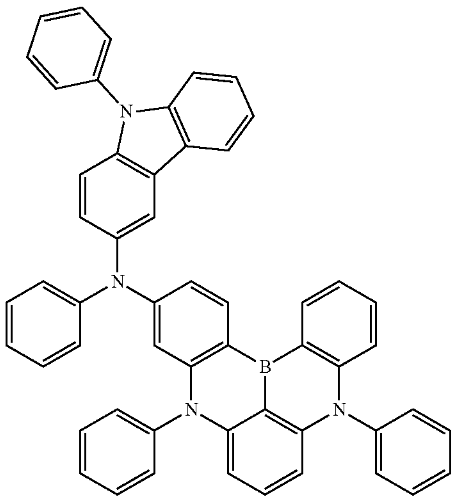
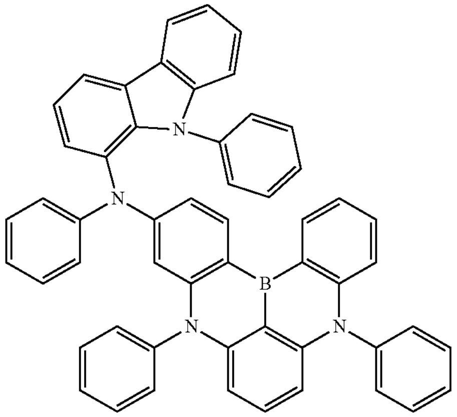

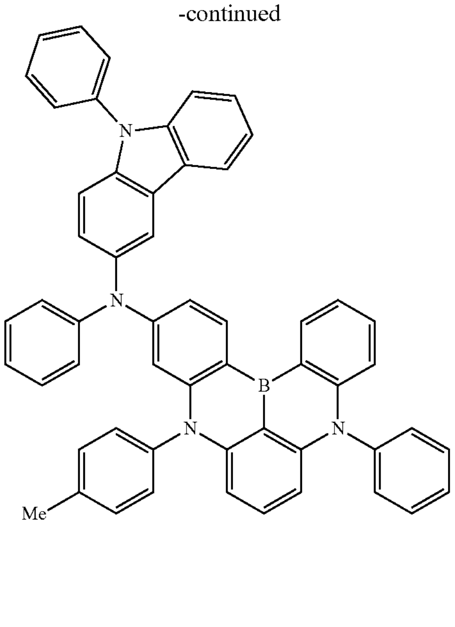
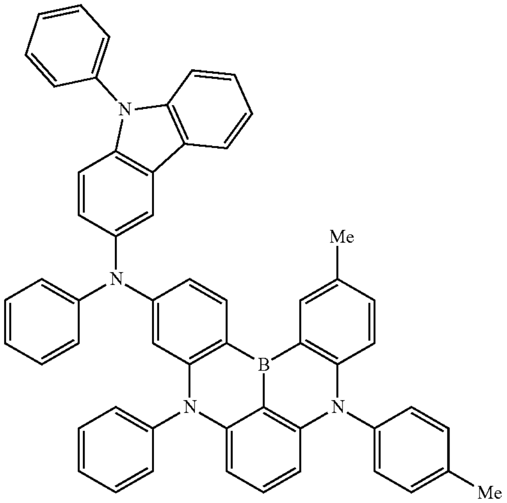
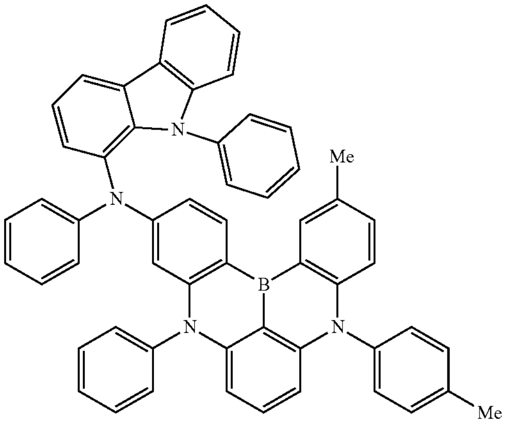
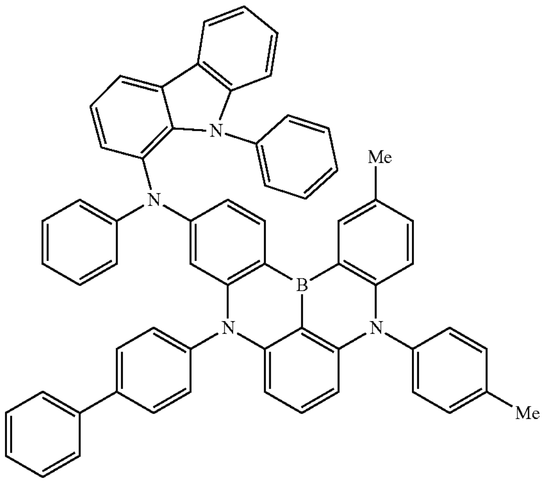
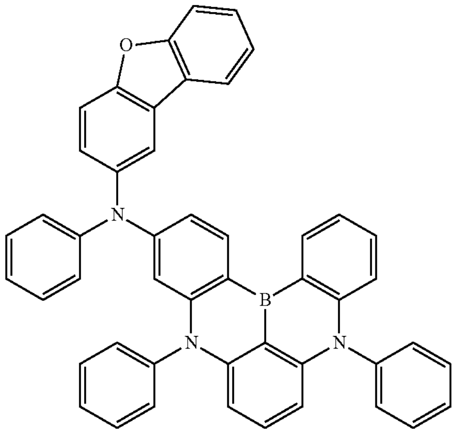
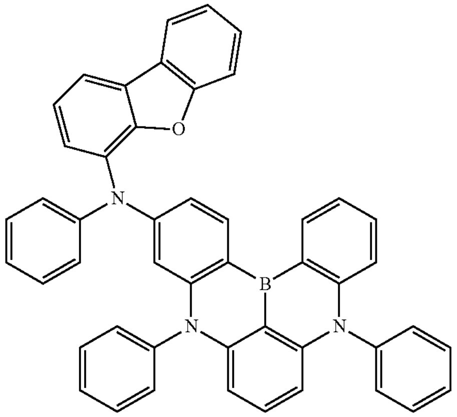

-continued
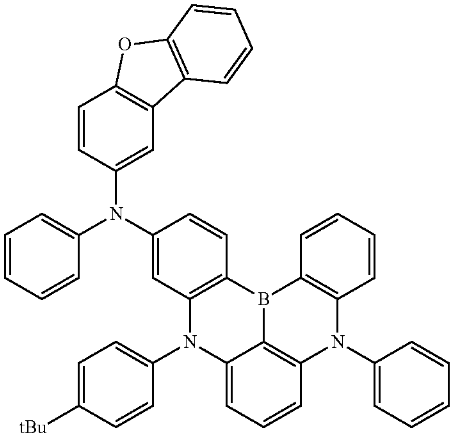
-continued
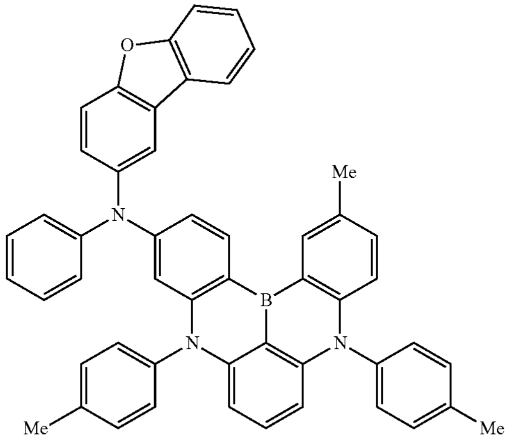
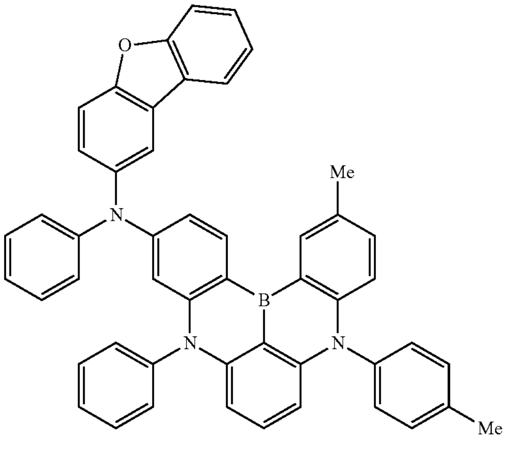
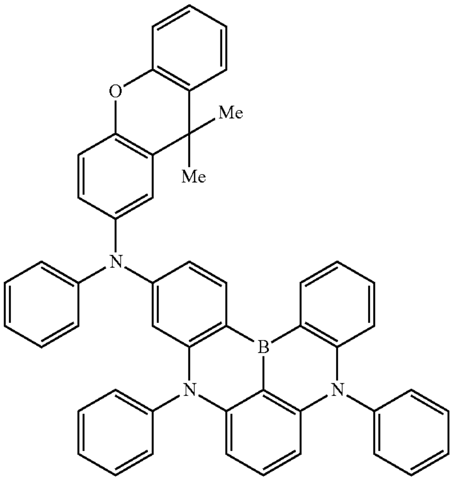
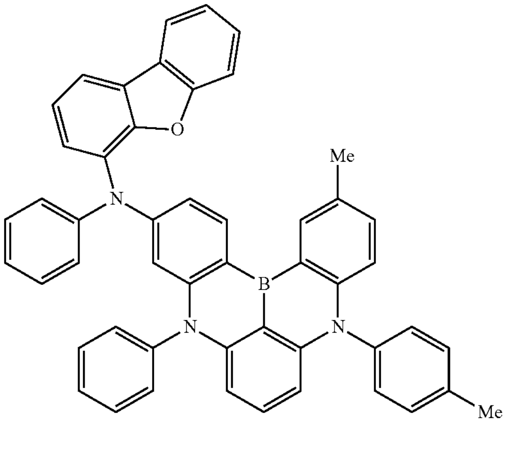
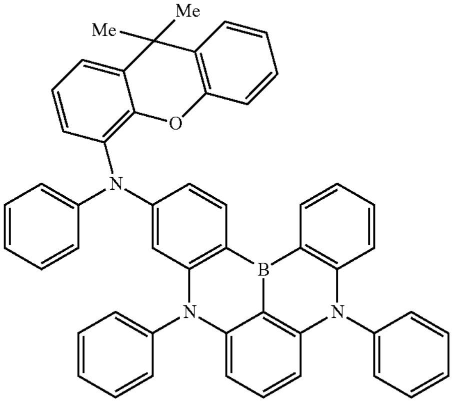

-continued
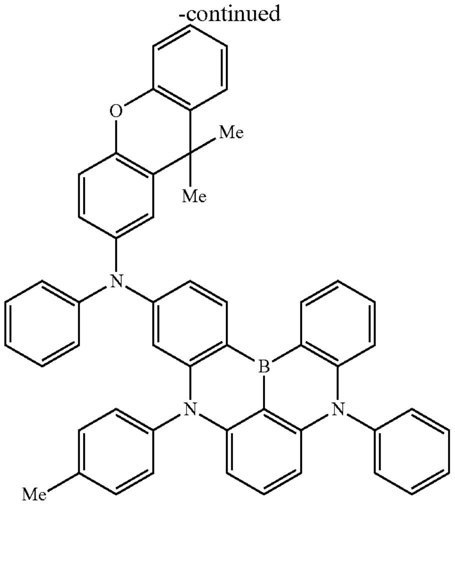
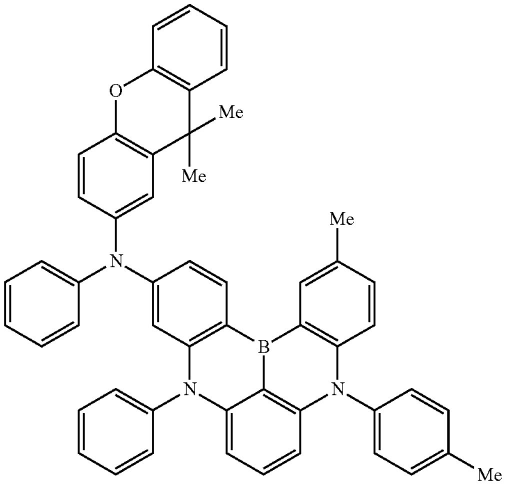
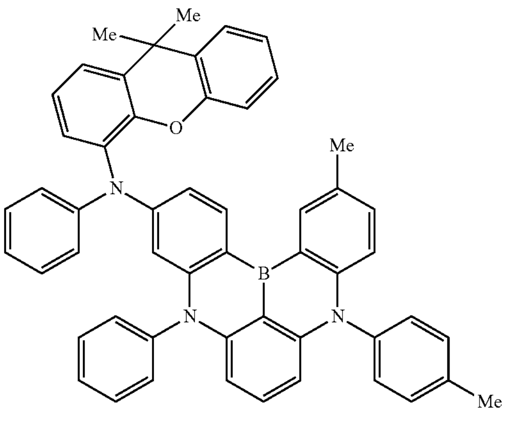
-continued
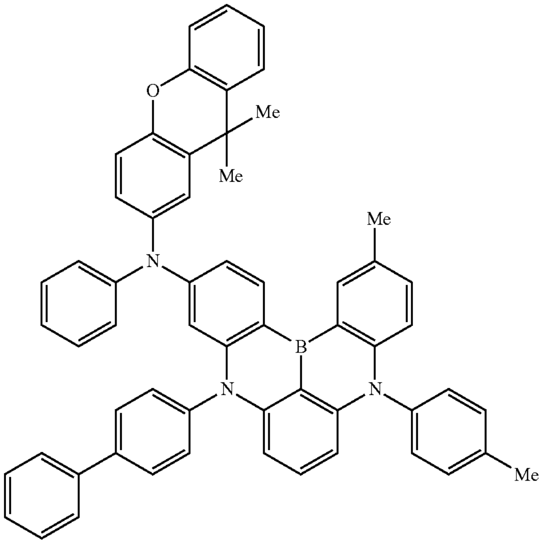
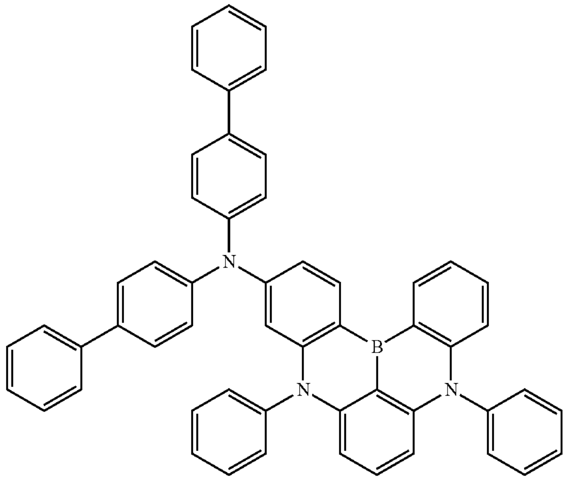
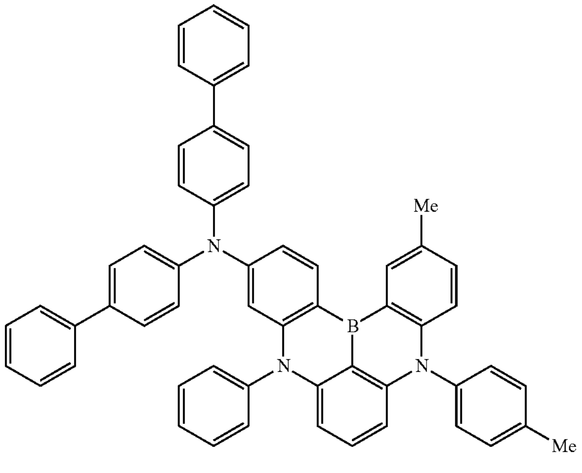

-continued
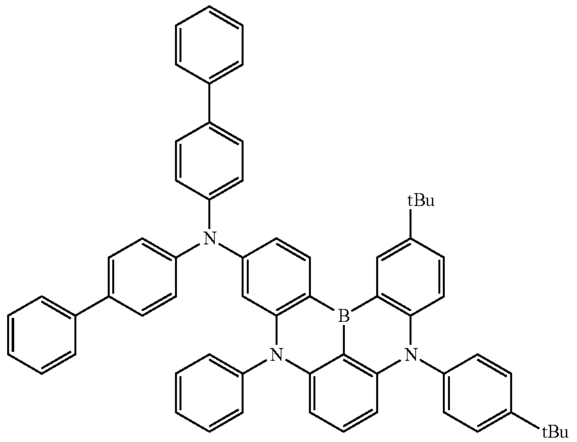
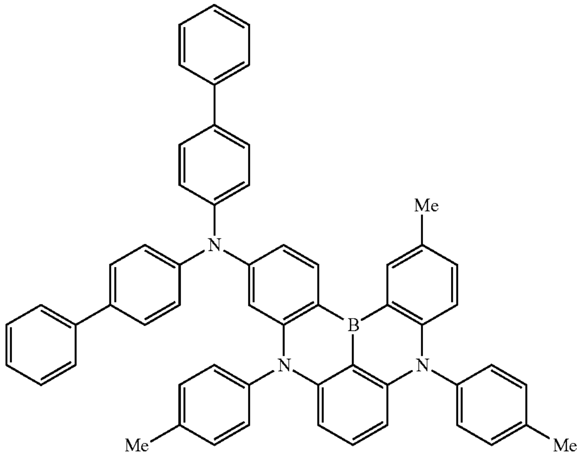
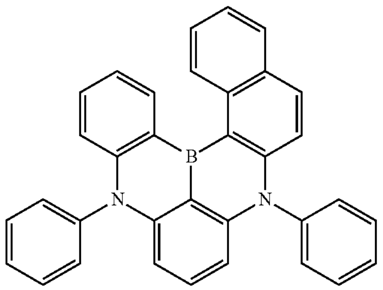
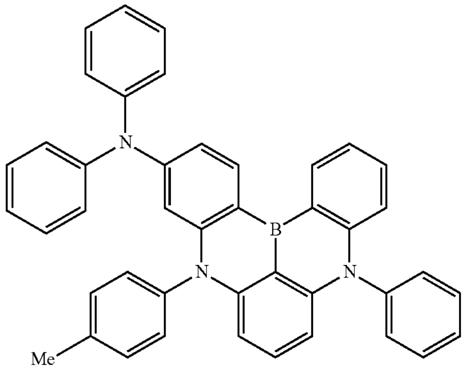
-continued
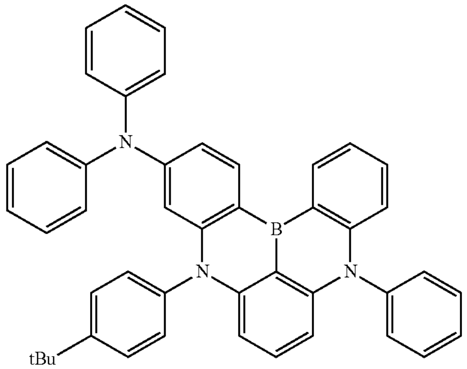
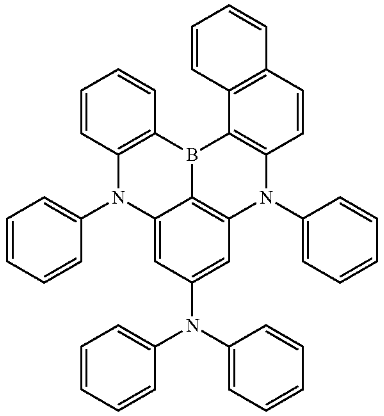
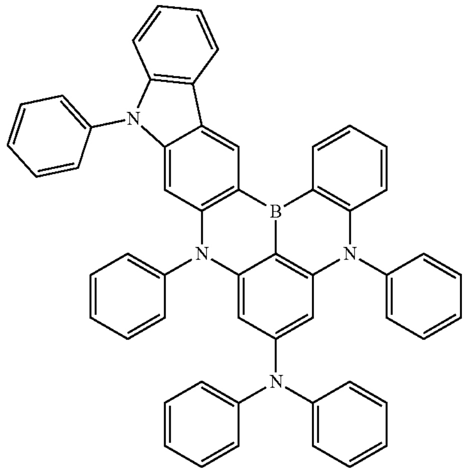
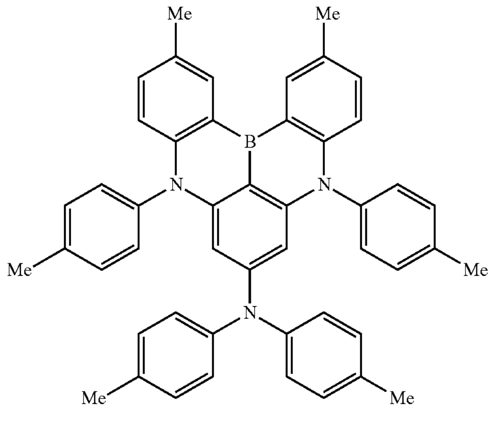

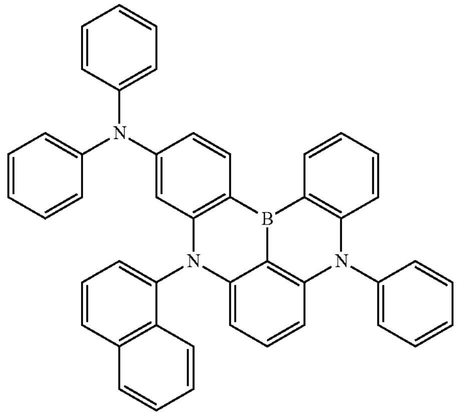
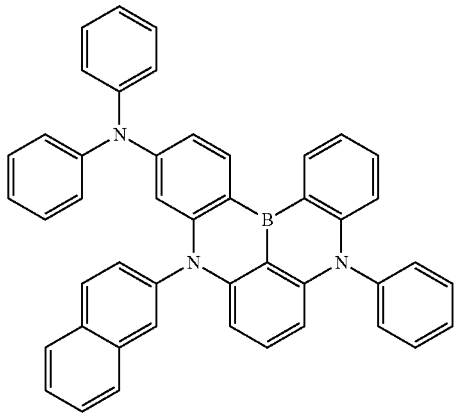
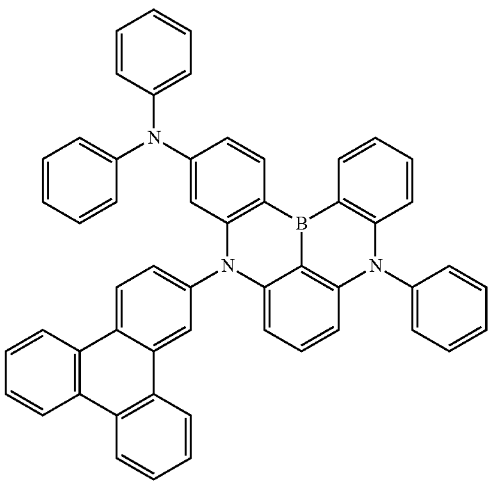
-continued
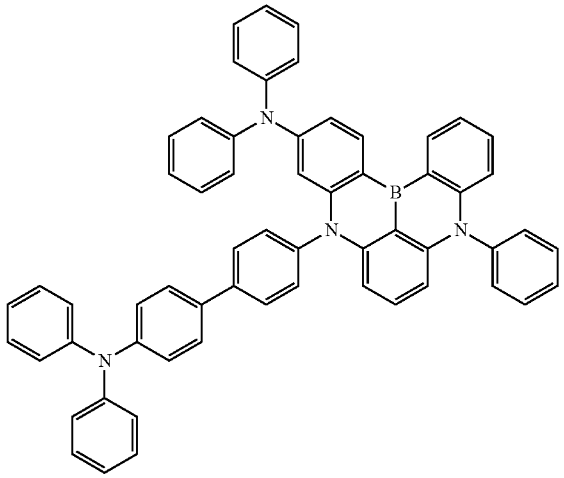
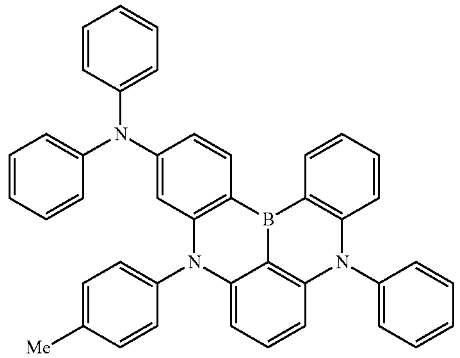
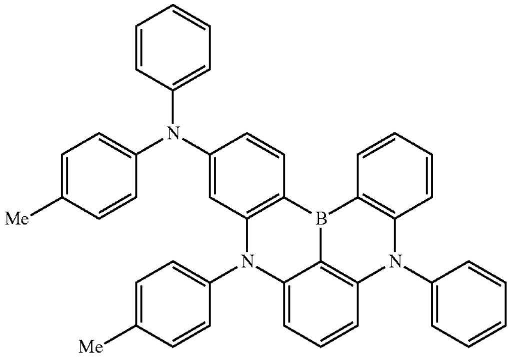
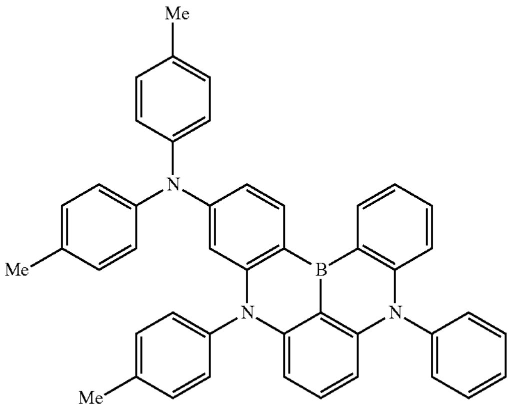

-continued
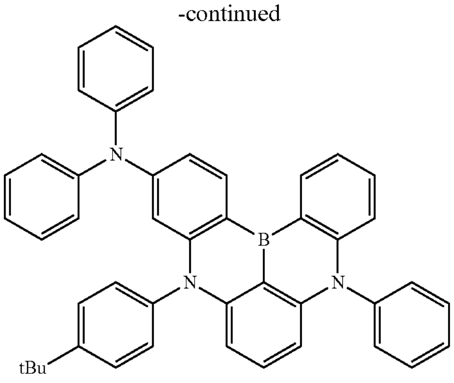
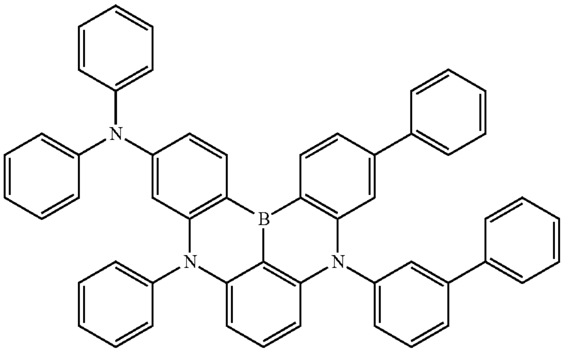
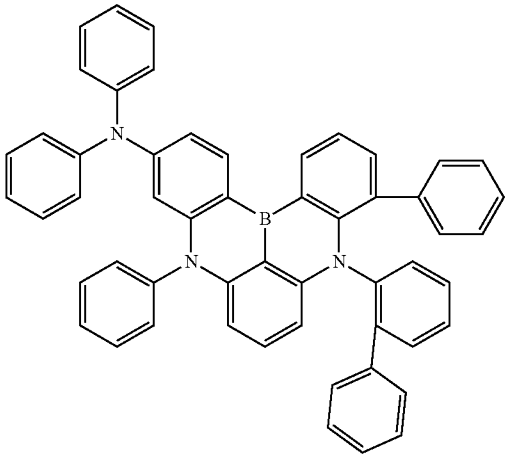
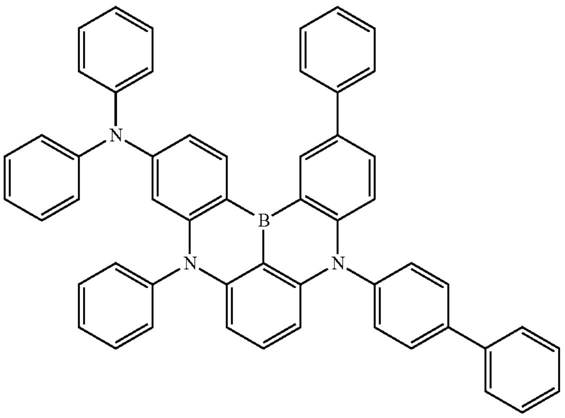
-continued
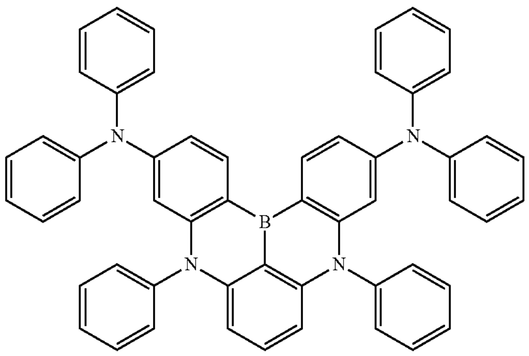
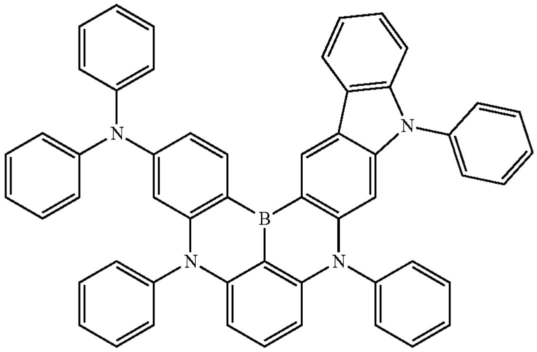
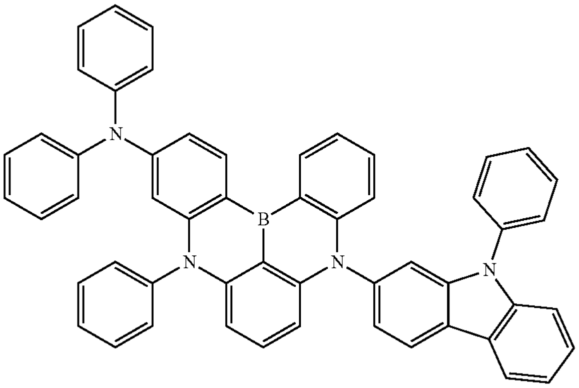
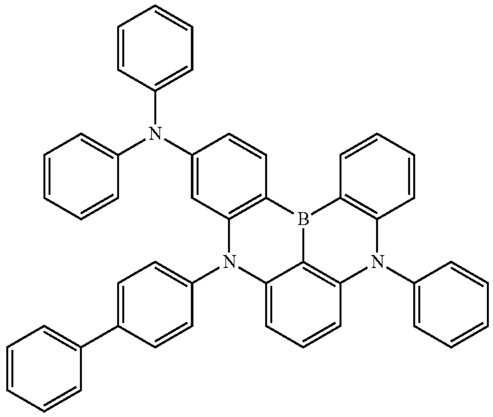

-continued
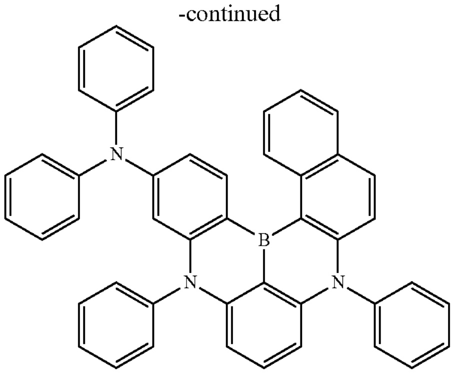
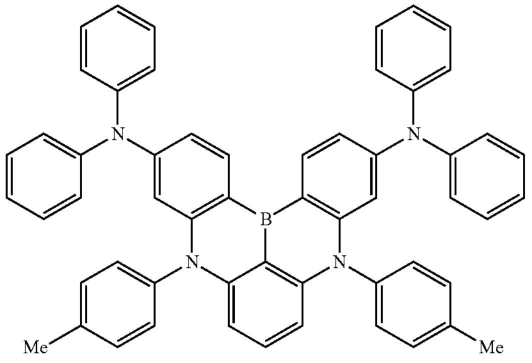
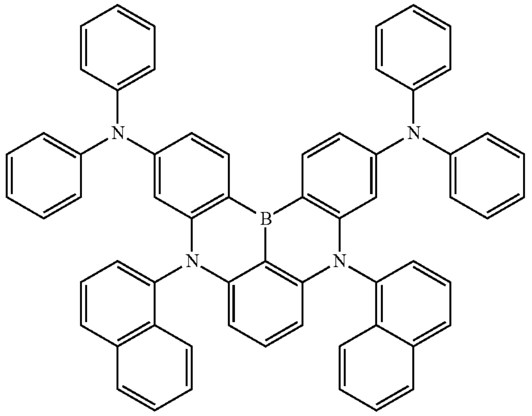
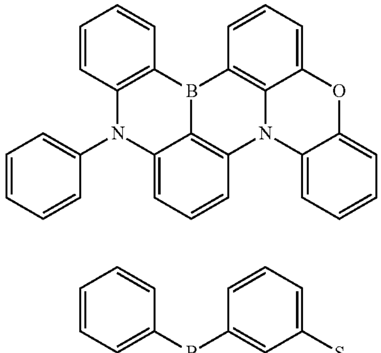
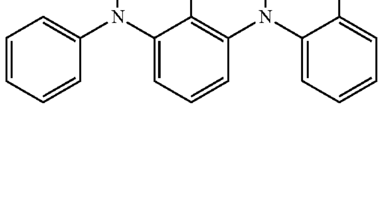
-continued
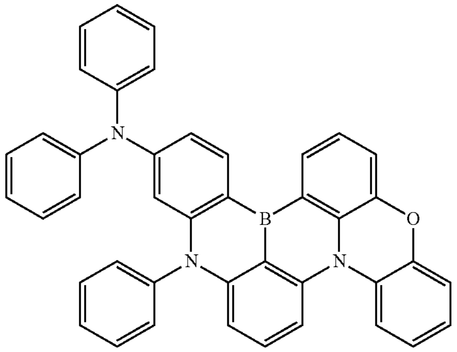
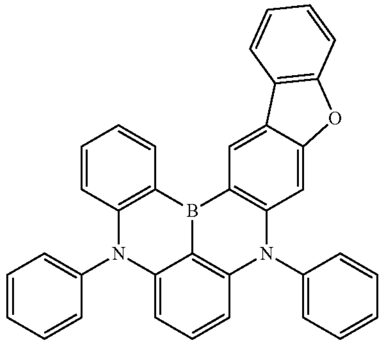
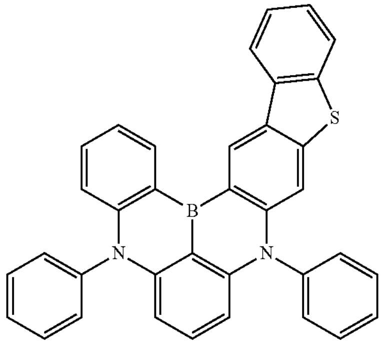
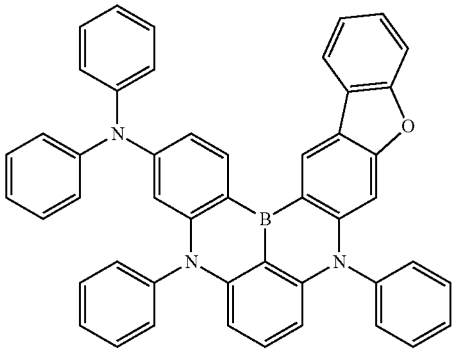
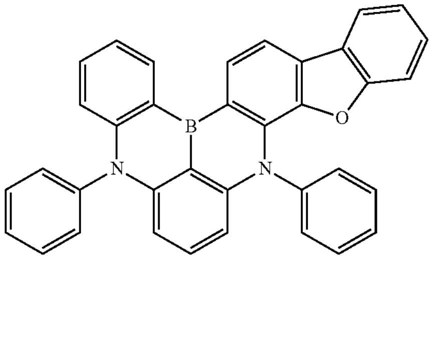

-continued
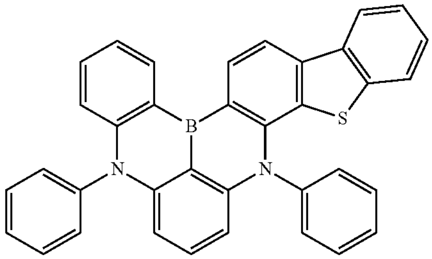
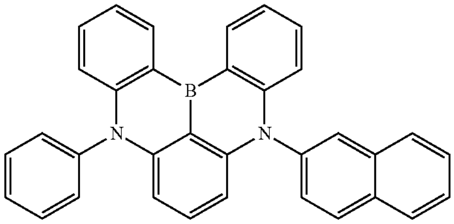
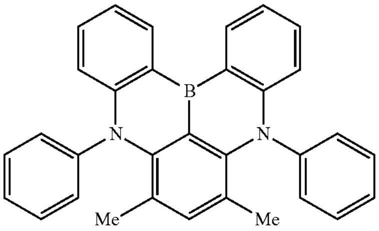
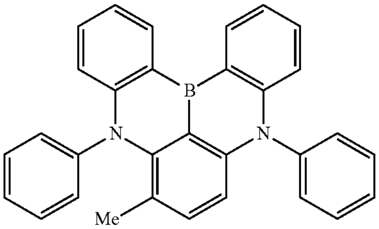
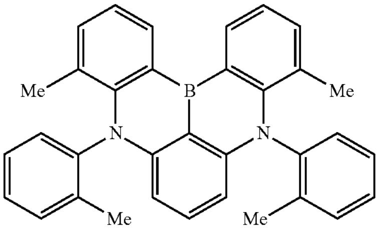
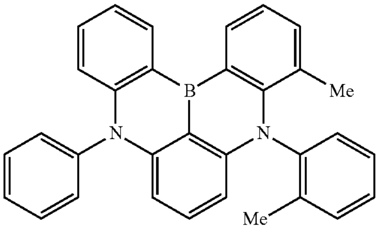
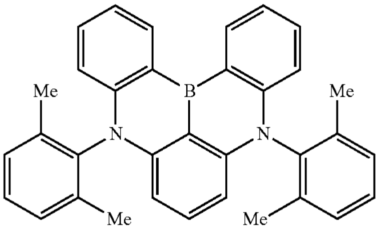
-continued
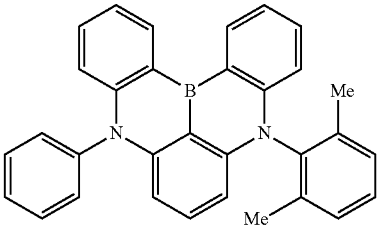
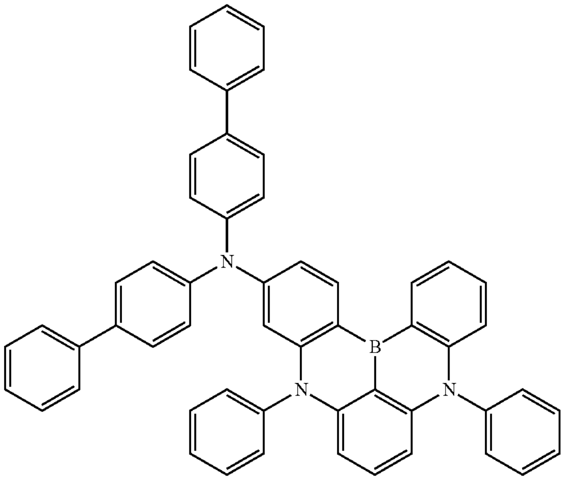
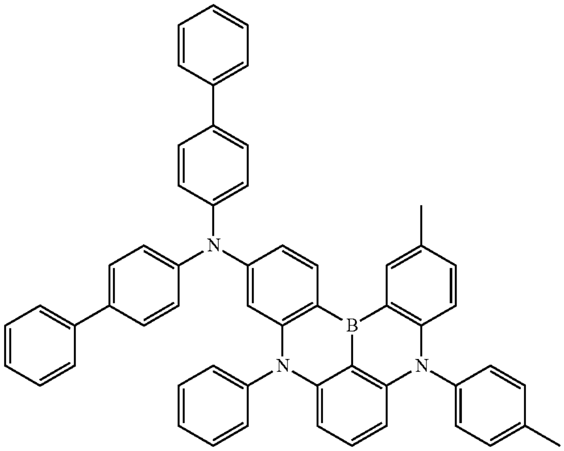
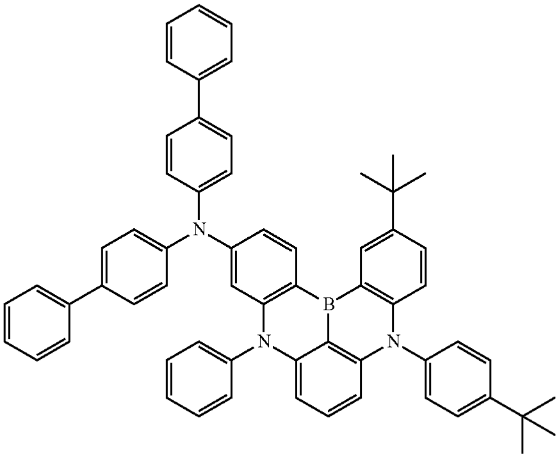

-continued
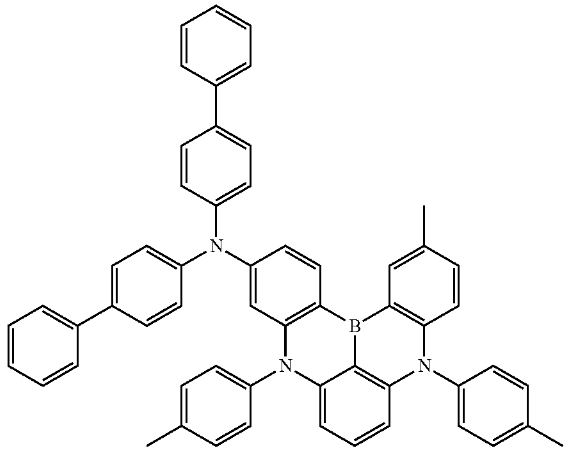
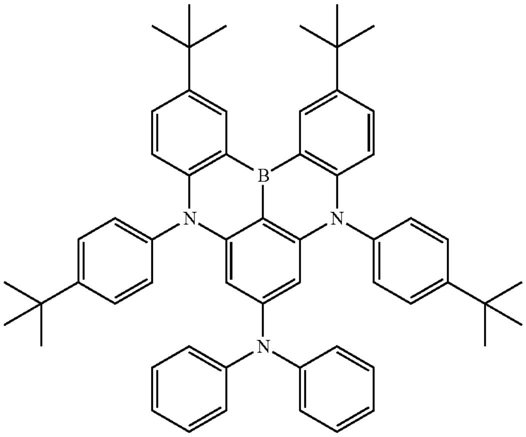
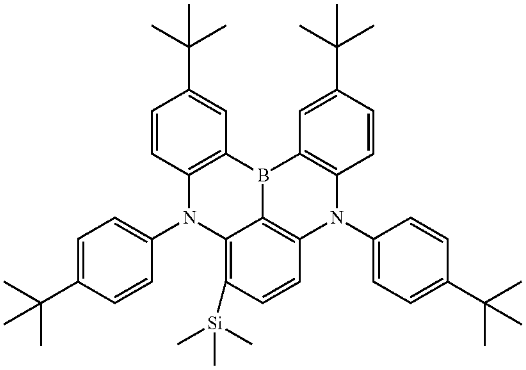
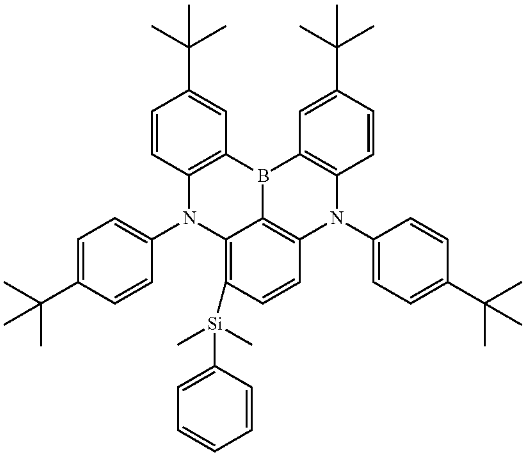
-continued
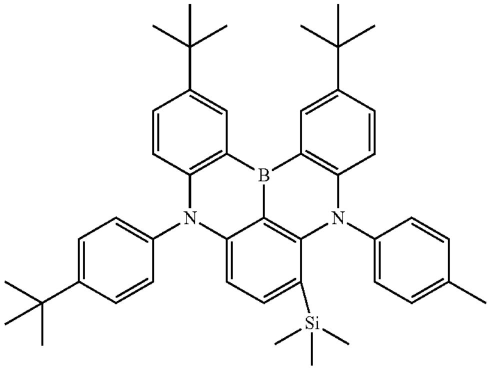
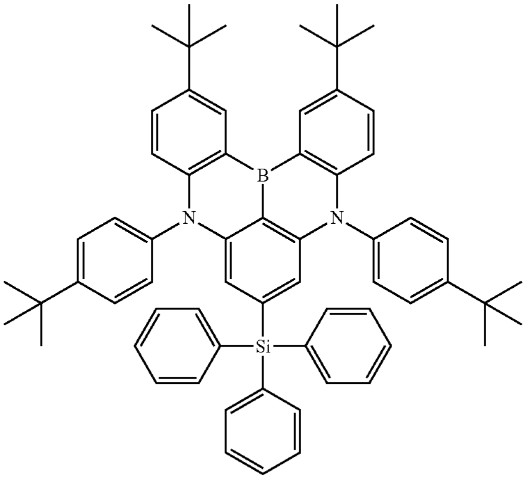
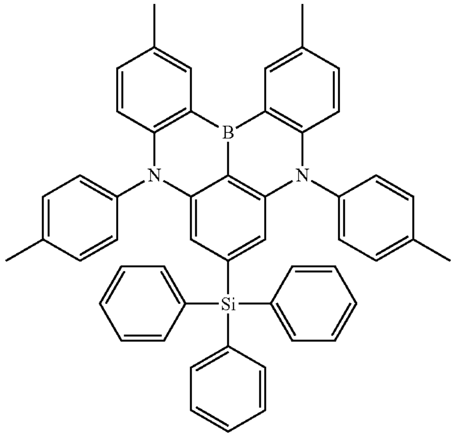
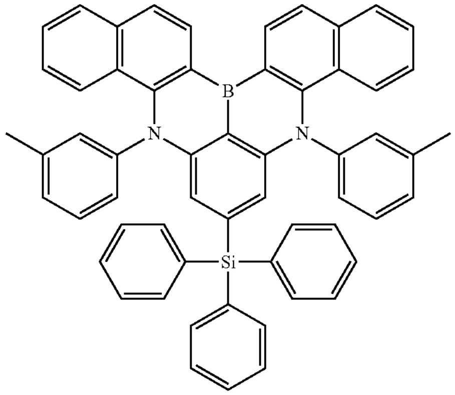

-continued
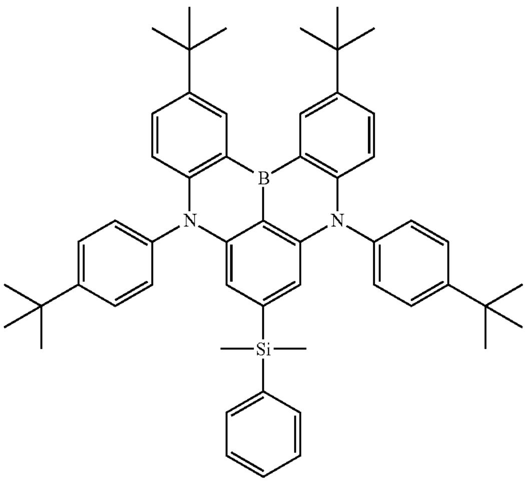
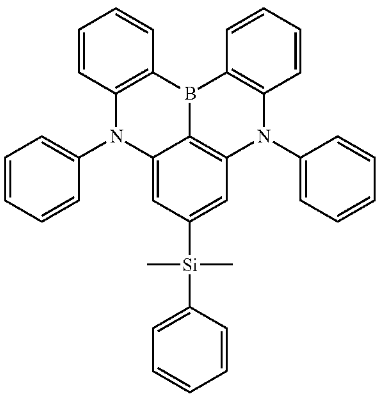
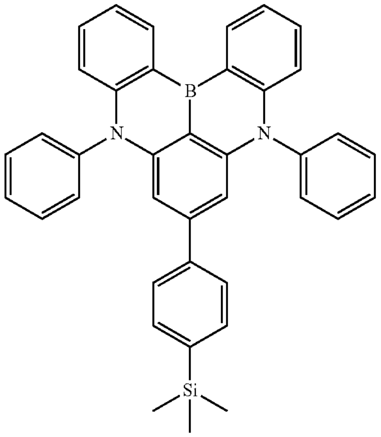
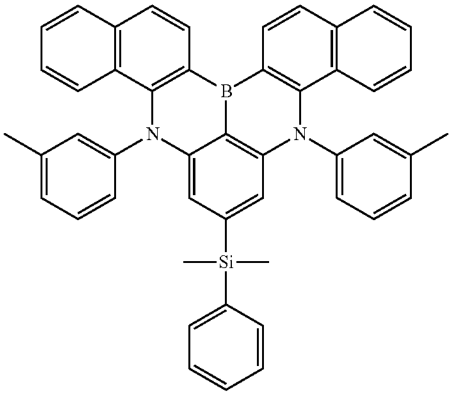
-continued
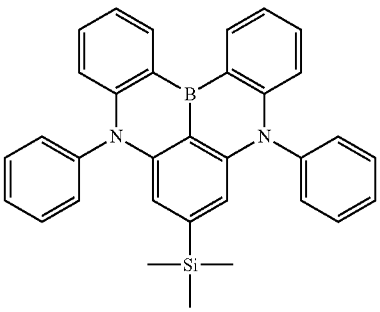
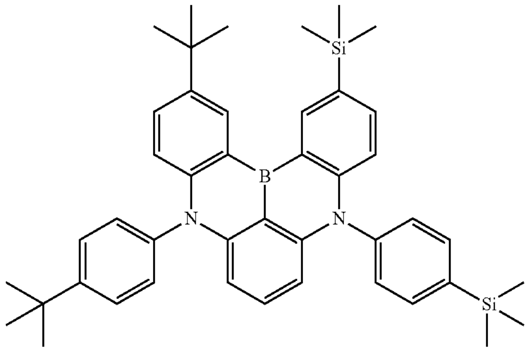
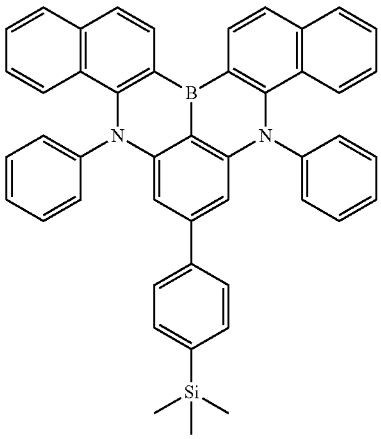
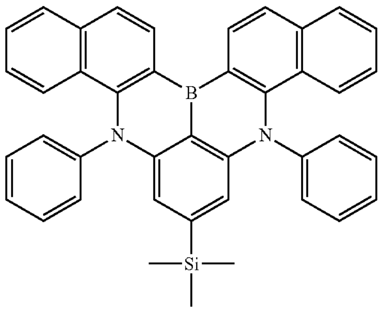

-continued
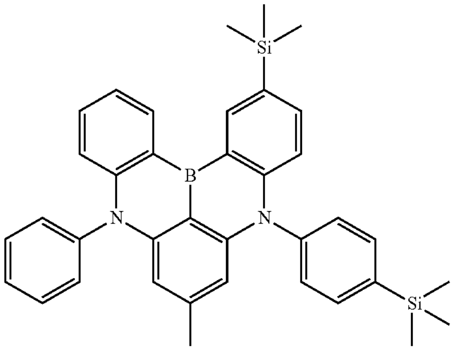
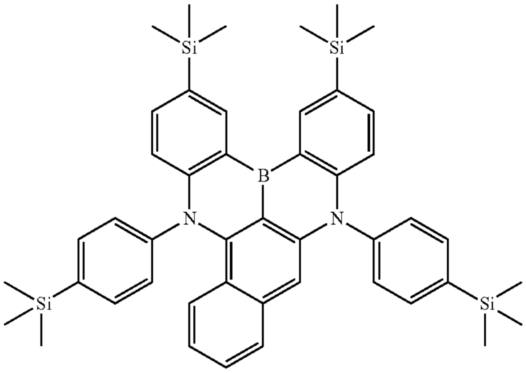
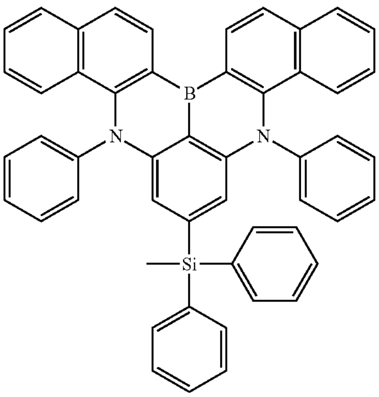
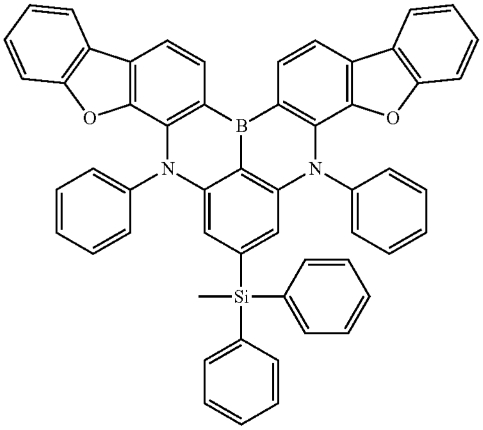
-continued
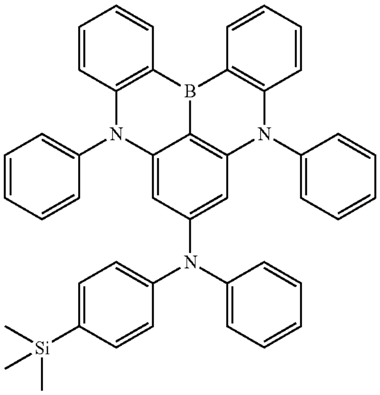
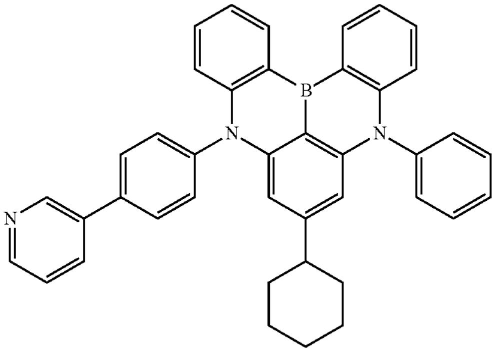
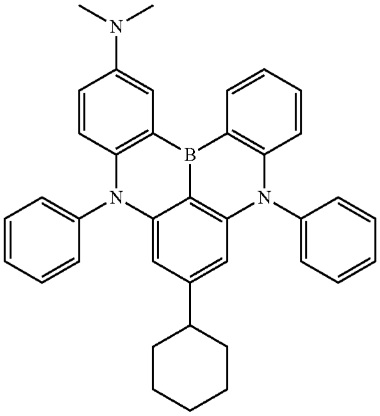

-continued
-continued
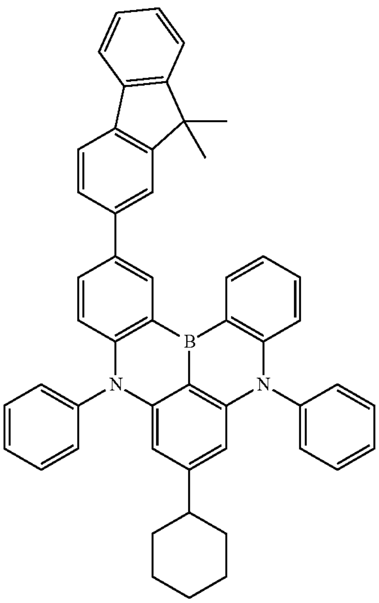
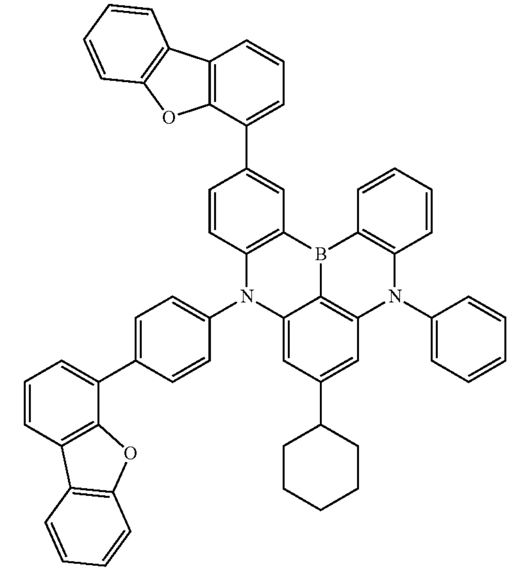
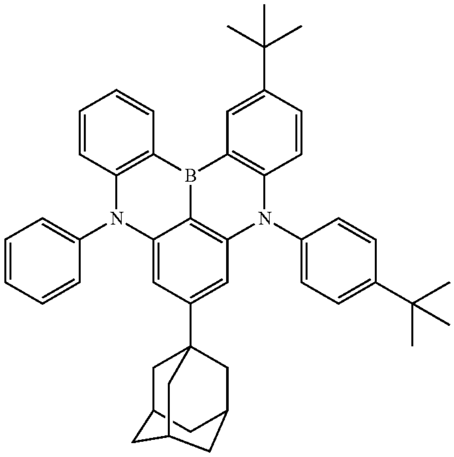
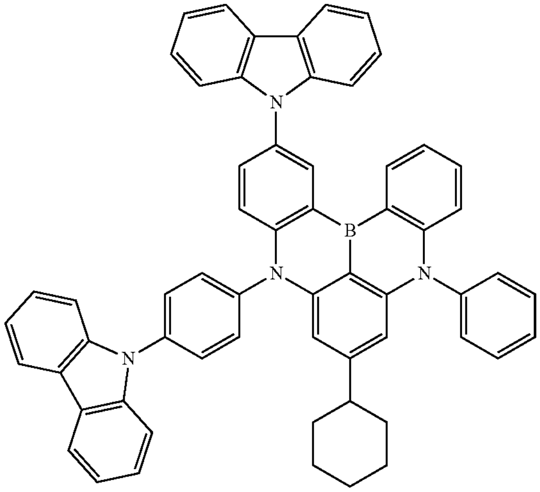
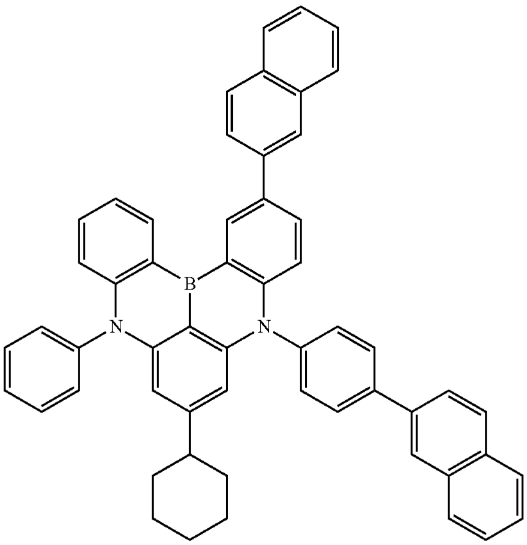
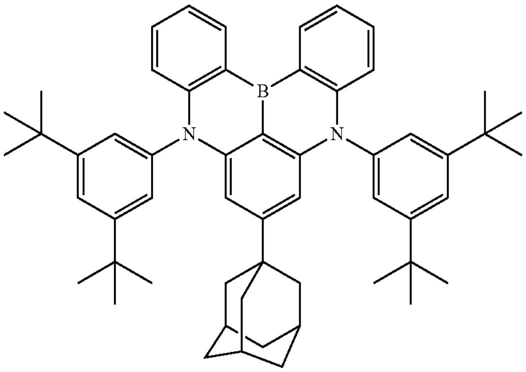

-continued
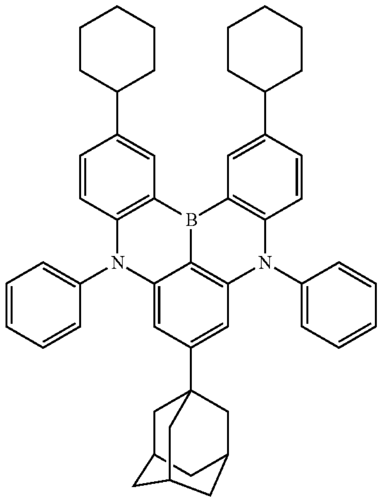
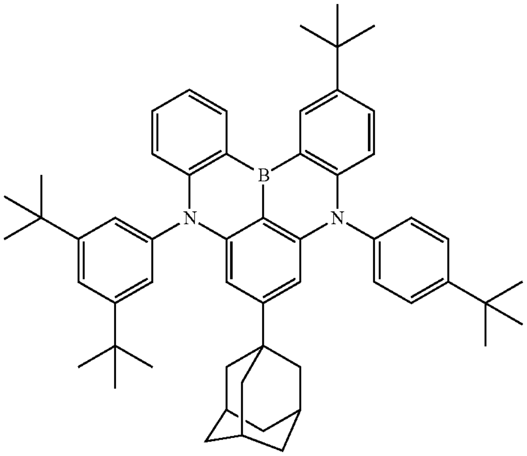
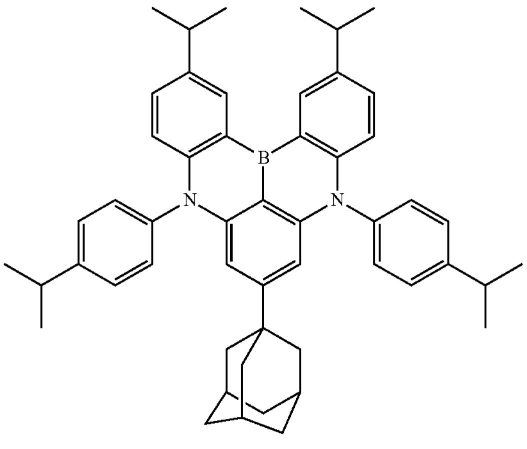
-continued
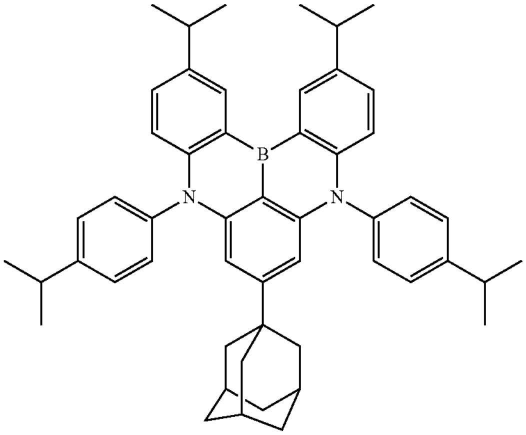
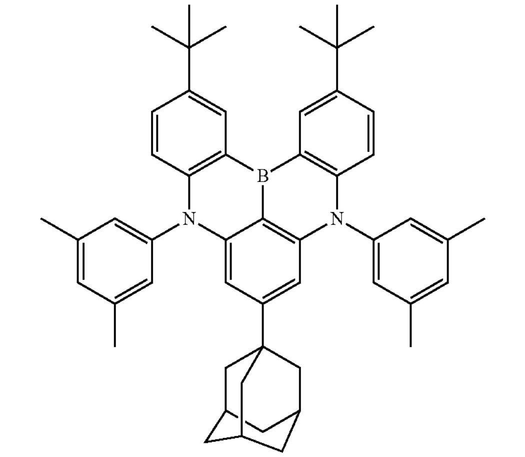
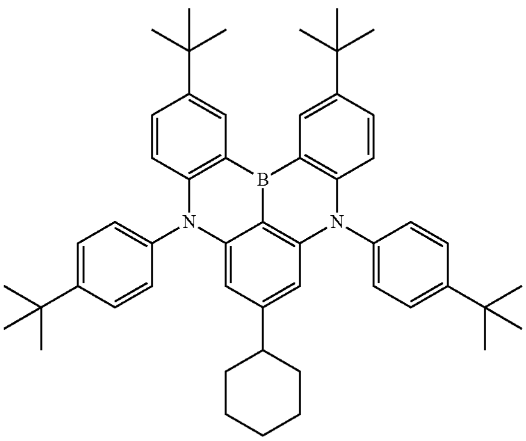

-continued
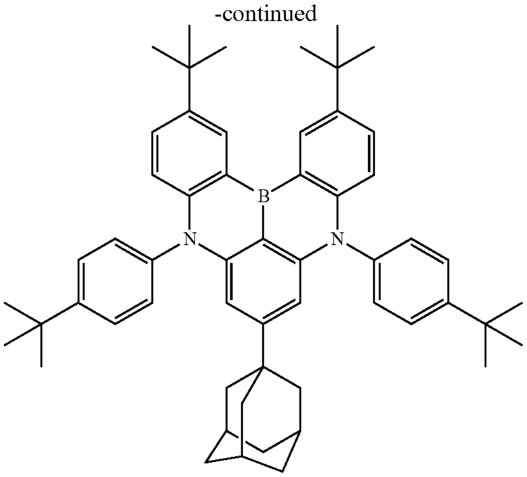
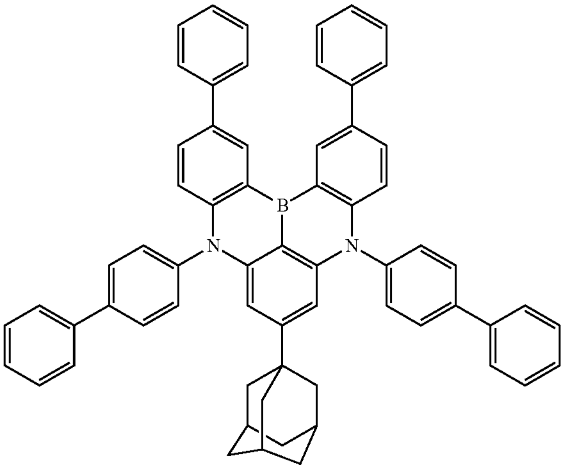
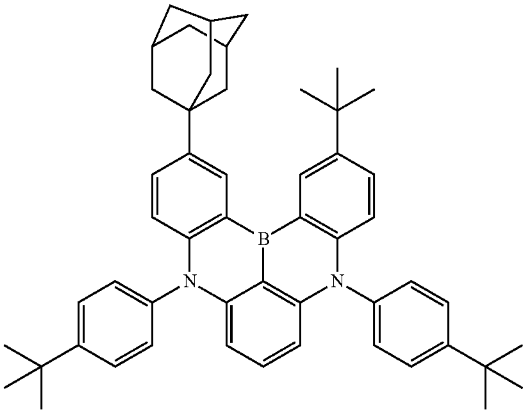
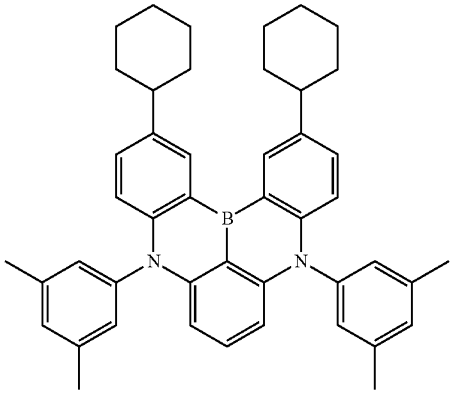
-continued
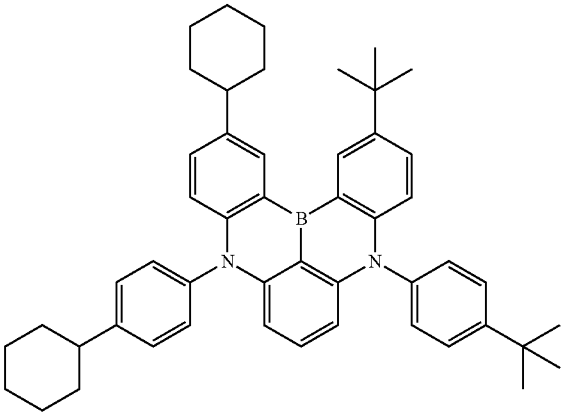
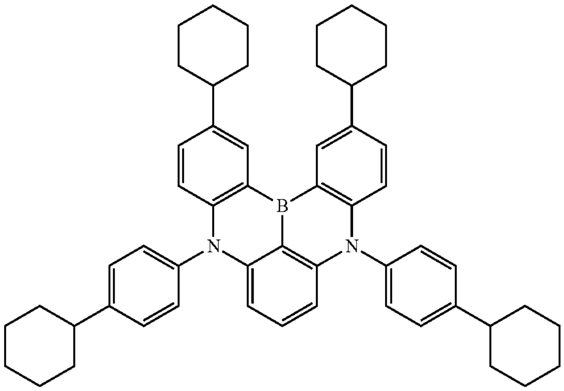
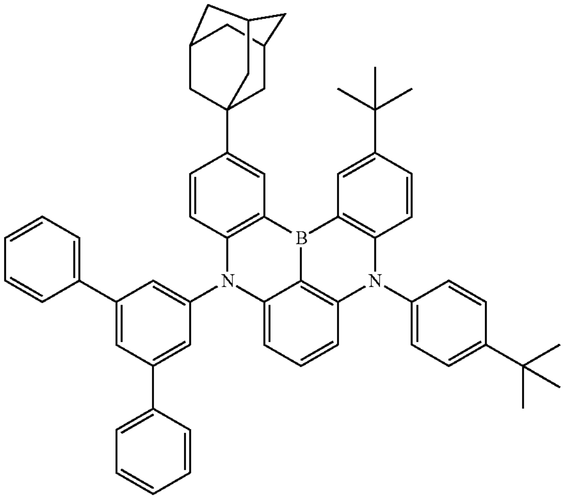
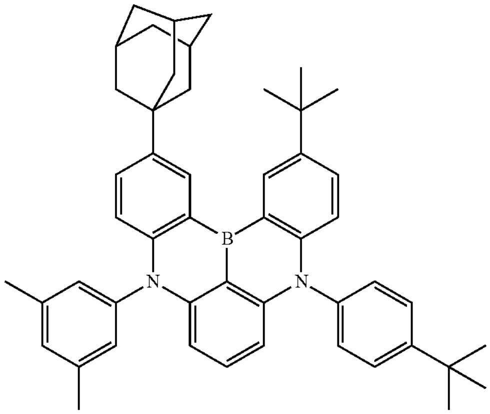

-continued
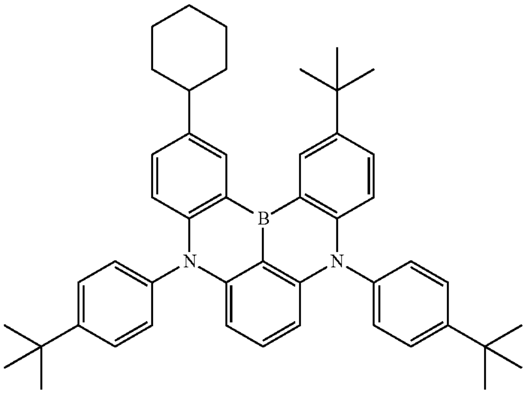
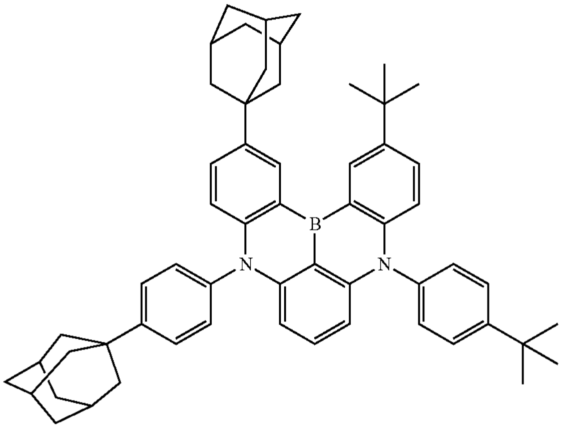
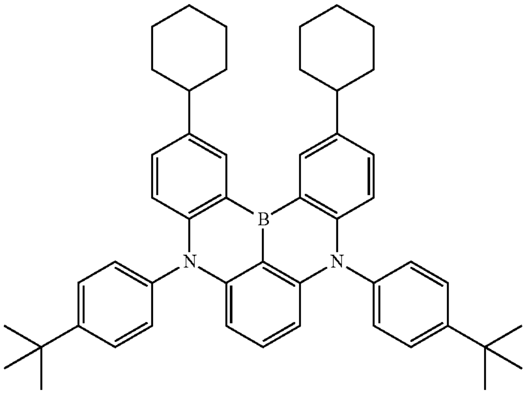
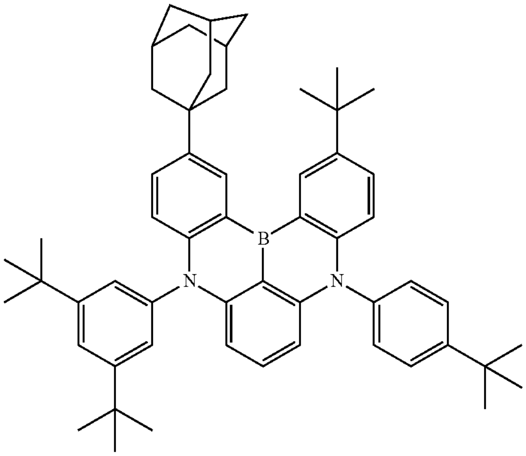
-continued
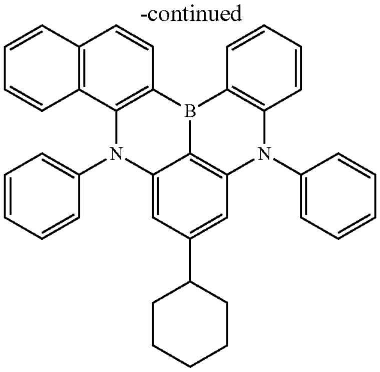
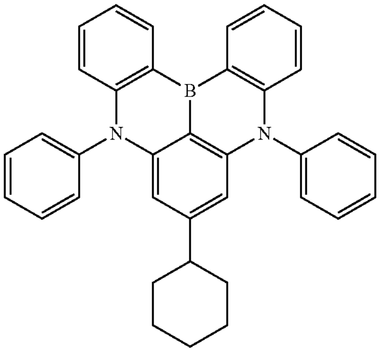
(Compound Represented by Formula (51))
The compound represented by the formula (51) is explained below.
(51)
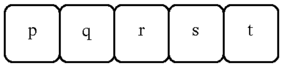
(52)
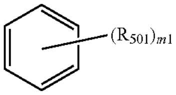
(53)
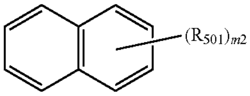
(54)
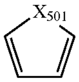
(55)
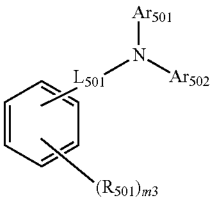

-continued (56)

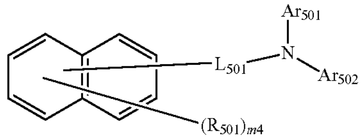

In the formula (51), ring r is a ring represented by the formula (52) or the formula (53) which is fused to respective arbitrary positions of the adjacent rings;

ring q and ring s are independently a ring represented by the formula (54) which is fused to respective arbitrary positions of the adjacent rings;

ring p and ring t are independently a ring represented by the formula (55) or the formula (56) which is fused to an arbitrary position of the adjacent ring;

when a plurality of $R_{501}$'s exists, adjacent $R_{501}$'s are bonded with each other to form a substituted or unsubstituted, saturated or unsaturated ring, or do not form a substituted or unsubstituted, saturated or unsaturated ring;

$X_{501}$ is an oxygen atom, a sulfur atom, or $NR_{502}$;

$R_{501}$ that do not form the substituted or unsubstituted saturated or unsaturated ring, and $R_{502}$ are a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are as defined in the formulas (1);

$Ar_{501}$ and $Ar_{502}$ are independently a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

$L_{501}$ is a substituted or unsubstituted alkylene group including 1 to 50 carbon atoms, a substituted or unsubstituted alkenylene group including 2 to 50 carbon atoms, a substituted or unsubstituted alkynylene group including 2 to 50 carbon atoms, a substituted or unsubstituted cycloalkylene group including 3 to 50 ring carbon atoms, a substituted or unsubstituted arylene group including 6 to 50 ring carbon atoms, or a substituted or unsubstituted divalent heterocyclic group including 5 to 50 ring atoms;

m1's are independently an integer of 0 to 2, m2's are independently an integer of 0 to 4, m3 is independently an integer of 0 to 3, and m4 is independently an integer of 0 to 5; and when a plurality of $R_{501}$'s exists, the plurality of $R_{501}$'s may be the same as or different from each other.

In the formula (51), each of the ring p to the ring t is fused with the adjacent ring by sharing two carbon atoms. The fused position and the fused direction are not limited, and it can be fused at any position and direction.

In one embodiment, in the formula (52) or (53) for the r ring, $R_{901}$ is a hydrogen atom.

In one embodiment, the compound represented by the formula (51) is a compound represented by any one of the following formulas (51-1) to (51-6).

(51-1)

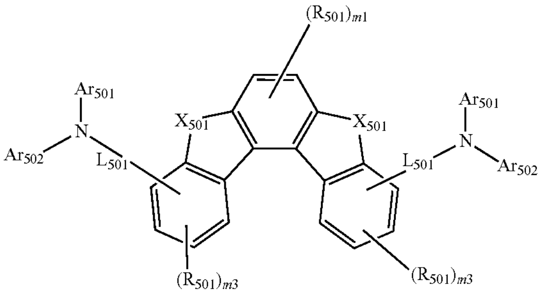

(51-2)

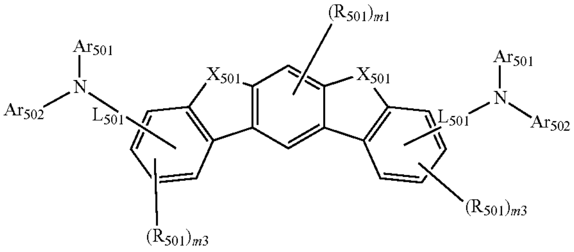

(51-3)

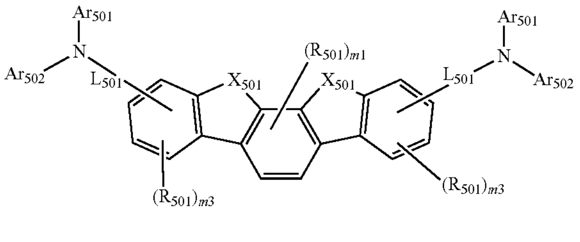

-continued (51-4)

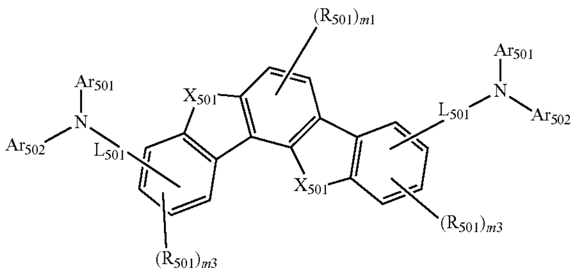

(51-5)

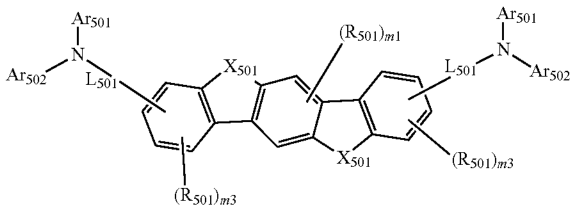

(51-6)

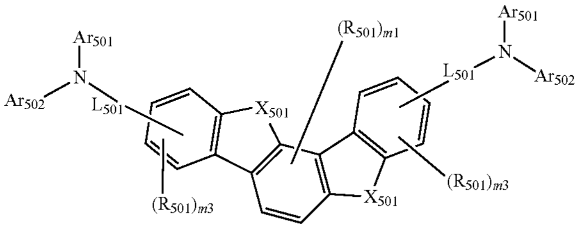

In the formulas (51-1) to (51-6), $R_{501}$, $X_{501}$, $Ar_{501}$, $Ar_{502}$, $L_{501}$, m1 and m3 are as defined in the formula (51).

In one embodiment, the compound represented by the formula (51) is a compound represented by any one of the following formulas (51-11) to (51-13).

(51-11)

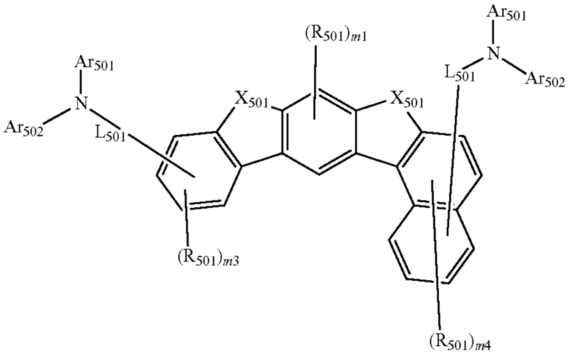

(51-12)

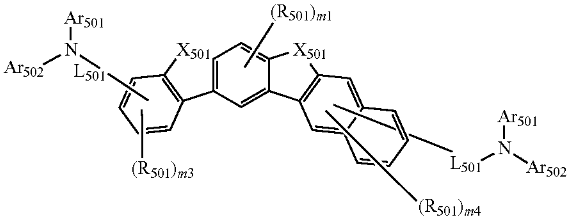

(51-13)

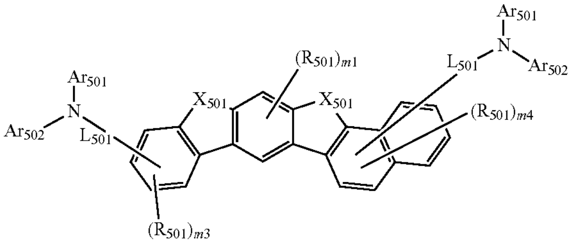

In the formulas (51-11) to (51-13), $R_{501}$, $X_{501}$, $Ar_{501}$, $Ar_{502}$, $L_{501}$, m1, m3 and m4 are as defined in the formula (51).

In one embodiment, the compound represented by the formula (51) is a compound represented by any one of the following formulas (51-21) to (51-25).

(51-21)

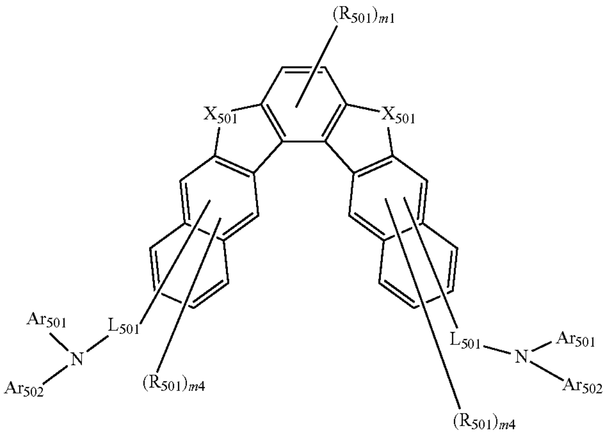

-continued
(51-22)
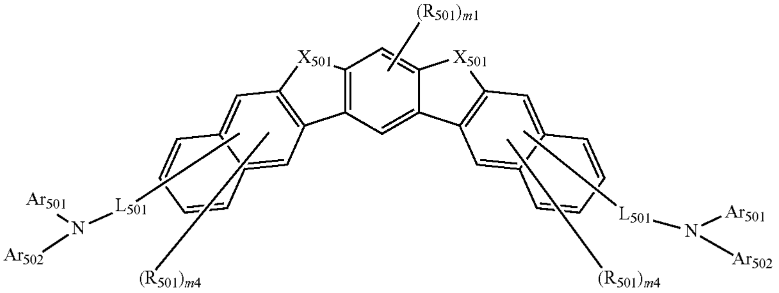
(51-23)
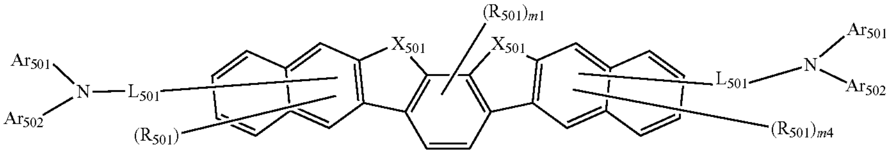
(51-24)
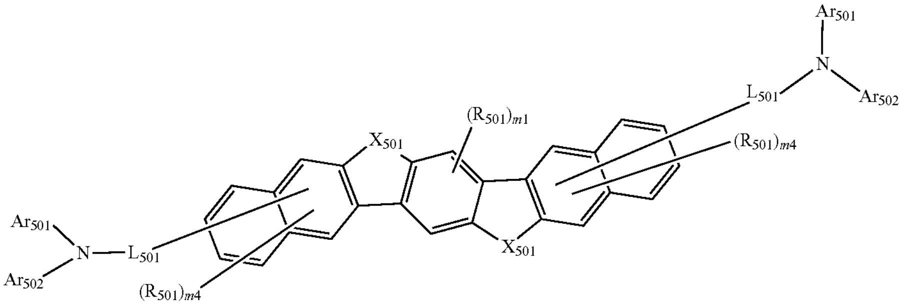
(51-25)
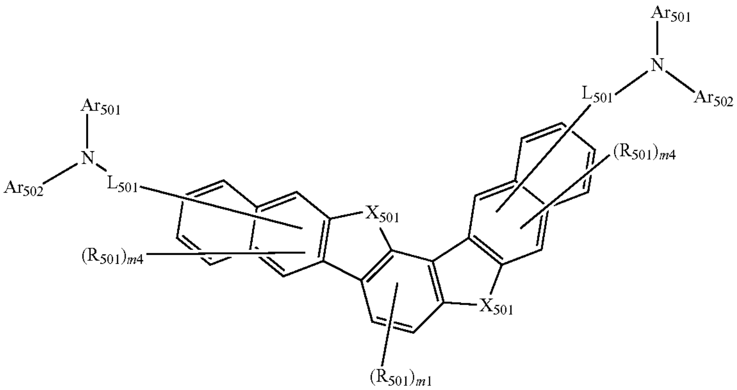
In the formulas (51-21) to (51-25), $R_{501}$, $X_{501}$, $Ar_{501}$, $Ar_{502}$, $L_{501}$, m1 and m4 are as defined in the formula (51).
In one embodiment, the compound represented by the formula (51) is a compound represented by any one of the following formulas (51-31) to (51-33).
(51-31)
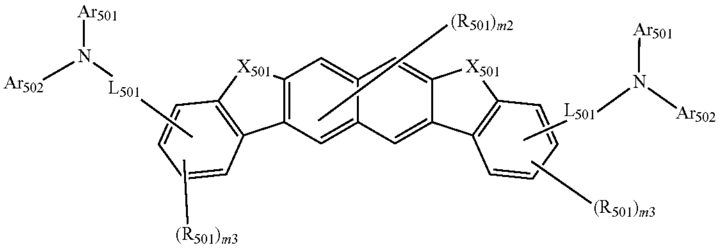

-continued (51-32)

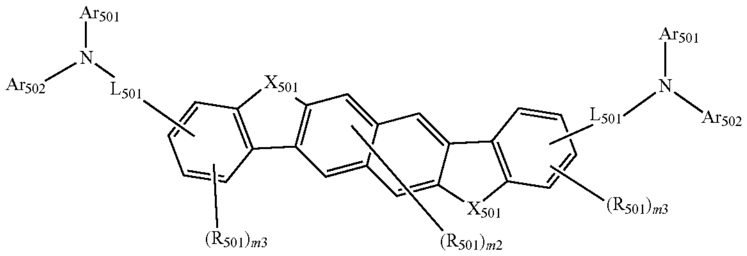

(51-33)

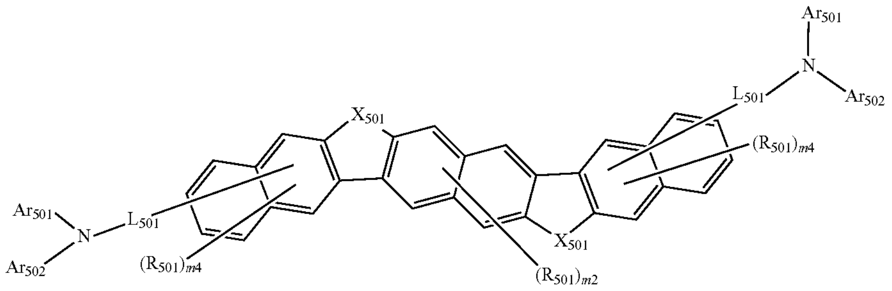

In the formulas (51-31) to (51-33), $R_{501}$, $X_{501}$, $Ar_{501}$, $Ar_{502}$, $L_{501}$, m1 to m4 are as defined in the formula (51).

In one embodiment, $Ar_{501}$ and $Ar_{502}$, are independently a substituted or unsubstituted aryl group including 6 to 50 ring carbon atoms.

In one embodiment, one of $Ar_{501}$ and $Ar_{502}$ is a substituted or unsubstituted aryl group including 6 to 50 ring carbon atoms and the other is a substituted or unsubstituted monovalent heterocyclic group including 5 to 50 ring atoms.

As examples of the compound represented by the formula (51), the following compounds can be given, for example. In the following specific examples, "Me" represents a methyl group.

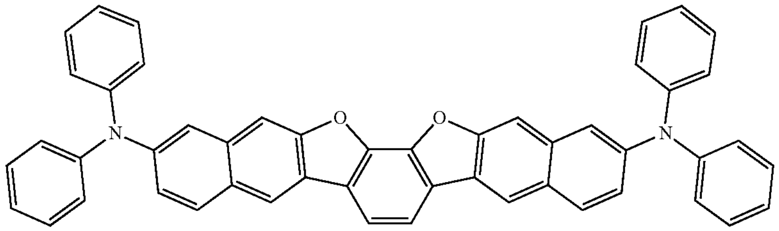

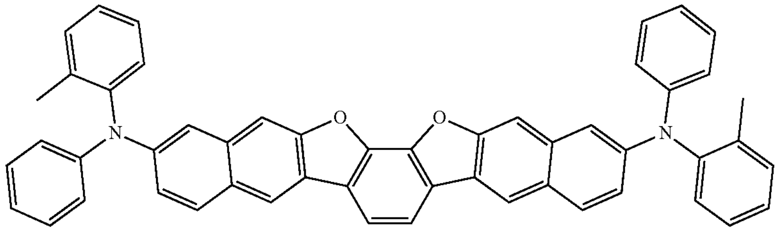

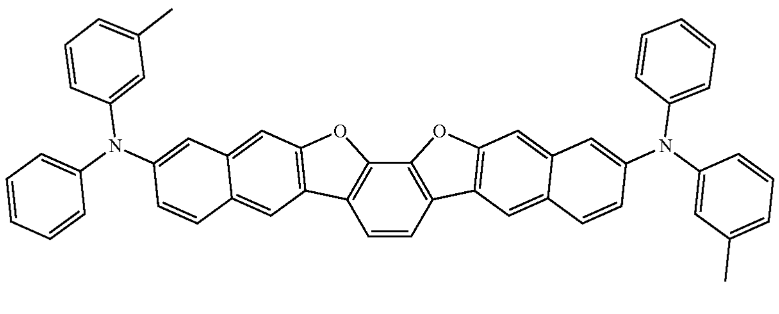

-continued
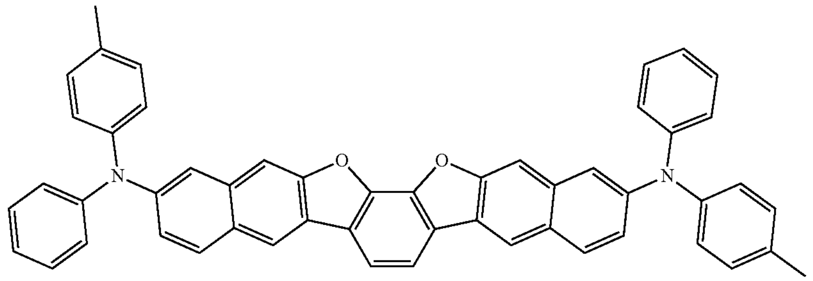
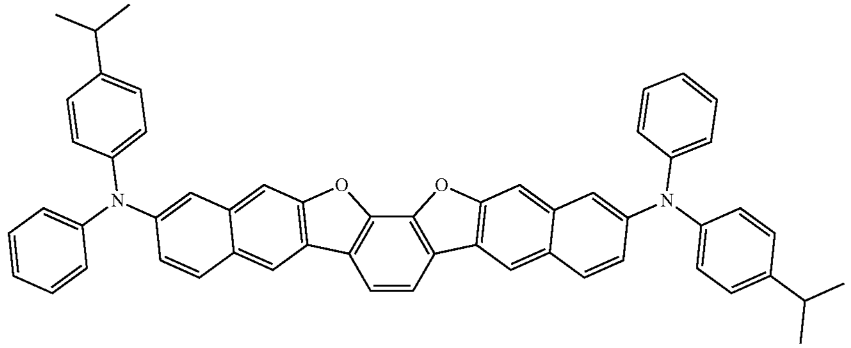
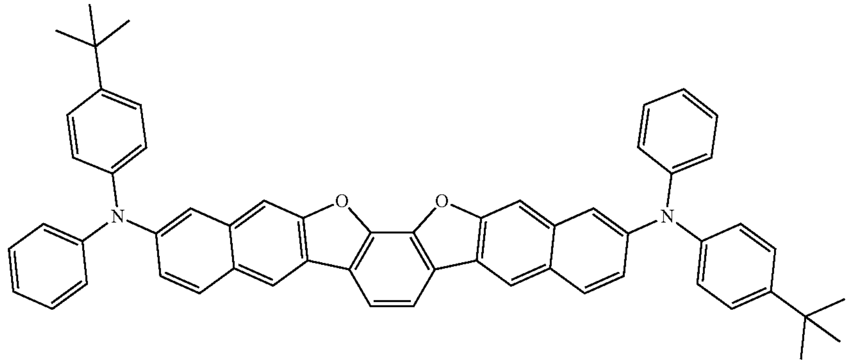
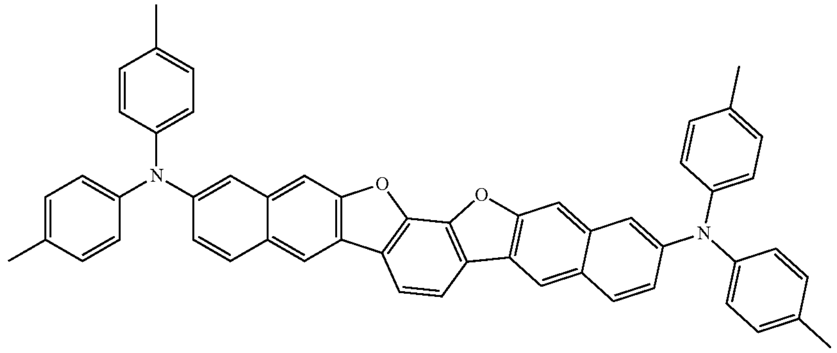
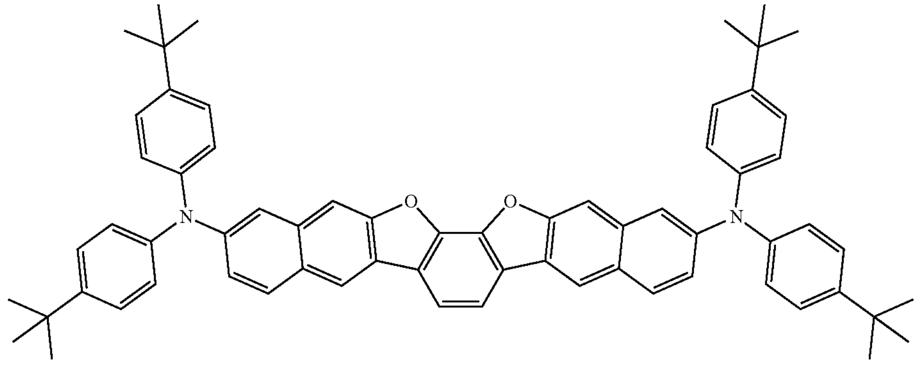

-continued
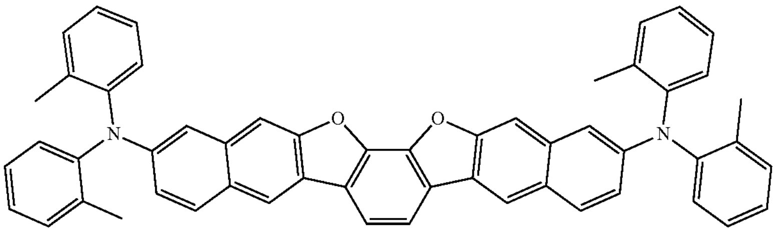
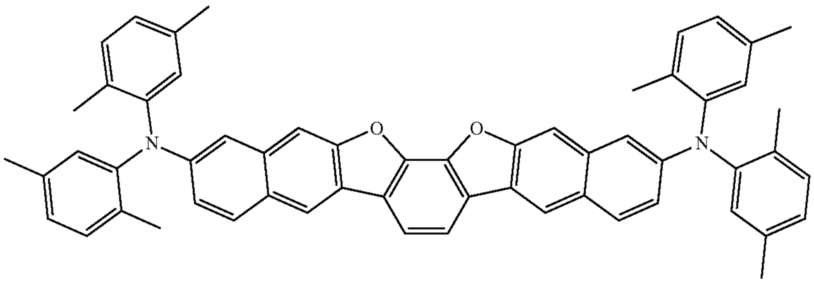
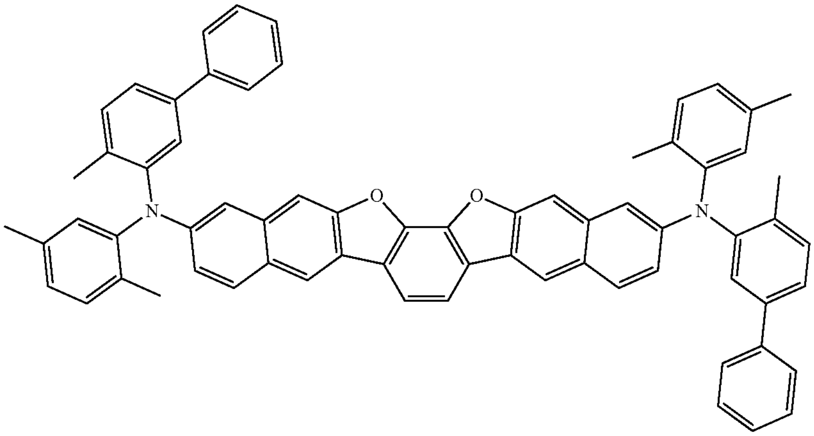
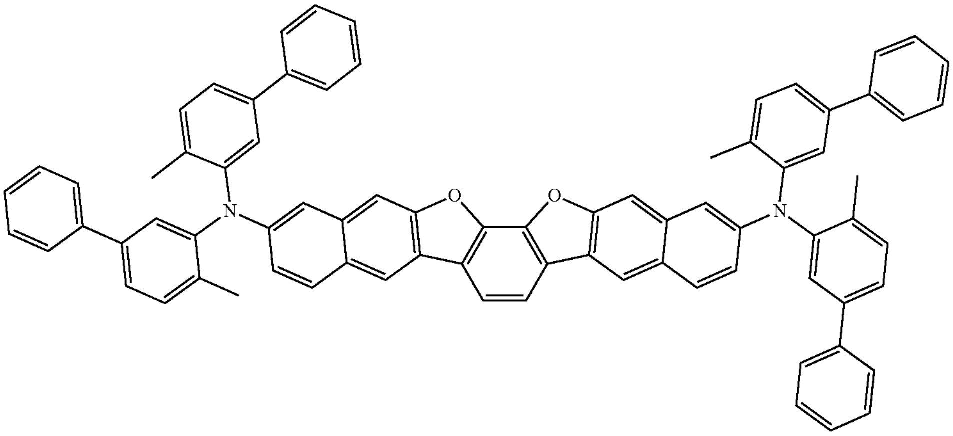
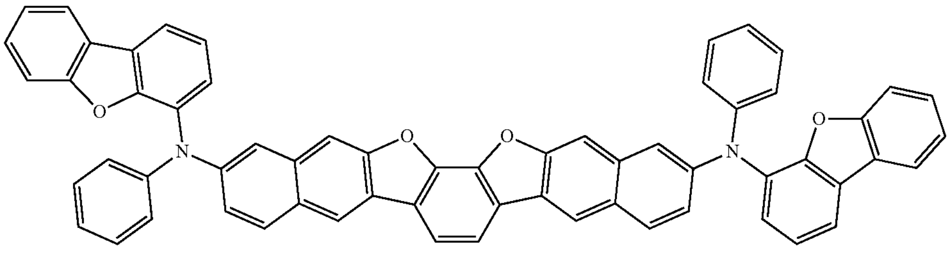

-continued
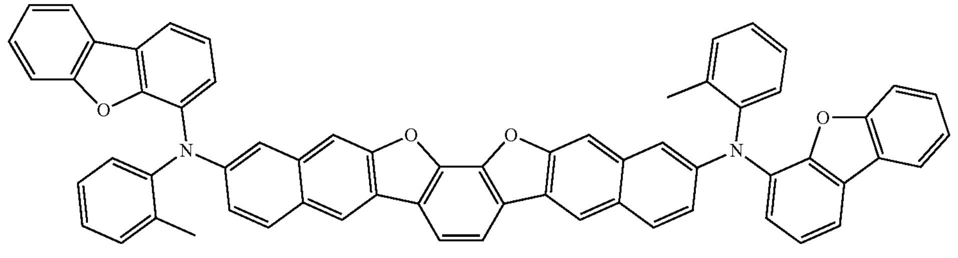
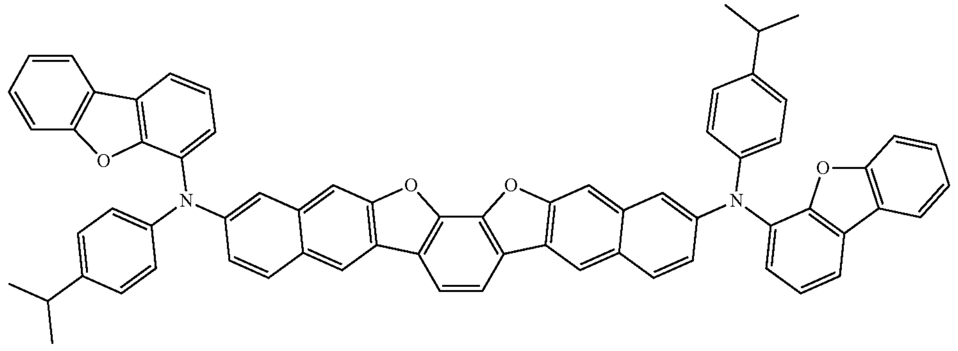
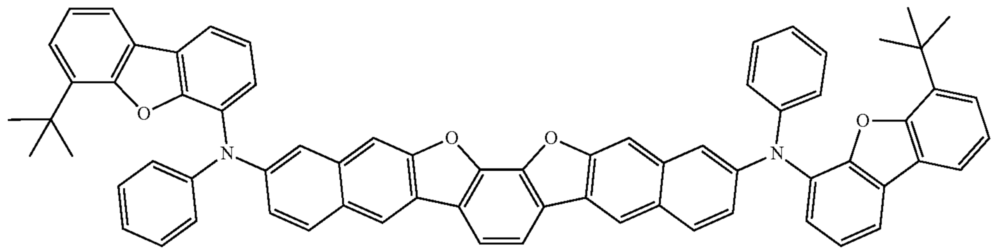
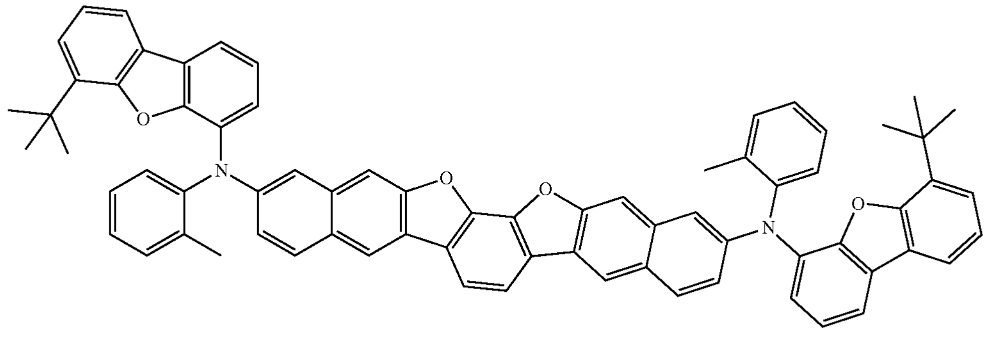
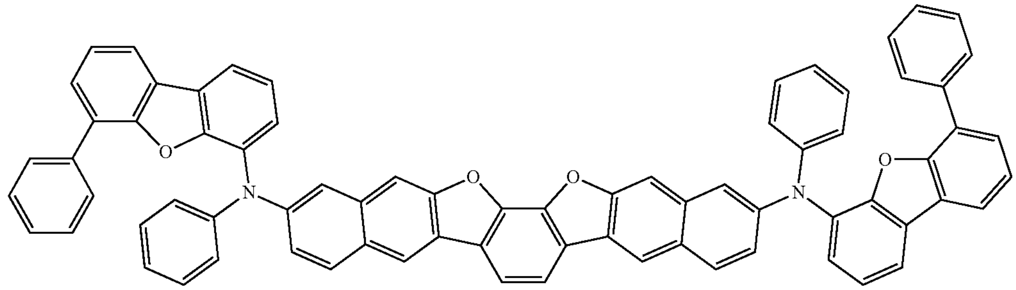

-continued
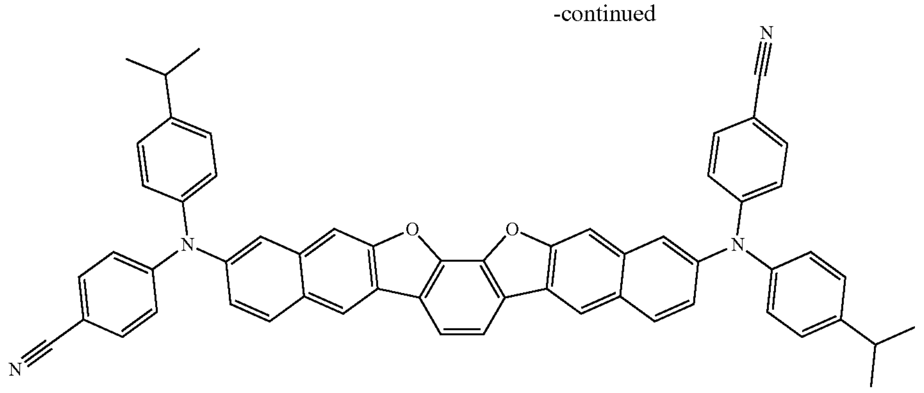
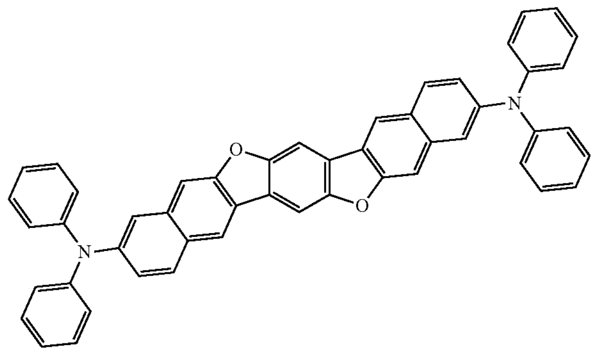
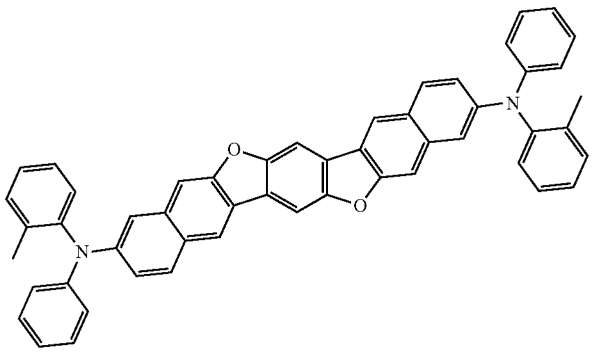
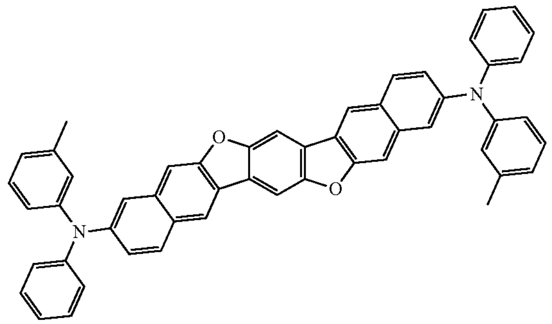
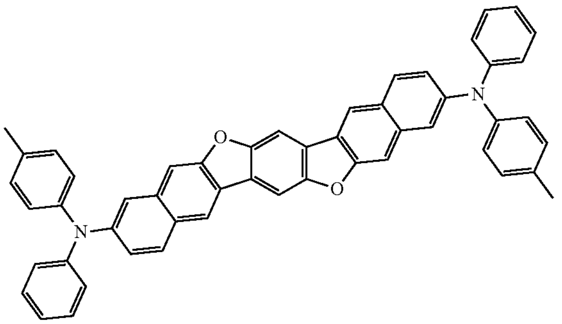
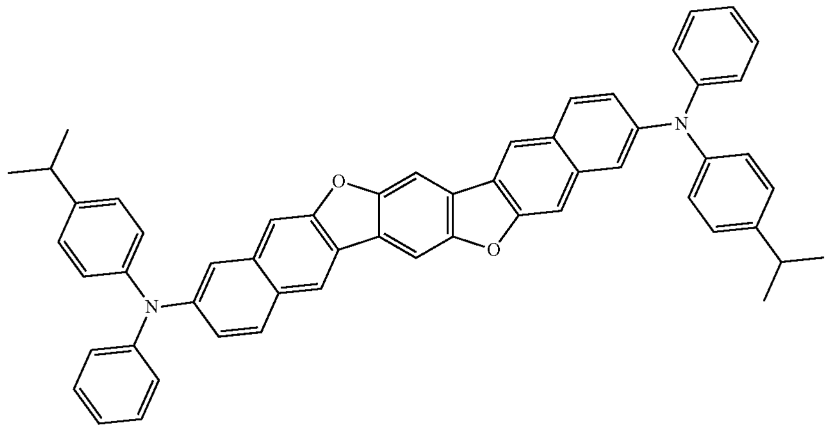

-continued
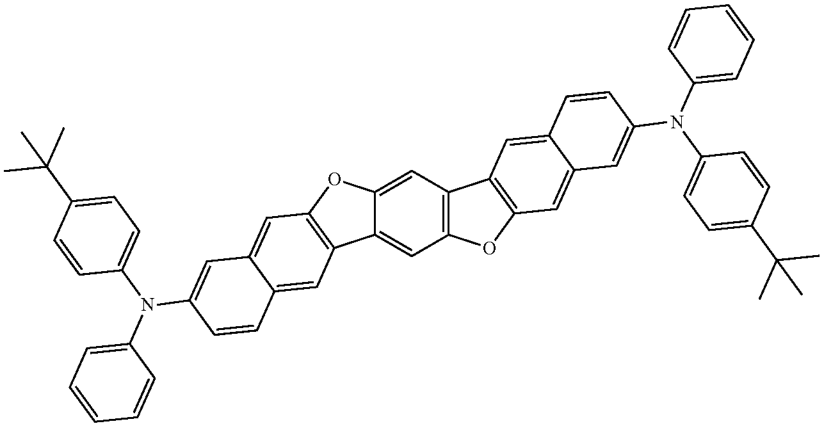
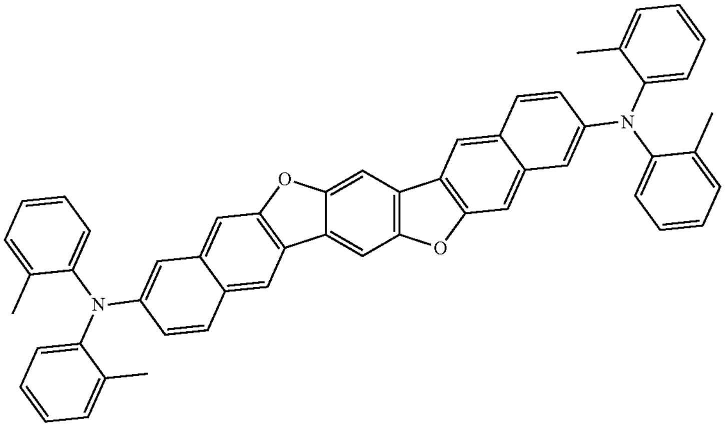
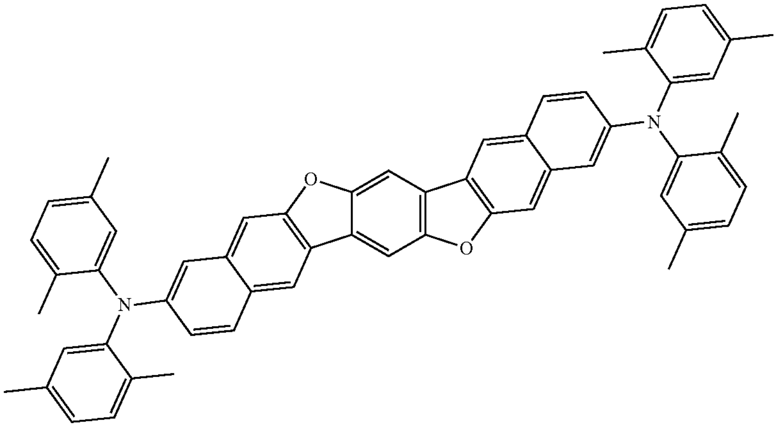
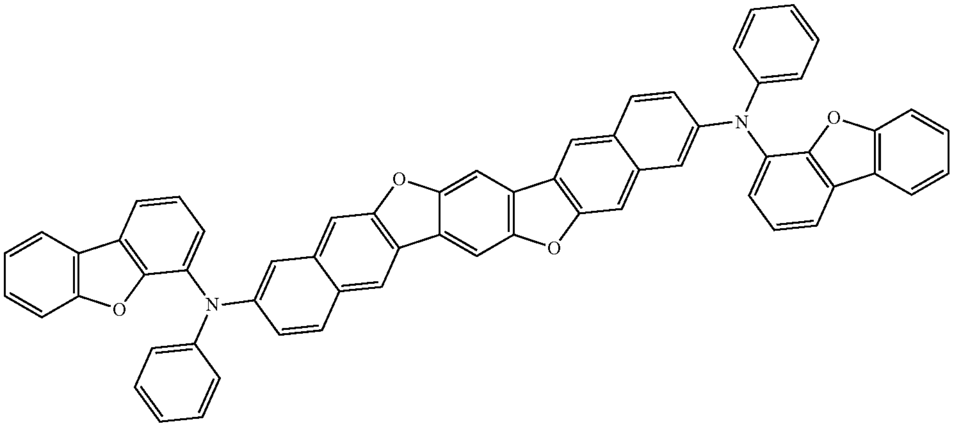

-continued
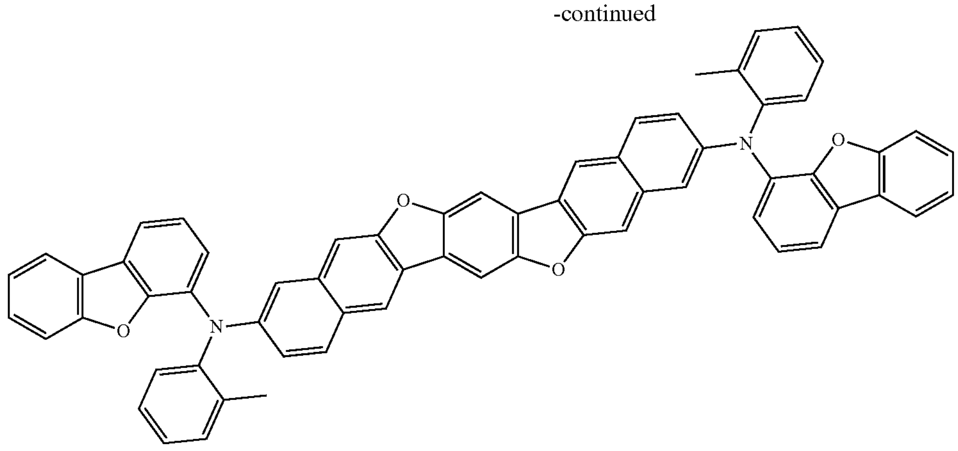
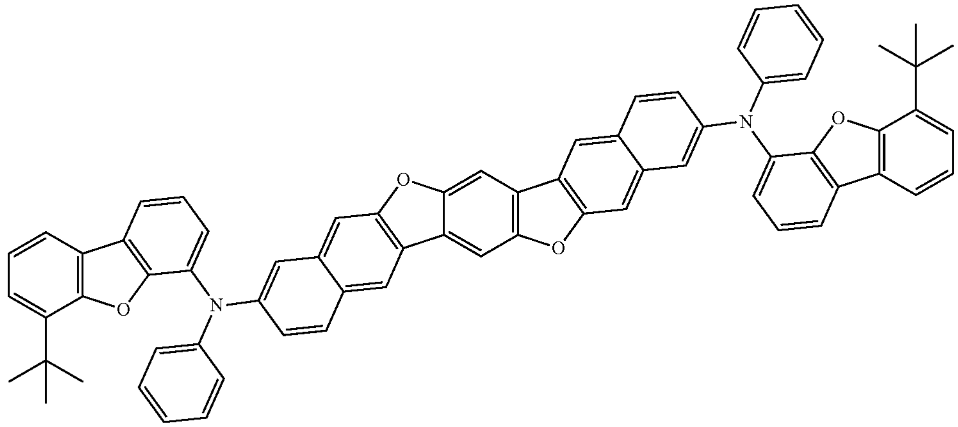
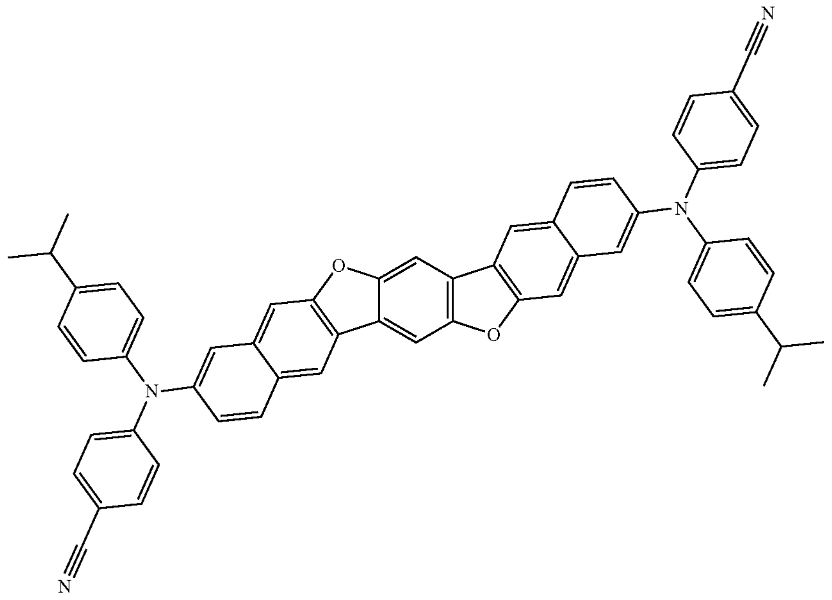

(Compound Represented by Formula (61))

The compound represented by the formula (61) is explained below.

(61)

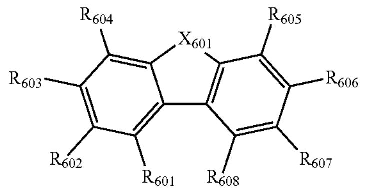

In the formula (61), at least one set (pair) of $R_{601}$ and $R_{602}$, $R_{602}$ and $R_{603}$, and $R_{603}$ and $R_{604}$ are bonded with each other to form a divalent group represented by the following formula (62);

at least one set (pair) of $R_{605}$ and $R_{606}$, $R_{606}$ and $R_{607}$, and $R_{607}$ and $R_{608}$ are bonded with each other to form a divalent group represented by the following formula (63).

(62)

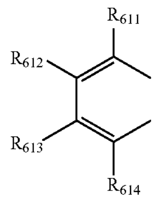

(63)

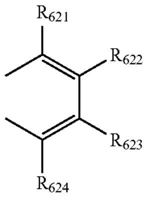

At least one of $R_{601}$ to $R_{604}$ that does not form the divalent group represented by the formula (62), and $R_{611}$ to $R_{614}$ is a monovalent group represented by the following formula (64);

at least one of $R_{605}$ to $R_{608}$ that do not form the divalent group represented by the formula (63), and $R_{621}$ to $R_{624}$ is a monovalent group represented by the following formula (64);

$X_{601}$ is an oxygen atom, a sulfur atom, or $NR_{609}$;

$R_{601}$ to $R_{608}$ that do not form the divalent group represented by the formulas (62) and (63) and that are not the monovalent group represented by the formula (64), $R_{611}$ to $R_{614}$ and $R_{621}$ to $R_{624}$ that are not the monovalent group represented by the formula (64), and $R_{609}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, $—S—(R_{905})$, $—N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

(64)

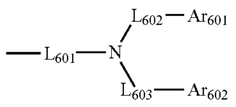

In the formula (64), $Ar_{601}$ and $Ar_{602}$ are independently a substituted or unsubstituted aryl group including 6 to 50 ring carbon atoms, or a substituted or unsubstituted monovalent heterocyclic group including 5 to 50 ring atoms; and $L_{601}$ to $L_{603}$ are independently a single bond, a substituted or unsubstituted arylene group including 6 to 30 ring carbon atoms, a substituted or unsubstituted divalent heterocyclic group including 5 to 30 ring atoms, or a divalent group formed by linking 2 to 4 of the substituted or unsubstituted arylene group including 6 to 30 ring carbon atoms, and the substituted or unsubstituted divalent heterocyclic group including 5 to 30 ring atoms.

In the formula (61), positions at which the divalent group represented by the formula (62) and the divalent group represented by the formula (63) are formed are not limited, and these groups can be formed at possible positions of $R_{601}$ to $R_{608}$.

In one embodiment, the compound represented by the formula (61) is a compound represented by any one of the following formulas (61-1) to (61-6).

(61-1)

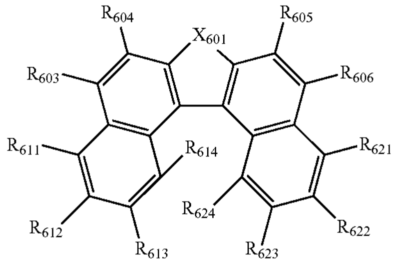

(61-2)

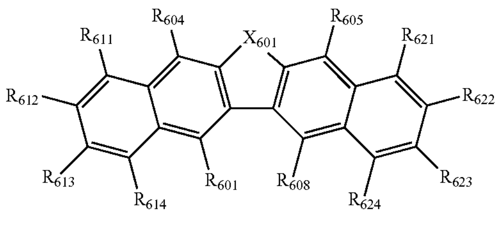

-continued (61-3)

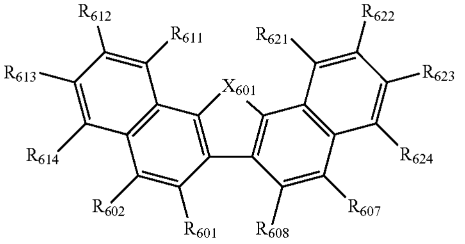

(61-4)

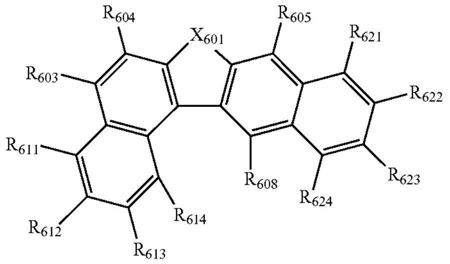

(61-5)

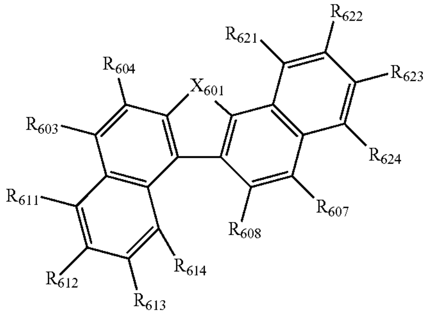

(61-6)

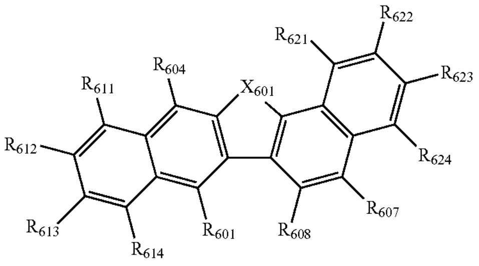

In the formulas (61-1) to (61-6), $X_{601}$ is as defined in the formula (61);

at least two of $R_{601}$ to $R_{624}$ are the monovalent groups represented by the formula (64);

$R_{601}$ to $R_{624}$ that are not the monovalent group represented by the formula (64) are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

In one embodiment, the compound represented by the formula (61) is a compound represented by any one of the following formulas (61-7) to (61-18).

(61-7)

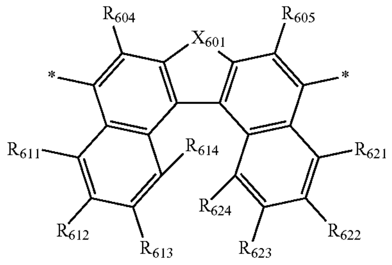

(61-8)

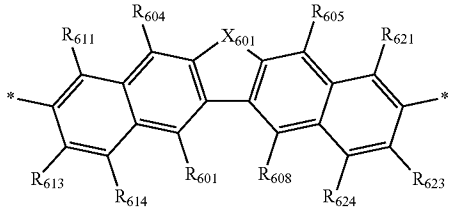

(61-9)

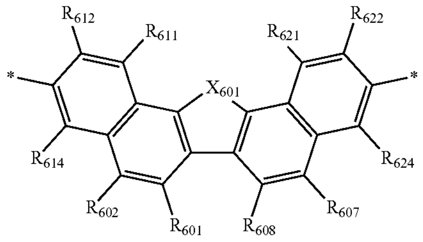

(61-10)

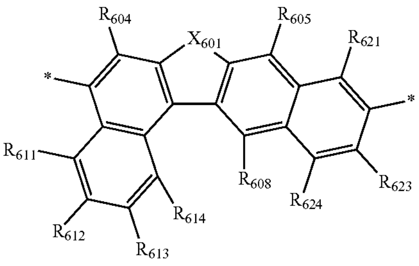

(61-11)

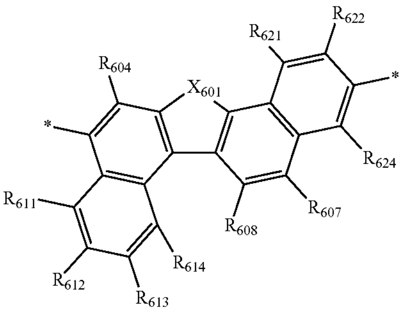

-continued (61-12)

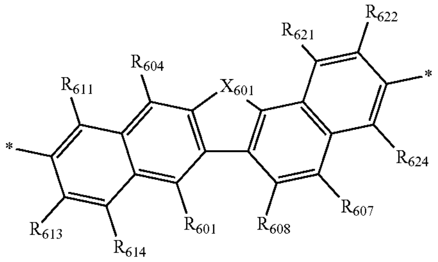

(61-13)

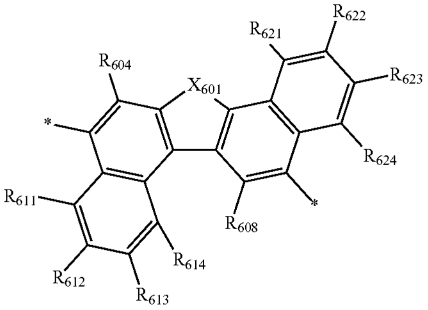

(61-14)

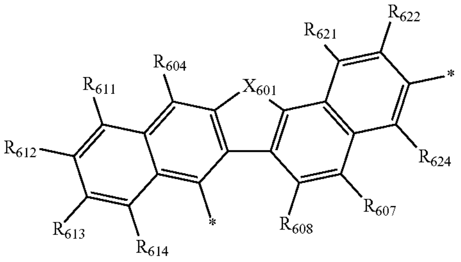

(61-15)

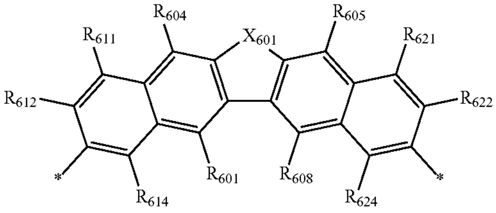

(61-16)

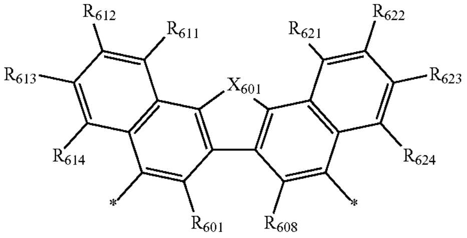

(61-17)

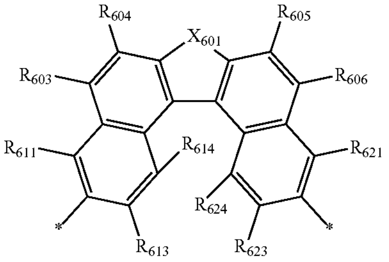

-continued (61-18)

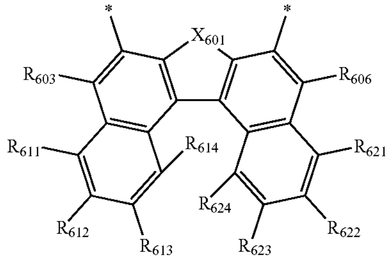

In the formulas (61-7) to (61-18), $X_{601}$ is as defined in the formula (61); * is a single bond which bonds to the monovalent group represented by the formula (64); and $R_{601}$ to $R_{624}$ are the same as $R_{601}$ to $R_{624}$ that are not the monovalent group represented by the formula (64).

$R_{601}$ to $R_{608}$ that do not form the divalent group represented by any one of the formulas (62) and (63) and that are not the monovalent group represented by the formula (64), and $R_{611}$ to $R_{614}$ and $R_{621}$ to $R_{624}$ that are not the monovalent group represented by the formula (64) are preferably independently

- a hydrogen atom,
- a substituted or unsubstituted alkyl group including 1 to 50 carbon atoms,
- a substituted or unsubstituted alkenyl group including 2 to 50 carbon atoms,
- a substituted or unsubstituted alkynyl group including 2 to 50 carbon atoms,
- a substituted or unsubstituted cycloalkyl group including 3 to 50 ring carbon atoms,
- a substituted or unsubstituted aryl group including 6 to 50 ring carbon atoms, or
- a substituted or unsubstituted monovalent heterocyclic group including 5 to 50 ring atoms.

The monovalent group represented by the formula (64) is preferably a group represented by the following formula (65) or (66).

(65)

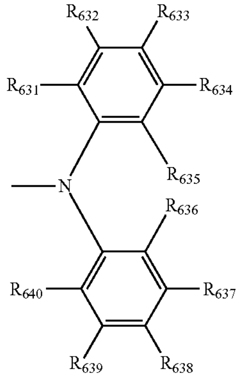

In the formula (65), $R_{631}$ to $R_{640}$ are independently

- a hydrogen atom,
- a substituted or unsubstituted alkyl group including 1 to 50 carbon atoms,
- a substituted or unsubstituted alkenyl group including 2 to 50 carbon atoms,
- a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

(66)

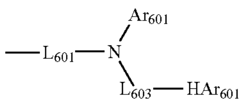

In the formula (66), $Ar_{601}$, $L_{601}$ and $L_{603}$ are as defined in the formula (64); and $HAr_{601}$ is a structure represented by the following formula (67).

(67)

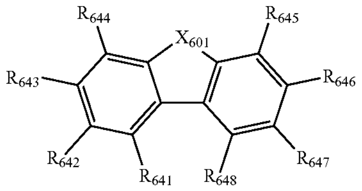

In the formula (67), $X_{602}$ is an oxygen atom or a sulfur atom;

any one of $R_{641}$ to $R_{648}$ is a single bond which bonds to $L_{603}$;

$R_{641}$ to $R_{648}$ that are not single bonds are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formulas (1).

As specific examples of the compound represented by the formula (61), the following compounds can be given, in addition to the compounds described in WO2014/104144. In the following specific examples, "Me" represents a methyl group.

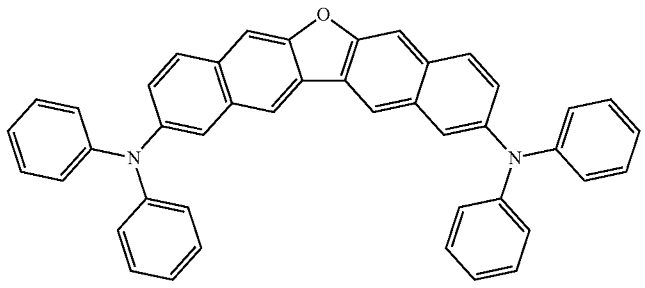

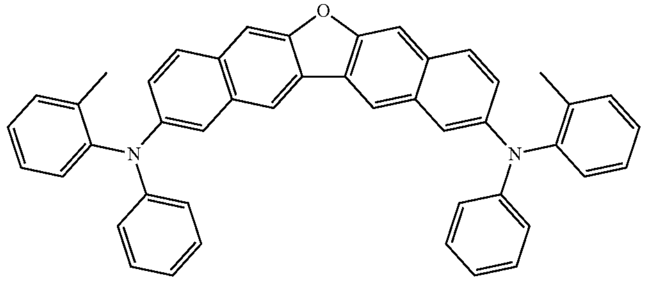

-continued
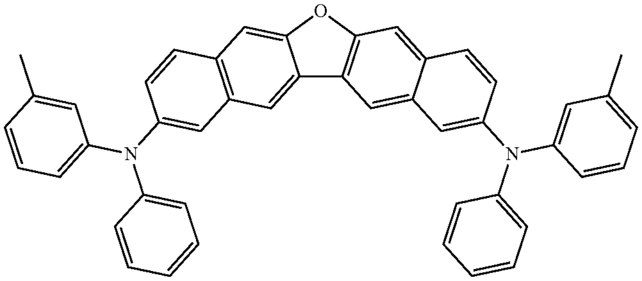
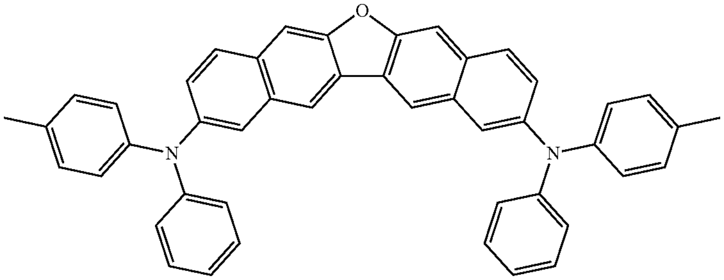
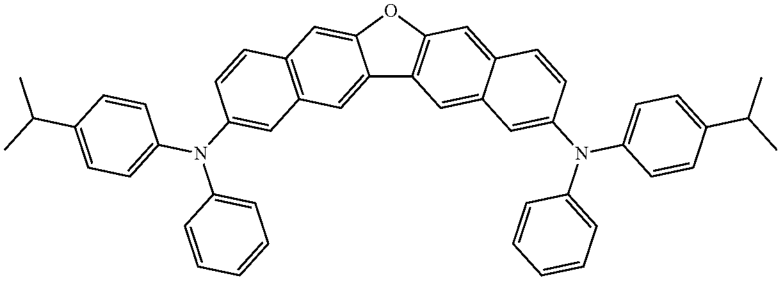
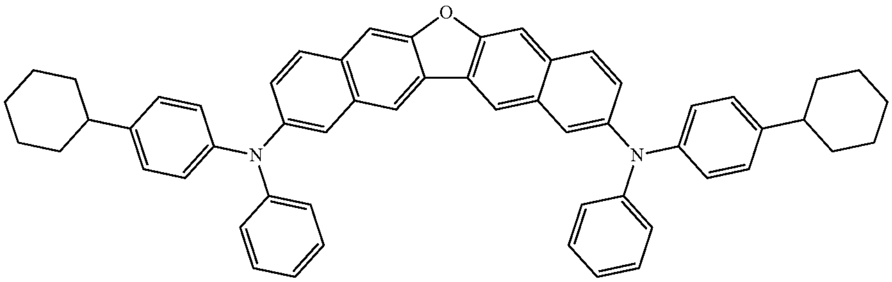
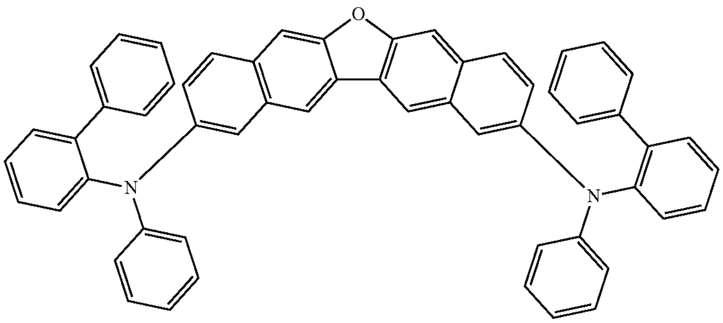

-continued
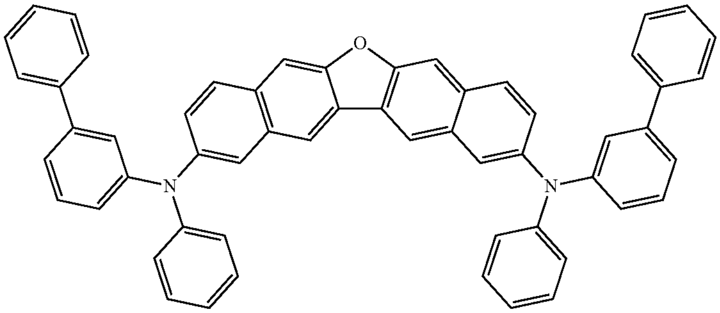
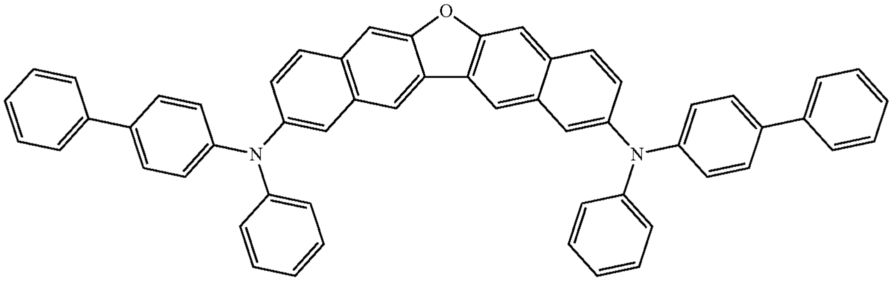
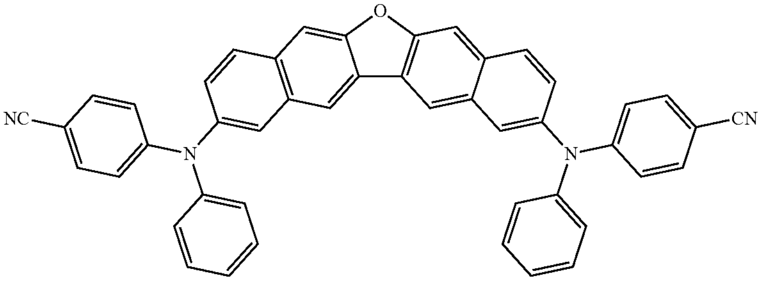
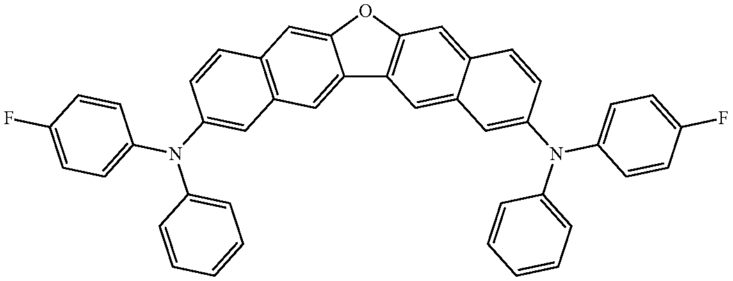
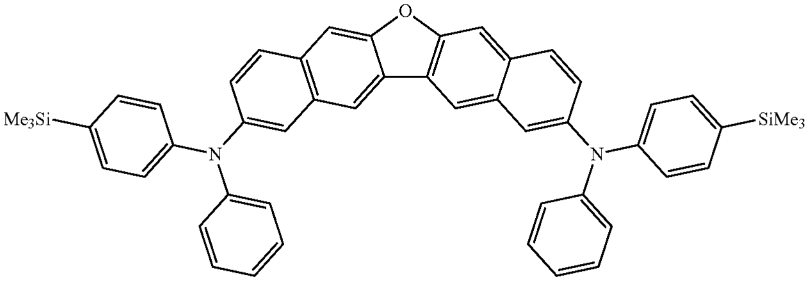
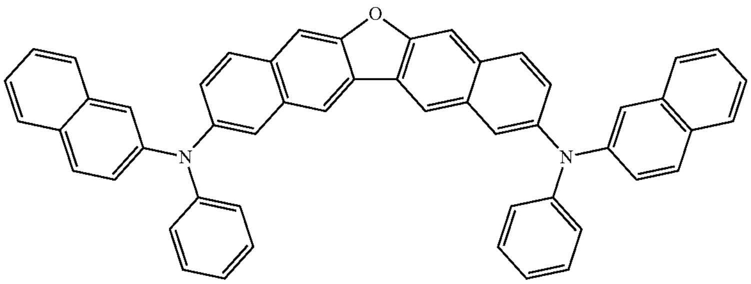

-continued
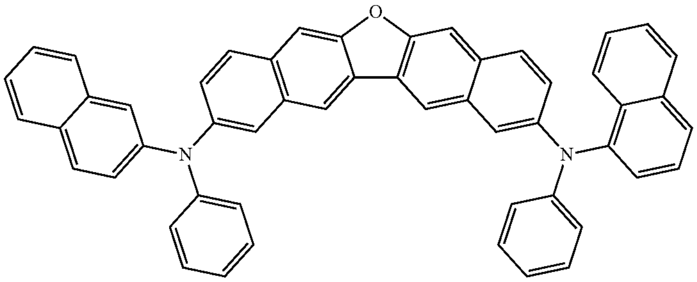
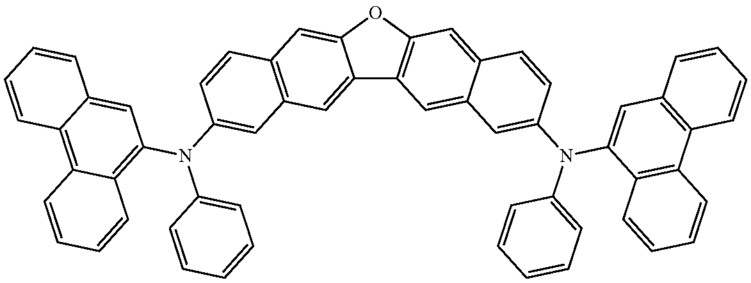
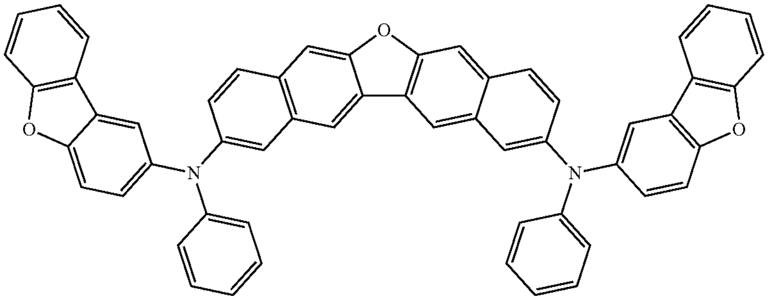
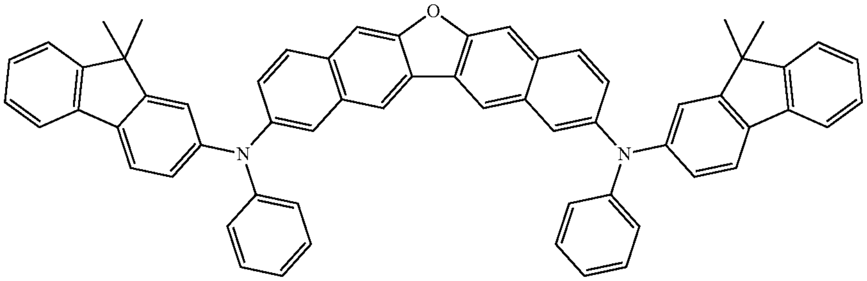
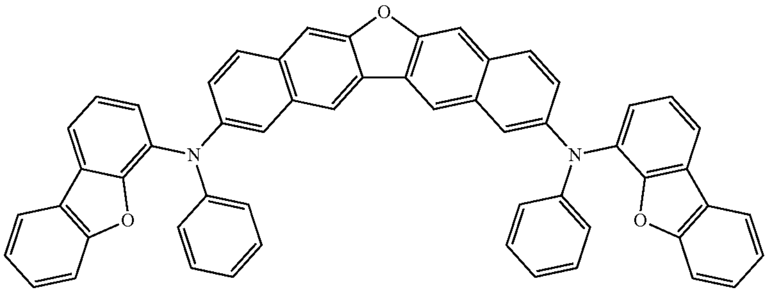
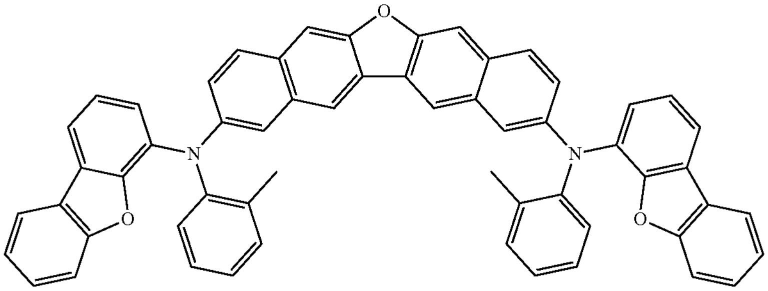

-continued
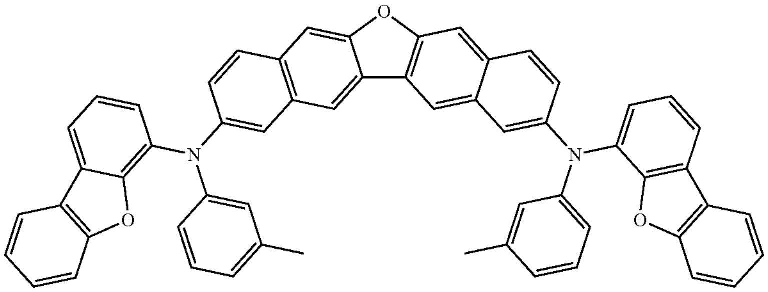
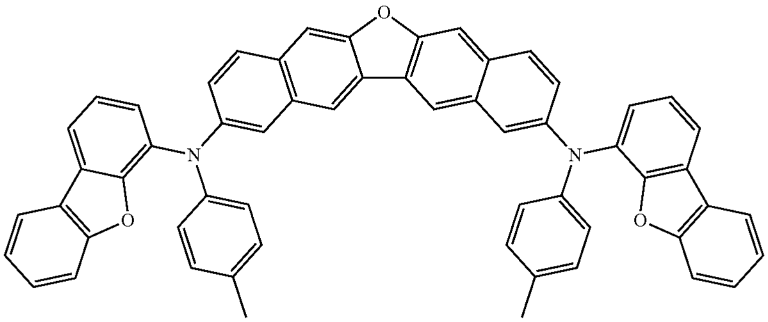
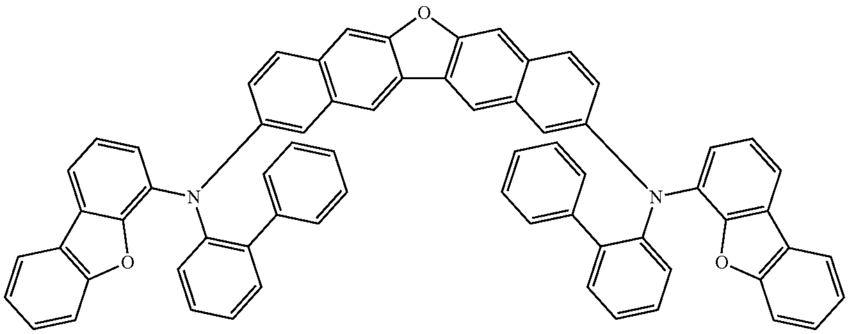
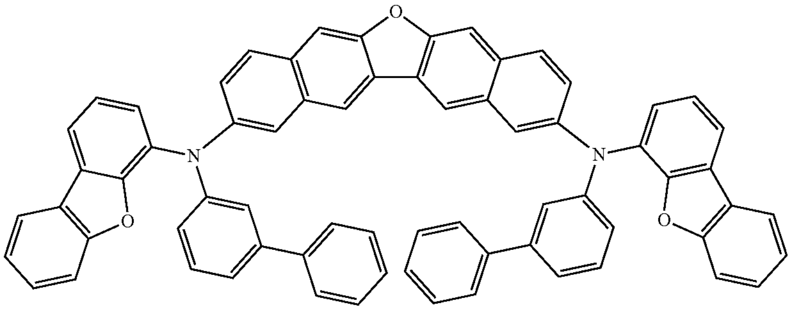
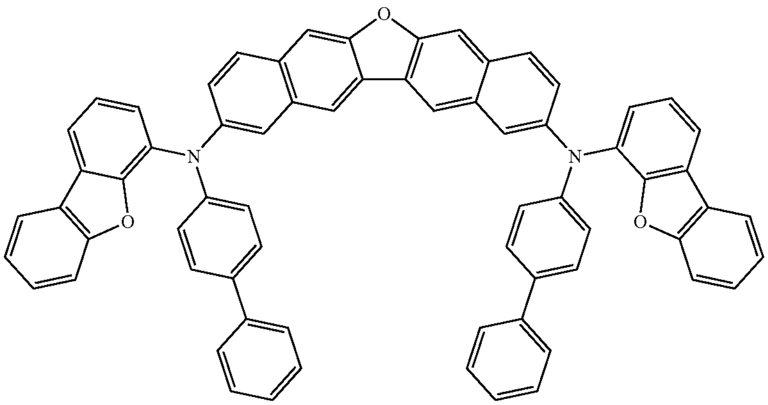

-continued
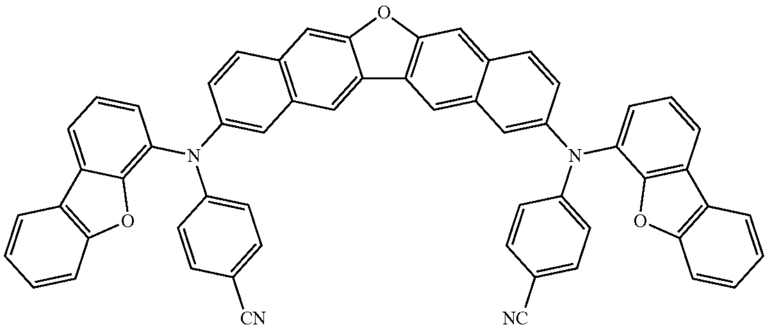
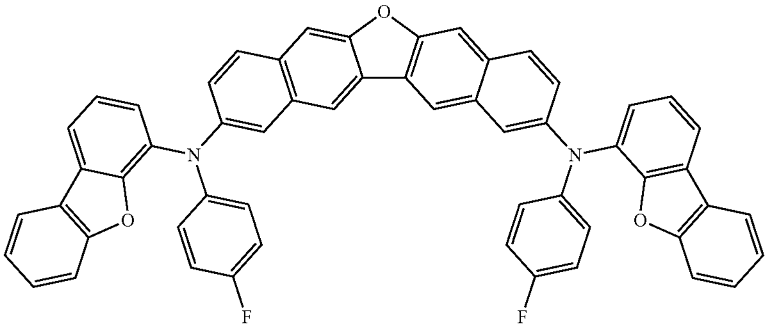
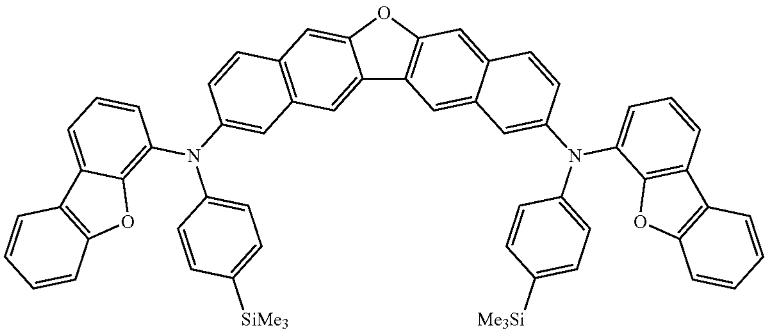
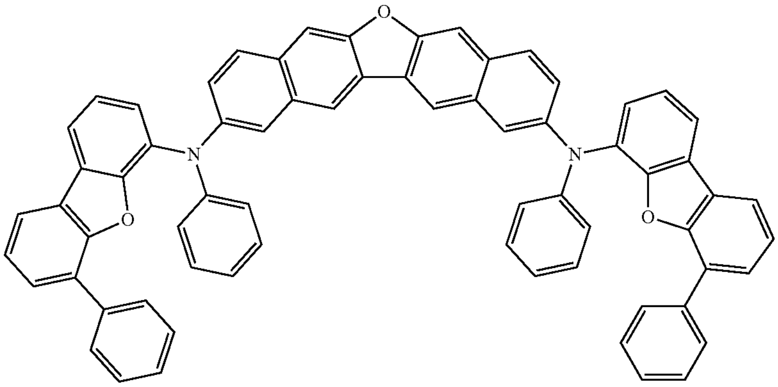

-continued
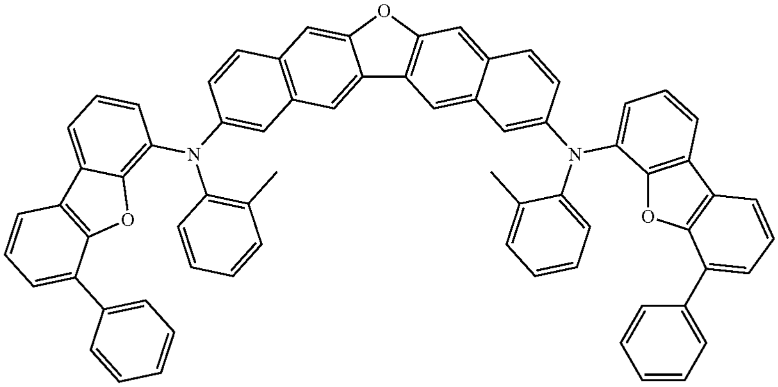
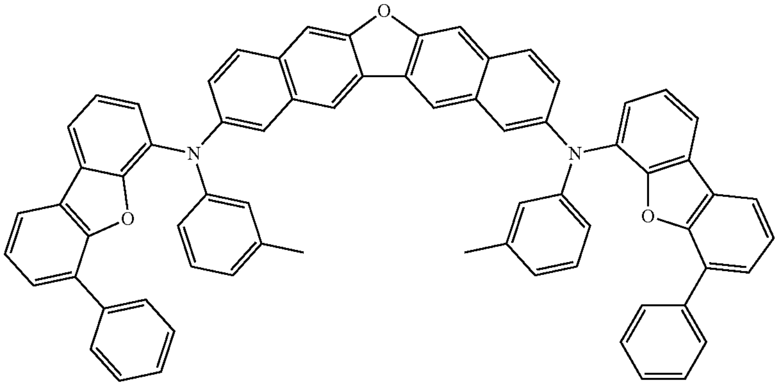
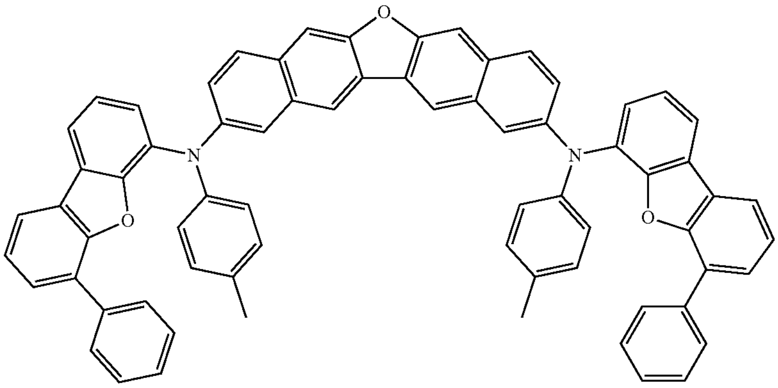
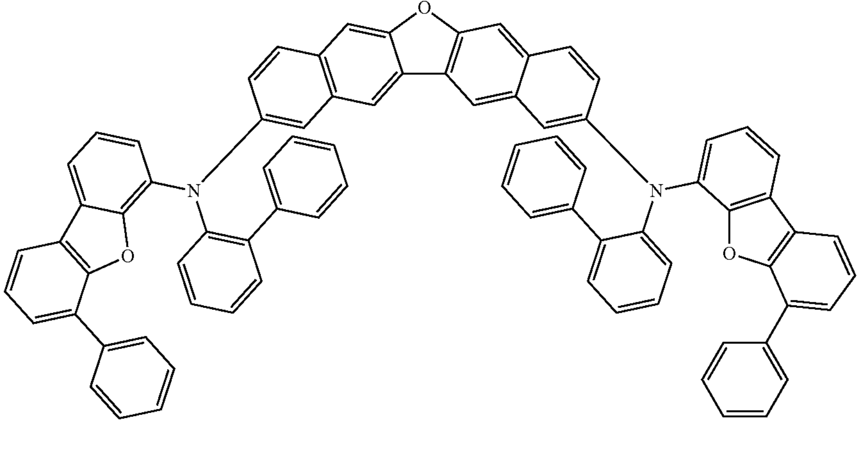

-continued
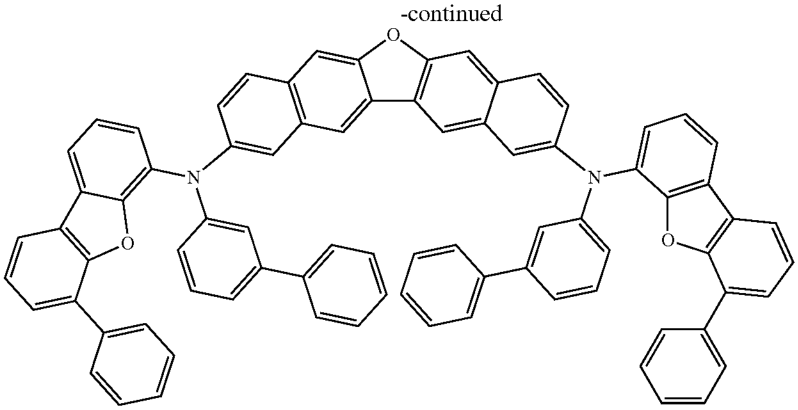
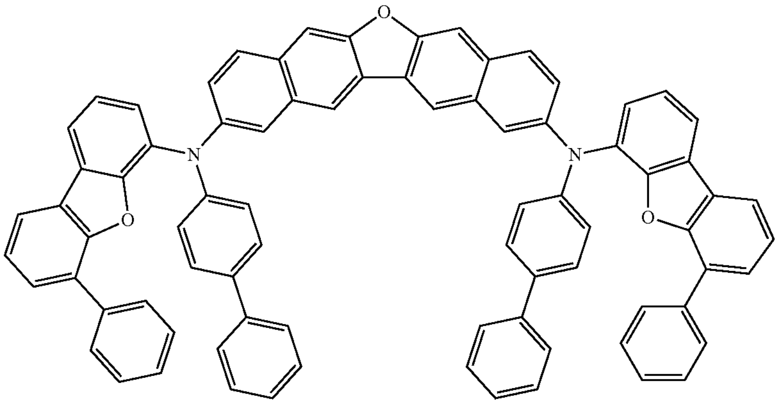
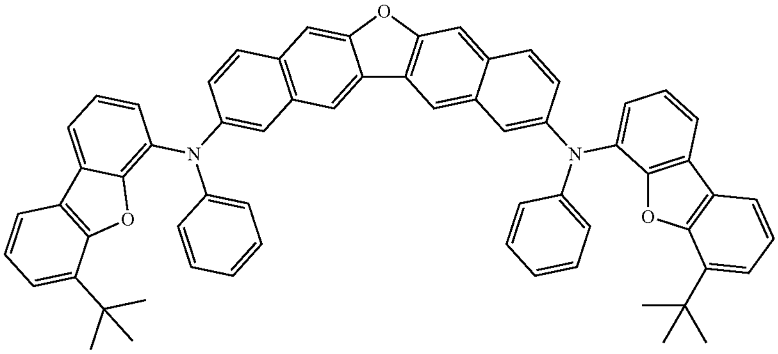
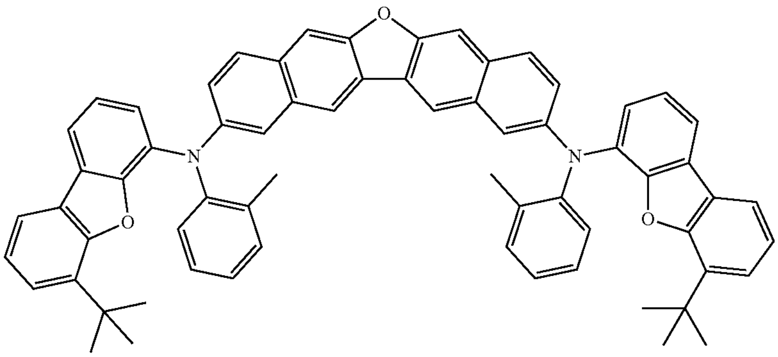

-continued
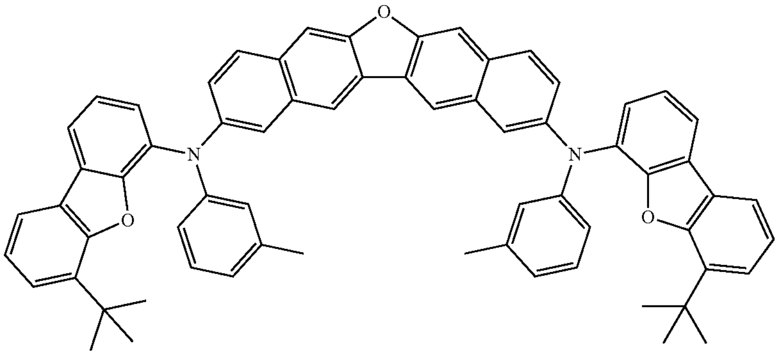
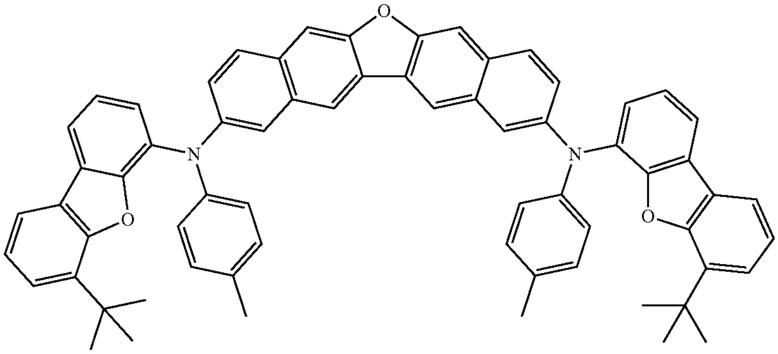
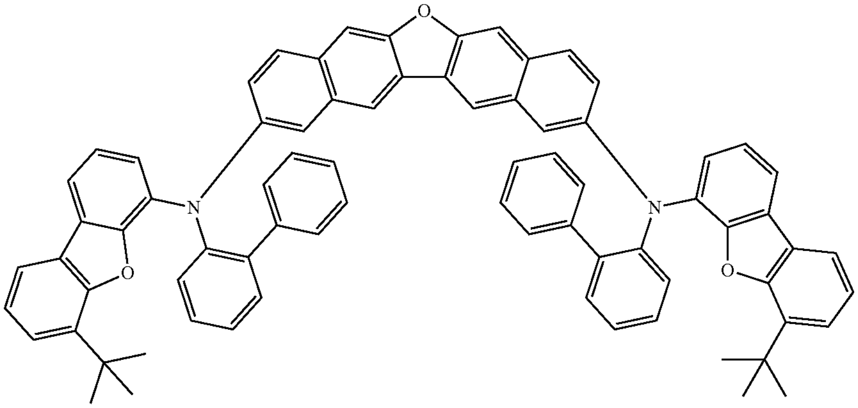
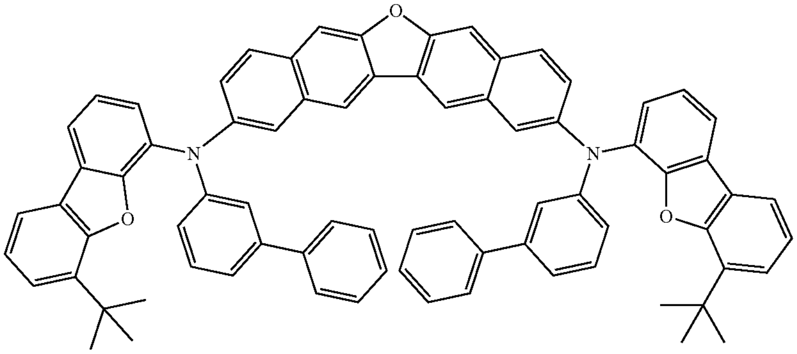

-continued
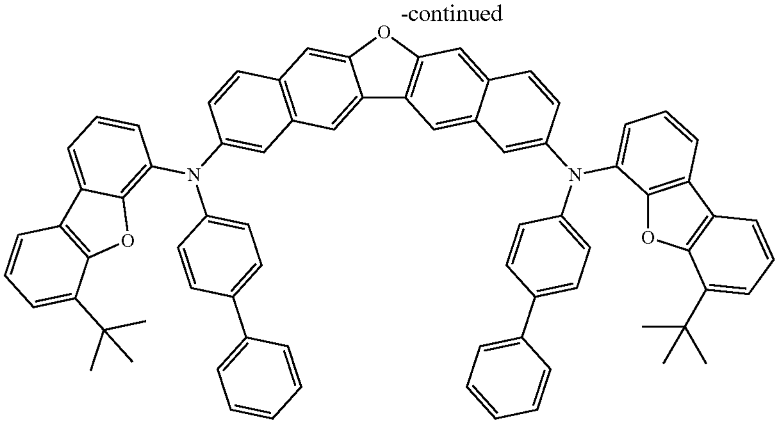
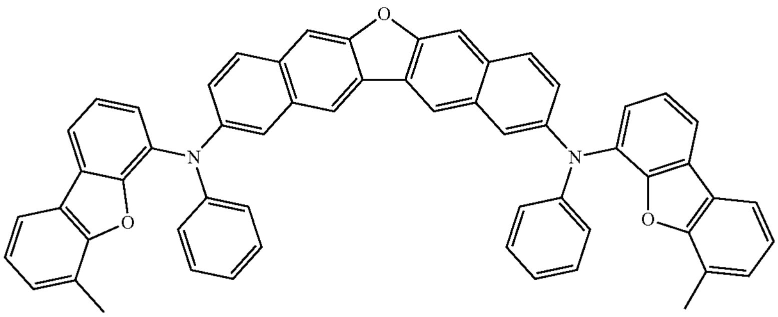
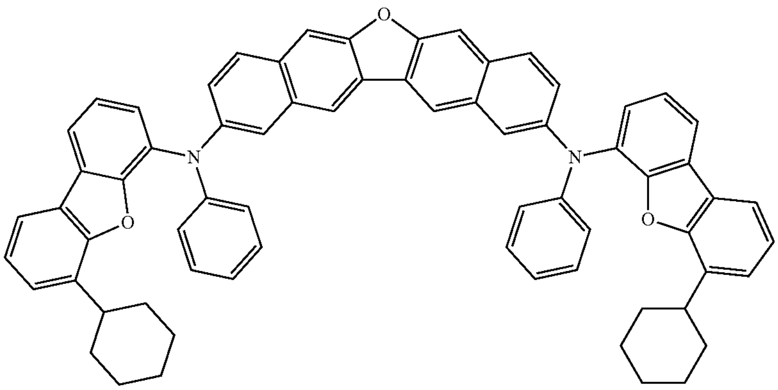
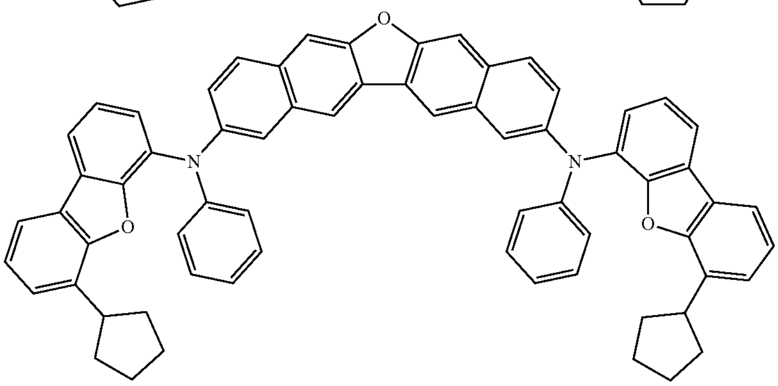

-continued
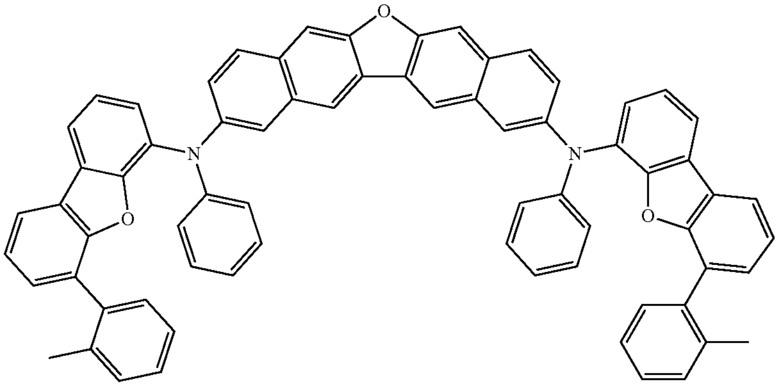
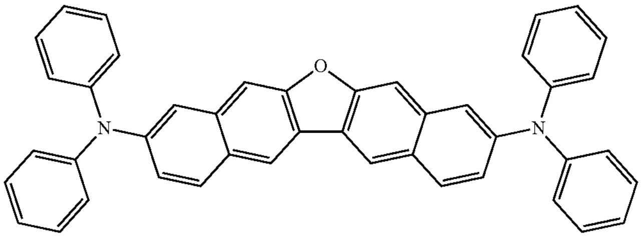
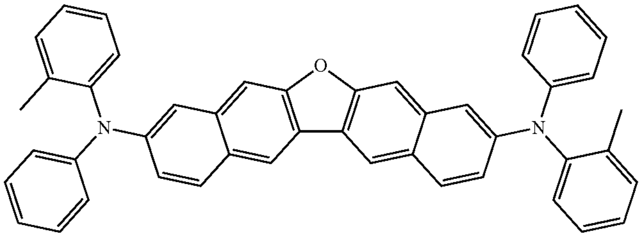
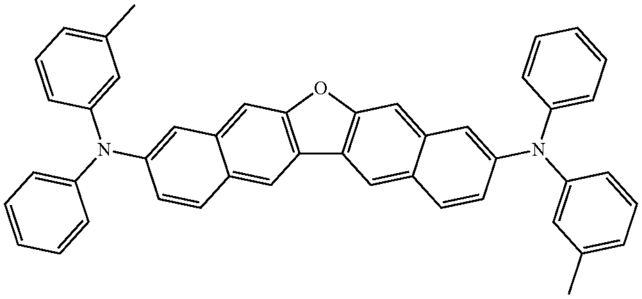
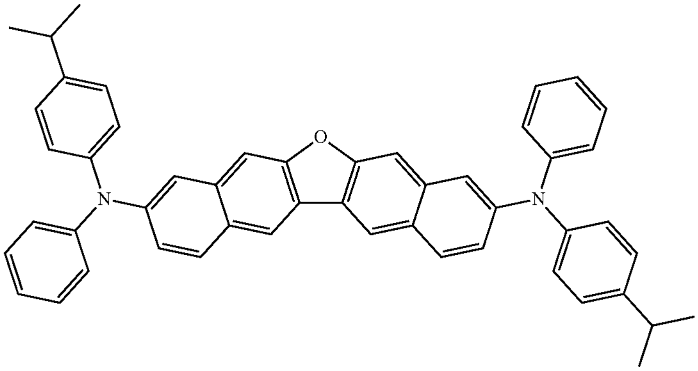

-continued
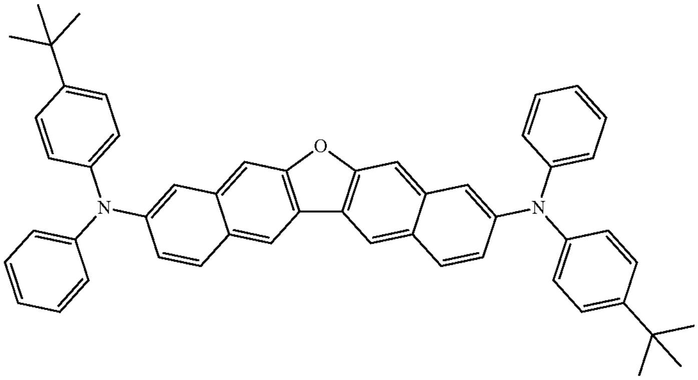
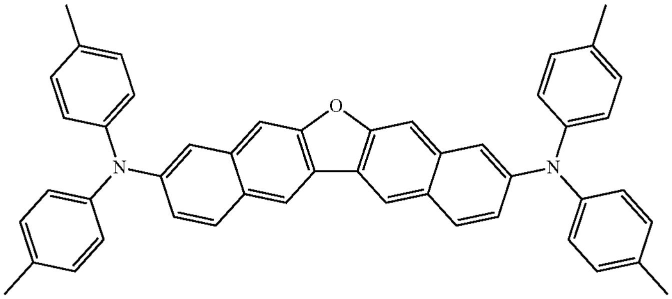
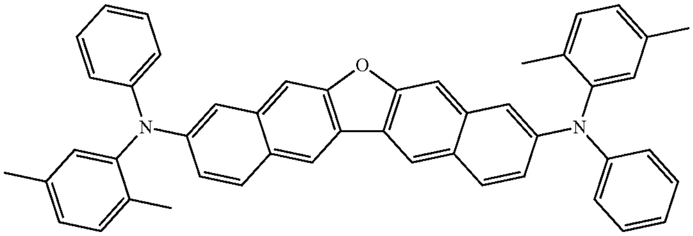
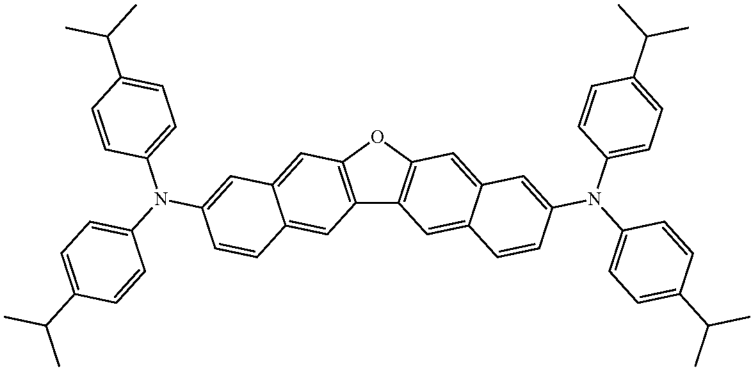
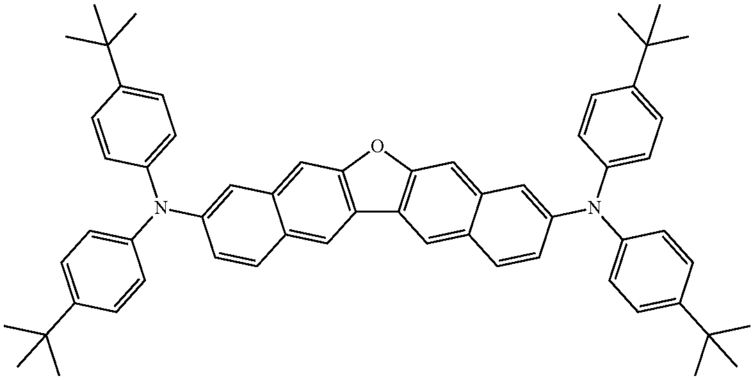

-continued
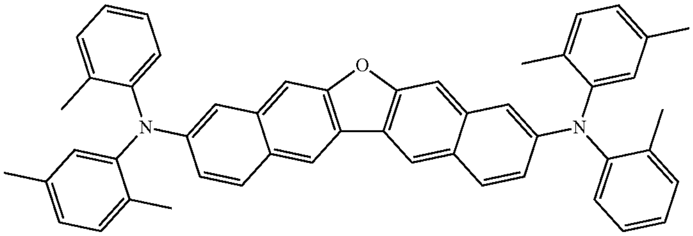
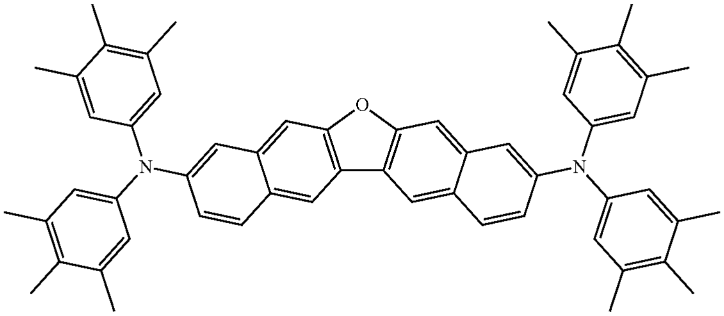
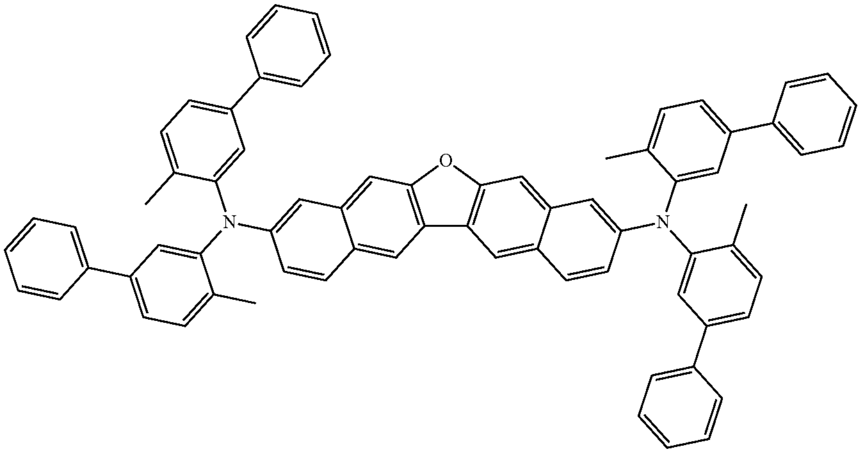
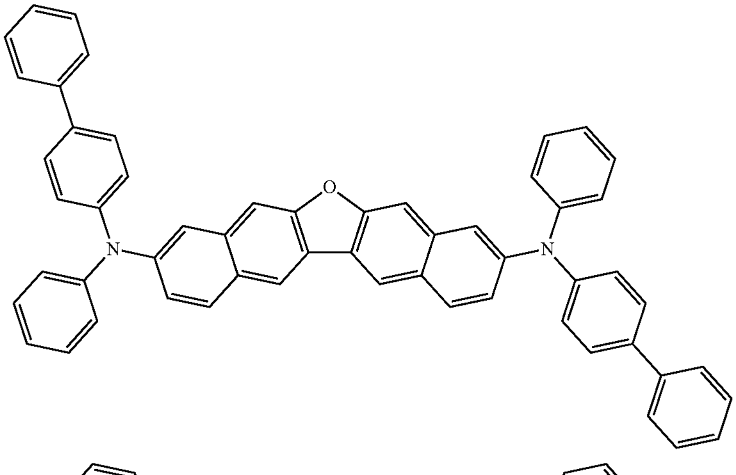
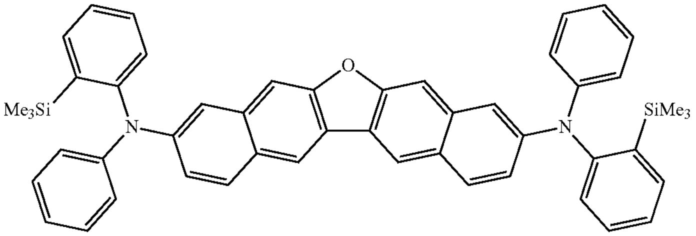

-continued
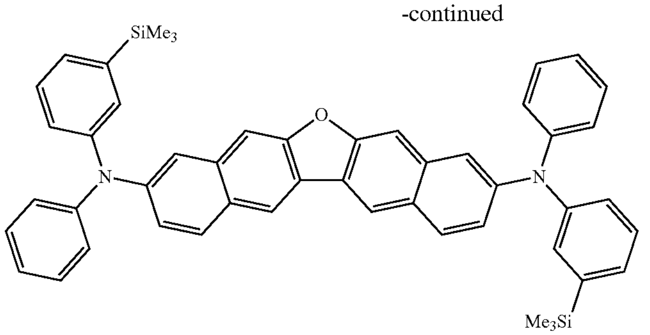
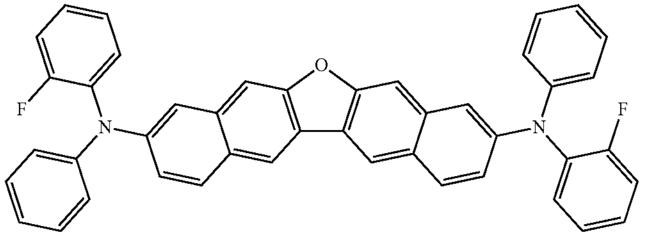
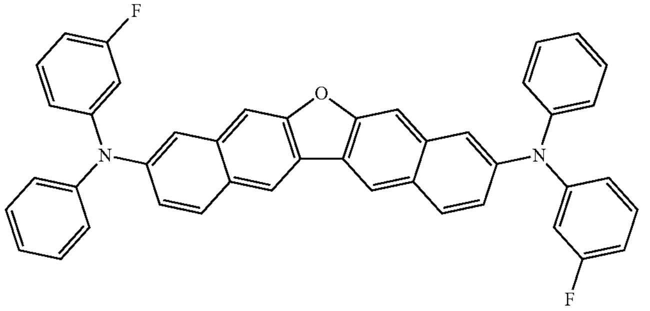
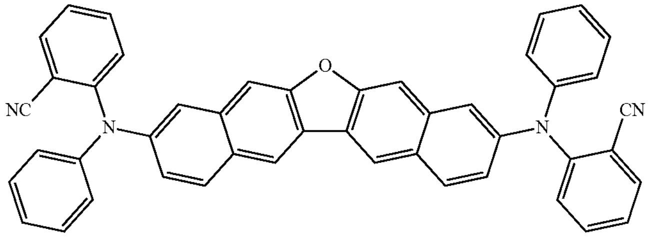
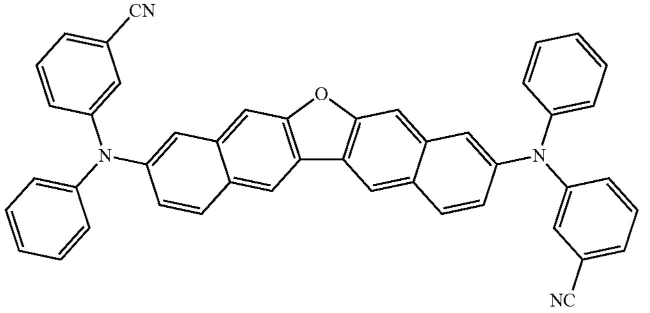
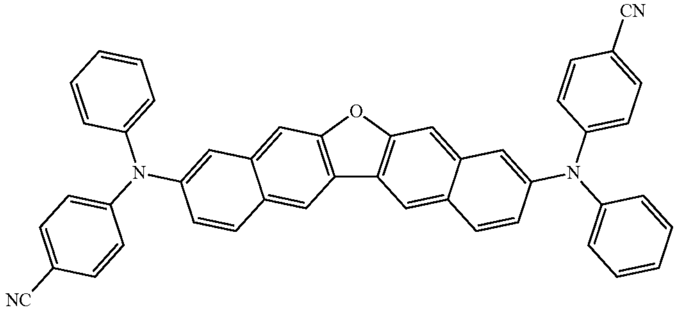

-continued
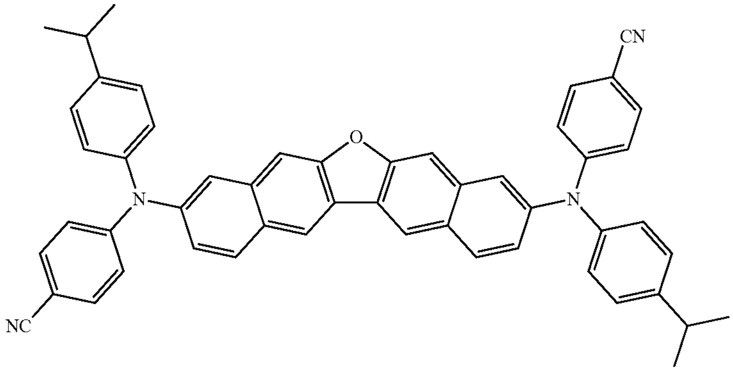
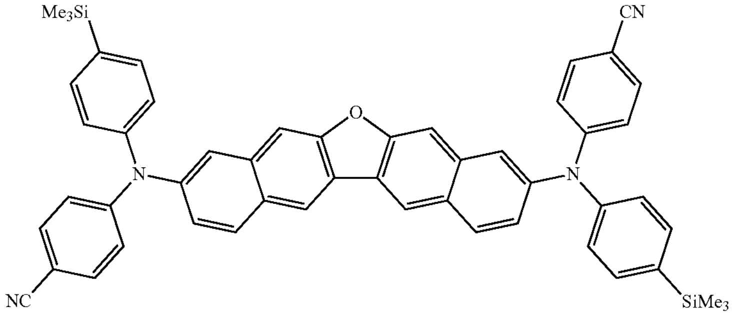
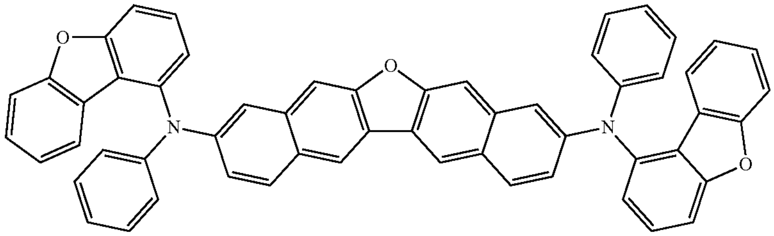
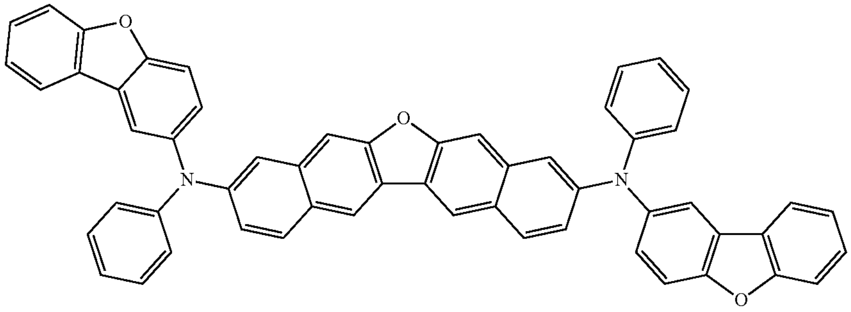
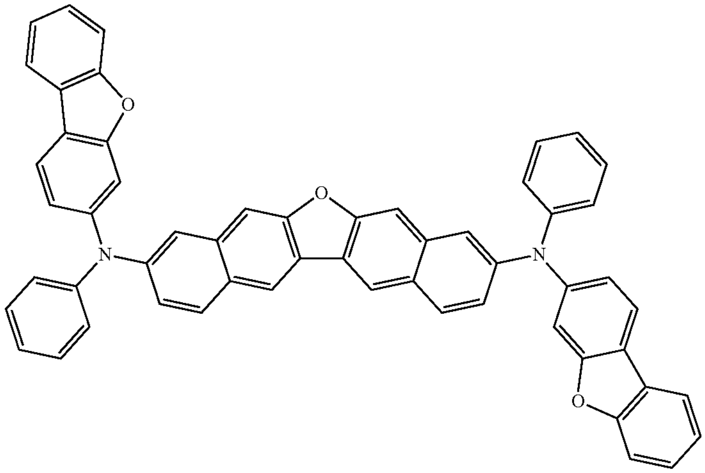

-continued

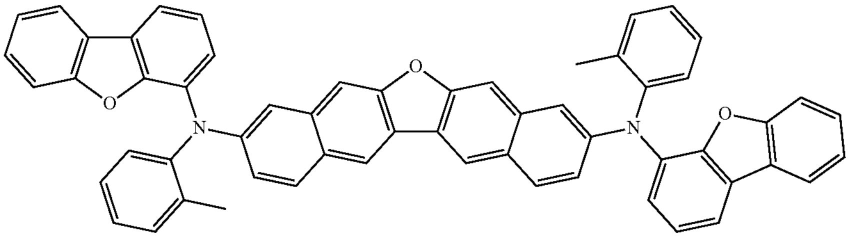

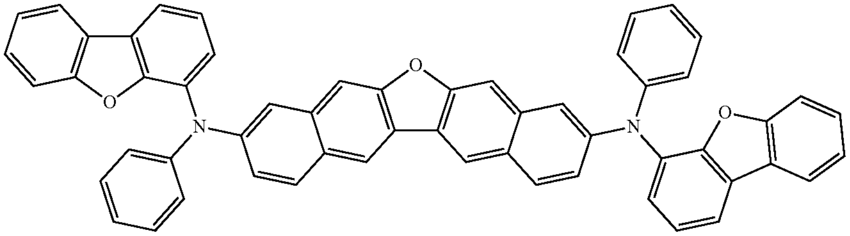

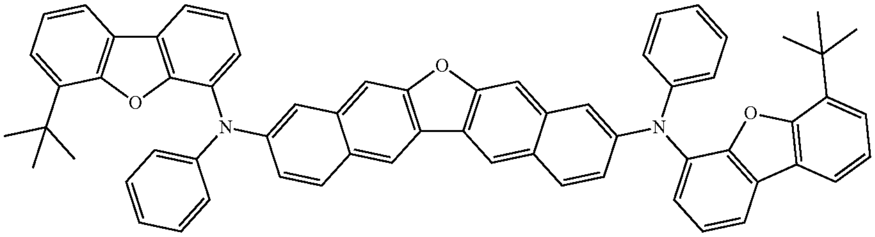

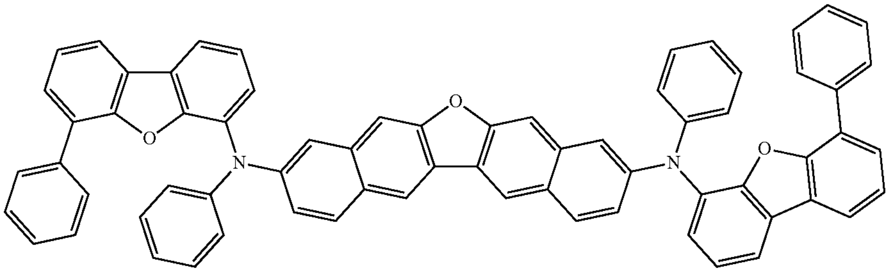

(Compound Represented by Formula (71))

The compound represented by the formula (71) is explained below.

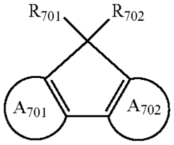

(71)

In the formula (71), ring A701 and ring A702 are independently a substituted or unsubstituted aromatic hydrocarbon ring including 6 to 50 ring carbon atoms, or a substituted or unsubstituted heterocycle including 5 to 50 ring atoms;

one or more rings selected from the group consisting of the ring $A_{701}$ and the ring $A_{702}$ are bonded to bonding hand *'s in the structure represented by the following formula (72).

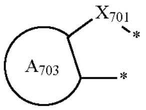

(72)

In the formula (72), rings $A_{703}$ are independently a substituted or unsubstituted aromatic hydrocarbon ring including 6 to 50 ring carbon atoms, or a substituted, or unsubstituted heterocycle including 5 to 50 ring atoms;

$X_{701}$ is $NR_{703}$, $C(R_{704})(R_{705})$, $Si(R_{706})(R_{707})$, $Ge(R_{708})(R_{709})$, O, S or Se;

$R_{701}$ and $R_{702}$ are bonded with each other to form a substituted or unsubstituted, saturated or unsaturated ring, or do not form a substituted or unsubstituted saturated or unsaturated ring;

$R_{701}$ and $R_{702}$ that do not form the substituted or unsubstituted, saturated or unsaturated ring, and $R_{703}$ to $R_{709}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are as defined in the formulas (1).

One or more rings selected from the group consisting of the ring $A_{701}$ and the ring $A_{702}$ is bonded to bonding hand *'s in the structure represented by the formula (72). That is, in one embodiment, the ring carbon atoms constituting the aromatic hydrocarbon ring or the ring atoms constituting the heterocycle for the ring $A_{701}$ are bonded to bonding hand*'s in the structure represented by the formula (72). In one embodiment, the ring carbon atoms constituting the aromatic hydrocarbon ring or the ring atoms constituting the heterocycle for the ring $A_{702}$ are bonded to bonding hand *'s in the structure represented by the formula (72).

In one embodiment, a group represented by the following formula (73) is bonded to any one of or both of the ring $A_{701}$ and the ring $A_{702}$:

(73)

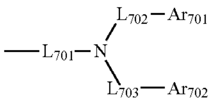

In the formula (73), $Ar_{701}$ and $Ar_{702}$ are independently a substituted or unsubstituted aryl group including 6 to 50 ring carbon atoms, or a substituted or unsubstituted monovalent heterocyclic group including 5 to 50 ring atoms; and $L_{701}$ to $L_{703}$ are independently a single bond, a substituted or unsubstituted arylene group including 6 to 30 ring carbon atoms, a substituted or unsubstituted divalent heterocyclic group including 5 to 30 ring atoms, or a divalent linking group formed by bonding 2 to 4 above mentioned groups.

In one embodiment, in addition to the ring $A_{701}$, the ring carbon atoms constituting the aromatic hydrocarbon ring or the ring atoms constituting the heterocycle for the ring $A_{702}$ are bonded to bonding hand *'s in the structure represented by the formula (72). In this case, the structures represented by the formula (72) may be the same or different.

In one embodiment, $R_{701}$ and $R_{702}$ are independently a substituted or unsubstituted aryl group including 6 to 50 ring carbon atoms.

In one embodiment, $R_{701}$ and $R_{702}$ are bonded with each other to form a fluorene structure.

In one embodiment, the ring $A_{701}$ and the ring $A_{702}$ are substituted or unsubstituted aromatic hydrocarbon rings including 6 to 50 ring carbon atoms, and they are substituted or unsubstituted benzene rings, for example.

In one embodiment, the ring $A_{703}$ is a substituted or unsubstituted aromatic hydrocarbon ring including 6 to 50 ring carbon atoms, and it is a substituted or unsubstituted benzene ring, for example.

In one embodiment, $X_{701}$ is O or S.

As specific examples of the compound represented by the formula (71), the following compounds can be given, for example. In the following specific examples, "Me" represents a methyl group.

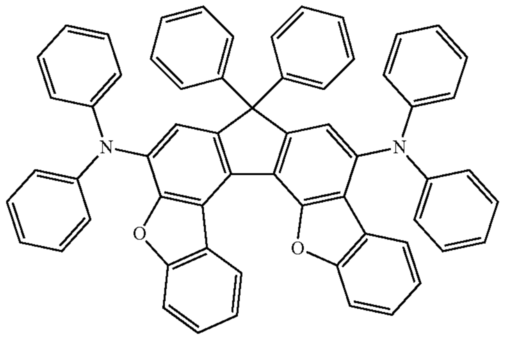

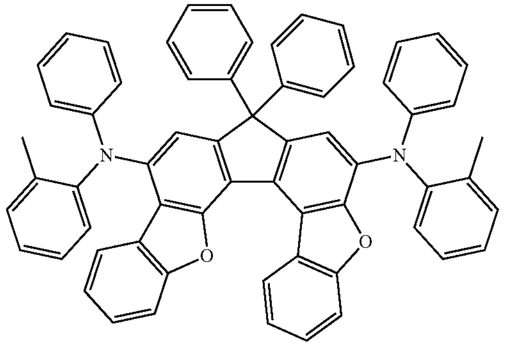

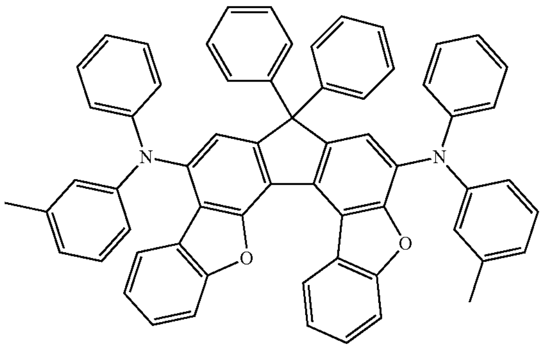

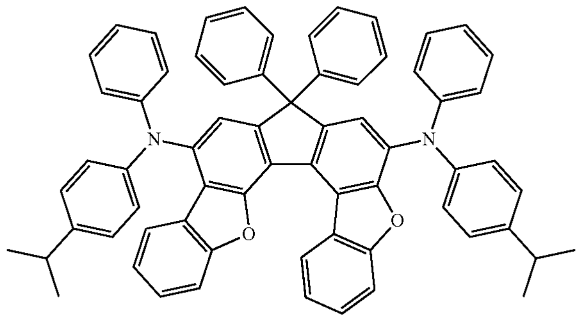

-continued
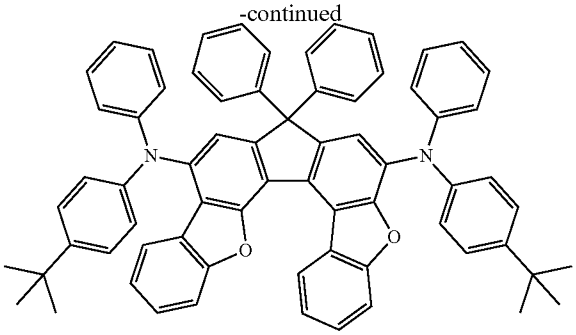
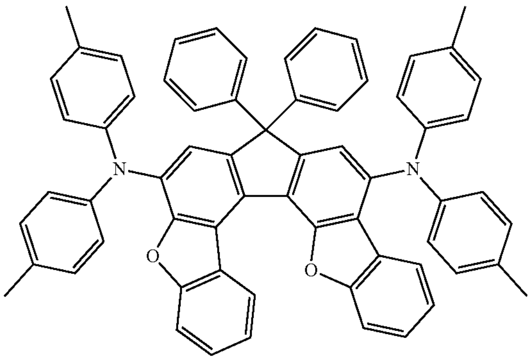
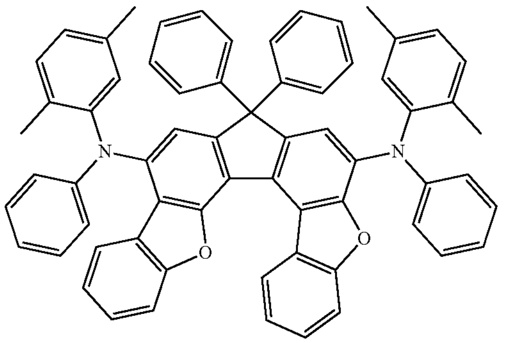
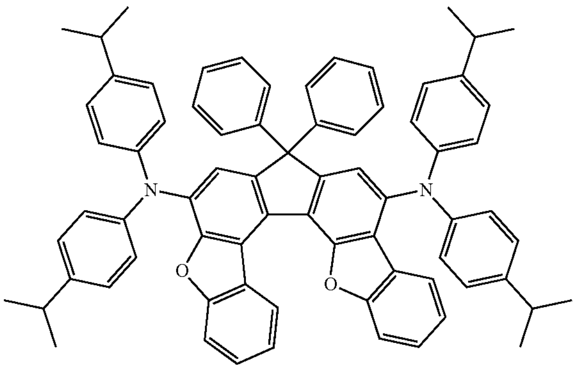
-continued
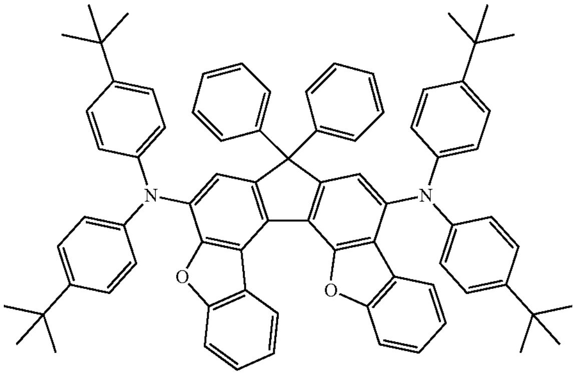
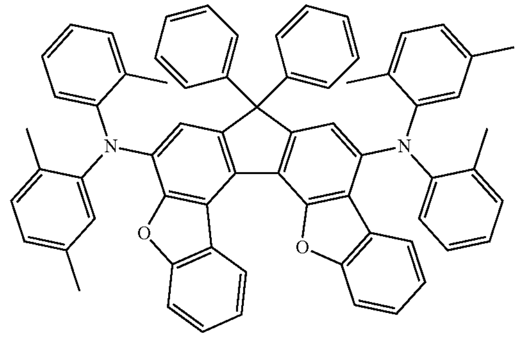
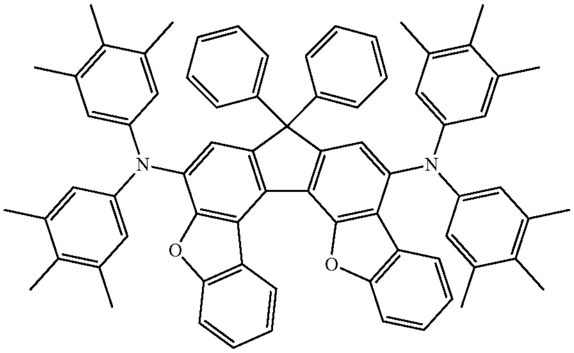
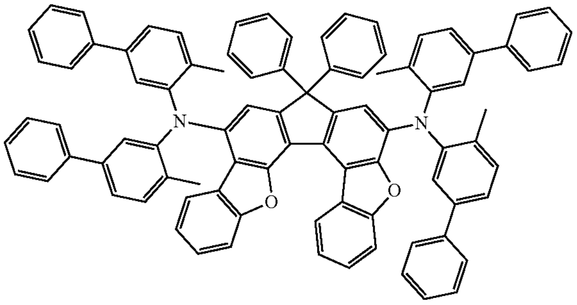
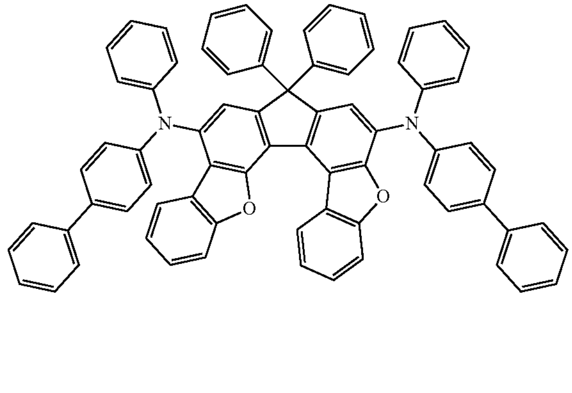

-continued
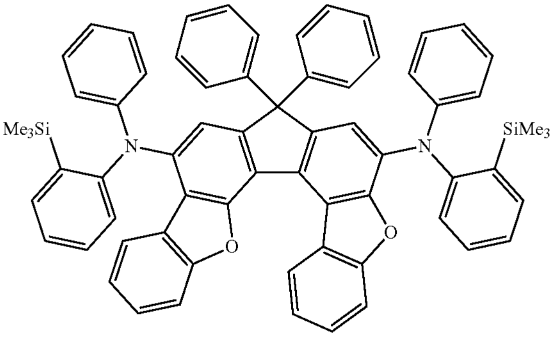
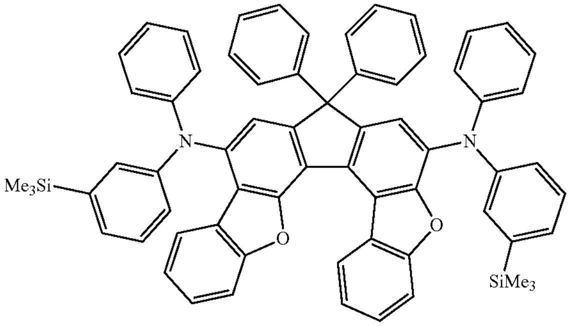
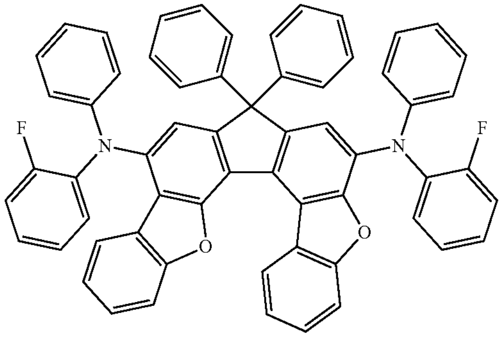
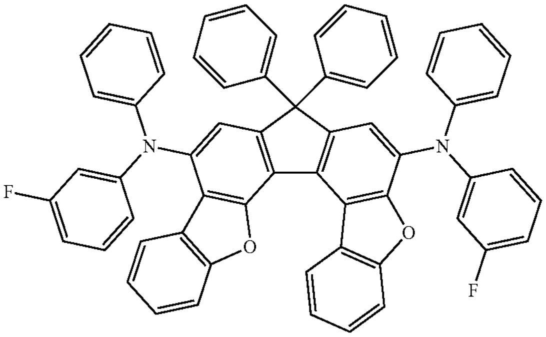
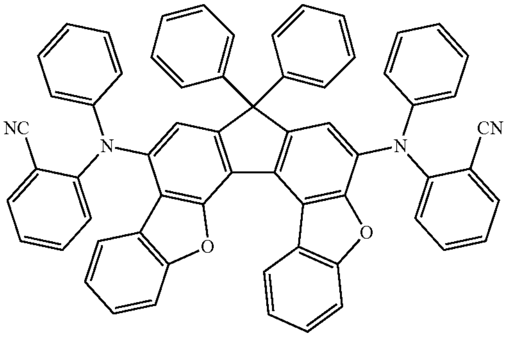
-continued
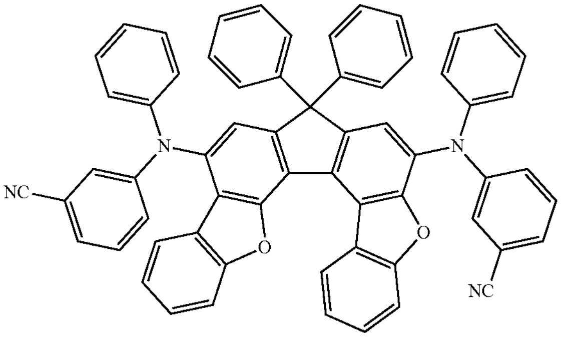
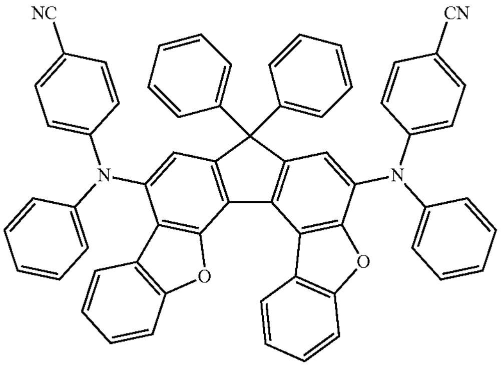
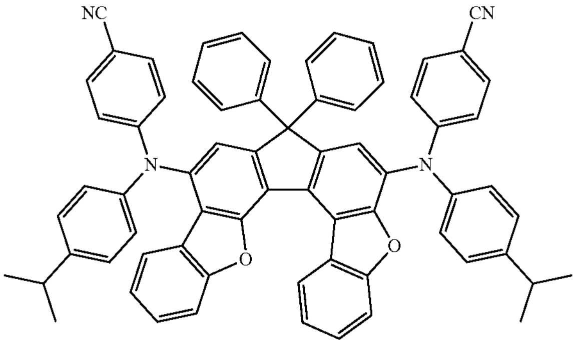
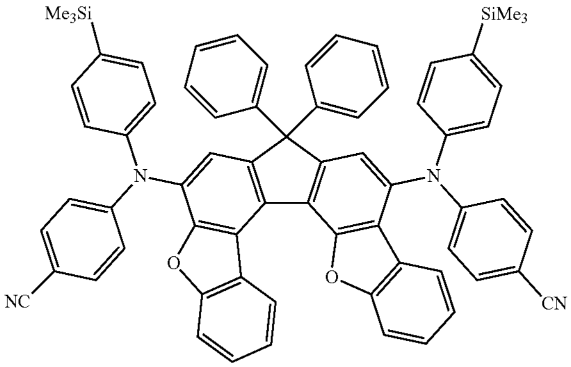
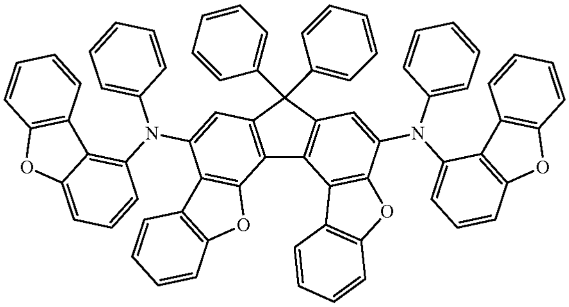

-continued
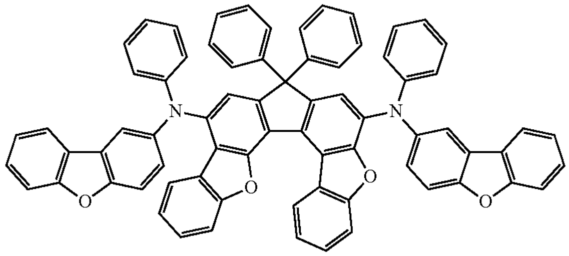
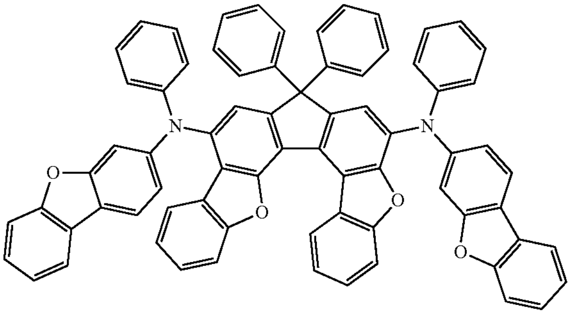
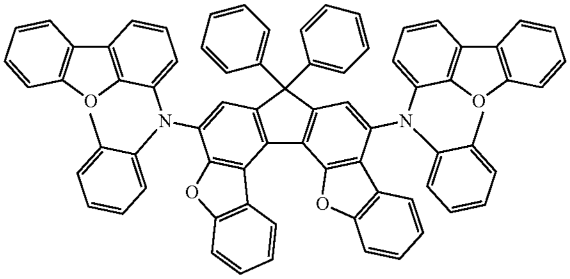
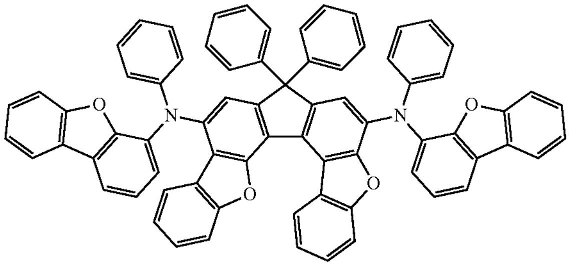
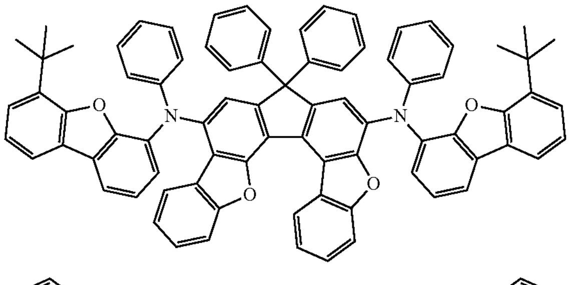
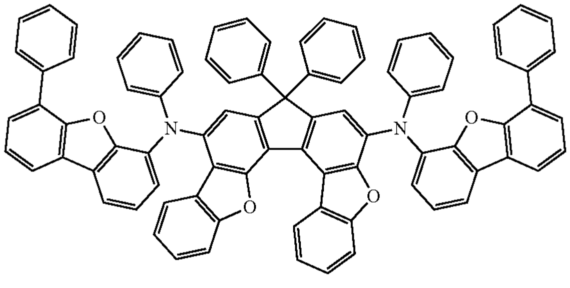
-continued
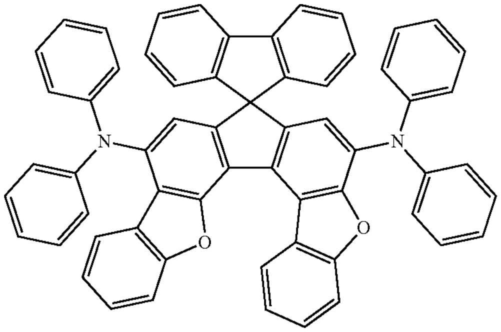
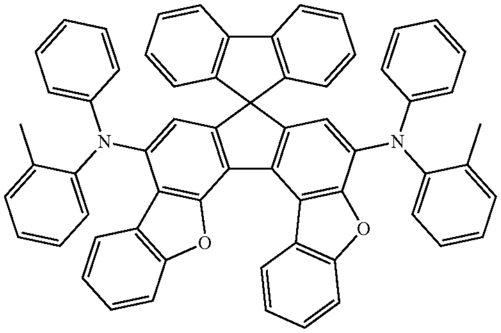
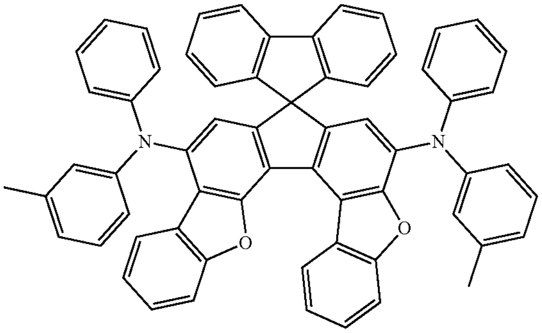
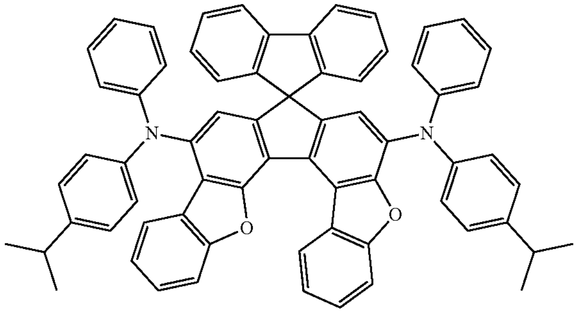
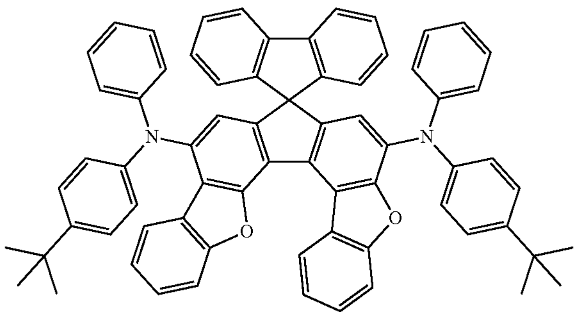

-continued
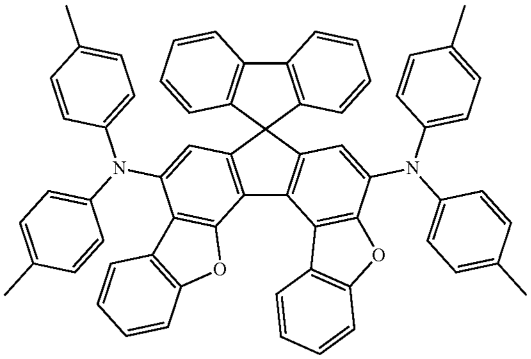
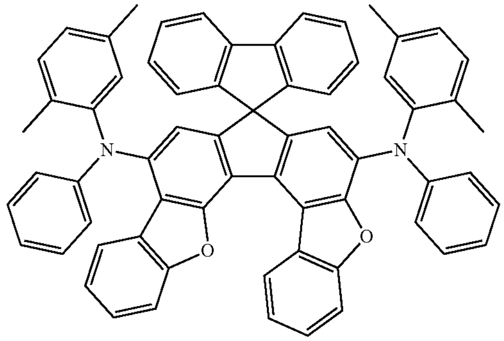
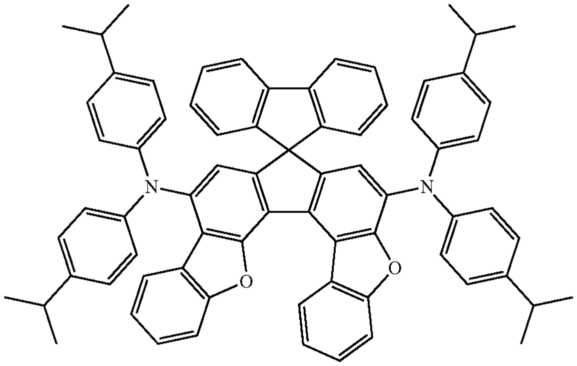
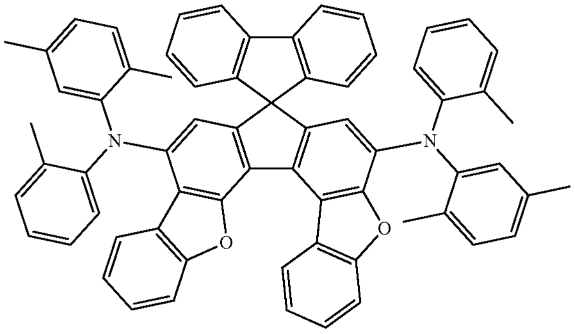
-continued
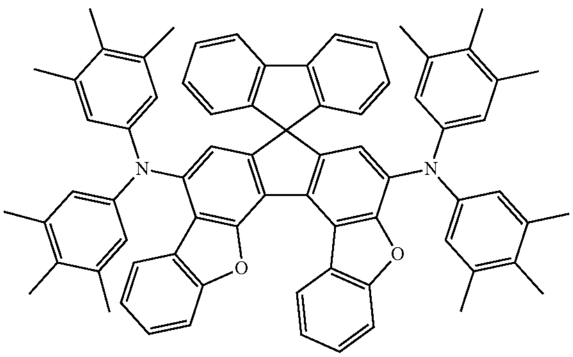
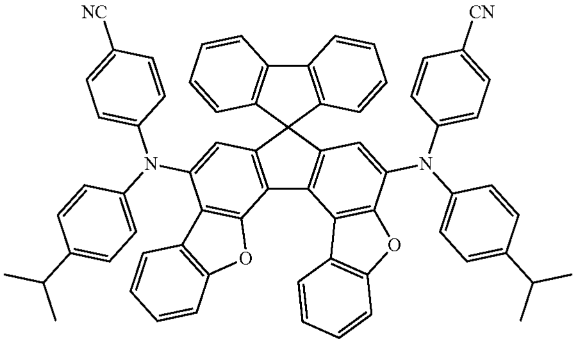
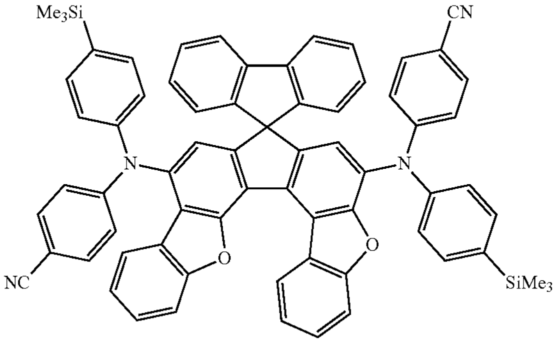
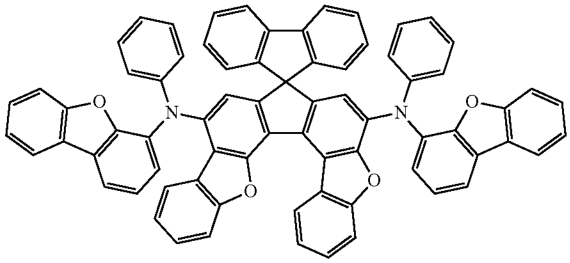
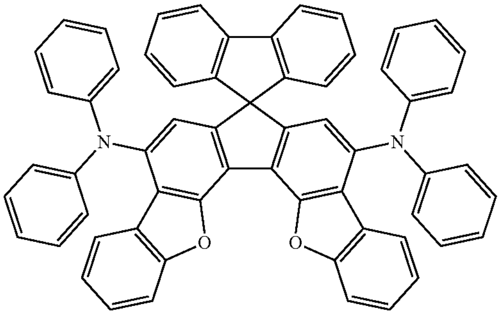

-continued

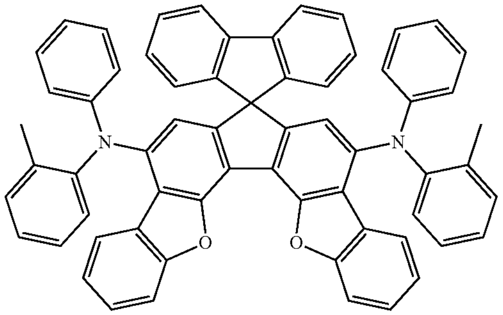

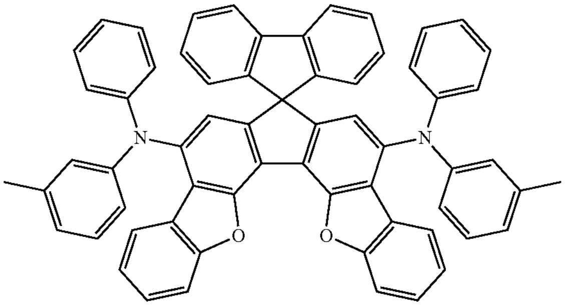

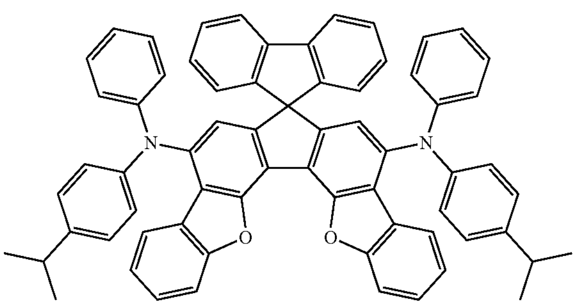

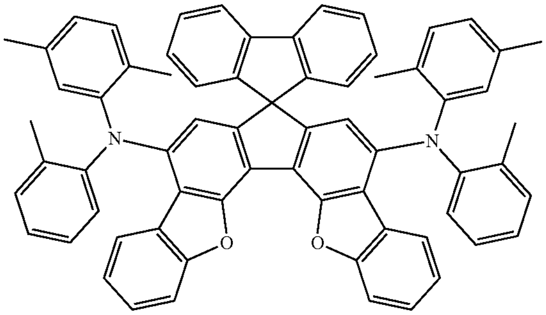

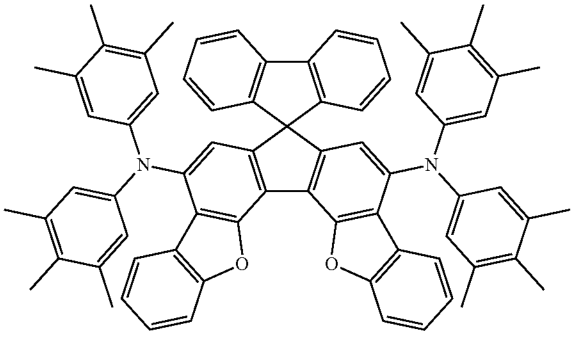

-continued

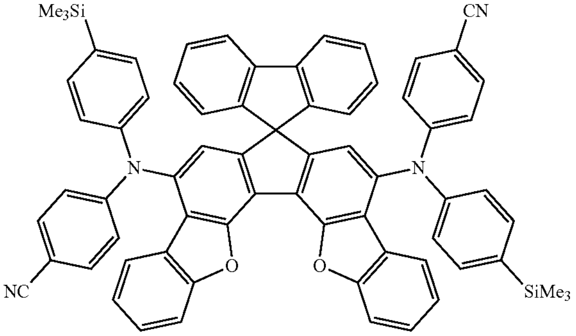

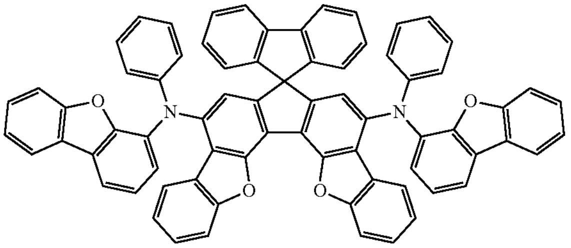

(Compound Represented by Formula (81))

The compound represented by the formula (81) is explained below.

(81)

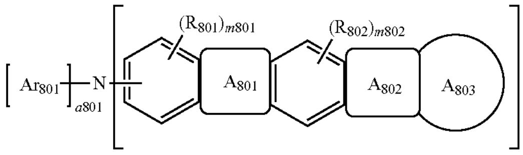

(82)

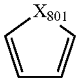

(83)

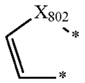

In the formula (81), ring $A_{801}$ is a ring represented by the formula (82) which is fused to respective arbitrary positions of the adjacent rings;

ring $A_{802}$ is a ring represented by the formula (83) which is fused to respective arbitrary positions of the adjacent rings; two bonding hand *'s bond to respective arbitrary positions of the ring Asos;

$X_{801}$ and $X_{802}$ are independently $C(R_{803})(R_{804})$, $Si(R_{805})(R_{806})$, an oxygen atom, or a sulfur atom;

ring $A_{803}$ is a substituted or unsubstituted aromatic hydrocarbon ring including 6 to 50 ring carbon atoms, or a substituted or unsubstituted heterocycle including 5 to 50 ring atoms;

$Ar_{801}$ is a substituted or unsubstituted aryl group including 6 to 50 ring carbon atoms, or a substituted or unsubstituted monovalent heterocyclic group including 5 to 50 ring atoms;

$R_{801}$ to $R_{806}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are as defined in the formulas (1);

m801 and m802 are independently an integer of 0 to 2; when m801 is 2, a plurality of $R_{801}$'s may be the same as or different from each other; when m802 is 2, a plurality of $R_{802}$'s may be the same as or different from each other;

a801 is an integer of 0 to 2; when a801 is 0 or 1, the "3-a801" structures in the parentheses may be the same as or different from each other; and when a801 is 2, $Ar_{801}$'s may be the same or different from each other.

In one embodiment, $Ar_{801}$ is a substituted or unsubstituted aryl group including 6 to 50 ring carbon atoms.

In one embodiment, ring $A_{803}$ is a substituted or unsubstituted aromatic hydrocarbon ring including 6 to 50 ring carbon atoms, and it is a substituted or unsubstituted benzene ring, a substituted or unsubstituted naphthalene ring, or a substituted or unsubstituted anthracene ring, for example.

In one embodiment, $R_{803}$ and $R_{804}$ are independently a substituted or unsubstituted alkyl group including 1 to 50 carbon atoms.

In one embodiment, a801 is 1.

As specific example of the compound represented by the formula (81), the following compounds can be given, for example.

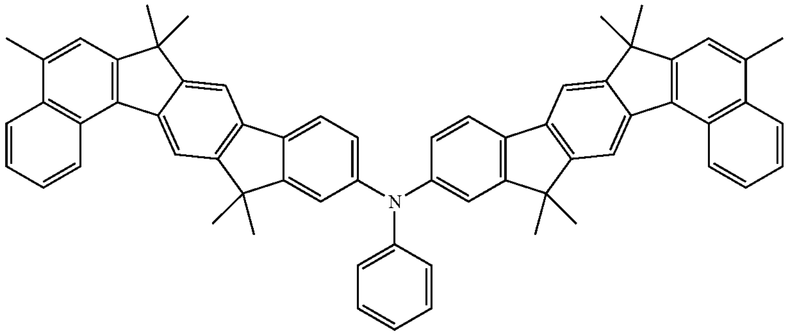

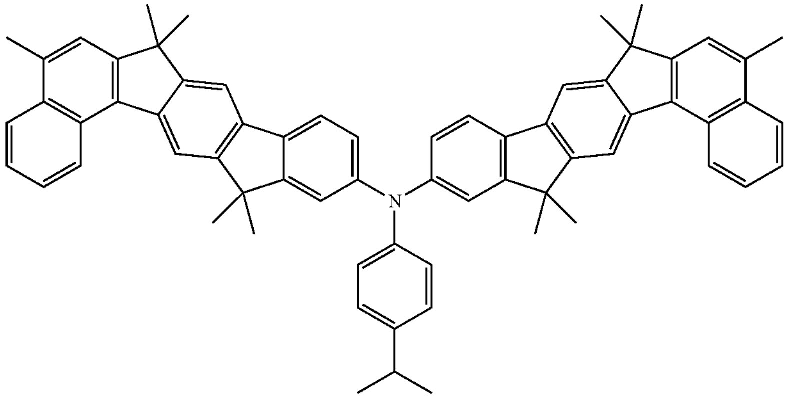

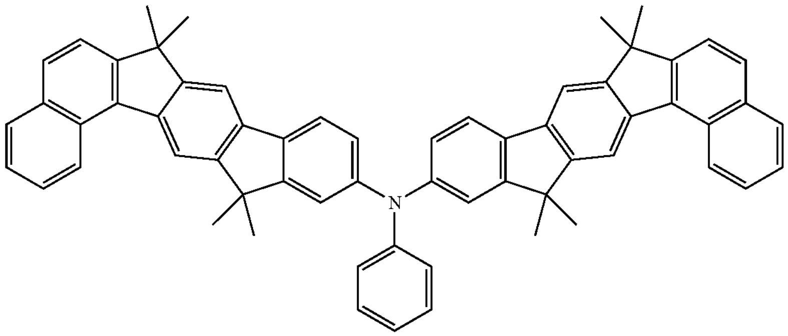

-continued

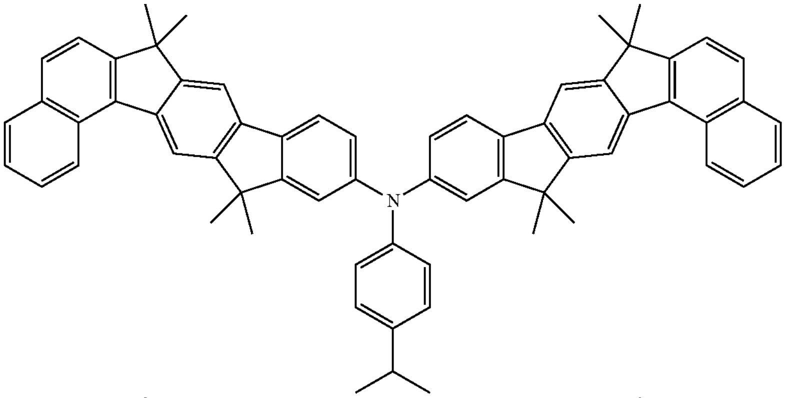

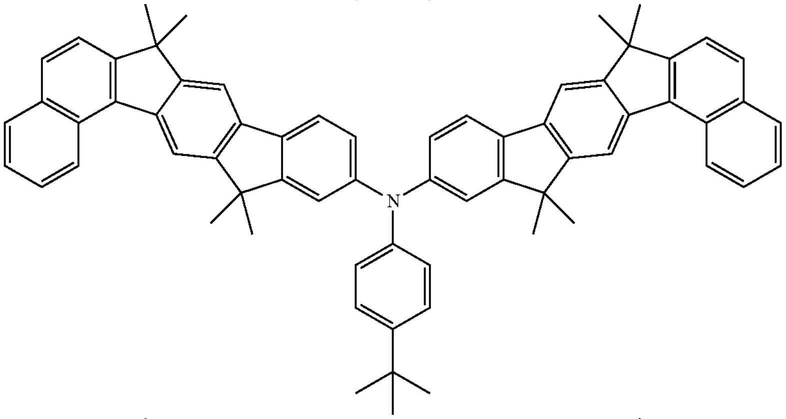

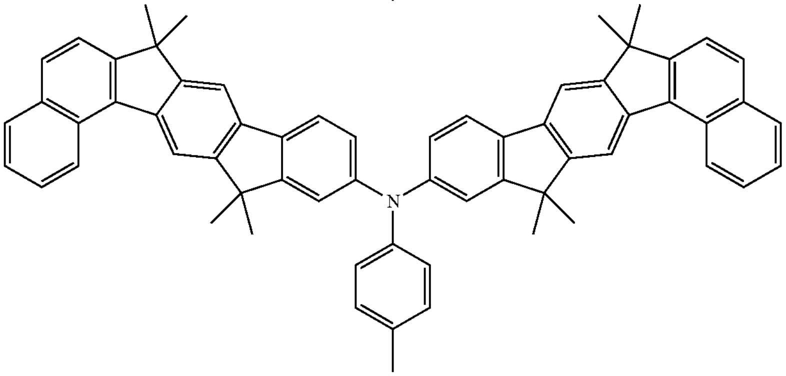

Specific examples of the above groups are as described in the section of [Definitions] of this specification.

As described above, known materials and device configurations may be applied to the organic EL device according to an aspect of the invention, as long as the device contains a cathode, an anode, and an emitting layer between the cathode and the anode, and the emitting layer contains a first host material, a second host material, and a dopant material, and the effect of the invention is not impaired.

The content of the first host material and the second host material in the emitting layer is preferably 80% by mass or more and 99% by mass or less based on the total mass of the emitting layer.

The content ratio (mass ratio) of the first host material and the second host material in the emitting layer is usually 1:99 to 99:1, preferably 10:90 to 90:10, and more preferably 40:60 to 60:40.

The content of the dopant material in the emitting layer is preferably 1% by mass or more and 20% by mass or less based on the total mass of the emitting layer.

An aspect of the organic EL device of the invention preferably contains a hole-transporting layer between the anode and the emitting layer.

An aspect of the organic EL device of the invention preferably contains an electron-transporting layer between the cathode and the emitting layer.

Specific examples of a typified device configuration of the organic EL device of the invention include structures such as (1) an anode/an emitting layer/a cathode, (2) an anode/a hole-injecting layer/an emitting layer/a cathode, (3) an anode/an emitting layer/an electron-injecting-transporting layer/a cathode, (4) an anode/a hole-injecting layer/an emitting layer/an electron-injecting-transporting layer/a cathode, (5) an anode/an organic semiconductor layer/an emitting layer/a cathode, (6) an anode/an organic semiconductor layer/an electron barrier layer/an emitting layer/a cathode, (7) an anode/an organic semiconductor layer/an emitting layer/an adhesion improving layer/a cathode,
(8) an anode/a hole-injecting-transporting layer/an emitting layer/an electron-injecting-transporting layer/a cathode,
(9) an anode/an insulating layer/an emitting layer/an insulating layer/a cathode,
(10) an anode/an inorganic semiconductor layer/an insulating layer/an emitting layer/an insulating layer/a cathode,
(11) an anode/an organic semiconductor layer/an insulating layer/an emitting layer/an insulating layer/a cathode,
(12) an anode/an insulating layer/a hole-injecting-transporting layer/an emitting layer/an insulating layer/a cathode, and
(13) an anode/an insulating layer/a hole-injecting-transporting layer/an emitting layer/an electron-injecting-transporting layer/a cathode, and the like.

Among the above-described structures, the configuration of (8) is preferably used, but the device configuration of the organic EL device is not limited thereto.

The "hole-injecting-transporting layer" in this specification indicates "at least one of the hole-injecting layer and the hole-transporting layer," and the "electron-injecting-transporting layer" in this specification indicates "at least one of the electron-injecting layer and the electron-transporting layer."

Parts which can be used in the organic EL device according to an aspect of the invention, materials for forming respective layers, other than the above compounds, and the like, will be described below.

(Substrate)

A substrate is used as a support of an emitting device. As the substrate, glass, quartz, plastics or the like can be used, for example. Further, a flexible substrate may be used. The "flexible substrate" means a bendable (flexible) substrate, and specific examples thereof include a plastic substrate formed of polycarbonate, polyvinyl chloride, or the like.

(Anode)

For the anode formed on the substrate, metals, alloys, electrically conductive compounds, mixtures thereof, and the like, which have a large work function (specifically 4.0 eV or more) are preferably used. Specific examples thereof include indium oxide-tin oxide (ITO: Indium Tin Oxide), indium oxide-tin oxide containing silicon or silicon oxide, indium oxide-zinc oxide, tungsten oxide, indium oxide containing zinc oxide, graphene, and the like. In addition thereto, specific examples thereof include gold (Au), platinum (Pt), a nitride of a metallic material (for example, titanium nitride), and the like.

(Hole-Injecting Layer)

The hole-injecting layer is a layer containing a substance having high hole-injecting property. As such a substance having high hole-injecting property molybdenum oxide, titanium oxide, vanadium oxide, rhenium oxide, ruthenium oxide, chromium oxide, zirconium oxide, hafnium oxide, tantalum oxide, silver oxide, tungsten oxide, manganese oxide, an aromatic amine compound, or a polymer compound (oligomers, dendrimers, polymers, etc.) can be given.

(Hole-Transporting Layer)

The hole-transporting layer is a layer containing a substance having high hole-transporting property. For the hole-transporting layer, an aromatic amine compound, a carbazole derivative, an anthracene derivative, or the like can be used. A polymer compound such as poly(N-vinylcarbazole) (abbreviation: PVK) and poly(4-vinyltriphenylamine) (abbreviation: PVTPA) can also be used. However, a material other than the above-described materials may be used as long as the material has higher transporting properties of holes in comparison with electrons. It should be noted that the layer containing the material having high hole-transporting properties may be formed into not only a monolayer, but also a stacked layer in which two or more layers formed of the above-described materials are stacked.

(Guest (Dopant) Material of the Emitting Layer)

The emitting layer is a layer containing a material having a high emitting property, and various materials can be used in addition to the materials used in the invention described above. For example, as the substance having a high emitting property, a fluorescent compound which emits fluorescence or a phosphorescent compound which emits phosphorescence can be used. The fluorescent compound is a compound which can emit from a singlet excited state, and the phosphorescent compound is a compound which can emit from a triplet excited state.

As a blue fluorescent emitting material which can be used for an emitting layer, pyrene derivatives, styrylamine derivatives, chrysene derivatives, fluoranthene derivatives, fluorene derivatives, diamine derivatives, triarylamine derivatives, and the like can be used. As a green fluorescent emitting material which can be used for an emitting layer, aromatic amine derivatives and the like can be used. As a red fluorescent emitting material which can be used for an emitting layer, tetracene derivatives, diamine derivatives and the like can be used.

As a blue phosphorescent emitting material which can be used for an emitting layer, metal complexes such as iridium complexes, osmium complexes, platinum complexes and the like are used. As a green phosphorescent emitting material which can be used for an emitting layer, iridium complexes and the like are used. As a red phosphorescent emitting material which can be used for an emitting layer, metal complexes such as iridium complexes, platinum complexes, terbium complexes, europium complexes and the like are used.

(Host Material for Emitting Layer)

The emitting layer may have a constitution in which the substance having a high emitting property (guest material) is dispersed in another substance (host material). As substances for dispersing the substance having a high emitting property, a variety of substances can be used in addition to the materials used in the invention described above, and it is preferable to use a material having a lowest unoccupied orbital level (LUMO level) higher than the material having a high emitting property and a highest occupied orbital level (HOMO level) lower than the material having a high emitting property.

As a material for dispersing a material having a high emitting property (host material), 1) a metal complex such as an aluminum complex, a beryllium complex, or a zinc complex, 2) a heterocyclic compound such as an oxadiazole derivative, a benzimidazole derivative, or a phenanthroline derivative, 3) a fused aromatic compound such as a carbazole derivative, an anthracene derivative, a phenanthrene derivative, a pyrene derivative, or a chrysene derivative, and 3) an aromatic amine compound such as a triarylamine derivative or a fused polycyclic aromatic amine derivative are used.

(Electron-Transporting Layer)

An electron-transporting layer is a layer which contains a substance having a high electron-transporting property. For the electron-transporting layer, 1) a metal complex such as an aluminum complex, a beryllium complex, a zinc complex, or the like; 2) a heteroaromatic complex such as an imidazole derivative, a benzimidazole derivative, an azine derivative, a carbazole derivative, a phenanthroline derivative, or the like; and 3) a polymer compound can be used.

(Electron-Injecting Layer)

An electron-injecting layer is a layer which contains a substance having a high electron-injecting property. For the electron-injection layer, a metal complex compound such as lithium (Li), ytterbium (Yb), lithium fluoride (LiF), cesium fluoride (CsF), calcium fluoride ($CaF_2$), or 8-hydroxyquinolinolato-lithium (Liq), an alkali metal, an alkaline earth metal, or a compound thereof such as lithium oxide ($LiO_x$) can be used.

(Cathode)

For the cathode, metals, alloys, electrically conductive compounds, mixtures thereof, and the like having a small work function (specifically, 3.8 eV or less) are preferably used. Specific examples of such a cathode material include elements belonging to Group 1 or Group 2 of the Periodic Table of the Elements, i.e., alkali metals such as lithium (Li) and cesium (Cs), alkaline earth metals such as magnesium (Mg), calcium (Ca) and strontium (Sr), and alloys containing these metals (e.g., MgAg and AlLi); rare earth metals such as europium (Eu) and ytterbium (Yb), and alloys containing these metals.

In the organic EL device according to an aspect of the invention, the methods for forming the respective layers are not particularly limited. A conventionally-known method for forming each layer according to a vacuum deposition process, a spin coating process or the like can be used. Each layer such as the emitting layer can be formed by a known method such as a vacuum deposition process, a molecular beam deposition process (MBE process), or an application process such as a dipping process, a spin coating process, a casting process, a bar coating process and a roll coating process, using a solution prepared by dissolving the material in a solvent.

In the organic EL device according to an aspect of the invention, the thickness of each layer is not particularly limited, but is generally preferable that the thickness be in the range of several nm to 1 μm in order to suppress defects such as pinholes, to suppress applied voltages to be low, and to improve luminous efficiency.

[Composition]

A composition in an aspect of the invention contains a compound represented by the formula (1) and a compound represented by the formula (2), wherein one or more selected from the group consisting of the compound represented, by the formula (1) and the compound represented by the formula (2) have at least one deuterium atom. Details of each material are as described above.

The form of the composition in an aspect of the invention is not particularly limited, and examples thereof include solid, powder, solution, film, and the like. When the composition is in a solid form, the composition may be molded into a pellet shape.

The blending ratio of the compound represented by the formula (1) and the compound represented by the formula (2) is not particularly limited. Depending on the desired effect of the composition, the blending ratio of the materials may be appropriately determined.

Here, the "film" described above includes a film formed containing a raw material containing a compound represented by the formula (1) and a compound represented by the formula (2). Examples of such a film include an emitting layer containing a first host material, a second host material, and a dopant material in an organic electroluminescence device in an aspect of the invention.

The blending ratio (mass ratio) of the compound represented by the formula (1) and the compound represented by the formula (2) is usually from 1:99 to 99:1, preferably from 10:90 to 90:10, and more preferably from 40:60 to 60:40.

In one embodiment, the composition is a powder consisting of a composition containing a compound represented by the formula (1) and a compound represented by the formula (2).

The composition in an aspect of the invention may be in powder shape. The powder may contain a compound represented by the formula (1) and a compound represented by the formula (2) in one particle, or may be a mixture of particles composed of a compound represented by the formula (1) and particles composed of a compound represented by the formula (2). The blending ratio of the compound represented by the formula (1) and the compound represented by the formula (2) is not particularly limited, and is as described above for the composition. The powder may be referred to as premix.

The composition in an aspect of the invention may contain a component other than the compound represented by the formula (1) and the compound represented by the formula (2). Examples of other components include the above-described dopant material and the like. Details of the dopant material are described above.

[Electronic Apparatus]

The electronic apparatus according to an aspect of the invention is characterized in that the organic EL device according to an aspect of the invention is equipped with.

Specific examples of the electronic apparatus include display components such as an organic EL panel module, and the like; display devices for a television, a cellular phone, a personal computer, and the like; and emitting devices such as a light, a vehicular lamp, and the like.

EXAMPLES

Hereinafter, Examples according to the invention will be described. The invention is not limited in any way by these Examples.

<Compound>

Compounds represented by the formula (1) (first host material) used in Examples and Comparative Examples are shown below.

BH1-1

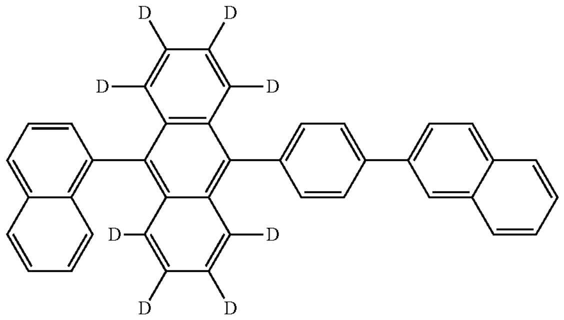

-continued
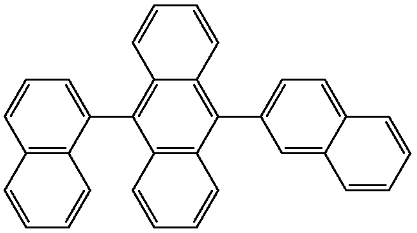
BH1-2
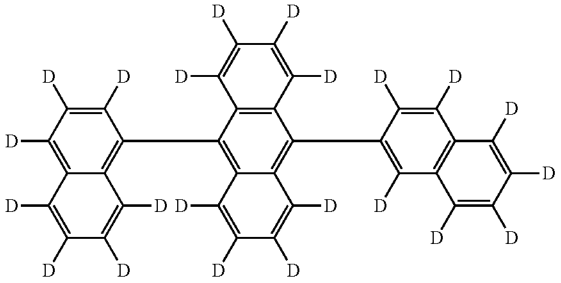
BH1-3
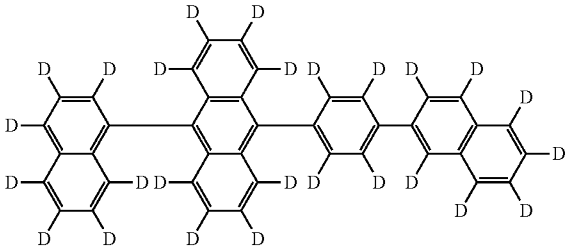
BH1-4
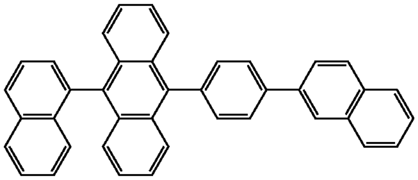
BH-3
Compounds represented by the formula (2) (second host material) used in Examples and Comparative Examples are shown below.
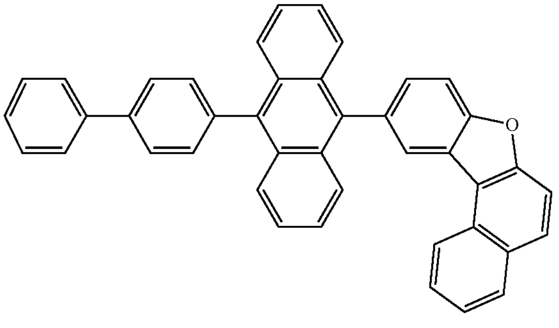
BH2-1
-continued
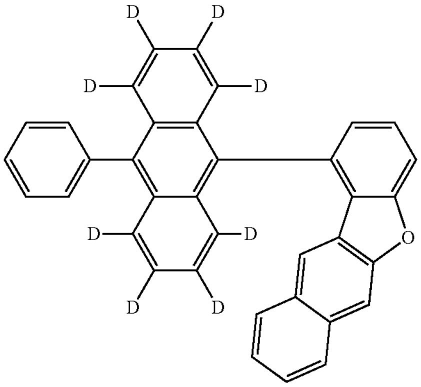
BH2-2
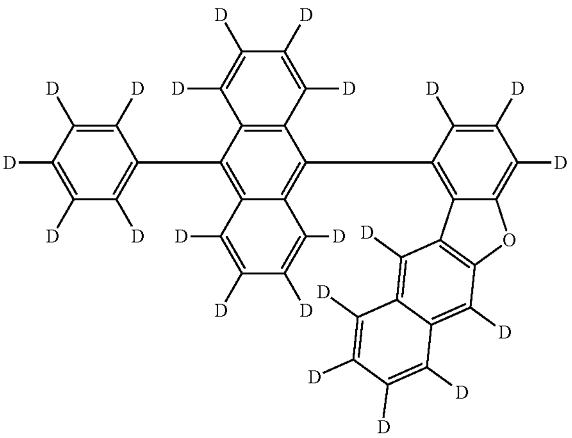
BH2-3
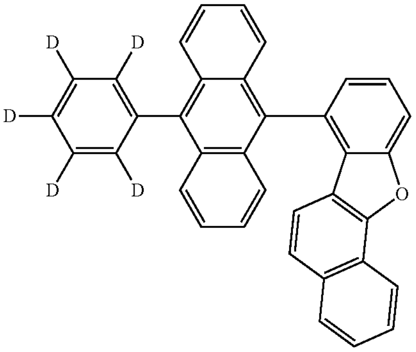
BH2-4

-continued
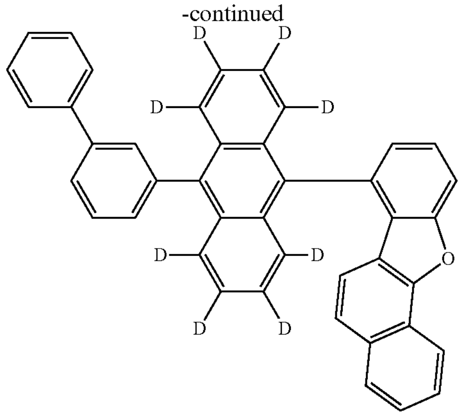
BH2-5
A dopant material used in Examples and Comparative Examples is shown below.
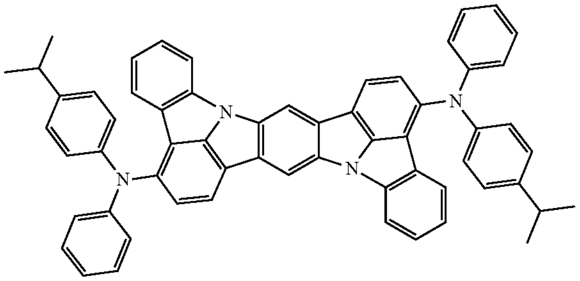
BD-1
Other compounds used in Examples and Comparative Examples are shown below.
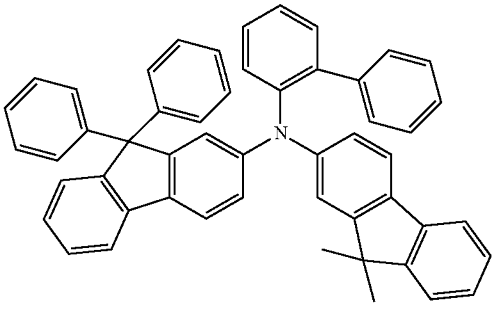
HT-1
-continued
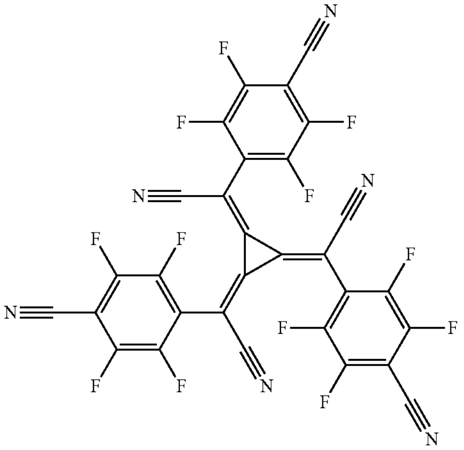
HI-1
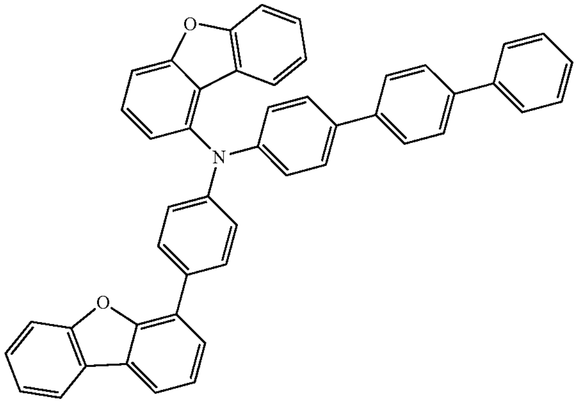
HT-2
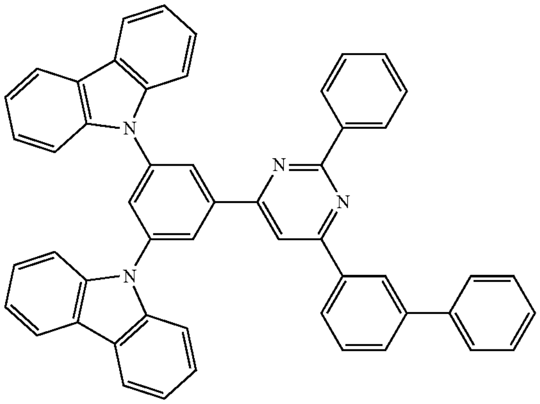
ET-1
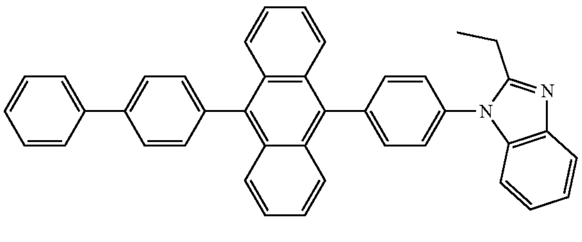
ET-2

Example 1

<Fabrication of Organic EL Device>

A 25 mm×75 mm×1.1 mm-thick glass substrate with an ITO transparent electrode (anode) (manufactured by GEOMATEC Co., Ltd.) was subjected to ultrasonic cleaning in isopropyl alcohol for 5 minutes, and then subjected to UV-ozone cleaning for 30 minutes. The thickness of the ITO film was 130 nm.

The glass substrate with the transparent electrode after being cleaned was mounted onto a substrate holder in a vacuum vapor deposition apparatus. First, a compound HI-1 and a compound HT-1 were co-deposited on a surface on the side on which the transparent electrode was formed to be 3% by mass in a proportion of the compound HI-1 so as to cover the transparent electrode to form a hole-injecting layer having a thickness of 10 nm.

Next, a compound HT-1 was deposited on the hole-injecting layer to form an HT-1 film having a thickness of 75 nm. The HT-1 film functions as a hole-transporting layer (first hole-transporting layer).

Following the deposition of the HT-1 film, a compound HT-2 was deposited to form an HT-2 film having a thickness of 15 nm on the HT-1 film. The HT-2 film functions as an electron-blocking layer (second hole-transporting layer).

A compound BH-1 (first host material), a compound BH-2 (second host material), and a compound BD-1 (dopant material) were co-deposited on the HT-2 film to form a BH:BD-1 film having a thickness of 20 nm. The BH:BD-1 film functions as an emitting layer. BH-1 and BH-2 contained in the emitting layer are 1:1 by mass ratio, and the concentration of BD-1 is 2% by mass with respect to the entire emitting layer.

A compound ET-1 was deposited on the emitting layer to form an ET-1 film having a thickness of 3 nm. The ET-1 film functions as a hole barrier layer (first electron-transporting layer).

A compound ET-2 and (8-quinolinolato)lithium (hereinafter also referred to as Liq) were co-deposited to form an ET-2:Liq film having a Liq proportion of 33% by mass and a thickness of 30 nm. The ET-2:Liq film functions as an electron-transporting layer (second electron-transporting layer). On the ET-2 film, LiF and Yb were co-evaporated to form an LiF:Yb film having a Yb proportion of 50% and a thickness of 1 nm. Metal A1 was deposited on the LiF:Yb film to form a metal cathode having a thickness of 50 nm to fabricate an organic EL device.

The device configuration of the organic EL device of Example 1 is schematically shown as follows.

ITO(130)/HT-1:HI-1(10:3%)/HT-1(75)/HT-2(15)/BH:BD-1 (20:2%)/ET-1(3)/ET-2:Liq(30:33%)/LiF:Yb(1:50%)/Al(50)

The numerical values in parentheses indicate the film thickness (unit: nm).

<Evaluation of Organic EL Device>

Initial characteristics of the obtained organic EL device was measured by DC (direct current)–constant current driving of 10 mA/$cm^2$ at room temperature.

Voltage was applied to the obtained organic EL device to be 10 mA/$cm^2$ in current density, thereby measuring an EL emission spectrum by using Spectroradiometer CS-1000 (manufactured by Konica Minolta, Inc.). External quantum efficiency (EQE (unit: %)) was calculated from the resulting spectral radiance spectrum.

Voltage was applied to the obtained organic EL device so that the current density became 50 mA/$cm^2$, and the time until the luminance became 95% of the initial luminance (LT95 (unit: hours)) was measured.

Evaluation results are shown in Table 1. Voltage is shown as a difference from Comparative Example 1, and EQE and LT95 are shown as relative values with the result of Comparative Example 1 being 100%.

Comparative Example 1 to 4

Organic EL devices were fabricated and evaluated in the same manner as in Example 1, except that the compound described in Table 1 was used as a host material of the emitting layer. Results are shown in Table 14.

TABLE 14

| | First host material | Second host material | Voltage (V) @ 10 m A/$cm^2$ | EQE (%) | LT95 (hr) |
|---|---|---|---|---|---|
| Ex. 1 | BH1-1 | BH2-1 | +0.06 | 105% | 157% |
| Comp. Ex. 1 | — | BH2-1 | ±0 | 100% | 100% |
| Comp. Ex. 2 | BH-3 | BH2-1 | +0.05 | 105% | 131% |
| Comp. Ex. 3 | BH-3 | — | +0.17 | 104% | 125% |
| Comp. Ex. 4 | BH1-1 | — | +0.17 | 105% | 171% |

Example 2-1

An organic EL device was fabricated and evaluated in the same manner as in Example 1, except that a compound BH1-2 (first host material) and a compound BH2-2 (second host material) were mixed in advance (premixed) to prepare a composition, and then the composition and a dopant material (BD-1) were co-deposited to form an emitting layer.

Results are shown in Table 15. Voltage is shown as a difference from Comparative Example 5, and EQE and LT95 are shown as relative values with the result of Comparative Example 5 being 100%.

Two materials, a first host material and a second host material, can be stably deposited from one deposition source, and desired device performance can be obtained.

Comparative Example 5

An organic EL device was fabricated and evaluated in the same manner as in Example 1, except that only a compound BH1-2 was used as a host material of an emitting layer. Results are shown in Table 15.

Examples 2-2 and 2-3

Organic EL devices were fabricated and evaluated by the same manner (premix) as in Example 2-1, except that compounds described in Table 15 were used as a host material of an emitting layer. Results are shown in Table 15. Voltage is shown as a difference from Comparative Example 5, and EQE and LT95 are shown as relative values with the result of Comparative Example 5 being 100%.

TABLE 15

| | First host material | Second host material | Voltage (V) @ 10 m A/$cm^2$ | EQE (%) | LT95 (hr) |
|---|---|---|---|---|---|
| Ex. 2-1 | BH1-2 | BH2-2 | −0.35 | 98% | 140% |
| Ex. 2-2 | BH1-2 | BH2-3 | −0.35 | 98% | 145% |
| Ex. 2-3 | BH1-3 | BH2-4 | −0.25 | 98% | 160% |
| Comp. Ex. 5 | BH1-2 | — | ±0 | 100% | 100% |

Examples 3-1 and 3-2

Organic EL devices were fabricated and evaluated by the same manner (premix) as in Example 2-1, except that compounds described in Table 3 were used as a host material of an emitting layer. Results are shown in Table 16. Voltage is shown as a difference from the voltage of Comparative Example 1, and EQE and LT95 are shown as relative values with the result of Comparative Example 1 being 100%.

TABLE 16

| | First host material | Second host material | Voltage (V) @ 10 m A/cm$^2$ | EQE (%) | LT95 (hr) |
|---|---|---|---|---|---|
| Ex. 3-1 | BH-3 | BH2-5 | −0.13 | 101% | 133% |
| Ex. 3-2 | BH1-4 | BH2-5 | −0.13 | 101% | 156% |

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The invention claimed is:

1. An organic electroluminescence device comprising:

a cathode;

an anode; and at least one emitting layer disposed between the cathode and the anode, wherein the emitting layer comprises a first host material, a second host material, and a dopant material, the first host material is a compound represented by the following formula (1), the second host material is a compound represented by the following formula (2), and one or more selected from the group consisting of the compound represented by the formula (1) and the compound represented by the formula (2) have at least one deuterium atom:

(1)

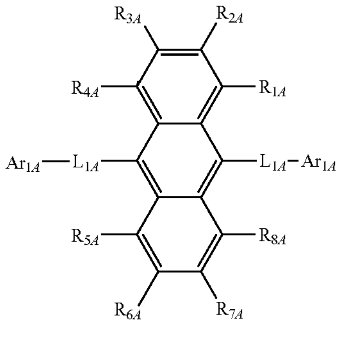

wherein in the formula (1), $R_{1A}$ to $R_{8A}$ are independently a hydrogen atom, a substituent R, or a group represented by the following formula (1A);

the substituent R is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

when two or more of the substituents R are present, the two or more of the substituents R may be the same as or different from each other;

$L_{1A}$'s are independently a single bond, a substituted or unsubstituted arylene group including 6 to 50 ring carbon atoms, or a substituted or unsubstituted divalent heterocyclic group including 5 to 50 ring atoms;

$Ar_{1A}$'s are independently a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ are the same as or different from each other;

$$-L_{1A}-Ar_{1A} \quad (1A)$$

wherein in the formula (1A), $L_{1A}$ and $Ar_{1A}$ are as defined in the formula (1); and when two or more groups represented by the formula (1A) are present, the two or more of each of the groups represented by the formula (1A) may be the same as or different from each other;

(2)

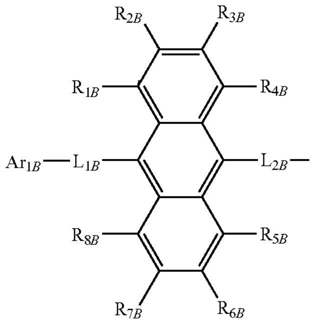

-continued

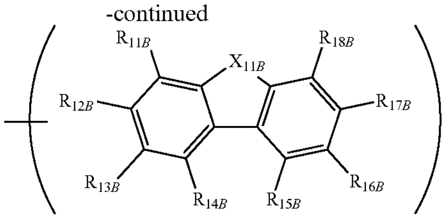

wherein in the formula (2), $R_{1B}$ to $R_{8B}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$X_{11B}$ is an oxygen atom or a sulfur atom;

one of $R_{11B}$ to $R_{18B}$ is a single bond bonding with $L_{2B}$;

one or more sets of adjacent two or more of $R_{11B}$ to $R_{18B}$ which are not single bonds bonding with $L_{2B}$ form a substituted or unsubstituted, saturated or unsaturated ring by bonding with each other, or do not form a substituted or unsubstituted, saturated or unsaturated ring;

$R_{11B}$ to $R_{18B}$ which are not single bonds bonding with $L_{2B}$ and which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$L_{1B}$ and $L_{2B}$ are independently a single bond, a substituted or unsubstituted arylene group including 6 to 30 ring carbon atoms, or a substituted or unsubstituted divalent heterocyclic group including 5 to 30 ring atoms;

$Ar_{1B}$ is a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (1), wherein at least one of $R_{1A}$ to $R_{8A}$ in the formula (1) and/or at least one of $R_{1B}$ to $R_{8B}$ in the formula (2) is a deuterium atom.

2. The organic electroluminescence device according to claim 1, wherein one or more sets of adjacent two or more of $R_{11B}$ to $R_{18B}$ which are not single bonds bonding with $L_{2B}$ in the formula (2) do not form a substituted or unsubstituted, saturated or unsaturated ring.

3. The organic electroluminescence device according to claim 1, wherein the compound represented by the formula (2) is a compound represented by any one of the following formulas (2-1) to (2-3):

(2-1)

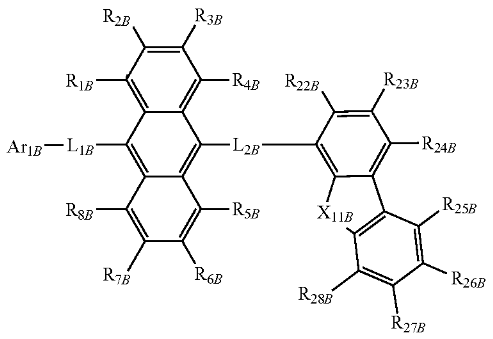

(2-2)

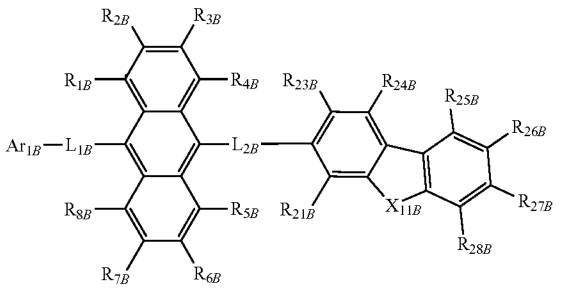

(2-3)

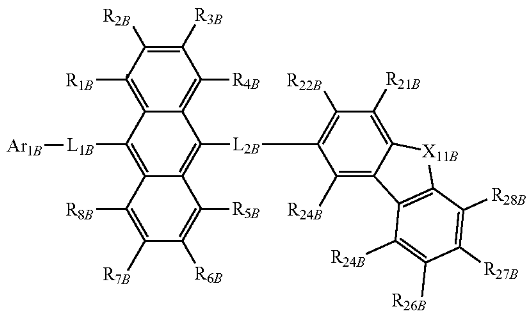

wherein in the formulas (2-1) to (2-3), $R_{1B}$ to $R_{8B}$, $L_{1B}$, $L_{2B}$, $Ar_{1B}$, and $X_{11B}$ are as defined in the formula (2);

one or more sets of adjacent two or more of $R_{25B}$ to $R_{28B}$ form a substituted or unsubstituted, saturated or unsaturated ring by bonding with each other;

one or more sets of adjacent two or more of $R_{21B}$ to $R_{24B}$ form a substituted or unsubstituted, saturated or unsaturated ring by bonding with each other, or do not form a substituted or unsubstituted, saturated or unsaturated ring;

$R_{21B}$ to $R_{28B}$ which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (1).

4. The organic electroluminescence device according to claim 1, wherein in the formula (2), $L_{1B}$ and $L_{2B}$ are independently a single bond or a substituted or unsubstituted arylene group including 6 to 14 ring carbon atoms.

5. The organic electroluminescence device according to claim 1, wherein in the formula (2), $L_{1B}$ and $L_{2B}$ are independently a single bond, a substituted or unsubstituted phenylene group, or a substituted or unsubstituted naphthylene group.

6. The organic electroluminescence device according to claim 1, wherein in the formula (2), $Ar_{1B}$ is a substituted or unsubstituted aryl group including 6 to 50 ring carbon atoms.

7. The organic electroluminescence device according to claim 1, wherein in the formula (2), $Ar_{1B}$ is selected from the group represented by the following formulas (a1) to (a4):

(a1)

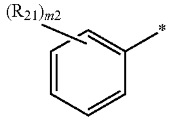

(a2)

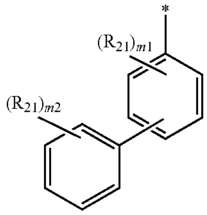

(a3)

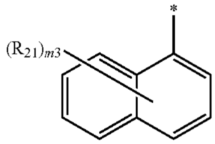

-continued (a4)

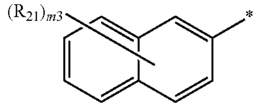

wherein in the formulas (a1) to (a4), * is a single bond bonding with $L_{1B}$;

$R_{21}$ is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$),

—S—($R_{905}$),

—N($R_{906}$)($R_{907}$), a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are as defined in the formula (1);

m1 is an integer of 0 to 4;

m2 is an integer of 0 to 5;

m3 is an integer of 0 to 7;

when each of m1 to m3 is 2 or more, a plurality of $R_{21}$ may be the same as or different from each other; and when each of m1 to m3 is 2 or more, a plurality of adjacent $R_{21}$'s forms a substituted or unsubstituted, saturated or unsaturated ring by bonding with each other, or does not form a substituted or unsubstituted, saturated or unsaturated ring.

8. The organic electroluminescence device according to claim 1, wherein in the formula (2), $X_{11B}$ is an oxygen atom.

9. The organic electroluminescence device according to claim 3, wherein the compound represented by the formula (2) or the formulas (2-1) to (2-3) is a compound represented by any one of the following formulas (2-11) to (2-14):

(2-11)

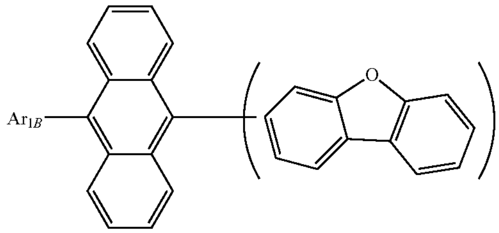

-continued (2-12)

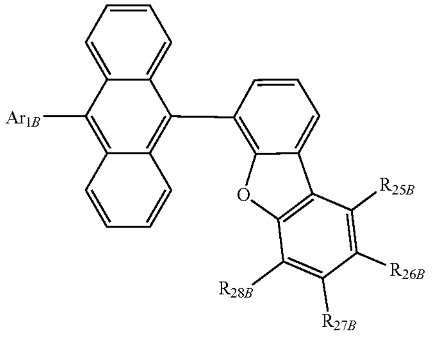

(2-13)

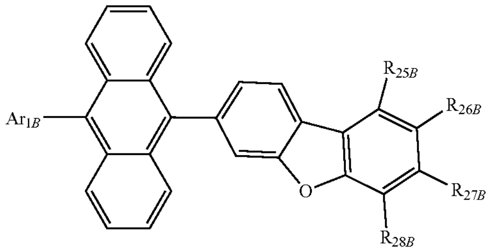

(2-14)

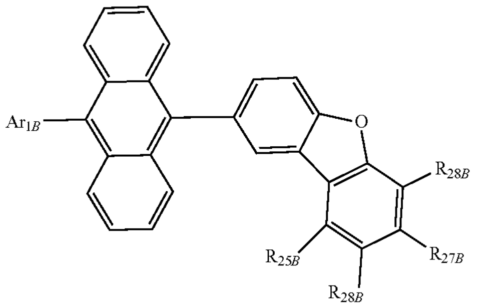

wherein in the formulas (2-11) to (2-14), $Ar_{1B}$ is as defined in the formula (2); and $R_{25B}$ to $R_{28B}$ are as defined in the formulas (2-1) to (2-3).

10. The organic electroluminescence device according to claim 1, wherein the compound represented by the formula (1) is a compound represented by the following formula (1-1):

(1-1)

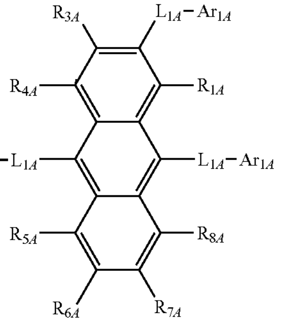

wherein in the formula (1-1), $R_{1A}$, $R_{3A}$ to $R_{8A}$, $L_{1A}$, and $Ar_{1A}$ are as defined in the formula (1).

11. The organic electroluminescence device according to claim 1, wherein the compound represented by the formula (1) is a compound represented by the following formula (1-11), the following formula (1-12), or the following formula (1-13):

(1-11)

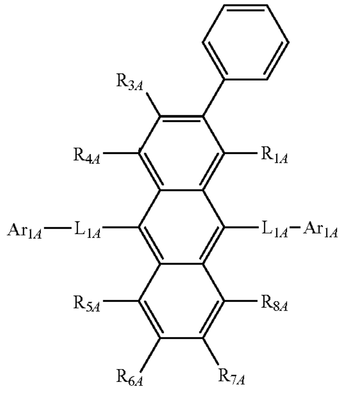

(1-12)

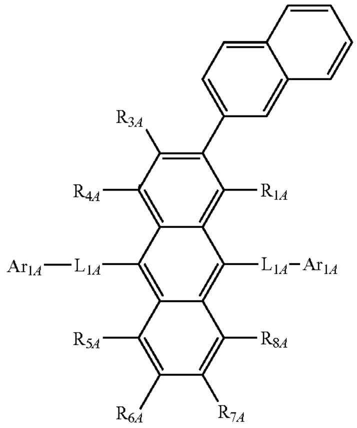

(1-13)

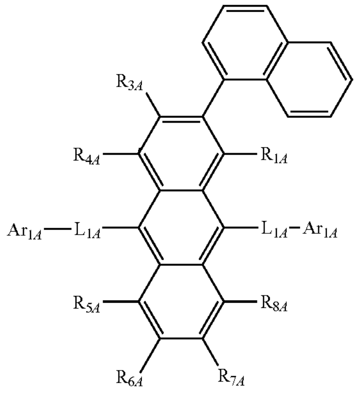

wherein in the formula (1-11), the formula (1-12), and the formula (1-13), $R_{1A}$, $R_{3A}$ to $R_{8A}$, $L_{1A}$, and $Ar_{1A}$ are as defined in the formula (1).

12. The organic electroluminescence device according to claim 1, wherein the compound represented by the formula (1) is a compound represented by the following formula (1-2):

(1-2)

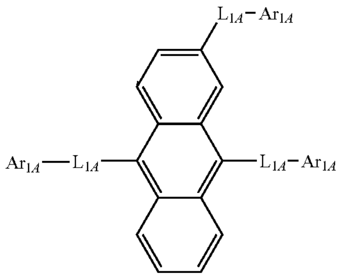

wherein in the formula (1-2), $L_{1A}$ and $Ar_{1A}$ are as defined in the formula (1).

13. The organic electroluminescence device according to claim 1, wherein the compound represented by the formula (1) is a compound represented by the following formula (1-21), the following formula (1-22), or the following formula (1-23):

(1-21)

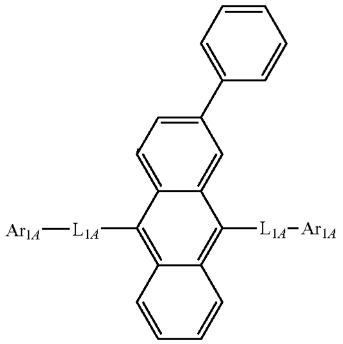

(1-22)

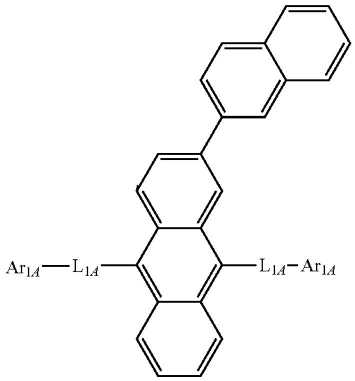

(1-23)

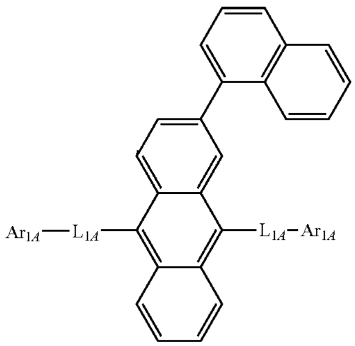

wherein in the formula (1-21), the formula (1-22), and the formula (1-23), $L_{1A}$ and $Ar_{1A}$ are as defined in the formula (1).

14. The organic electroluminescence device according to claim 1, wherein $L_{1A}$ is a single bond or a substituted or unsubstituted arylene group including 6 to 14 ring carbon atoms in the formula (1), the formula (1-1), the formula (1-2), the formulas (1-11) to (1-13) or the formulas (1-21) to (1-23).

15. The organic electroluminescence device according to claim 1, wherein in the formula (1), the formula (1-1), the formula (1-2), the formulas (1-11) to (1-13) or the formulas (1-21) to (1-23), $L_{1A}$ is a single bond, a substituted or unsubstituted phenylene group, or a substituted or unsubstituted naphthylene group.

16. The organic electroluminescence device according to claim 1, wherein in the formula (1), the formula (1-1), the formula (1-2), the formulas (1-11) to (1-13) or the formulas (1-21) to (1-23), $Ar_{1A}$ is a substituted or unsubstituted aryl group including 6 to 50 ring carbon atoms.

17. The organic electroluminescence device according to claim 1, wherein in the formula (1), the formula (1-1), the formula (1-2), the formulas (1-11) to (1-13), or the formulas (1-21) to (1-23), $Ar_{1A}$ is selected from the group represented by the following formulas (a1) to (a4):

(a1)

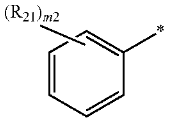

(a2)

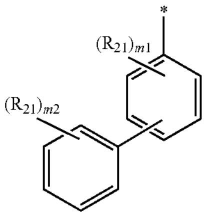

(a3)

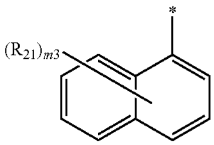

(a4)

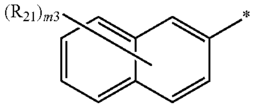

wherein in the formulas (a1) to (a4), * is a single bond bonding with $L_{1A}$;

$R_{21}$ is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $—Si(R_{901})(R_{902})(R_{903})$, $—O—(R_{904})$, —S—($R_{905}$),
—N($R_{906}$)($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{907}$ are as defined in the formula (1);
m1 is an integer of 0 to 4;
m2 is an integer of 0 to 5;
m3 is an integer of 0 to 7;
when each of m1 to m3 is 2 or more, a plurality of $R_{21}$ may be the same as or different from each other; and
when each of m1 to m3 is 2 or more, a plurality of adjacent $R_{21}$'s forms a substituted or unsubstituted, saturated or unsaturated ring by bonding with each other, or does not form a substituted or unsubstituted, saturated or unsaturated ring.

18. The organic electroluminescence device according to claim 1, wherein at least two of $R_{1A}$ to $R_{8A}$ in the formula (1) and $R_{1B}$ to $R_{8B}$ in the formula (2) are deuterium atoms.

19. The organic electroluminescence device according to claim 1, wherein $R_{1A}$ to $R_{8A}$ in the formula (1) and $R_{1B}$ to $R_{8B}$ in the formula (2) are all deuterium atoms.

20. The organic electroluminescence device according to claim 1, wherein the dopant material comprises a compound represented by the following formula (31):

(31)

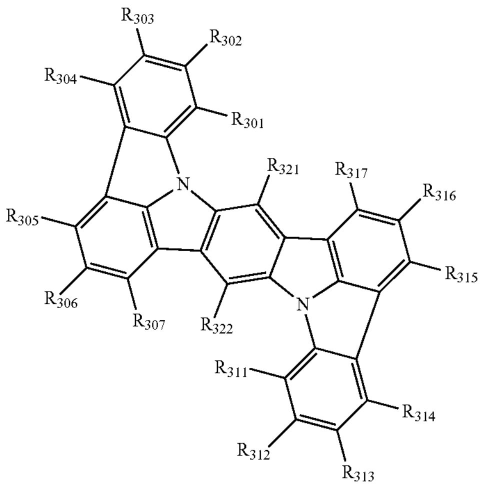

wherein in the formula (31),
one or more sets of adjacent two or more of $R_{301}$ to $R_{307}$ and $R_{311}$ to $R_{317}$ form a substituted or unsubstituted, saturated or unsaturated ring, or do not form a substituted or unsubstituted, saturated or unsaturated ring;
$R_{301}$ to $R_{307}$ and $R_{311}$ to $R_{317}$ which do not form the substituted or unsubstituted, saturated or unsaturated ring are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{321}$ and $R_{322}$ are independently
a hydrogen atom,
a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms; and
$R_{901}$ to $R_{907}$ are as defined in the formula (1).

21. The organic electroluminescence device according to claim 20, wherein at least one of $R_{301}$ to $R_{307}$ and $R_{311}$ to $R_{317}$ in the formula (31) is a group represented by —N($R_{906}$)($R_{907}$).

22. The organic electroluminescence device according to claim 20, wherein at least two of $R_{301}$ to $R_{307}$ and $R_{311}$ to $R_{317}$ in the formula (31) are groups represented by —N($R_{906}$)($R_{907}$).

23. The organic electroluminescence device according to claim 20, wherein the compound represented by the formula (31) is one or more compounds selected from the group consisting of the following formulas (32), (34-2), and (35-2):

(32)

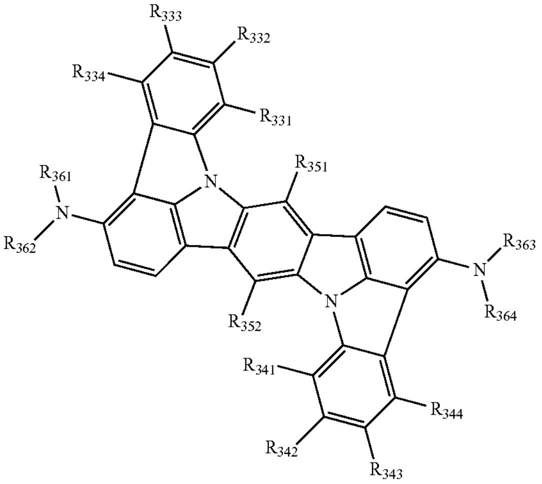

-continued (34-2)

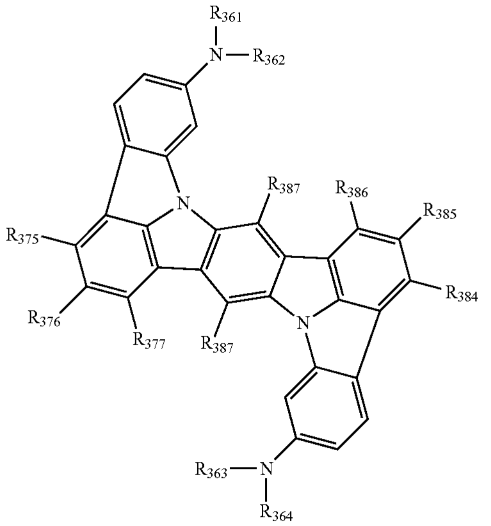

(35-2)

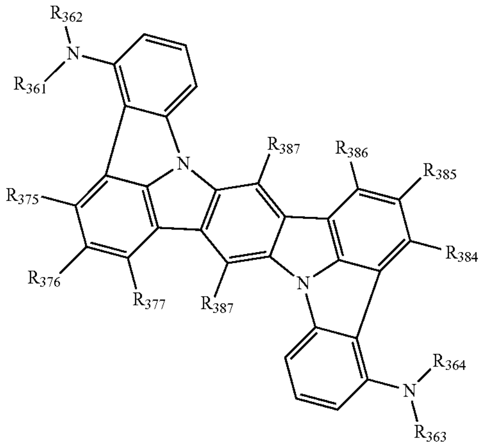

wherein in the formula (32), one or more sets of adjacent two or more of $R_{331}$ to $R_{334}$ and $R_{341}$ to $R_{344}$ form a substituted or unsubstituted, saturated or unsaturated ring, or do not form a substituted or unsubstituted, saturated or unsaturated ring;

$R_{331}$ to $R_{334}$, $R_{341}$ to $R_{344}$, and $R_{351}$ and $R_{352}$ which do not form the substituted or unsubstituted, saturated or unsaturated ring are independently a hydrogen atom, a substituted or unsubstituted aryl group including 6 to 50 ring carbon atoms, or a substituted or unsubstituted monovalent heterocyclic group including 5 to 50 ring atoms;

$R_{361}$ to $R_{364}$ are independently a substituted or unsubstituted aryl group including 6 to 50 ring carbon atoms, or a substituted or unsubstituted monovalent heterocyclic group including 5 to 50 ring atoms;

wherein in the formulas (34-2) and (35-2), $R_{361}$ to $R_{364}$ are as defined in the formula (32);

one or more sets of adjacent two or more of $R_{375}$ to $R_{377}$ and $R_{384}$ to $R_{386}$ form a substituted or unsubstituted, saturated or unsaturated ring, or do not form a substituted or unsubstituted, saturated or unsaturated ring; and $R_{375}$ to $R_{377}$ and $R_{384}$ to $R_{386}$ which do not form the substituted or unsubstituted, saturated or unsaturated ring, and $R_{387}$ are independently a hydrogen atom, a substituted or unsubstituted aryl group including 6 to 50 ring carbon atoms, or a substituted or unsubstituted monovalent heterocyclic group including 5 to 50 ring atoms.

24. The organic electroluminescence device according to claim 20, wherein the compound represented by the formula (31) is one or more compounds selected from the group consisting of the following formulas (32-11), (34-11), and (35-11):

(32-11)

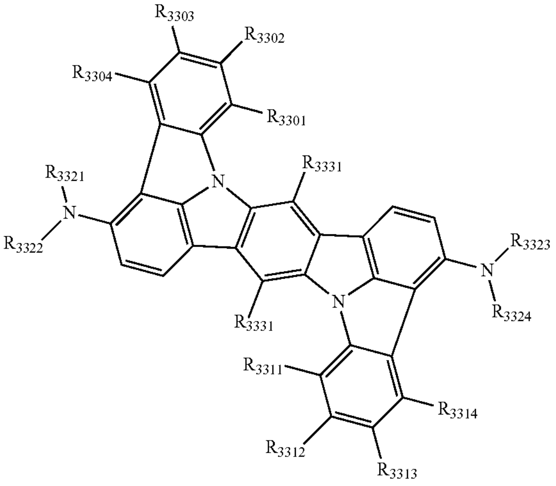

(34-11)

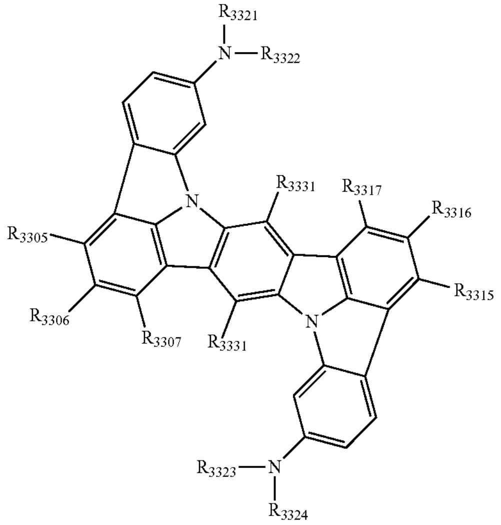

-continued (35-11)

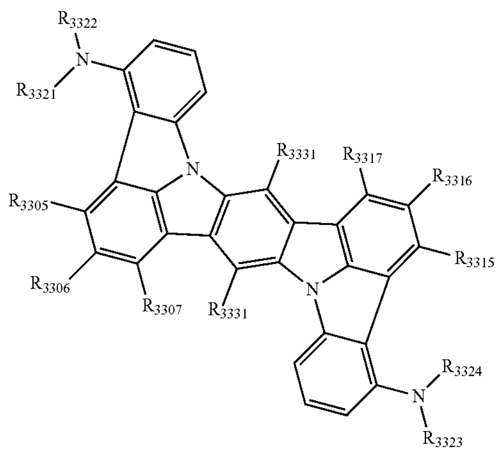

wherein in the formulas (32-11), (34-11), and (35-11), one or more sets of adjacent two or more of $R_{3301}$ to $R_{3307}$ and $R_{3311}$ to $R_{3317}$ form a substituted or unsubstituted, saturated or unsaturated ring, or do not form a substituted or unsubstituted, saturated or unsaturated ring;

$R_{3301}$ to $R_{3307}$ and $R_{3311}$ to $R_{3317}$ which do not form the substituted or unsubstituted, saturated or unsaturated ring, and $R_{3331}$ are independently a hydrogen atom, a substituted or unsubstituted aryl group including 6 to 20 ring carbon atoms, or a substituted or unsubstituted monovalent heterocyclic group including 5 to 20 ring atoms; two $R_{3331}$'s may be the same as or different from each other; and $R_{3321}$ to $R_{3324}$ are independently a substituted or unsubstituted aryl group including 6 to 20 ring carbon atoms, or a substituted or unsubstituted monovalent heterocyclic group including 5 to 20 ring atoms.

25. The organic electroluminescence device according to claim 1, wherein the first host material and the second host material are comprised in a single emitting layer.

26. The organic electroluminescence device according to claim 1, comprising a hole-transporting layer between the anode and the emitting layer.

27. The organic electroluminescence device according to claim 1, comprising an electron-transporting layer between the cathode and the emitting layer.

28. A composition comprising a compound represented by the following formula (1) and a compound represented by the following formula (2), wherein one or more selected from the group consisting of the compound represented by the formula (1) and the compound represented by the formula (2) have at least one deuterium atom, (1)

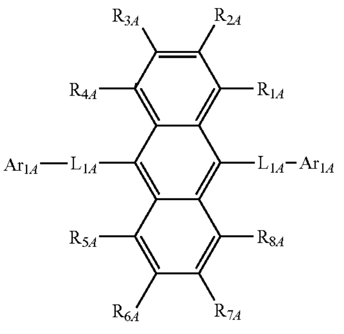

wherein in the formula (1), $R_{1A}$ to $R_{8A}$ are independently a hydrogen atom, a substituent R, or a group represented by the following formula (1A);

the substituent R is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, $-Si(R_{901})(R_{902})(R_{903})$, $-O-(R_{904})$, $-S-(R_{905})$, $-N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

when two or more of the substituents R are present, the two or more of the substituents R may be the same as or different from each other;

$L_{1A}$'s are independently a single bond, a substituted or unsubstituted arylene group including 6 to 50 ring carbon atoms, or a substituted or unsubstituted divalent heterocyclic group including 5 to 50 ring atoms;

$Ar_{1A}$ are independently a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ are the same as or different from each other;

$$-L_{1A}-Ar_{1A} \quad (1A)$$

wherein in the formula (1A), $L_{1A}$ and $Ar_{1A}$ are as defined in the formula (1);

when two or more groups represented by the formula (1A) are present, the two or more of each of the groups represented by the formula (1A) may be the same as or different from each other;

(2)

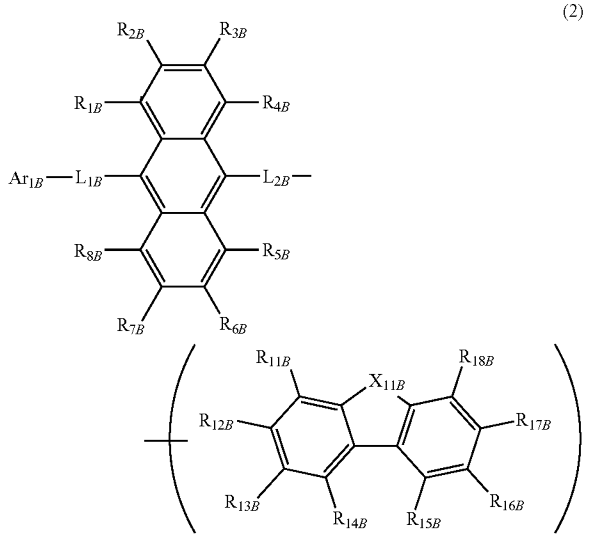

wherein in the formula (2), $R_{1B}$ to $R_{8B}$ are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$X_{11B}$ is an oxygen atom or a sulfur atom;

one of $R_{11B}$ to $R_{18B}$ is a single bond bonding with $L_{2B}$;

one or more sets of adjacent two or more of $R_{11B}$ to $R_{18B}$ which are not single bonds bonding with $L_{2B}$ form a substituted or unsubstituted, saturated or unsaturated ring by bonding with each other, or do not form a substituted or unsubstituted, saturated or unsaturated ring;

$R_{11B}$ to $R_{18B}$ which are not single bonds bonding with $L_{2B}$ and which do not form the substituted or unsubstituted, saturated or unsaturated ring are independently a hydrogen atom, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$L_{1B}$ and $L_{2B}$ are independently a single bond, a substituted or unsubstituted arylene group including 6 to 30 ring carbon atoms, or a substituted or unsubstituted divalent heterocyclic group including 5 to 30 ring atoms;

$Ar_{1B}$ is a substituted or unsubstituted aryl group including 6 to 50 ring carbon atoms, or a substituted or unsubstituted monovalent heterocyclic group including 5 to 50 ring atoms; and $R_{901}$ to $R_{907}$ are as defined in the formula (1), wherein at least one of $R_{1A}$ to $R_{8A}$ in the formula (1) and/or at least one of $R_{1B}$ to $R_{8B}$ in the formula (2) is a deuterium atom.

29. An organic electroluminescence device comprising:

a cathode;

an anode; and at least one emitting layer disposed between the cathode and the anode, wherein the emitting layer comprises a composition according to claim 28.

30. An electronic apparatus, comprising the organic electroluminescence device according to claim 1.

31. The electroluminescence device according to claim 1, wherein at least one of $R_{1A}$ to $R_{8A}$ in the formula (1) and at least one of $R_{1B}$ to $R_{8B}$ in the formula (2) is a deuterium atom.

32. The composition according to claim 29, wherein at least one of $R_{1A}$ to $R_{8A}$ in the formula (1) and at least one of $R_{1B}$ to $R_{8B}$ in the formula (2) is a deuterium atom.

33. The organic electroluminescence device according to claim 1, wherein $R_{1A}$ to $R_{8A}$ in the formula (1) are all deuterium atoms and/or $R_{1B}$ to $R_{8B}$ in the formula (2) are all deuterium atoms.

34. The composition according to claim 29, wherein $R_{1A}$ to $R_{8A}$ in the formula (1) are all deuterium atoms and/or $R_{1B}$ to $R_{8B}$ in the formula (2) are all deuterium atoms.

* * * * *